US011539012B2

(12) United States Patent
Jeon et al.

(10) Patent No.: US 11,539,012 B2
(45) Date of Patent: Dec. 27, 2022

(54) ORGANIC LIGHT-EMITTING DEVICE

(71) Applicant: Samsung Electronics Co., Ltd., Suwon-si (KR)

(72) Inventors: Soonok Jeon, Suwon-si (KR); Eunsuk Kwon, Suwon-si (KR); Sangmo Kim, Hwaseong-si (KR); Minsik Min, Suwon-si (KR); Hyejin Bae, Suwon-si (KR); Yeonsook Chung, Seoul (KR); Yongsik Jung, Seoul (KR); Youngmok Son, Hwaseong-si (KR); Eunkyung Lee, Seoul (KR); Hasup Lee, Seoul (KR); Hyeonho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 98 days.

(21) Appl. No.: 16/944,248

(22) Filed: Jul. 31, 2020

(65) Prior Publication Data

US 2021/0167311 A1 Jun. 3, 2021

(30) Foreign Application Priority Data

Nov. 29, 2019 (KR) ........................ 10-2019-0157676

(51) Int. Cl.
*H01L 51/50* (2006.01)
*H01L 51/00* (2006.01)
*H01L 27/32* (2006.01)

(52) U.S. Cl.
CPC ...... *H01L 51/5004* (2013.01); *H01L 51/0087* (2013.01); *H01L 51/5016* (2013.01); *H01L 51/5024* (2013.01); *H01L 51/5056* (2013.01); *H01L 51/5072* (2013.01)

(58) Field of Classification Search
CPC .................................................. H01L 51/5004
See application file for complete search history.

(56) References Cited

U.S. PATENT DOCUMENTS

| | | | |
|---|---|---|---|
| 10,418,573 B2 | 9/2019 | Kim et al. | |
| 2016/0329512 A1* | 11/2016 | Nishide | H01L 51/5028 |
| 2017/0250363 A1 | 8/2017 | Baumann et al. | |
| 2017/0271610 A1* | 9/2017 | Takahashi | H01L 51/5004 |
| 2018/0182980 A1 | 6/2018 | Lennartz et al. | |
| 2020/0044165 A1 | 2/2020 | Lennartz et al. | |
| 2020/0321537 A1 | 10/2020 | Jeon et al. | |
| 2020/0343469 A1* | 10/2020 | Ohsawa | H01L 51/5028 |
| 2021/0202864 A1* | 7/2021 | Nakanotani | H01L 51/0072 |

FOREIGN PATENT DOCUMENTS

| | | | |
|---|---|---|---|
| JP | 2017197481 | A | 11/2017 |
| KR | 1020160100961 | A | 8/2016 |
| KR | 1020160101519 | A1 | 8/2016 |
| KR | 1020170055535 | A | 5/2017 |

(Continued)

OTHER PUBLICATIONS

ADF2009.01, SCM, Theoretical Chemistry, Vrije Universiteit, Amsterdam, The Netherlands, 2010.

(Continued)

*Primary Examiner* — Omar F Mojaddedi
(74) *Attorney, Agent, or Firm* — Cantor Colburn LLP

(57) ABSTRACT

Presented is an organic light-emitting device including a host, a dopant, and a sensitizer.

19 Claims, 3 Drawing Sheets

(56) References Cited

FOREIGN PATENT DOCUMENTS

| | | | |
|---|---|---|---|
| KR | 1020180014738 | A | 2/2018 |
| KR | 1020200115134 | A | 10/2020 |

OTHER PUBLICATIONS

Ansgar Schafer, et al., Fully optimized contracted Gaussian basis sets for atoms Li to Kr, J. Chern. Phys. 97 (4), Aug. 15, 1992, 2571-2577.
Axel D. Becke, Density-functional thermochemistry. III. The role of exact exchange, J. Chern. Phys. 98 (7). Apr. 1, 1993.
D. Andrae, et al., Energy-adjusted ab initio pseudopotentials for the second and third row transition elements, Theor Chim Acta (1990) 77: 123-141.
E. Van Lenthe, et al., Optimized Slater-Type Basis Sets for the Elements 1-118, 2003 Wiley Periodicals, Inc. J Comput Chem 24: 1142-1156, 2003.
English Abstract of JP 2017-197481.
Erik van Lenthe, et al., Geometry optimizations in the zero order regular approximation for relativistic effects, Journal of Chemical Physics vol. 110, No. 18 May 8, 1999.
Fan Wang, et al., A simplified relativistic time-dependent density-functional theory formalism for the calculations of excitation energies including spin-orbit coupling effect, The Journal of Chemical Physics 123, 154102 (2005).
Hyun-Gu Kim, et al., Harnessing Triplet Excited States by Fluorescent Dopant Utilizing Codoped Phosphorescent Dopant in Exciplex Host for Efficient Fluorescent Organic Light Emitting Diodes, Adv. Optical Mater. 2017, 1600749 (6 pp.).
John P. Perdew, Department of Physics and Quantum Theory GroupT, Ulane University Density-functional approximation for the correlation energy of the inhomogeneous electron gas, Physical Review B, vol. 33, No. 12, Jun. 15, 1986.
Lindsay E. Roy, et al., Revised Basis Sets for the LANL Effective Core Potentials, J. Chem. Theory Comput. 2008, 4, 1029-1031.
R. Ahlrichs, M. Bar, M. Haser, H. Hom, and C. Colmel, Electronic Structure Calculations on Workstation Computers: The Program System Turbomole, Chem. Phys.Lett. 162, 165-169 (1989).
Shiyong Liu, et al., Enhanced red emission from fluorescent organic light-emitting devices utilizing a phosphorescent sensitizer, Japanese Journal of Applied Physics vol. 43, No. 4B, 2004, pp. 2320-2322.
Sinheui Kim, et al., Degradation of blue-phosphorescent organic light-emitting devices involves exciton-induced generation of polaron pair within emitting layers, Nature Communications, DOI: 10.1038/s41467-018-03602-4.
Tengxiao Liu, et al. Boosting the Efficiency of Near-Infrared Fluorescent OLEDs with an Electroluminescent Peak of Nearly 800 nm by Sensitizer-Based Cascade Energy Transfer, Adv. Funct. Mater. 2018, 1706088 (8 pp).
W. J. Hehre, et al., Self-Consistent Molecular Orbital Methods. XII. Further Extensions of Gaussian-Type Basis Sets for Use in Molecular Orbital Studies of Organic Molecules, J. Chem. Phys. 56, 2257 (1972); doi: 10.1063/1.1677527.

* cited by examiner

ORGANIC LIGHT-EMITTING DEVICE

CROSS-REFERENCE TO RELATED APPLICATION

This application claims priority and the benefit of Korean Patent Application No. 10-2019-0157676, filed on Nov. 29, 2019, in the Korean Intellectual Property Office, the content of which is incorporated herein in its entirety by reference.

BACKGROUND

1. Field

One or more embodiments provide an organic light-emitting device including a host, a dopant, and a sensitizer.

2. Description of Related Art

Organic light-emitting devices are self-emission devices that produce full-color images, and also have wide viewing angles, high contrast ratios, short response times, and excellent characteristics in terms of brightness, driving voltage, and response speed, compared to devices in the art.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments provide an organic light-emitting device including a certain host, a certain dopant, and a certain sensitizer.

Additional aspects will be set forth in part in the description which follows and, in part, will be apparent from the description, or may be learned by practice of the presented embodiments of the disclosure.

According to an aspect, provided is an organic light-emitting device including a first electrode, a second electrode, and an organic layer between the first electrode and the second electrode, wherein the organic layer includes an emission layer, the emission layer includes a host, a dopant, and a sensitizer, the sensitizer includes ruthenium (Ru), palladium (Pd), rhenium (Re), osmium (Os), or platinum (Pt), and the dopant and the sensitizer satisfy the following Conditions 1 and 2:

$$0.2\ \text{eV} \leq \Delta E_{ST}(S) \quad \text{<Condition 1>}$$

$$|\text{HOMO}(D) - \text{HOMO}(S)| < 0.5\ \text{eV}. \quad \text{<Condition 2>}$$

In Conditions 1 and 2, $\Delta E_{ST}(S)$ is a difference between a lowest excitation singlet energy level and a lowest excitation triplet energy level of the sensitizer, HOMO(D) is a highest occupied molecular orbital (HOMO) energy level of the dopant, and HOMO(S) is a HOMO energy level of the sensitizer.

According to another aspect, provided is an organic light-emitting device including a first electrode, a second electrode, m emission units located between the first electrode and the second electrode and including at least one emission layer, m−1 charge generating layers located between two adjacent emission units among the m emission units and including an n-type charge generating layer and a p-type charge generating layer, wherein m is an integer of 2 or more, a maximum emission wavelength of light emitted from at least one emission unit among the m emission units is different from a maximum emission wavelength of light emitted from at least one emission unit among the remaining emission units, the emission layer includes a host, a dopant, and a sensitizer, and the dopant and the sensitizer satisfy the Conditions 1 and 2 described above.

According to another aspect, provided is an organic light-emitting device including a first electrode, a second electrode, and m emission layers between the first electrode and the second electrode, wherein m is an integer of 2 or more, a maximum emission wavelength of light emitted from at least one emission layer among the m emission layers is different from a maximum emission wavelength of light emitted from at least one emission layer among the remaining emission layers, the emission layer includes a host, a dopant, and a sensitizer, and the dopant and the sensitizer satisfy Conditions 1 and 2 described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
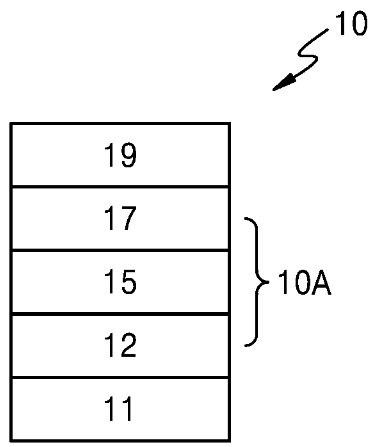
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

Figure 2:
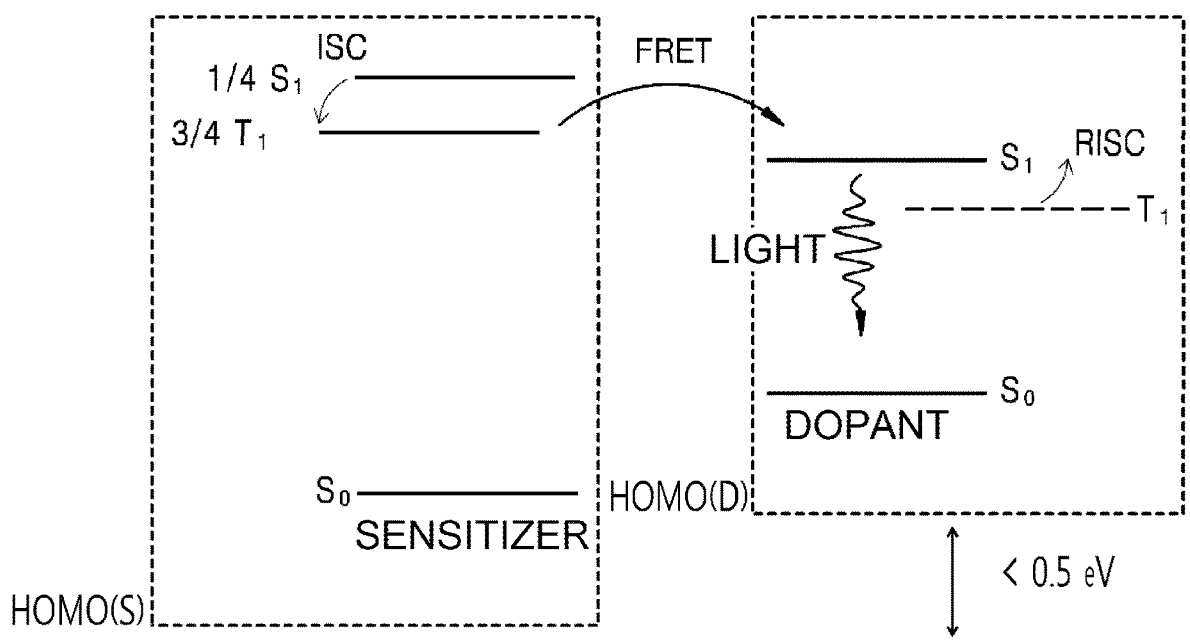
FIG. 2 shows a diagram schematically illustrating energy transfer in an emission layer of an organic light-emitting device according to an exemplary embodiment.

Description of FIGS. 1 and 2

FIG. 1 is a schematic view of an organic light-emitting device 10 according to an exemplary embodiment. Hereinafter, a structure and a manufacturing method of an organic light-emitting device according to an example of the present disclosure will be described with reference to FIG. 1.

The organic light-emitting device 10 of FIG. 1 includes a first electrode 11, a second electrode 19 facing the first electrode 11, and an organic layer 10A between the first electrode 11 and the second electrode 19.

The organic layer 10A includes an emission layer 15, a hole transport region 12 is located between the first electrode 11 and the emission layer 15, and an electron transport region 17 is located between the emission layer 15 and the second electrode 19.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

First Electrode 11

In one or more embodiments, the first electrode 11 may be formed by depositing or sputtering a material for forming the first electrode 11 on the substrate. The first electrode 11 may be an anode. The material for forming the first electrode 11 may be a material with a high work function to facilitate hole injection.

The first electrode 11 may be a reflective electrode, a semi-transmissive electrode, or a transmissive electrode. When the first electrode 11 is a transmissive electrode, a material for forming a first electrode may be indium tin oxide (ITO), indium zinc oxide (IZO), tin oxide ($SnO_2$), zinc oxide (ZnO), or any combinations thereof, but embodiments of the present disclosure are not limited thereto. In one or more embodiments, when the first electrode 11 is a semi-transmissive electrode or a reflective electrode, a material for forming a first electrode may be magnesium (Mg), silver (Ag), aluminum (Al), aluminum-lithium (Al—Li), calcium (Ca), magnesium-indium (Mg—In), magnesium-silver (Mg—Ag), or any combinations thereof, but embodiments of the present disclosure are not limited thereto.

The first electrode 11 may have a single-layered structure or a multi-layered structure including two or more layers.

[Emission Layer 15]

The emission layer 15 includes a host, a dopant, and a sensitizer.

The emission layer 15 emits fluorescent light. That is, the dopant is a material that may emit fluorescent light. The emission layer 15 emitting the fluorescent light is clearly distinguished from an emission layer emitting phosphorescent light.

In one or more embodiments, the emission layer 15 may include a host, a dopant, and a sensitizer, wherein the dopant and the sensitizer may satisfy the following Conditions 1 and 2:

$$0.2\ \text{eV} \leq \Delta E_{ST}(S) \qquad \text{<Condition 1>}$$

$$|\text{HOMO}(D) - \text{HOMO}(S)| < 0.5\ \text{eV}. \qquad \text{<Condition 2>}$$

In Conditions 1 and 2, $\Delta E_{ST}(S)$ is a difference between a lowest excitation singlet energy level and a lowest excitation triplet energy level of the sensitizer, HOMO(D) is a highest occupied molecular orbital (HOMO) energy level of the dopant, and HOMO(S) is a HOMO energy level of the sensitizer.

Each of the lowest excitation singlet energy level and the lowest excitation triplet energy level of the sensitizer is evaluated by using a DFT method of a Gaussian 09 program which is structurally optimized at B3LYP/6-31G(d,p) level.

Each of the HOMO energy levels of the dopant and the sensitizer is a value calculated from a reduction onset potential measured by using cyclic voltammetry (CV).

More detailed evaluation methods of the HOMO energy levels of the dopant and the sensitizer and $\Delta E_{ST}(S)$ of the sensitizer are described with reference to the following Examples.

In the present disclosure, by satisfying Condition 1, stability of the sensitizer, in particular, stability at the lowest excitation triplet energy level, may be ensured. Accordingly, stability of an organic light-emitting device including the sensitizer may be improved, and roll-off characteristics may be improved.

In the present disclosure, by satisfying Condition 2, the lifespan of an organic light-emitting device may be improved. In detail, the dopant may have a relatively high hole trap characteristic. However, when the sensitizer is selected to satisfy Condition 2, the hole trap characteristic of the dopant may be improved, thereby allowing holes to be well transmitted from the dopant to the sensitizer. Accordingly, an organic light-emitting device may be controlled not to emit light in a certain region in an emission layer, and thus the deterioration of the dopant due to high exciton energy is suppressed. Thus, the organic light-emitting device may have improved lifespan characteristics.

In detail, the organic light-emitting device may further satisfy Condition 1-1 below:

$$0.2\ \text{eV} \leq \Delta E_{ST}(S) \leq 0.4\ \text{eV}. \qquad \text{<Condition 1-1>}$$

In Condition 1-1, $\Delta E_{ST}(S)$ is a difference between a lowest excitation singlet energy level and a lowest excitation triplet energy level of the sensitizer.

In the present disclosure, the sensitizer necessarily includes an atom such as Pt, and thus the full width at half maximum of the sensitizer may be relatively small. Accordingly, color reproducibility of the organic light-emitting device may be improved.

In detail. the sensitizer may satisfy Condition 3 below:

$$T_1(S) \geq 2.63\ \text{eV}. \qquad \text{<Condition 3>}$$

In Condition 3, $T_1(S)$ is the lowest triplet excitation energy level of the sensitizer.

In detail, the sensitizer may further satisfy Condition 4 below:

$$\text{HOMO}(S) \geq -6.0\ \text{eV}. \qquad \text{<Condition 4>}$$

In Condition 4,

HOMO(S) is a HOMO energy level of the sensitizer.

In detail, a typical energy transfer in an organic light-emitting device according to an embodiment is described below with reference to FIG. 2.

Not wishing to be bound by theory, 75% of triplet excitons formed in the host are transmitted to a sensitizer via Dexter energy transfer, and the energy of 25% of singlet excitons formed in the host are transferred to a singlet and triplet of the sensitizer. The energy transferred to the singlet intersystem crosses to the triplet, and then the triplet energy of the sensitizer is transferred to a dopant via Forster energy transfer.

Accordingly, both singlet excitons and triplet excitons, generated in an emission layer, are transmitted to a dopant, and thus an organic light-emitting device with improved efficiency may be obtained. In addition, since an organic light-emitting device in which energy loss is significantly reduced may be obtained, the organic light-emitting device may have improved lifespan characteristics.

An amount of the sensitizer in the emission layer may be selected within the range of 5 wt % to 50 wt %. When the amount of the sensitizer is within this range, efficient energy transfer in an emission layer may be achieved, and an organic light-emitting device with high efficiency and long lifespan may be implemented.

In one or more embodiment, the host, the dopant, and the sensitizer may further satisfy Condition 6 below:

$$T_1(H) \geq T_1(S) \geq S_1(D). \qquad \text{<Condition 6>}$$

In Condition 6, $T_1(H)$ is a lowest excitation triplet energy level of the host, $S_1(D)$ is a lowest excitation singlet energy level of the dopant, and $T_1(S)$ is a lowest excitation triplet energy level of the sensitizer.

When the host, the dopant, and the sensitizer further satisfy Condition 6, triplet excitons in an emission layer may be efficiently transmitted to the dopant, and thus an organic light-emitting device with improved efficiency may be obtained.

The emission layer may consist of the host, the dopant, and the sensitizer. That is, the emission layer may not further include materials other than the host, the dopant, and the sensitizer.

A thickness of the emission layer may be in a range of about 100 Å to about 1,000 Å, for example, about 200 Å to about 600 Å. When the thickness of the emission layer is within the range, excellent light-emission characteristics may be obtained without a substantial increase in driving voltage.

Among total emission components emitted from the emission layer, a proportion of emission components emitted from the dopant may be 90% or more.

[Host in Emission Layer 15]

The host may include no metal atoms.

In one or more embodiments, the host may include one kind of host. When the host includes one host, the one host may be an amphoteric host, an electron transport host, and a hole transport host, which will be described later.

In one or more embodiments, the host may include a mixture of two or more different hosts. For example, the host may be a mixture of an electron transport host and a hole transport host, a mixture of two types of electron transport hosts different from each other, or a mixture of two types of hole transport hosts different from each other. The electron transport host and the hole transport host may be understood by referring to the related description to be disclosed herein.

In one or more embodiments, the host may include an electron transport host including at least one electron transport moiety, a hole transport host that is free of an electron transport moiety, or any combination thereof.

The electron transport moiety used herein may be a cyano group, a π electron-deficient nitrogen-containing $C_1$-$C_{60}$ cyclic group, or a group represented by one of the following formulae:

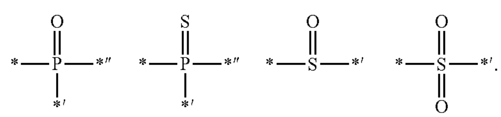

In the formulae, *, *', and *" are each a binding site to a neighboring atom.

In one or more embodiments, the electron transport host of the emission layer 15 may include at least one of a cyano group, a π electron-deficient nitrogen-containing $C_1$-$C_{60}$ cyclic group, or any combination thereof.

In one or more embodiments, the electron transport host in the emission layer 15 may include at least one cyano group.

In one or more embodiments, the electron transport host in the emission layer 15 may include at least one cyano group, at least one π electron deficient nitrogen-containing $C_1$-$C_{60}$ cyclic group, or any combination thereof.

In one or more embodiments, the host may include an electron transport host and a hole transport host, wherein the electron transport host may include at least one π electron-rich $C_3$-$C_{60}$ cyclic group, at least one electron transport moiety, or any combination thereof, and the hole transport host may include at least one π electron-rich $C_3$-$C_{60}$ cyclic group and may not include an electron transport moiety.

The term "π electron-deficient nitrogen-containing $C_1$-$C_{60}$ cyclic group" used herein refers to a cyclic group having at least one *—N═*' moiety, and for example, may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group; a condensed cyclic group in which two or more π electron-efficient nitrogen-containing $C_1$-$C_{60}$ cyclic groups, or any combination thereof.

Meanwhile, the π electron-rich $C_3$-$C_{60}$ cyclic group may be a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, benzosilolocarbazole group, a triindolobenzene group; or a condensed cyclic group of two or more π electron-rich $C_3$-$C_{60}$ cyclic groups, but embodiments of the present disclosure are not limited thereto.

In one or more embodiments, the electron transport host may be a compound represented by Formula E-1, and the hole transport host may be compounds represented by Formula H-1, but embodiments of the present disclosure are not limited thereto:

$$[Ar_{301}]_{xb11}\text{-}[(L_{301})_{xb1}\text{-}R_{301}]_{xb21}. \quad \text{<Formula E-1>}$$

In Formula E-1, $Ar_{301}$ may be a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may each independently be a single bond, a group represented by the following formula, a substituted or unsubstituted $C_5$-$C_{60}$ carbocyclic group, or a substituted or unsubstituted $C_1$-$C_{60}$ heterocyclic group, and * and in the following formulae are each a binding site to a neighboring atom,

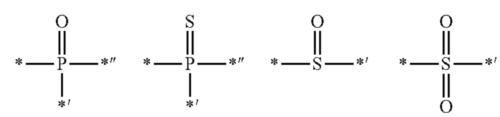

xb1 may be an integer from 1 to 5, $R_{301}$ may be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), —S(═O)($Q_{301}$), —P(═O)($Q_{301}$)($Q_{302}$), or —P(═S)($Q_{301}$)($Q_{302}$), xb21 may be an integer from 1 to 5, $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, and at least one of <Condition 1> to <Condition 3> is satisfied:

<Condition 1>

$Ar_{301}$, $L_{301}$, and $R_{301}$ in Formula E-1 may each independently include a π electron-deficient nitrogen-containing $C_1$-$C_{60}$ cyclic group;

<Condition 2>

$L_{301}$ in Formula E-1 is a group represented by the following formulae:

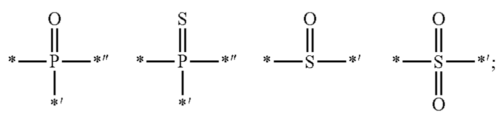

<Condition 3>

$R_{301}$ in Formula E-1 may be a cyano group, —S(═O)$_2$($Q_{301}$), —S(═O)($Q_{301}$), —P(═O)($Q_{301}$)($Q_{302}$), or —P(═S)($Q_{301}$)($Q_{302}$).

$Ar_{401}$-$(L_{401})_{xd1}$-$(Ar_{402})_{xd11}$ <Formula H-1>

11

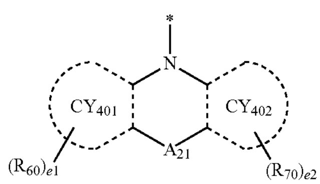

12

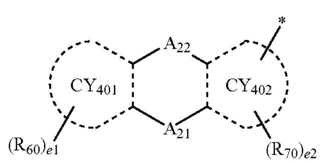

In Formulae H-1, 11, and 12, $L_{401}$ may be:

a single bond; or a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with at least one deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or any combination thereof.

xd1 may be an integer from 1 to 10, wherein when xd1 is 2 or more, two or more of $L_{401}$(s) may be identical to or different from each other, $Ar_{401}$ may be a group represented by Formulae 11 or 12, $Ar_{402}$ may be:

a group represented by Formula 11 or 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each substituted with at least one deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, a triphenylenyl group, or any combination thereof, $CY_{401}$ and $CY_{402}$ may each independently be a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, $A_{21}$ may be a single bond, O, S, N($R_{51}$), C($R_{51}$)($R_{52}$), or Si($R_{51}$)($R_{52}$), $A_{22}$ may be a single bond, O, S, N($R_{53}$), C($R_{53}$)($R_{54}$), or Si($R_{53}$)($R_{54}$), at least one $A_{21}$, $A_{22}$, or any combination thereof in Formula 12 is not a single bond, $R_{51}$ to $R_{54}$, $R_{60}$, and $R_{70}$ may each independently be:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group, or a $C_1$-$C_{20}$ alkoxy group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, or any combination thereof;

a π electron-rich $C_3$-$C_{60}$ cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group);

a π electron-rich $C_3$-$C_{60}$ cyclic group (for example, a phenyl group, a naphthyl group, a fluorenyl group, a carbazolyl group, a dibenzofuranyl group, a dibenzothiophenyl group, a biphenyl group, a terphenyl group, or a triphenylenyl group), each substituted with at least one deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, or any combination thereof; or —Si($Q_{404}$)($Q_{405}$)($Q_{406}$), e1 and e2 are each independently an integer from 0 to 10, $Q_{401}$ to $Q_{406}$ may each independently be hydrogen, deuterium, a hydroxyl group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to a neighboring atom.

In one or more embodiments, $Ar_{301}$ and $L_{301}$ in Formula E-1 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, a benzothiazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof, at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof, and $R_{301}$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano group-containing phenyl group, a cyano group-containing biphenyl group, a cyano group-containing terphenyl group, a cyano group-containing tetraphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one or more embodiments, $Ar_{301}$ may be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with at least one deuterium, —F, —CI, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof; and a group represented by one of Formulae 5-1 to 5-3 and Formulae 6-1 to 6-33, and $L_{301}$ may be groups represented by Formulae 5-1 to 5-3 and Formulae 6-1 to 6-33:

5-1

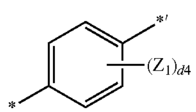

5-2

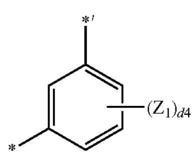

5-3

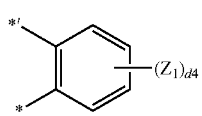

6-1

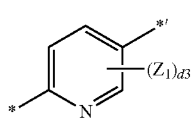

6-2

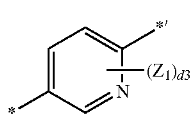

6-3

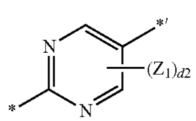

6-4

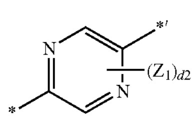

-continued 6-5

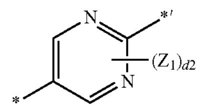

6-6

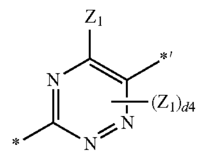

6-7

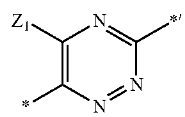

6-8

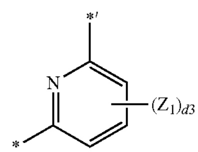

6-9

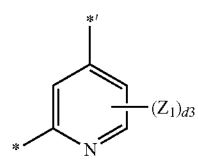

6-10

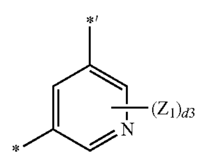

6-11

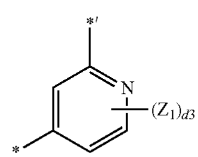

6-12

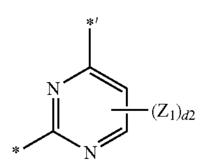

6-13

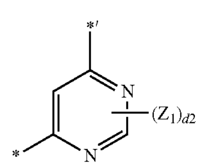

6-14

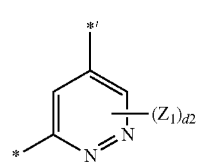

-continued 6-15

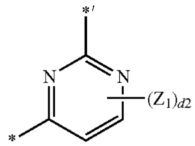

6-16

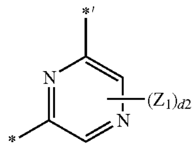

6-17

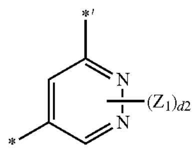

6-18

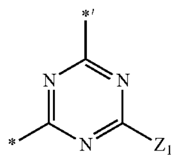

6-19

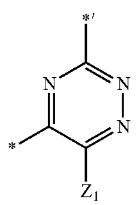

6-20

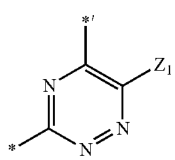

6-21

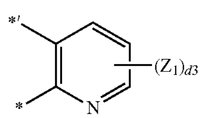

6-22

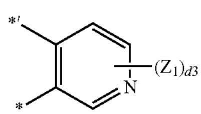

6-23

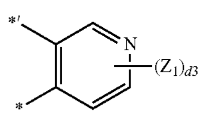

6-24

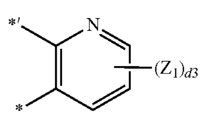

6-25

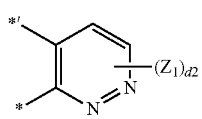

-continued 6-26

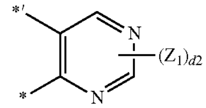

6-27

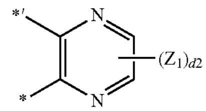

6-28

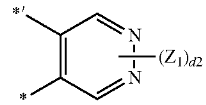

6-29

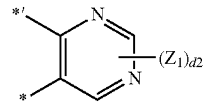

6-30

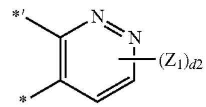

6-31

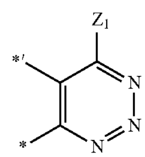

6-32

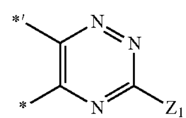

6-33

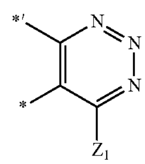

In Formulae 5-1 to 5-3 and 6-1 to 6-33, $Z_1$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$, d4 may be 0, 1, 2, 3, or 4, d3 may be 0, 1, 2, or 3, d2 may be 0, 1, or 2, and

* and *' each indicate a binding site to a neighboring atom.

$Q_{31}$ to $Q_{33}$ are the same as described above.

In one or more embodiments, $L_{301}$ may be groups represented by Formulae 5-2, 5-3, and 6-8 to 6-33.

In one or more embodiments, $R_{301}$ may be a cyano group or a group represented by one of Formulae 7-1 to 7-18, and at least one of $Ar_{402}$(s) in the number of xd11 may be a group represented by one of Formulae 7-1 to 7-18, but embodiments of the present disclosure are not limited thereto:

7-1

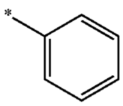

7-2

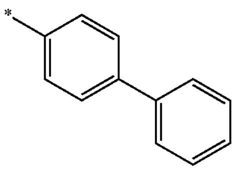

7-3

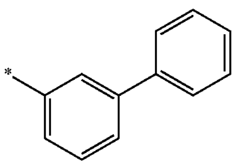

7-4

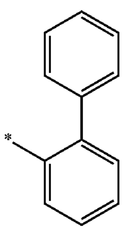

7-5

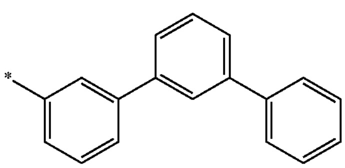

7-6

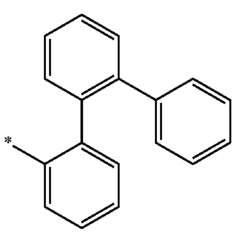

7-7

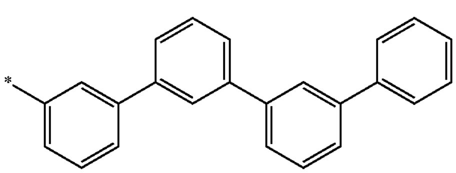

-continued 7-8

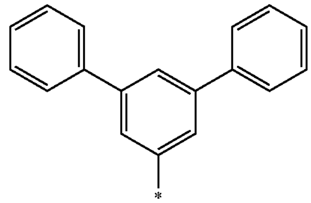

7-9

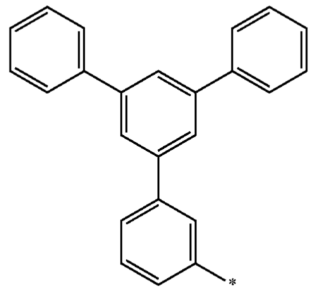

7-10

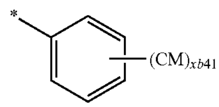

7-11

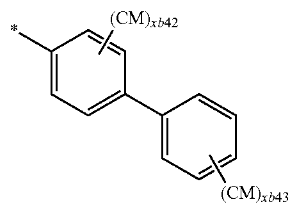

7-12

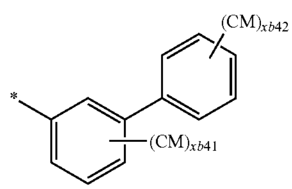

7-13

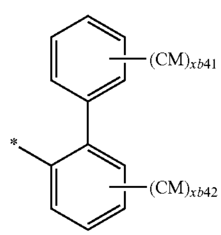

7-14

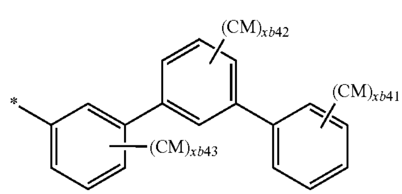

-continued 7-15

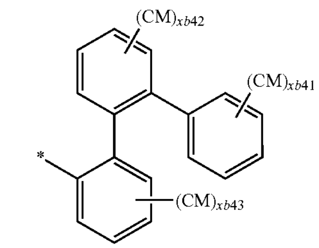

7-16

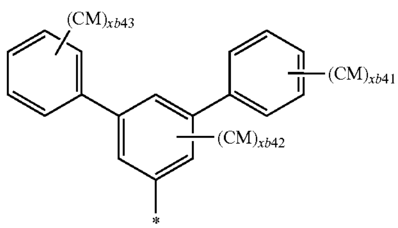

7-17

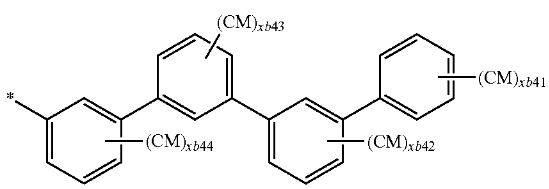

-continued 7-18

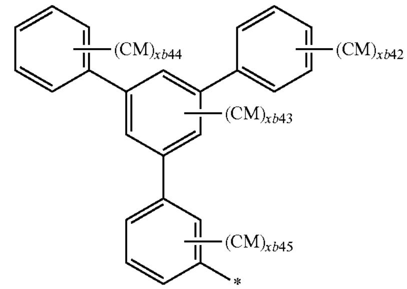

In Formulae 7-1 to 7-18, xb41 to xb44 may each be 0, 1, or 2, wherein xb41 in Formula 7-10 is not 0, the sum of xb41 and xb42 in Formulae 7-11 to 7-13 is not 0, the sum of xb41, xb42, and xb43 in Formulae 7-14 to 7-16 is not 0, the sum of xb41, xb42, xb43, and xb44 in Formulae 7-17 and 7-18 is not 0, and * indicates a binding site to a neighboring atom.

Two or more $Ar_{301}$(s) in Formula E-1 may be identical to or different from each other, two or more $L_{301}$(s) may be identical to or different from each other, two or more $L_{401}$(s) in Formula H-1 may be identical to or different from each other, and two or more $Ar_{402}$(s) in Formula H-1 may be identical to or different from each other.

In one or more embodiments, the electron transport host includes i) at least one of a cyano group, a pyrimidine group, a pyrazine group, a triazine group, or any combination thereof, and ii) a triphenylene group, and the hole transport host may include a carbazole group.

In one or more embodiments, the electron transport host may include at least one cyano group.

The electron transport host may be, for example, of Groups HE1 to HE7, but embodiments of the present disclosure are not limited thereto:

<Group HE1>

H-E1

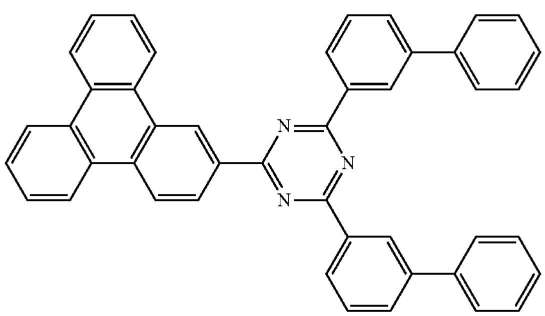

H-E2

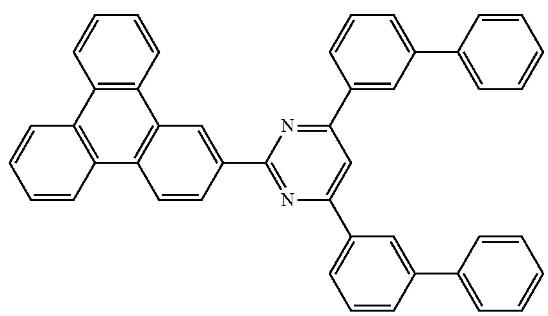

H-E3

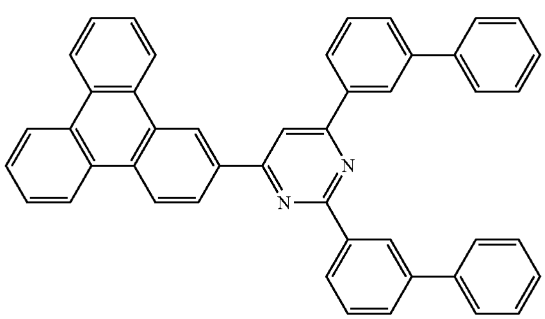

H-E4

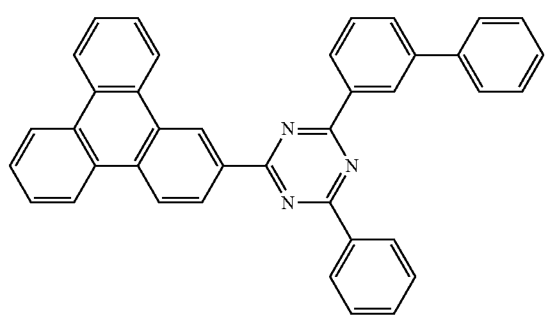

-continued
H-E5
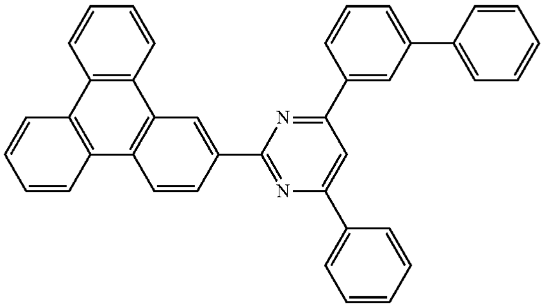
H-E6
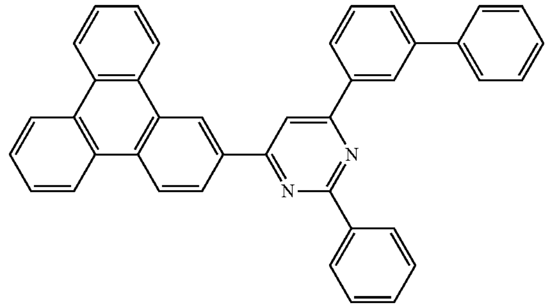
H-E7
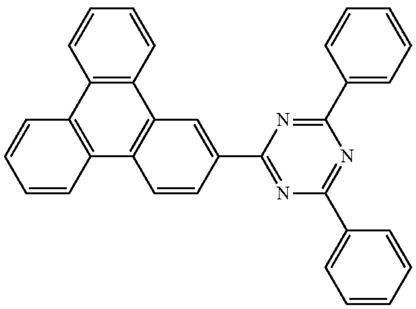
H-E8
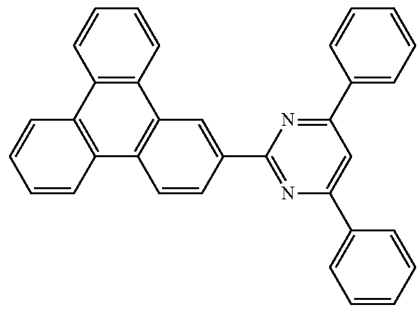
H-E9
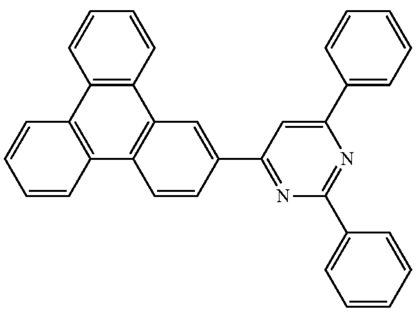
H-E10
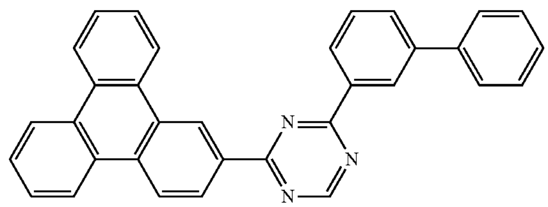
H-E11
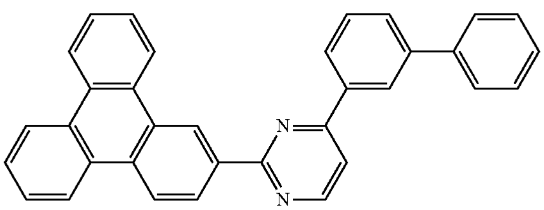
H-E12
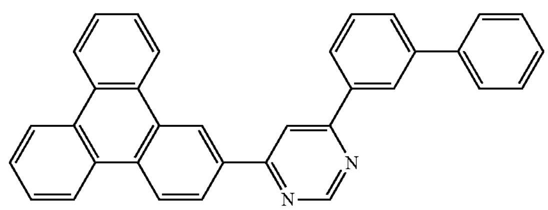
H-E13
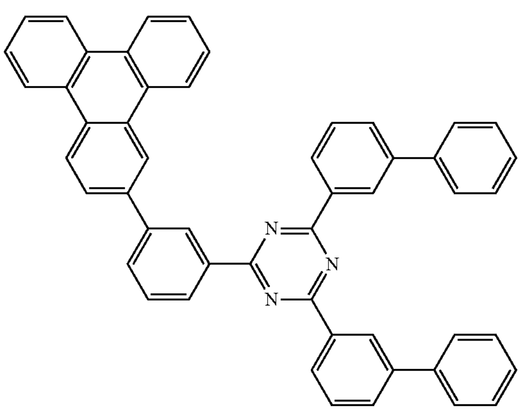
H-E14
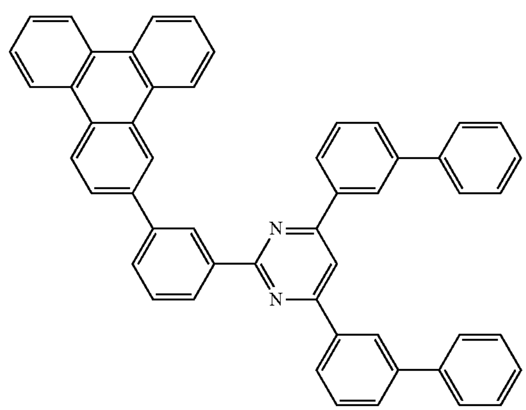

-continued
H-E15
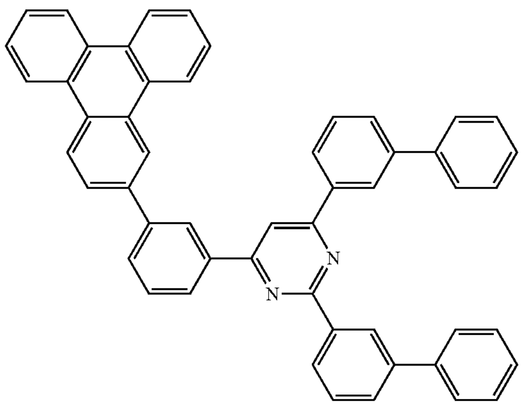
H-E16
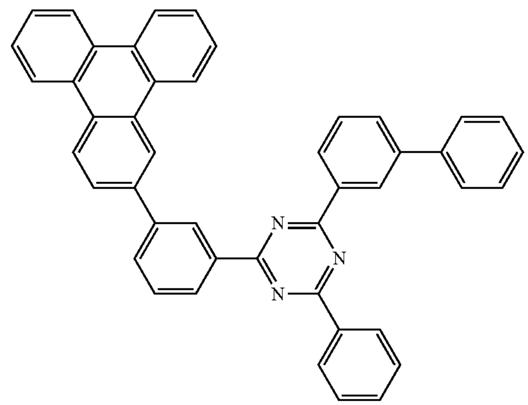
H-E17
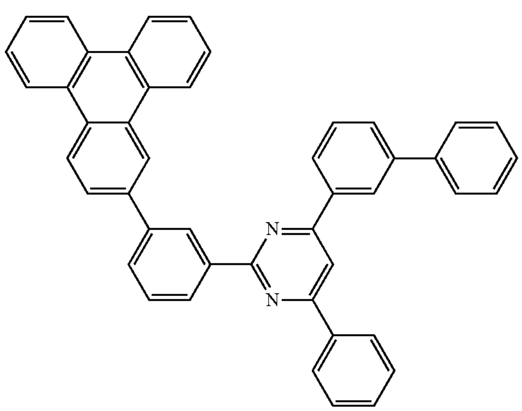
H-E18
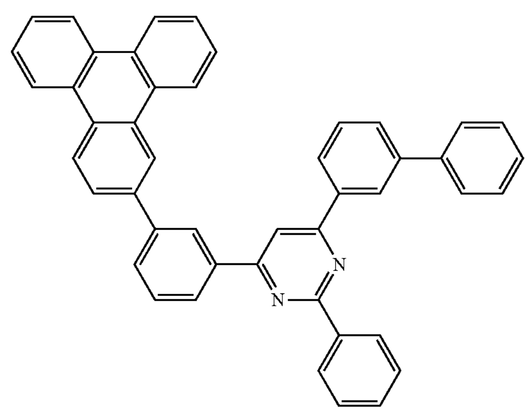
H-E19
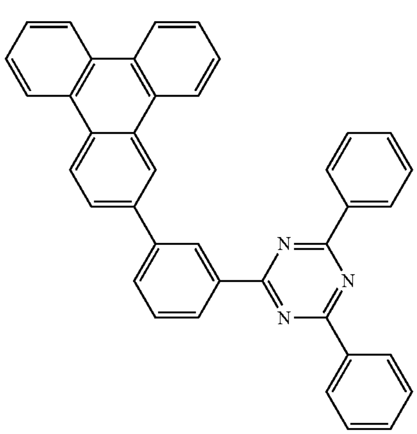
H-E20
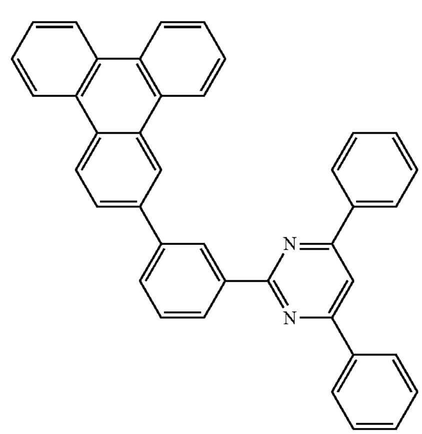

-continued
H-E21
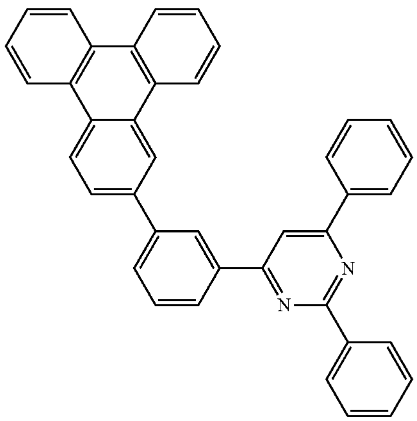
H-E22
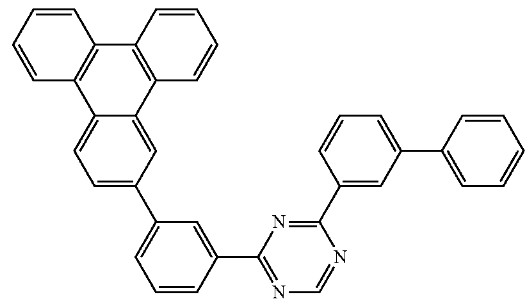
H-E23
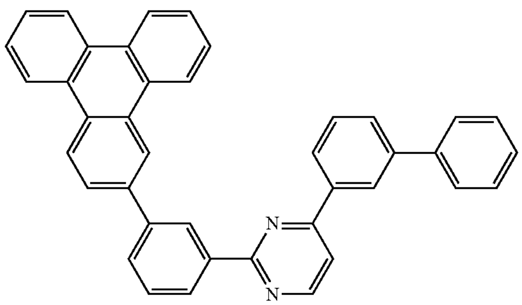
H-E24
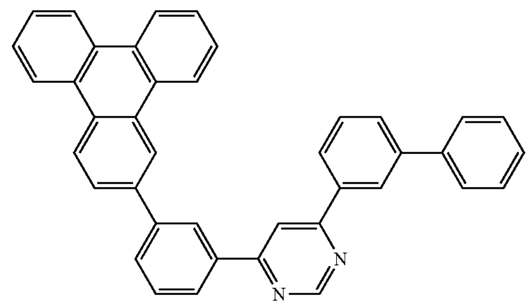
H-E25
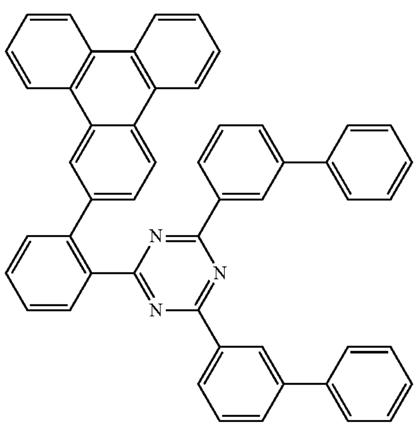
H-E26
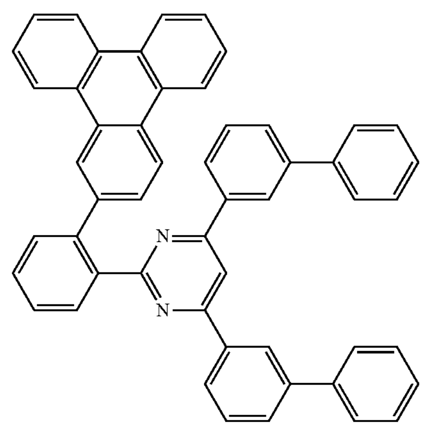
H-E27
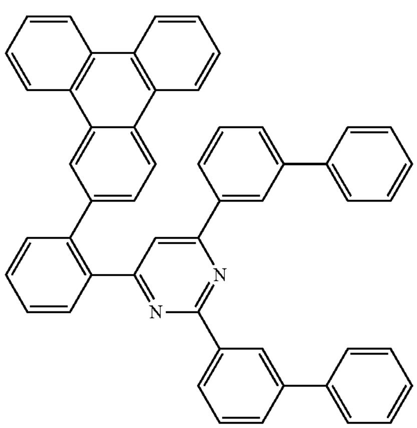
H-E28
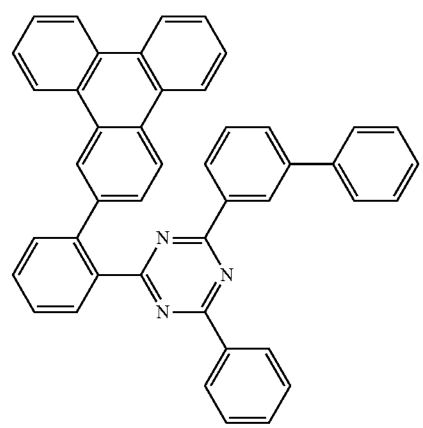

-continued
H-E29
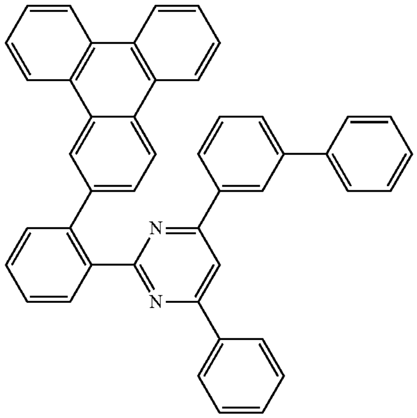
H-E30
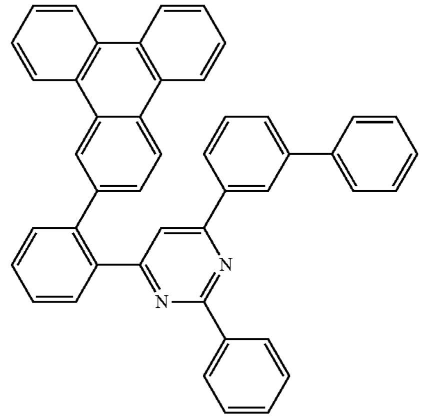
H-E31
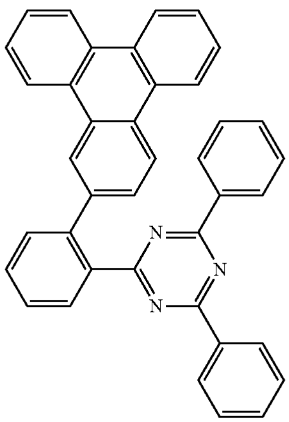
H-E32
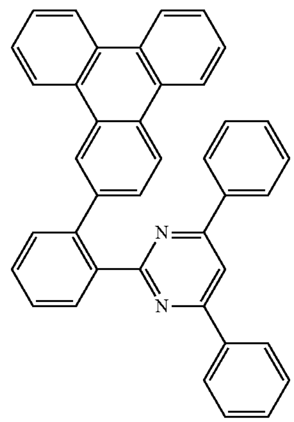
H-E33
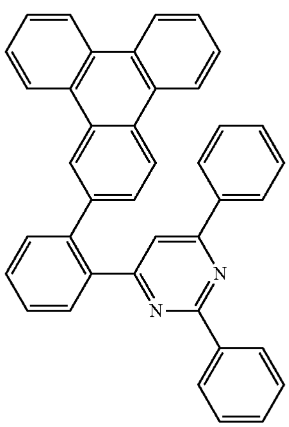
H-E34
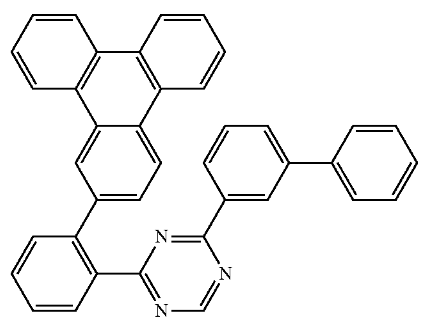
H-E35
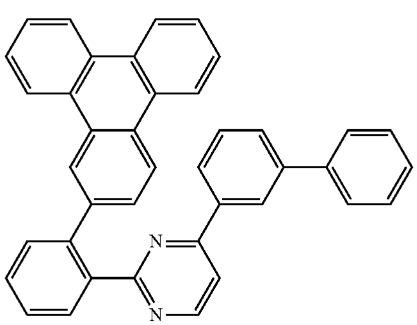
H-E36
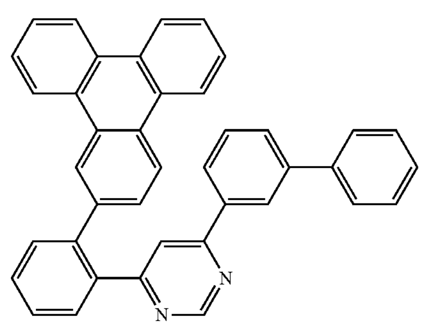

-continued
H-E37
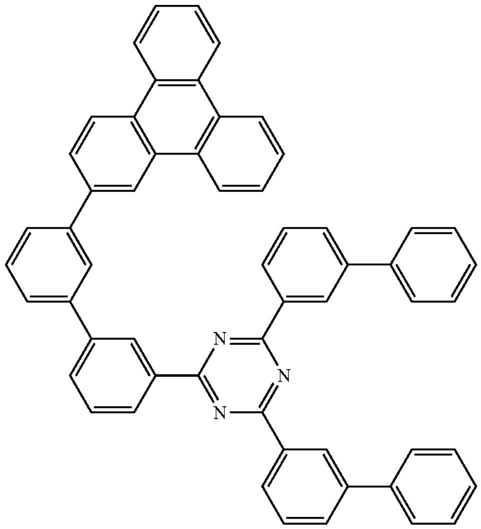
H-E38
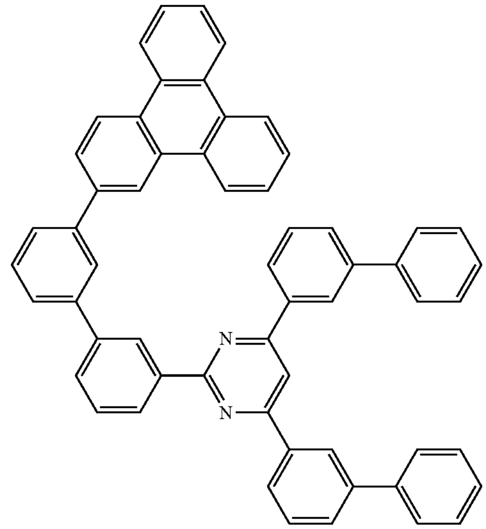
H-E39
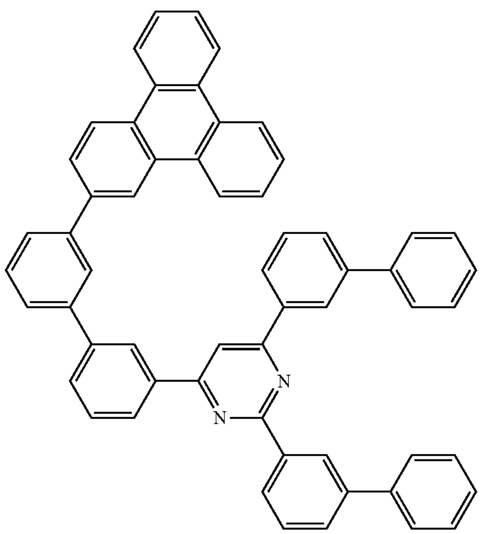
H-E40
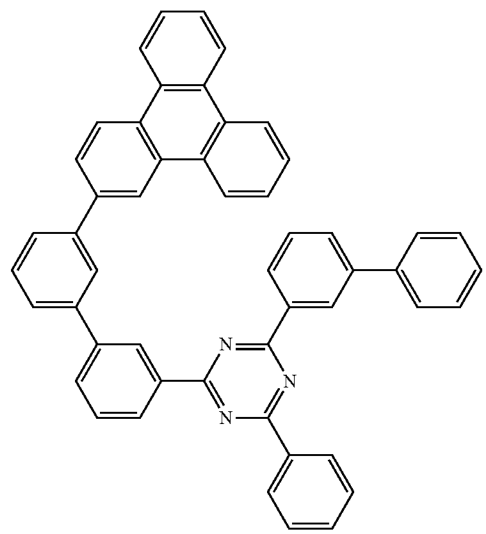
H-E41
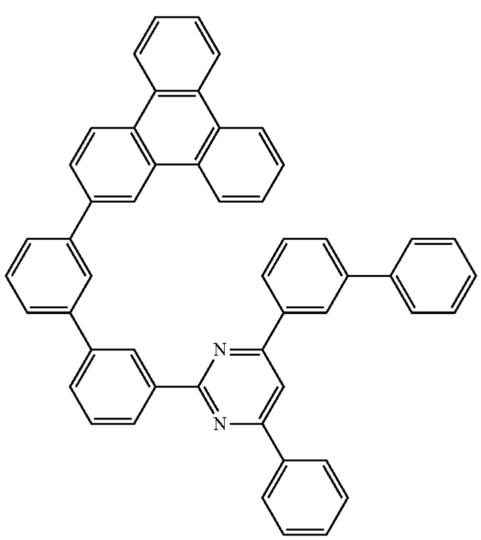
H-E42
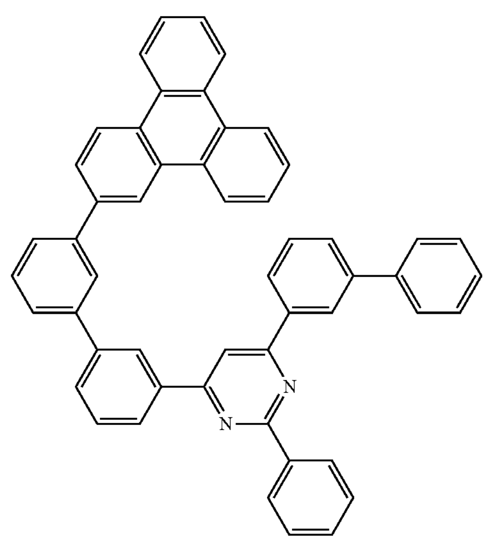

-continued
H-E43
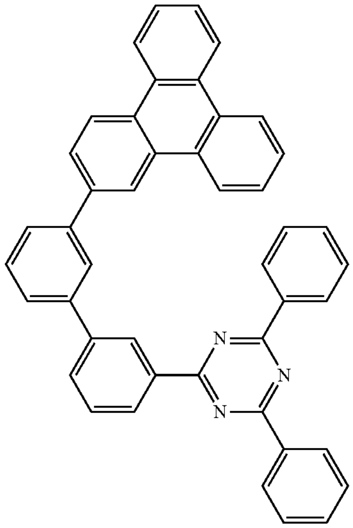
H-E44
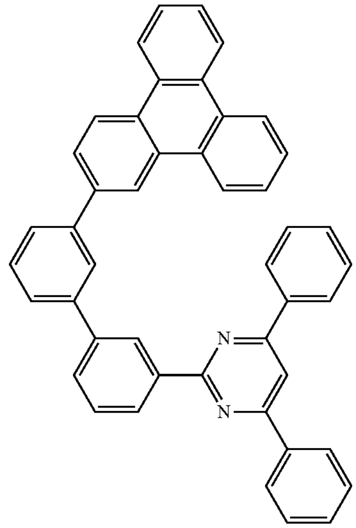
H-E45
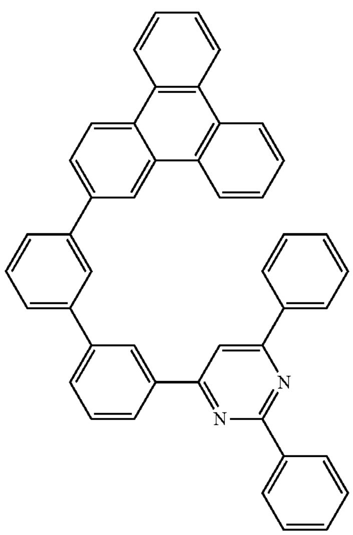
H-E46
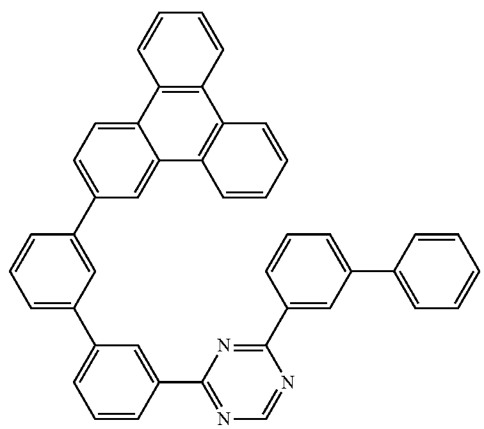
H-E47
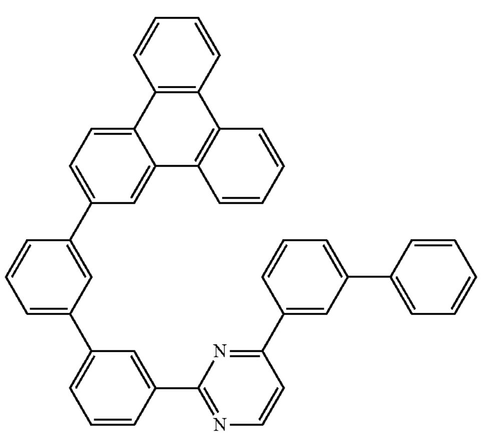
H-E48
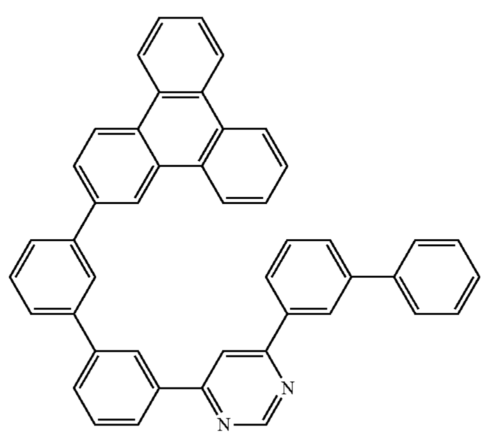

-continued
H-E49
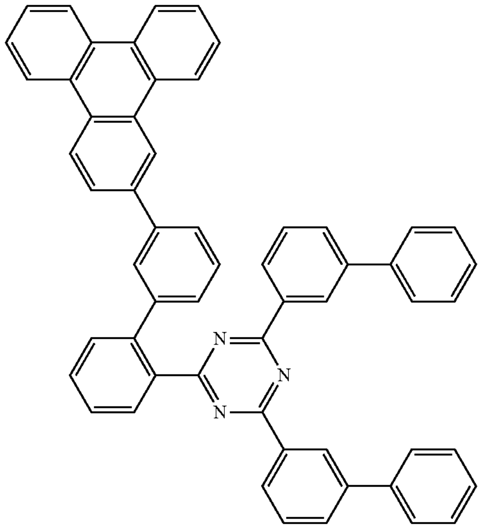
H-E50
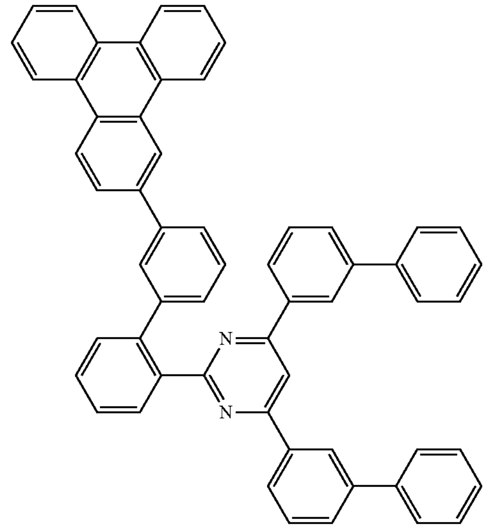
H-E51
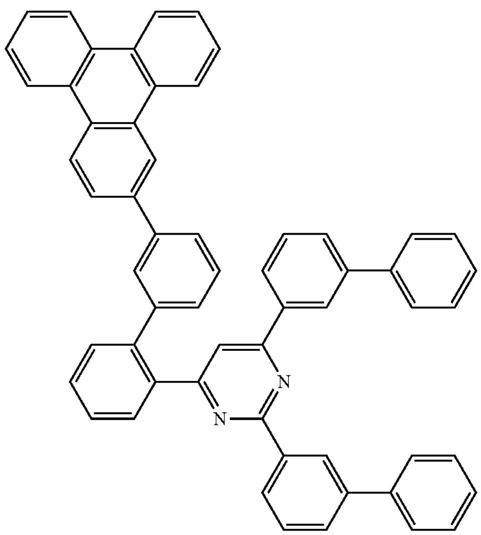
H-E52
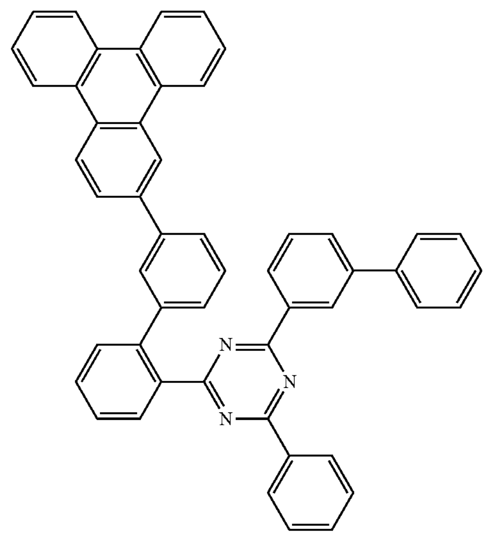
H-E53
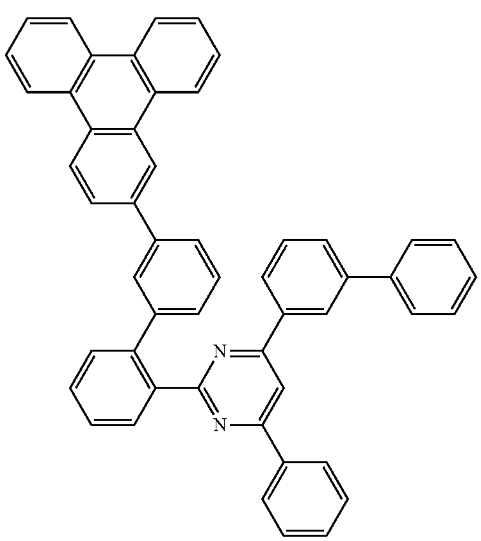
H-E54
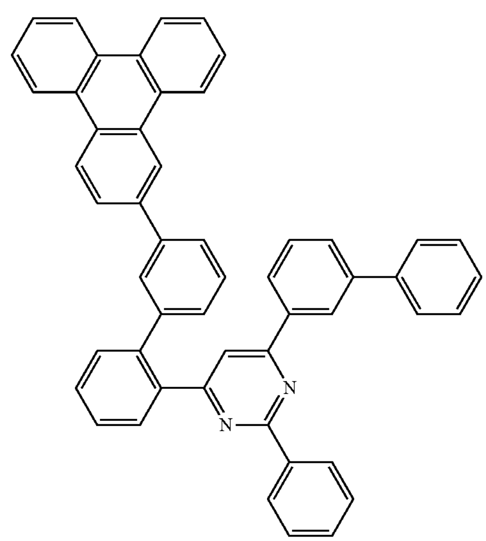

-continued
H-E55
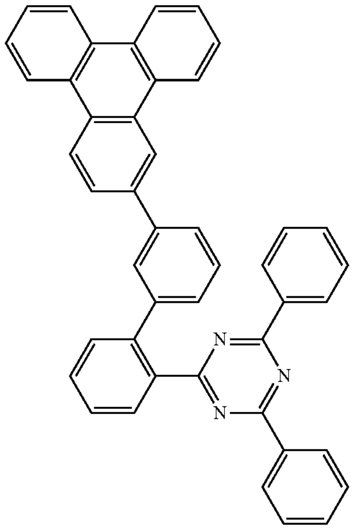
H-E56
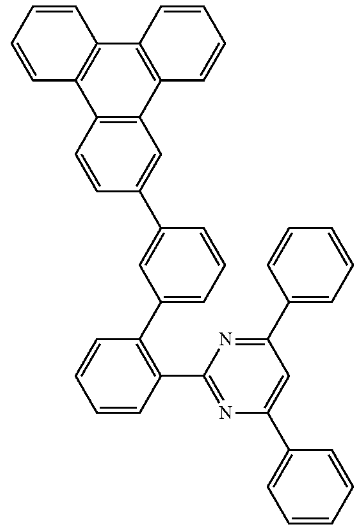
H-E57
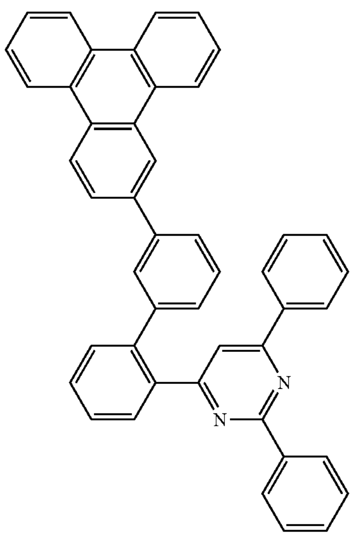
H-E58
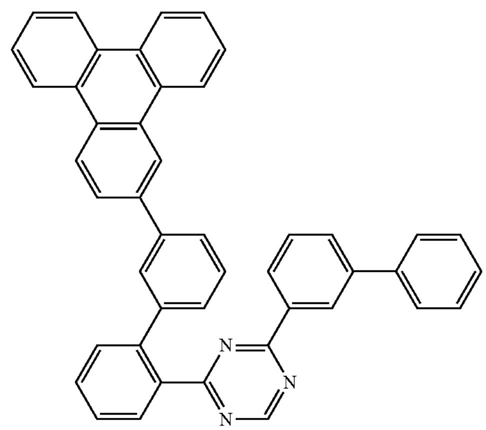
H-E59
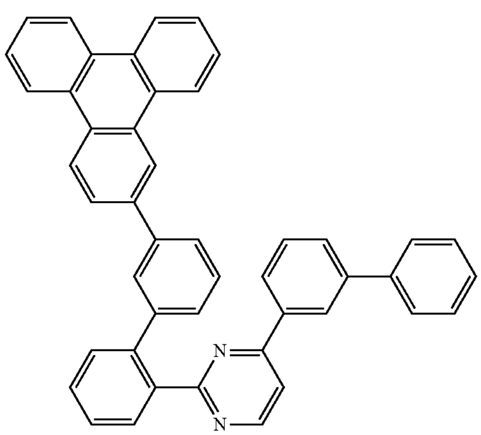
H-E60
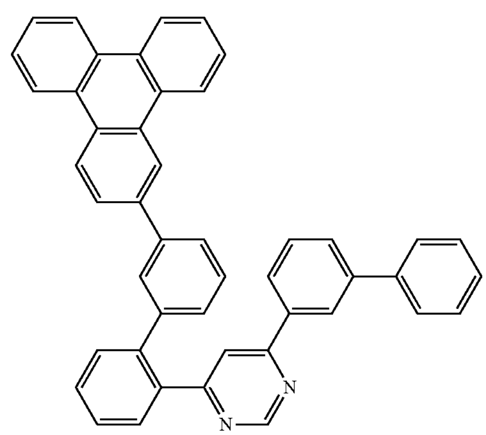

-continued
H-E61
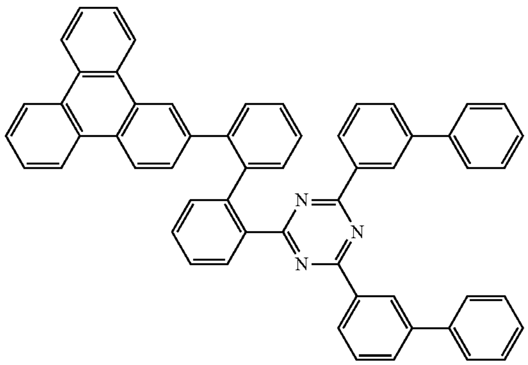
H-E62
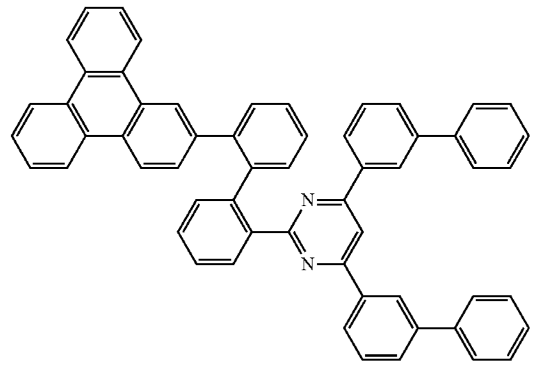
H-E63
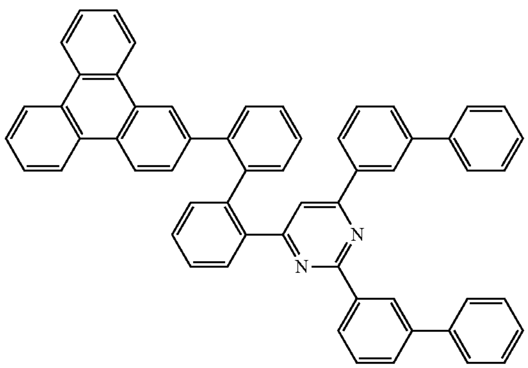
H-E64
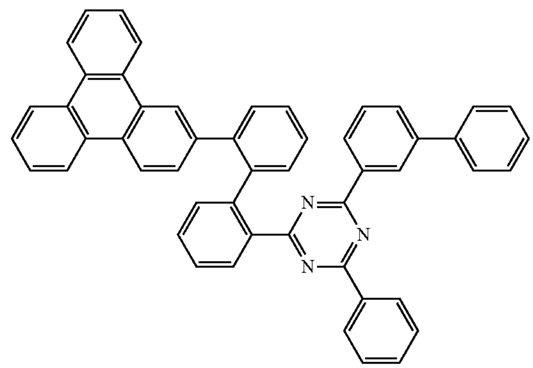
H-E65
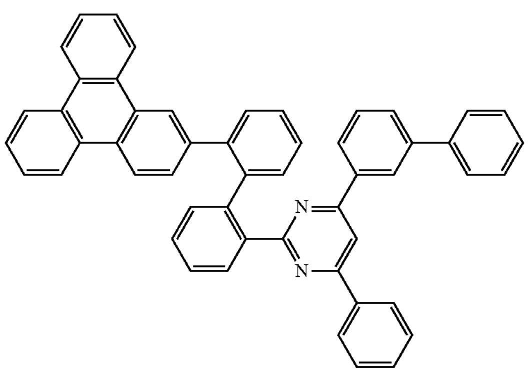
H-E66
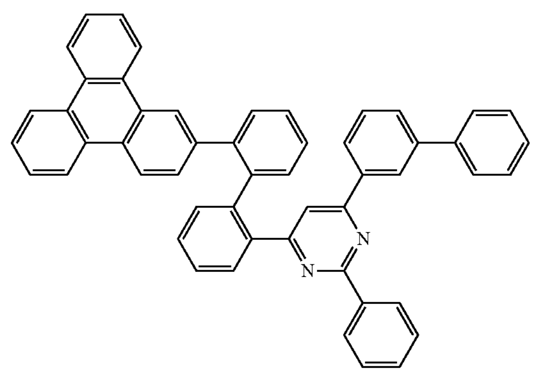
H-E67
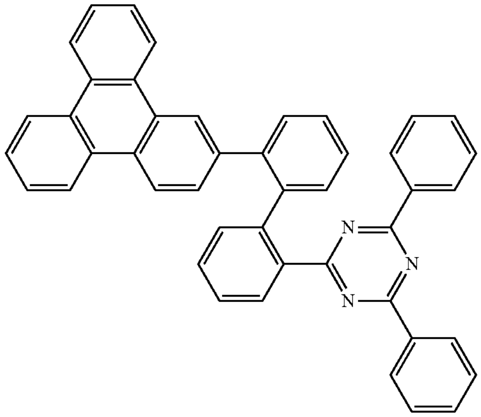
H-E68
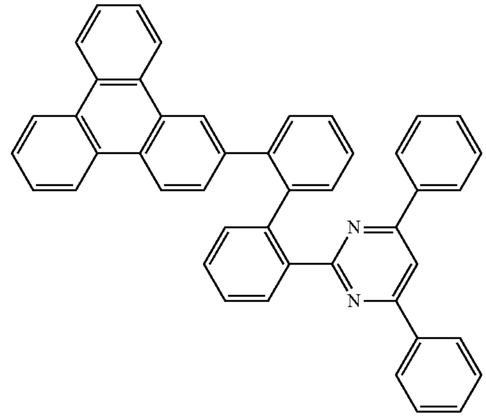

-continued
H-E69
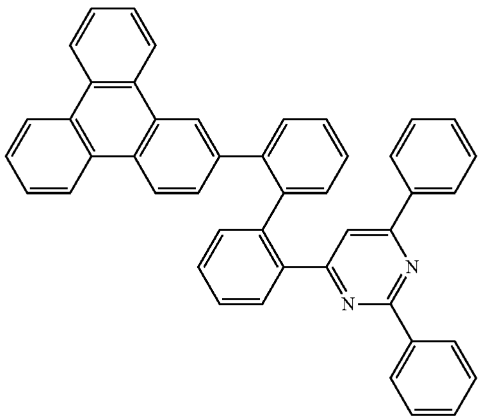
H-E70
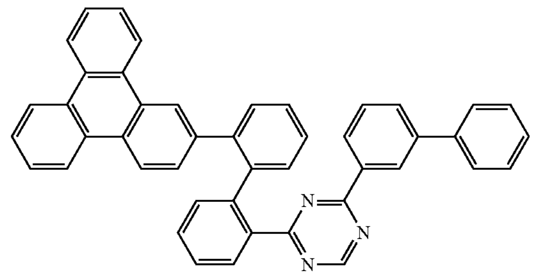
H-E71
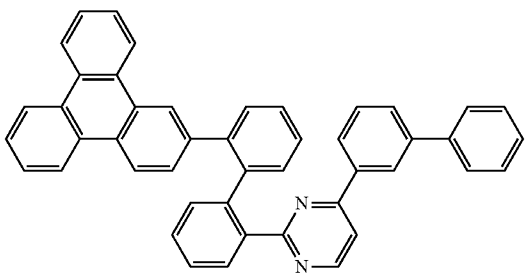
H-E72
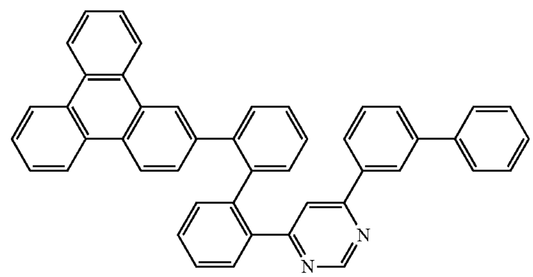
H-E73
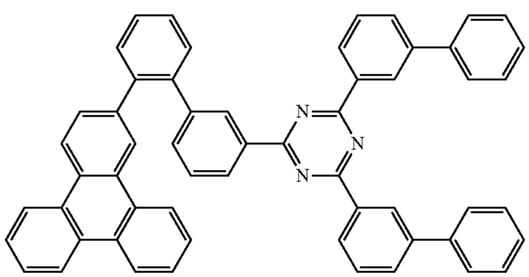
H-E74
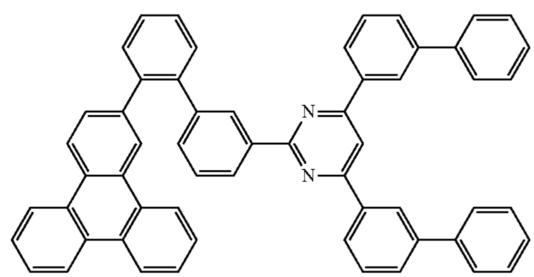
H-E75
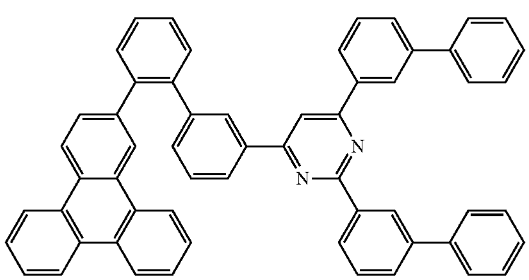
H-E76
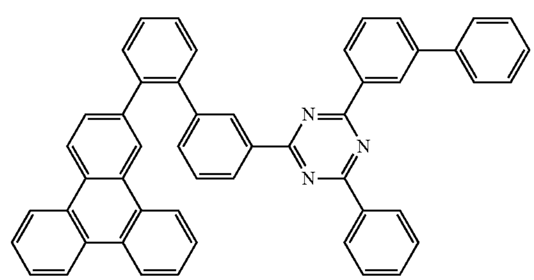
H-E77
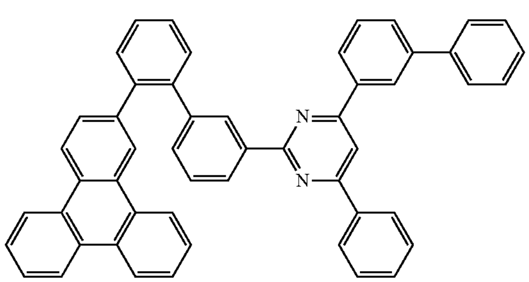
H-E78
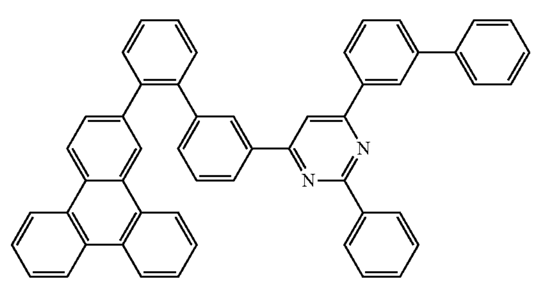

-continued
H-E79
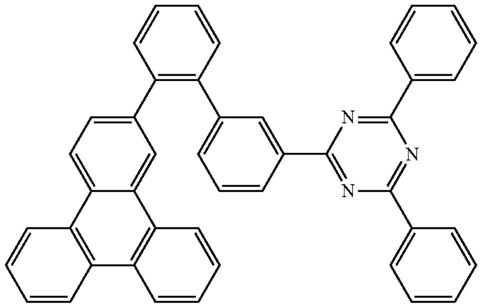
H-E80
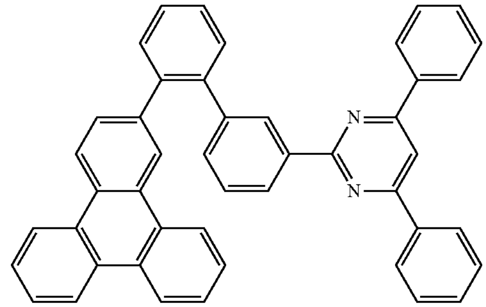
H-E81
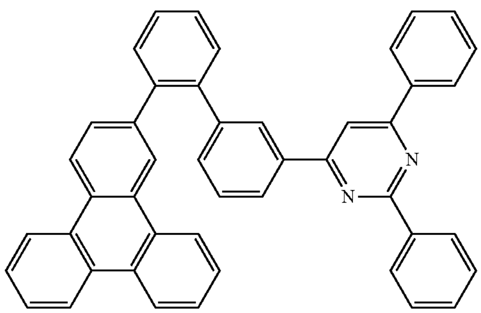
H-E82
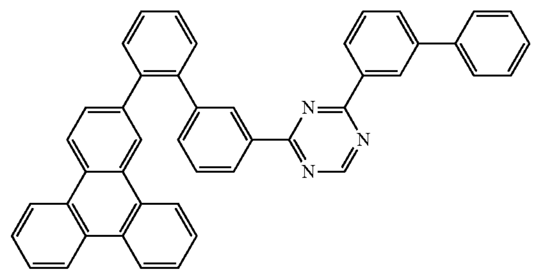
H-E83
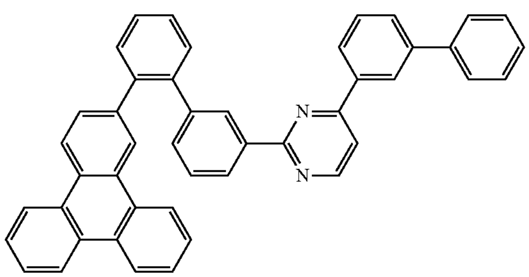
H-E84
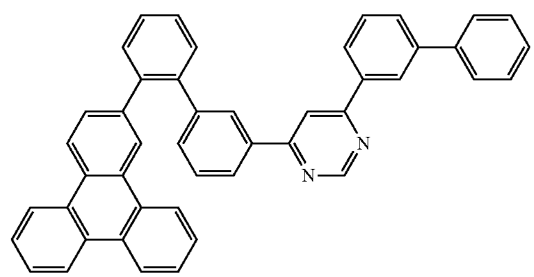
H-E(1)
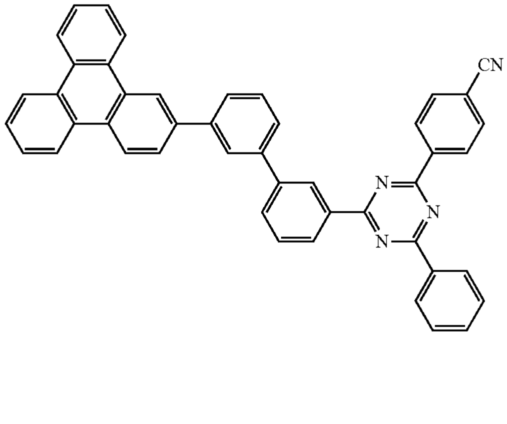
H-E(2)
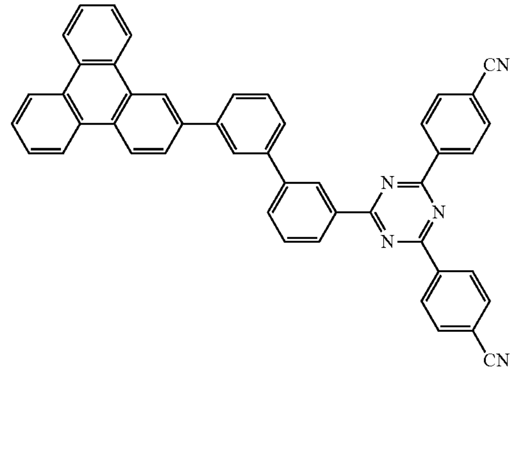

-continued
H-E(3)
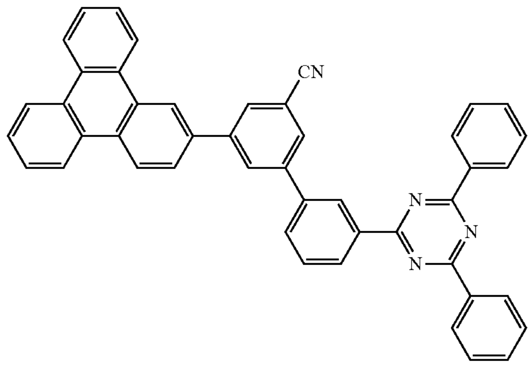
H-E(4)
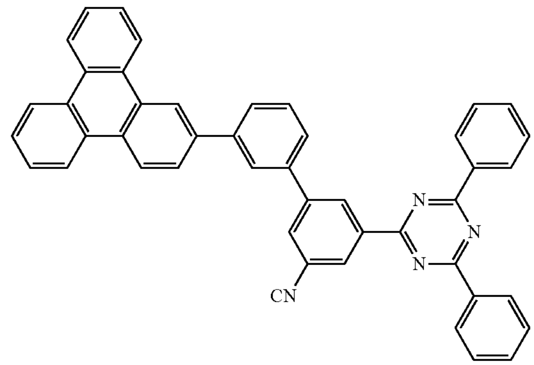
A-1
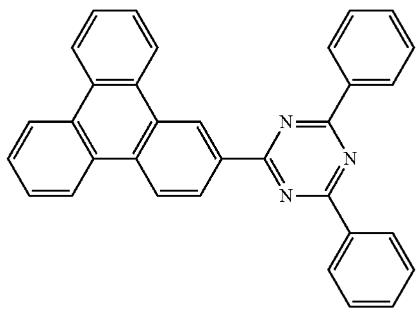
A-2
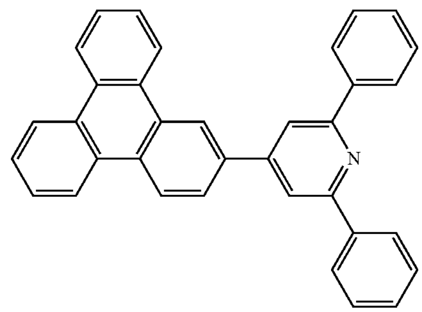
A-3
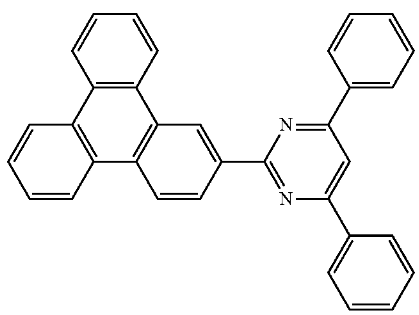
A-4
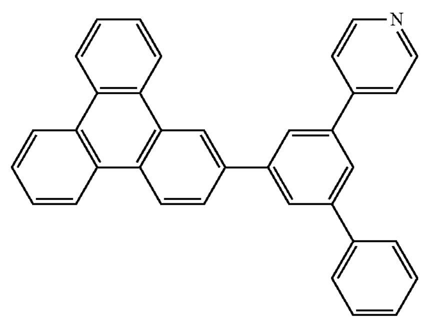
A-5
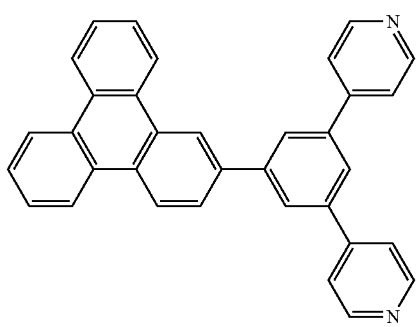
A-6
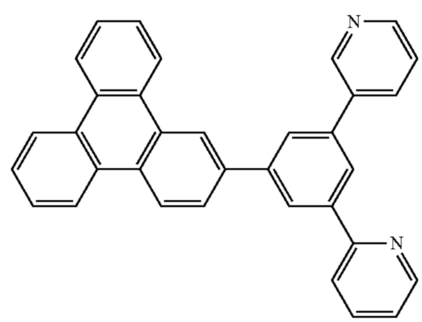
A-7
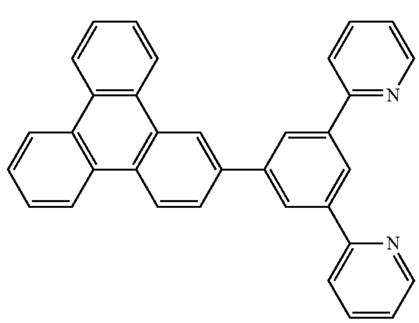
A-8
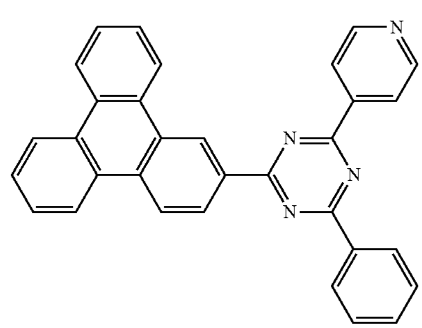

-continued
A-9
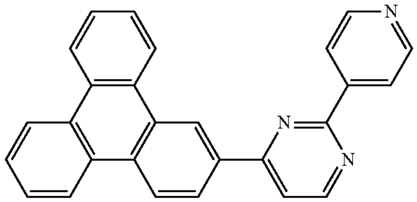
A-10
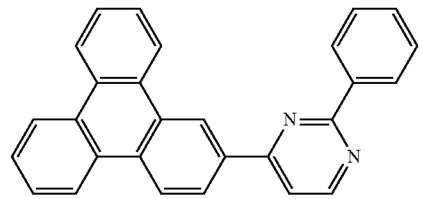
A-11
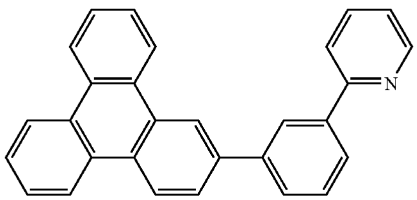
A-12
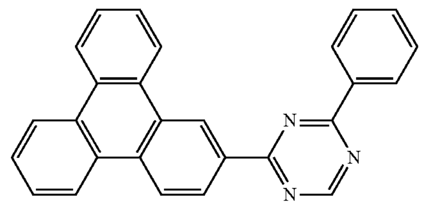
A-13
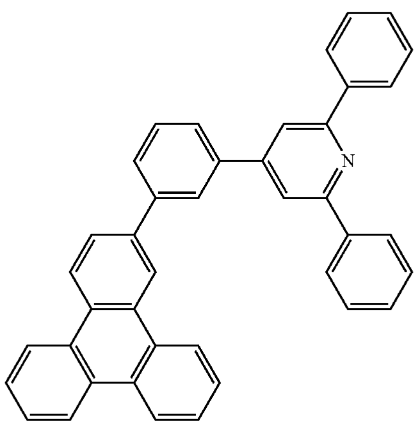
A-14
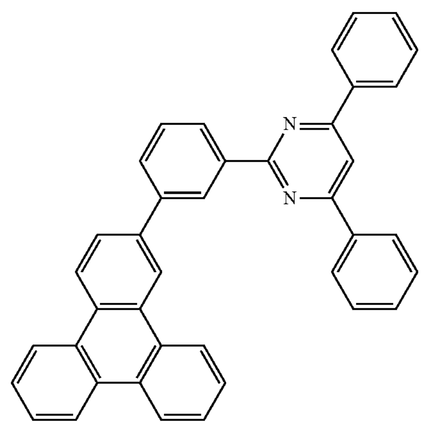
A-15
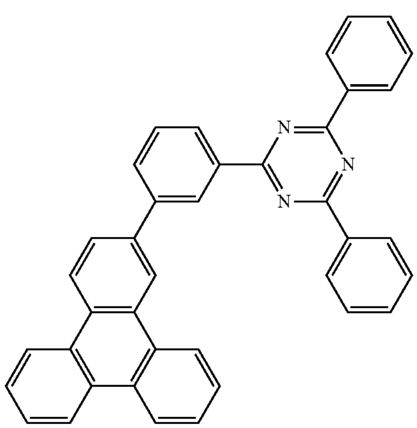
A-16
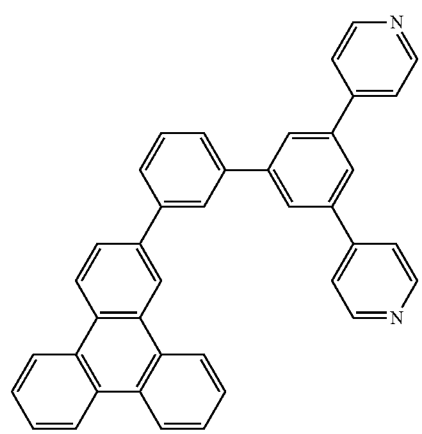

-continued
A-17
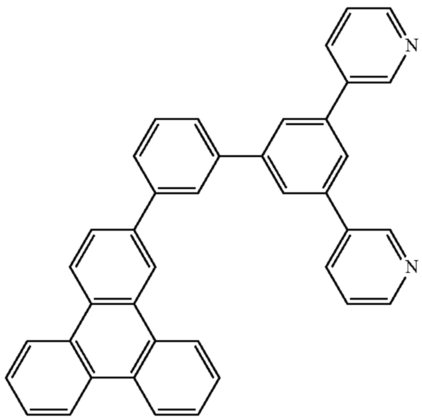
A-18
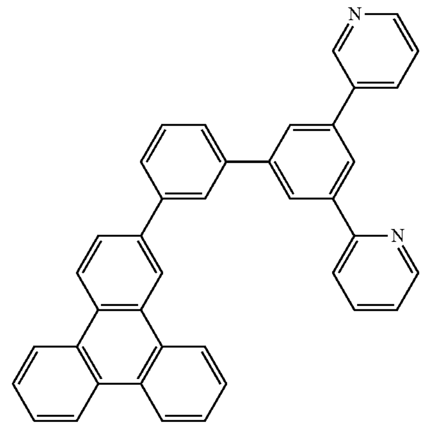
A-19
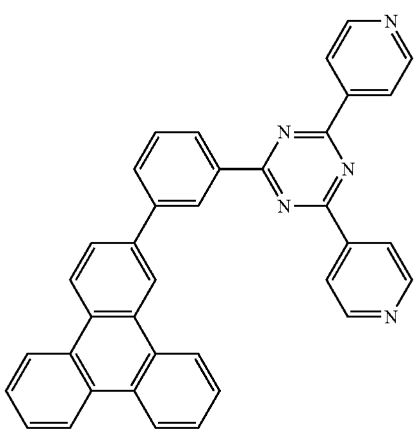
A-20
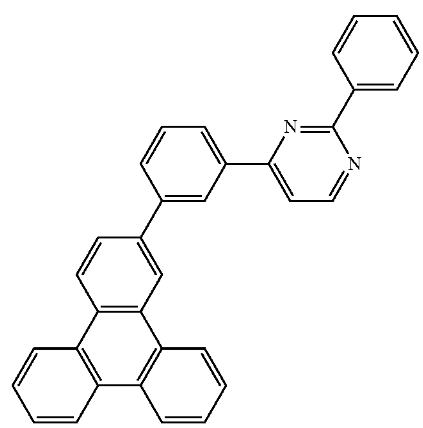
A-21
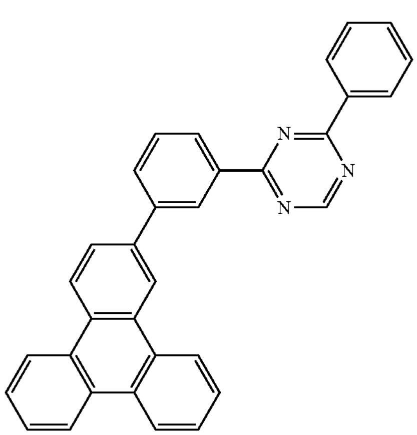
A-22
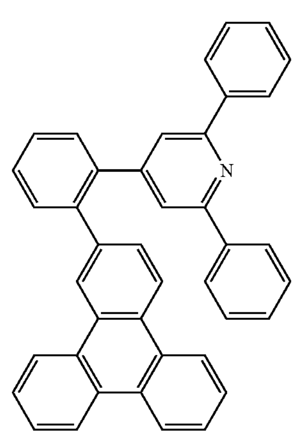

-continued
A-23
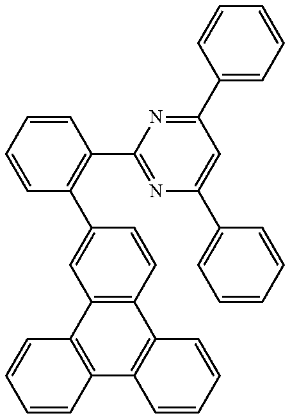
A-24
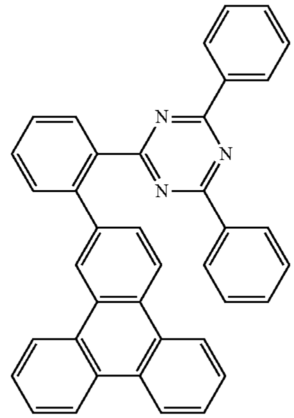
A-25
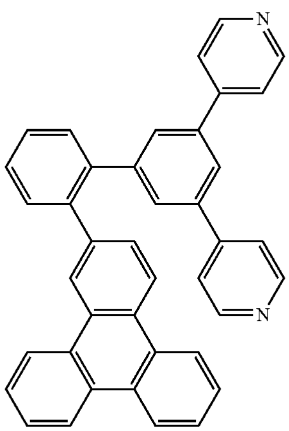
A-26
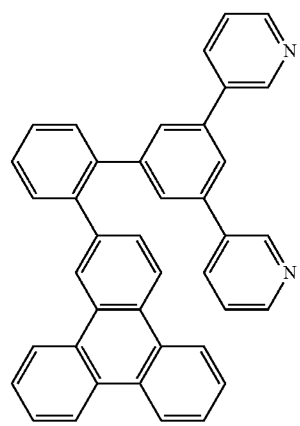
A-27
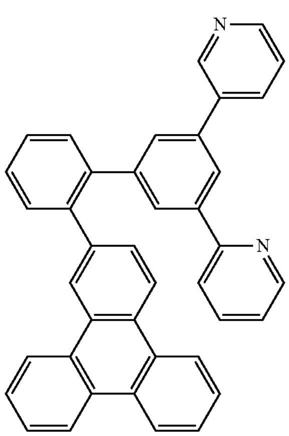
A-28
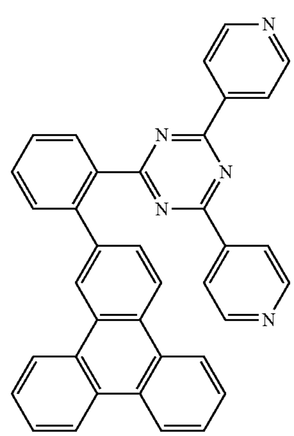

-continued
A-29
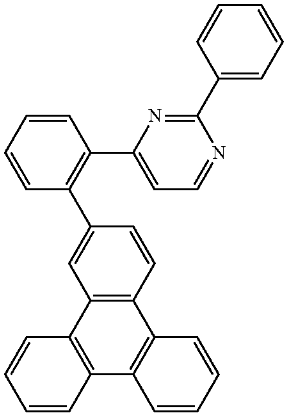
A-30
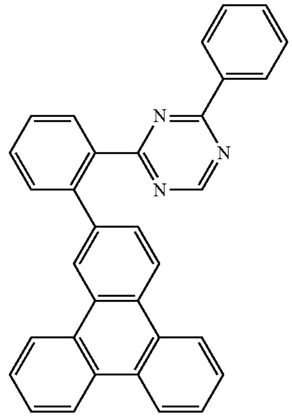
A-31
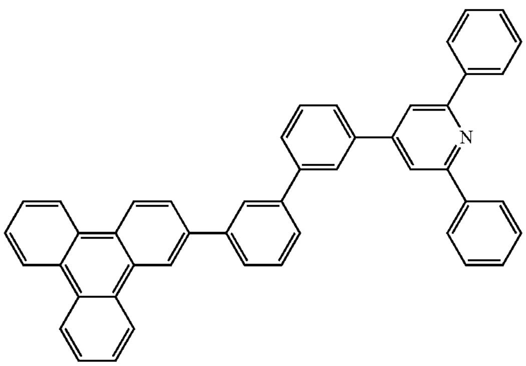
A-32
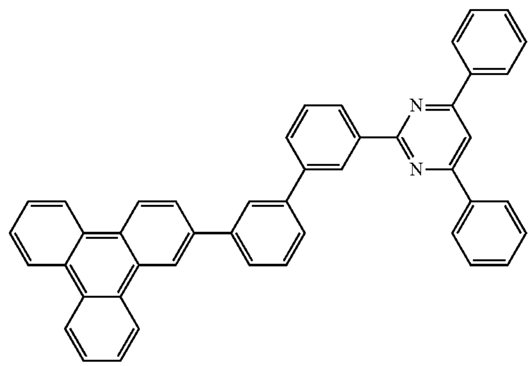
A-33
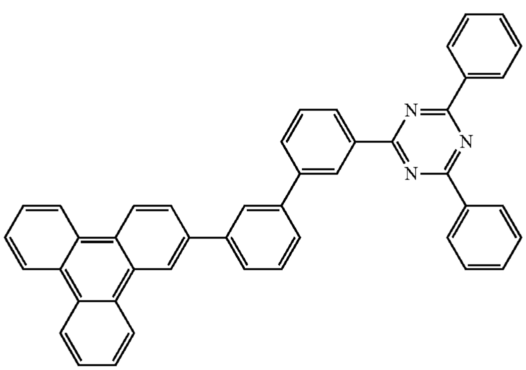
A-34
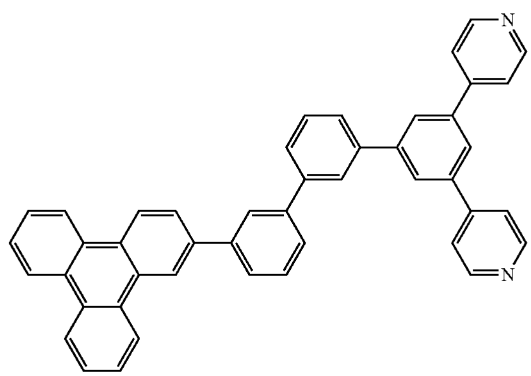
A-35
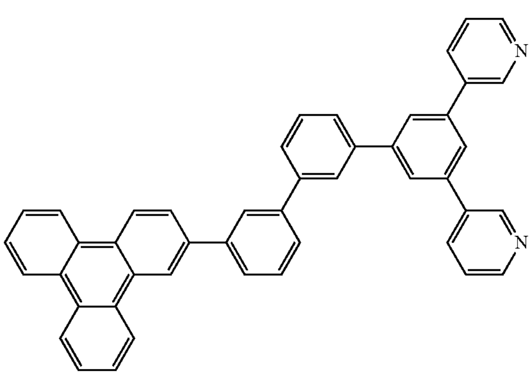
A-36
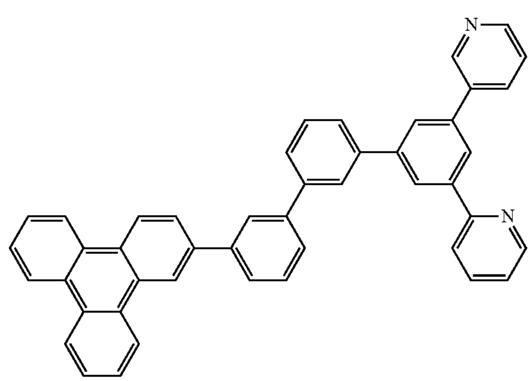

-continued
A-37
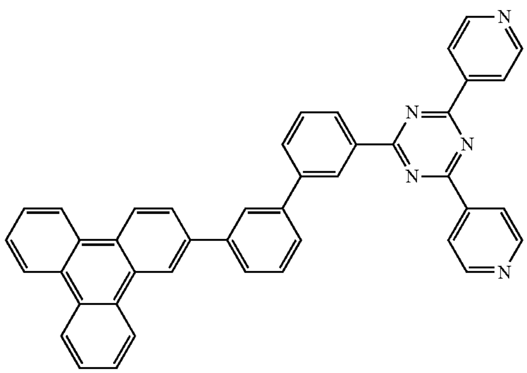
A-38
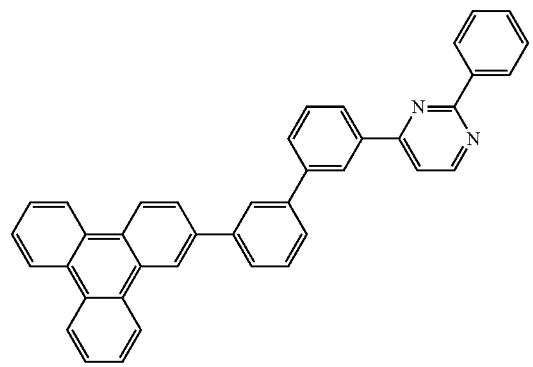
A-39
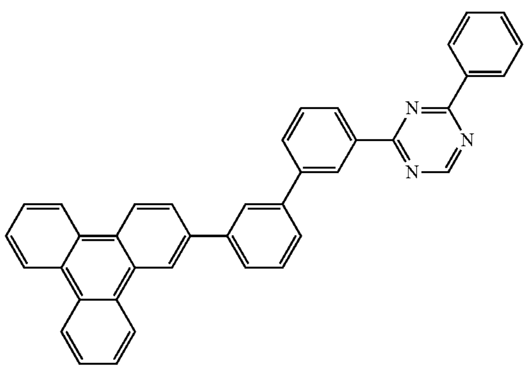
A-40
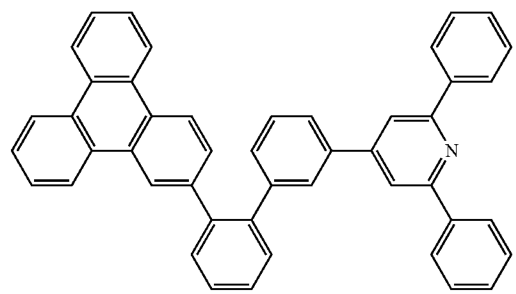
A-41
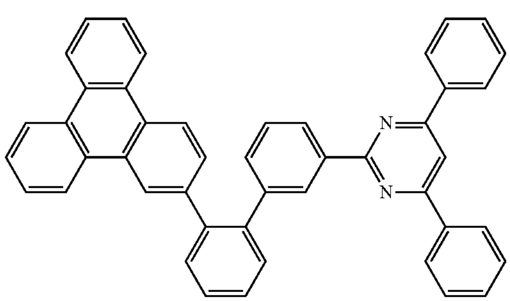
A-42
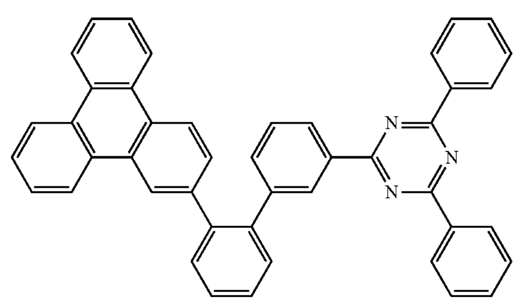
A-43
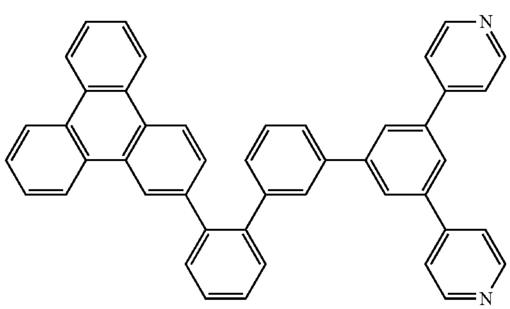
A-44
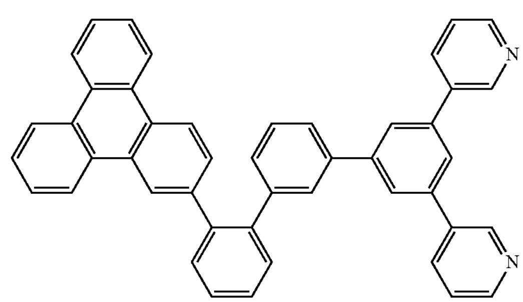

-continued
A-45
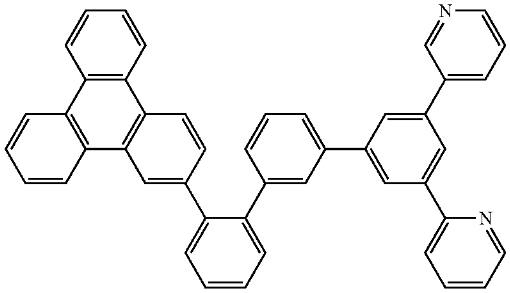
A-46
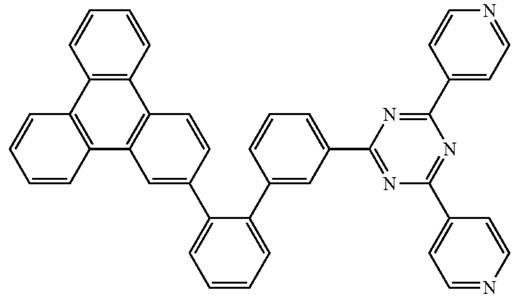
A-47
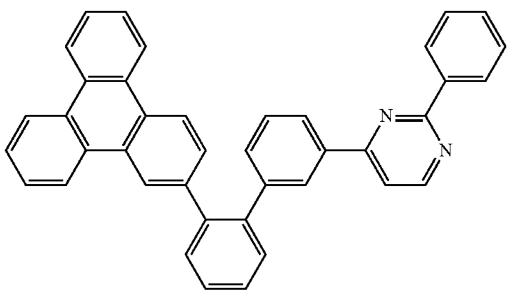
A-48
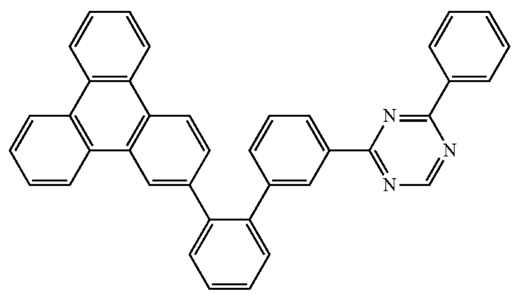
A-49
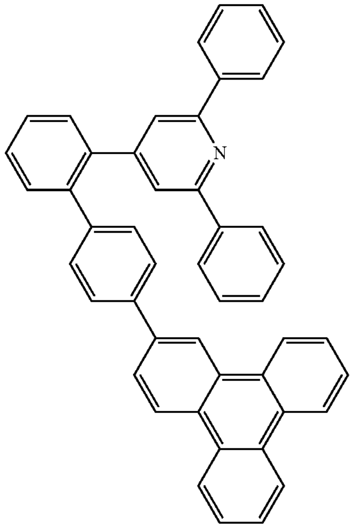
A-50
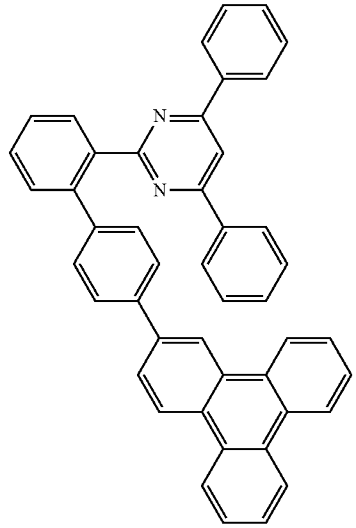

-continued
A-51
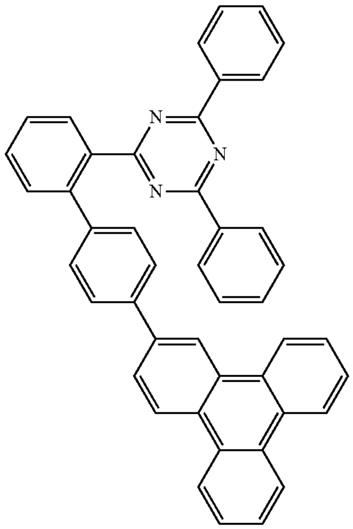
A-52
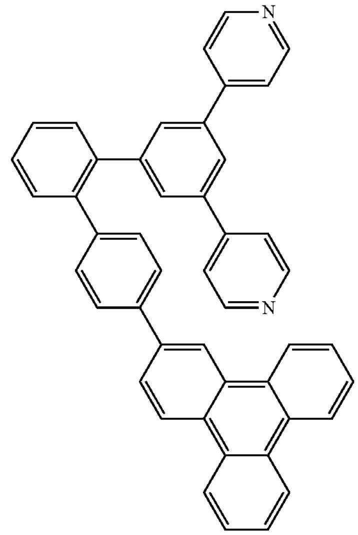
A-53
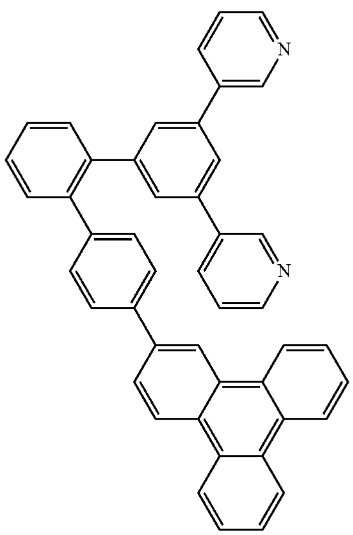
A-54
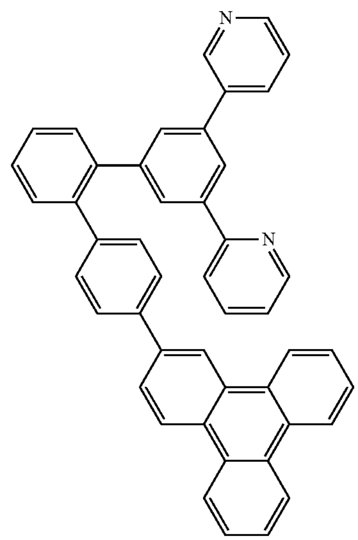
A-55
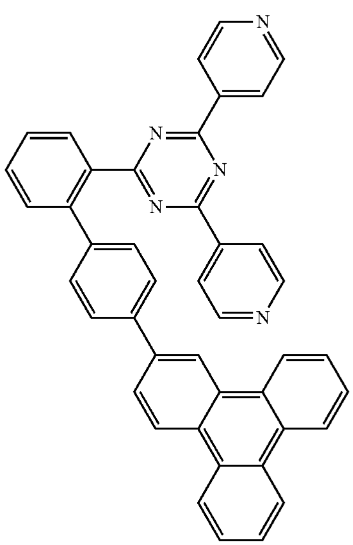
A-56
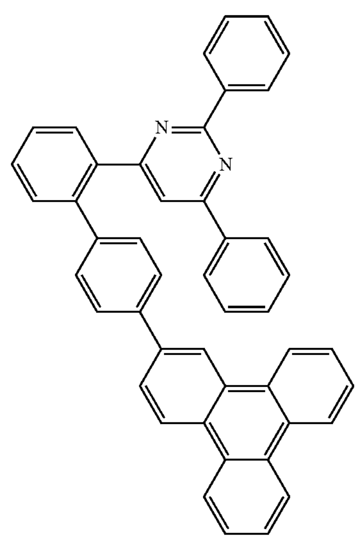

-continued
A-57
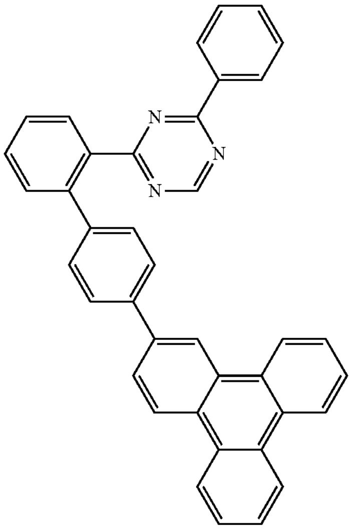
A-58
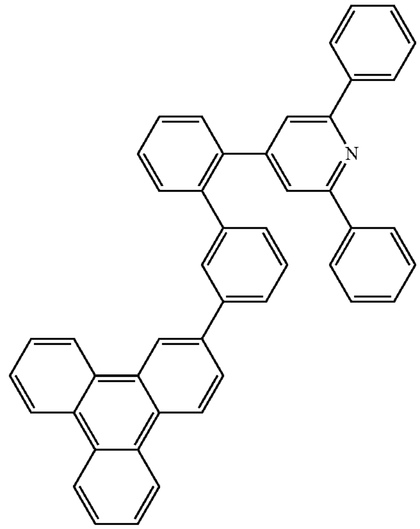
A-59
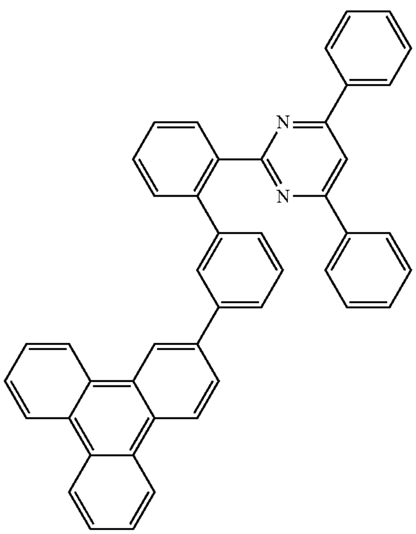
A-60
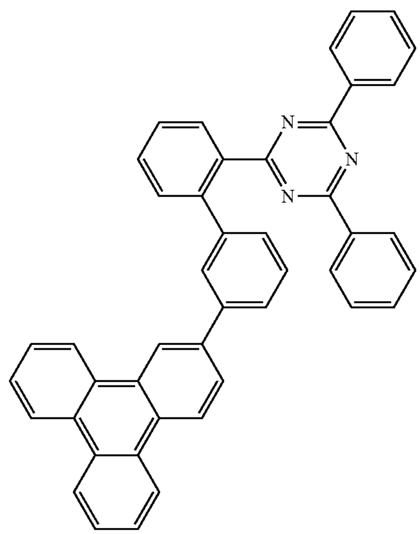
A-61
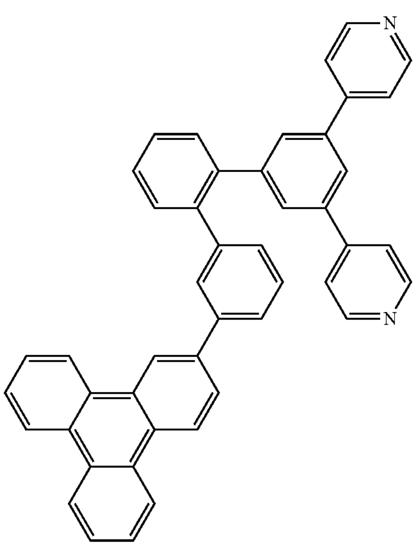
A-62
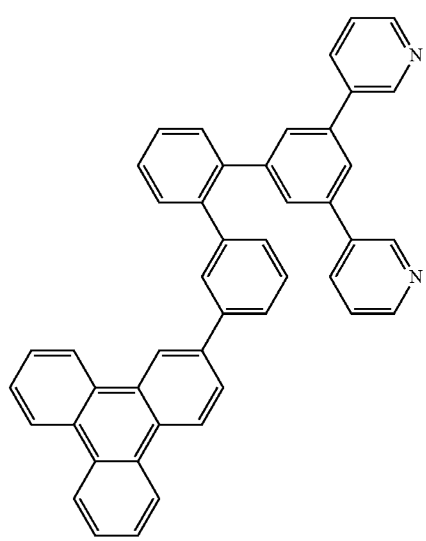

-continued
A-63
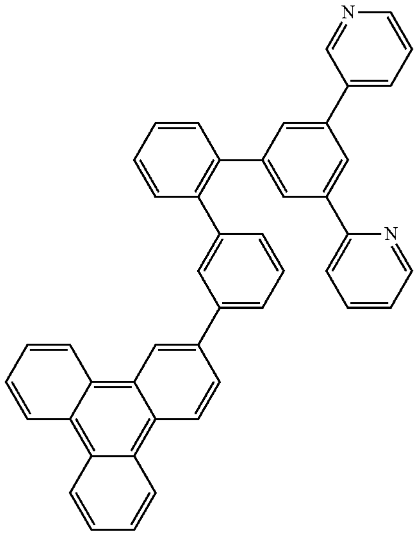
A-64
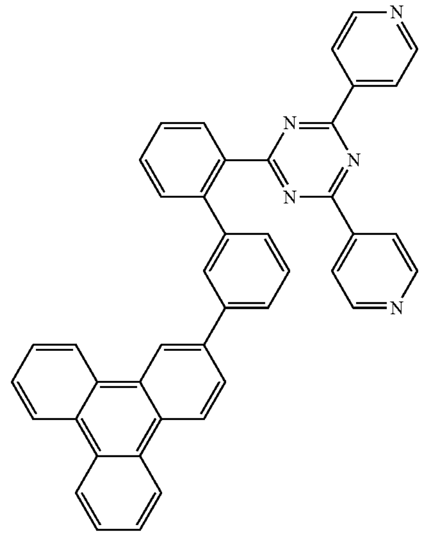
A-65
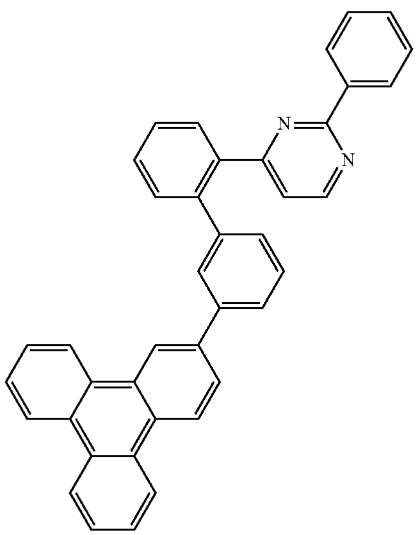
A-66
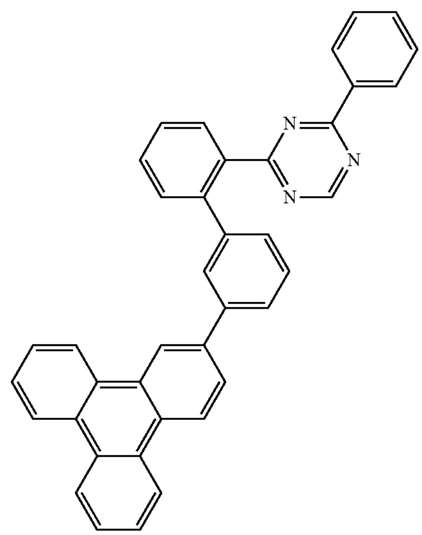
A-67
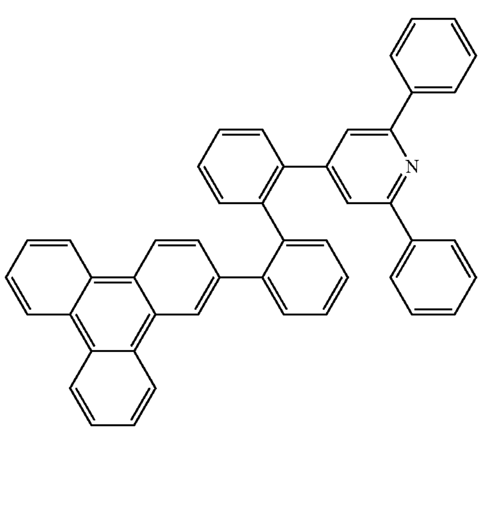
A-68
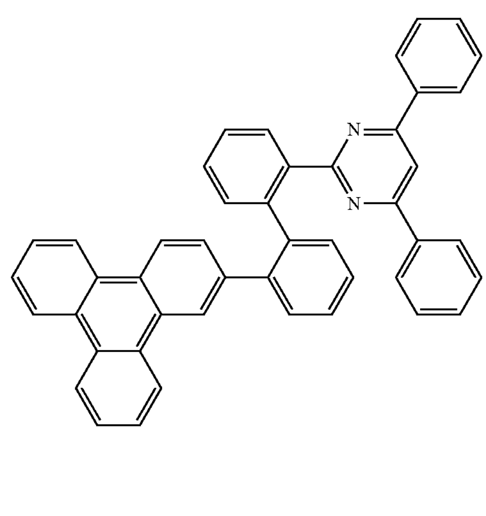

-continued
A-69
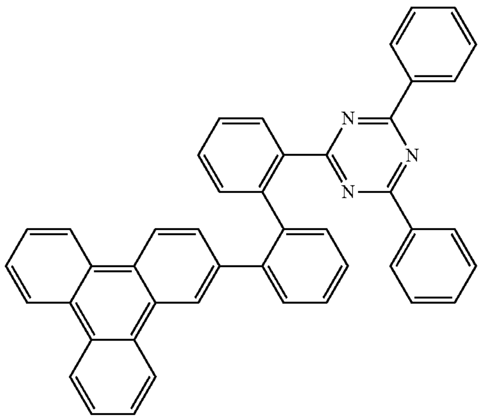
A-70
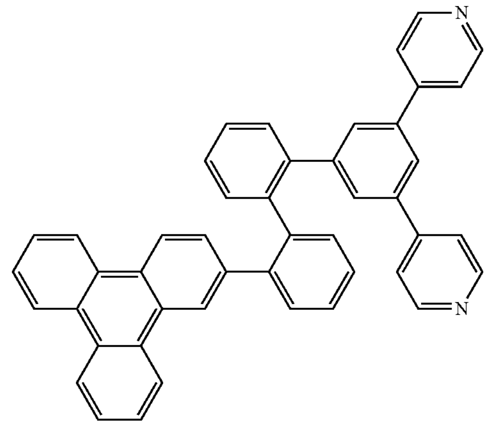
A-71
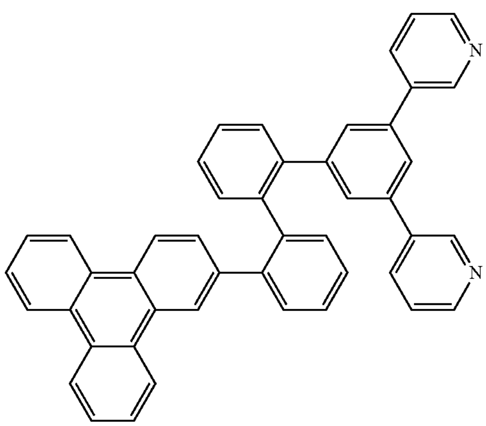
A-72
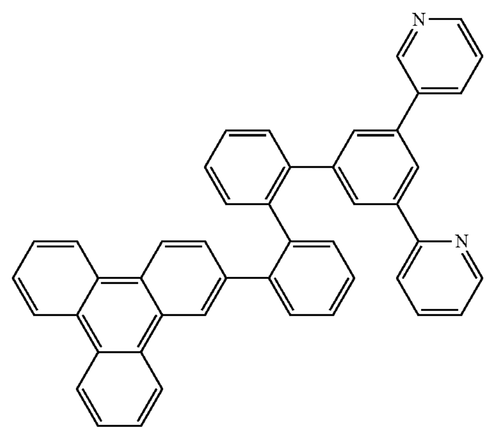
A-73
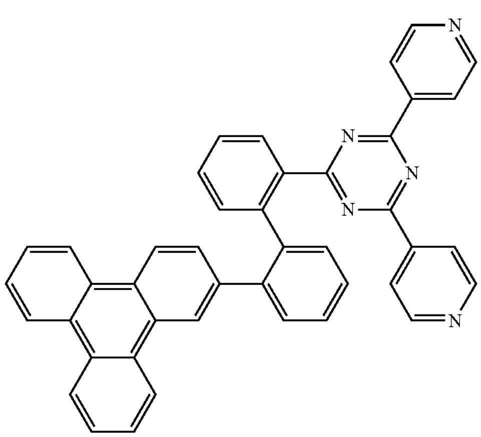
A-74
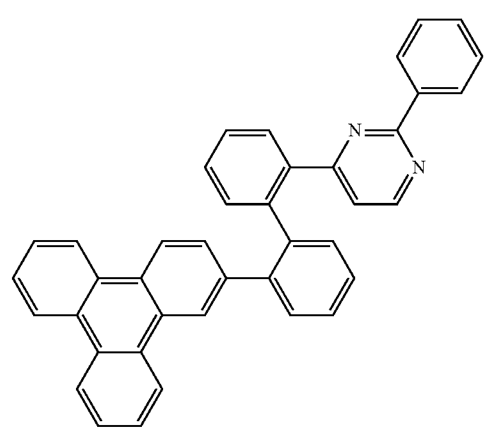

-continued
A-75
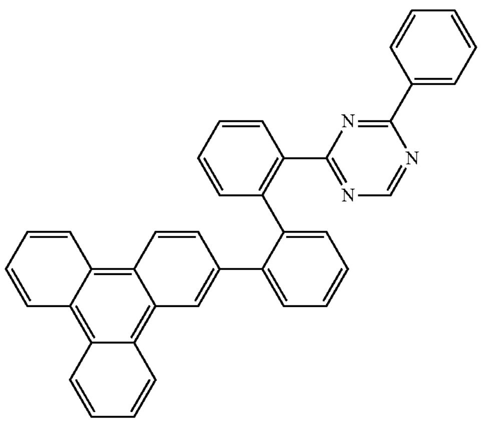
A-76
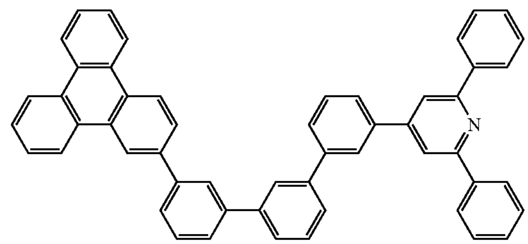
A-77
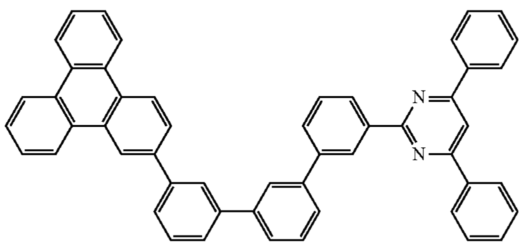
A-78
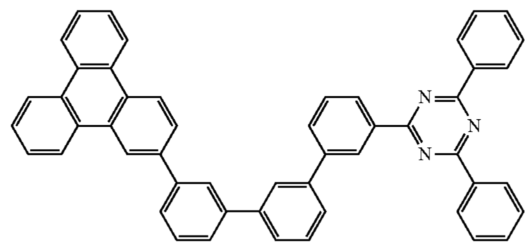
A-79
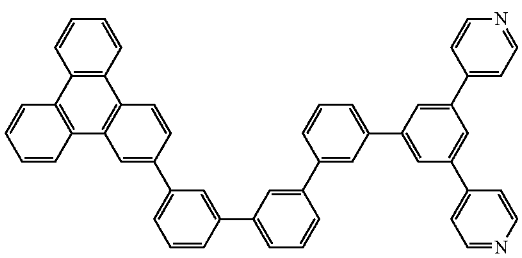
A-80
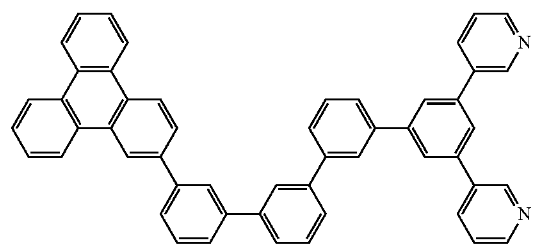
A-81
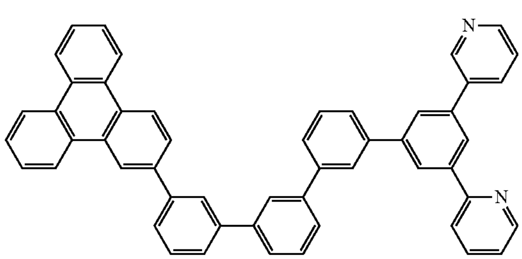
A-82
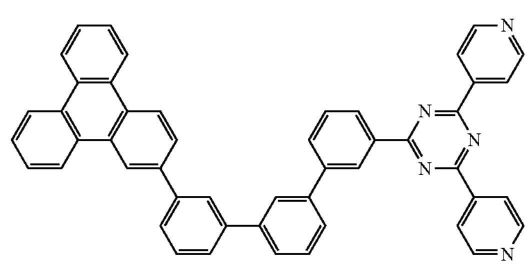
A-83
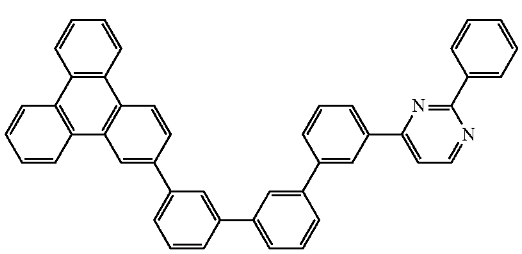
A-84
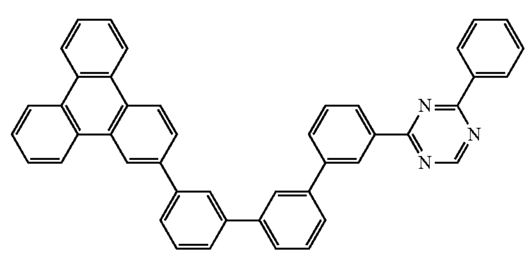

-continued
A-85
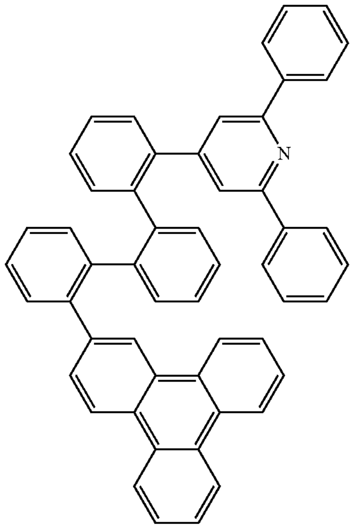
A-86
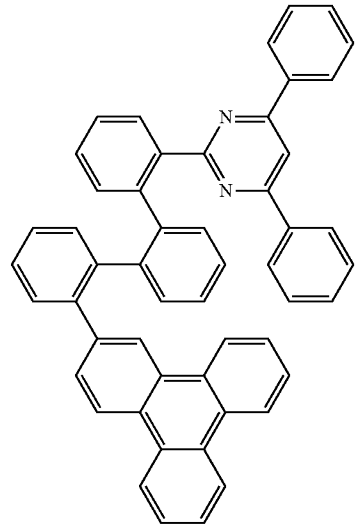
A-87
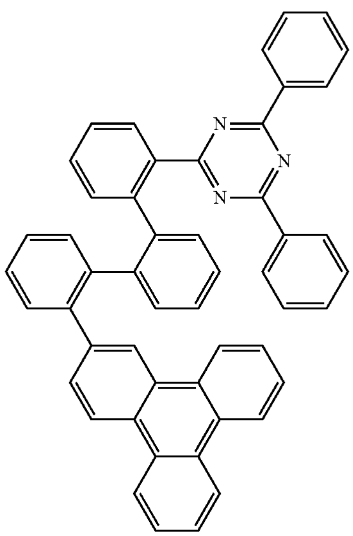
A-88
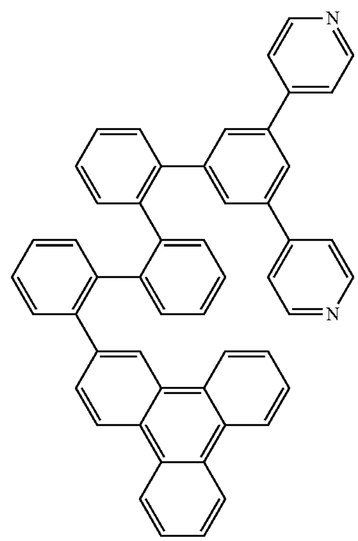
A-89
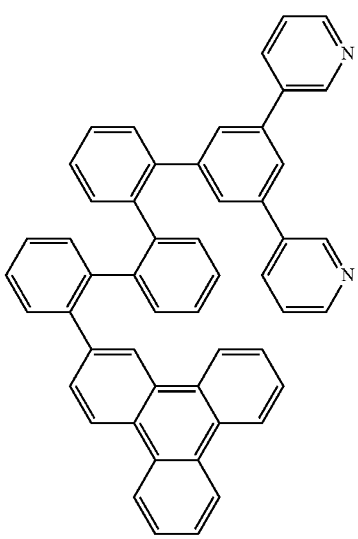
A-90
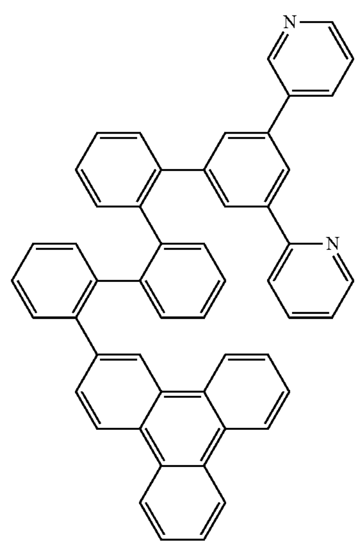

-continued
A-91
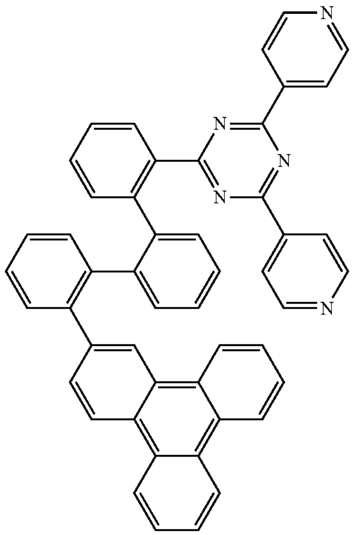
A-92
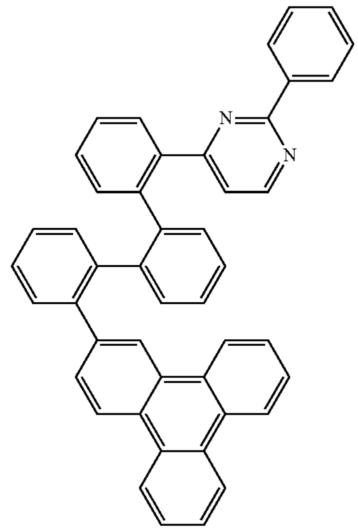
A-93
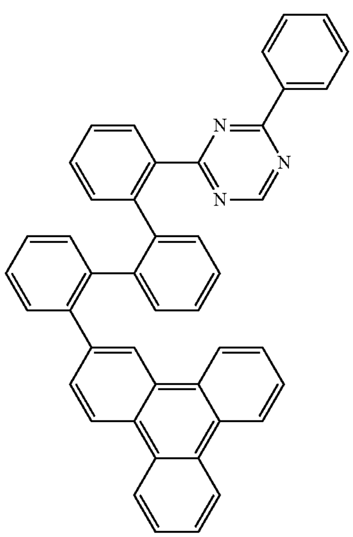
A-94
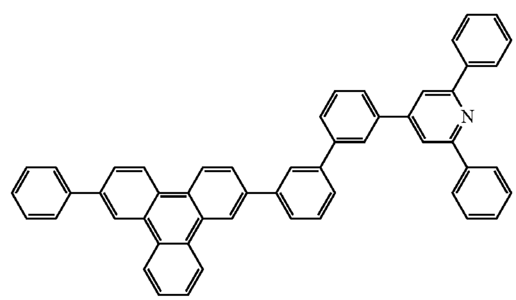
A-95
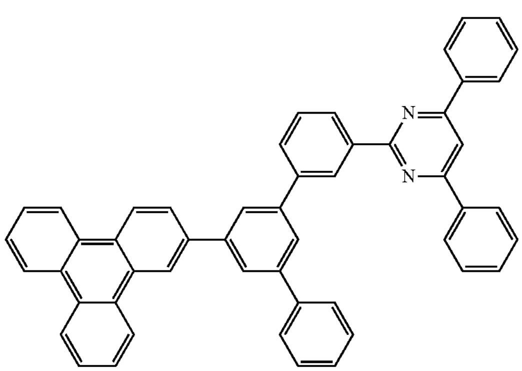
A-96
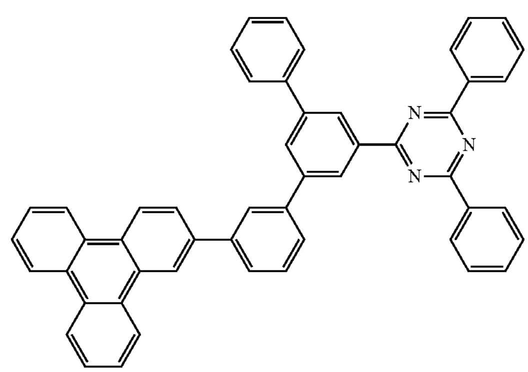

-continued
A-97
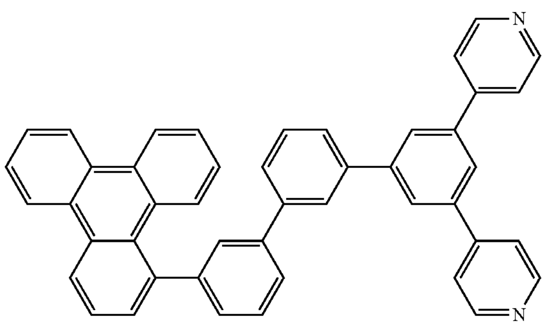
A-98
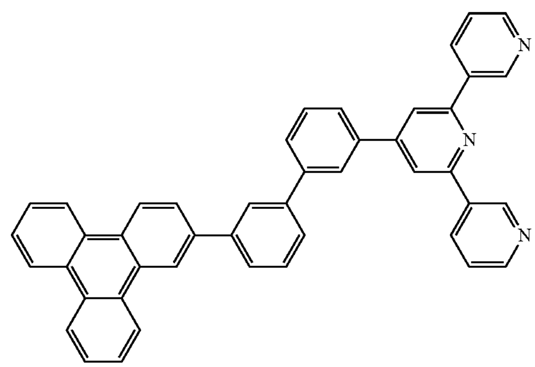
A-99
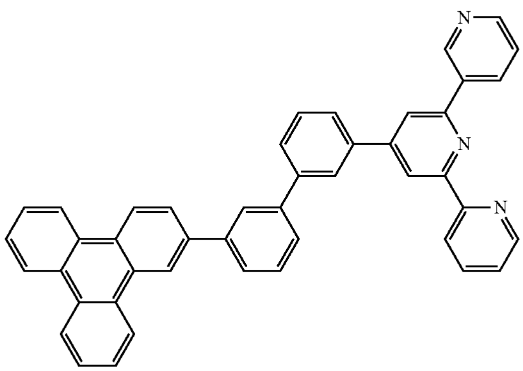
A-100
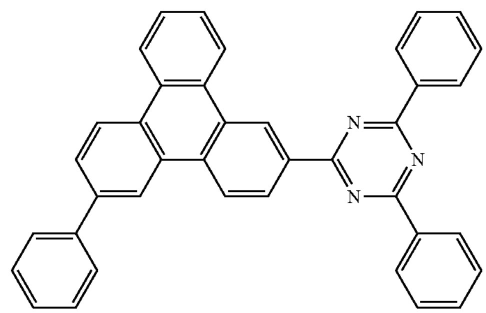
A-101
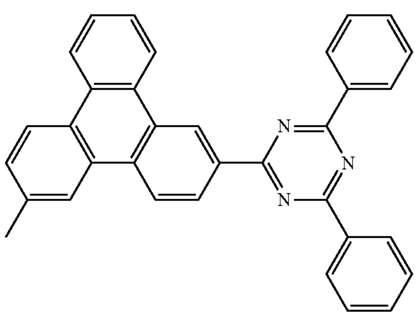
A-102
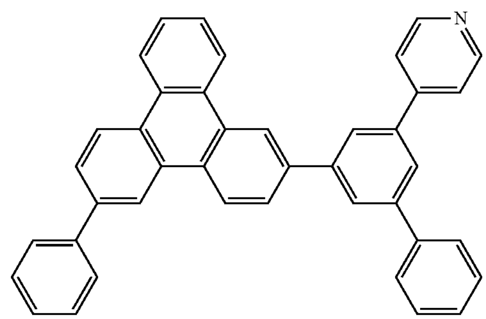
A-103
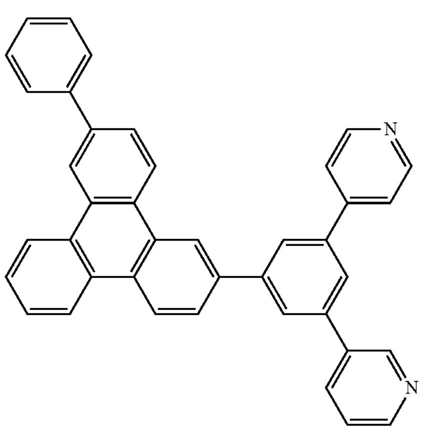
A-104
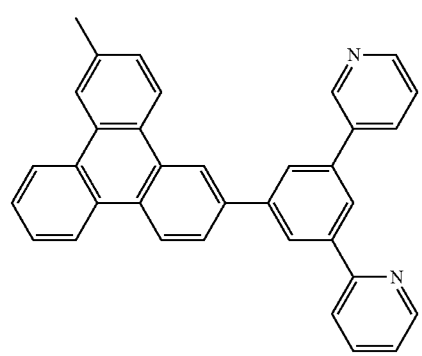

-continued
A-105
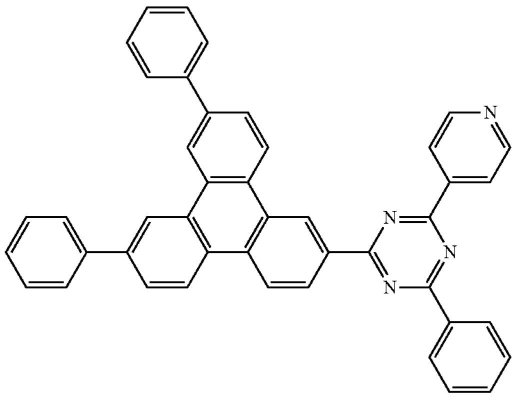
A-106
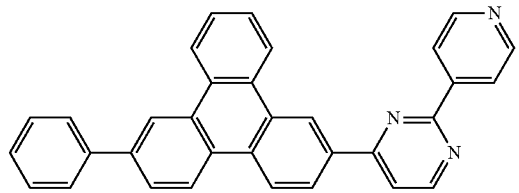
A-107
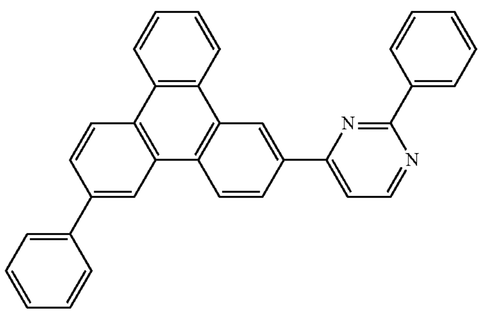
A-108
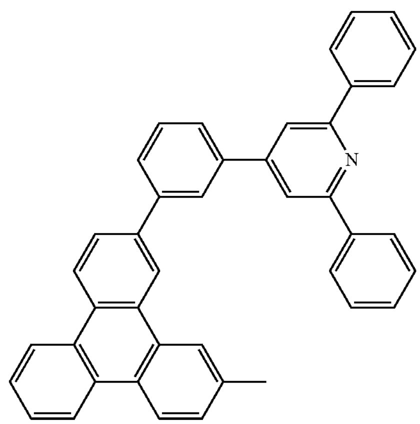
A-109
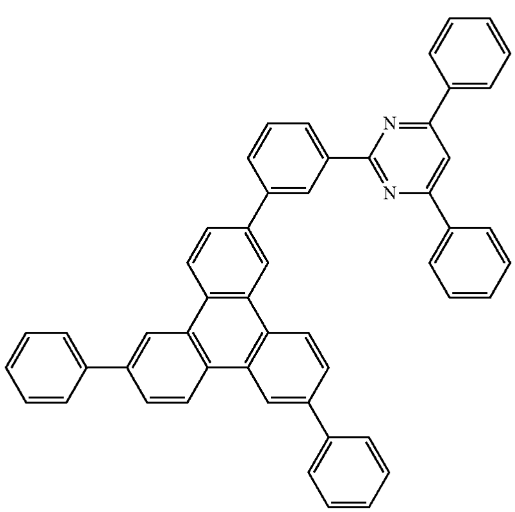
A-110
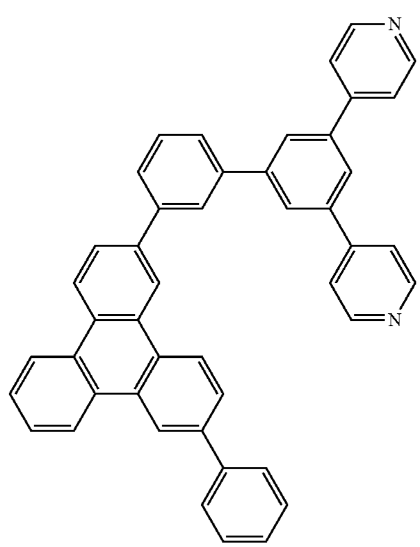

-continued
A-111
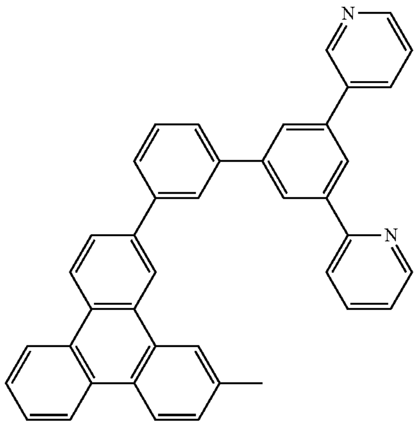
A-112
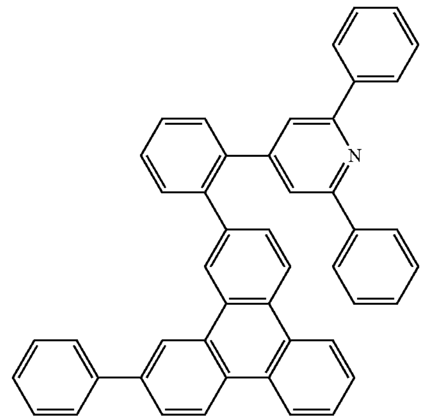
A-113
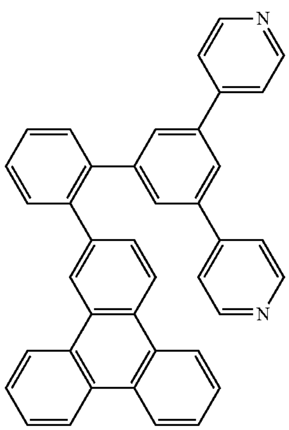
A-114
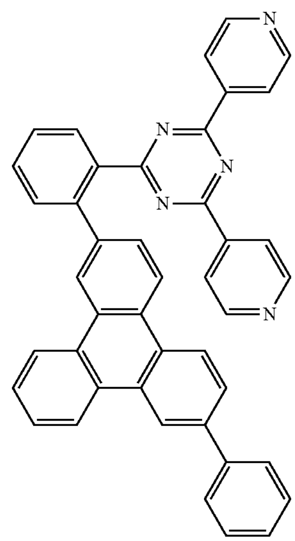
A-115
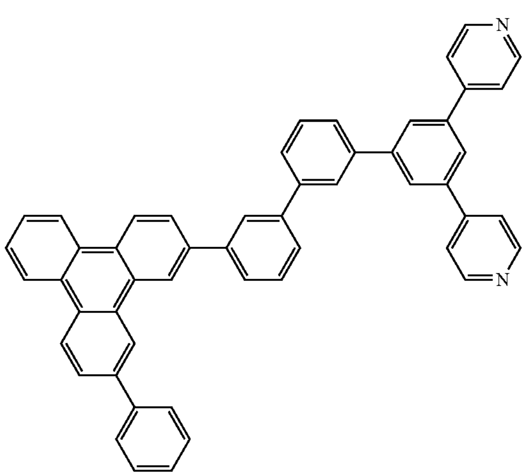
A-116
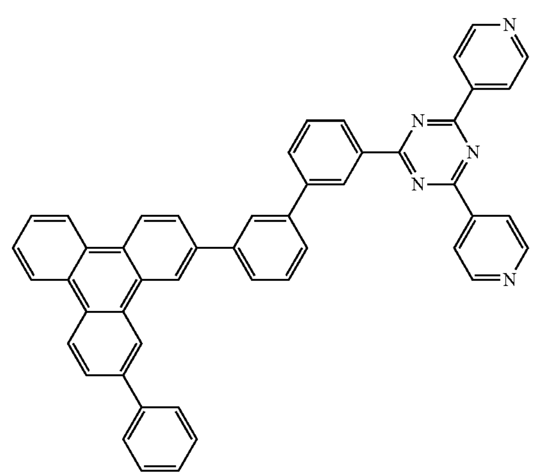

-continued
A-117
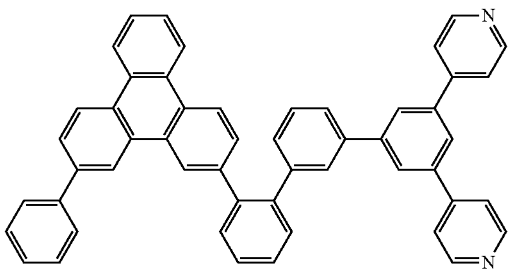
A-118
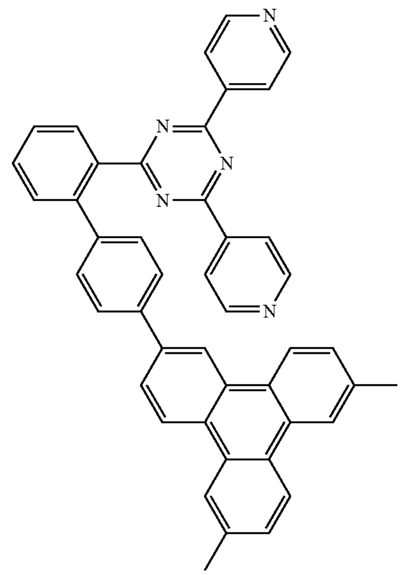
A-119
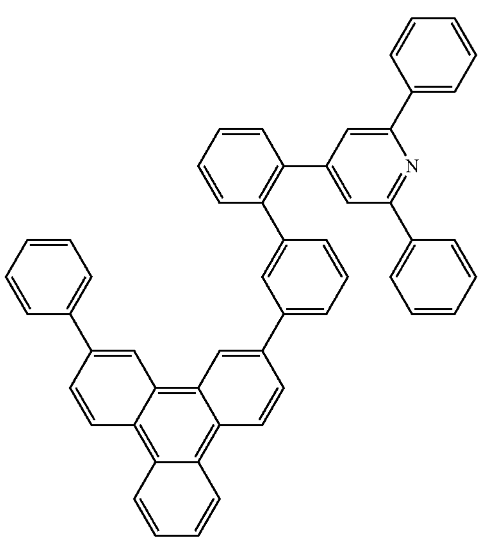
A-120
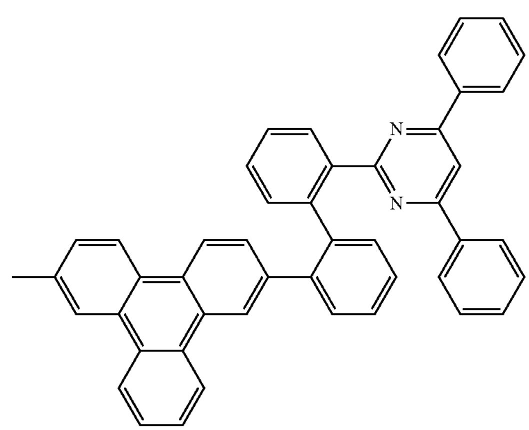

-continued
A-121
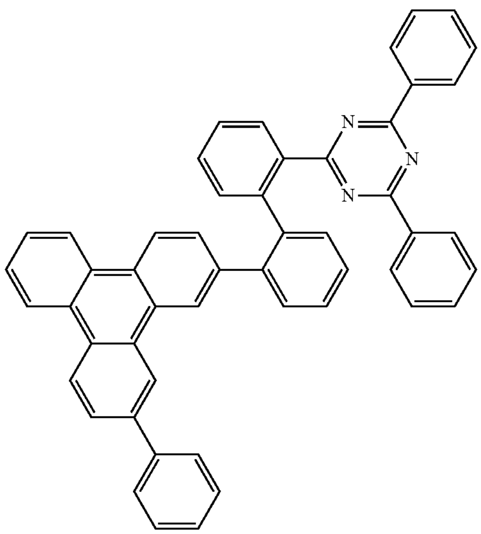
A-122
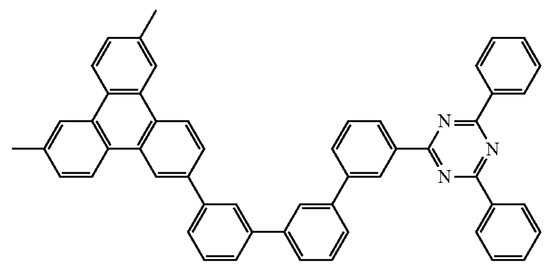
A-123
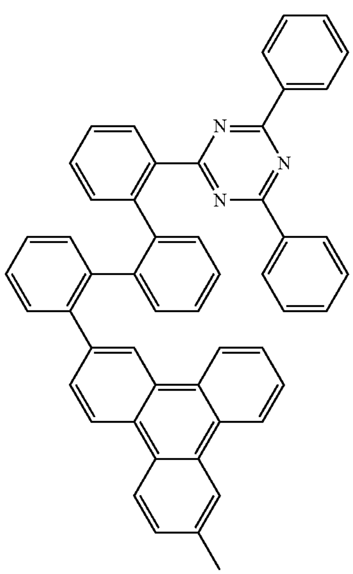
A-124
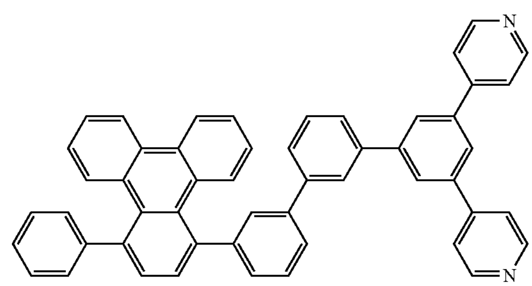
A-125
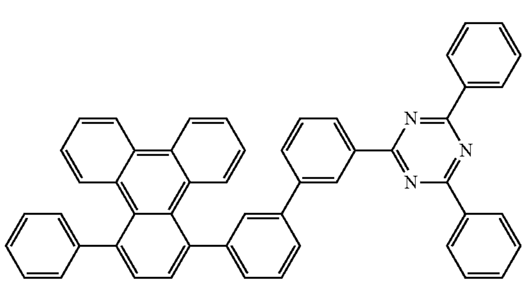
A(1)
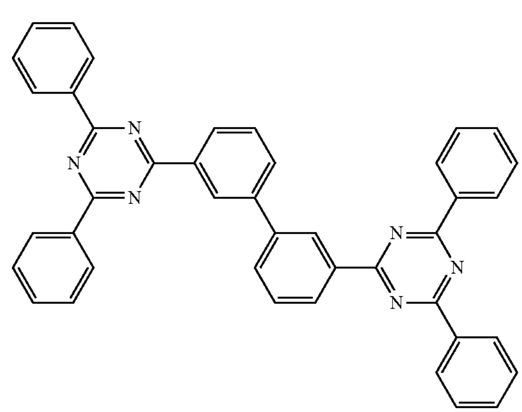

-continued
A(2)
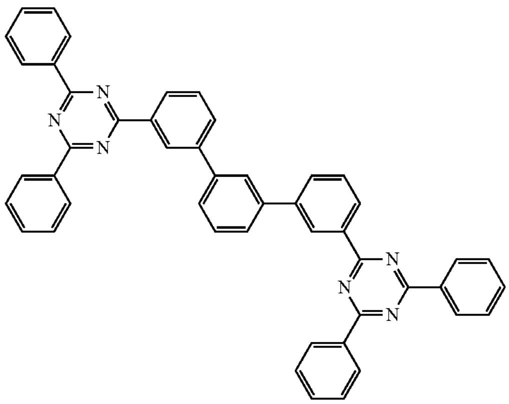
A(3)
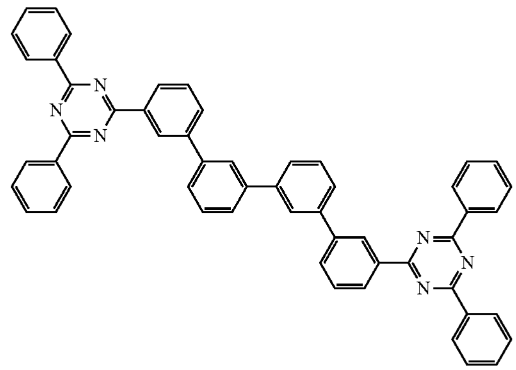
A(4)
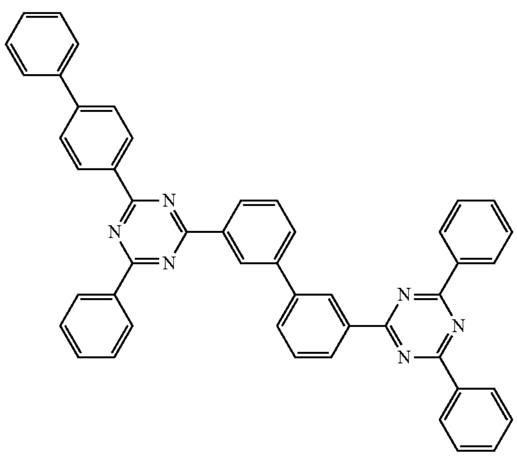
A(5)
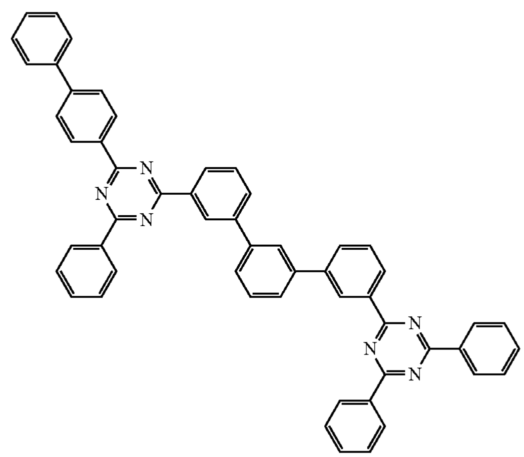
A(6)
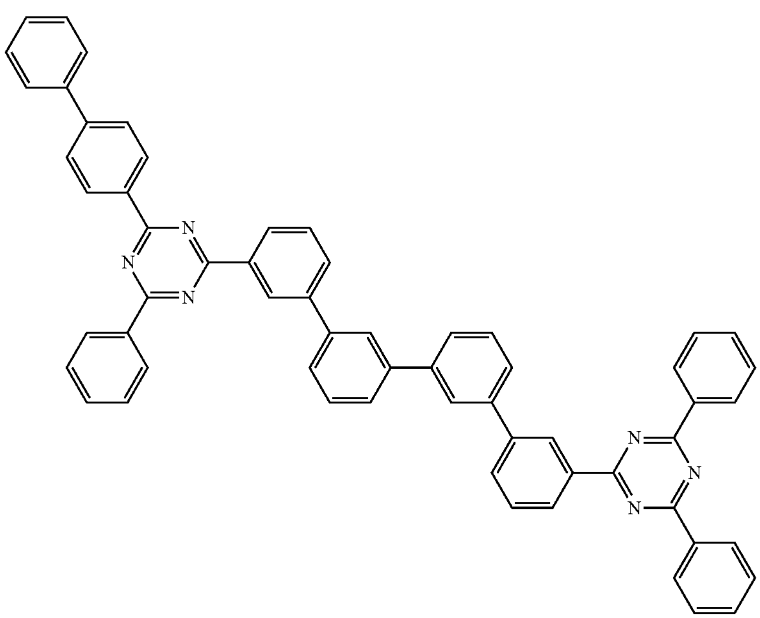

-continued
A(7)
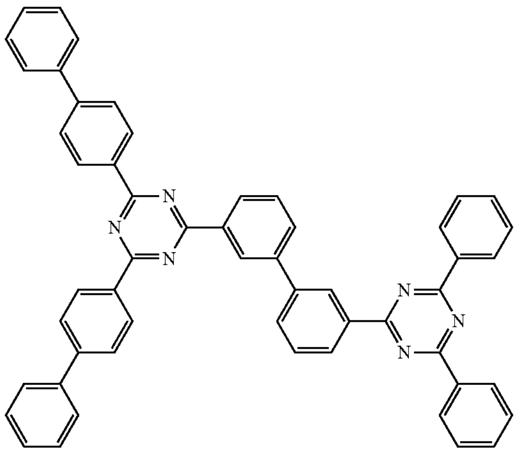
A(8)
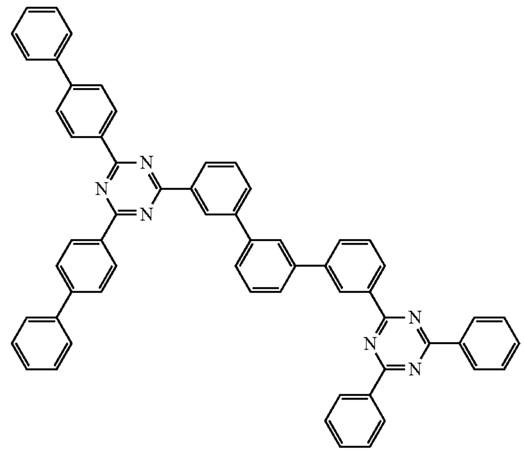
A(9)
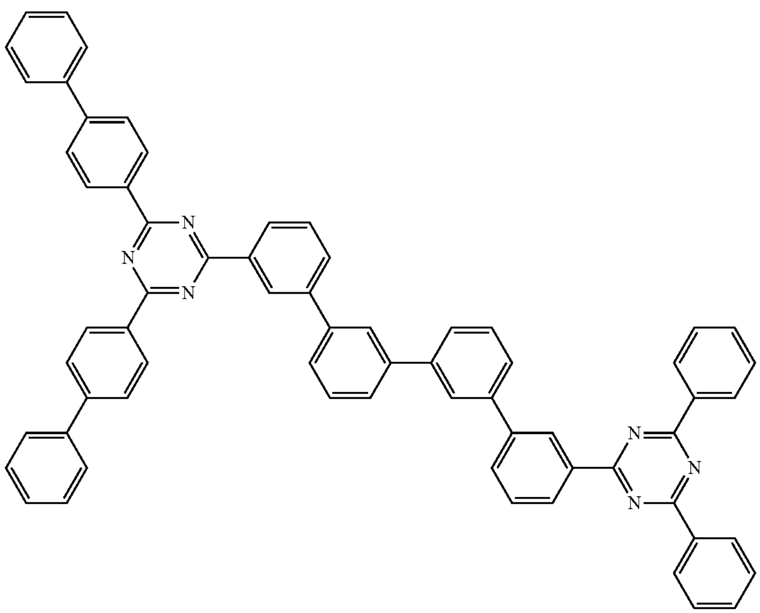
A(10)
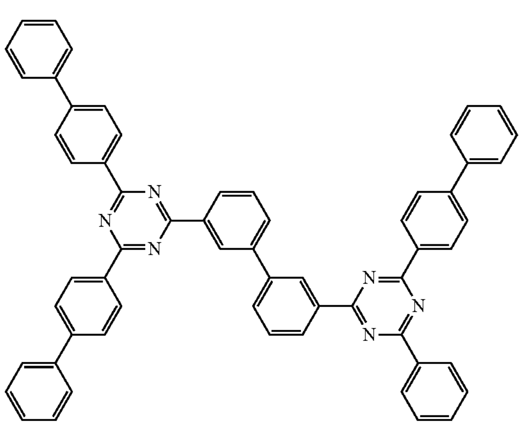
A(11)
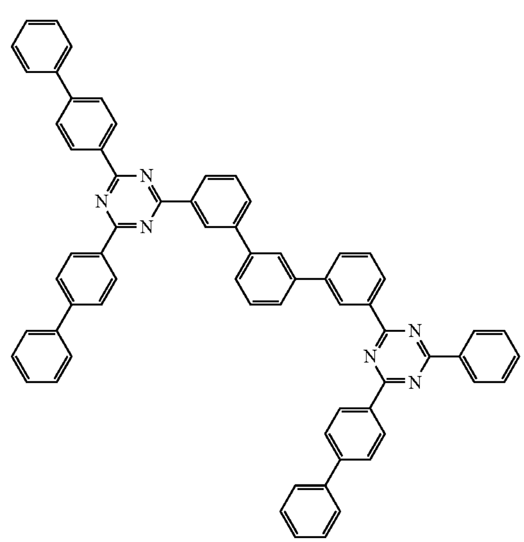

-continued
A(12)
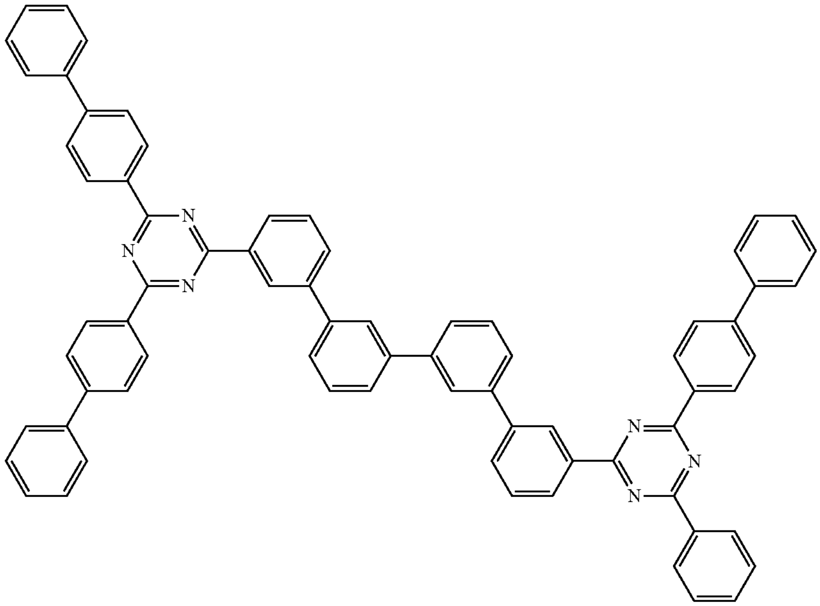
A(13)
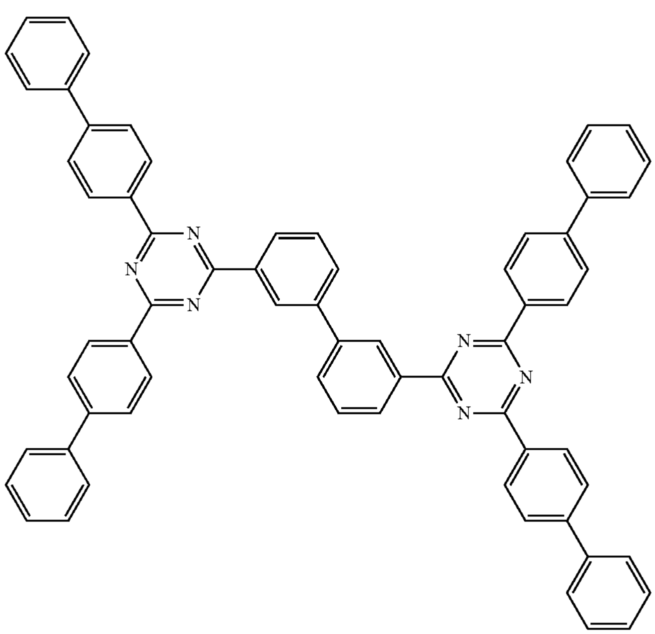

-continued
A(14)
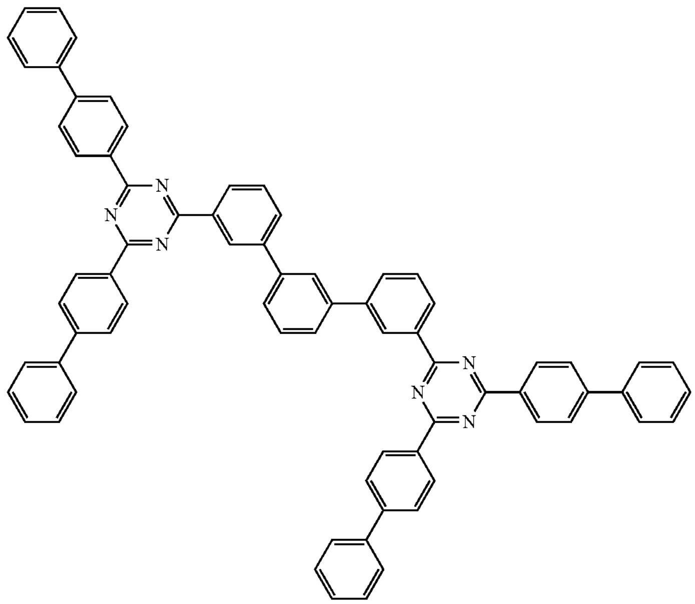
A(15)
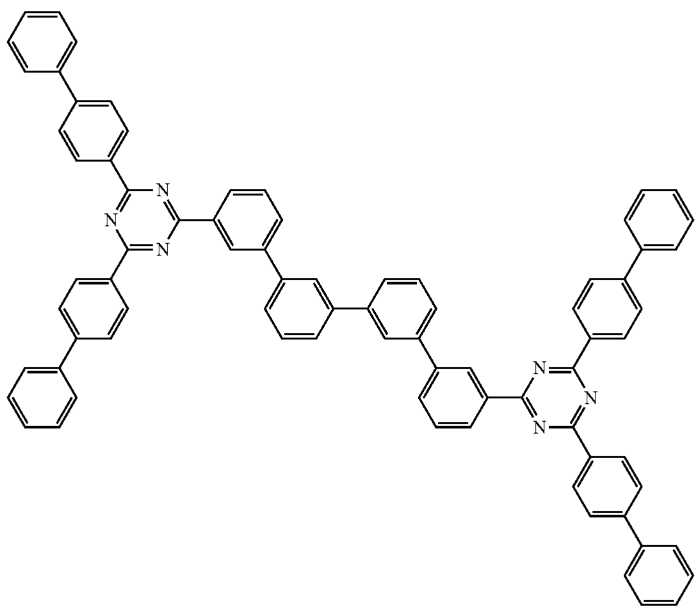
(A16)
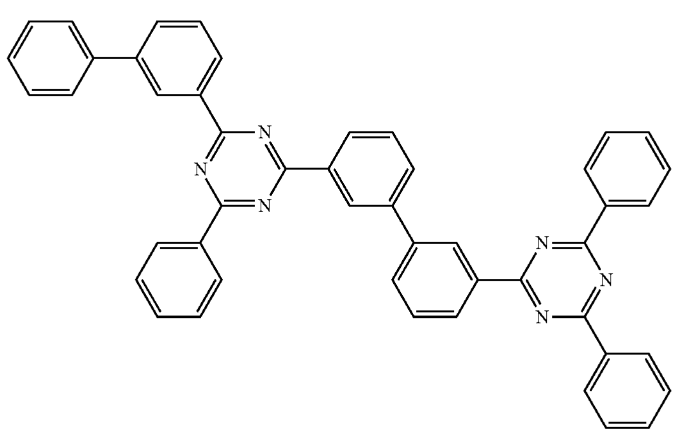

-continued
A(17)
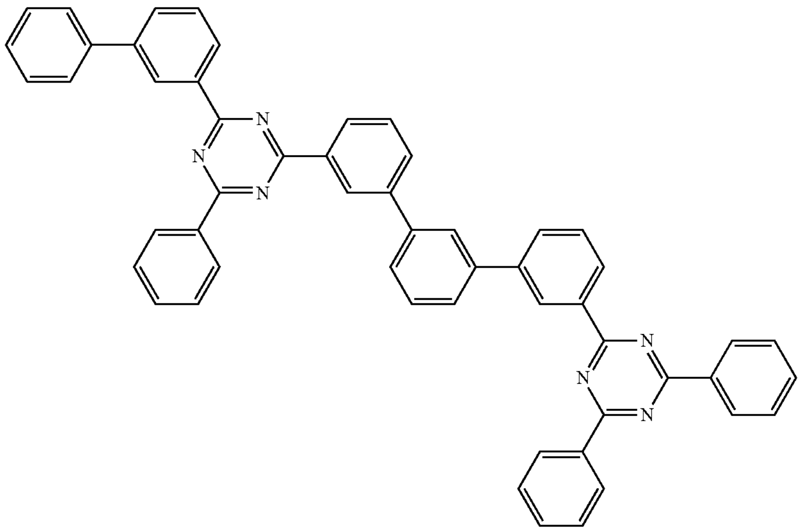
A(18)
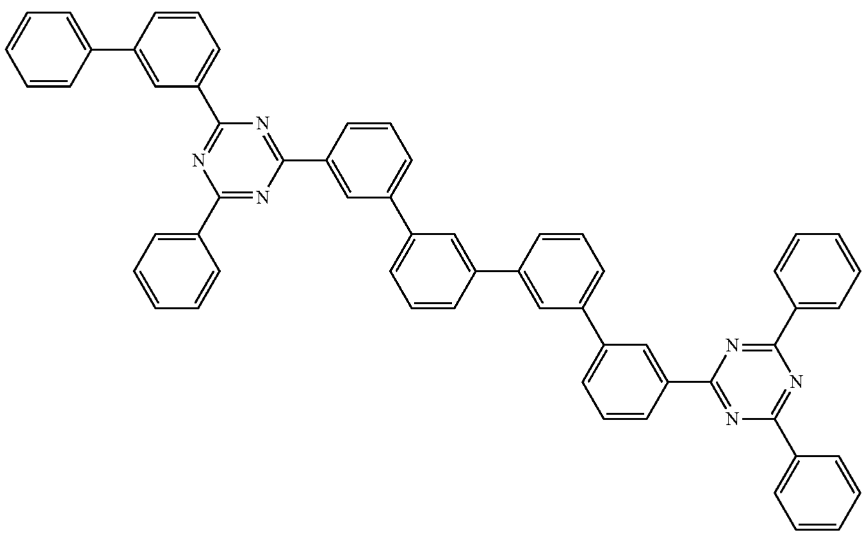
A(19)
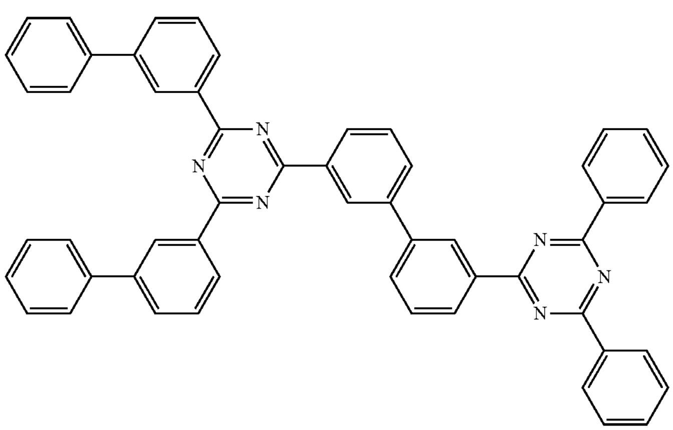

-continued
A(20)
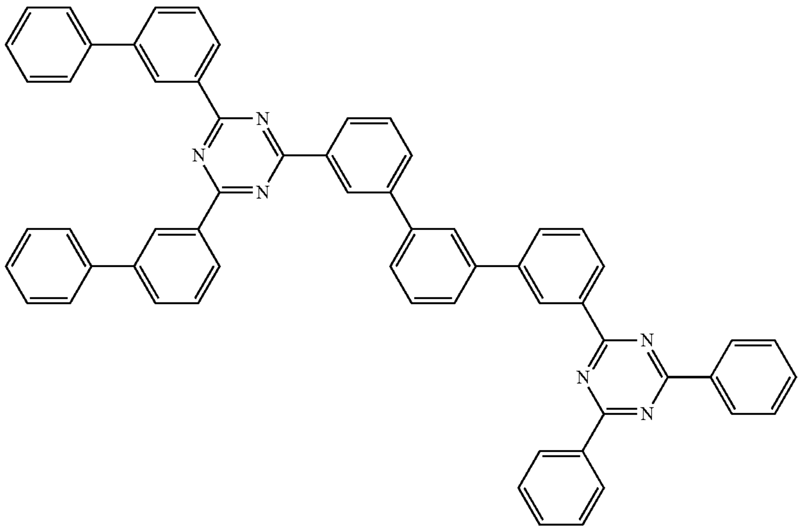
A(21)
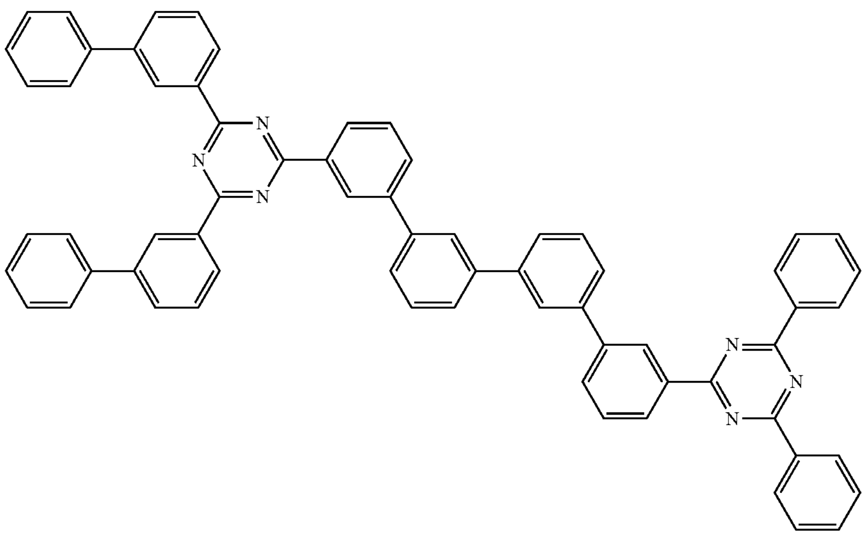
A(22)
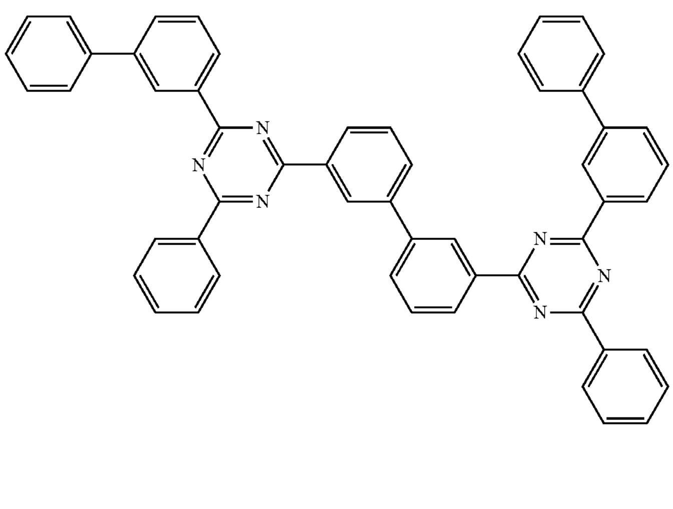

-continued
A(23)
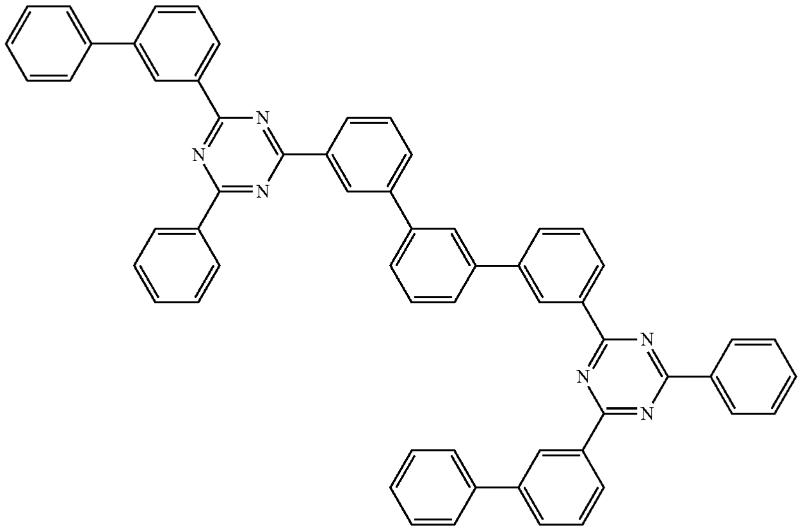
A(24)
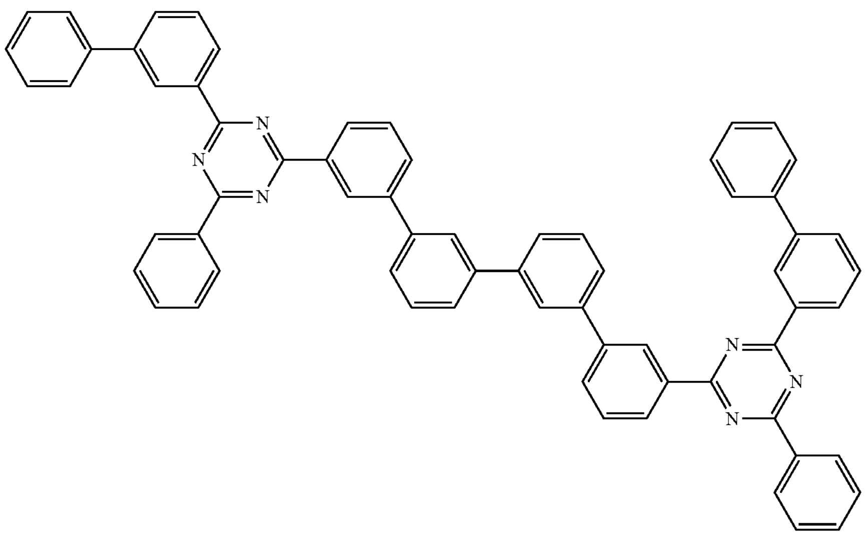
A(25)
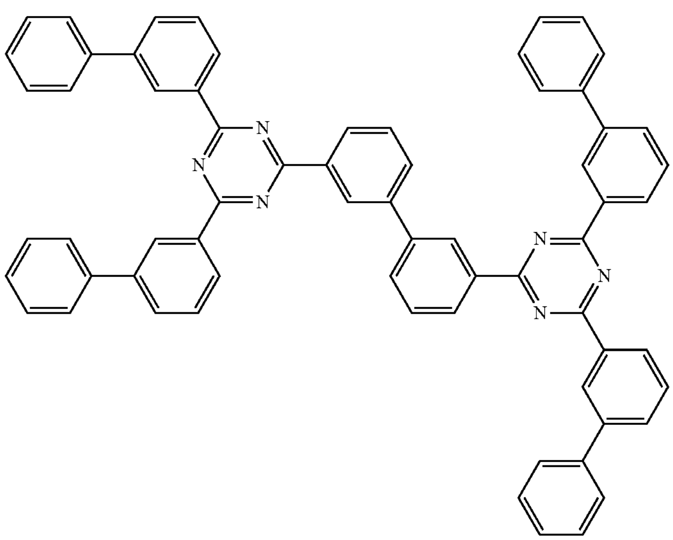

-continued
A(26)
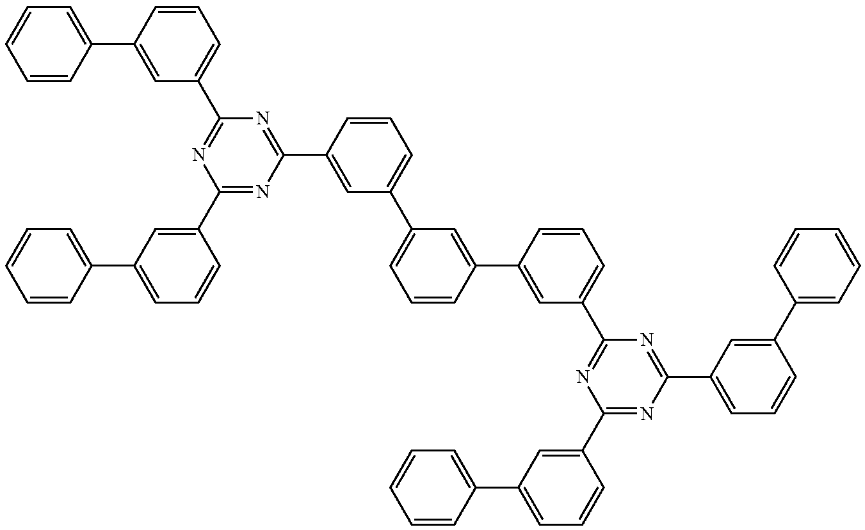
A(27)
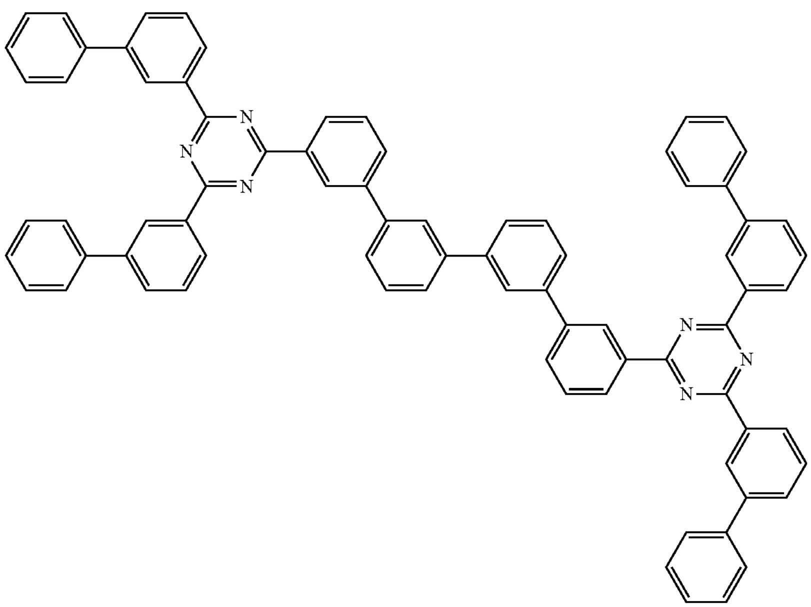
A(28)
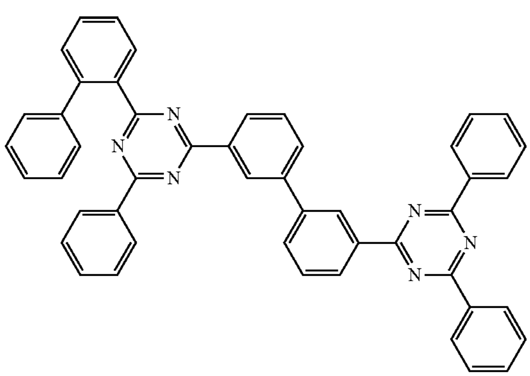
A(29)
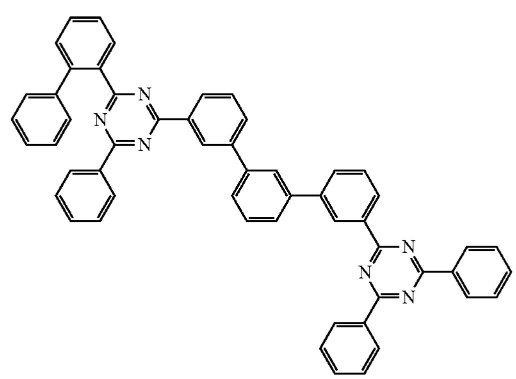

-continued
A(30)
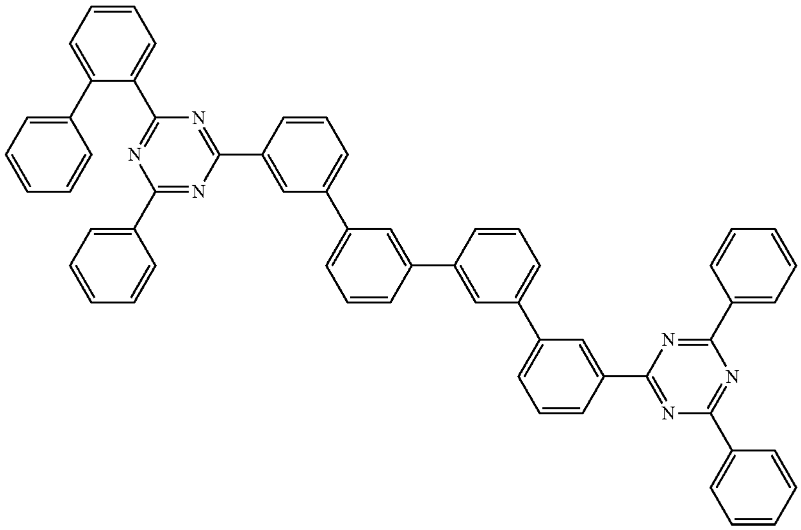
A(31)
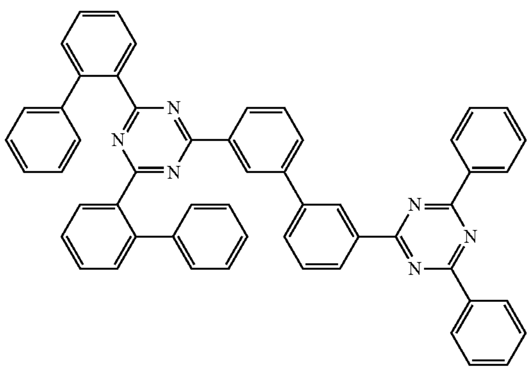
A(32)
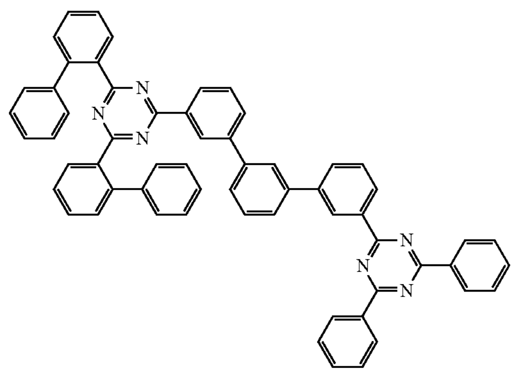
A(33)
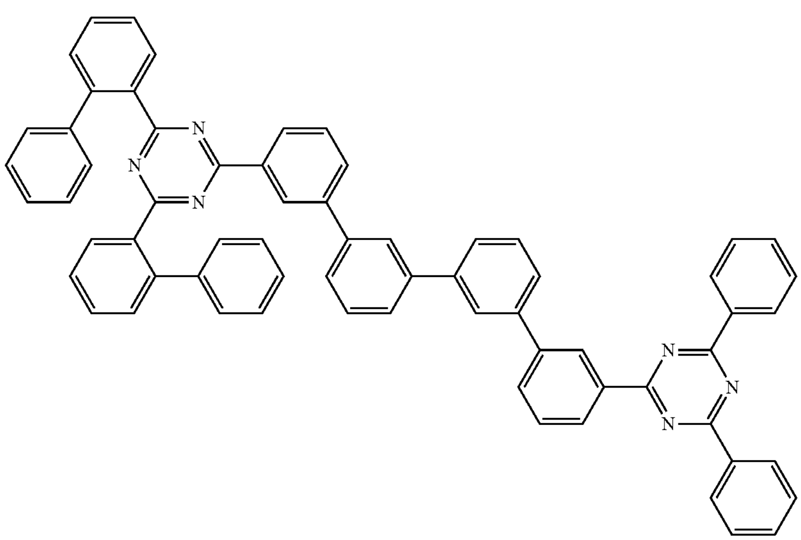

-continued
A(34)
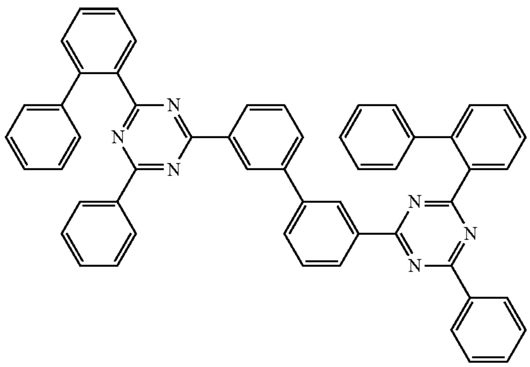
A(35)
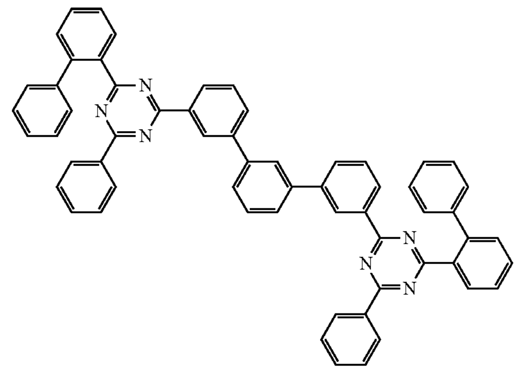
A(36)
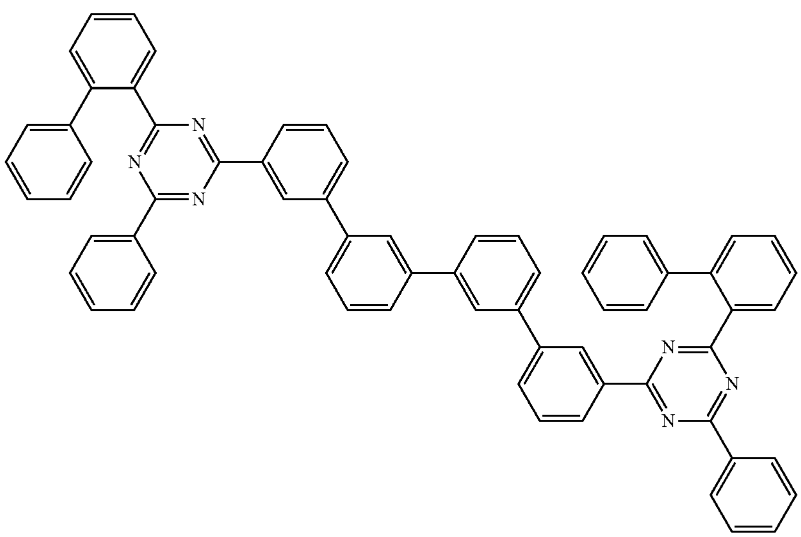
A(37)
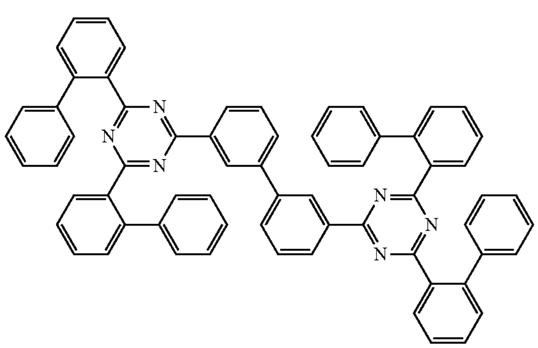
A(38)
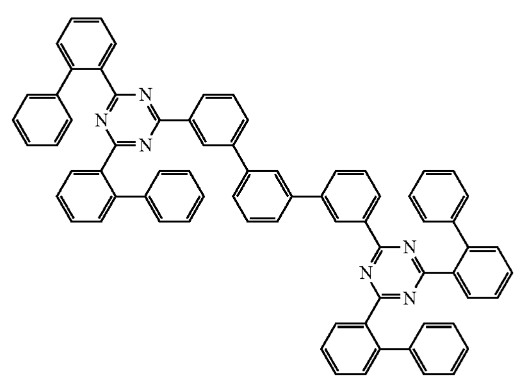

-continued
A(39)
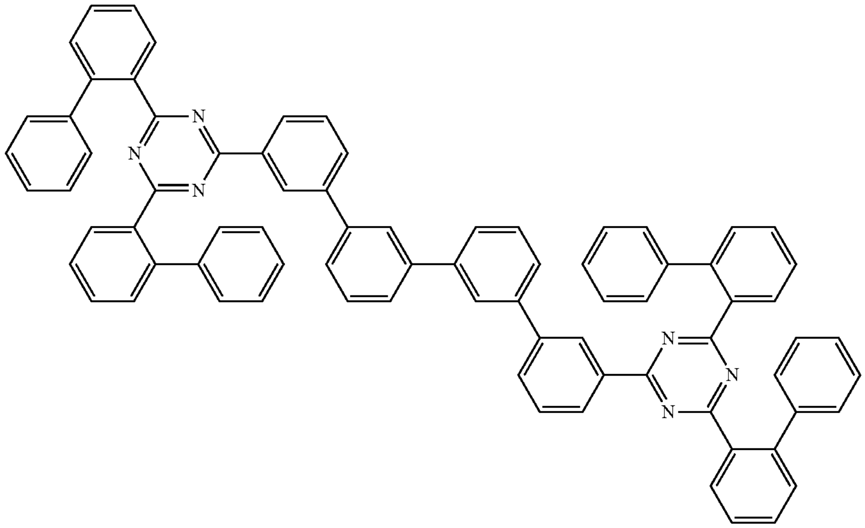
A(40)
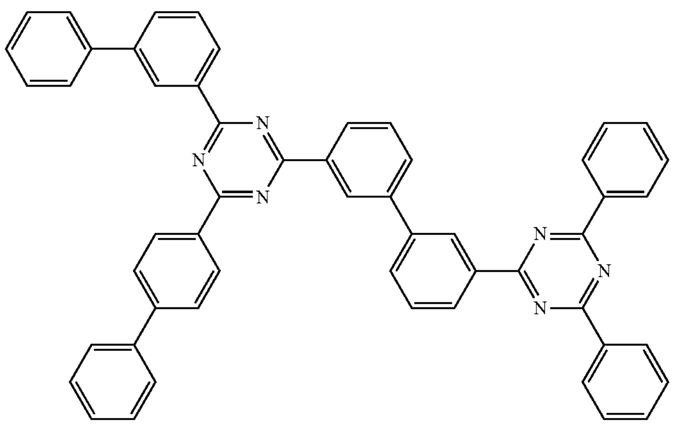
A(41)
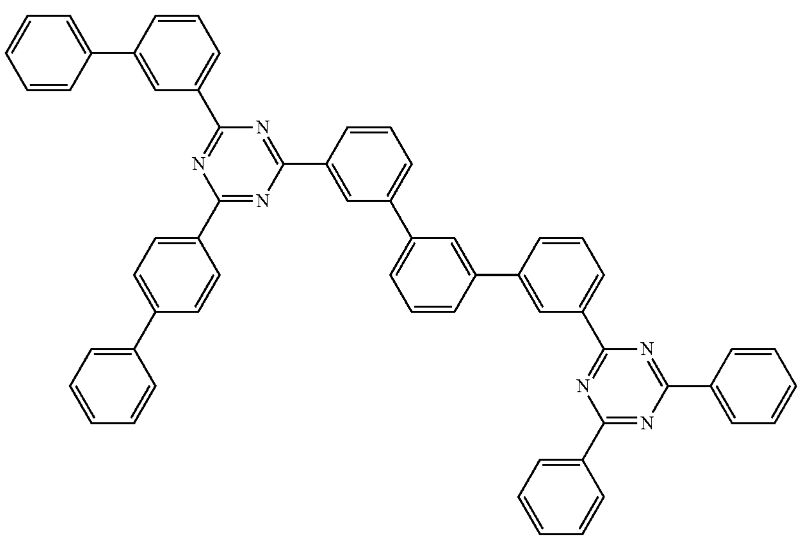

-continued
A(42)
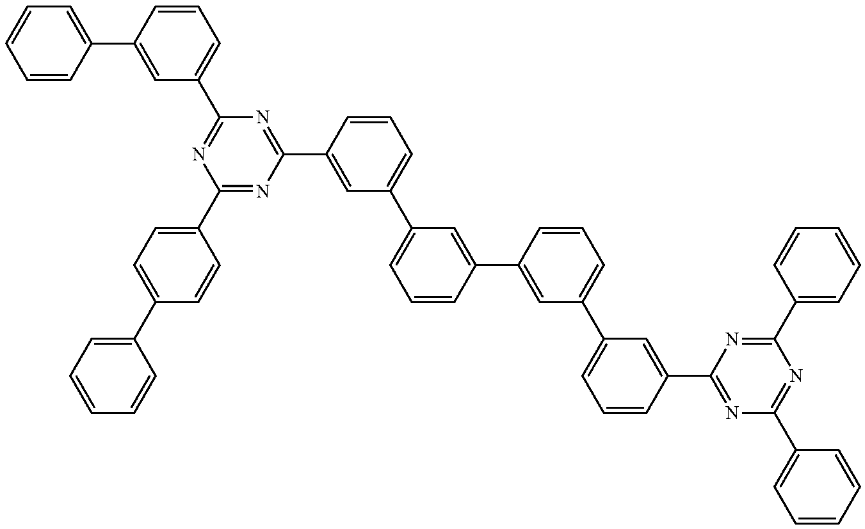
A(43)
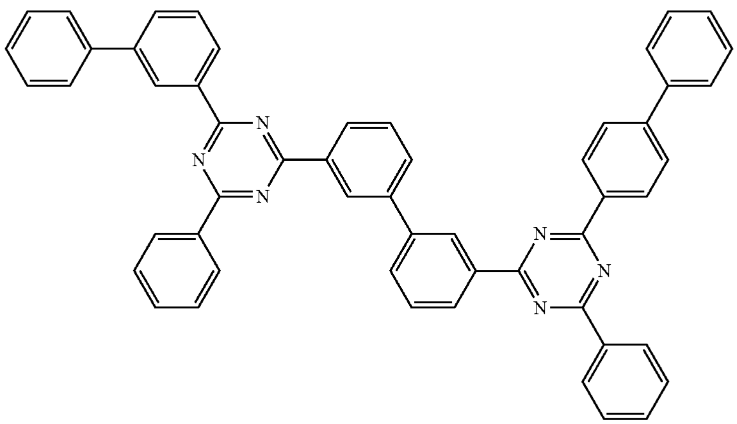
A(44)
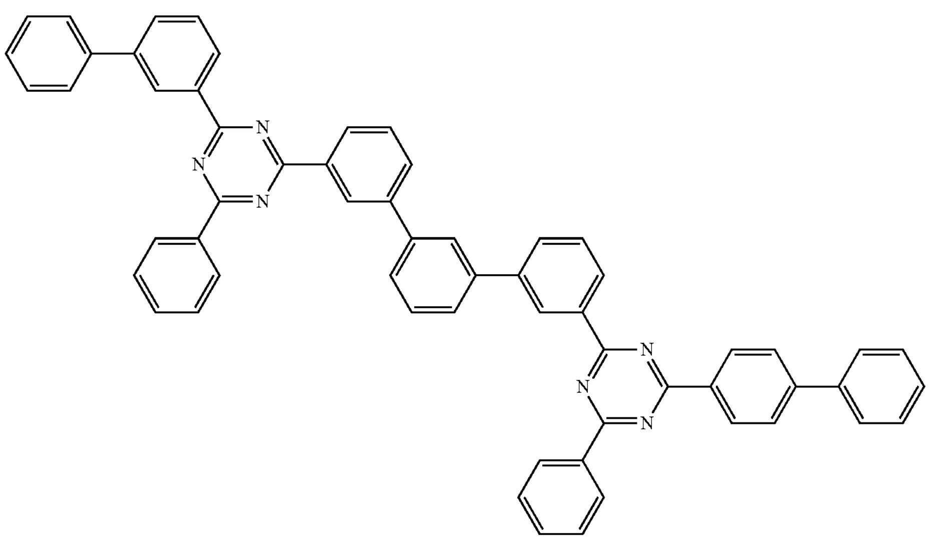

-continued
A(45)
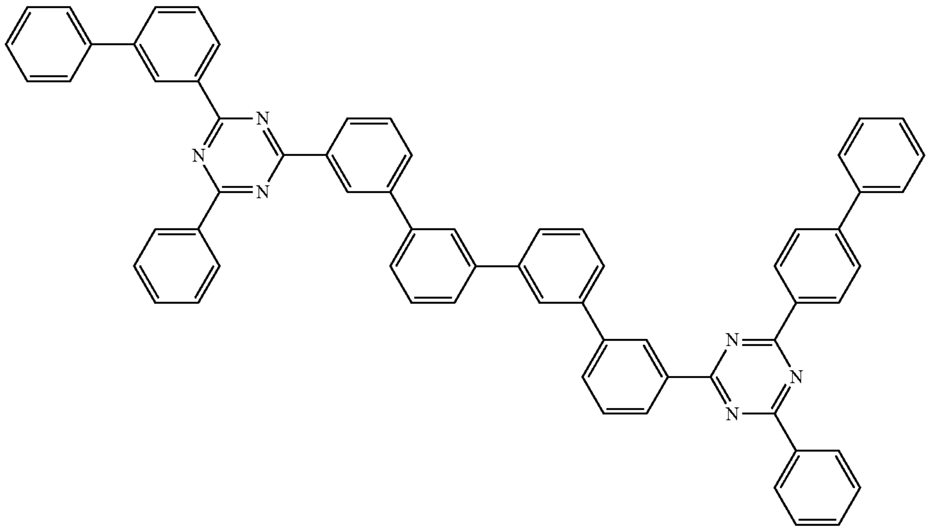
A(46)
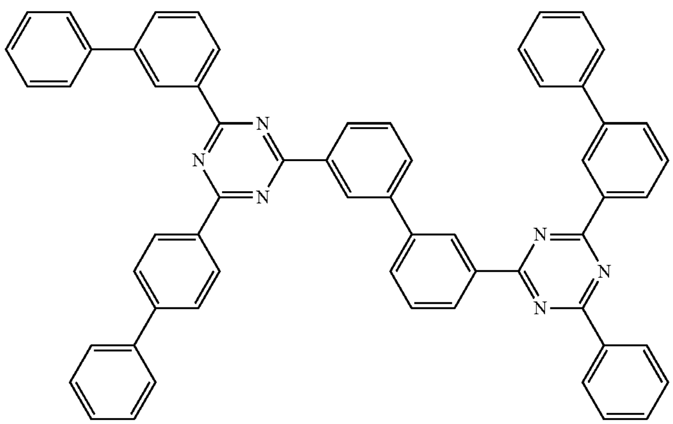
A(47)
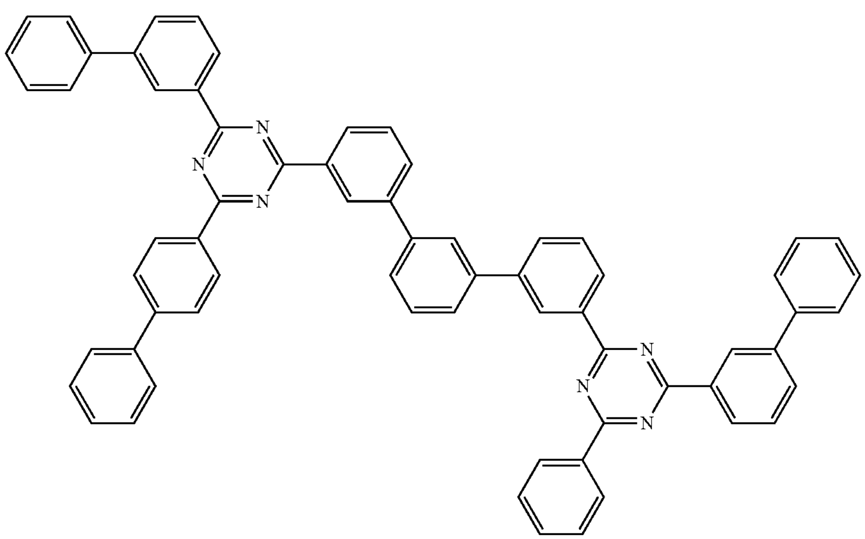

-continued
A(48)
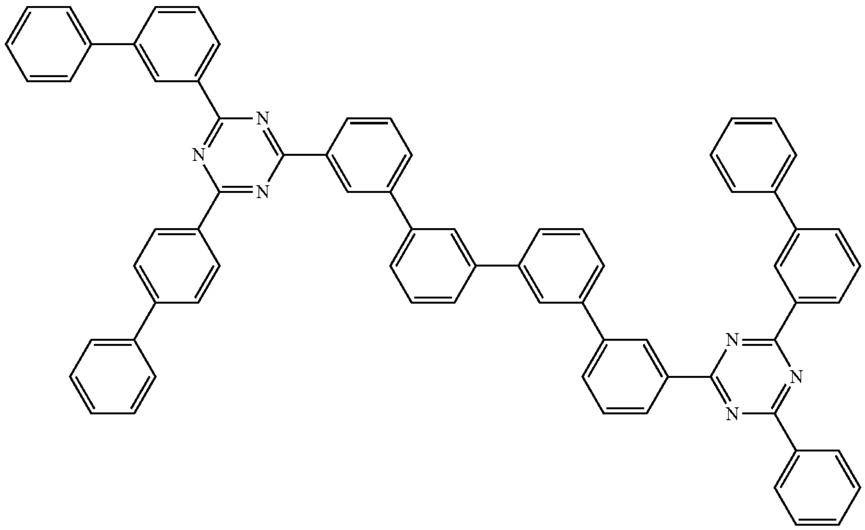
A(49)
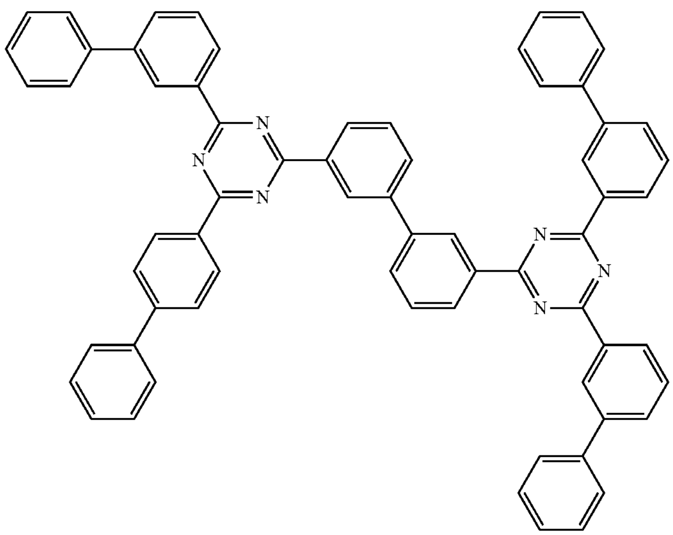
A(50)
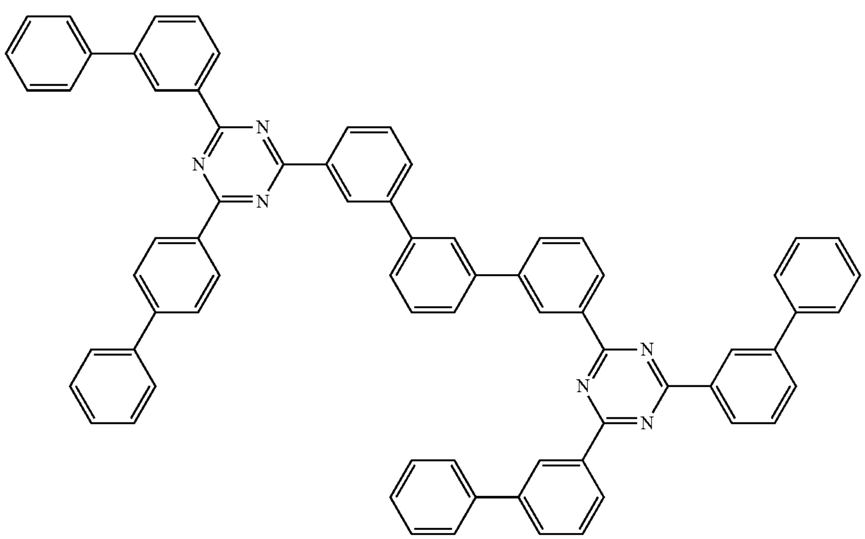

-continued
A(51)
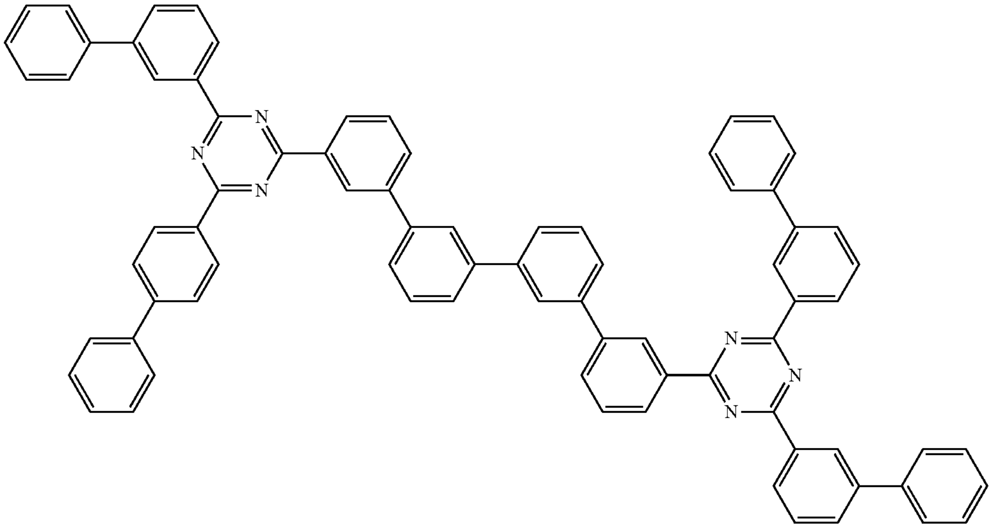
A(52)
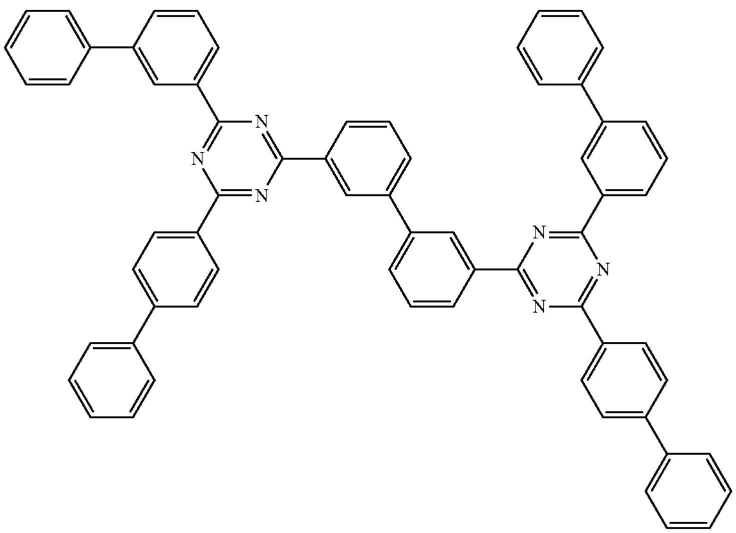
A(53)
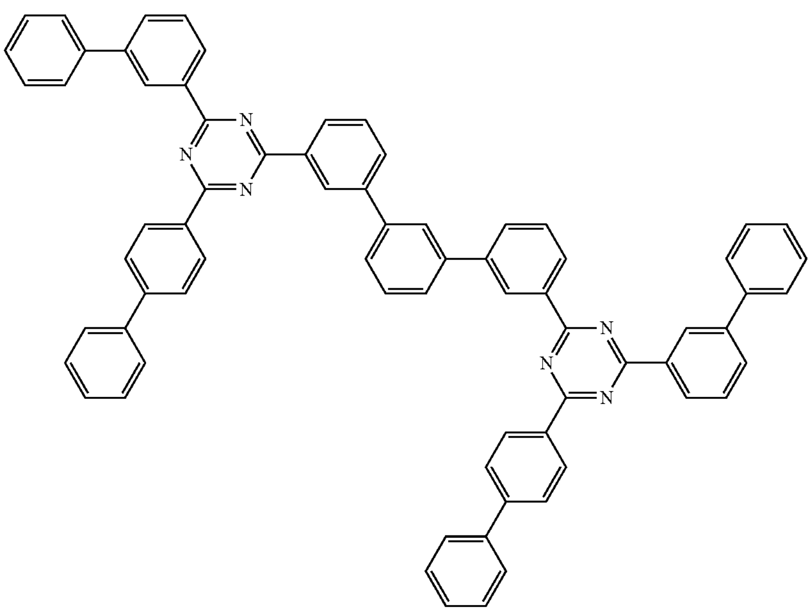

-continued
A(54)
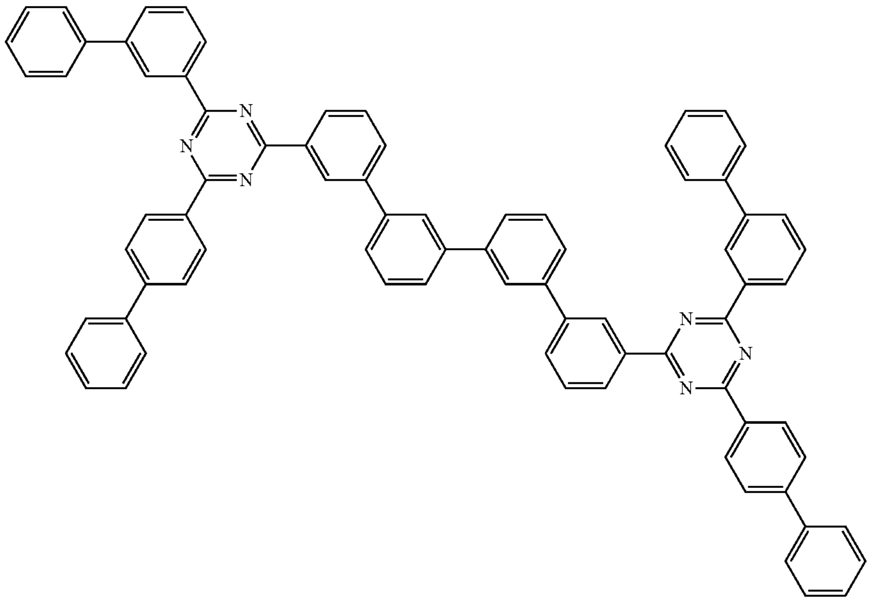
A(55)
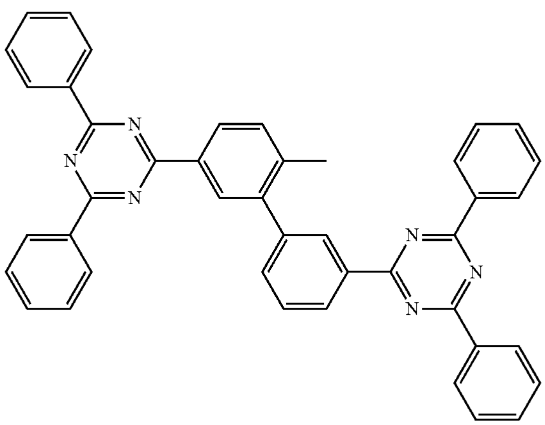
A(56)
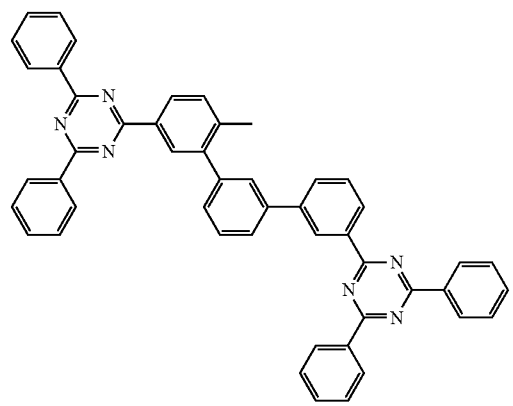
A(57)
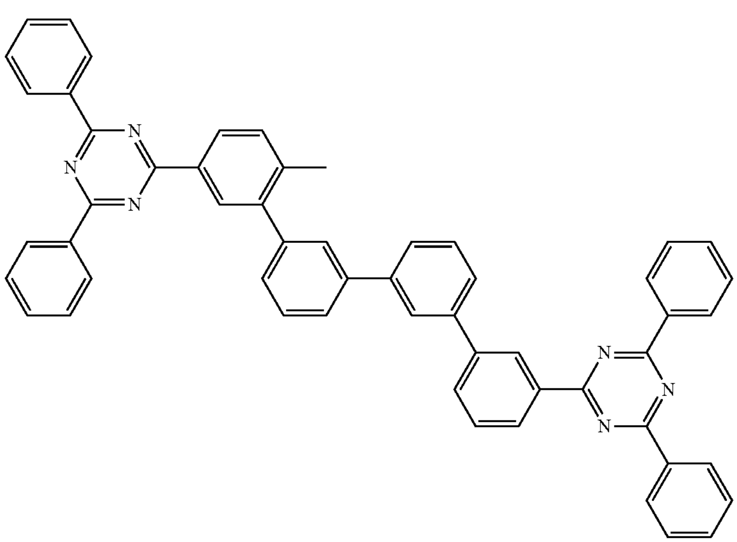

-continued
A(58)
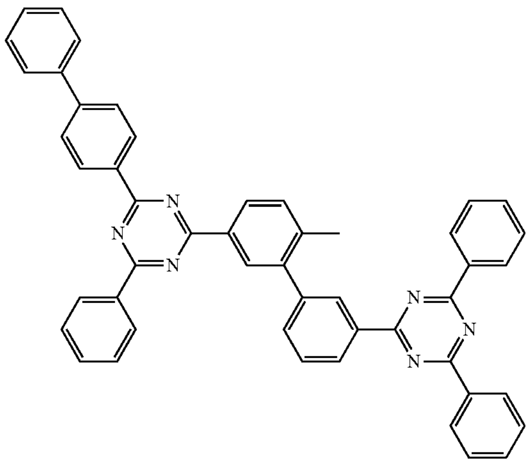
A(59)
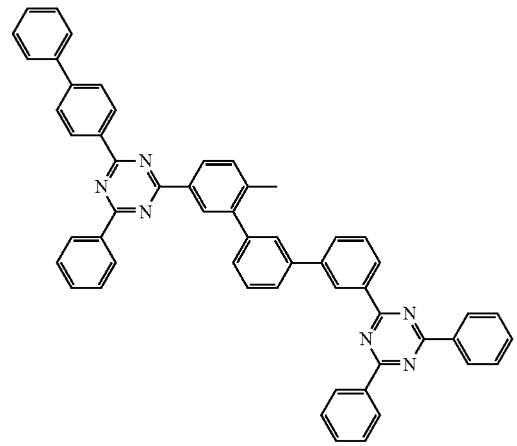
A(60)
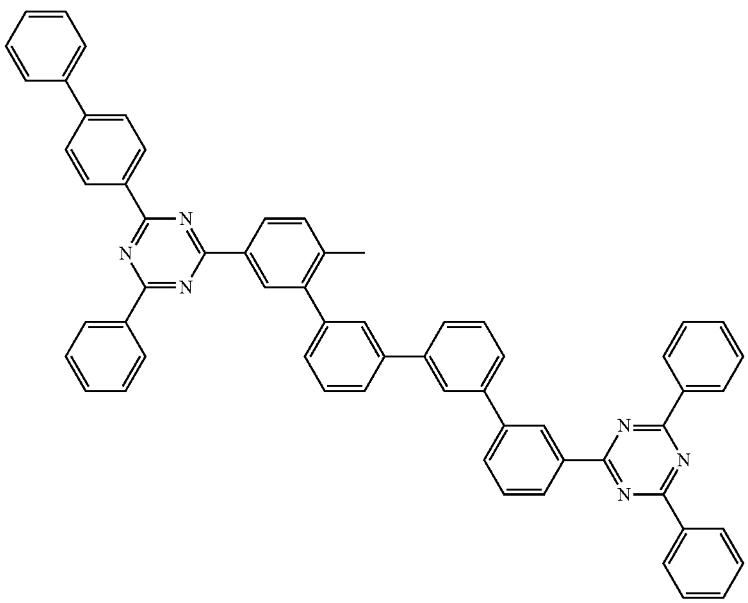
A(61)
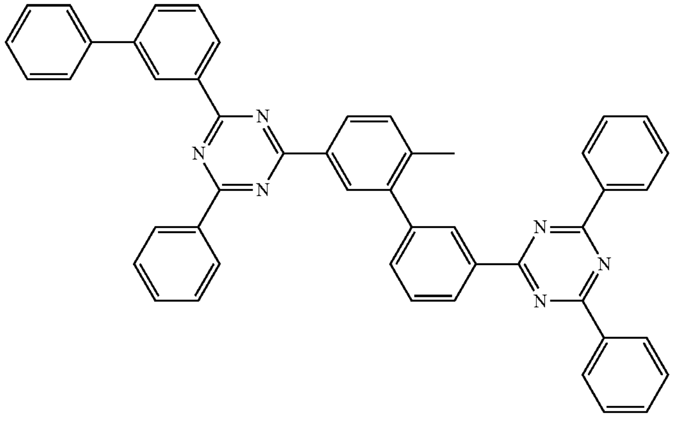

-continued
A(62)
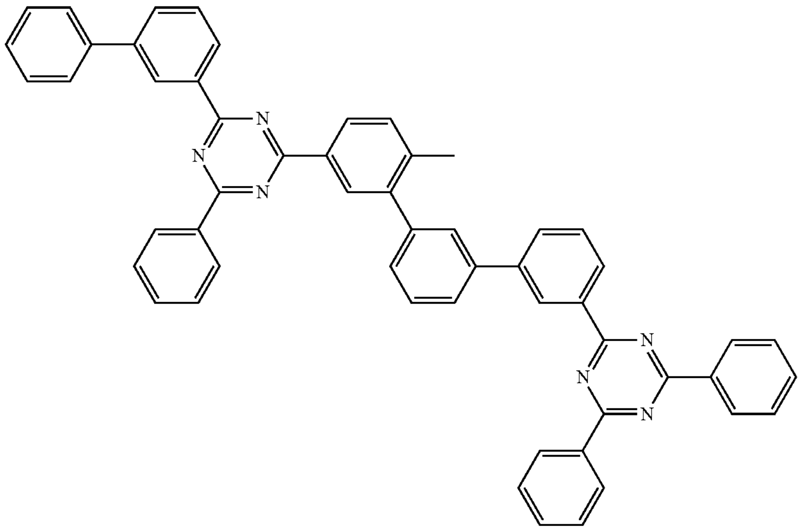
A(63)
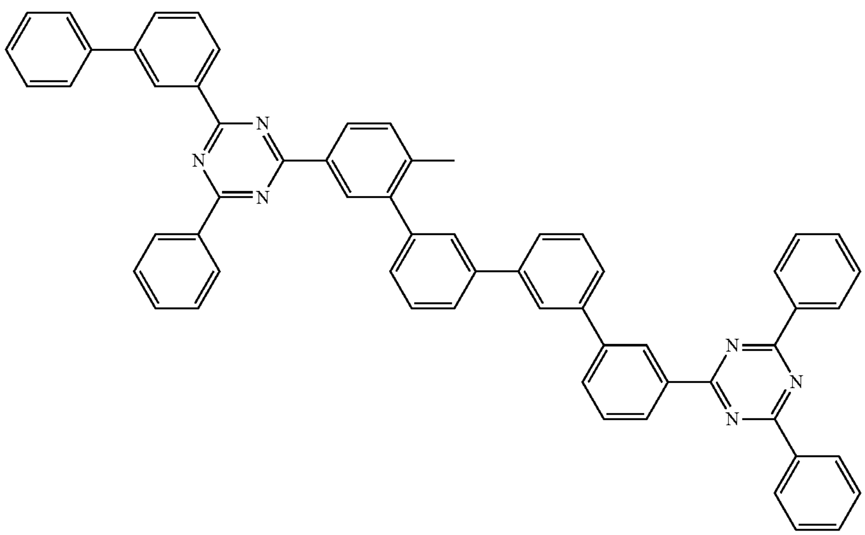
A(64)
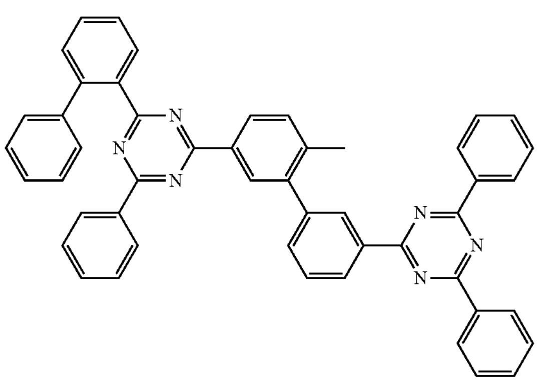
A(65)
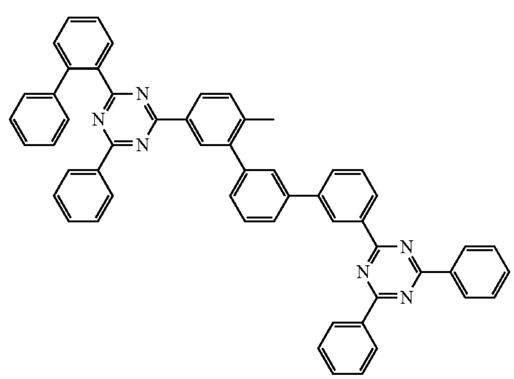

-continued
A(66)
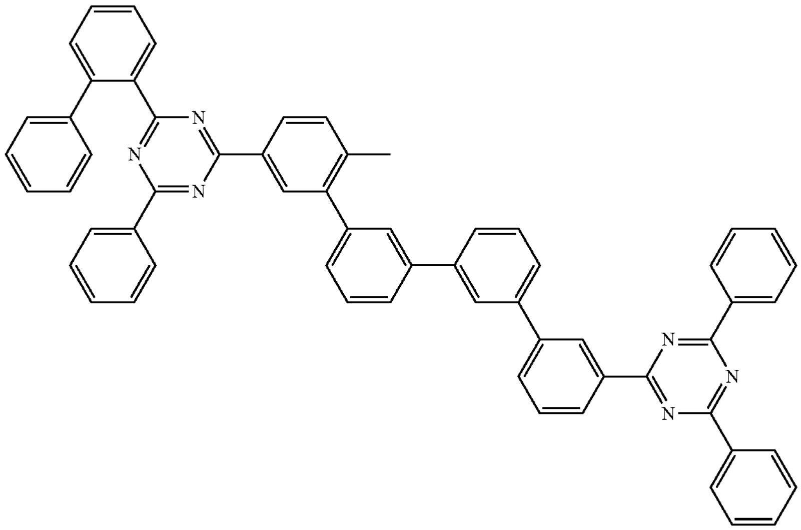
A(67)
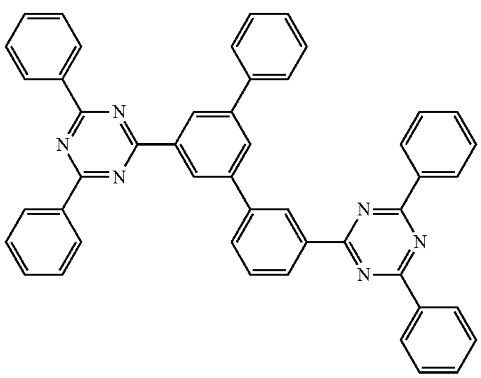
A(68)
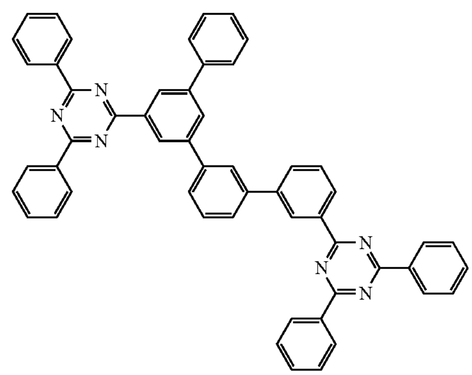
A(69)
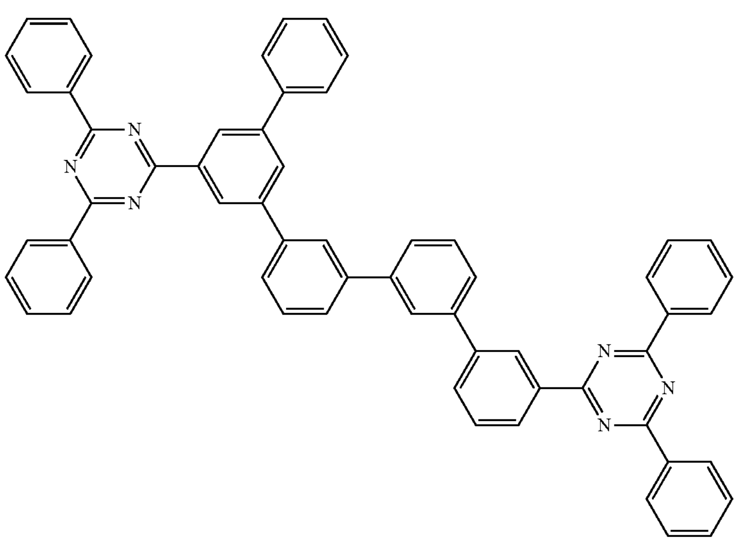

-continued
A(70)
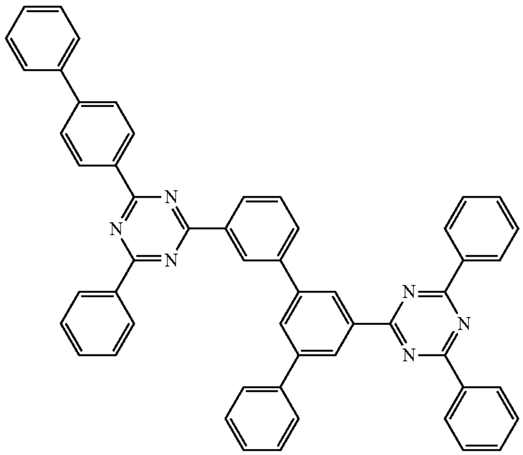
A(71)
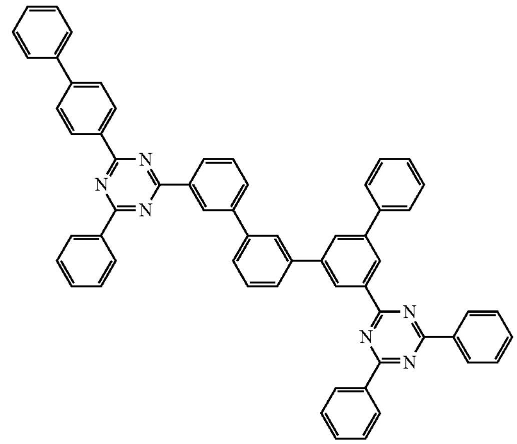
A(72)
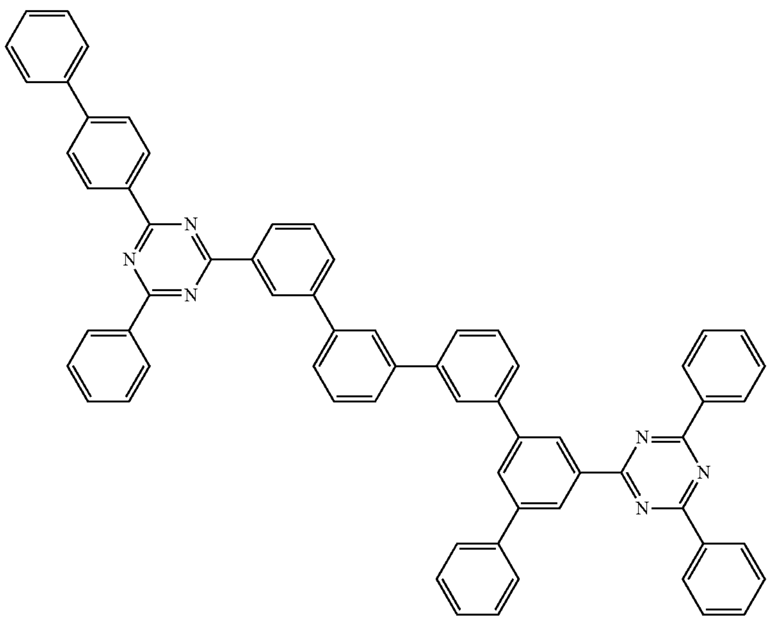
A(73)
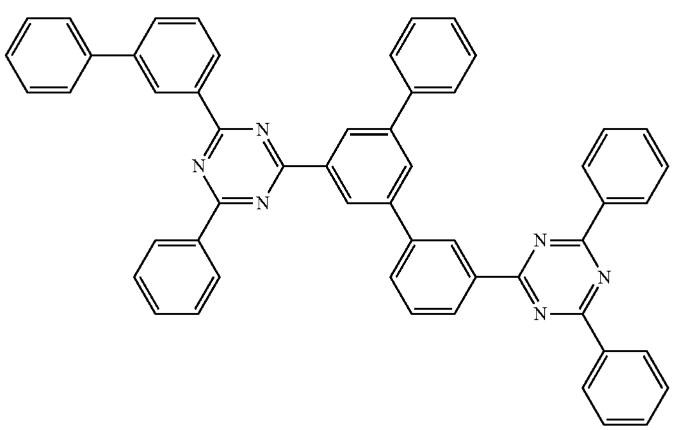

-continued
A(74)
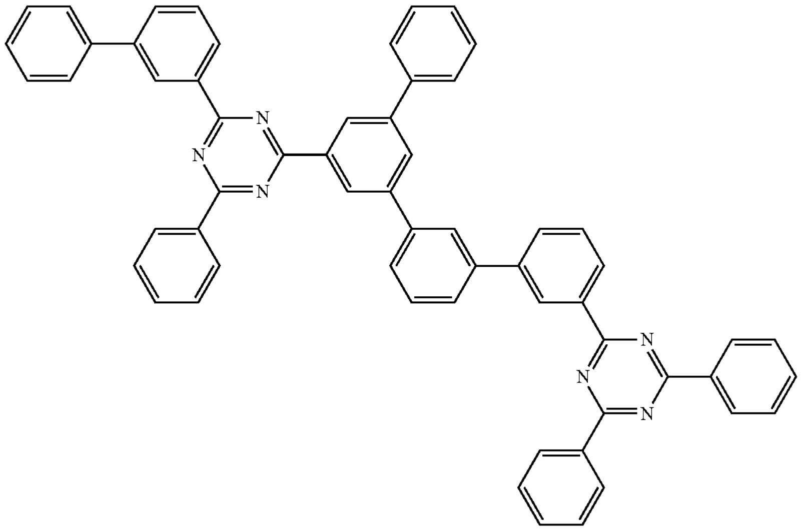
A(75)
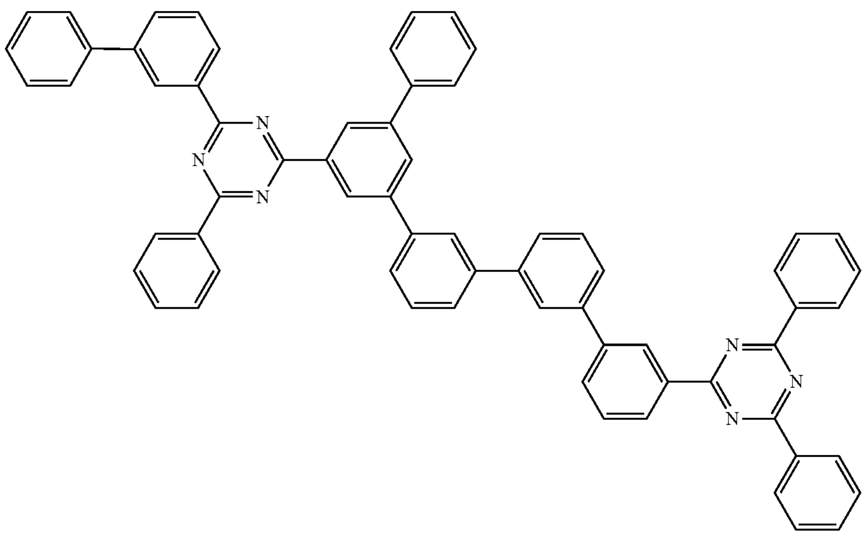
A(76)
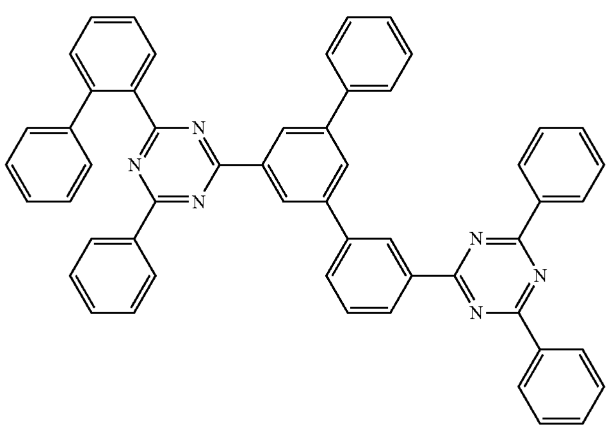

-continued
A(77)
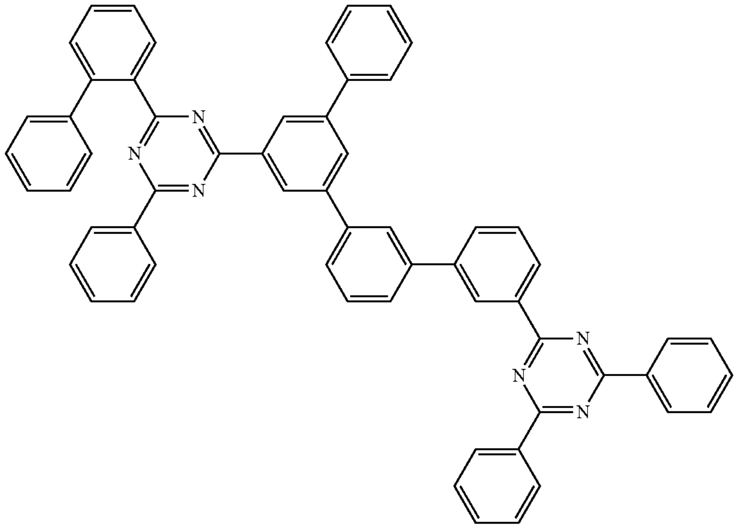
A(78)
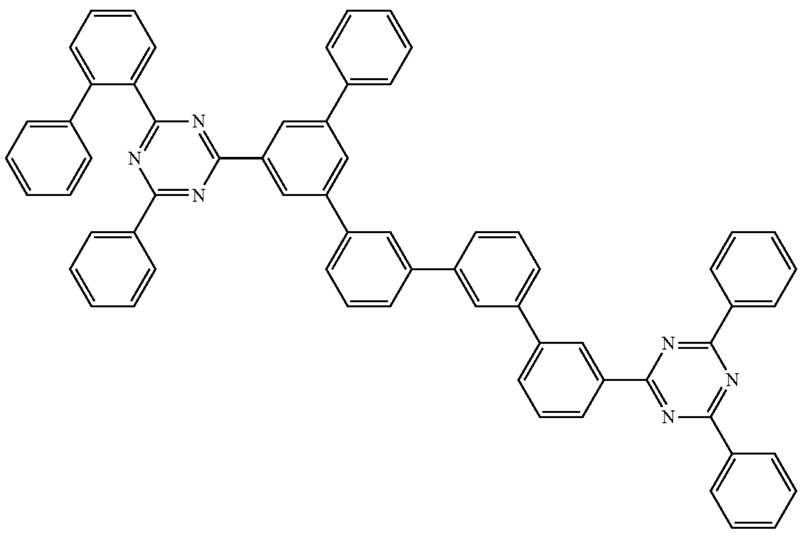
A(79)
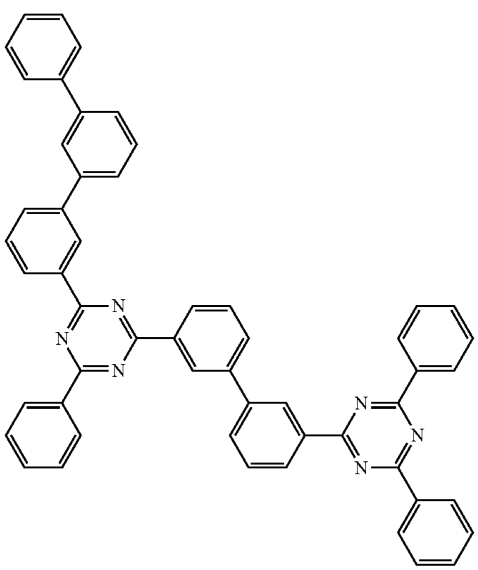
A(80)
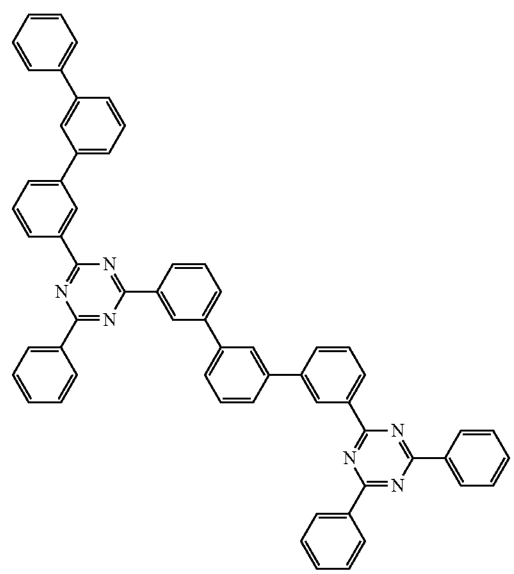

-continued
A(81)
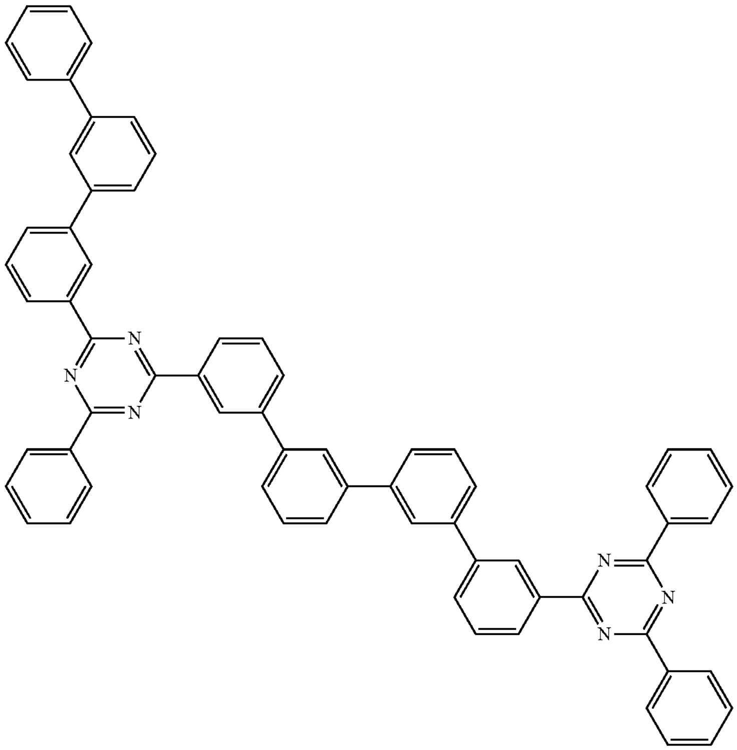
A(82)
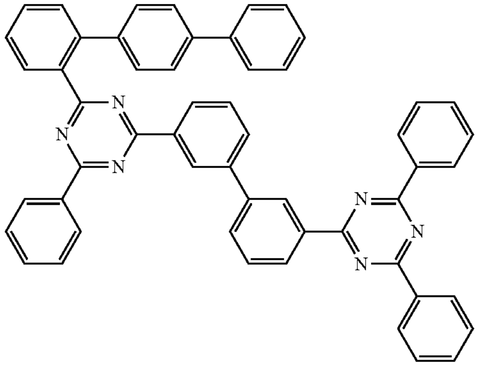
A(83)
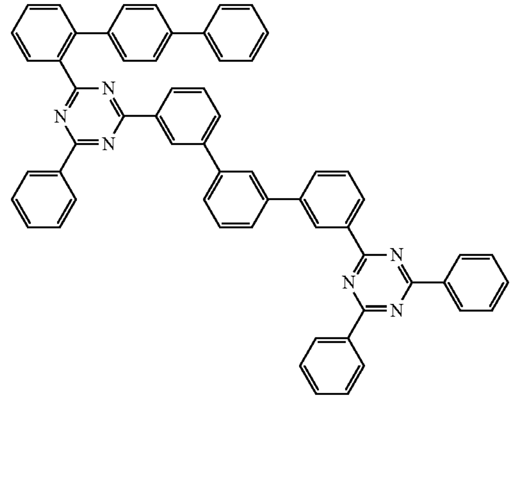

-continued
A(84)
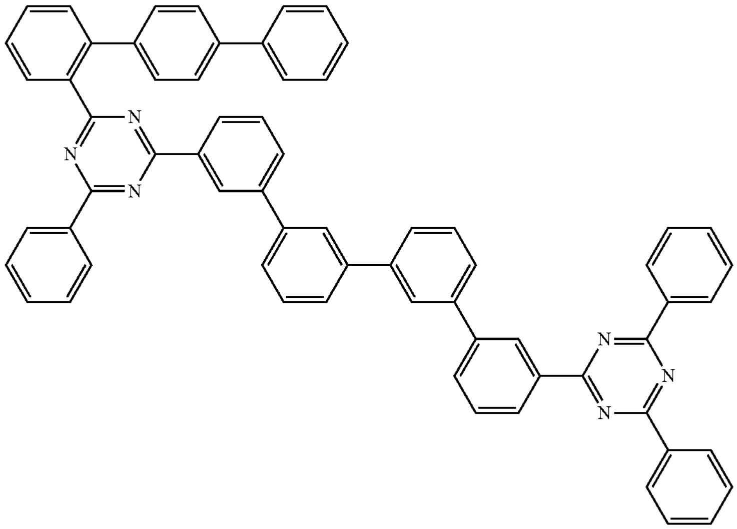
A(85)
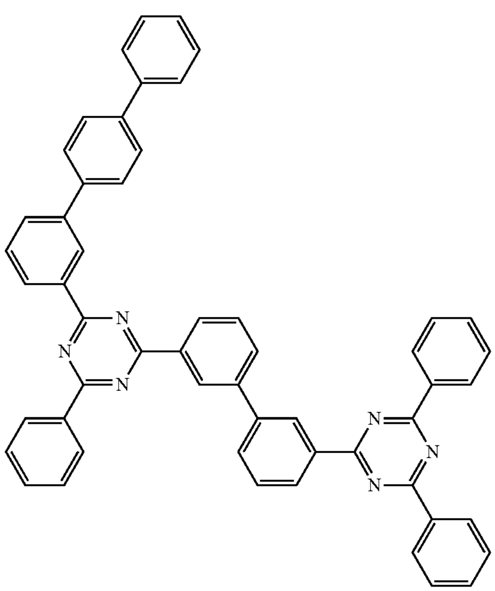
A(86)
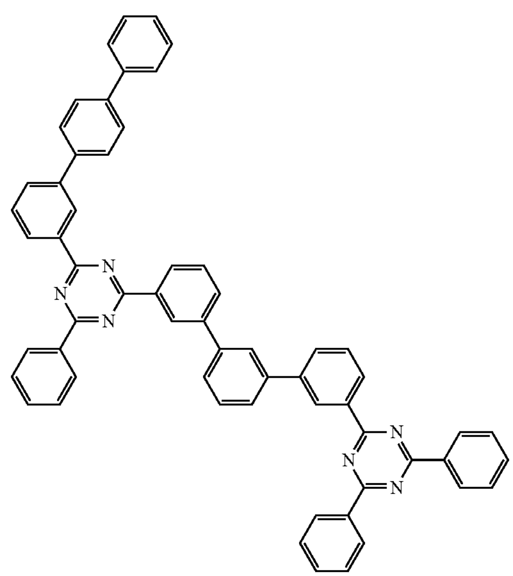

-continued
A(87)
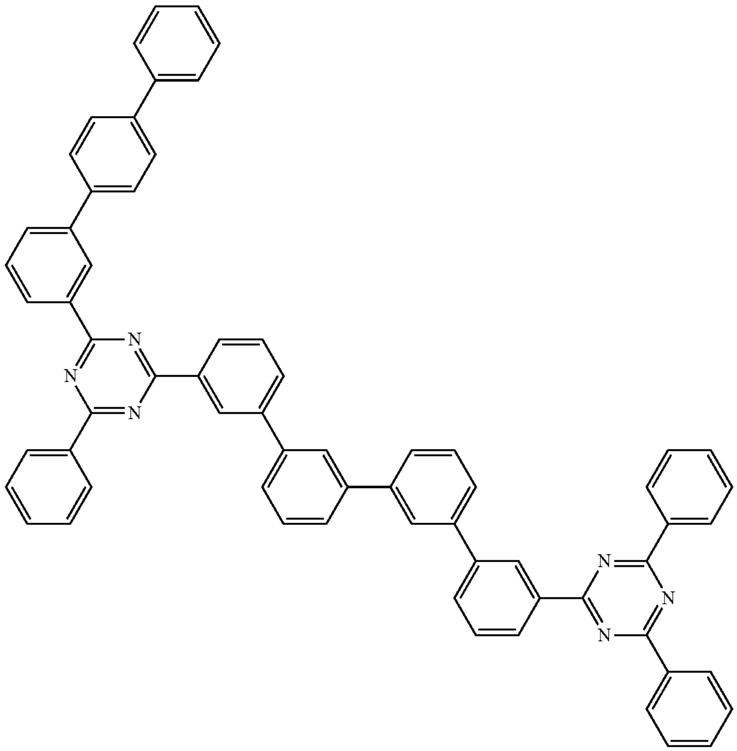
A(88)
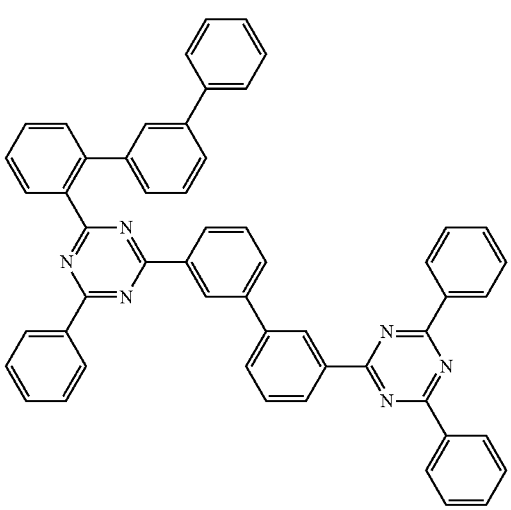
A(89)
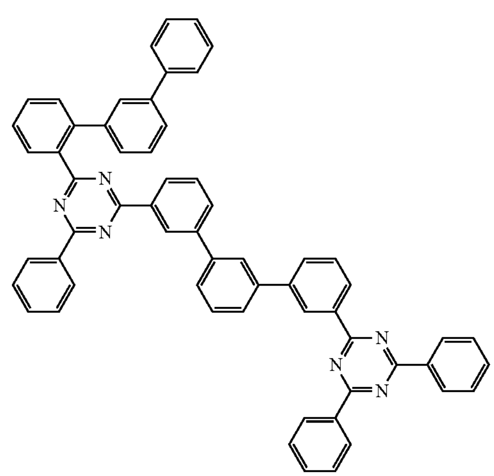

-continued
A(90)
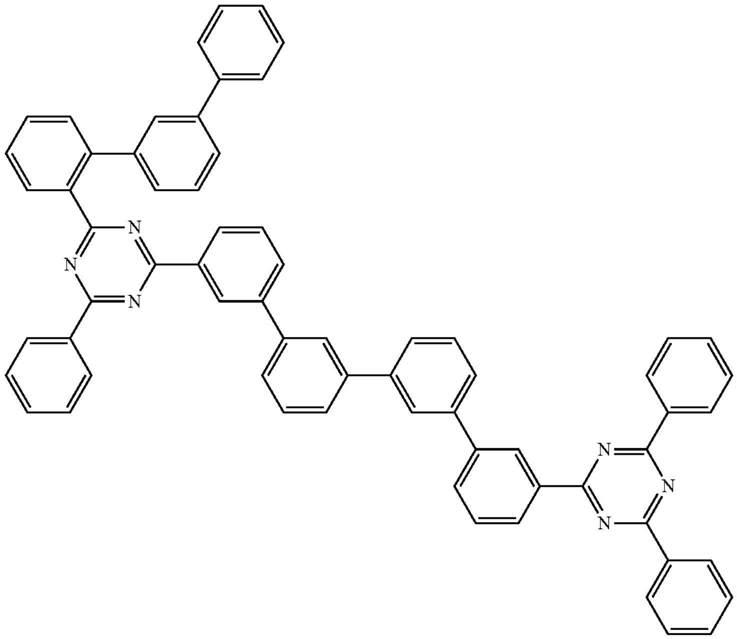
A(91)
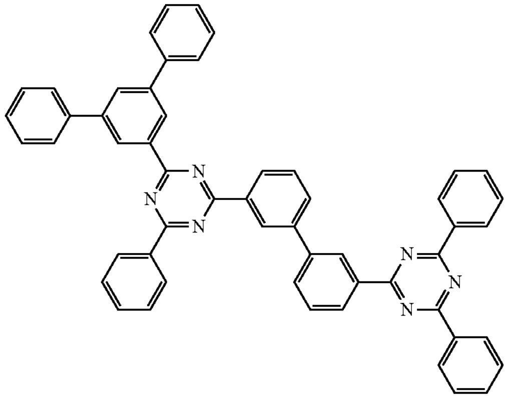
A(92)
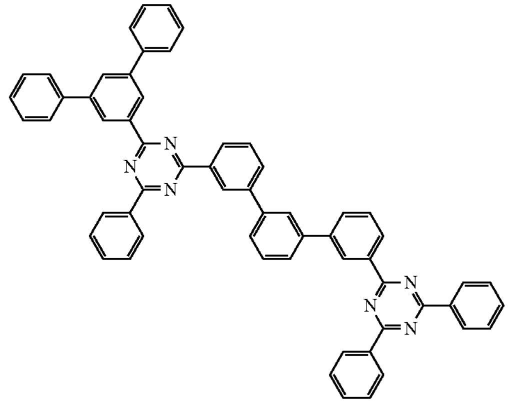

-continued
A(93)
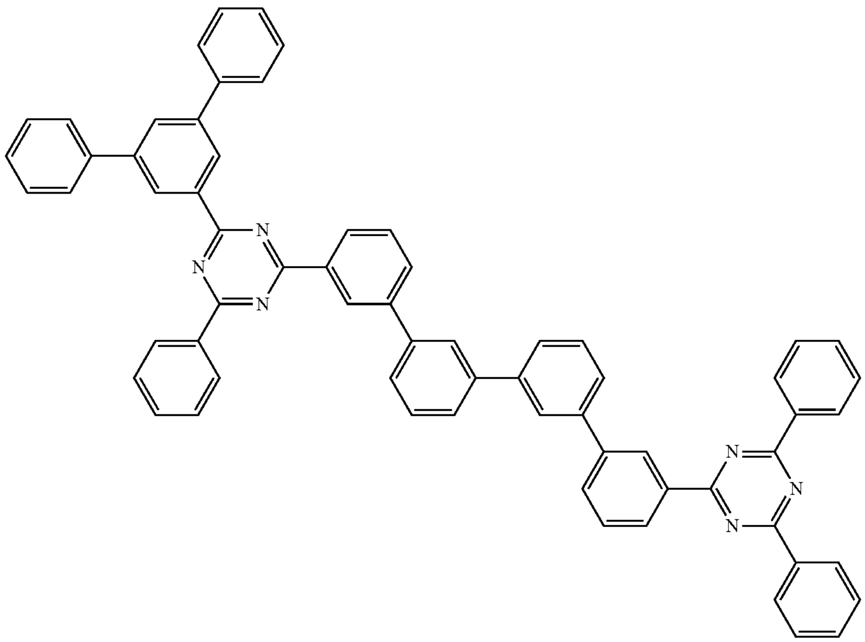
A(94)
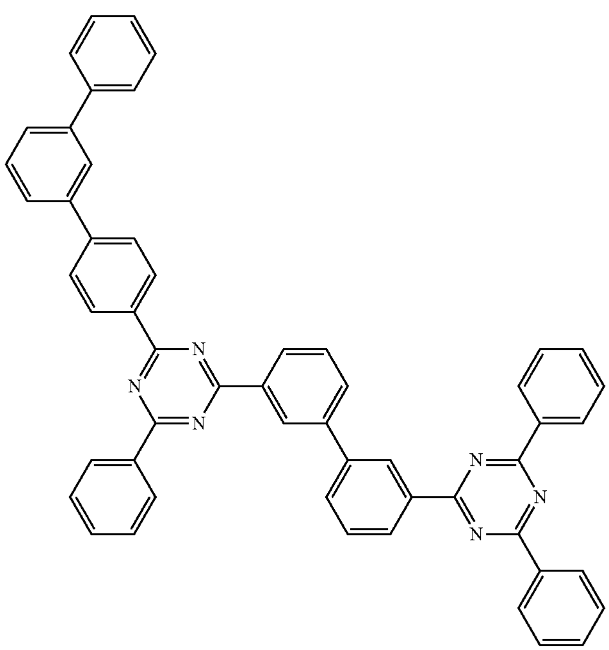

-continued
A(95)
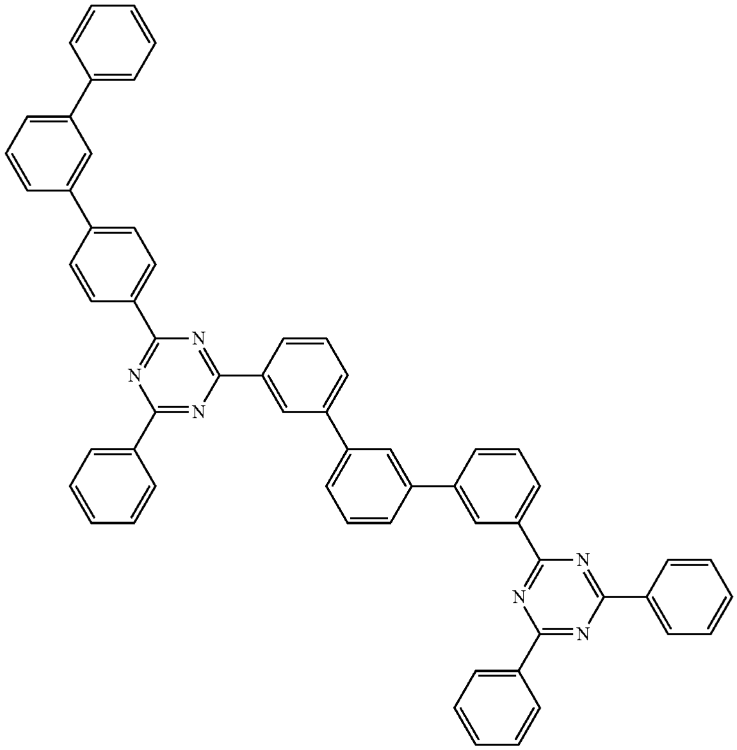
A(96)
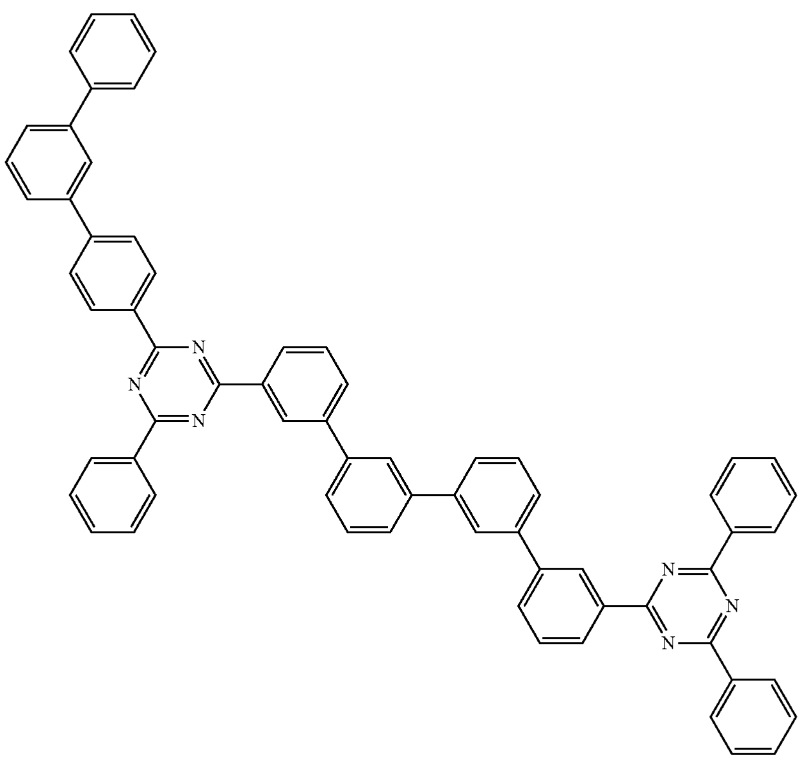

-continued
A(97)
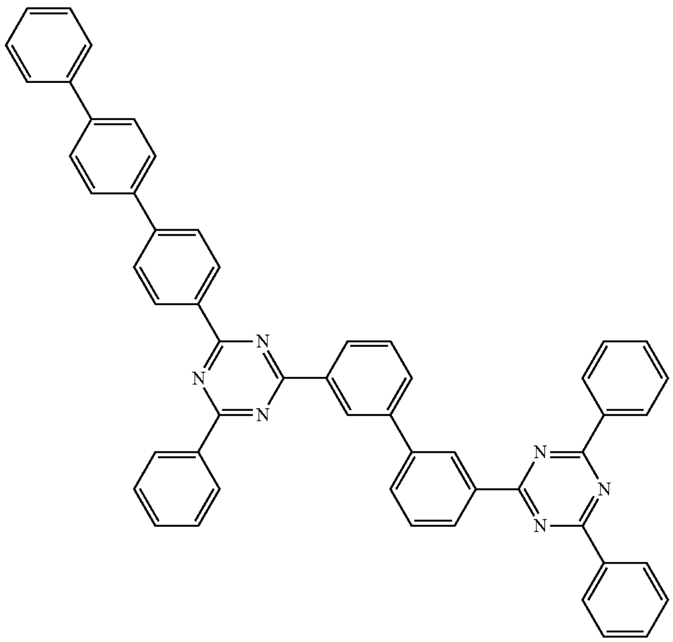
A(98)
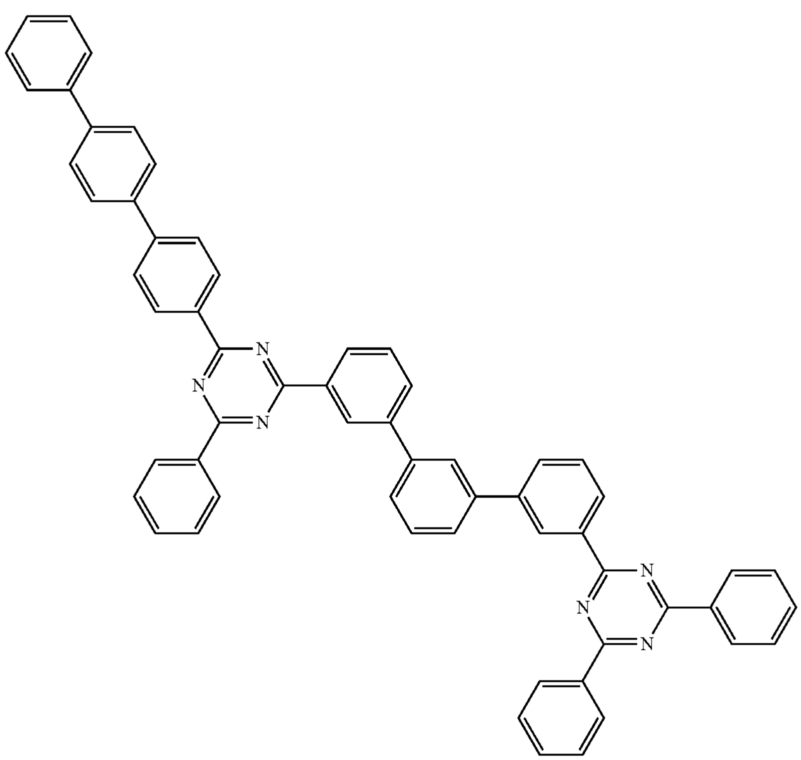

-continued
A(99)
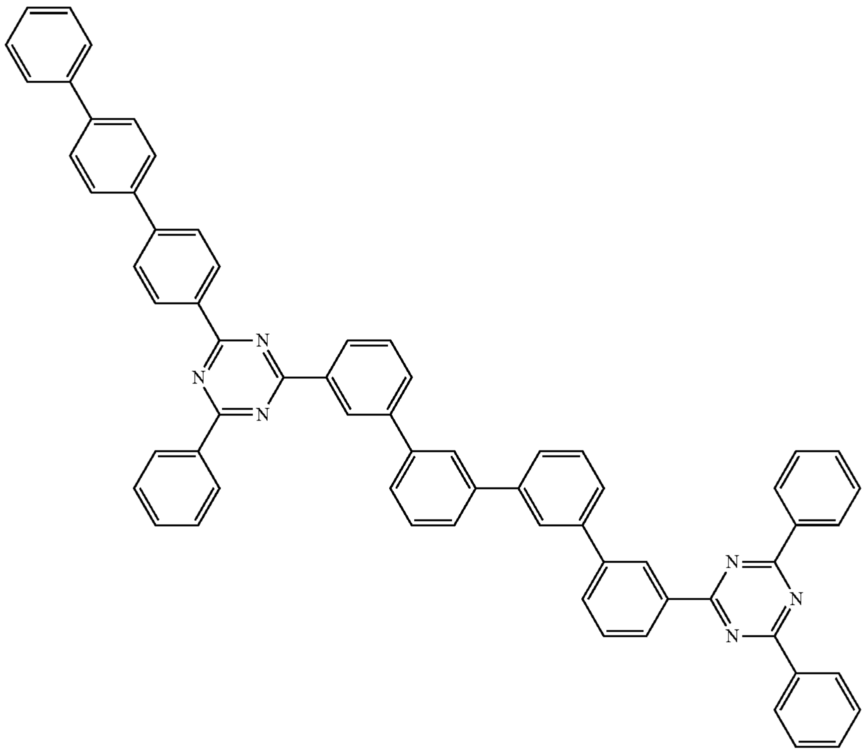
A(100)
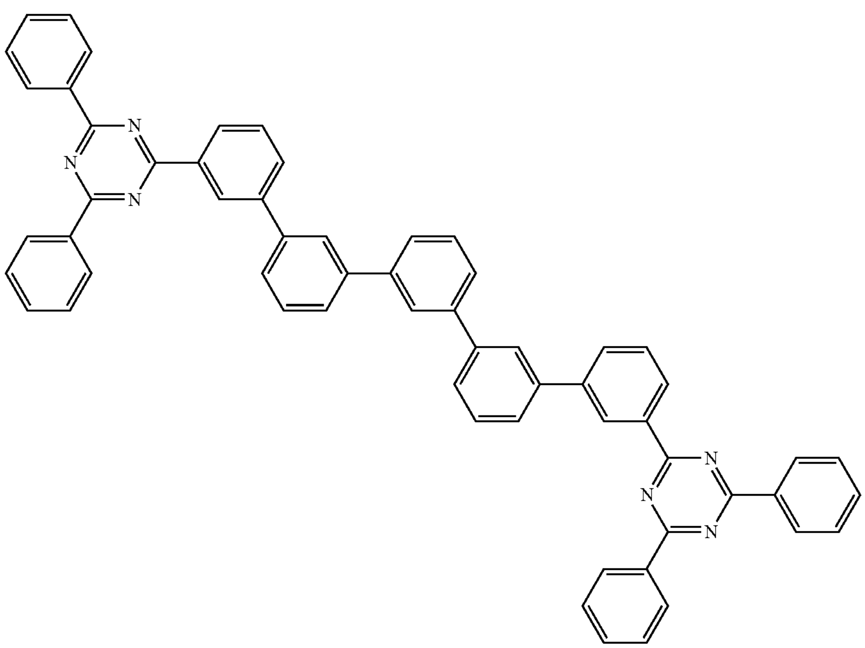

-continued
A(101)
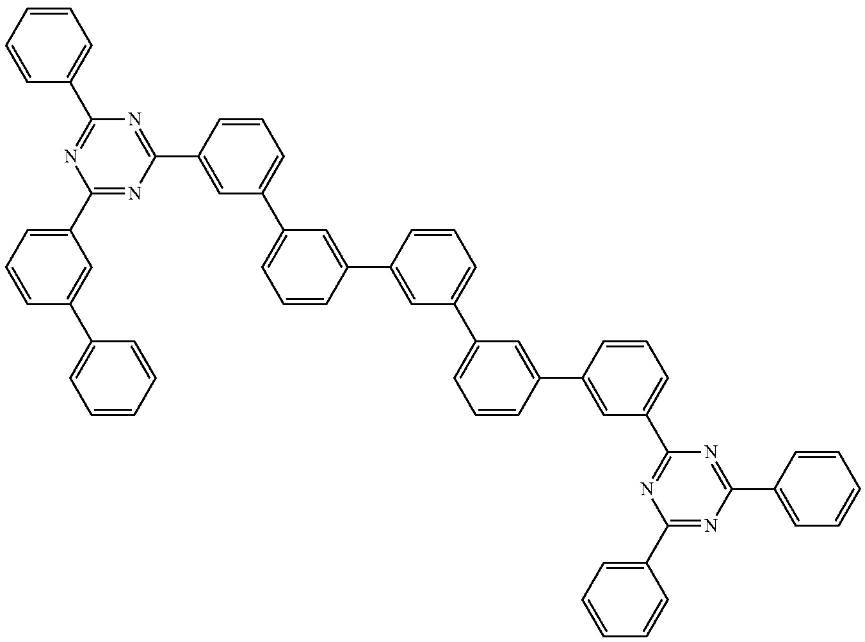
A(102)
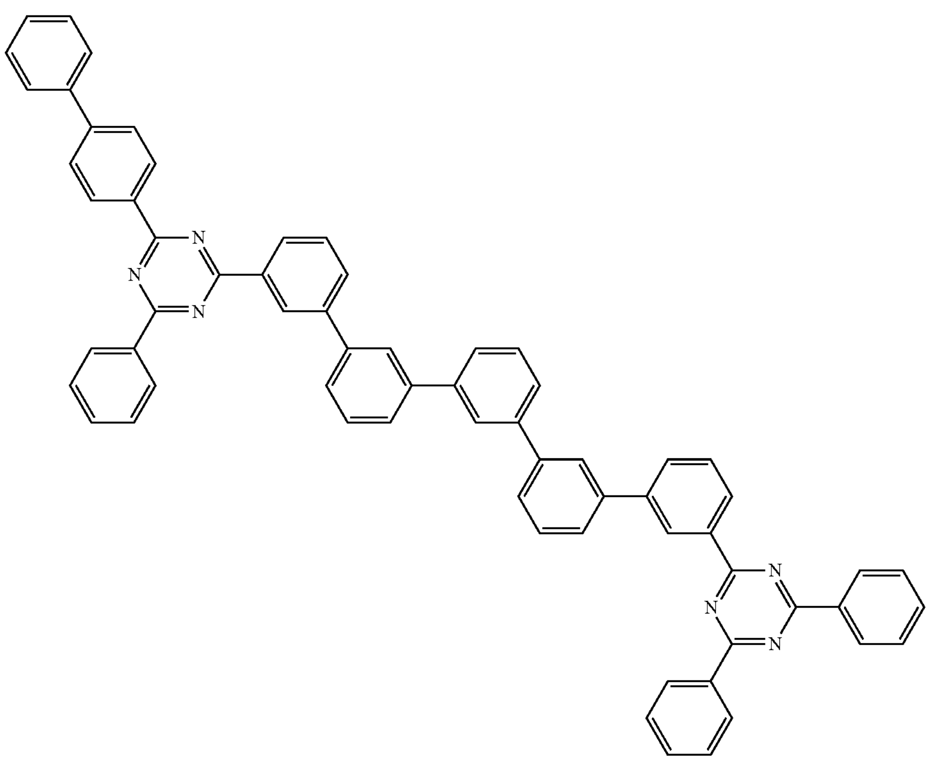

-continued
A(103)
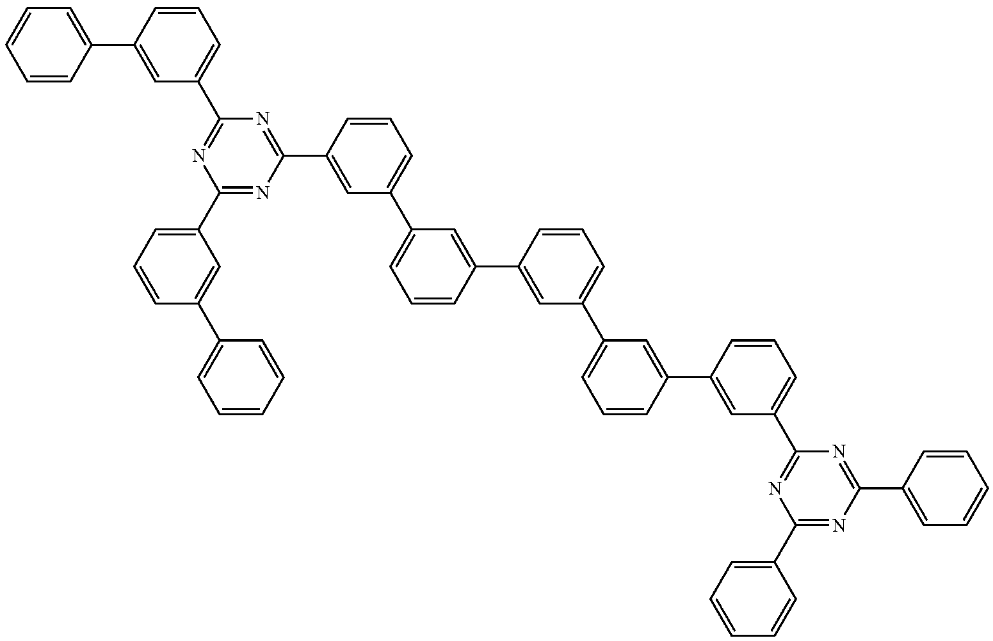
A(104)
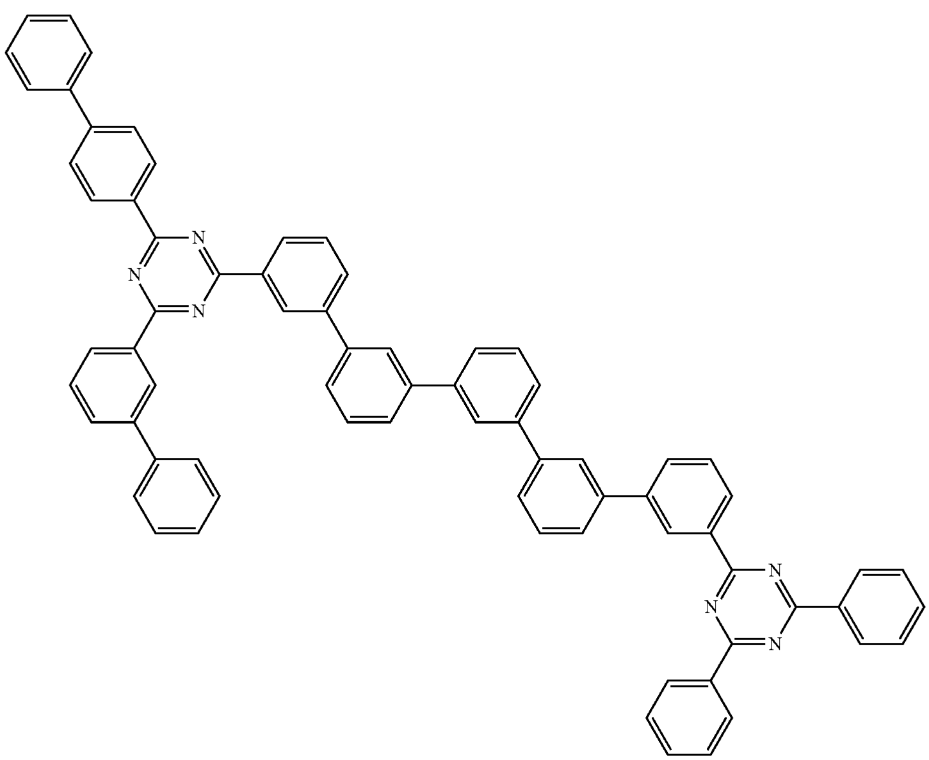

-continued
A(105)
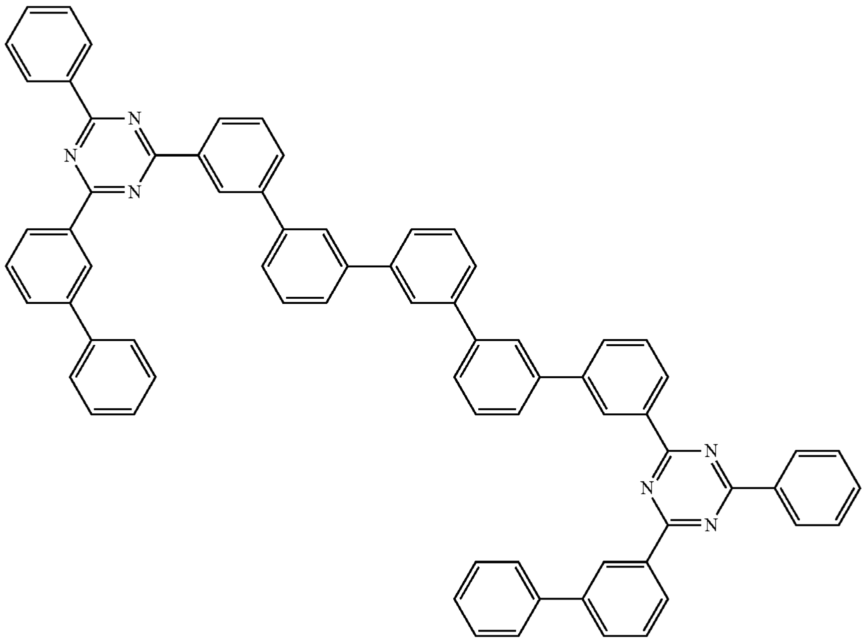
A(106)
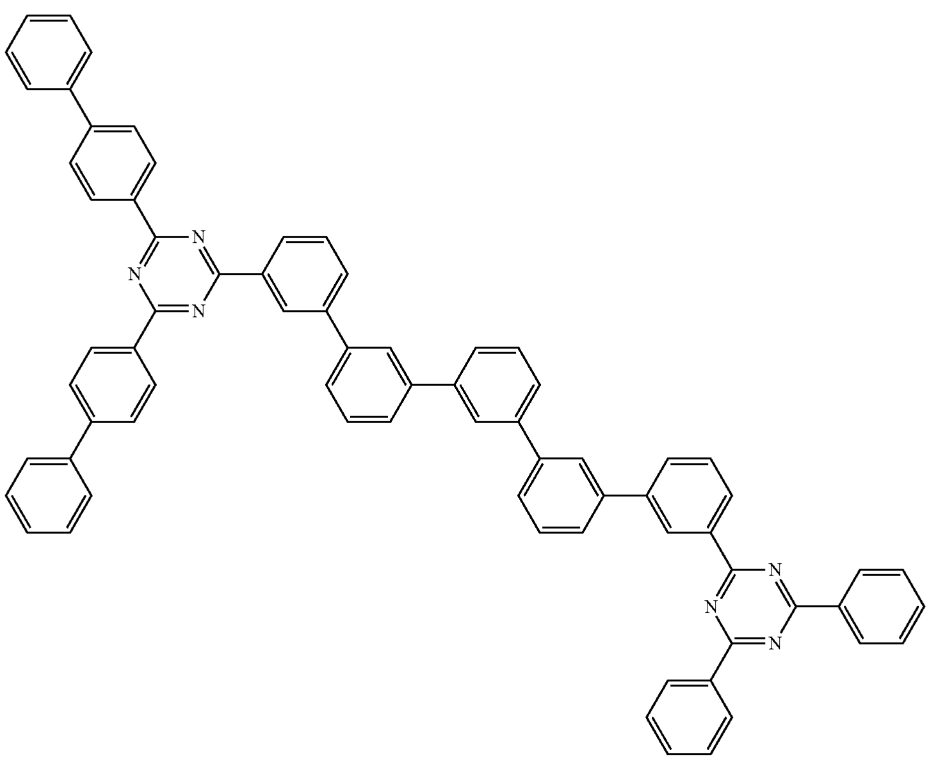

-continued
A(107)
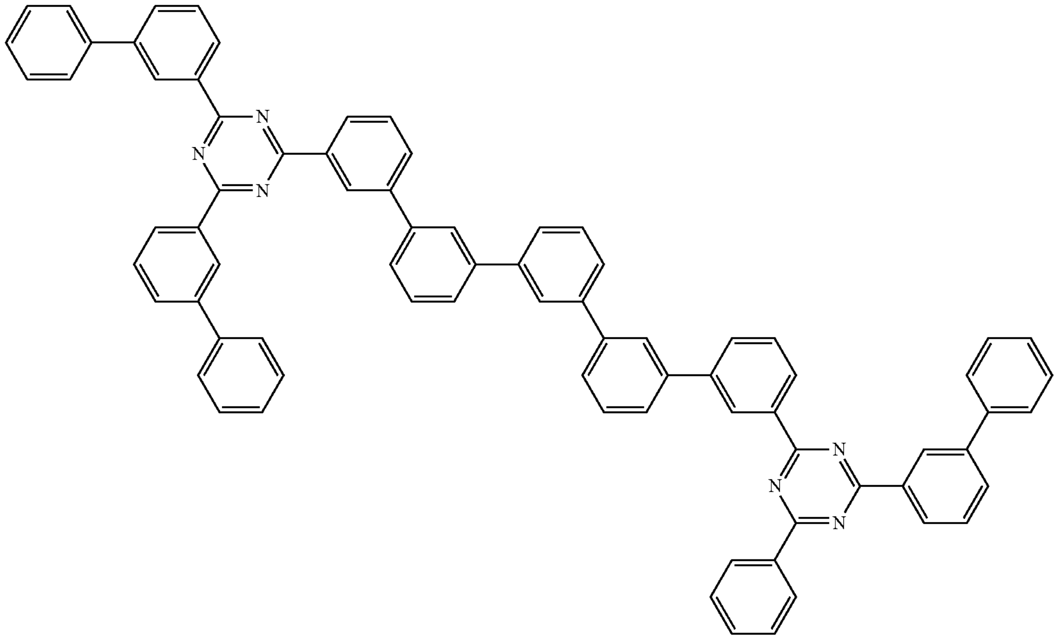
A(108)
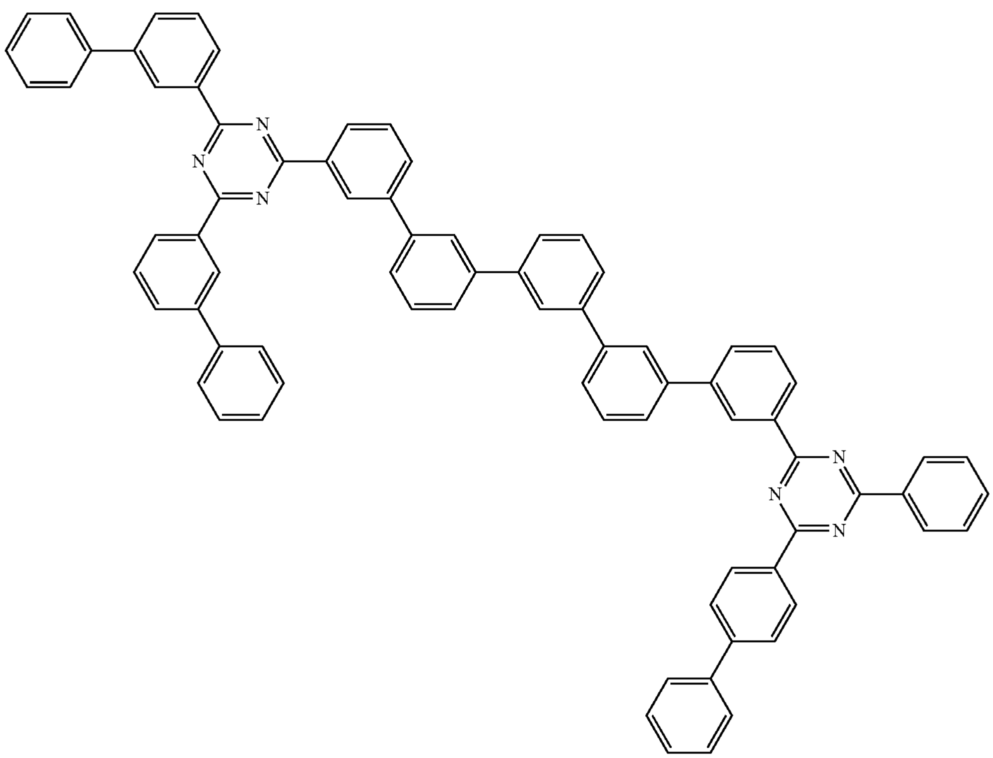

-continued
A(109)
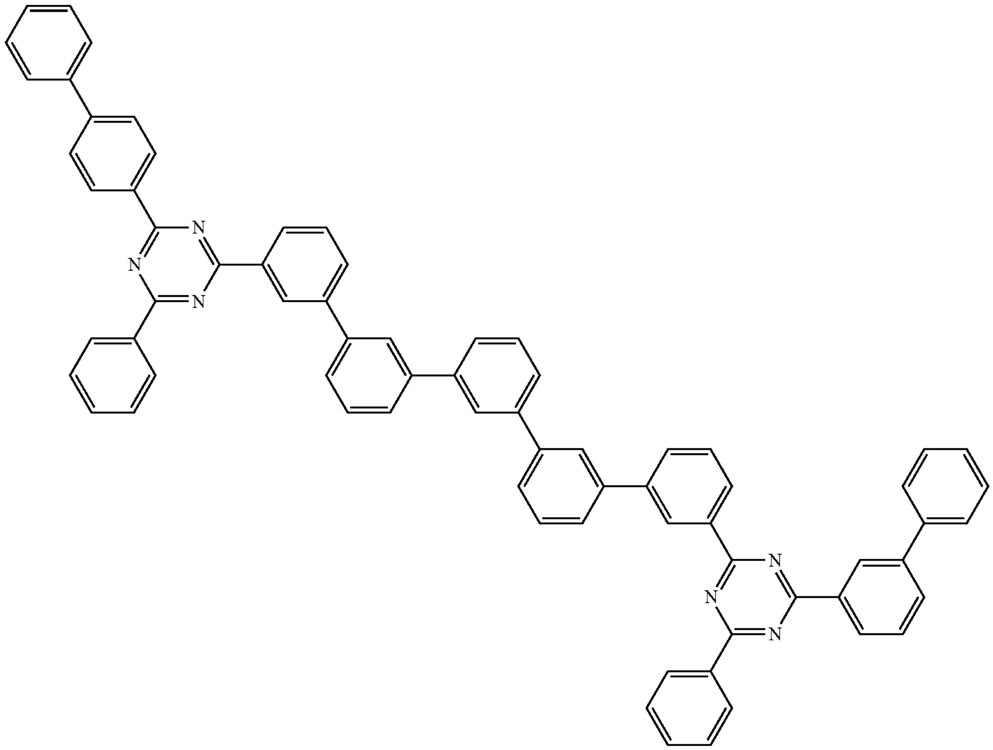
A(110)
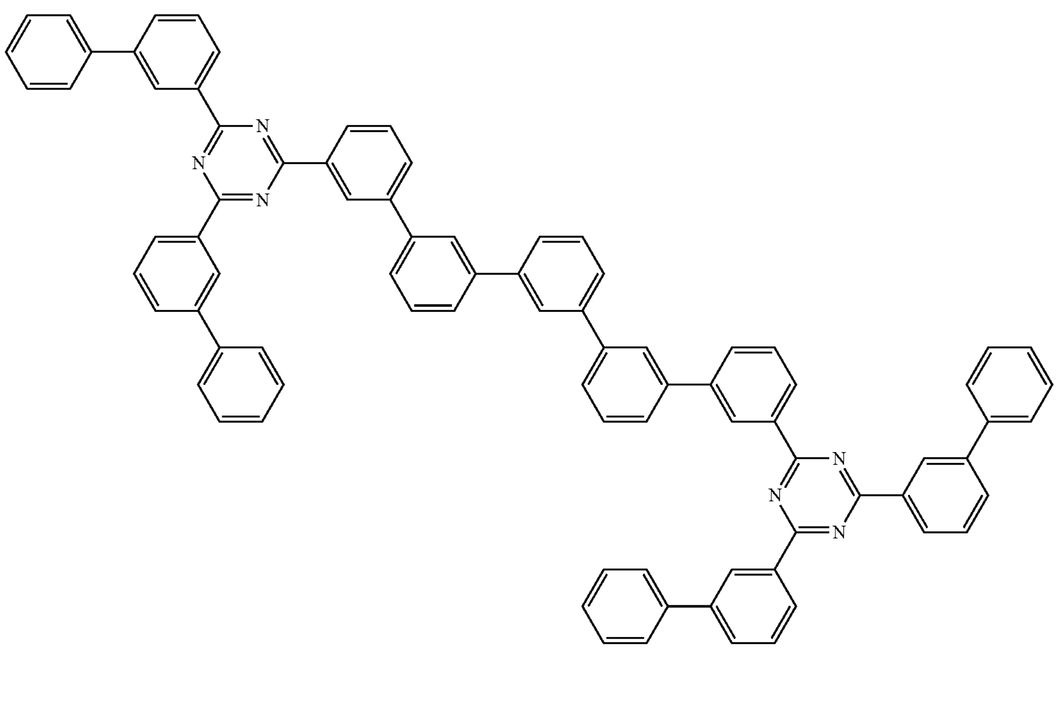

-continued
A(111)
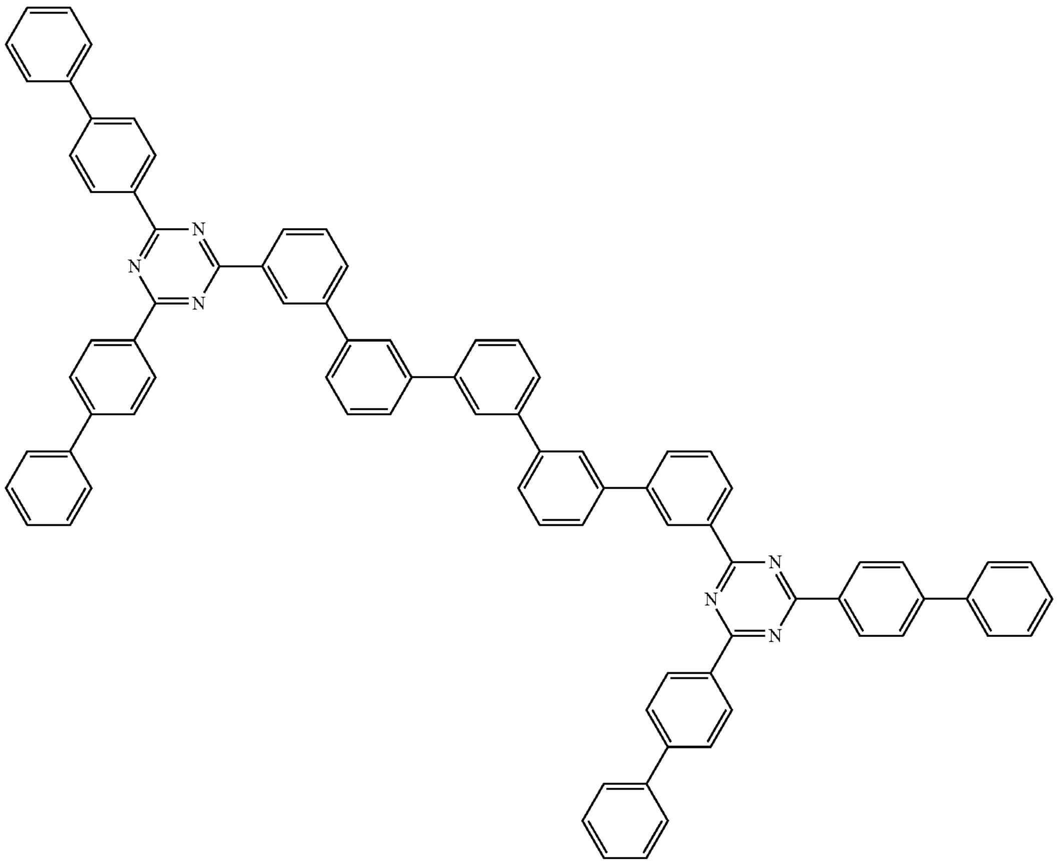
A(112)
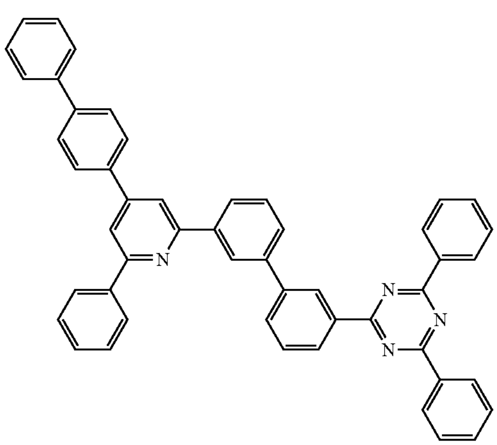
A(113)
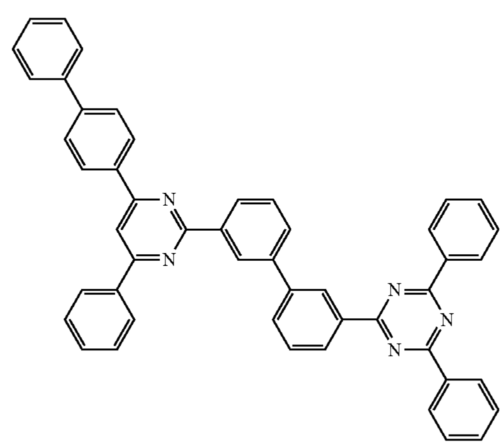

-continued
A(114)
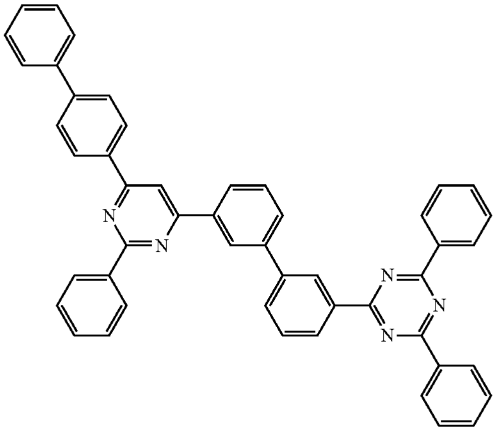
A(115)
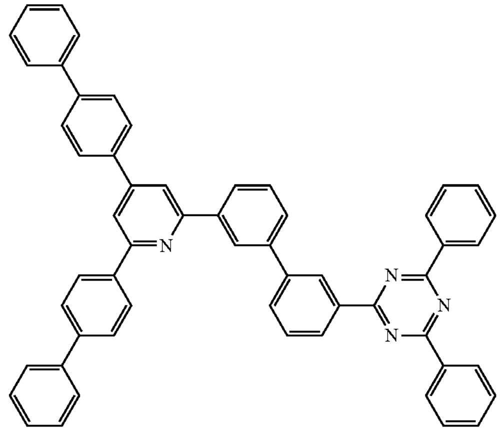
A(116)
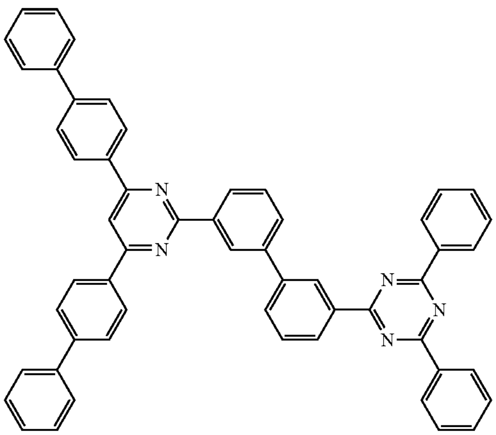
A(117)
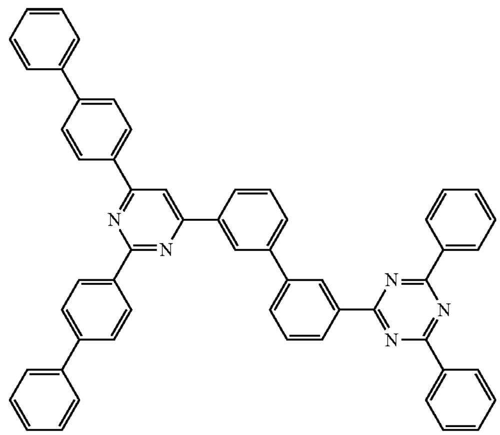
A(118)
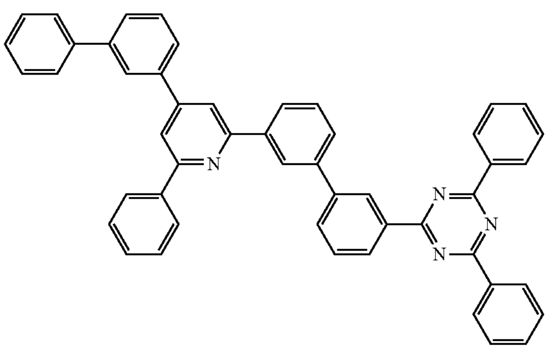
A(119)
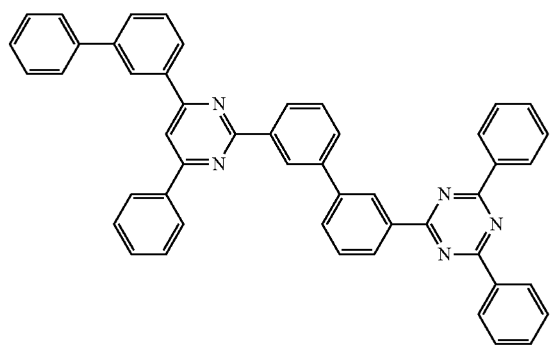
A(120)
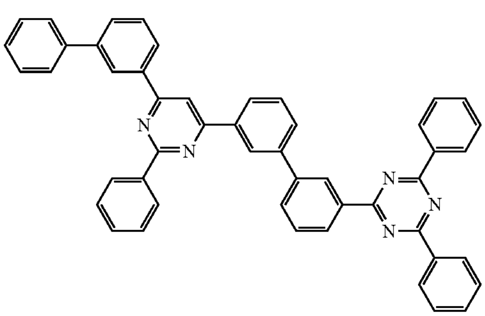
A(121)
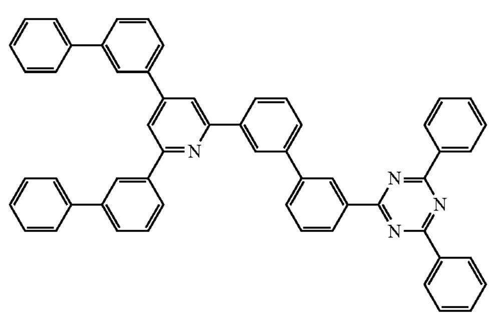

-continued
A(122)
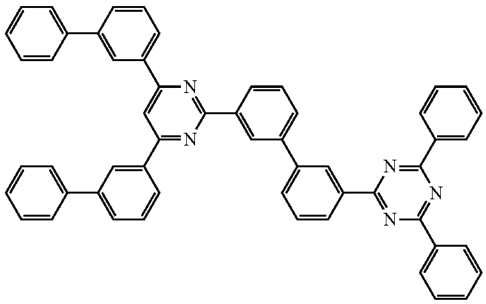
A(123)
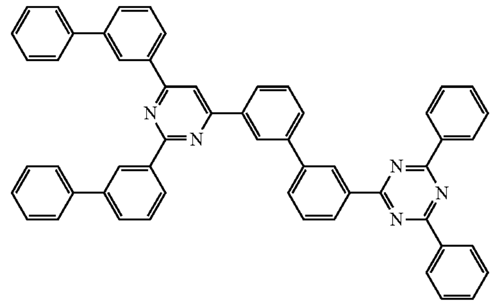
A(124)
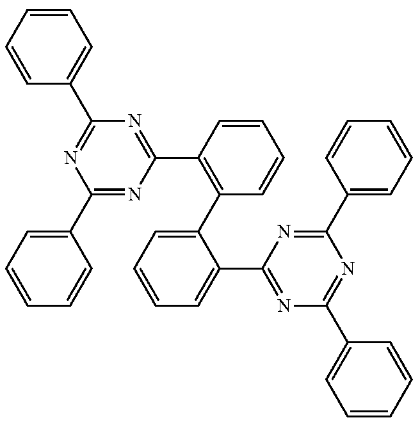
A(125)
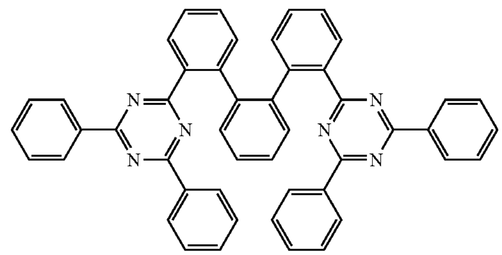
A(126)
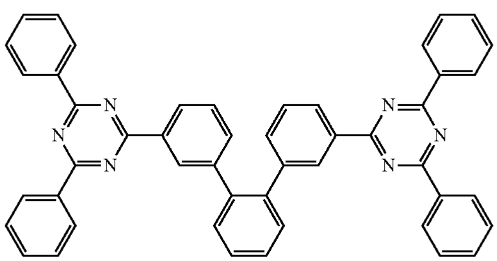
A(127)
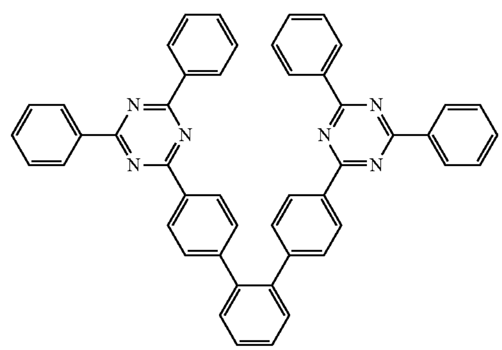
A(128)
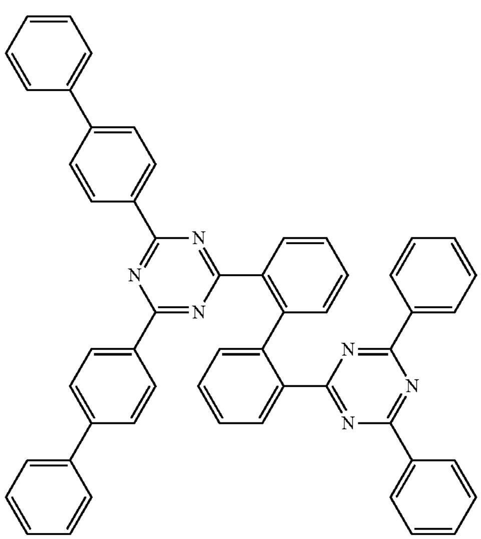

-continued
A(129)
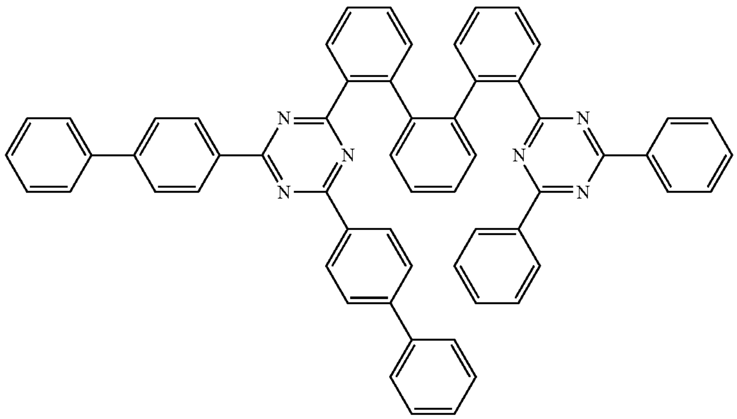
A(130)
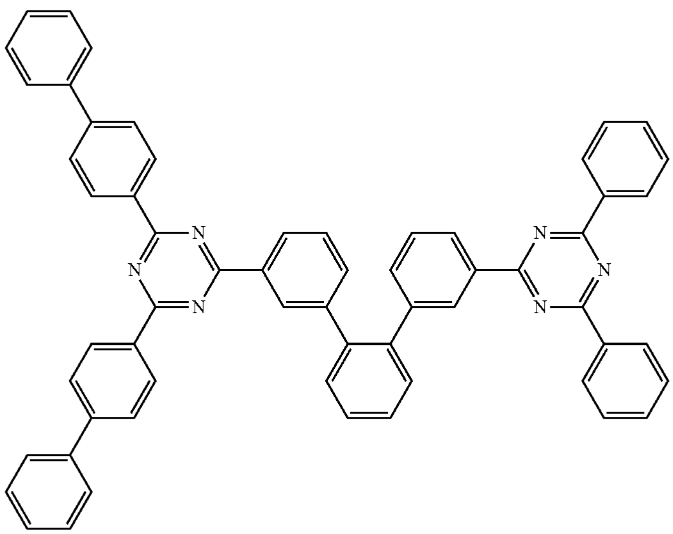
A(131)
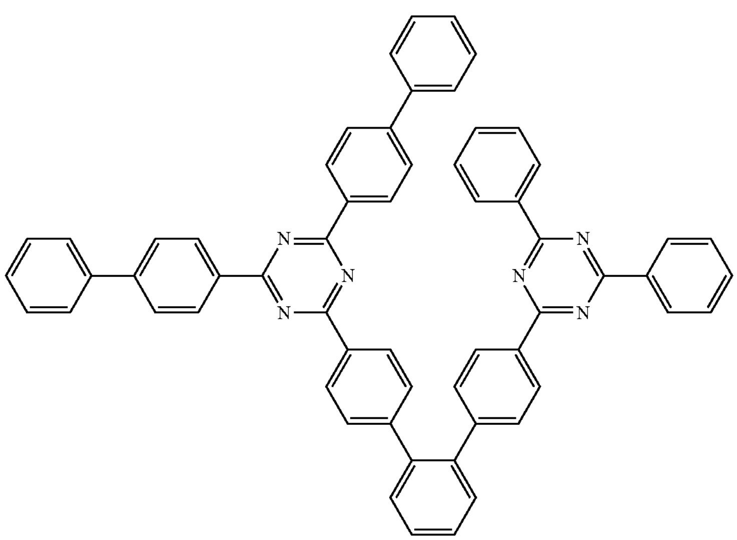

-continued
A(132)
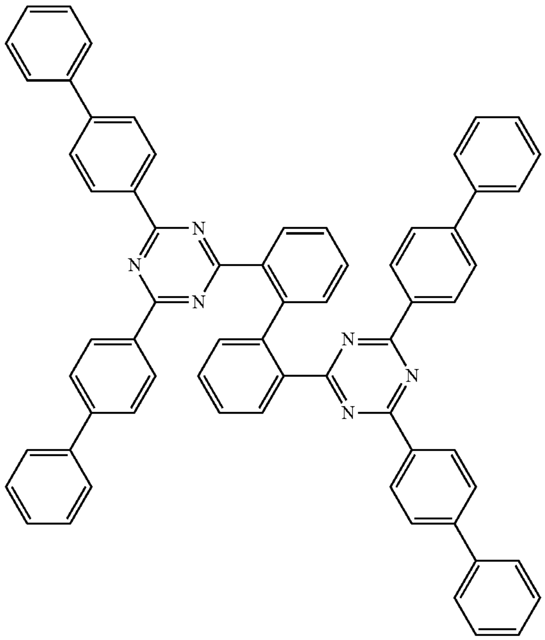
A(133)
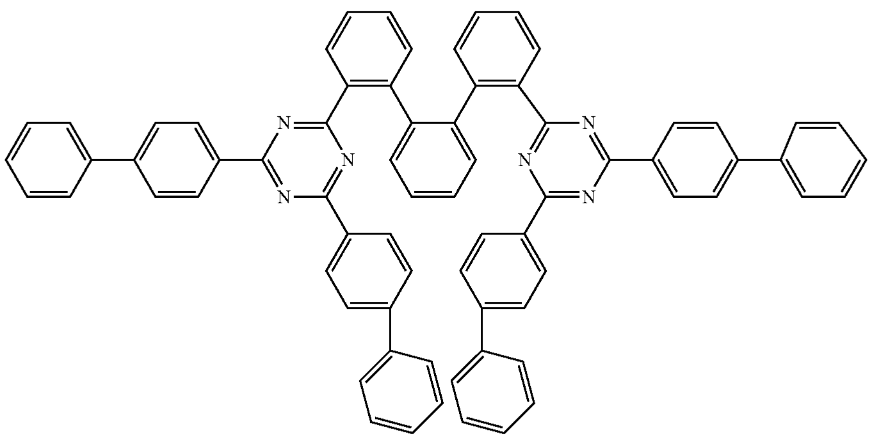
A(134)
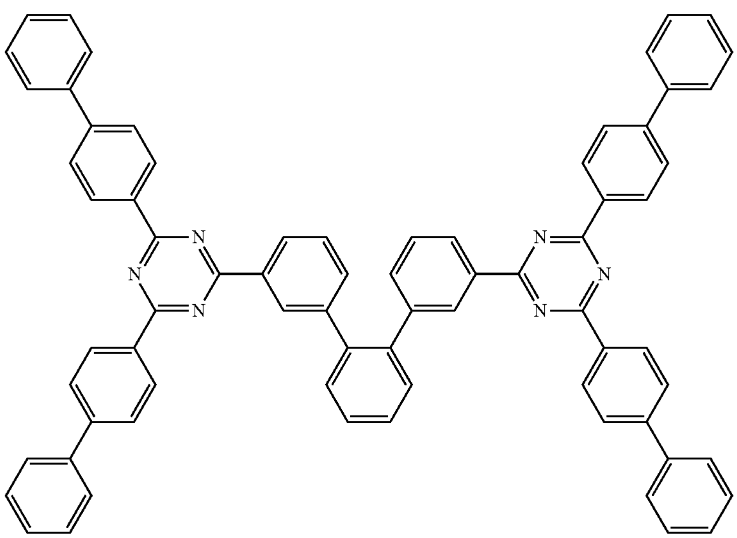

-continued
A(135)
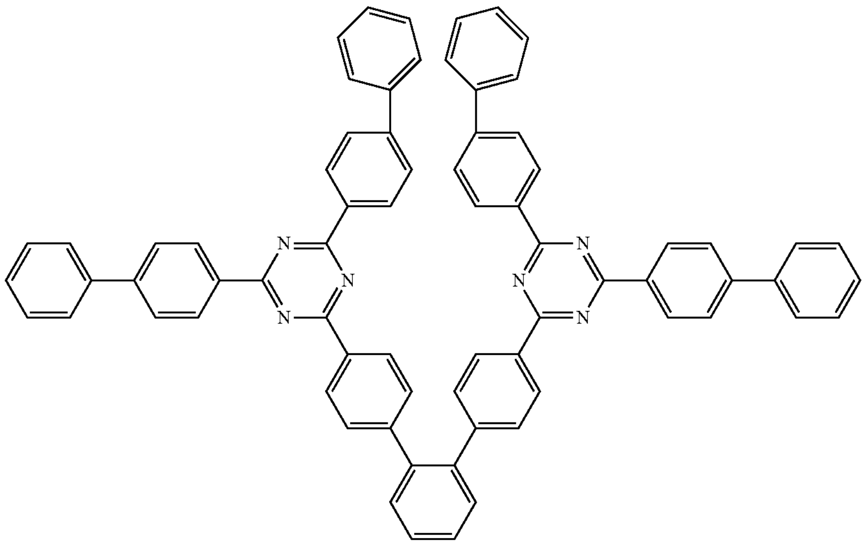
A(136)
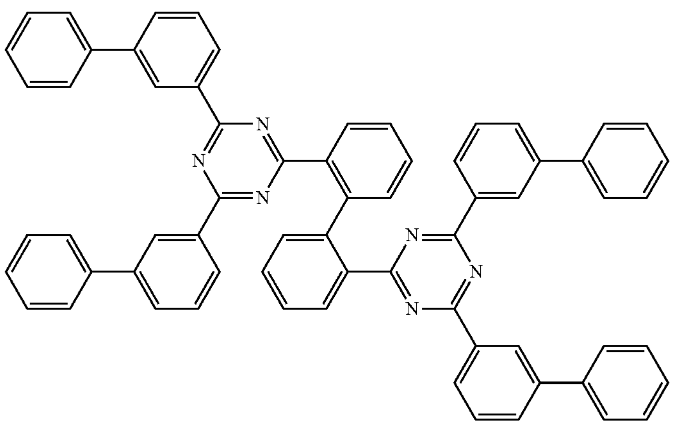
A(137)
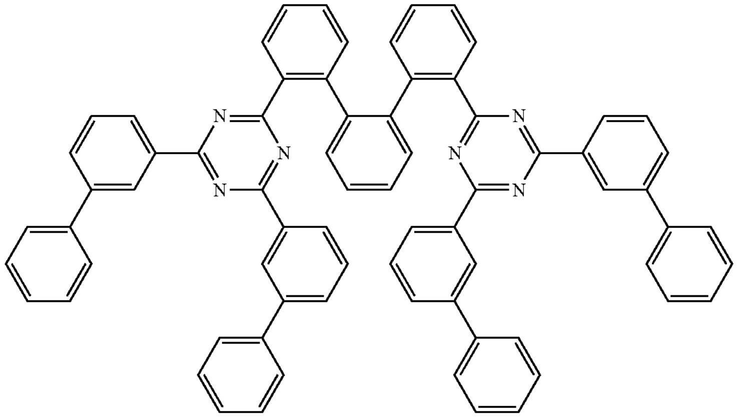

-continued
A(138)
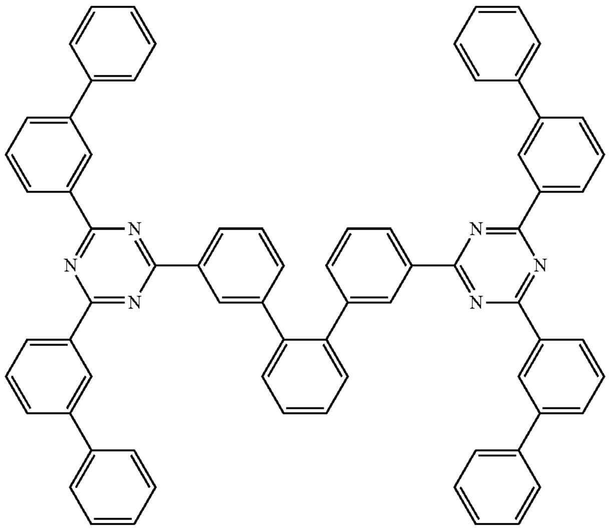
A(139)
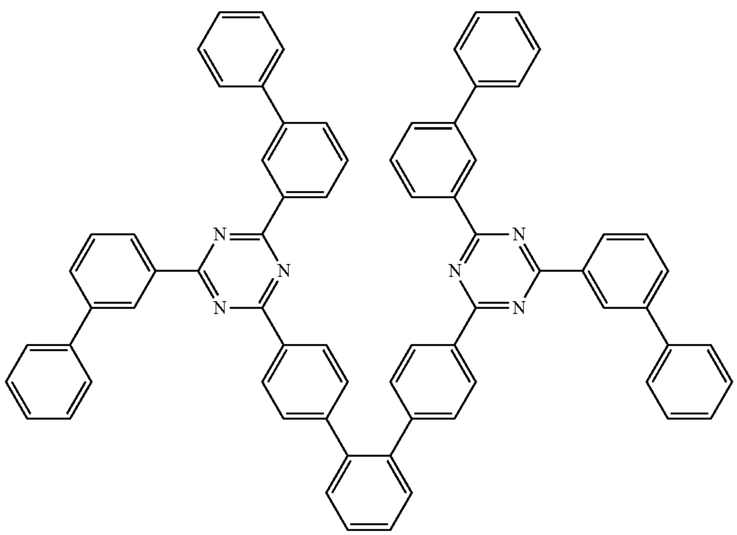
A(140)
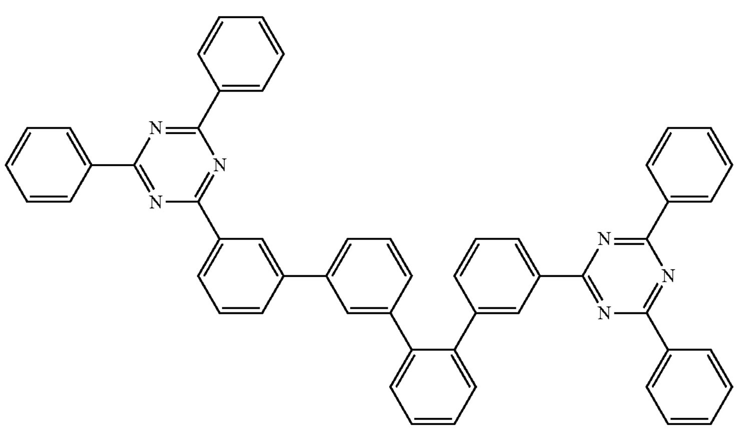

-continued
A(141)
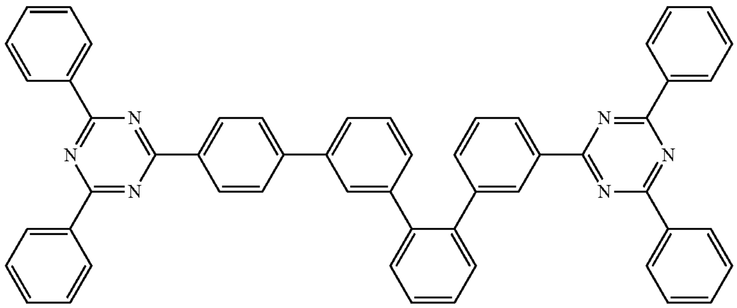
A(142)
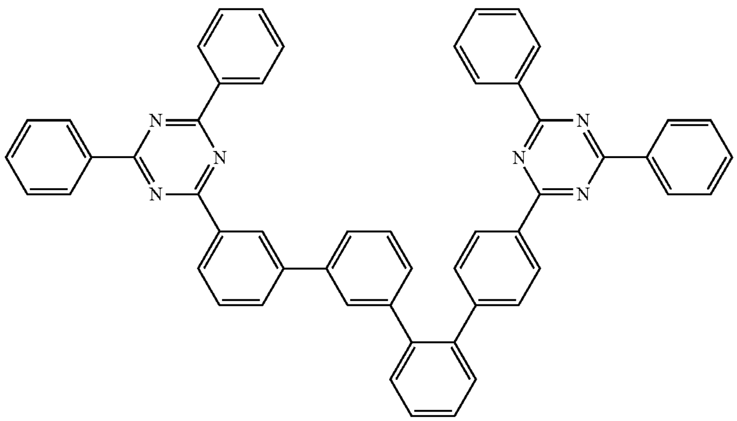
A(143)
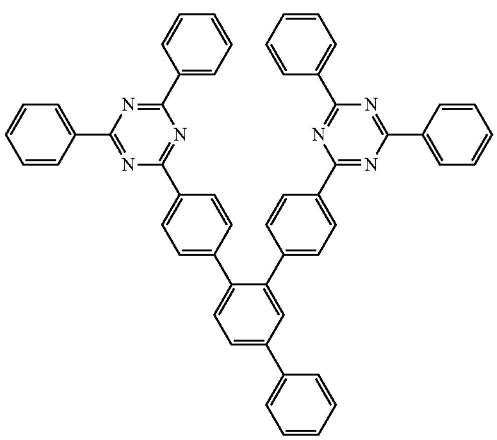
A(144)
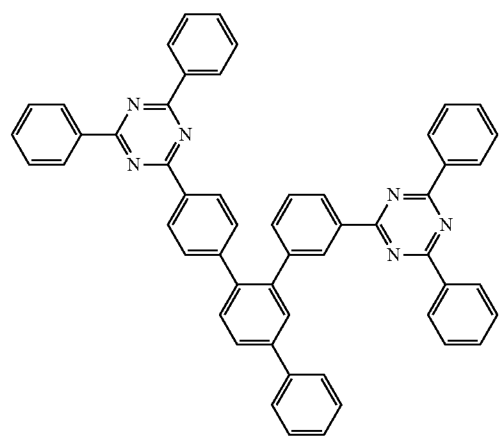
A(145)
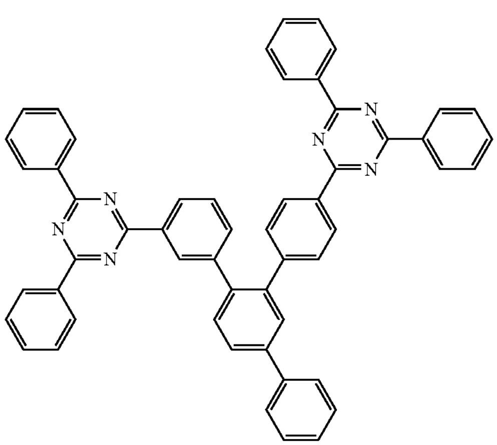
A(146)
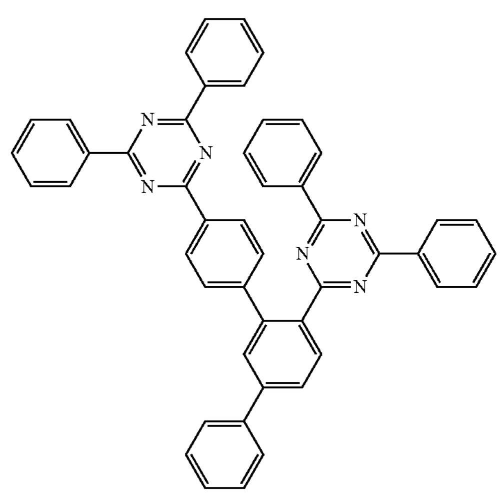

-continued
A(147)
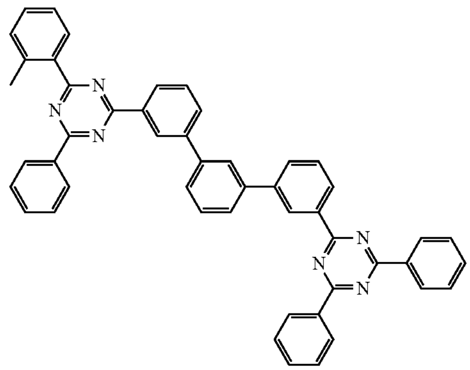
A(148)
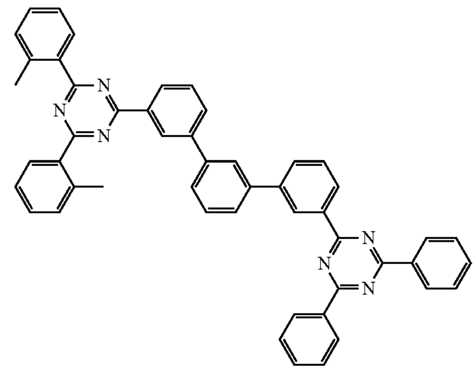
A(149)
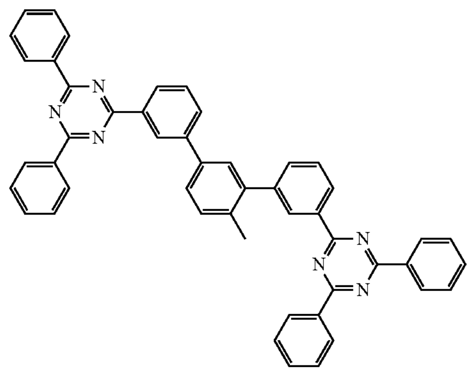
A(150)
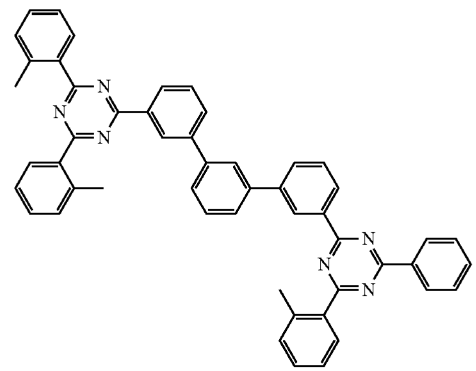
A(151)
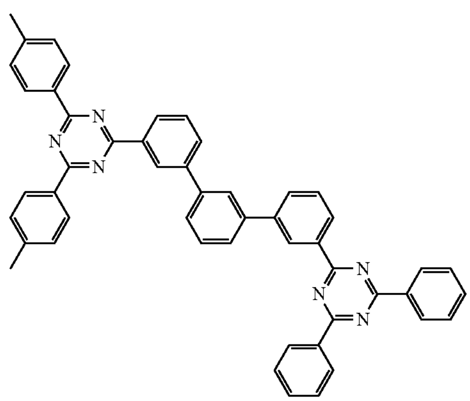
A(152)
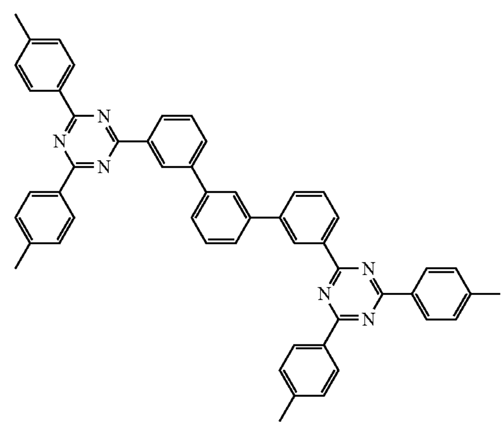
A(153)
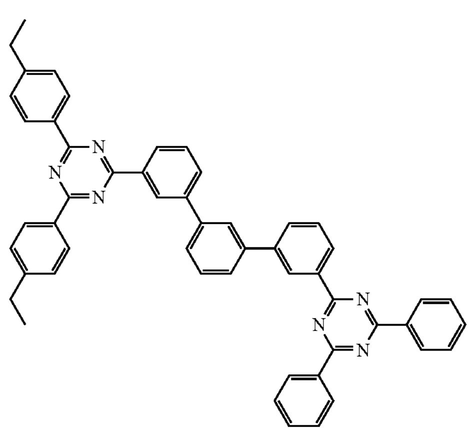
A(153)
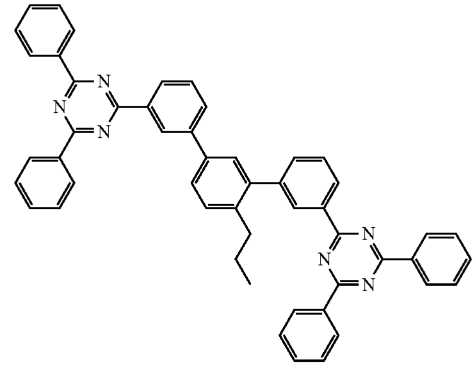

-continued
<Group HE2>
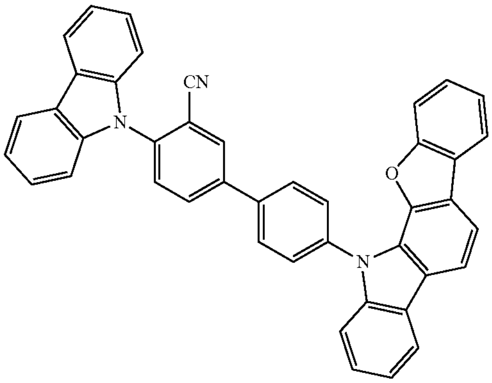
1
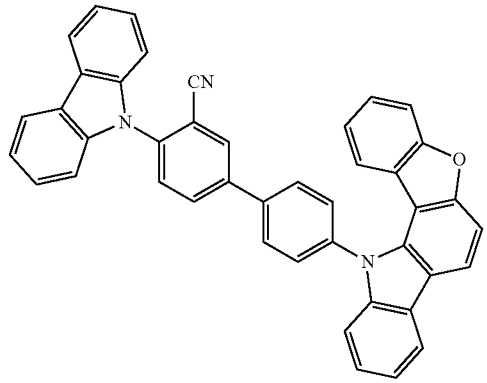
2
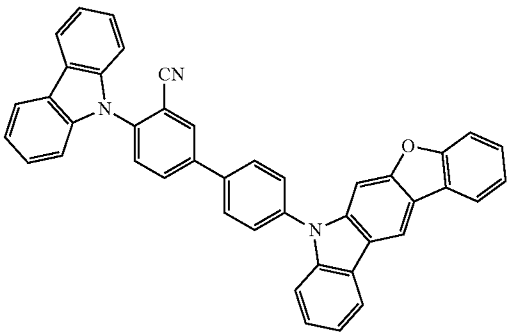
3
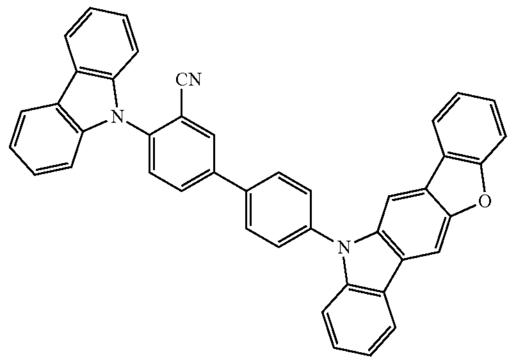
4
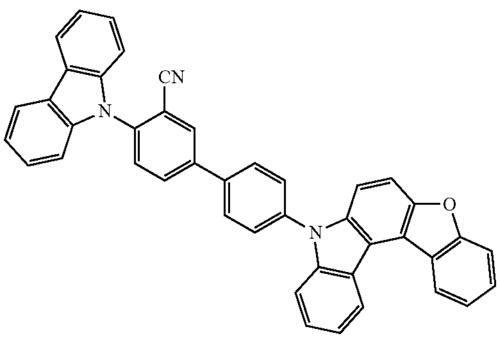
5
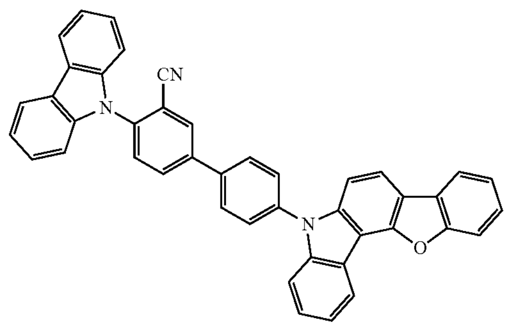
6
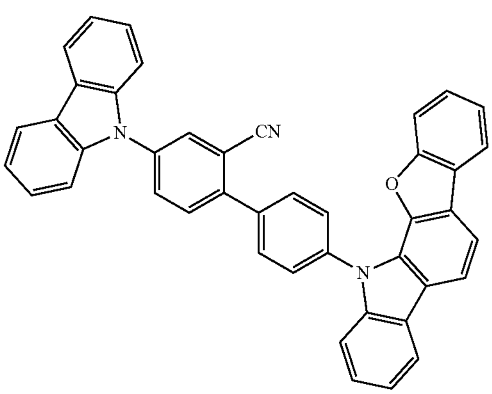
7
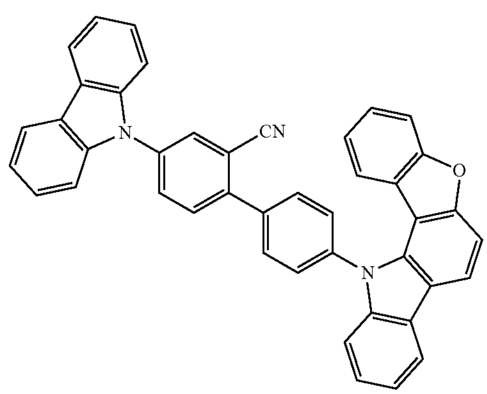
8

-continued
9
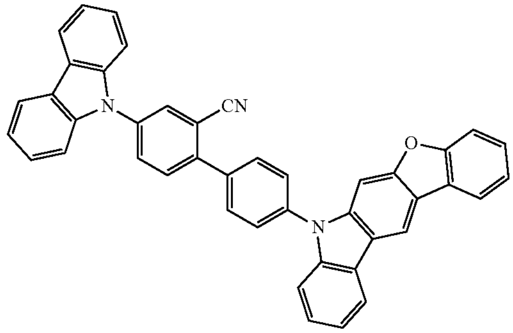
10
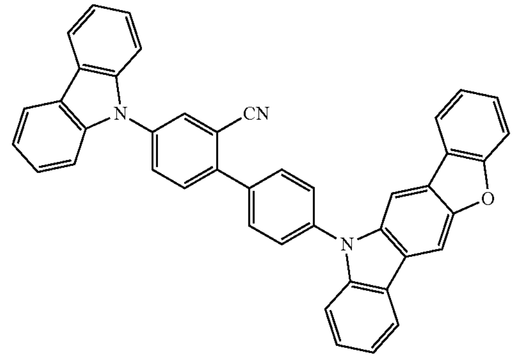
11
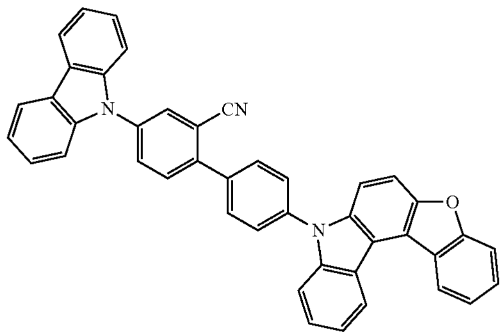
12
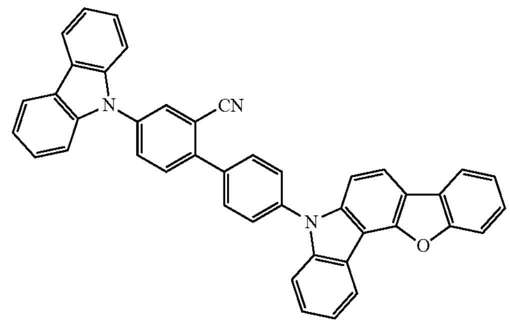
13
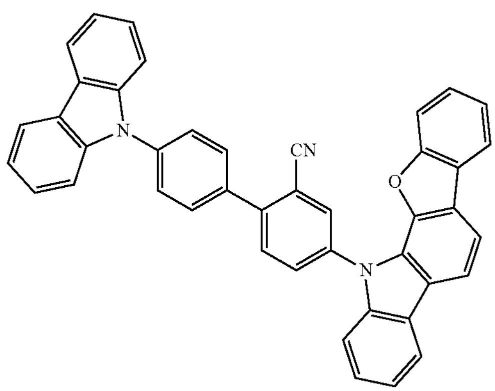
14
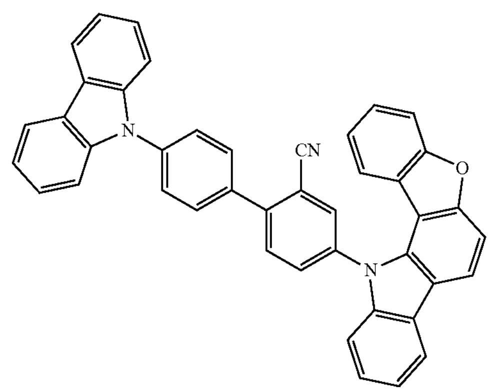
15
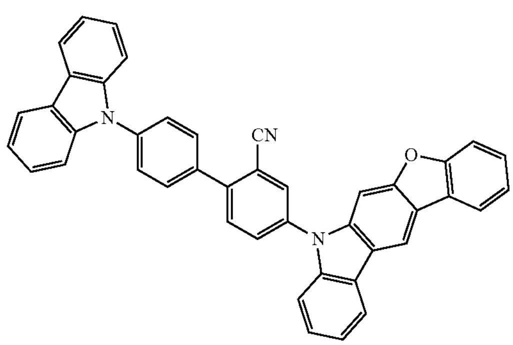
16
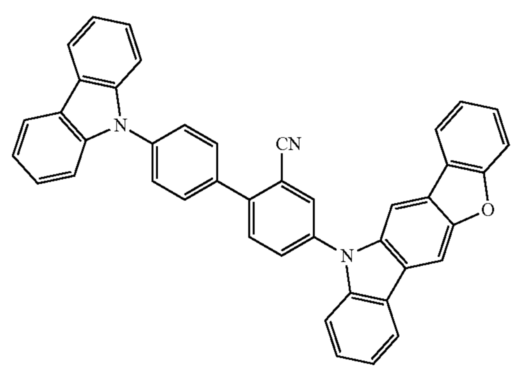

-continued
17
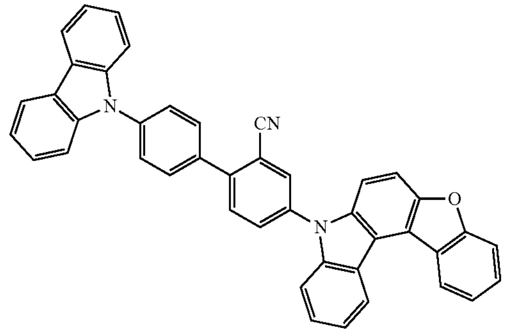
18
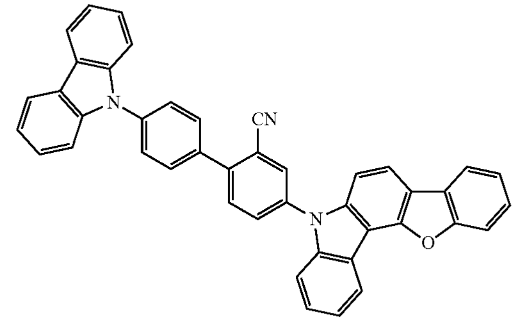
19
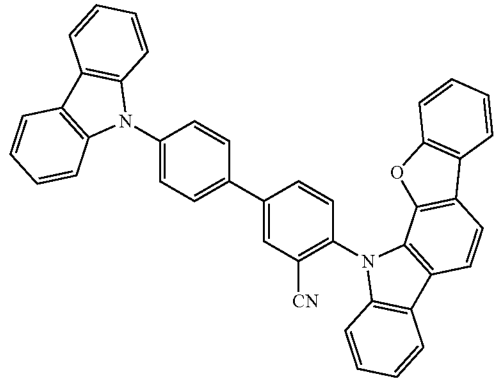
20
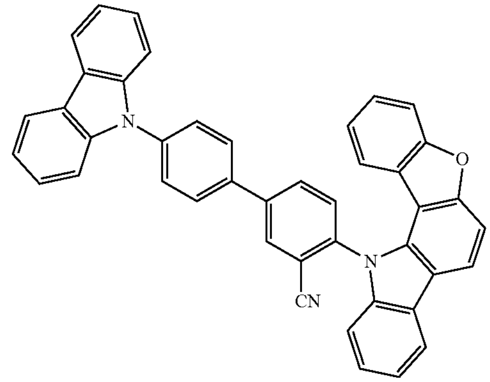
21
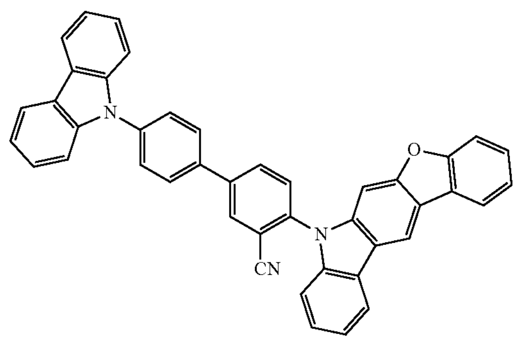
22
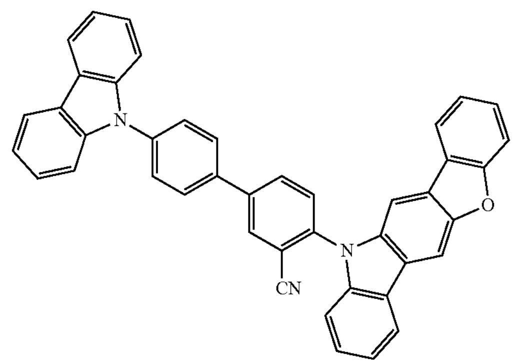
23
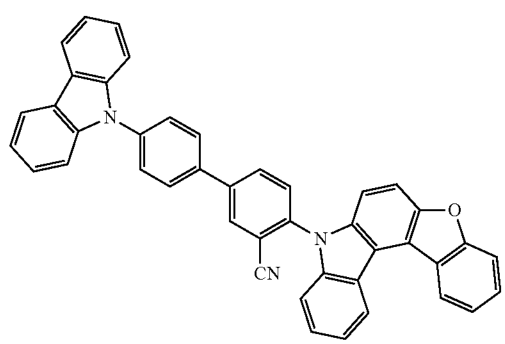
24
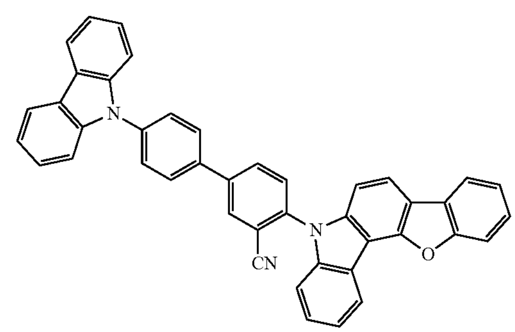

-continued
25
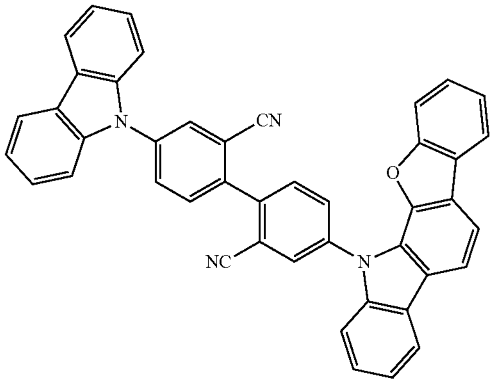
26
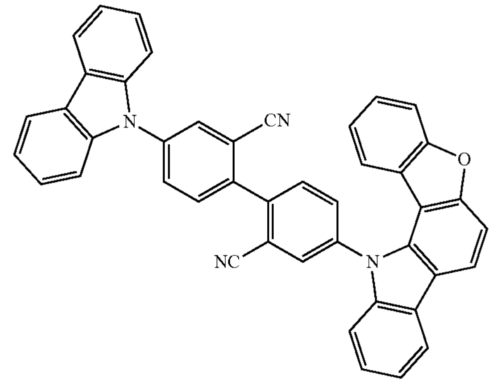
27
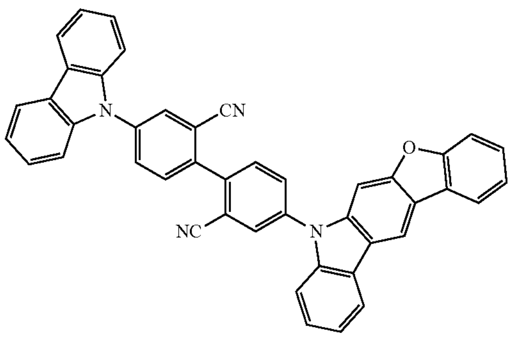
28
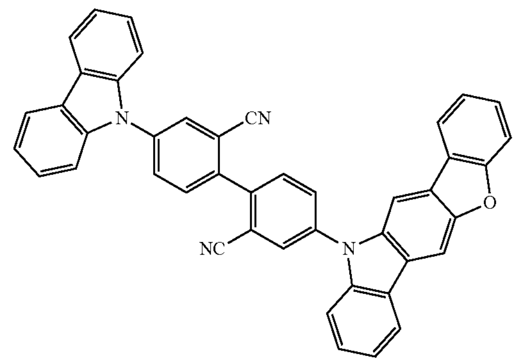
29
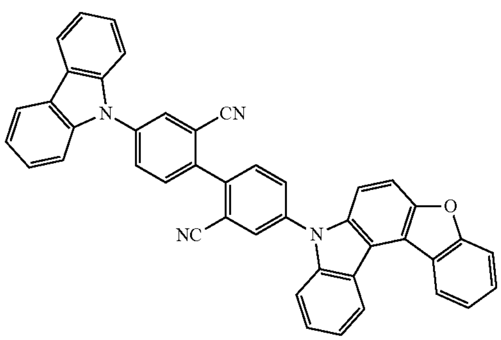
30
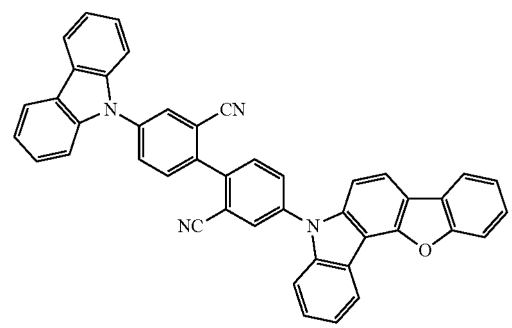
31
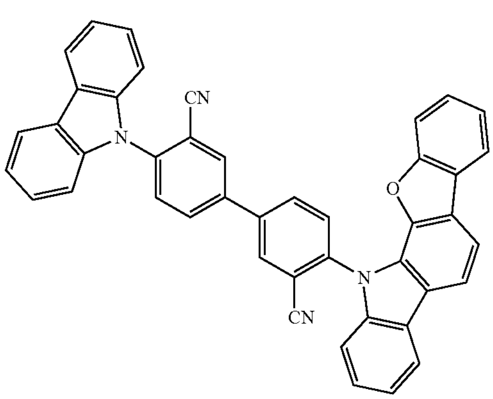
32
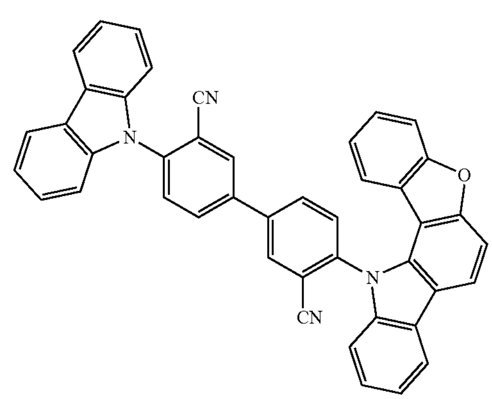

-continued
33
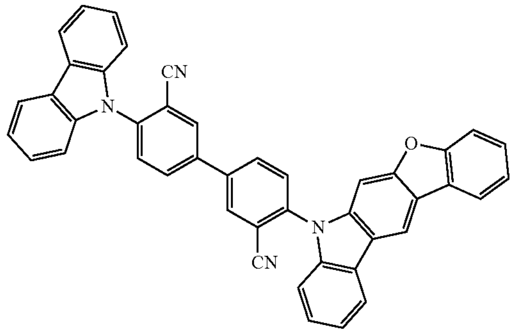
34
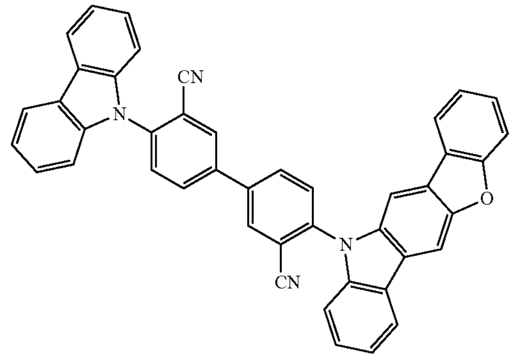
35
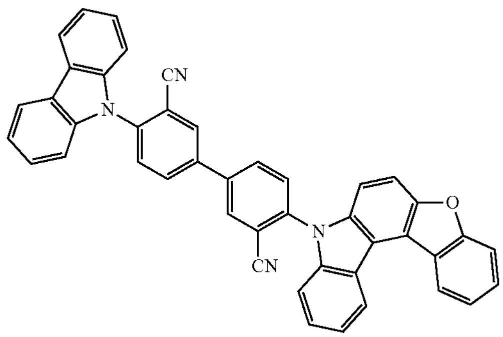
36
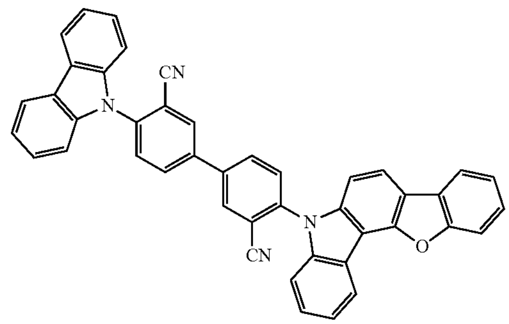
37
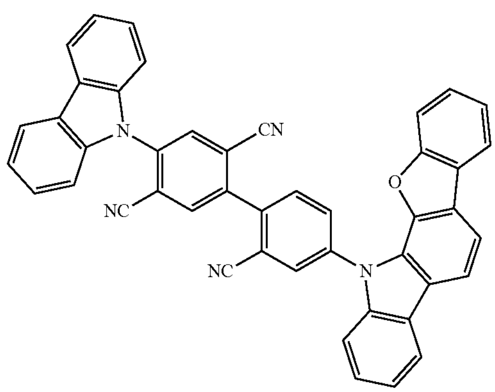
38
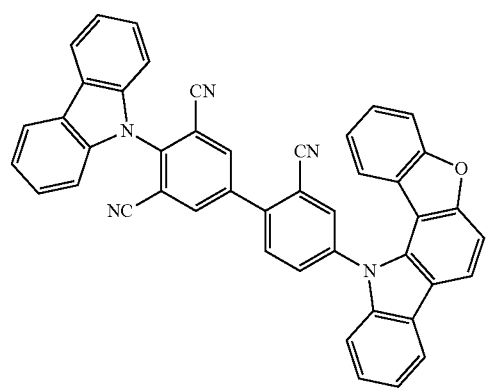
39
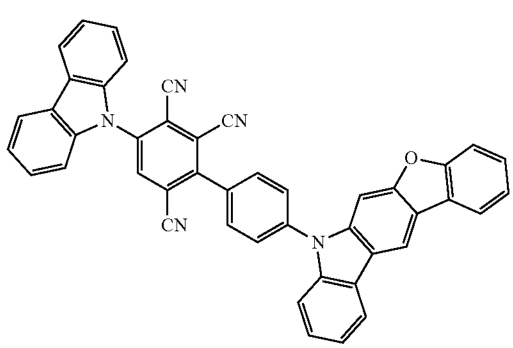
40
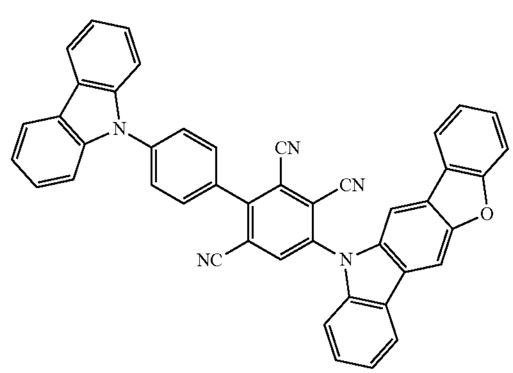

-continued
41
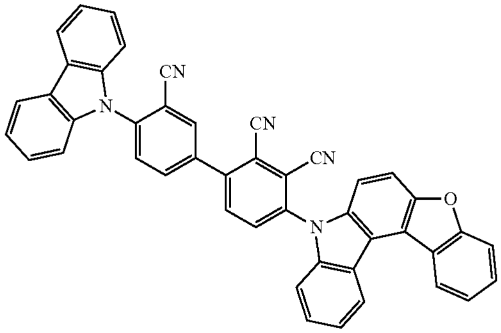
42
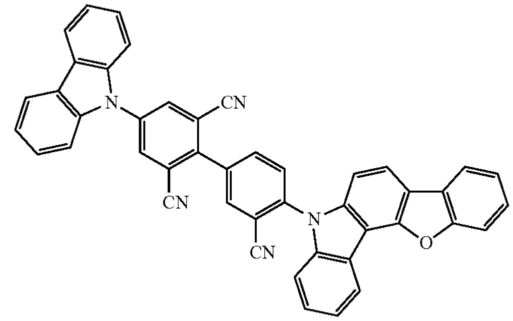
43
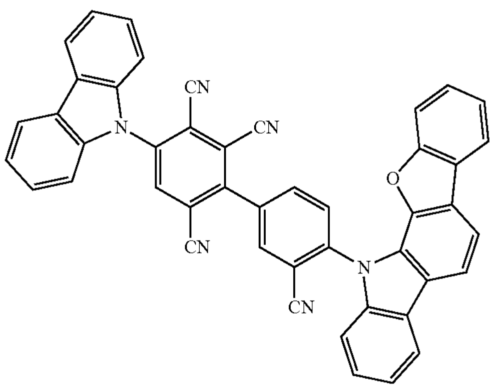
44
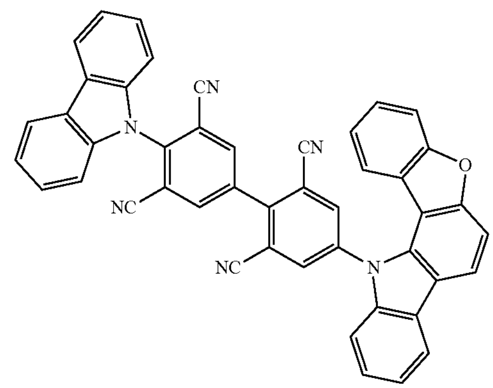
45
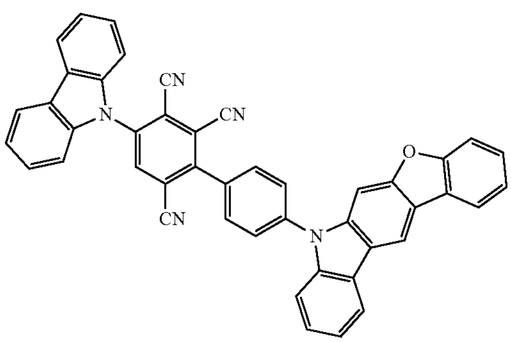
46
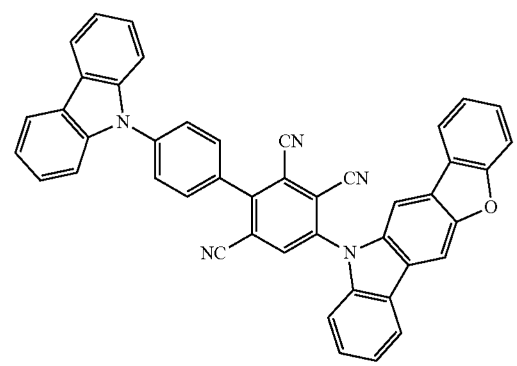
47
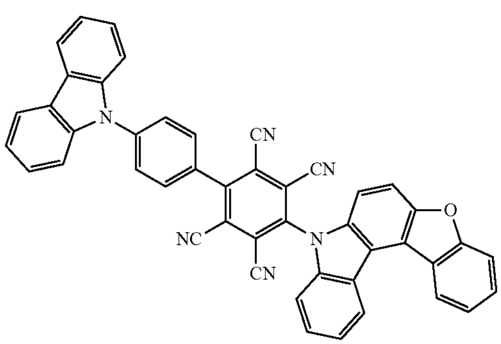
48
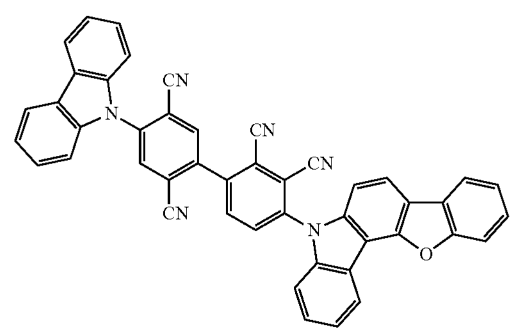

-continued
49
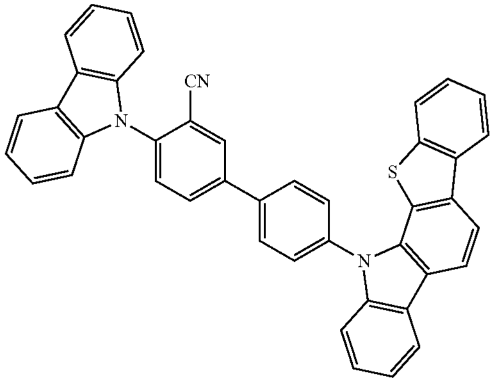
50
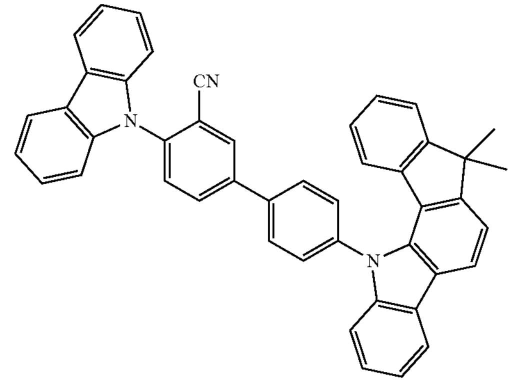
51
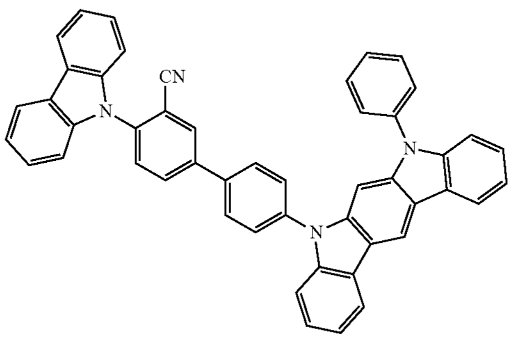
52
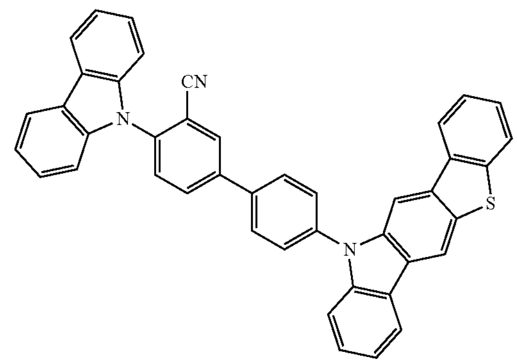
53
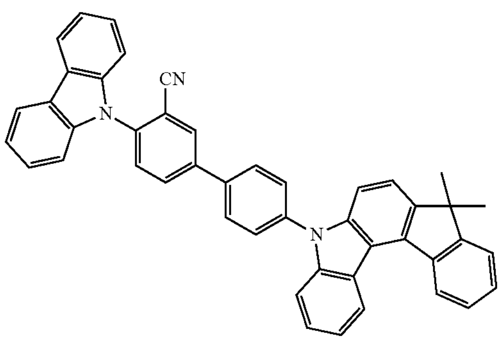
54
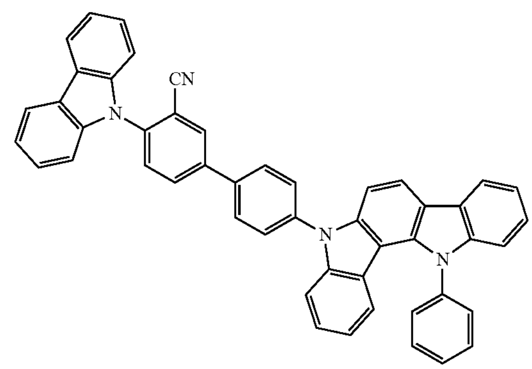
55
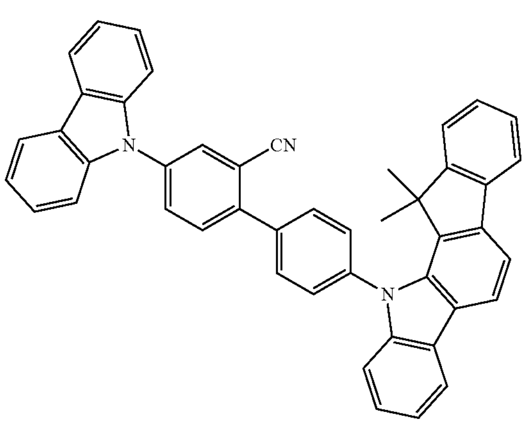
56
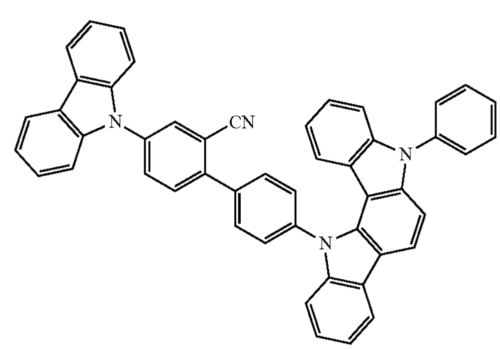

-continued
57
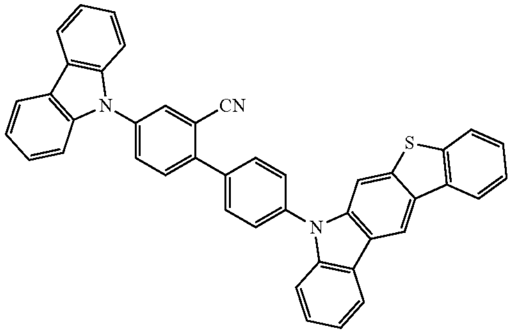
58
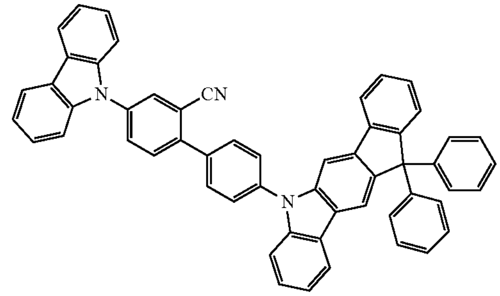
59
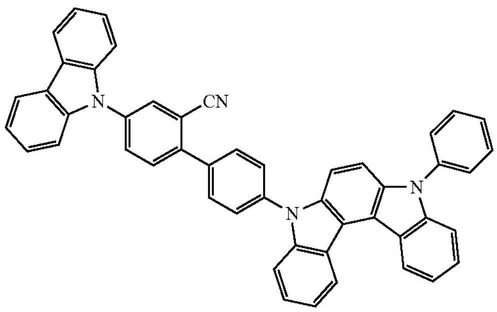
60
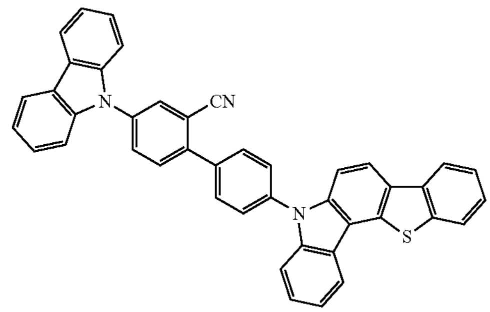
61
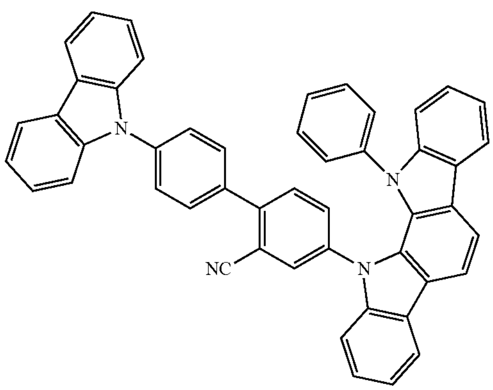
62
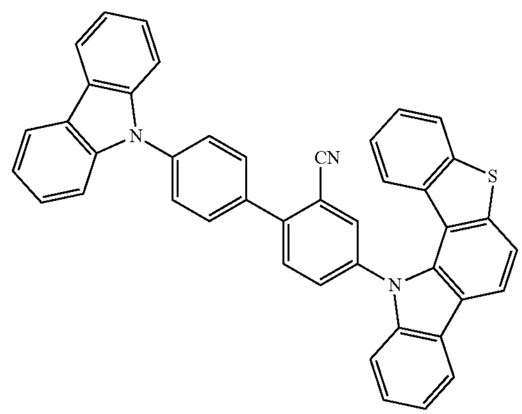
63
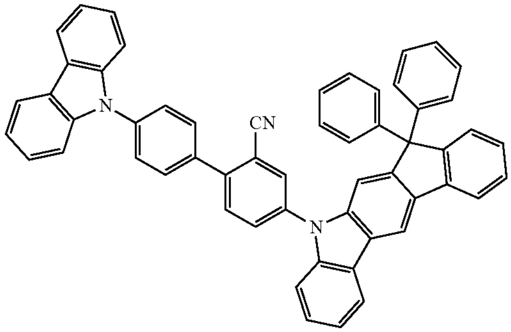
64
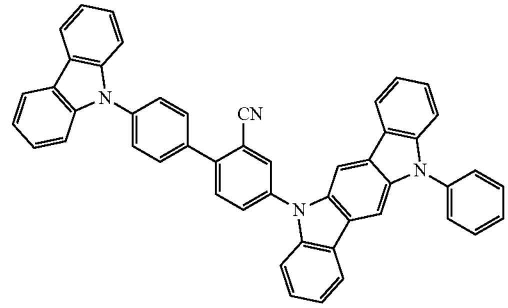

-continued
65
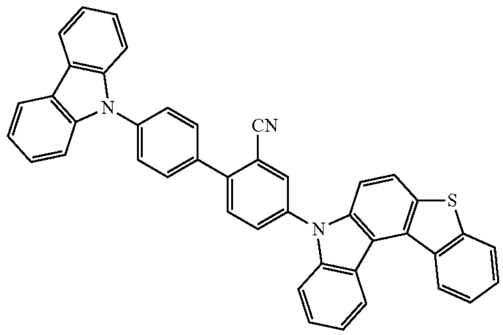
66
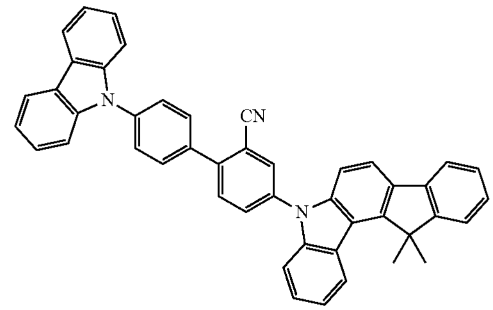
67
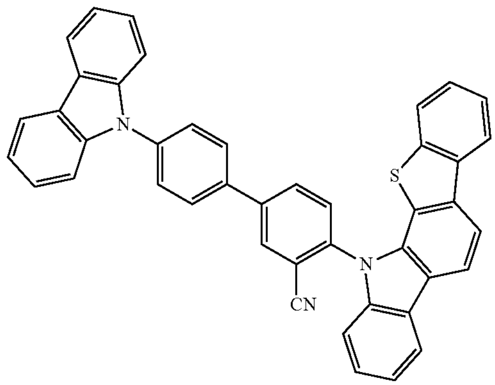
68
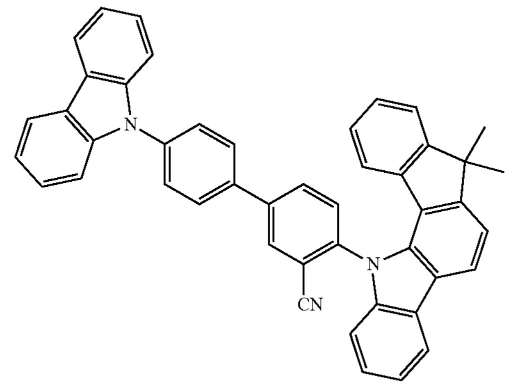
69
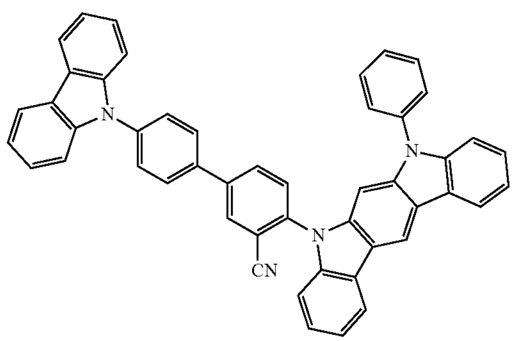
70
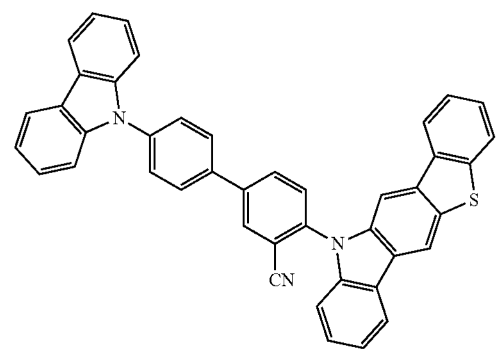
71
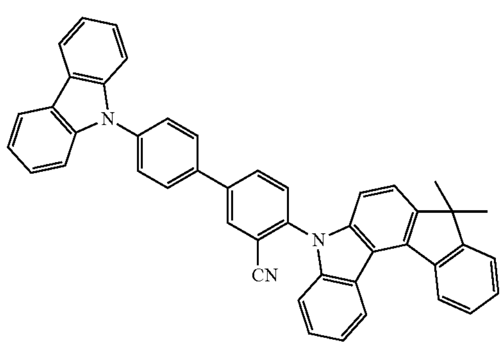
72
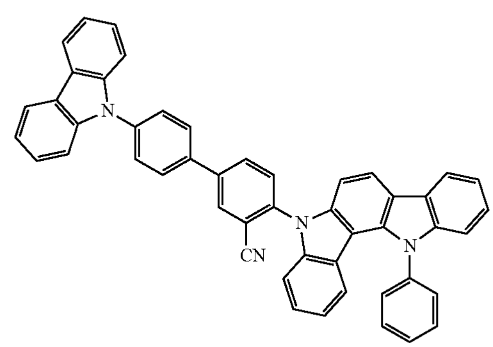

-continued
73
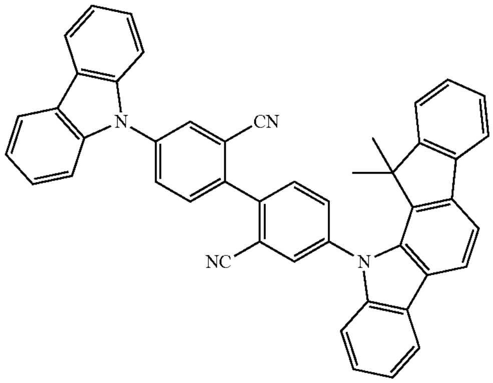
74
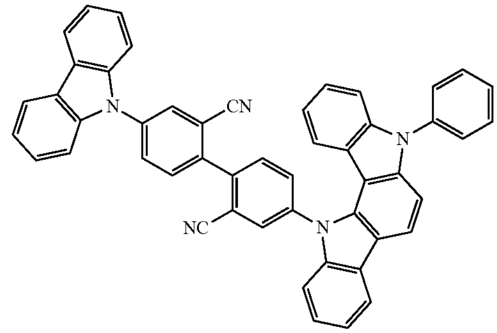
75
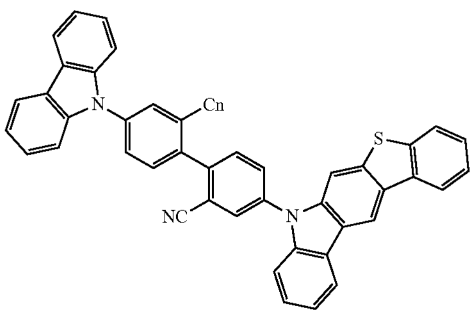
76
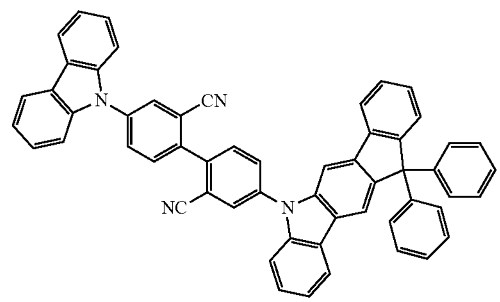
77
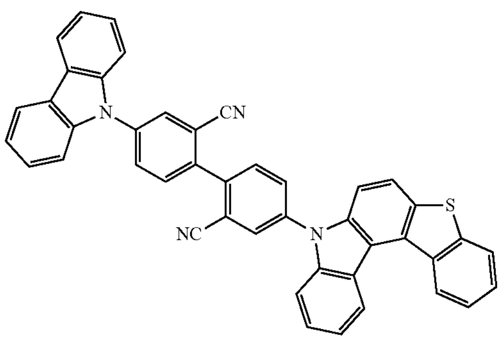
78
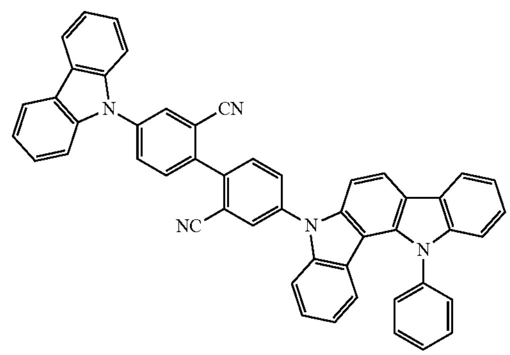
79
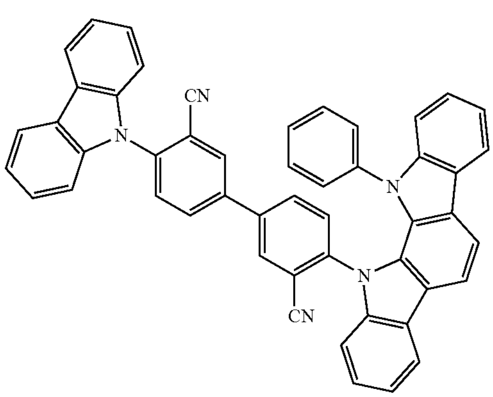
80
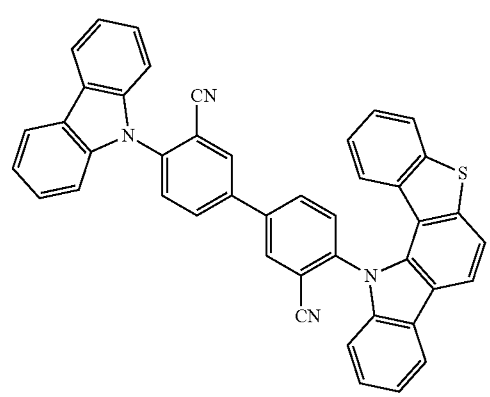

-continued
81
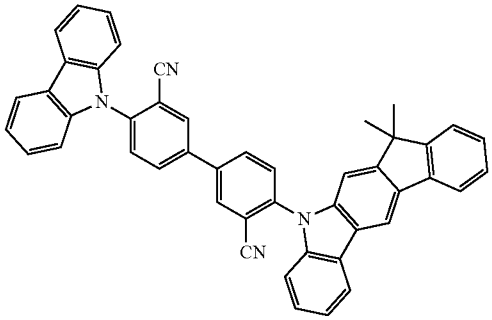
82
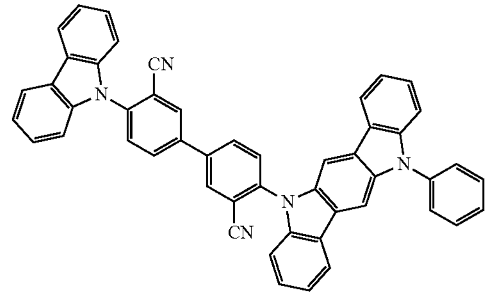
83
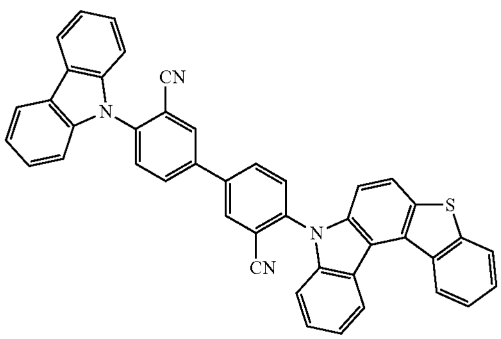
84
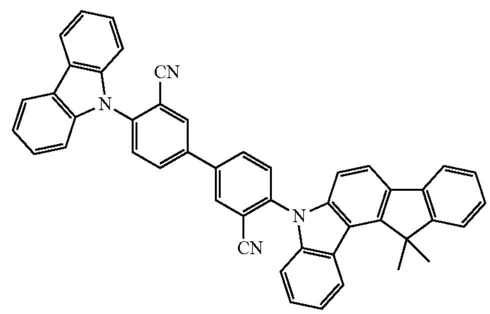
85
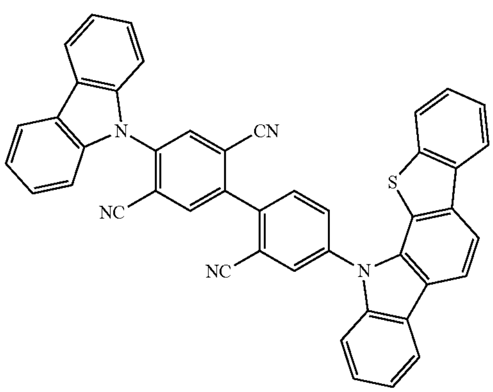
86
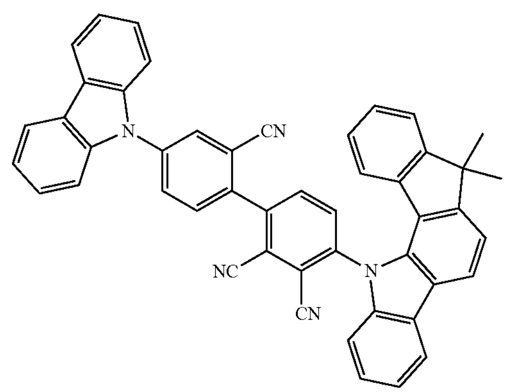
87
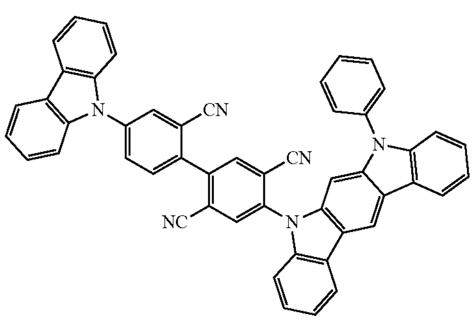
88
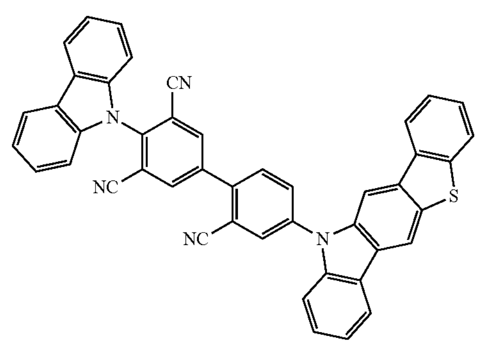

-continued
89
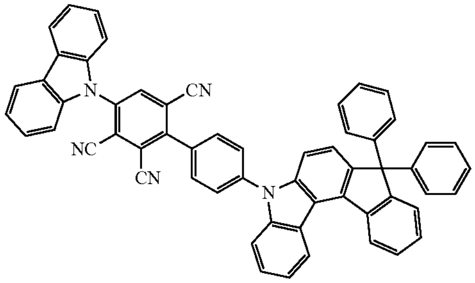
90
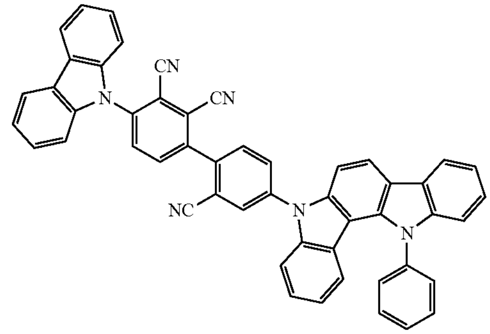
91
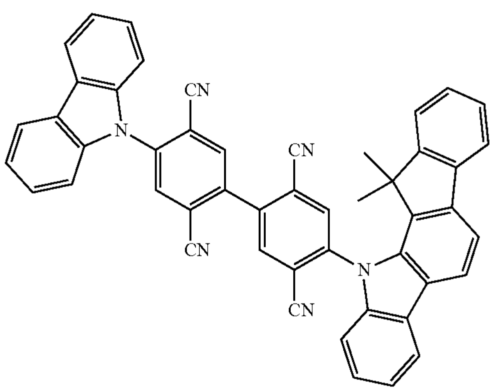
92
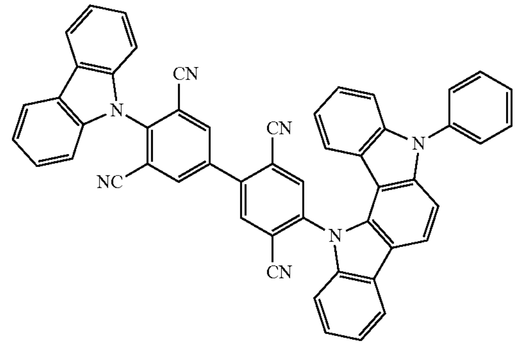
93
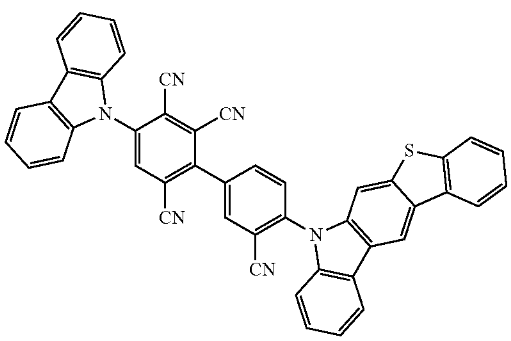
94
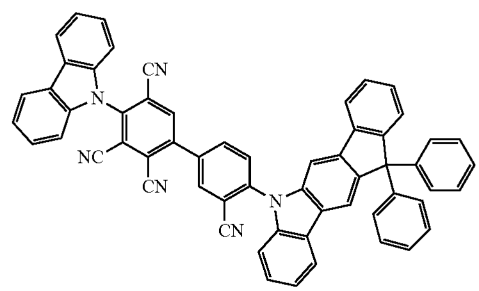
95
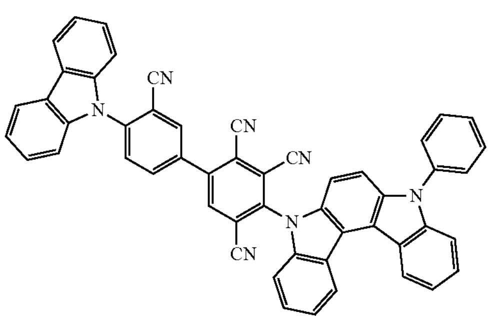
96
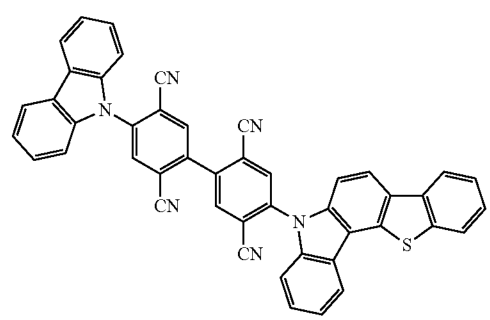

-continued
97
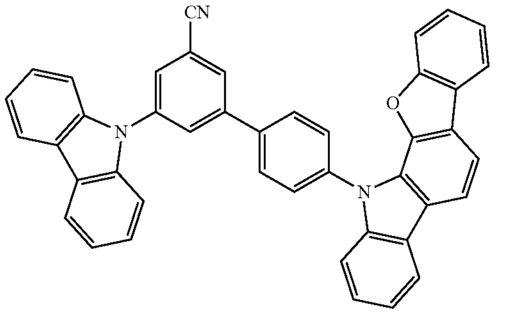
98
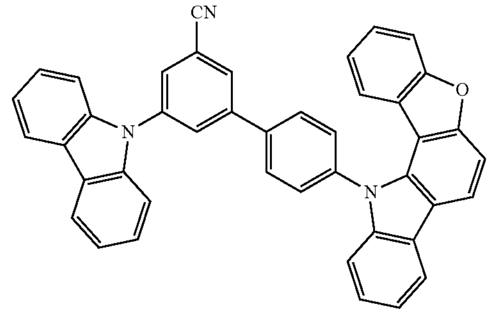
99
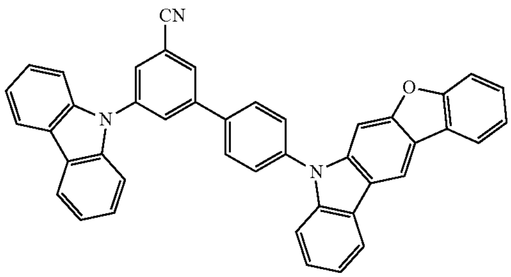
100
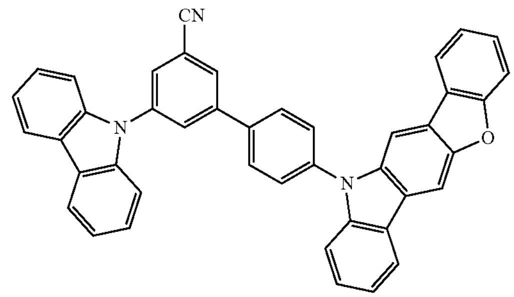
101
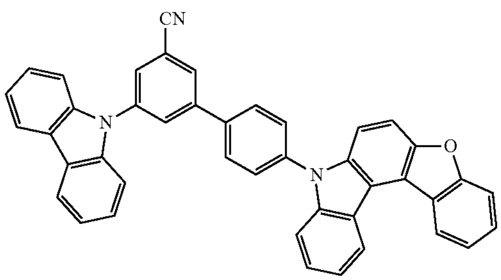
102
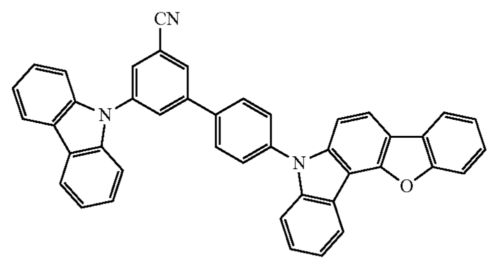
103
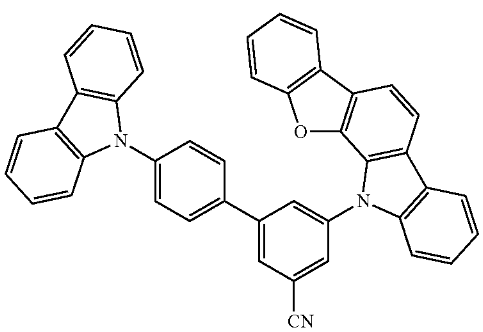
104
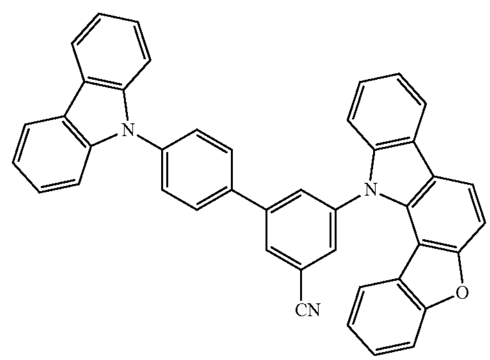
105
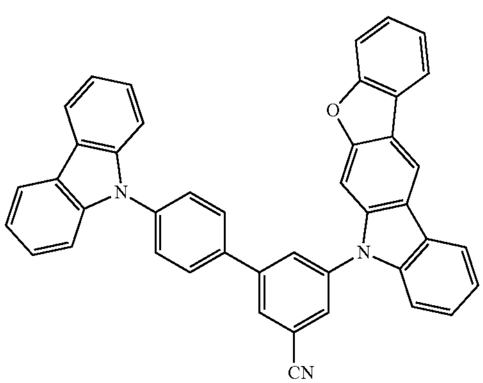
106
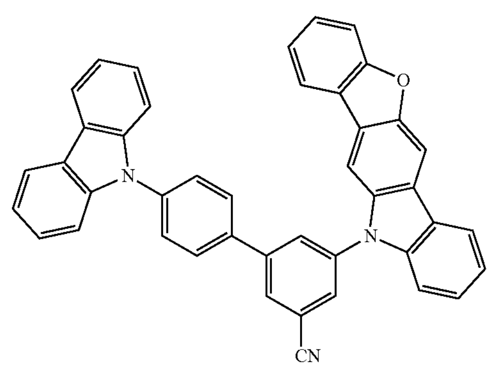

-continued
107
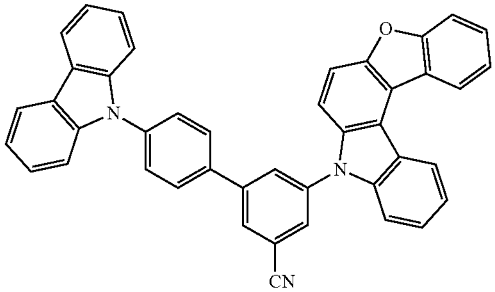
108
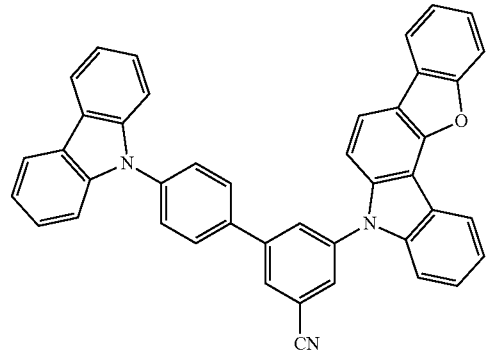
109
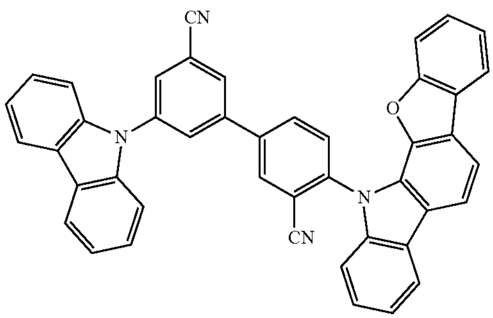
110
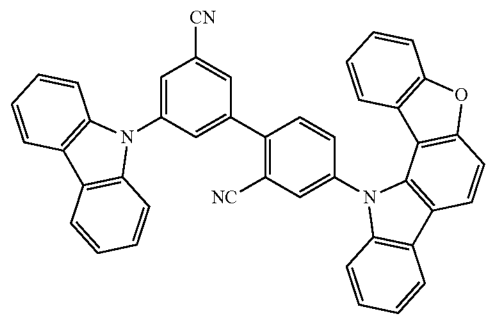
111
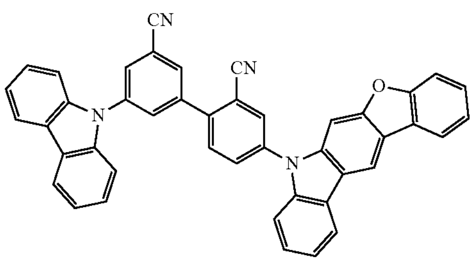
112
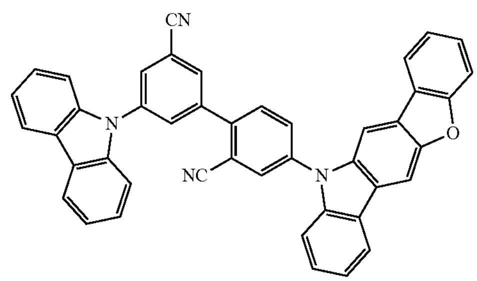
113
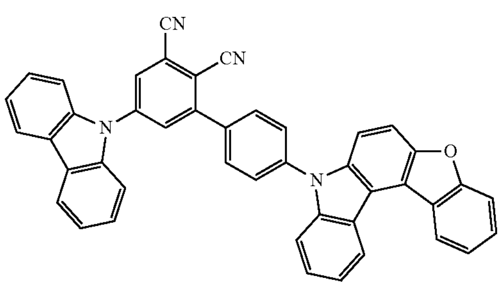
114
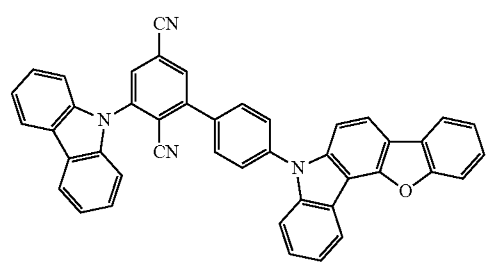
115
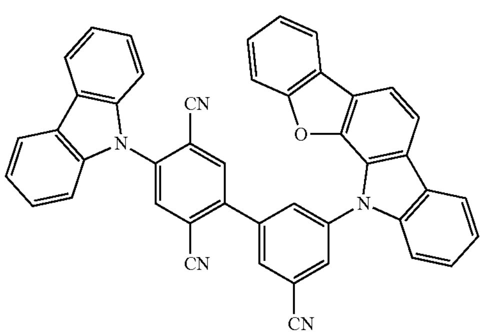
116
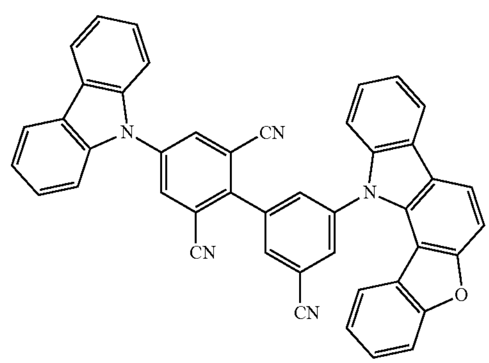

-continued
117
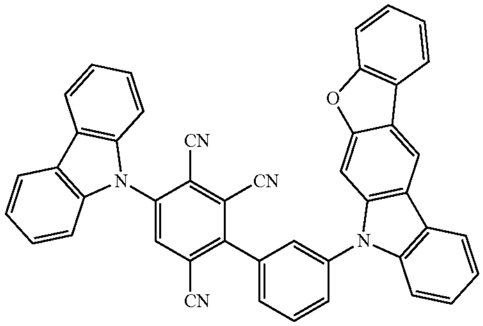
118
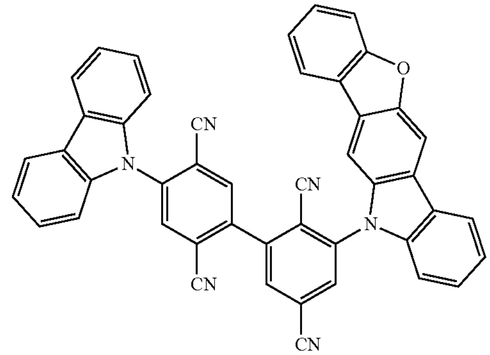
119
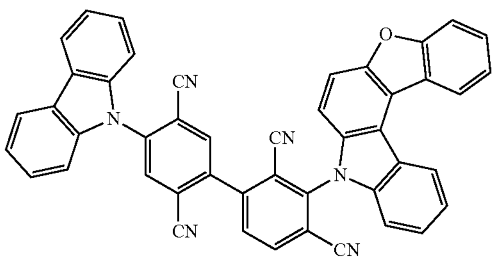
120
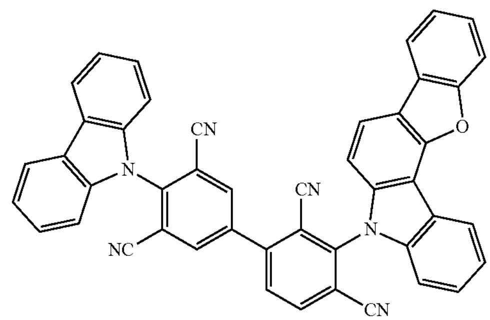
121
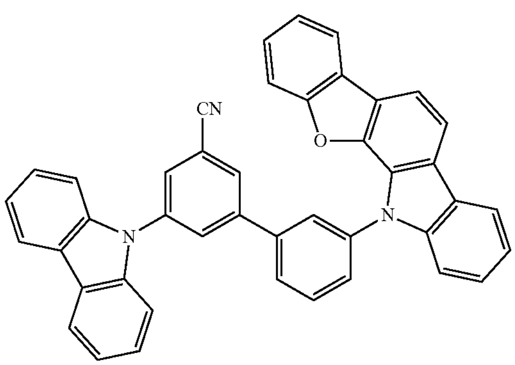
122
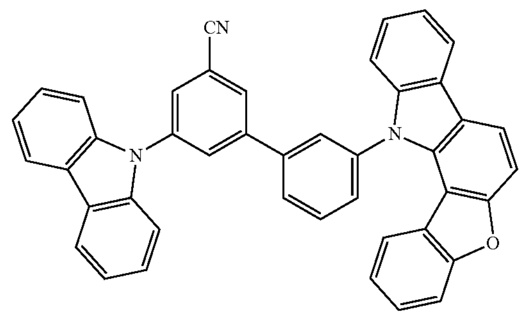
123
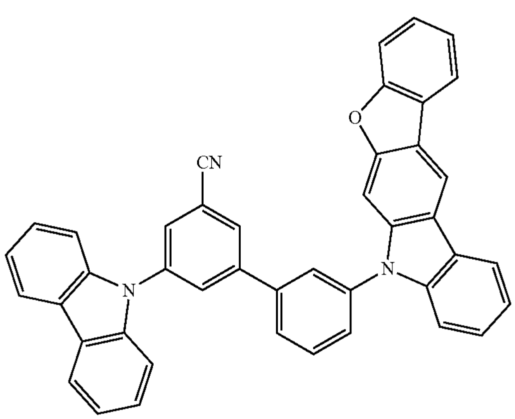
124
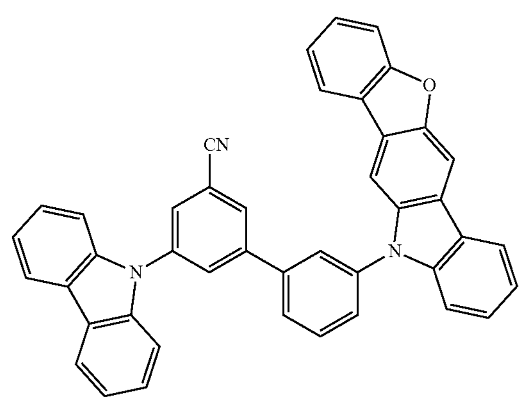

-continued
125
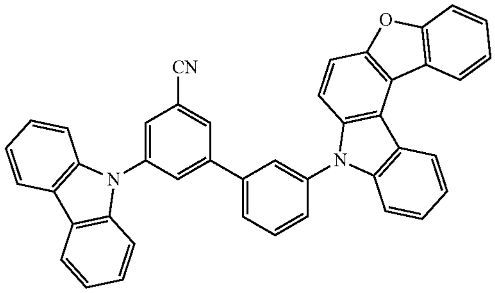
126
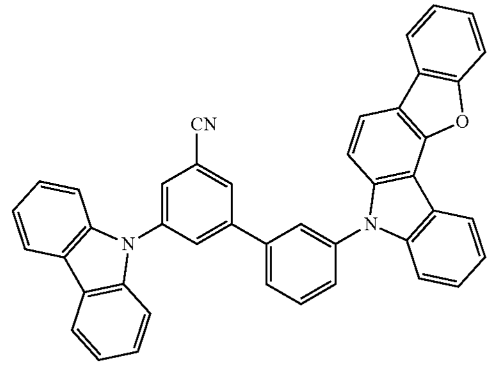
127
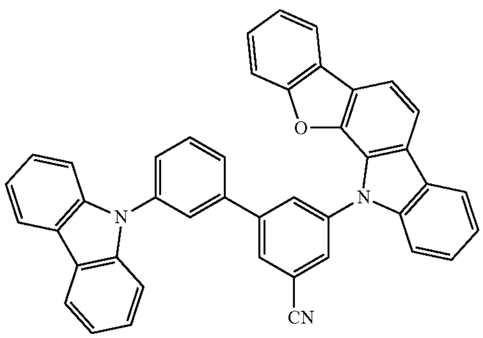
128
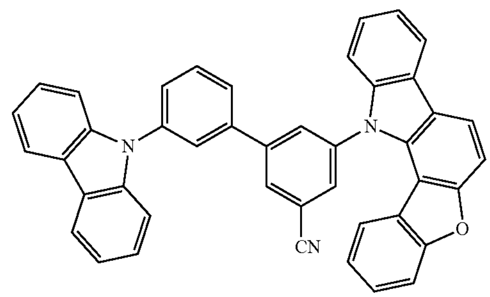
129
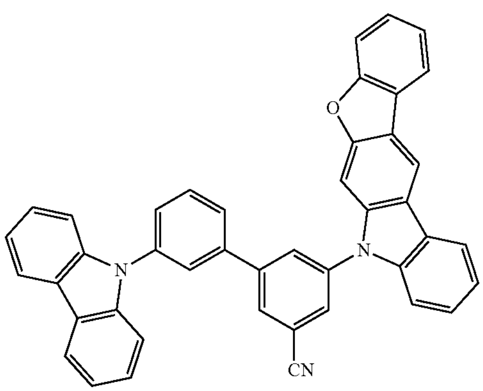
130
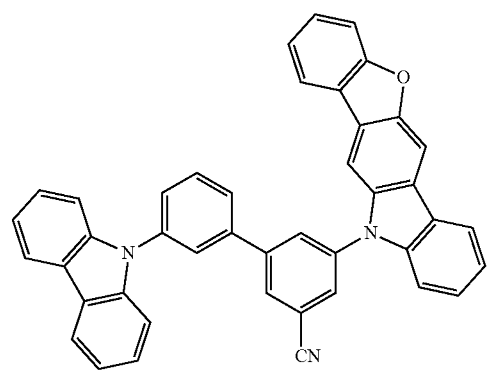
131
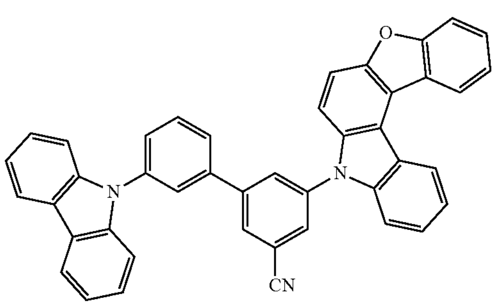
132
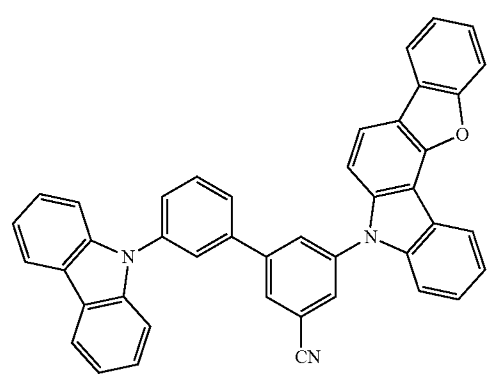

-continued
133
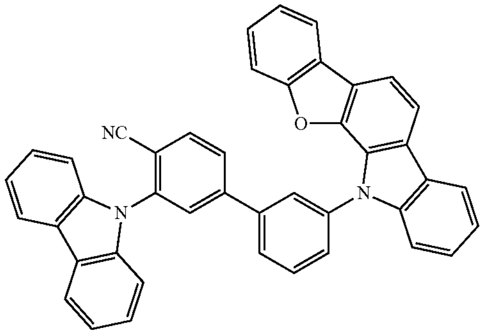
134
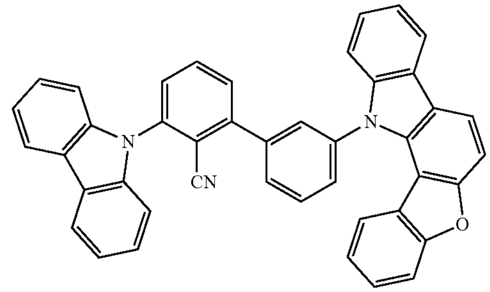
135
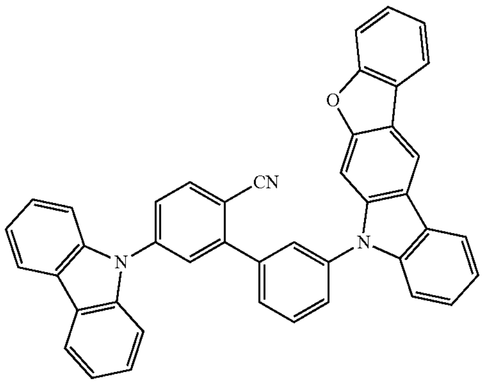
136
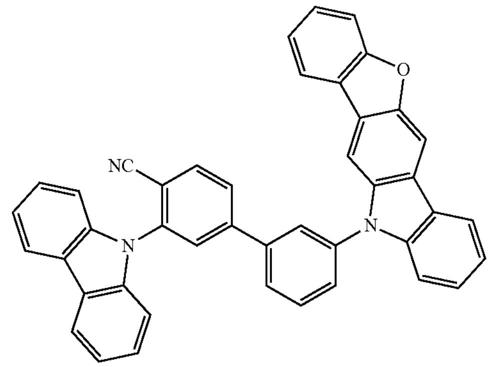
137
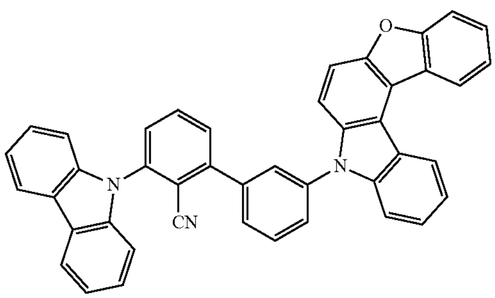
138
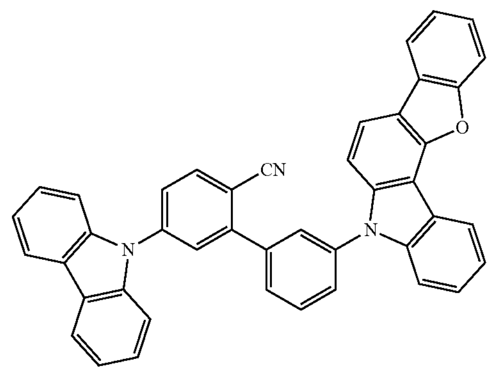
139
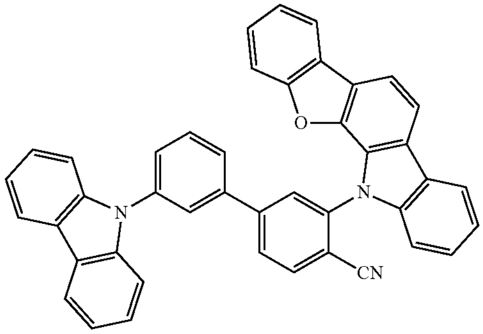
140
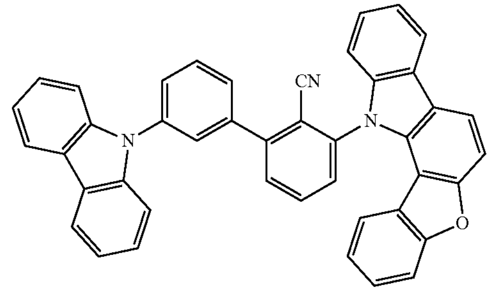

-continued
141
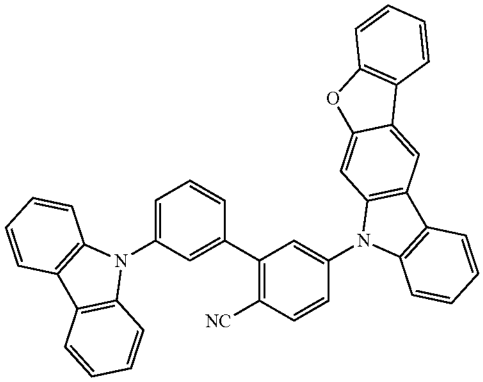
142
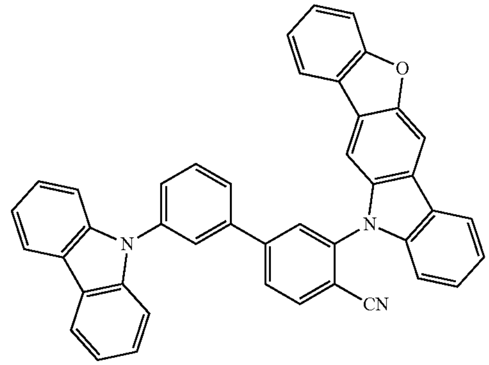
143
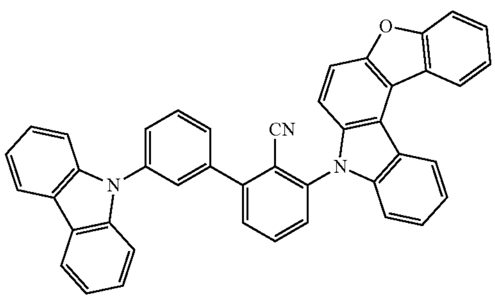
144
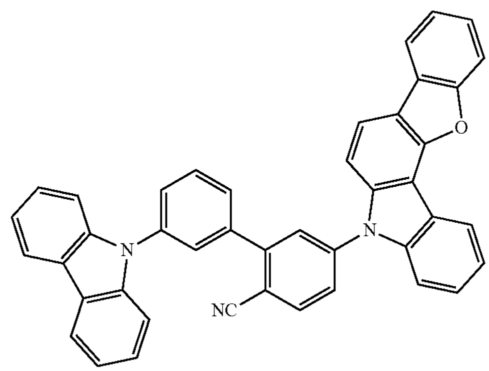
145
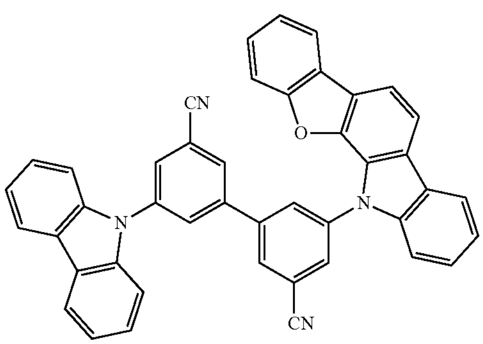
146
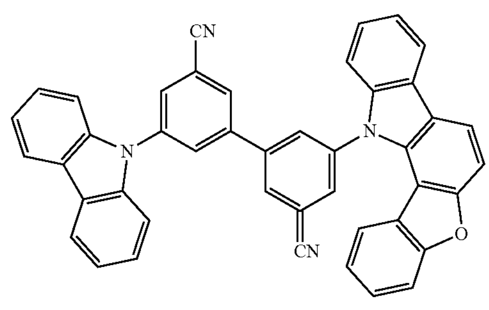
147
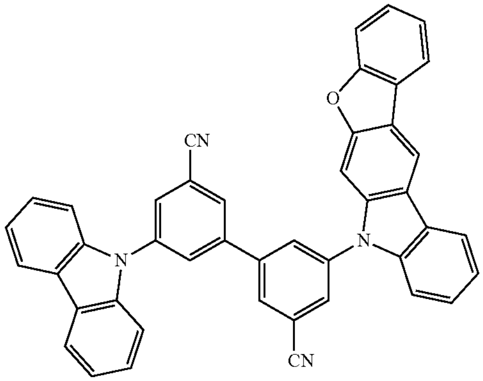
148
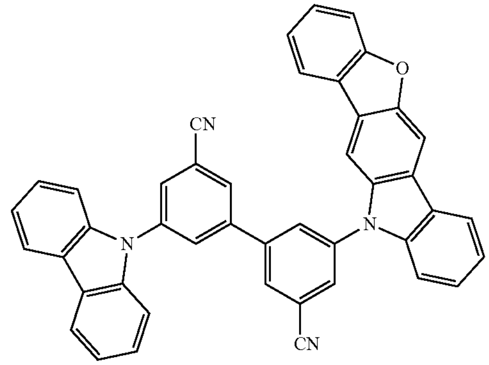

-continued
149
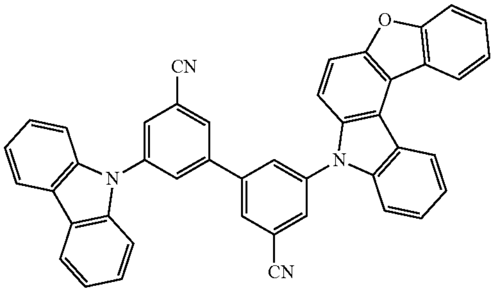
150
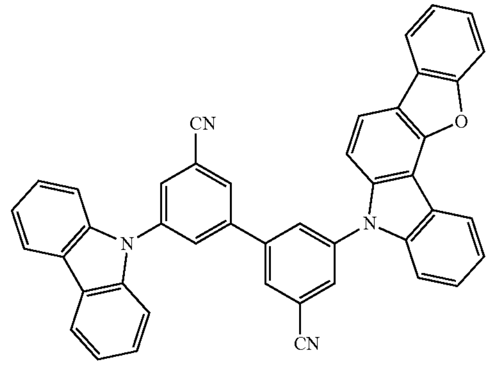
151
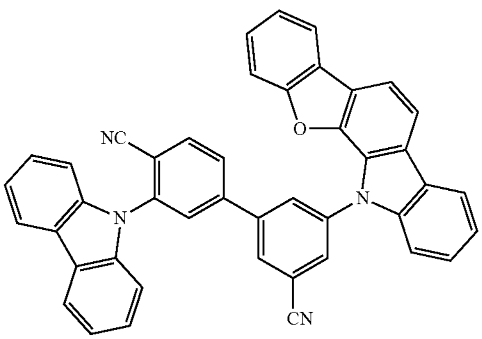
152
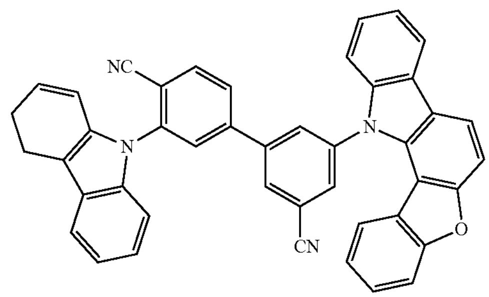
153
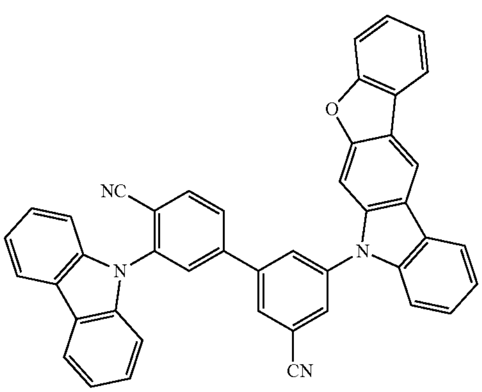
154
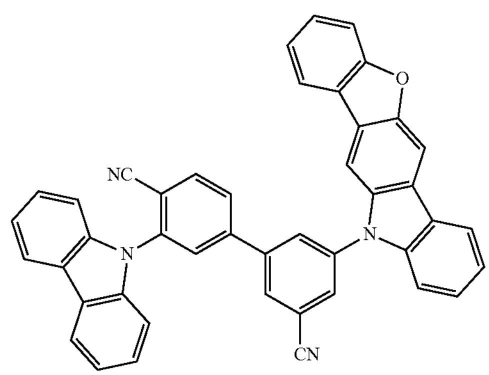
155
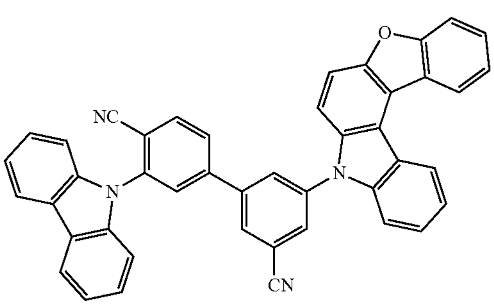
156
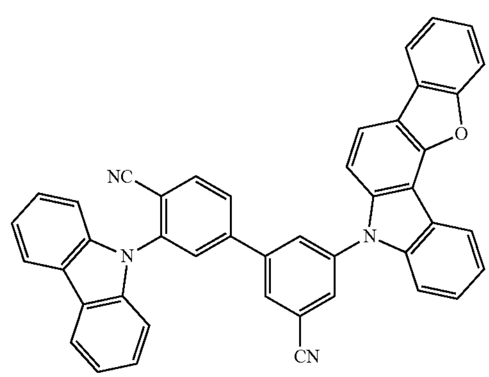

-continued
157
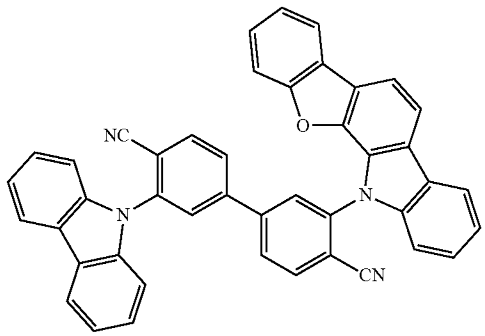
158
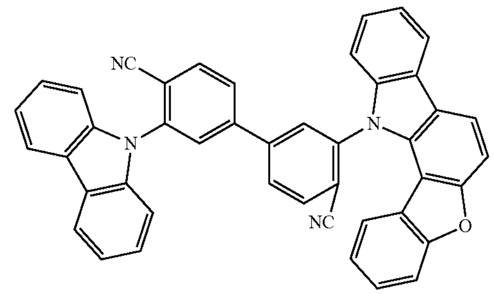
159
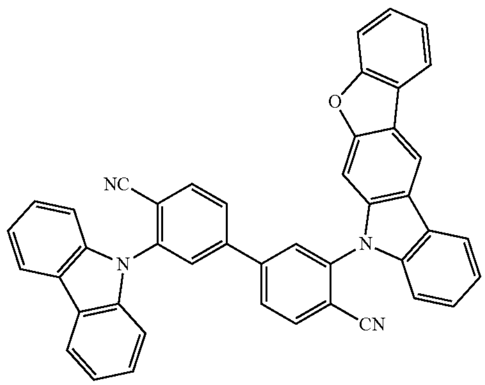
160
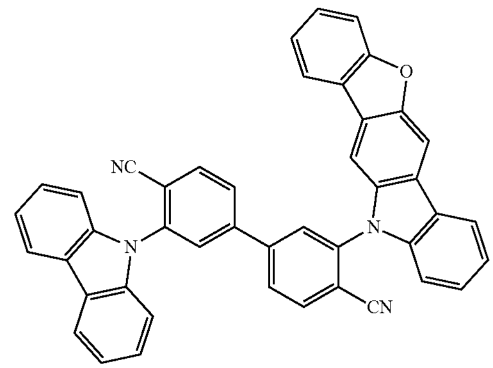
161
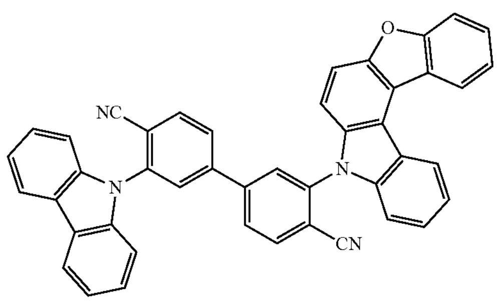
162
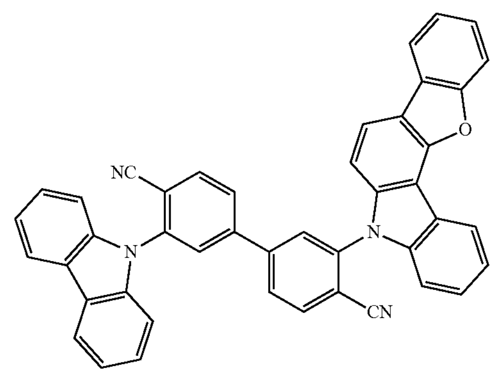
163
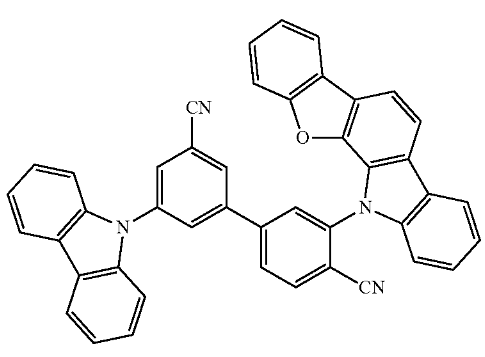
164
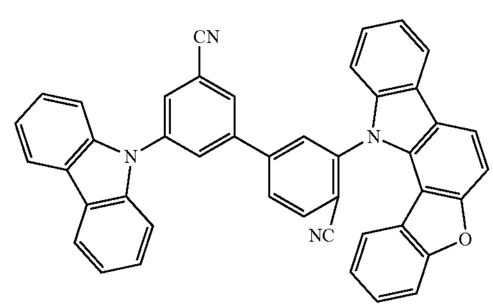

-continued
165
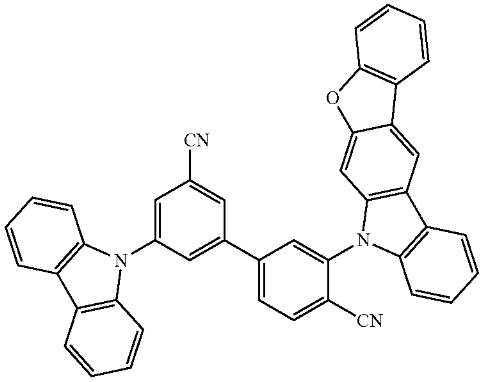
166
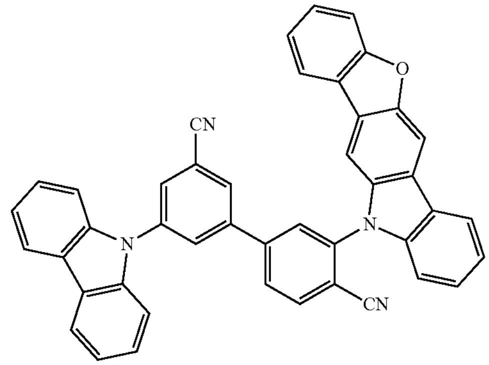
167
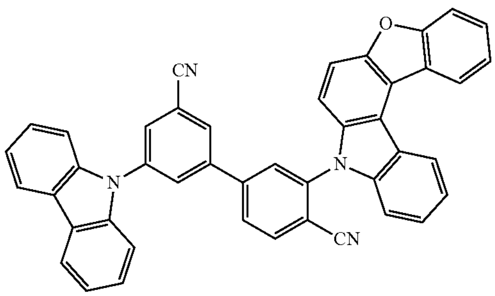
168
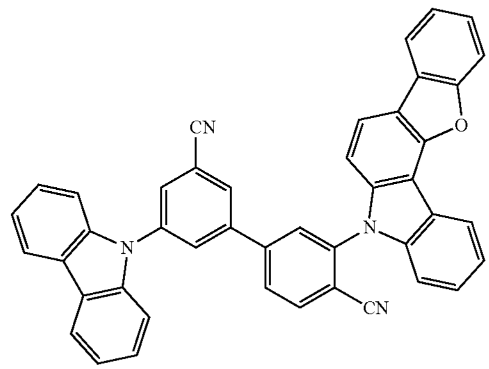
169
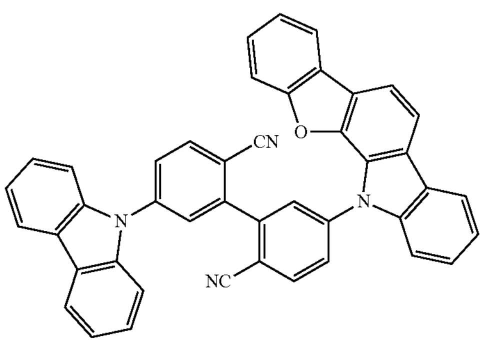
170
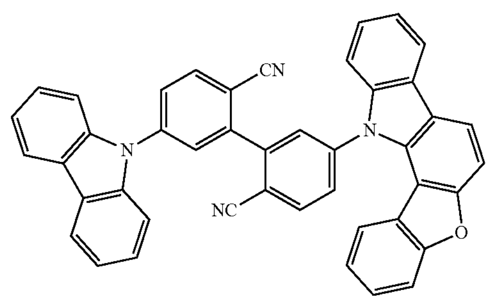
171
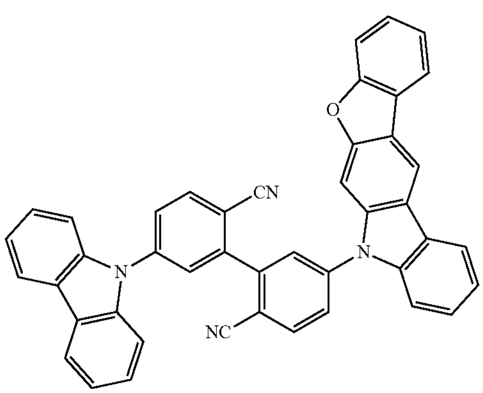
172
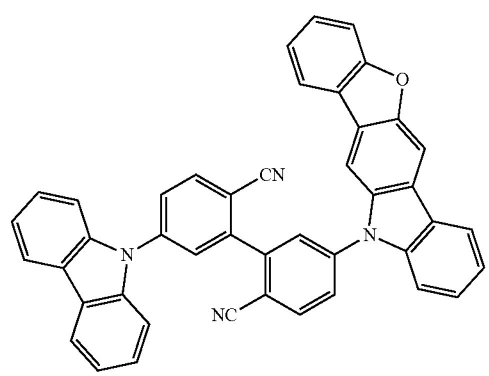

-continued
173
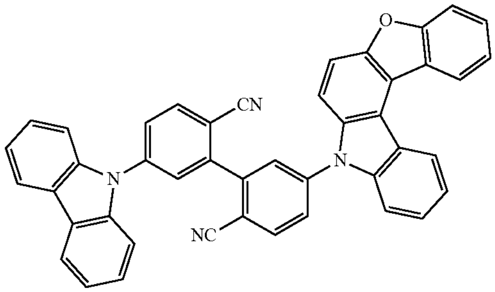
174
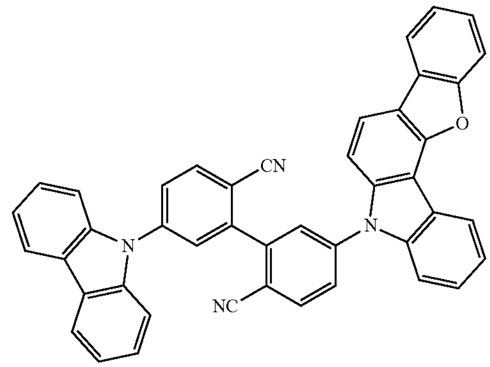
175
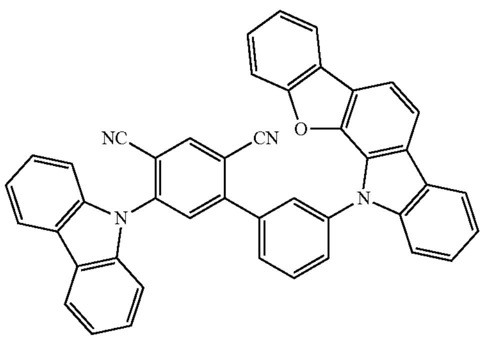
176
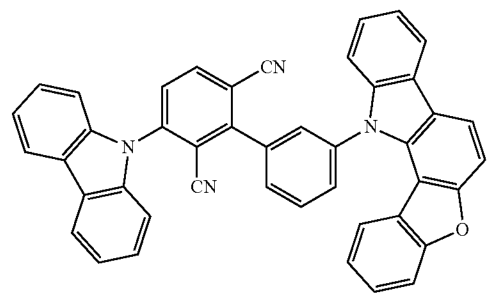
177
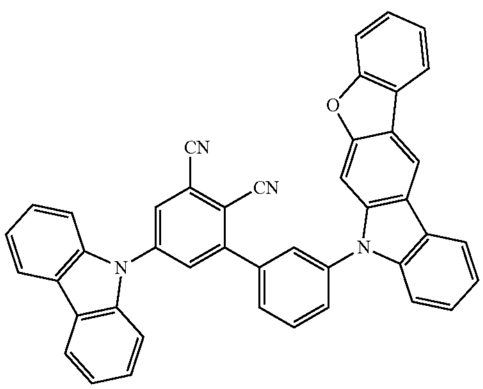
178
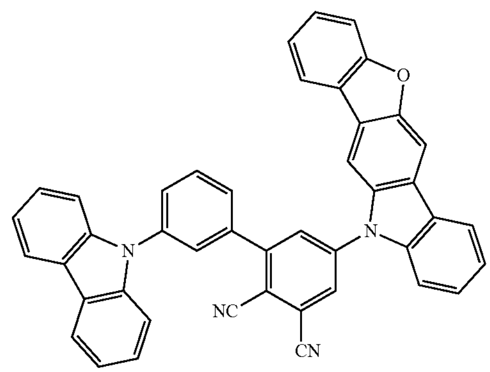
179
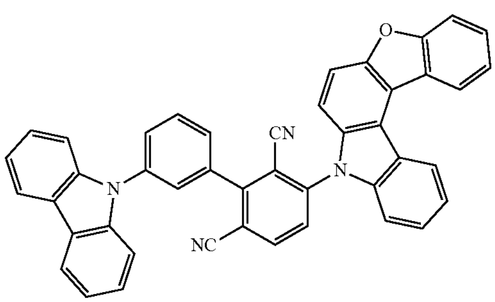
180
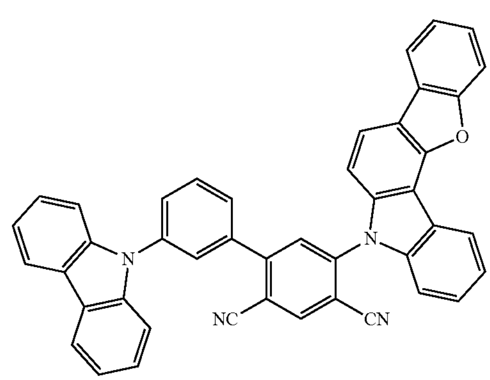

-continued
181
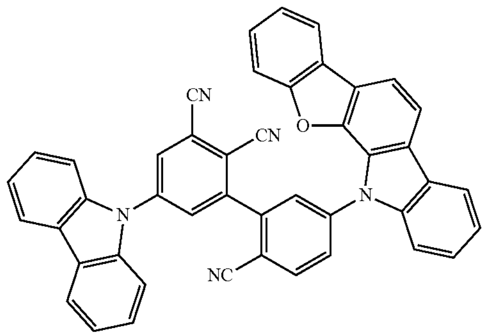
182
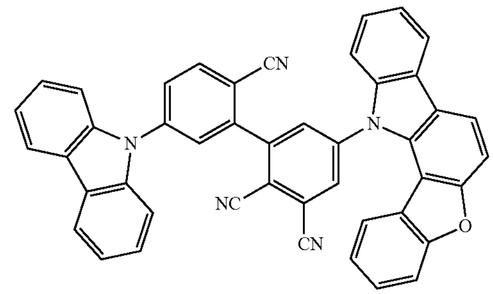
183
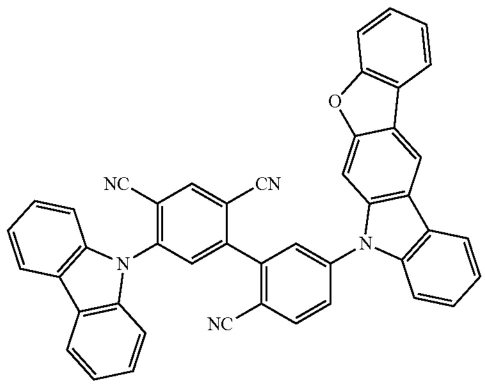
184
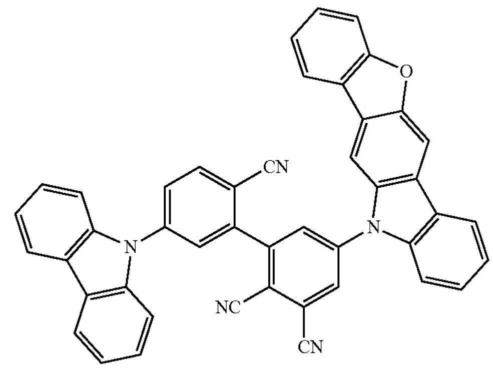
185
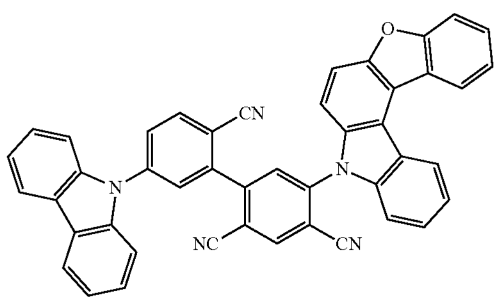
186
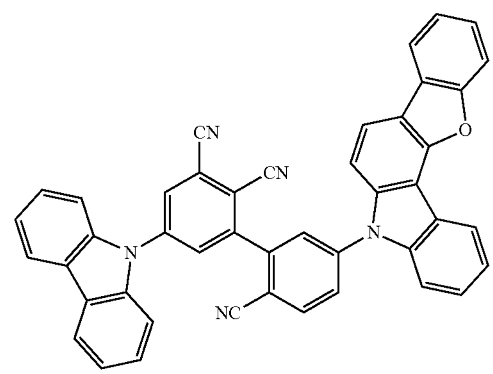
187
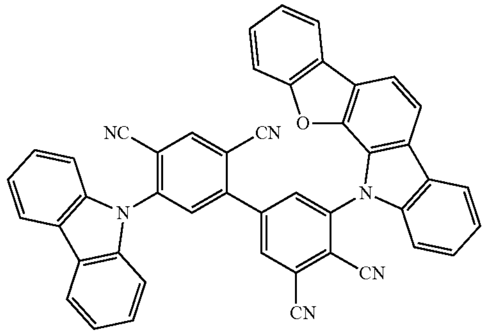
188
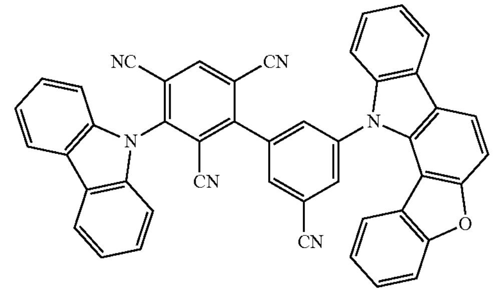

-continued
189
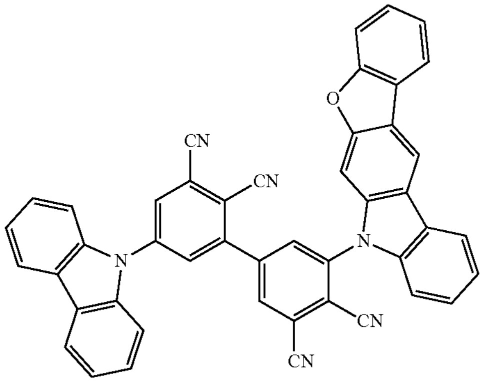
190
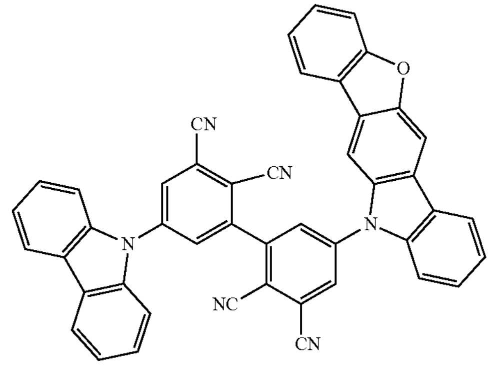
191
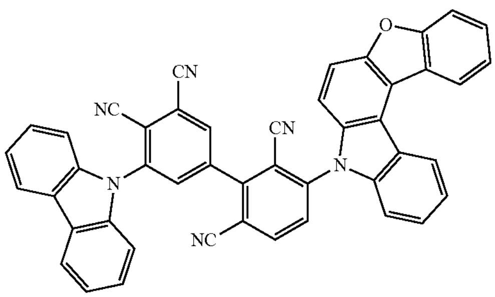
192
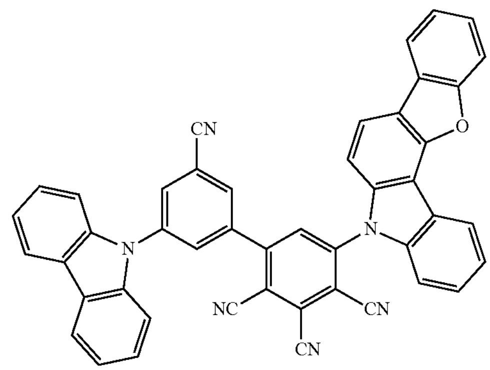
193
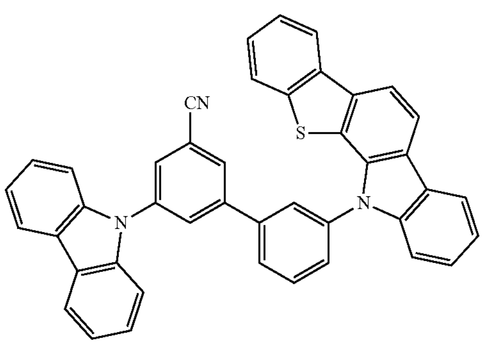
194
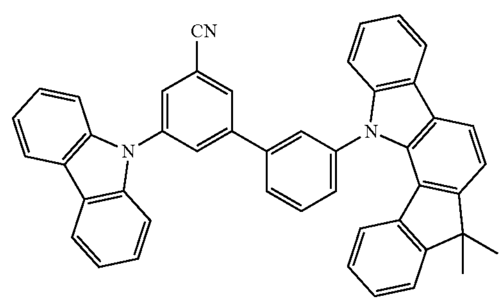
195
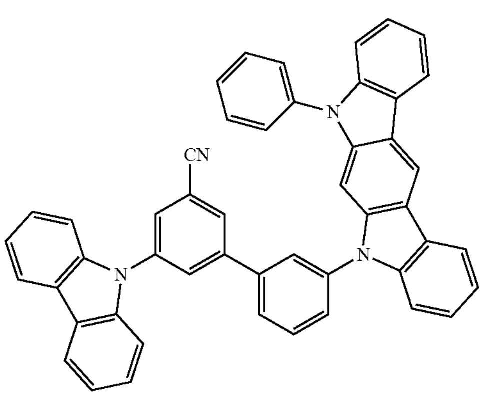
196
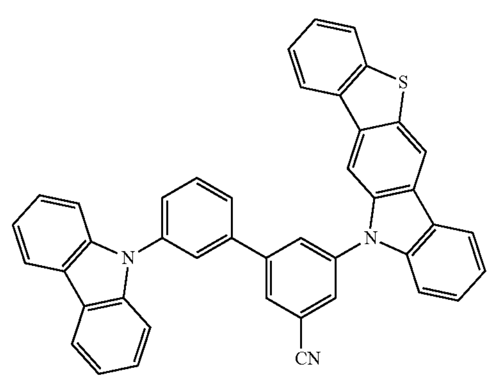

-continued
197
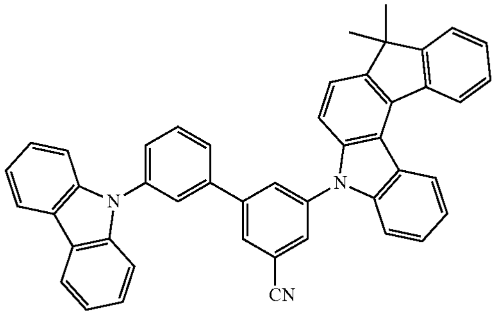
198
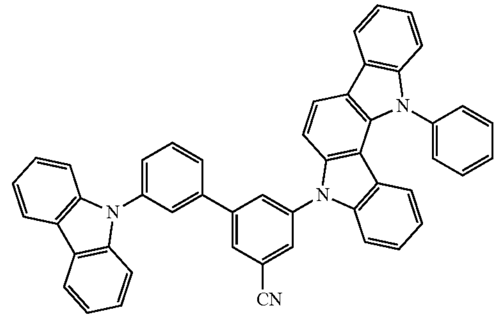
199
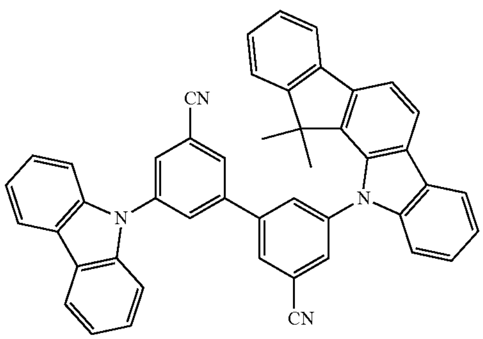
200
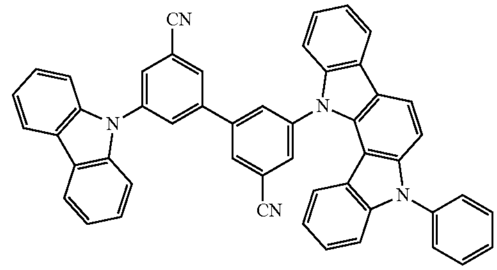
201
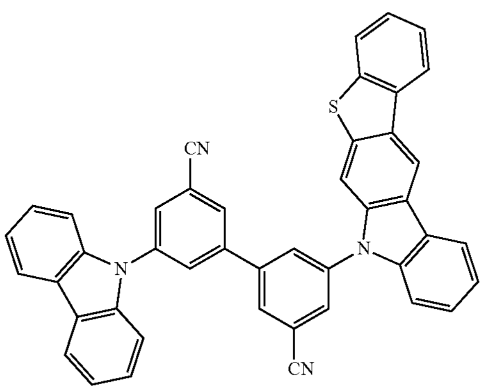
202
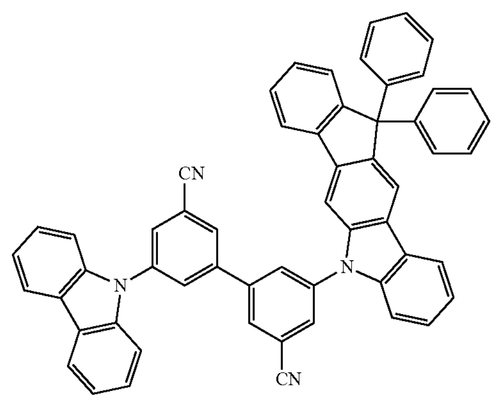
203
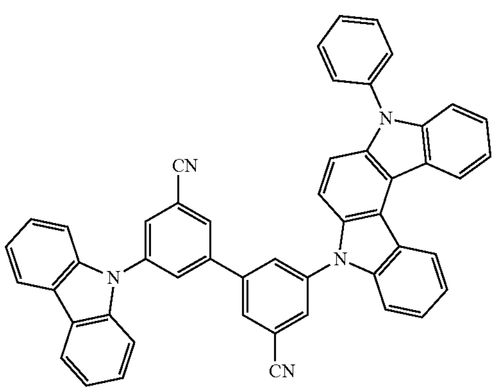
204
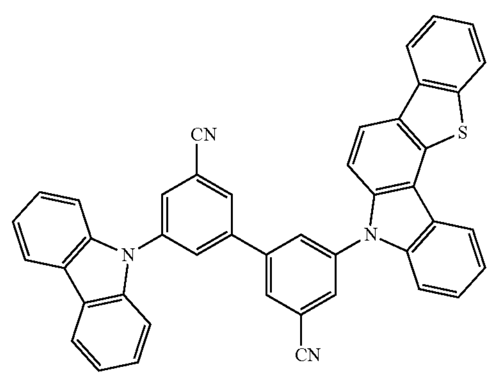

-continued
205
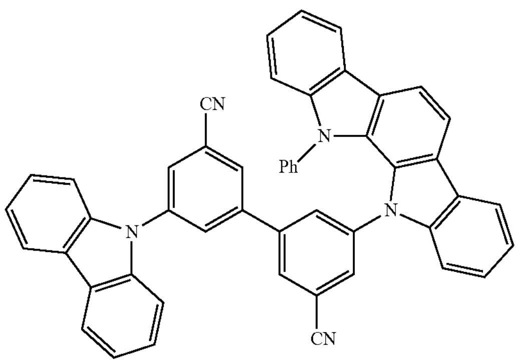
206
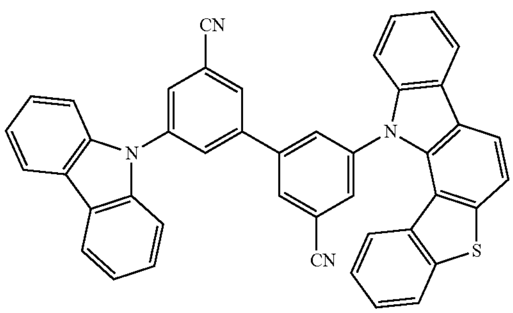
207
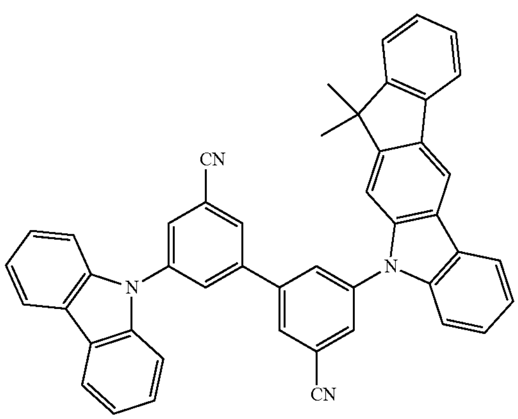
208
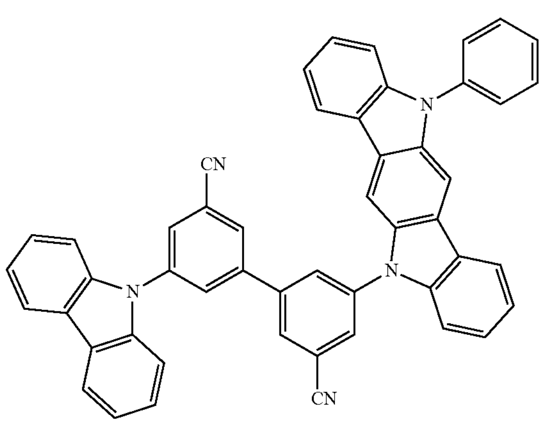
209
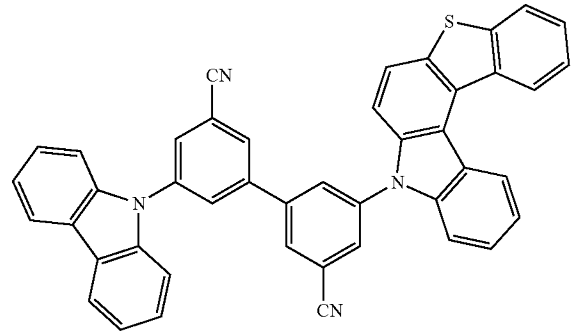
210
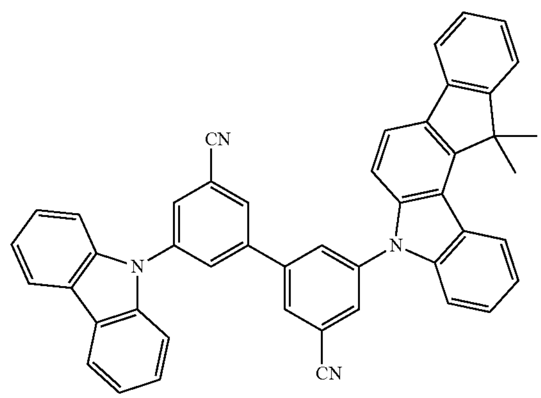
211
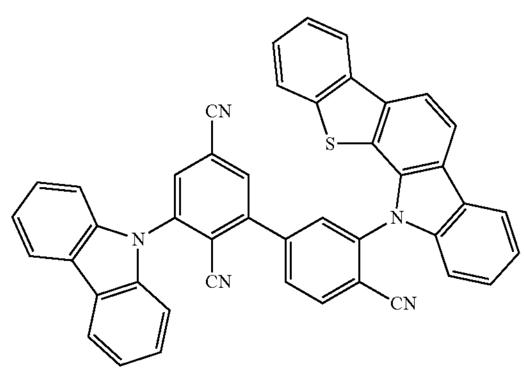
212
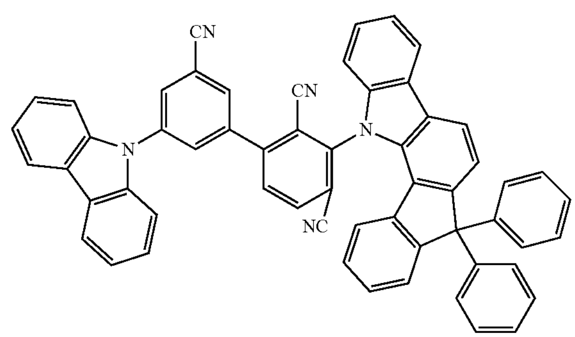

213
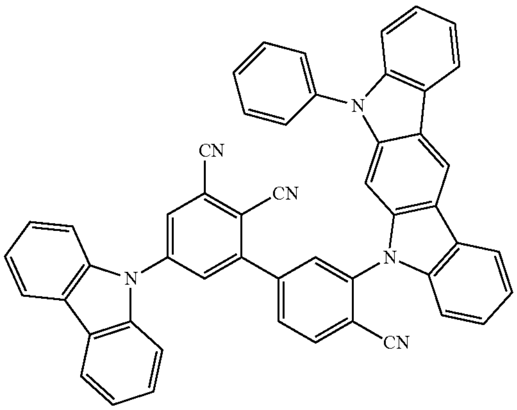
214
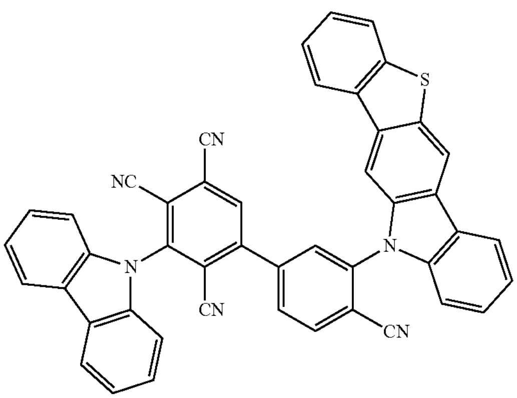
215
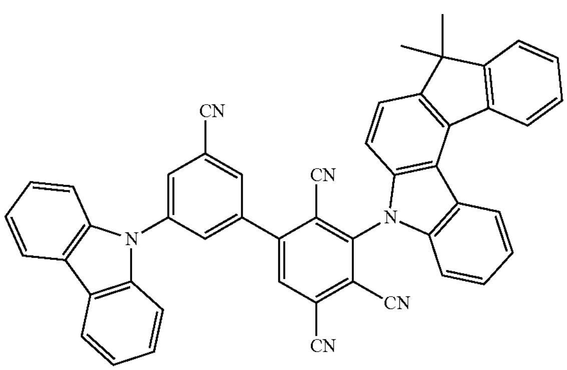
216
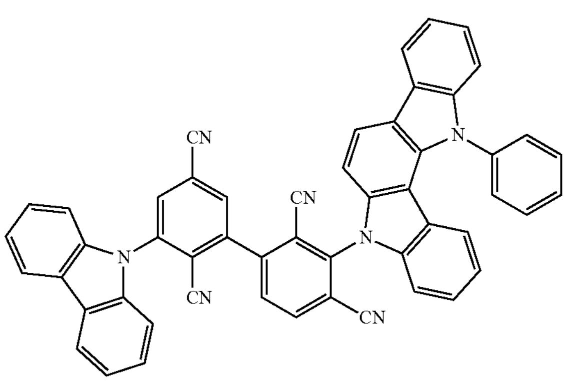
217
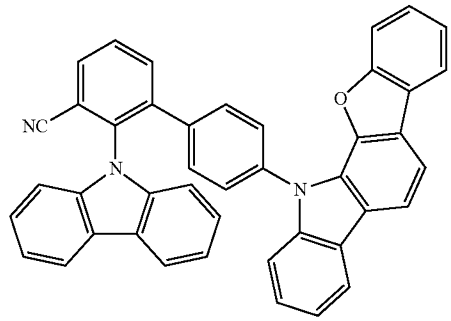
218
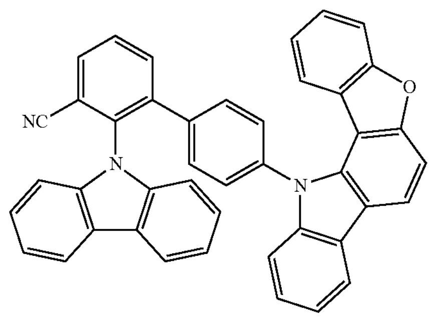
219
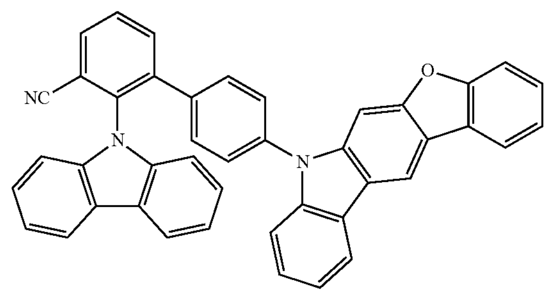
220
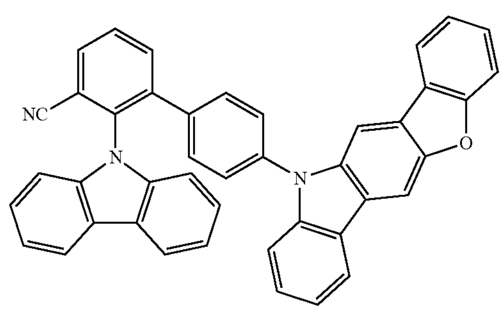
221
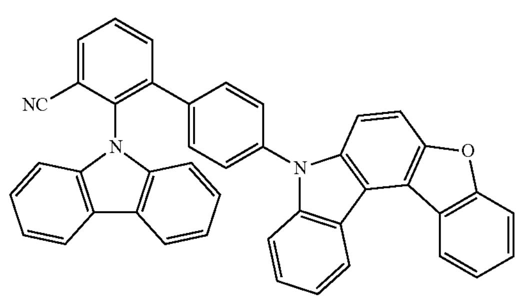

-continued
222
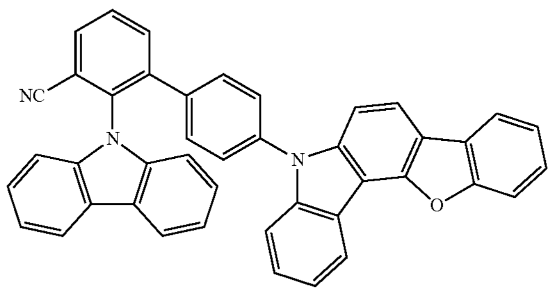
223
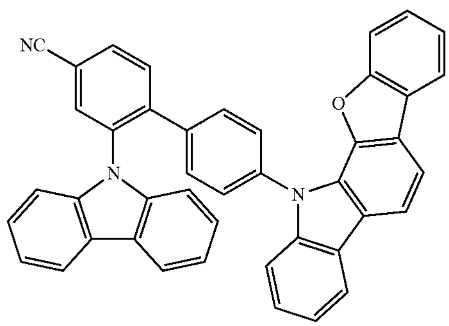
224
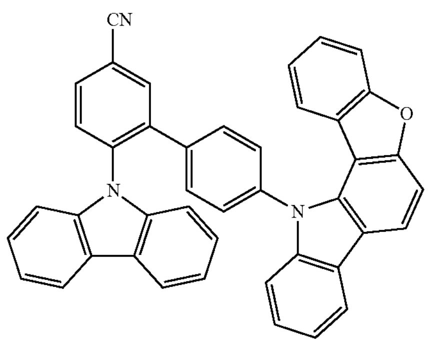
225
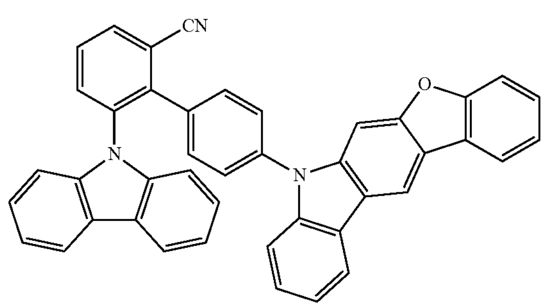
226
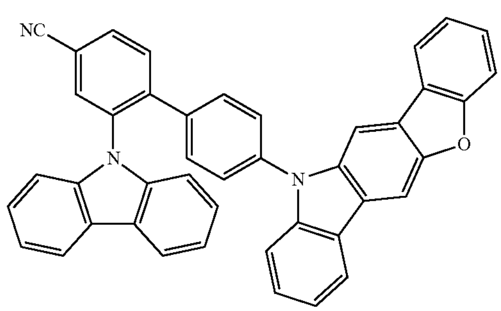
-continued
227
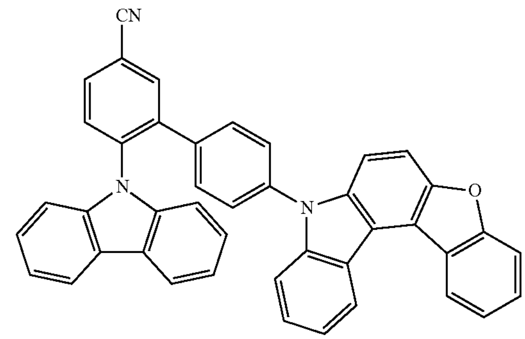
228
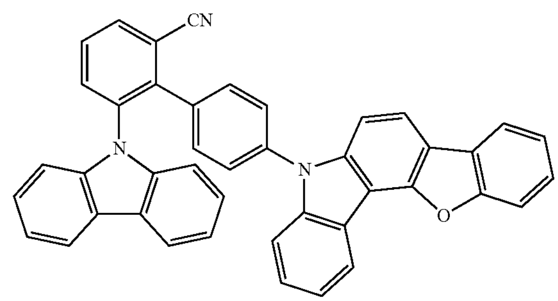
229
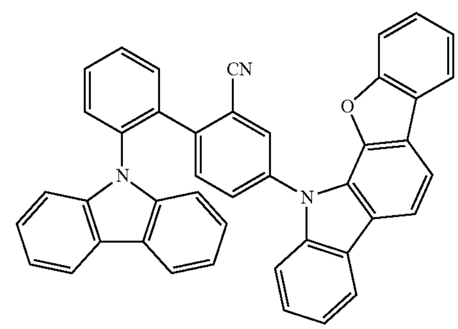
230
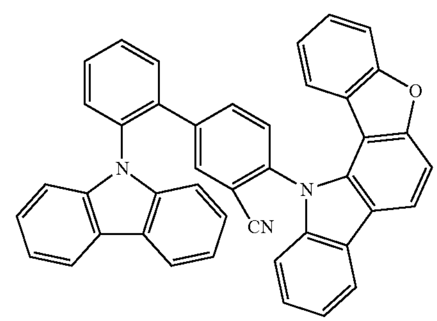
231
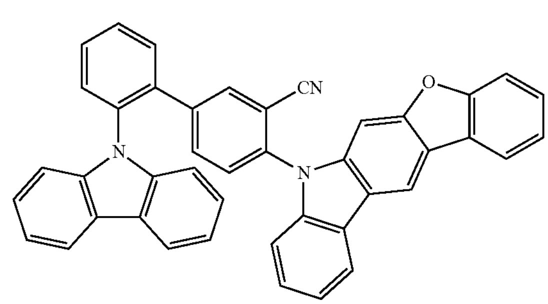

-continued
232
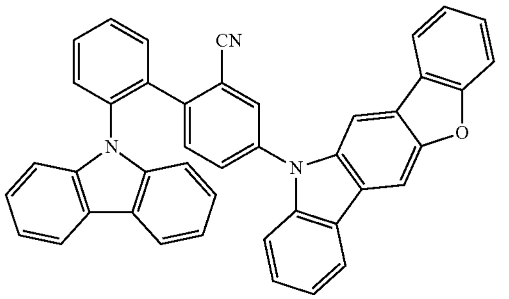
233
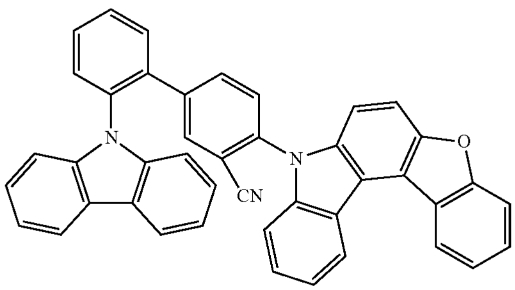
234
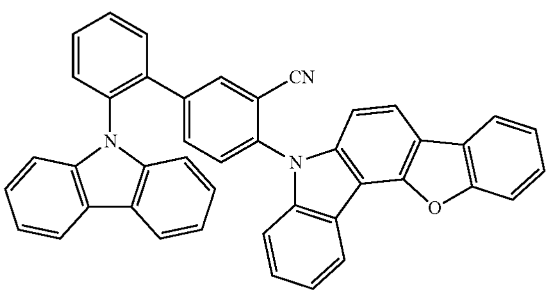
235
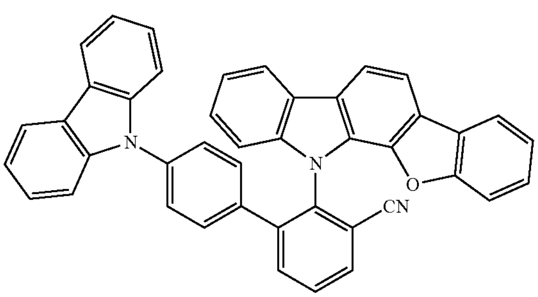
236
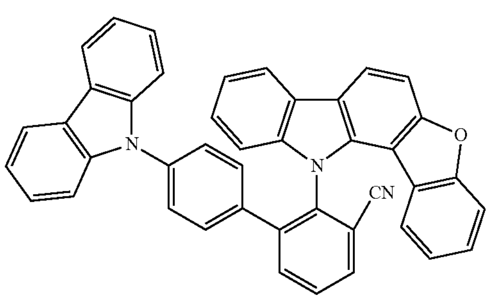
-continued
237
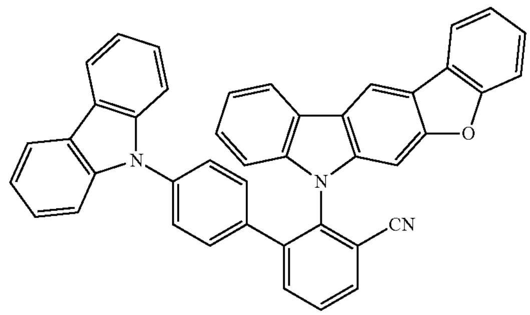
238
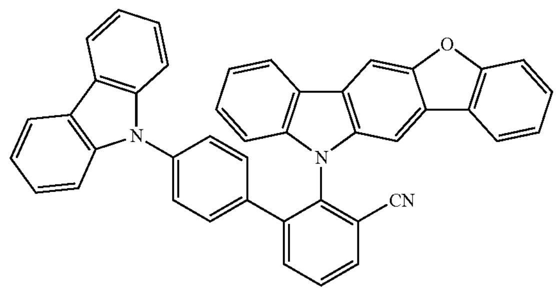
239
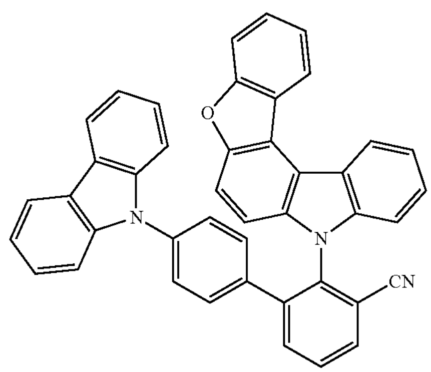
240
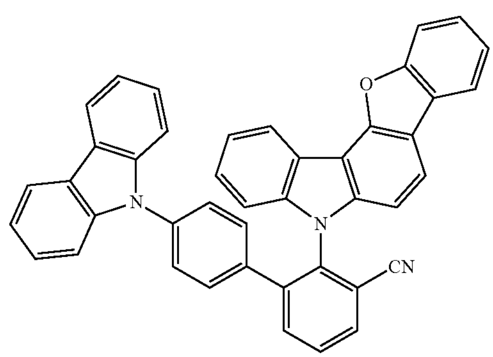

-continued
241
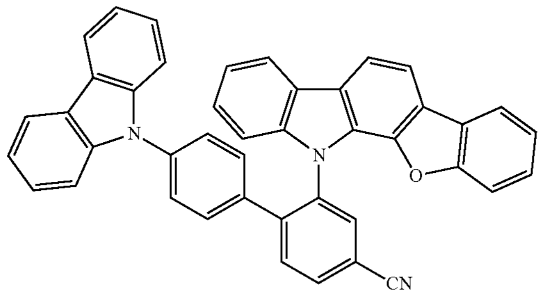
242
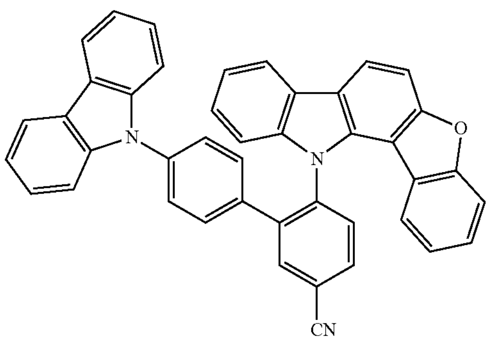
243
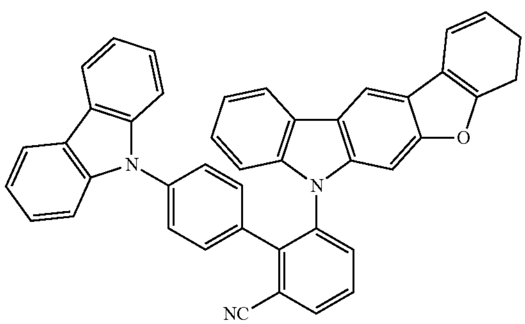
244
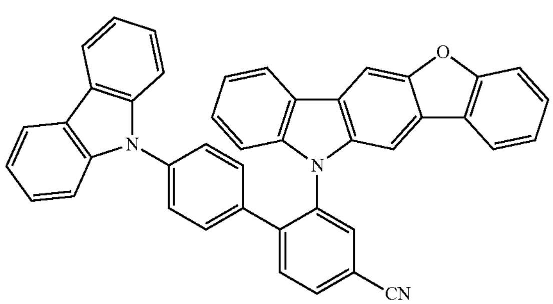
-continued
245
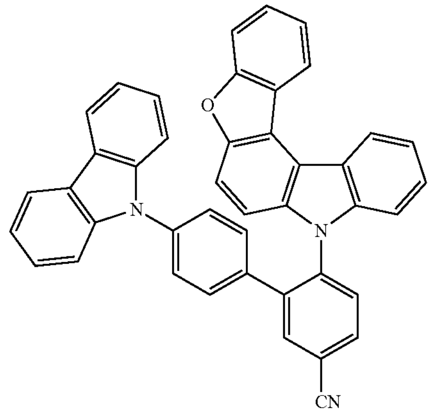
246
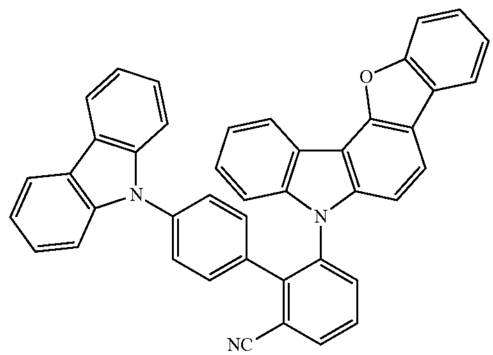
247
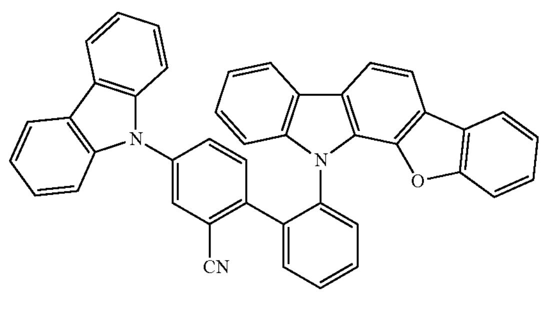
248
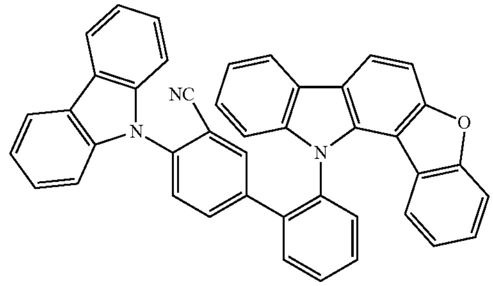

-continued
249
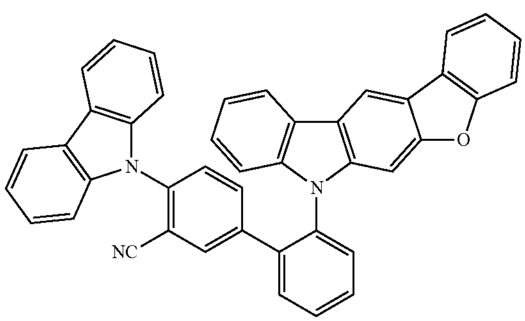
250
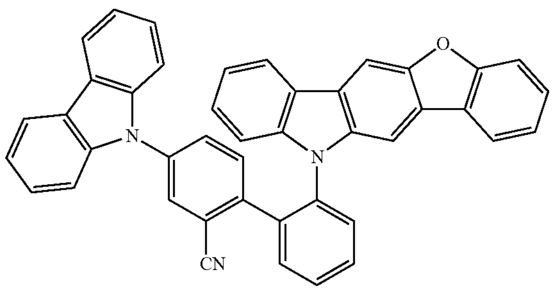
251
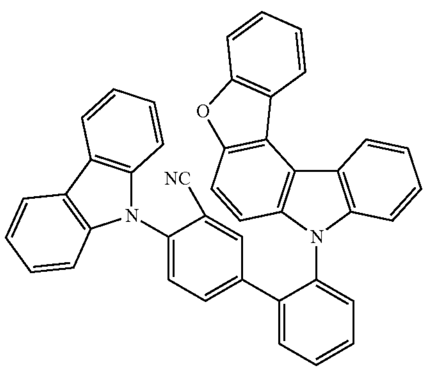
252
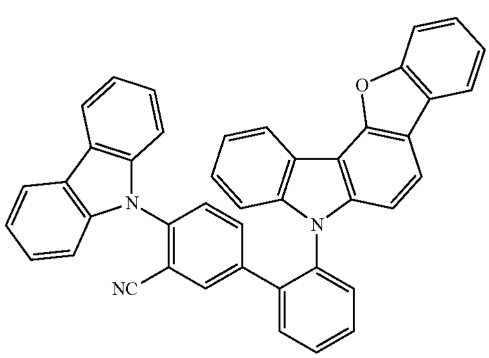
-continued
253
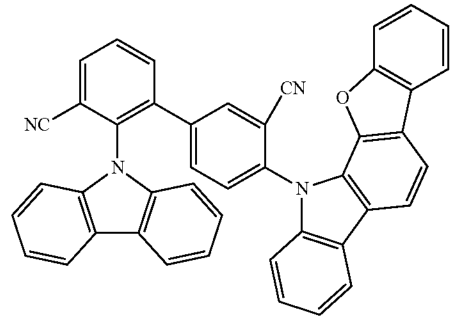
254
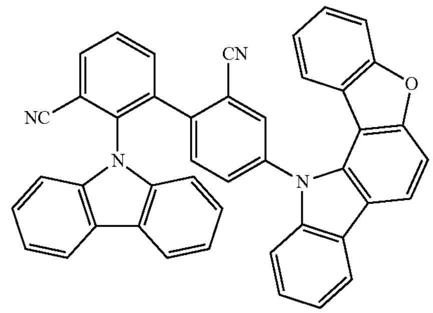
255
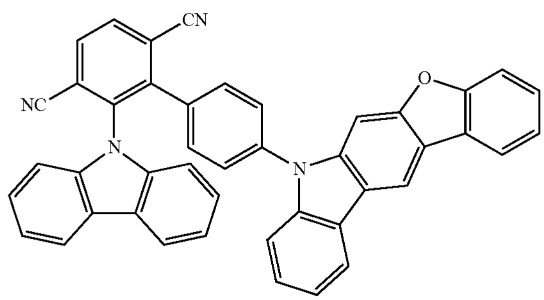
256
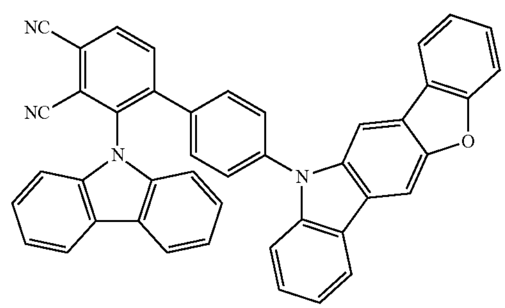
257
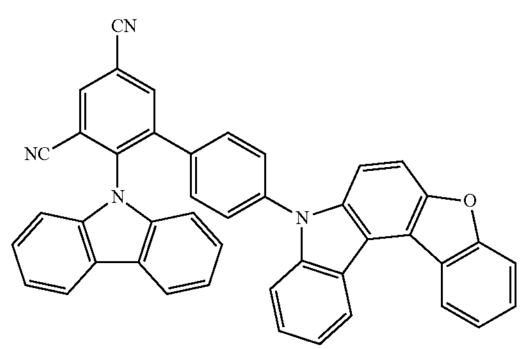

258
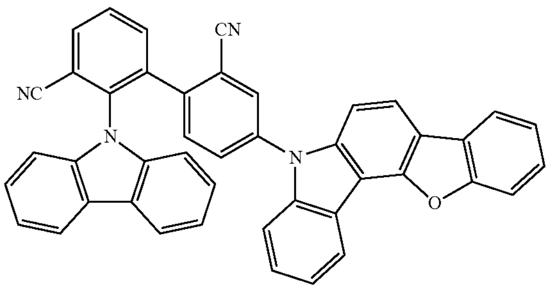
259
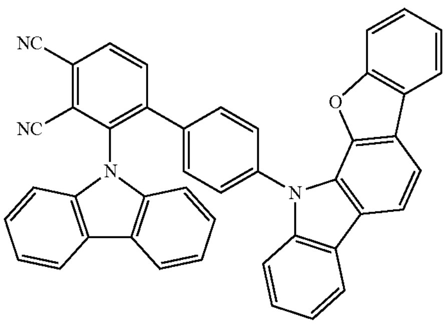
260
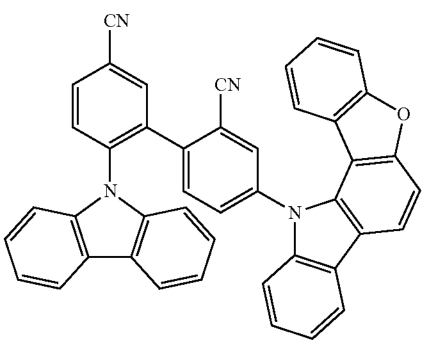
261
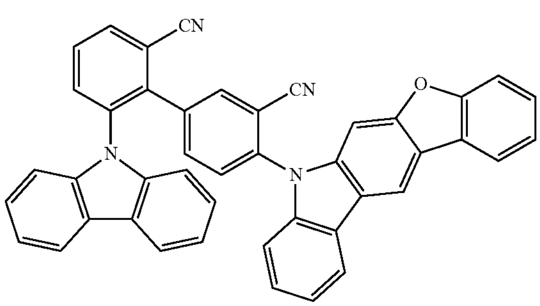
262
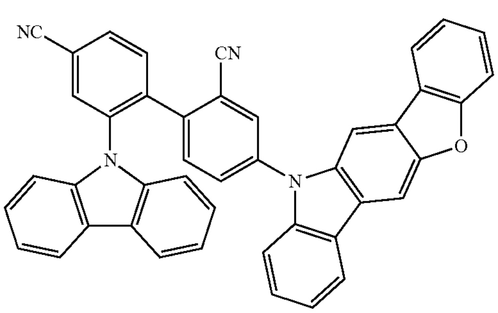
263
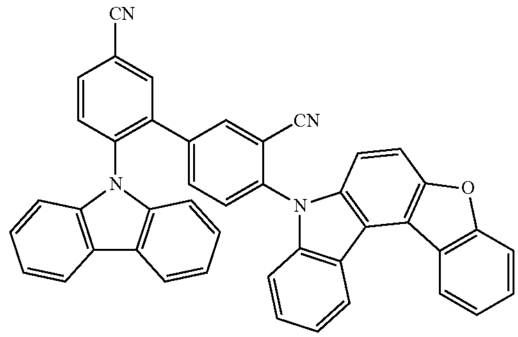
264
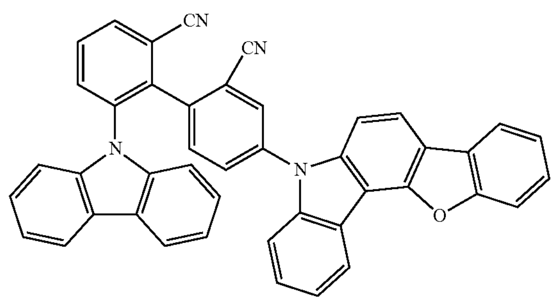
265
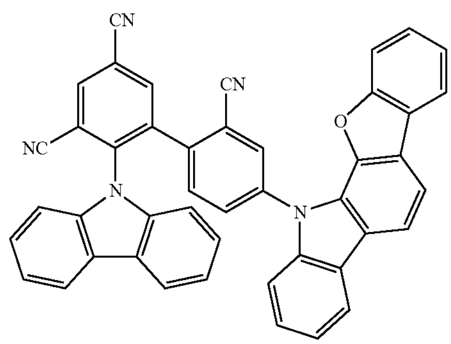
266
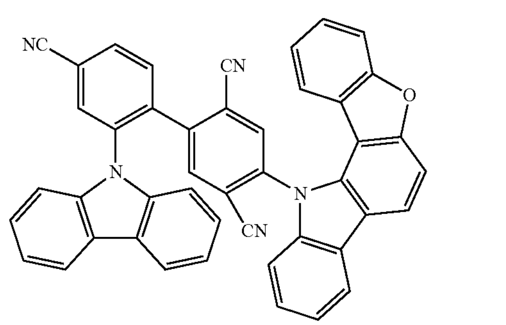

-continued
267
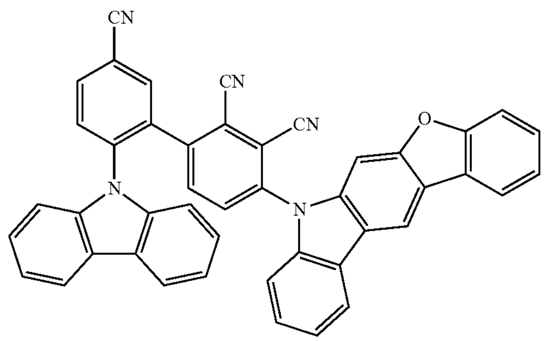
268
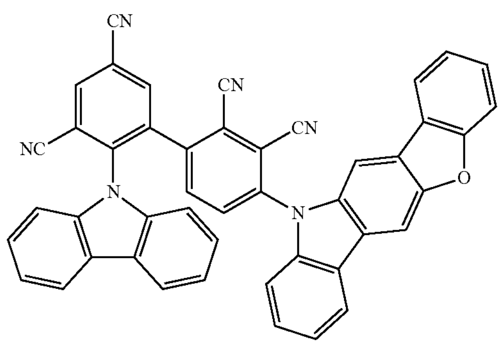
269
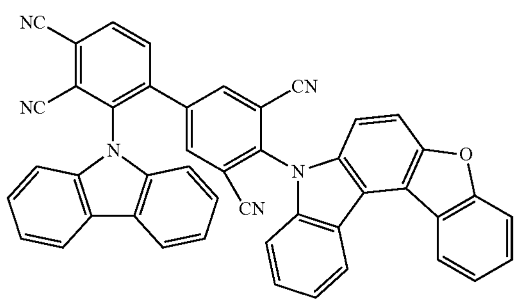
270
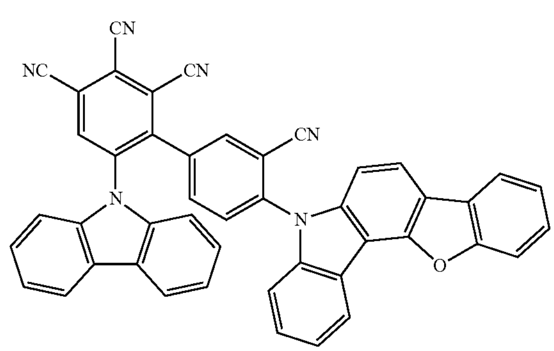
-continued
271
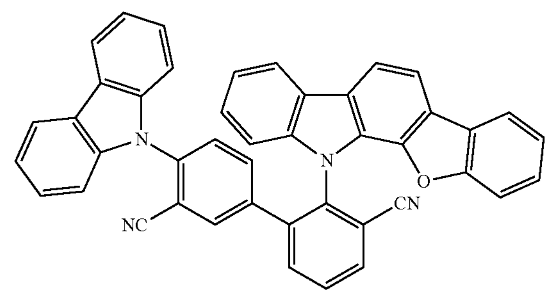
272
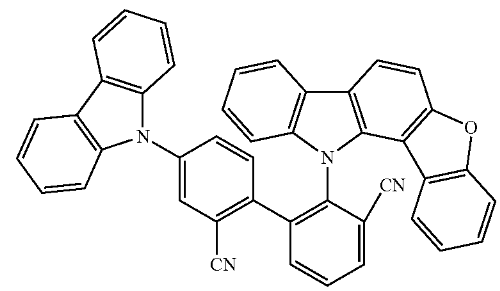
273
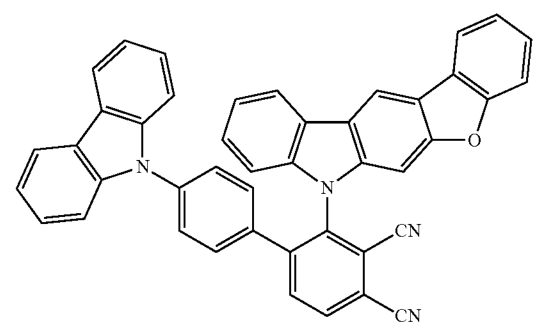
274
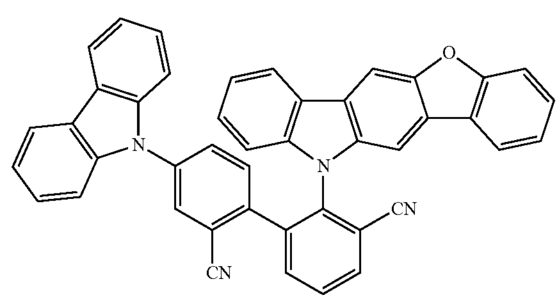
275
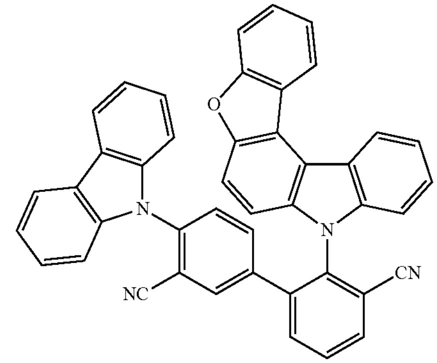

-continued
276
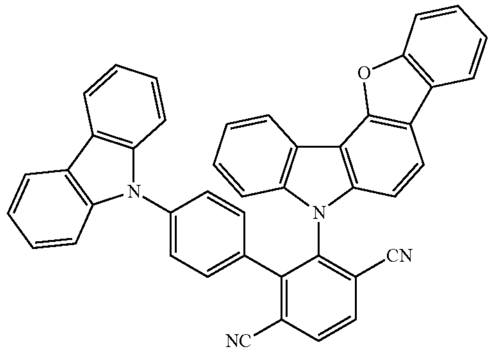
277
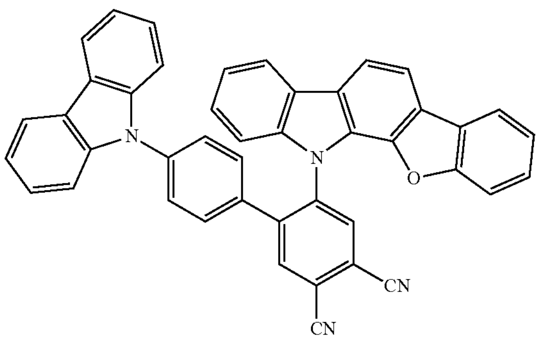
278
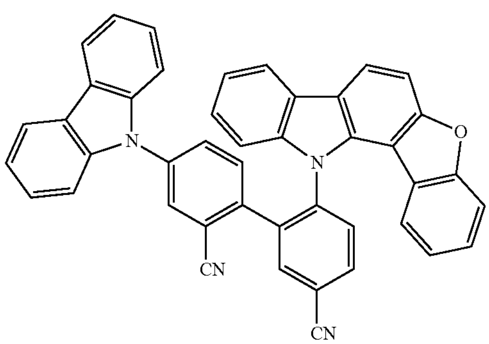
279
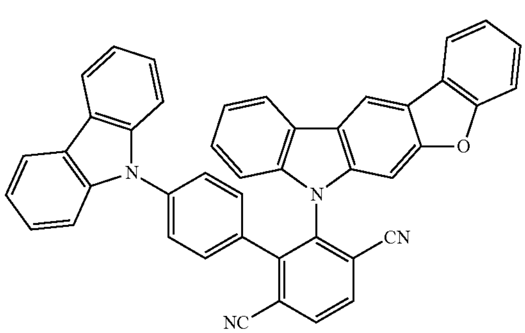
-continued
280
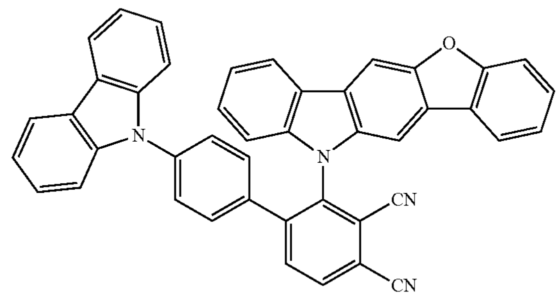
281
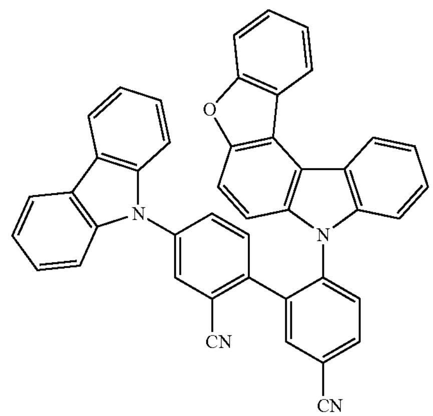
282
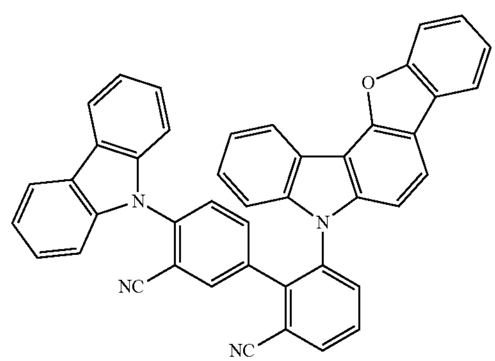
283
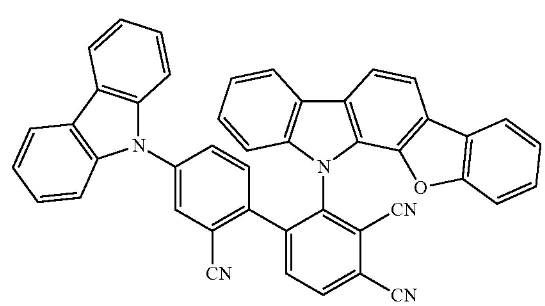

284
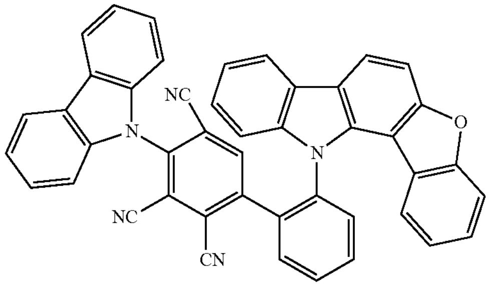
285
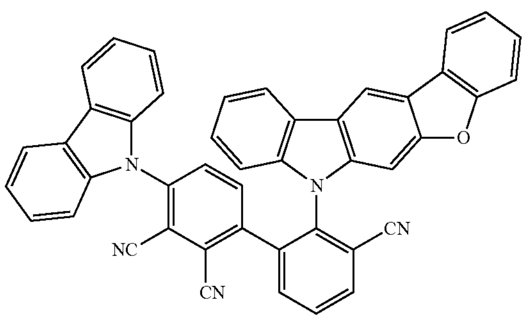
286
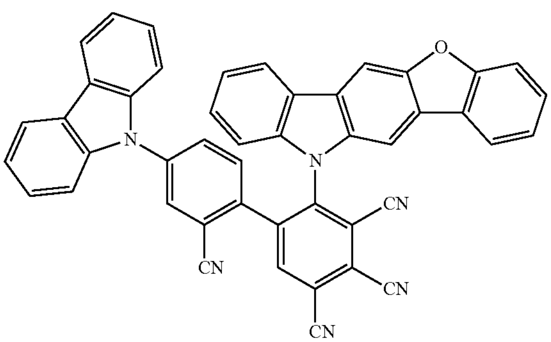
287
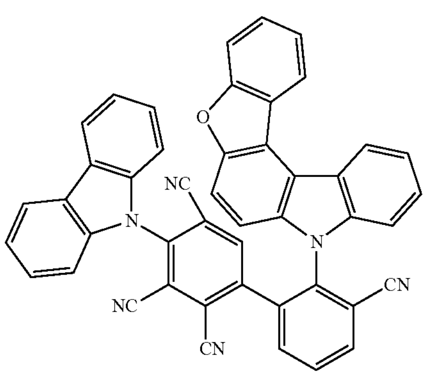
288
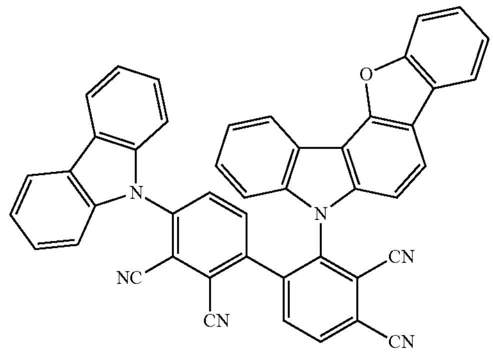
289
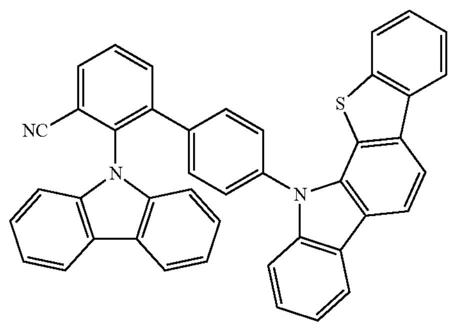
290
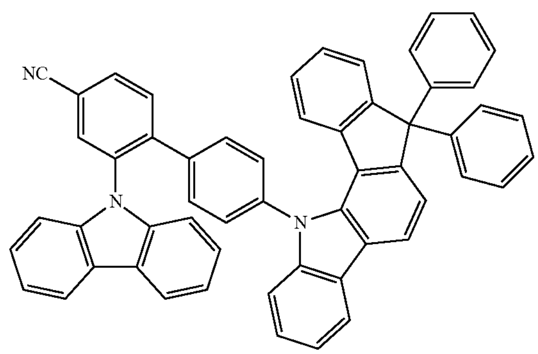
291
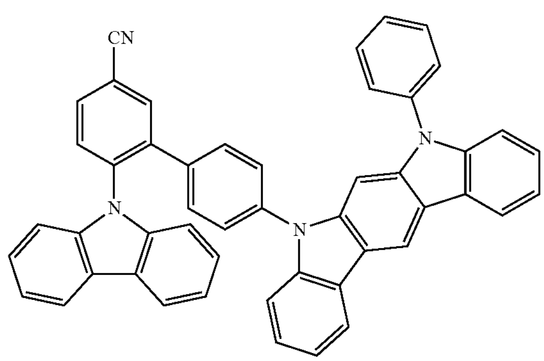

-continued
292
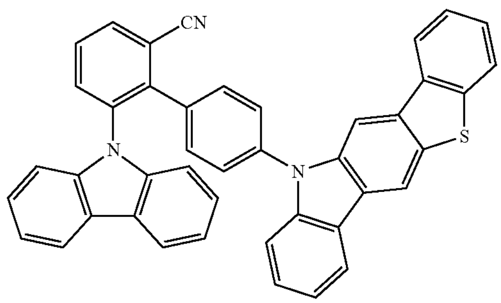
293
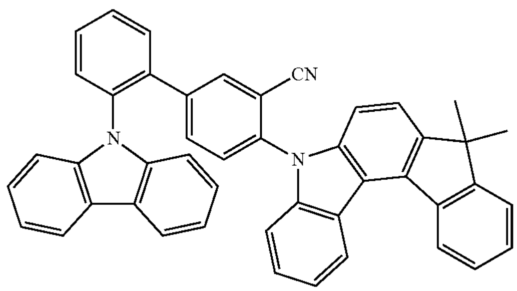
294
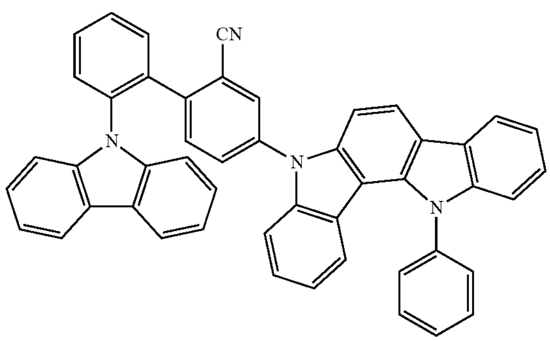
295
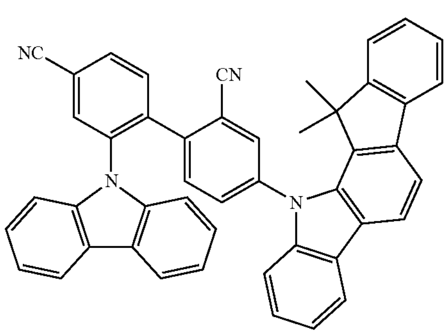
-continued
296
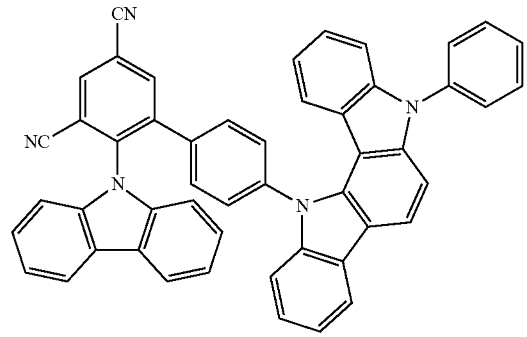
297
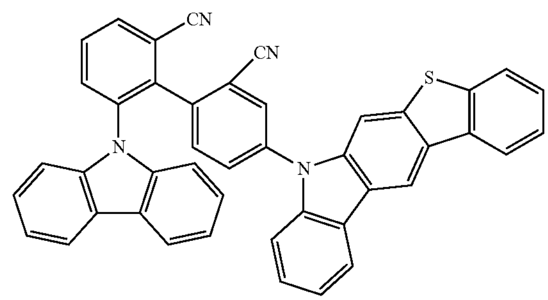
298
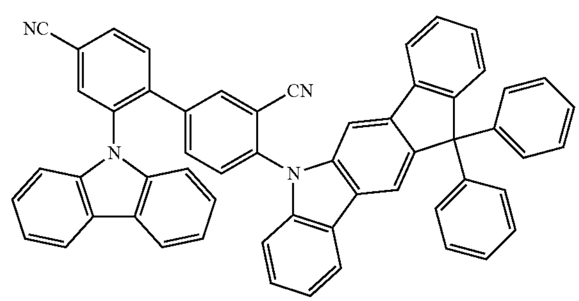
299
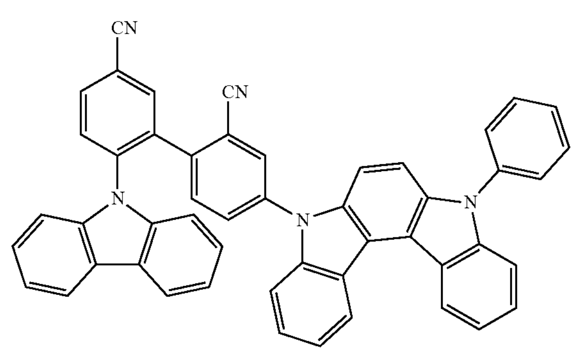

-continued
300
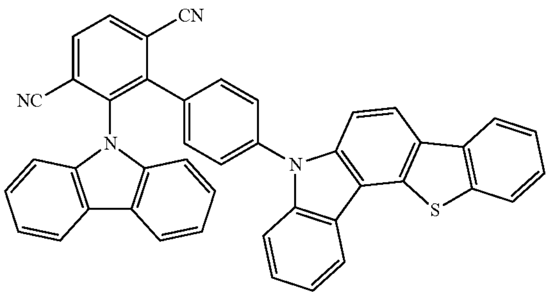
301
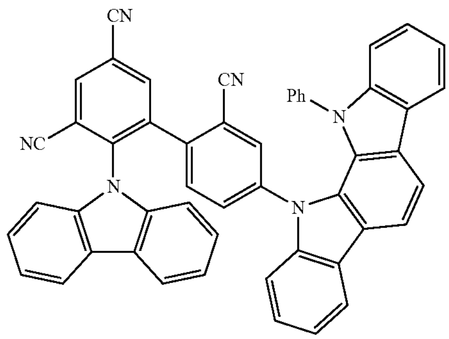
302
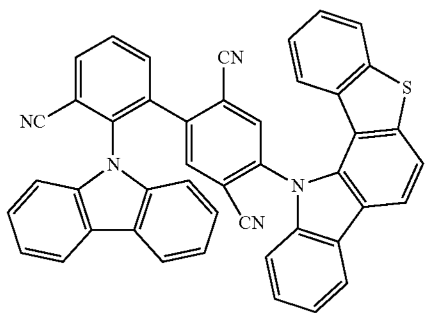
303
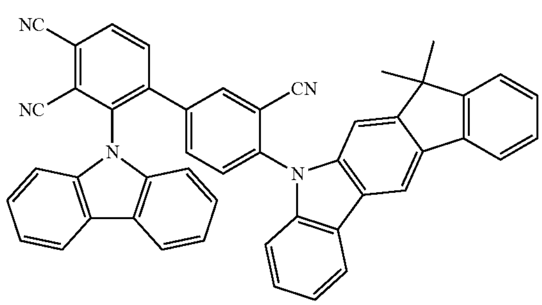
304
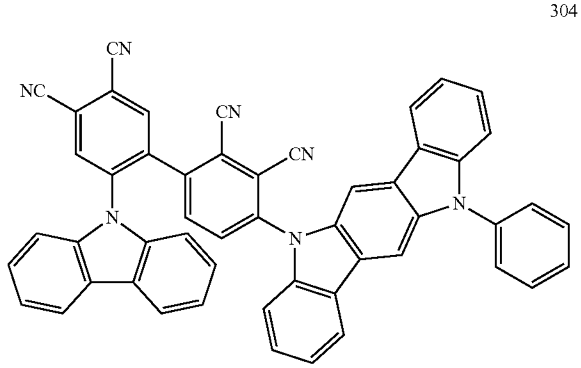
-continued
305
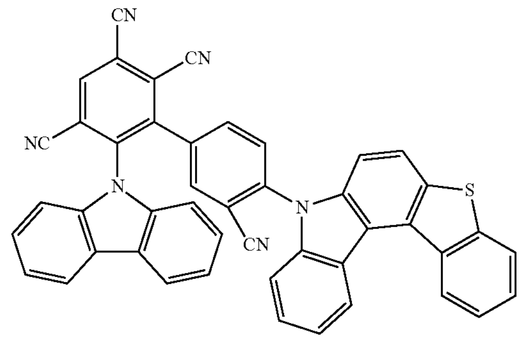
306
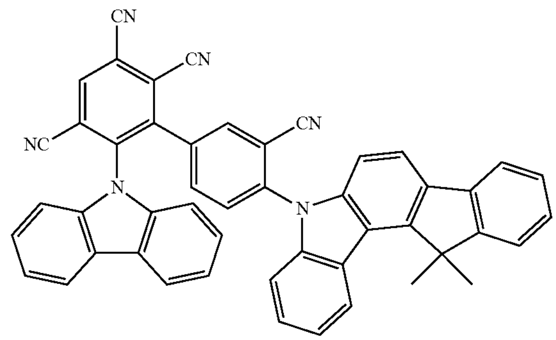
307
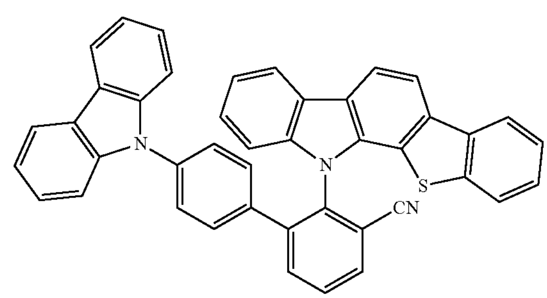
308
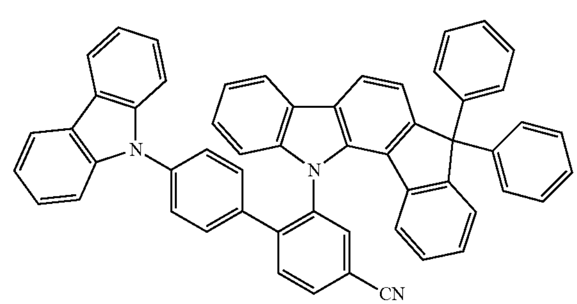

-continued
309
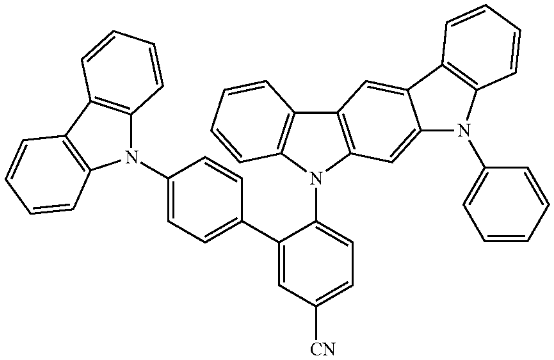
310
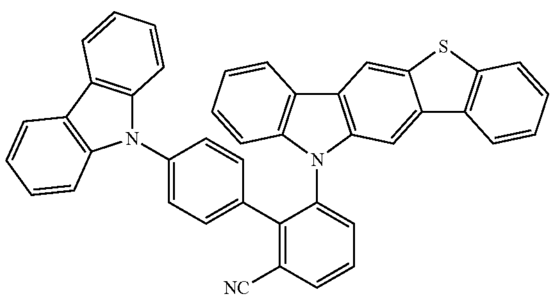
311
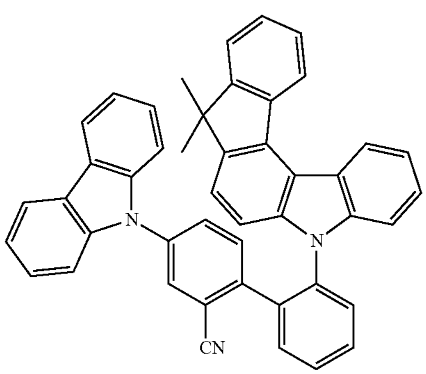
312
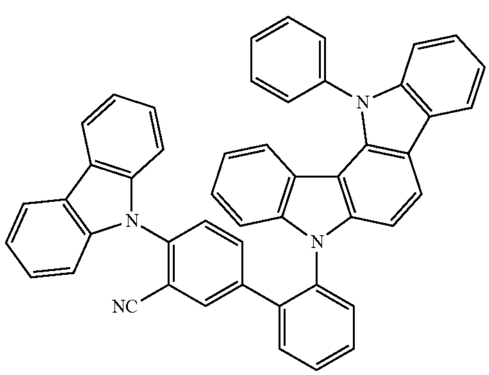
-continued
313
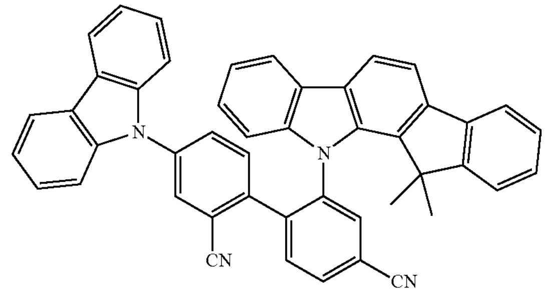
314
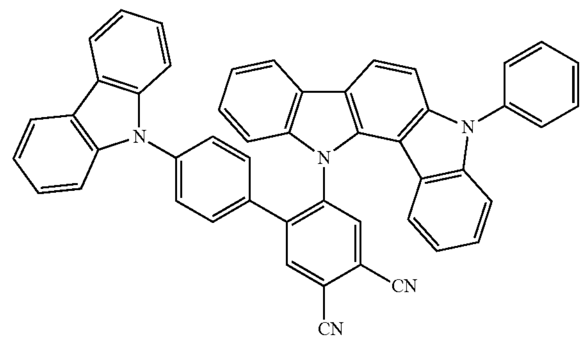
315
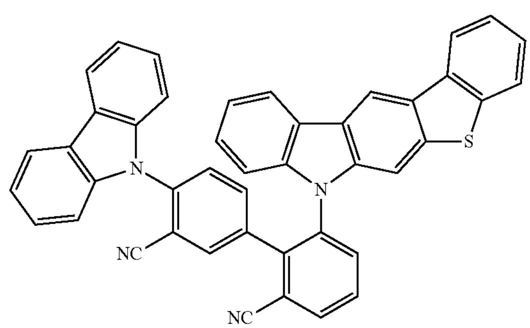
316
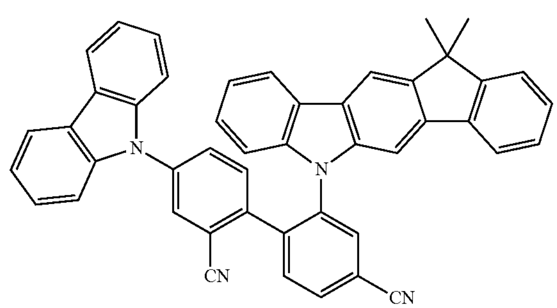

-continued
317
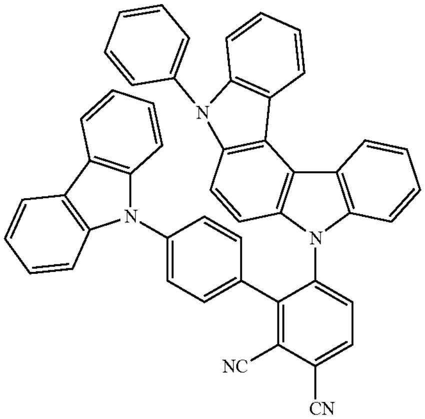
318
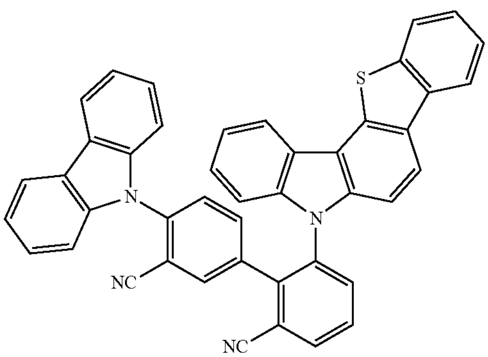
319
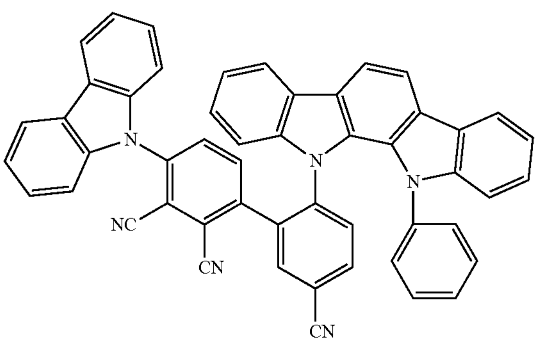
320
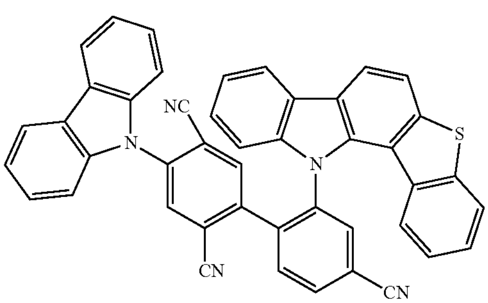
-continued
321
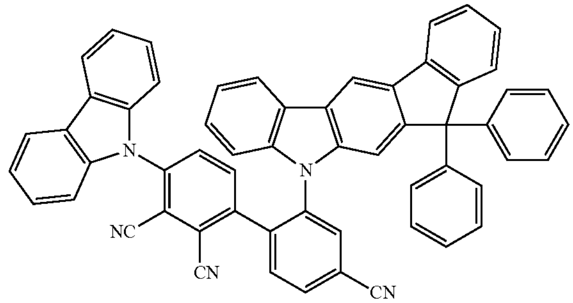
322
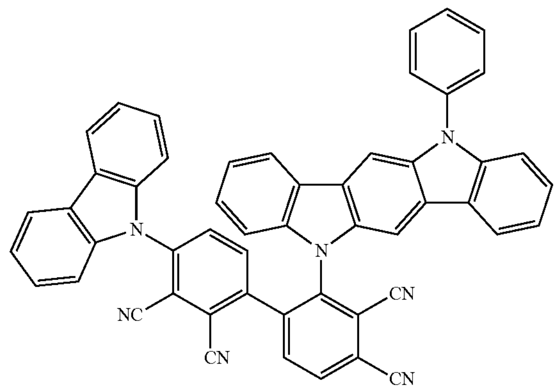
323
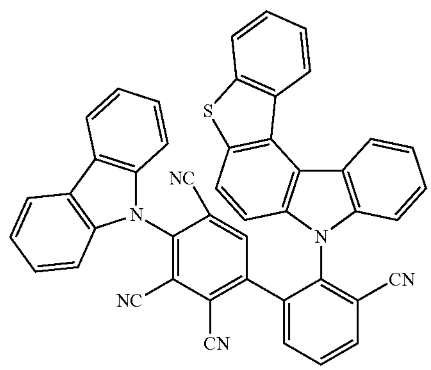
324
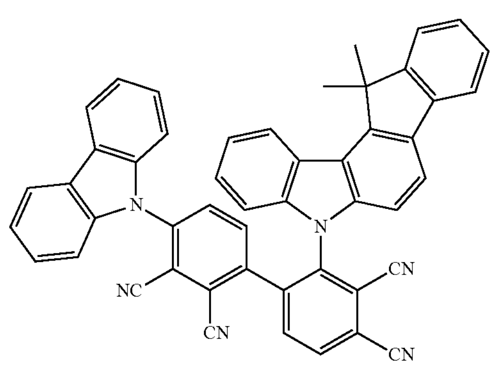

-continued
325
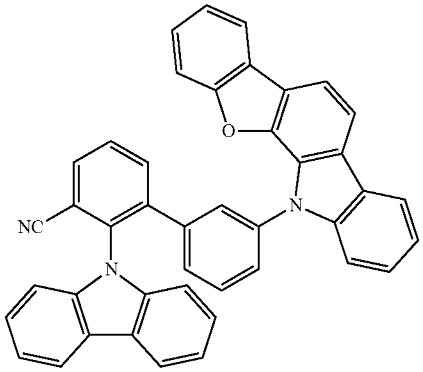
326
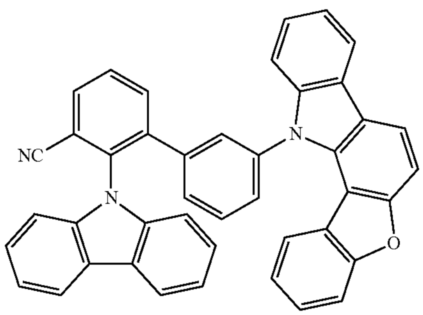
327
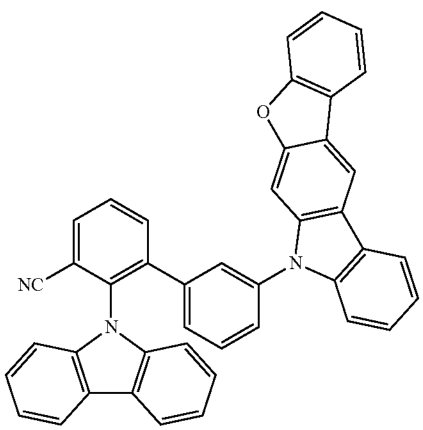
328
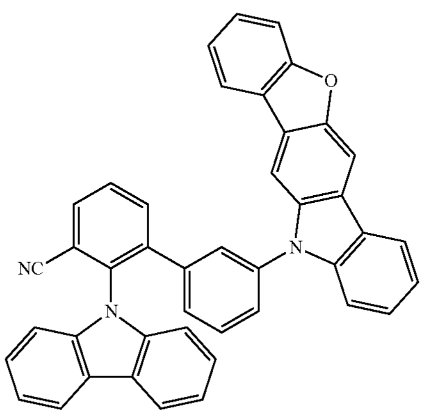
-continued
329
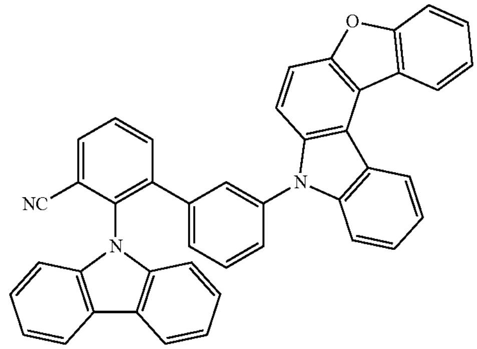
330
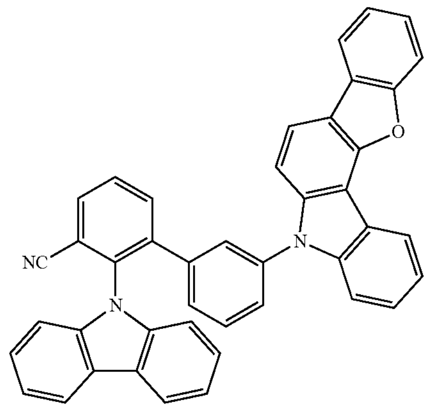
331
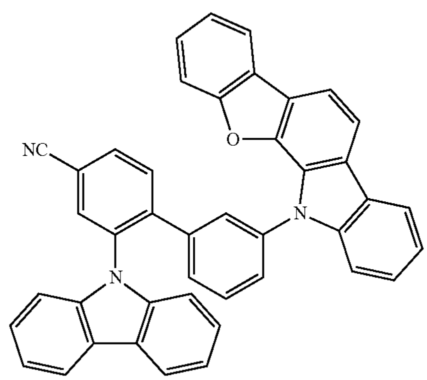
332
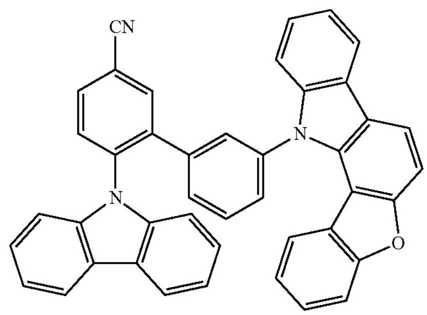

-continued
333
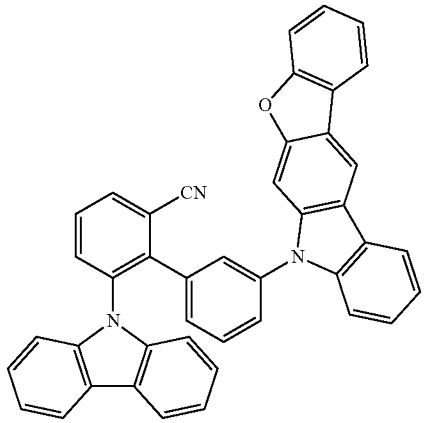
334
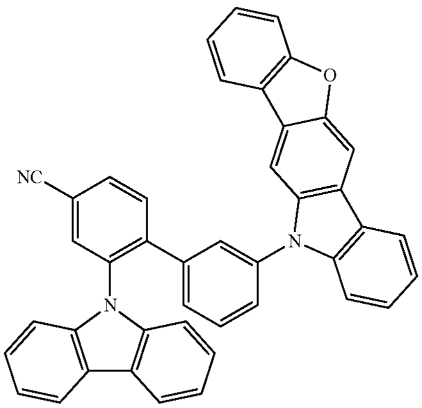
335
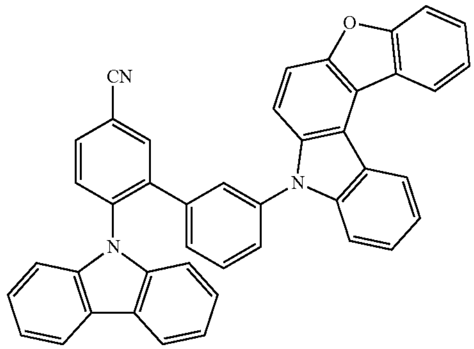
336
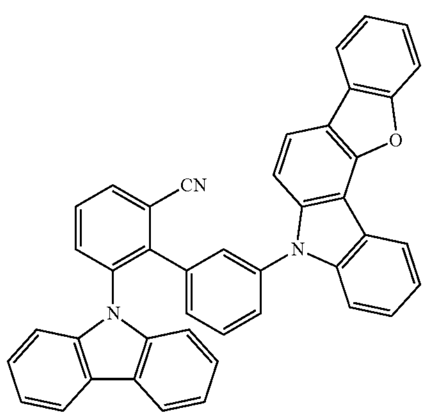
-continued
337
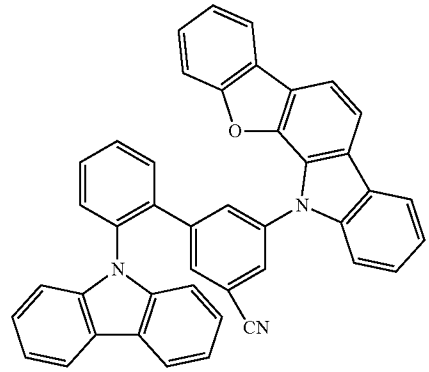
338
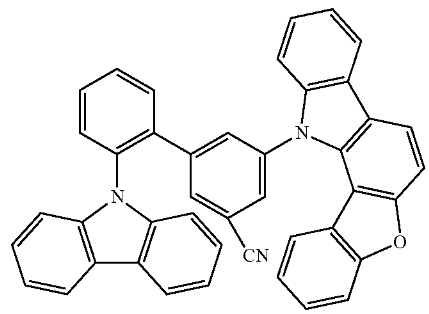
339
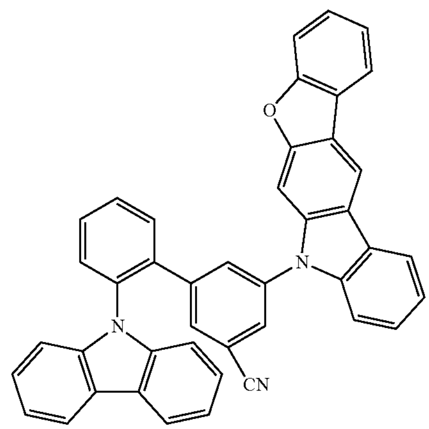
340
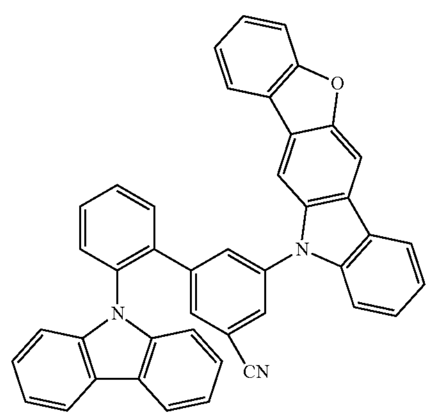

-continued
341
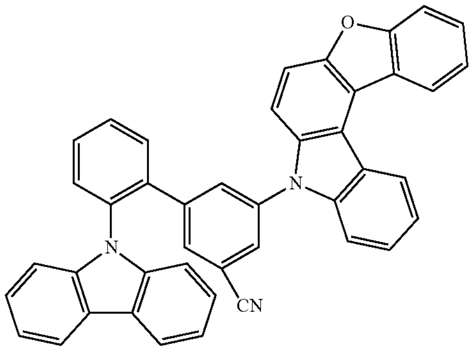
342
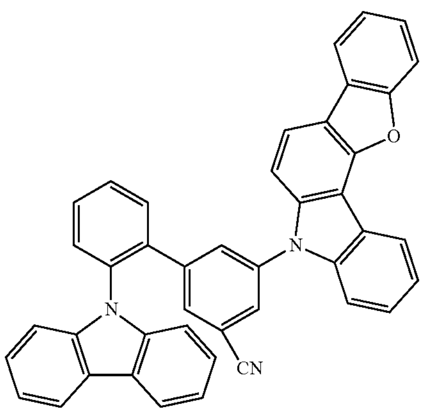
343
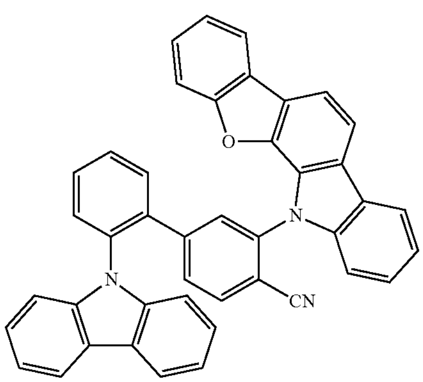
344
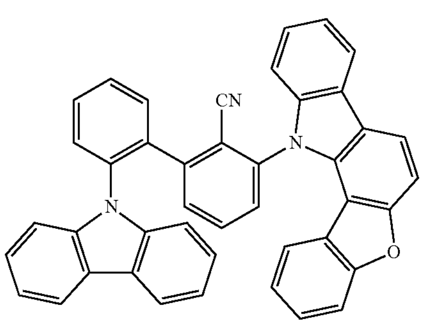
-continued
345
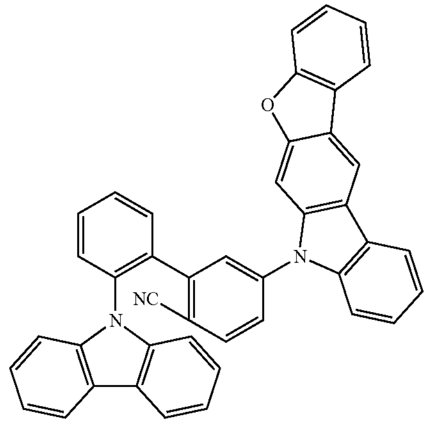
346
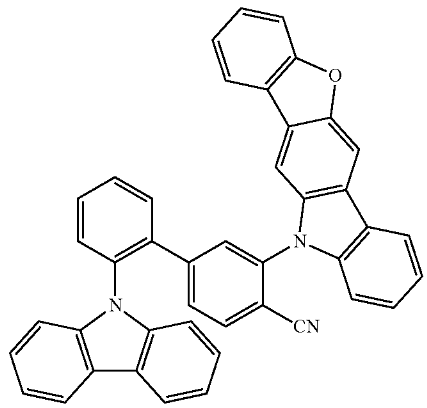
347
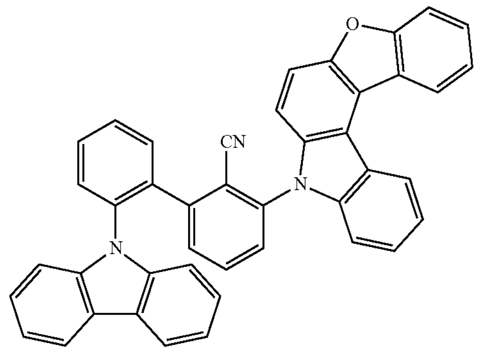
348
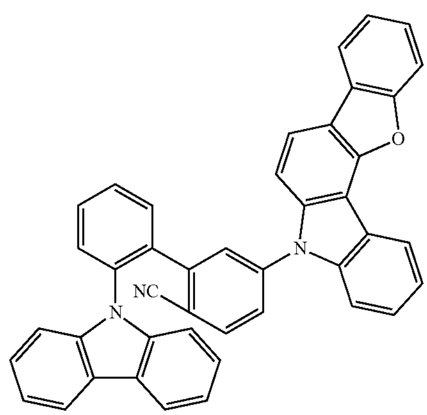

-continued
349
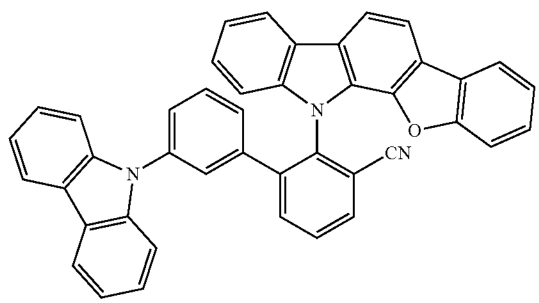
350
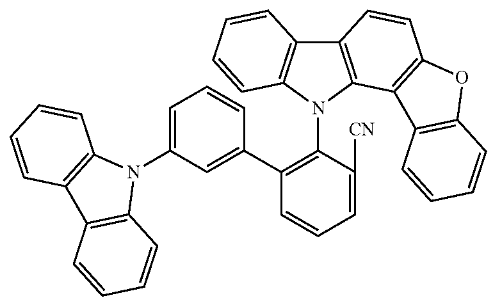
351
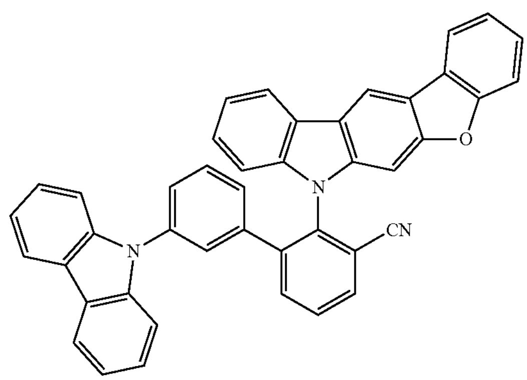
352
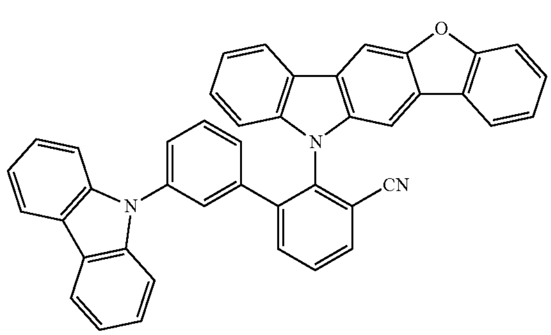
-continued
353
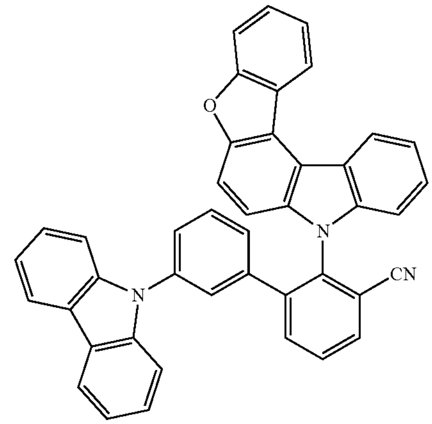
354
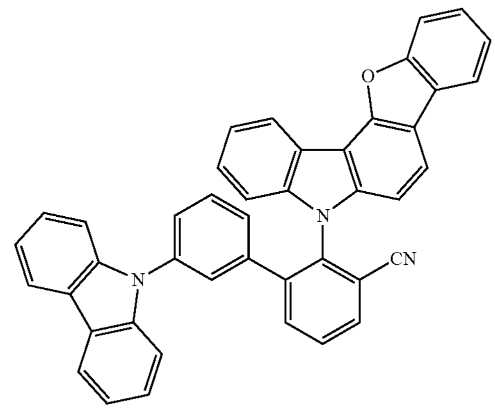
355
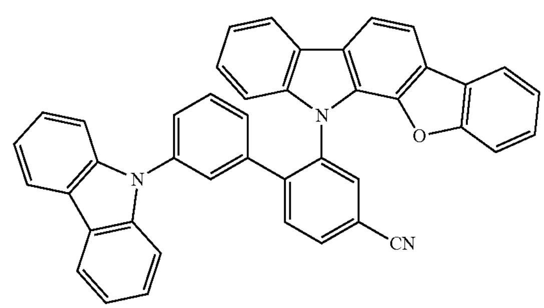
356
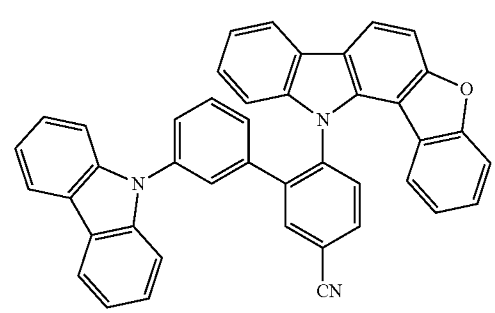

-continued
357
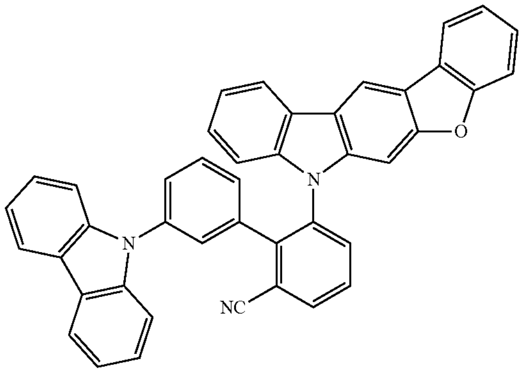
358
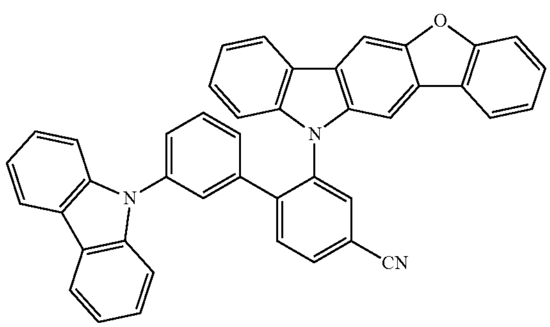
359
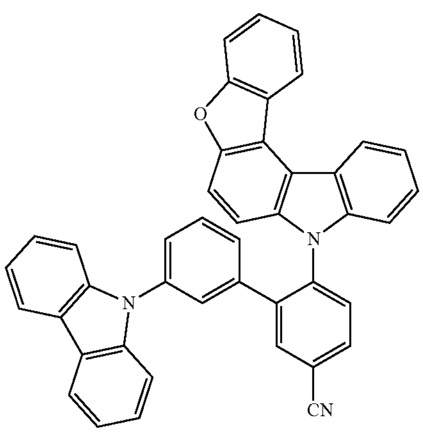
360
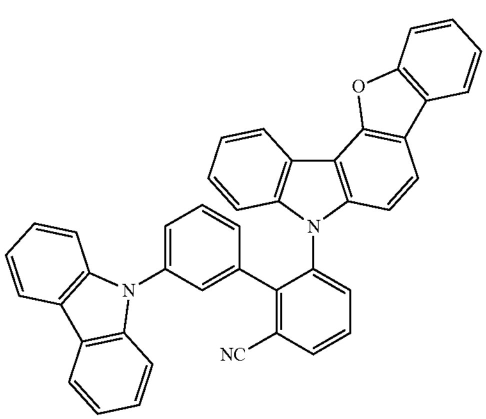
-continued
361
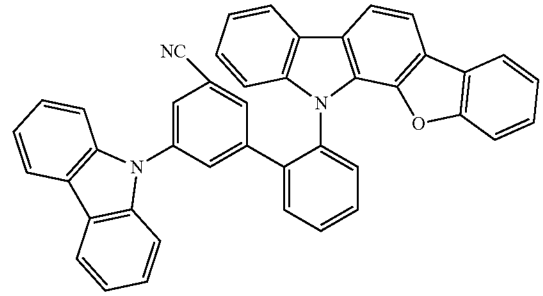
362
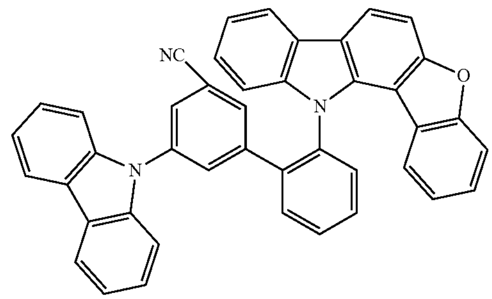
363
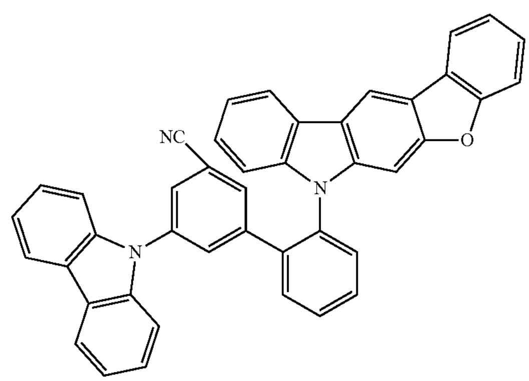
364
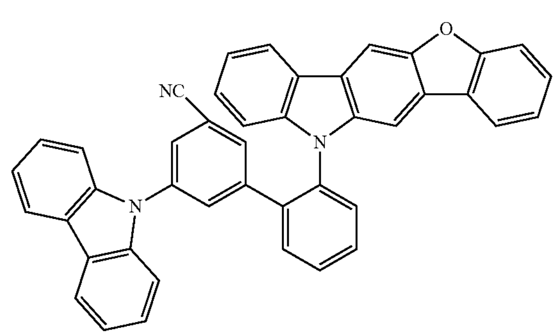

-continued
365
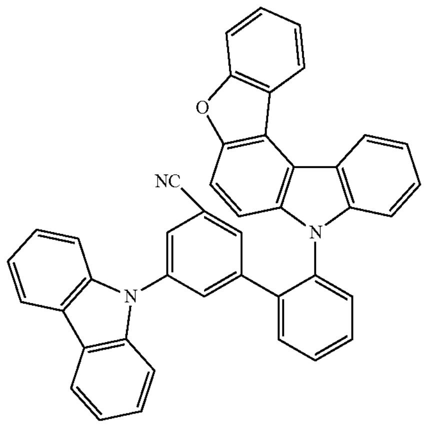
366
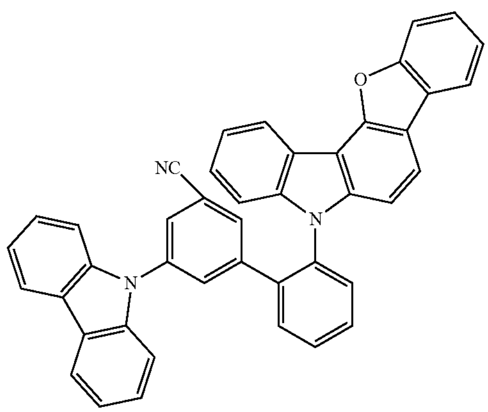
367
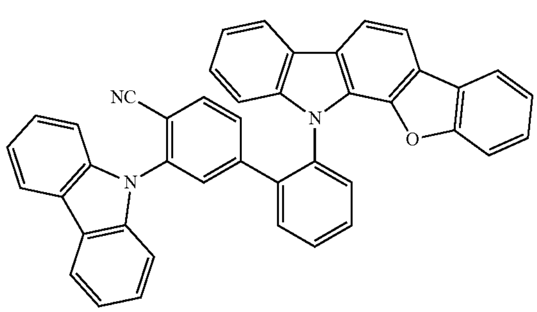
368
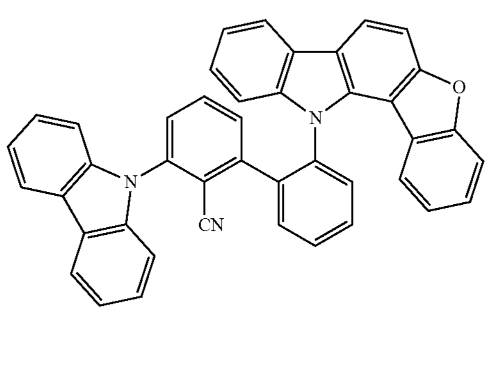
369
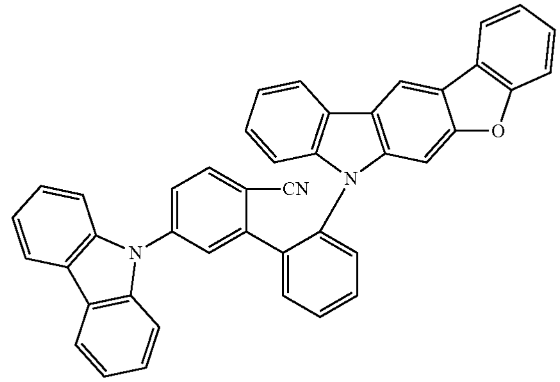
370
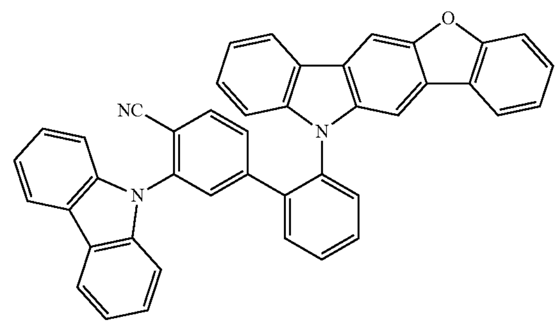
371
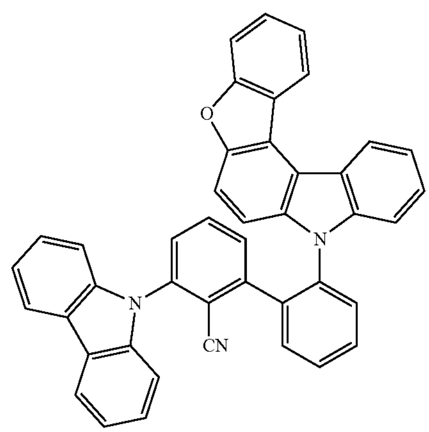
372
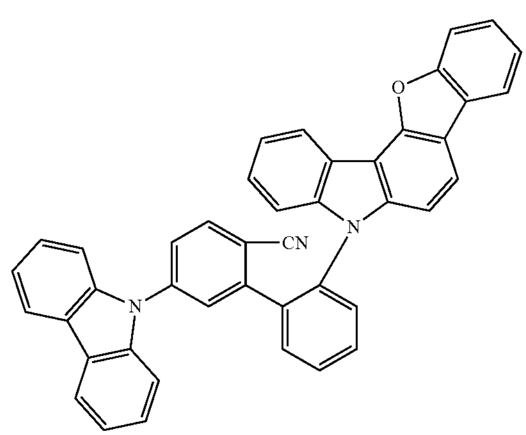

-continued
373
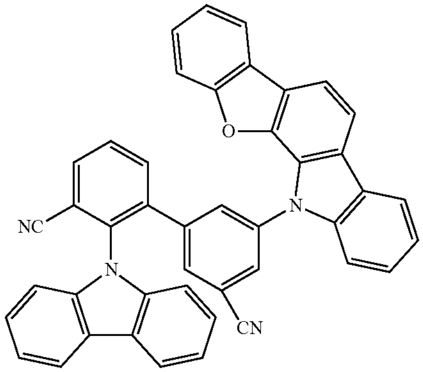
374
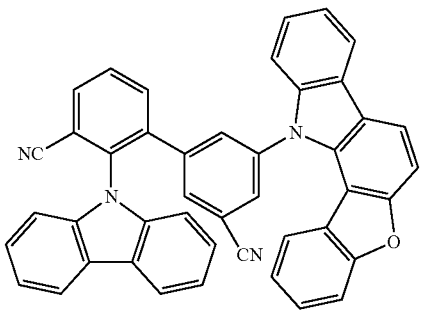
375
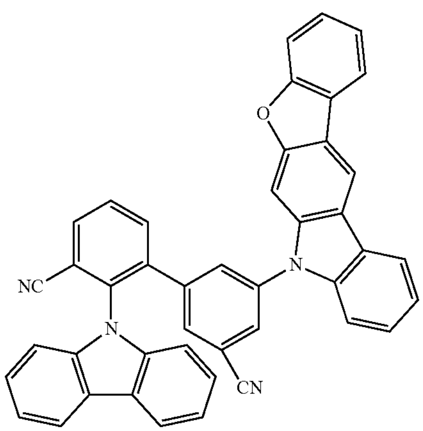
376
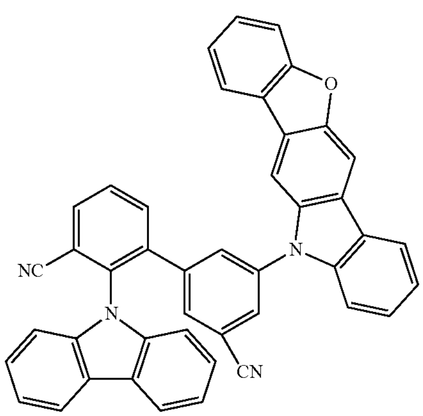
-continued
377
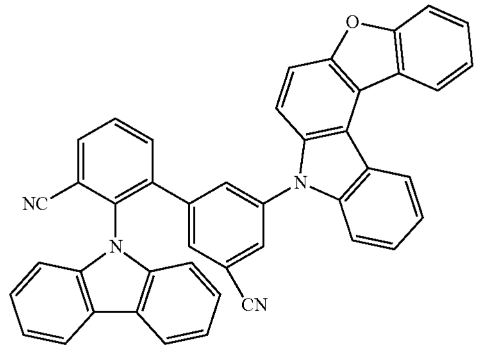
378
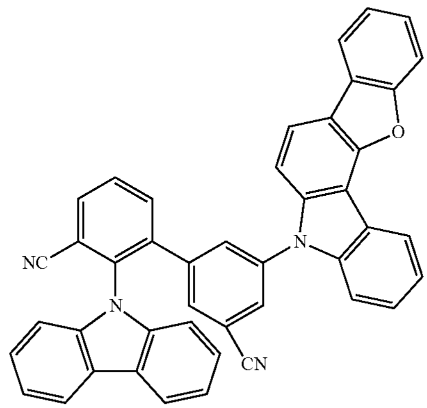
379
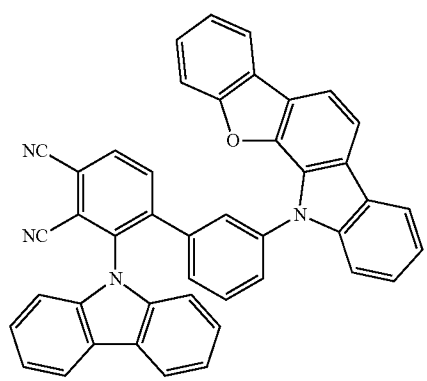
380
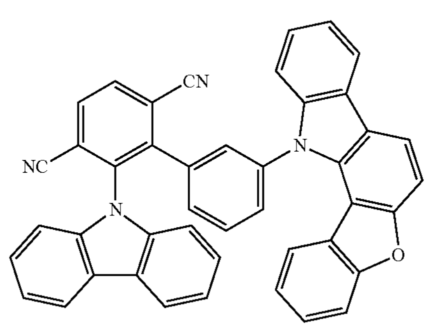

381
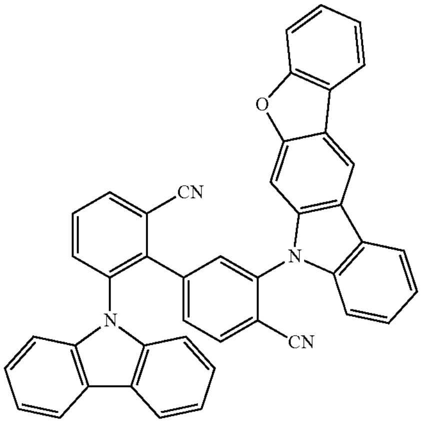
382
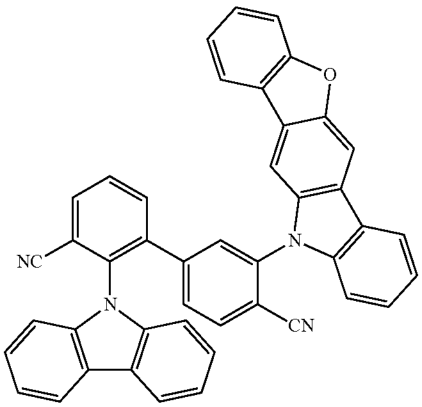
383
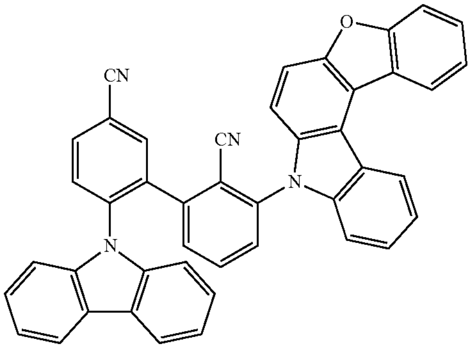
384
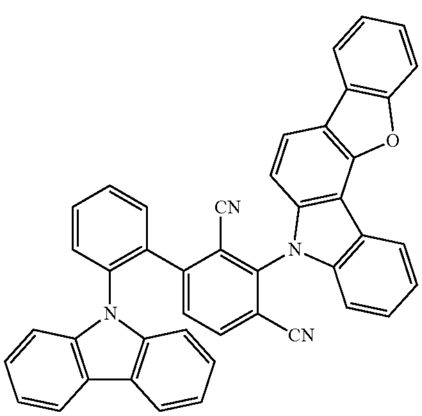
385
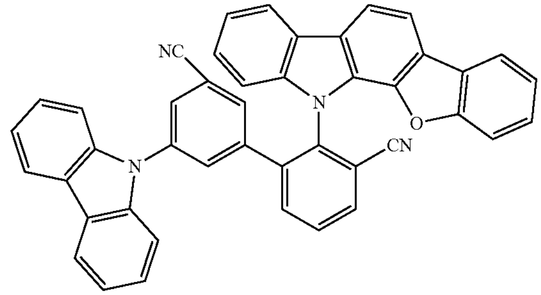
386
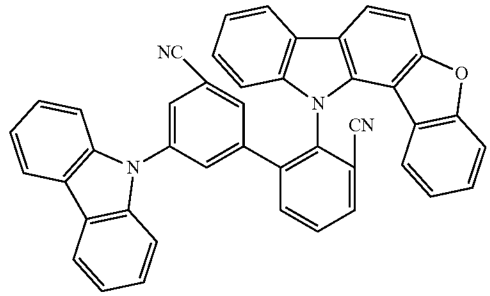
387
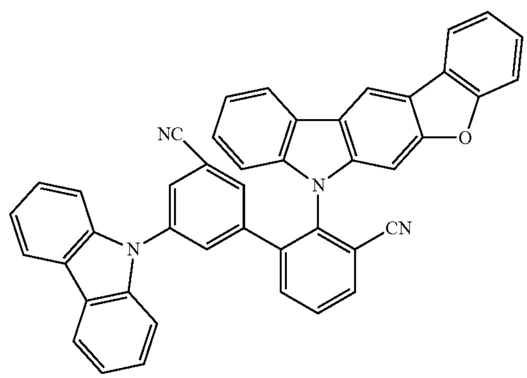
388
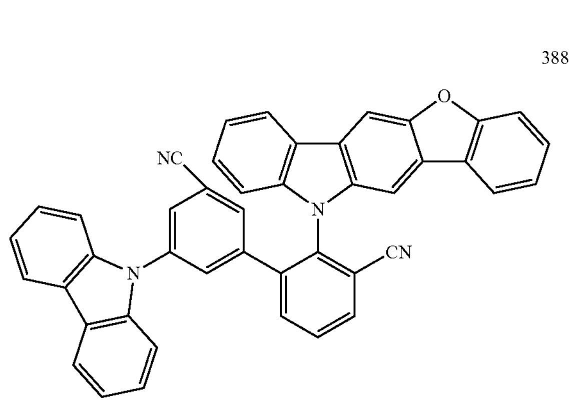

-continued
389
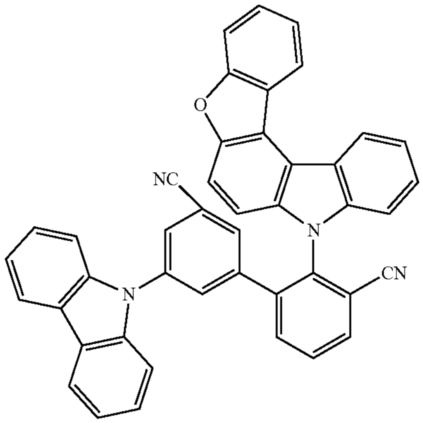
390
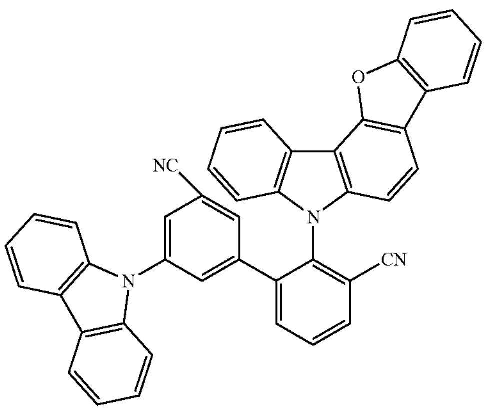
391
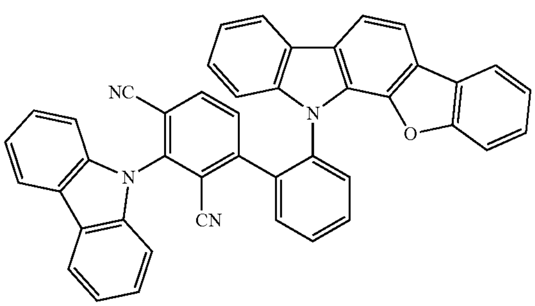
392
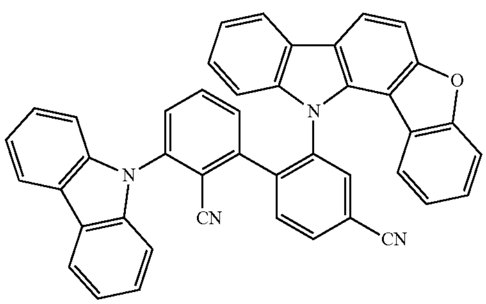
-continued
393
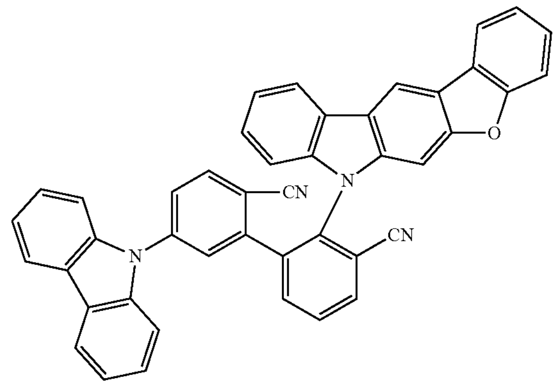
394
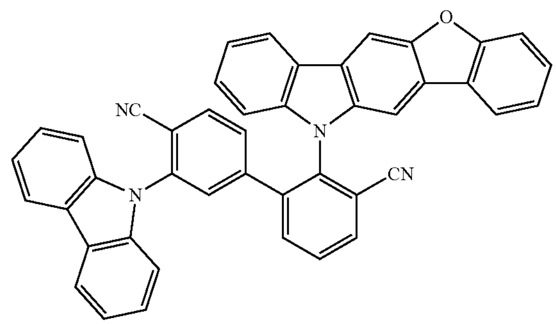
395
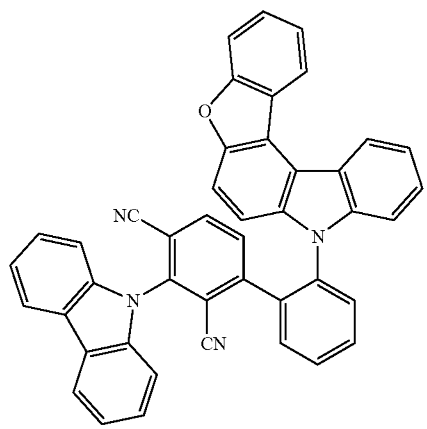
396
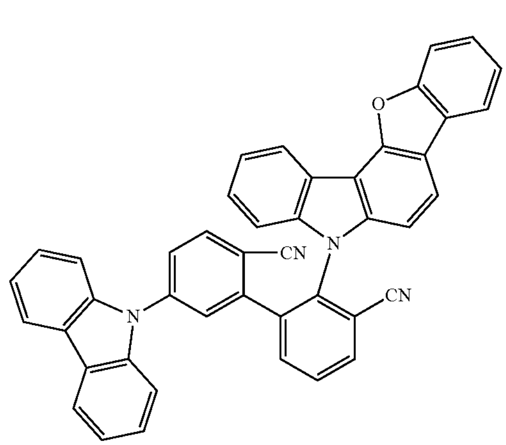

-continued
397
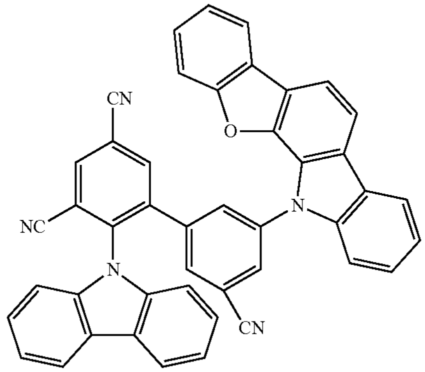
398
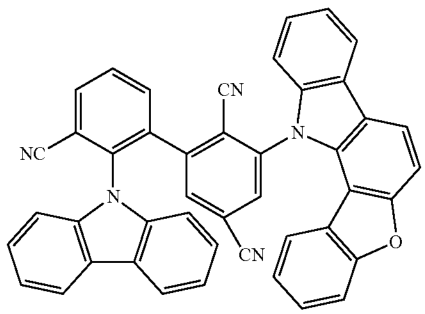
399
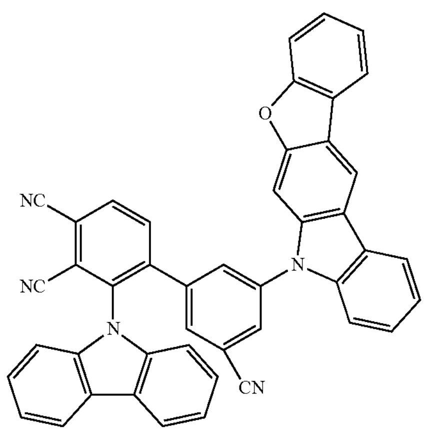
400
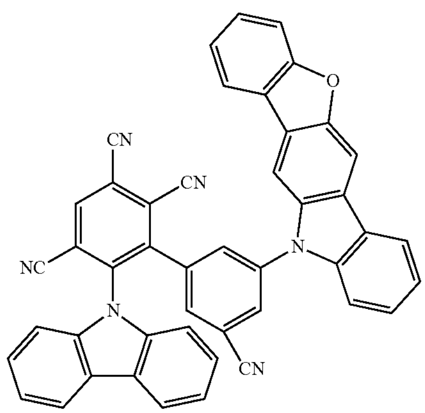
-continued
401
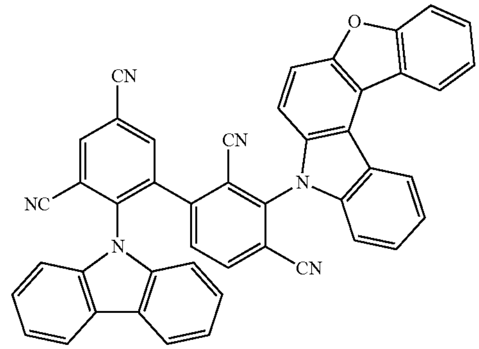
402
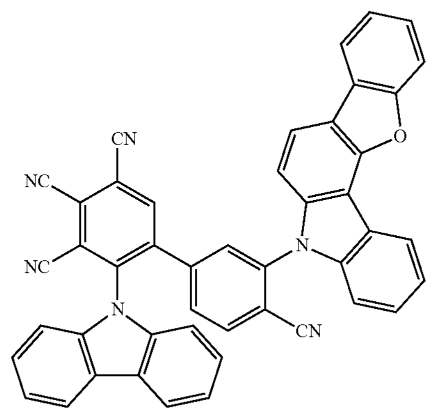
403
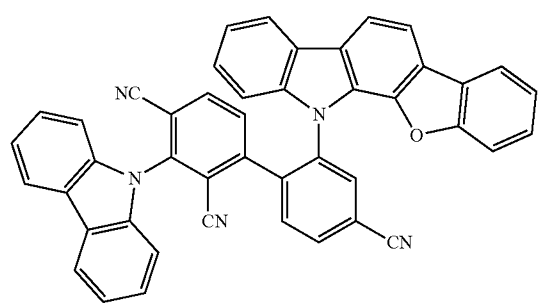
404
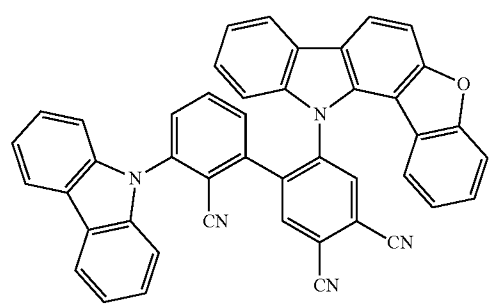

-continued
405
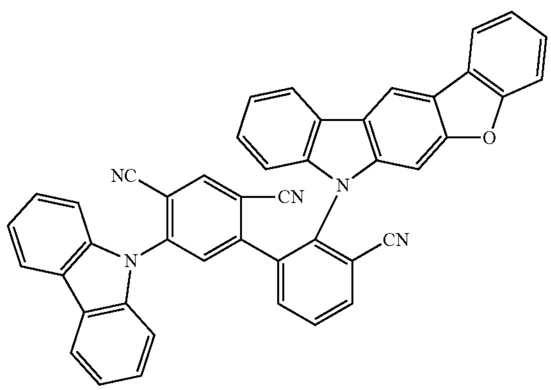
406
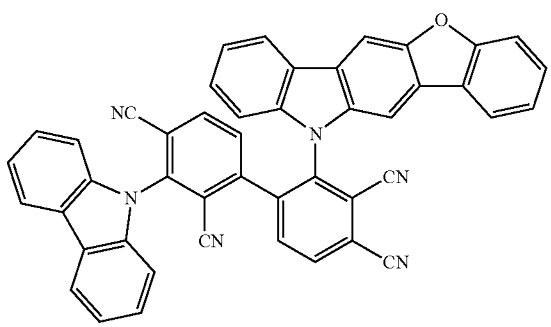
407
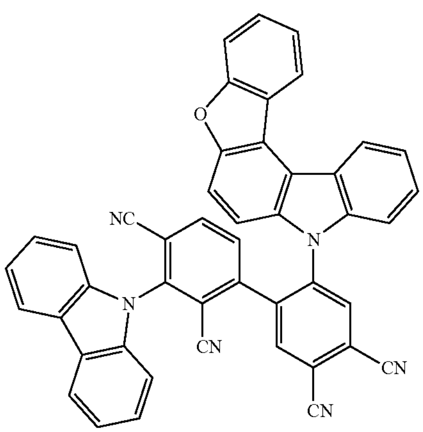
408
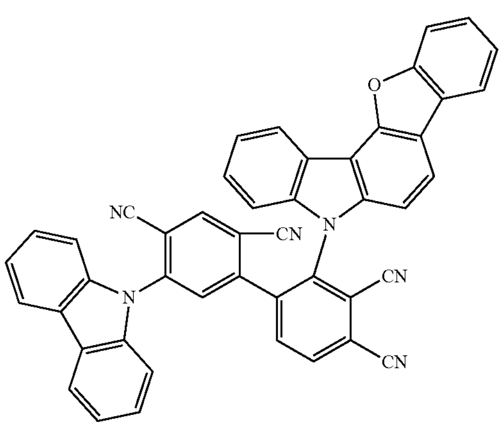
-continued
409
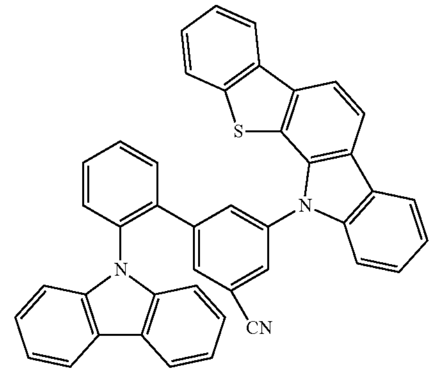
410
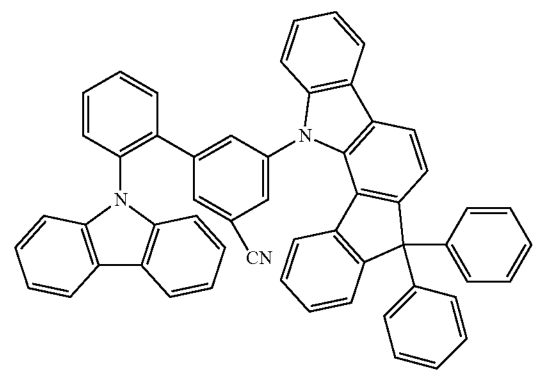
411
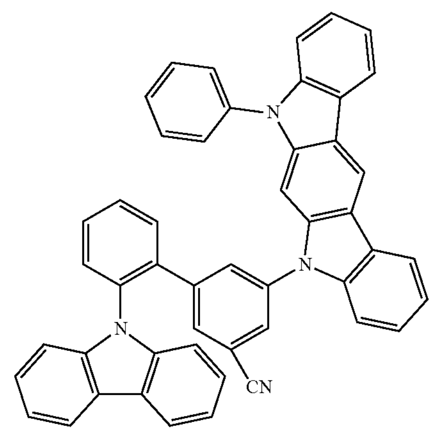
412
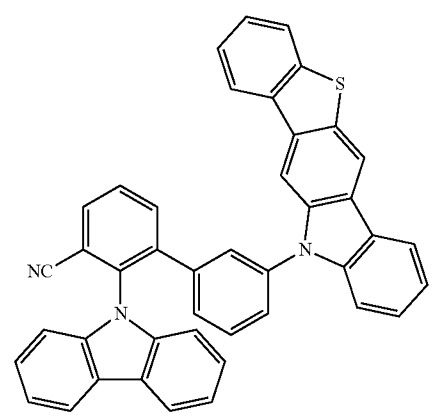

-continued
413
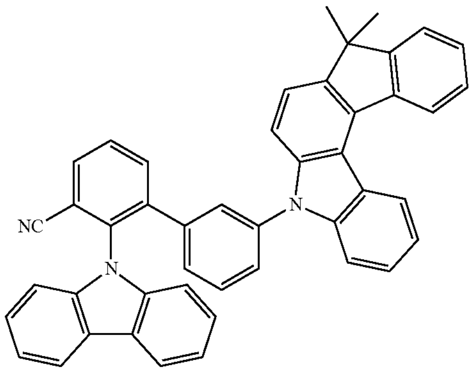
414
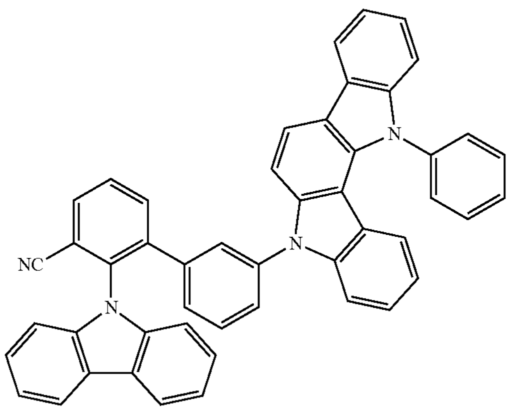
415
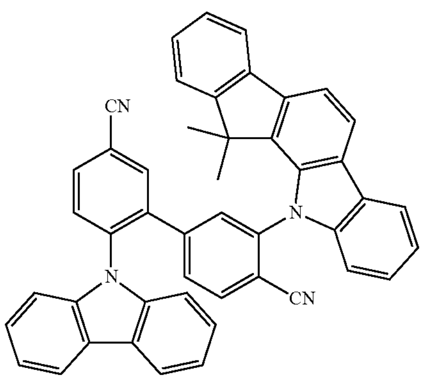
416
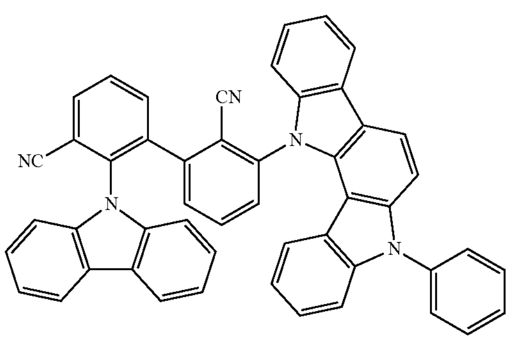
-continued
417
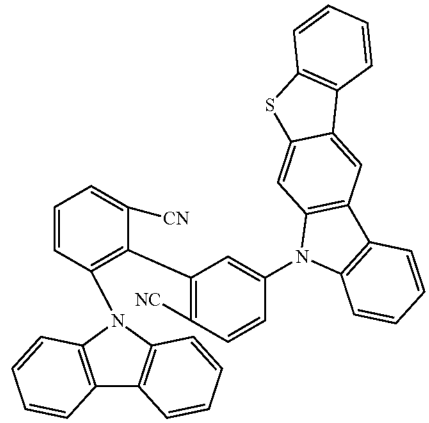
418
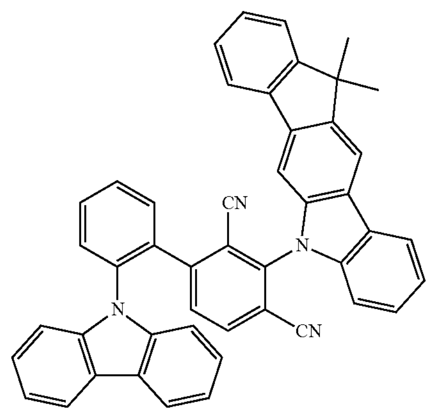
419
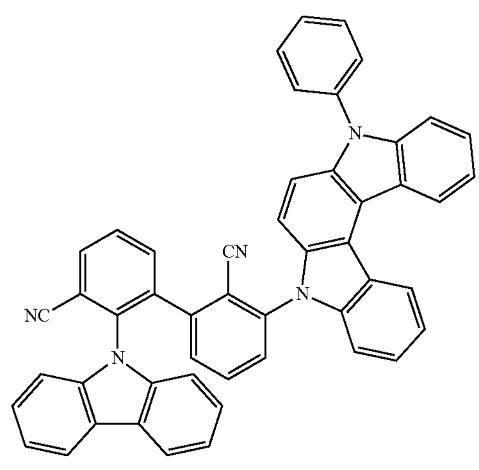

-continued
420
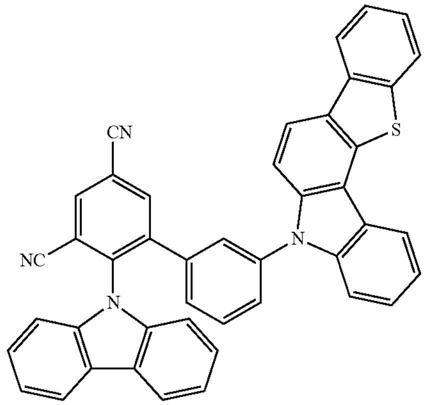
421
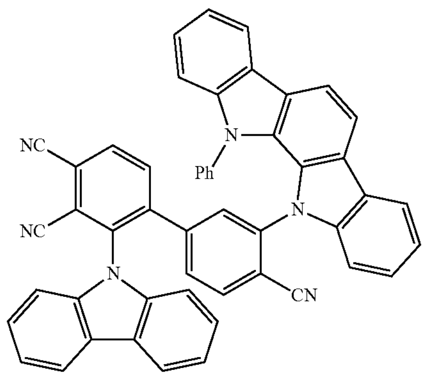
422
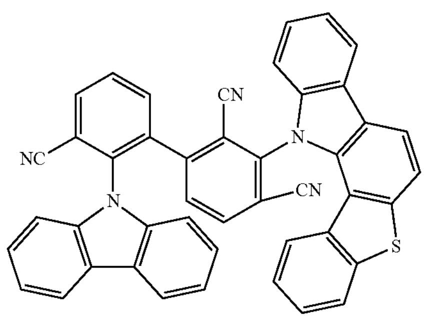
423
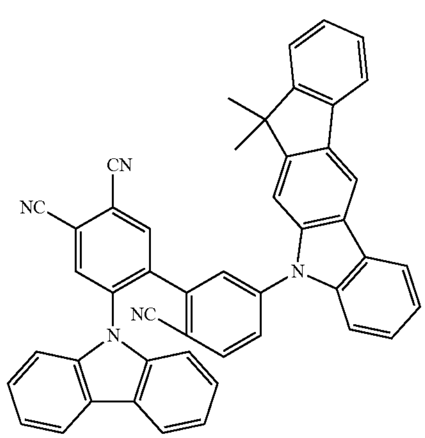
-continued
424
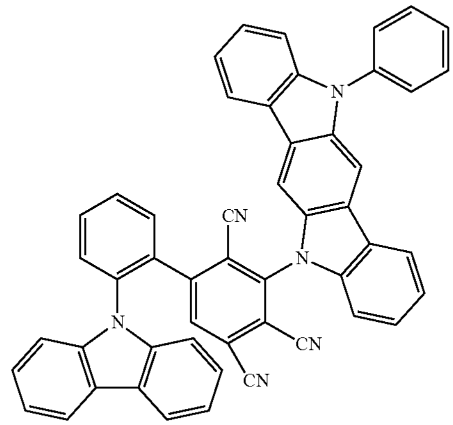
425
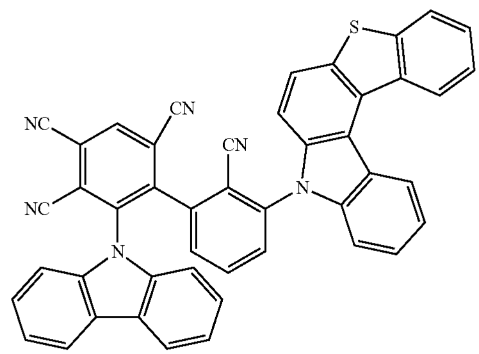
426
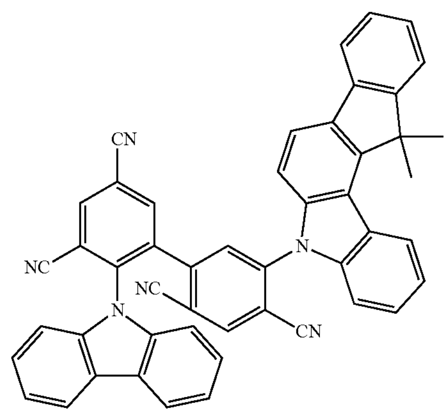
427
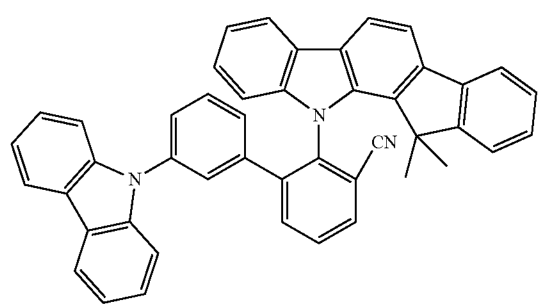

-continued
428
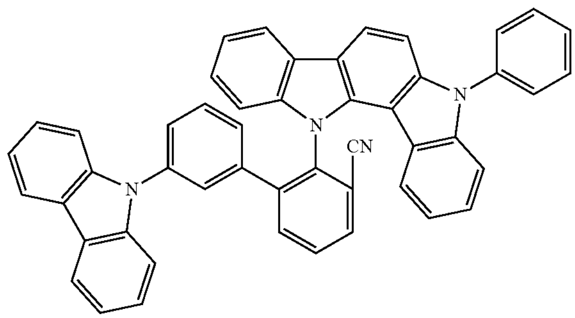
429
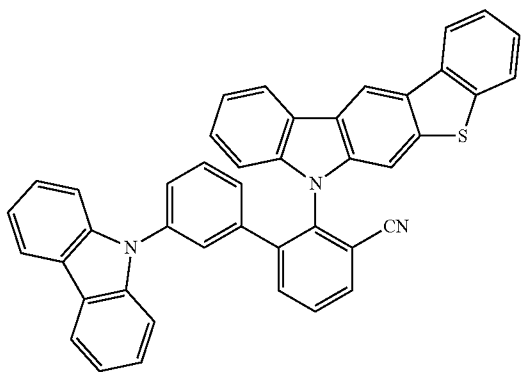
430
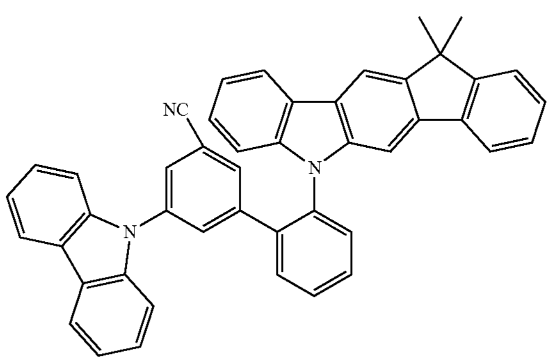
431
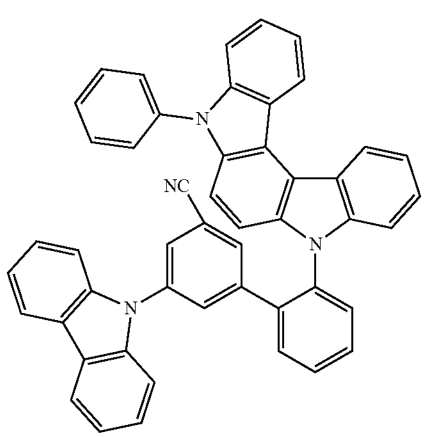
-continued
432
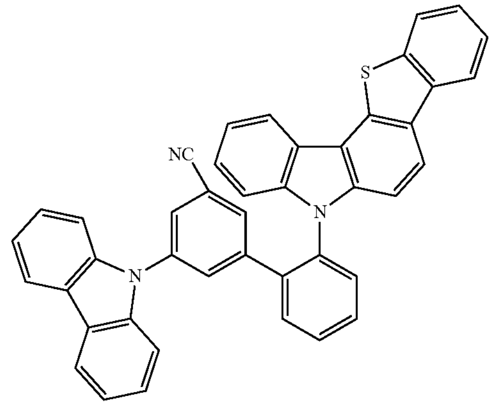
433
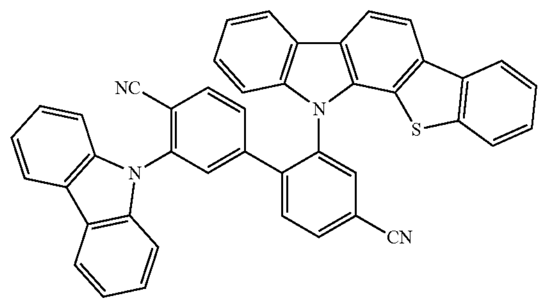
434
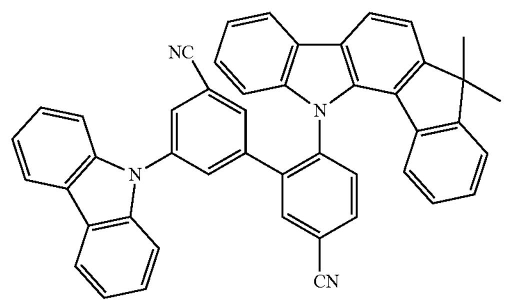
435
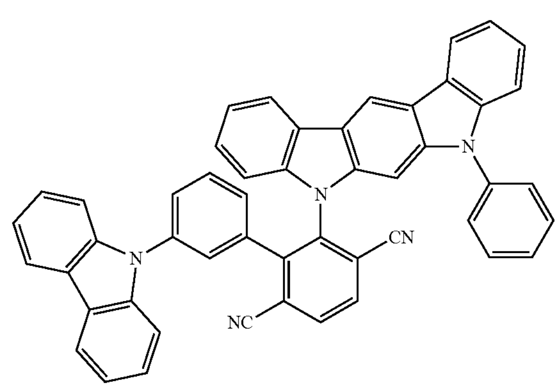

436
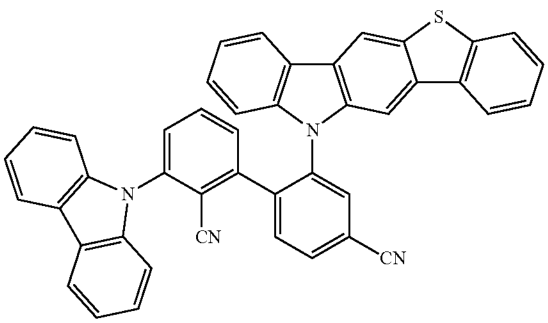
437
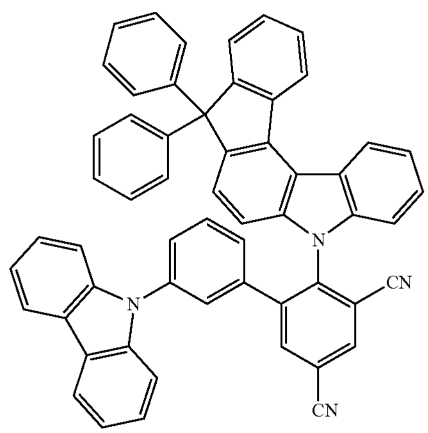
438
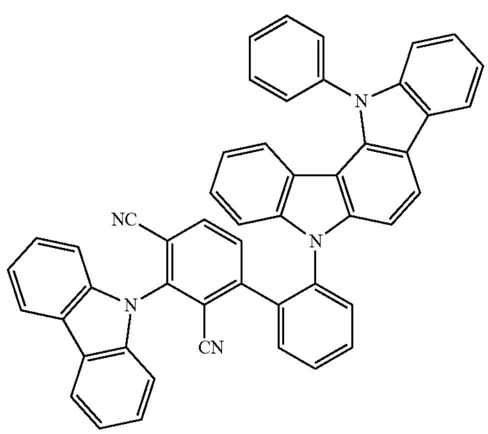
439
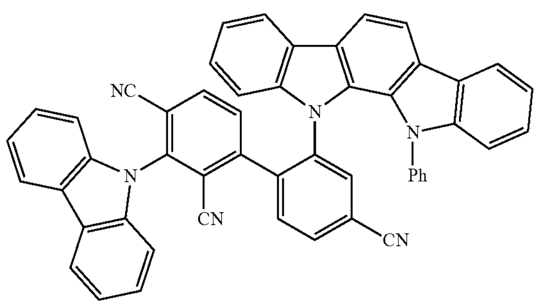
440
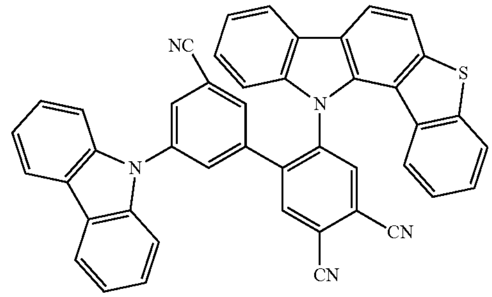
441
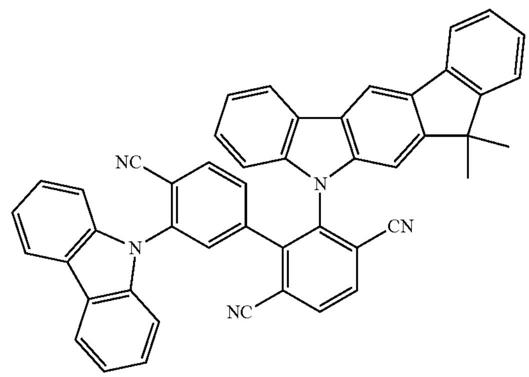
442
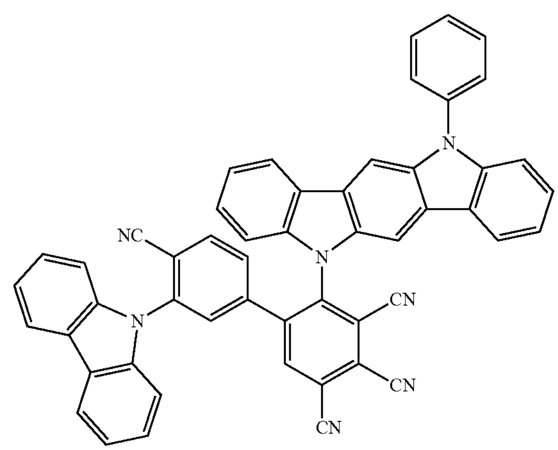
443
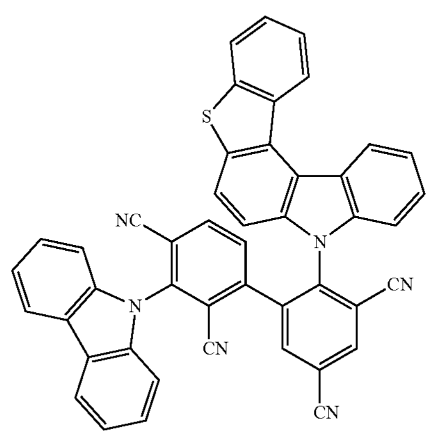

-continued
444
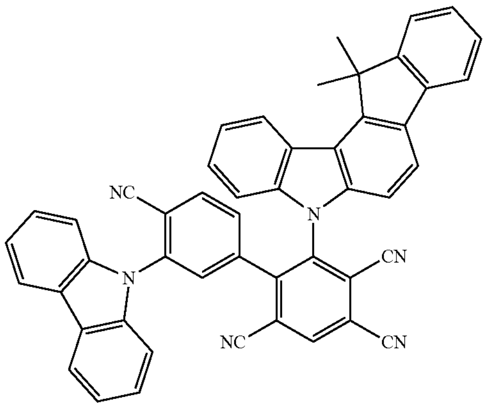
445
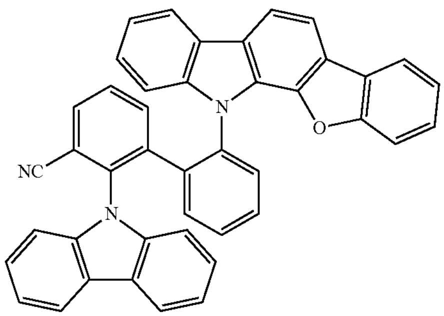
446
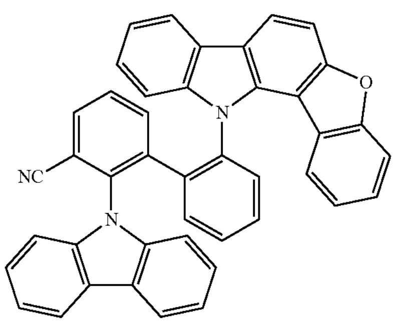
447
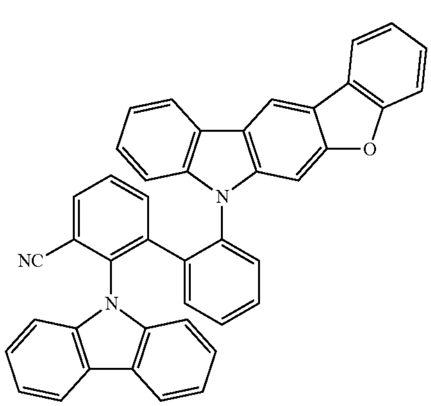
-continued
448
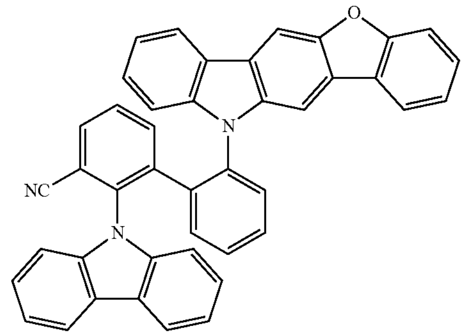
449
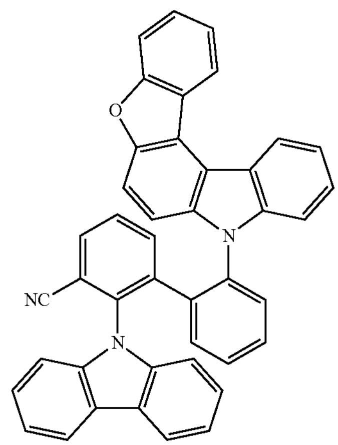
450
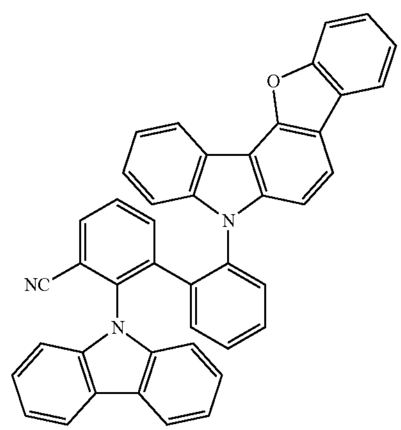
451
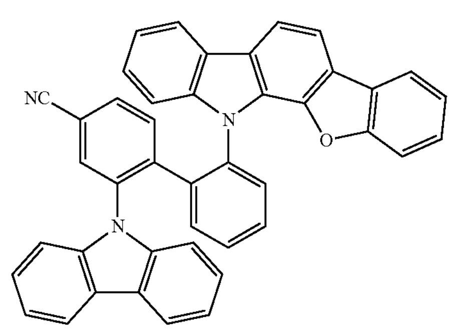

-continued
452
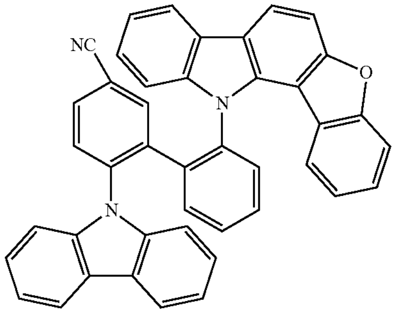
453
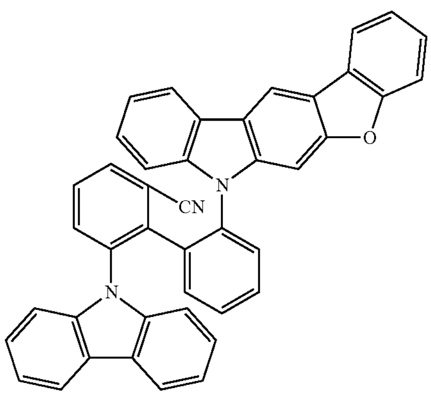
454
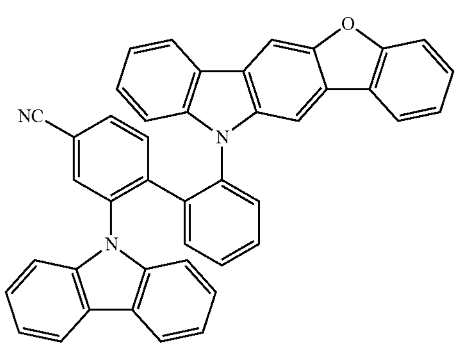
455
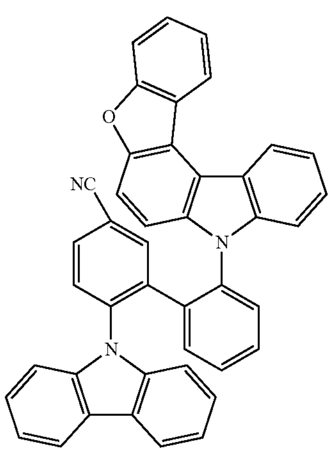
-continued
456
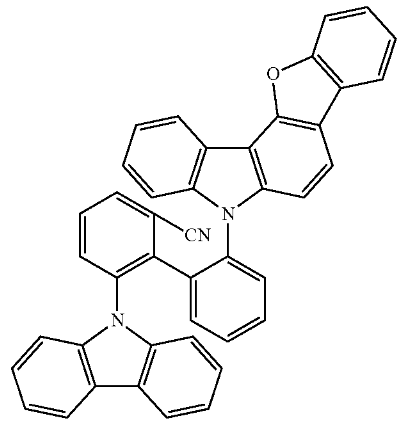
457
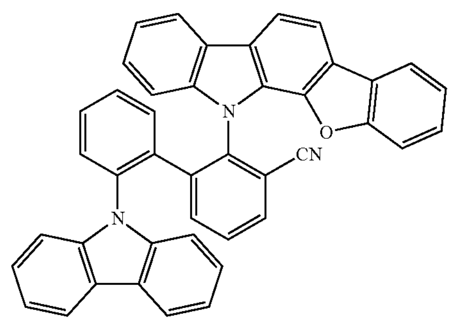
458
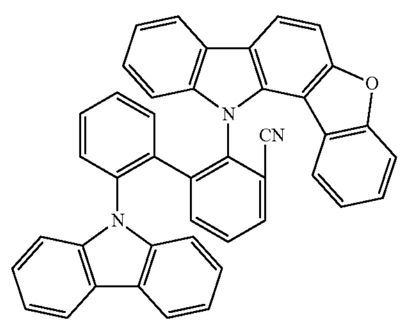
459
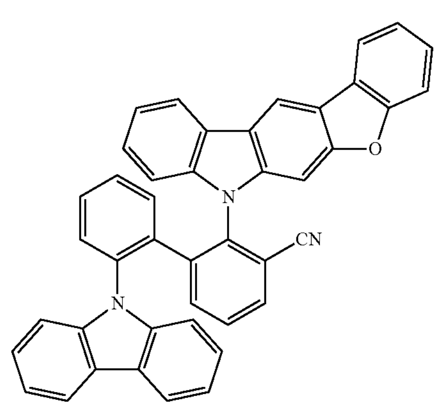

-continued
460
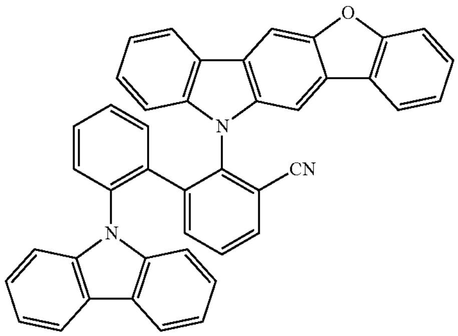
461
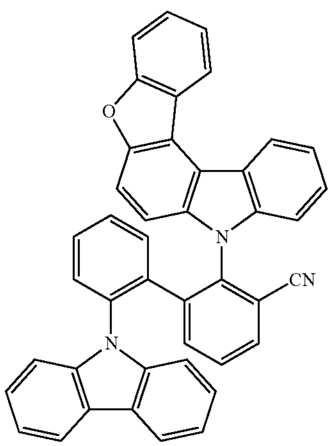
462
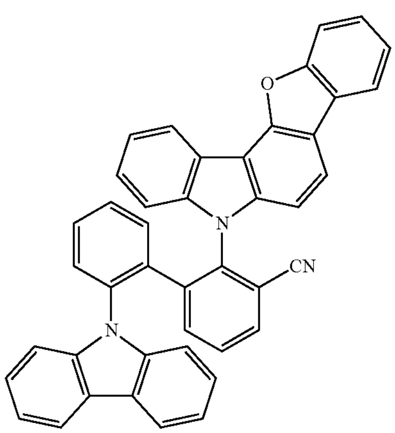
-continued
463
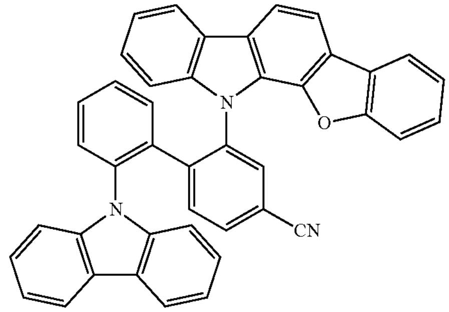
464
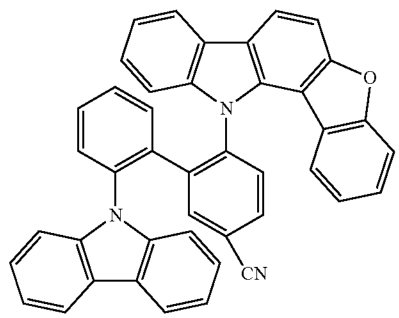
465
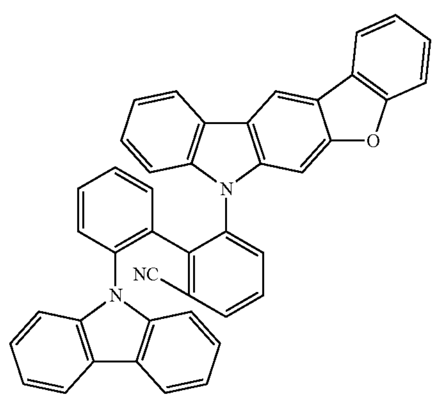
466
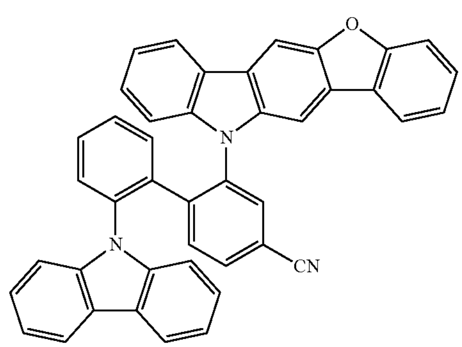

-continued
467
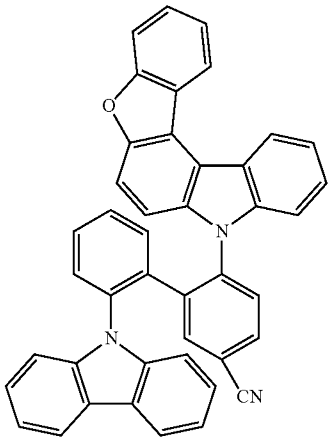
468
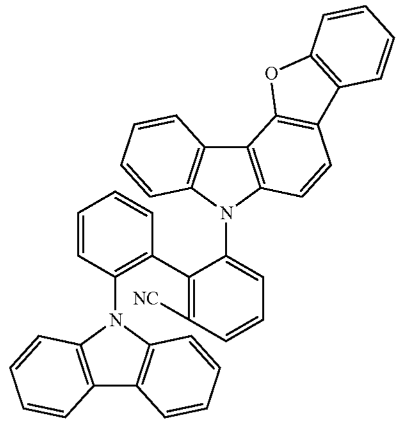
469
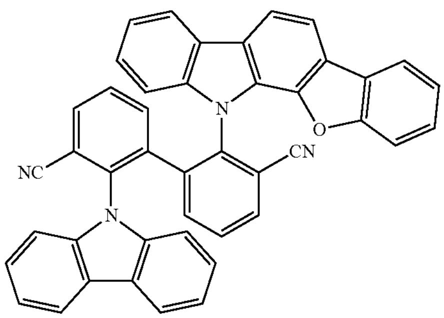
470
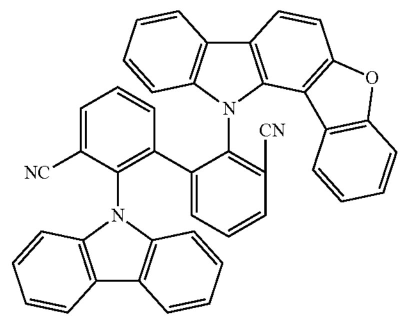
471
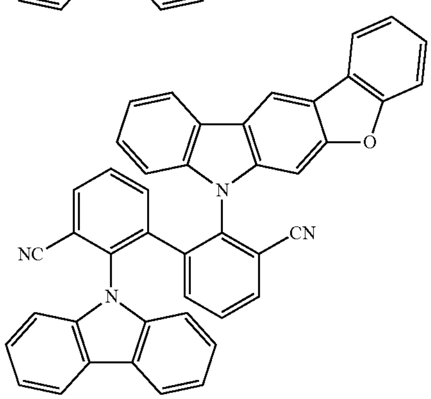
472
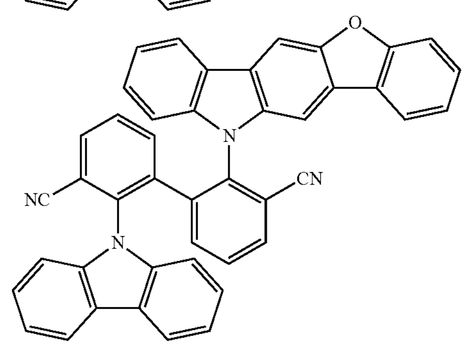
473
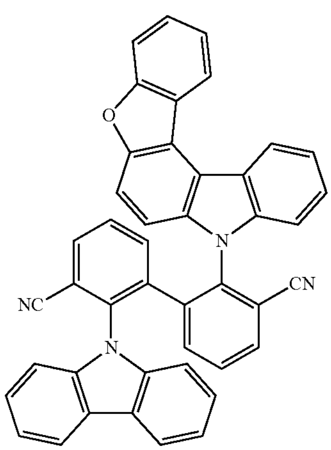
474
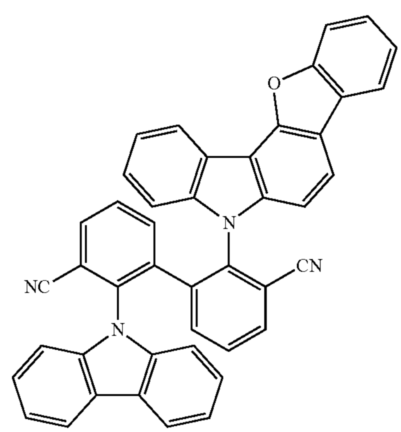

-continued
475
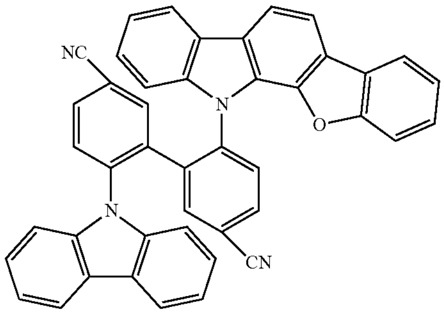
476
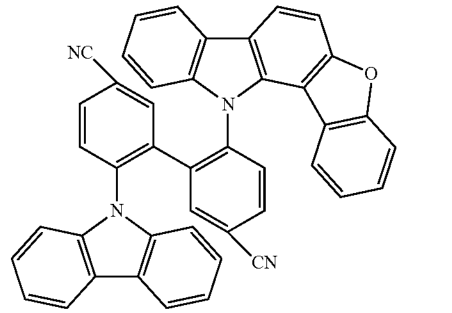
477
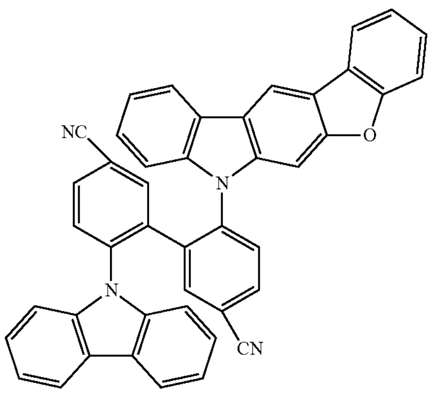
478
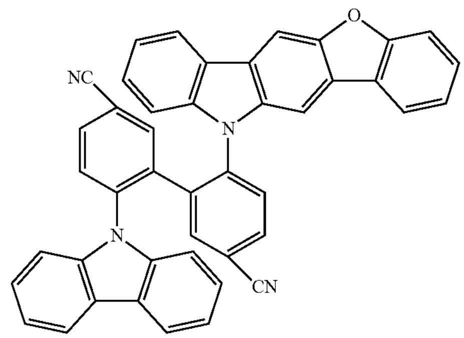
479
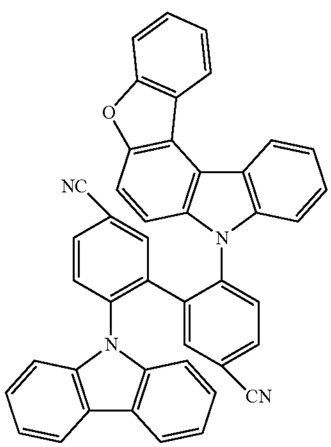
480
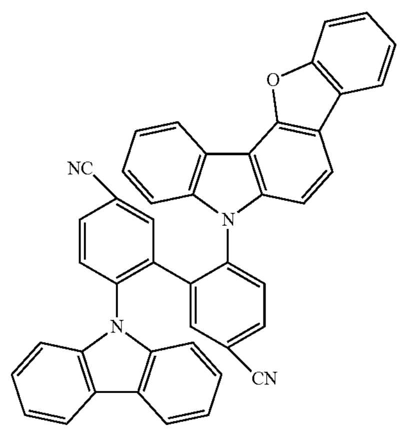
481
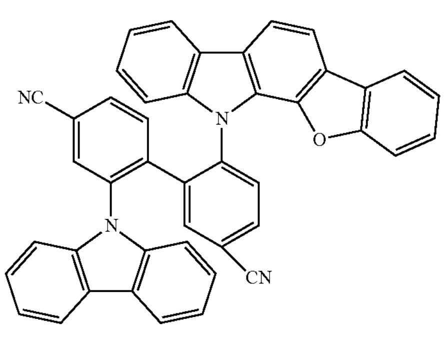
482
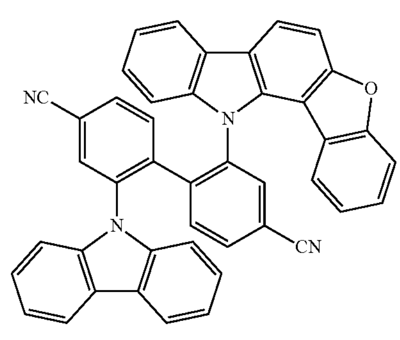

-continued
483
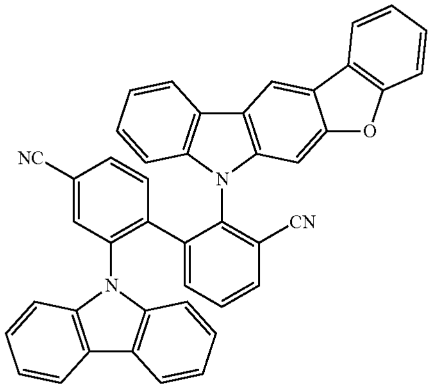
484
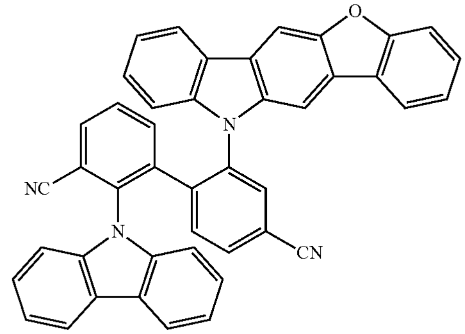
485
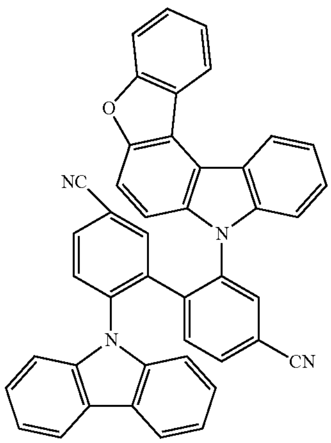
486
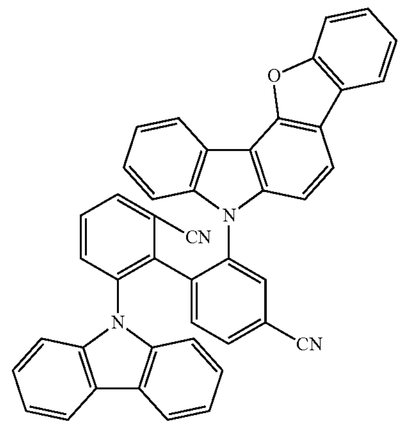
487
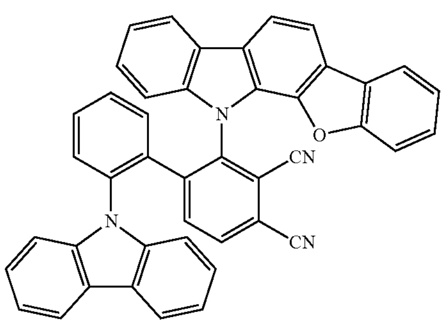
488
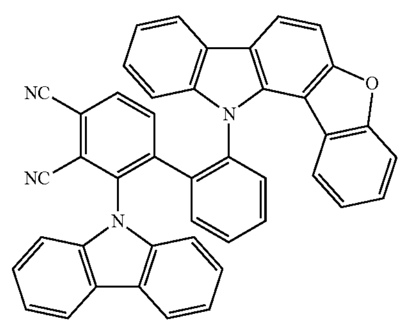
489
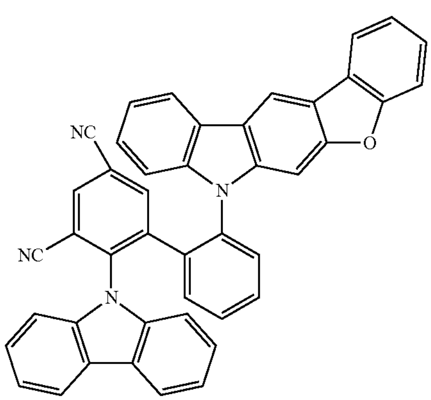
490
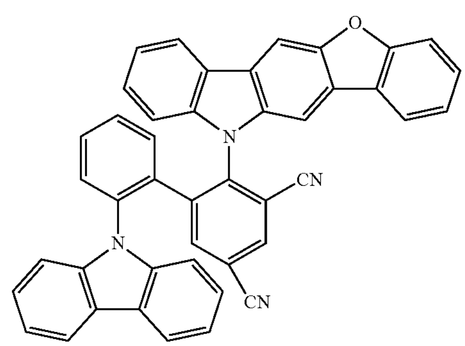

-continued
491
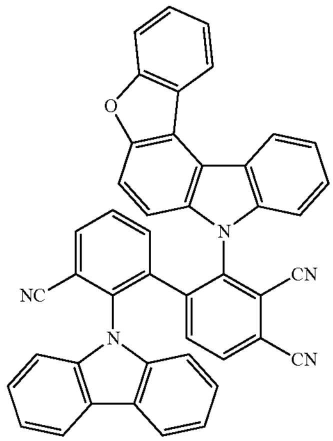
492
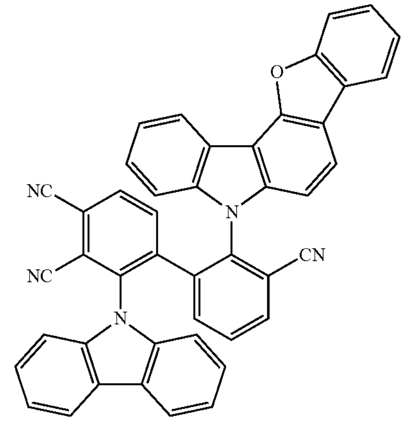
493
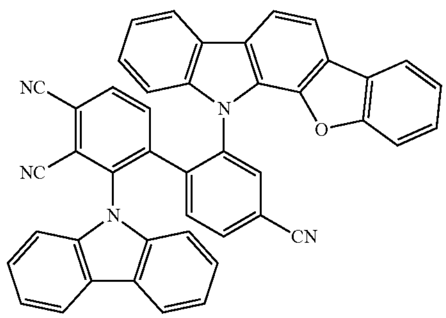
494
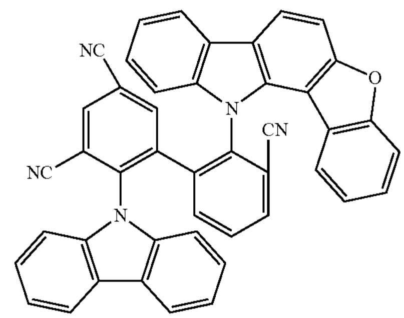
495
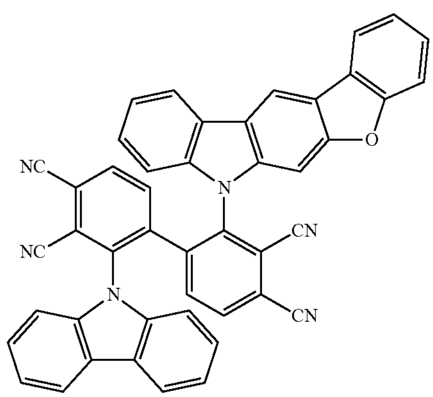
496
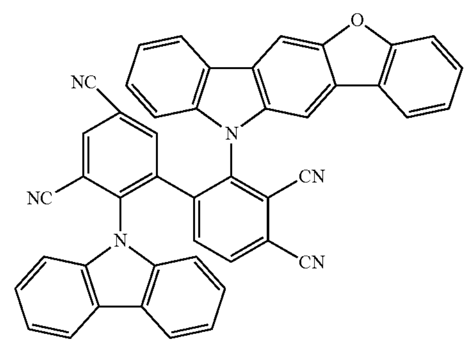
497
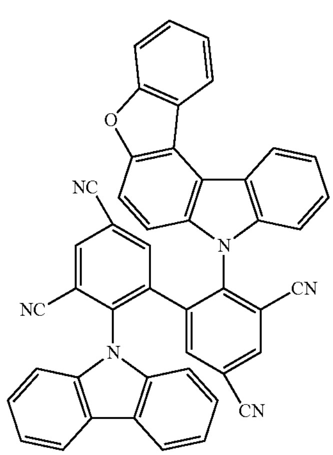
498
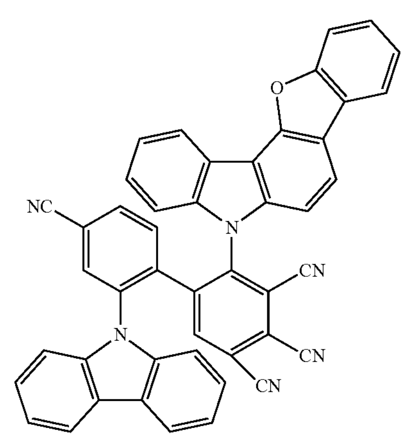

-continued
499
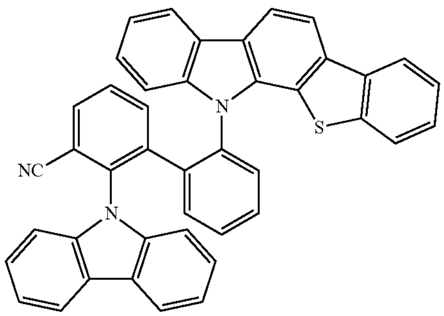
500
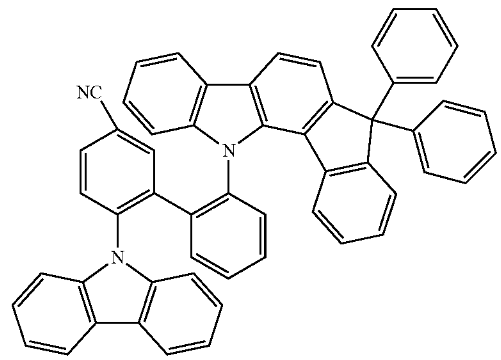
501
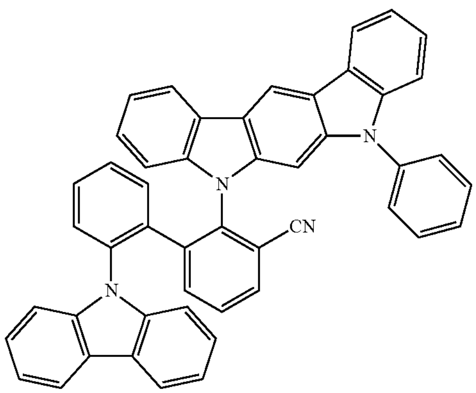
502
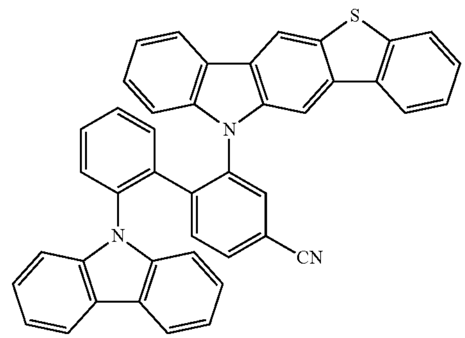
503
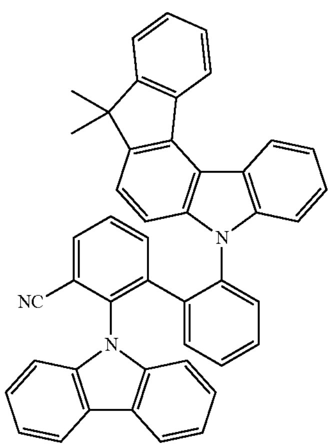
504
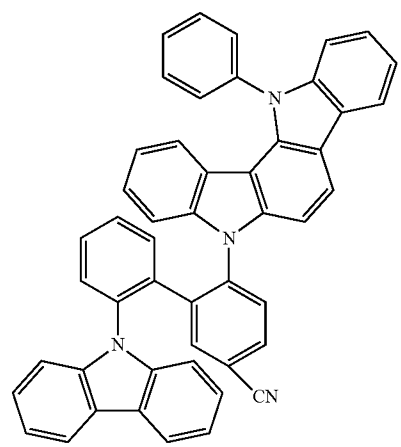
505
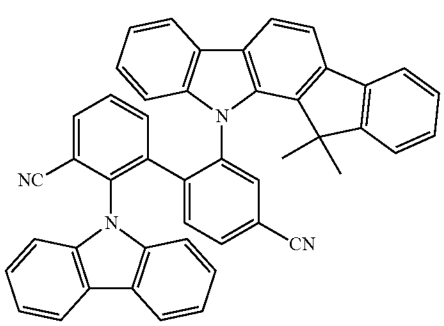
506
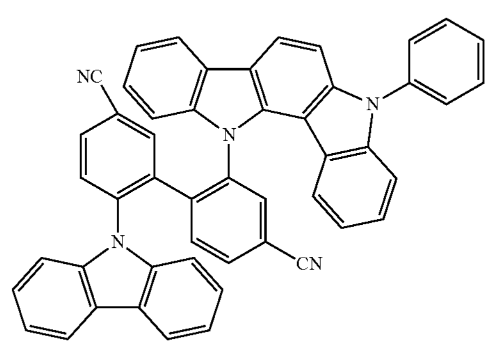

-continued
507
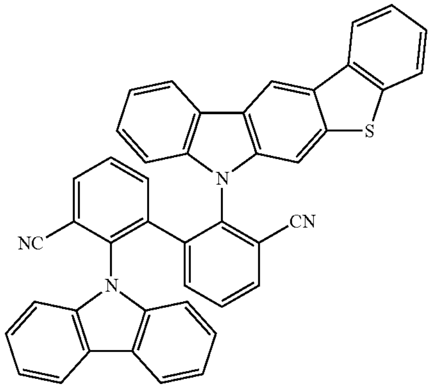
508
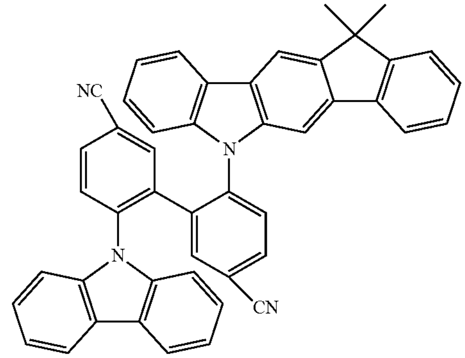
509
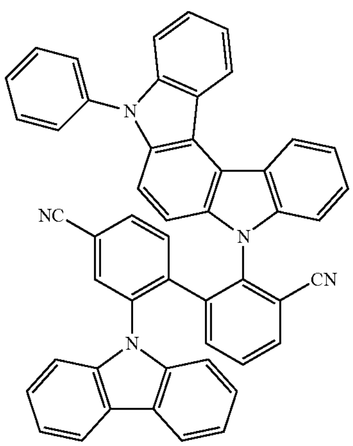
510
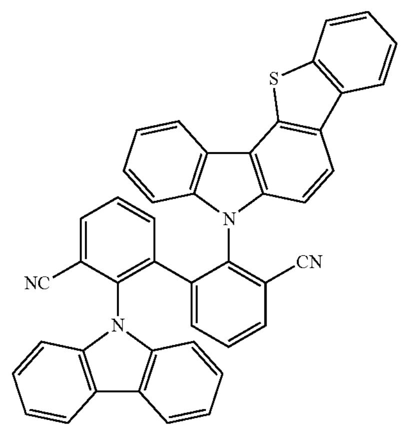
511
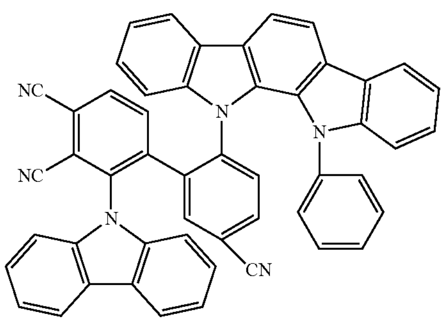
512
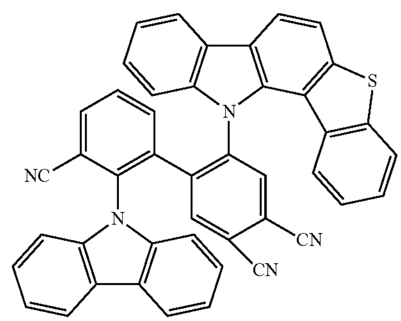
513
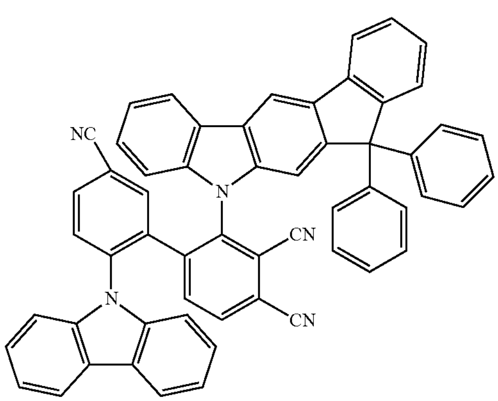
514
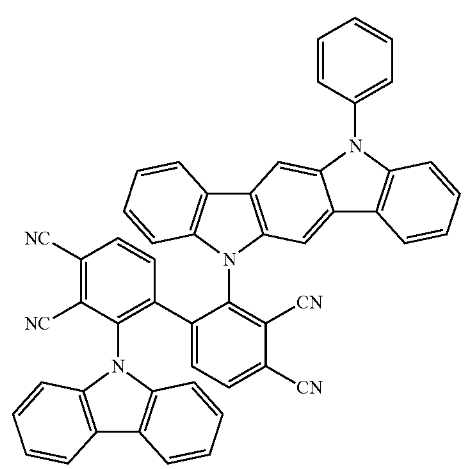

-continued
515
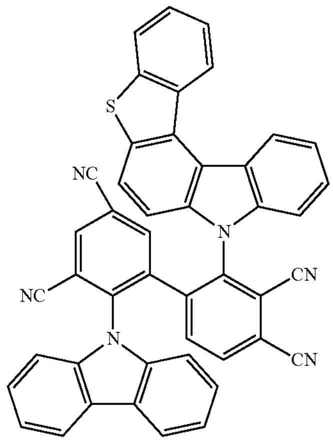
516
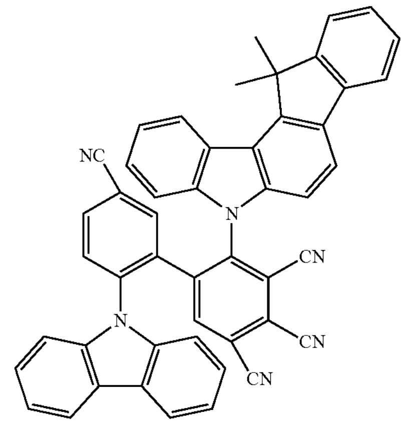
517
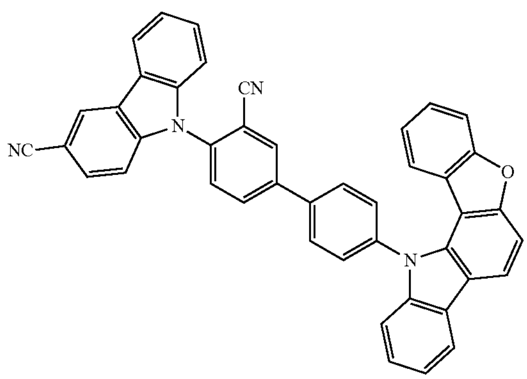
518
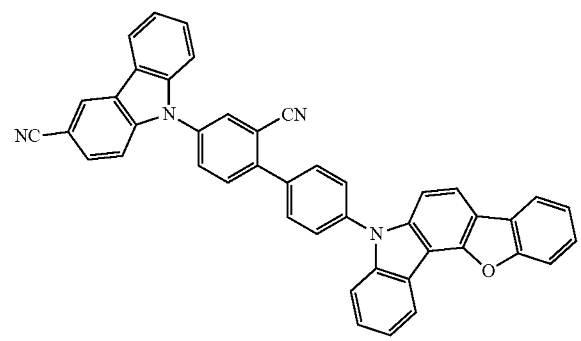
519
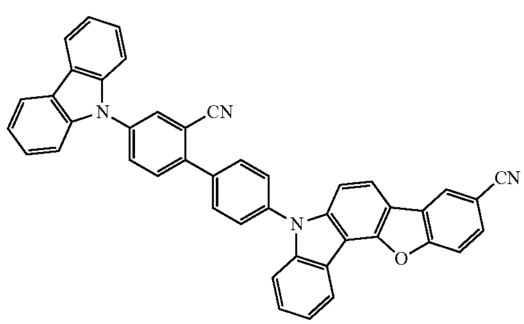
520
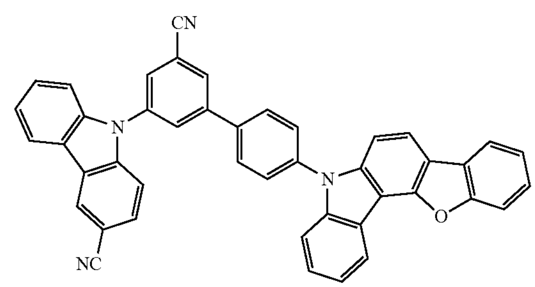
521
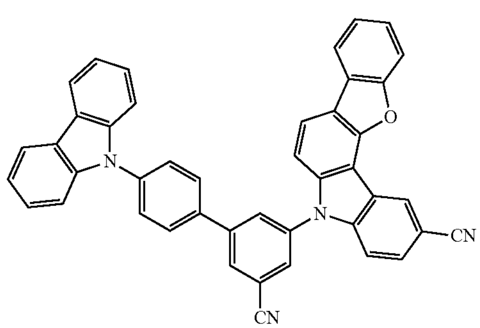
522
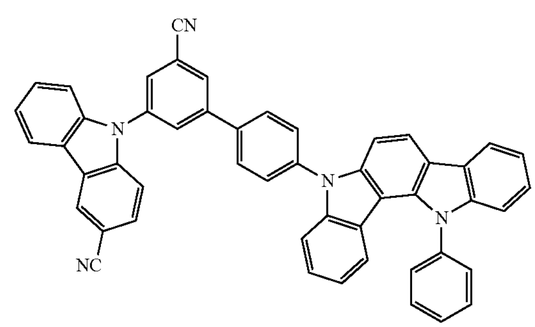

-continued
523
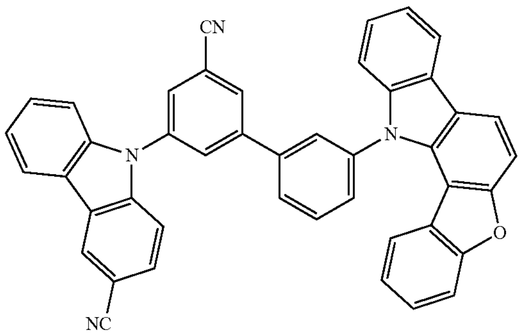
524
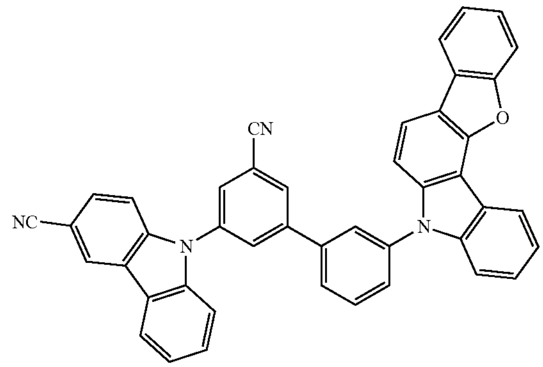
525
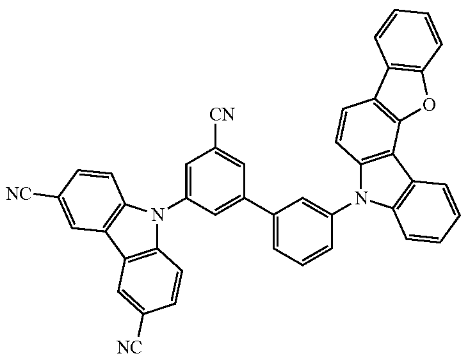
526
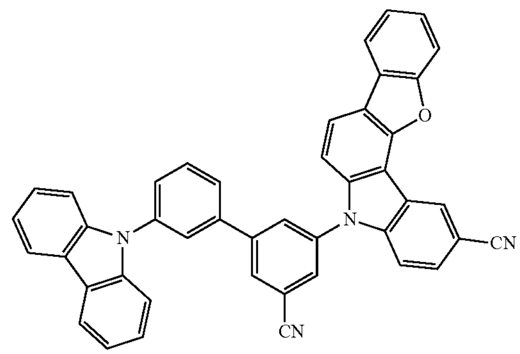
527
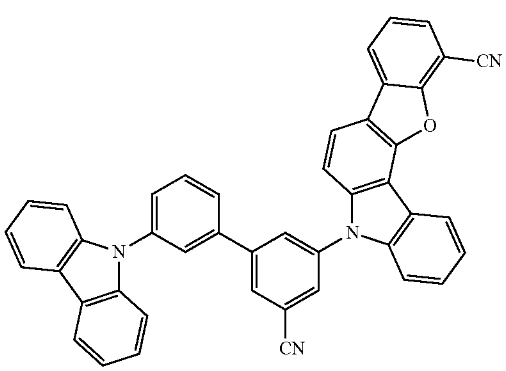
528
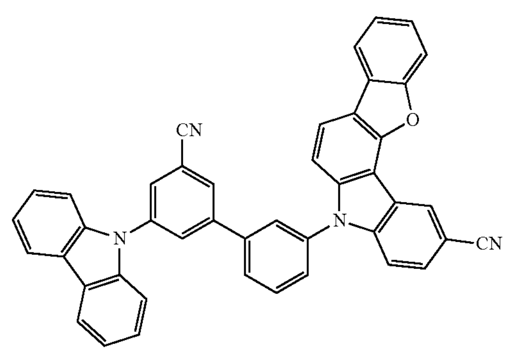
529
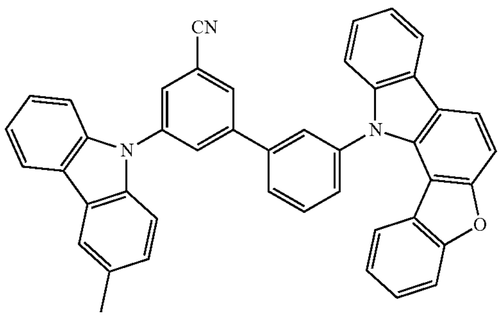
530
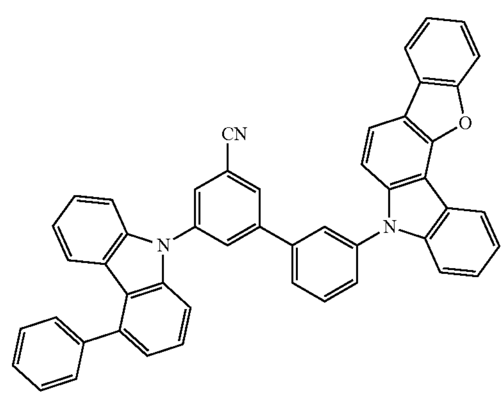

-continued
531
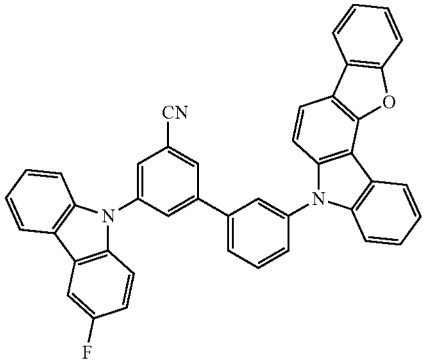
532
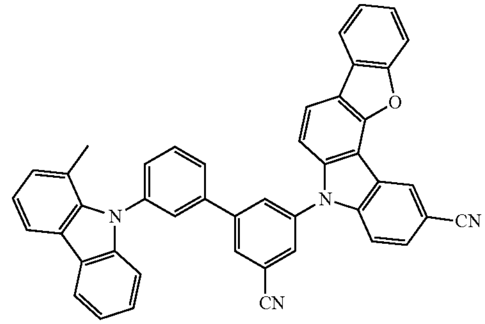
533
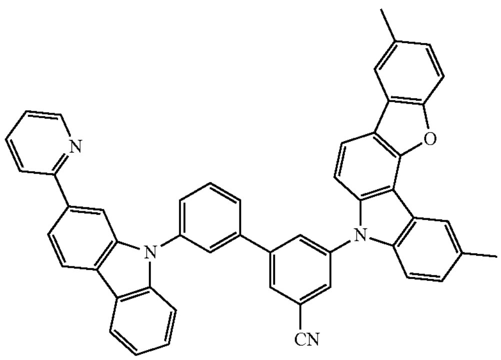
534
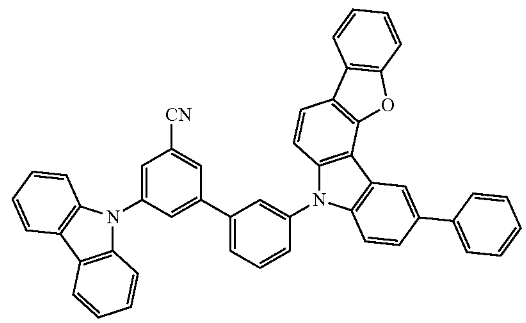
535
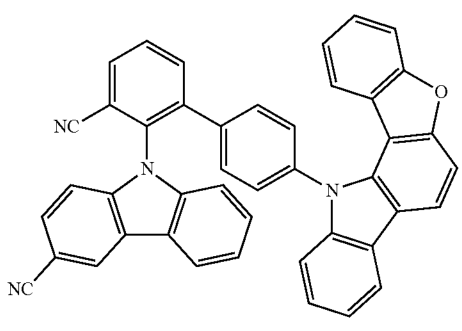
536
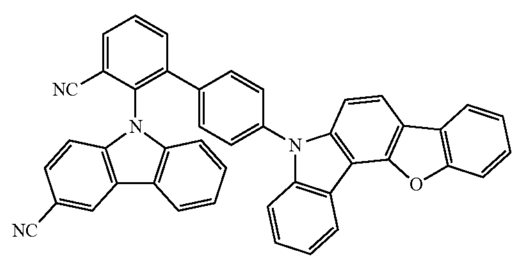
537
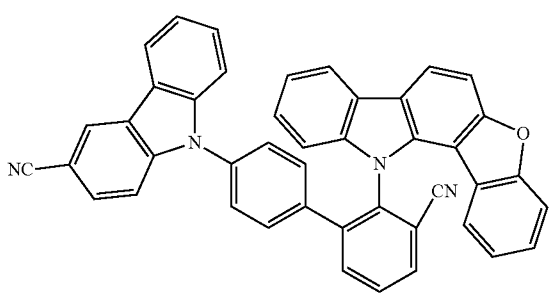
538
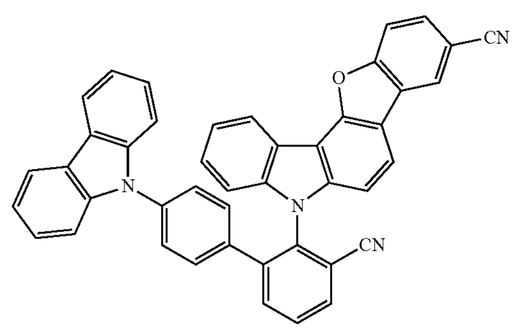

-continued
539
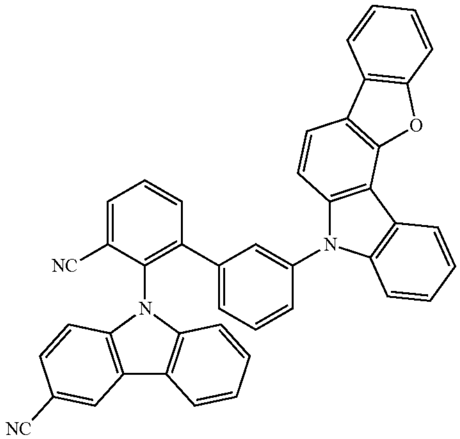
540
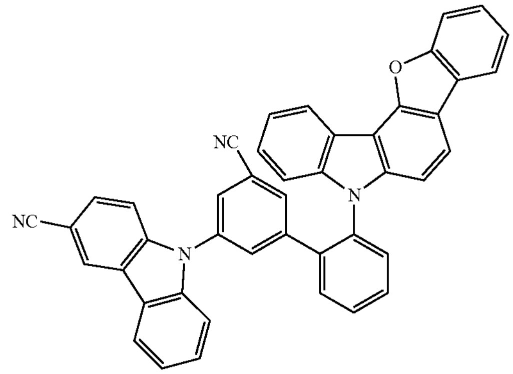
541
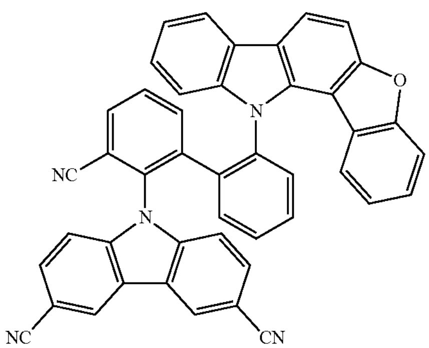
542
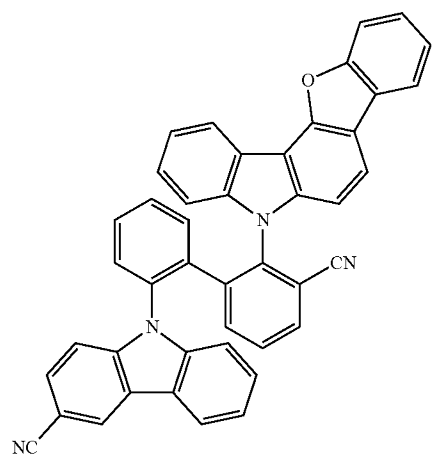
543
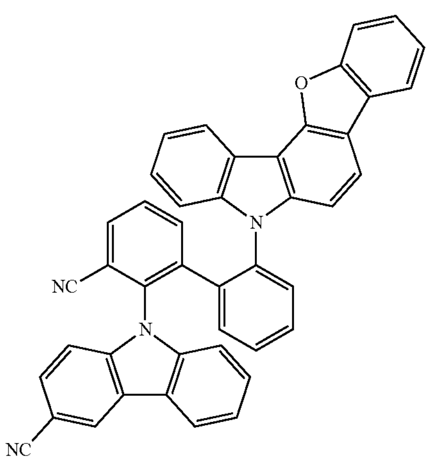
544
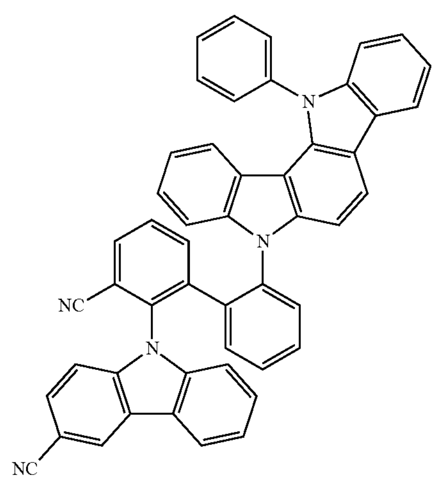

-continued
545
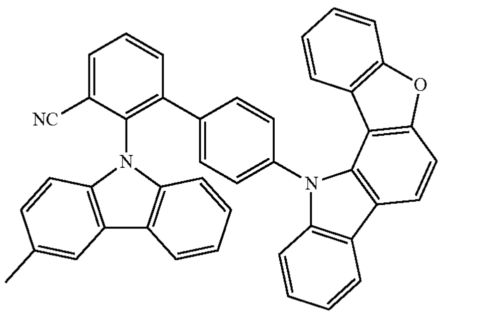
546
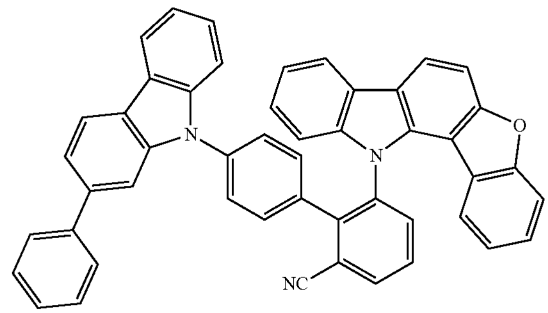
547
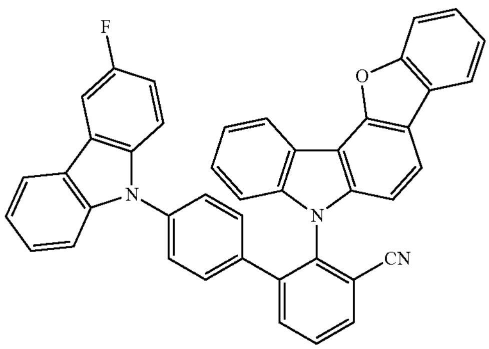
548
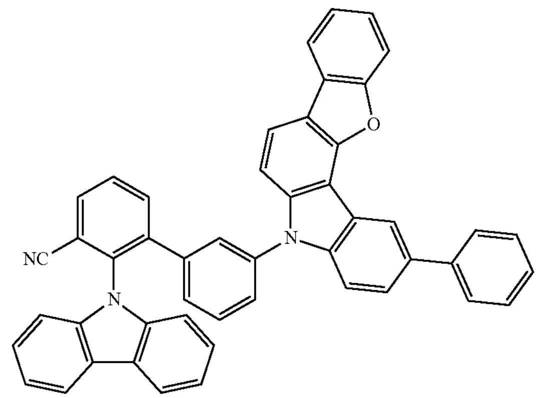
549
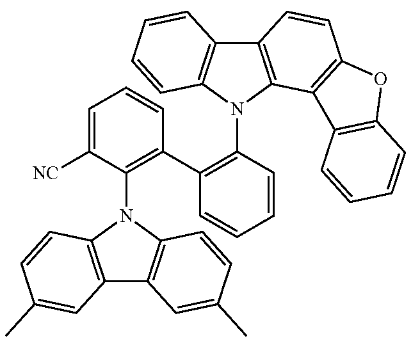
550
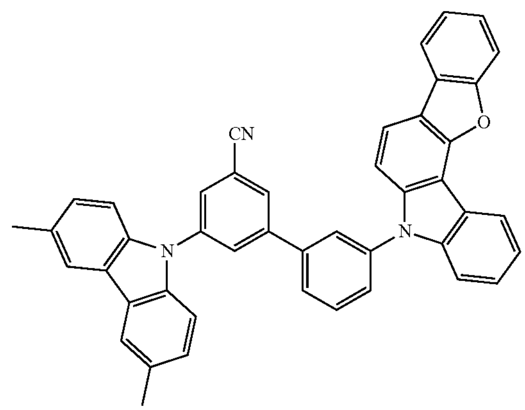
551
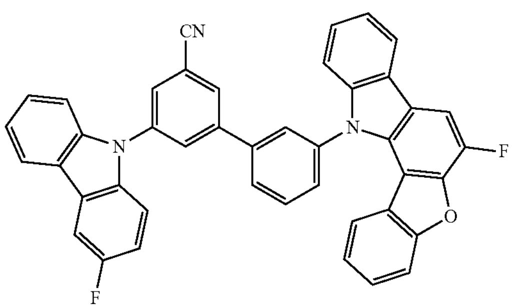
552
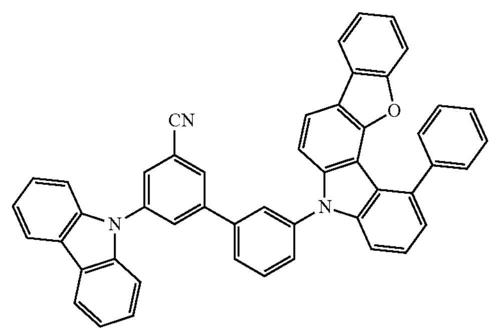

-continued
553
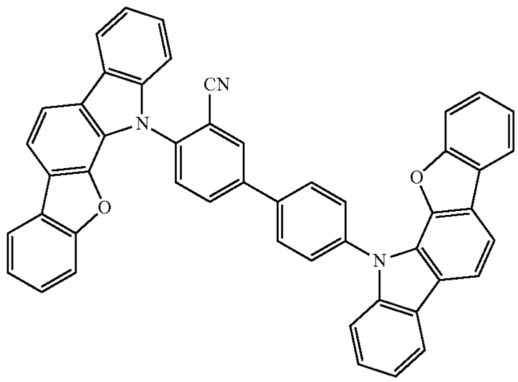
554
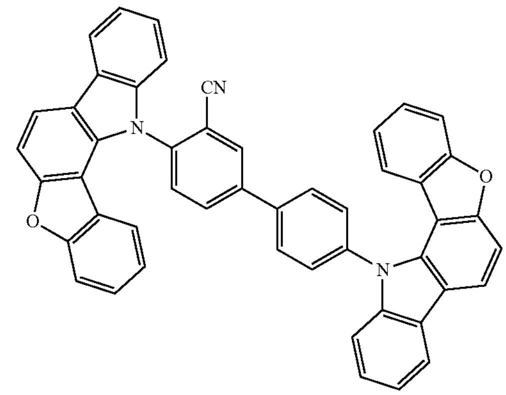
555
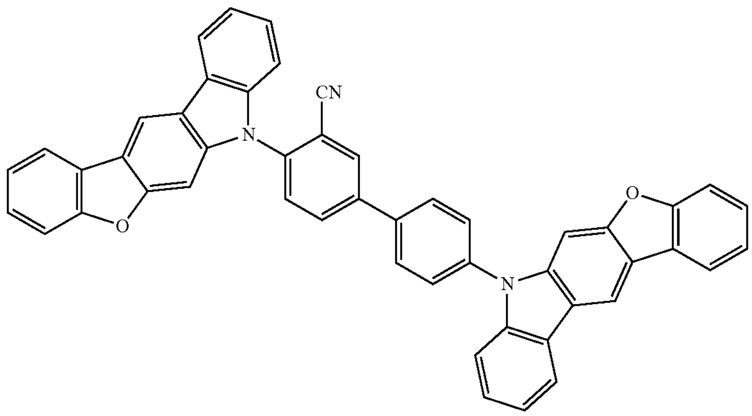
556
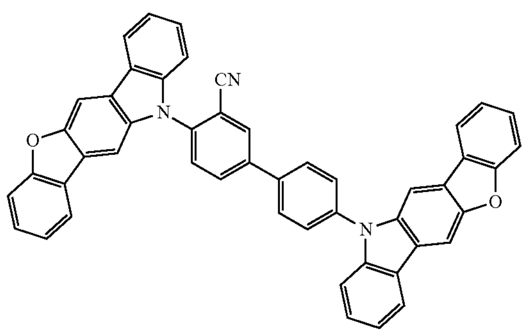
557
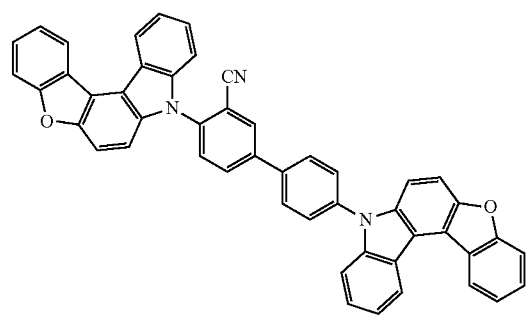
558
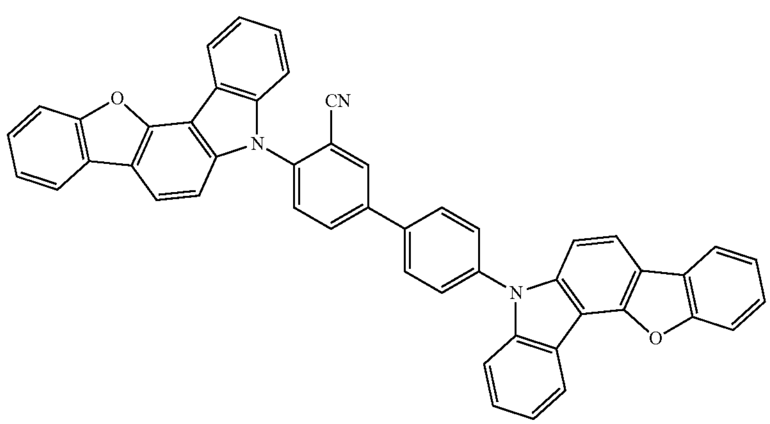

-continued
559
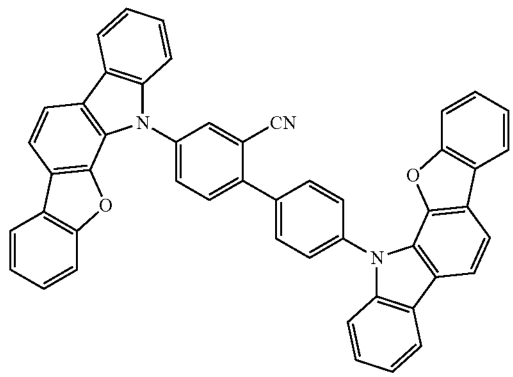
560
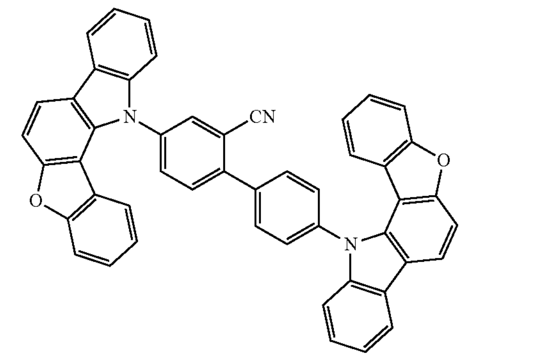
561
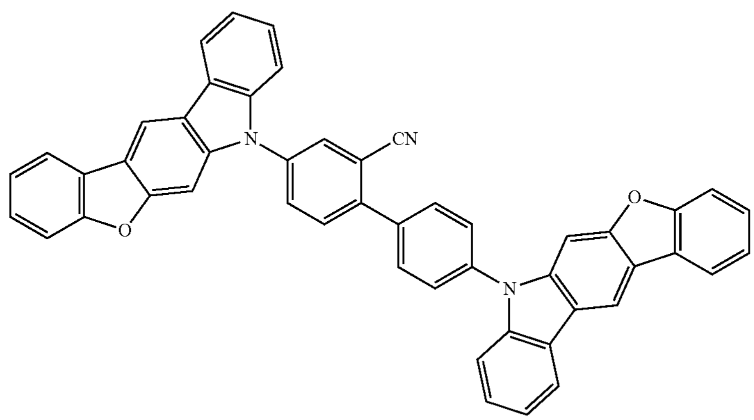
562
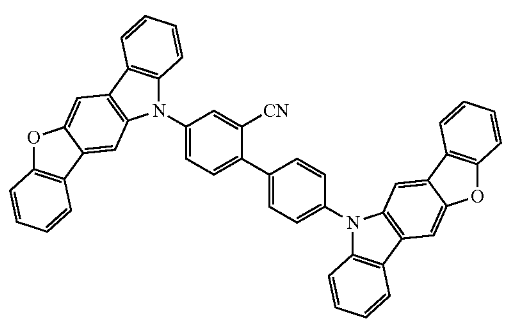
563
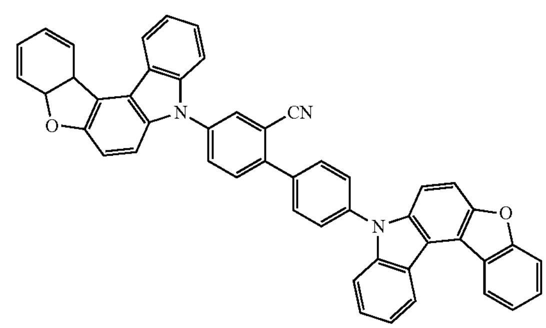
564
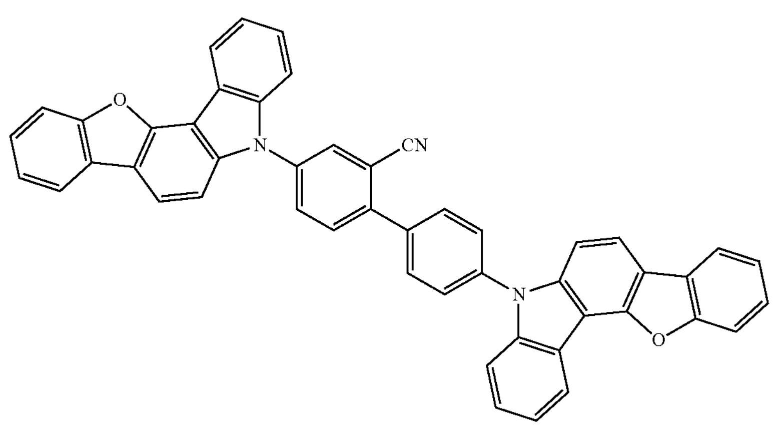

-continued
565
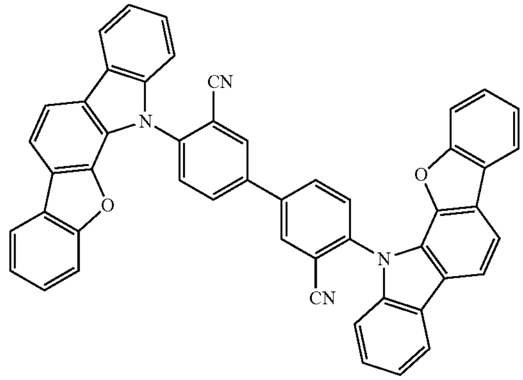
566
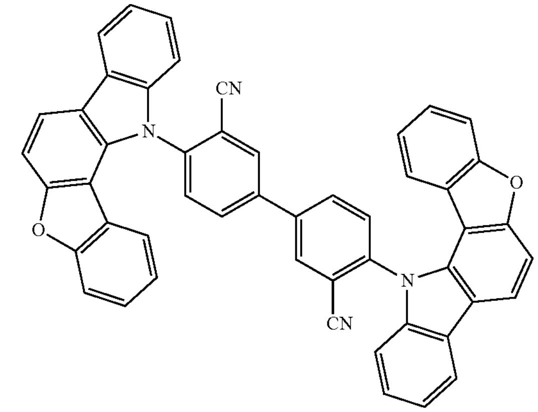
567
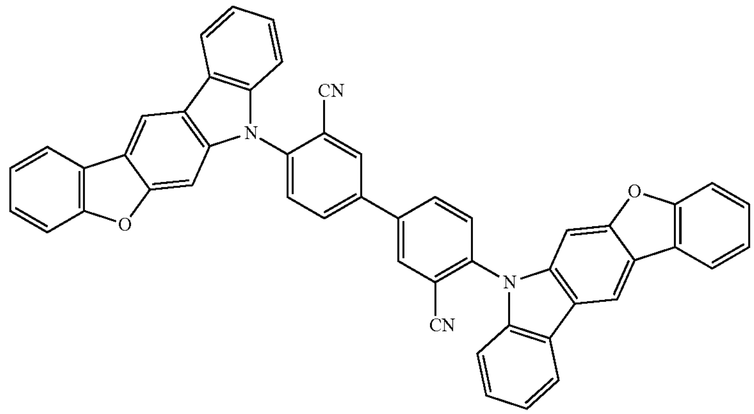
568
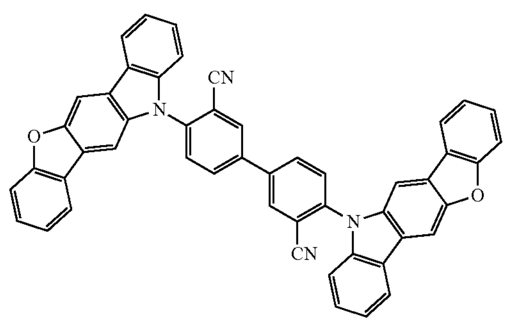
569
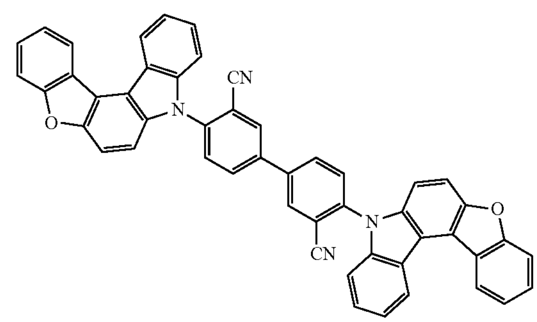
570
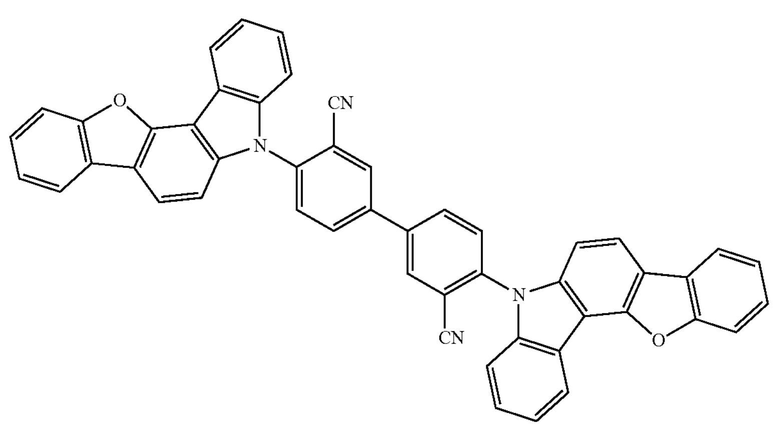

-continued
571
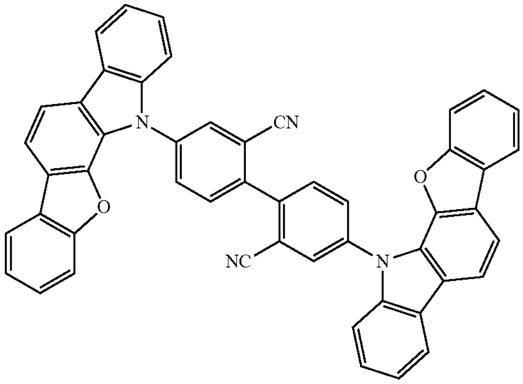
572
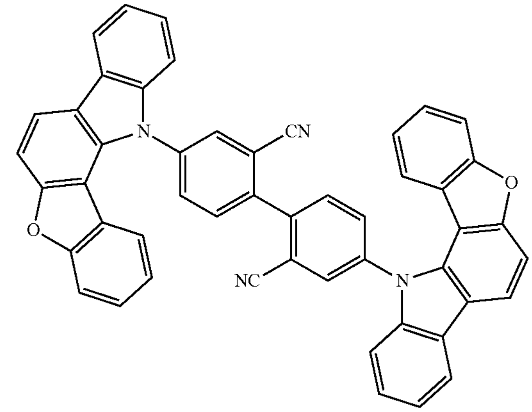
573
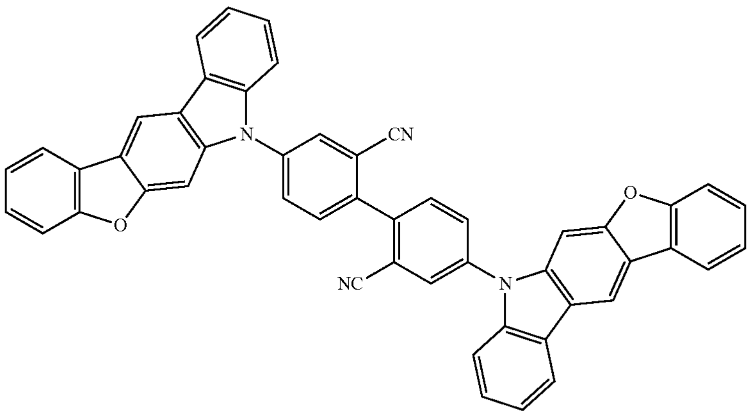
574
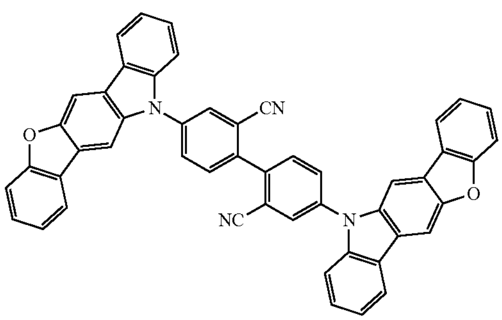
575
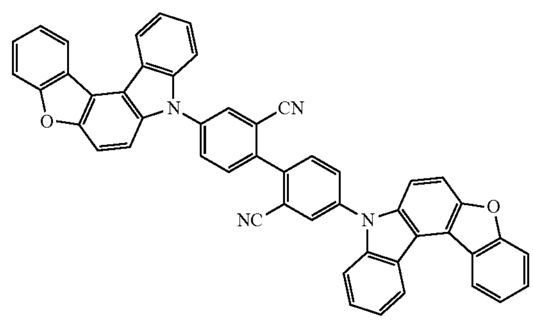
576
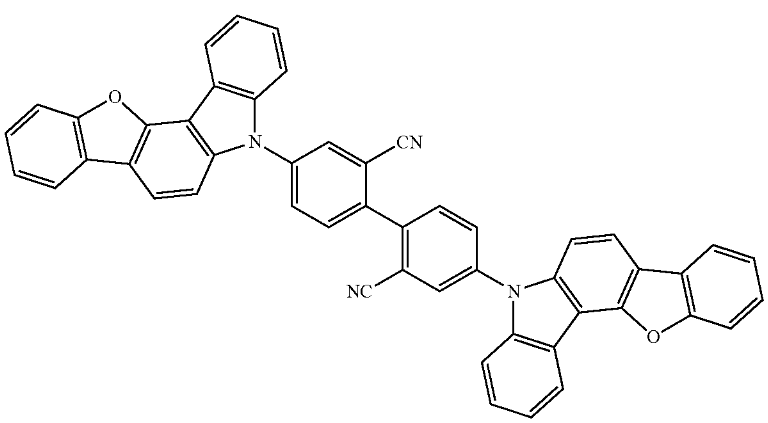

-continued
577
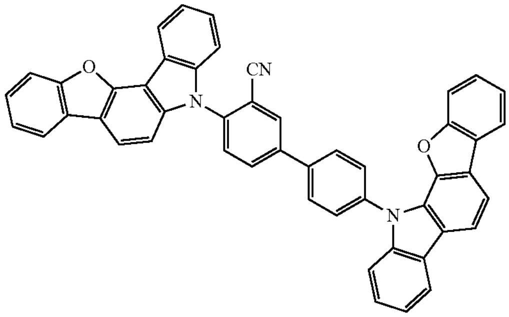
578
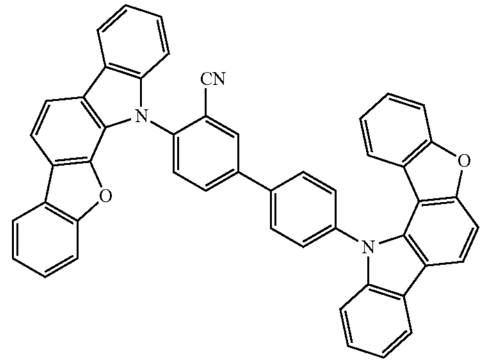
579
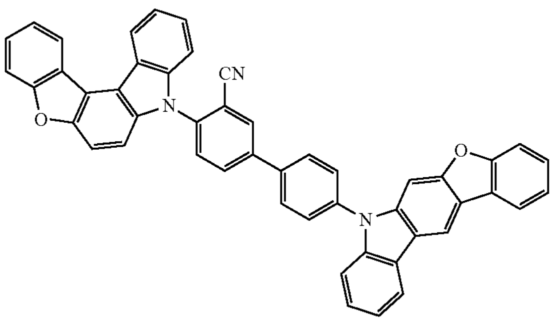
580
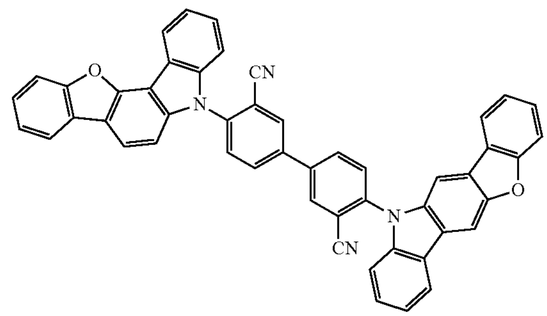
581
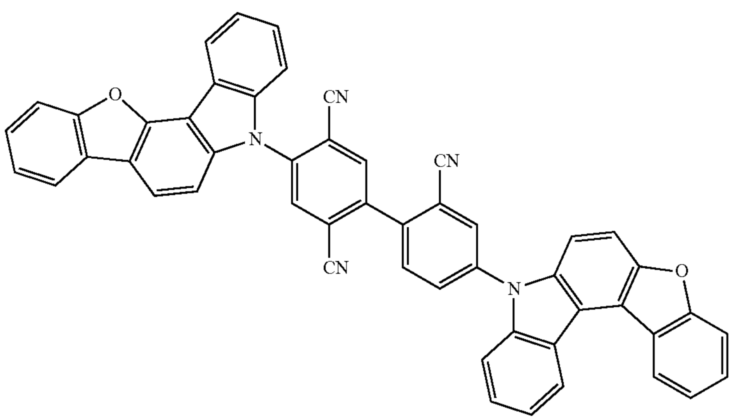
582
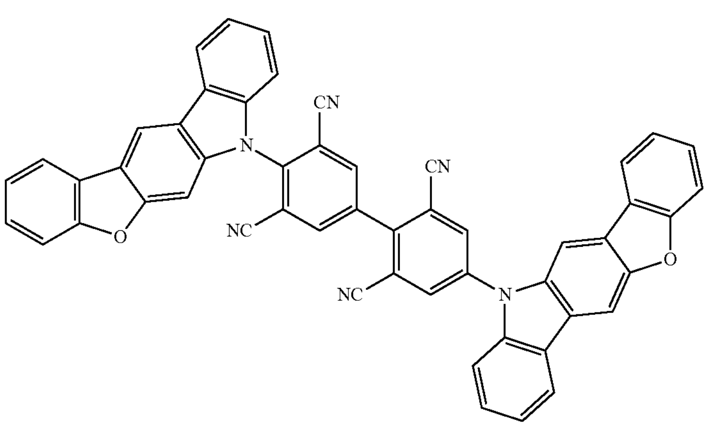

-continued
583
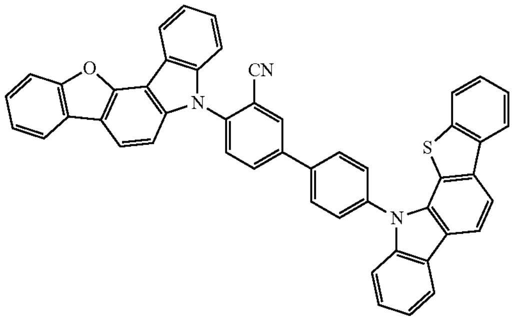
584
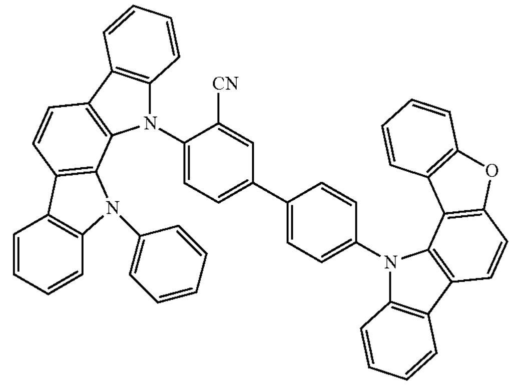
585
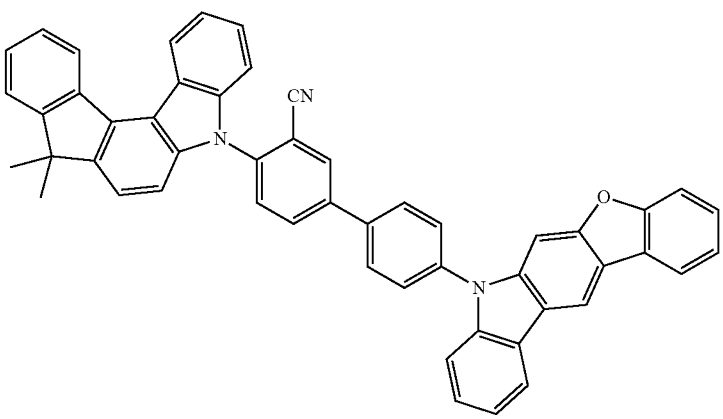
586
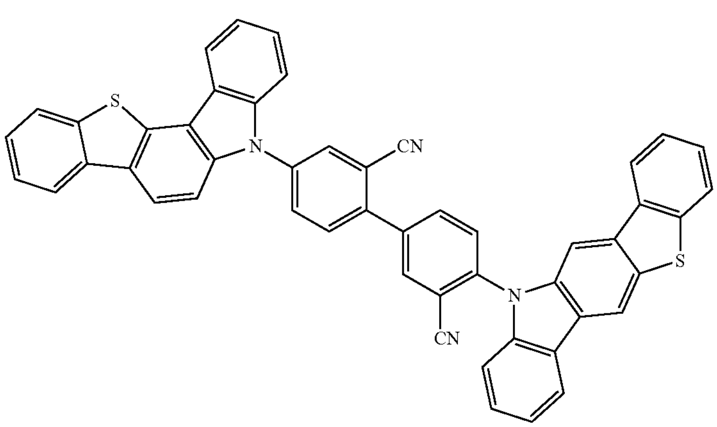

-continued
587
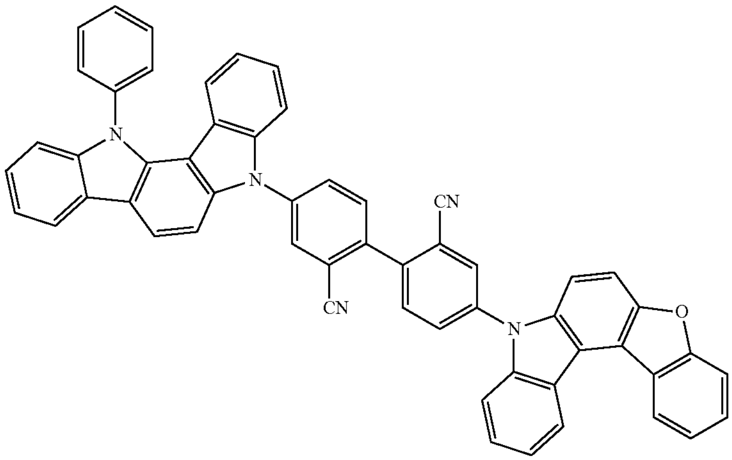
588
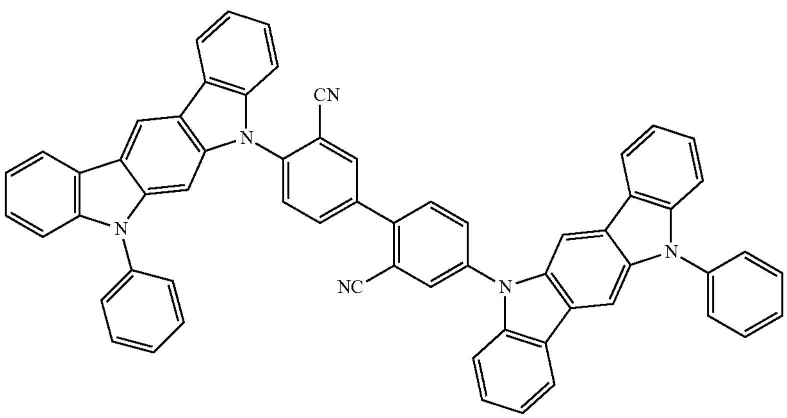
589
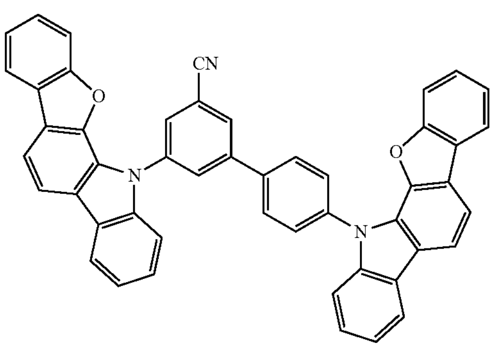
590
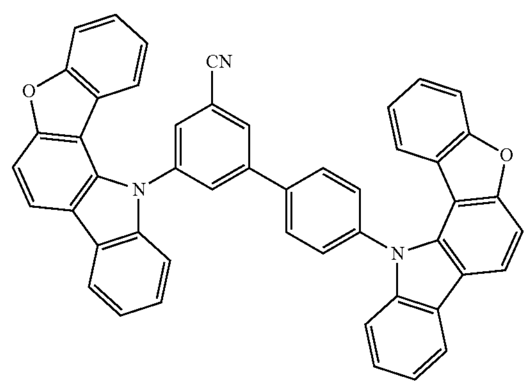
591
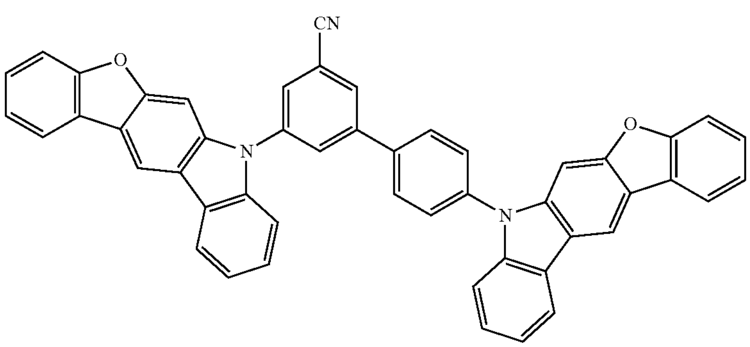

-continued
592
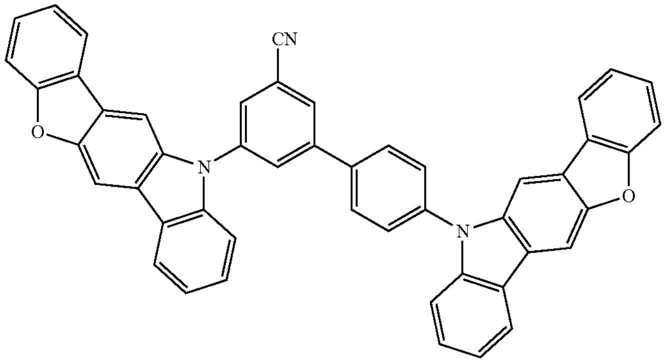
593
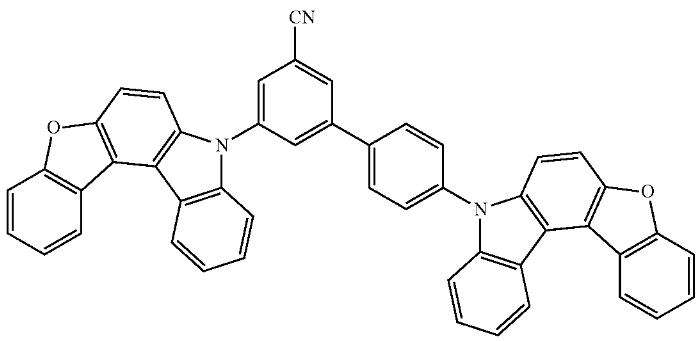
594
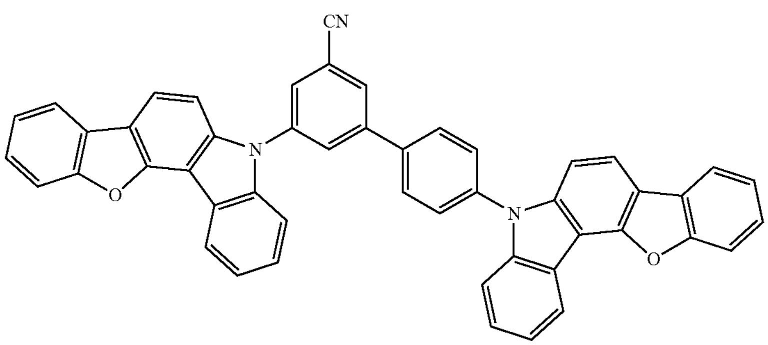
595
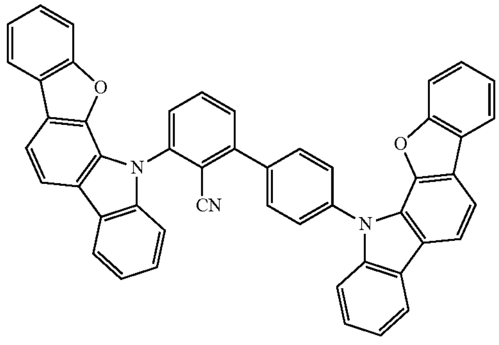
596
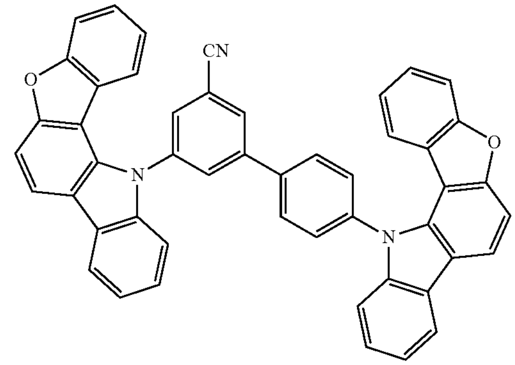

-continued
597
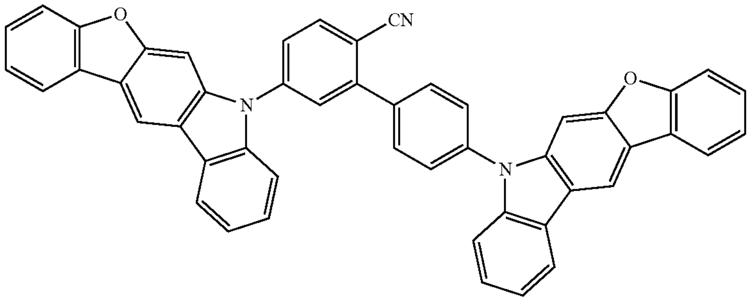
598
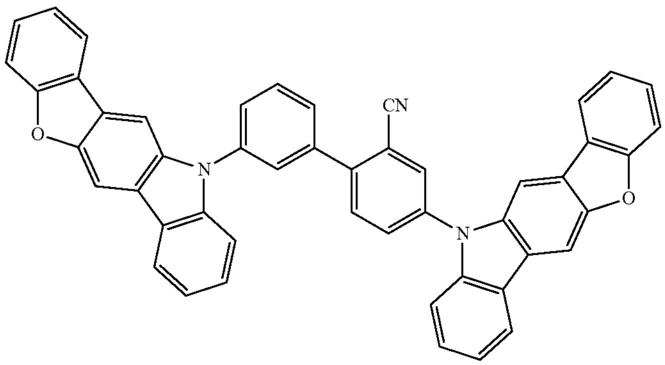
599
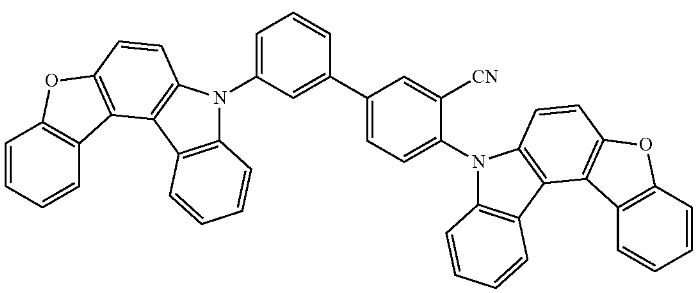
600
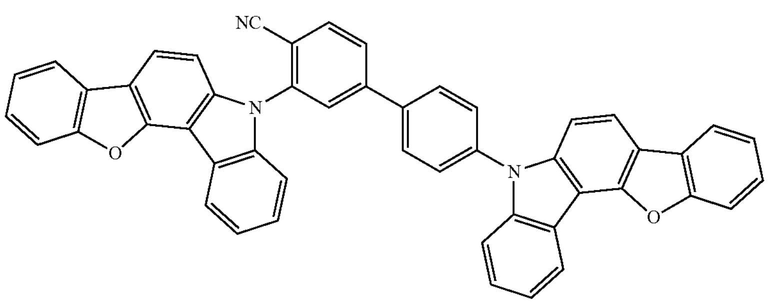
601
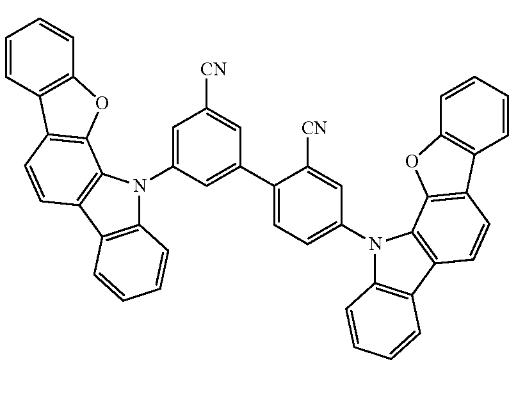
602
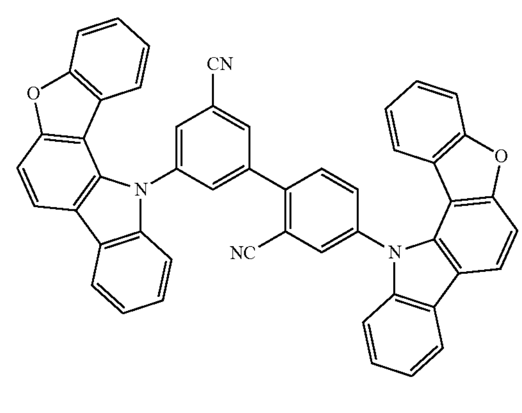

-continued
603
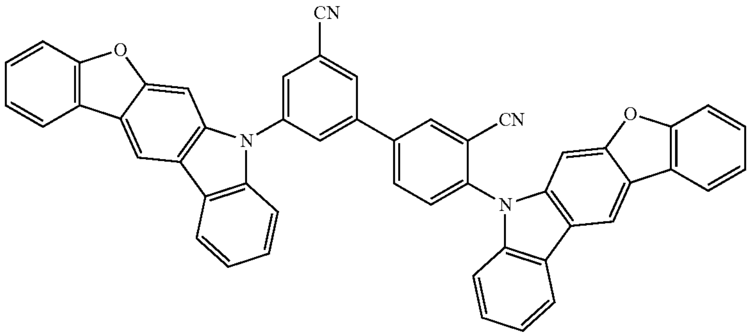
604
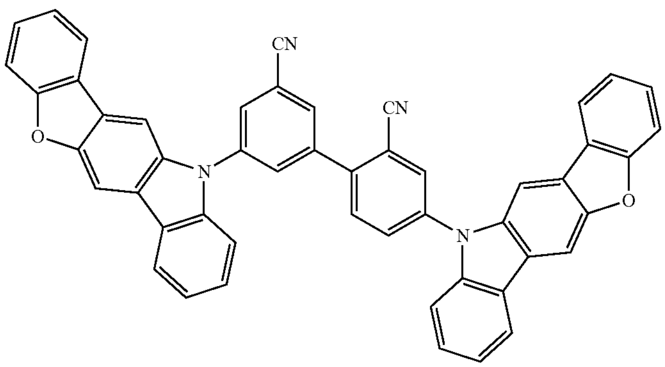
605
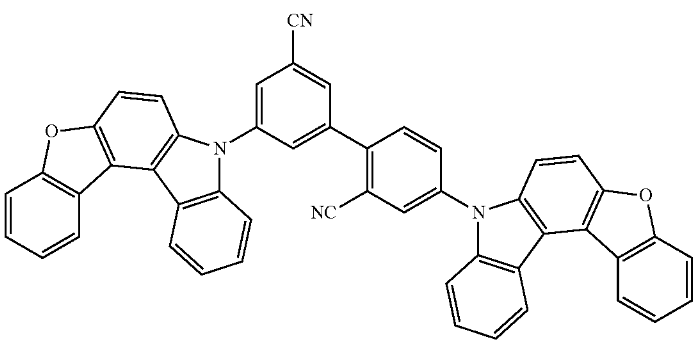
606
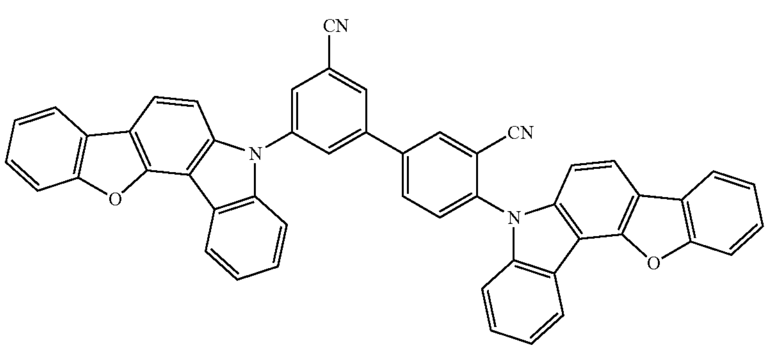

-continued
607
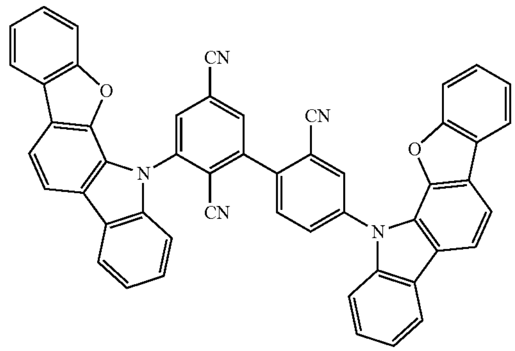
608
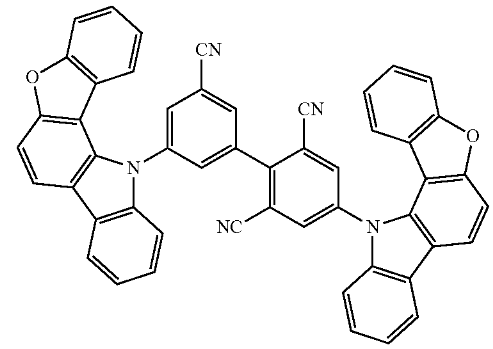
609
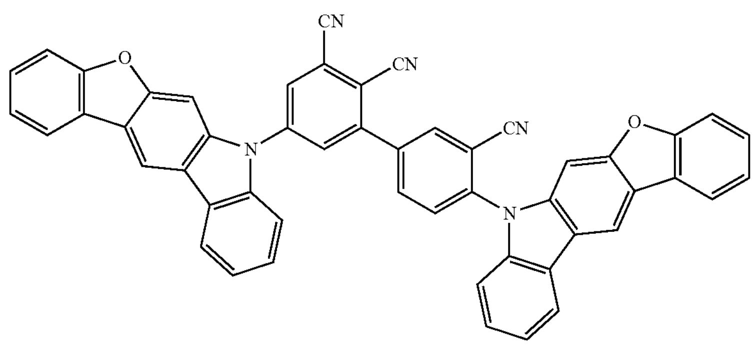
610
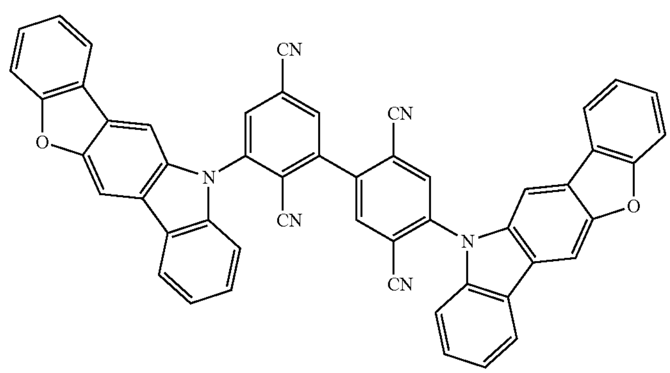
611
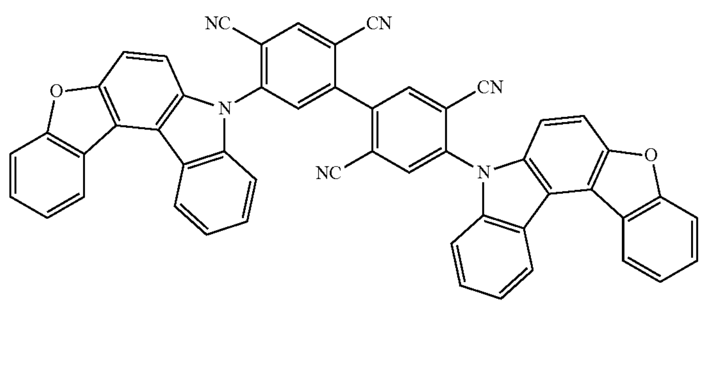

-continued
612
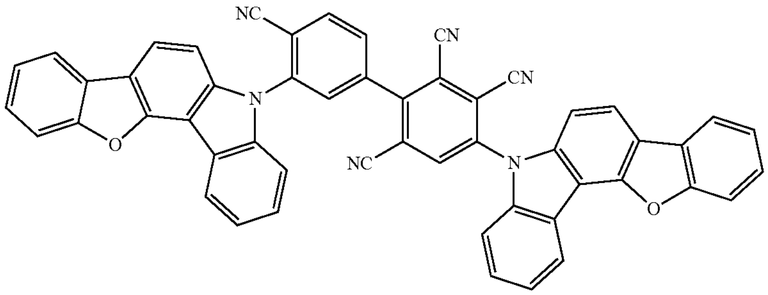
613
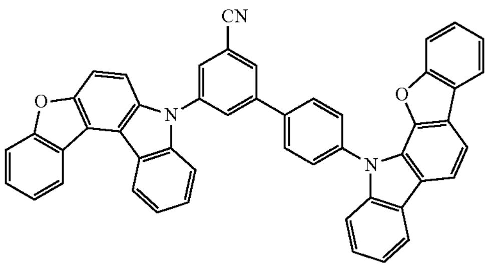
614
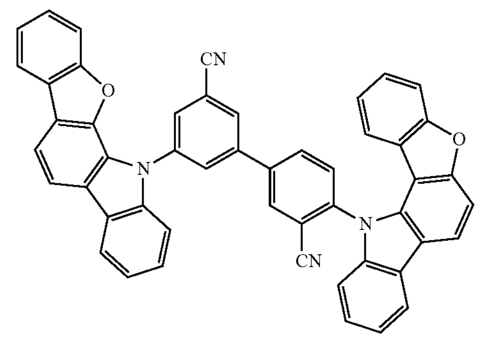
615
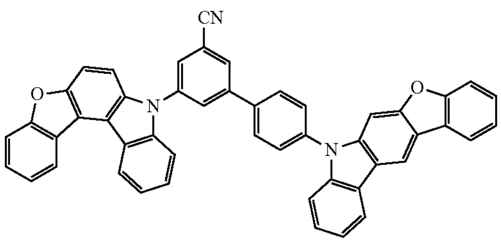
616
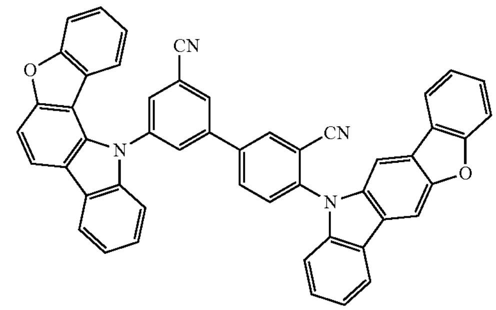
617
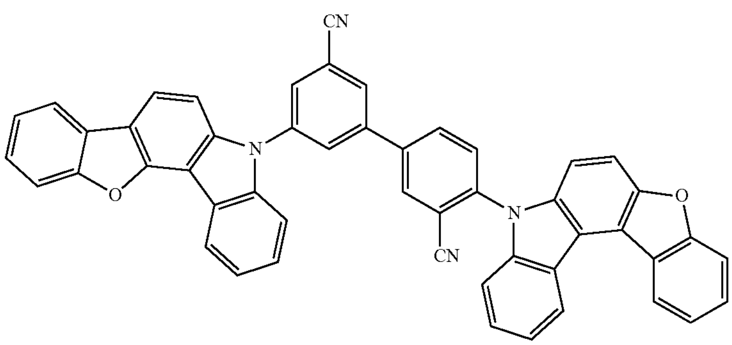
618
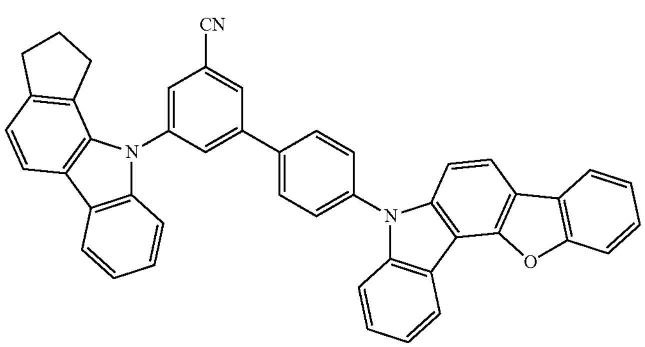

-continued
619
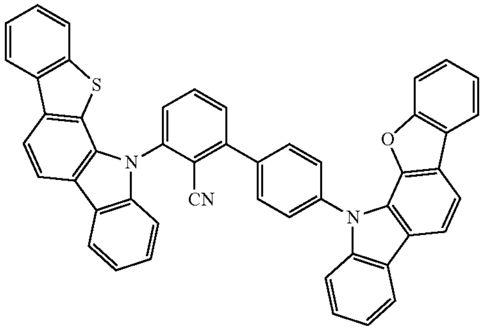
620
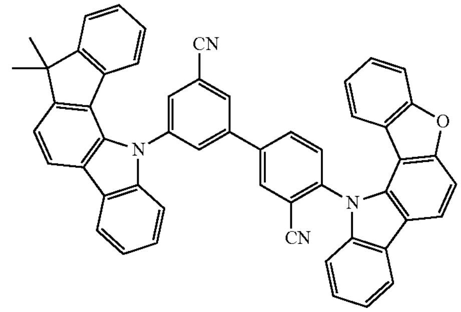
621
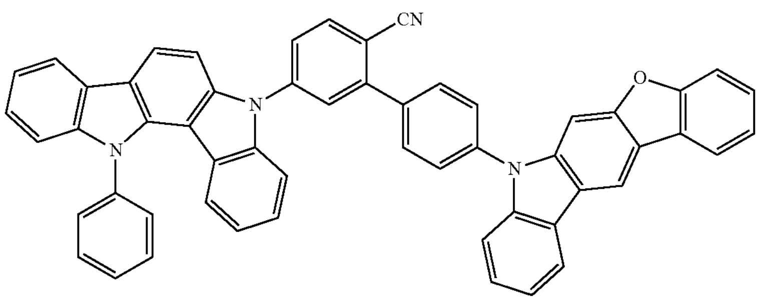
622
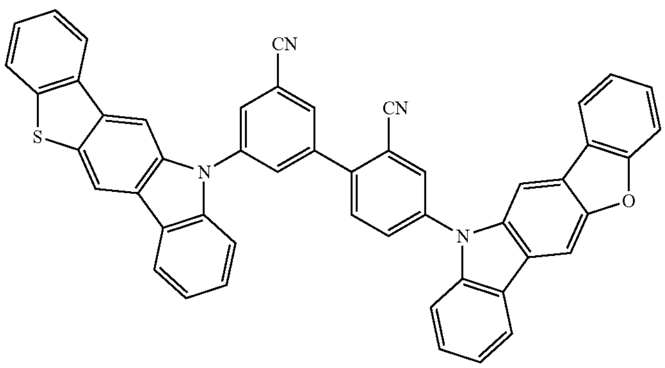
623
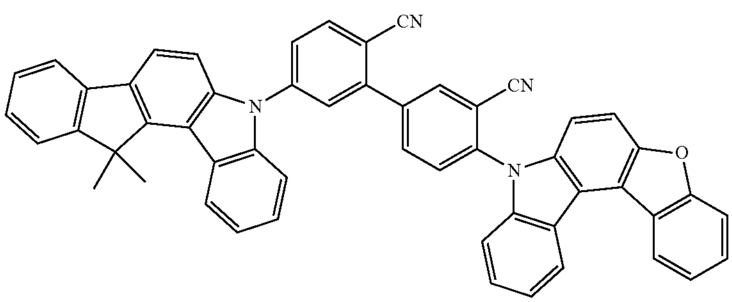
624
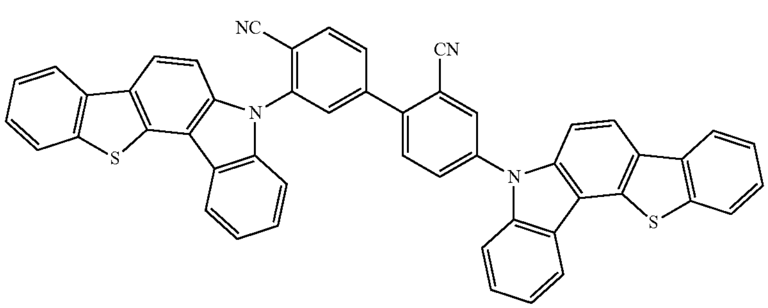

-continued
625
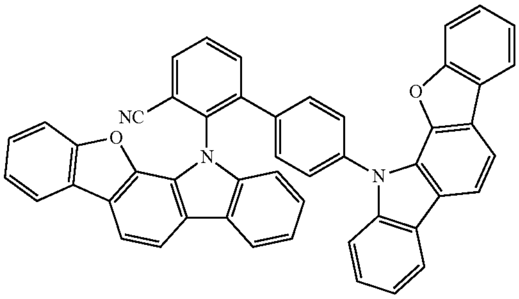
626
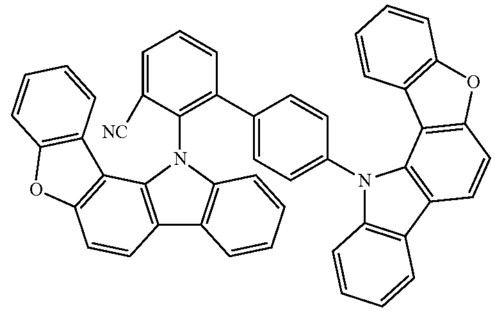
627
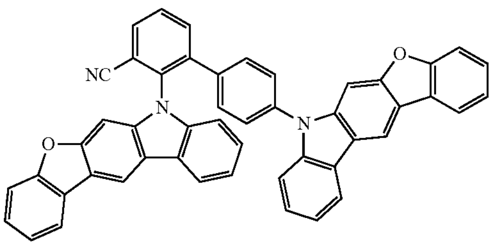
628
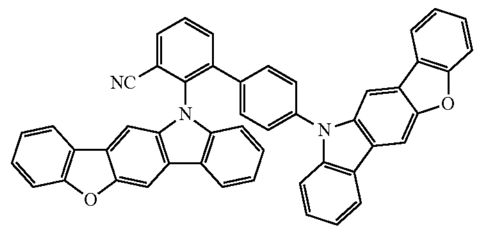
629
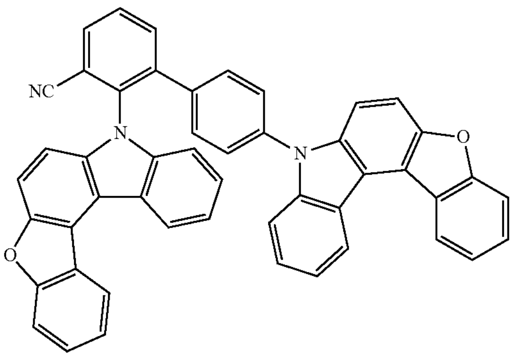
630
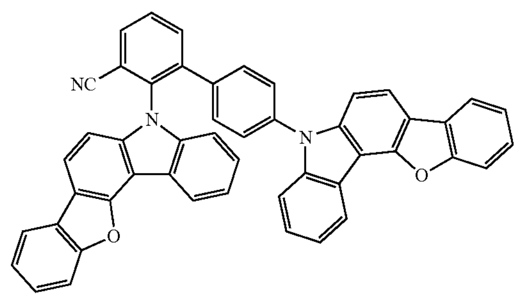
631
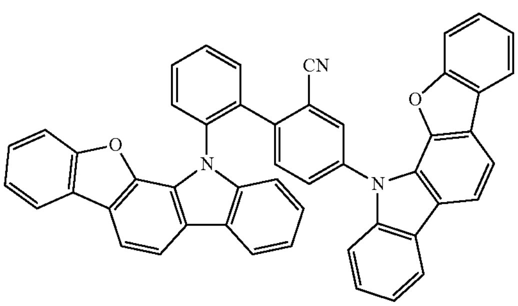
632
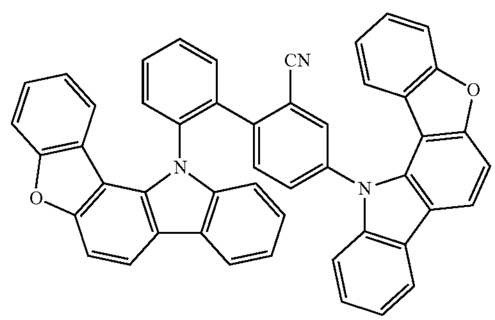
633
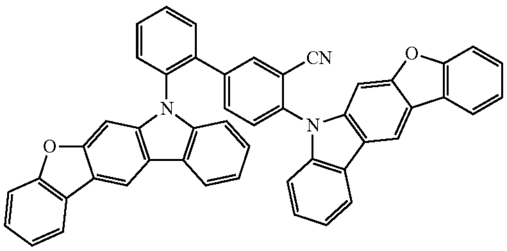
634
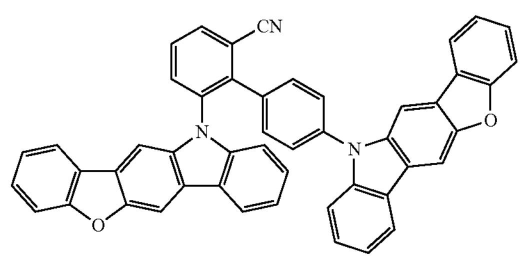

-continued
635
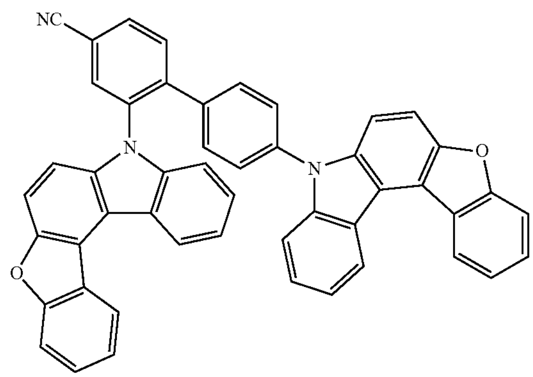
636
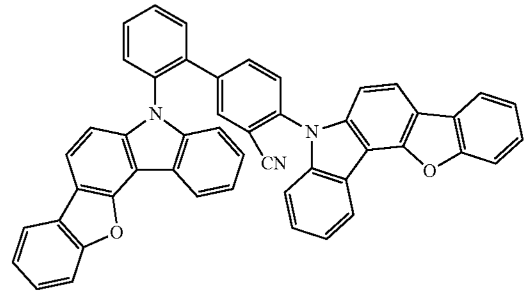
637
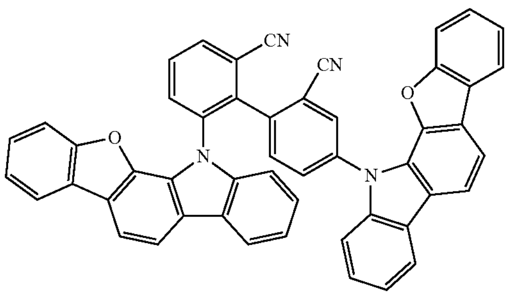
638
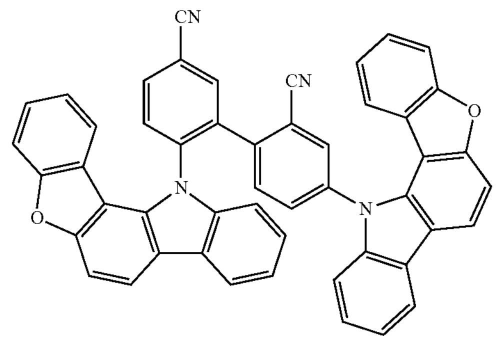
639
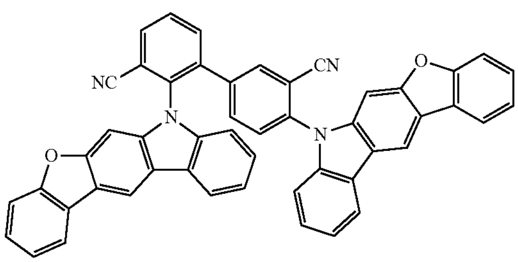
640
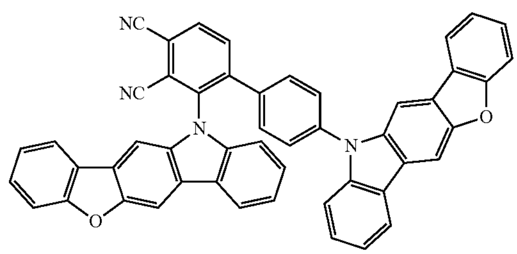
641
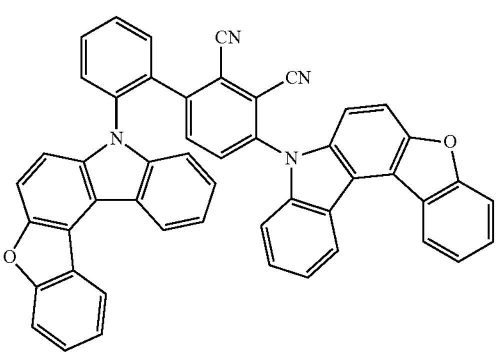
642
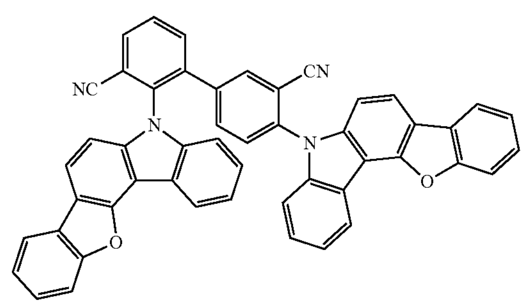

-continued
643
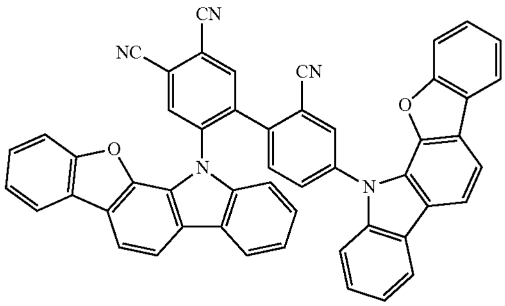
644
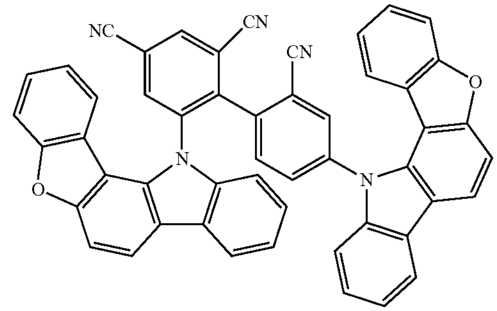
645
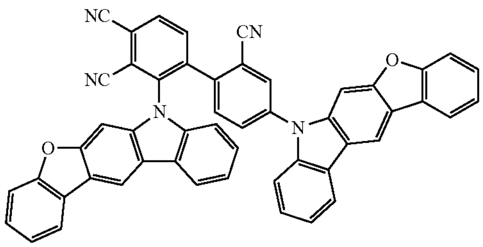
646
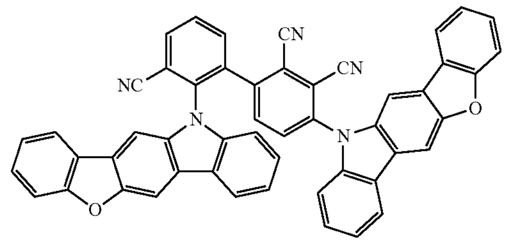
647
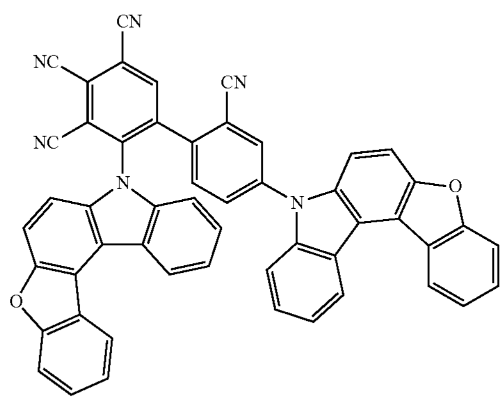
648
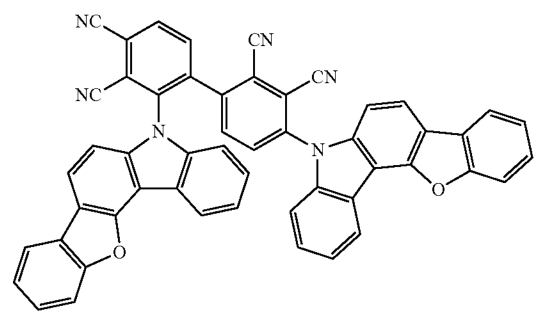
649
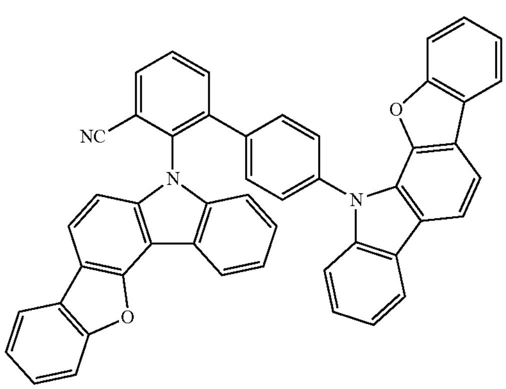
650
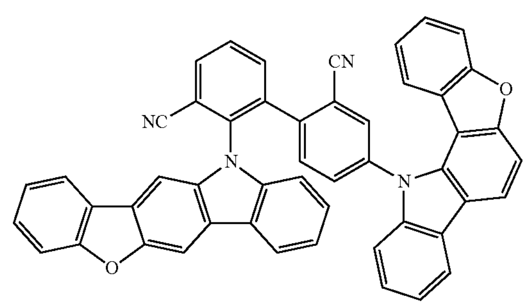

-continued
651
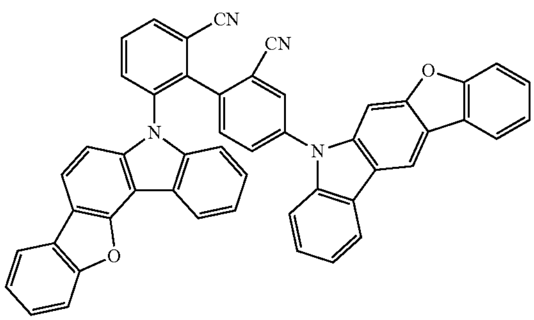
652
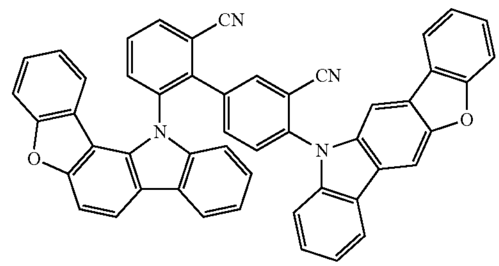
653
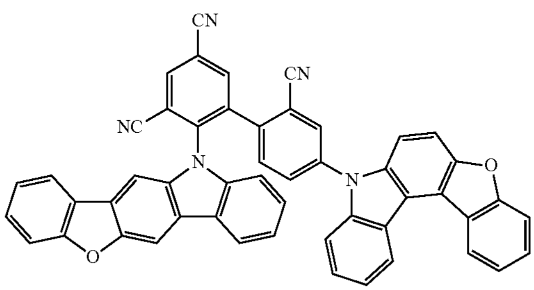
654
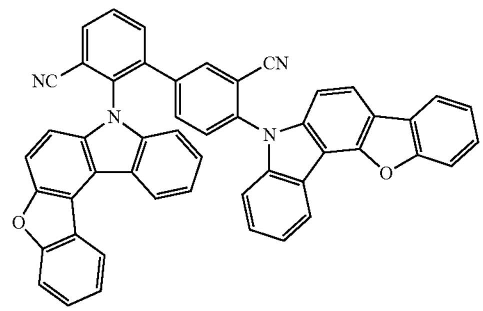
655
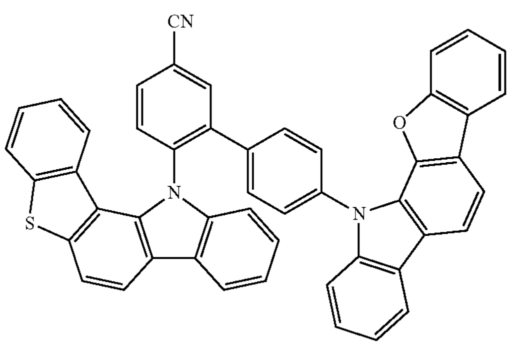
656
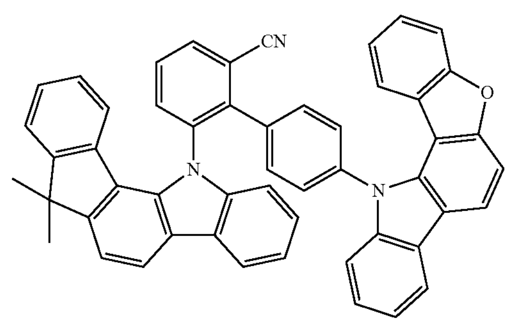
657
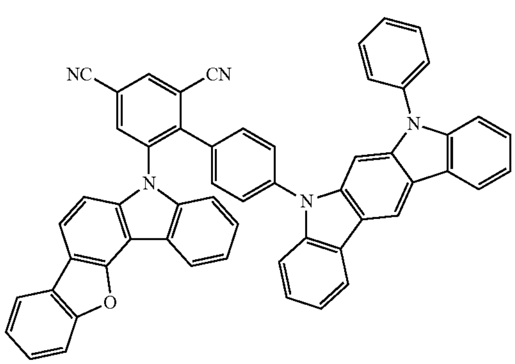
658
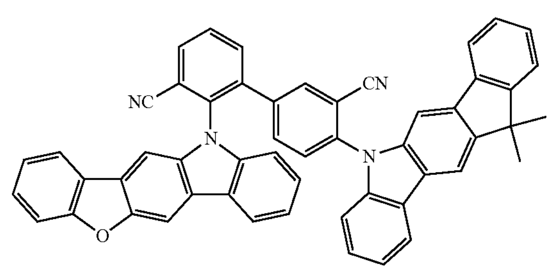

-continued
659
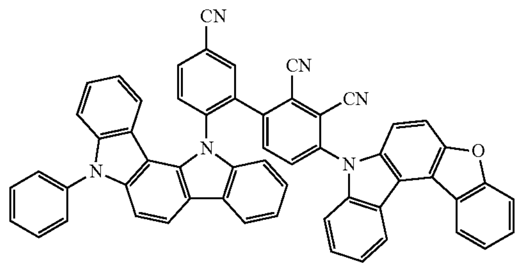
660
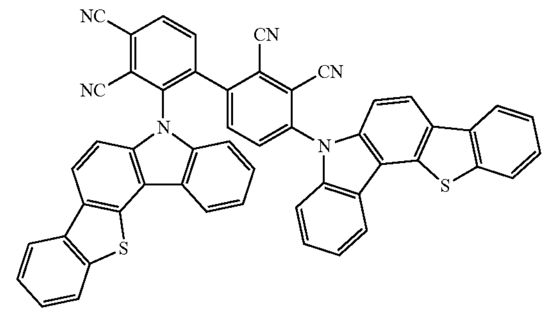
661
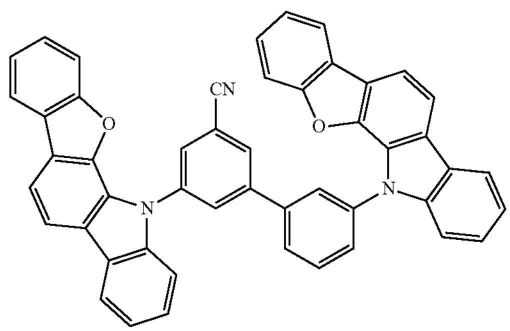
662
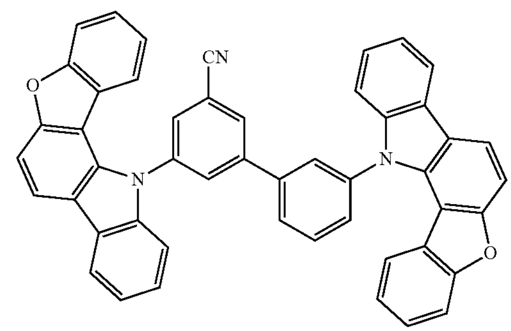
663
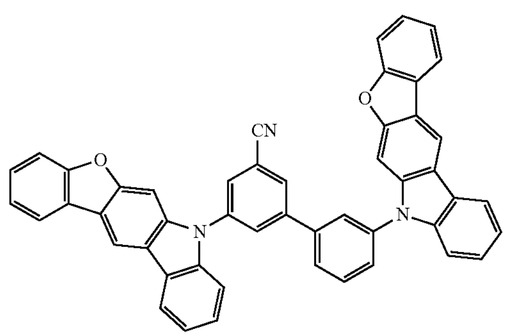
664
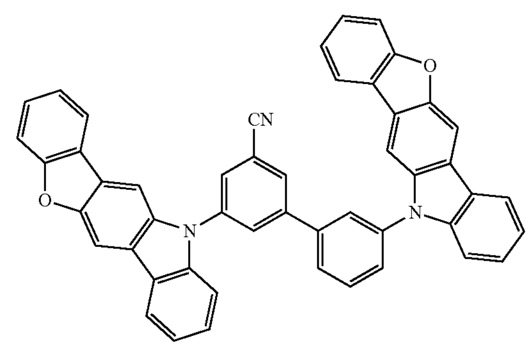
665
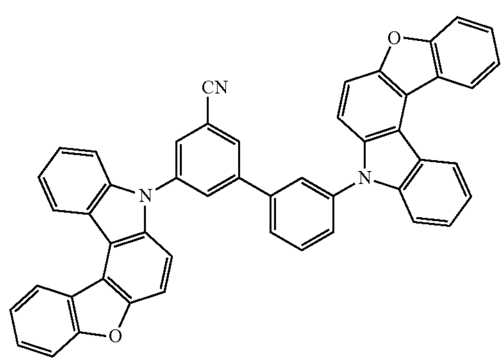
666
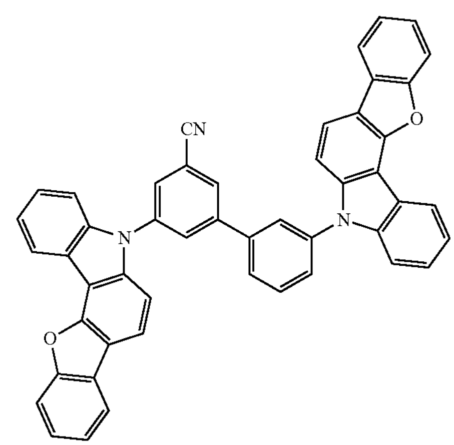

-continued
667
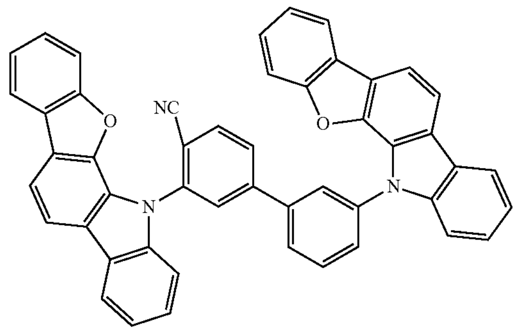
668
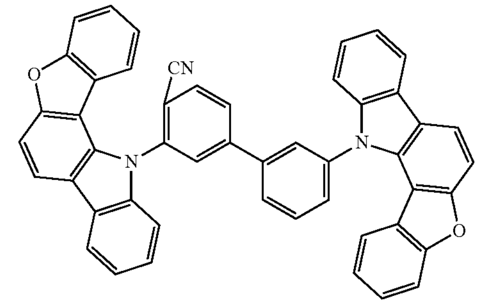
669
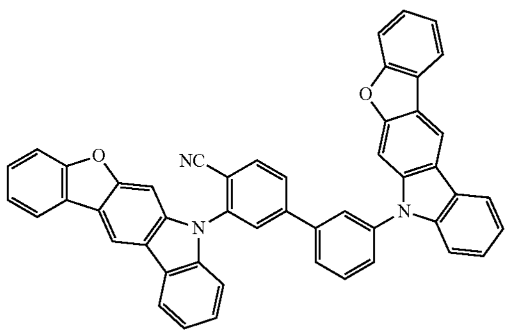
670
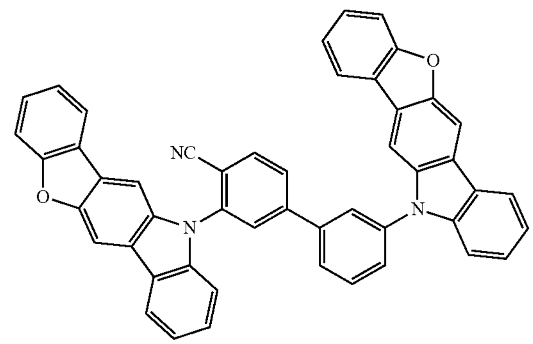
671
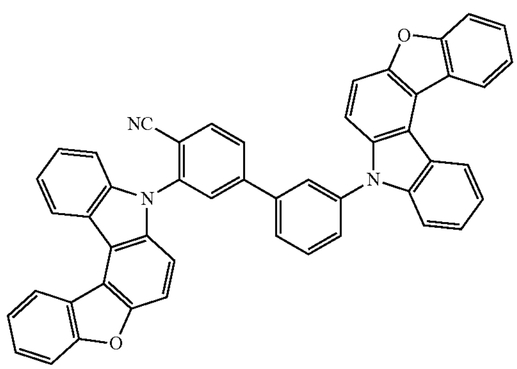
672
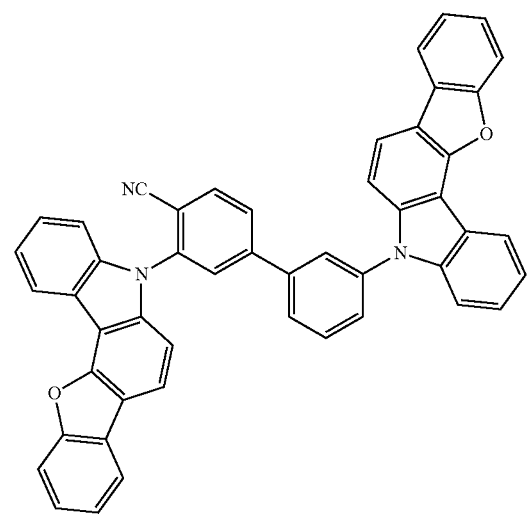
673
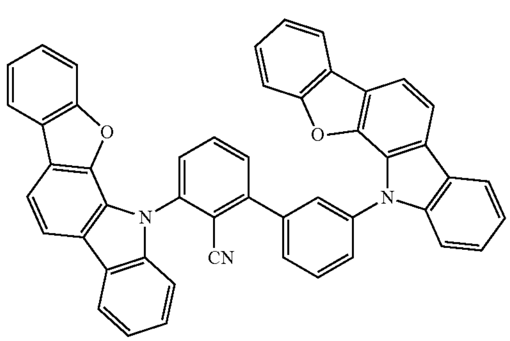
674
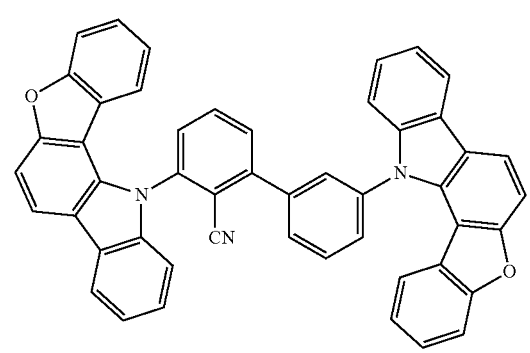

-continued
675
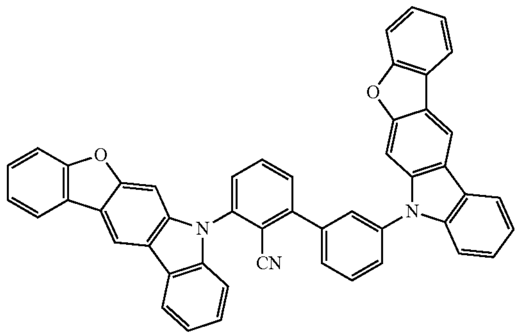
676
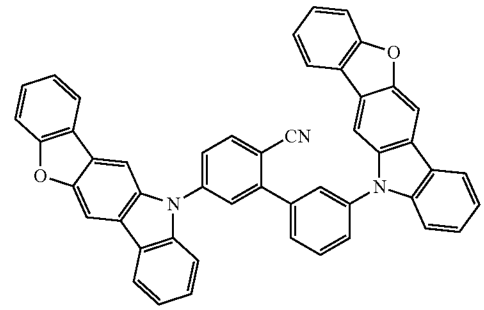
677
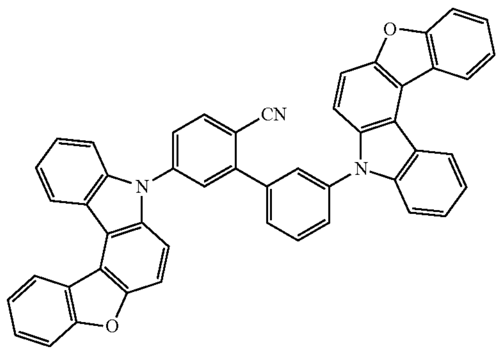
678
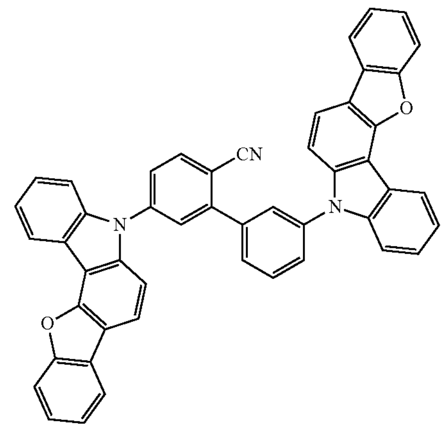
679
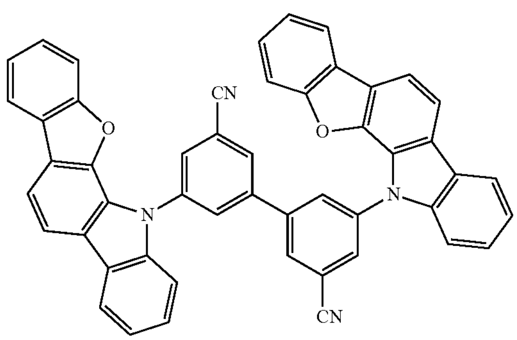
680
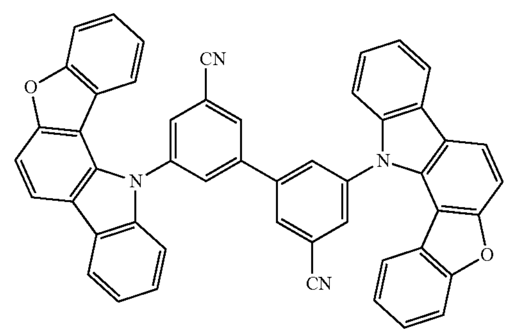
681
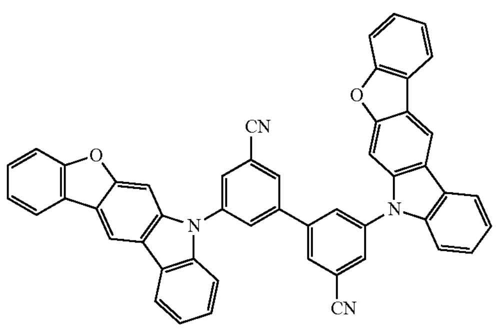
682
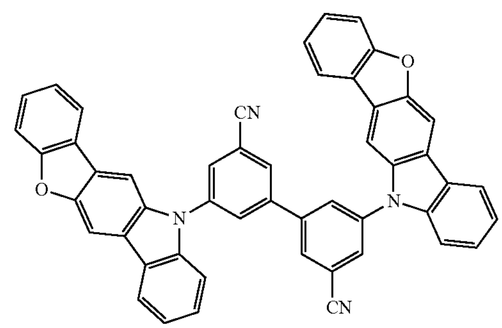

-continued
683
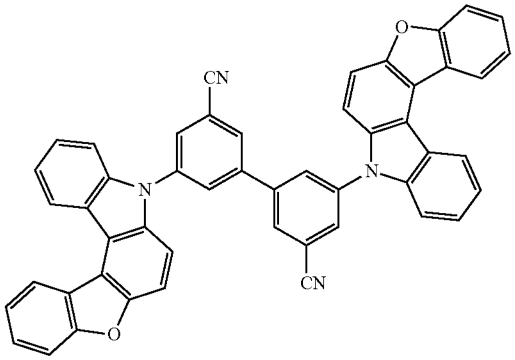
684
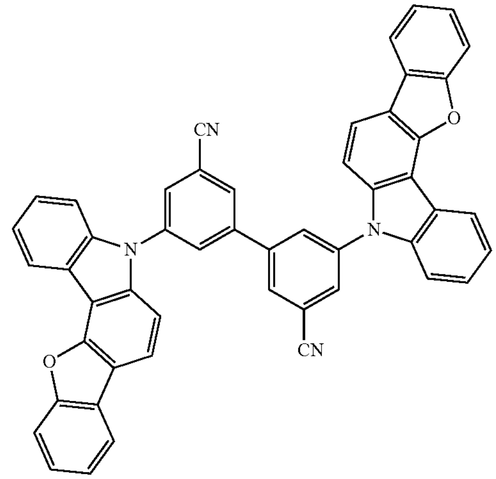
685
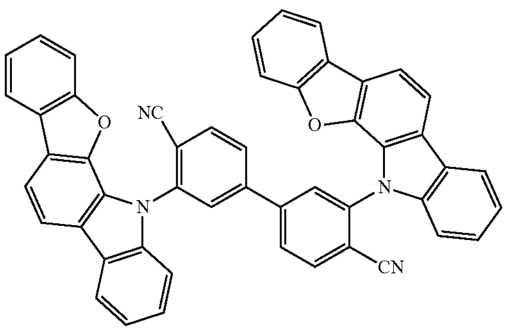
686
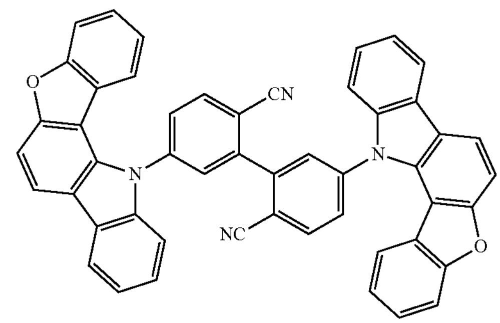
687
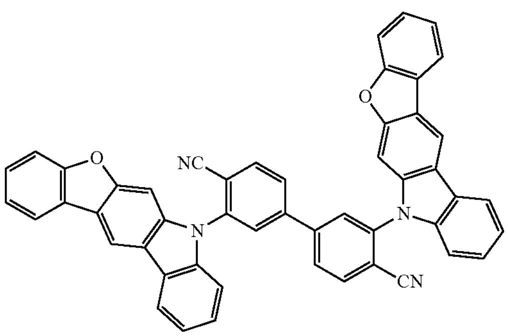
688
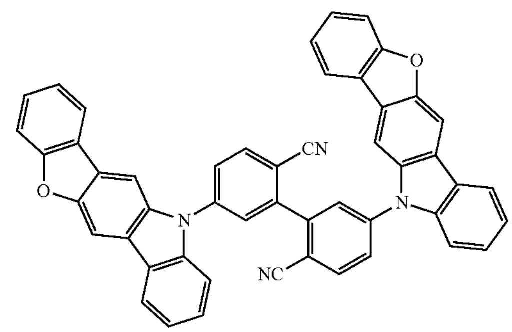
689
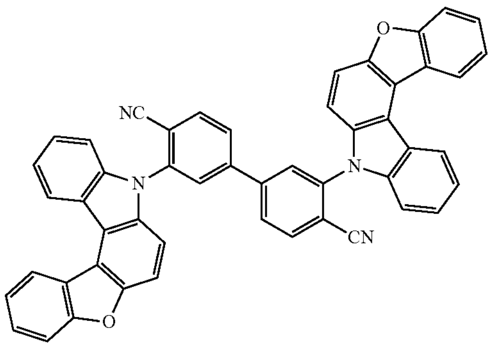
690
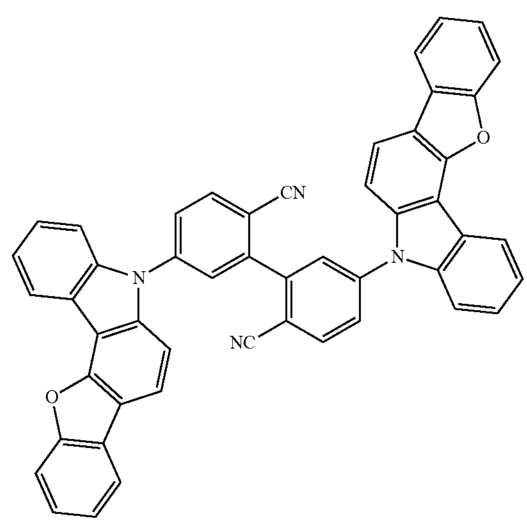

-continued
691
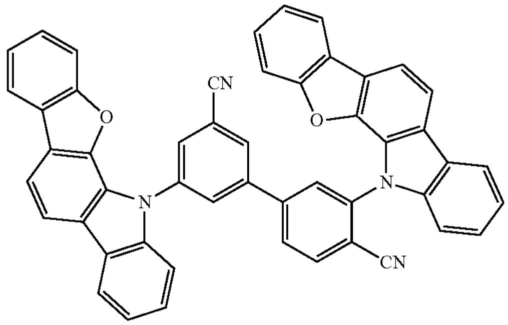
692
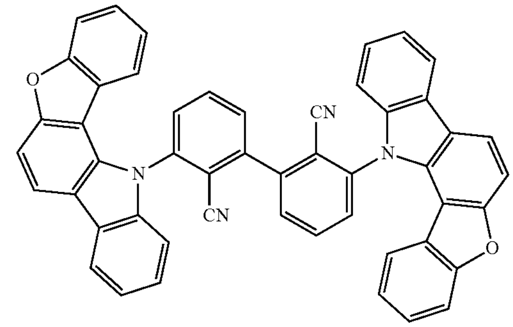
693
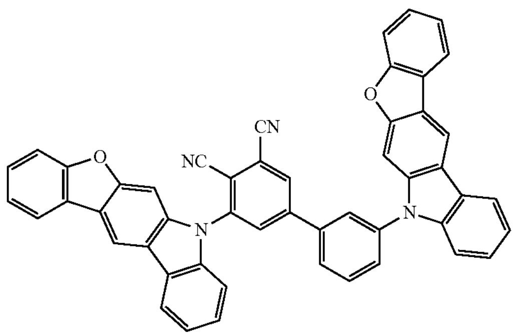
694
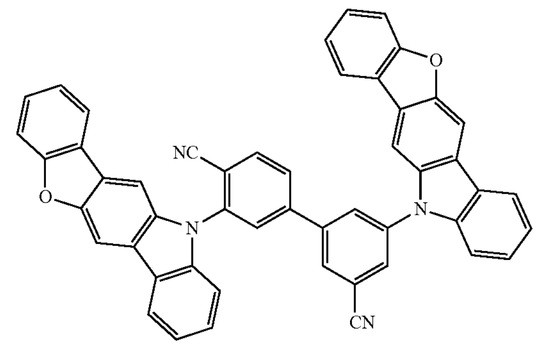
695
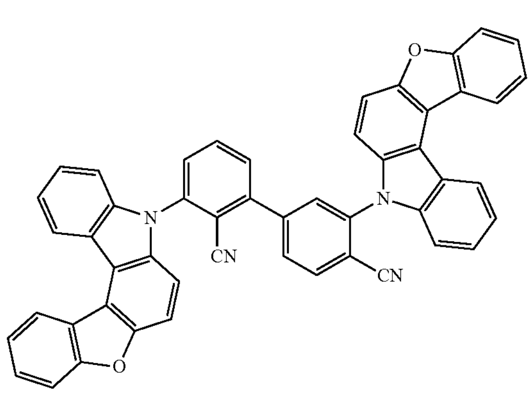
696
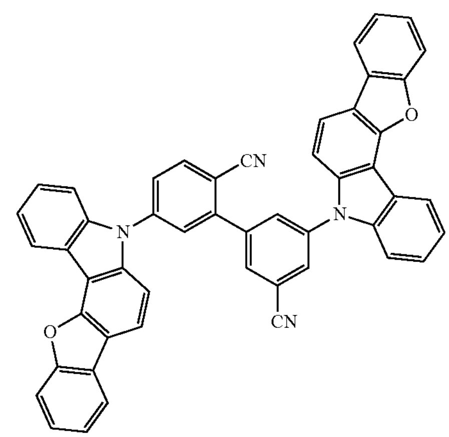
697
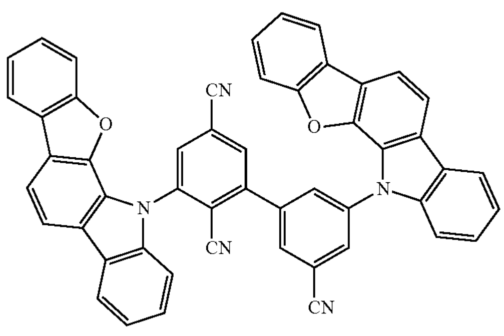
698
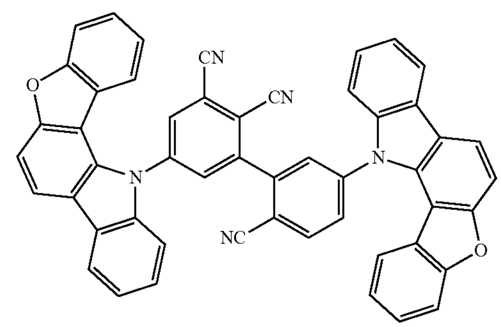

-continued
699
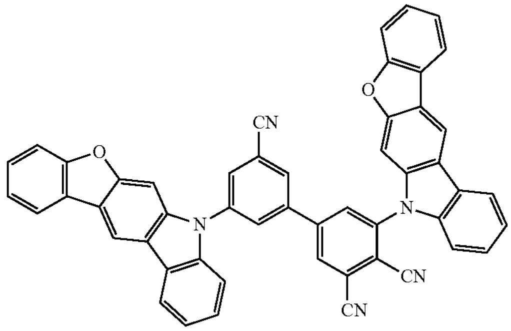
700
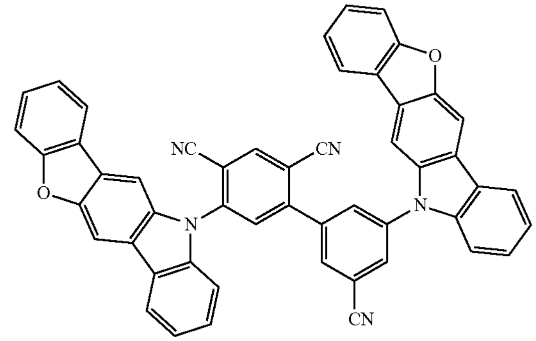
701
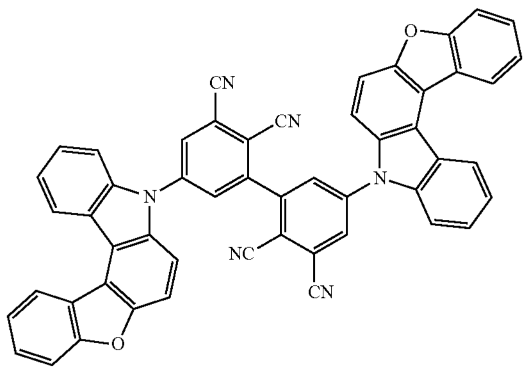
702
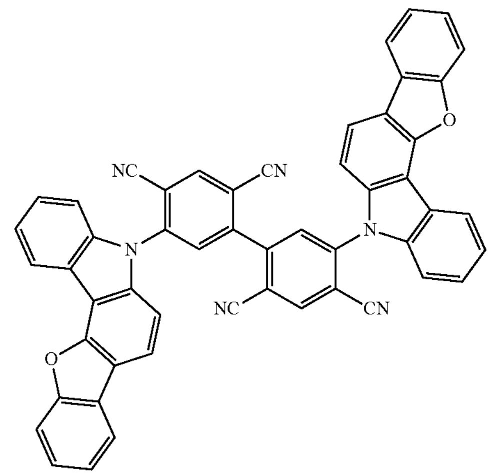
703
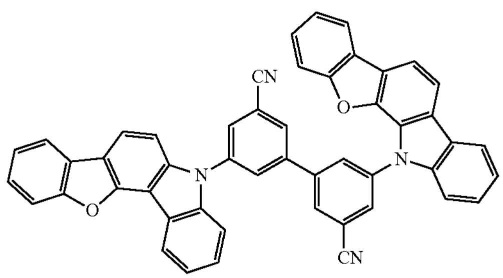
704
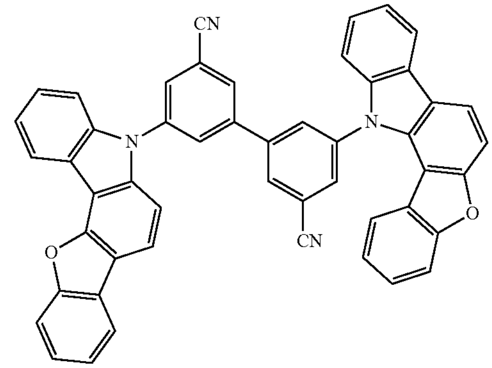
705
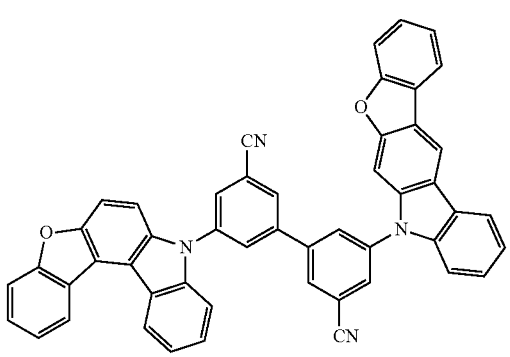
706
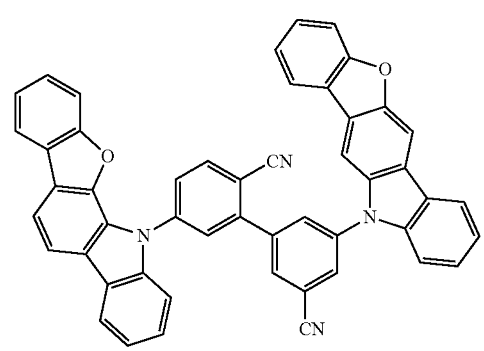

-continued
707
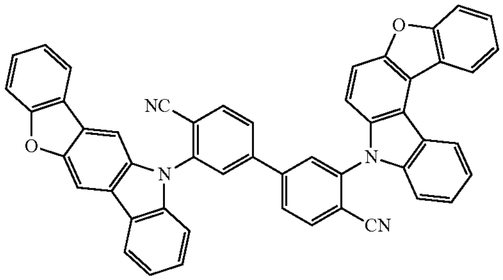
708
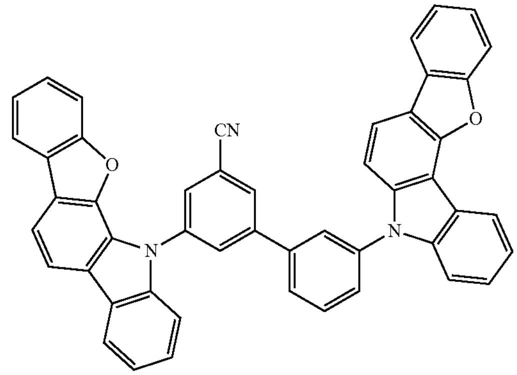
709
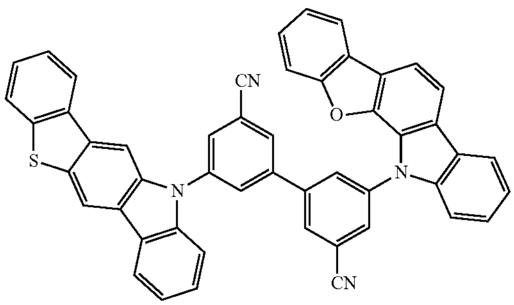
710
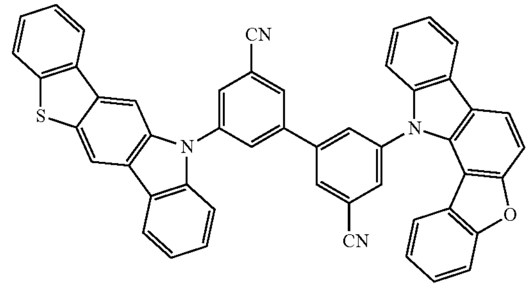
711
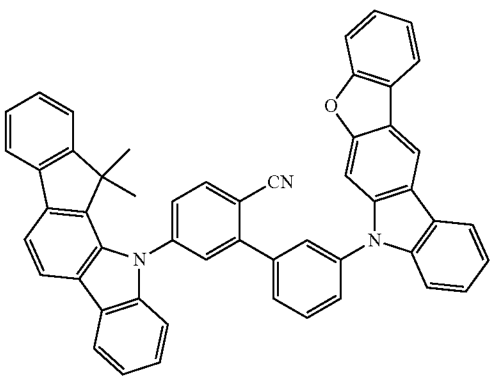
712
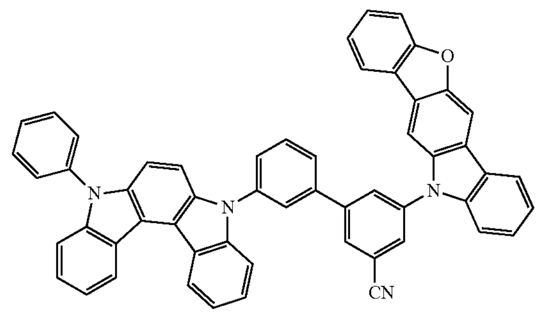
713
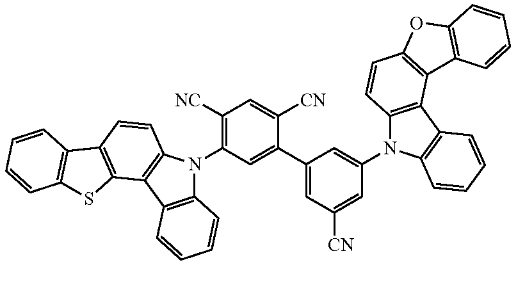
714
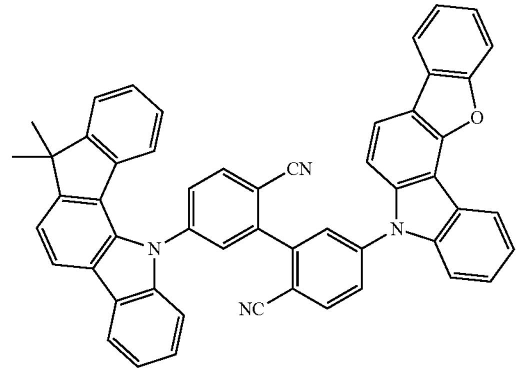

-continued
715
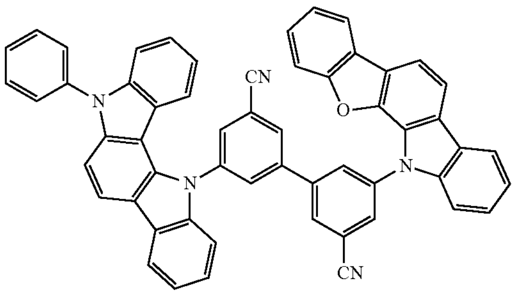
716
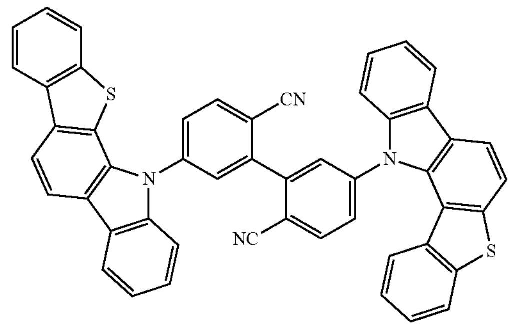
717
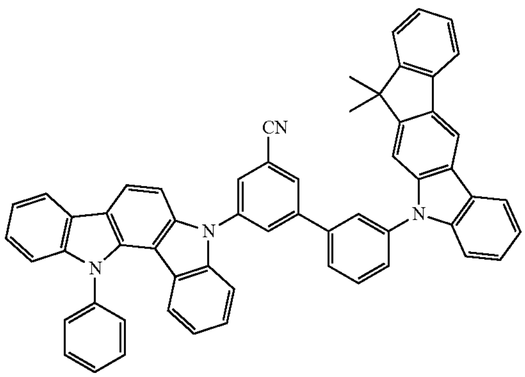
718
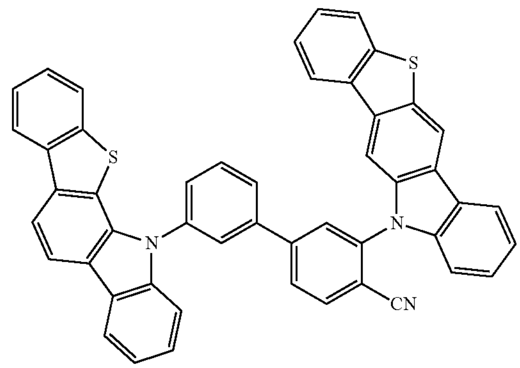
719
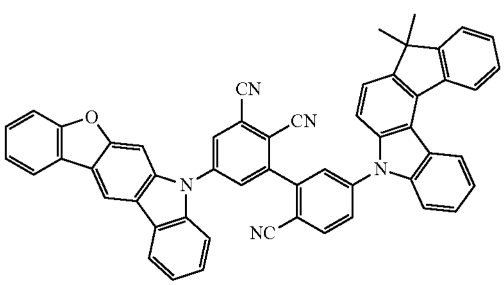
720
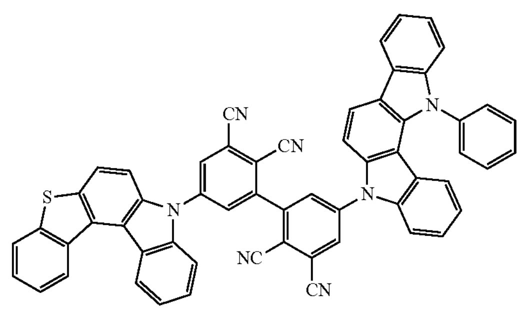
721
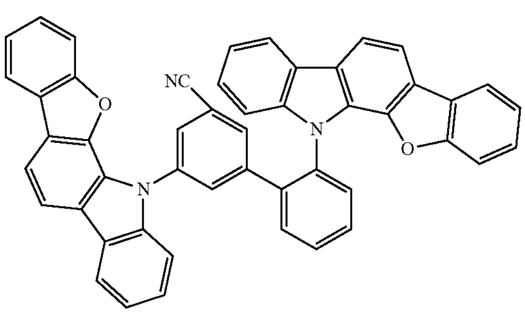
722
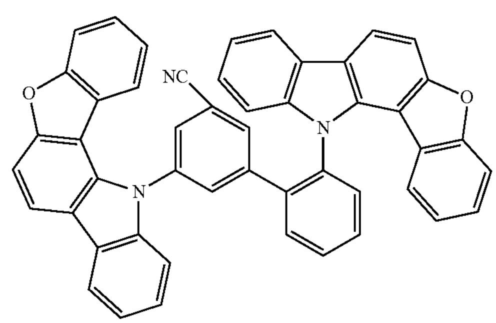

-continued
723
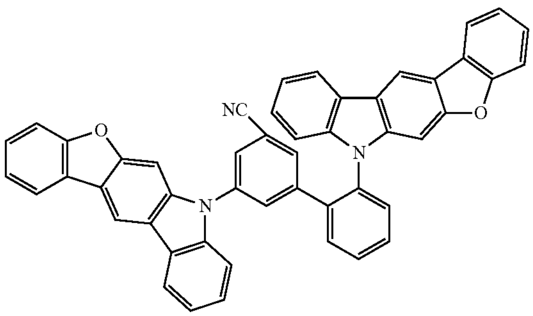
724
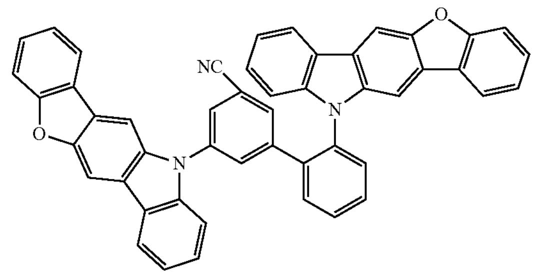
725
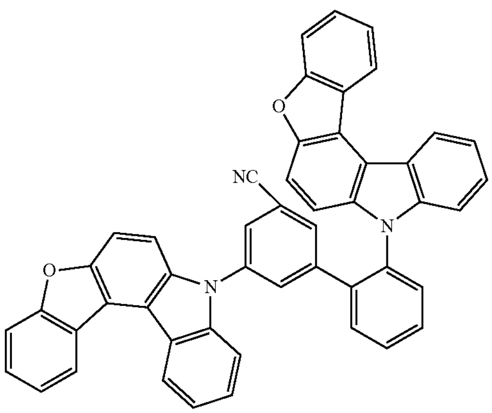
726
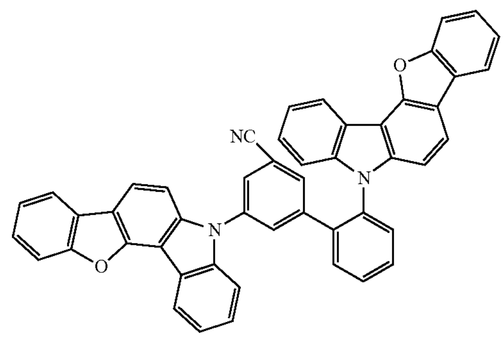
727
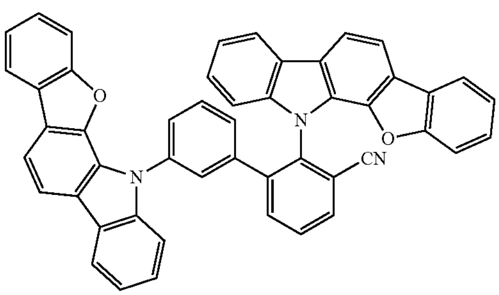
728
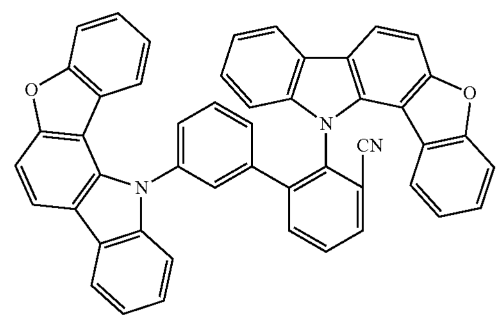
729
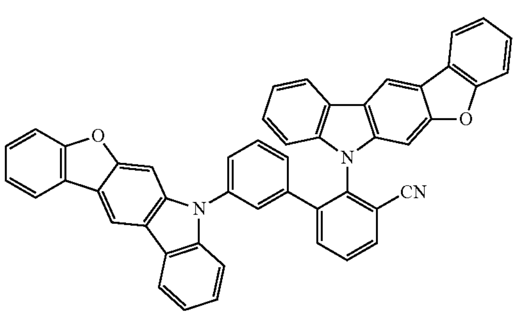
730
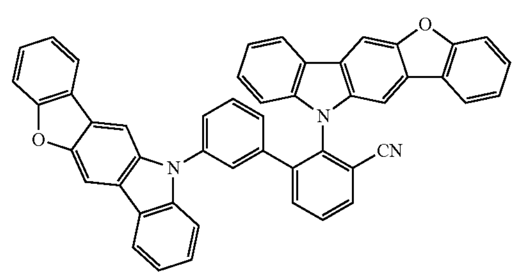

-continued
731
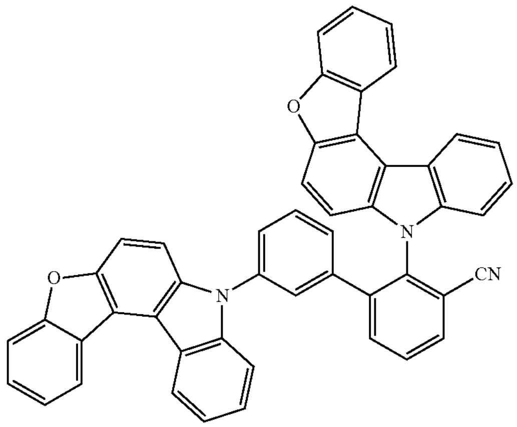
732
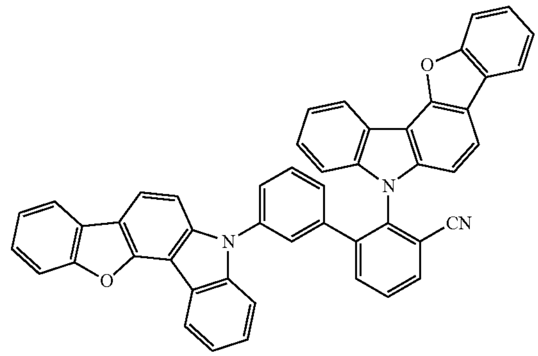
733
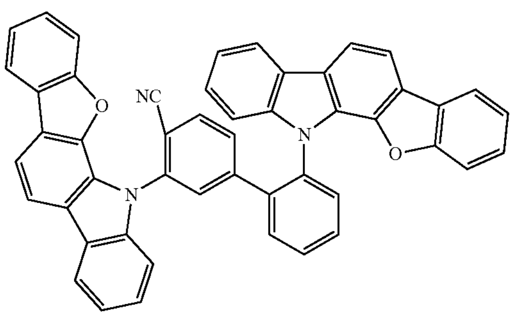
734
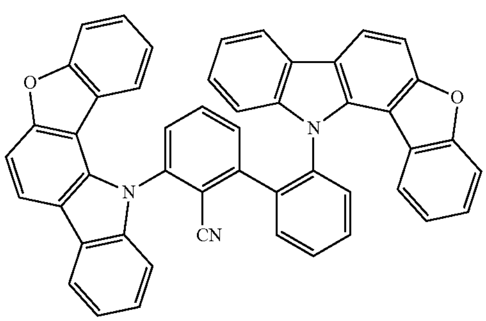
735
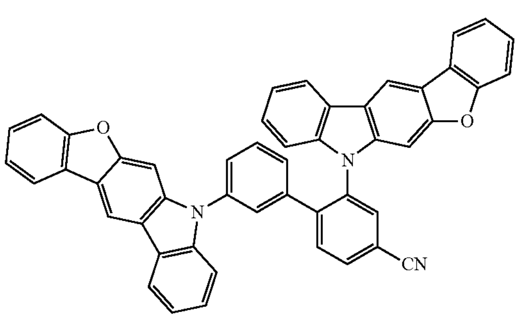
-continued
736
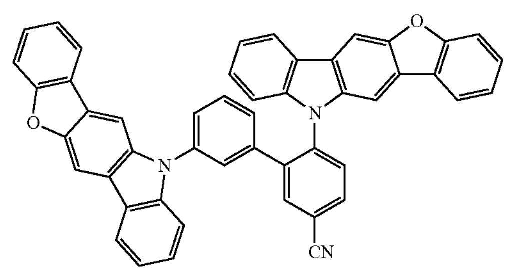
737
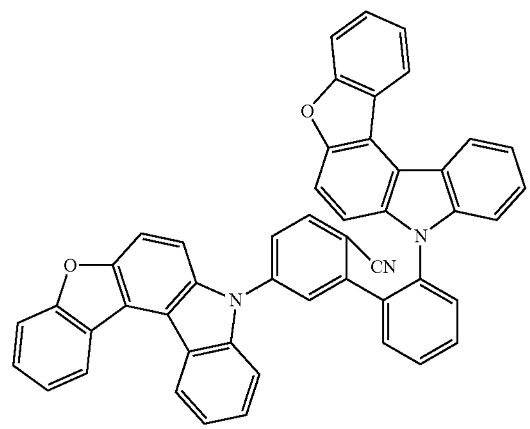
738
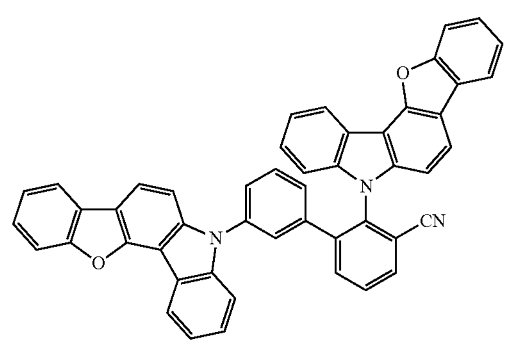

739
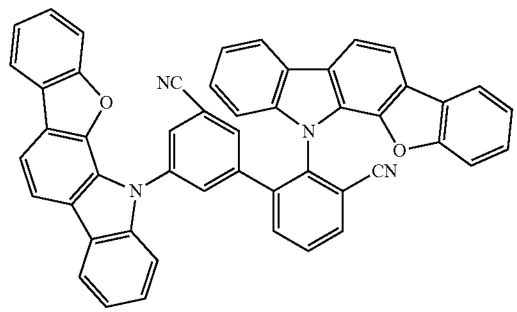
740
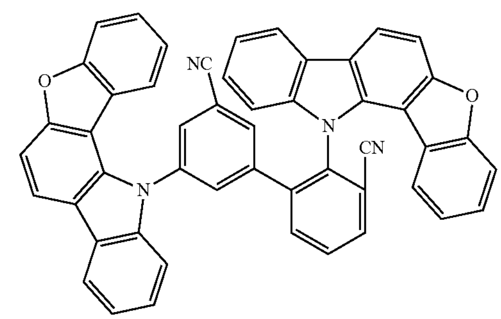
741
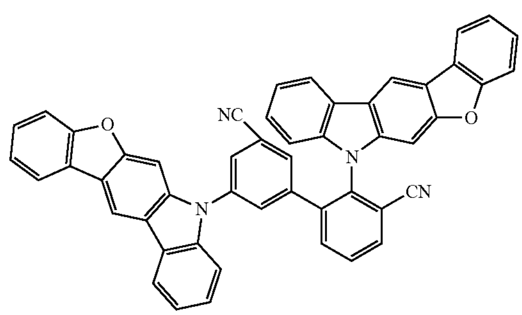
742
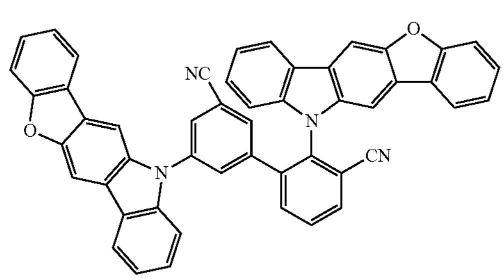
743
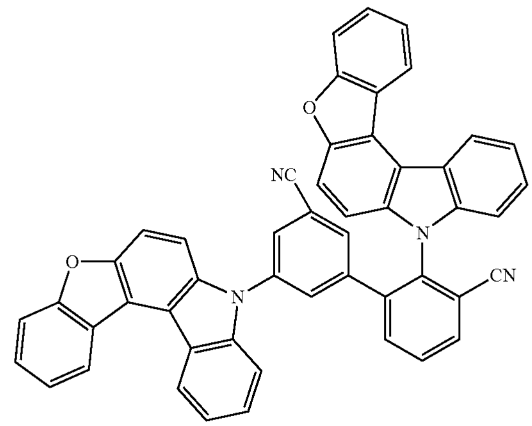
744
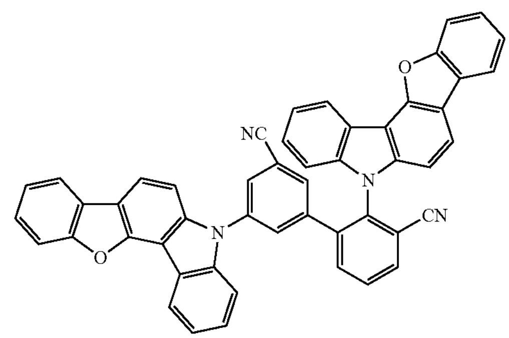
745
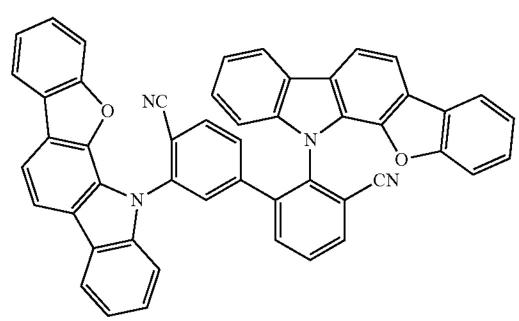
746
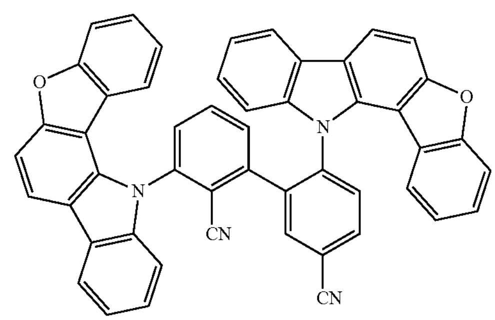

-continued
747
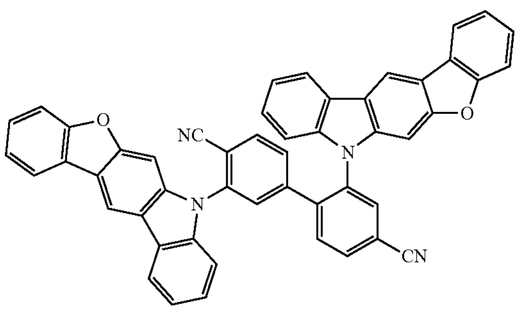
748
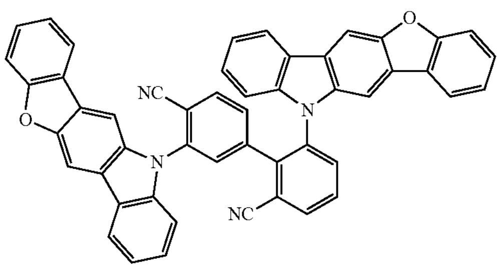
749
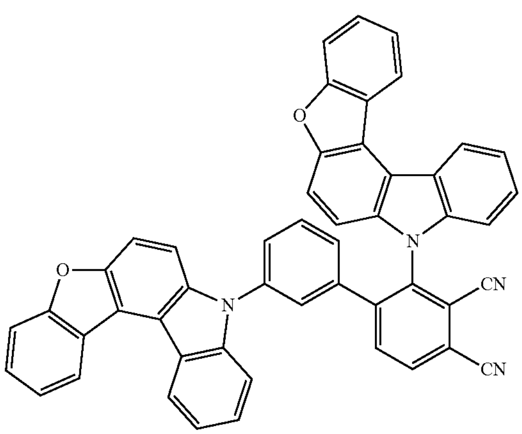
750
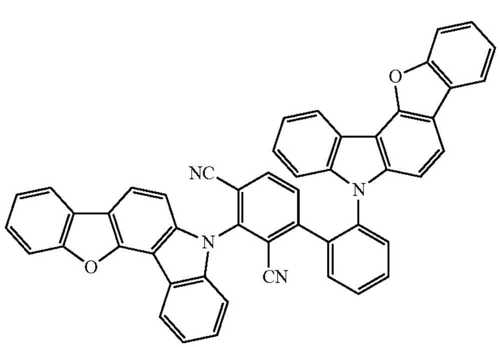
-continued
751
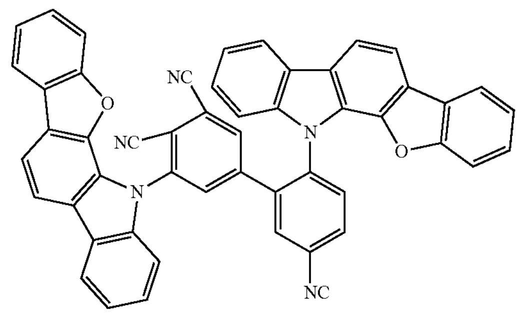
752
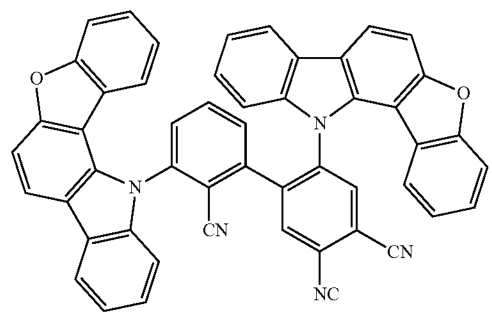
753
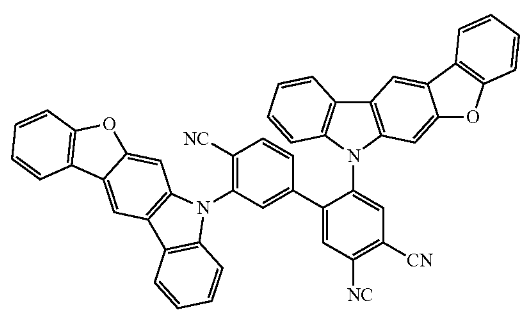
754
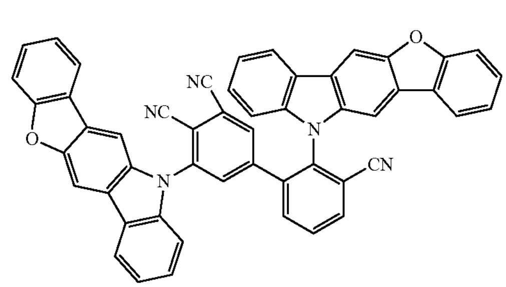

-continued
755
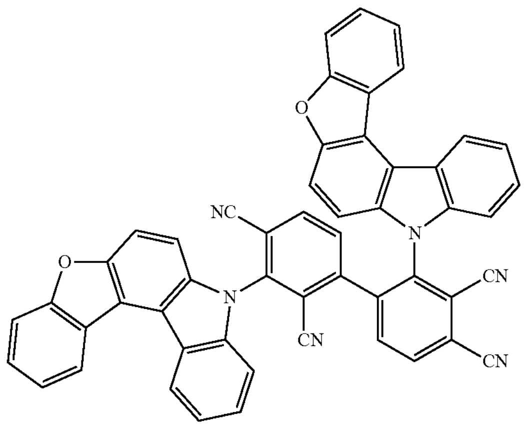
756
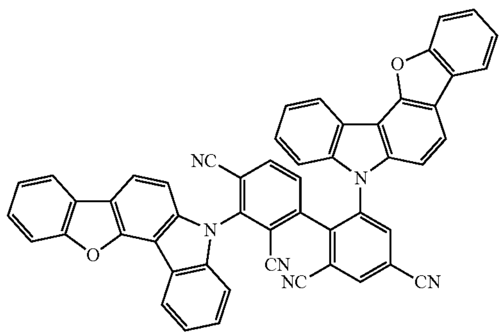
757
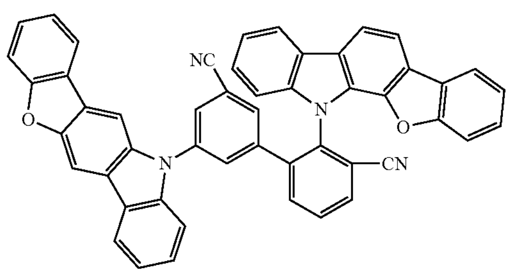
758
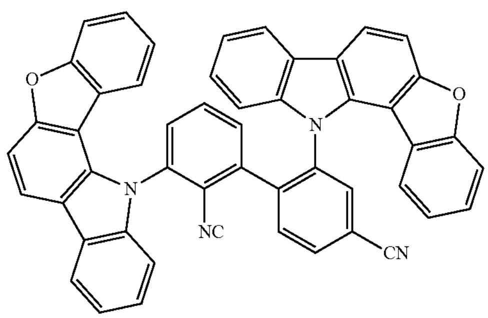
-continued
759
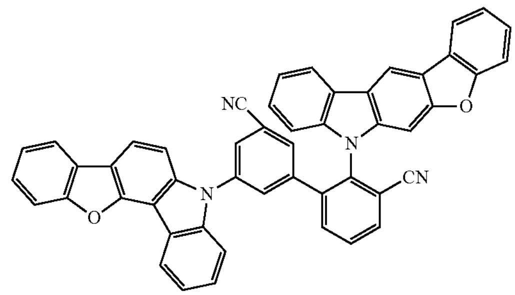
760
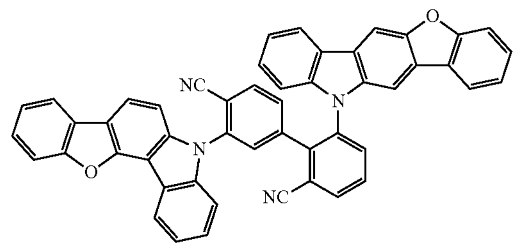
761
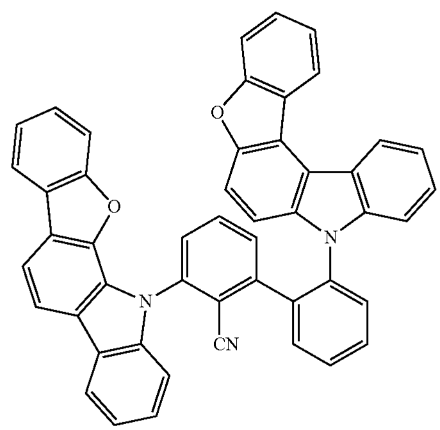
762
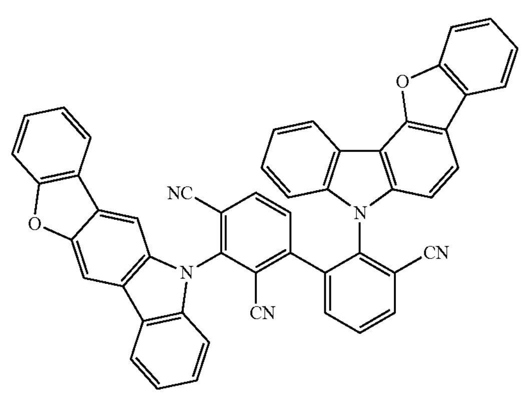

-continued
763
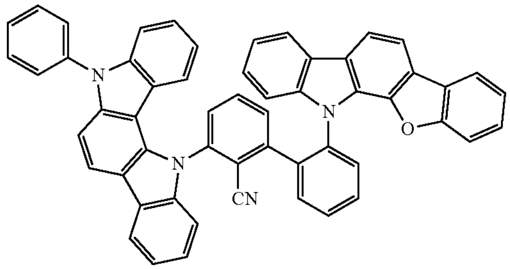
764
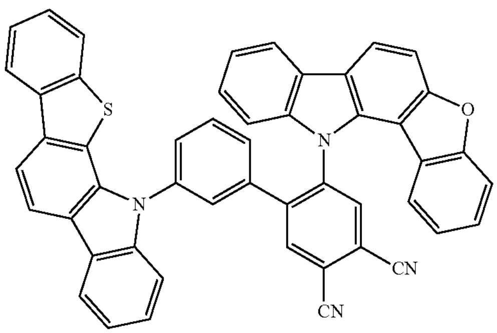
765
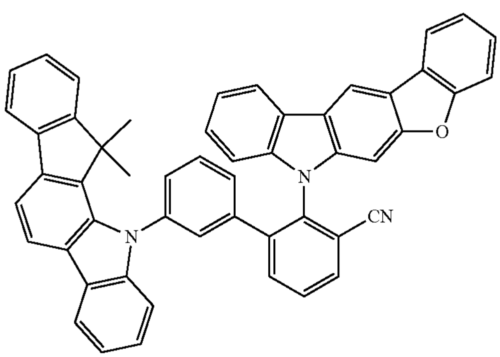
766
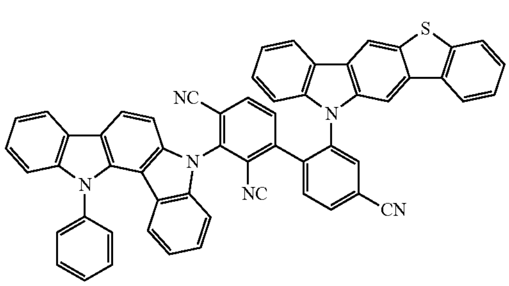
-continued
767
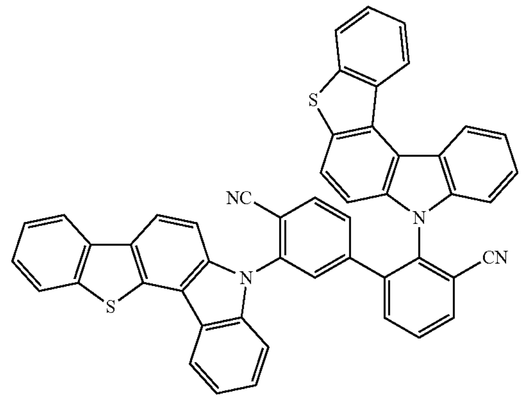
768
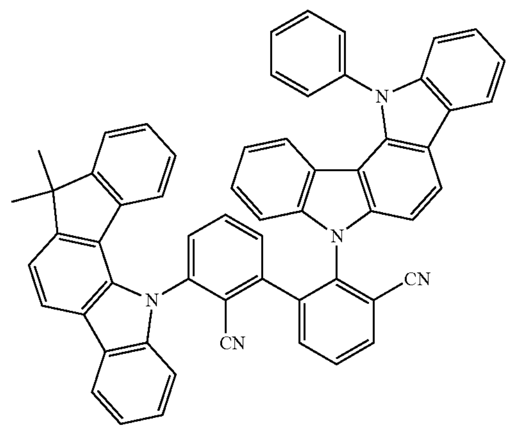
769
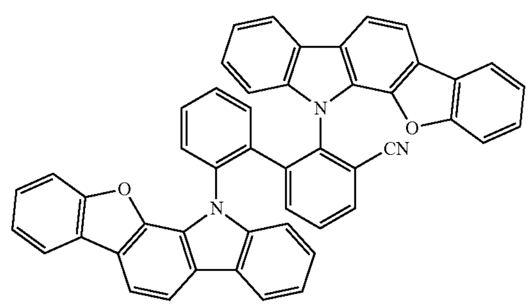
770
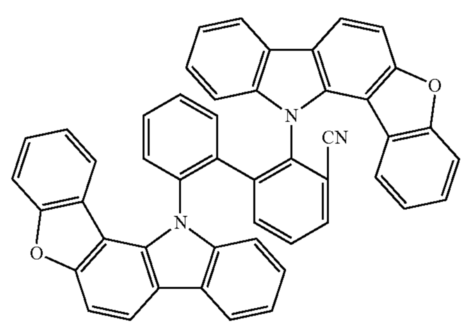

-continued
771
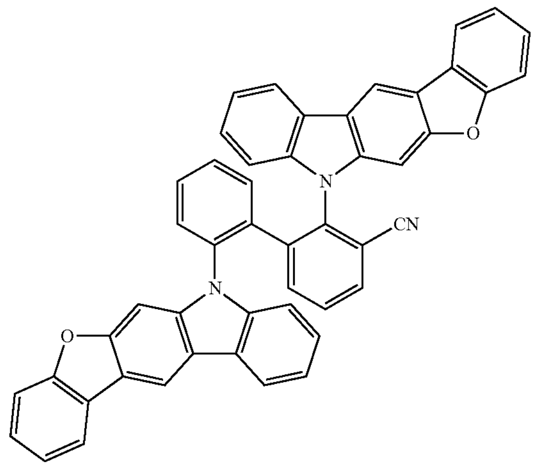
772
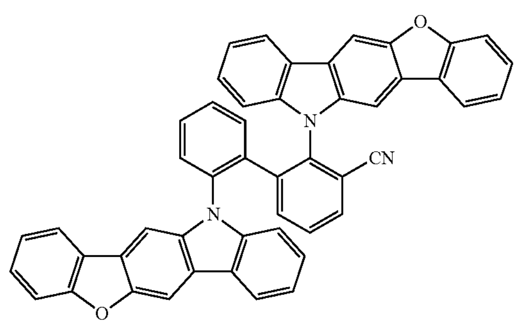
773
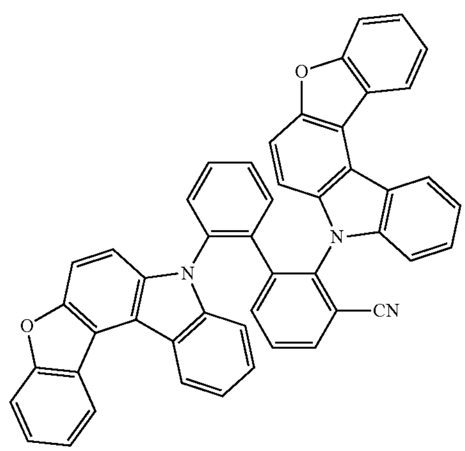
774
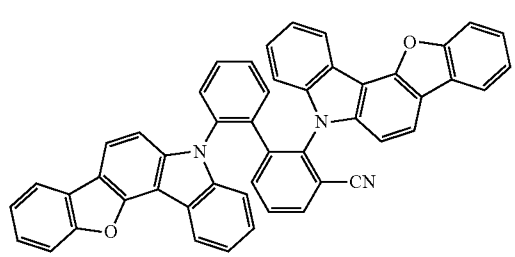
-continued
775
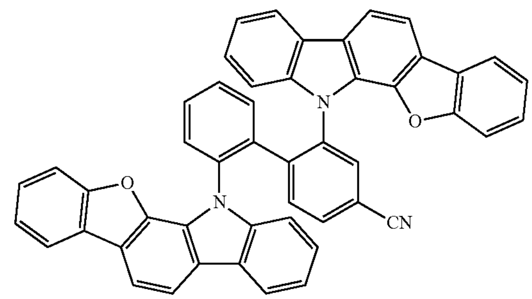
776
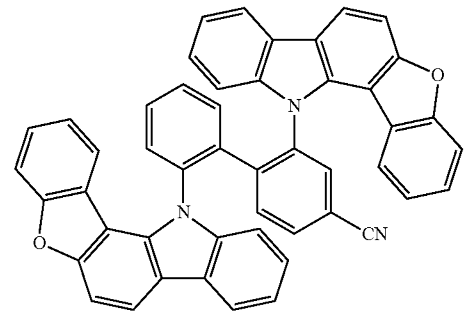
777
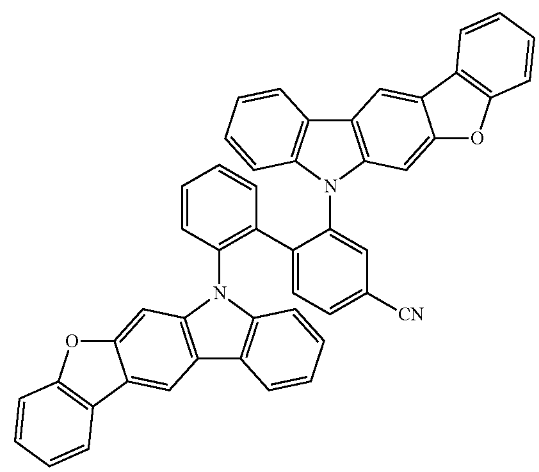
778
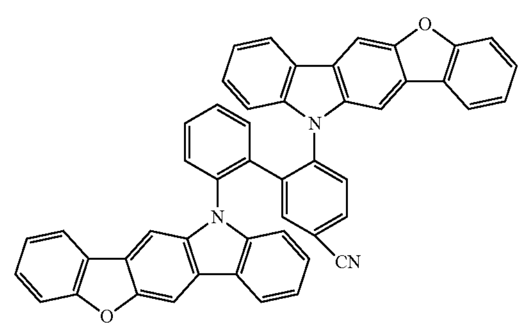

-continued
779
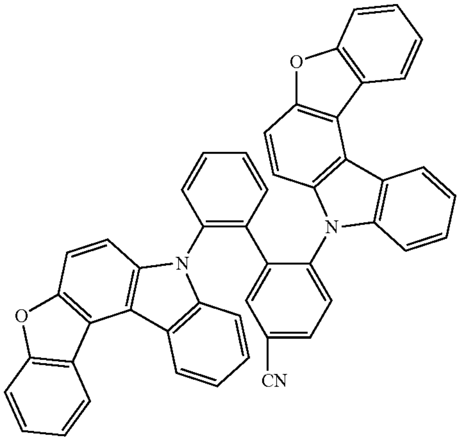
780
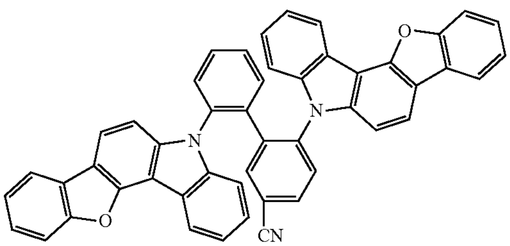
781
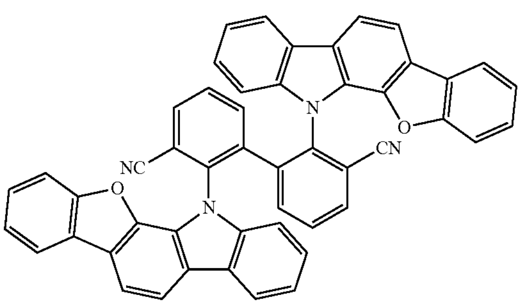
782
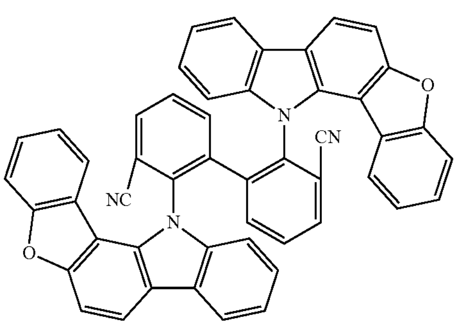
-continued
783
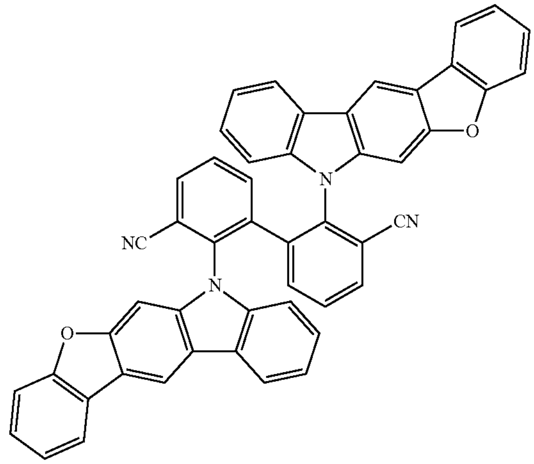
784
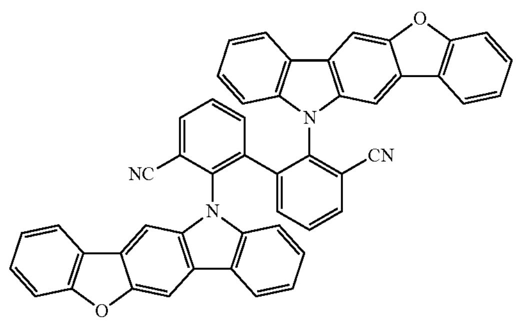
785
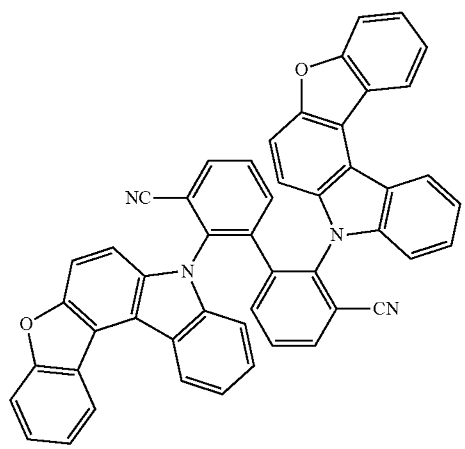
786
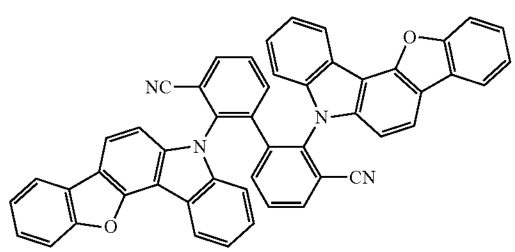

-continued
787
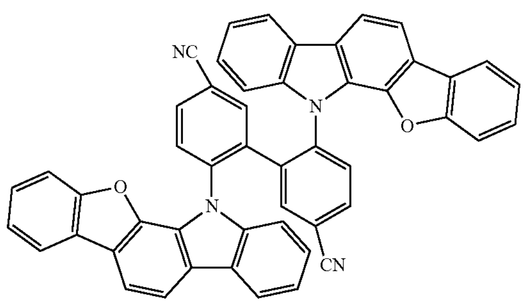
788
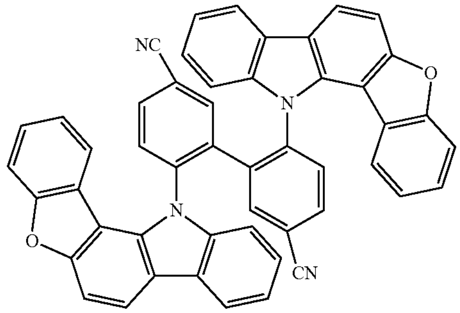
789
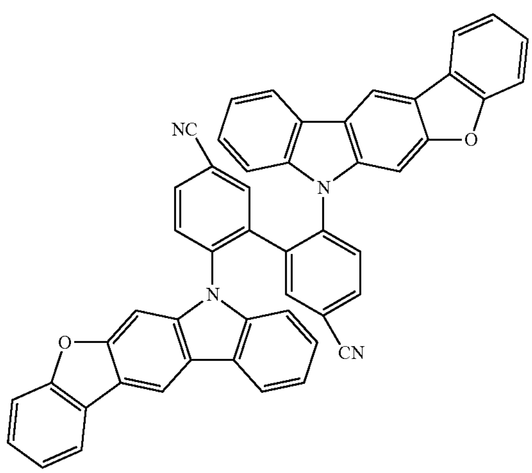
790
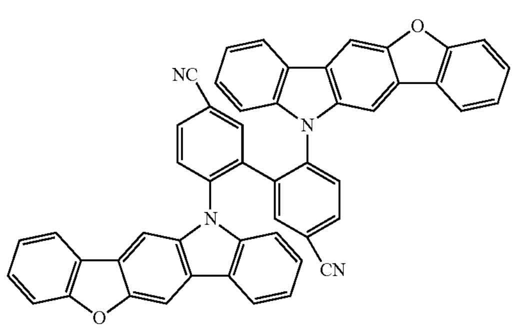
-continued
791
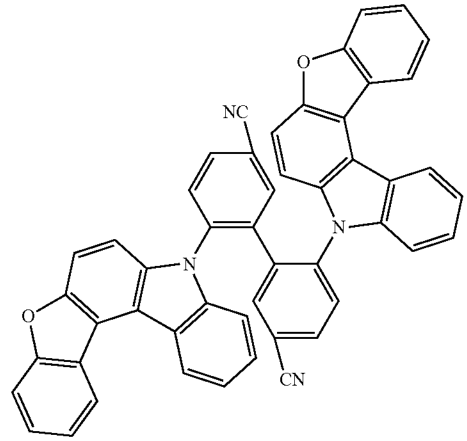
792
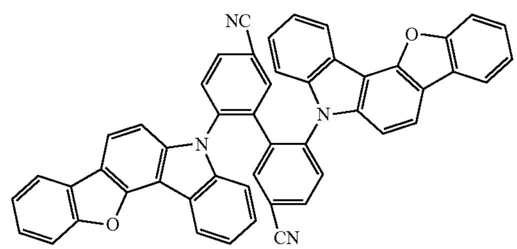
793
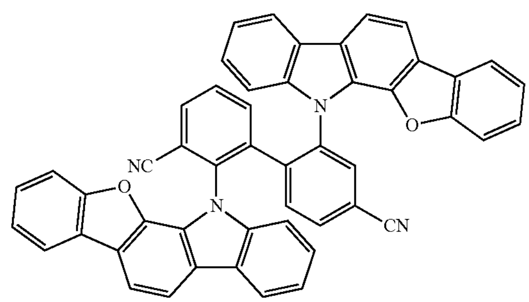
794
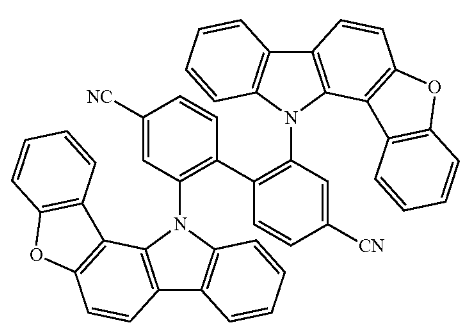

-continued
795
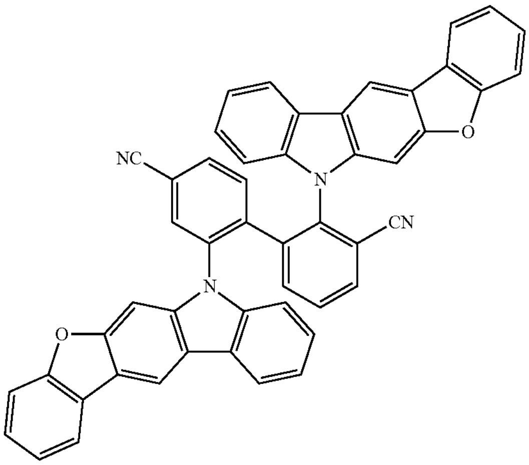
796
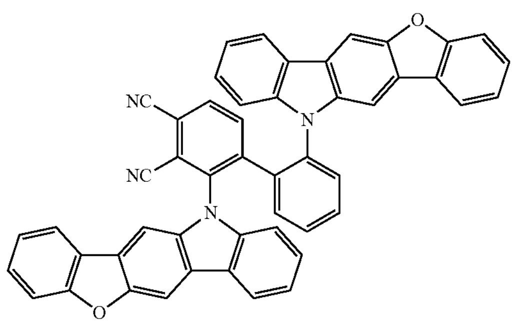
797
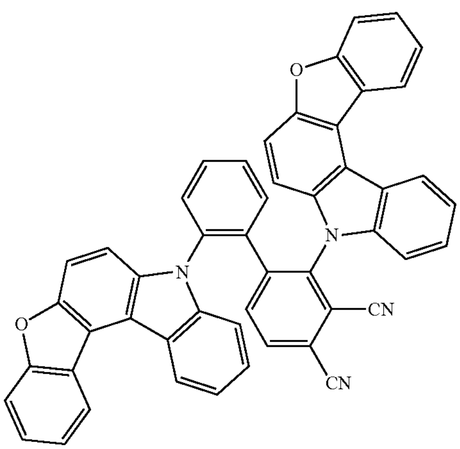
798
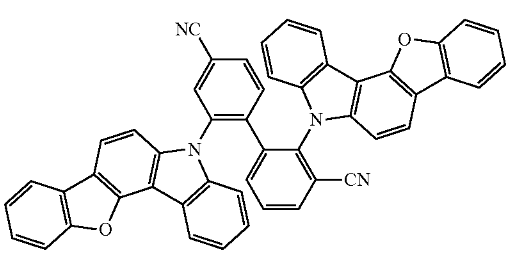
-continued
799
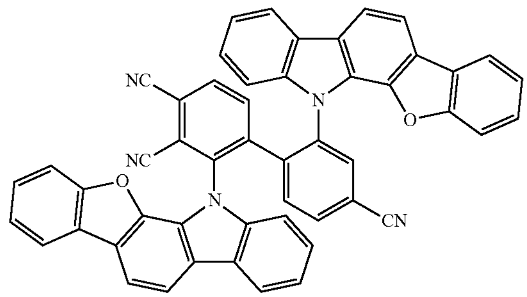
800
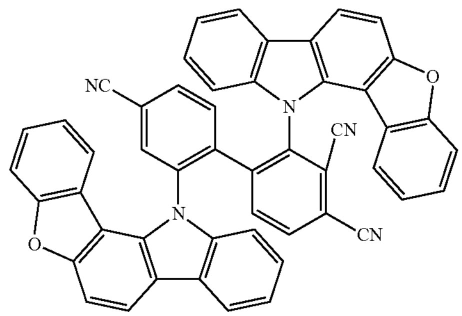
801
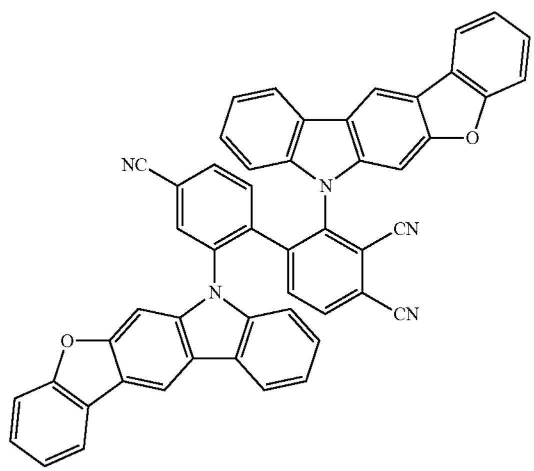
802
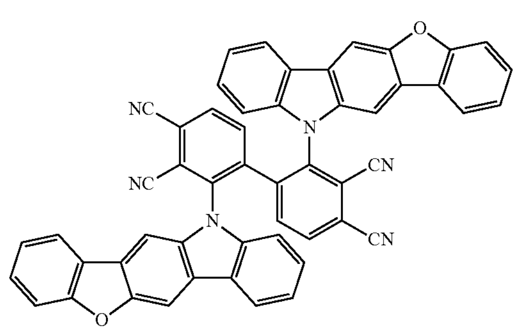

-continued
803
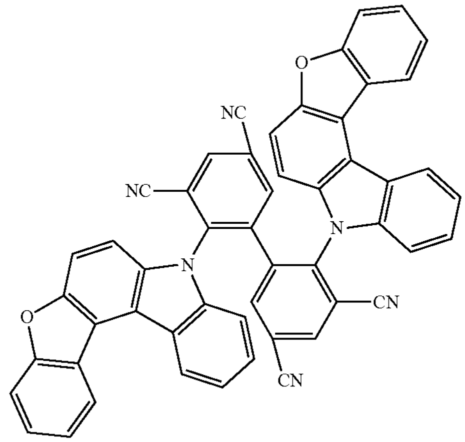
804
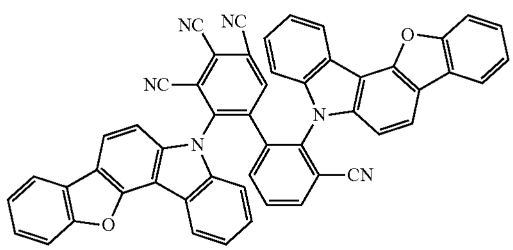
805
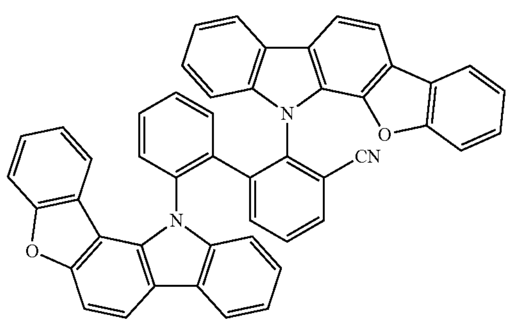
806
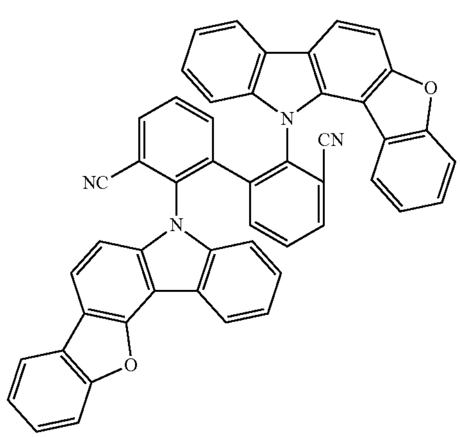
-continued
807
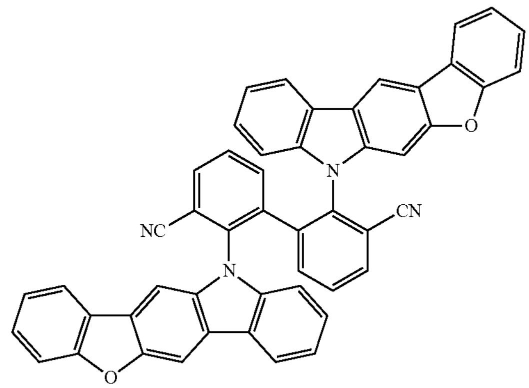
808
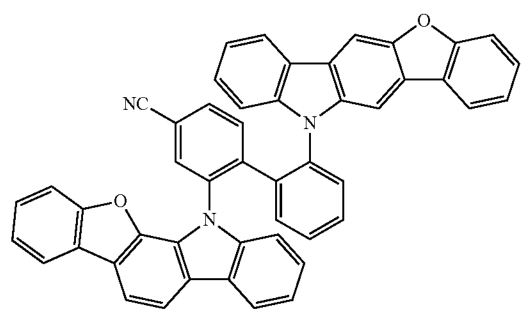
809
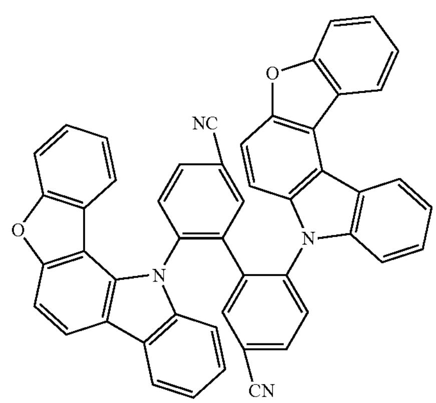
810
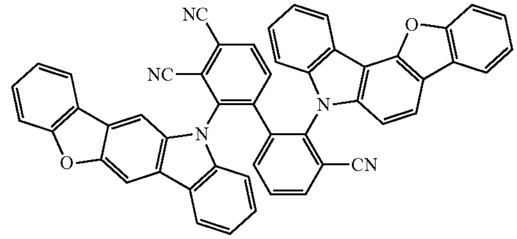

-continued
811
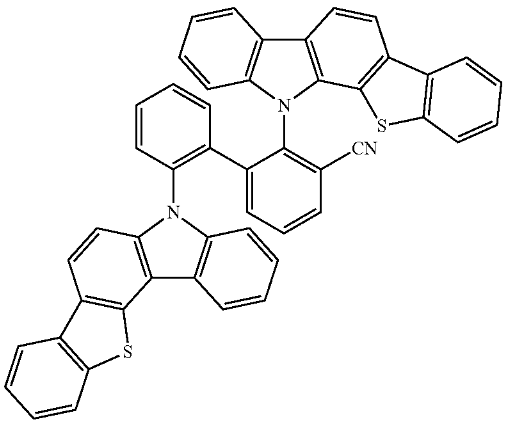
812
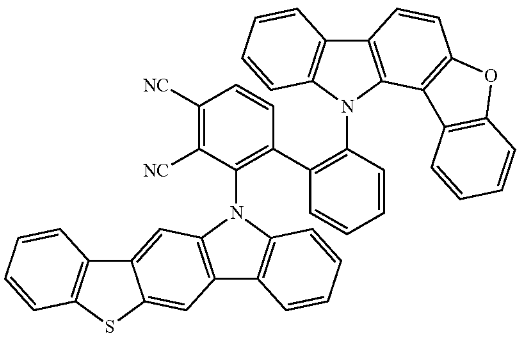
813
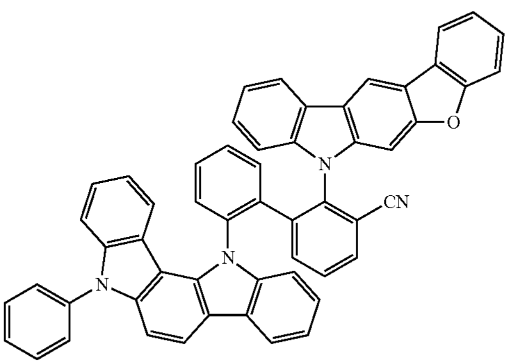
814
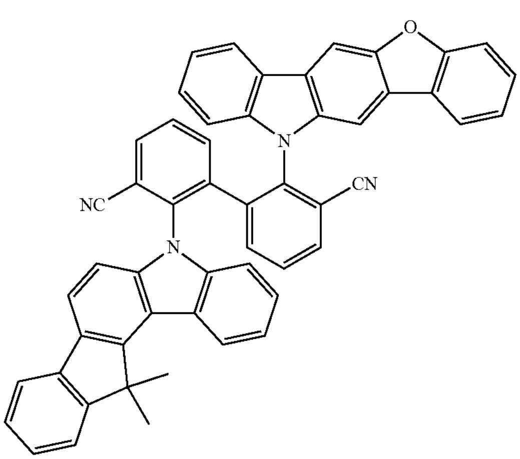
-continued
815
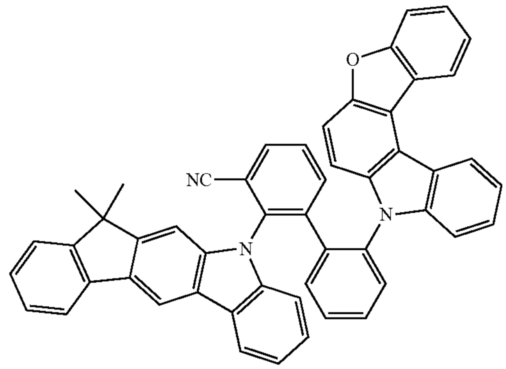
816
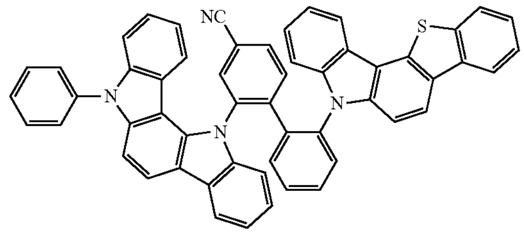
817
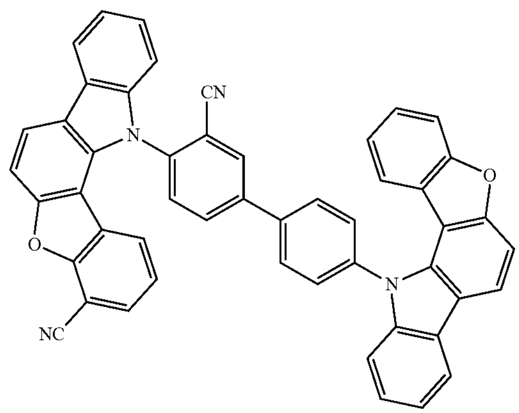
818
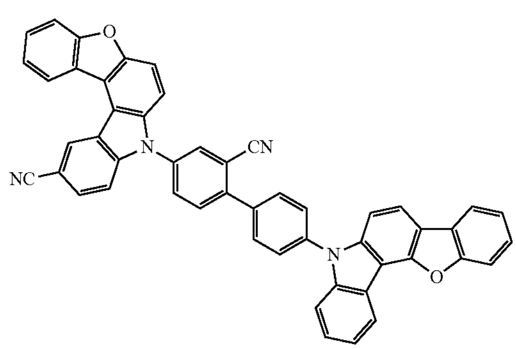

-continued
819
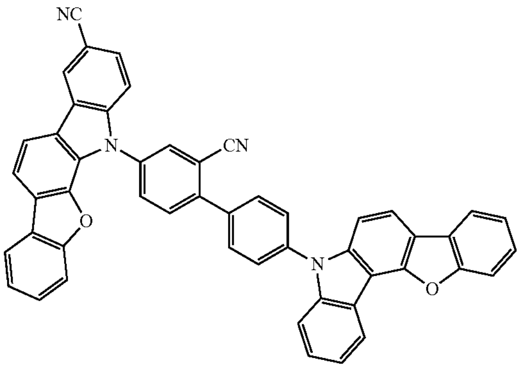
820
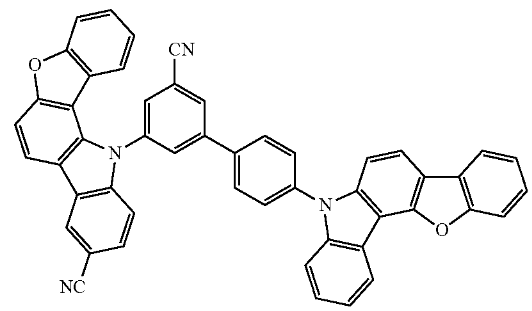
821
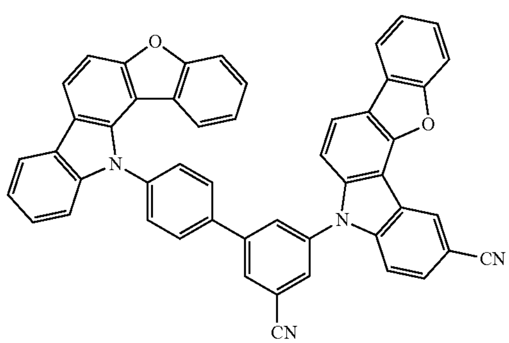
822
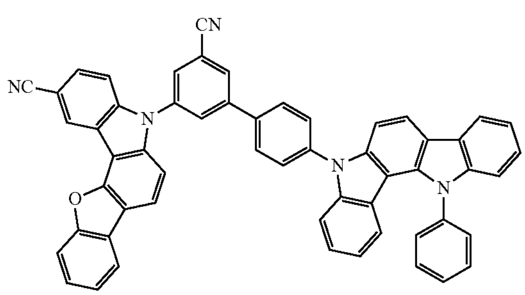
-continued
823
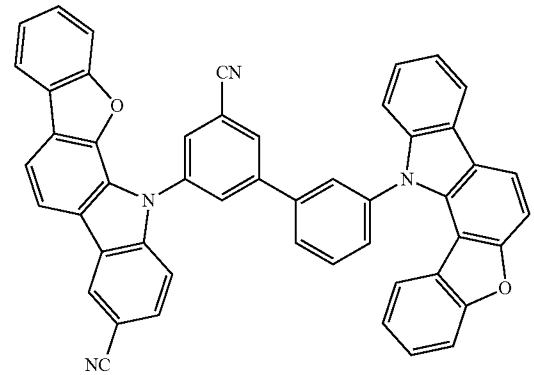
824
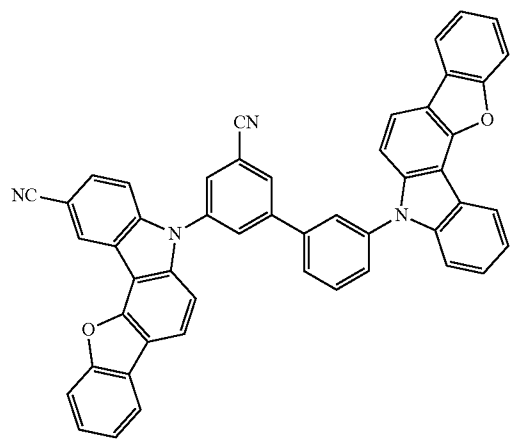
825
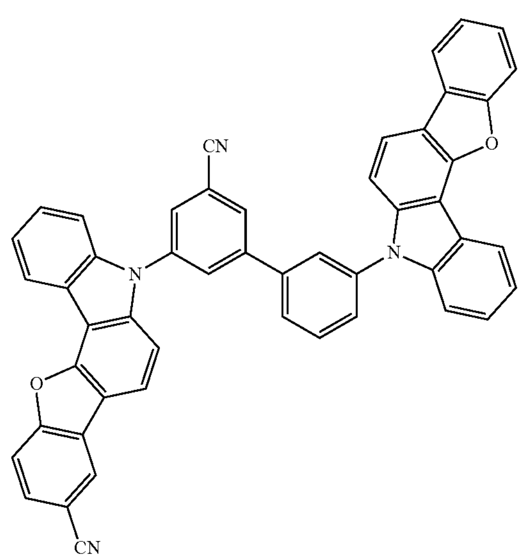

-continued
826
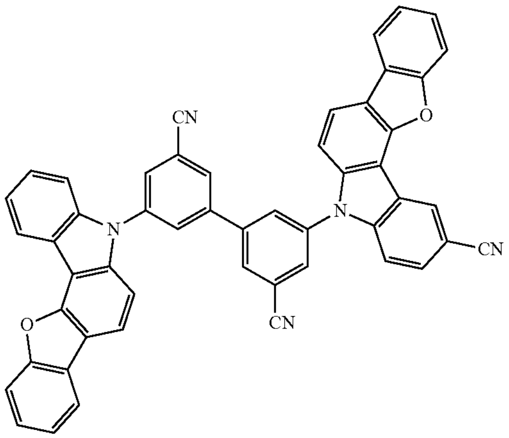
827
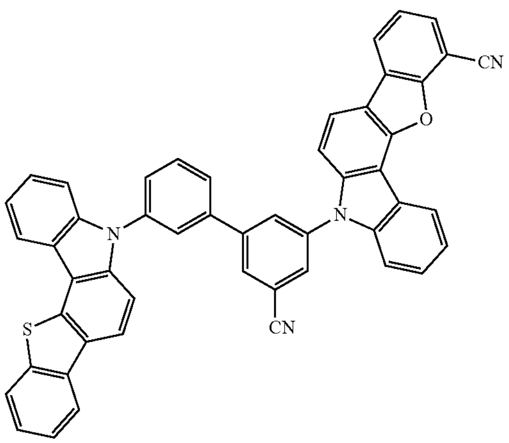
828
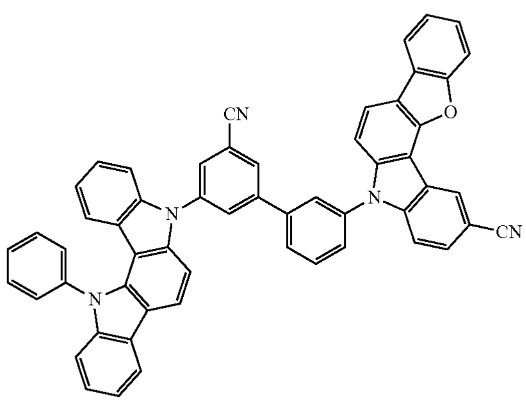
-continued
829
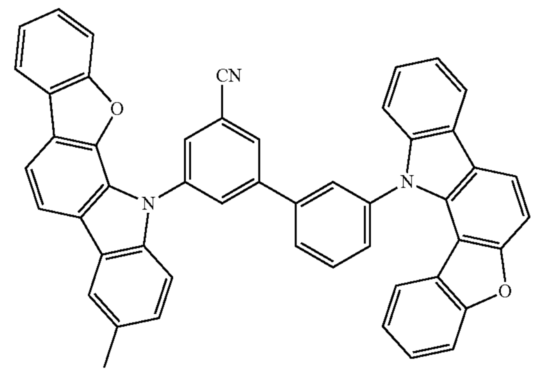
830
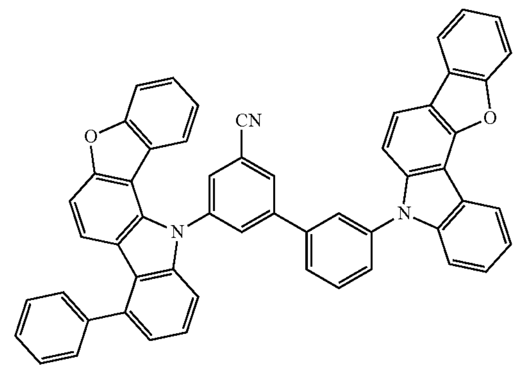
831
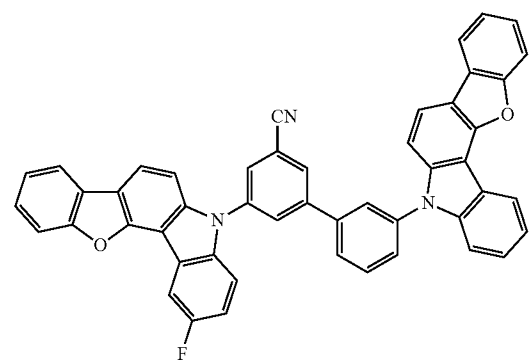
832
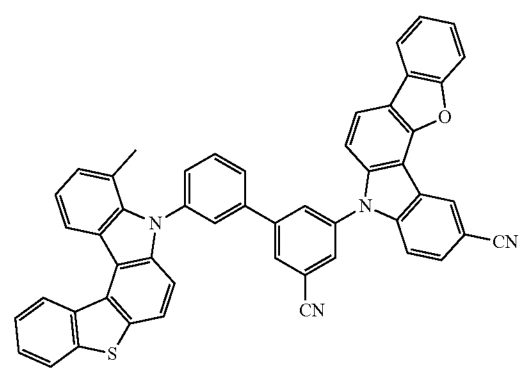

-continued
833
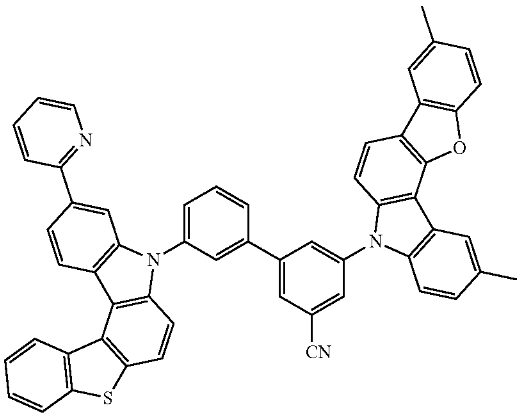
834
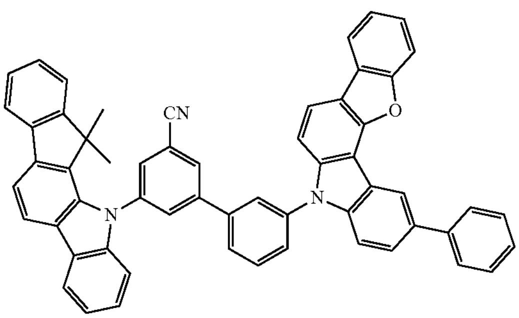
835
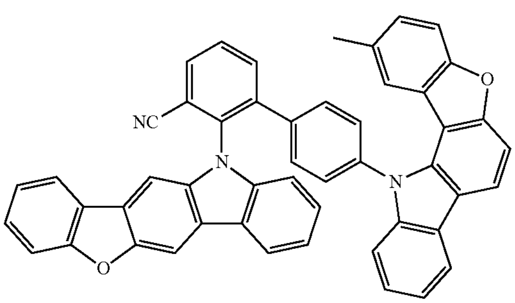
836
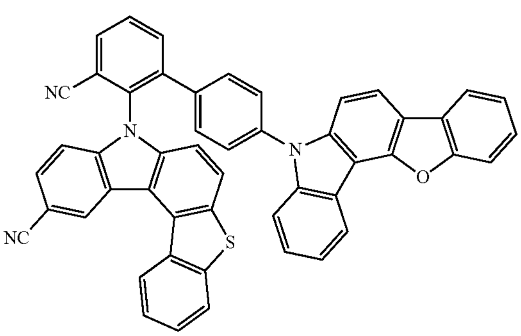
-continued
837
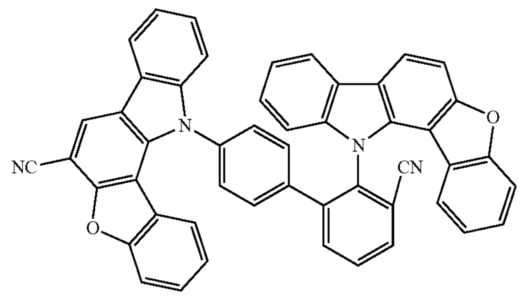
838
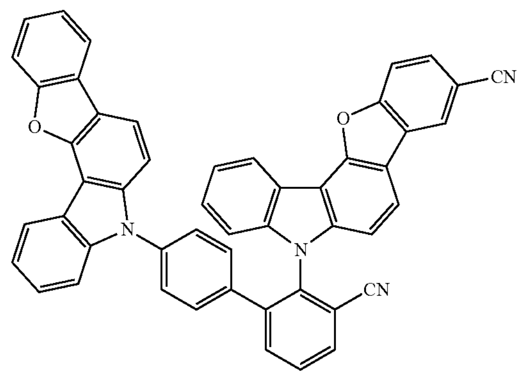
839
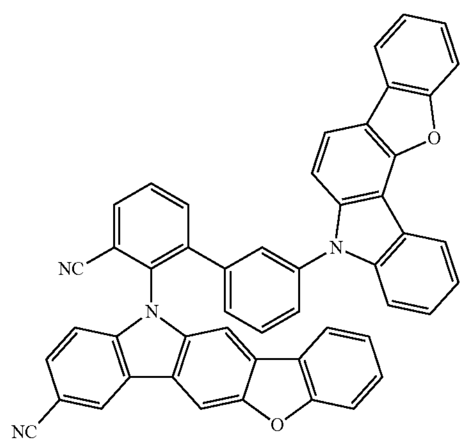
840
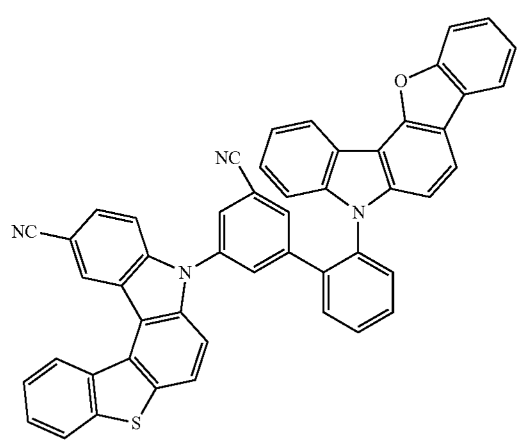

-continued
841
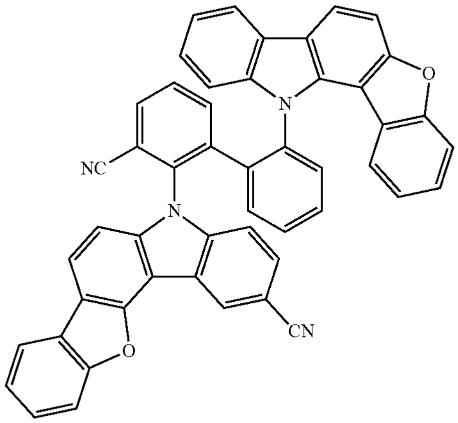
842
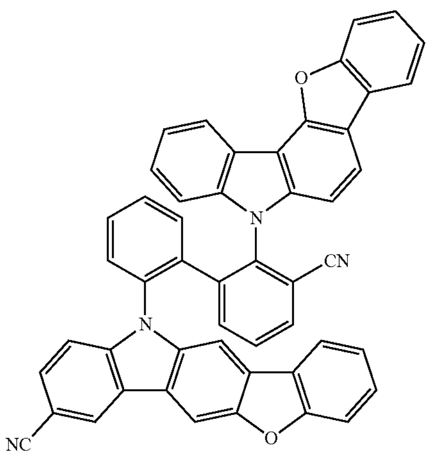
843
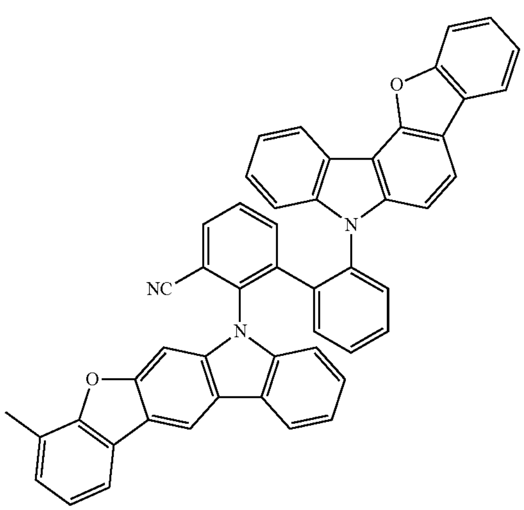
-continued
844
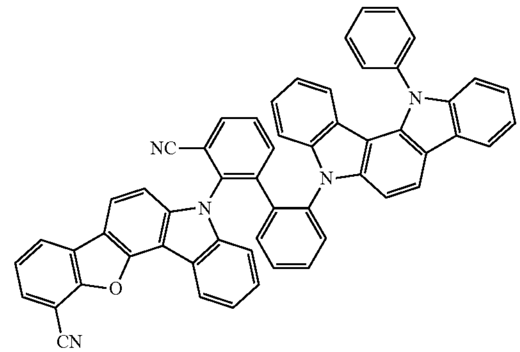
845
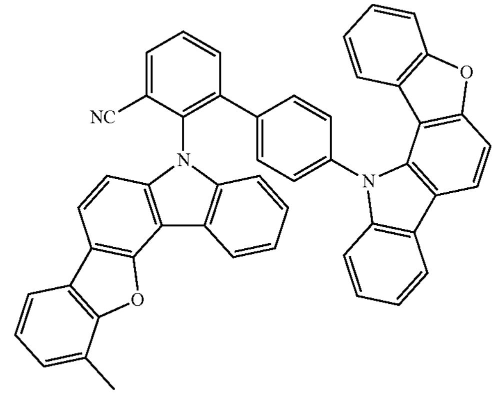
846
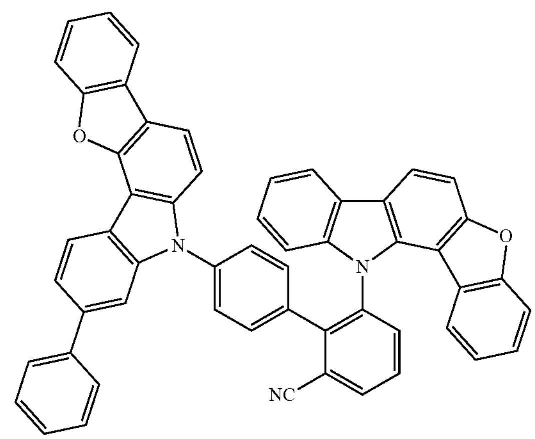
847
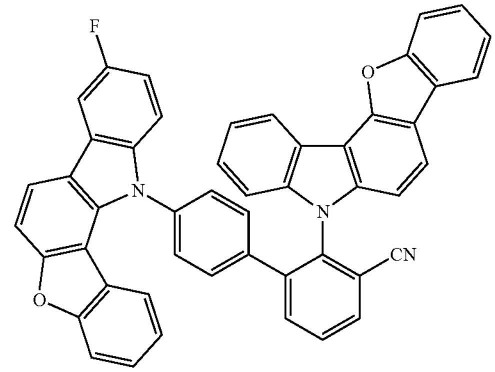

-continued
848
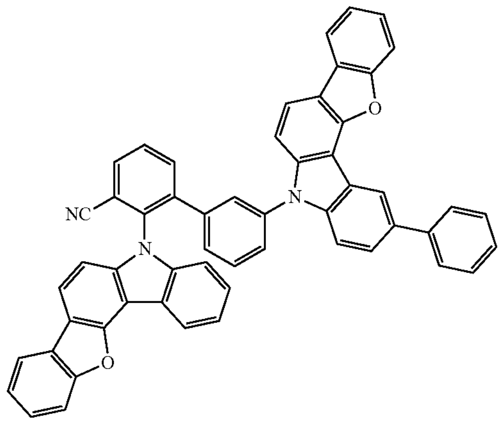
849
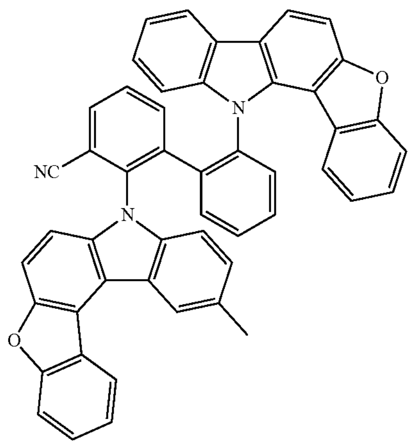
850
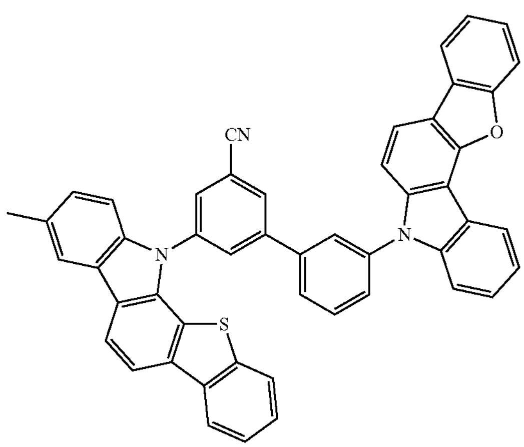
-continued
851
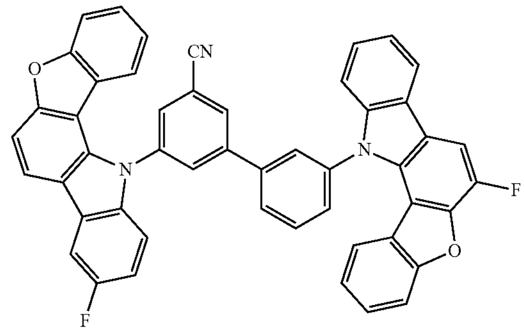
852
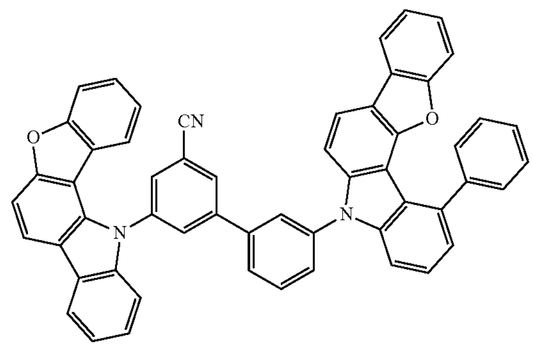
<Group HE3>
1
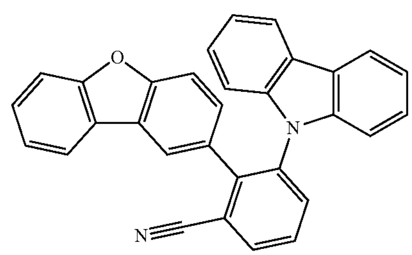
2
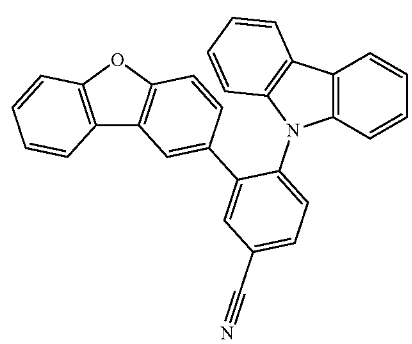

-continued
3
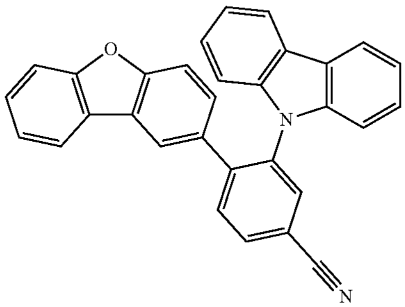
4
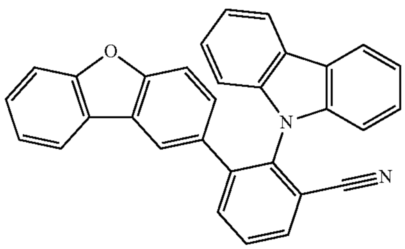
5
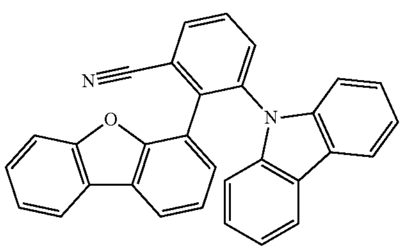
6
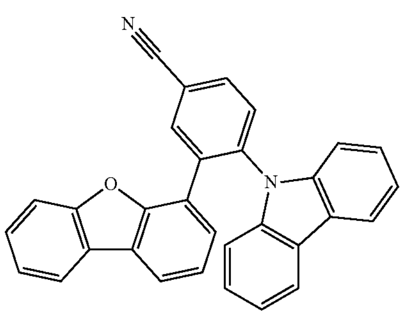
7
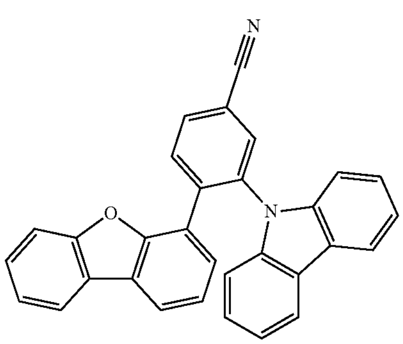
-continued
8
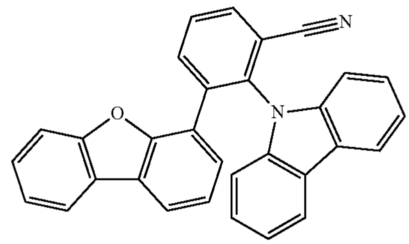
9
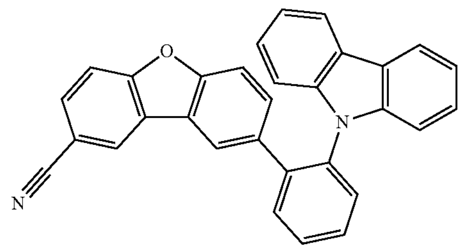
10
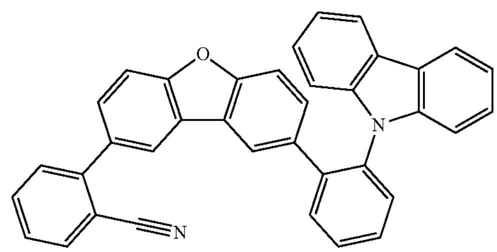
11
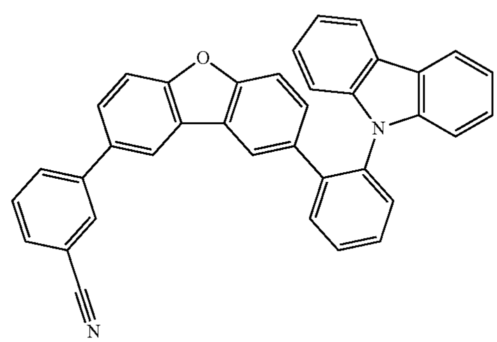
12
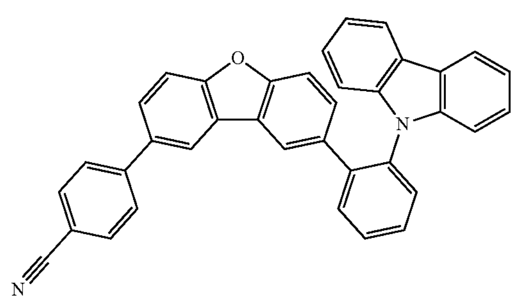

13
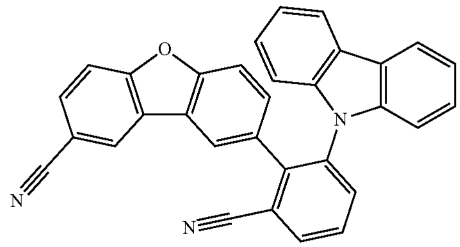
14
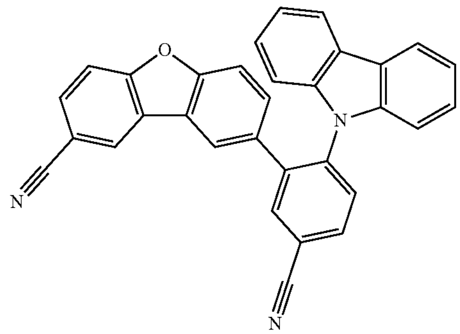
15
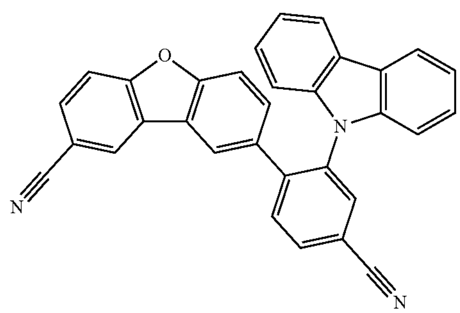
16
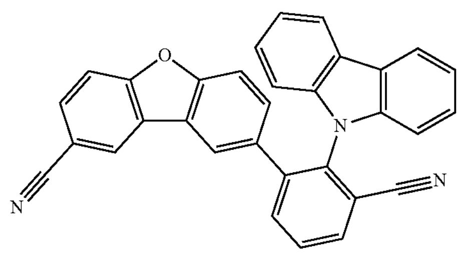
17
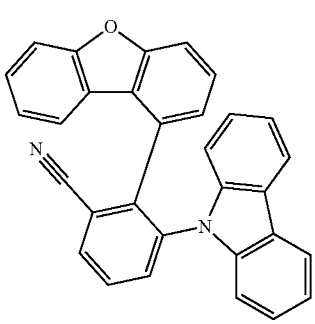
18
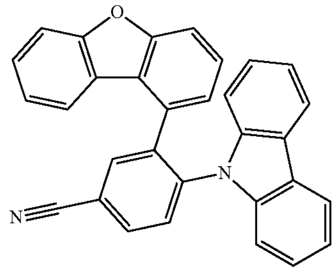
19
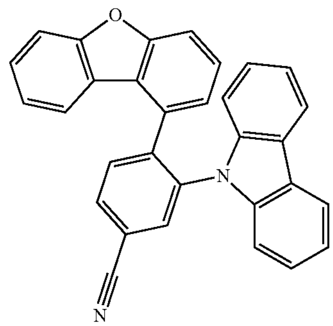
20
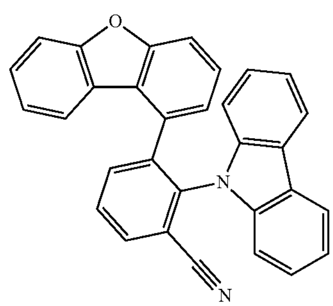
21
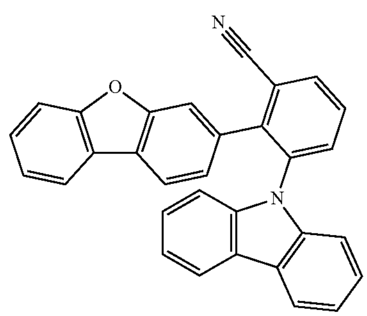
22
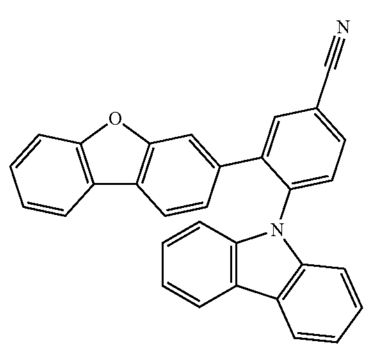

-continued
23
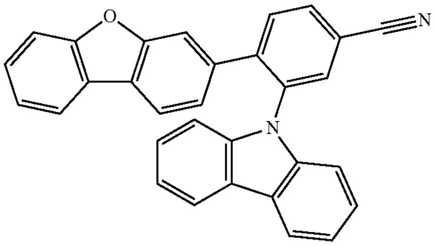
24
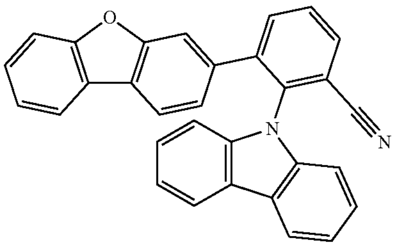
25
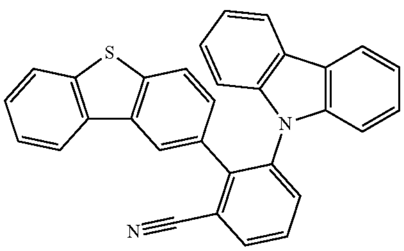
26
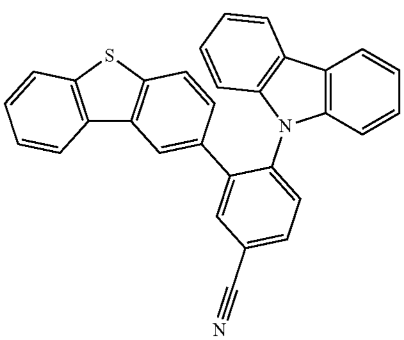
27
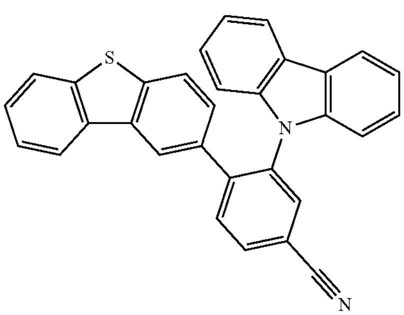
-continued
28
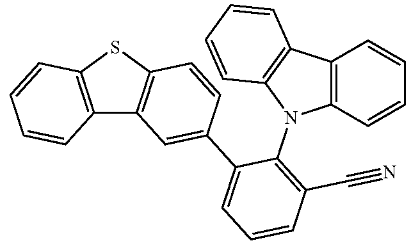
29
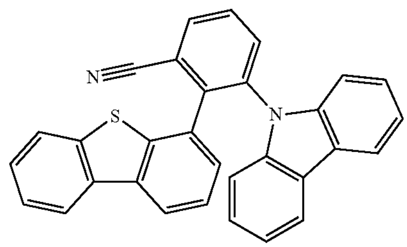
30
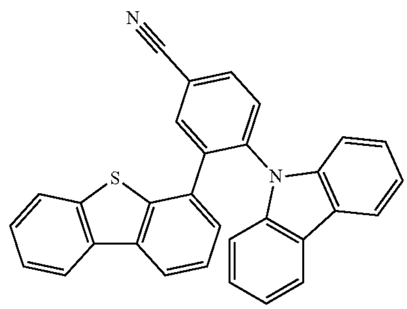
31
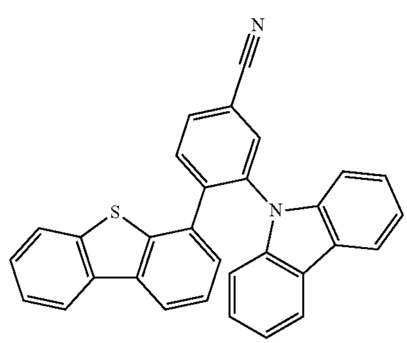
32
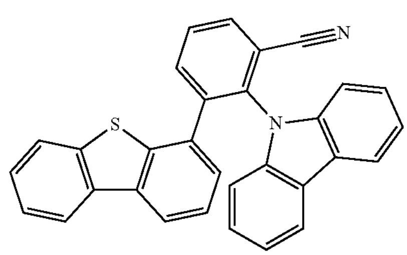

33
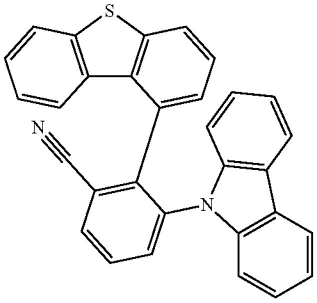
34
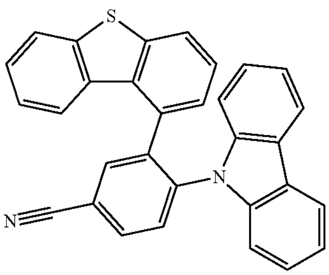
35
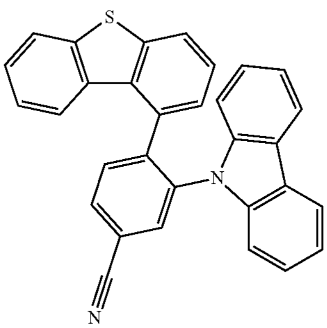
36
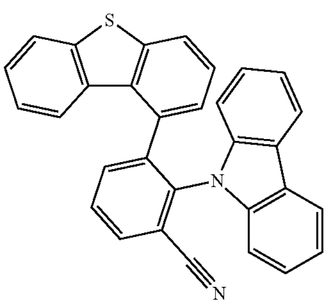
37
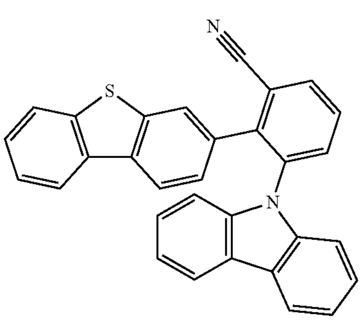
38
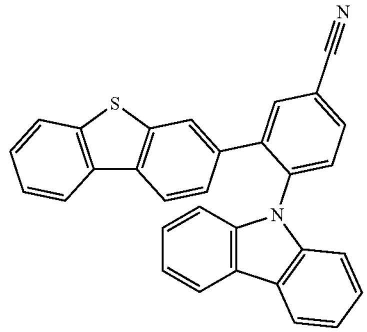
39
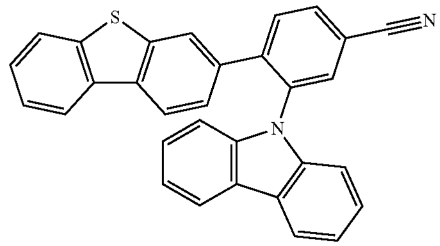
40
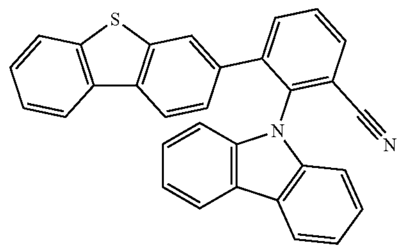
41
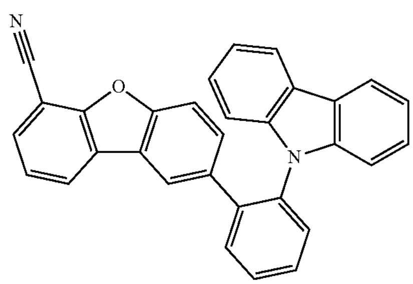
42
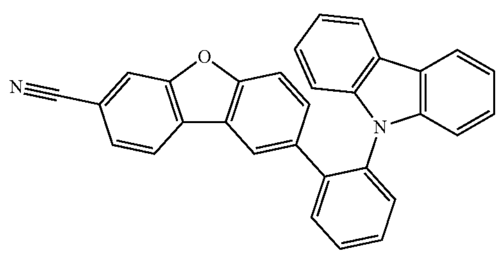
43
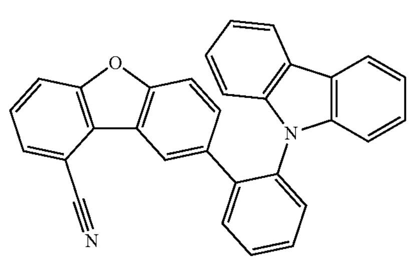

-continued
44
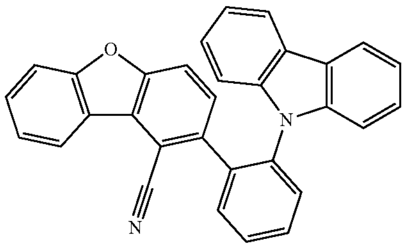
45
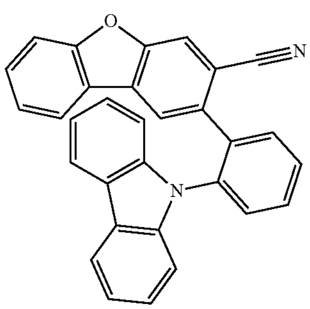
46
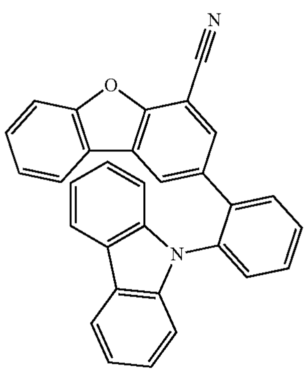
47
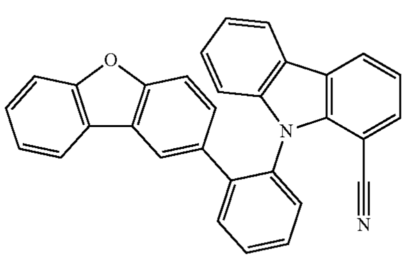
48
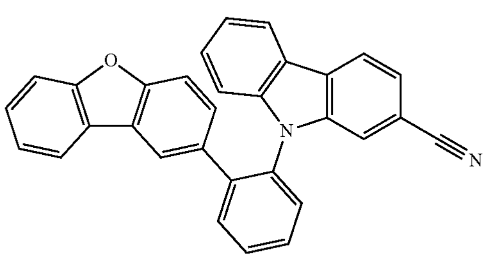
-continued
49
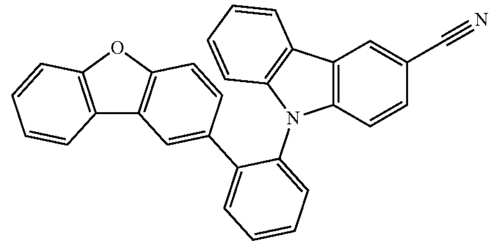
50
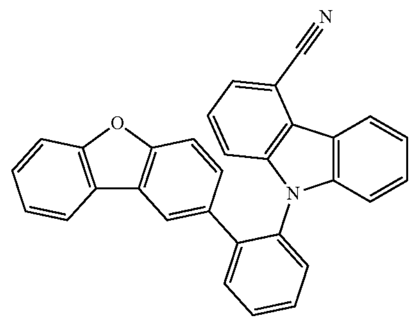
51
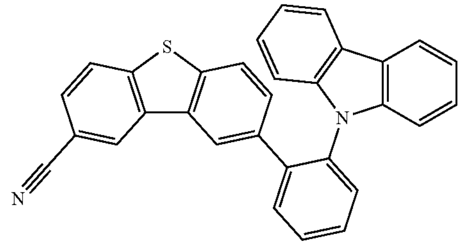
52
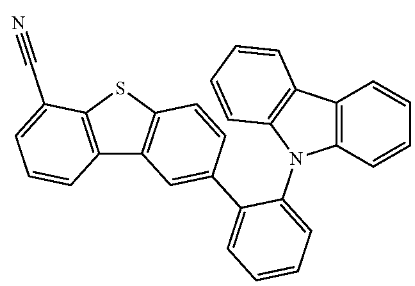
53
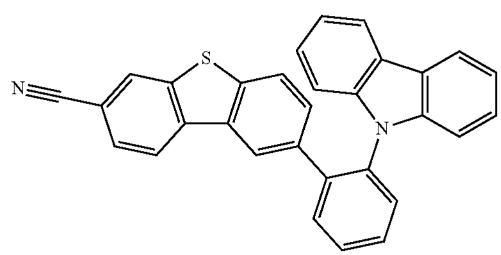
54
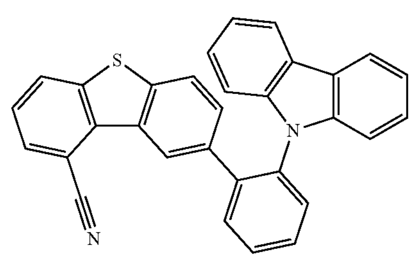

-continued
55
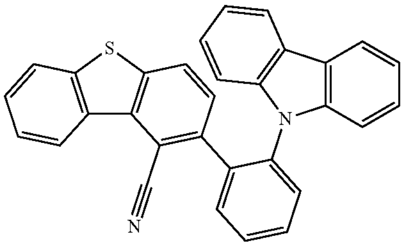
56
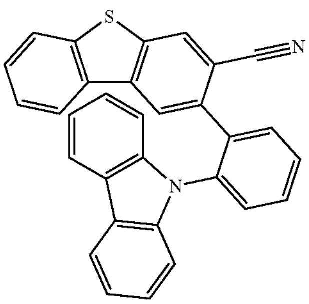
57
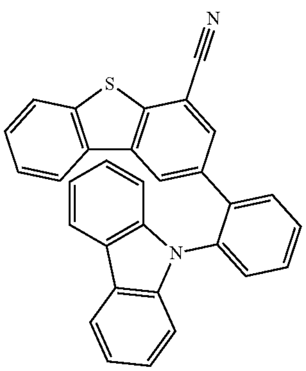
58
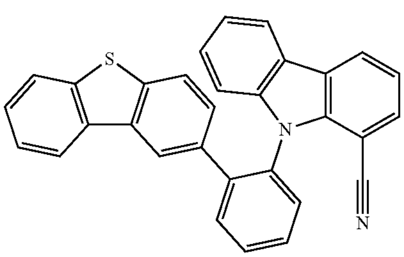
59
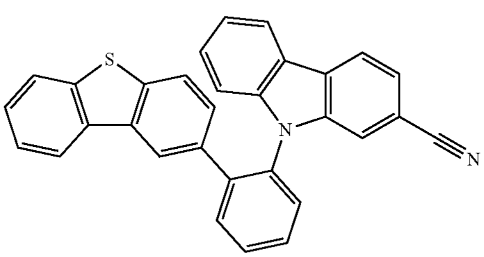
-continued
60
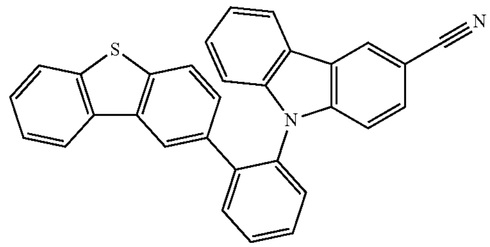
61
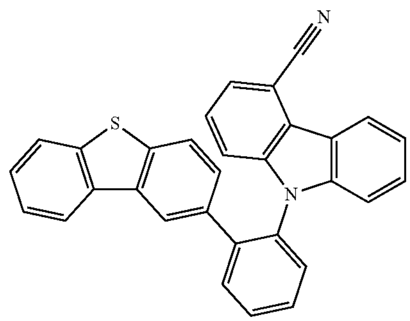
62
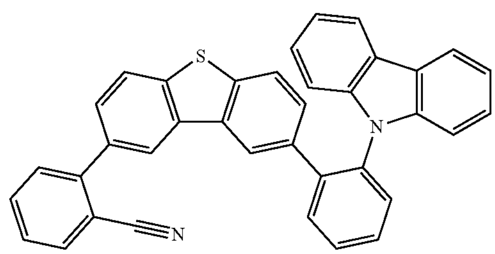
63
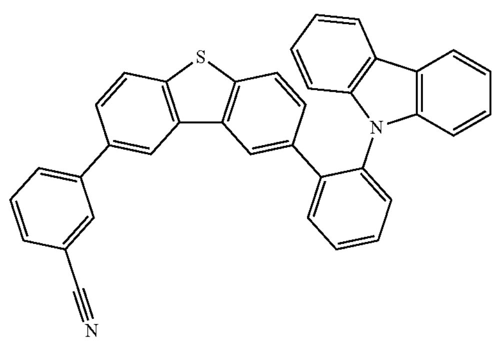
64
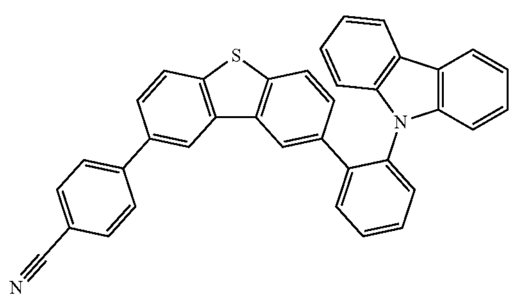

-continued
65
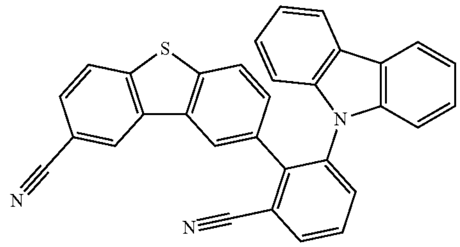
66
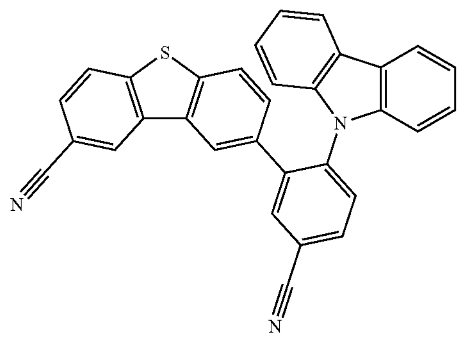
67
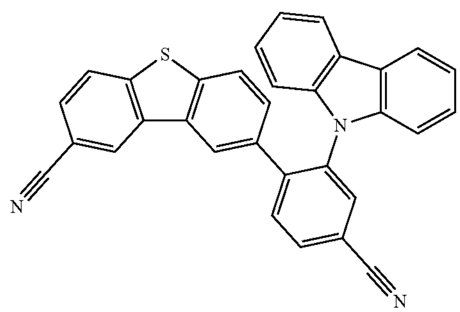
68
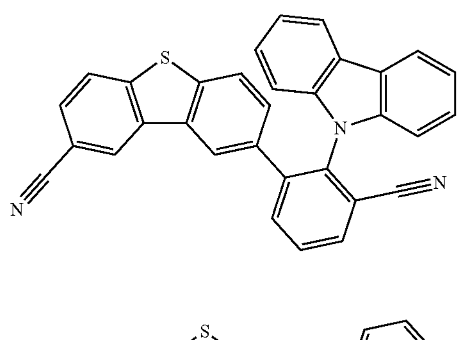
69
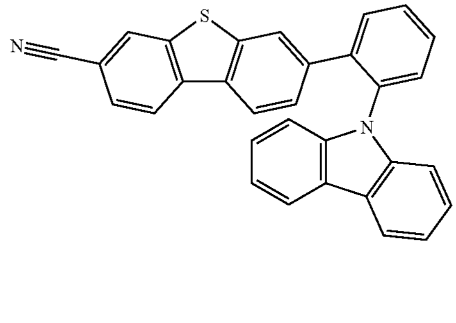
-continued
70
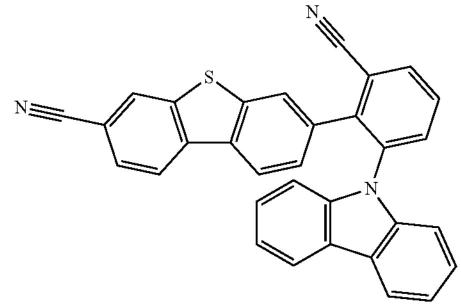
71
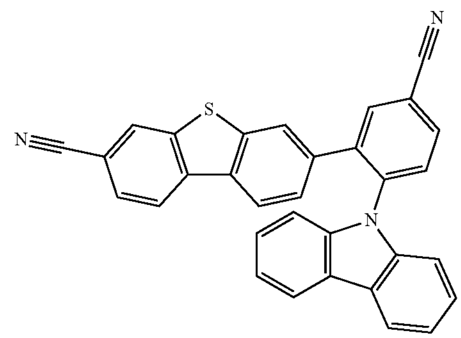
72
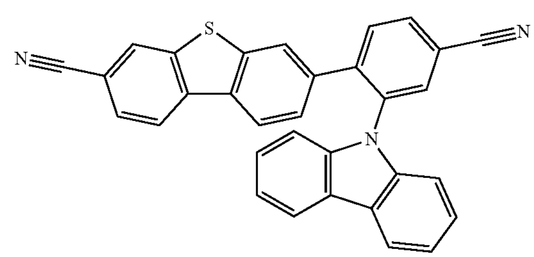
73
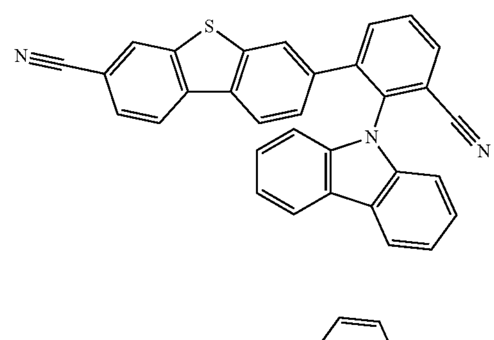
74
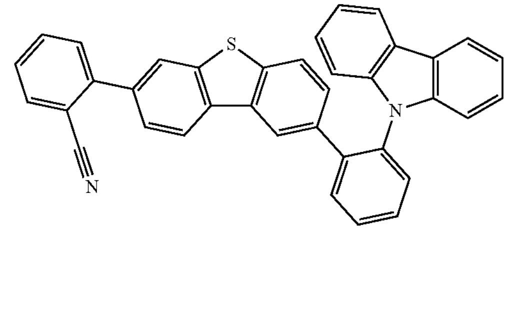

-continued
75
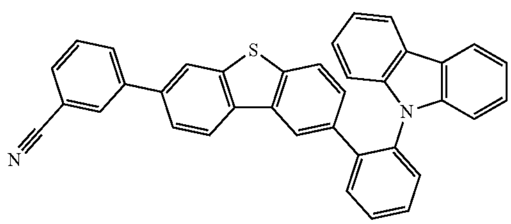
76
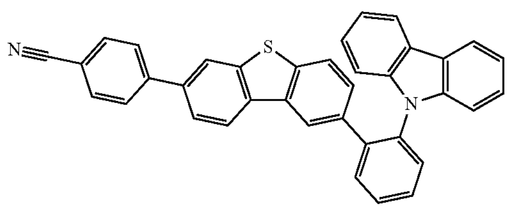
77
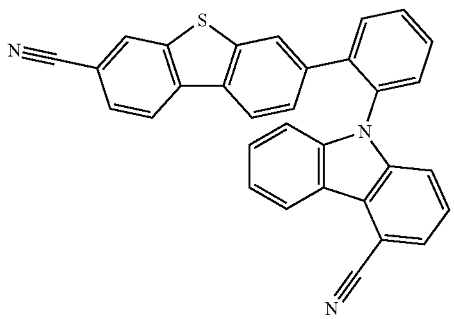
78
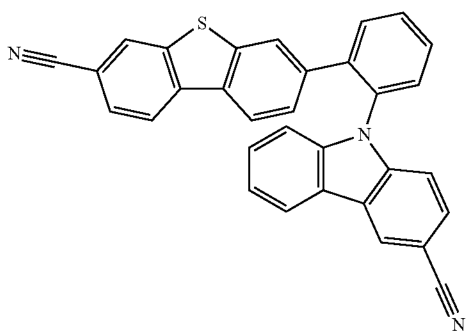
79
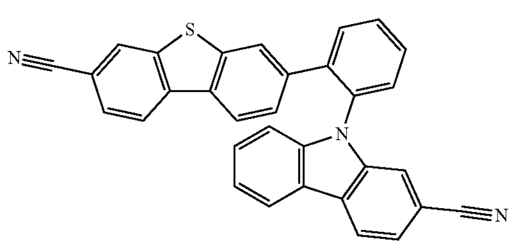
80
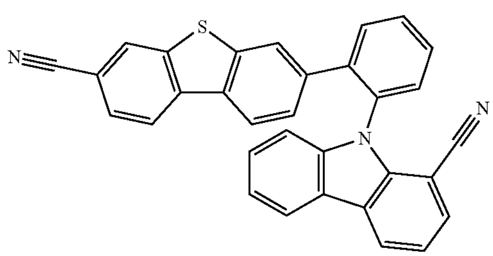
-continued
81
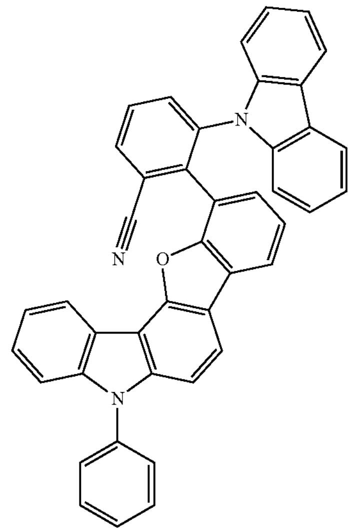
82
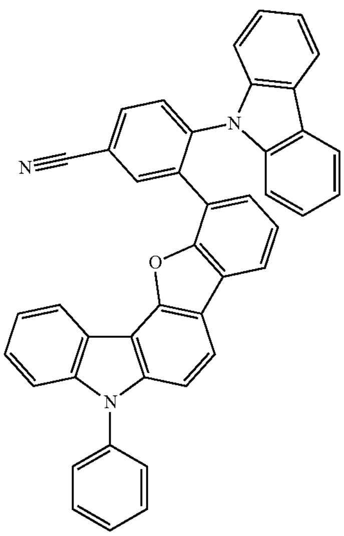
83
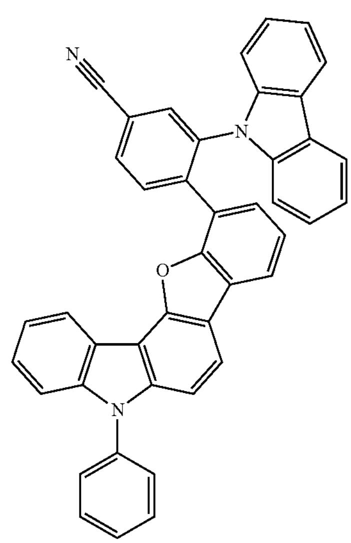

-continued
84
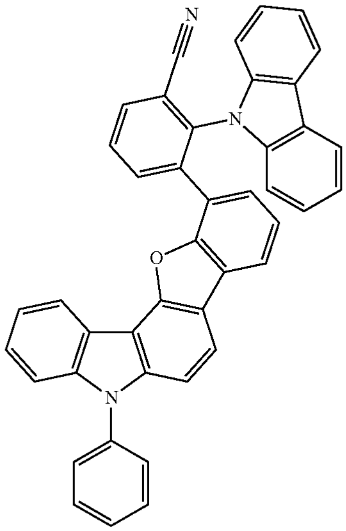
85
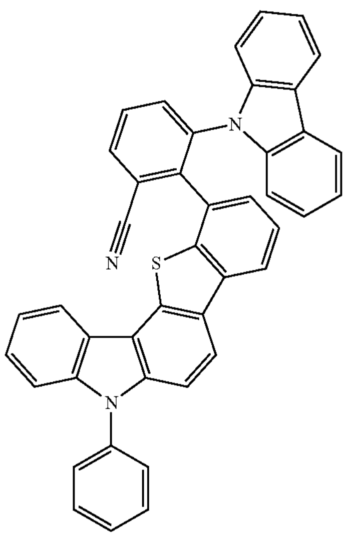
86
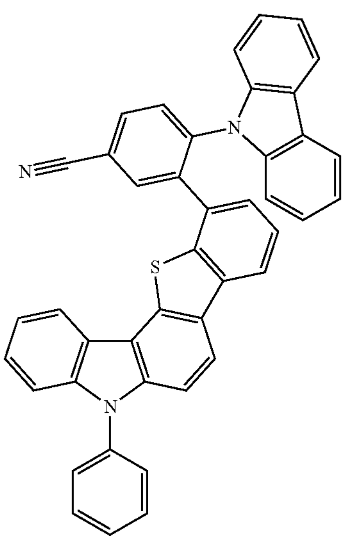
-continued
87
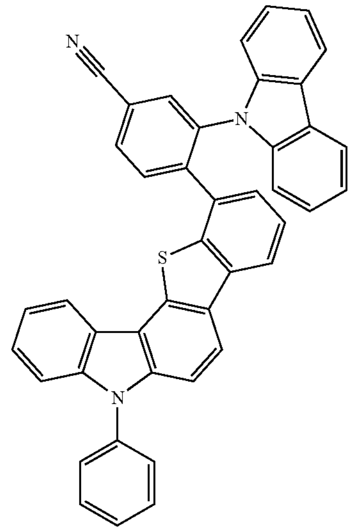
88
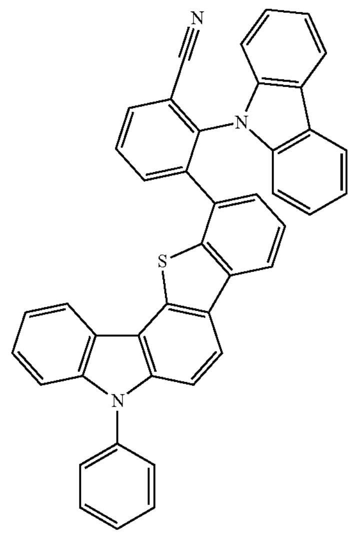
89
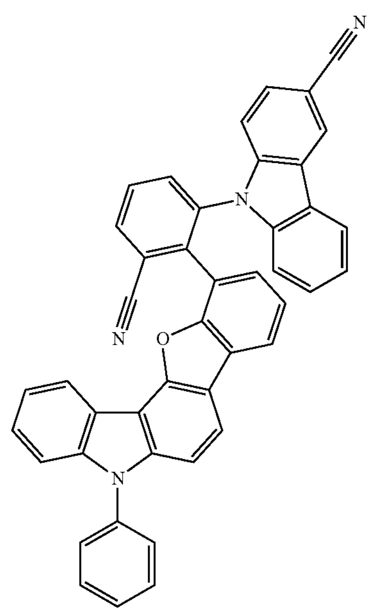

-continued
91
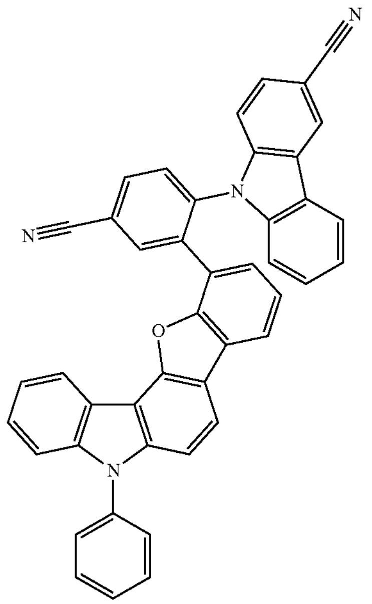
91
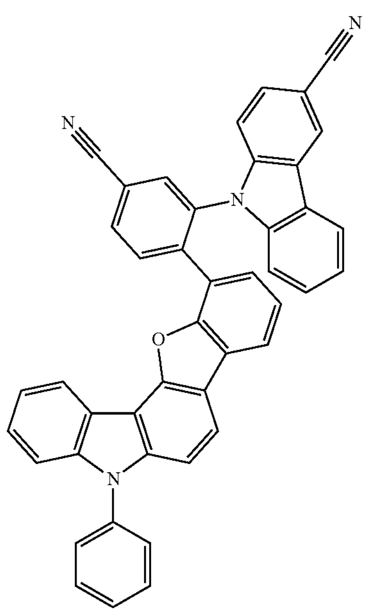
-continued
92
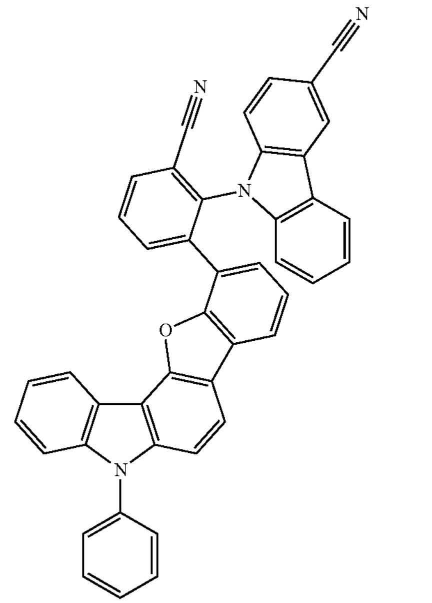
93
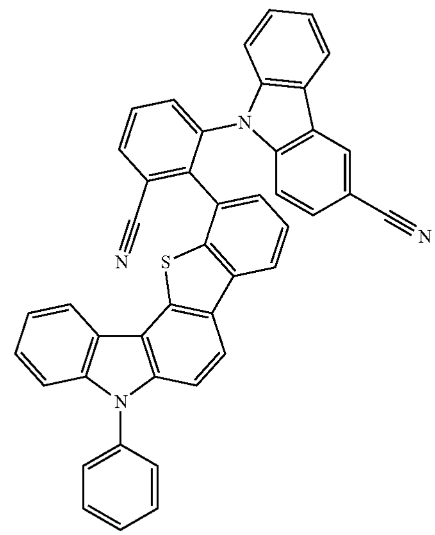
94
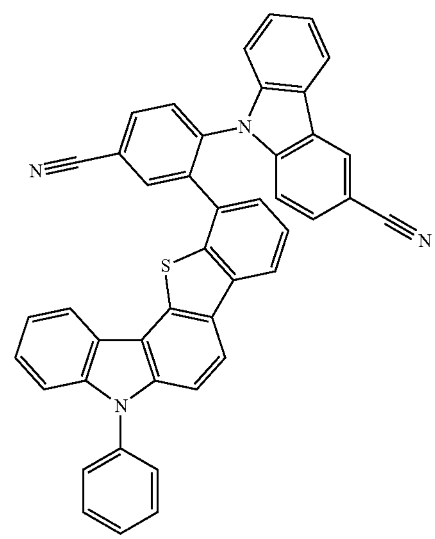

-continued
95
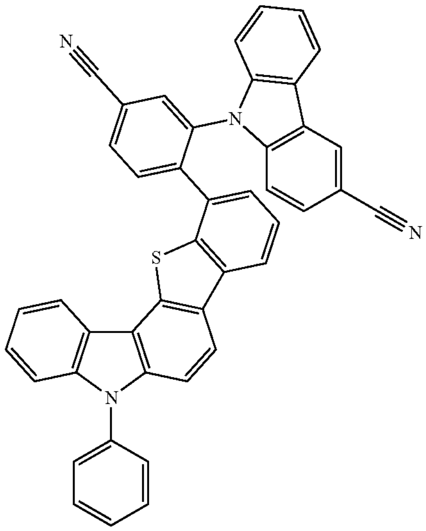
96
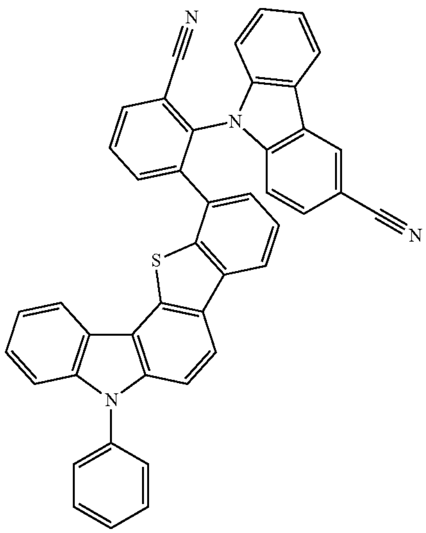
97
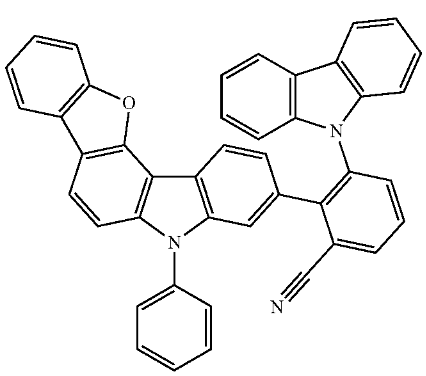
-continued
98
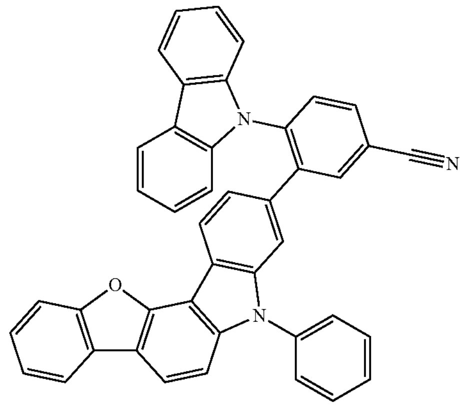
99
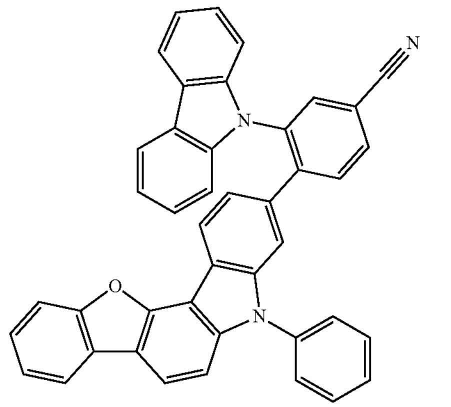
100
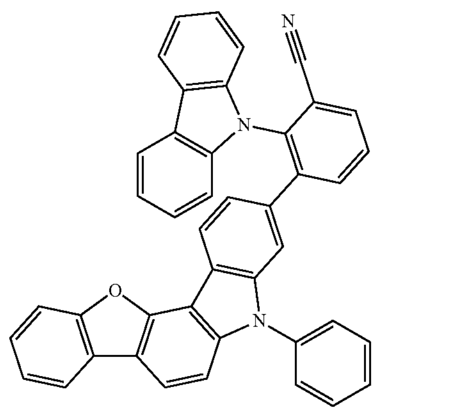
101
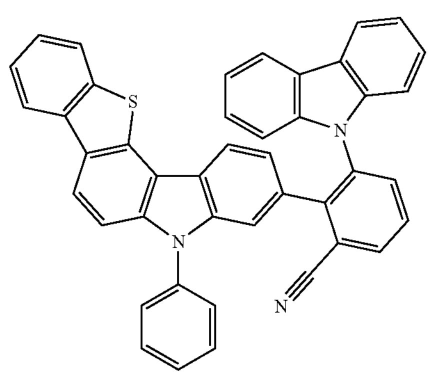

-continued
102
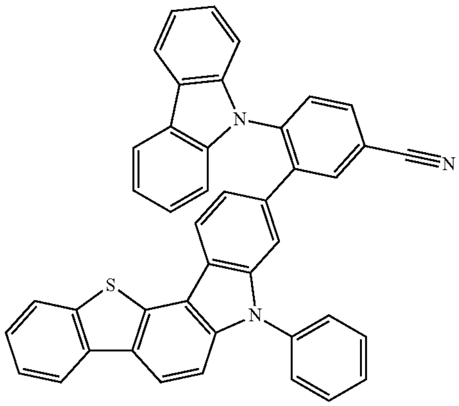
103
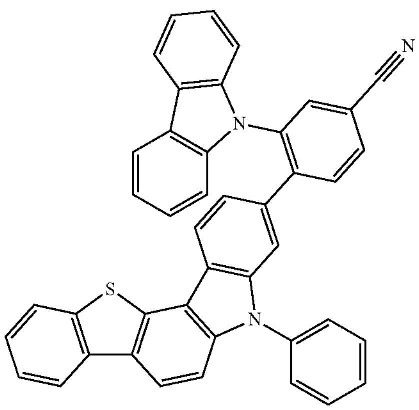
104
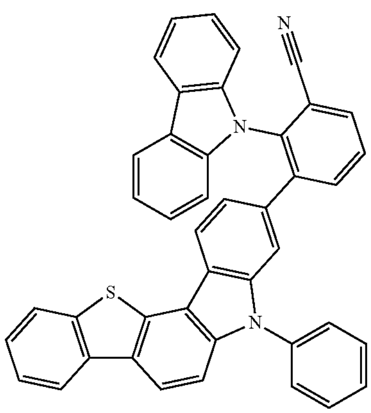
105
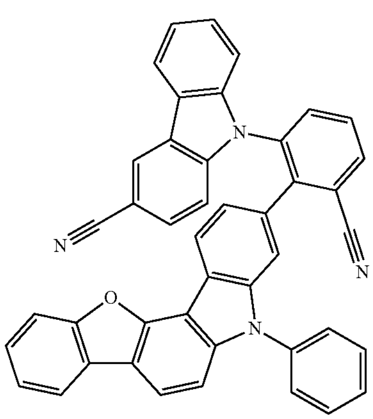
-continued
106
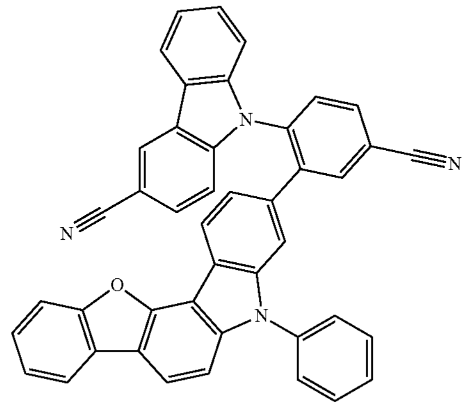
107
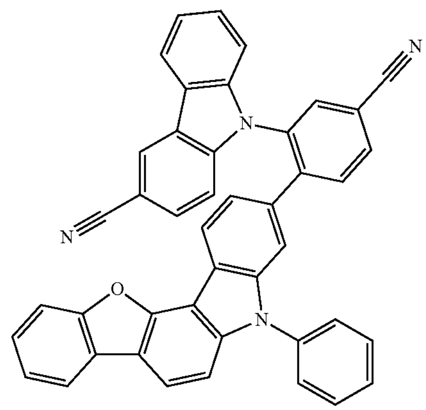
108
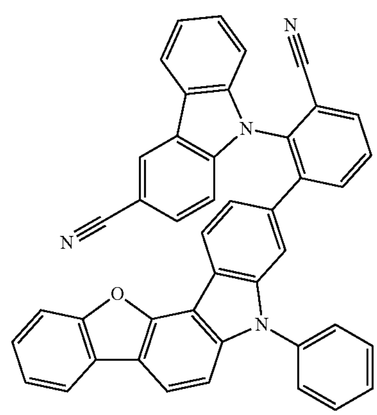
109
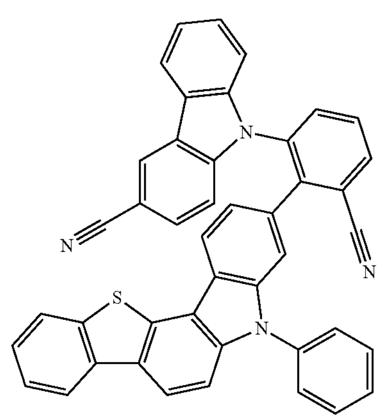

-continued
110
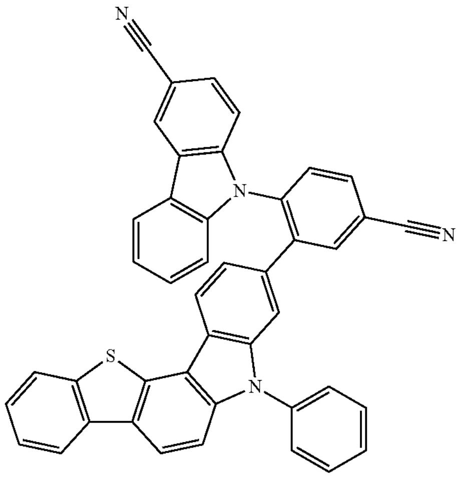
111
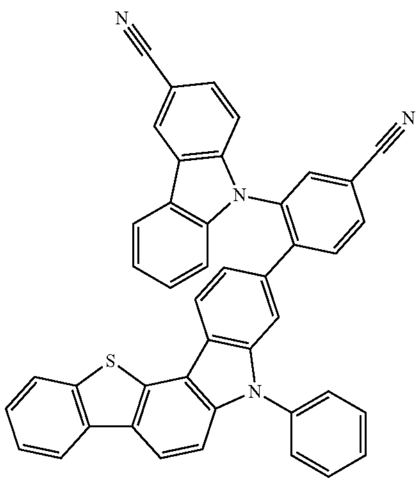
112
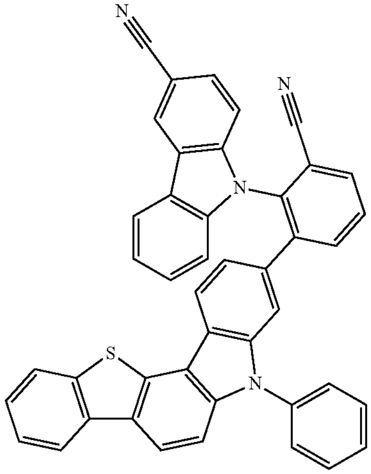
-continued
113
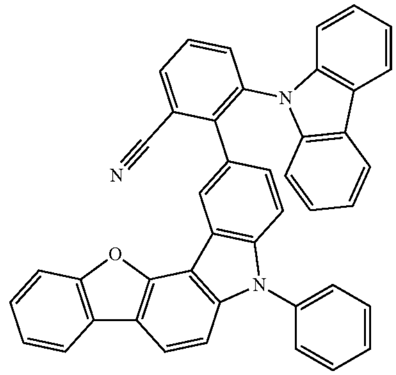
114
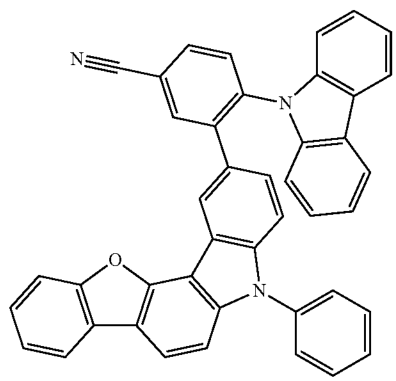
115
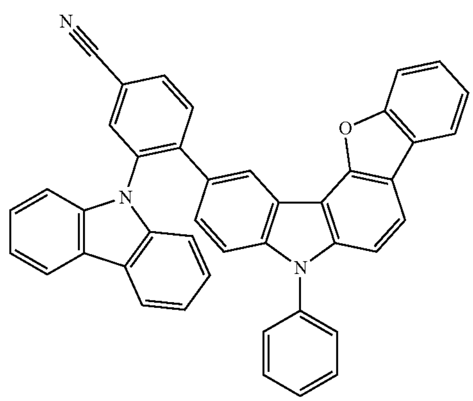
116
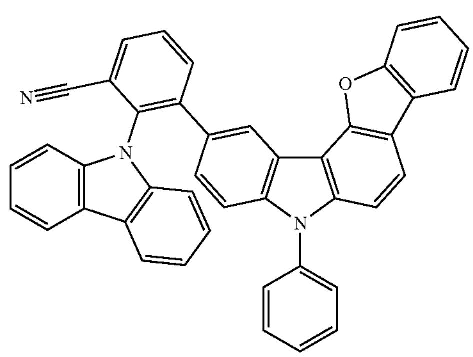

-continued
117
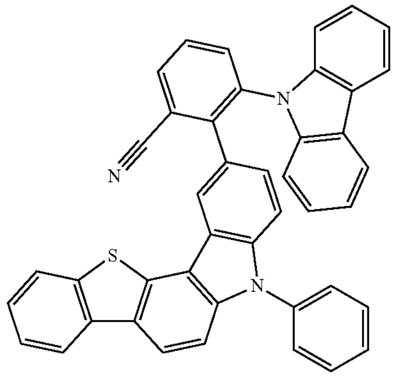
118
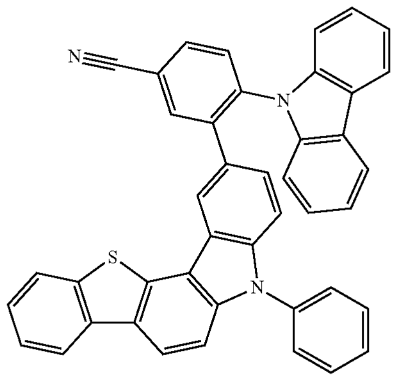
119
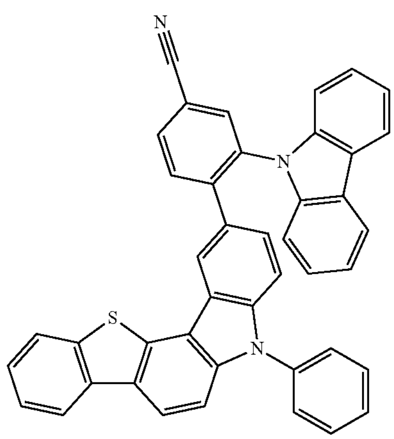
120
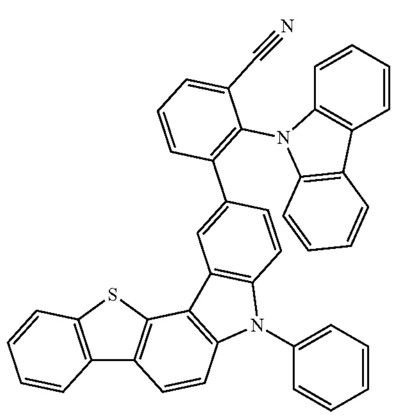
-continued
121
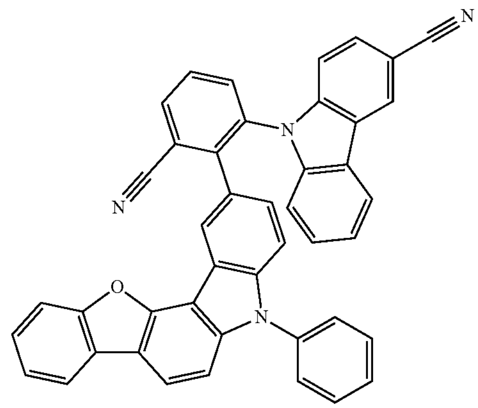
122
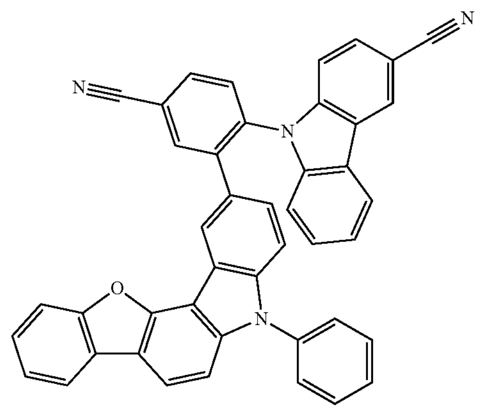
123
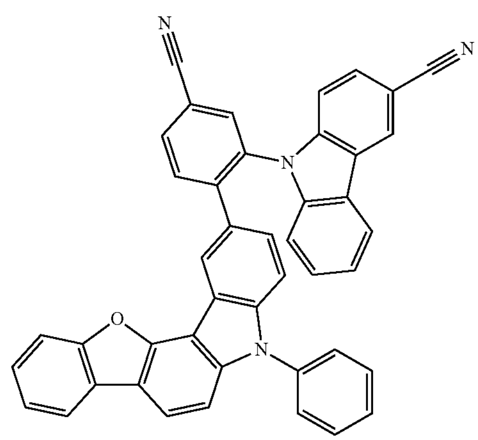
124
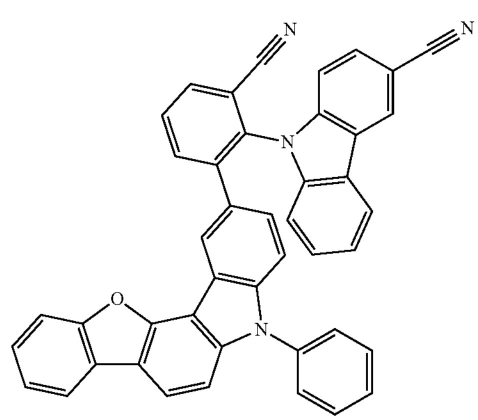

-continued
125
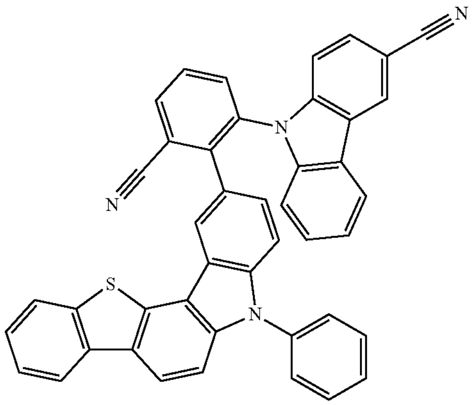
126
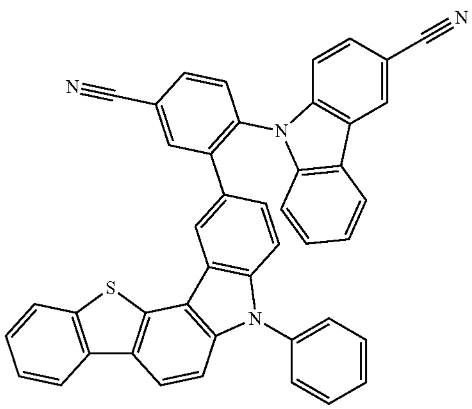
127
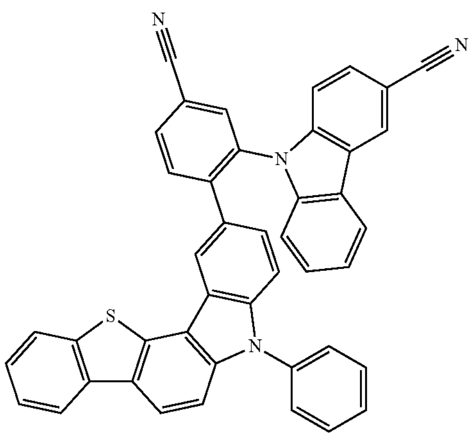
128
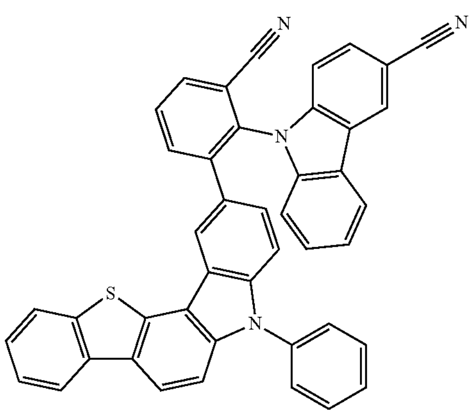
-continued
129
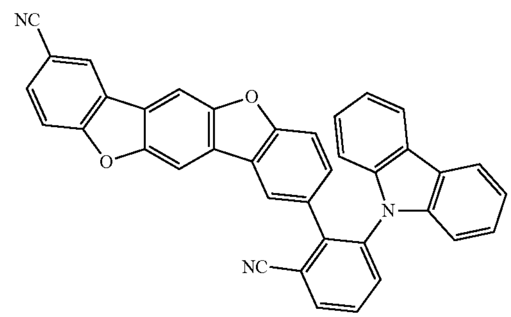
130
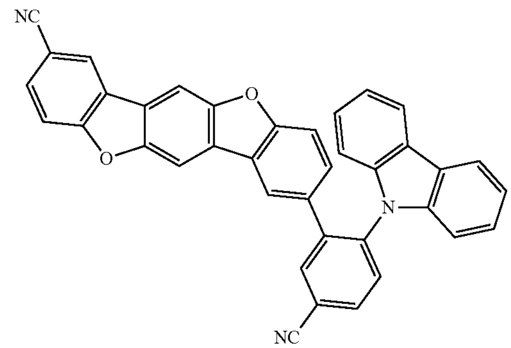
131
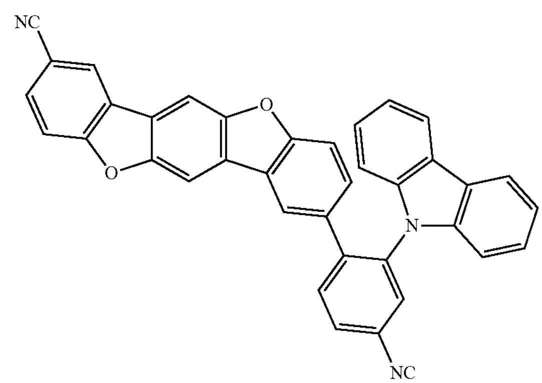
132
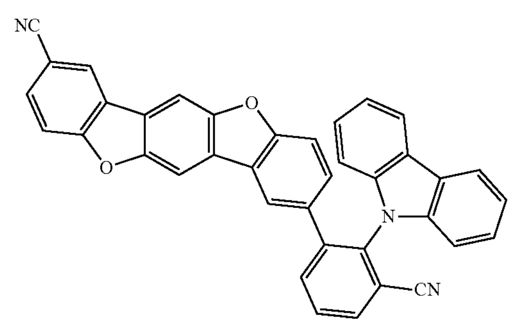

-continued
133
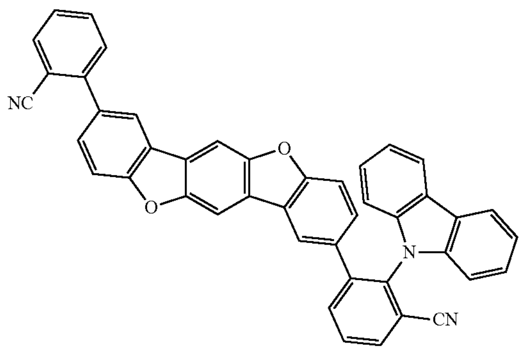
134
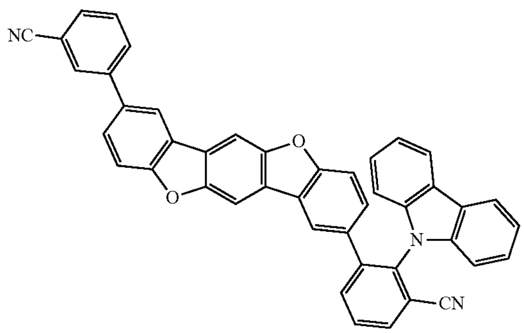
135
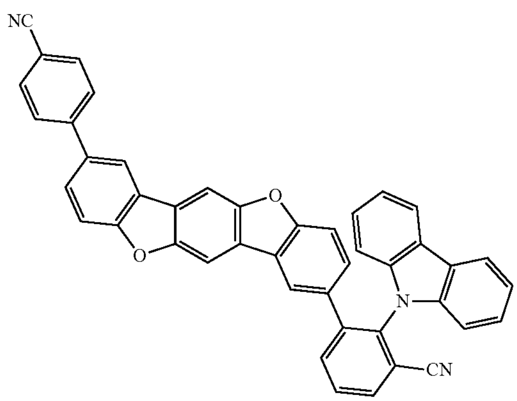
136
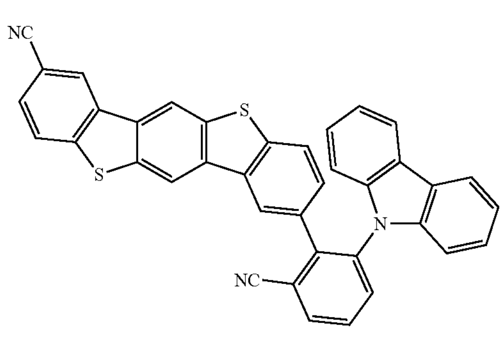
-continued
137
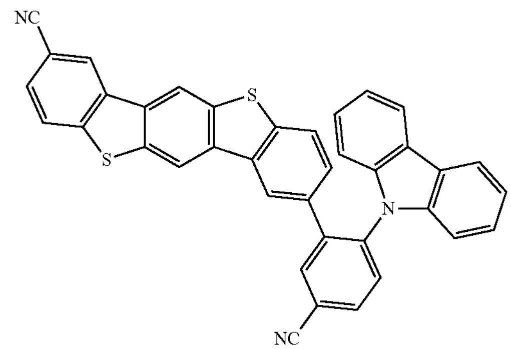
138
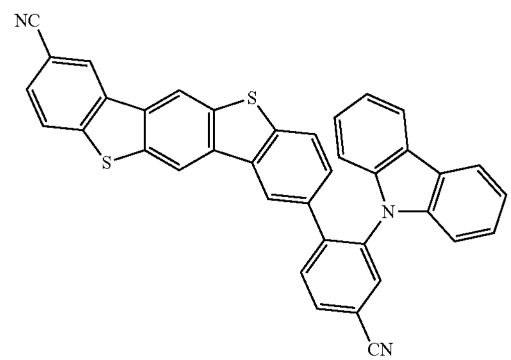
139
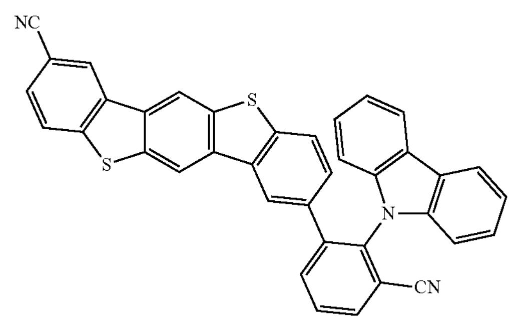
140
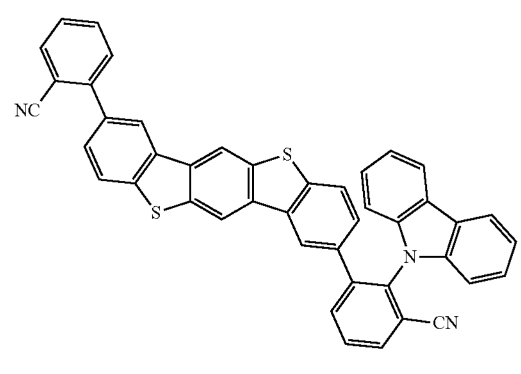

-continued
141
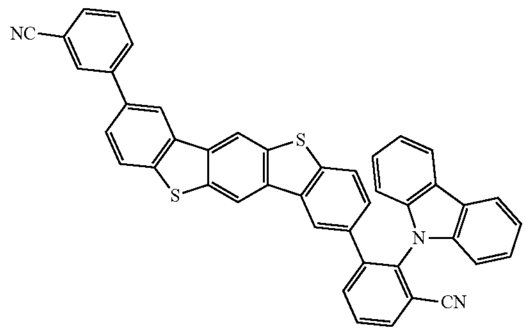
142
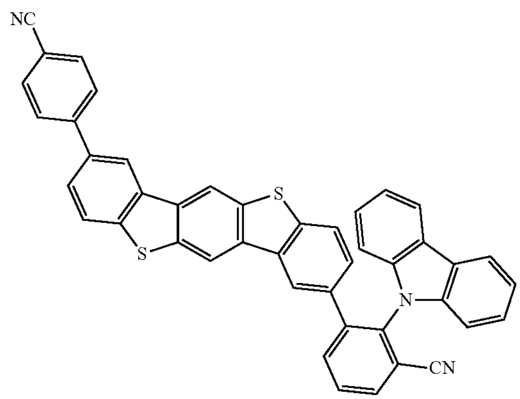
143
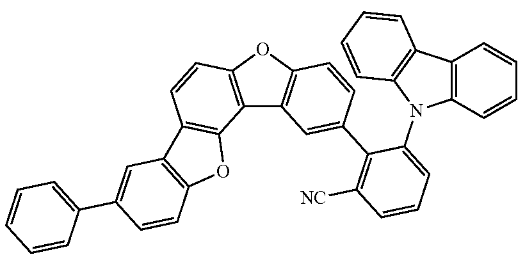
144
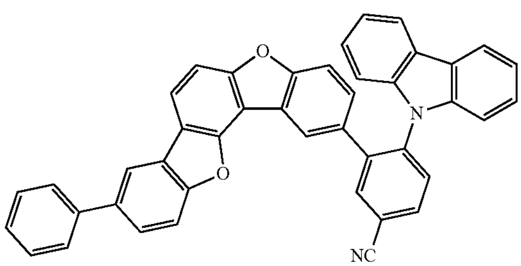
145
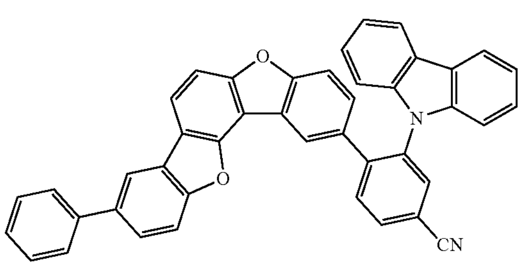
-continued
146
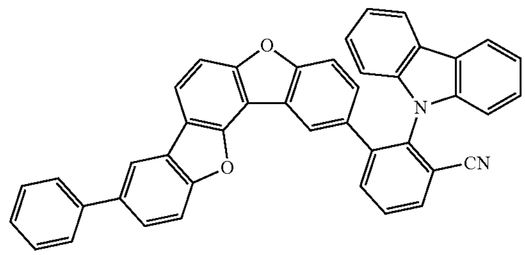
147
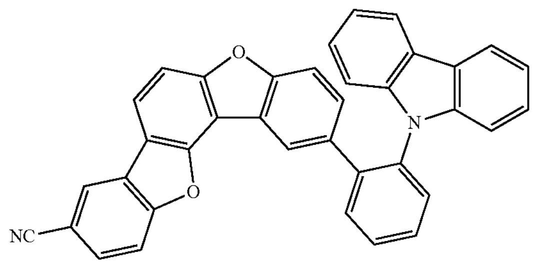
148
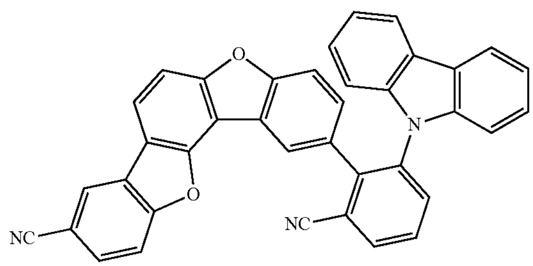
149
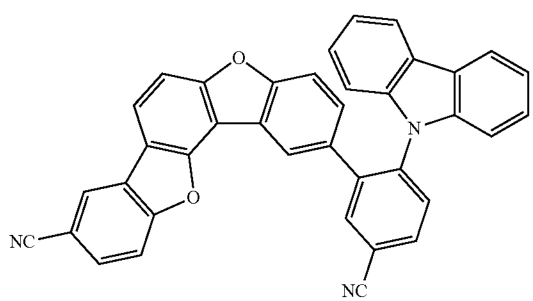
150
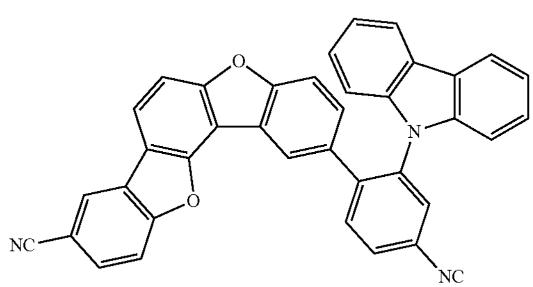

151
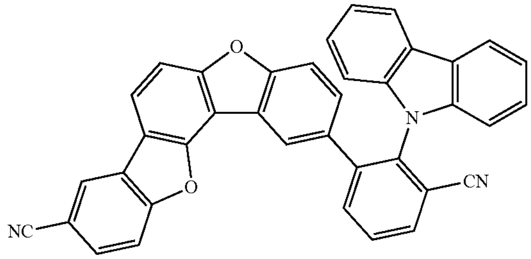
152
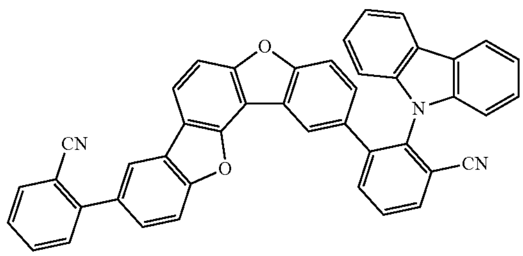
153
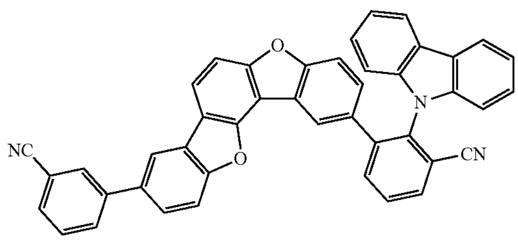
154
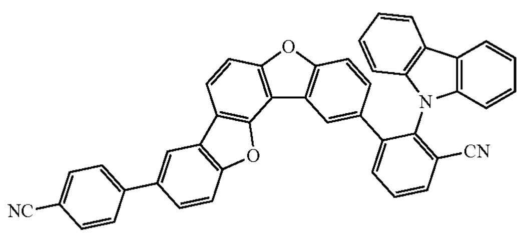
155
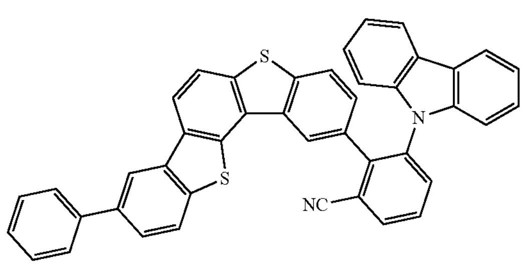
156
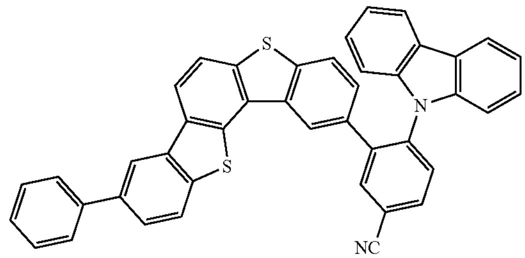
157
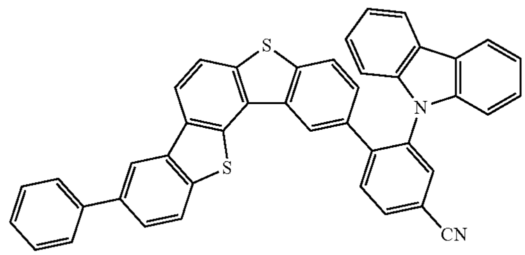
158
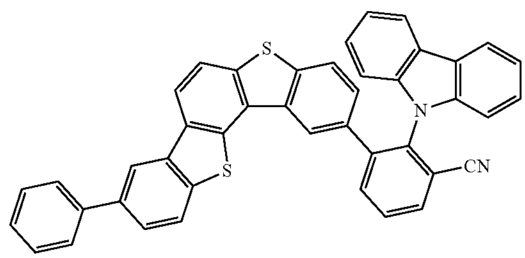
159
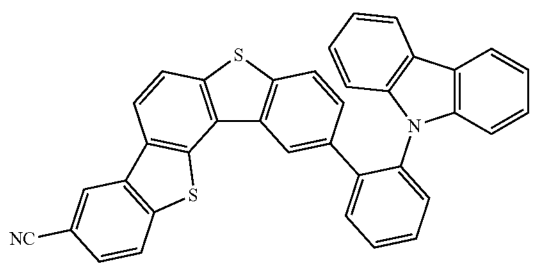
160
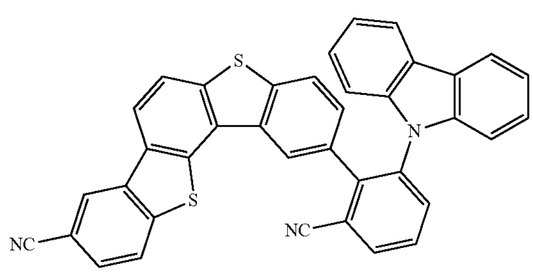

-continued
161
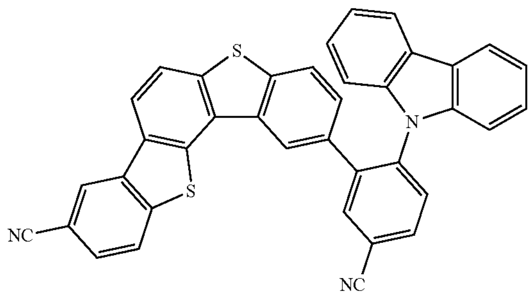
162
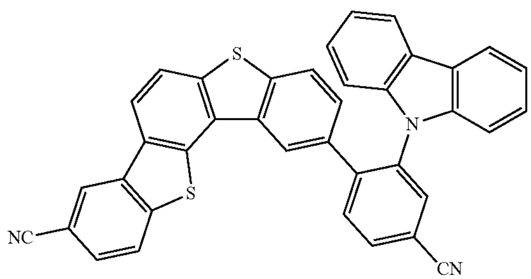
163
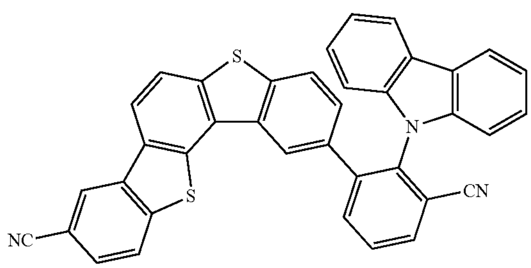
164
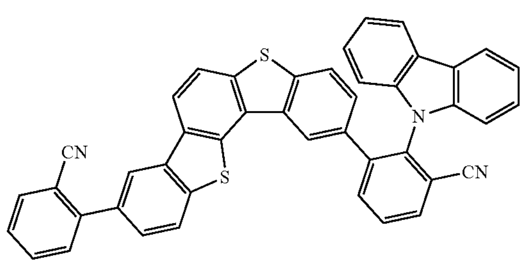
165
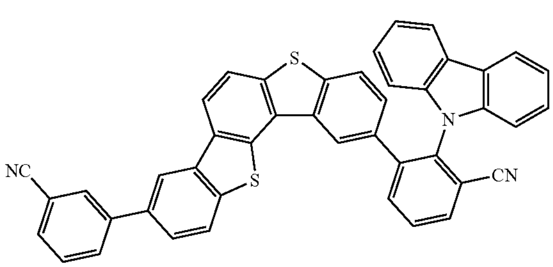
-continued
166
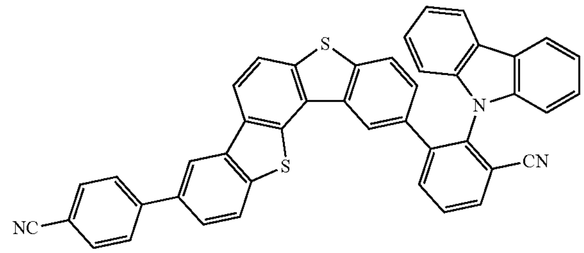
167
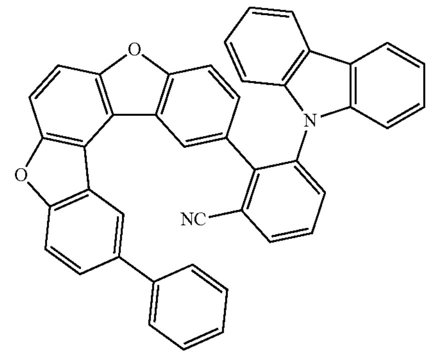
168
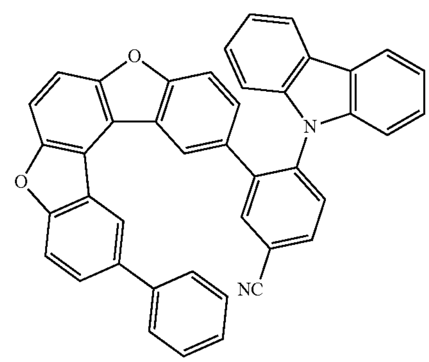
169
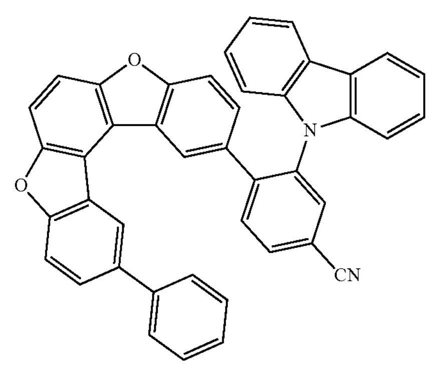

-continued
170
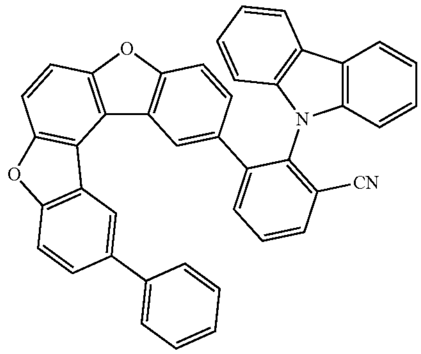
171
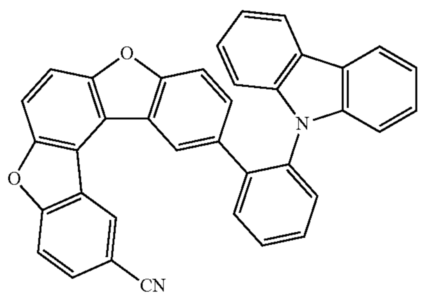
172
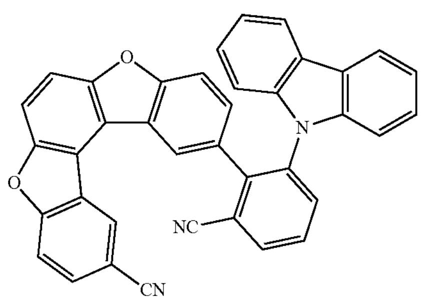
173
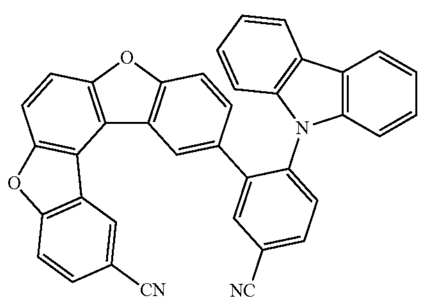
174
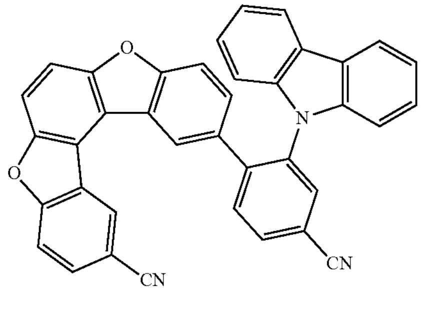
-continued
175
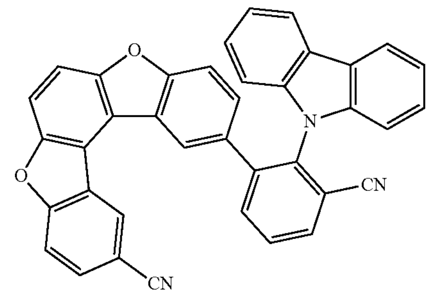
176
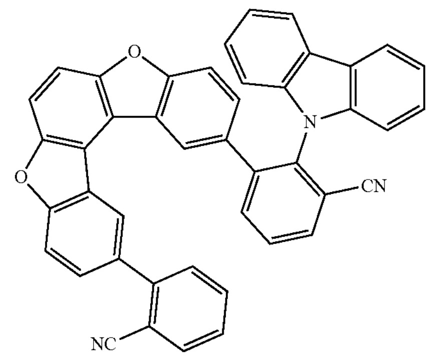
177
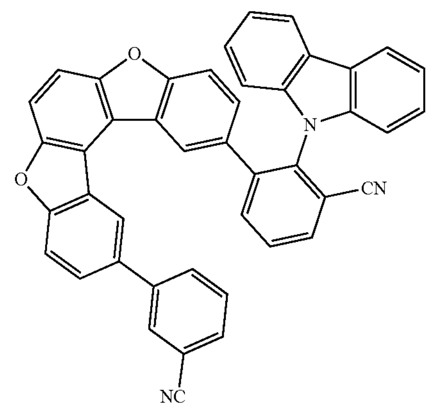
178
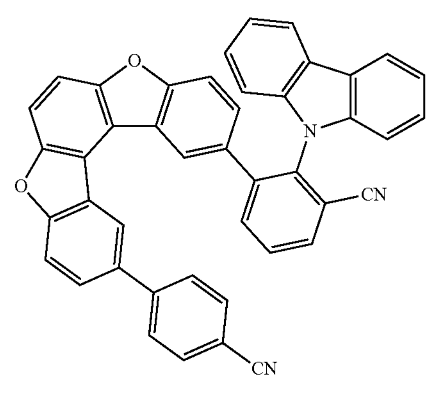

-continued
179
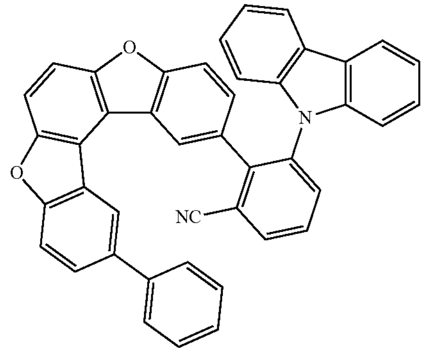
180
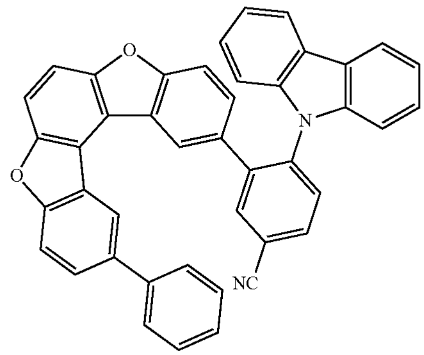
181
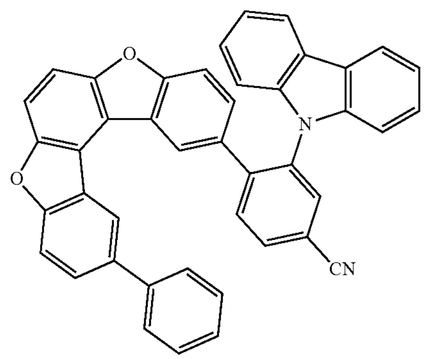
182
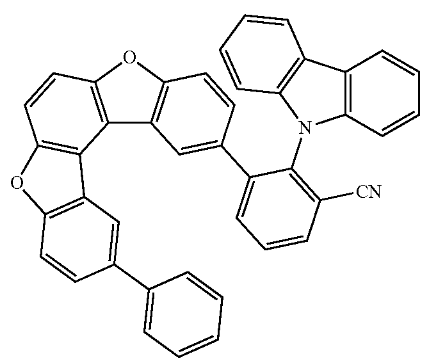
-continued
183
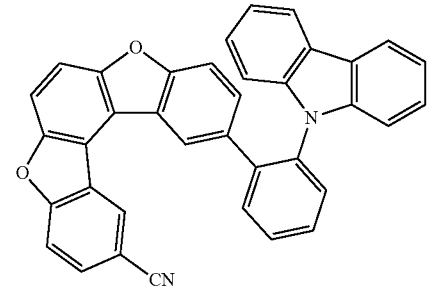
184
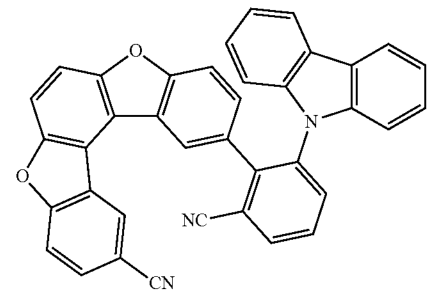
185
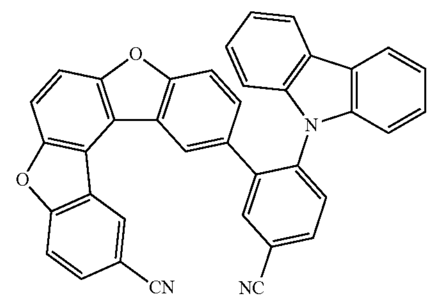
186
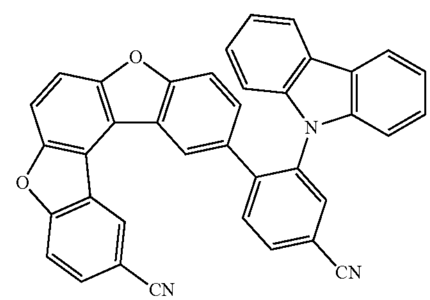
187
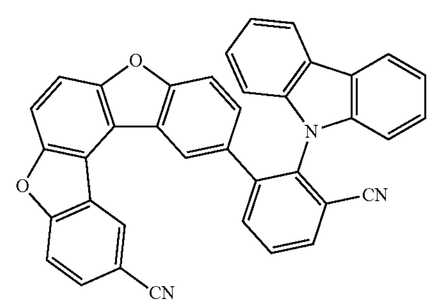

-continued
188
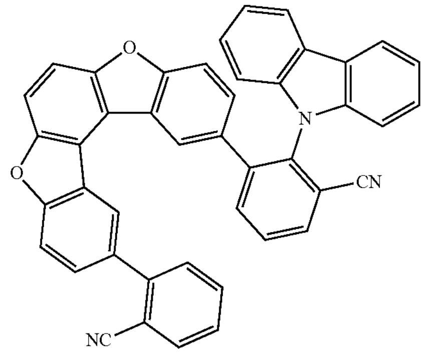
189
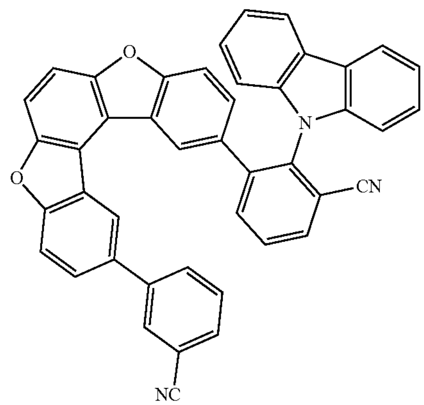
190
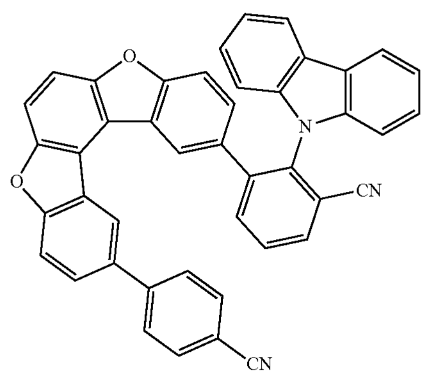
191
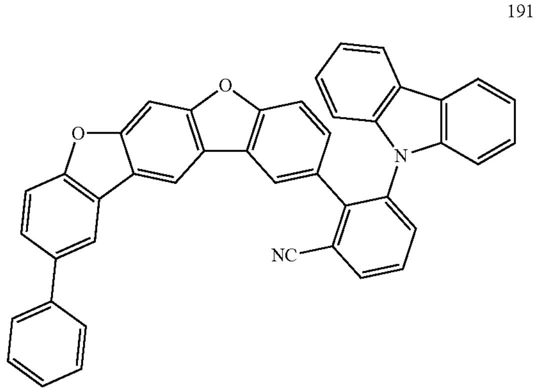
-continued
192
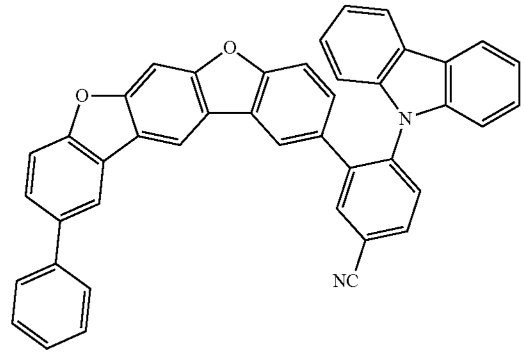
193
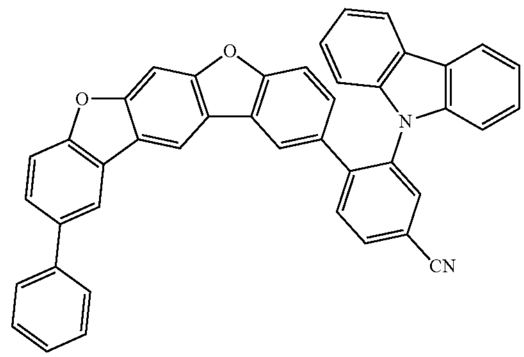
194
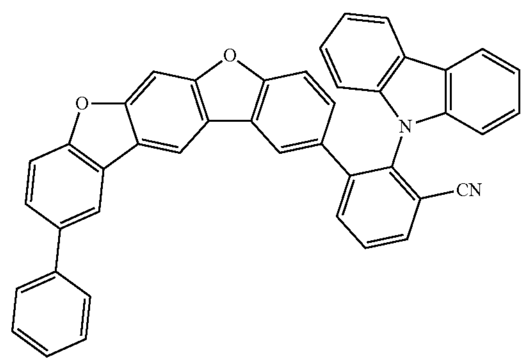
195
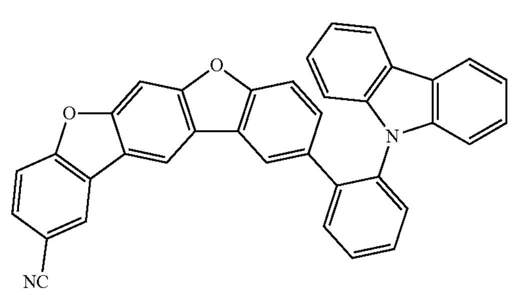

-continued
196
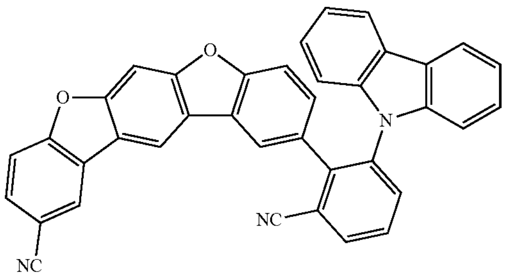
197
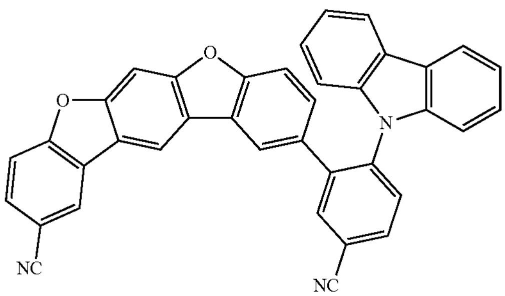
198
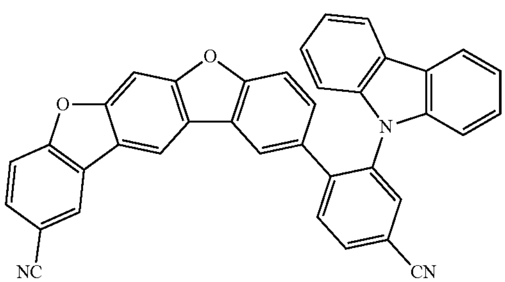
199
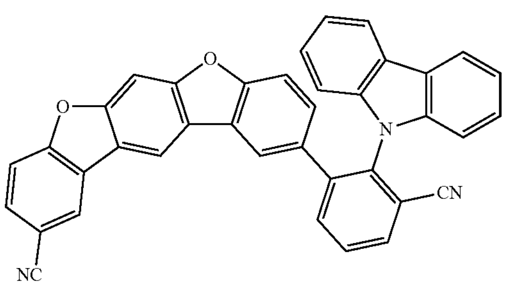
200
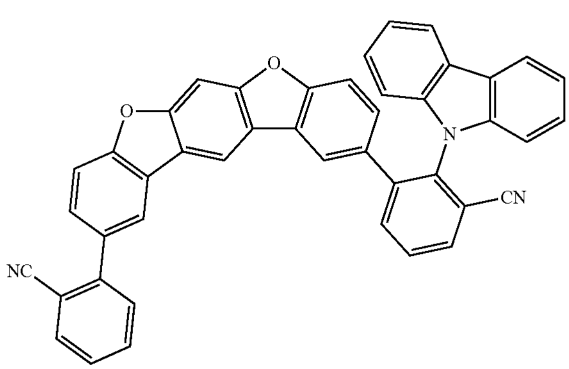
-continued
201
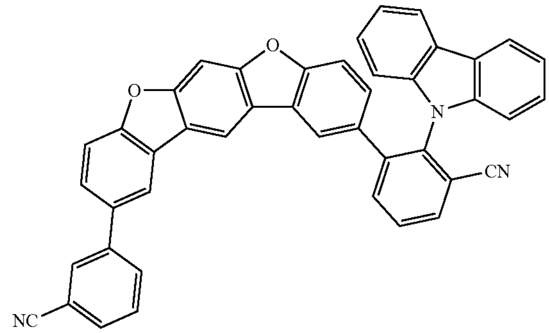
202
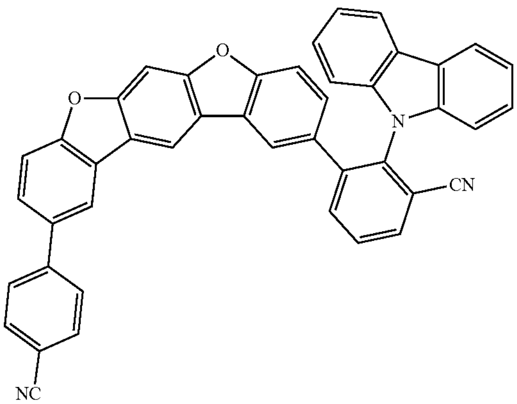
203
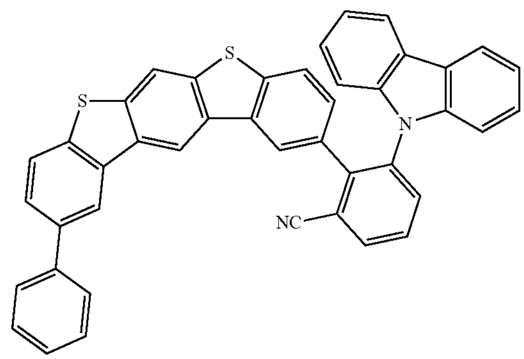
204
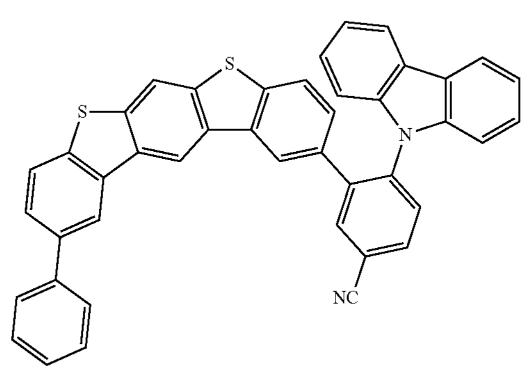

-continued
205
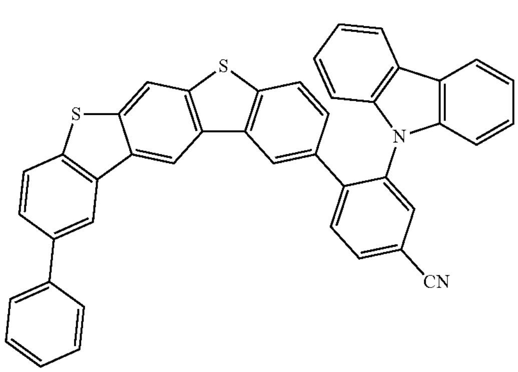
206
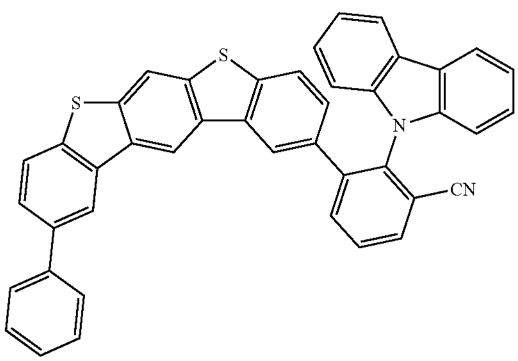
207
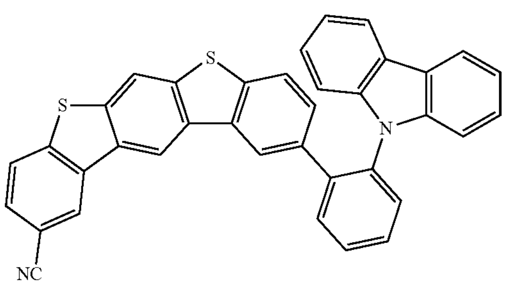
208
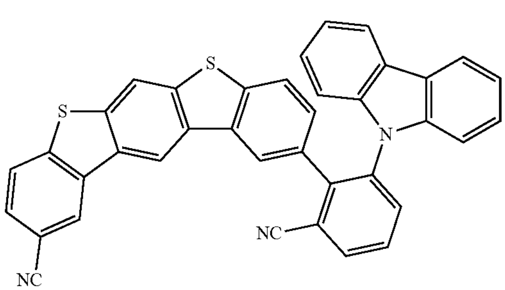
-continued
209
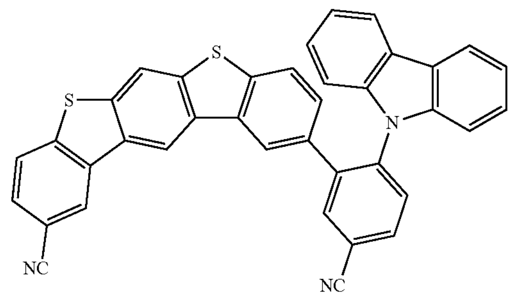
210
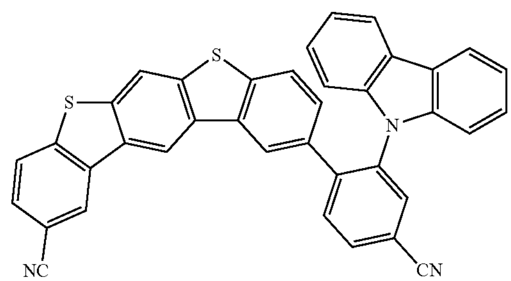
211
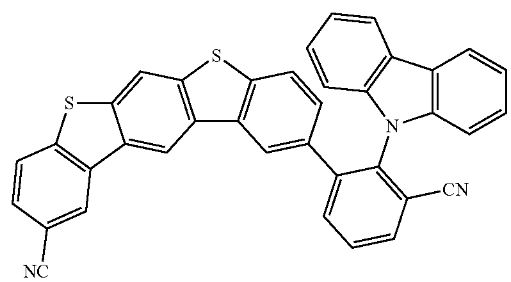
212
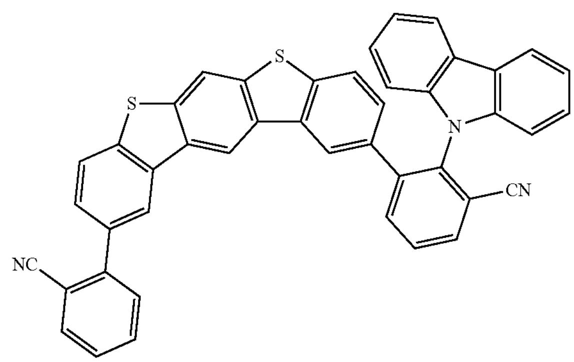
213
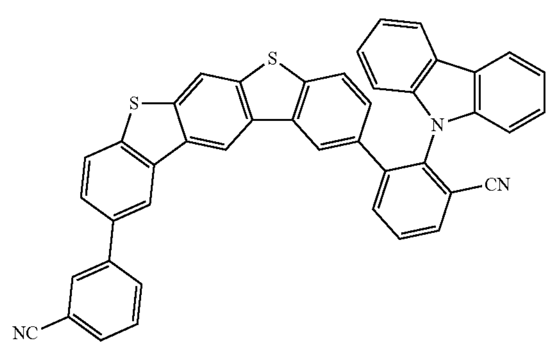

-continued
214
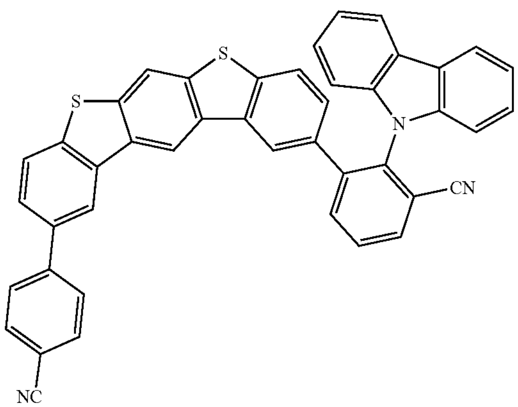
215
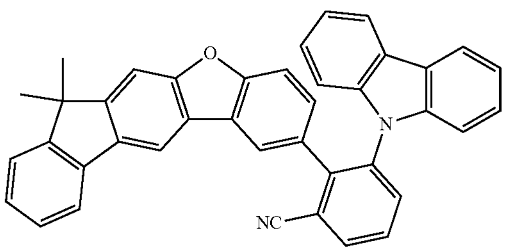
216
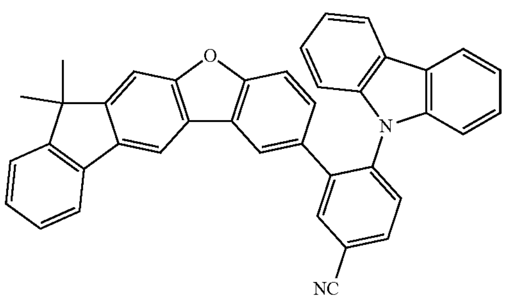
217
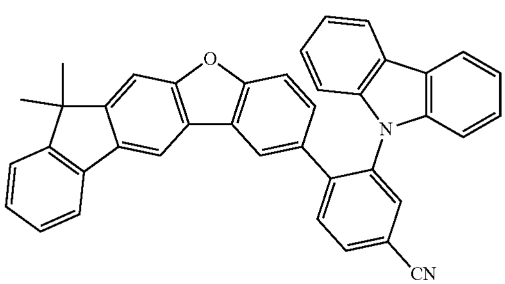
218
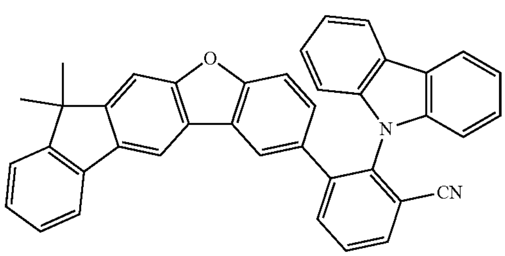
-continued
219
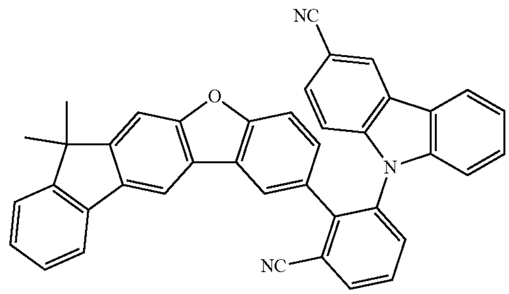
220
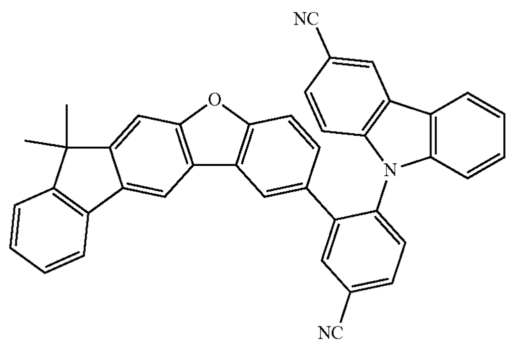
221
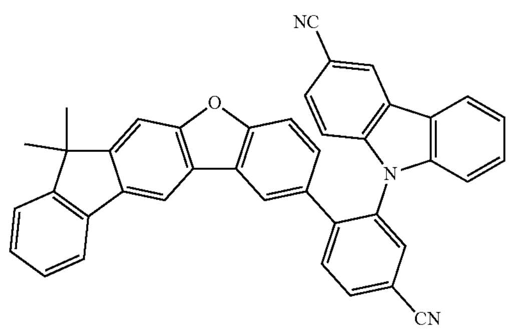
222
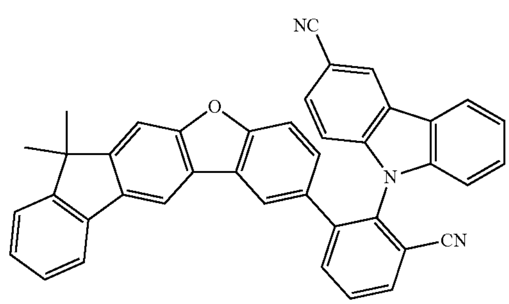
223
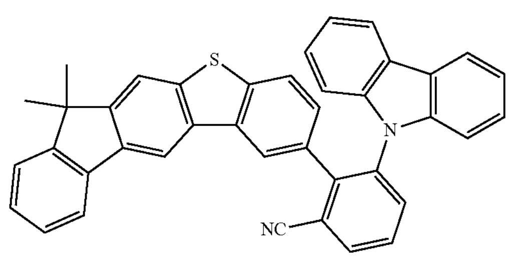

-continued
224
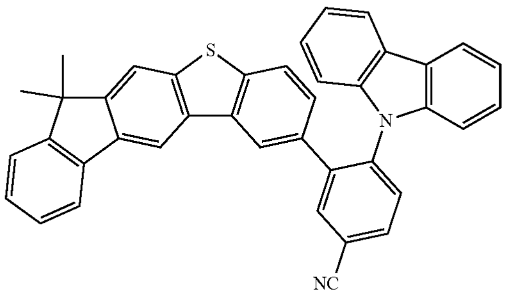
225
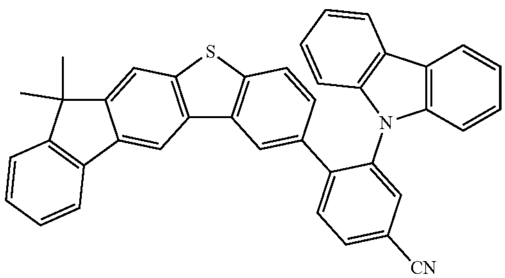
226
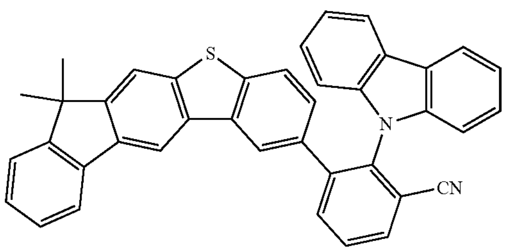
227
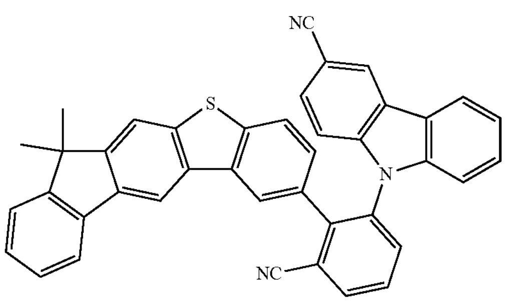
228
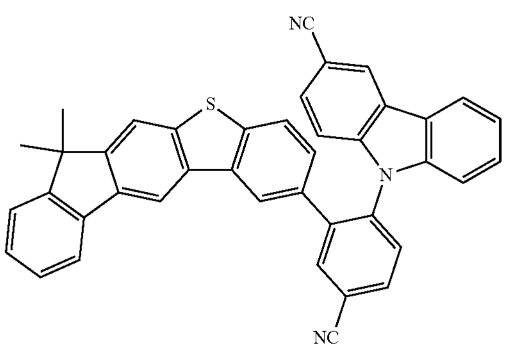
-continued
229
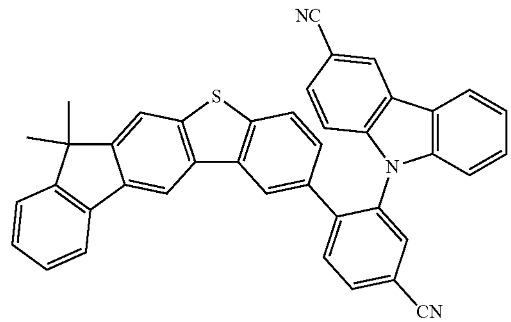
230
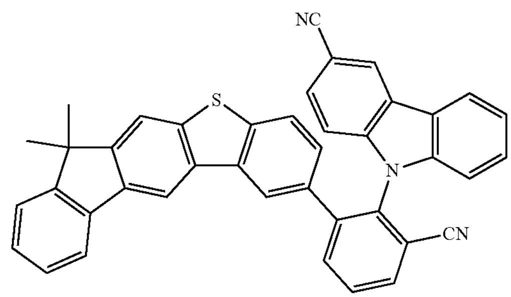
231
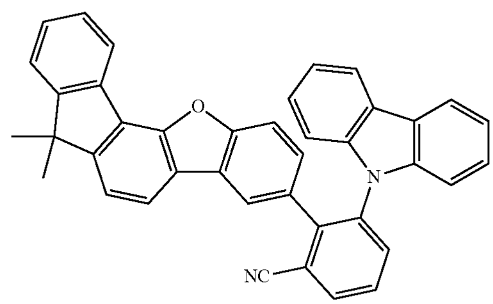
232
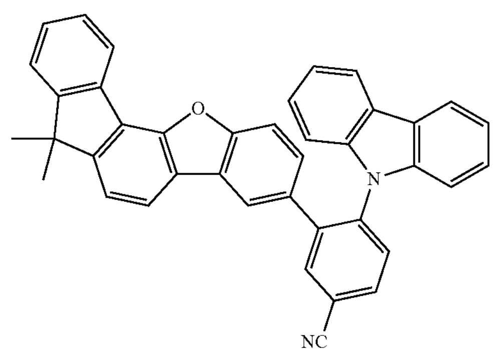
233
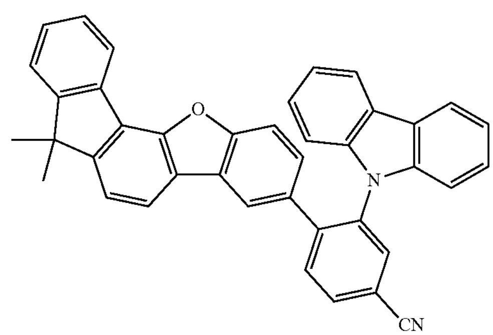

-continued
234
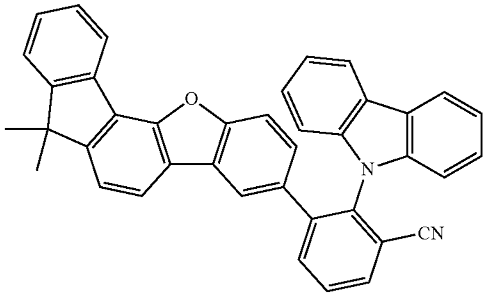
235
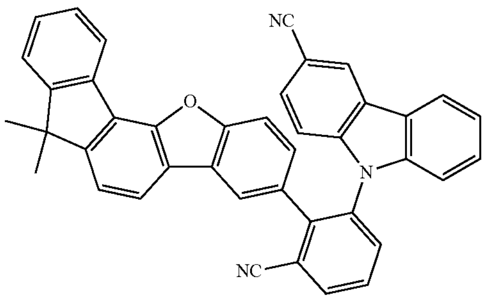
236
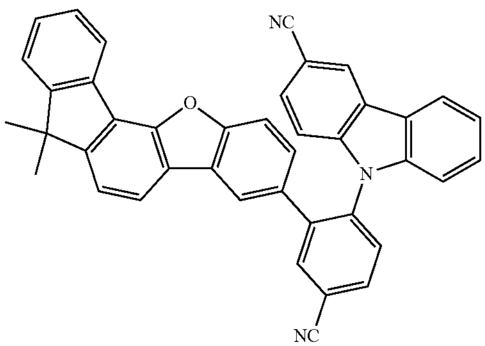
237
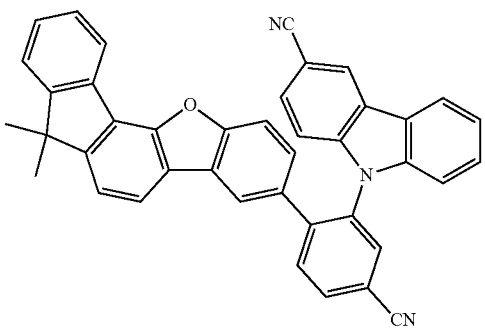
238
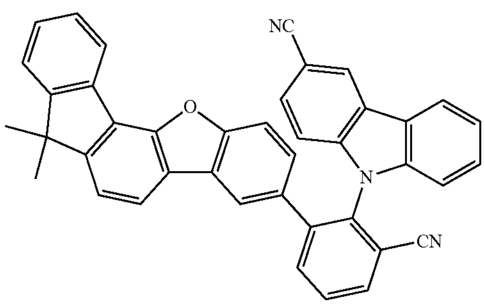
-continued
239
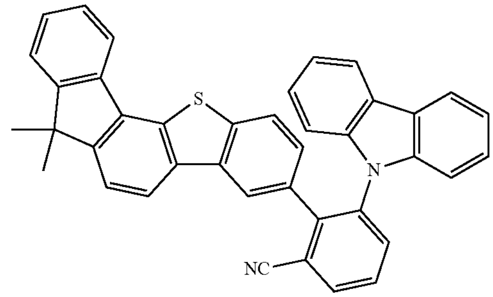
240
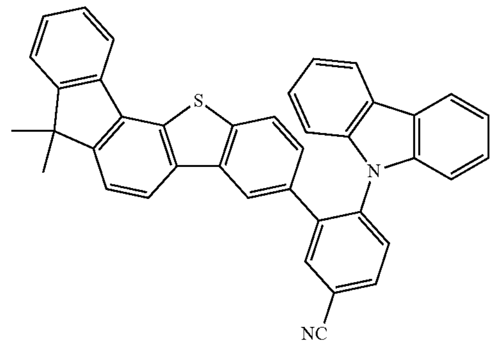
241
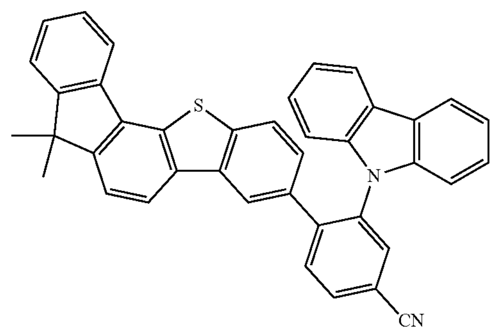
242
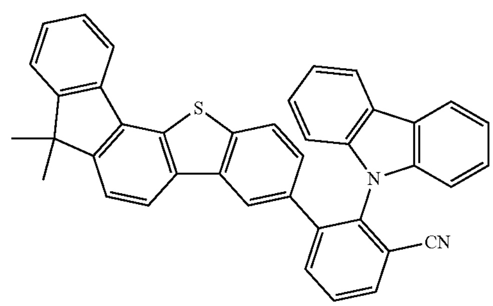
243
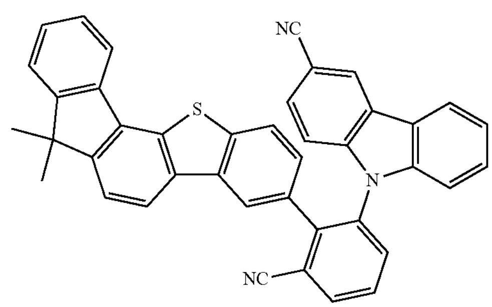

-continued
244
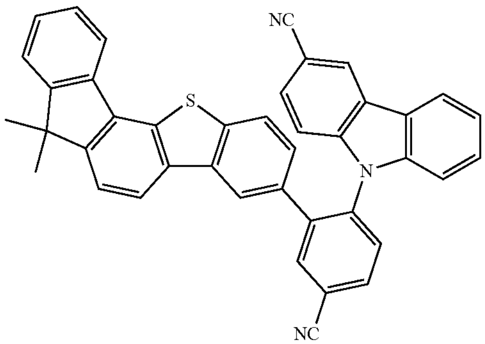
245
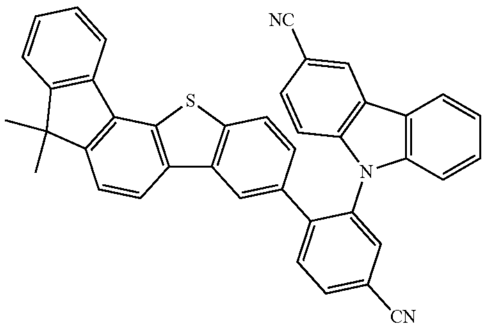
246
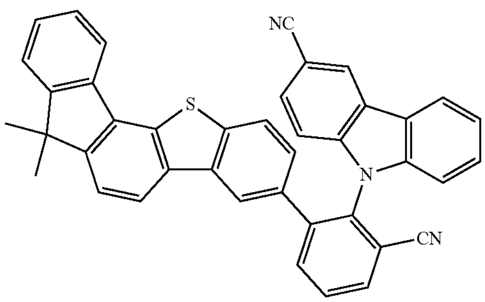
247
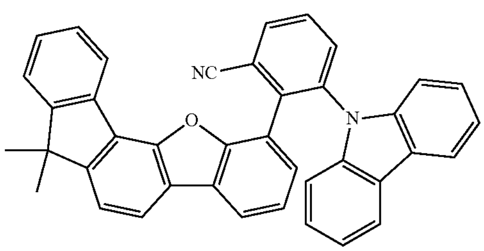
248
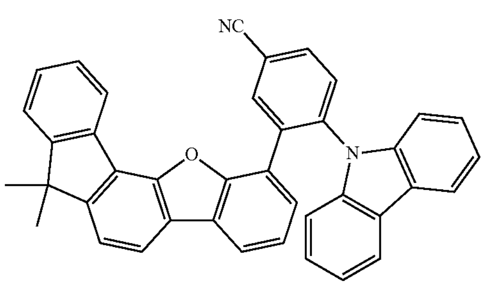
-continued
249
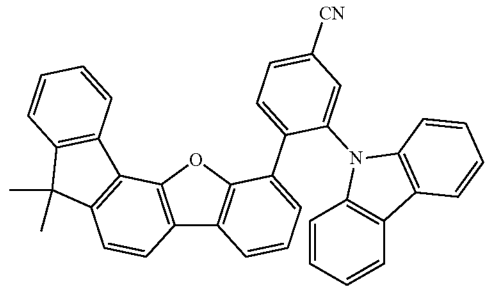
250
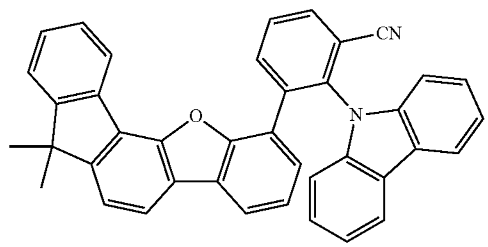
251
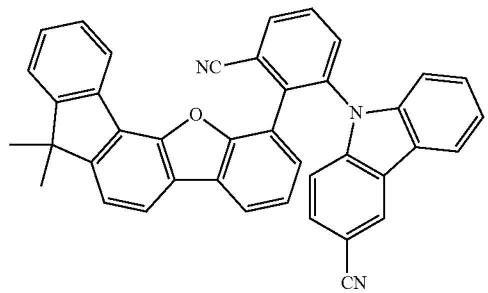
252
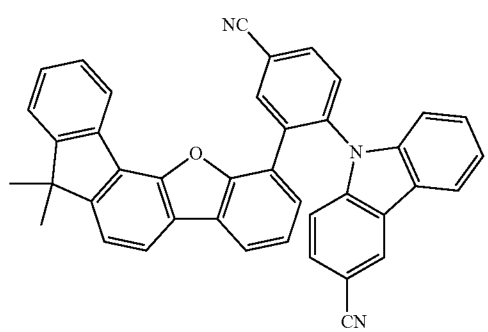
253
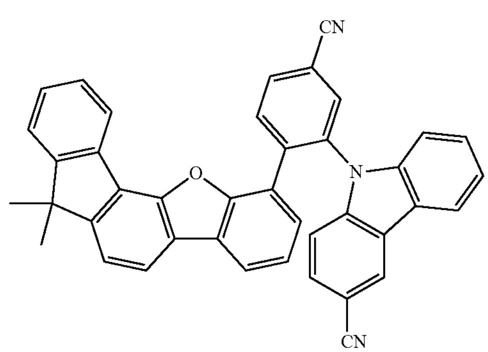

-continued
254
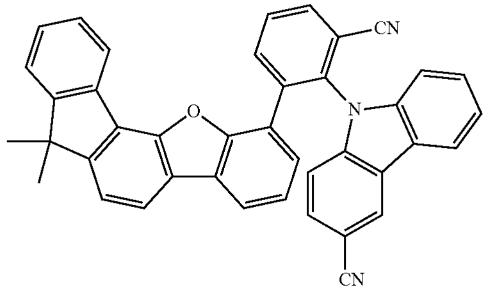
255
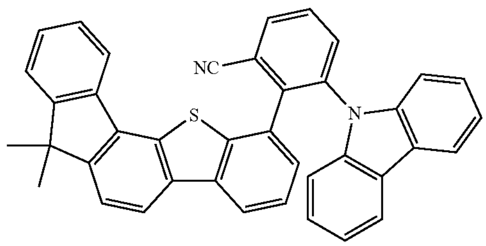
256
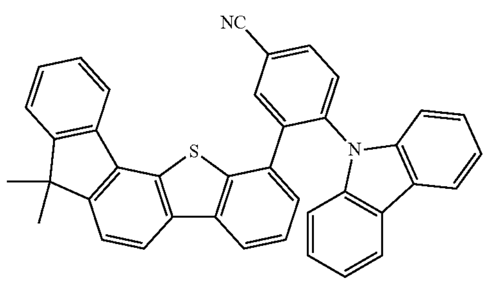
257
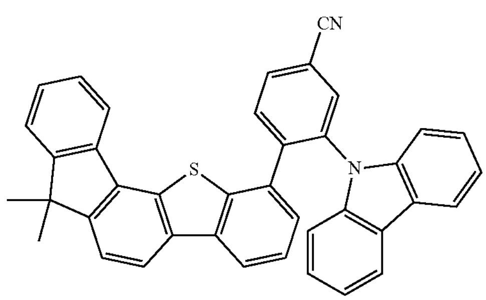
258
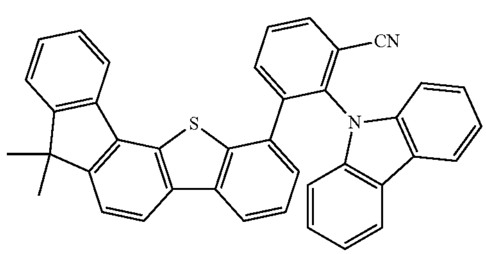
-continued
259
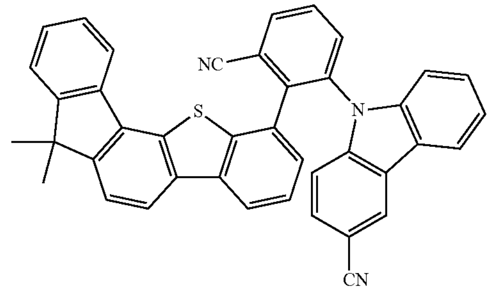
260
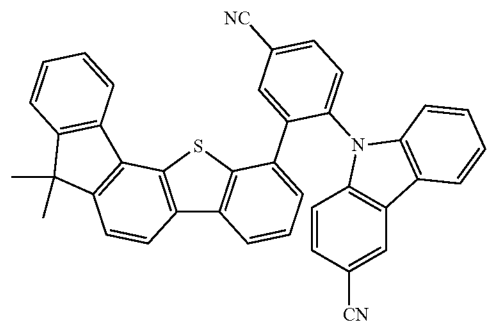
261
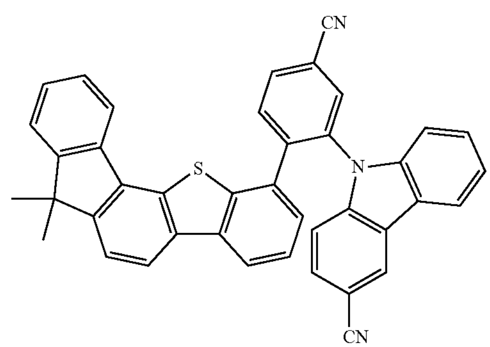
262
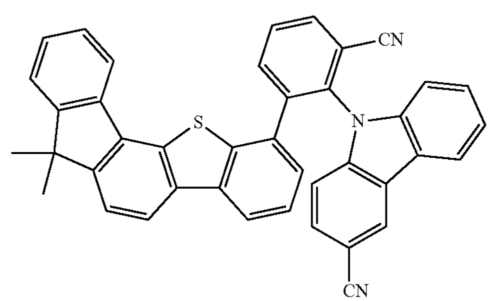
263
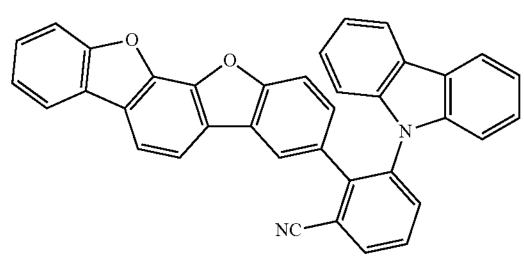

-continued
264
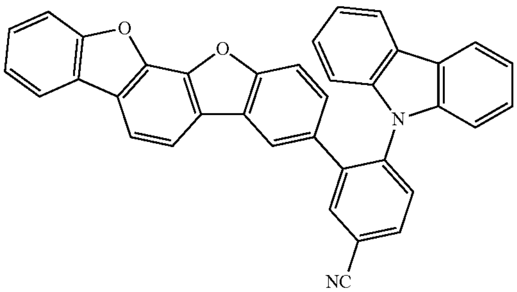
265
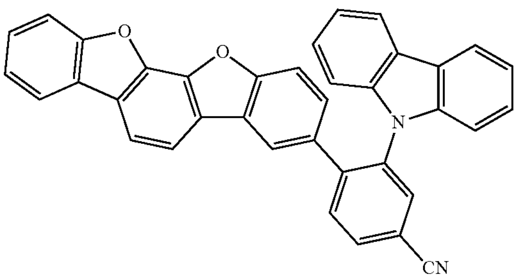
266
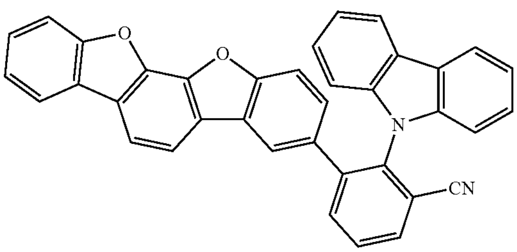
267
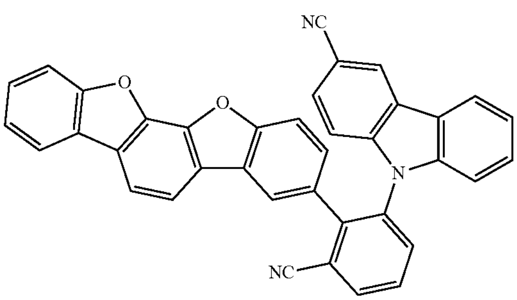
268
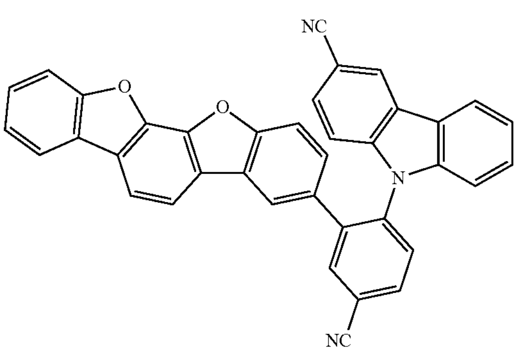
-continued
269
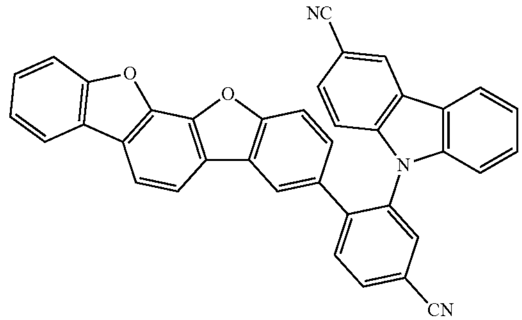
270
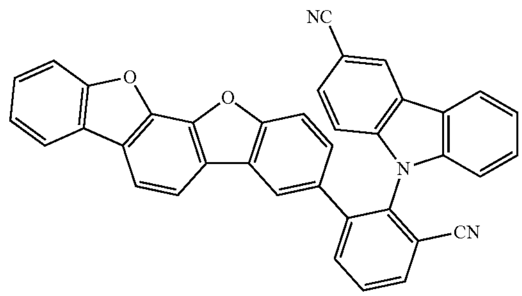
271
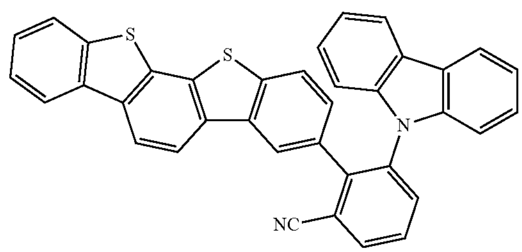
272
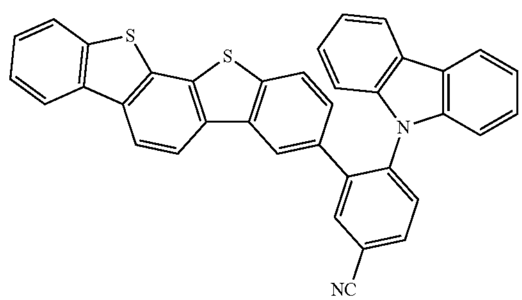
273
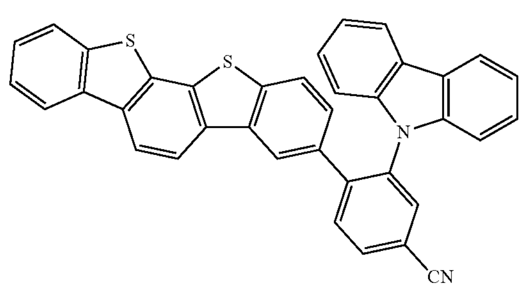

-continued
274
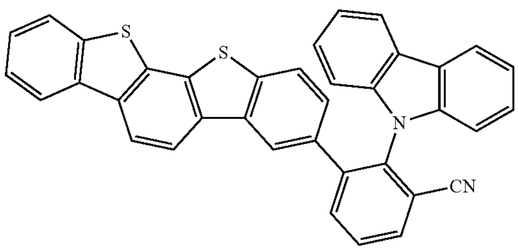
275
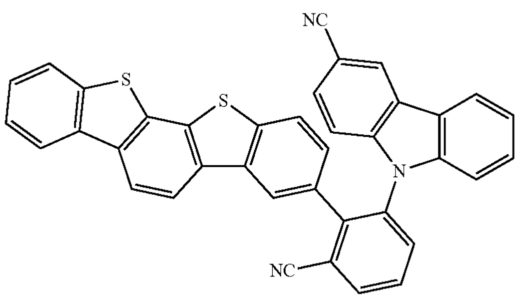
276
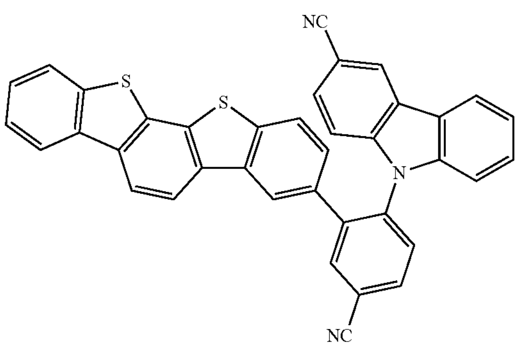
277
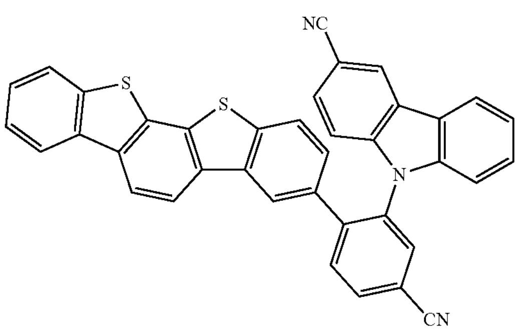
278
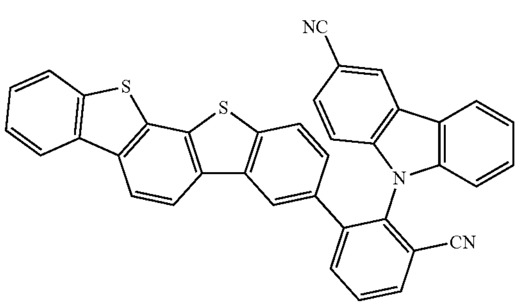
-continued
279
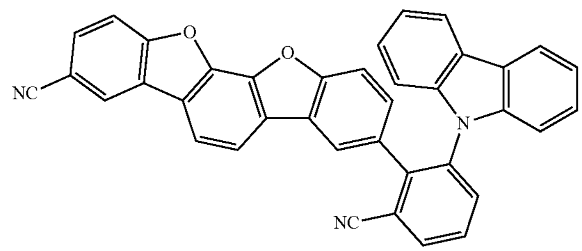
280
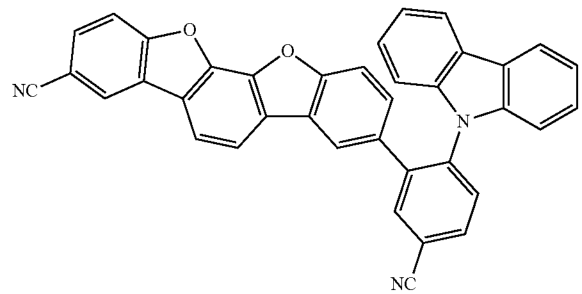
281
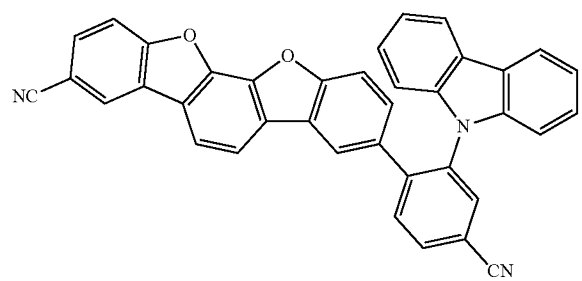
282
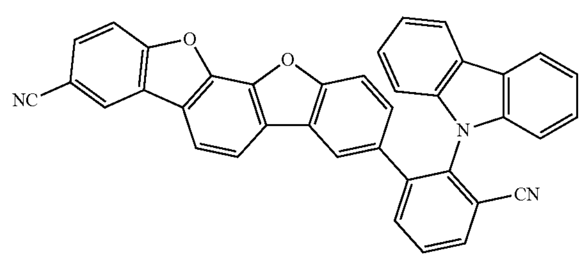
283
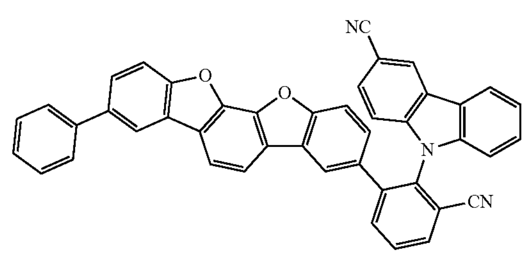

-continued
284
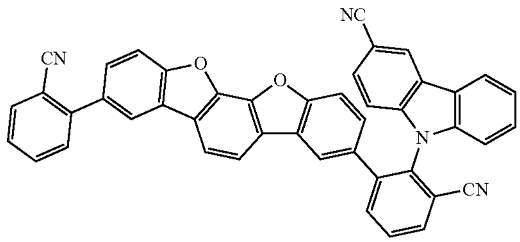
285
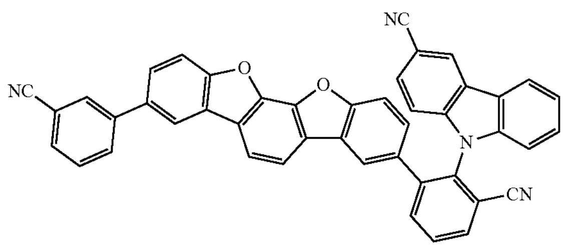
286
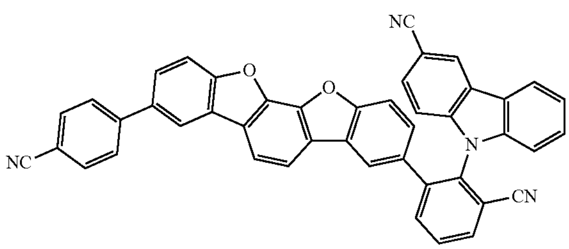
287
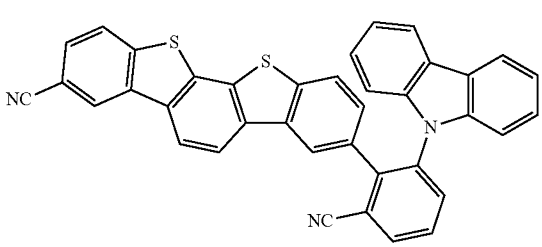
288
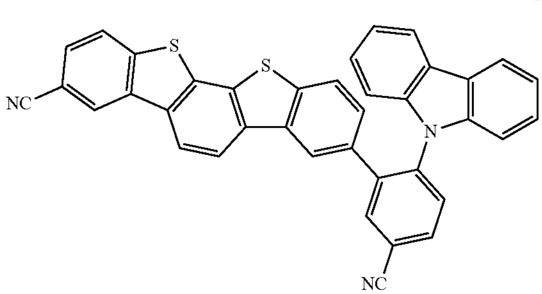
289
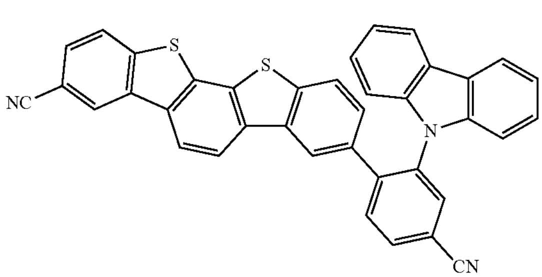
-continued
290
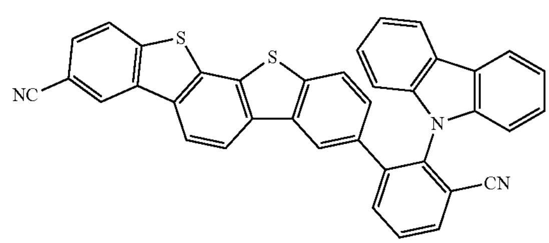
291
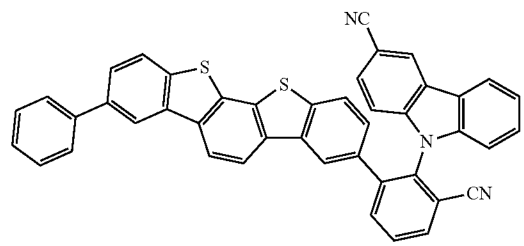
292
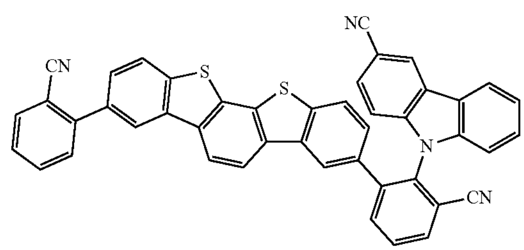
293
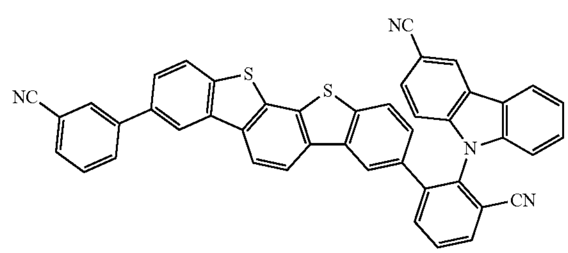
294
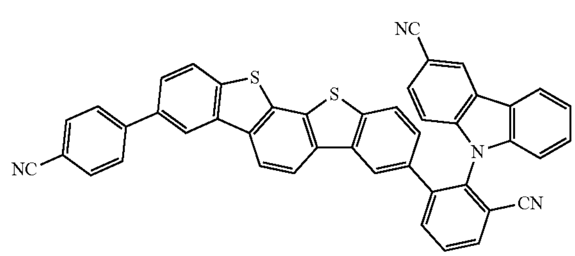

295
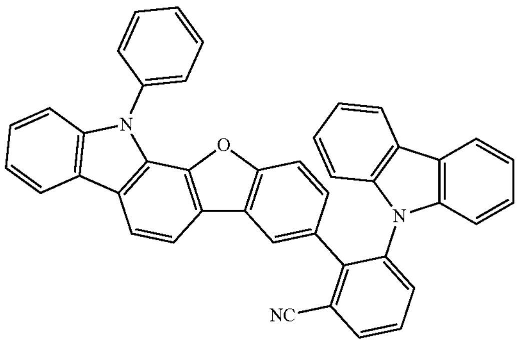
296
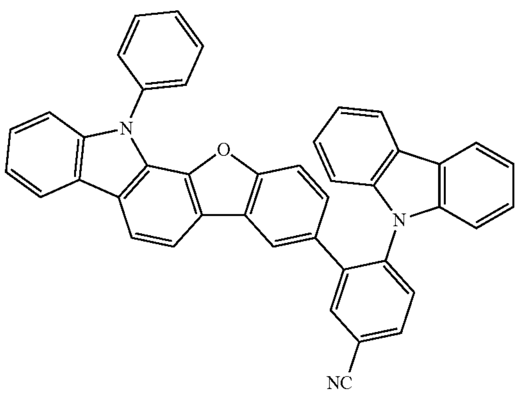
297
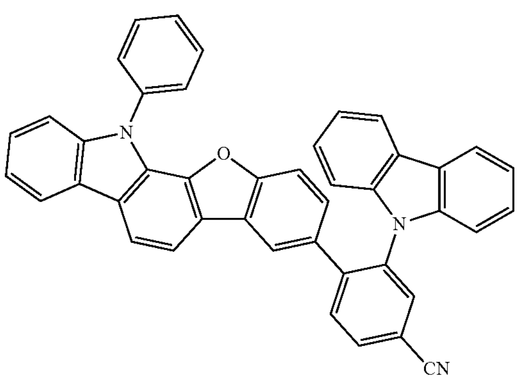
298
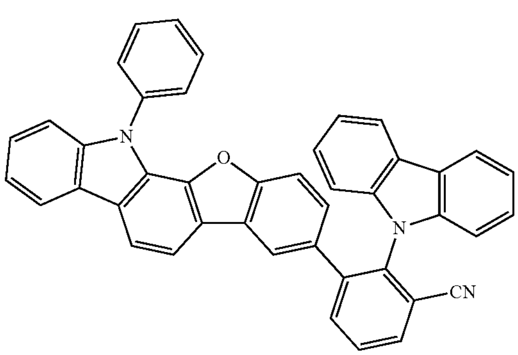
299
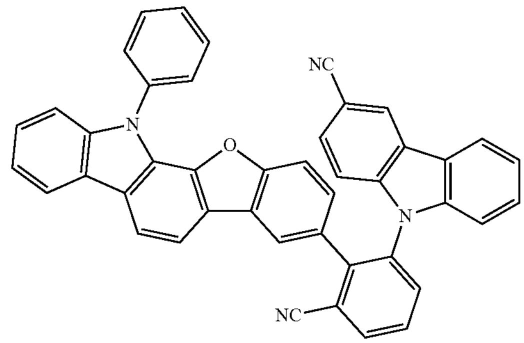
300
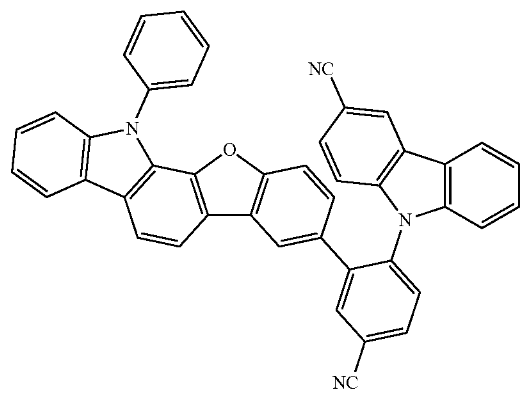
301
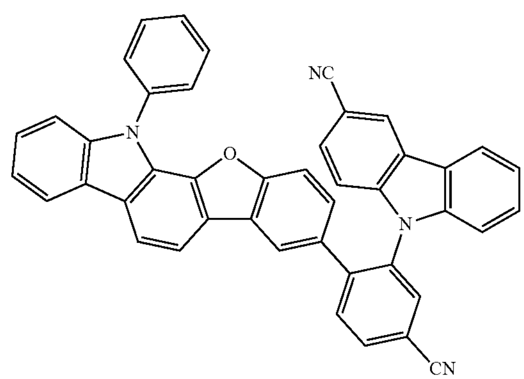
302
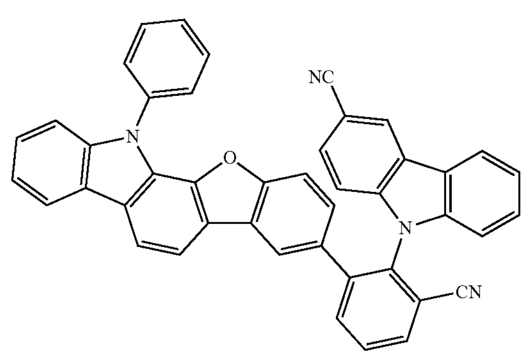

-continued
303
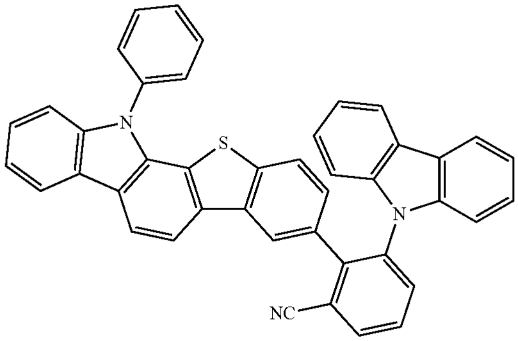
304
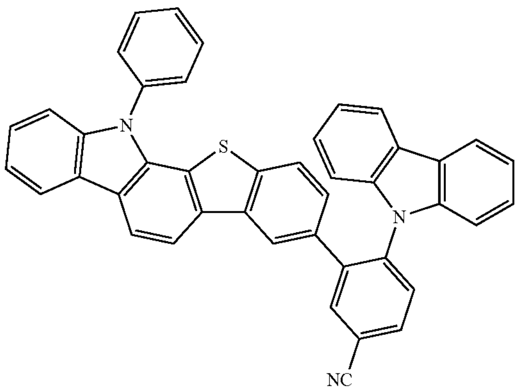
305
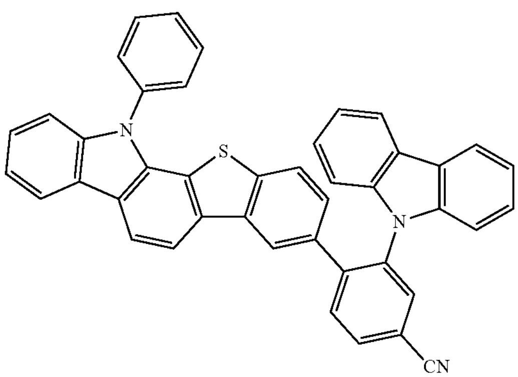
306
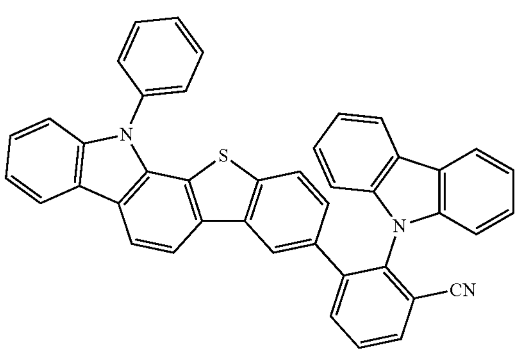
-continued
307
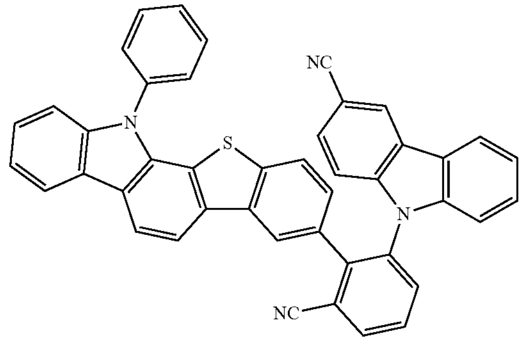
308
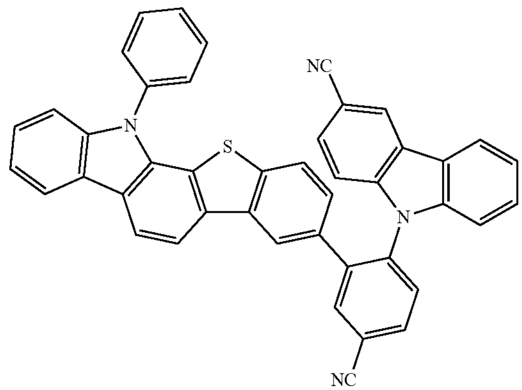
309
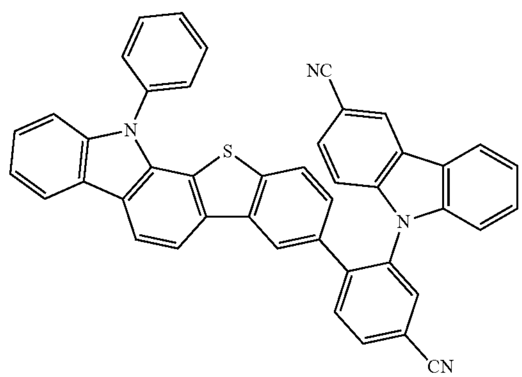
310
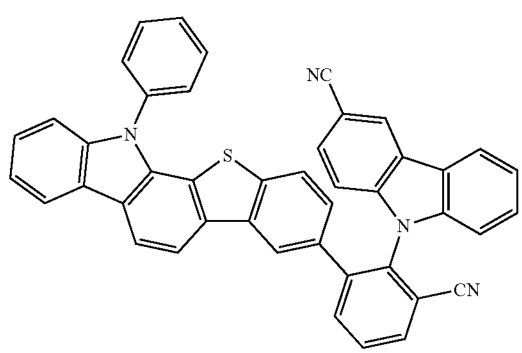

-continued
311
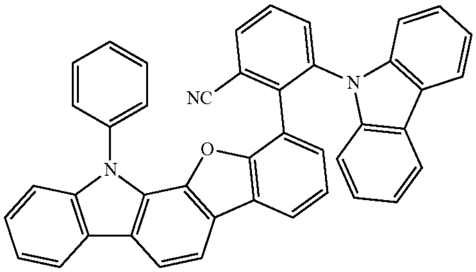
312
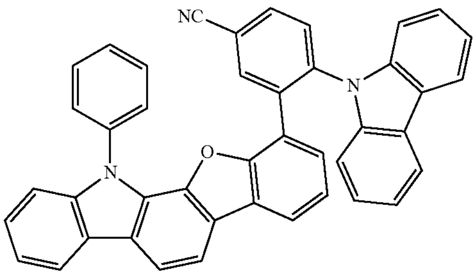
313
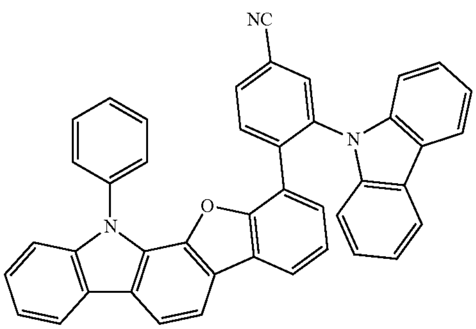
314
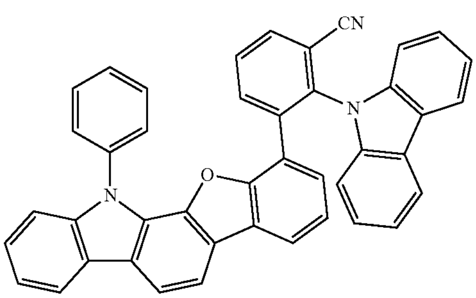
315
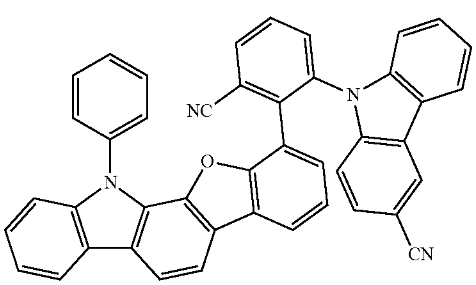
-continued
316
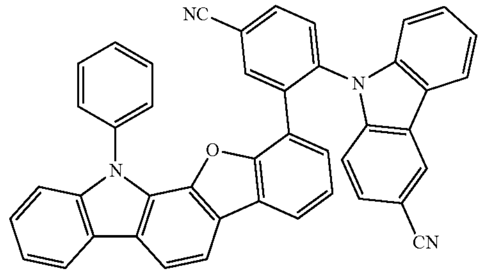
317
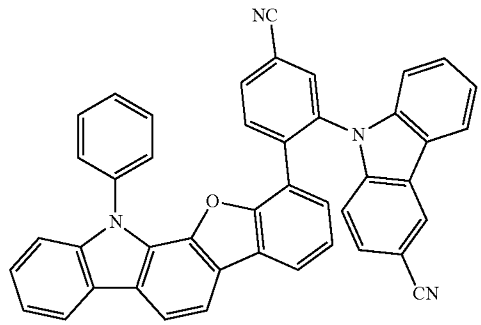
318
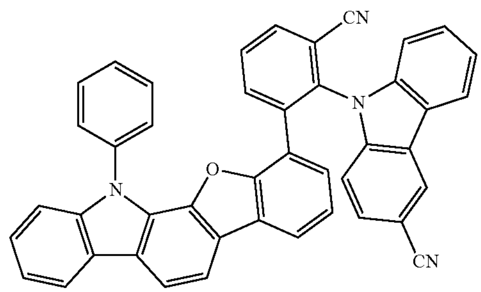
319
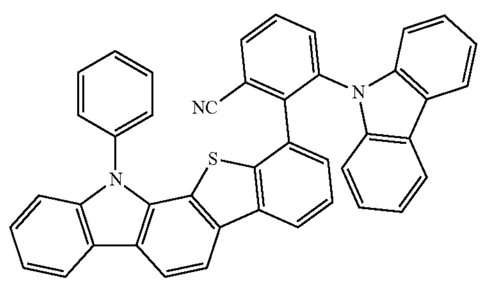
320
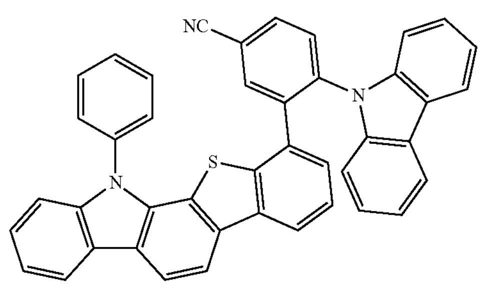

-continued
321
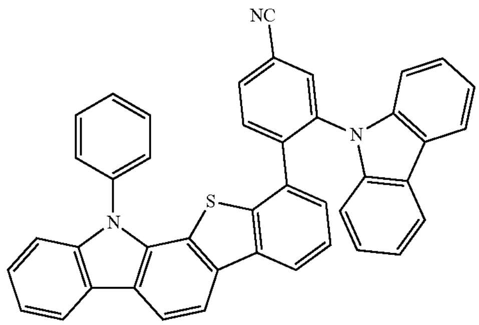
322
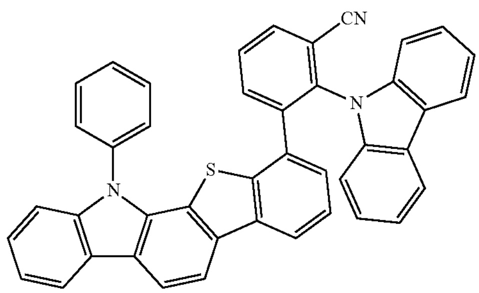
323
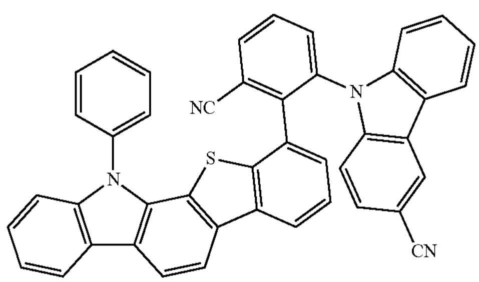
324
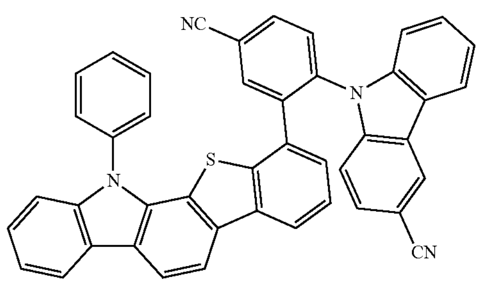
325
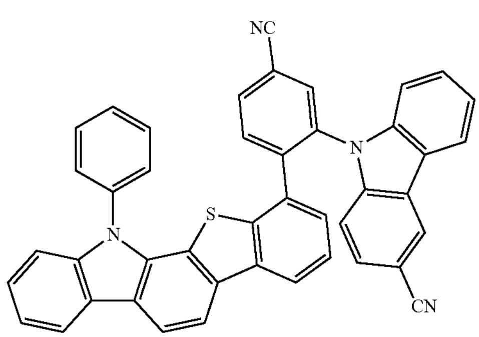
-continued
326
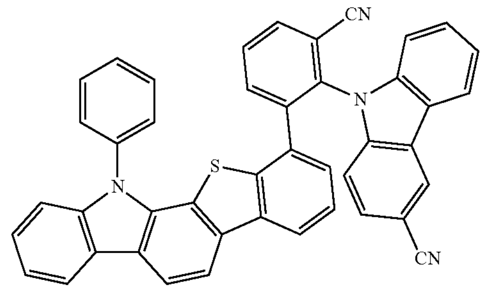
327
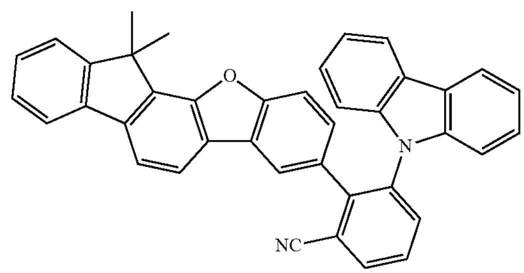
328
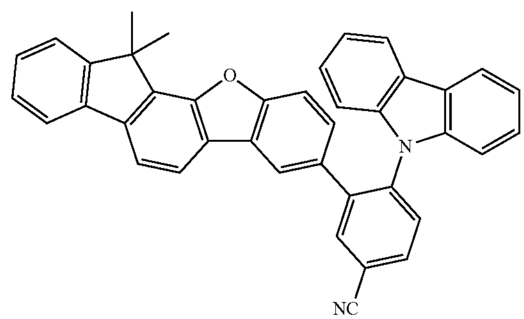
329
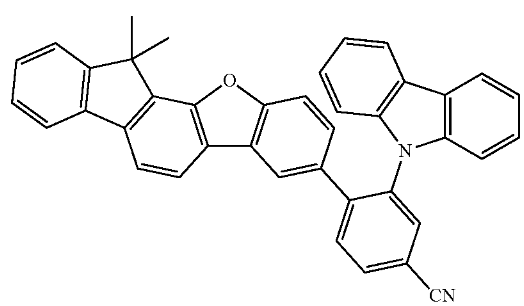
330
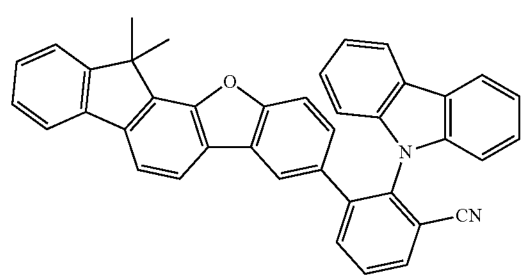

-continued
331
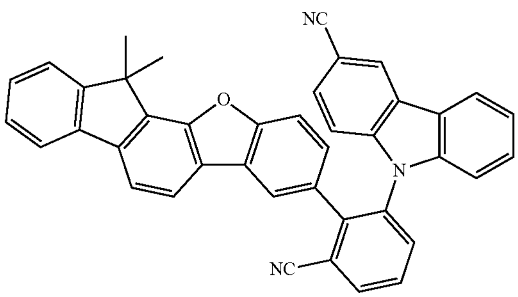
332
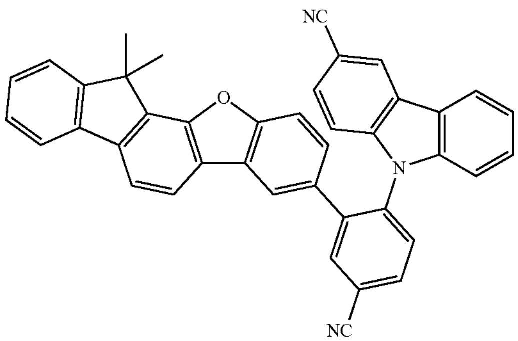
333
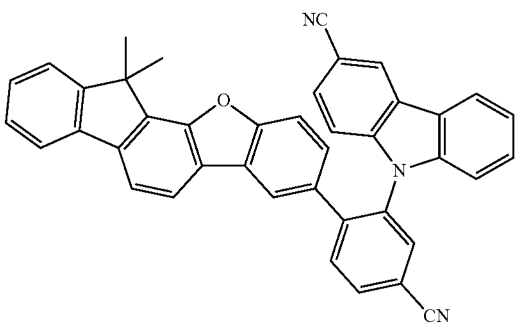
334
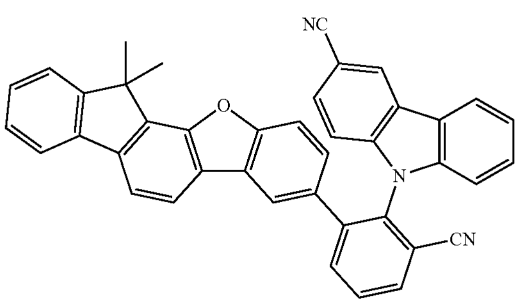
335
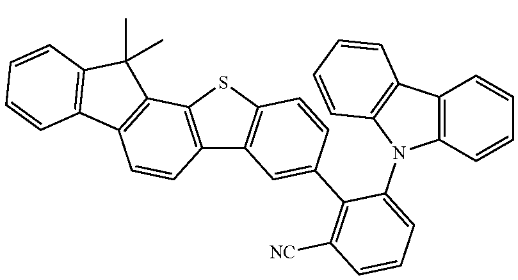
-continued
336
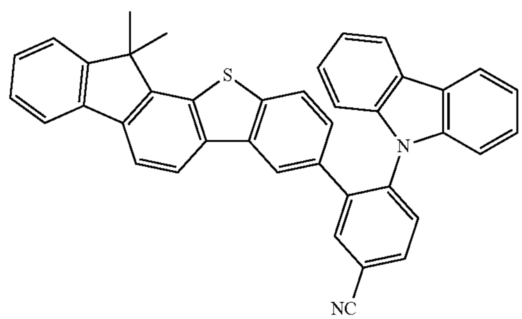
337
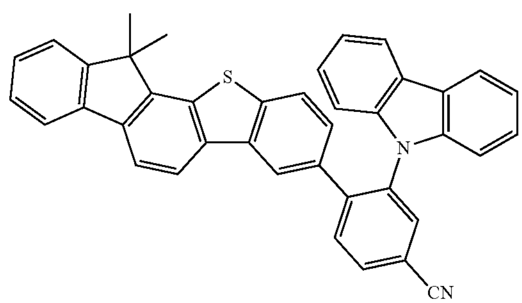
338
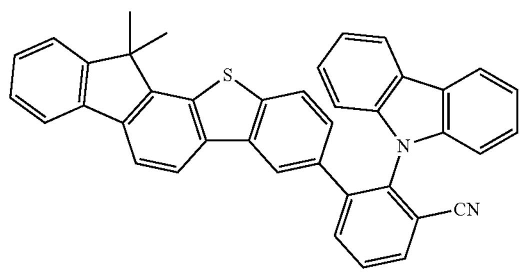
339
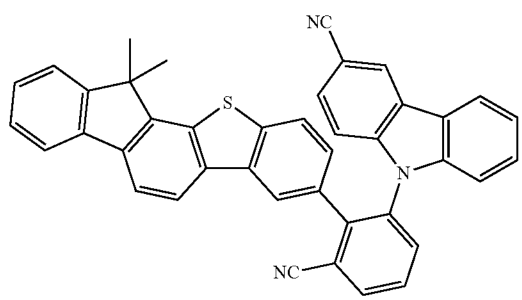
340
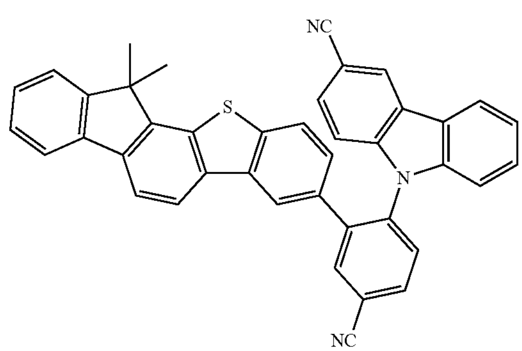

-continued
341
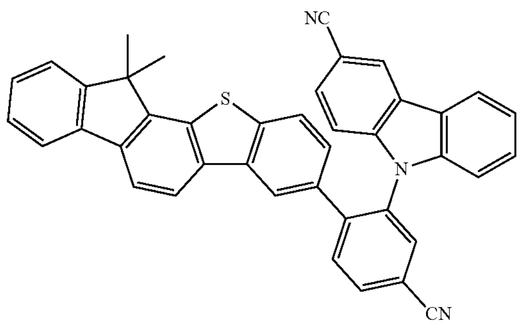
342
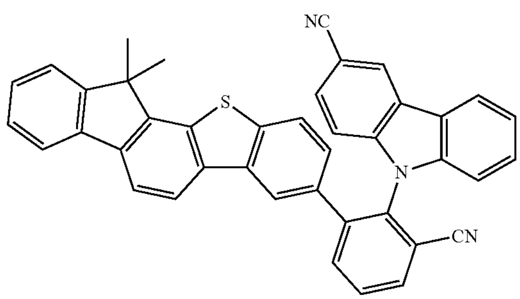
343
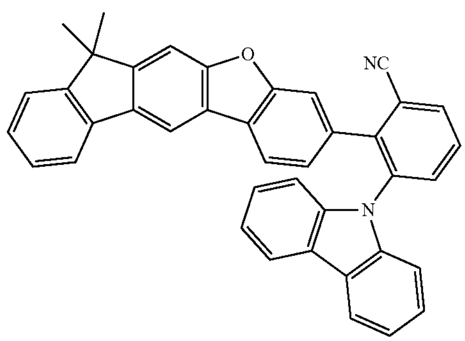
344
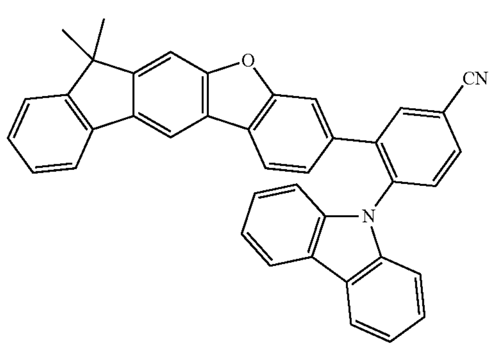
-continued
345
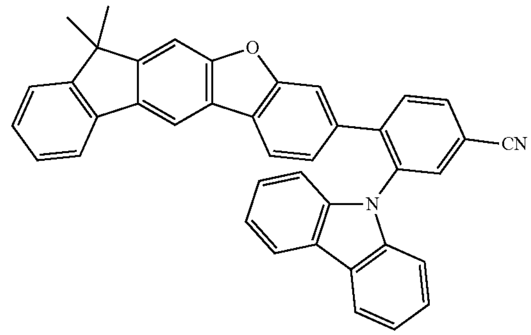
346
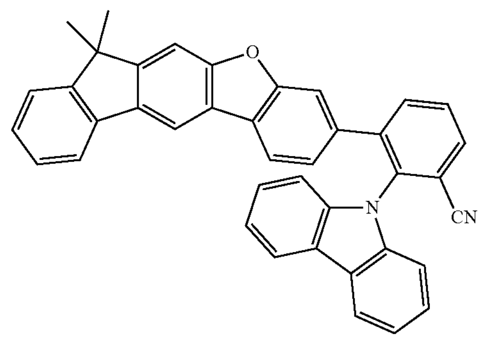
347
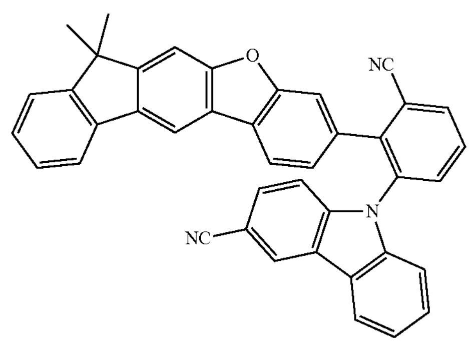
348
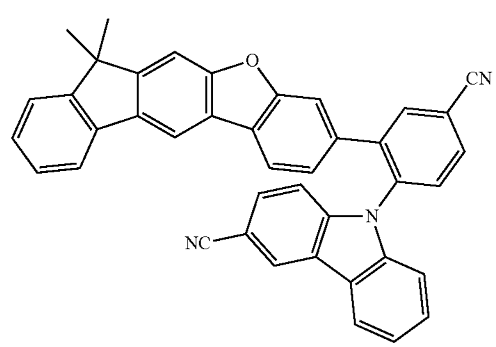

-continued
349
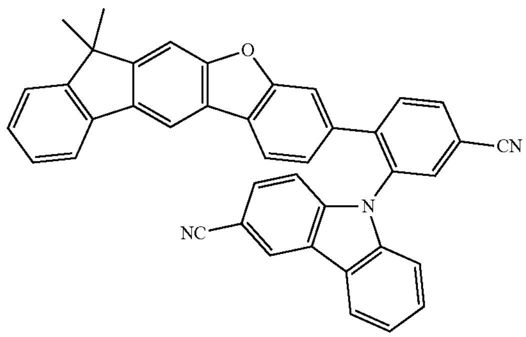
350
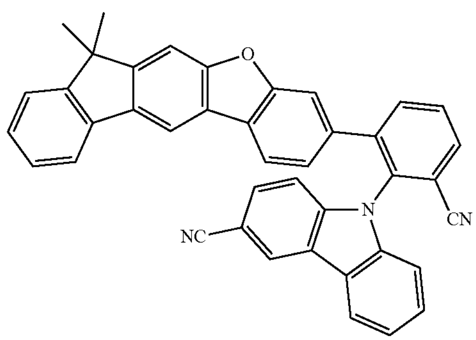
351
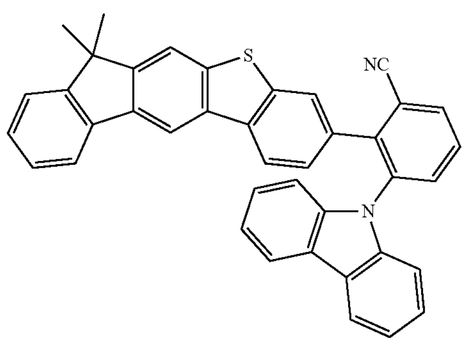
352
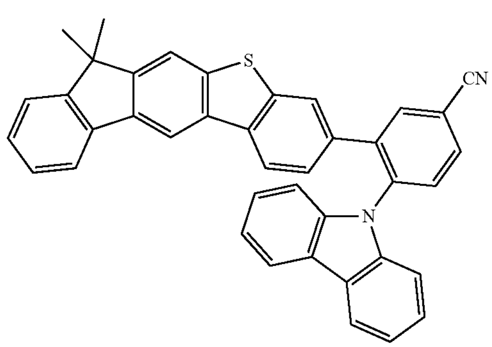
-continued
353
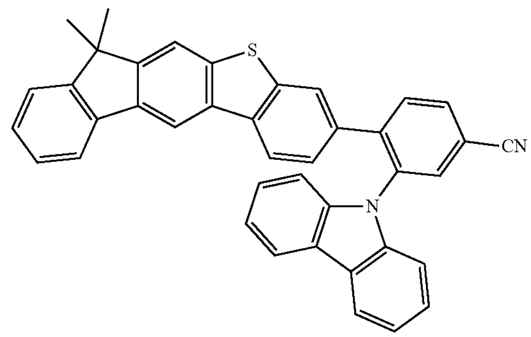
354
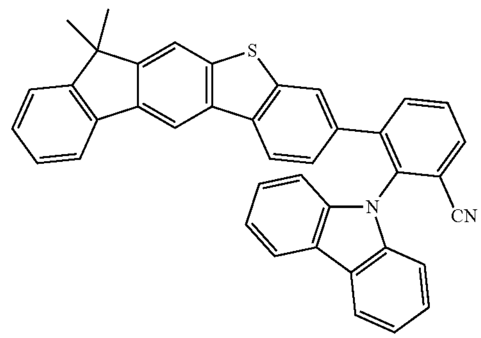
355
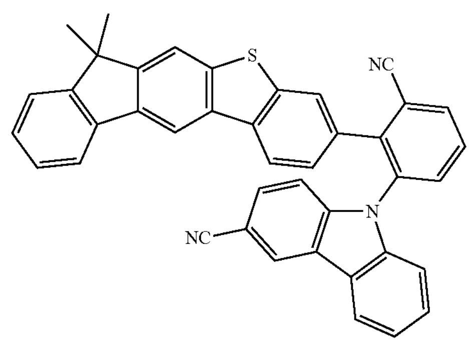
356
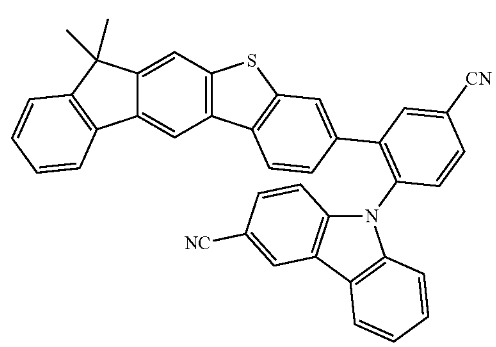

-continued
357
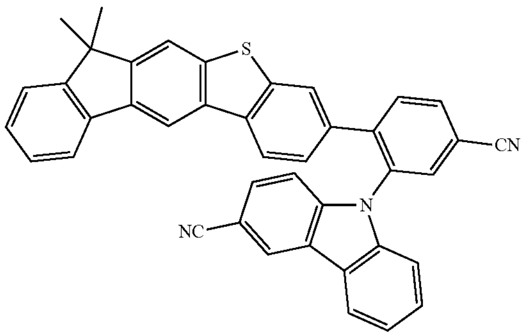
358
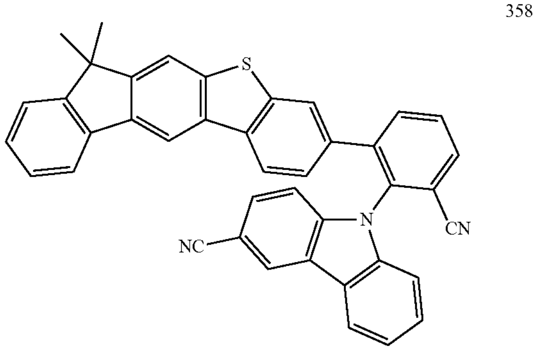
359
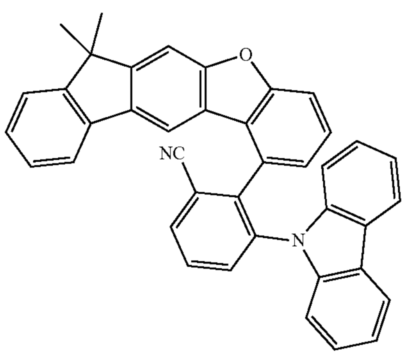
360
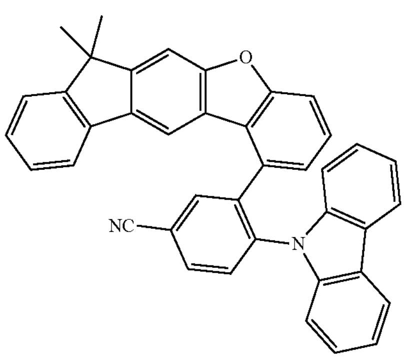
-continued
361
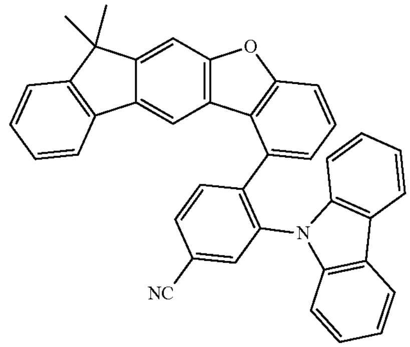
362
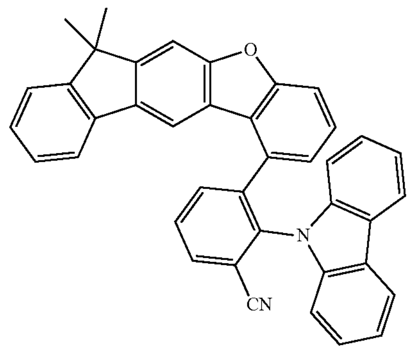
363
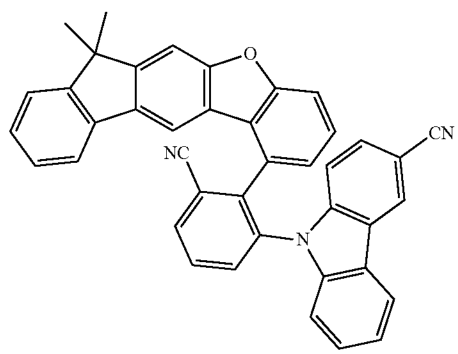
364
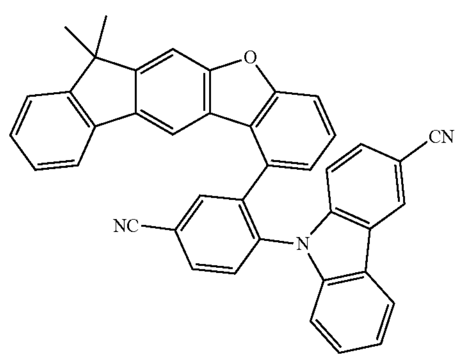

-continued
365
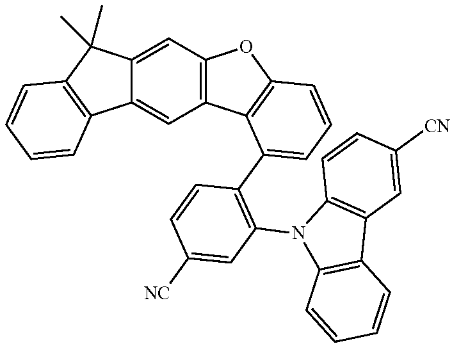
366
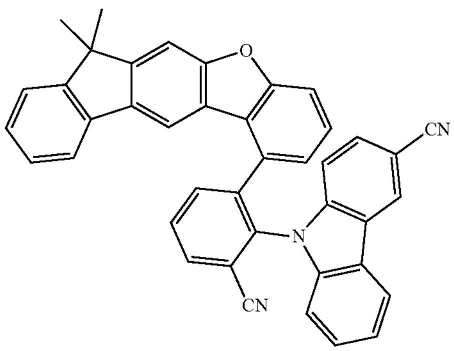
367
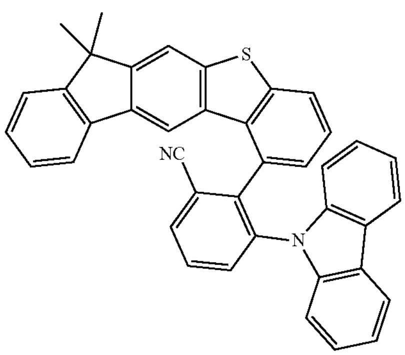
368
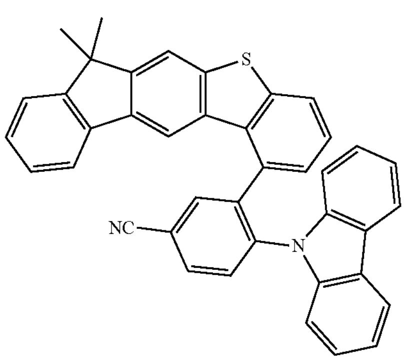
-continued
369
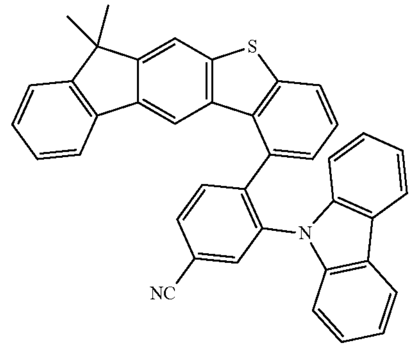
370
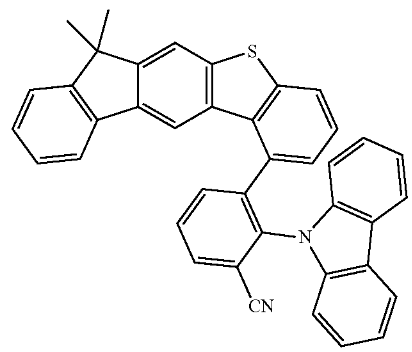
371
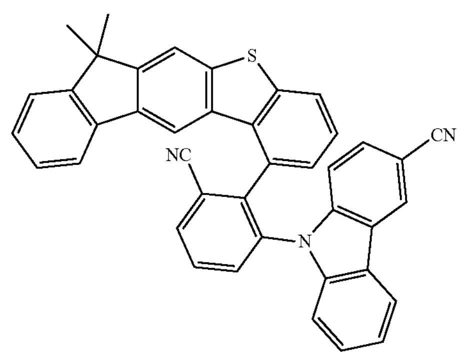
372
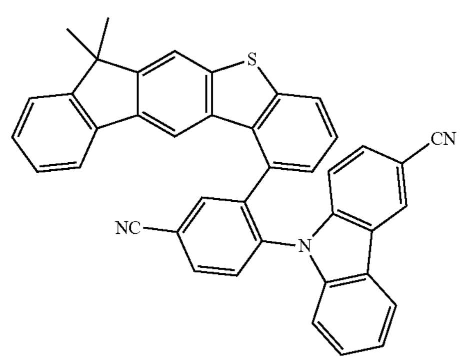

-continued
373
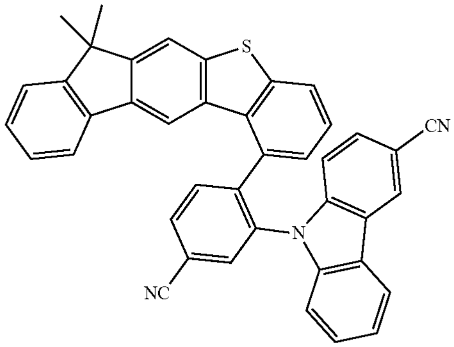
374
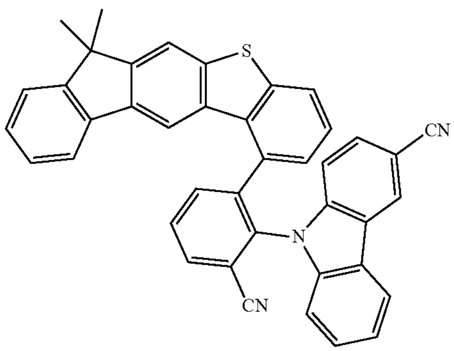
375
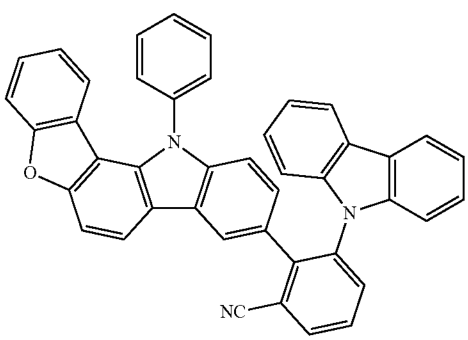
376
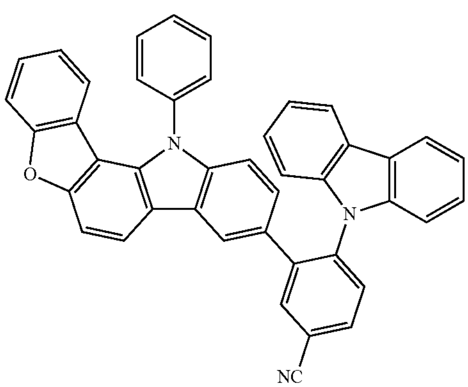
-continued
377
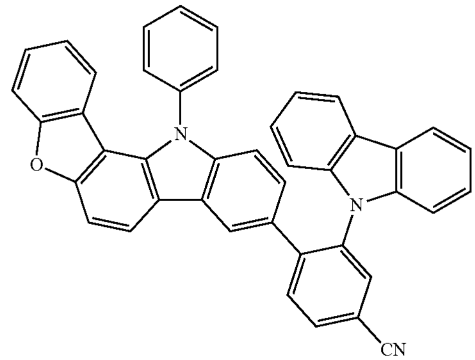
378
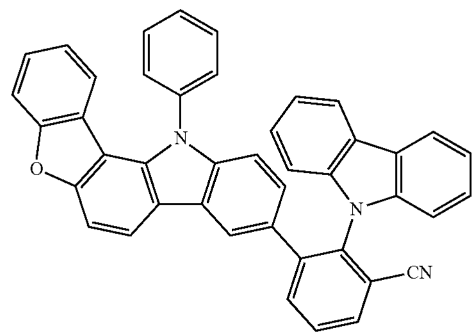
379
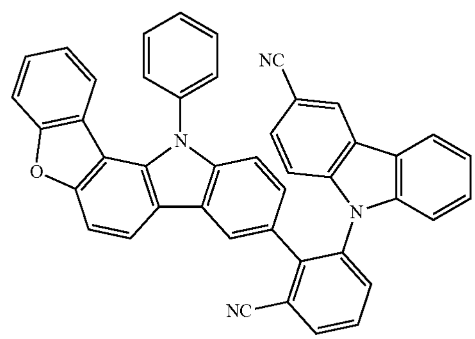
380
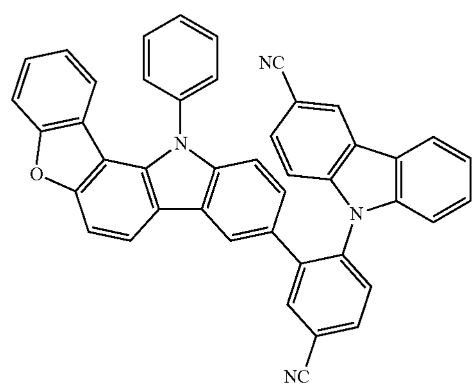

-continued
381
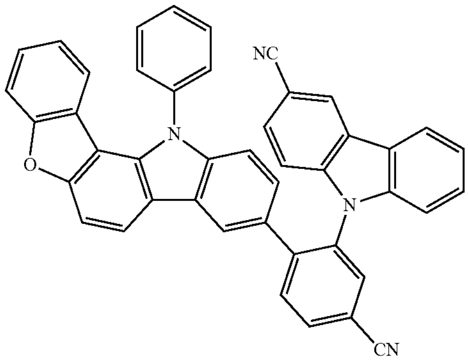
382
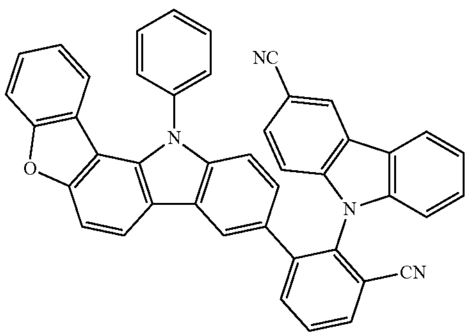
383
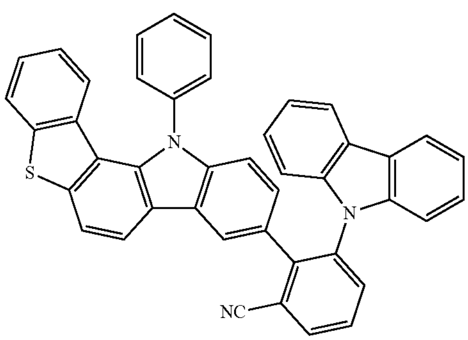
384
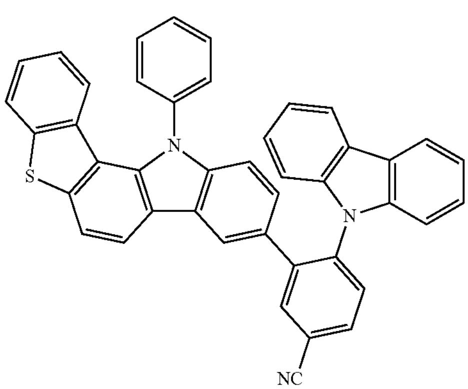
-continued
385
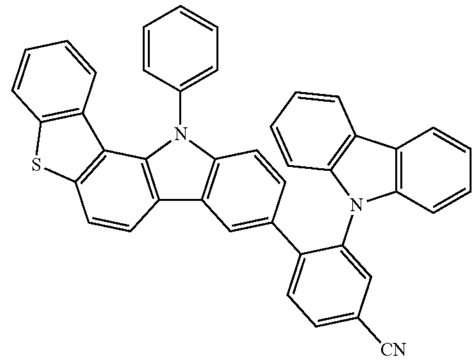
386
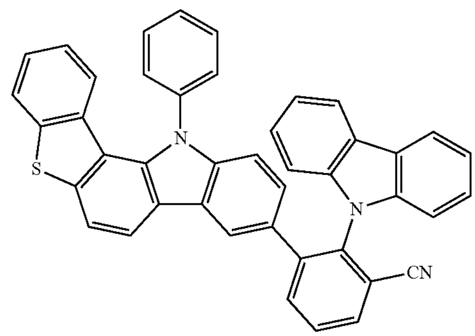
387
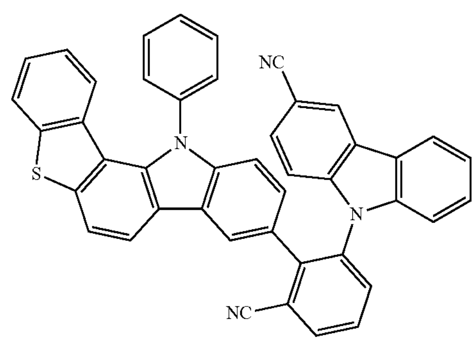
388
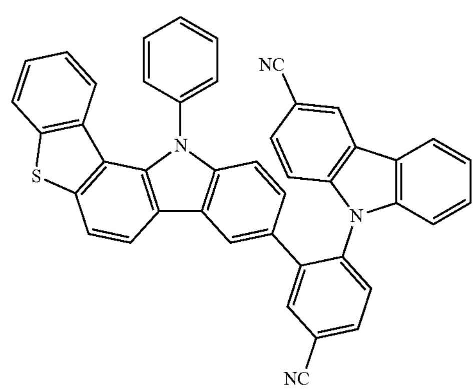

-continued
389
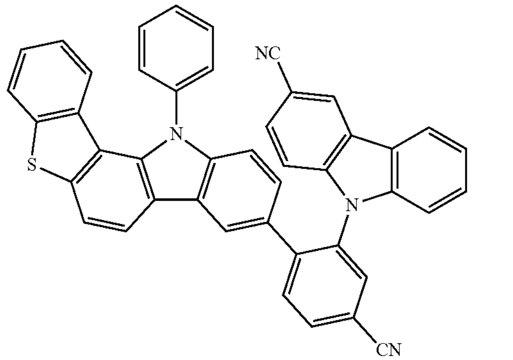
390
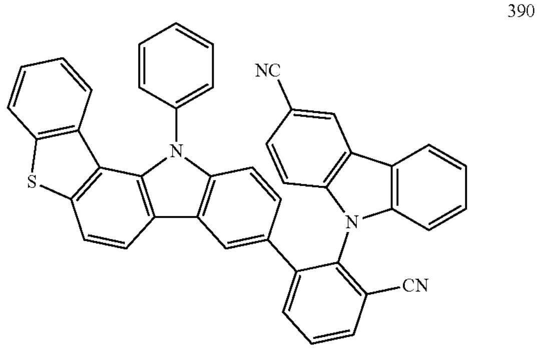
391
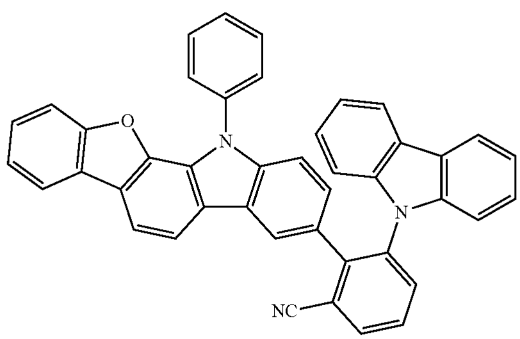
392
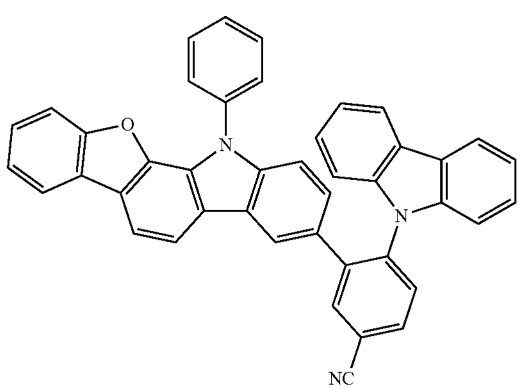
-continued
393
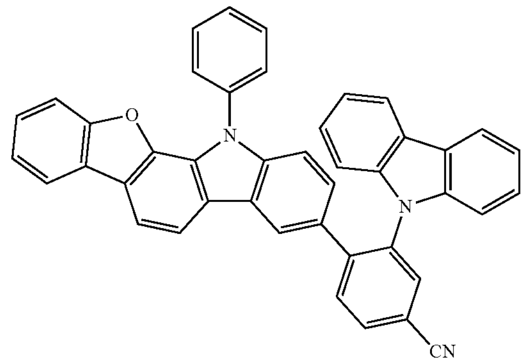
394
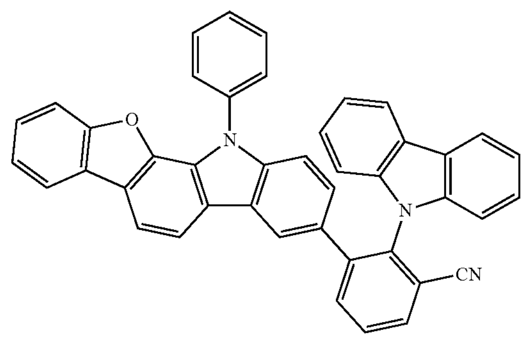
395
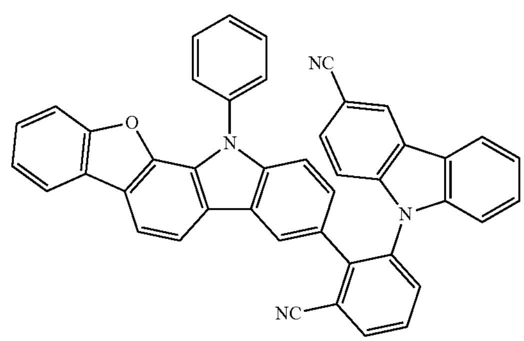
396
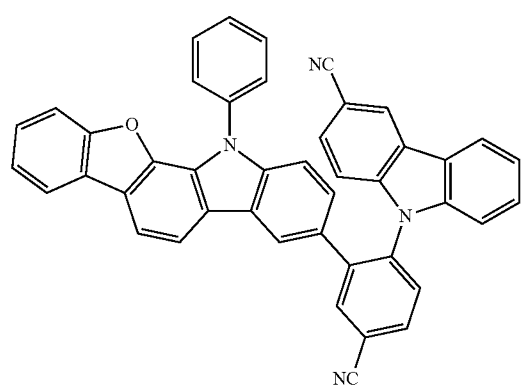

397
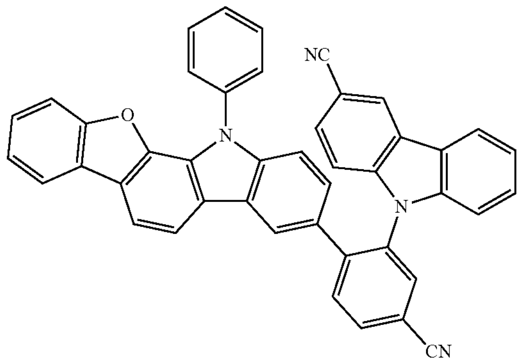
398
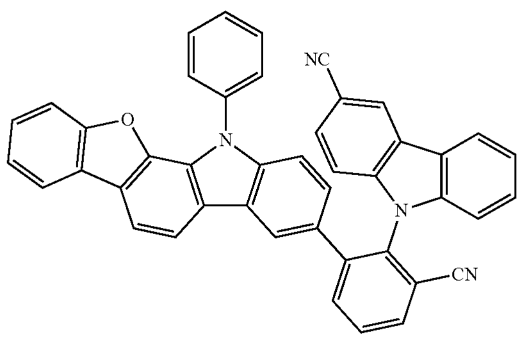
399
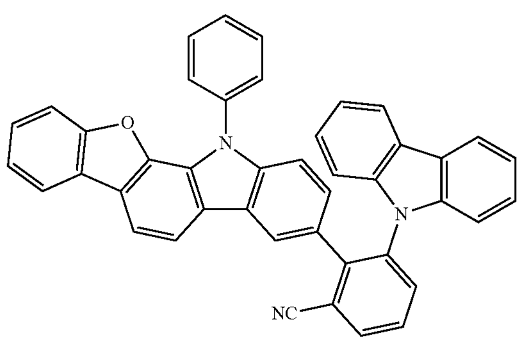
400
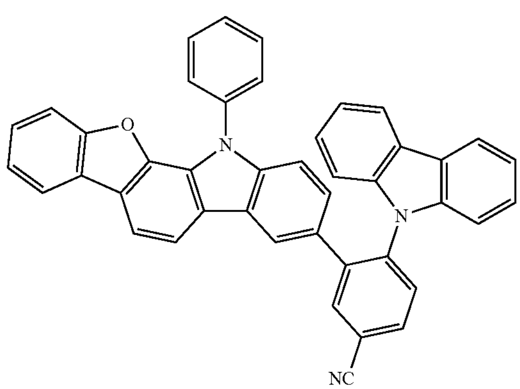
401
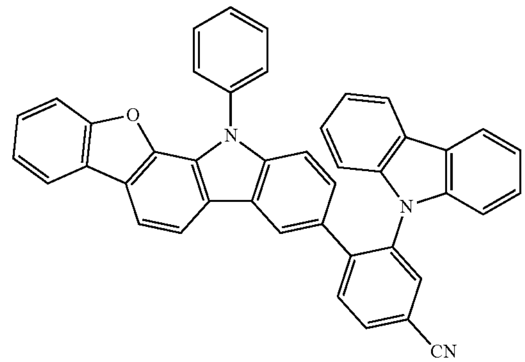
402
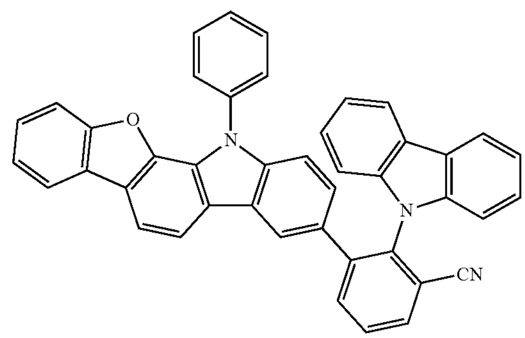
403
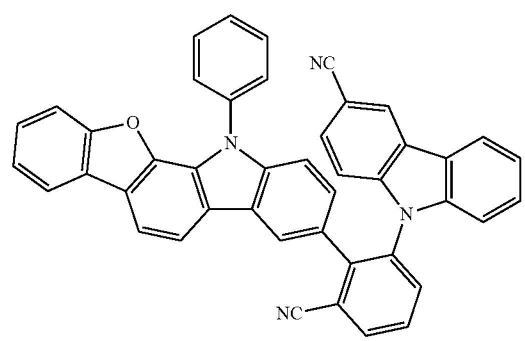
404
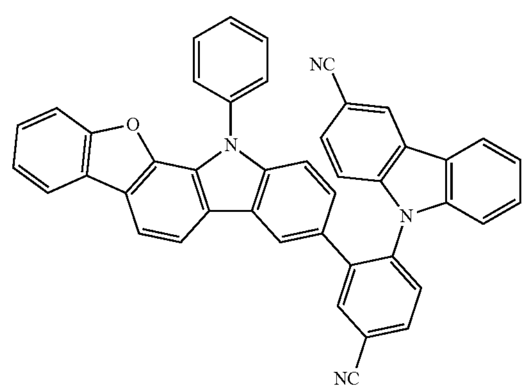

-continued
405
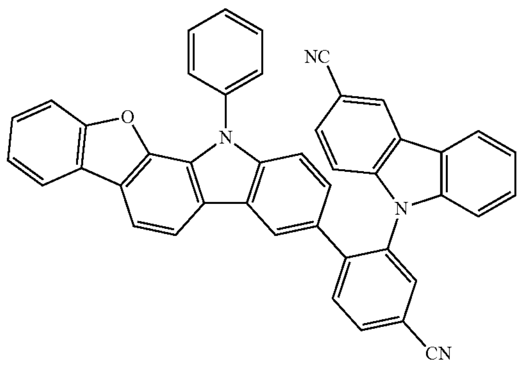
406
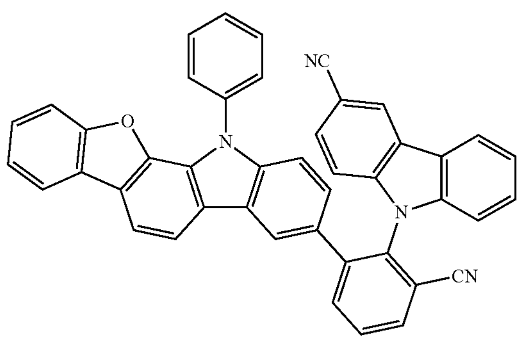
407
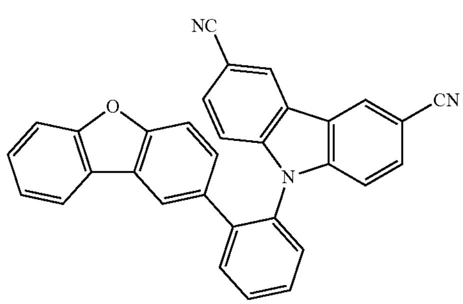
408
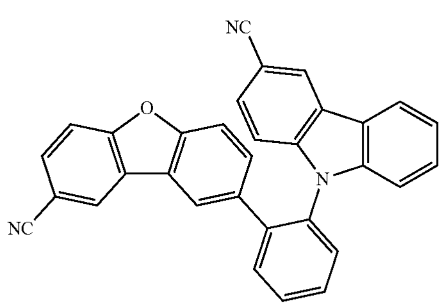
-continued
409
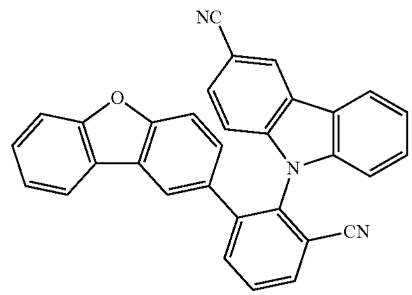
410
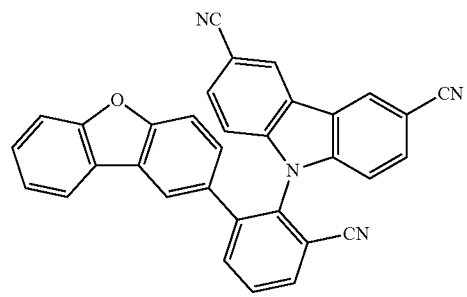
411
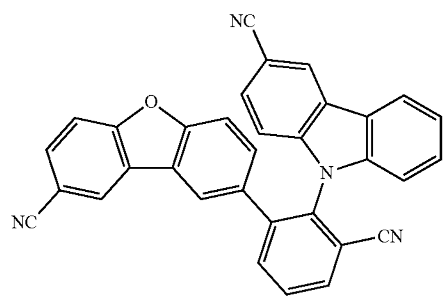
412
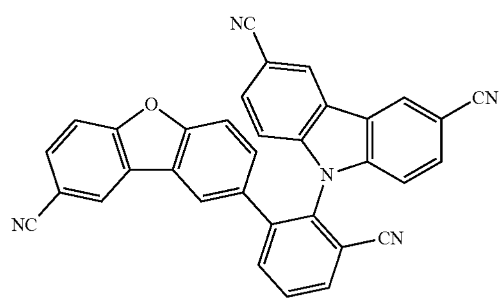
413
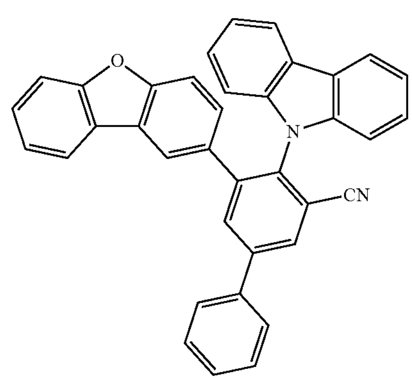

-continued
414
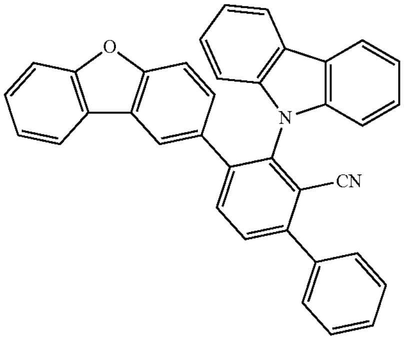
415
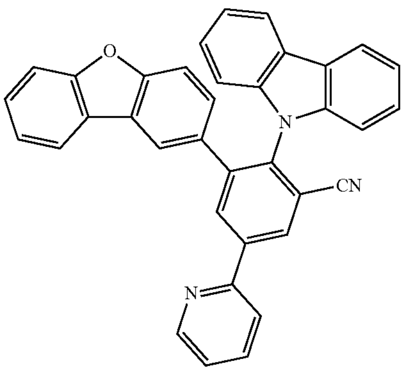
416
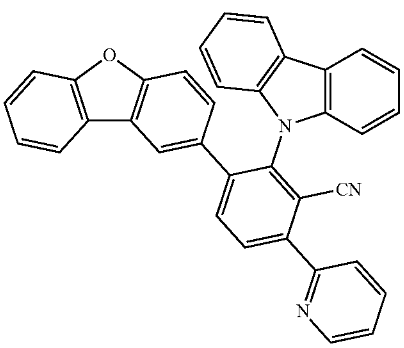
417
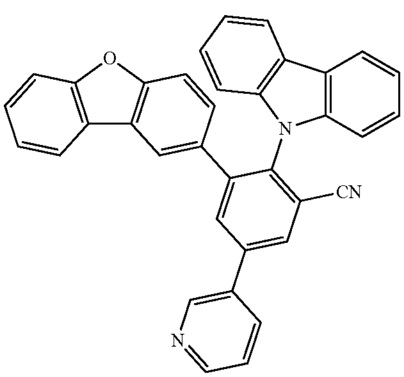
-continued
418
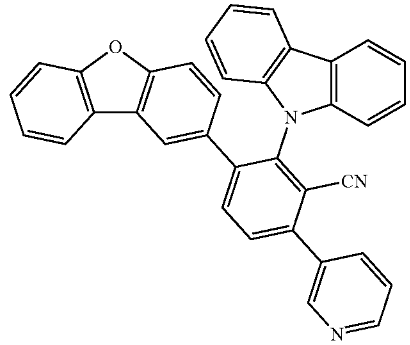
419
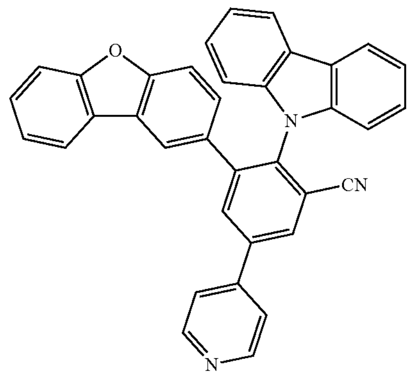
420
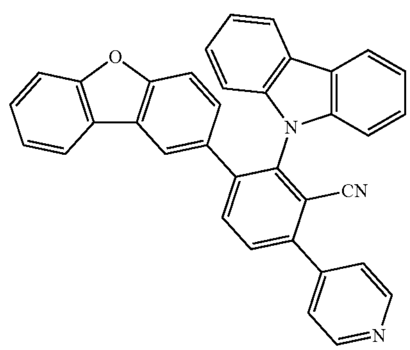
421
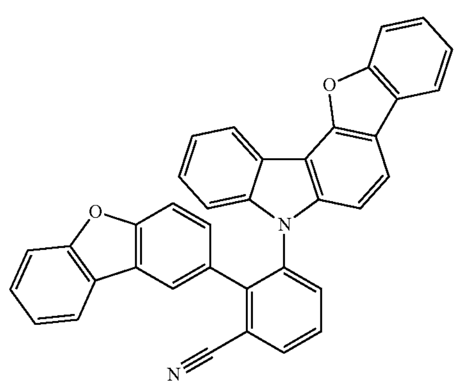

-continued
422
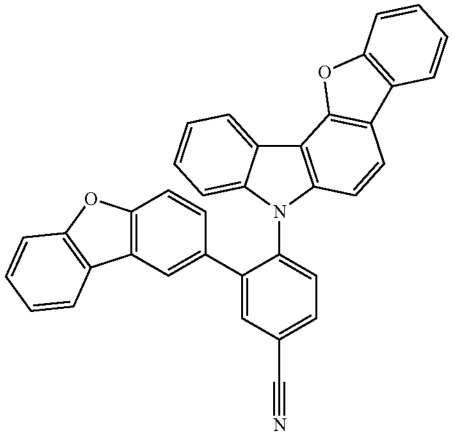
423
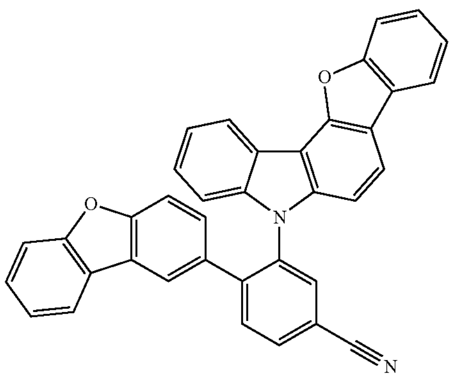
424
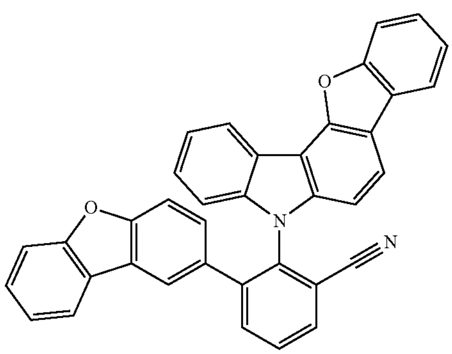
425
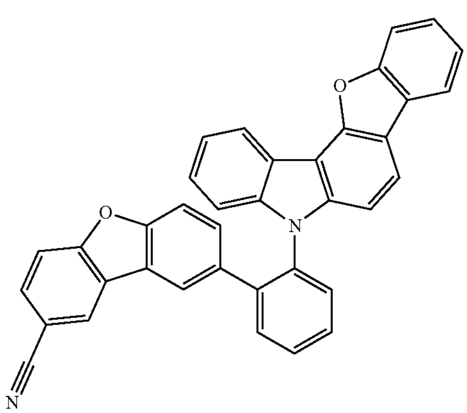
-continued
426
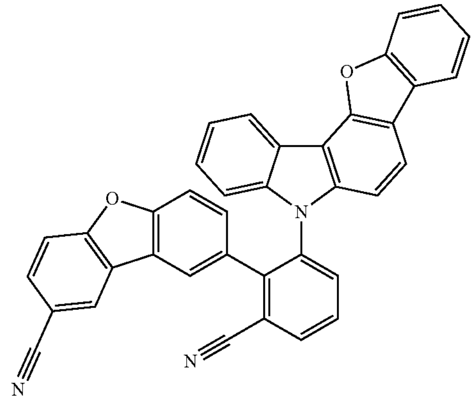
427
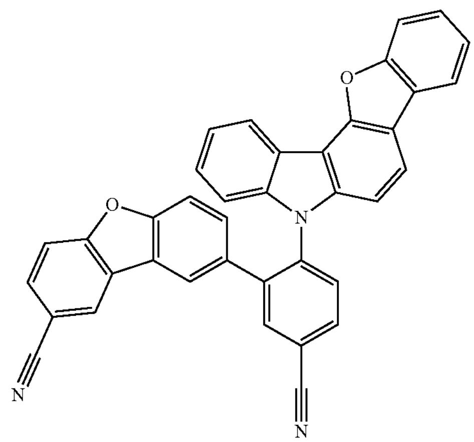
428
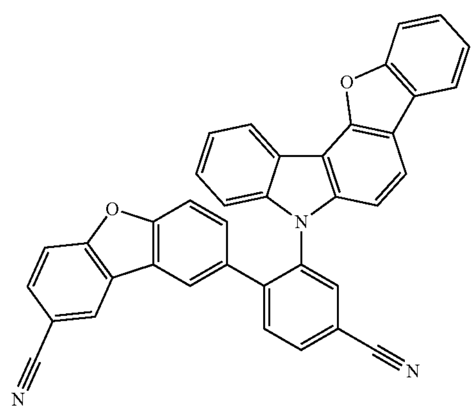
429
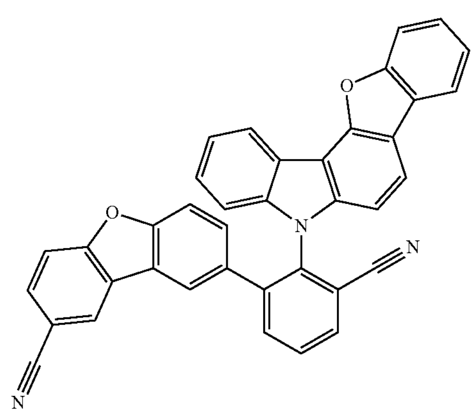

-continued
430
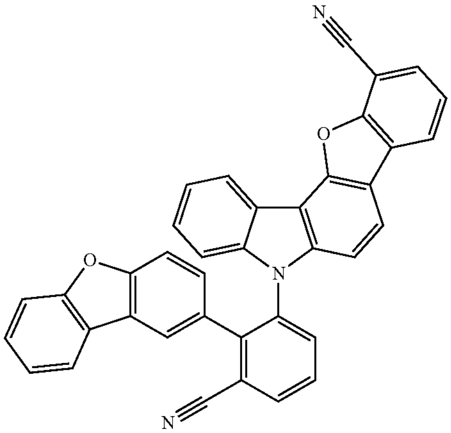
431
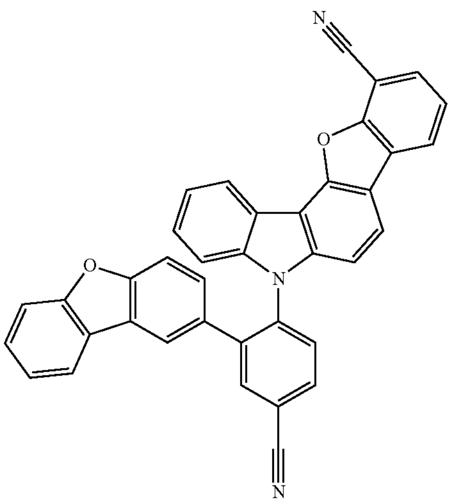
432
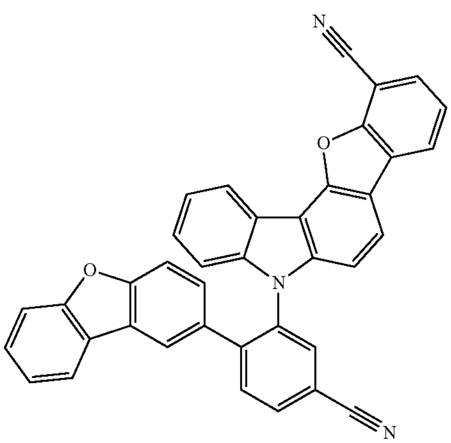
-continued
433
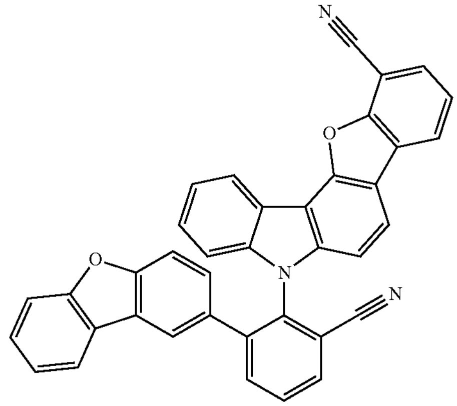
434
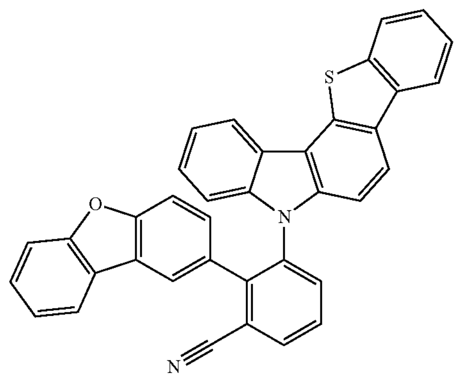
435
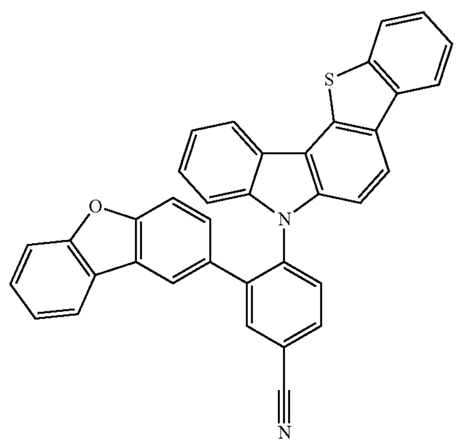
436
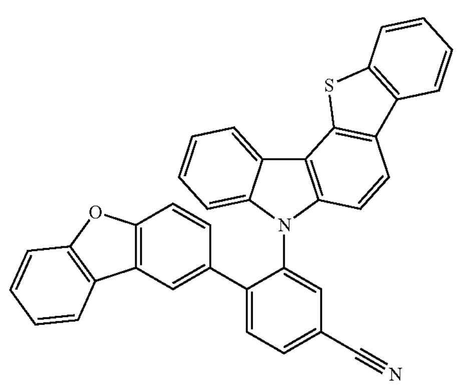

-continued
437
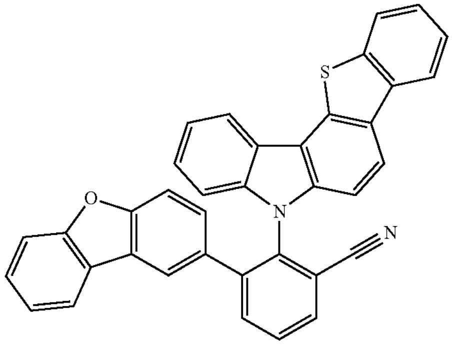
438
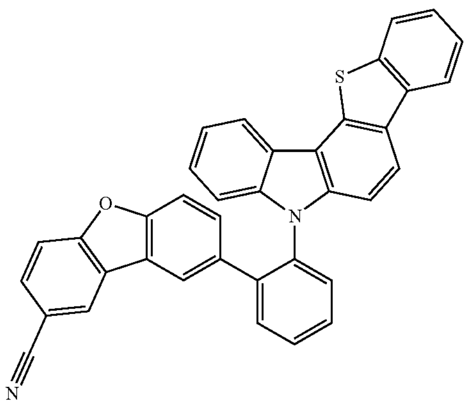
439
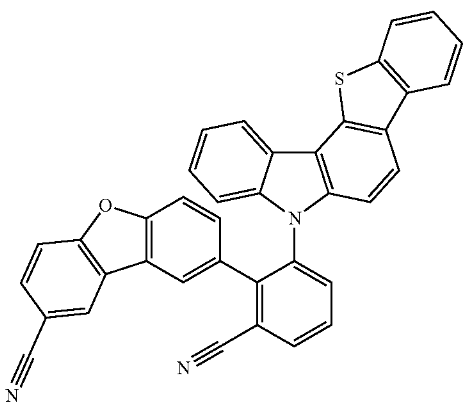
440
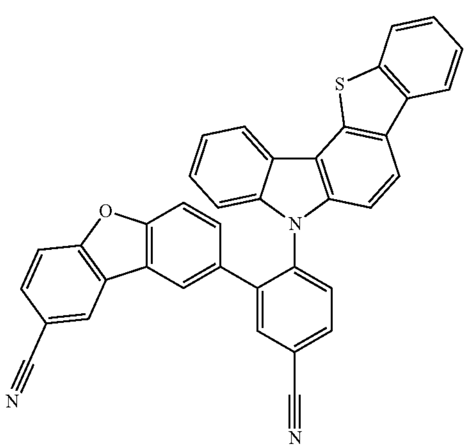
-continued
441
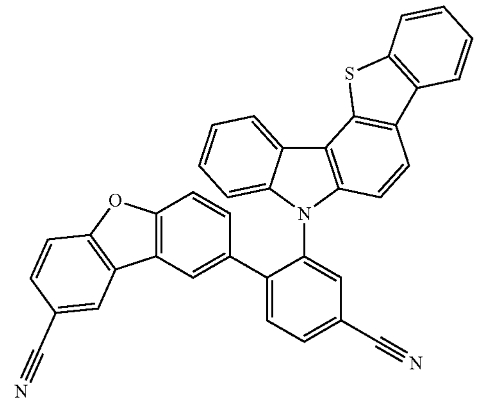
442
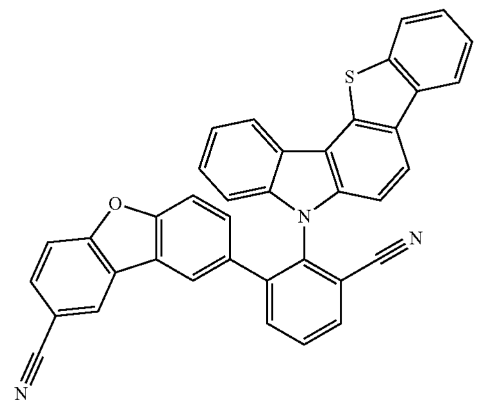
443
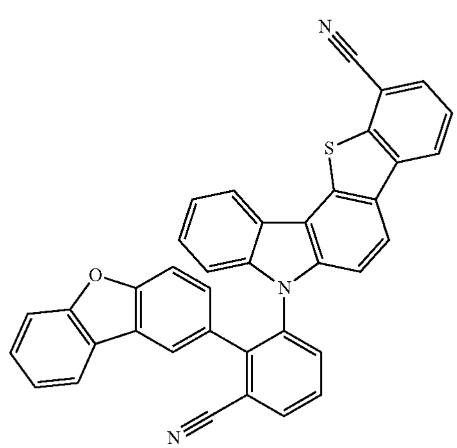

-continued
444
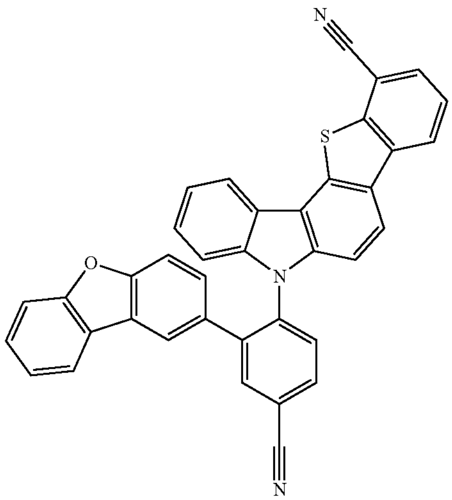
445
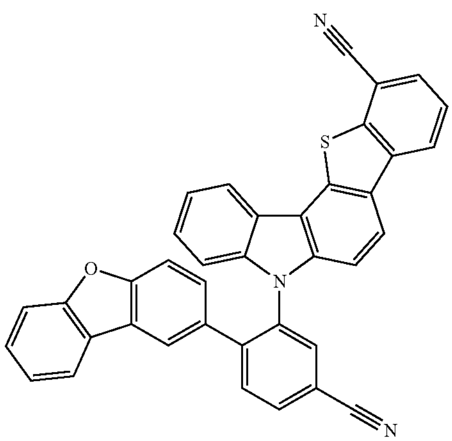
446
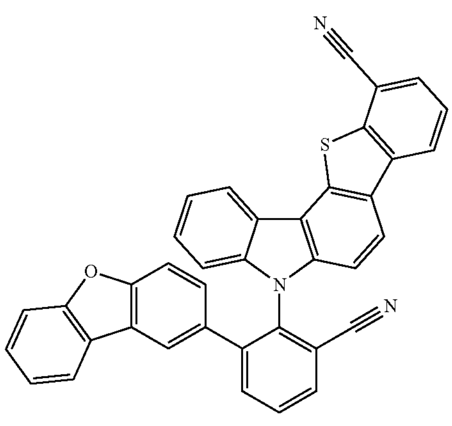
-continued
447
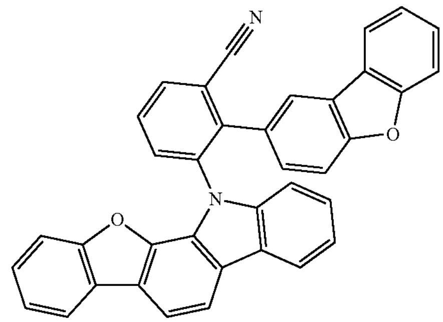
448
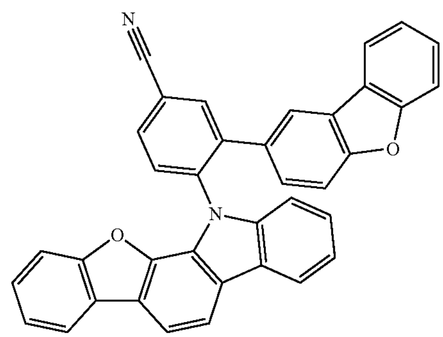
449
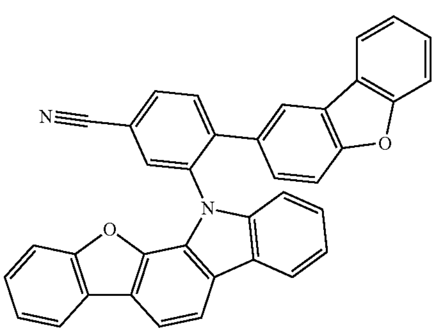
450
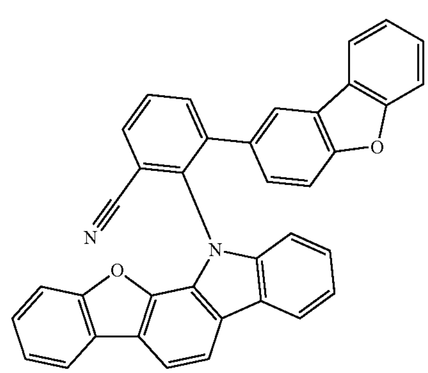

-continued
451
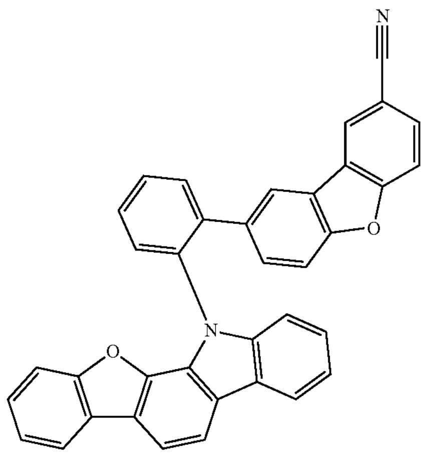
452
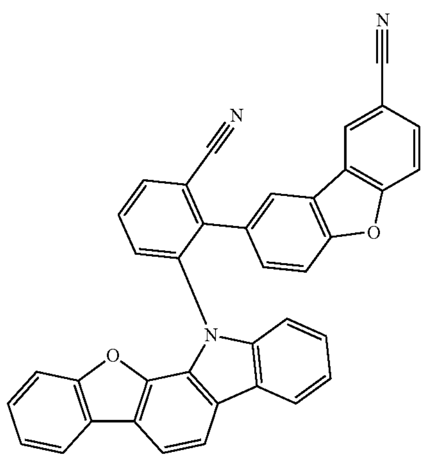
453
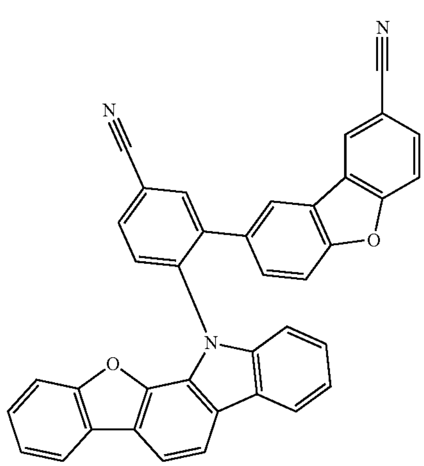
-continued
454
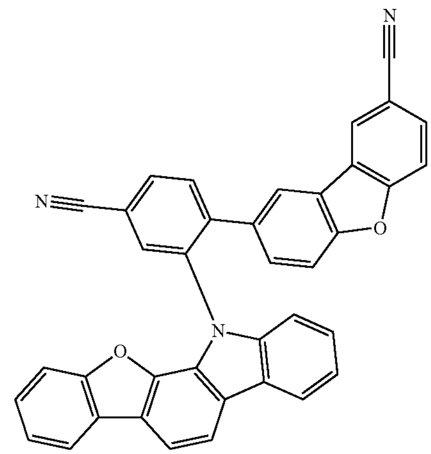
455
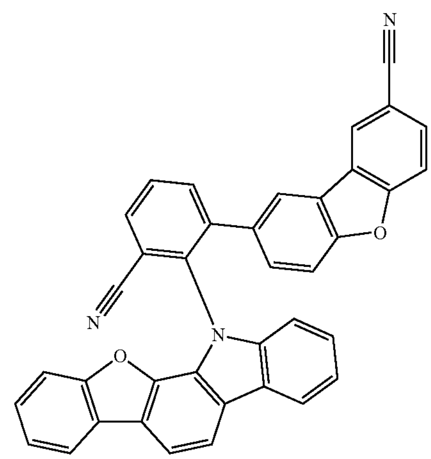
456
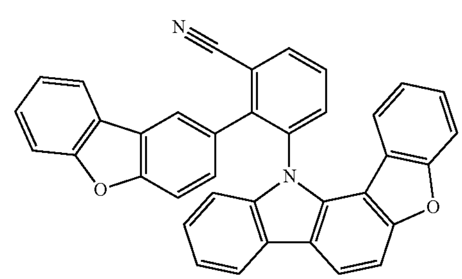
457
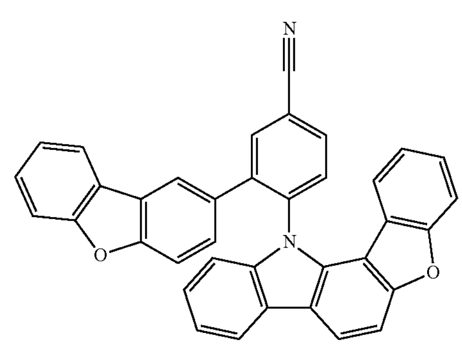

-continued
458
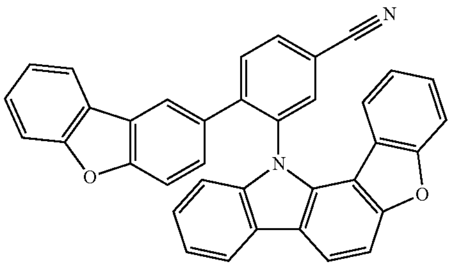
459
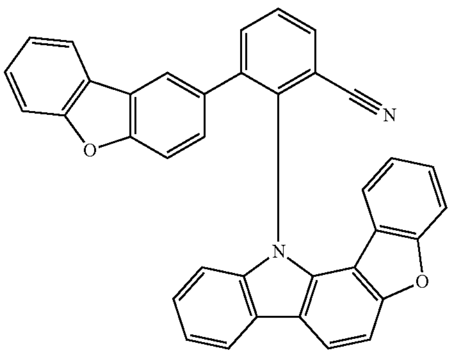
460
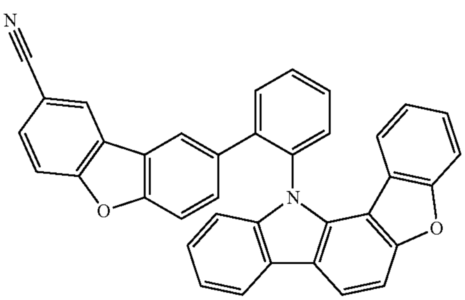
461
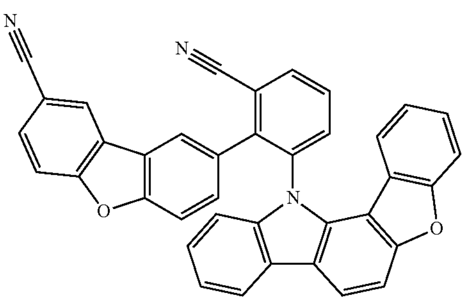
462
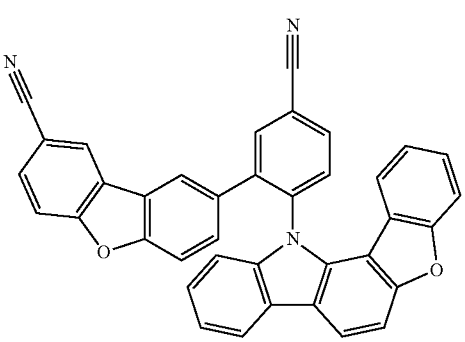
-continued
463
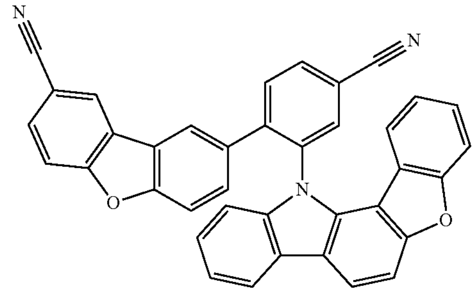
464
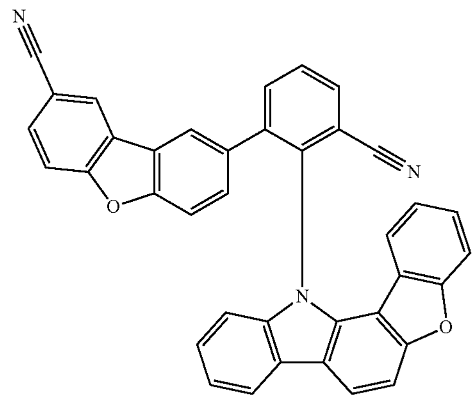
465
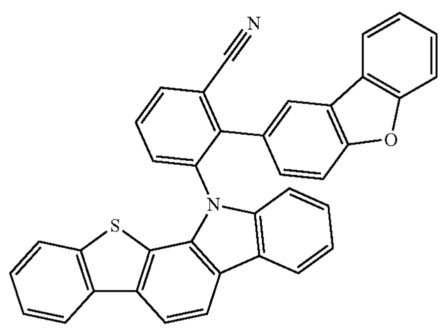
466
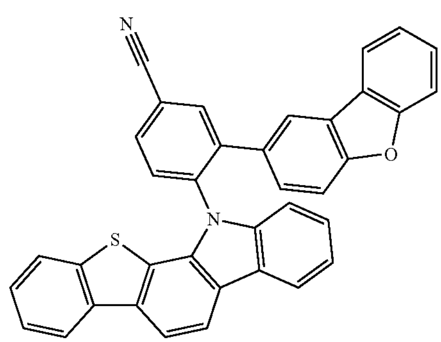

467
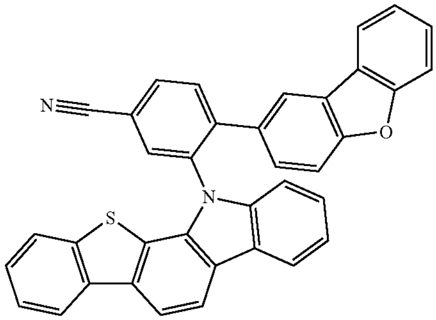
468
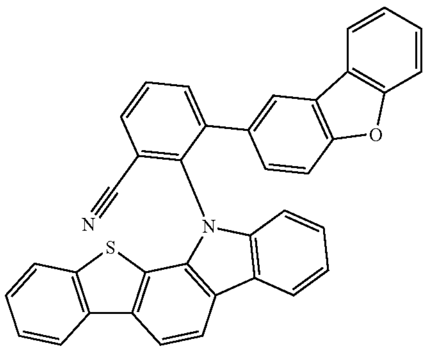
469
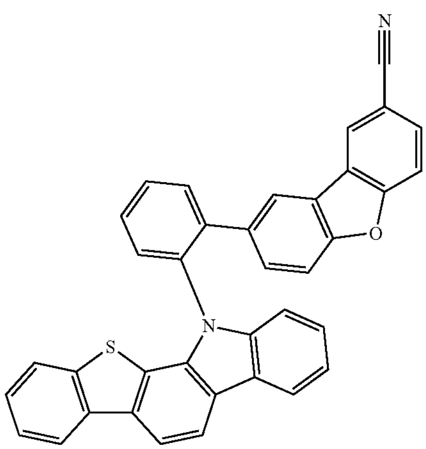
470
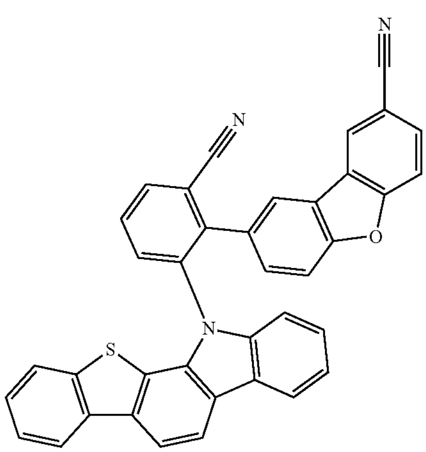
471
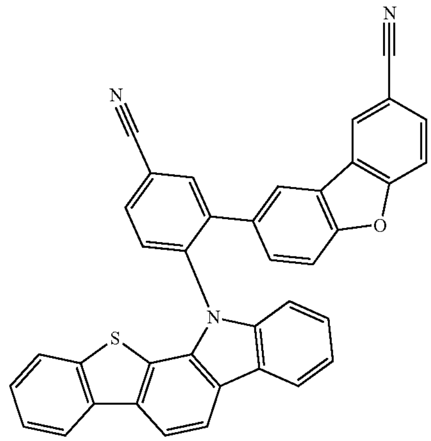
472
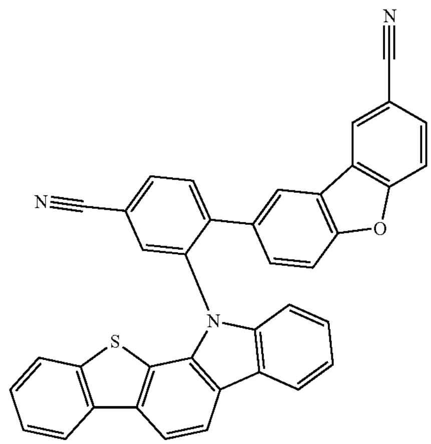
473
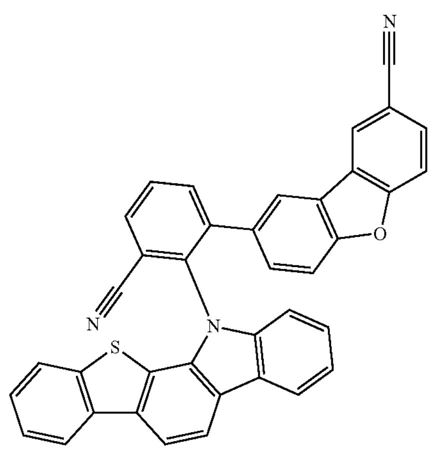
474
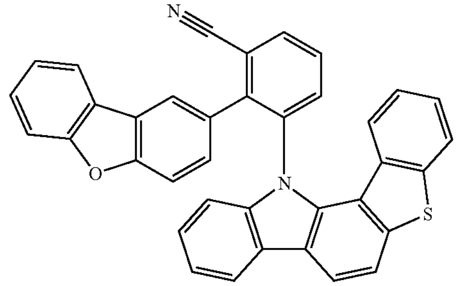

-continued
475
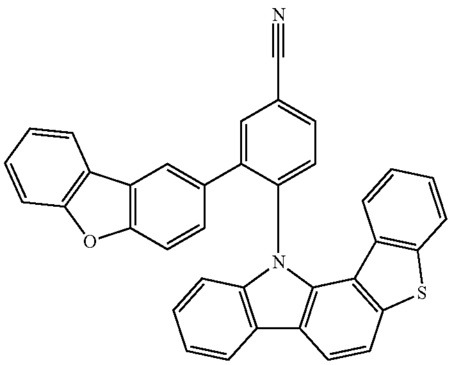
476
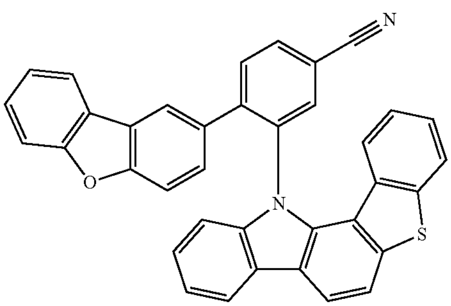
477
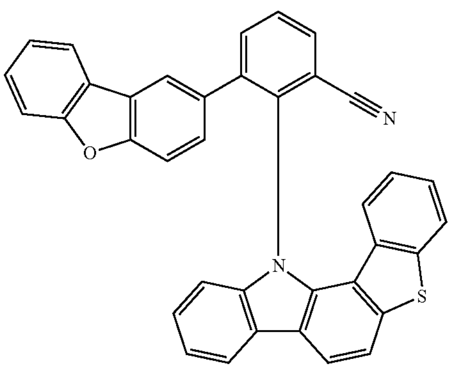
478
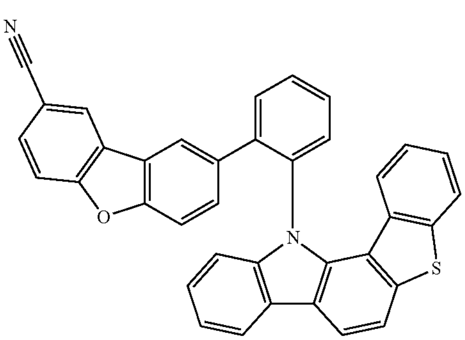
-continued
479
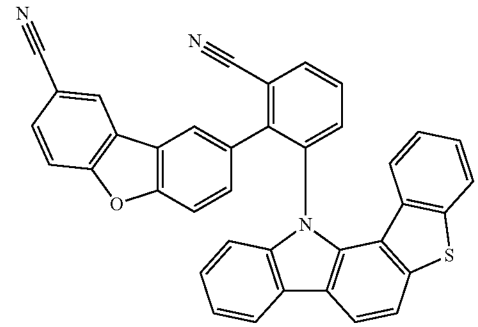
480
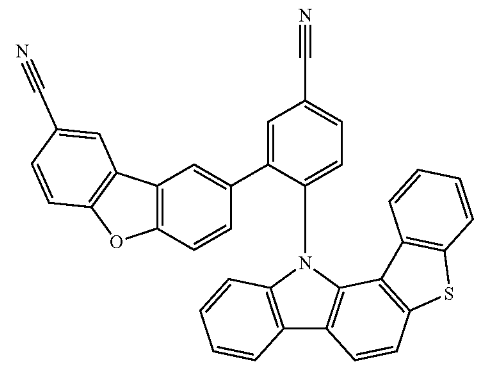
481
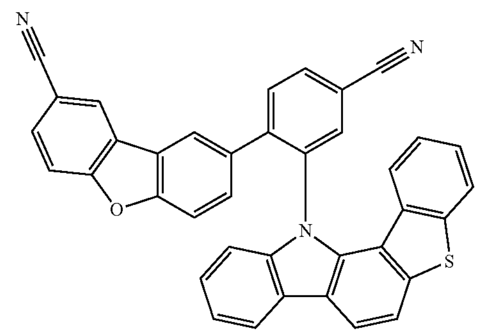
482
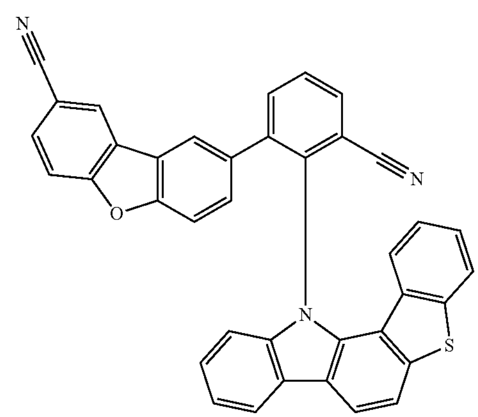

-continued
<Group HE4>
1
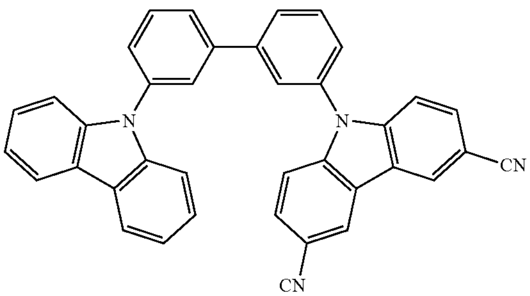
2
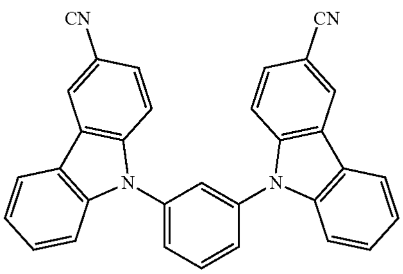
3
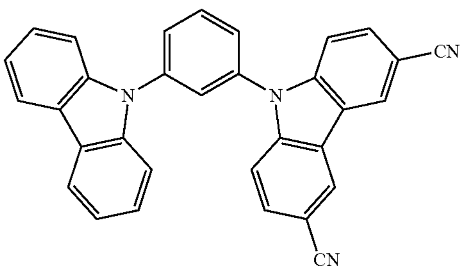
4
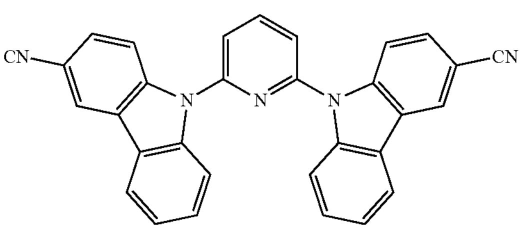
5
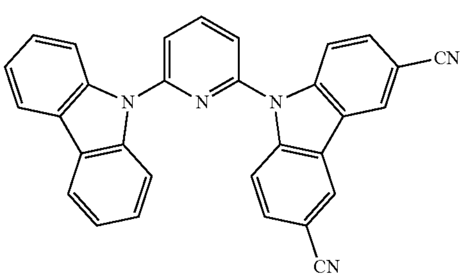
-continued
6
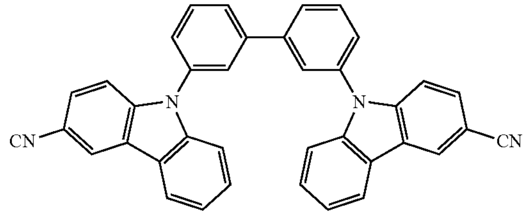
7
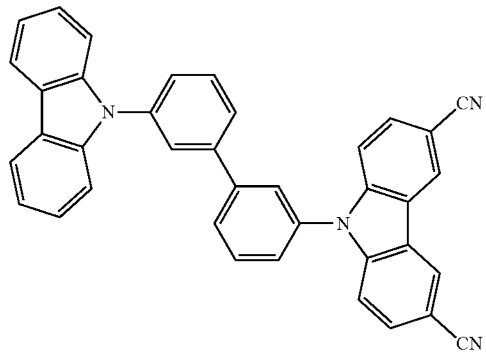
8
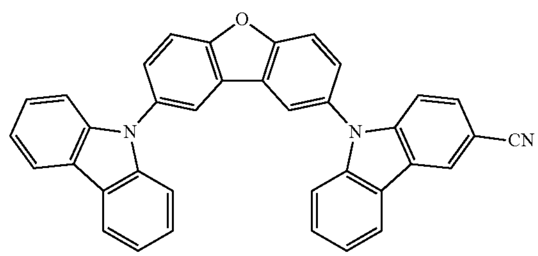
9
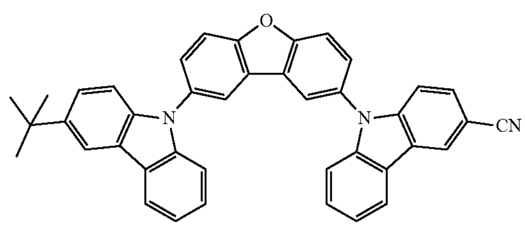
10
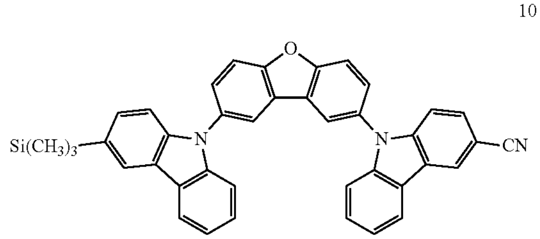
11
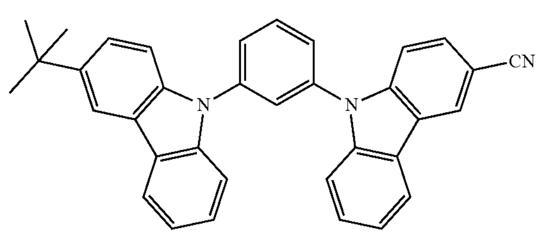

-continued
12
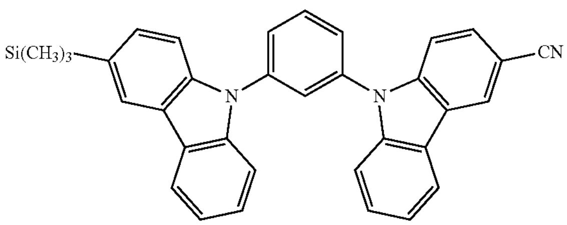
13
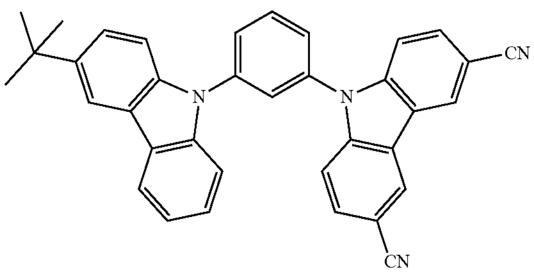
14
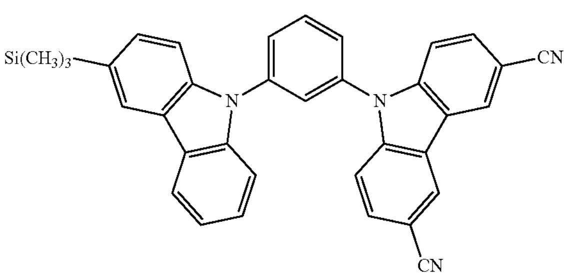
15
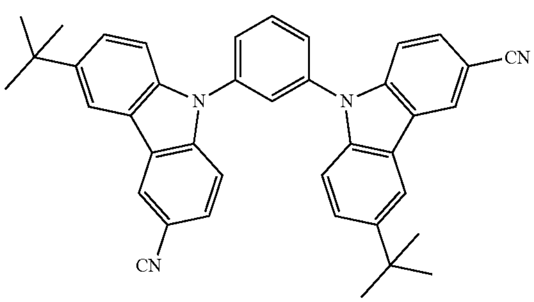
16
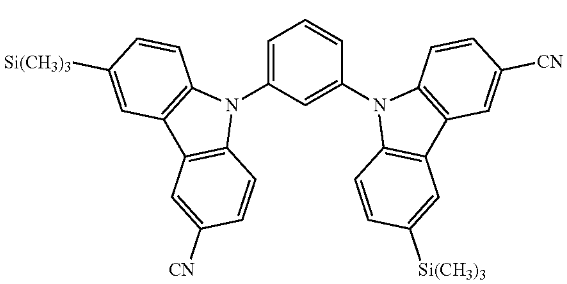
-continued
17
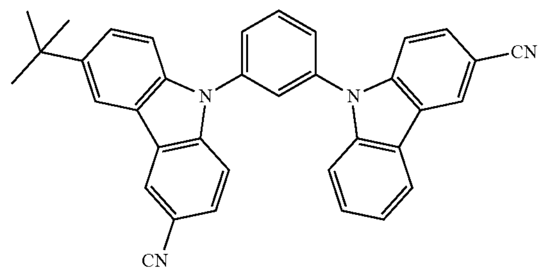
18
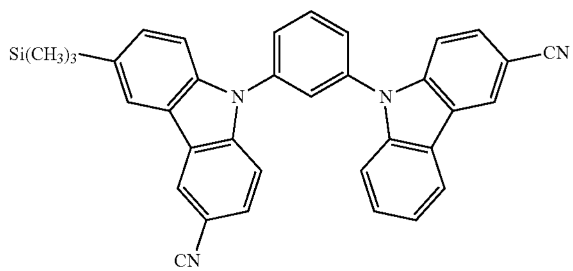
19
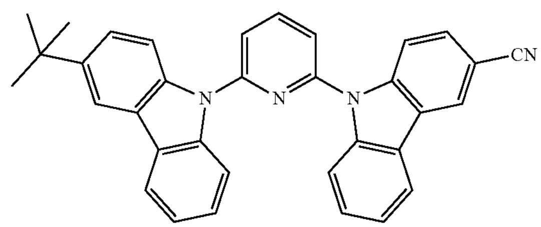
20
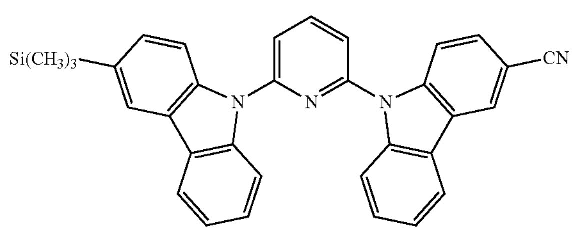
21
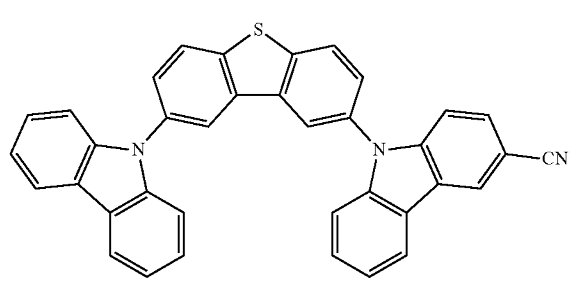
22
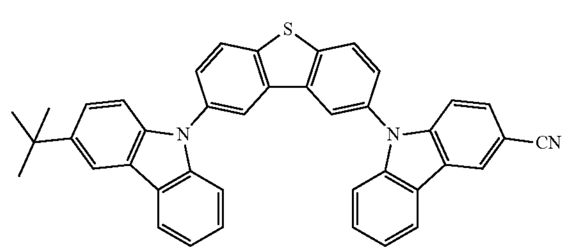

-continued
23
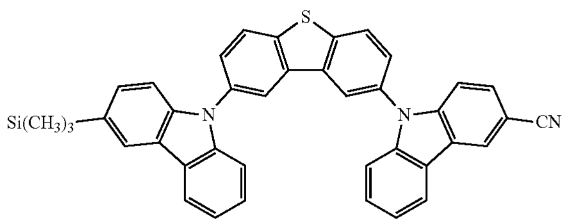
24
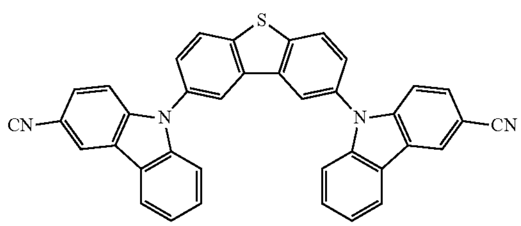
25
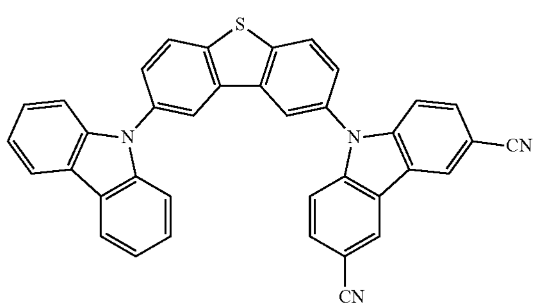
26
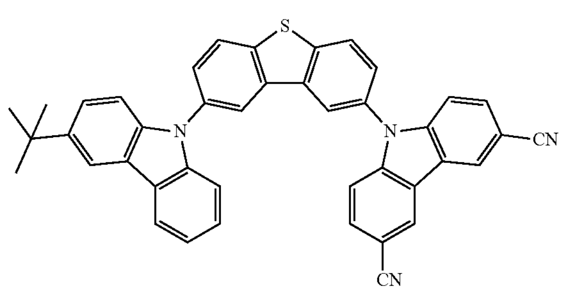
27
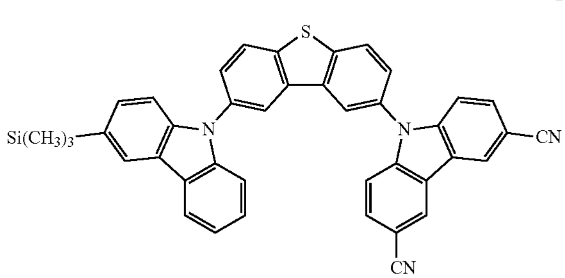
-continued
28
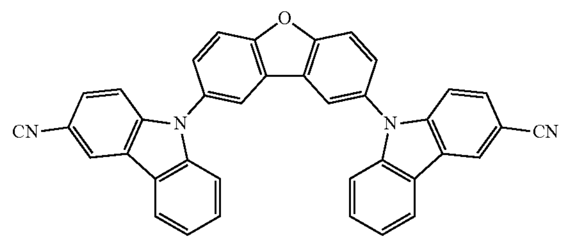
29
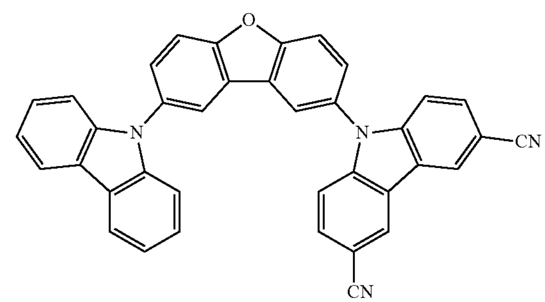
30
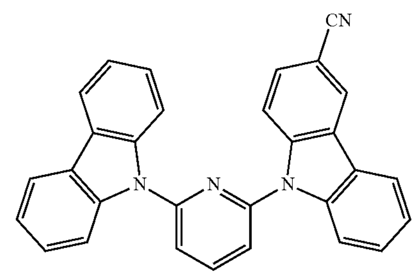
31
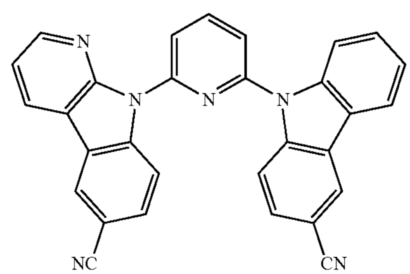
32
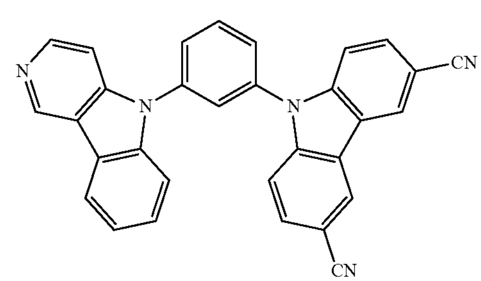

-continued
33
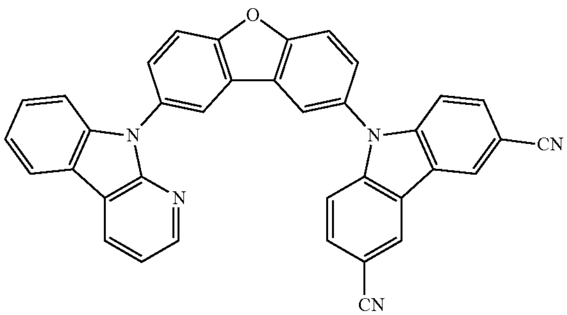
34
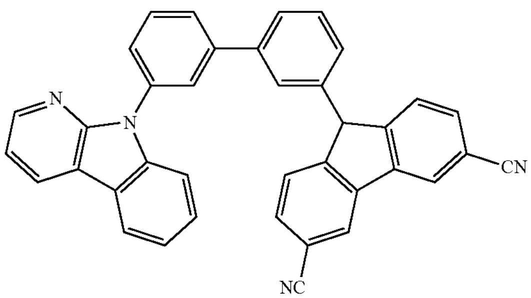
35
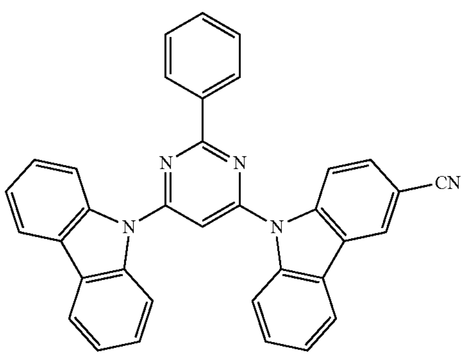
36
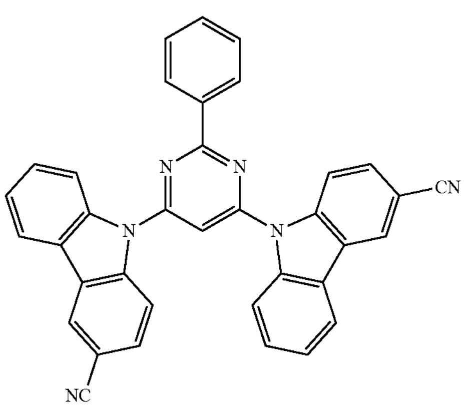
-continued
37
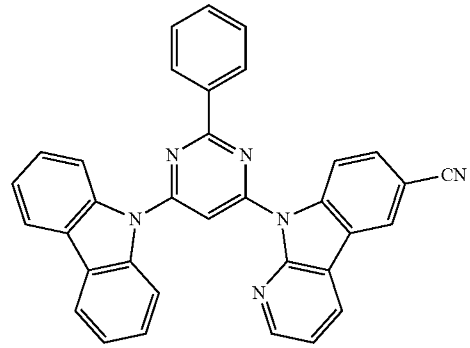
38
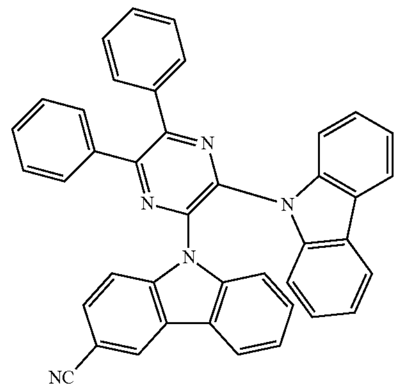
39
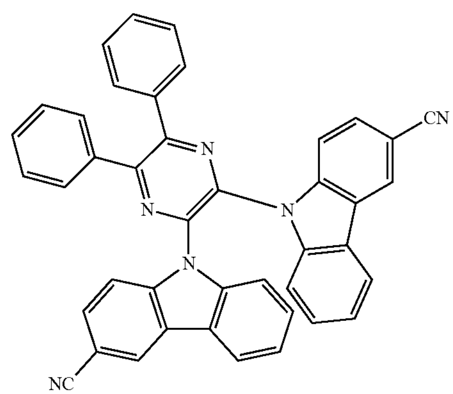
40
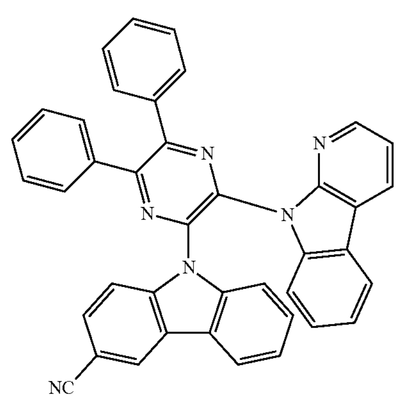

-continued
41
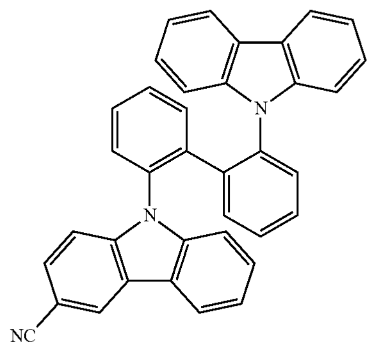
42
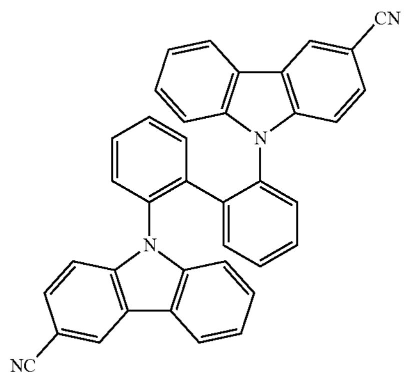
43
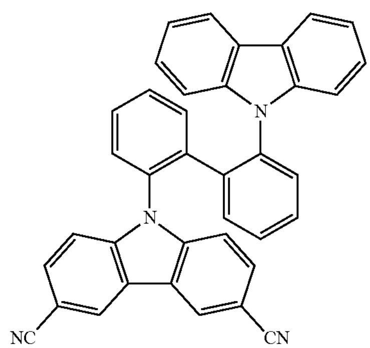
44
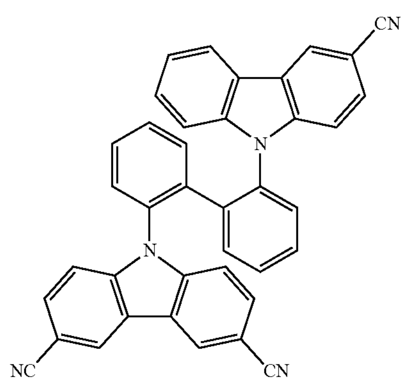
-continued
45
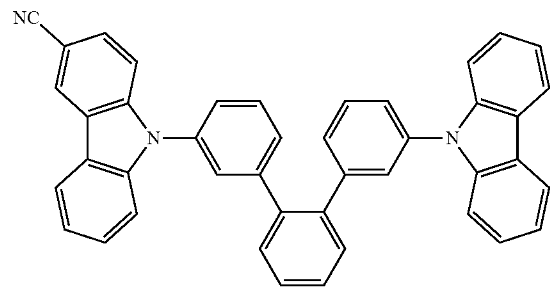
46
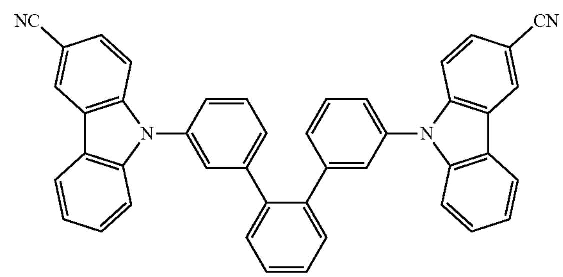
47
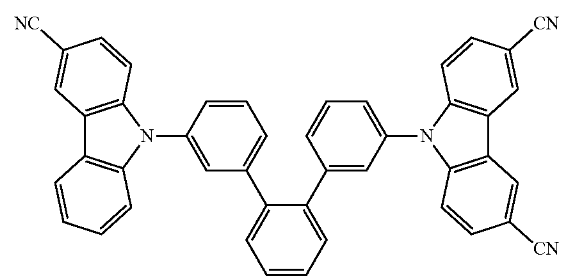
48
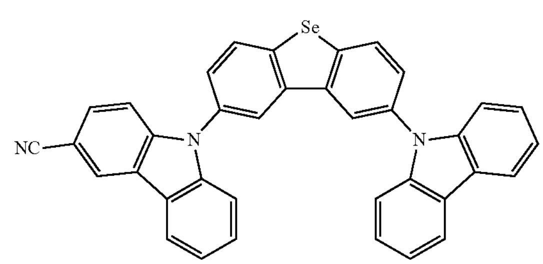
49
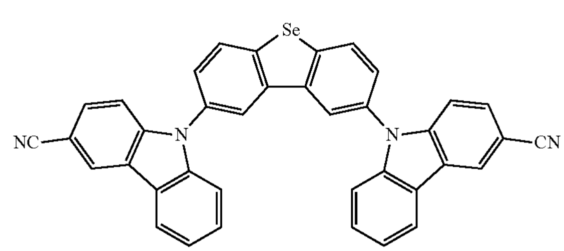

-continued
50
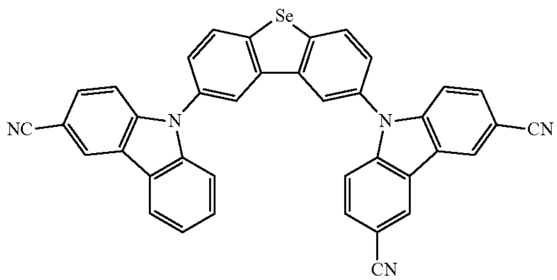
51
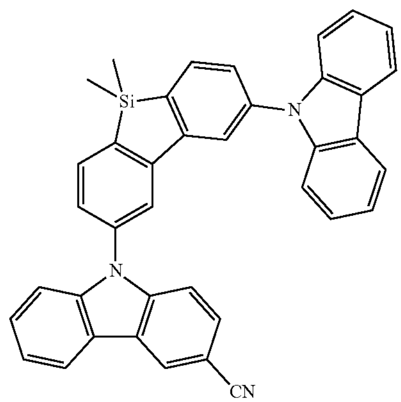
52
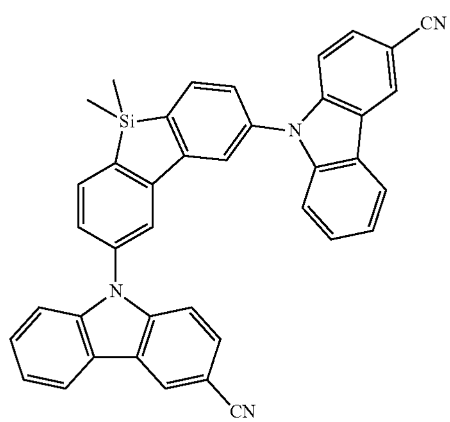
53
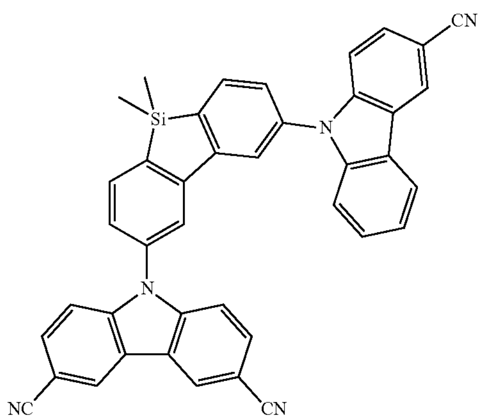
-continued
54
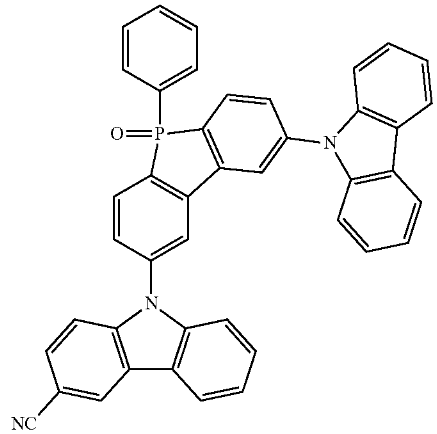
55
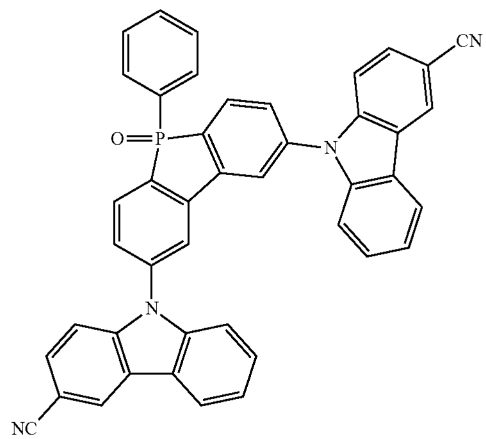
56
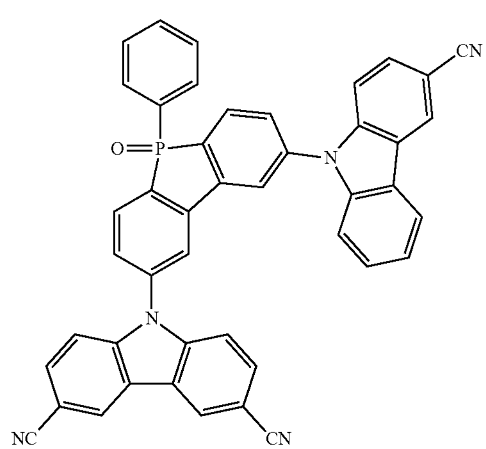

-continued
<Group HE5>
1
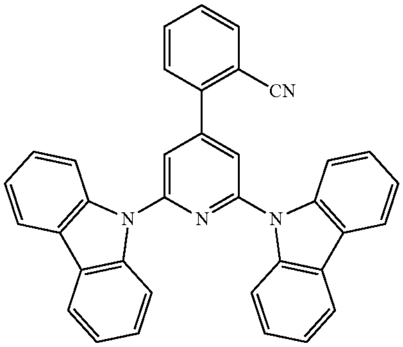
2
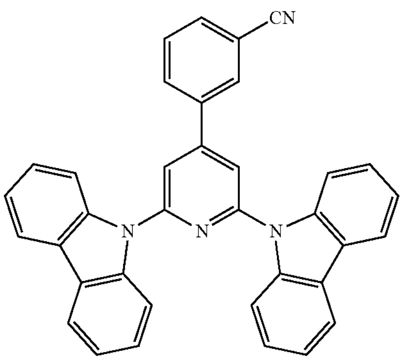
3
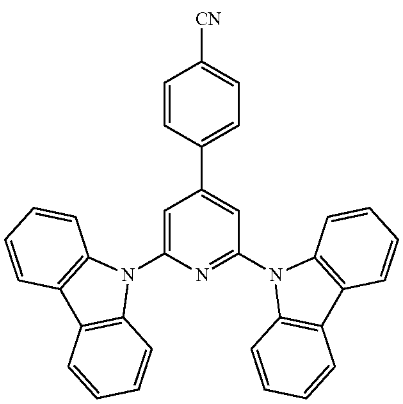
4
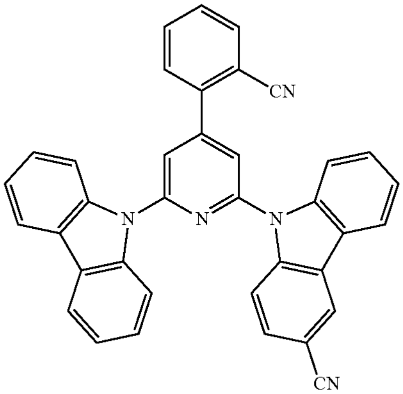
-continued
5
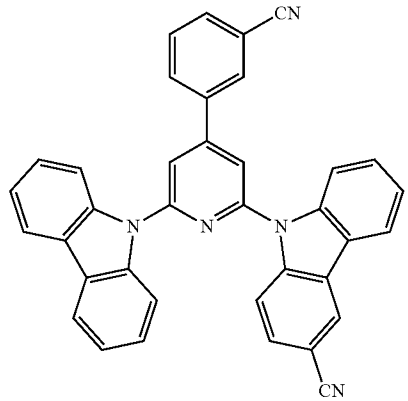
6
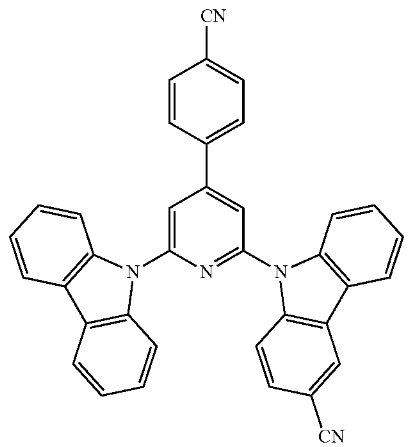
7
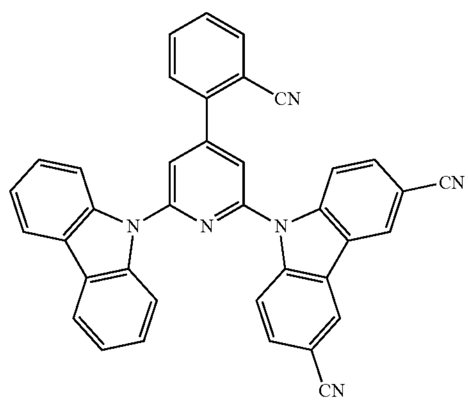
8
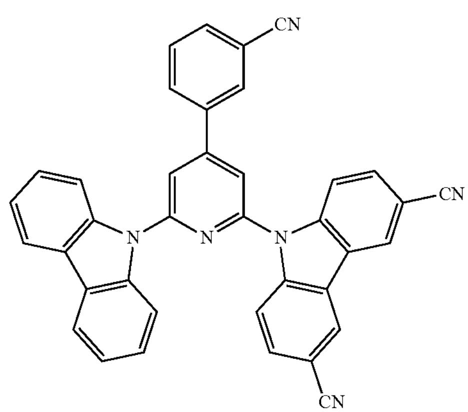

9
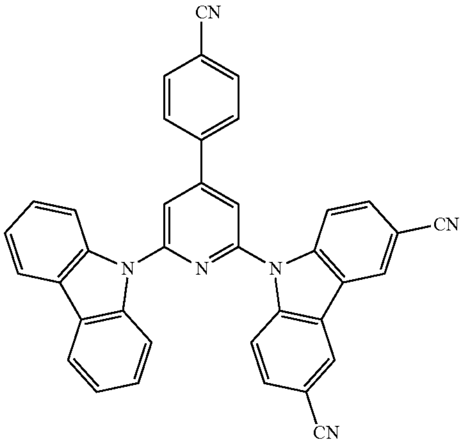
10
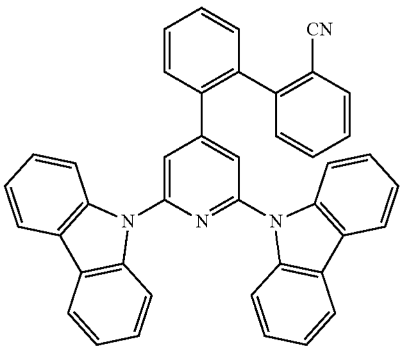
11
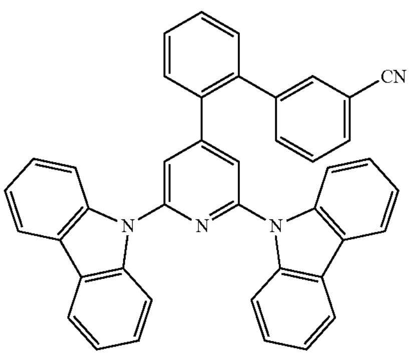
12
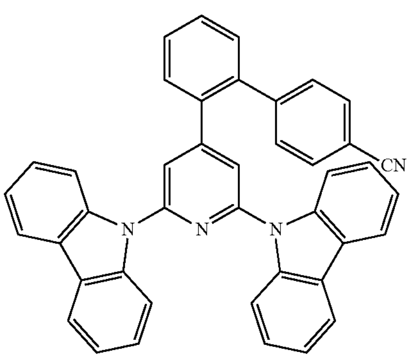
13
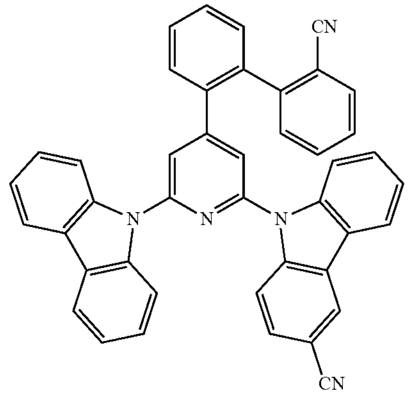
14
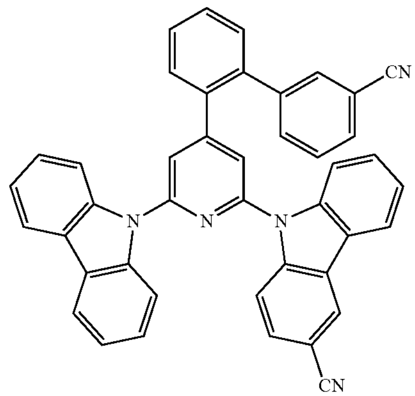
15
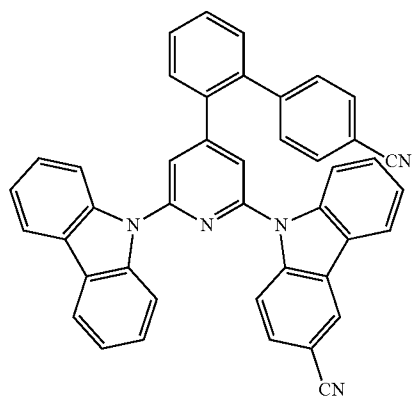
16
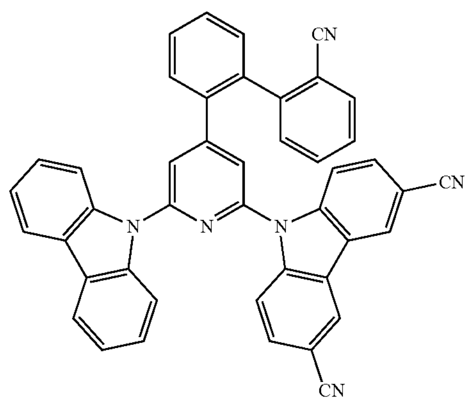

17
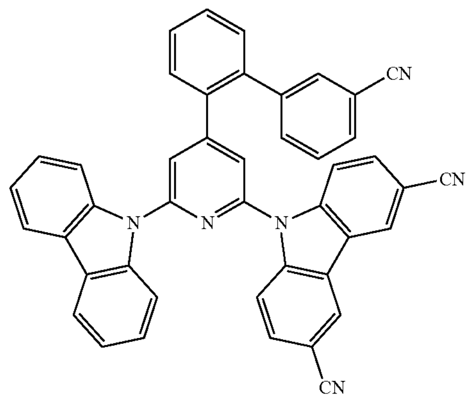
18
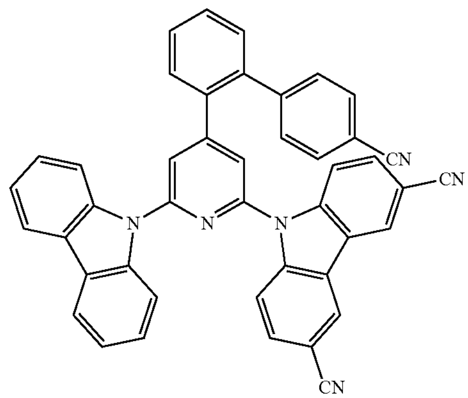
19
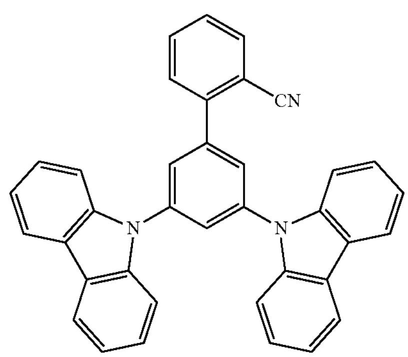
20
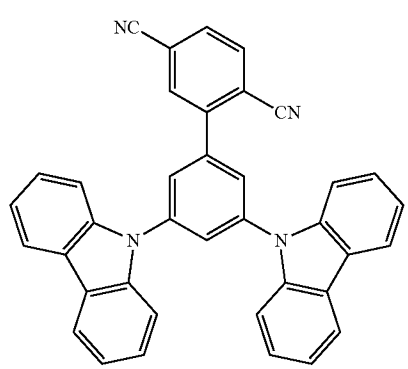
21
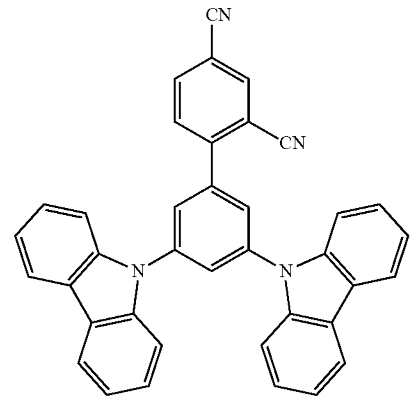
22
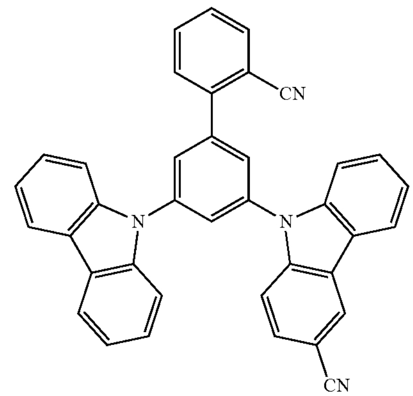
23
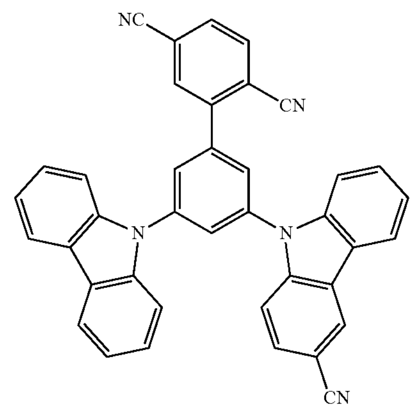
24
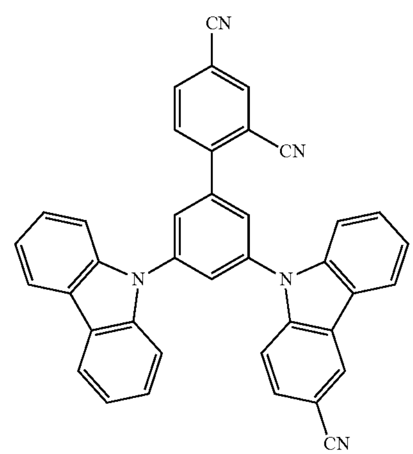

-continued
25
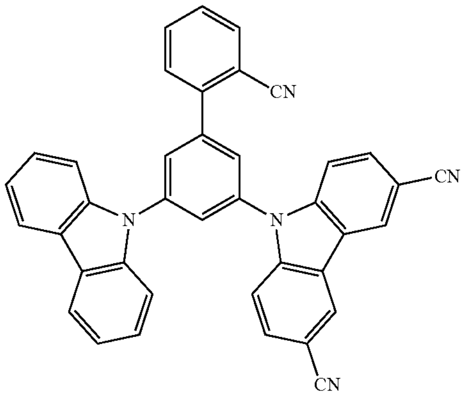
26
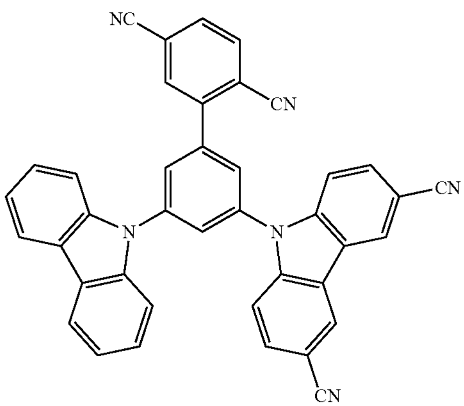
27
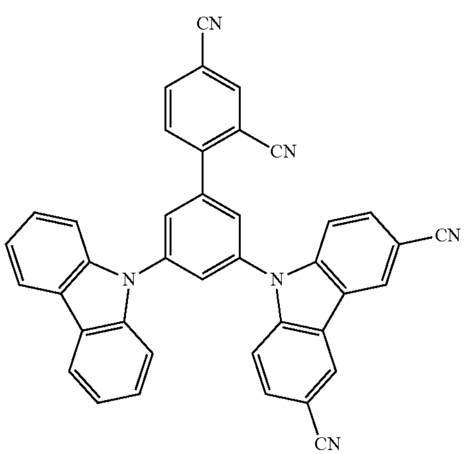
28
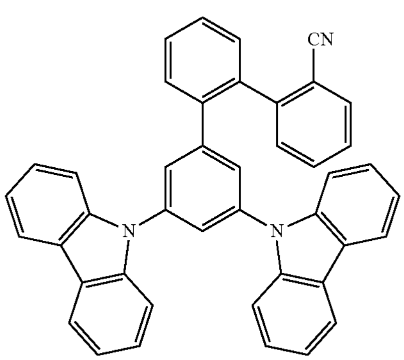
-continued
29
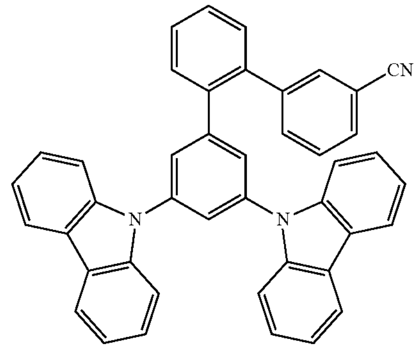
30
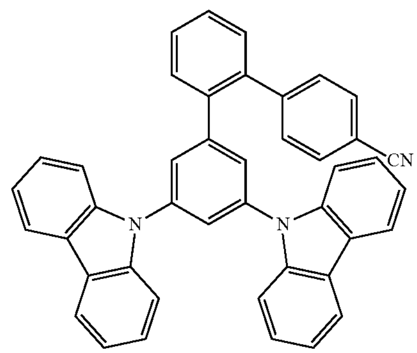
31
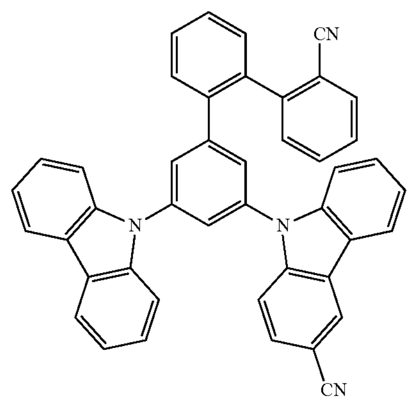
32
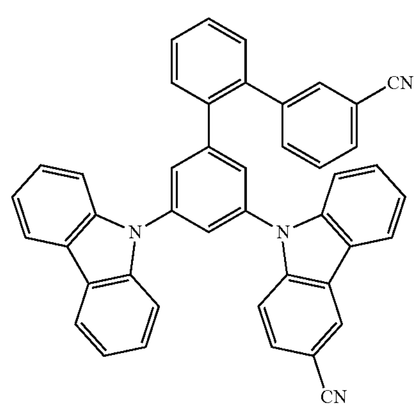

-continued
33
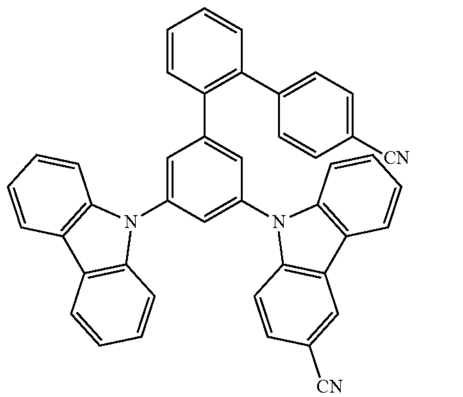
34
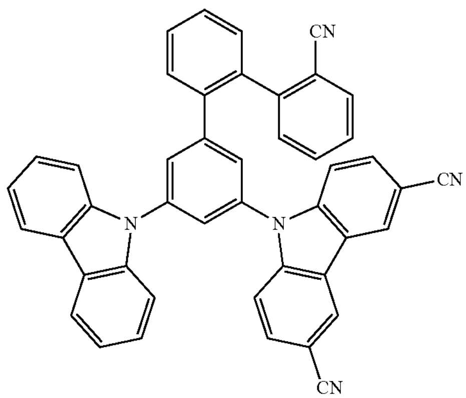
35
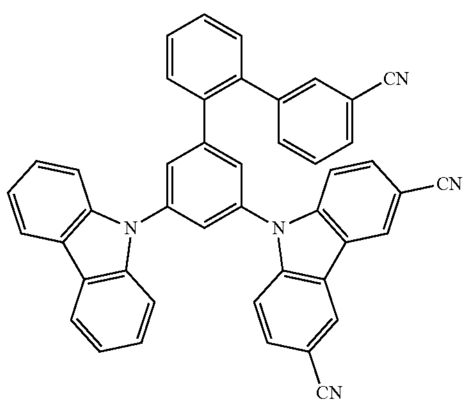
36
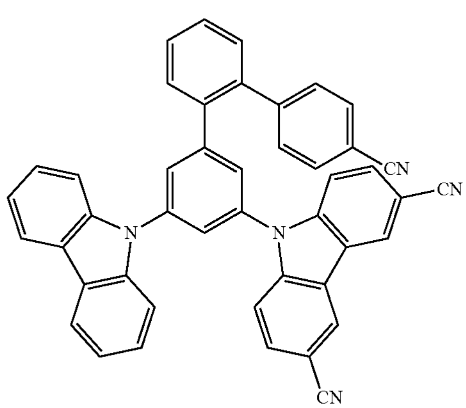
-continued
37
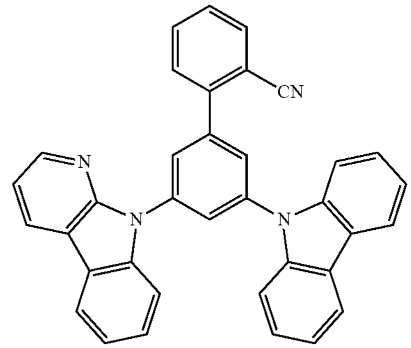
38
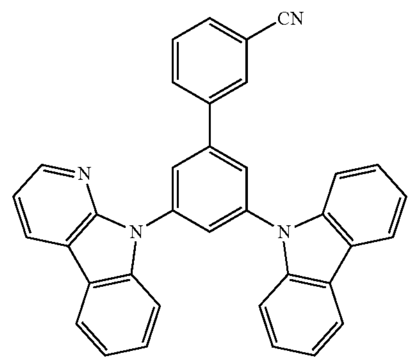
39
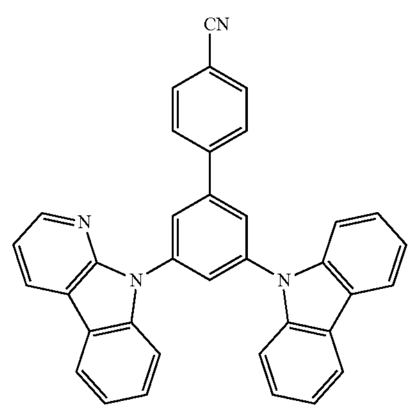
40
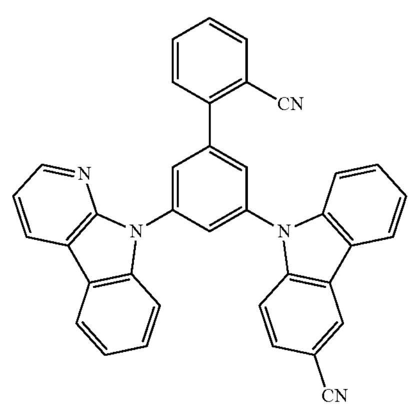

-continued
41
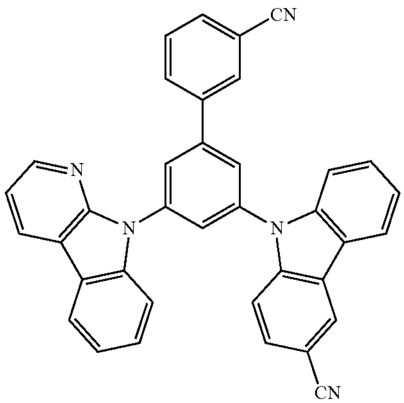
42
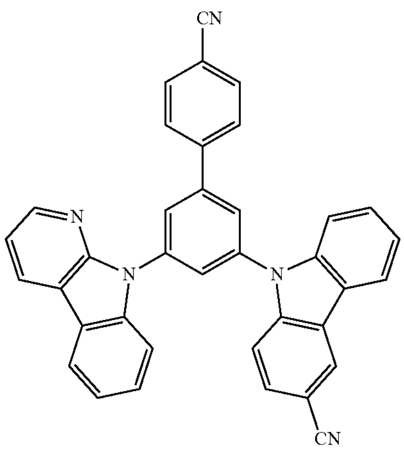
43
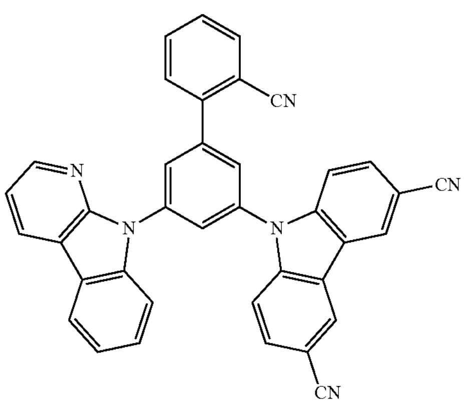
44
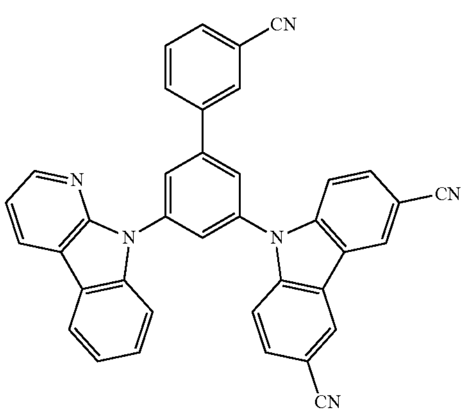
-continued
45
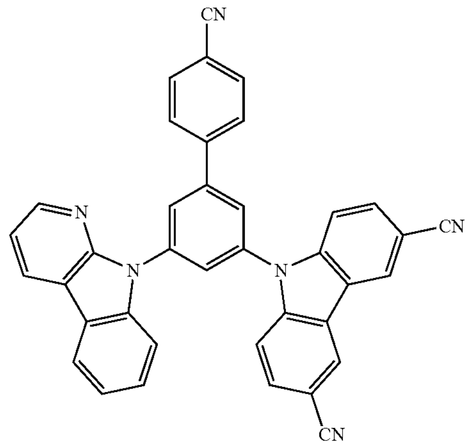
46
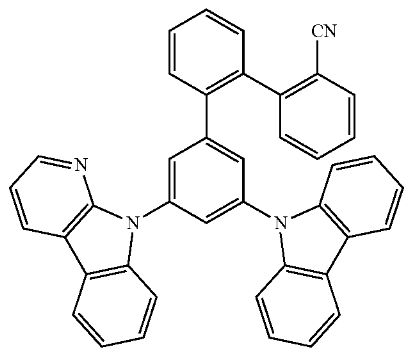
47
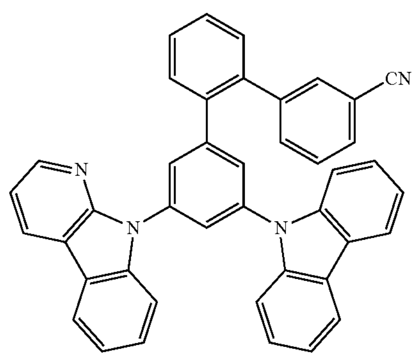
48
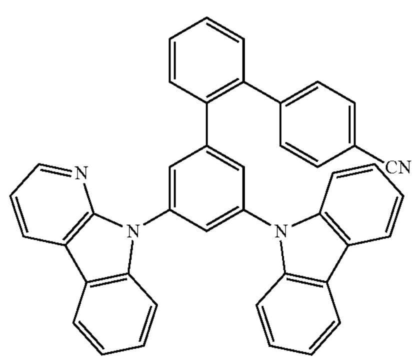

49
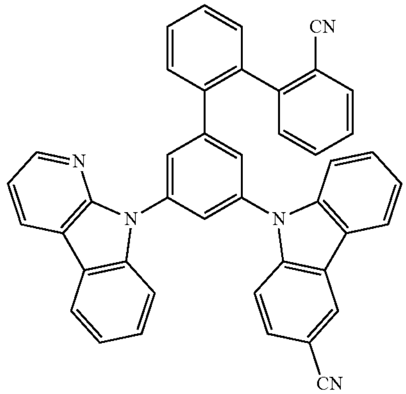
50
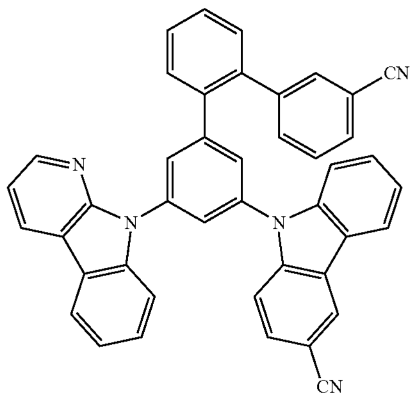
51
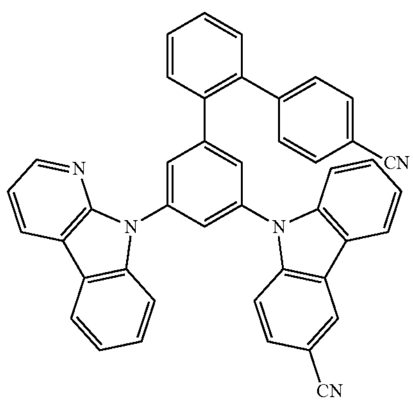
52
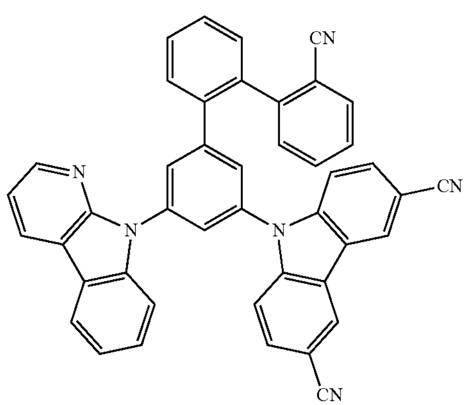
53
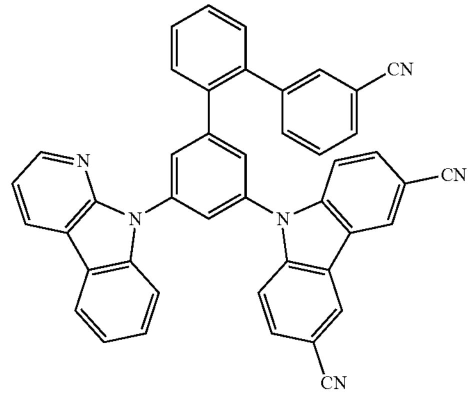
54
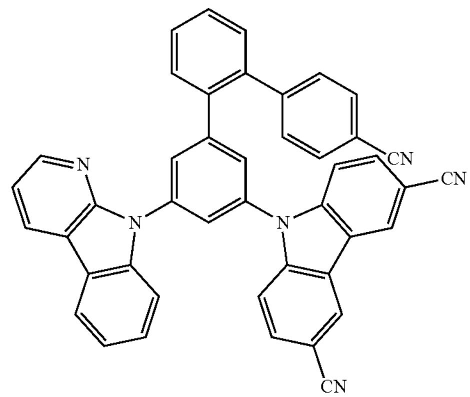
55
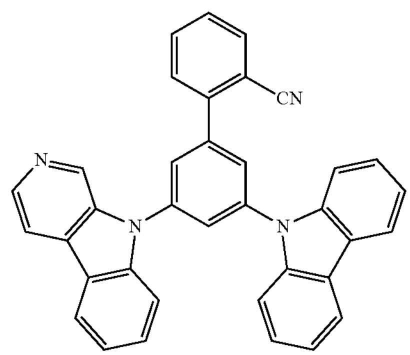
56
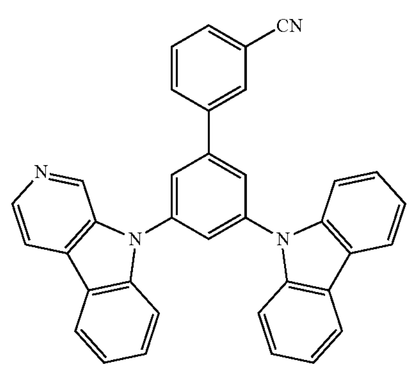

-continued
57
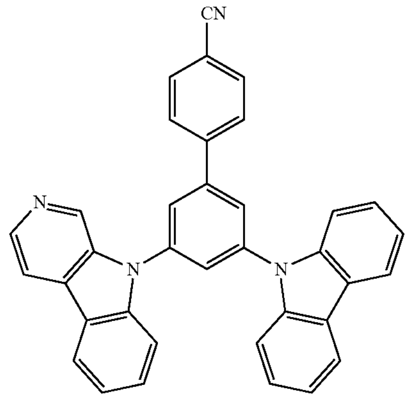
58
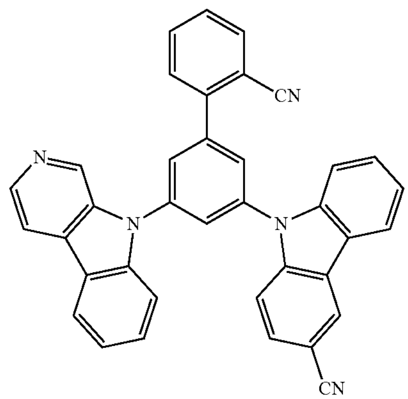
59
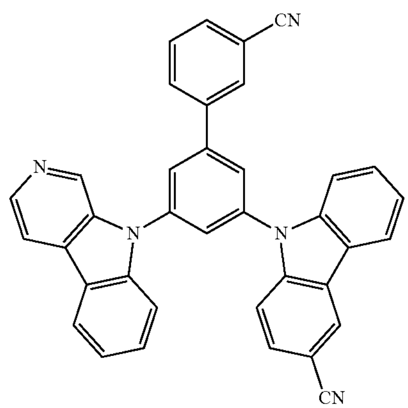
60
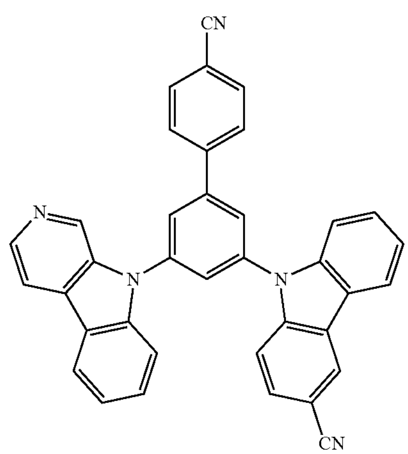
-continued
61
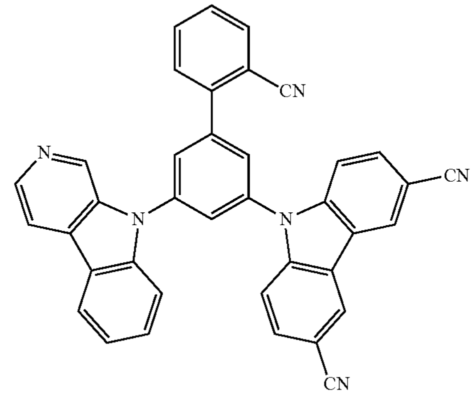
62
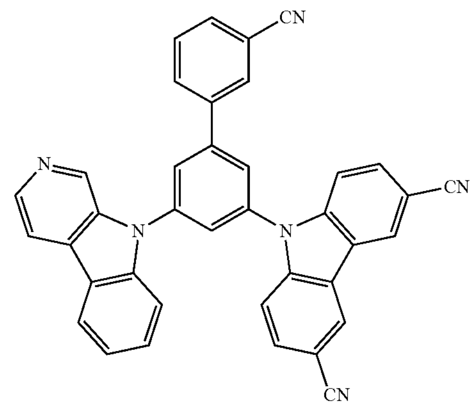
63
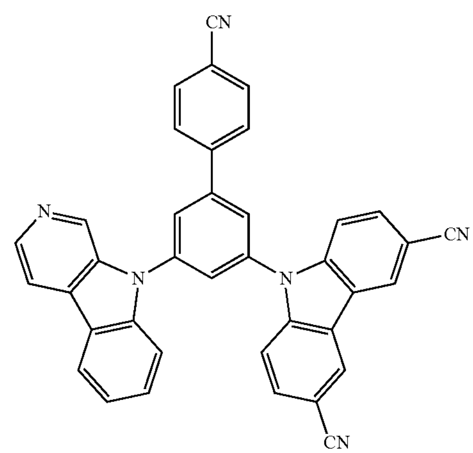
64
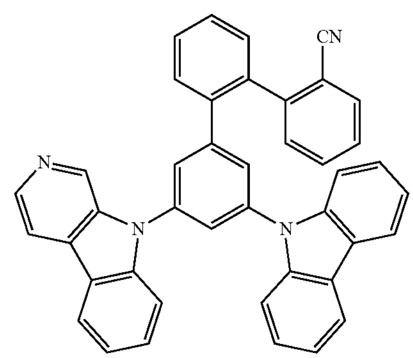

-continued
65
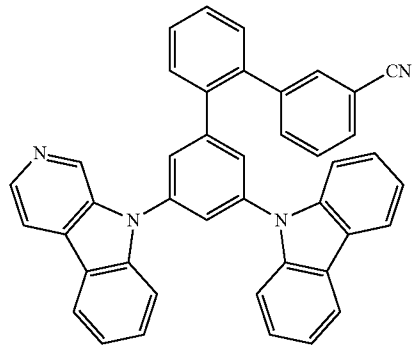
66
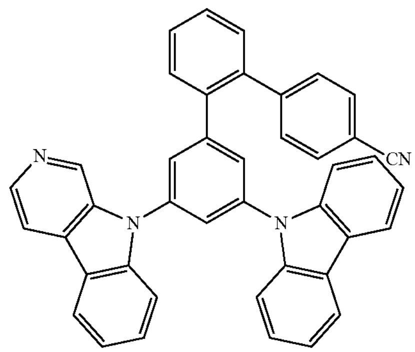
67
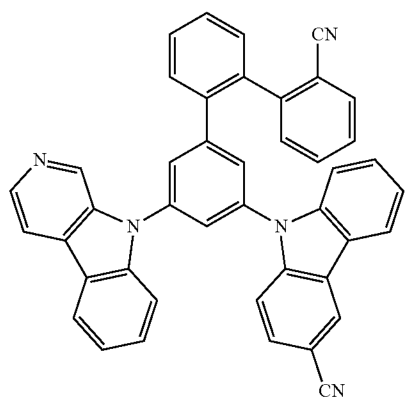
68
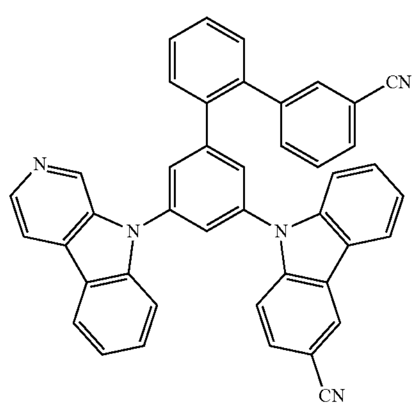
-continued
69
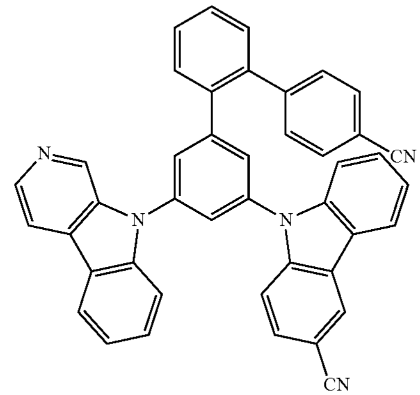
70
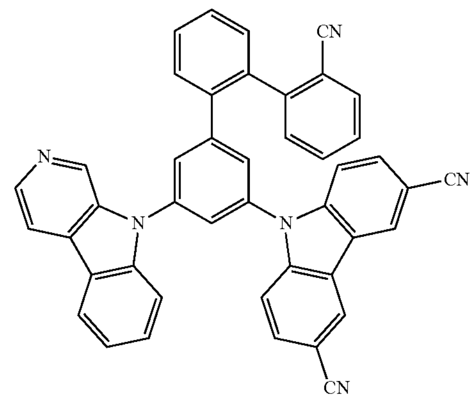
71
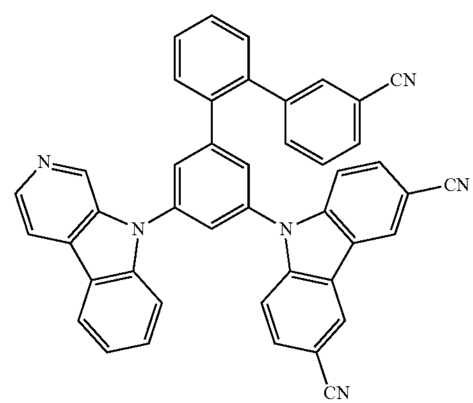
72
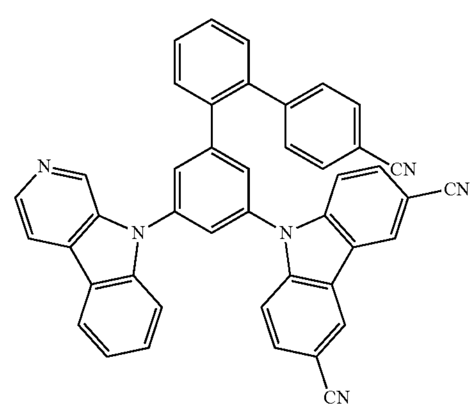

-continued
73
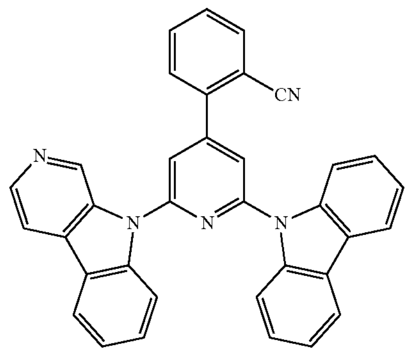
74
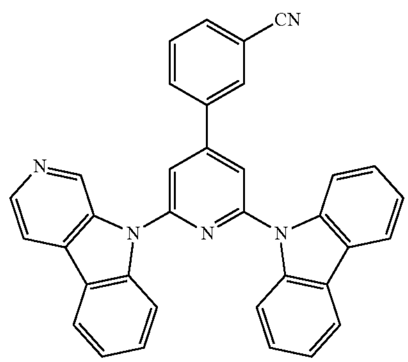
75
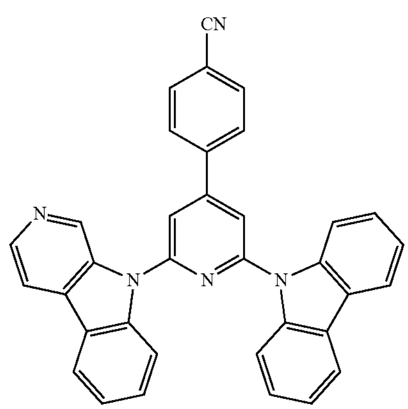
76
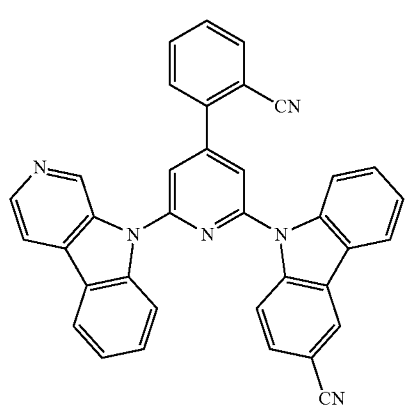
-continued
77
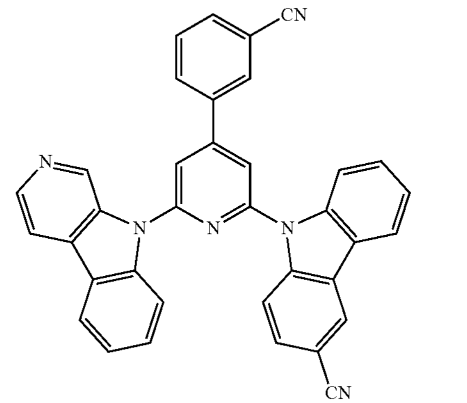
78
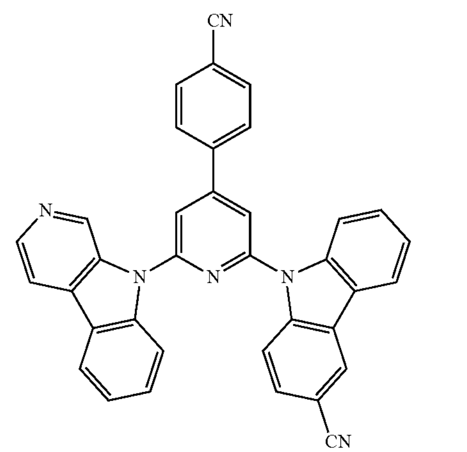
79
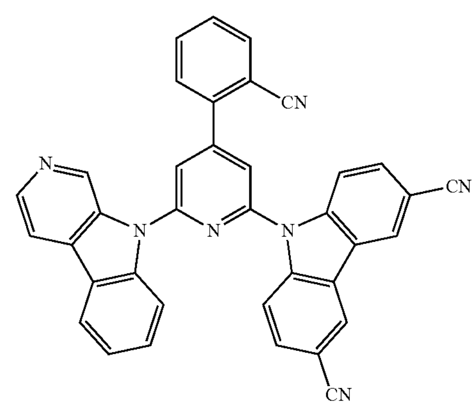
80
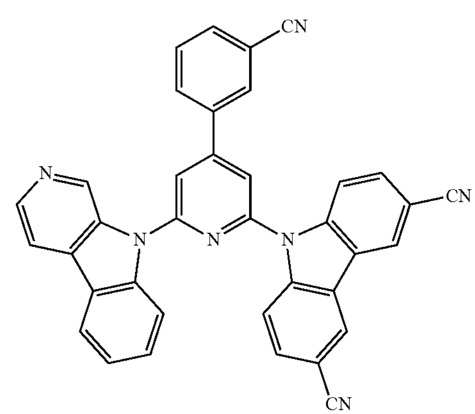

-continued
81
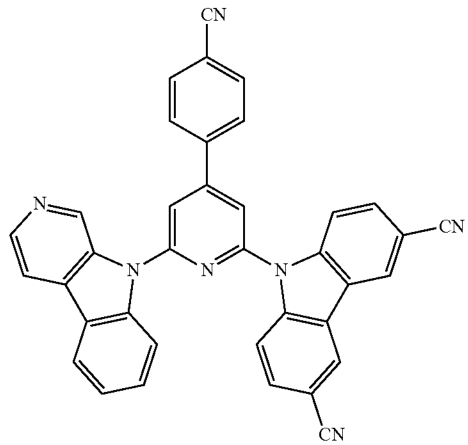
82
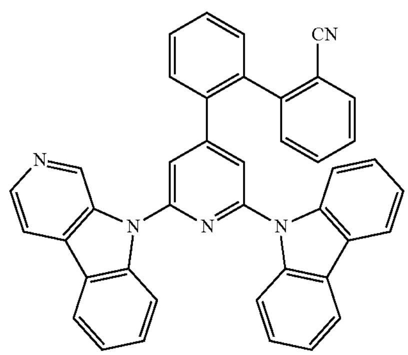
83
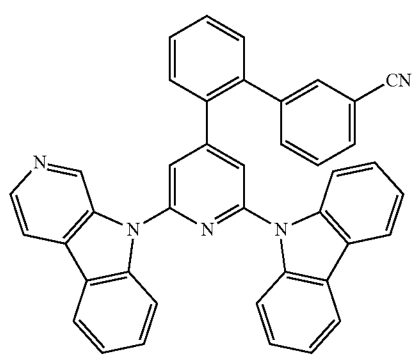
84
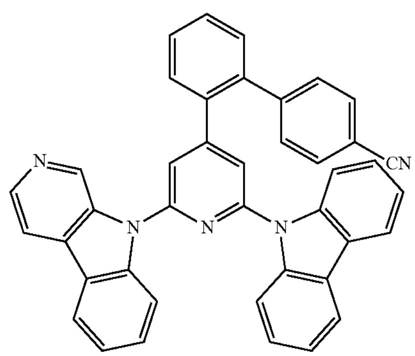
-continued
85
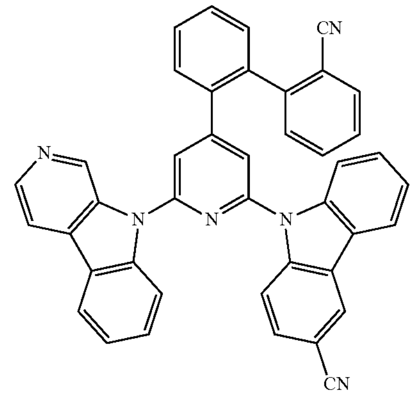
86
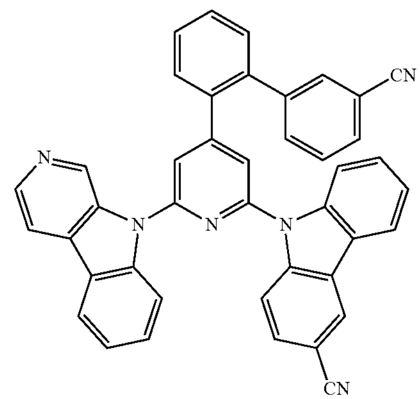
87
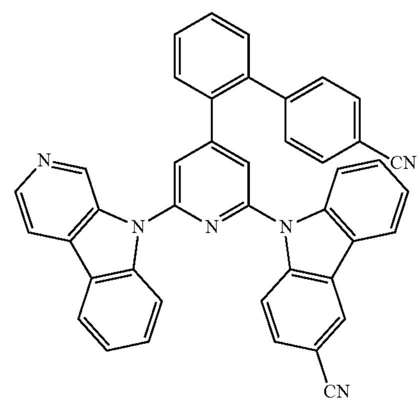
88
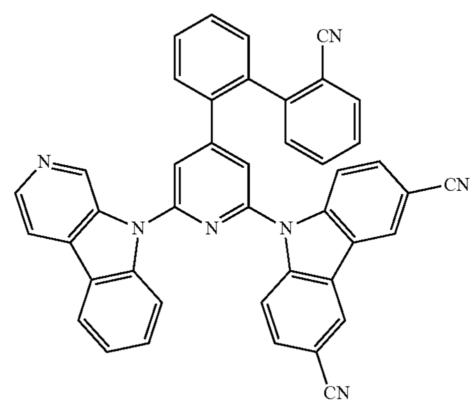

-continued
89
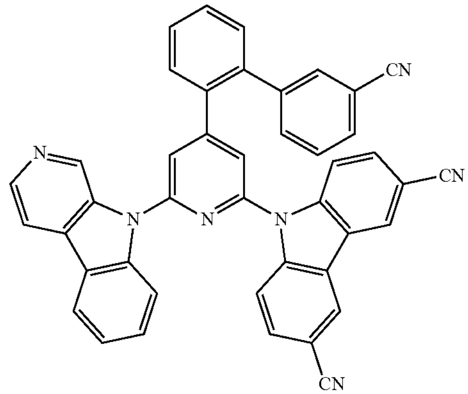
90
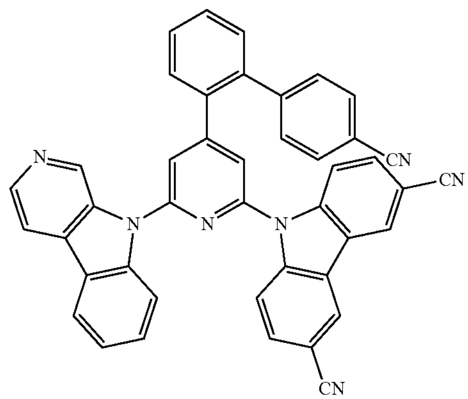
91
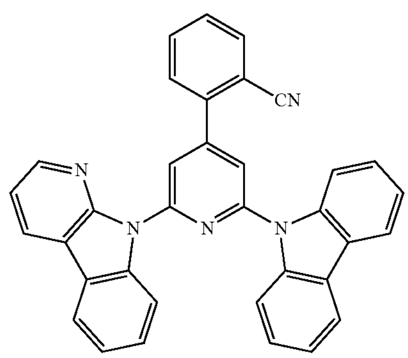
92
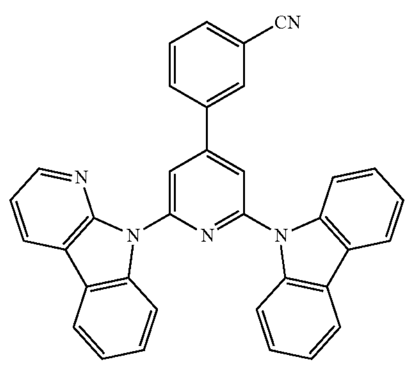
-continued
93
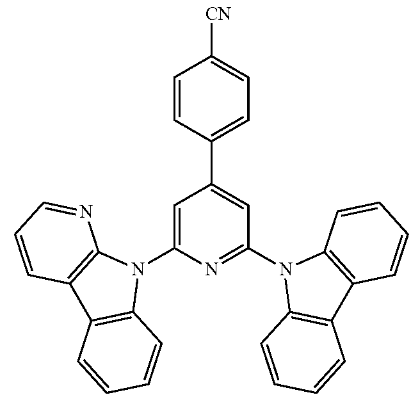
94
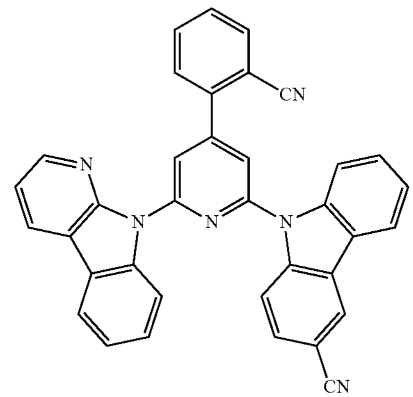
95
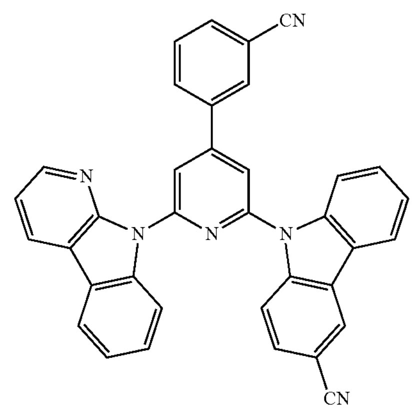
96
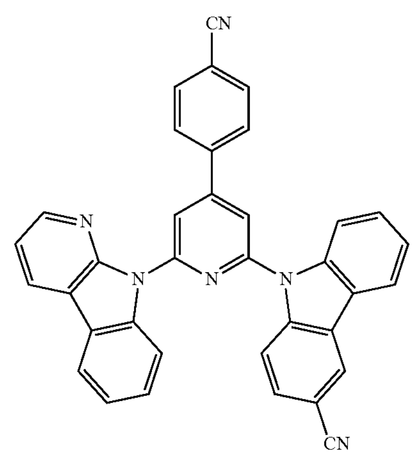

97
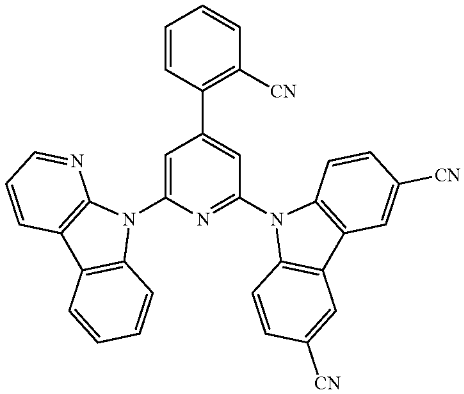
98
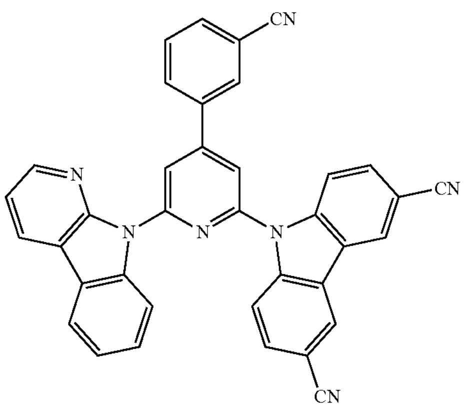
99
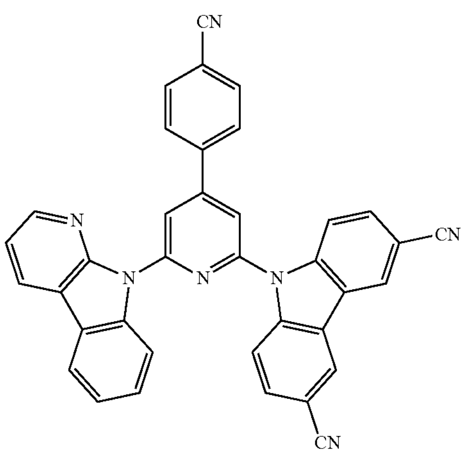
100
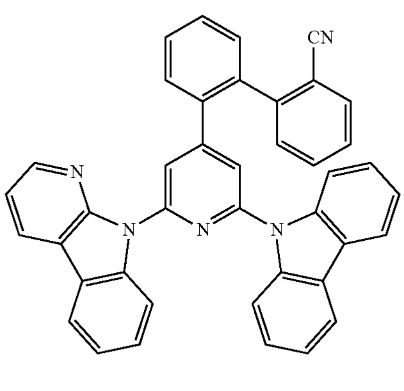
101
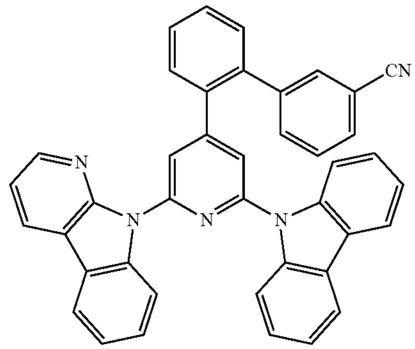
102
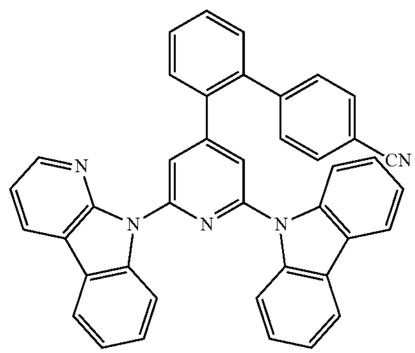
103
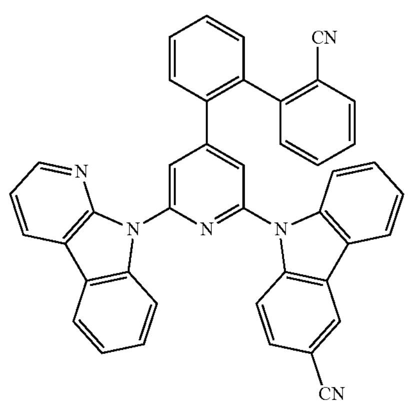
104
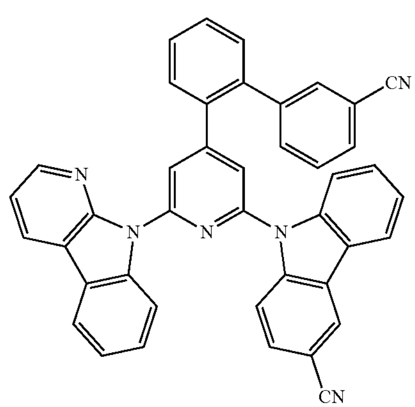

-continued
105
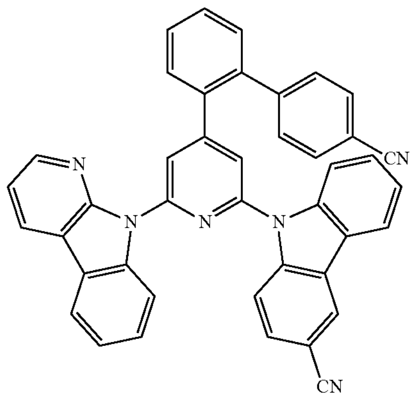
106
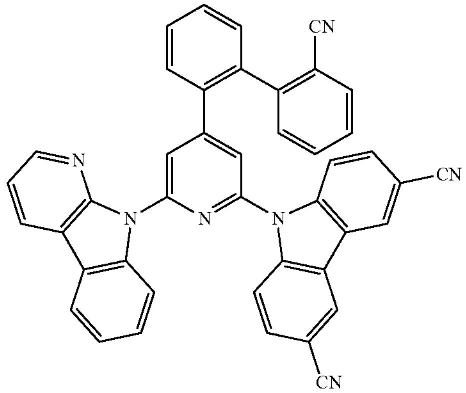
107
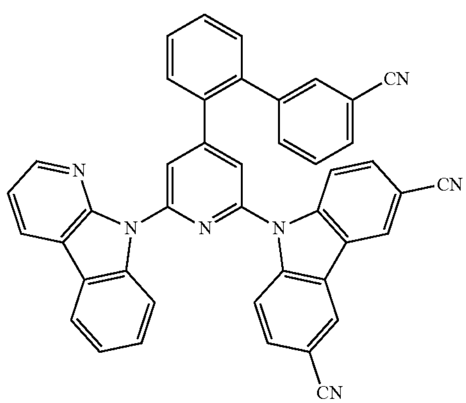
108
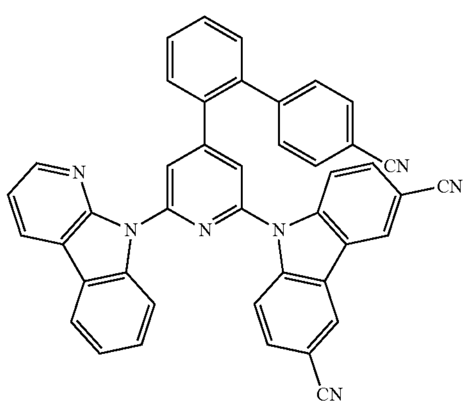
109
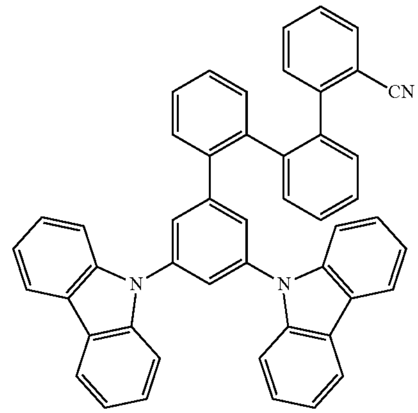
110
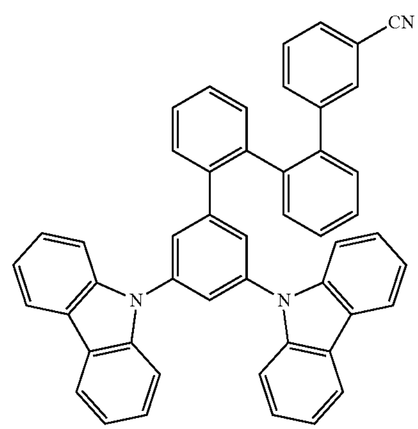
111
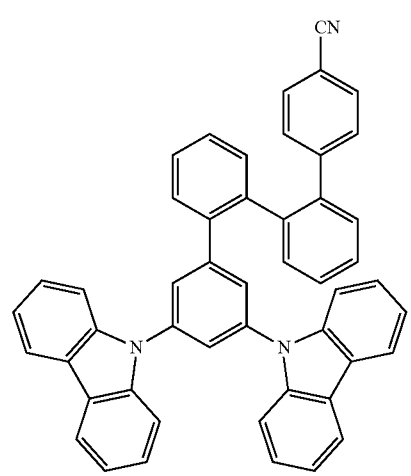

-continued
112
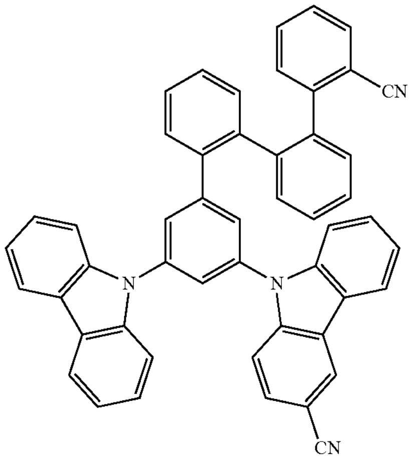
113
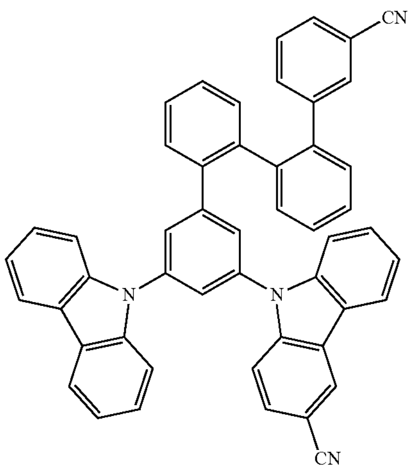
114
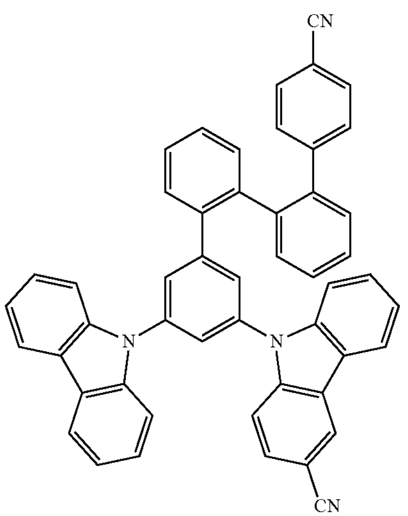
-continued
115
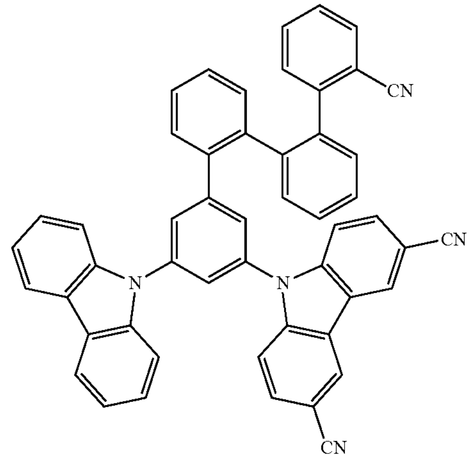
116
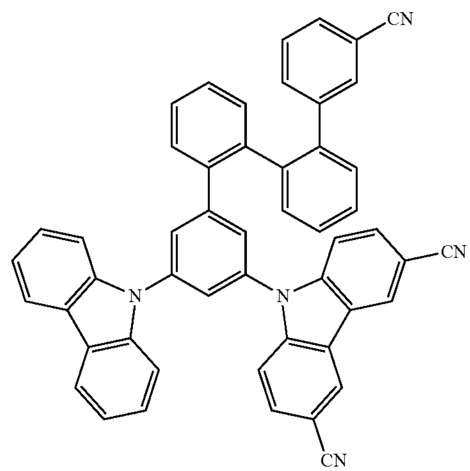
117
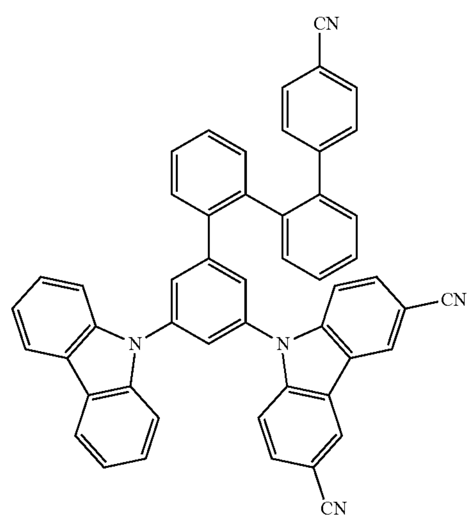

118
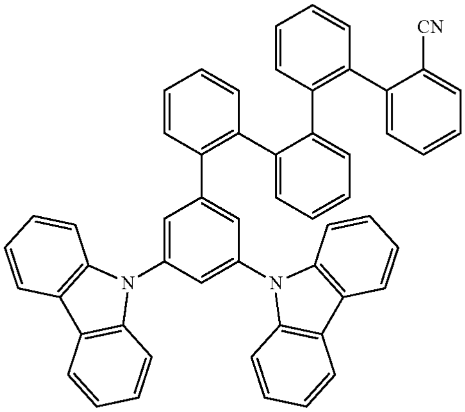
119
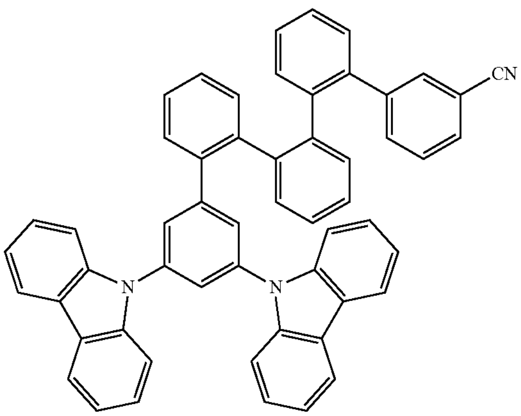
120
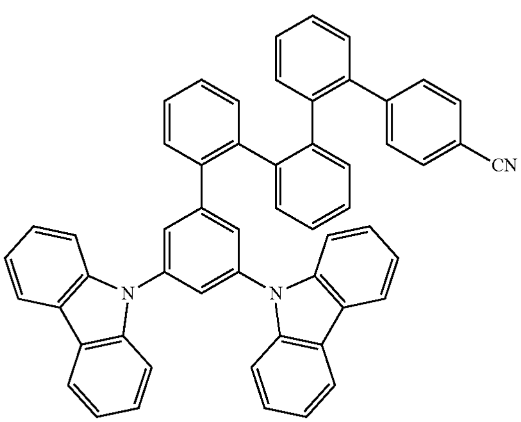
121
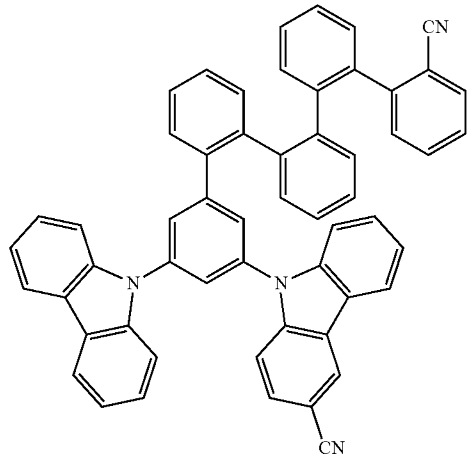
122
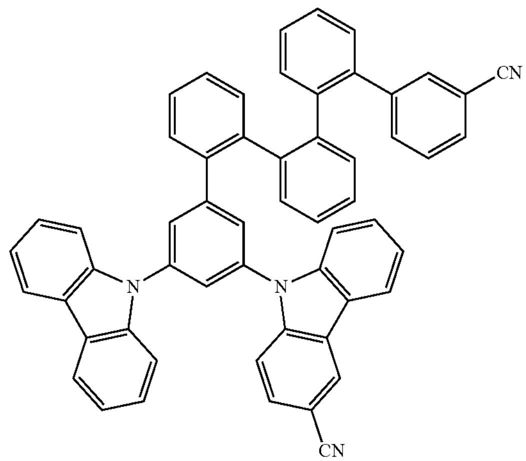
123
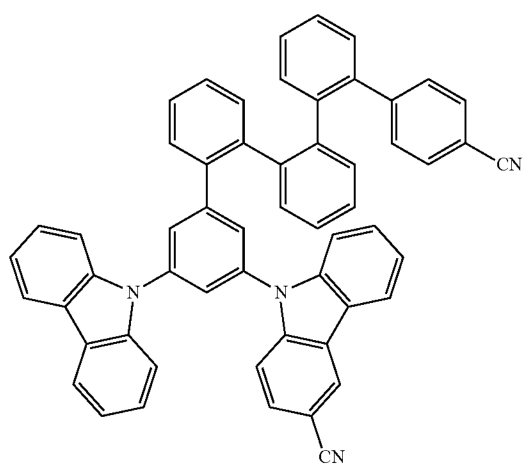

-continued
124
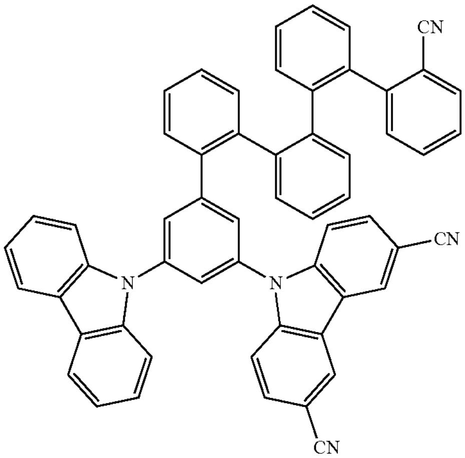
125
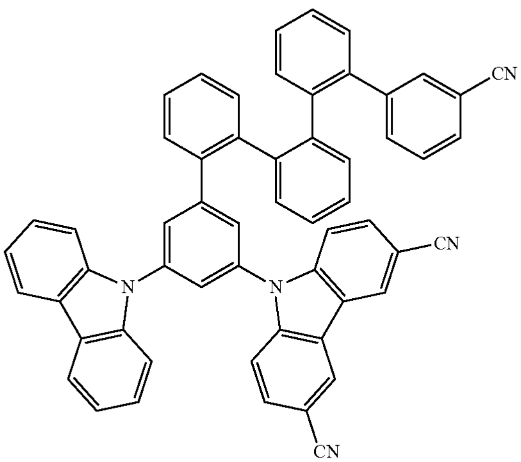
126
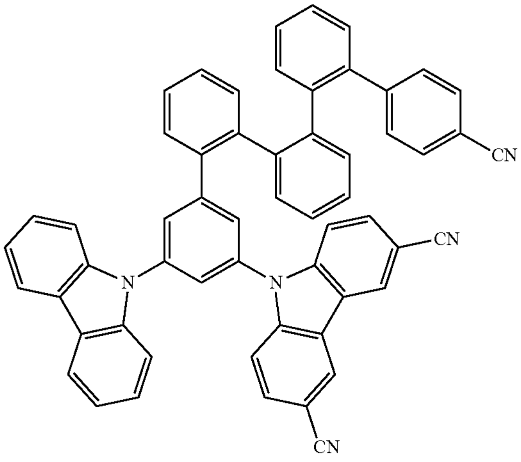
-continued
127
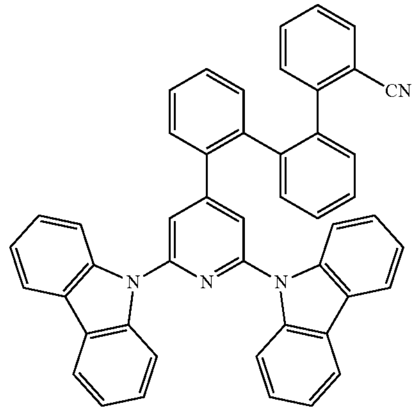
128
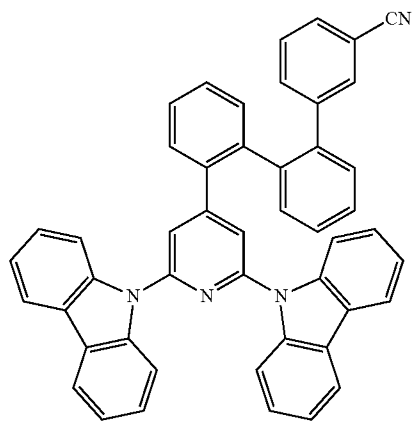
129
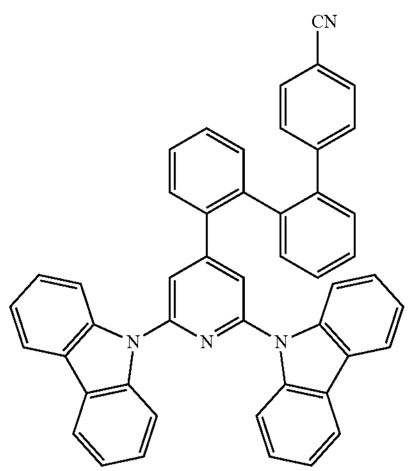

-continued
130
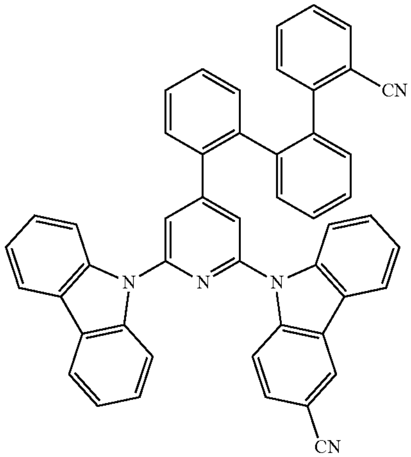
131
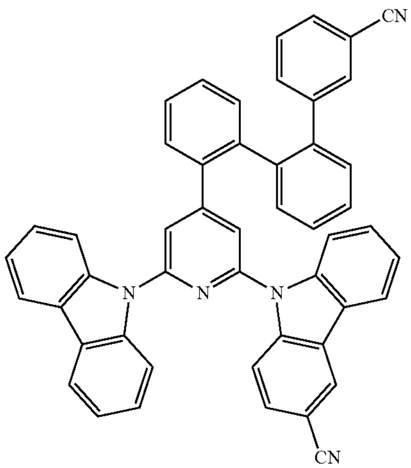
132
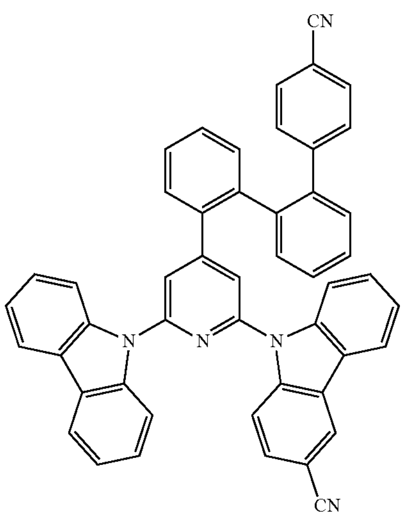
-continued
133
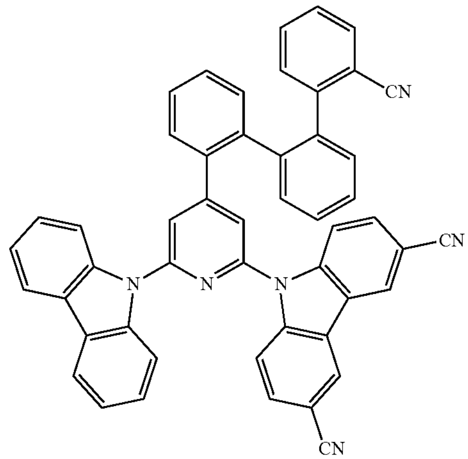
134
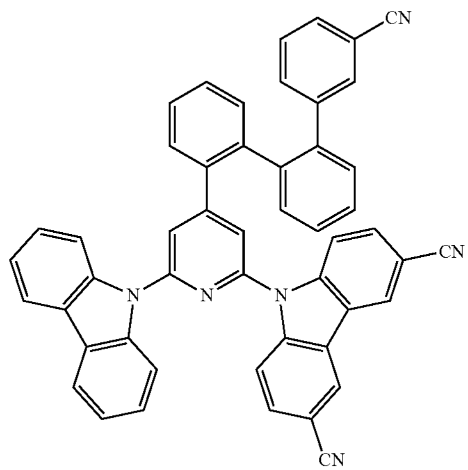
135
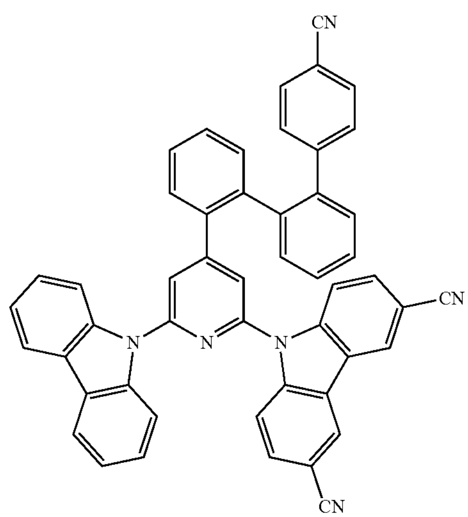

-continued
136
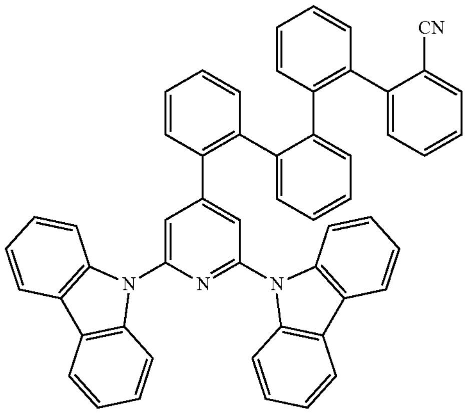
137
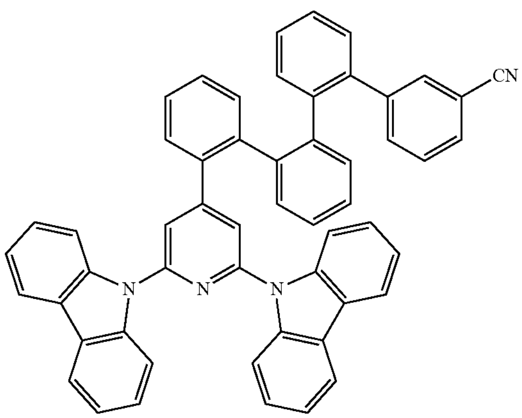
138
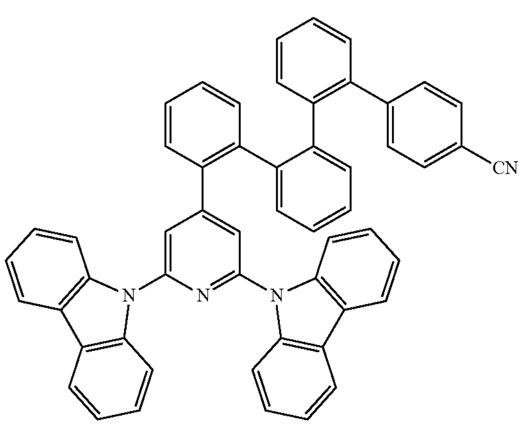
-continued
139
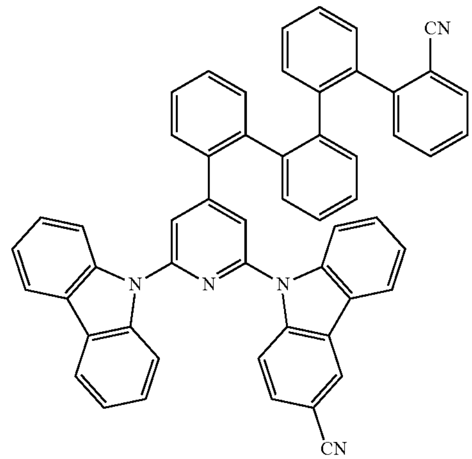
140
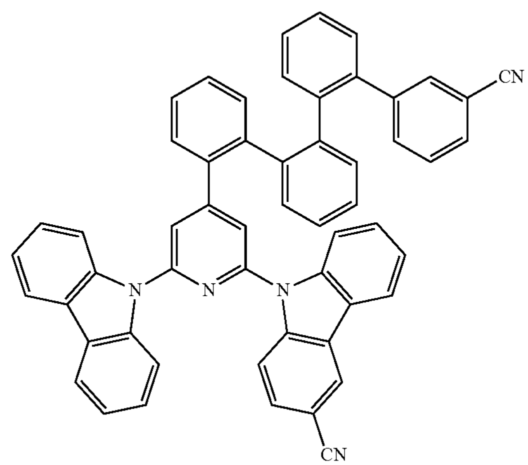
141
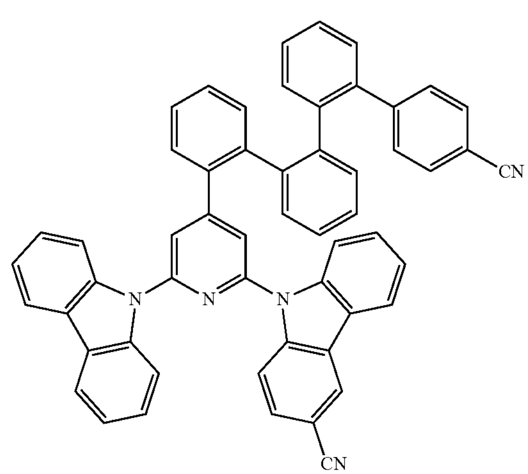

-continued
142
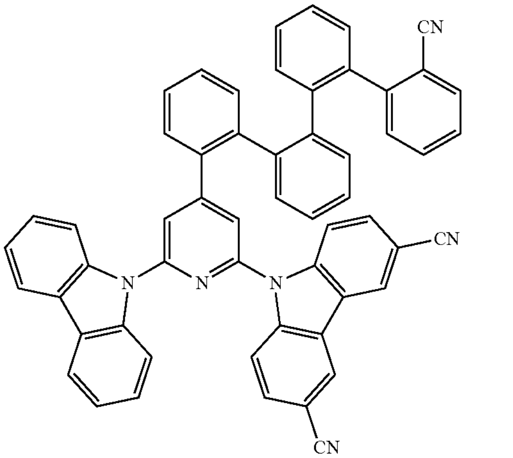
143
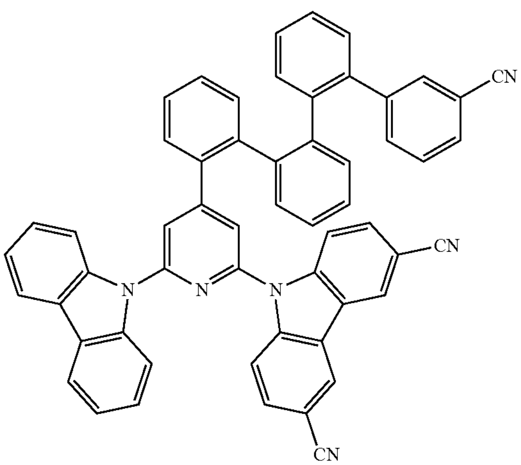
144
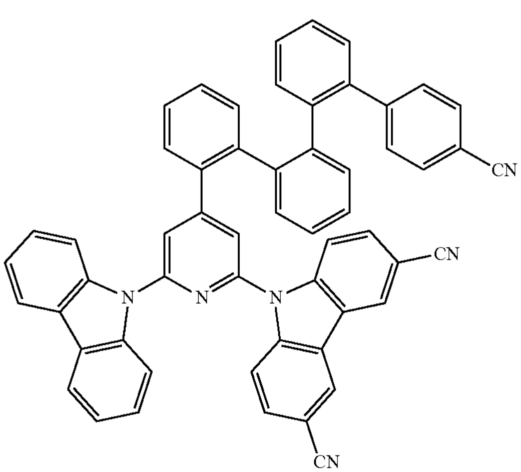
-continued
145
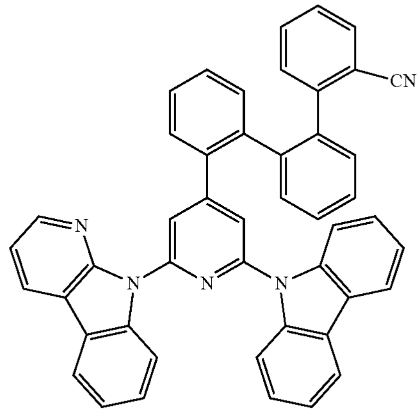
146
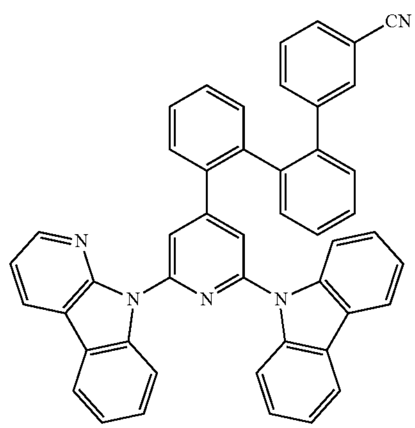
147
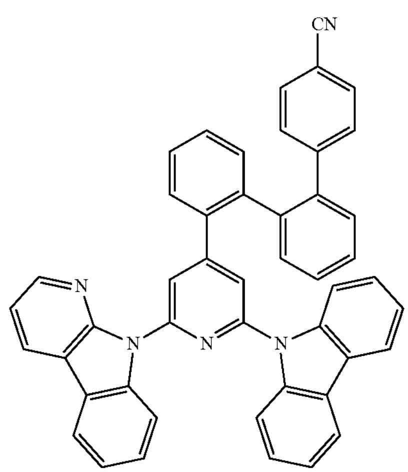

-continued
148
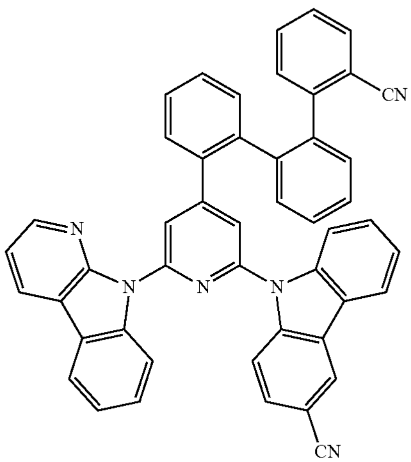
149
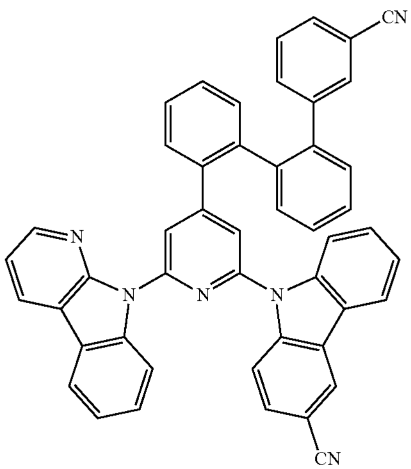
150
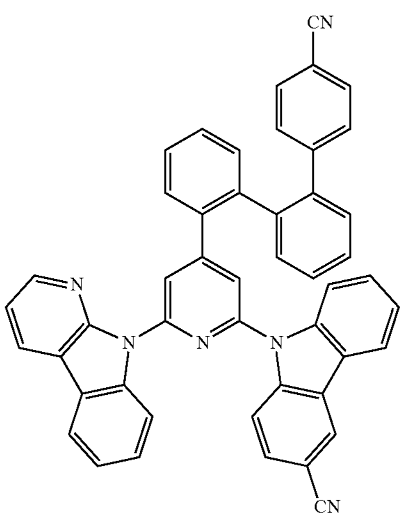
-continued
151
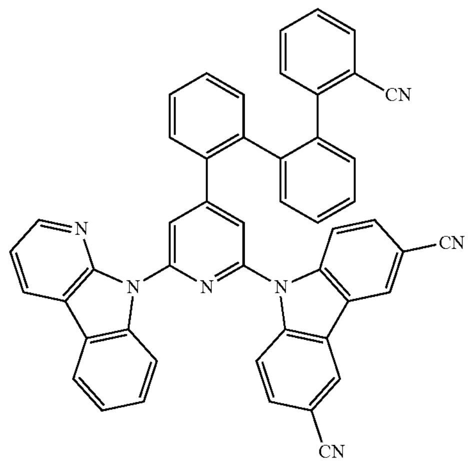
152
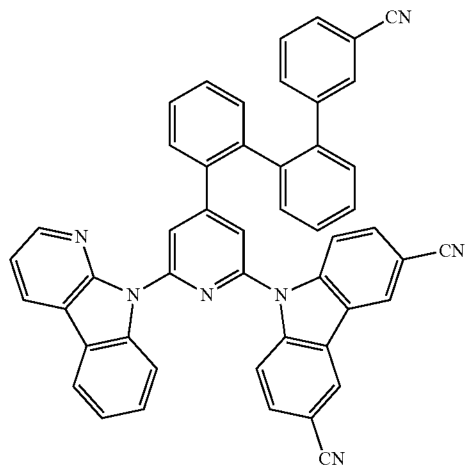
153
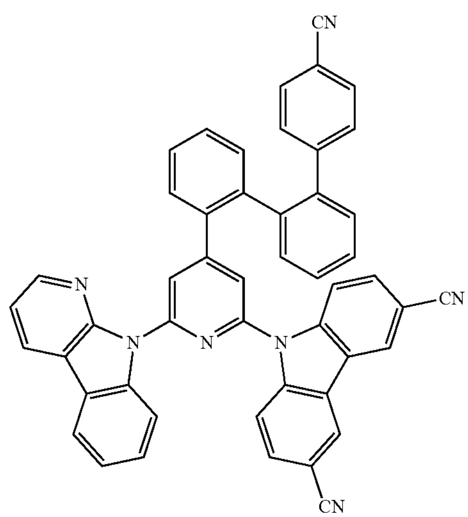

-continued
154
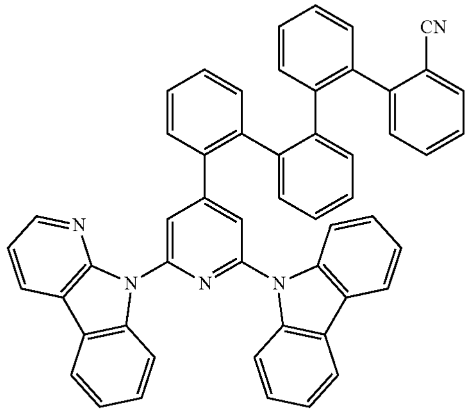
155
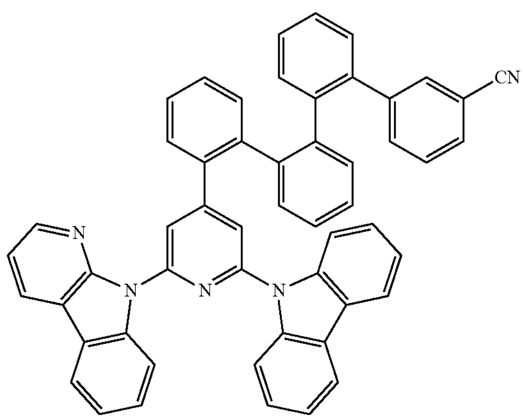
156
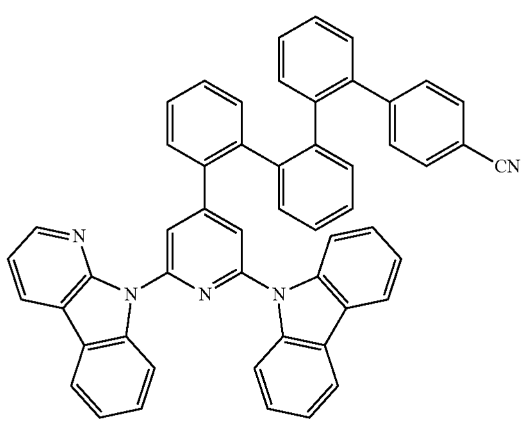
-continued
157
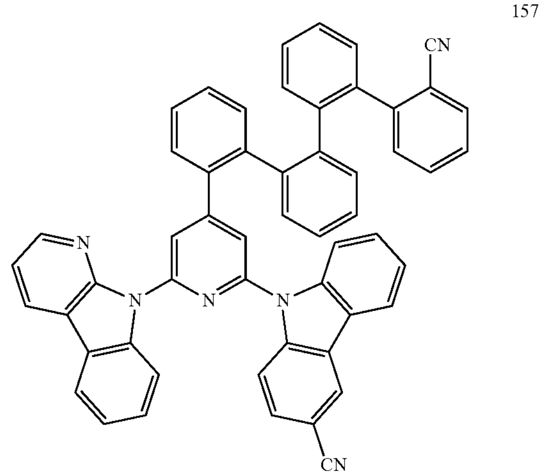
158
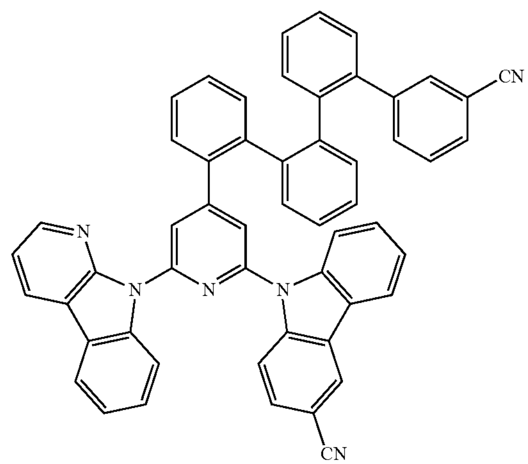
159
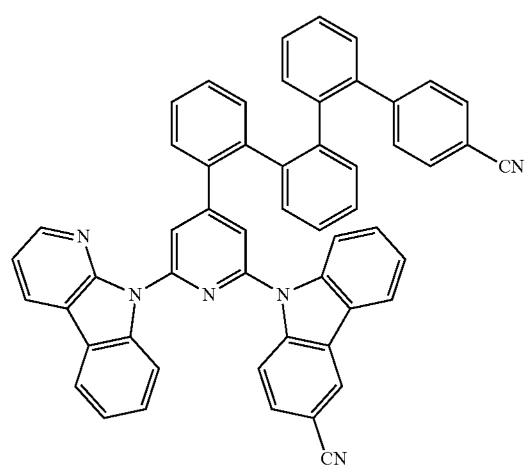

160
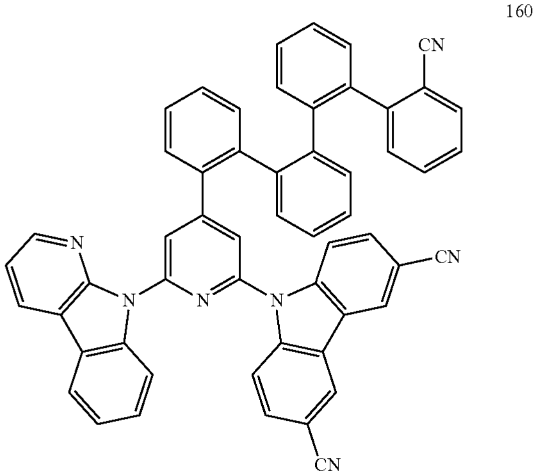
163
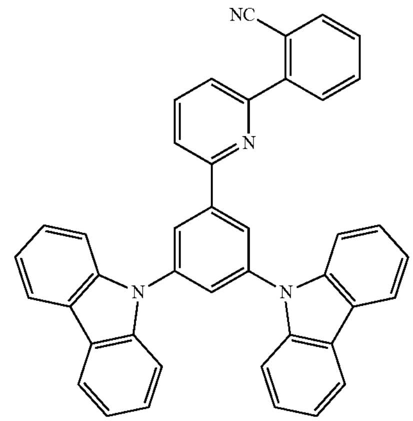
161
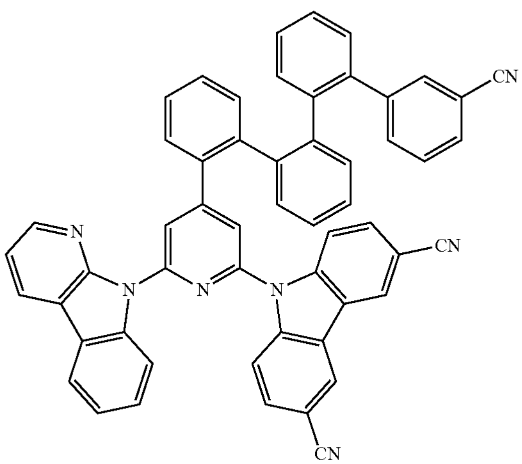
164
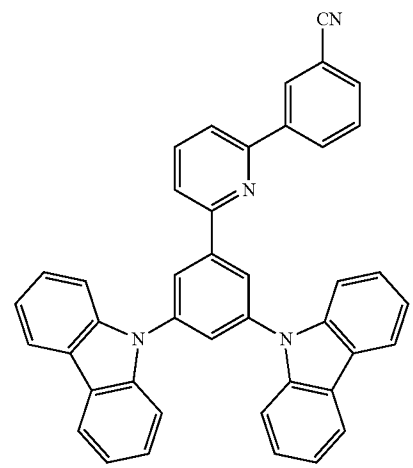
162
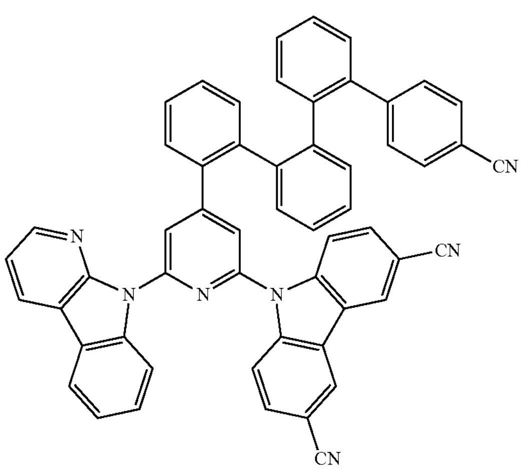
165
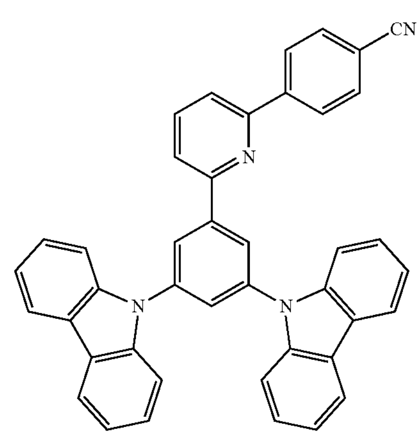

-continued
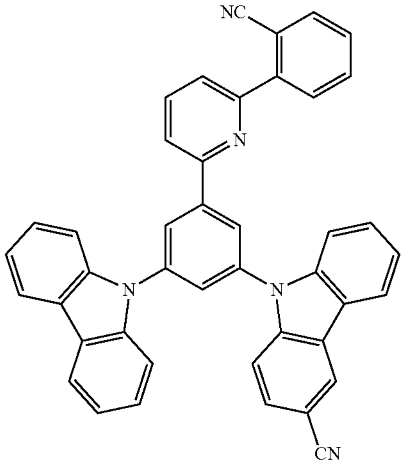
166
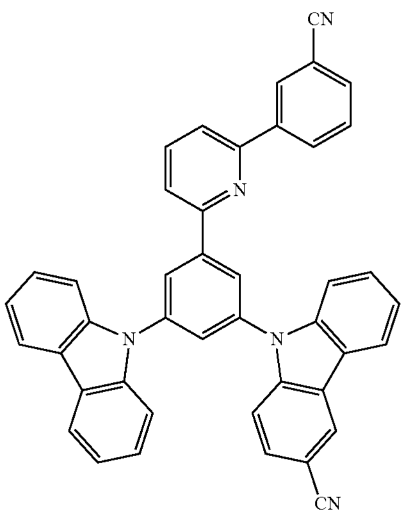
167
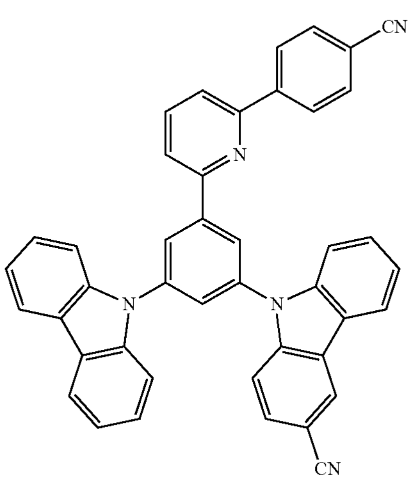
168
-continued
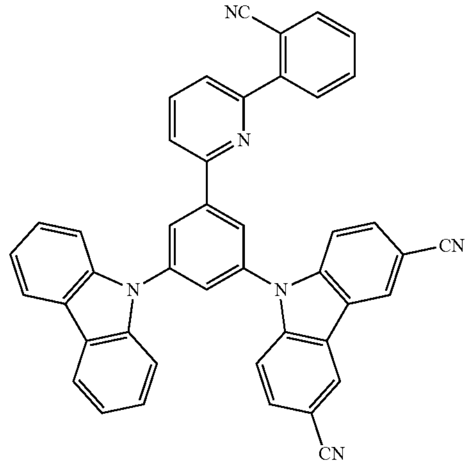
169
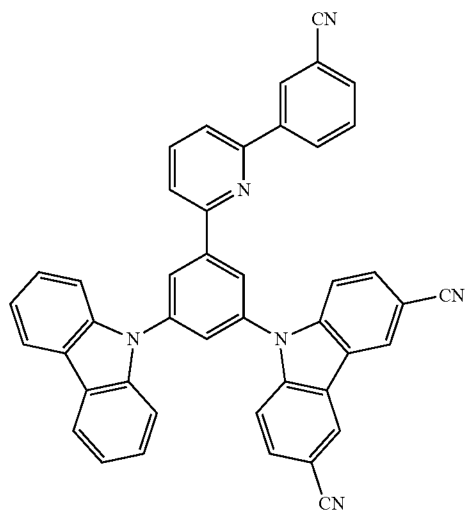
170
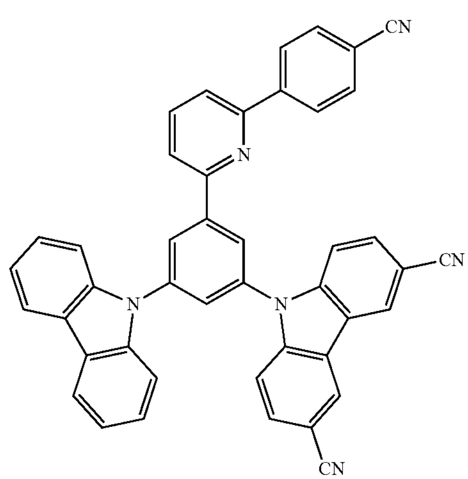
171

172
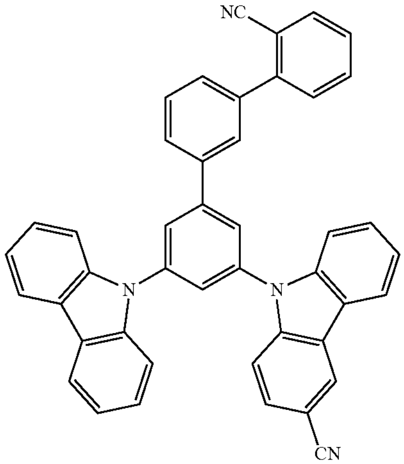
173
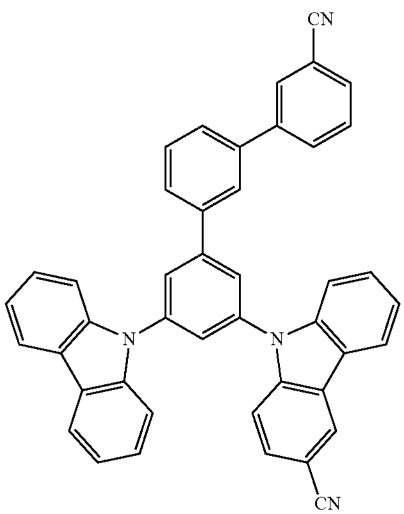
174
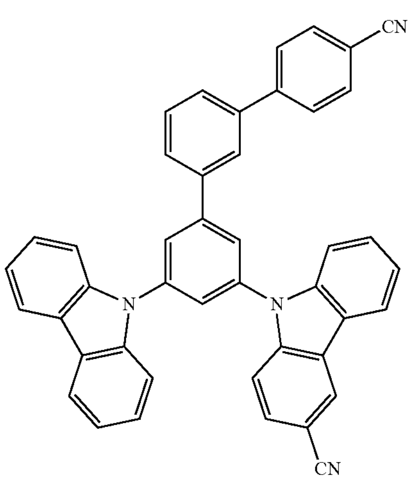
175
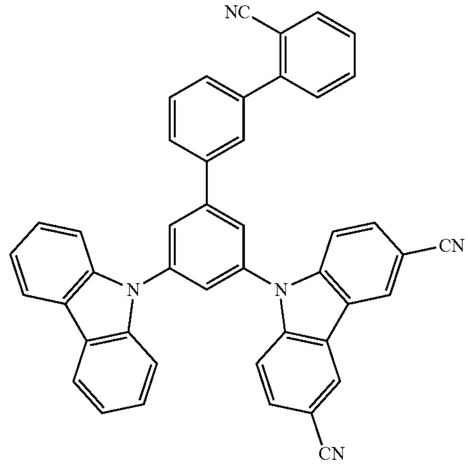
176
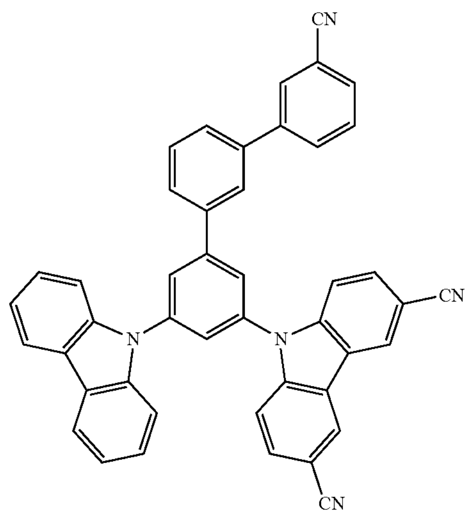
177
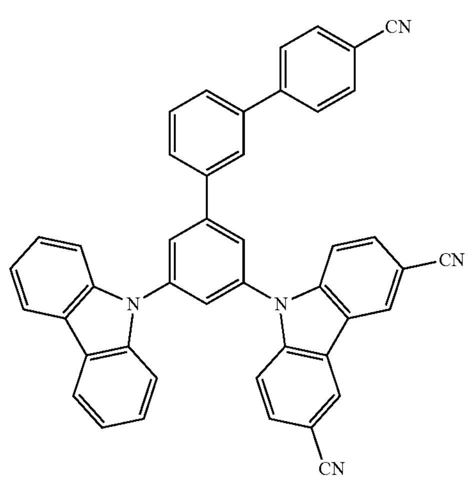

178
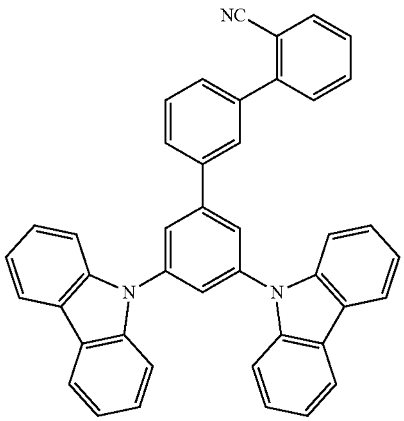
179
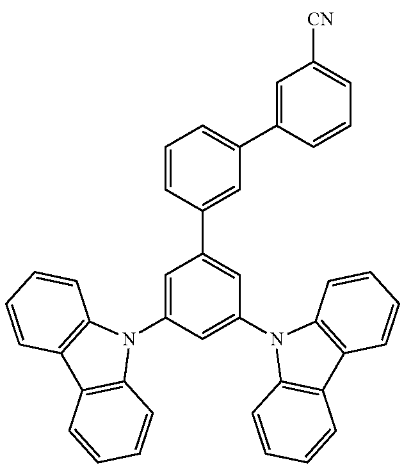
180
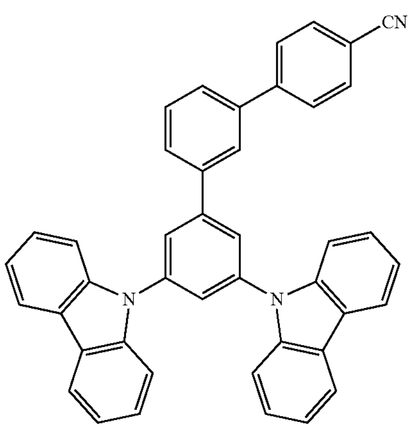
181
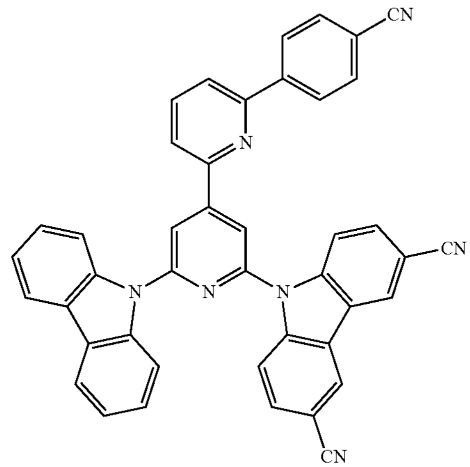
182
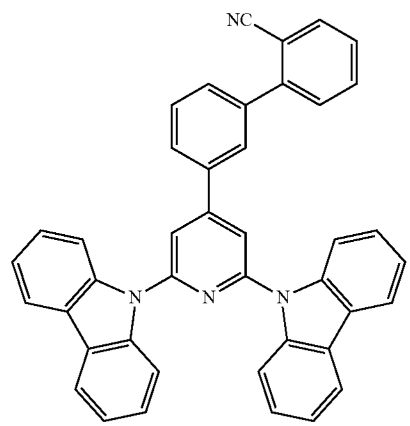
183
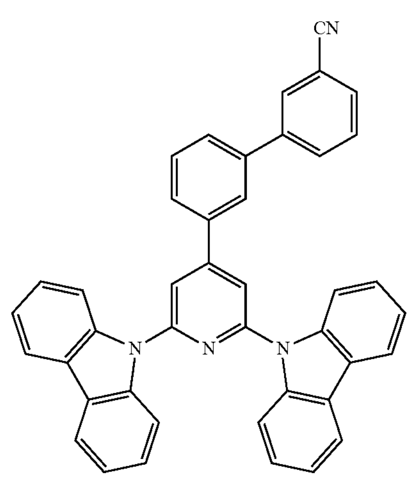

-continued
184
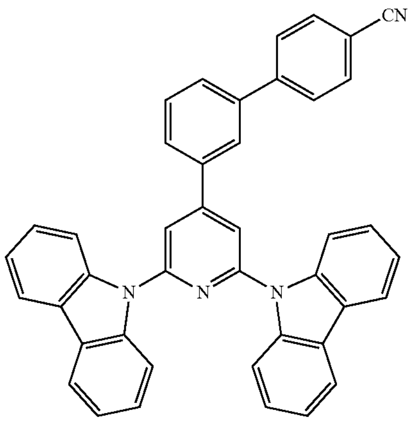
185
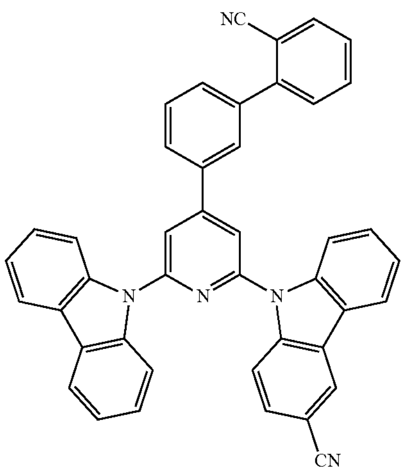
186
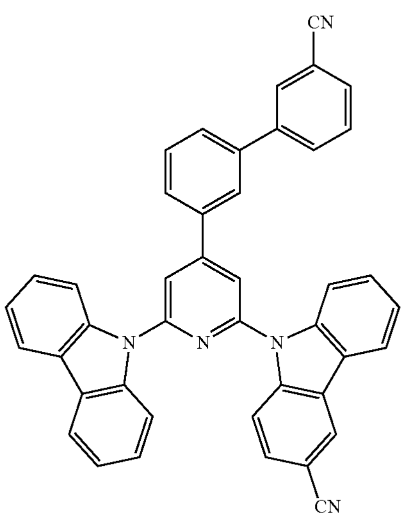
-continued
187
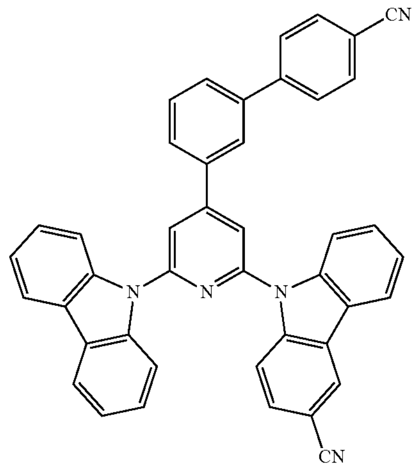
188
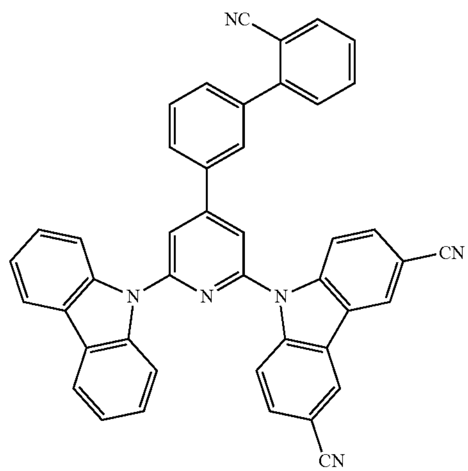
189
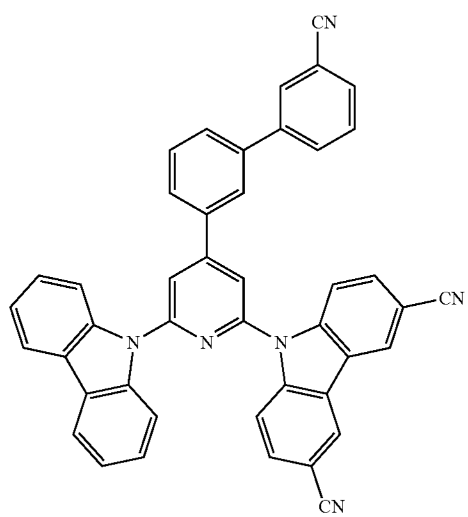

190
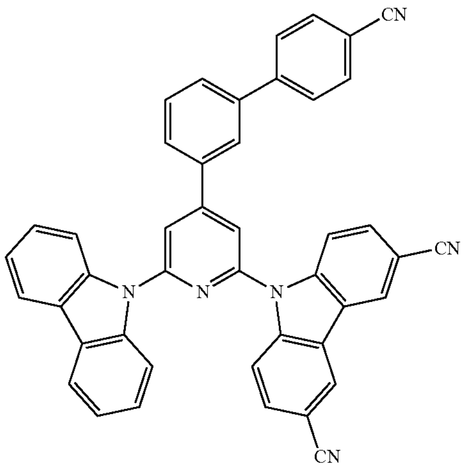
191
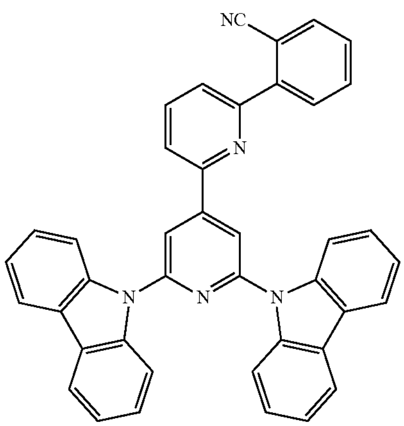
192
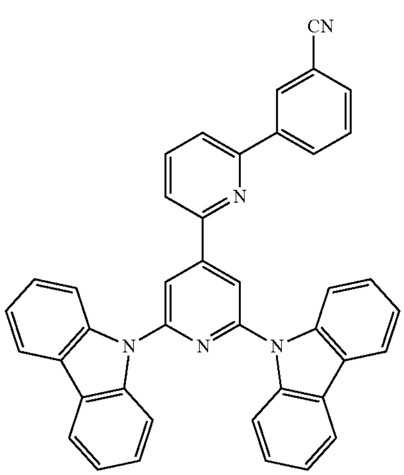
193
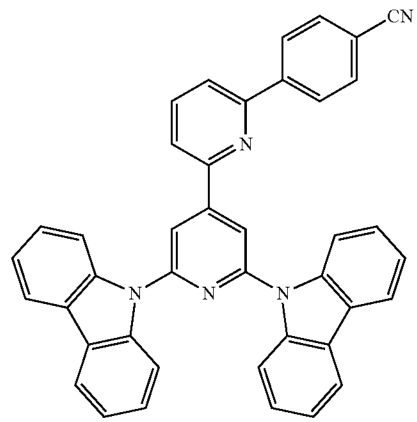
194
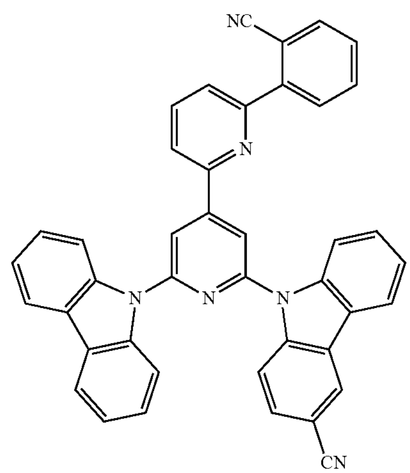
195
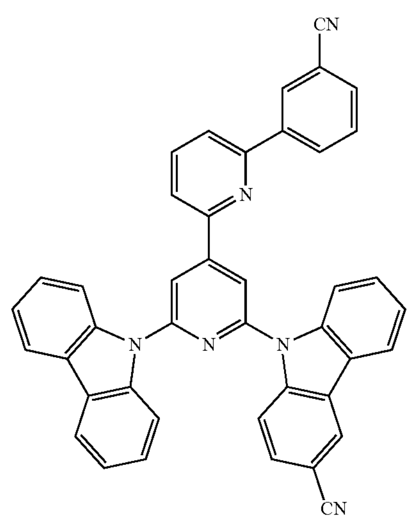

-continued
193
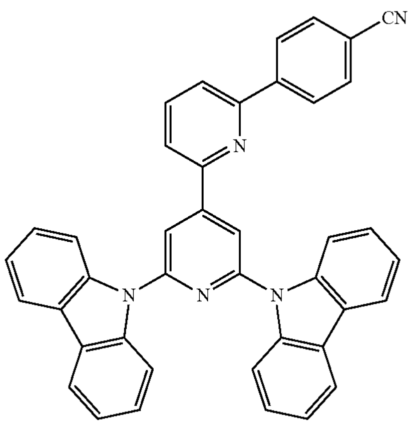
194
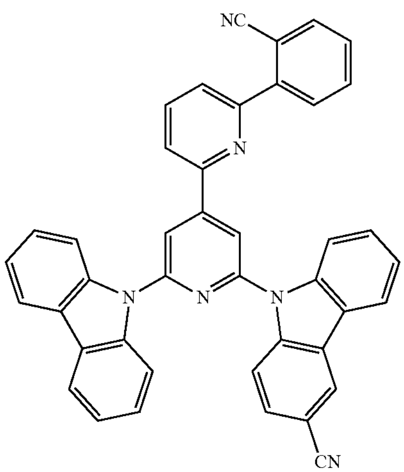
195
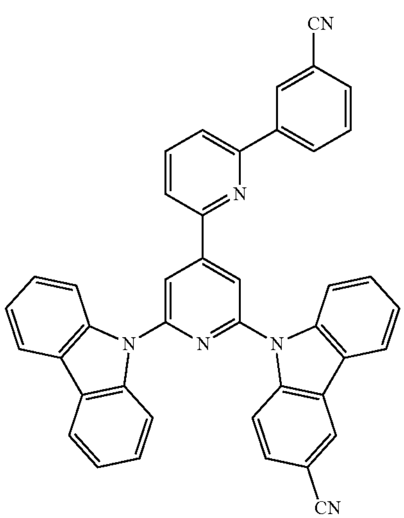
-continued
196
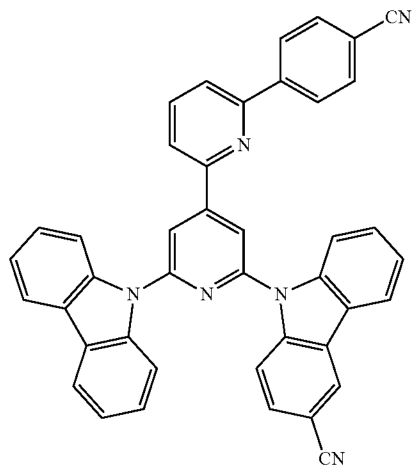
197
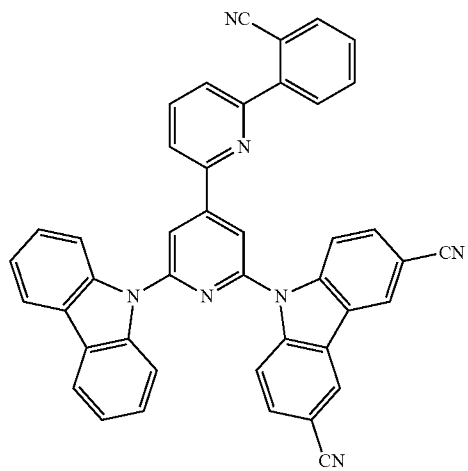
198
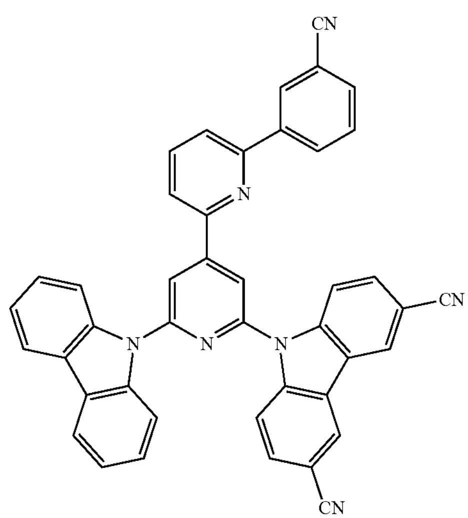

-continued
199
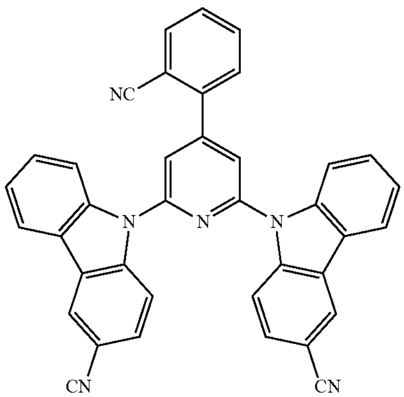
200
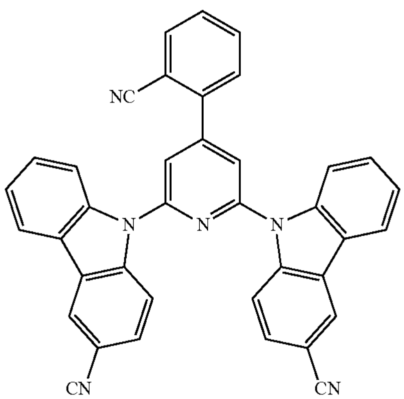
201
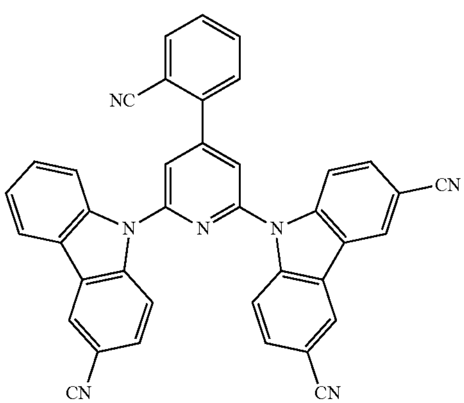
202
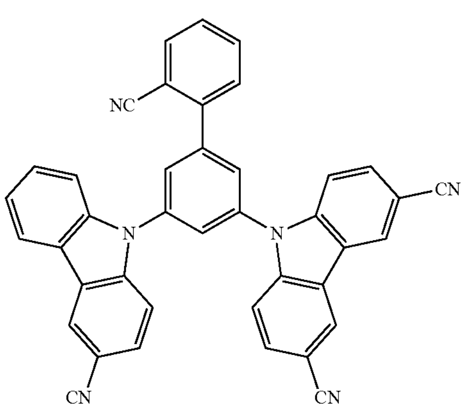
-continued
<Group HE6>
1
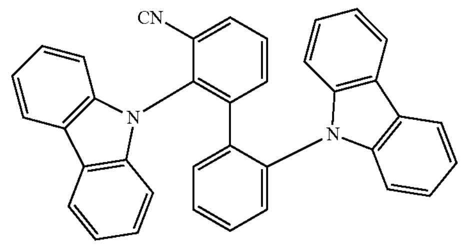
2
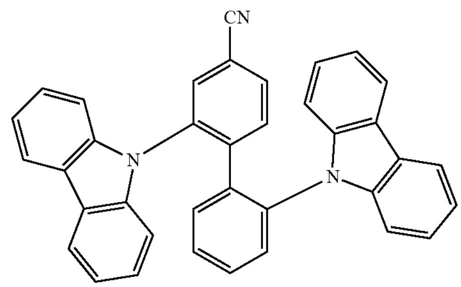
3
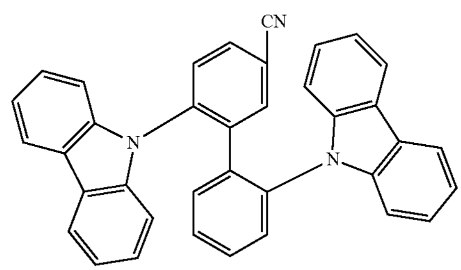
4
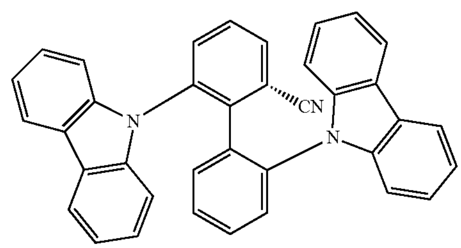
5
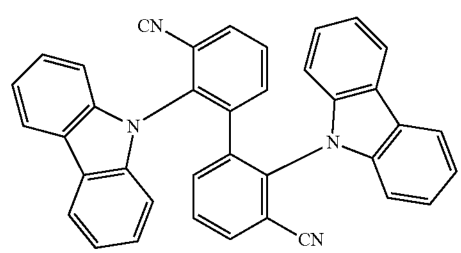
6
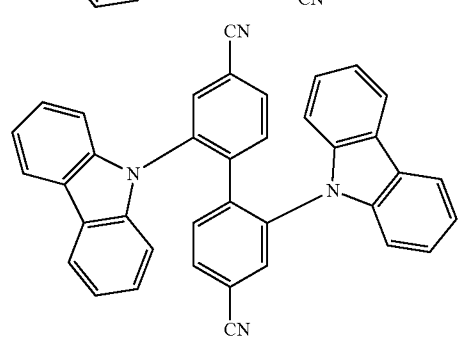

7
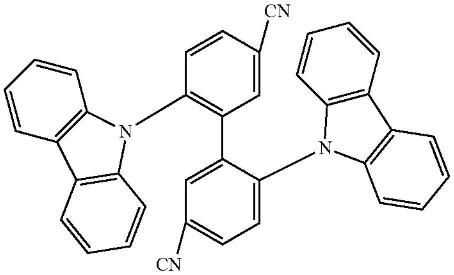
8
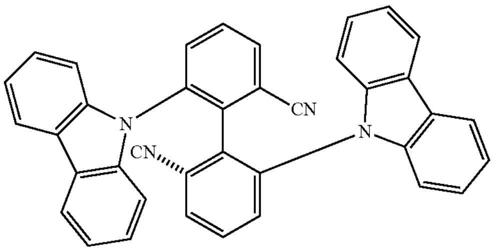
10
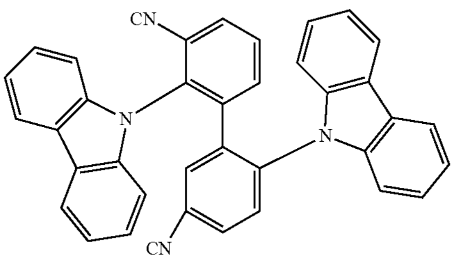
11
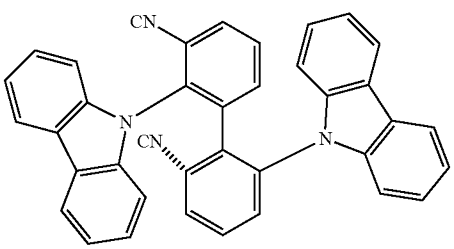
12
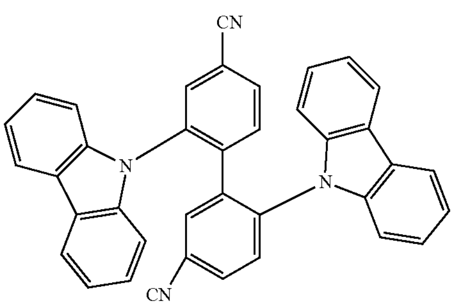
13
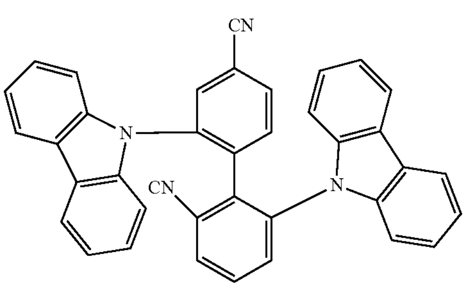
14
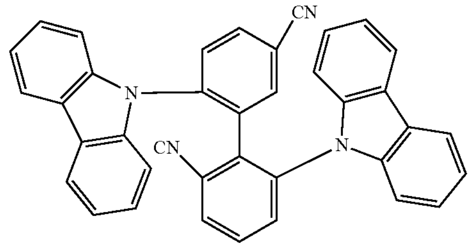
15
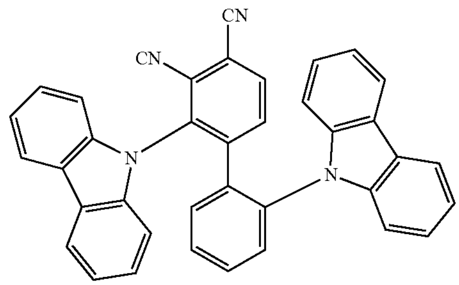
16
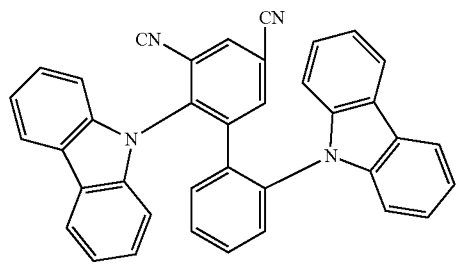
17
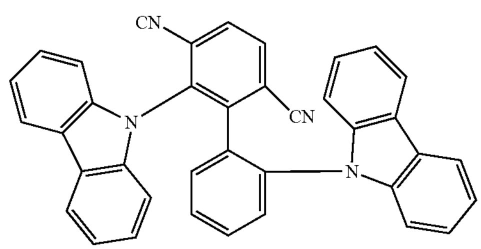
18
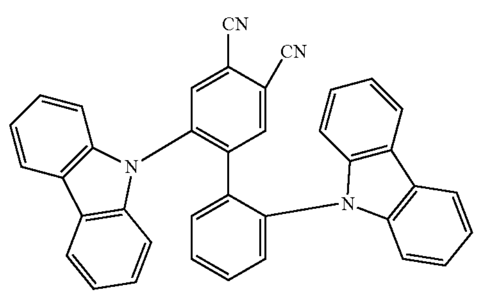
19
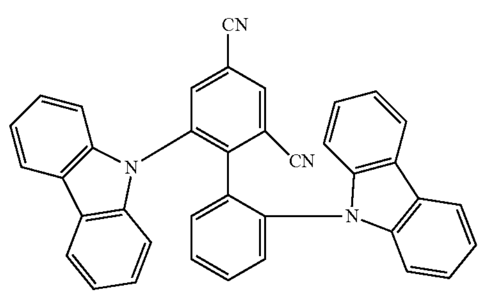

20
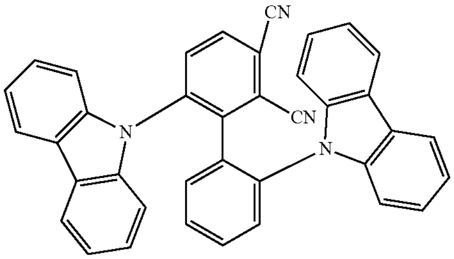
21
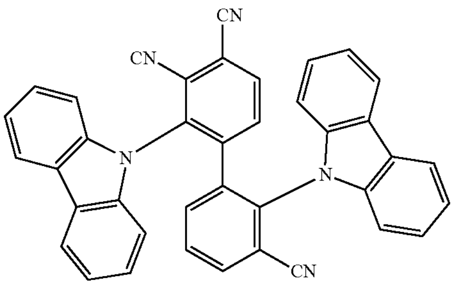
22
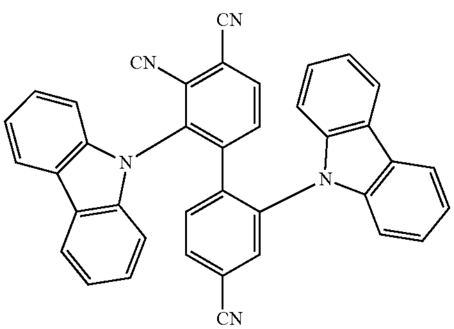
23
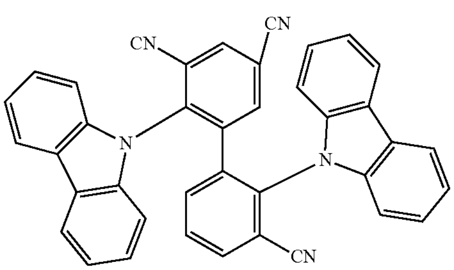
24
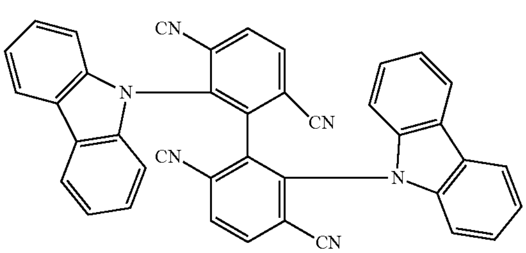
25
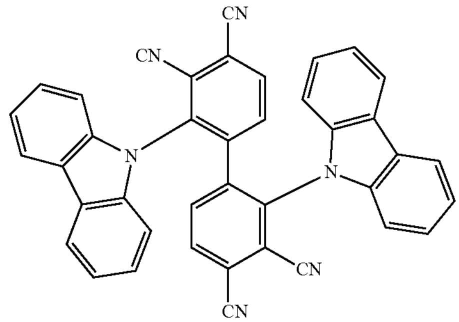
26
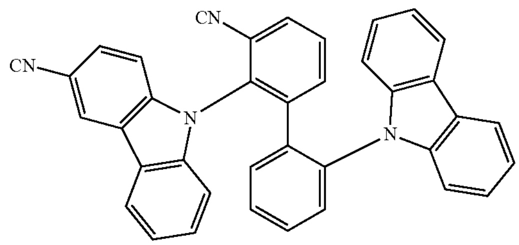
27
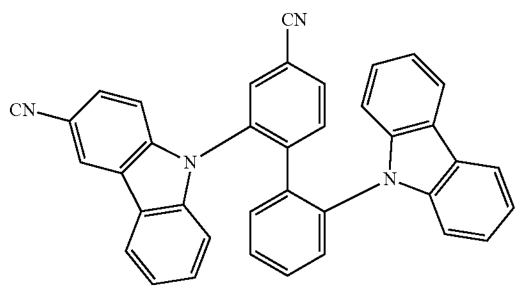
28
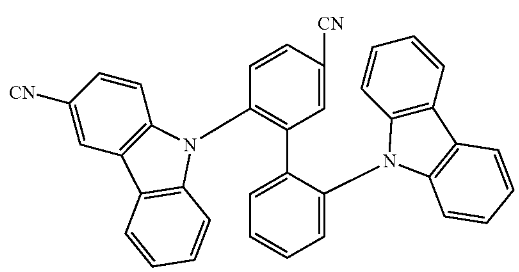
29
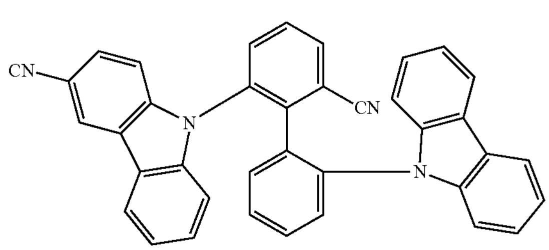

-continued
30
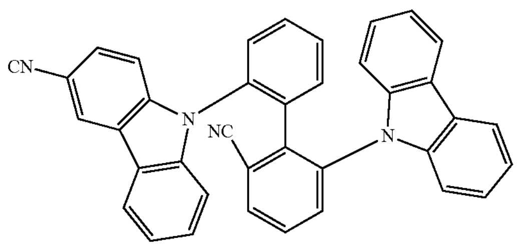
31
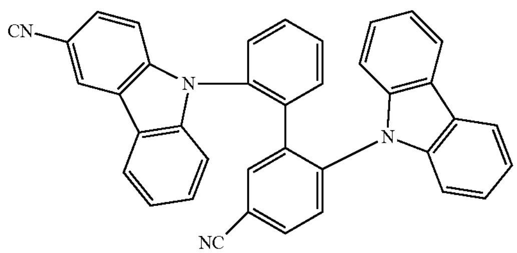
32
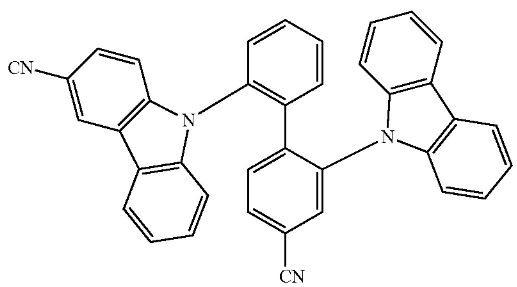
33
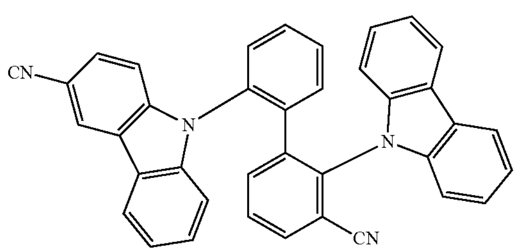
34
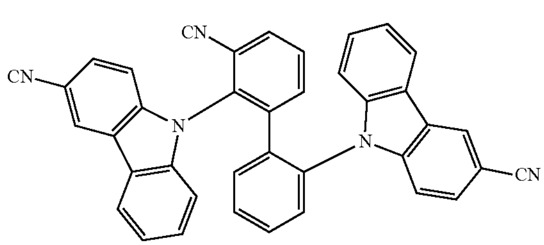
-continued
35
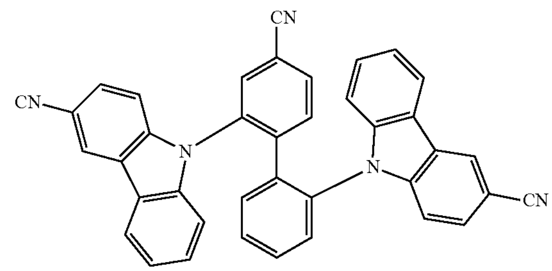
36
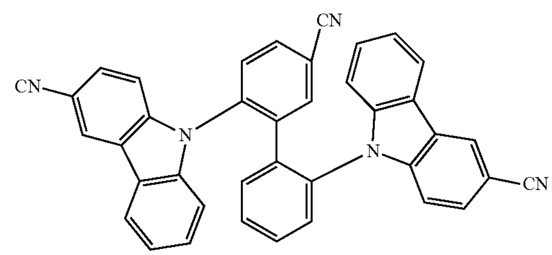
37
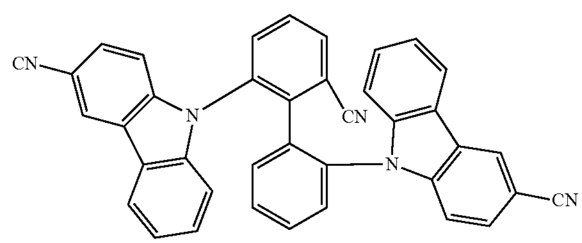
38
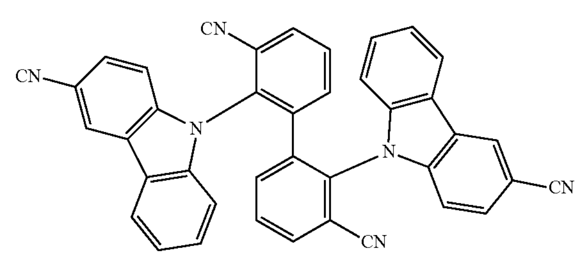
39
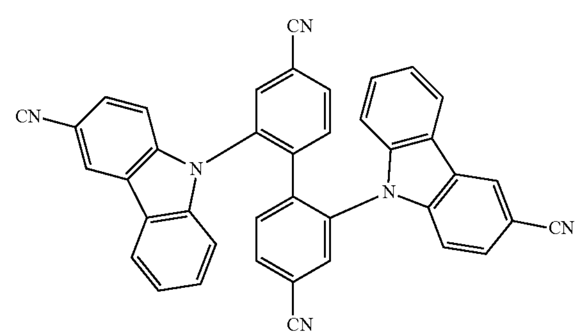

40
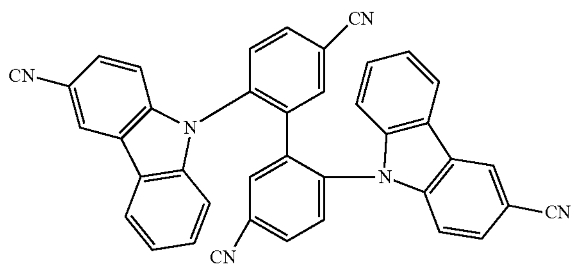
41
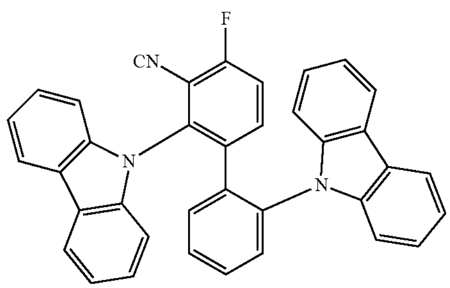
42
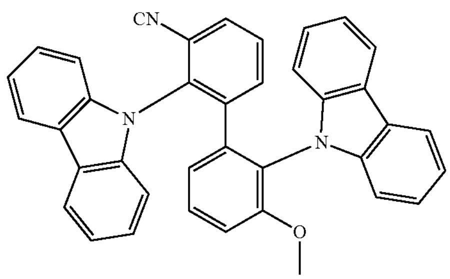
43
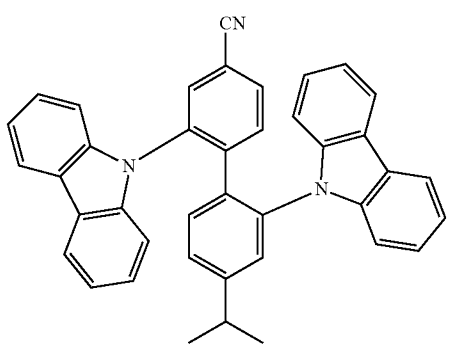
44
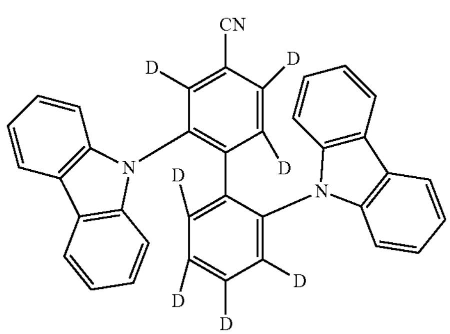
45
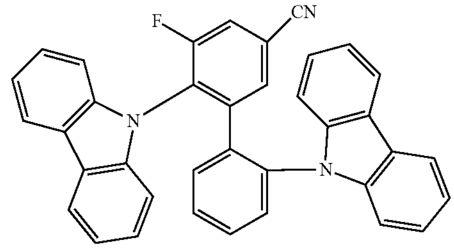
46
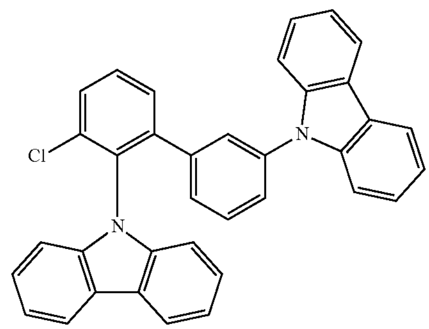
47
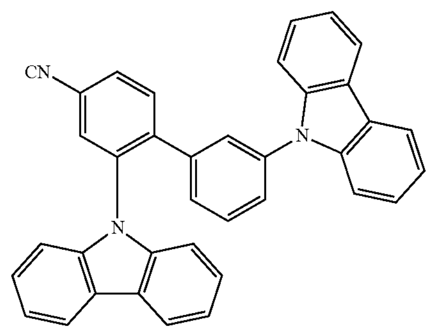
48
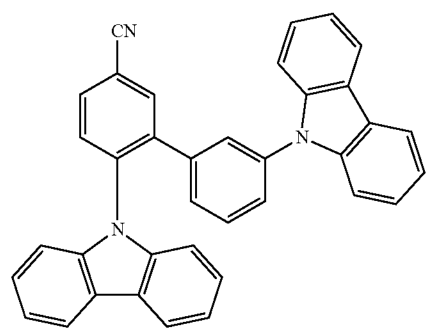
49
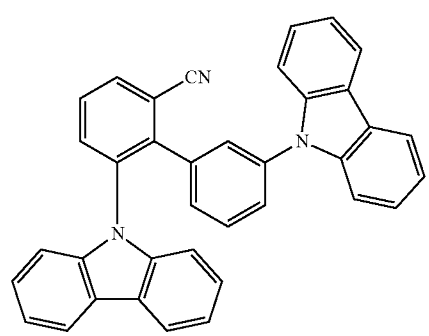

-continued
50
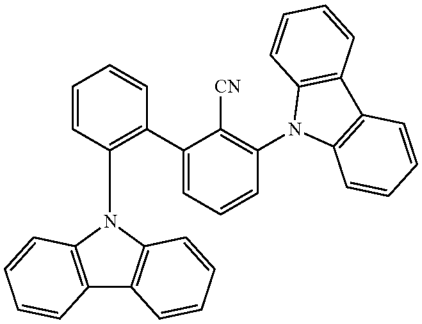
51
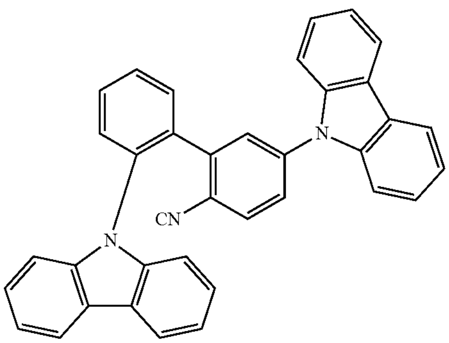
52
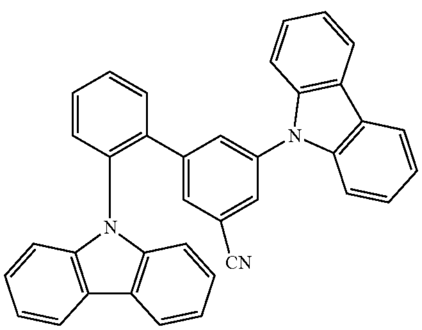
53
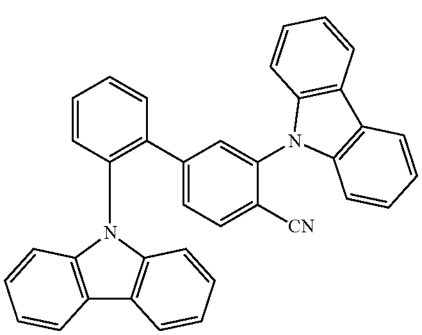
-continued
54
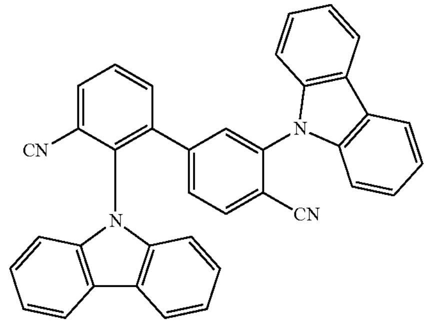
55
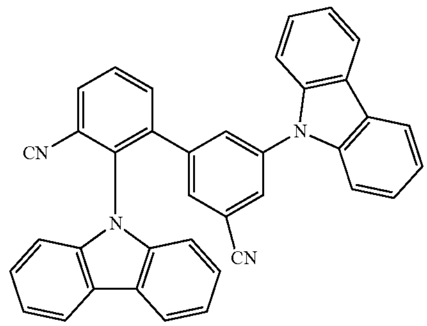
56
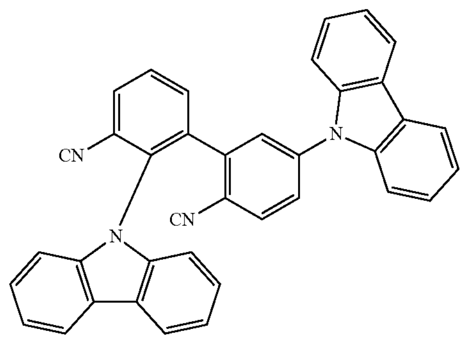
57
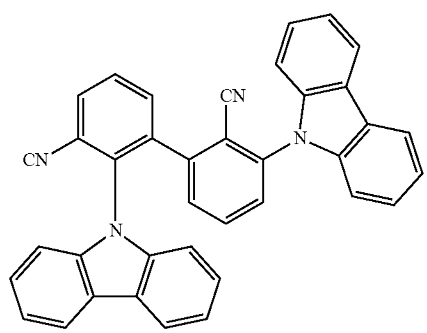
58
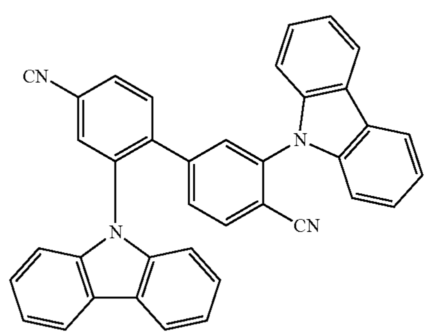

59
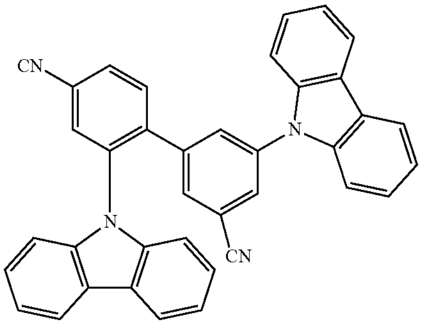
60
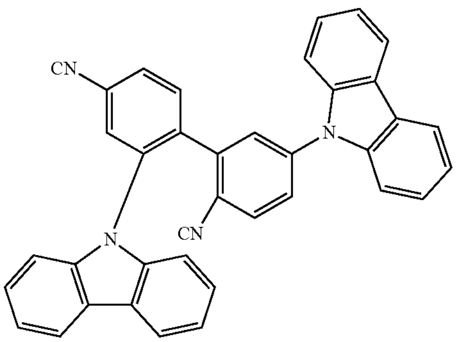
61
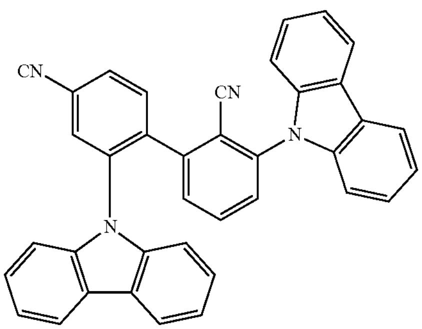
62
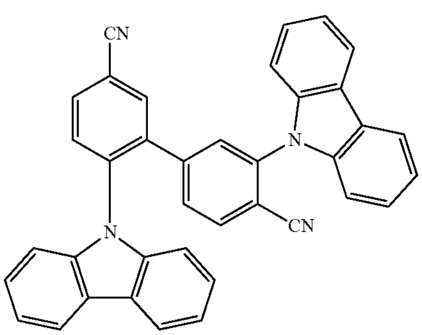
63
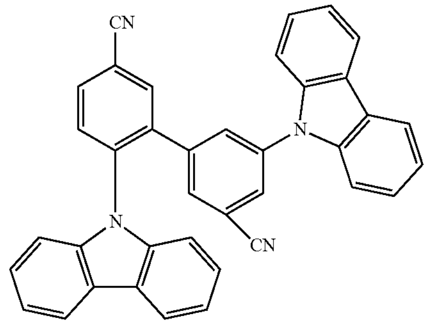
64
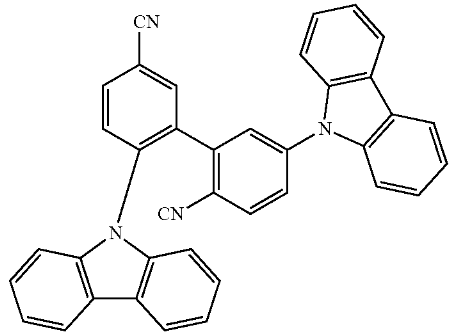
65
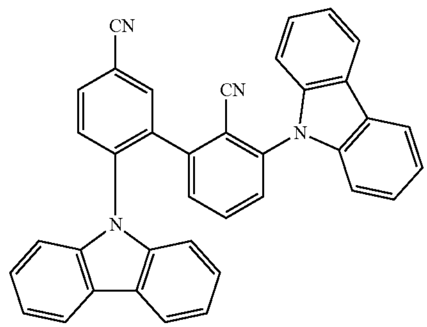
66
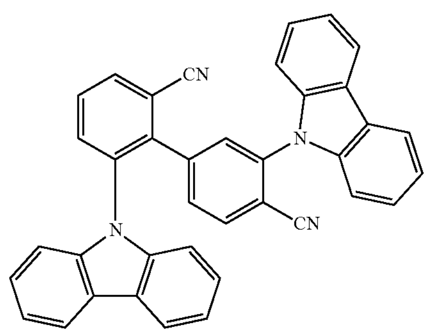

-continued
67
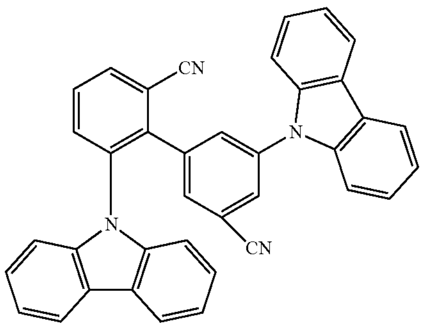
68
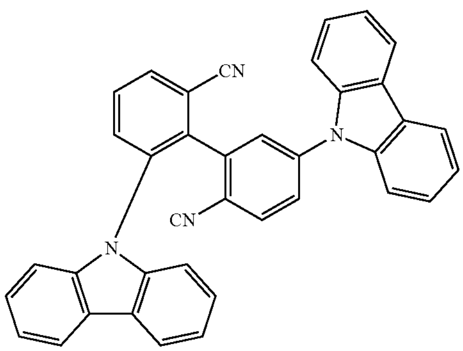
69
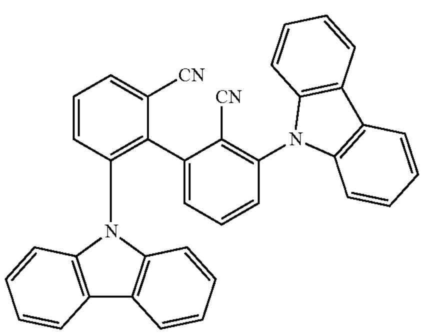
70
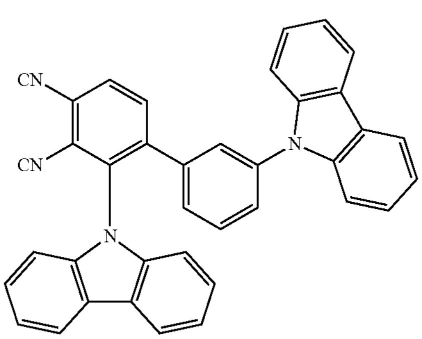
-continued
71
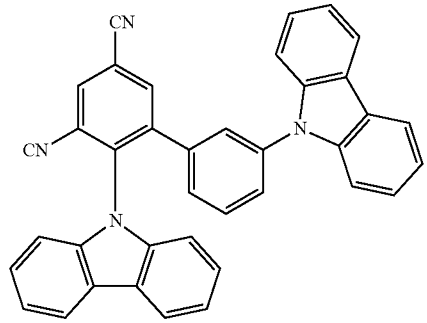
72
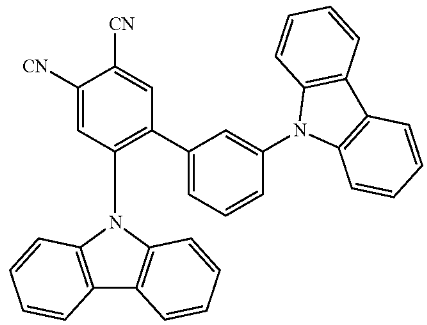
73
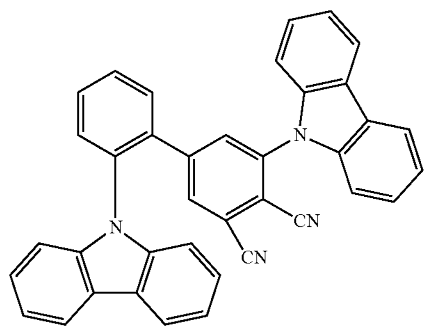
74
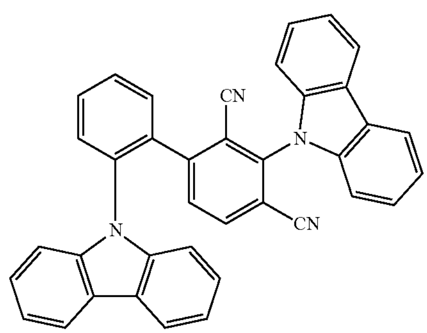
75
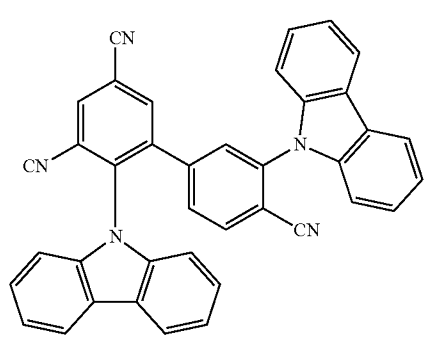

-continued
76
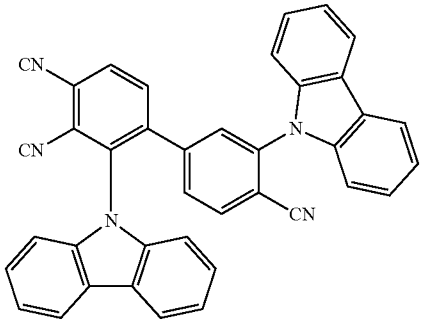
77
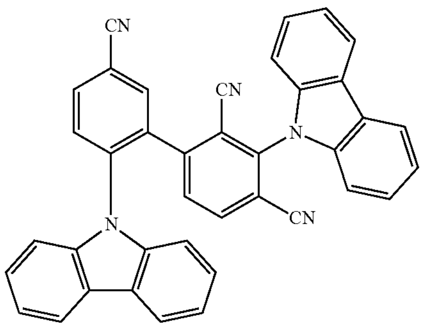
78
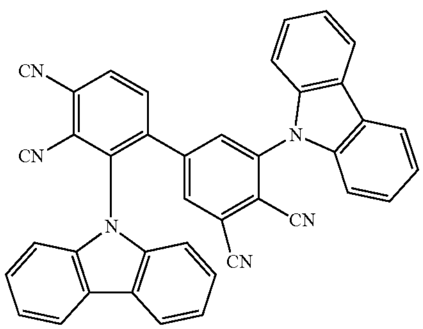
79
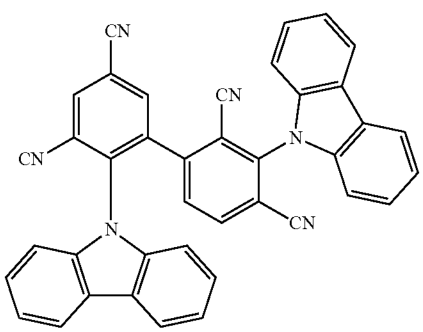
80
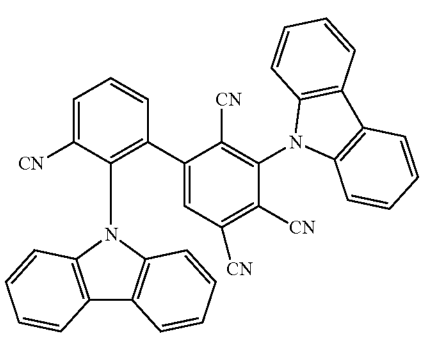
-continued
81
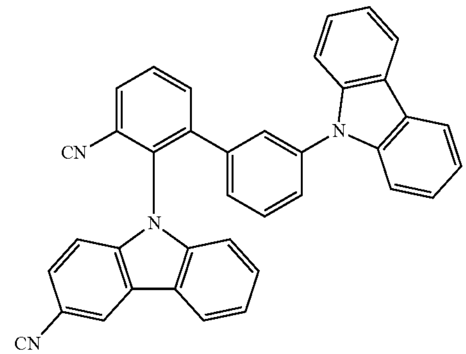
82
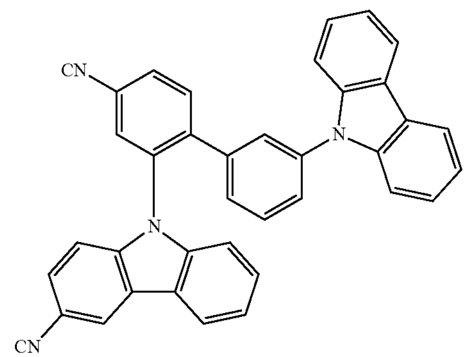
83
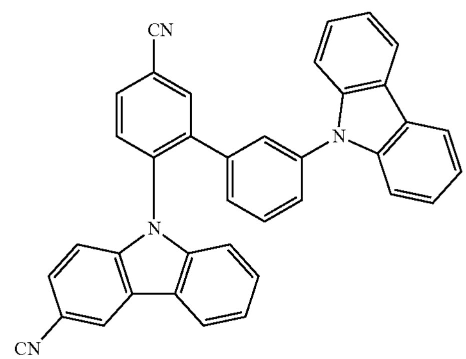
84
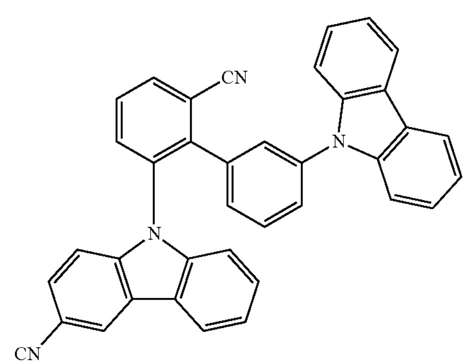

-continued
85
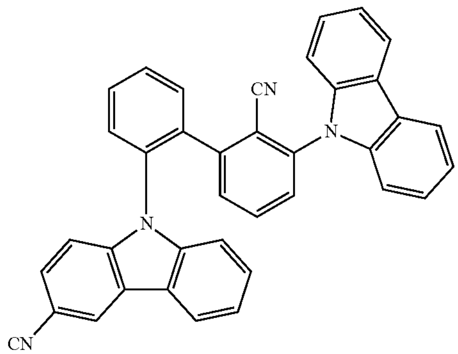
86
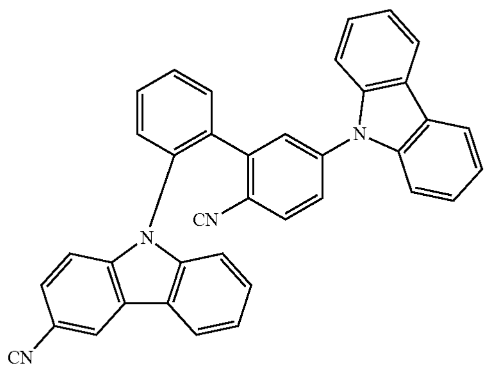
87
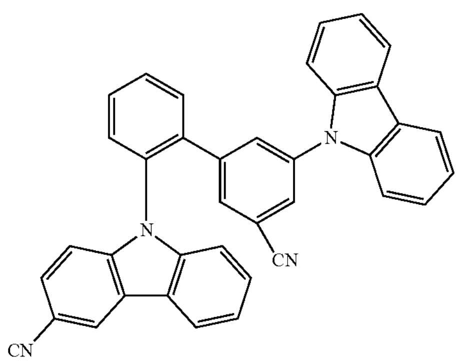
88
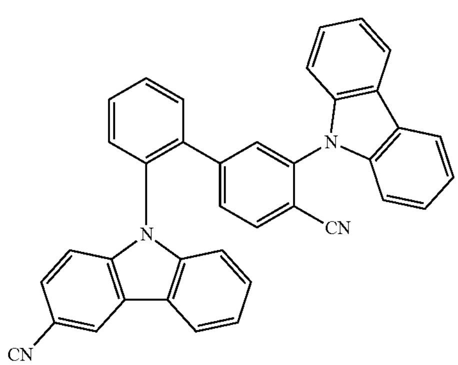
-continued
89
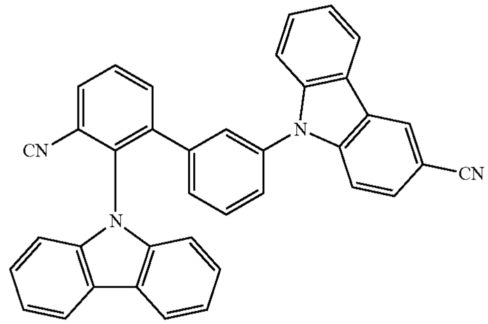
90
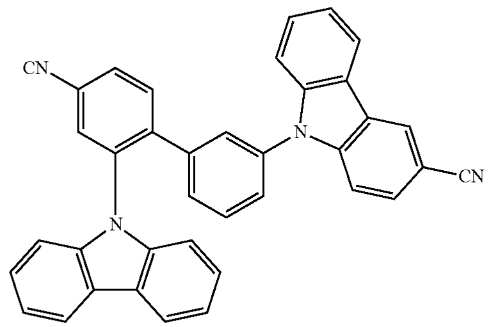
91
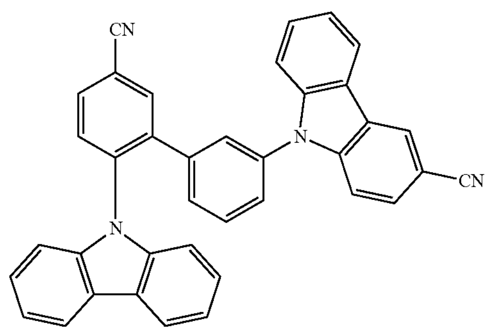
92
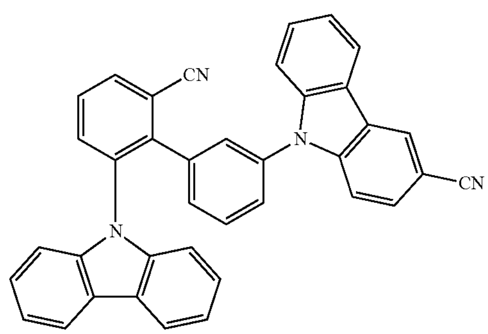
93
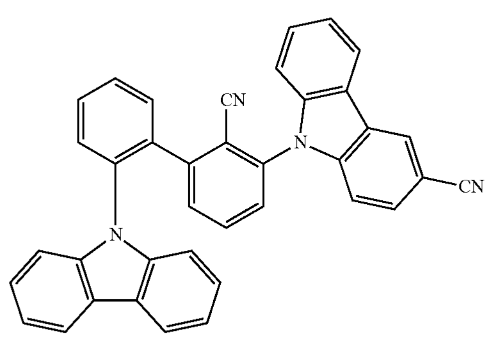

-continued
94
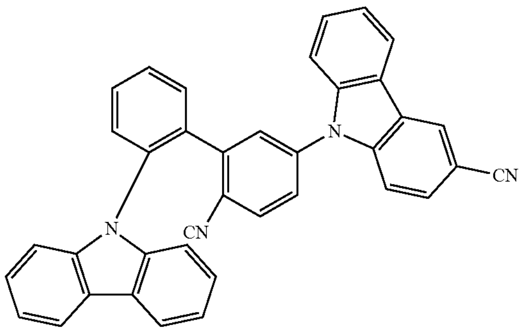
95
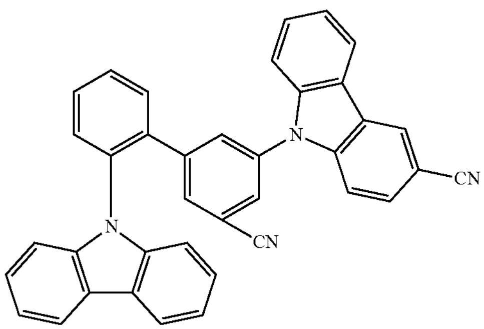
96
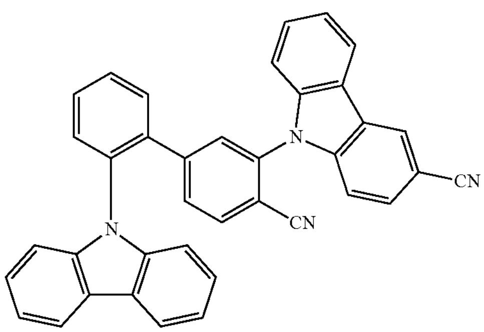
97
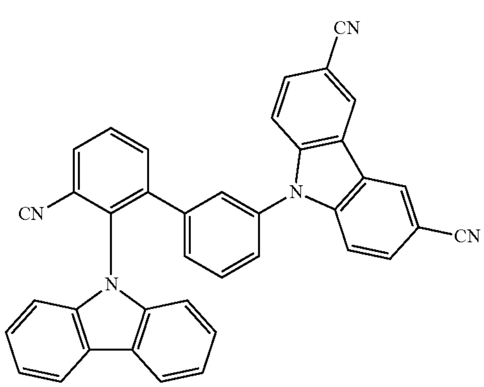
-continued
98
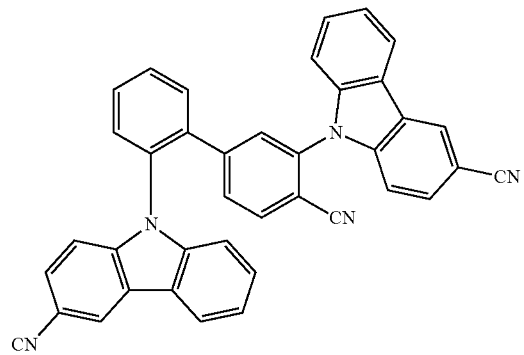
99
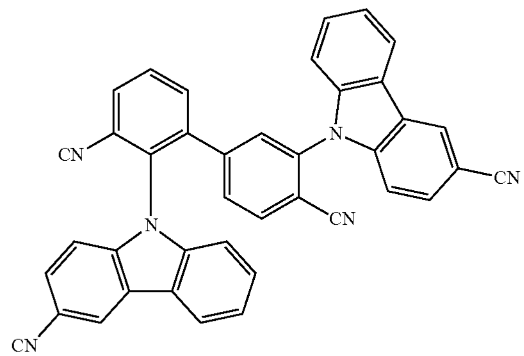
100
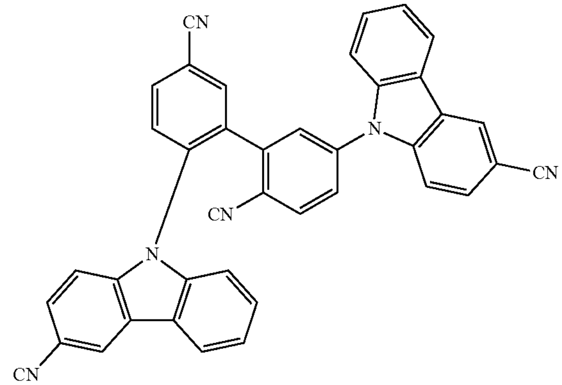
101
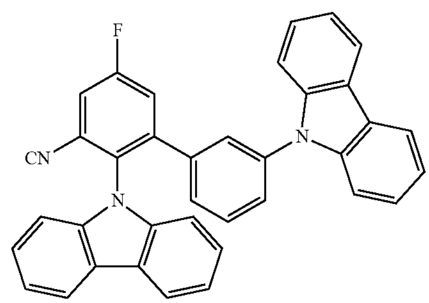

-continued
102
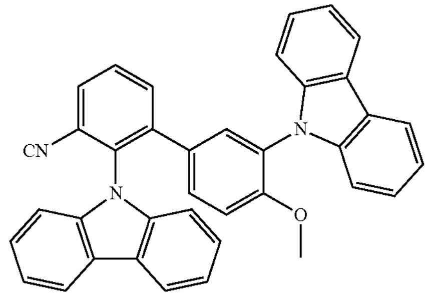
103
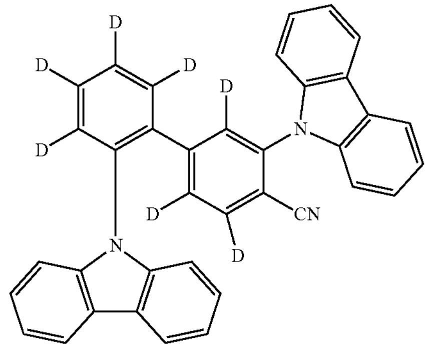
104
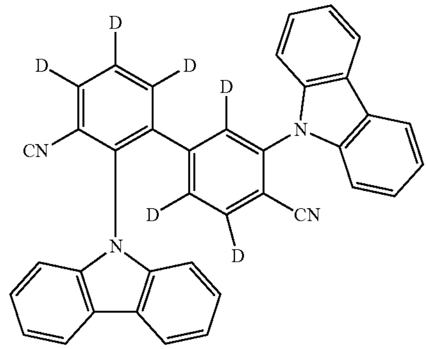
105
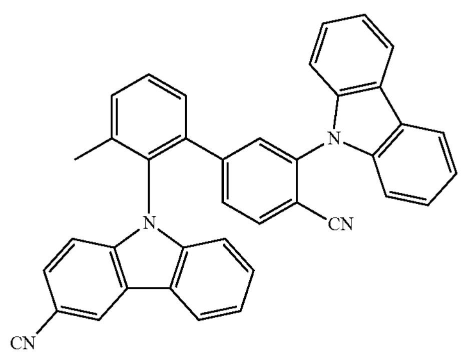
106
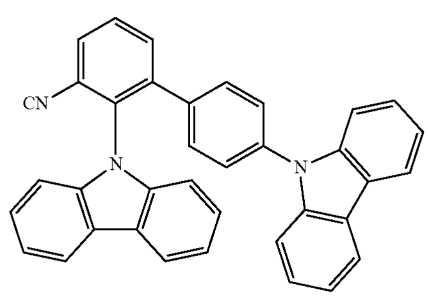
-continued
107
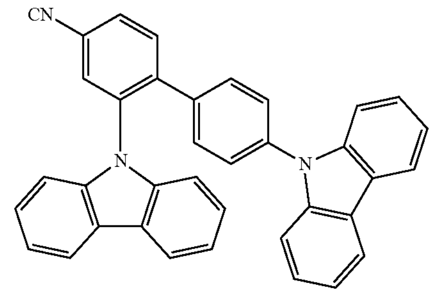
108
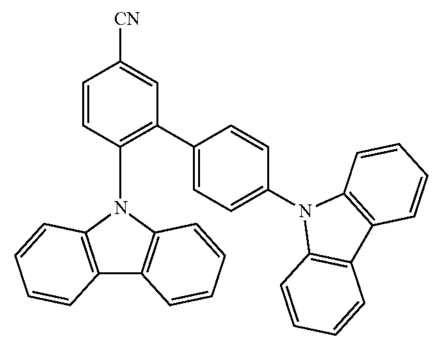
109
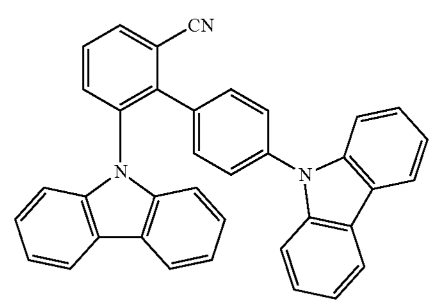
110
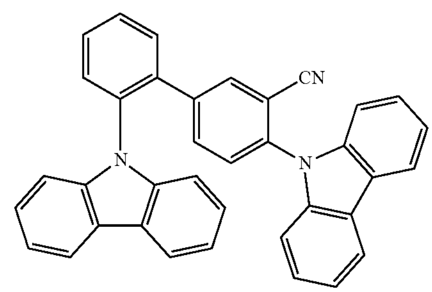
111
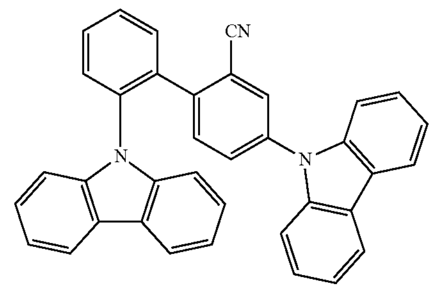

-continued
112
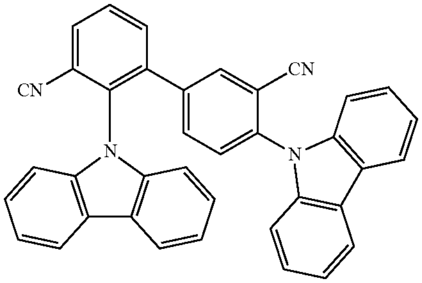
113
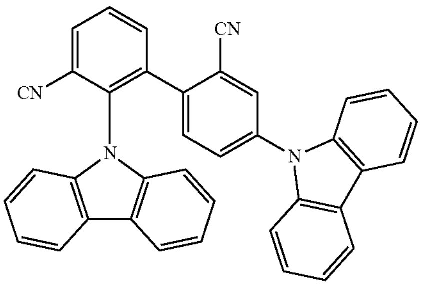
114
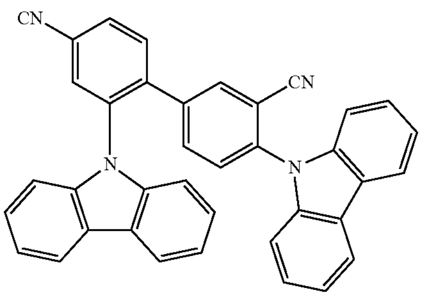
115
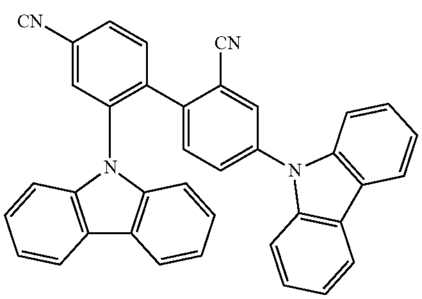
116
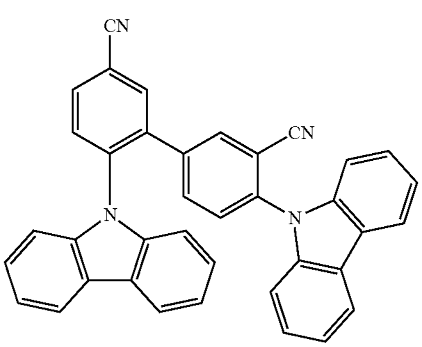
-continued
117
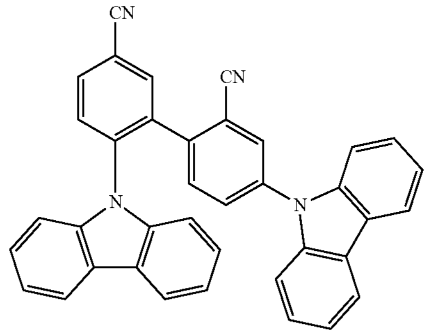
118
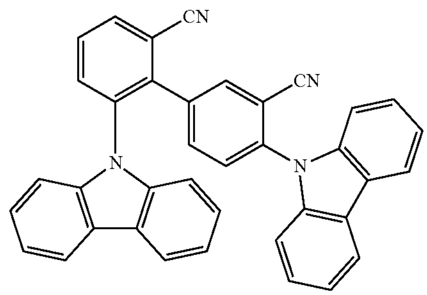
119
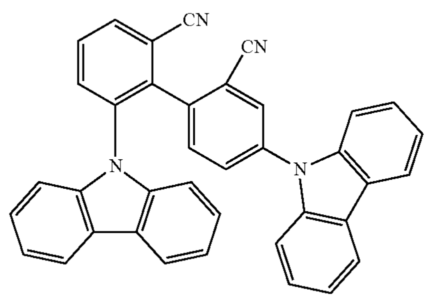
120
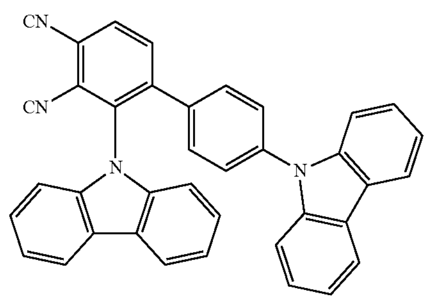
121
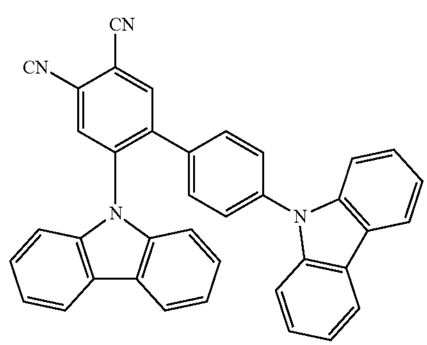

-continued
122
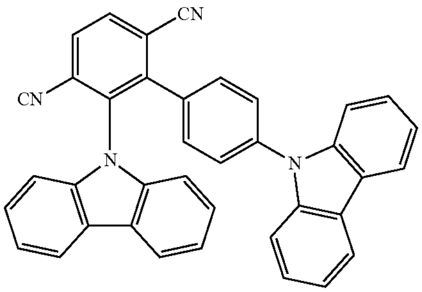
123
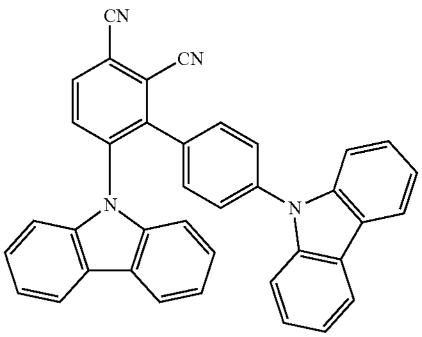
124
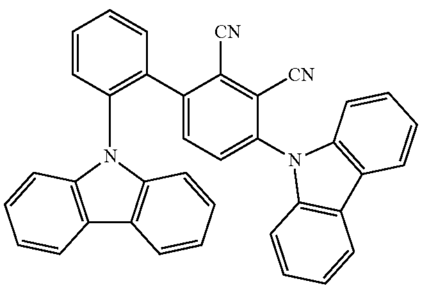
125
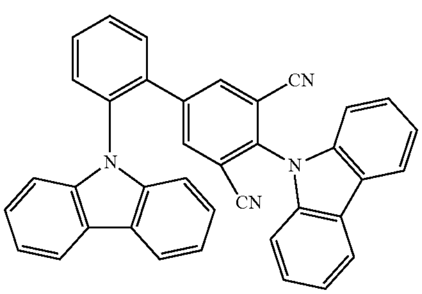
126
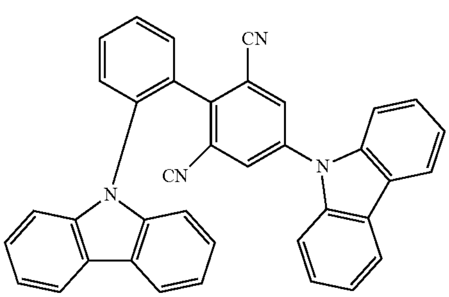
-continued
127
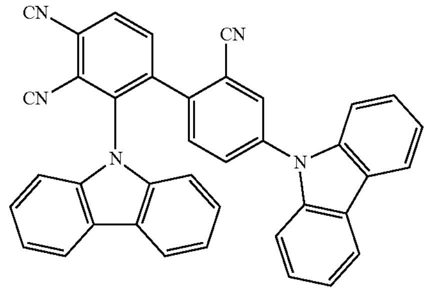
128
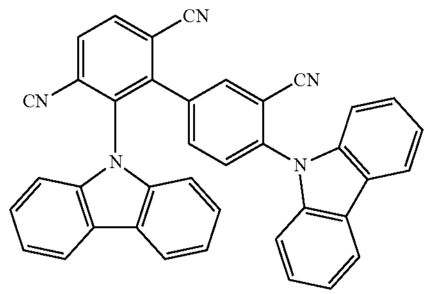
129
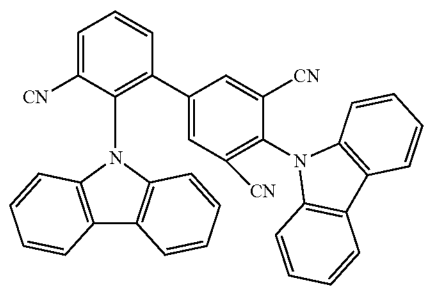
130
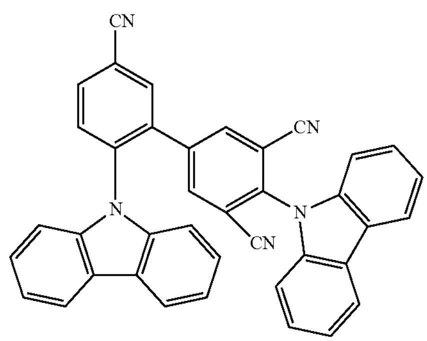
131
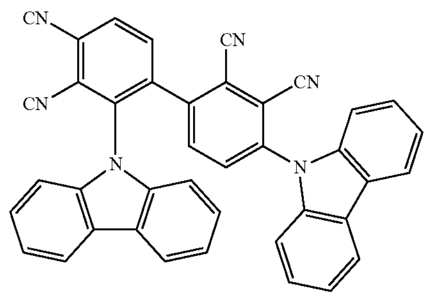

-continued
132
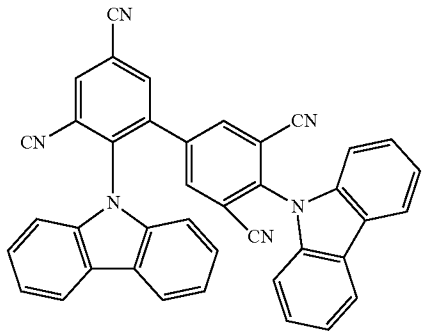
133
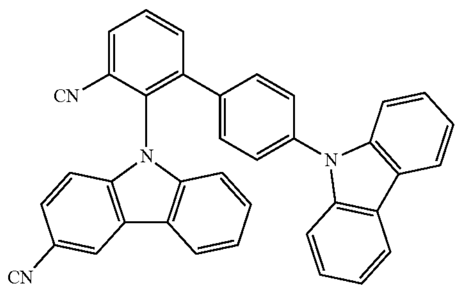
134
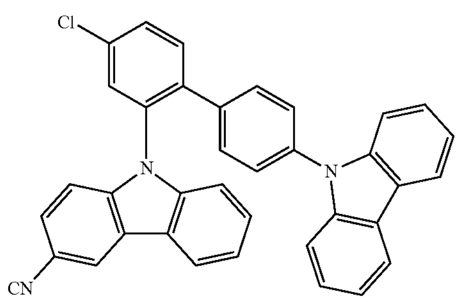
135
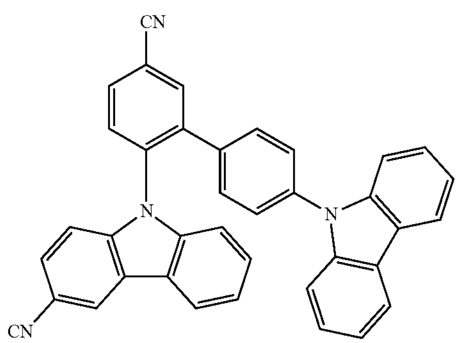
136
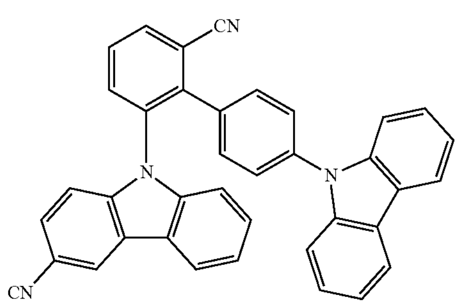
-continued
137
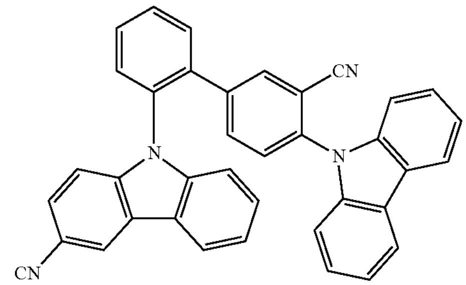
138
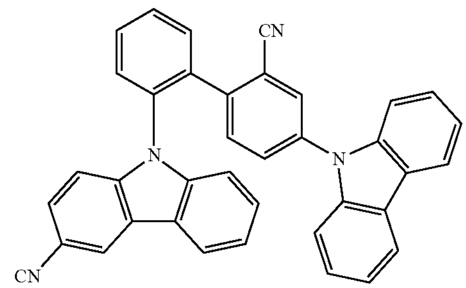
139
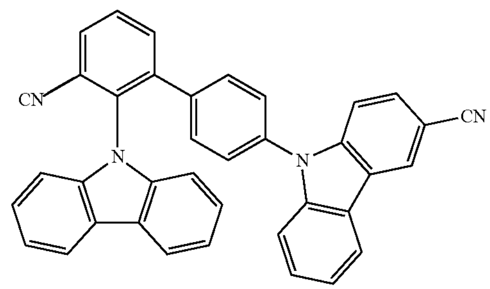
140
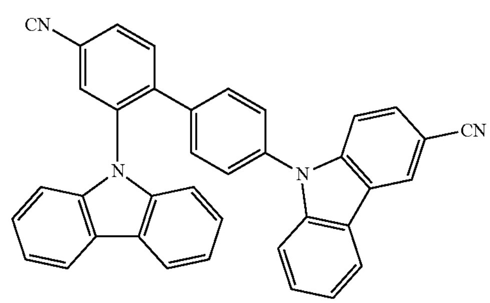
141
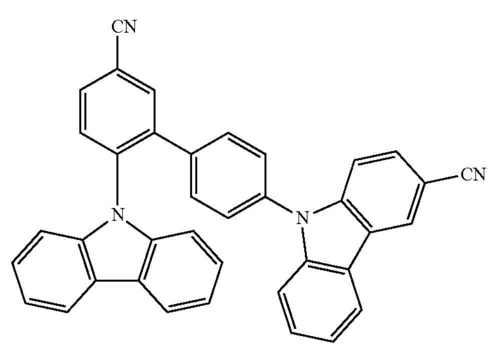

-continued
142
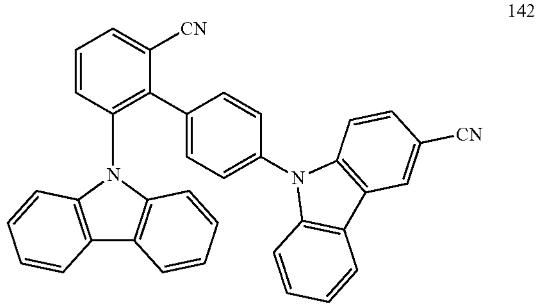
143
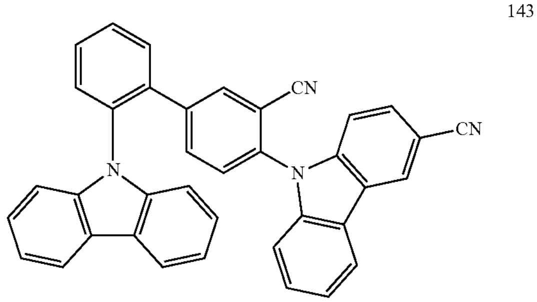
144
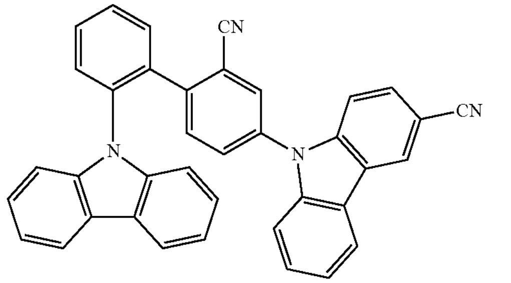
145
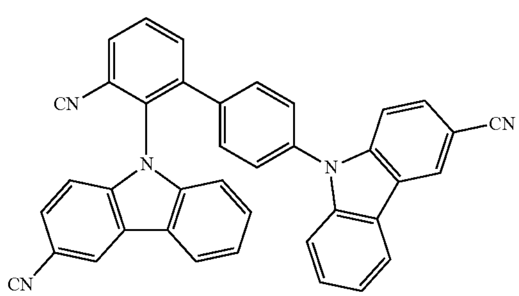
146
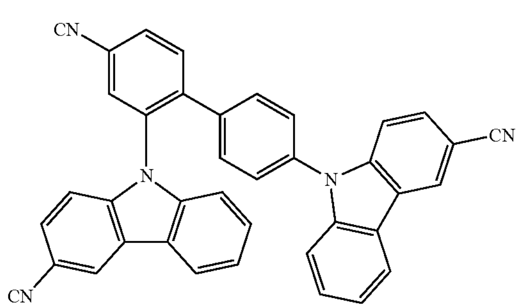
-continued
147
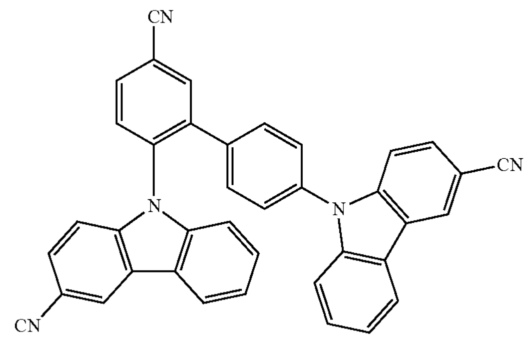
148
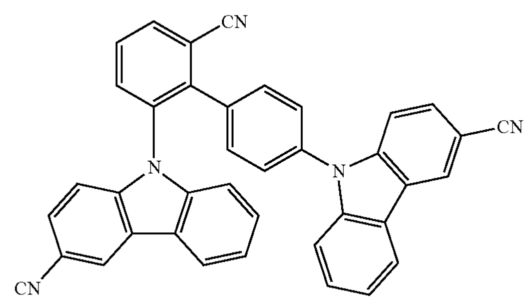
149
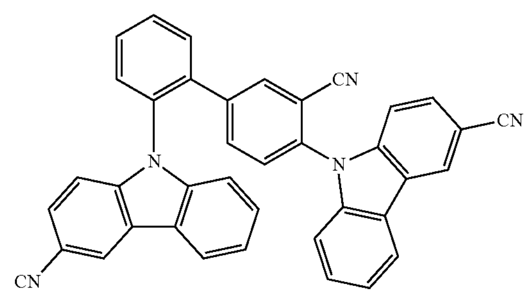
150
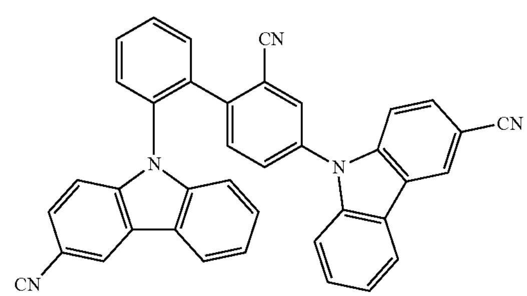
151
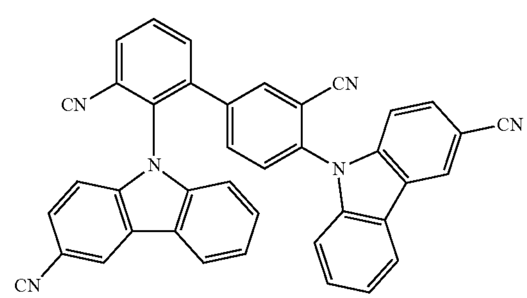

-continued
152
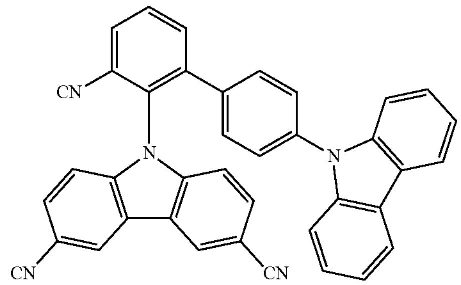
153
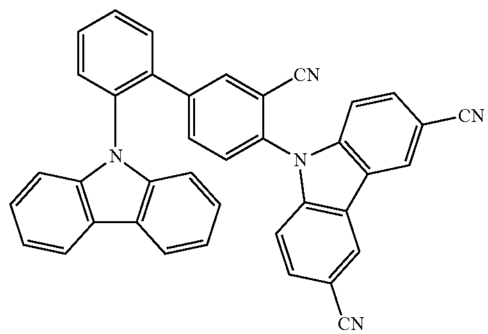
154
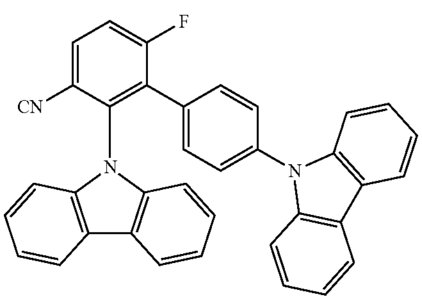
155
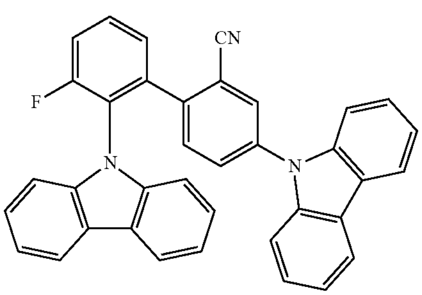
156
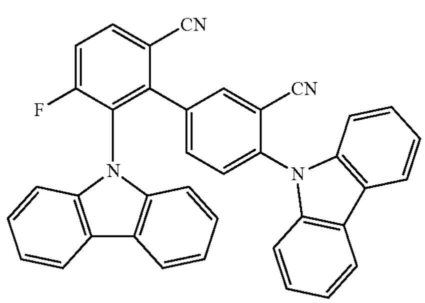
-continued
157
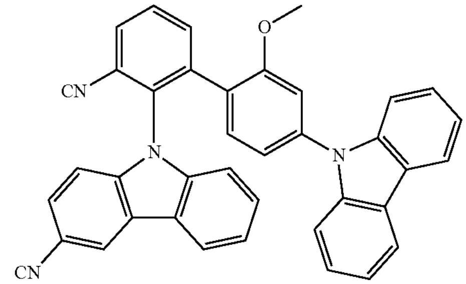
158
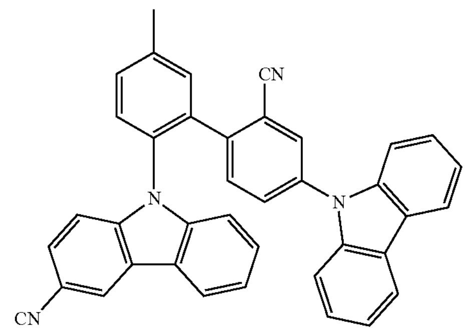
159
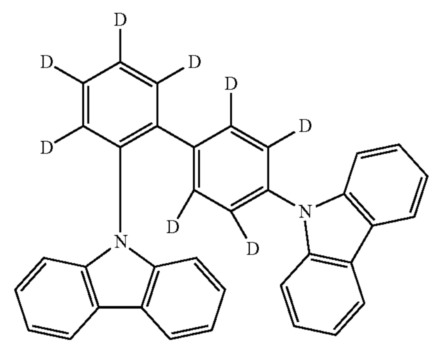
160
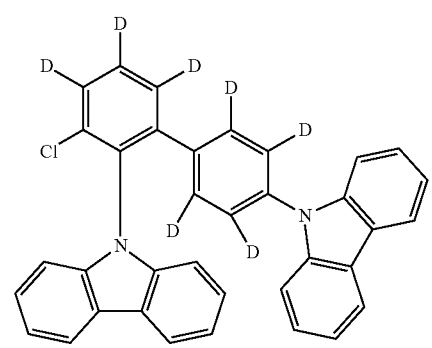
161
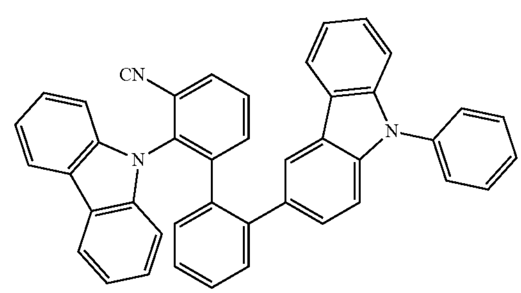

-continued
162
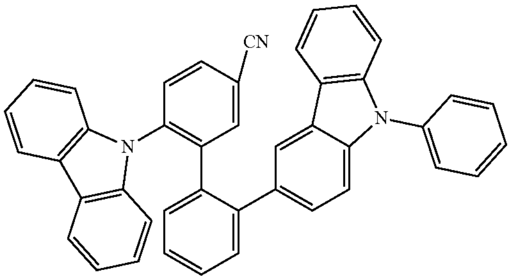
163
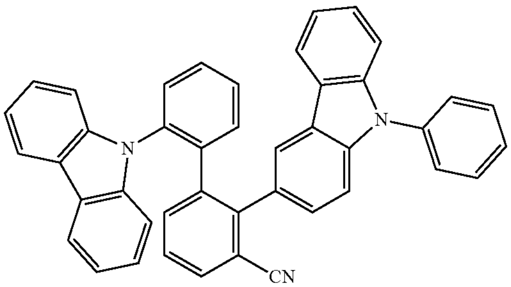
164
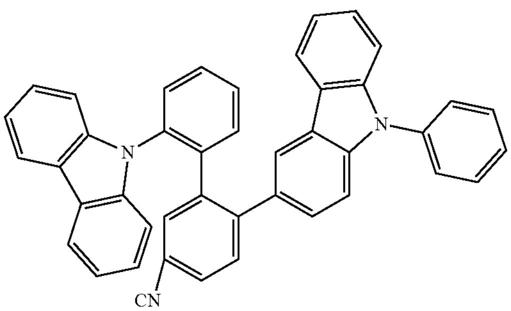
165
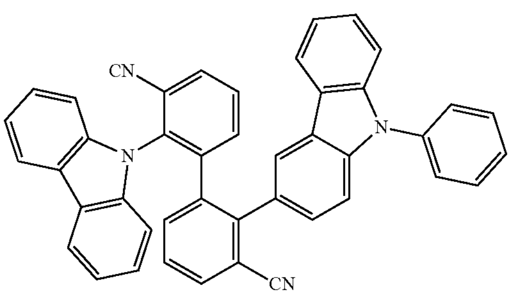
166
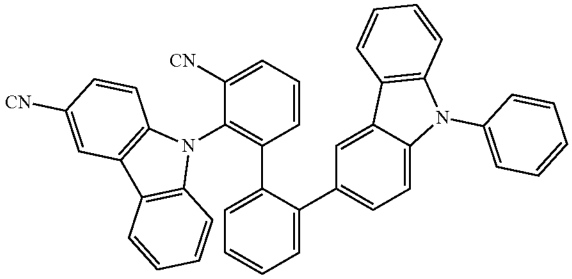
-continued
167
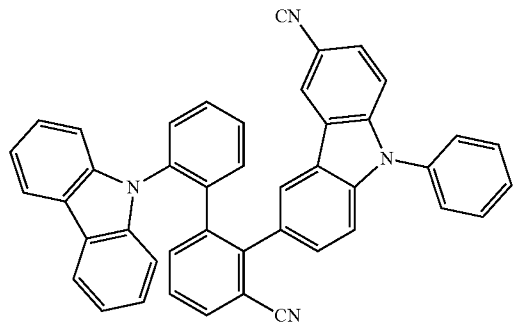
168
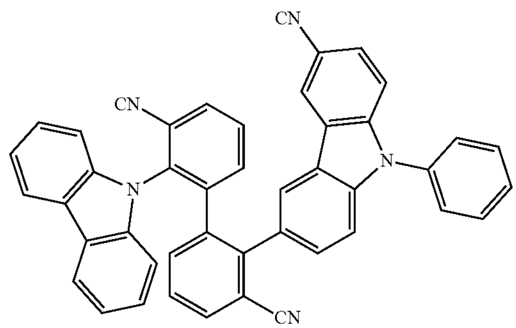
169
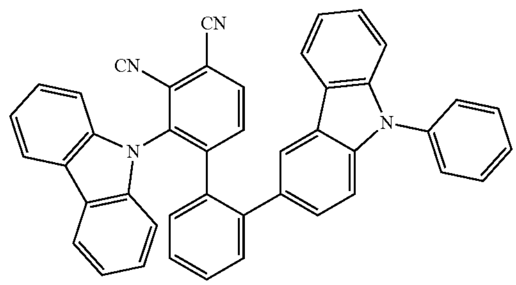
170
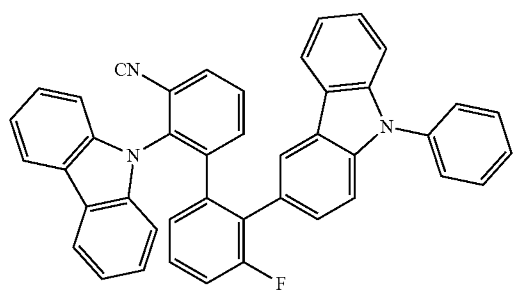
171
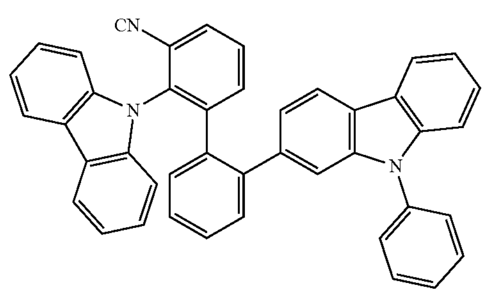

-continued
172
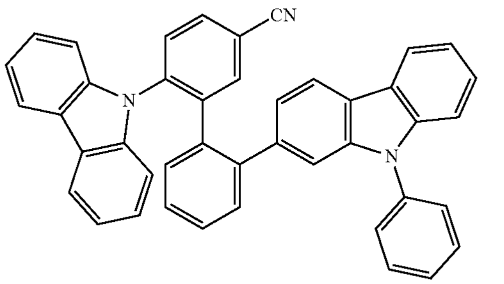
173
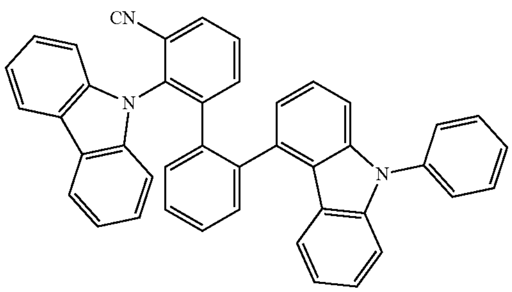
174
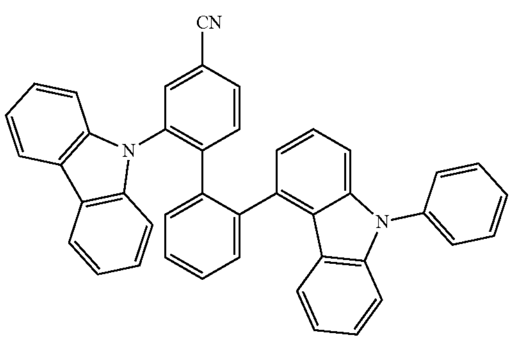
175
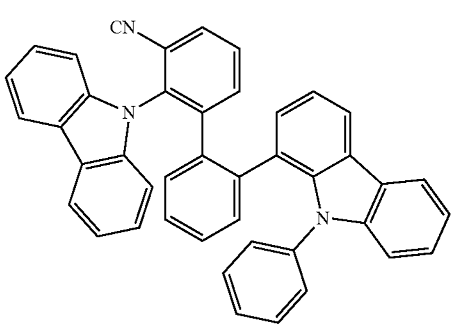
-continued
176
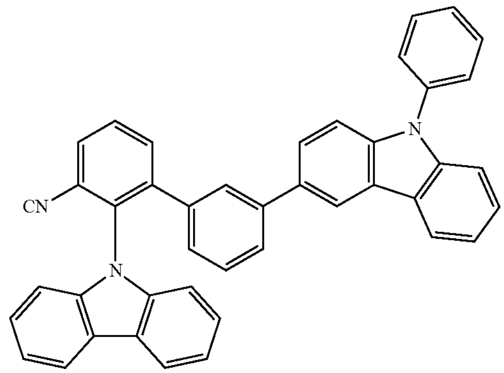
177
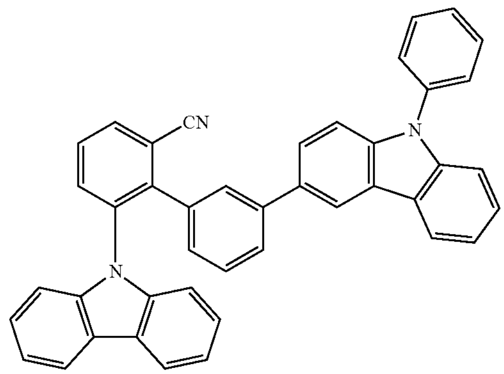
178
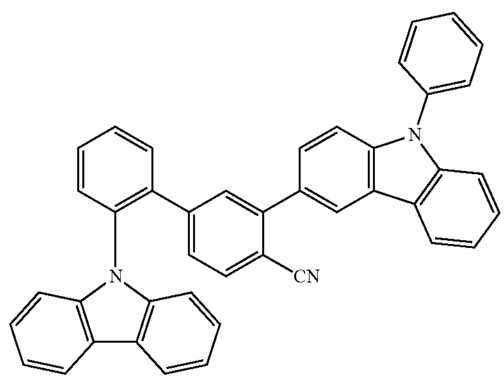
179
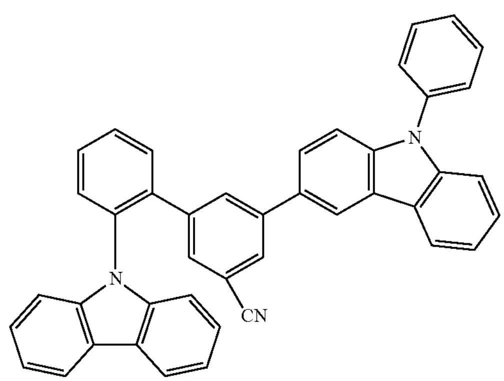

180
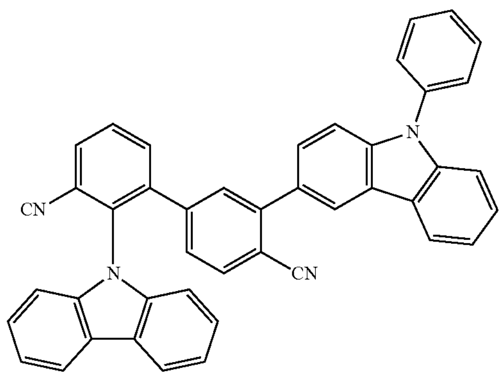
181
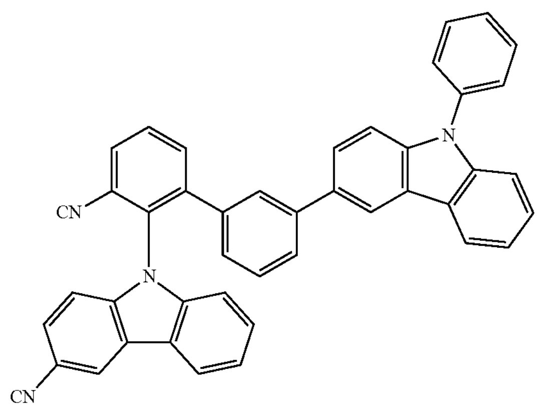
182
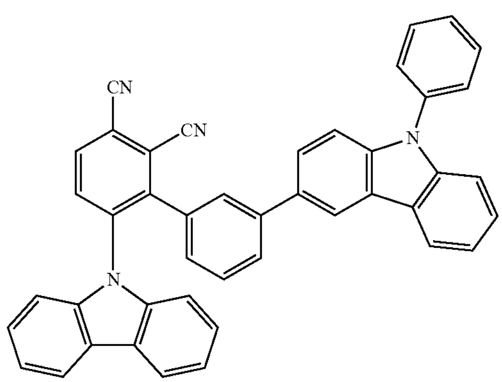
183
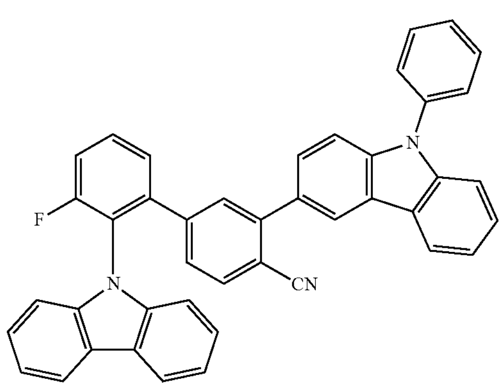
184
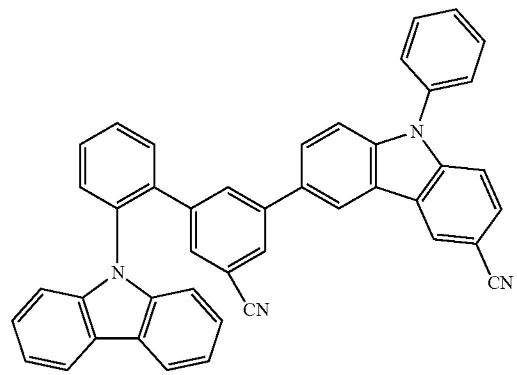
185
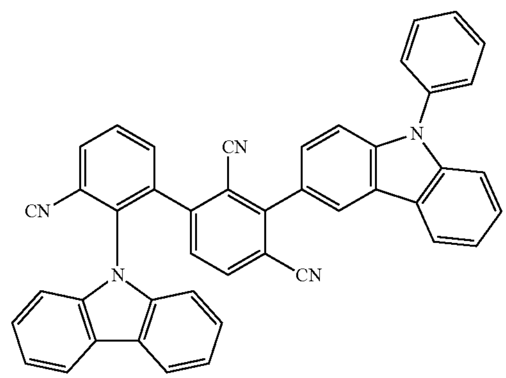
186
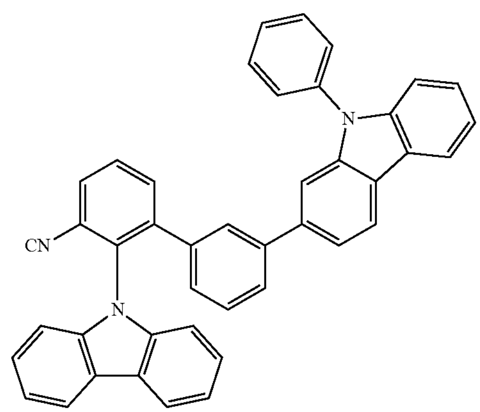
187
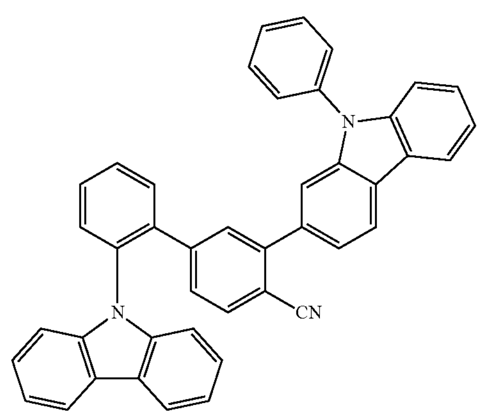

-continued
188
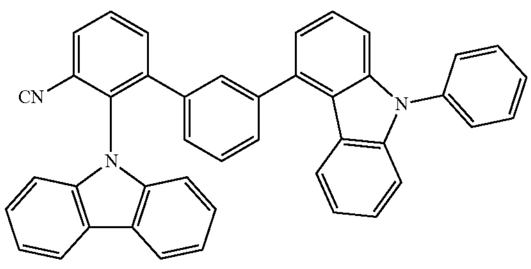
189
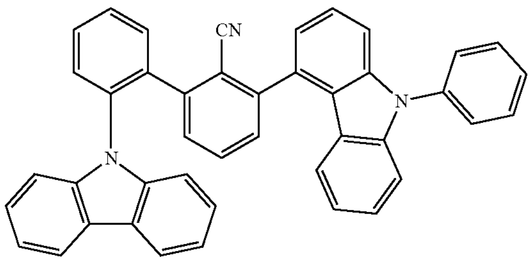
190
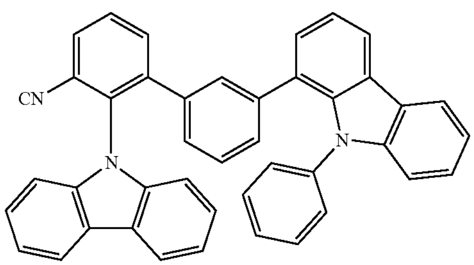
191
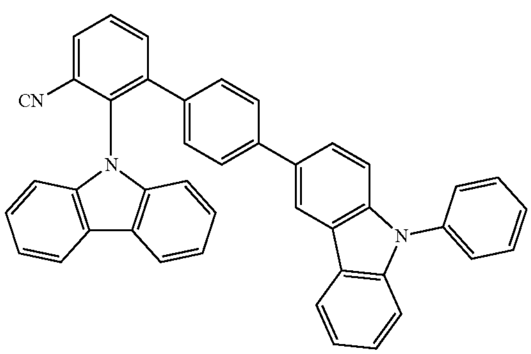
192
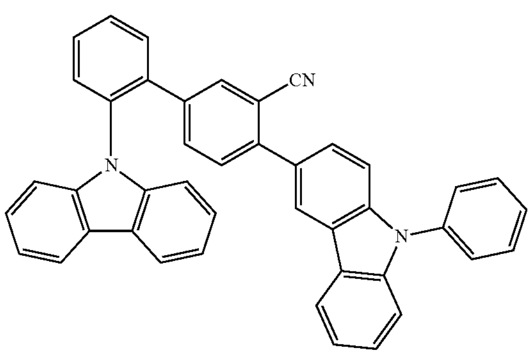
-continued
193
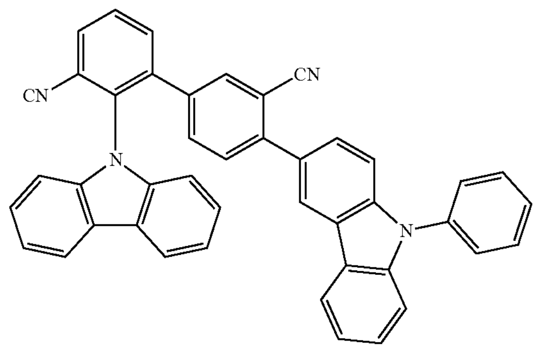
194
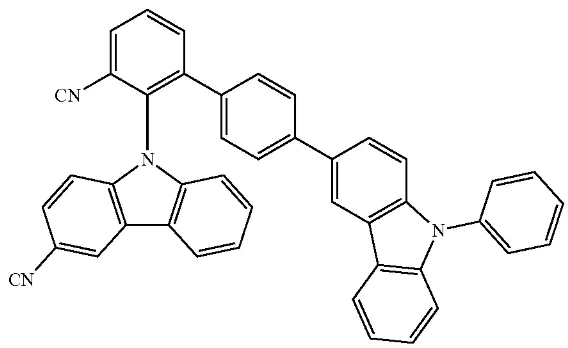
195
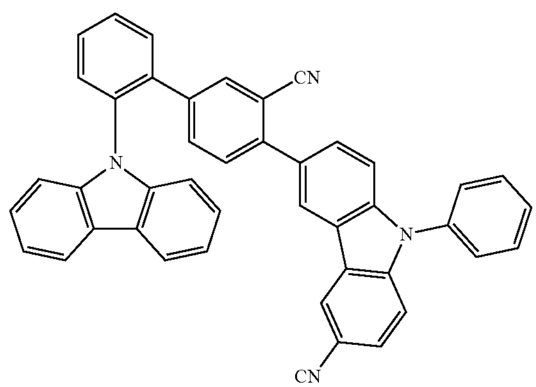
196
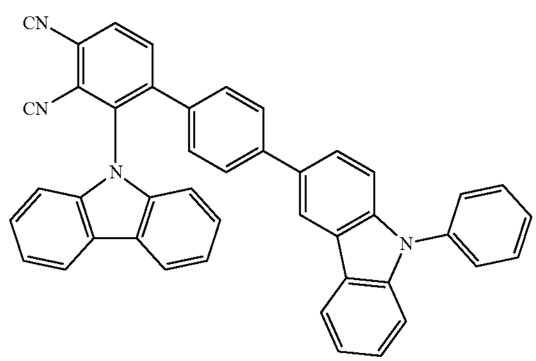

-continued
197
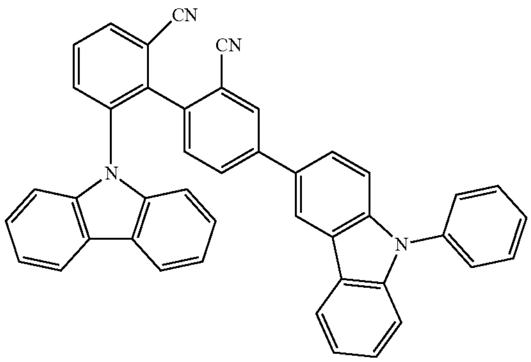
198
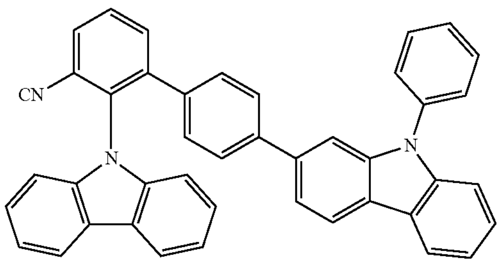
199
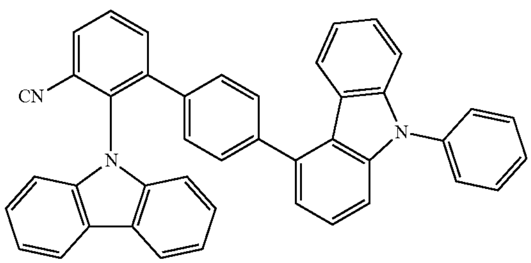
200
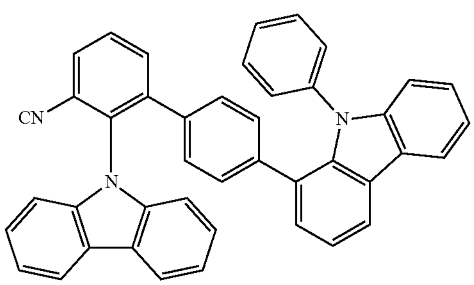
201
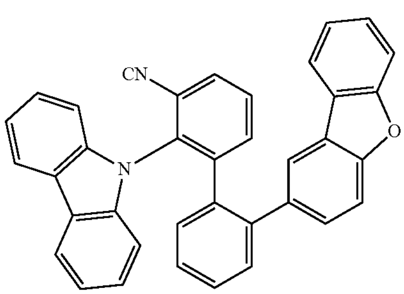
-continued
202
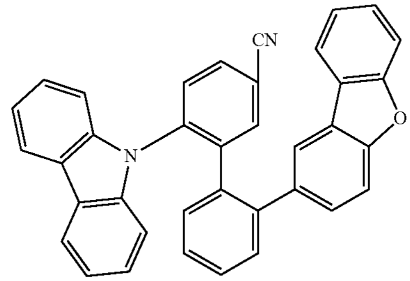
203
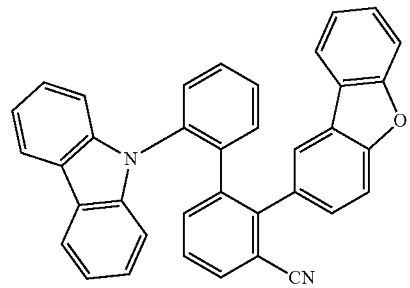
204
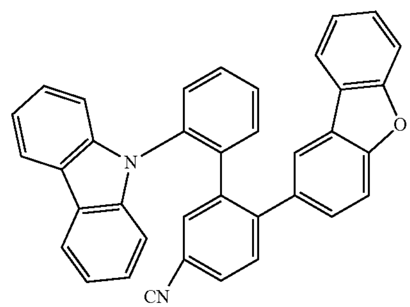
205
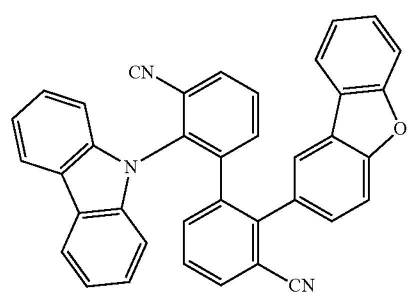
206
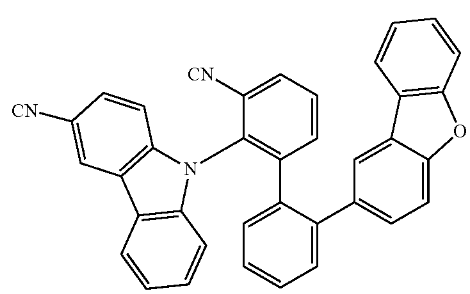

-continued
207
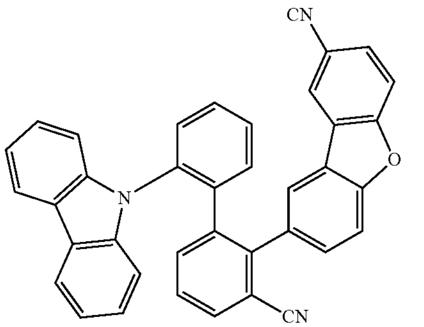
208
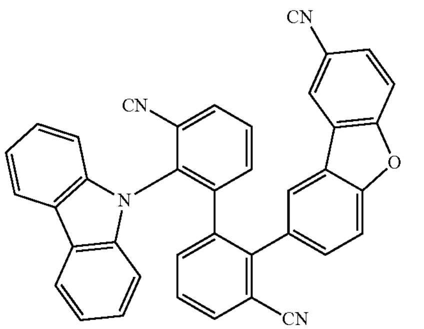
209
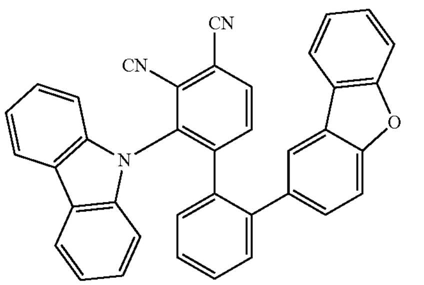
210
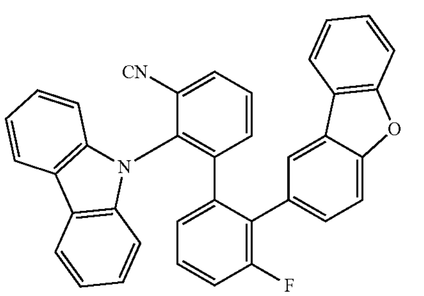
211
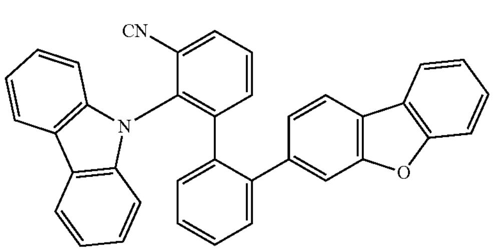
-continued
212
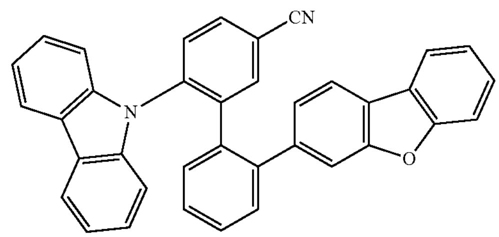
213
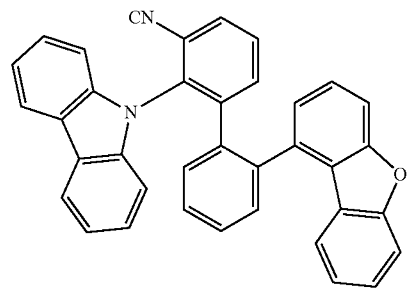
214
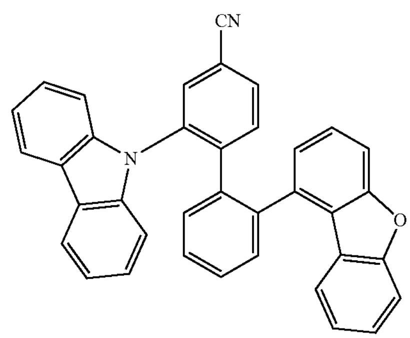
215
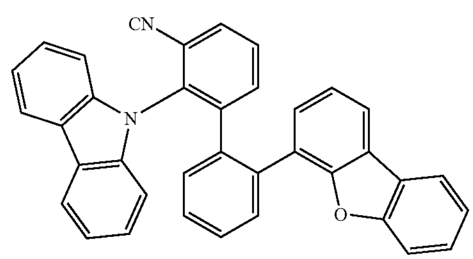
216
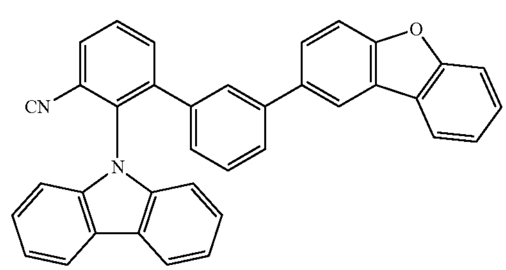

217
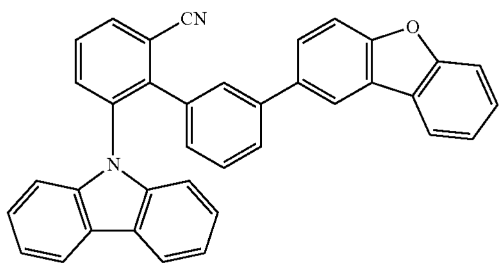
218
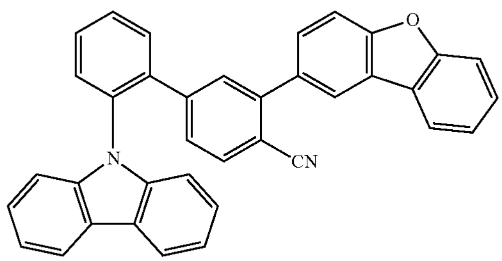
219
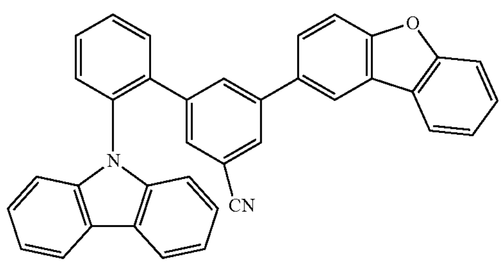
220
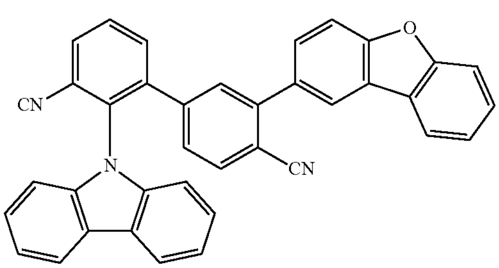
221
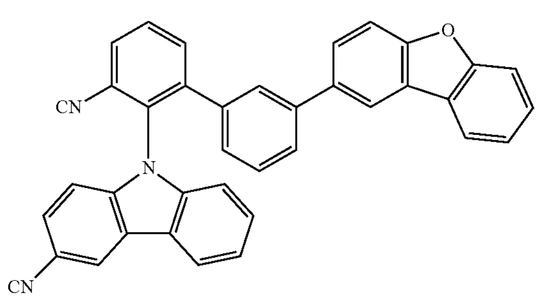
222
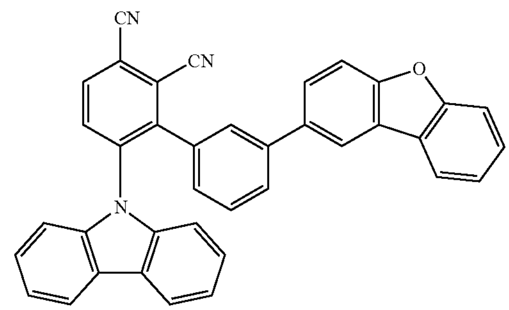
223
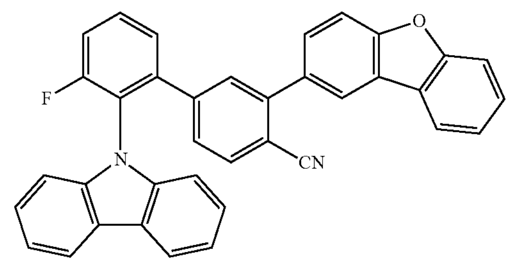
224
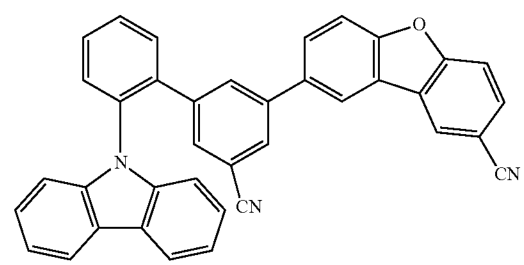
225
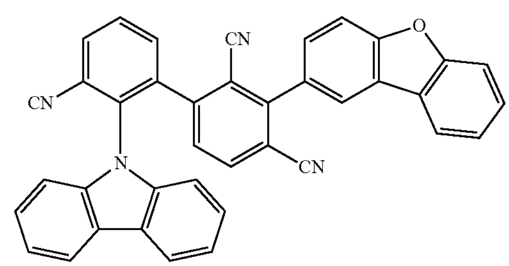
226
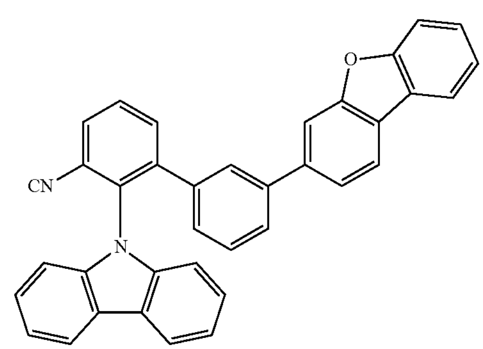

-continued
227
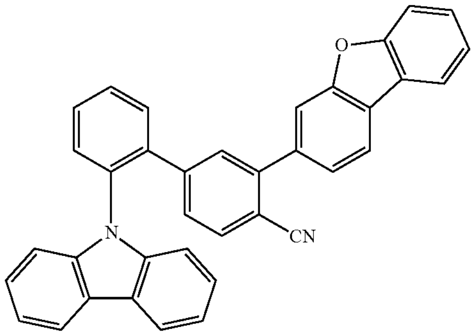
228
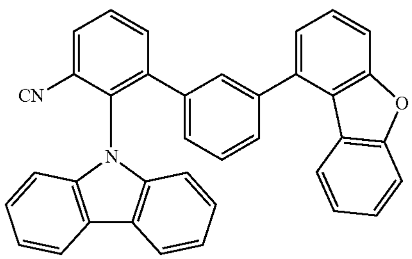
229
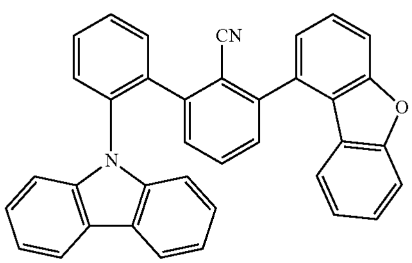
230
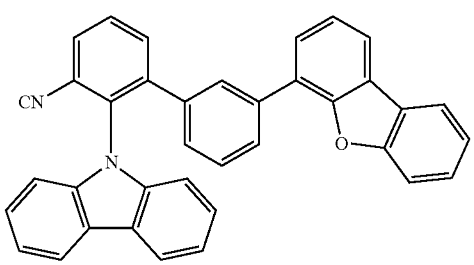
231
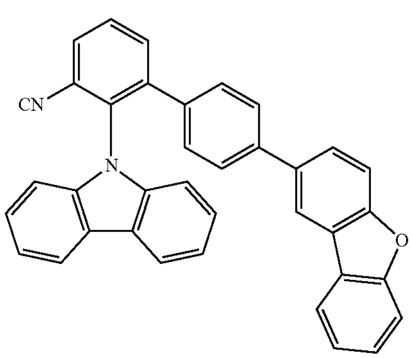
-continued
232
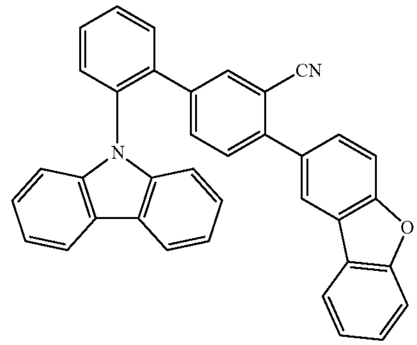
233
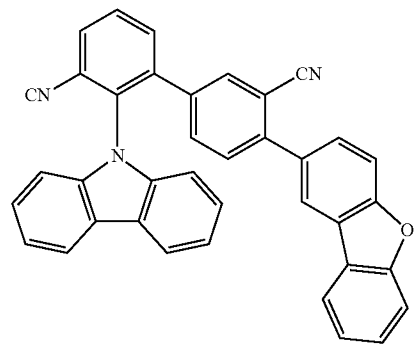
234
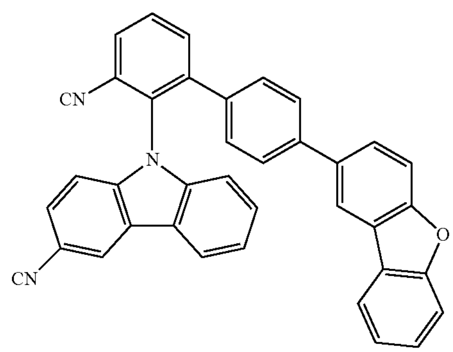
235
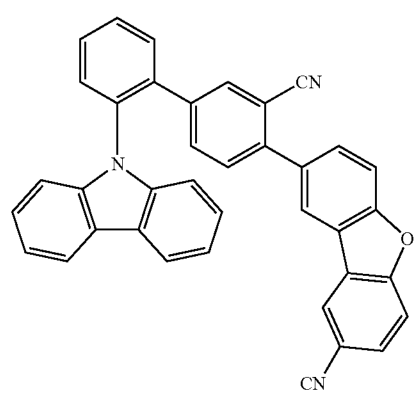

-continued
236
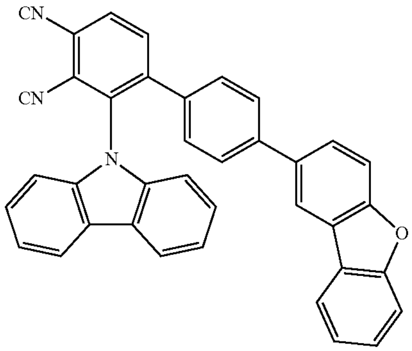
237
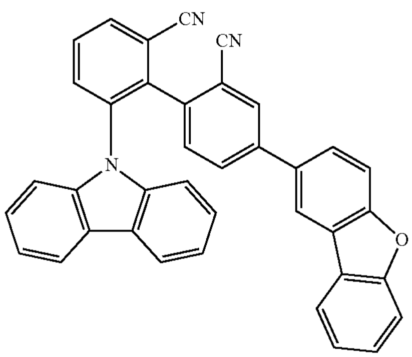
238
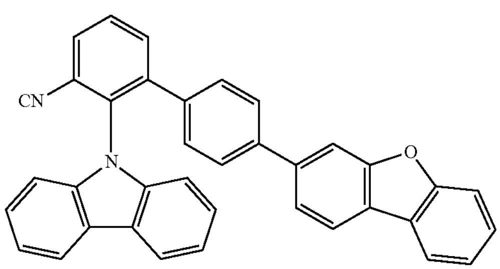
239
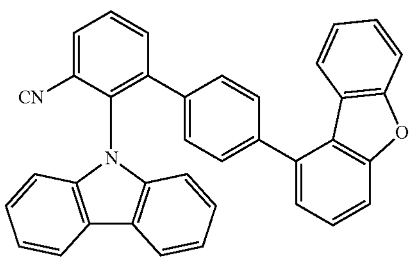
240
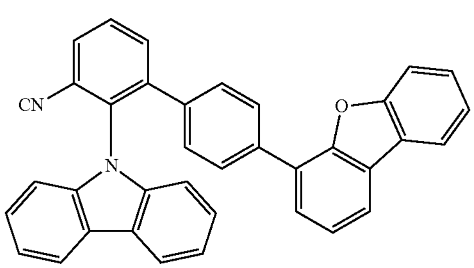
-continued
241
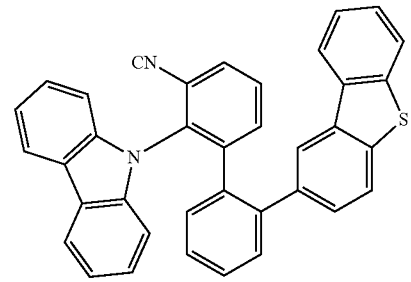
242
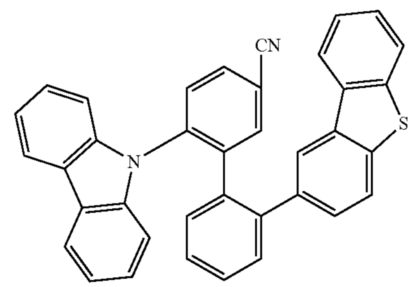
243
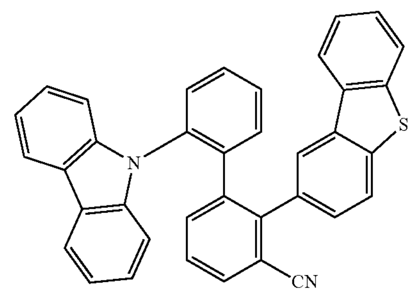
244
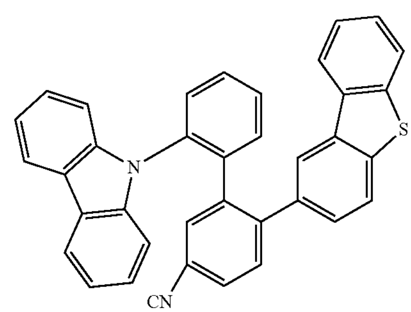
245
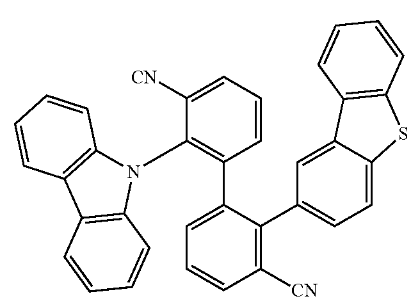

-continued
246
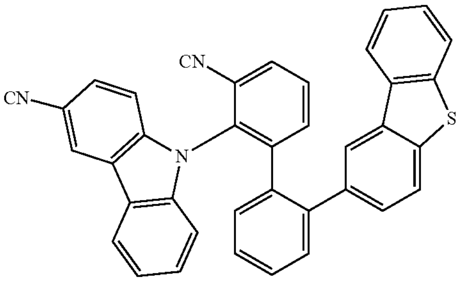
247
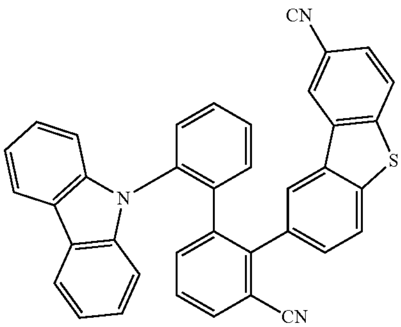
248
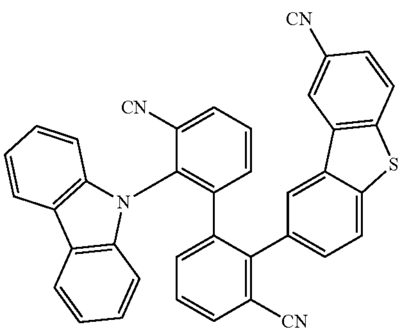
249
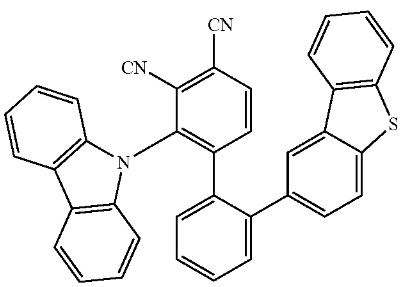
250
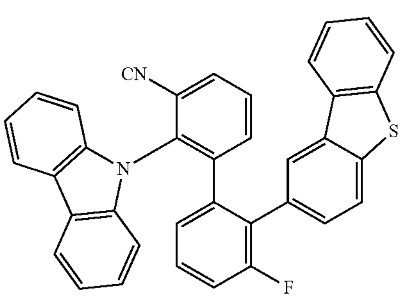
-continued
251
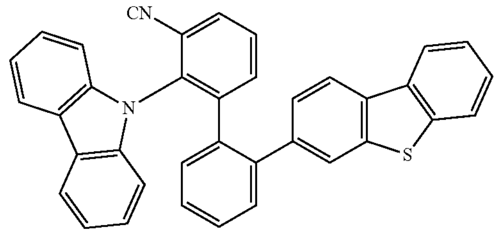
252
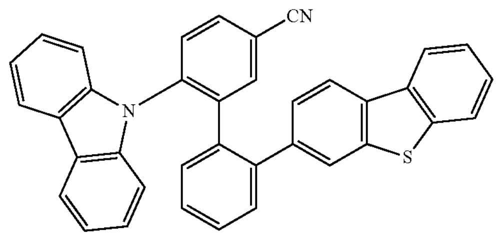
253
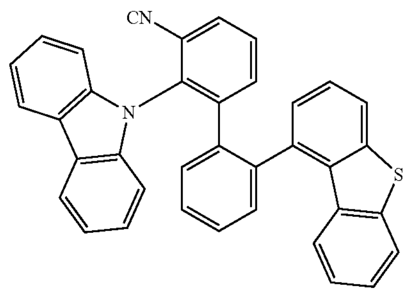
254
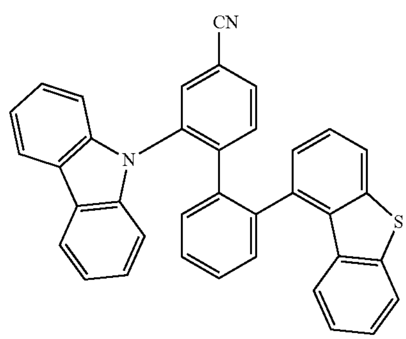
255
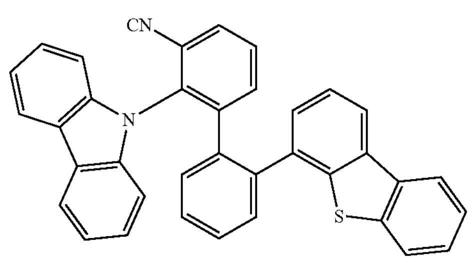

-continued
256
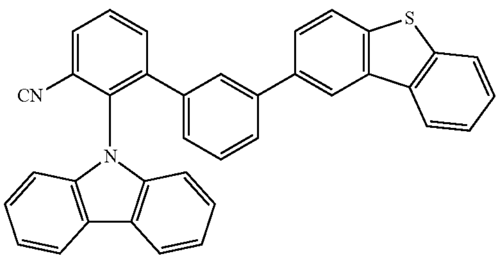
257
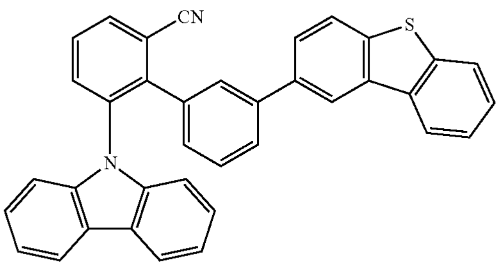
258
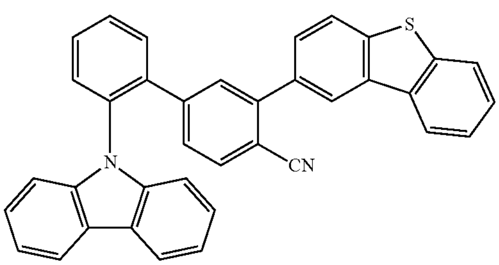
259
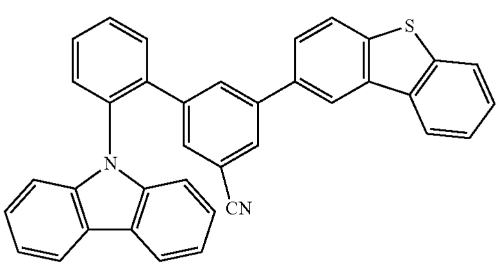
260
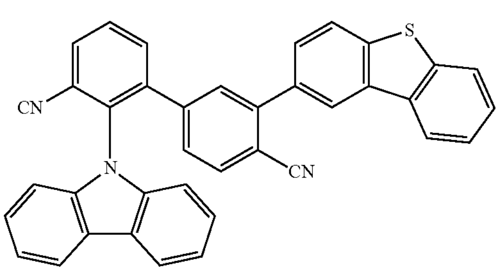
-continued
261
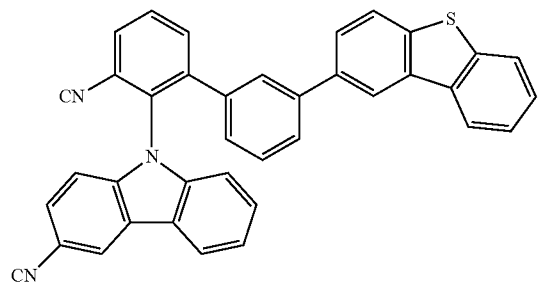
262
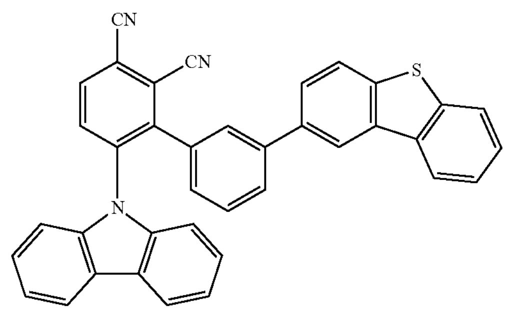
263
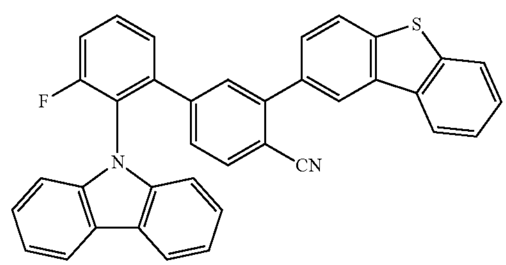
264
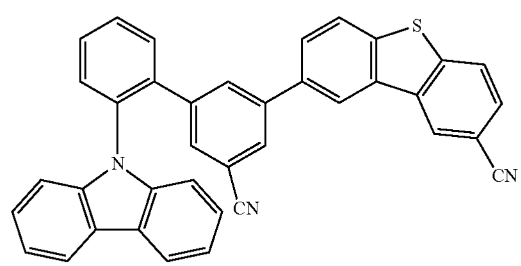
265
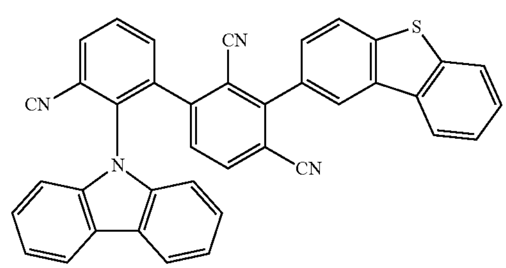

-continued
266
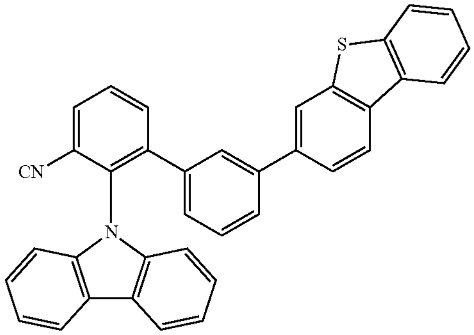
267
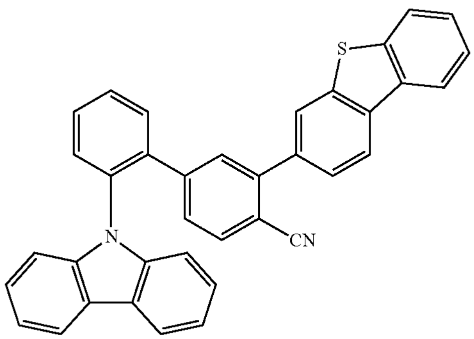
268
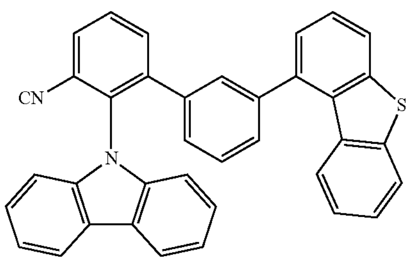
269
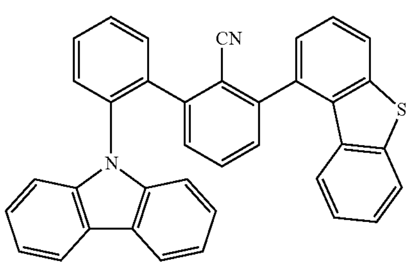
270
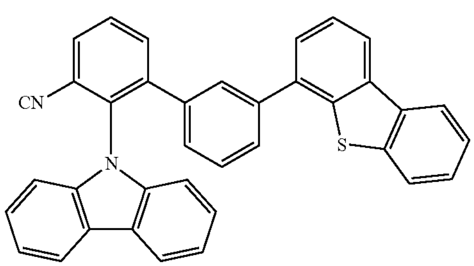
-continued
271
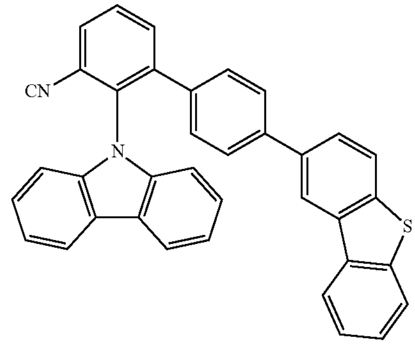
272
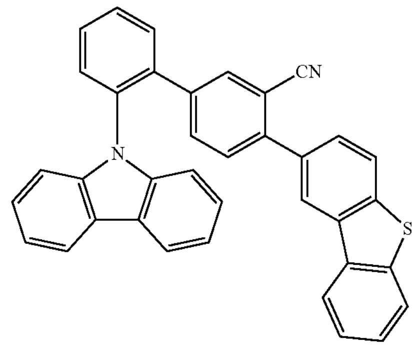
273
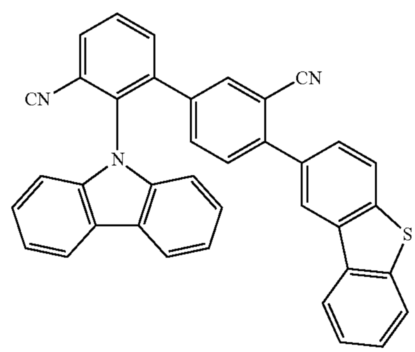
274
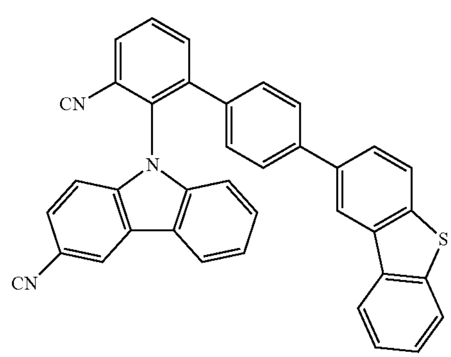

-continued
275
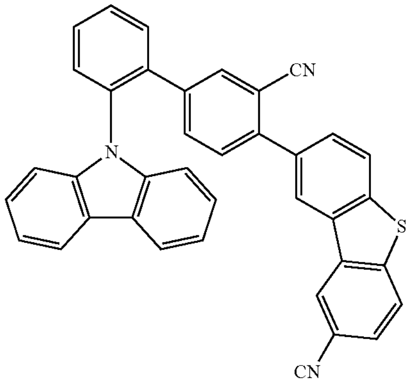
276
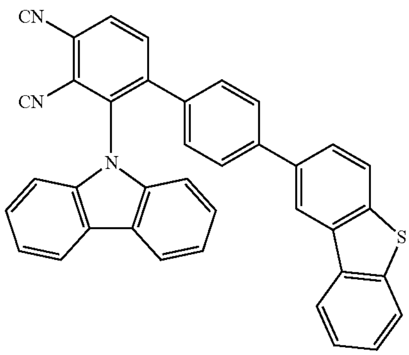
277
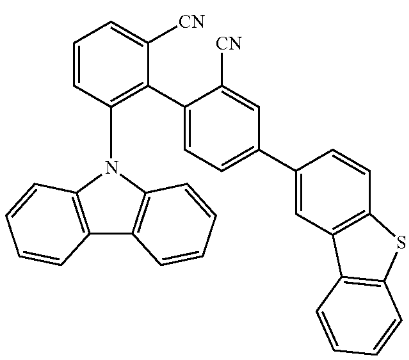
278
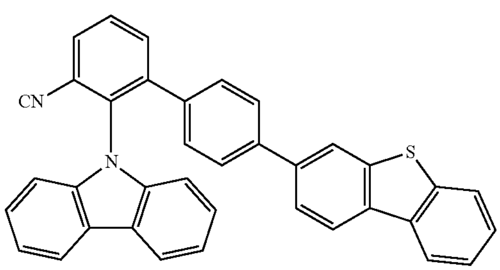
279
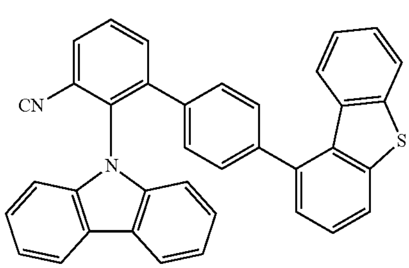
-continued
280
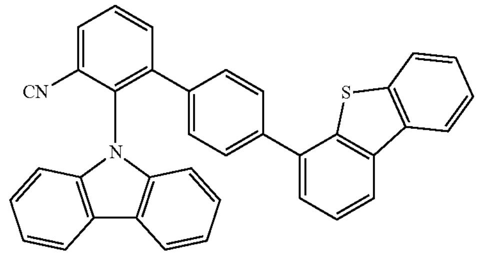
281
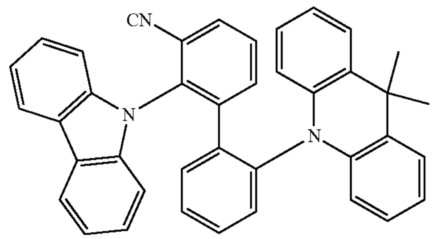
282
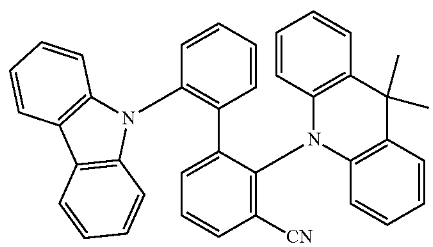
283
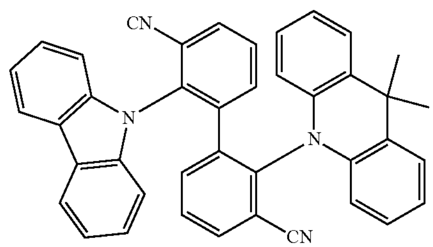
284
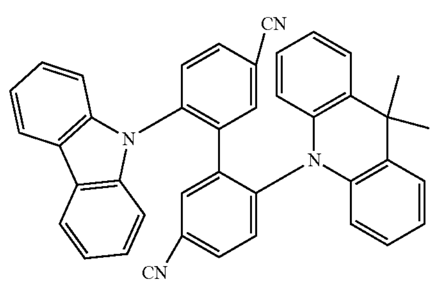
285
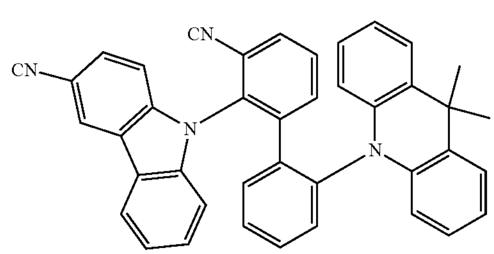

-continued
286
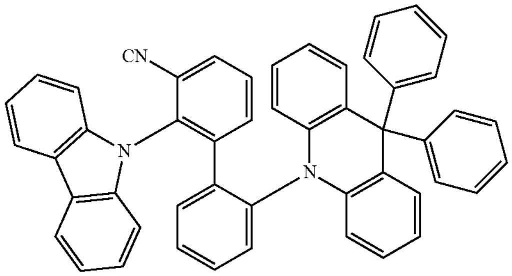
287
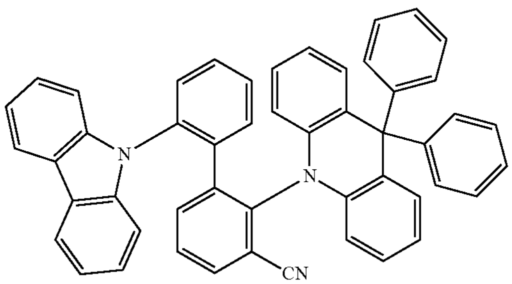
288
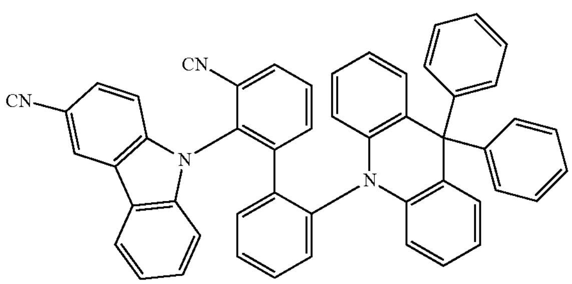
289
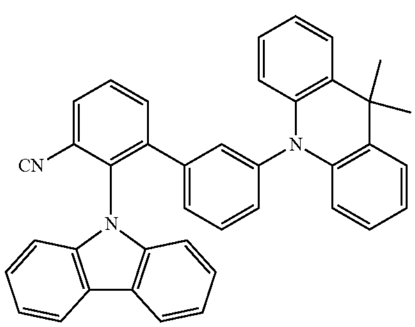
290
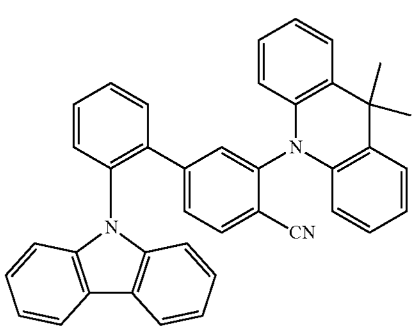
-continued
291
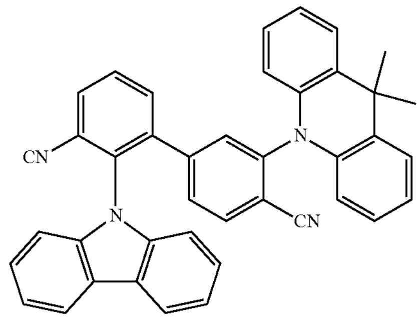
292
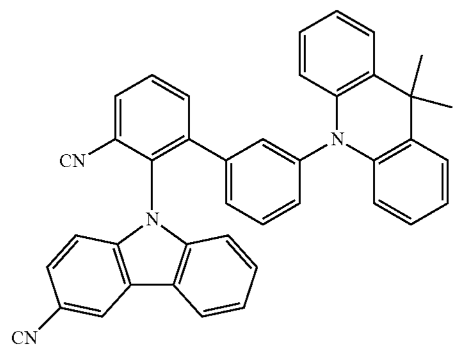
293
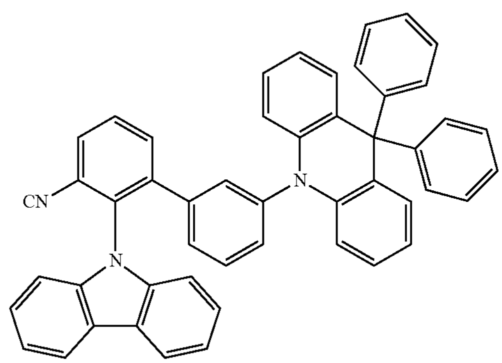
294
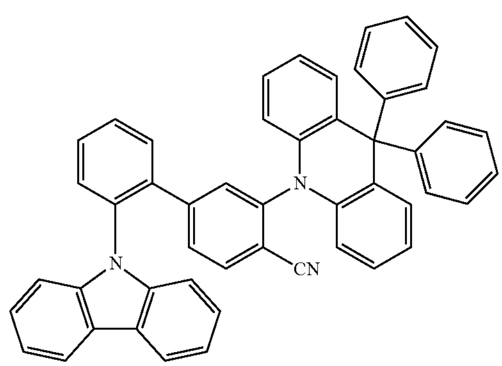

-continued
295
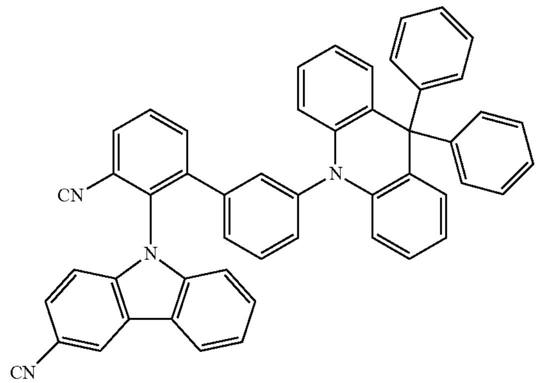
296
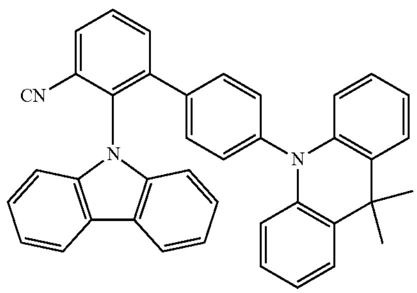
297
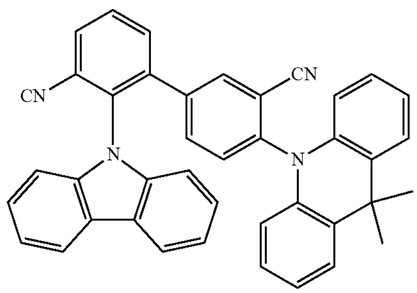
298
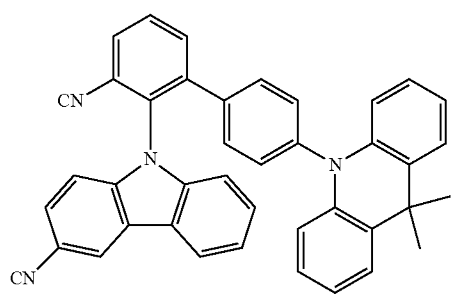
299
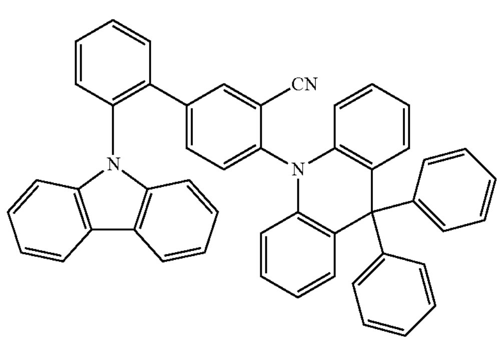
-continued
300
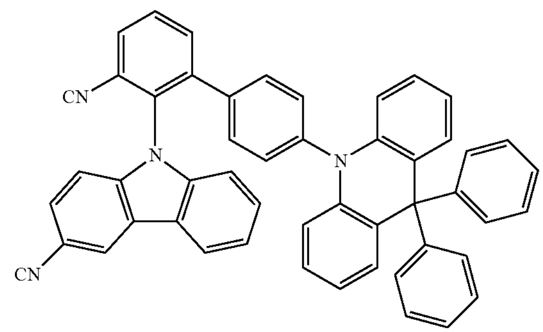
301
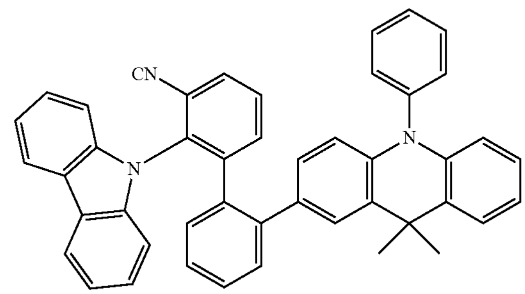
302
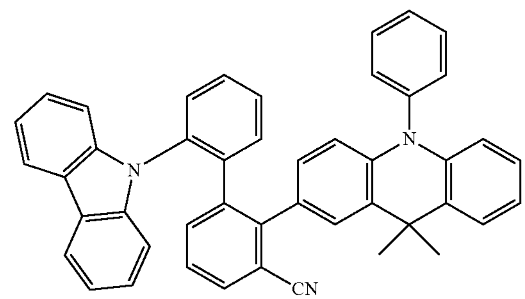
303
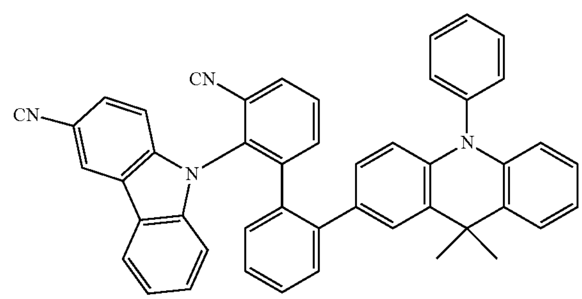
304
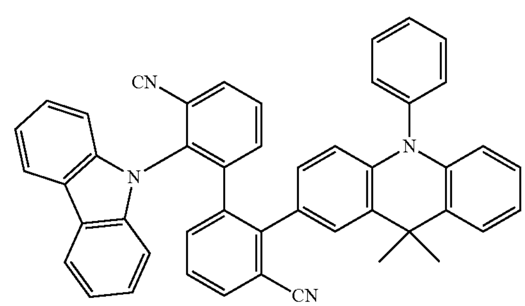

-continued
305
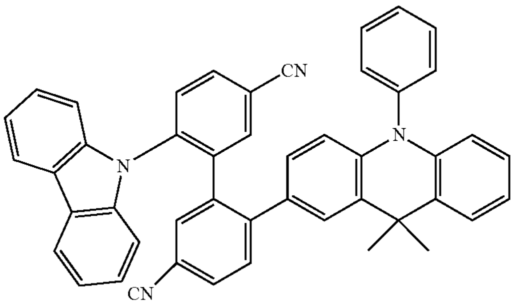
306
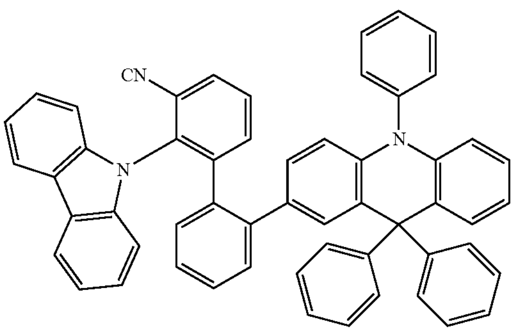
307
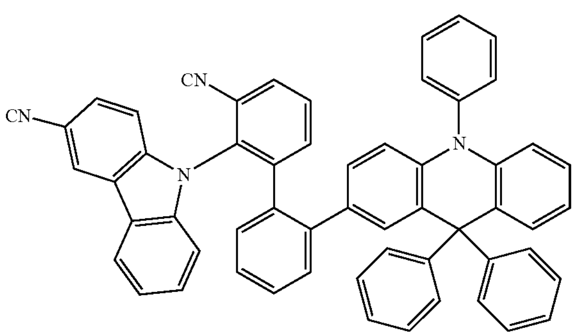
308
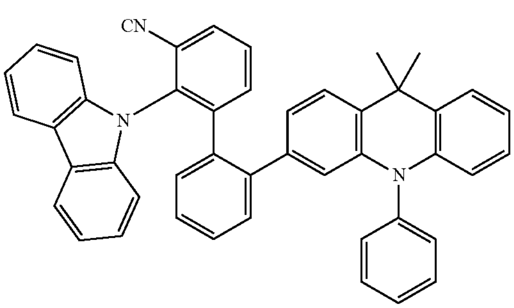
-continued
309
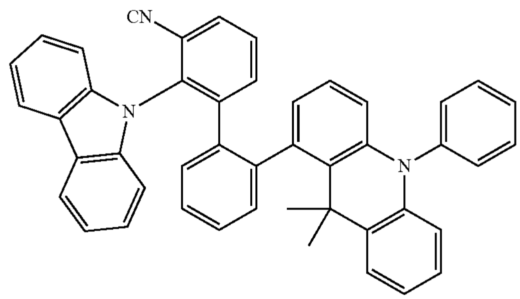
310
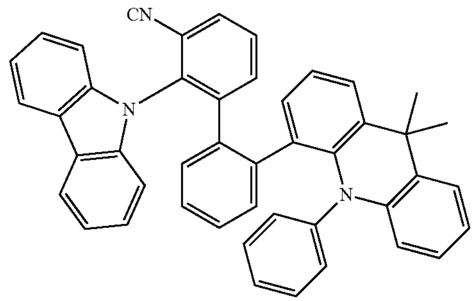
311
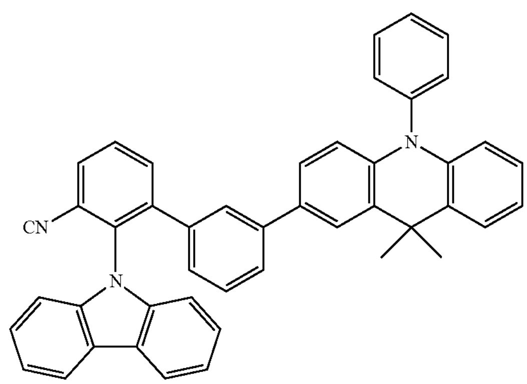
312
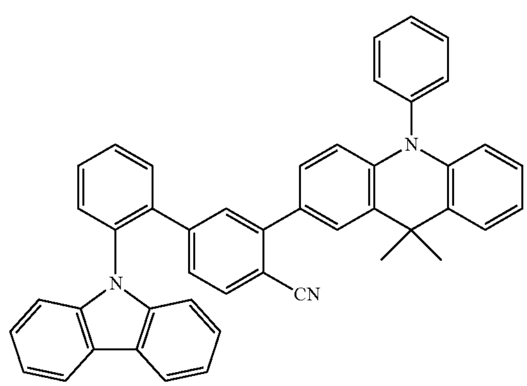

-continued
313
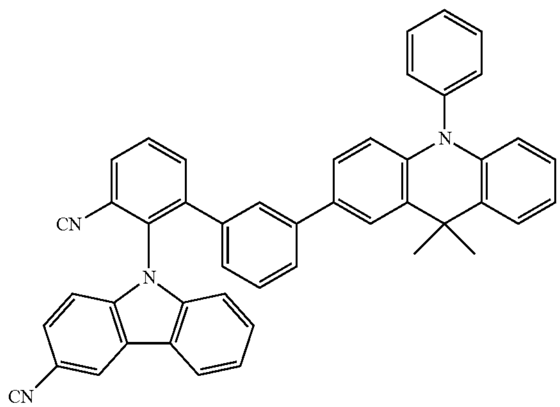
314
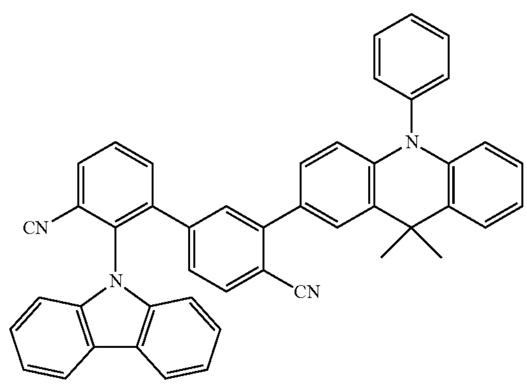
315
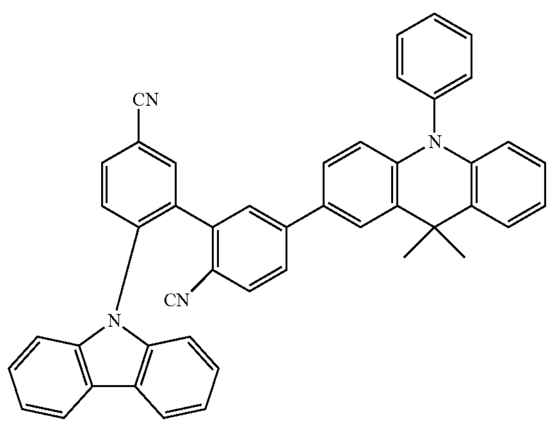
316
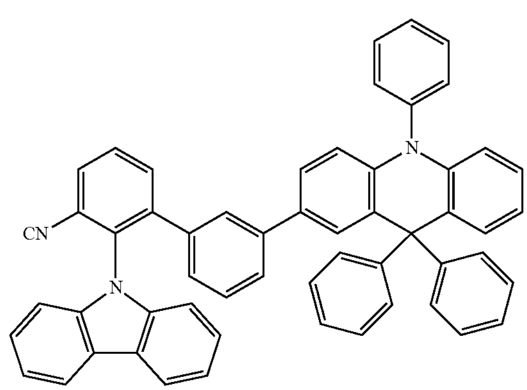
-continued
317
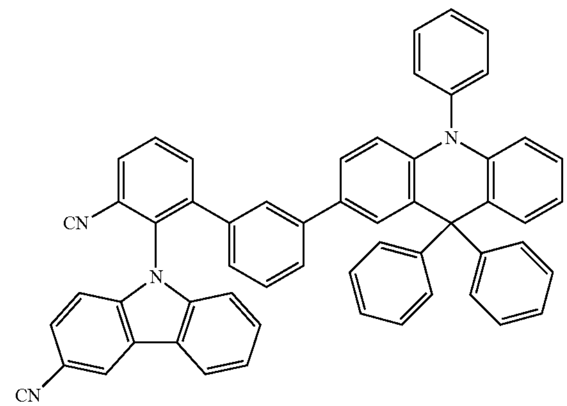
318
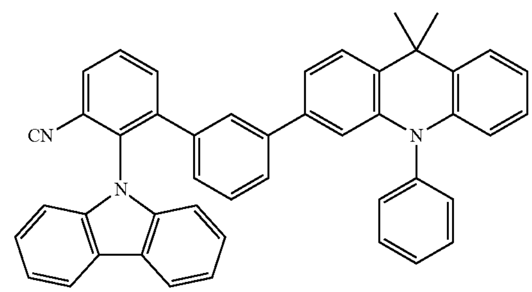
319
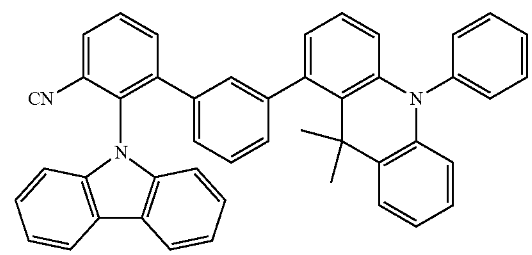
320
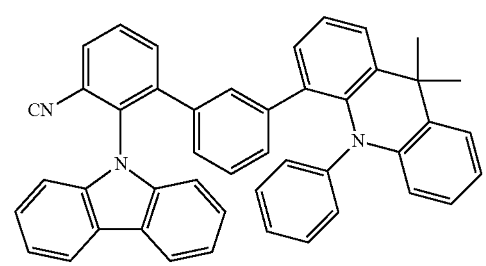
321
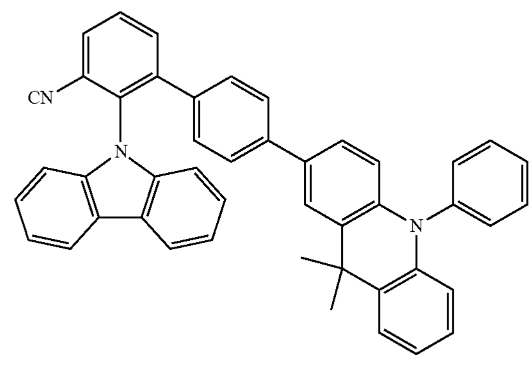

-continued
322
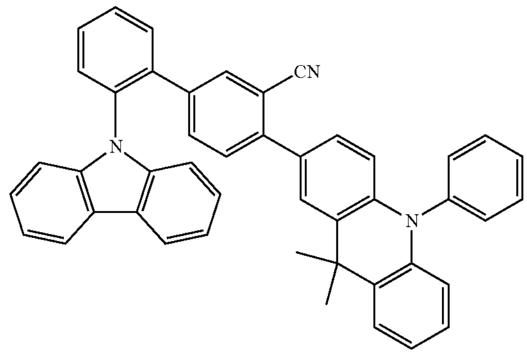
323
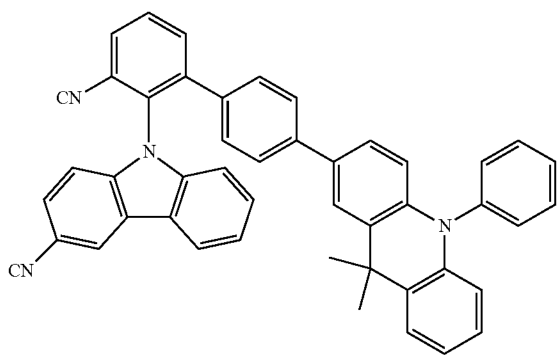
324
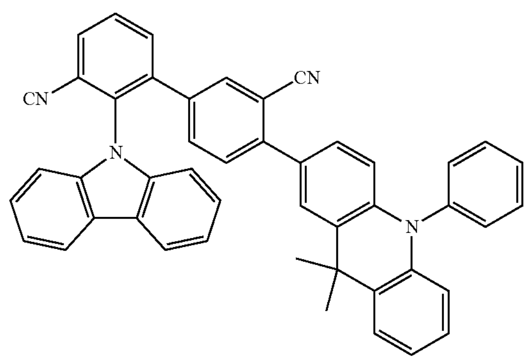
325
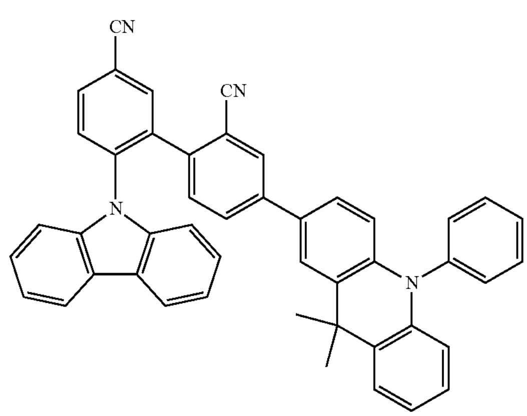
-continued
326
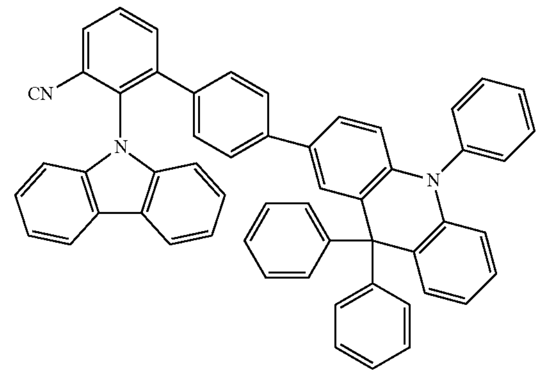
327
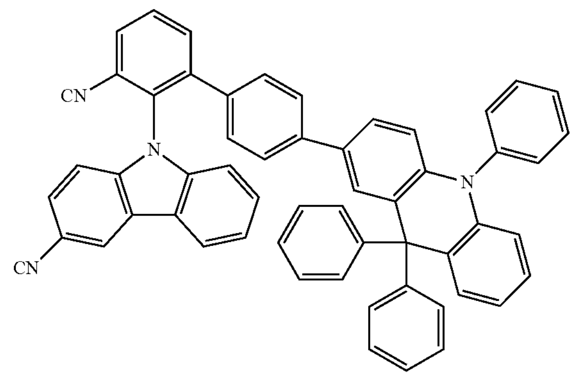
328
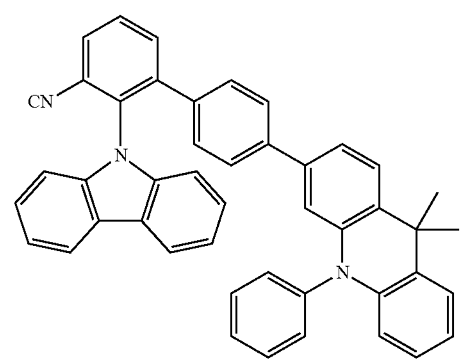
329
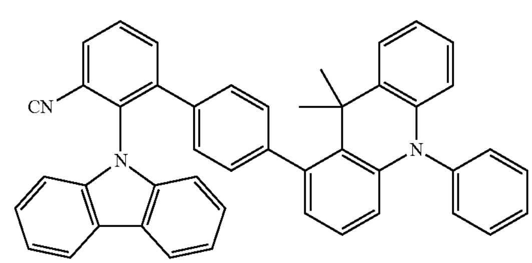

-continued
330
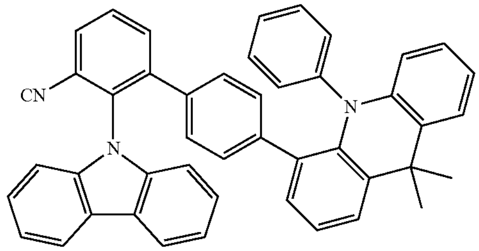
<Group HE7>
1
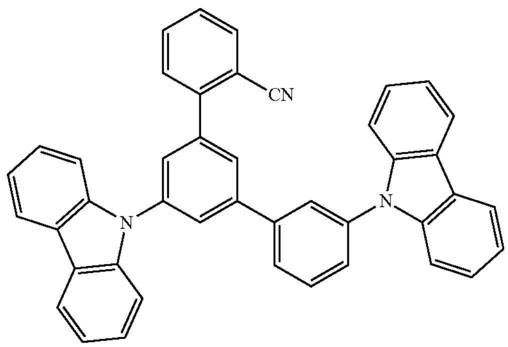
2
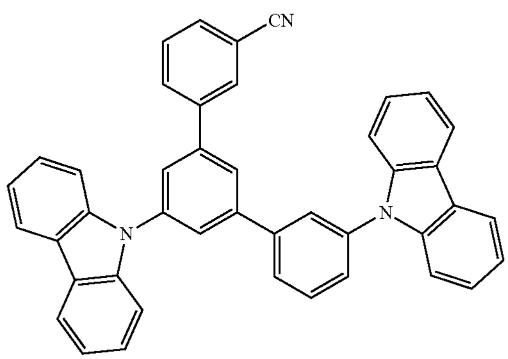
3
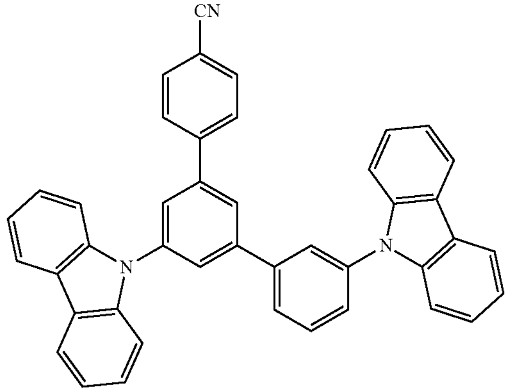
-continued
4
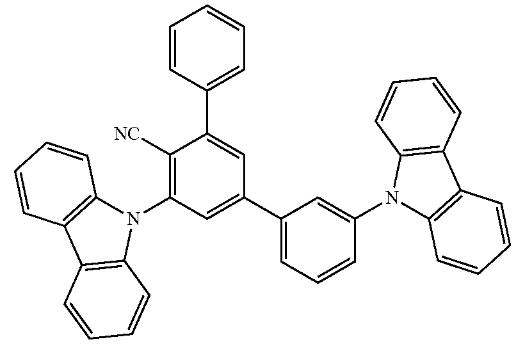
5
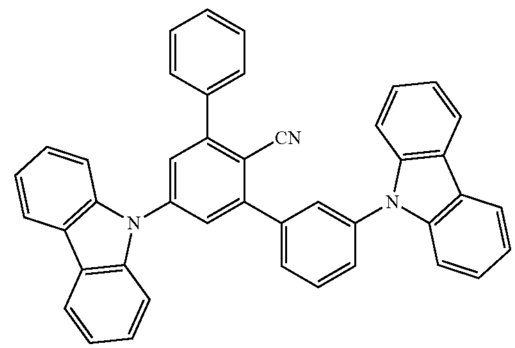
6
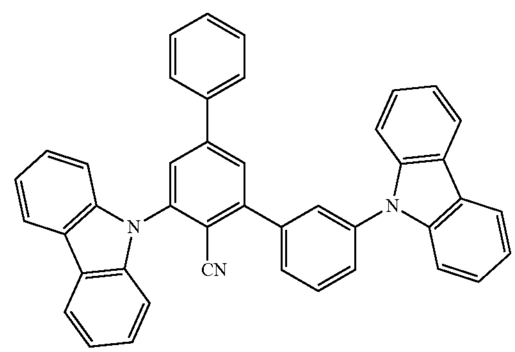
7
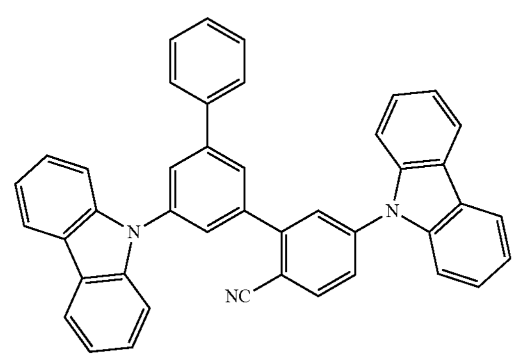

-continued
8
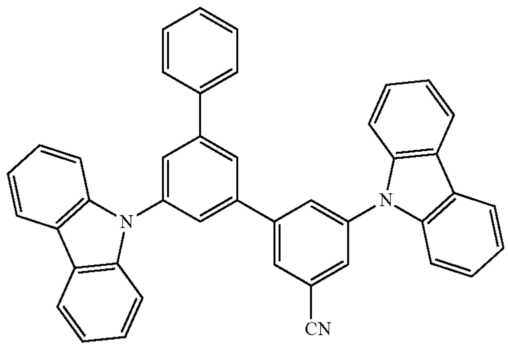
9
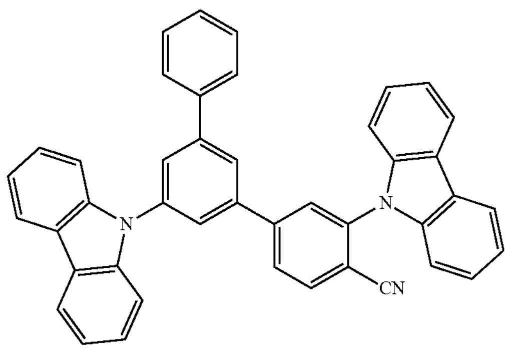
10
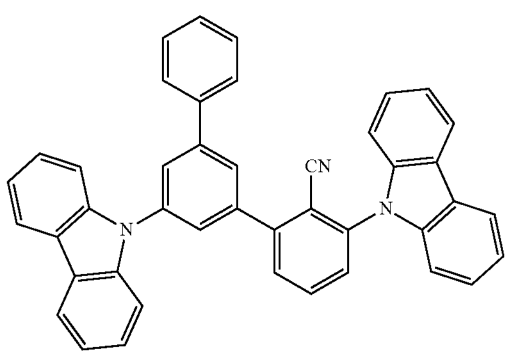
11
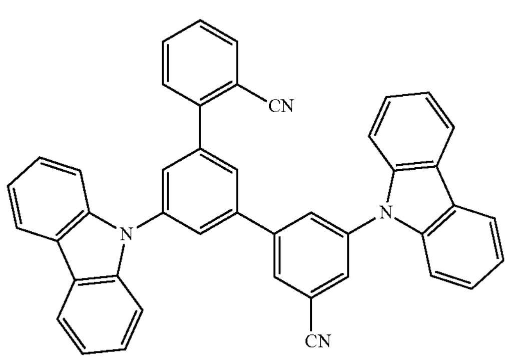
-continued
12
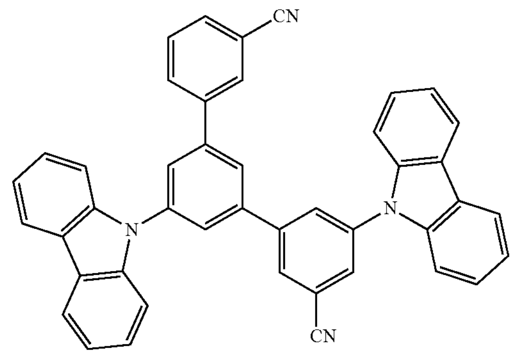
13
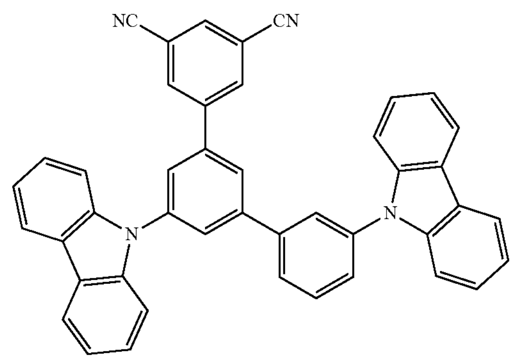
14
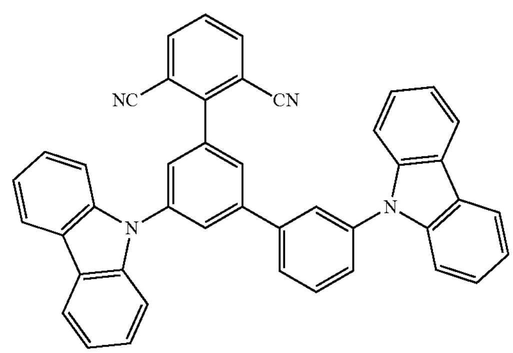
15
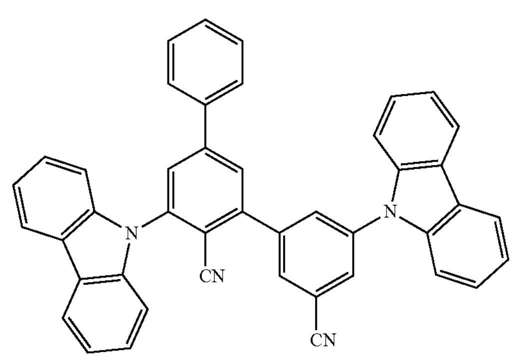

-continued
16
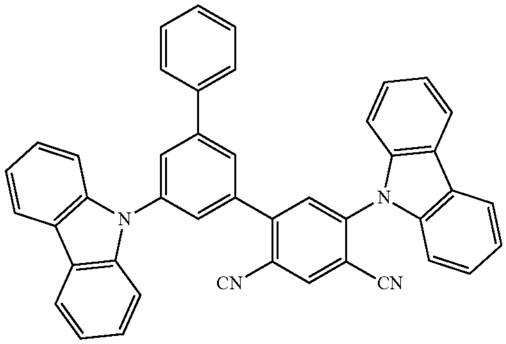
17
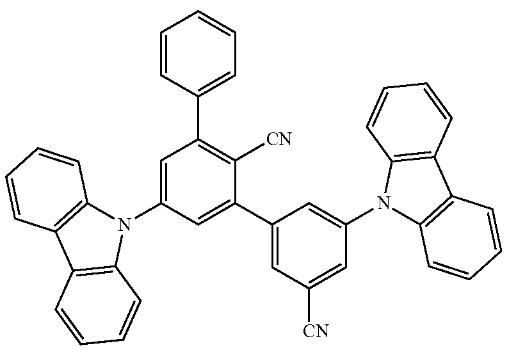
18
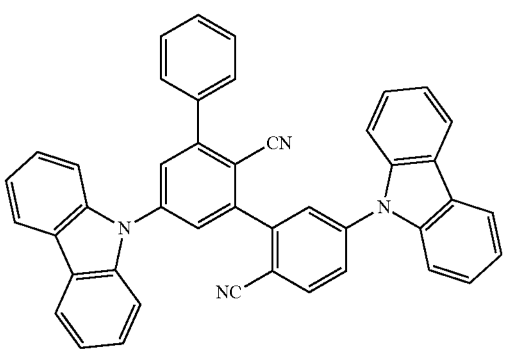
19
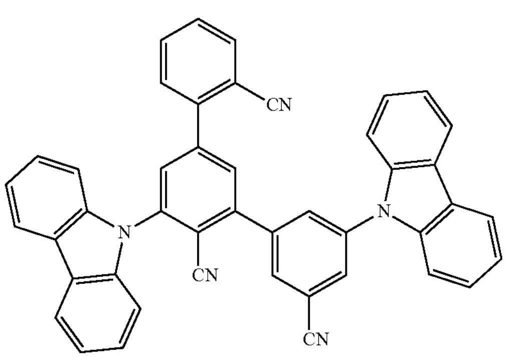
-continued
20
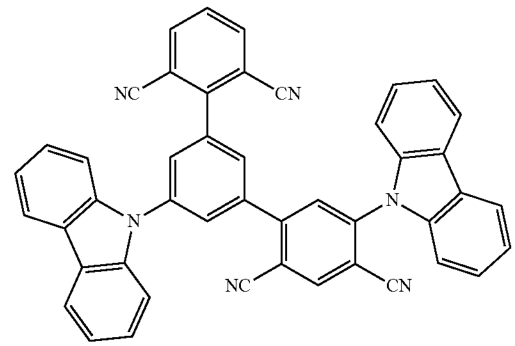
21
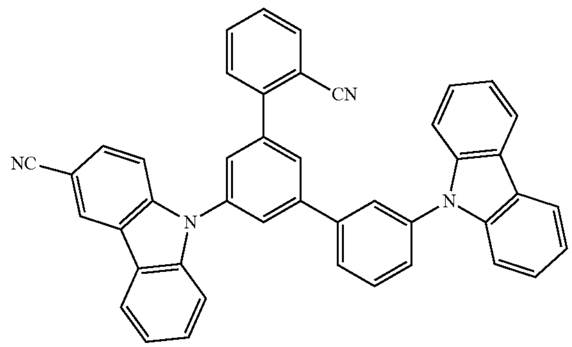
22
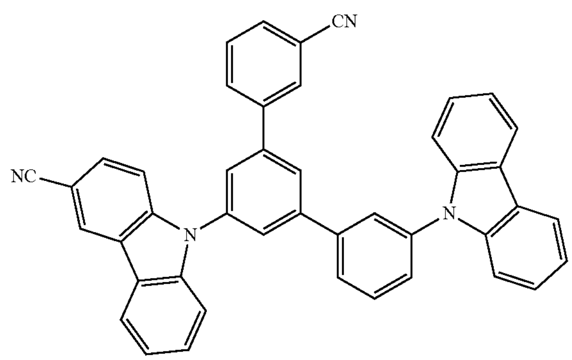
23
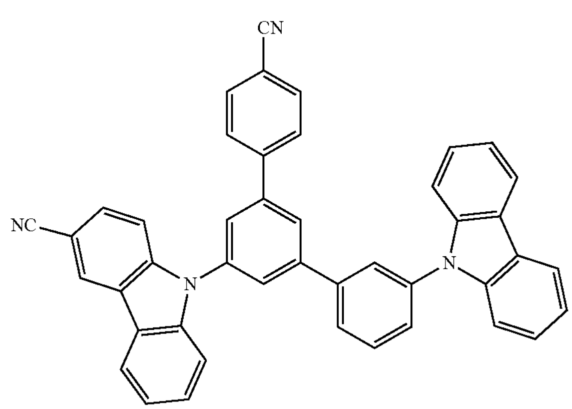

24
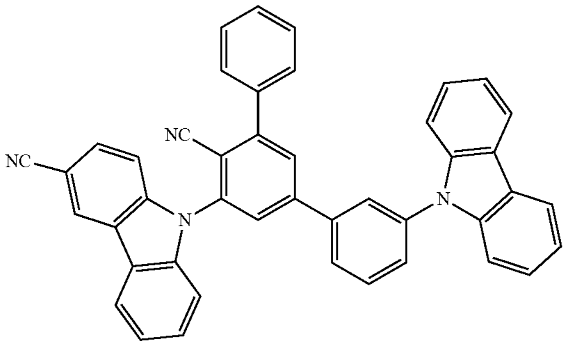
25
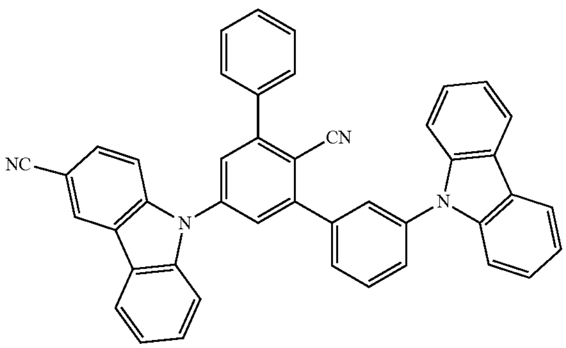
26
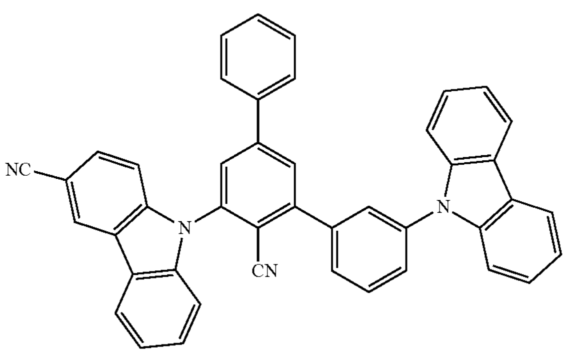
27
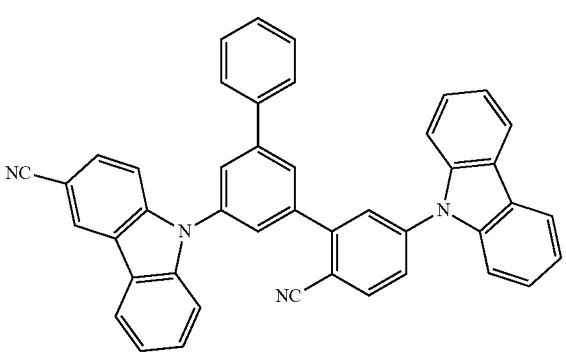
28
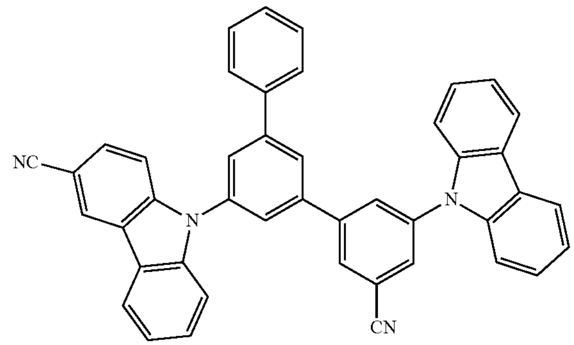
29
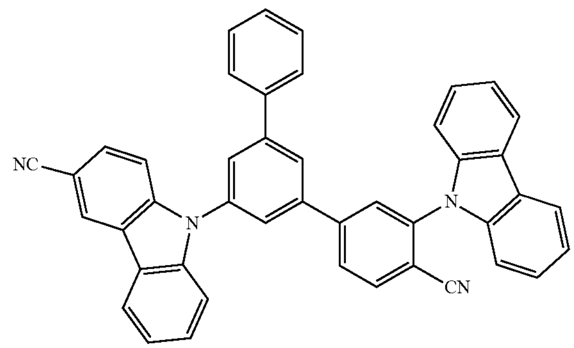
30
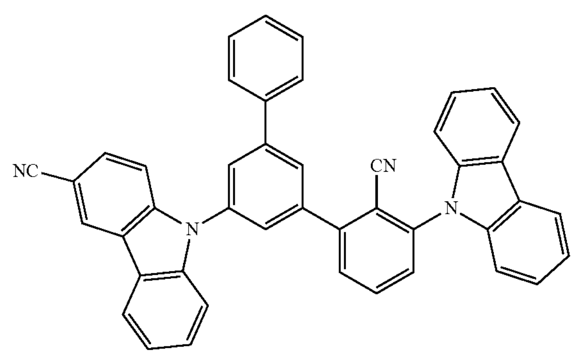
31
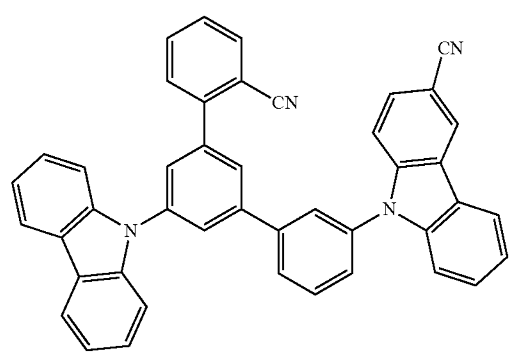

32
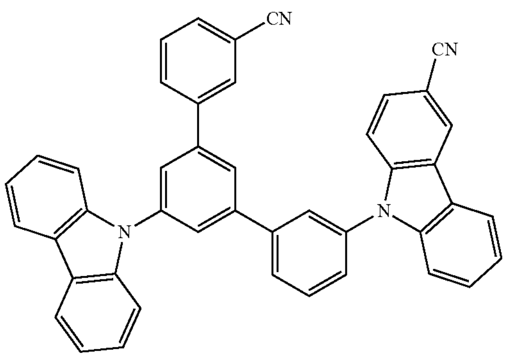
33
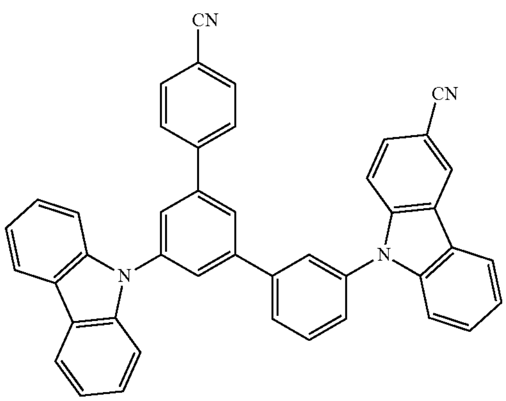
34
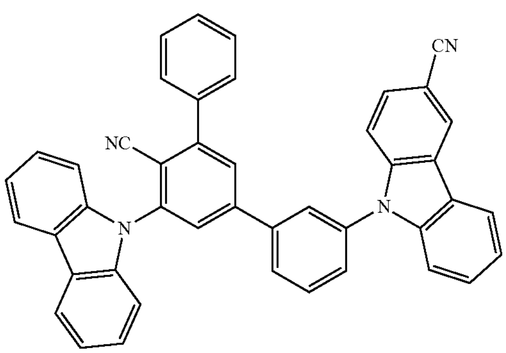
35
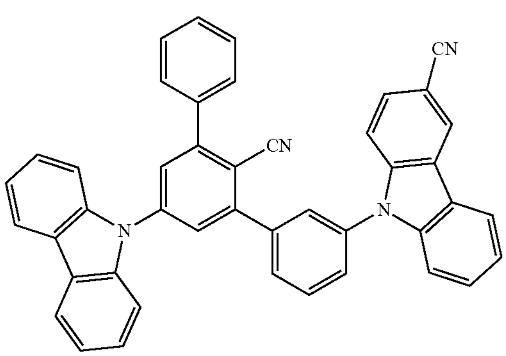
36
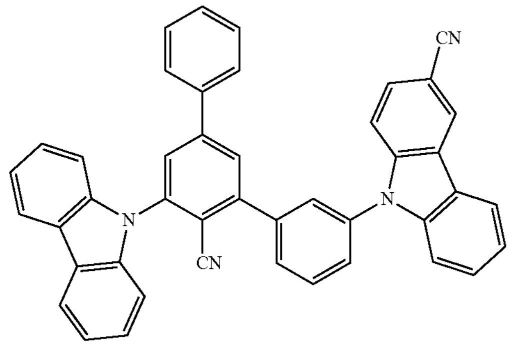
37
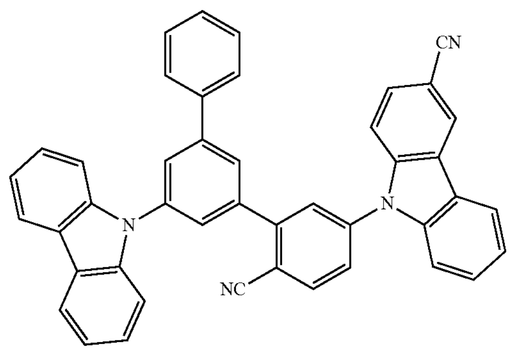
38
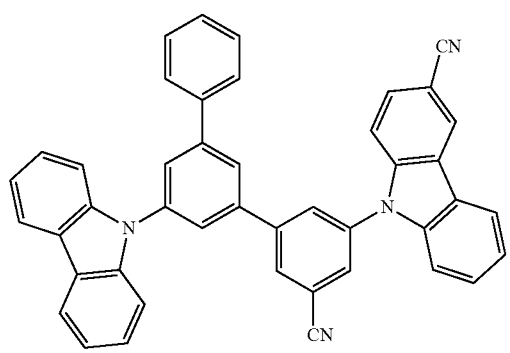
39
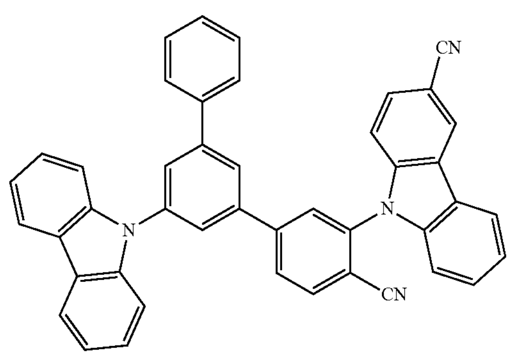

-continued
40
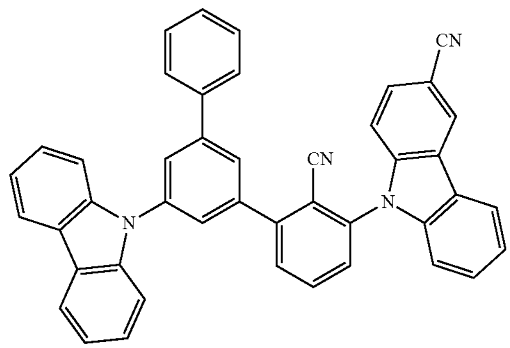
41
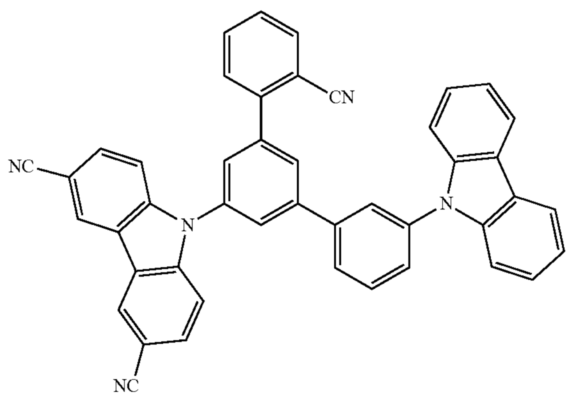
42
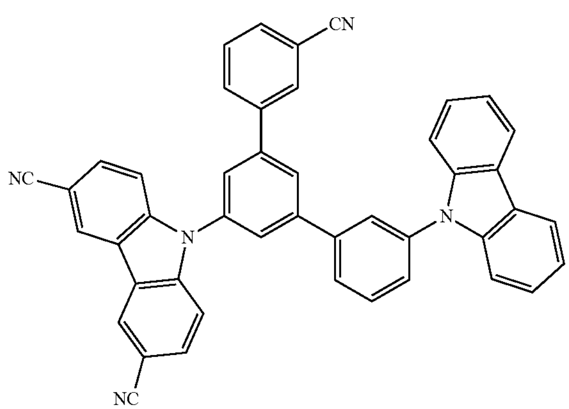
43
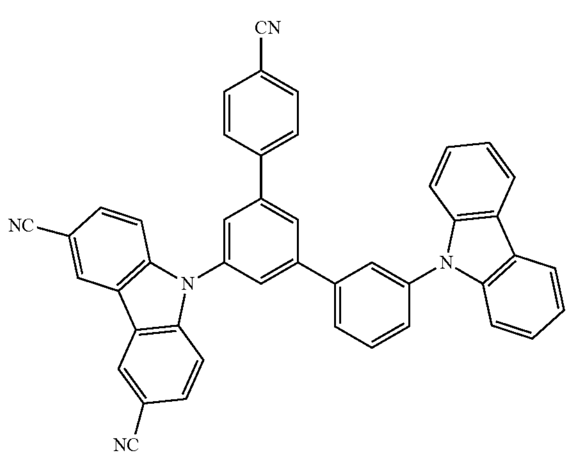
-continued
44
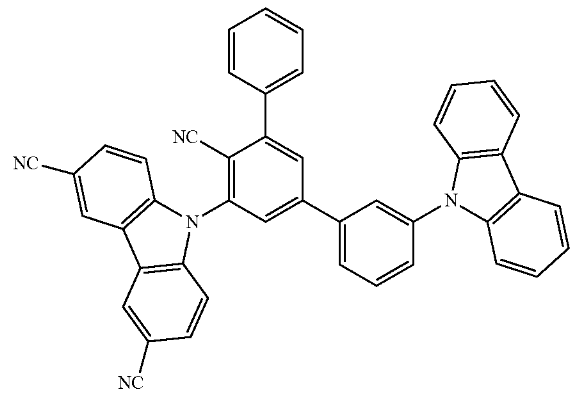
45
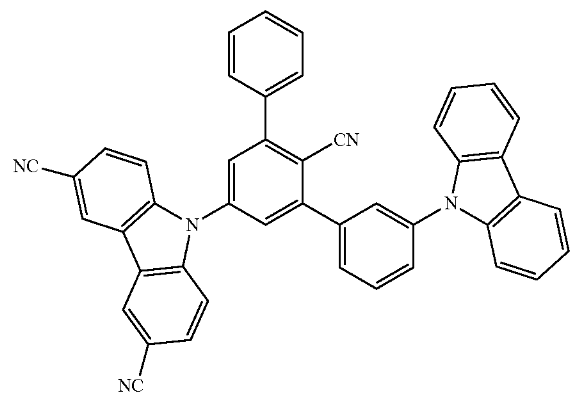
46
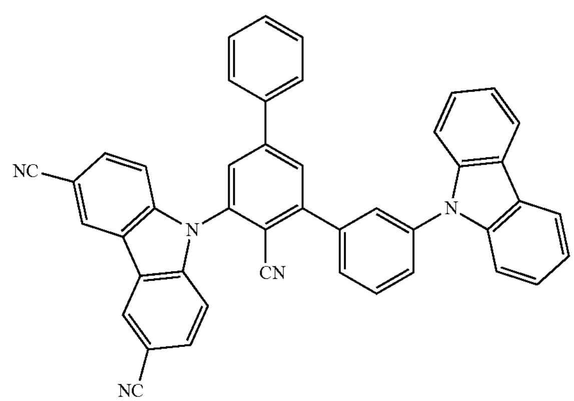
47
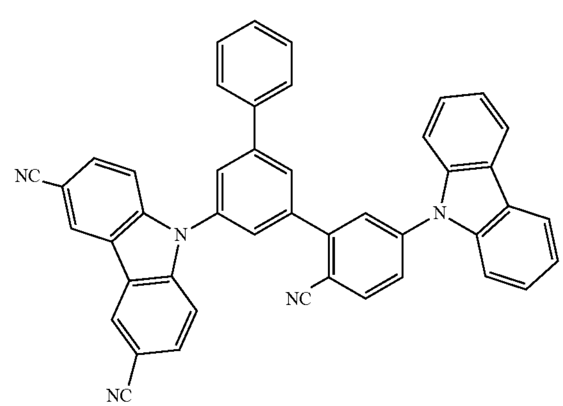

48
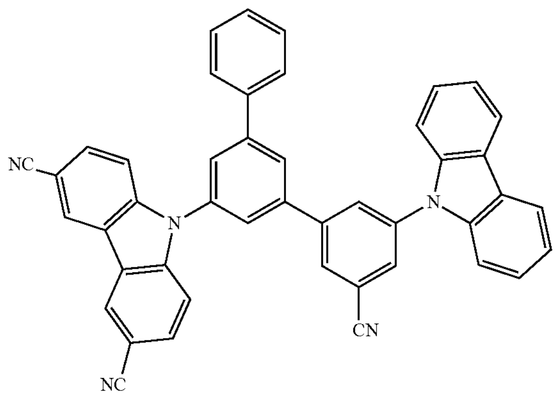
49
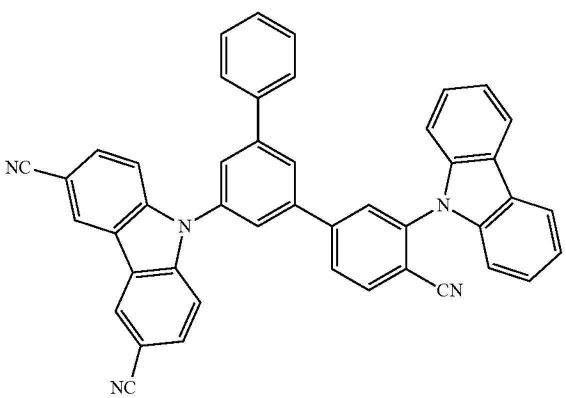
50
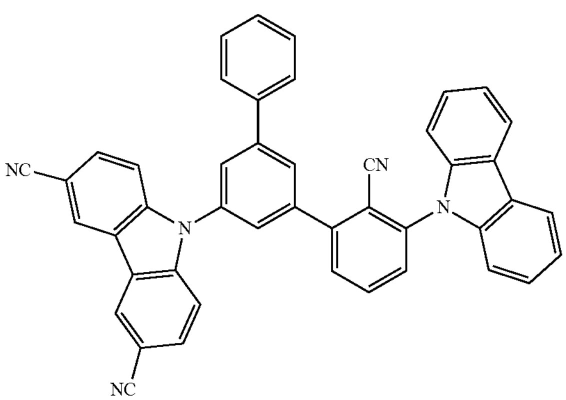
51
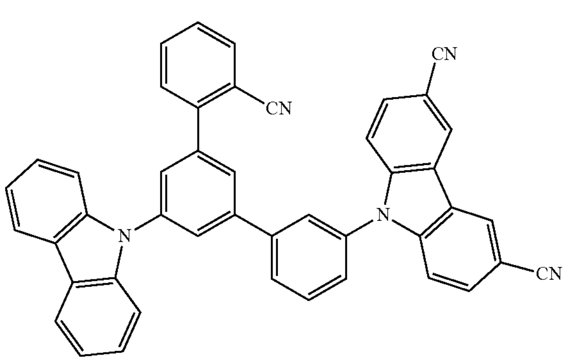
52
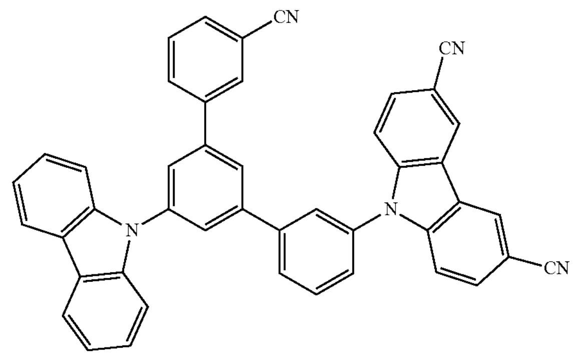
53
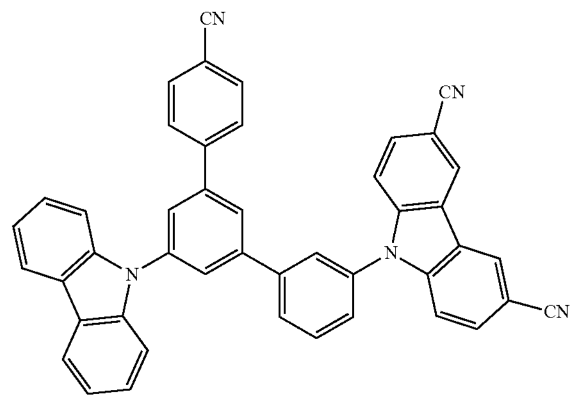
54
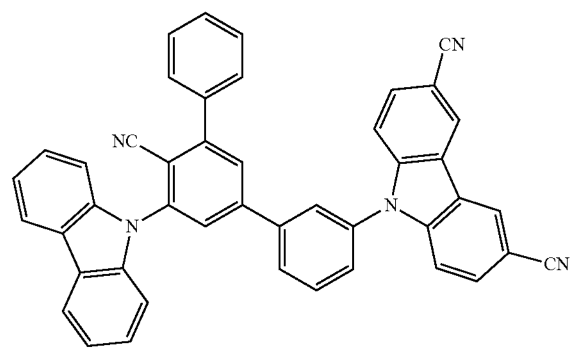
55
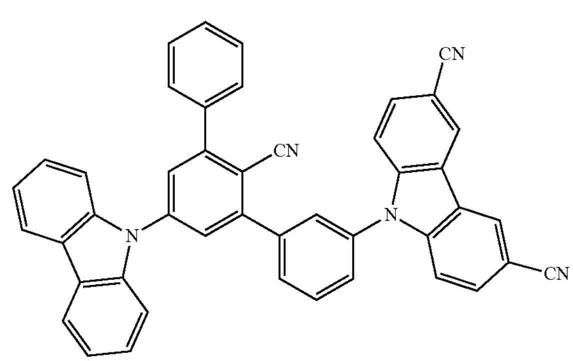

-continued
56
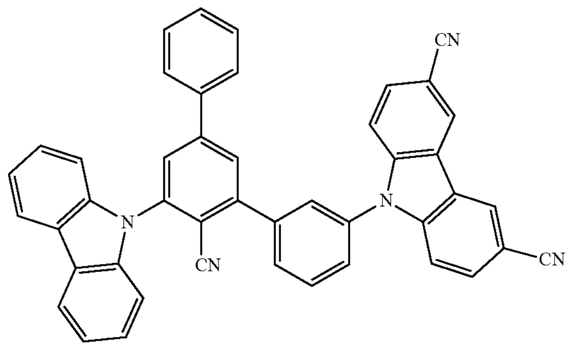
57
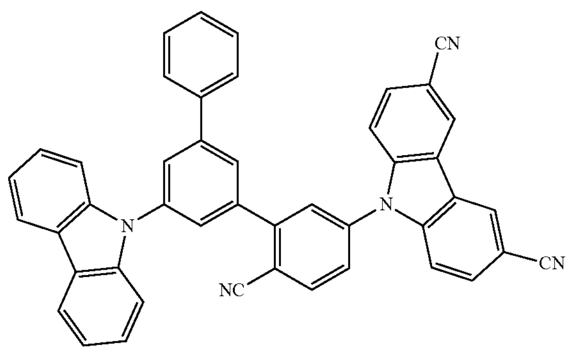
58
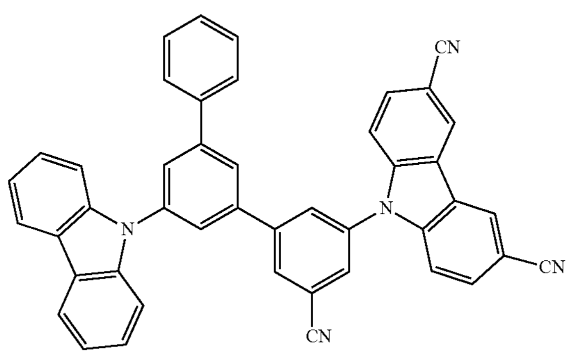
59
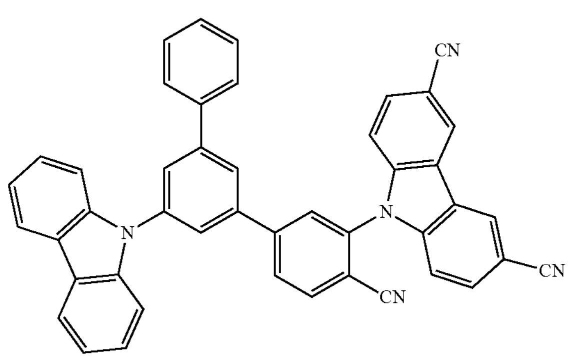
-continued
60
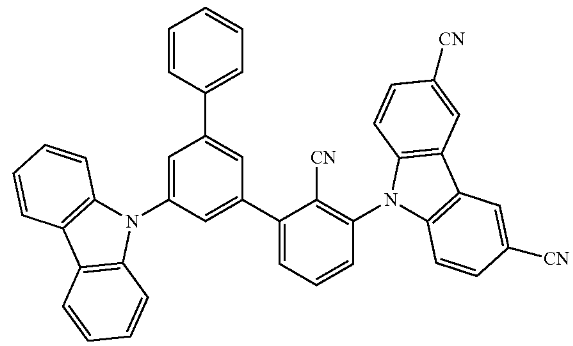
61
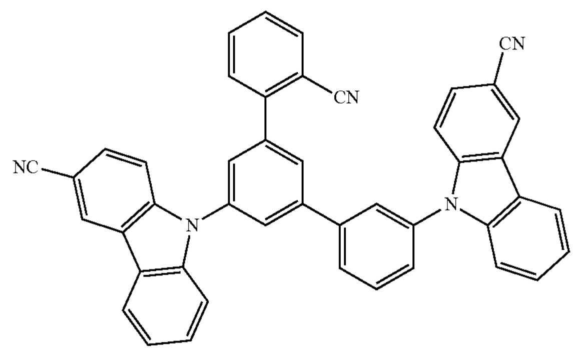
62
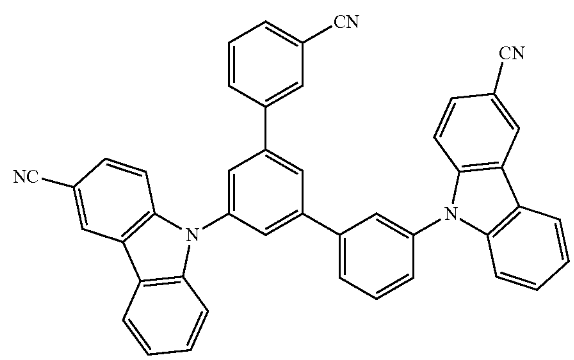
63
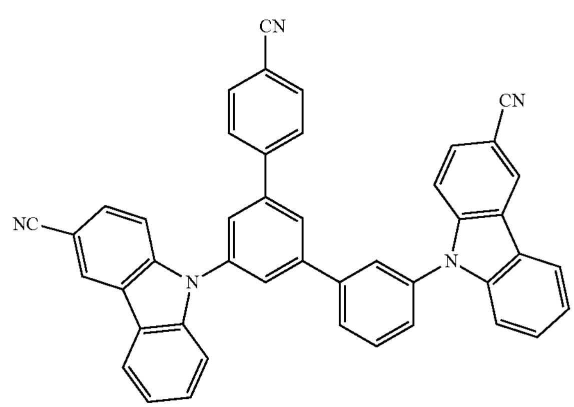

-continued
64
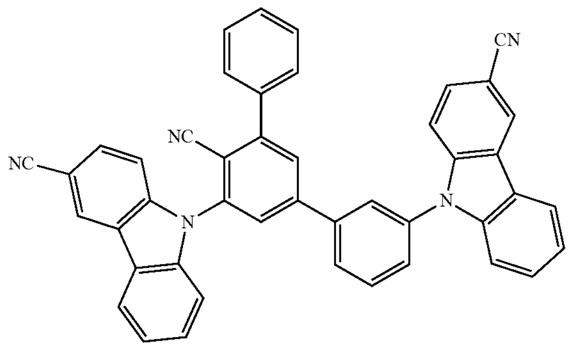
65
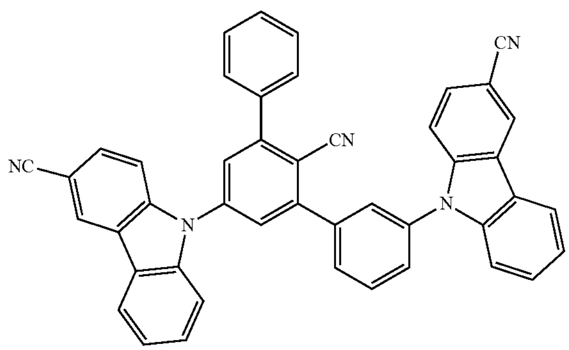
66
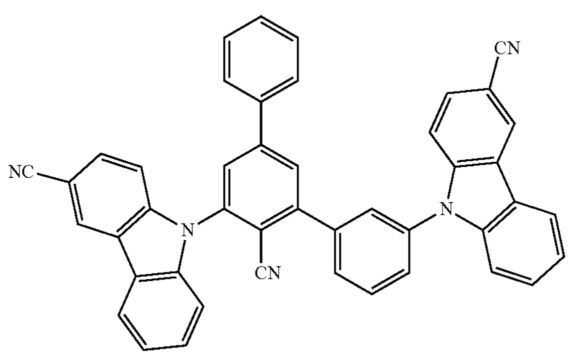
67
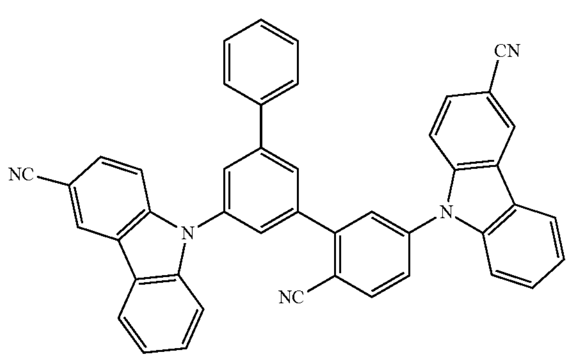
-continued
68
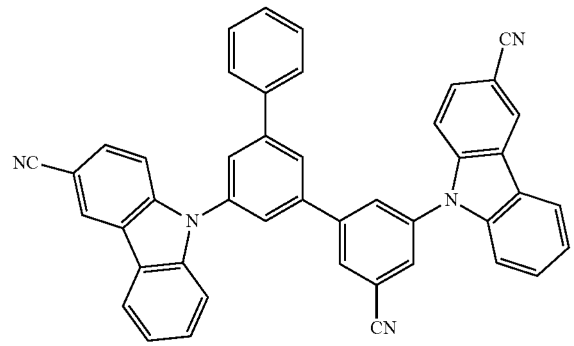
69
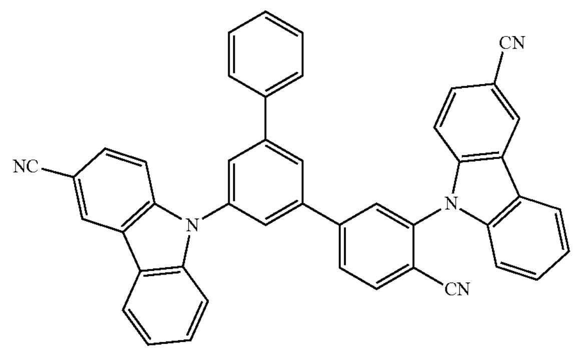
70
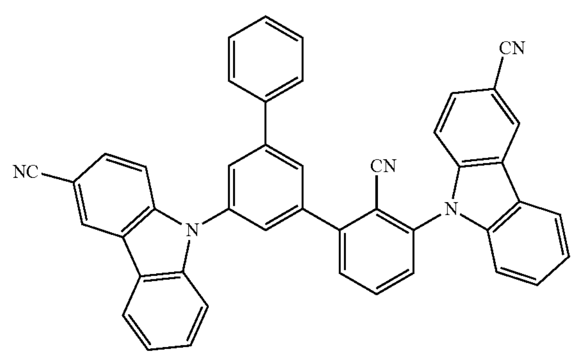
71
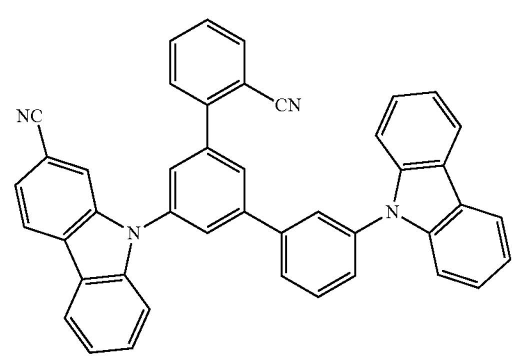

-continued
72
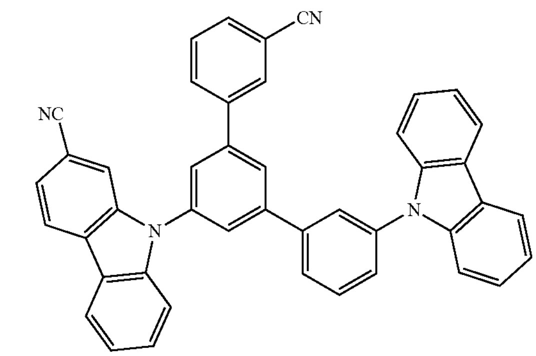
73
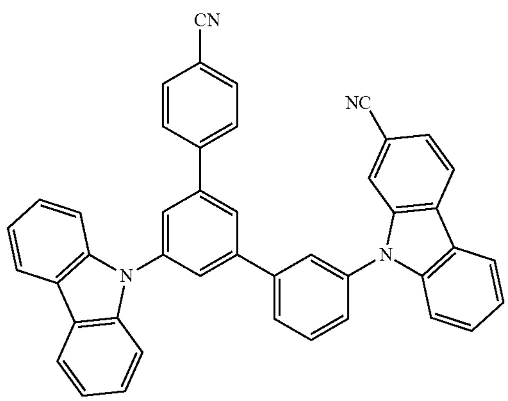
74
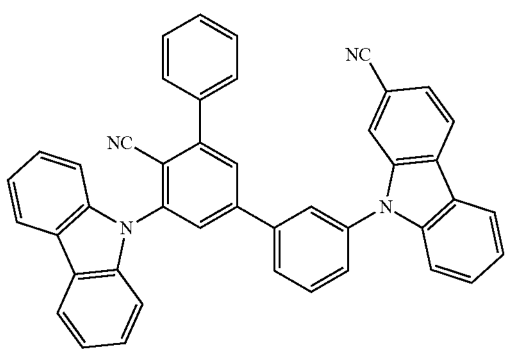
75
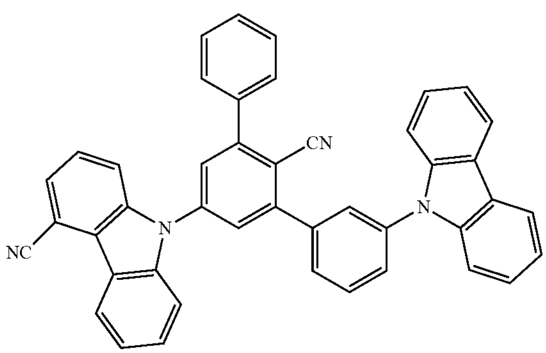
-continued
76
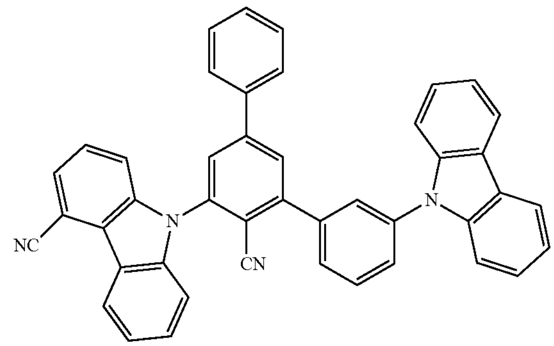
77
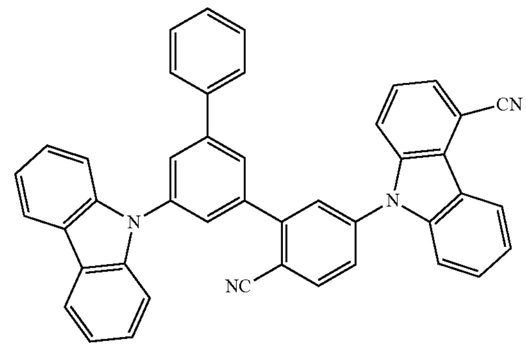
78
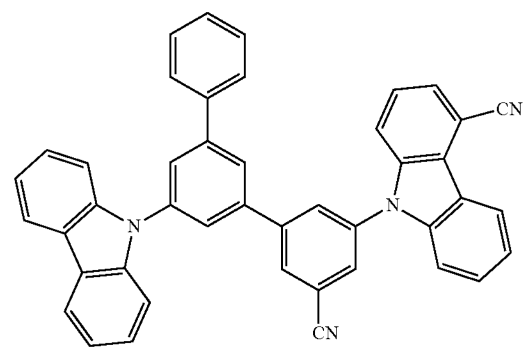
79
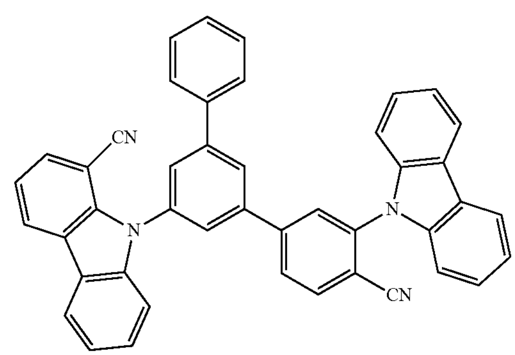

-continued
80
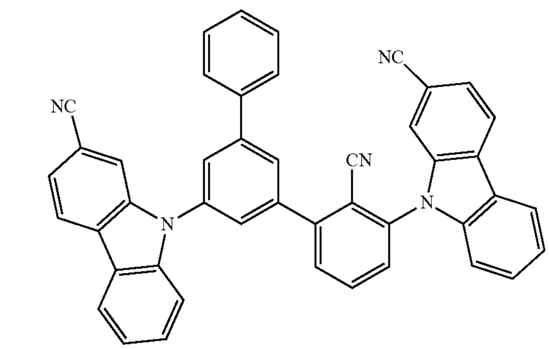
81
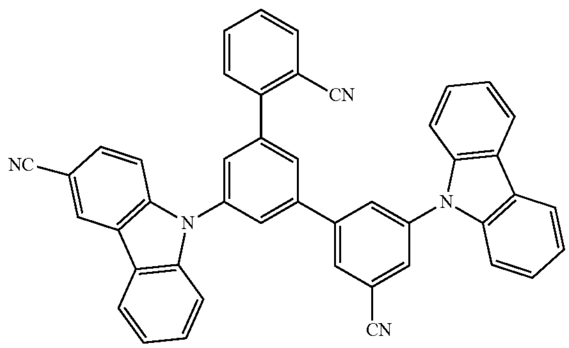
82
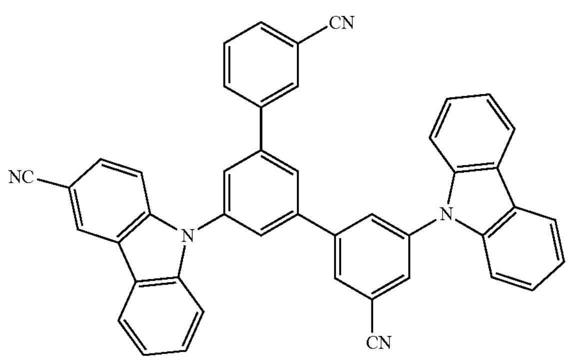
83
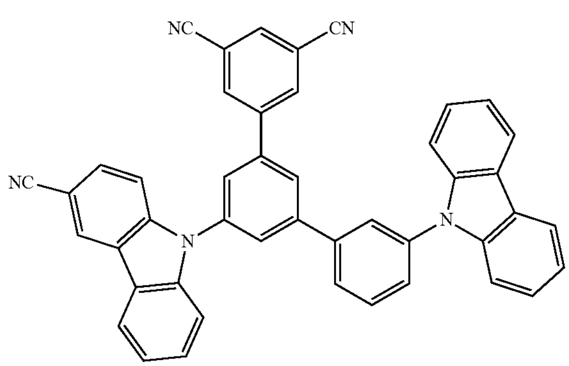
-continued
84
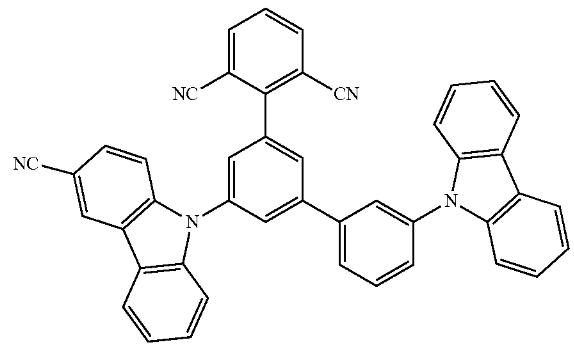
85
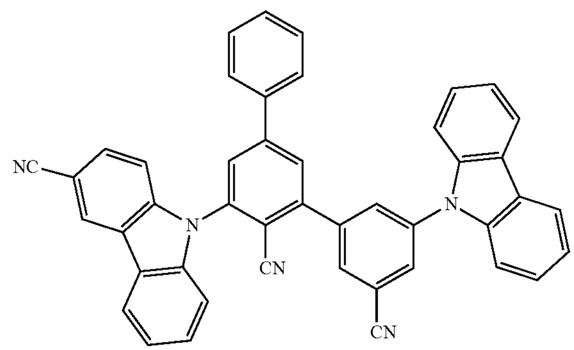
86
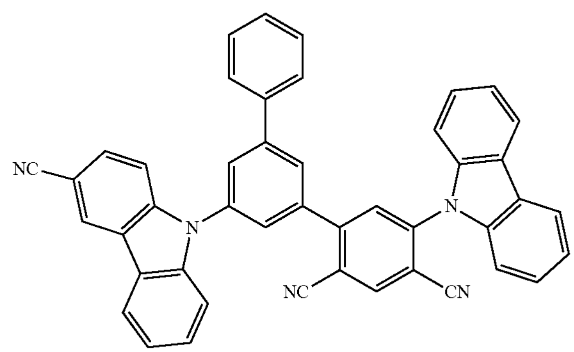
87
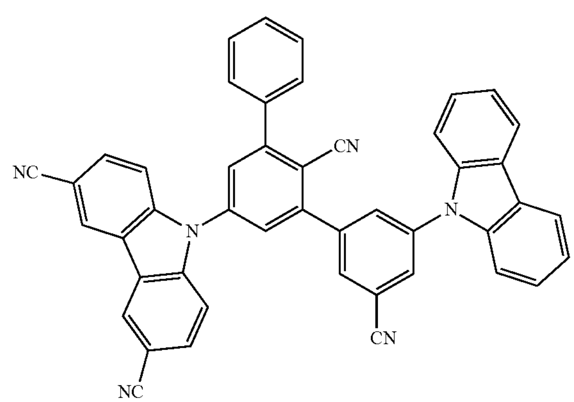

-continued
88
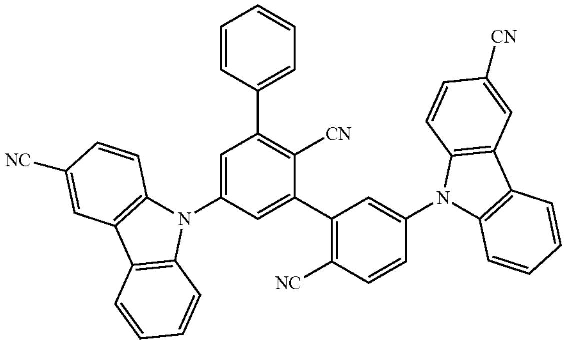
89
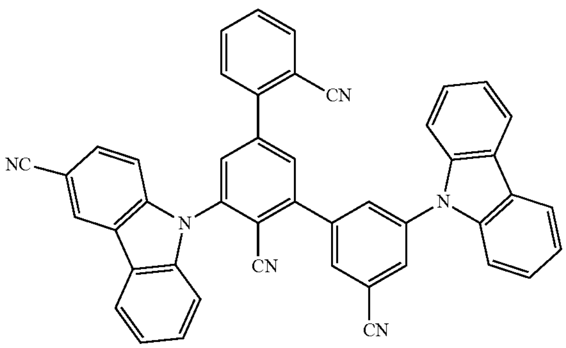
90
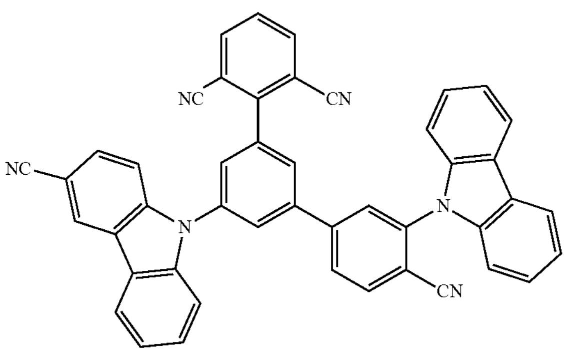
91
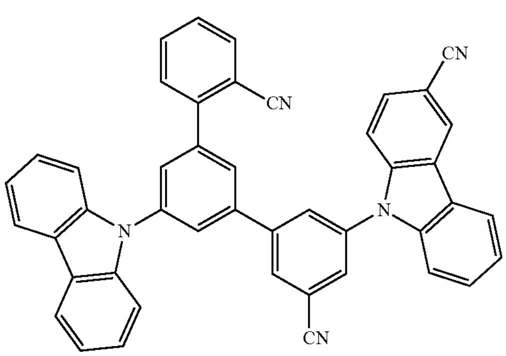
-continued
92
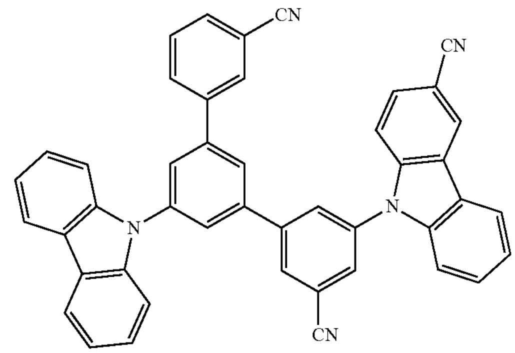
93
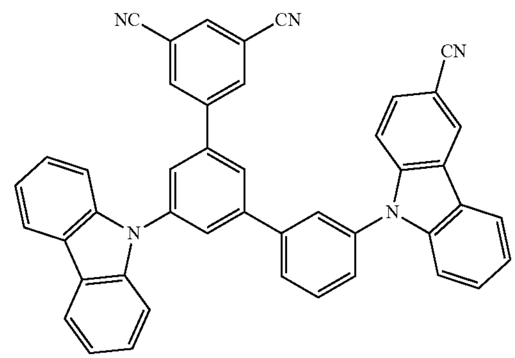
94
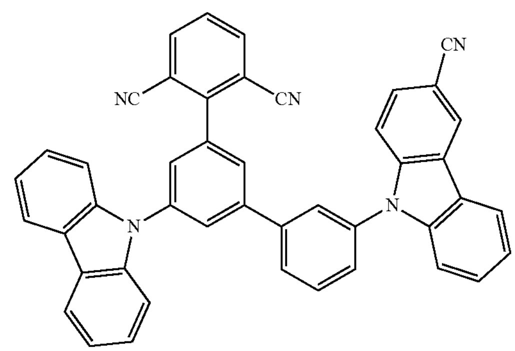
95
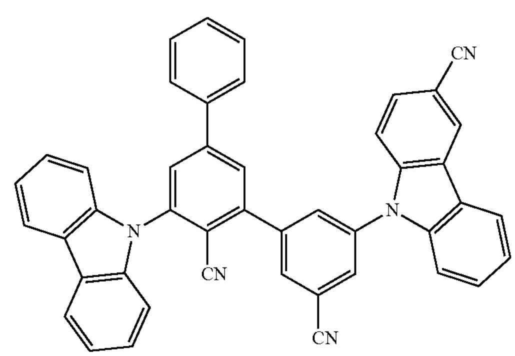

-continued
96
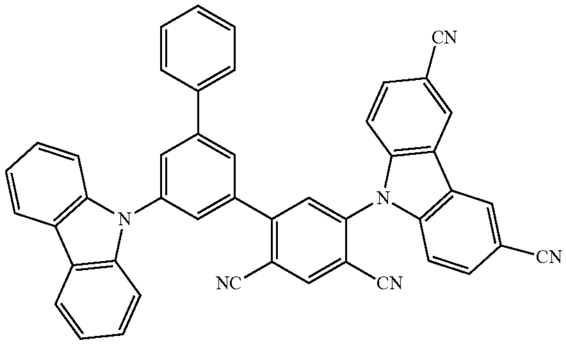
97
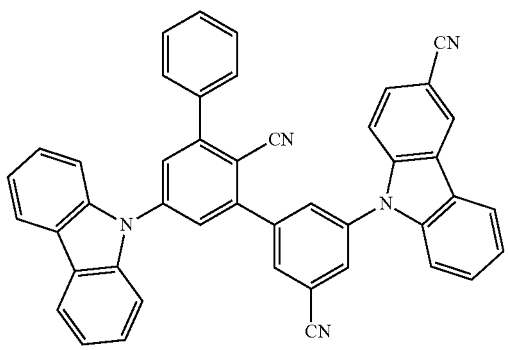
98
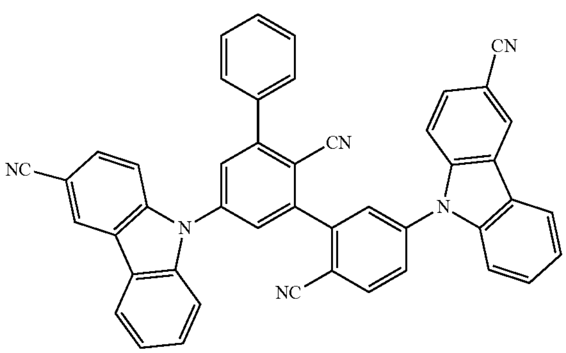
99
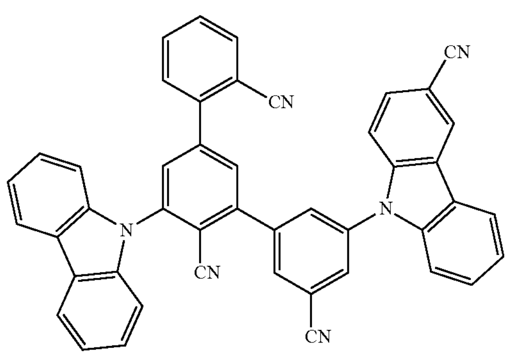
-continued
100
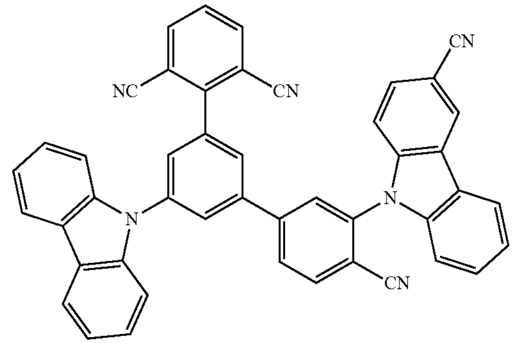
101
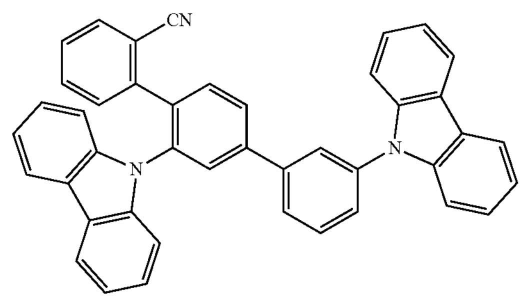
102
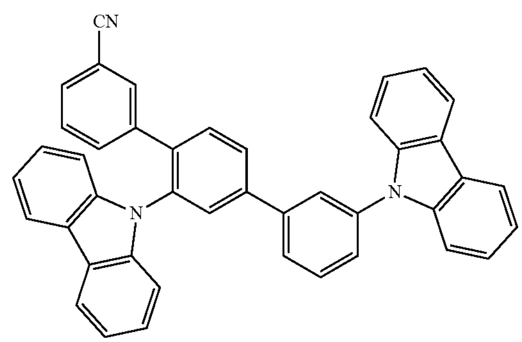
103
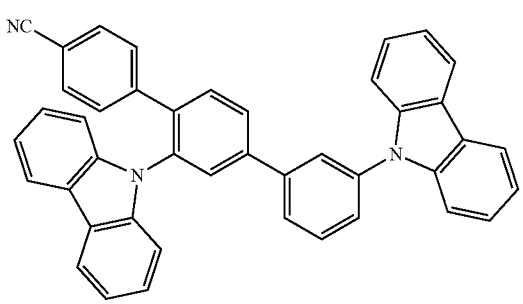

-continued
104
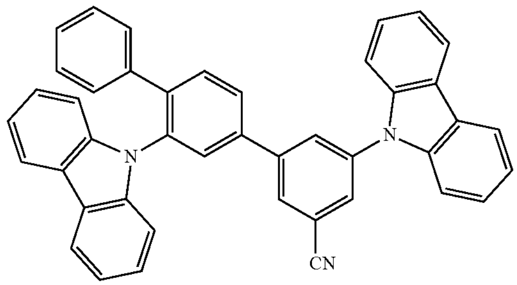
105
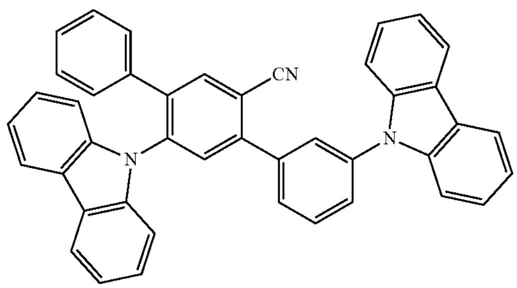
106
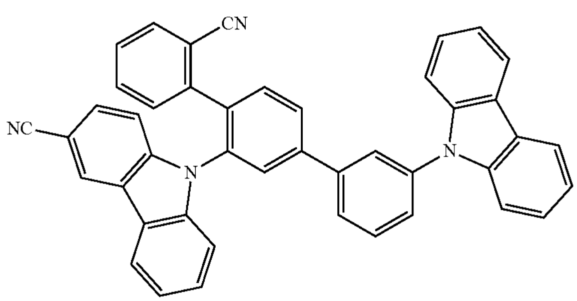
107
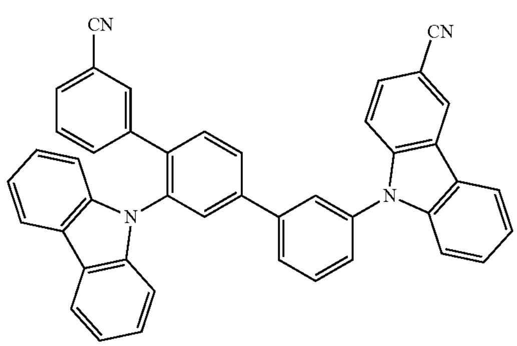
108
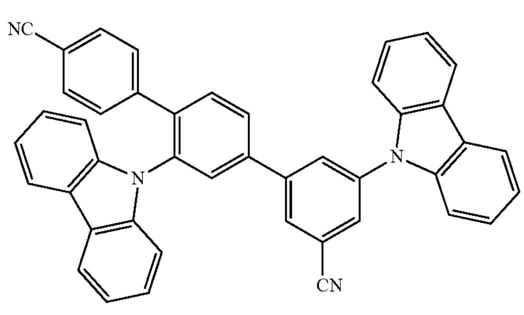
-continued
109
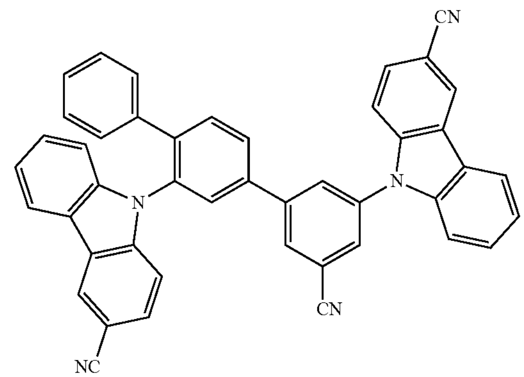
110
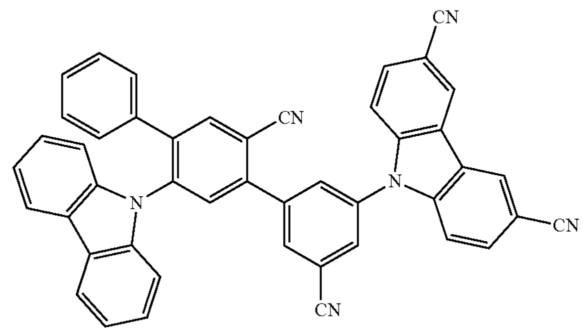
111
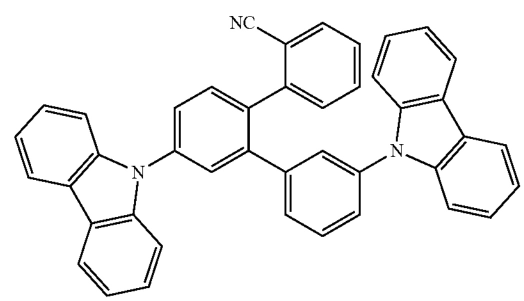
112
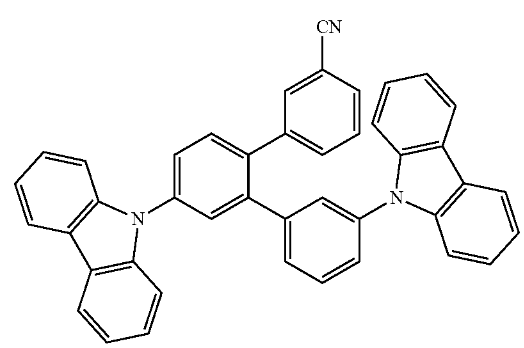

-continued
113
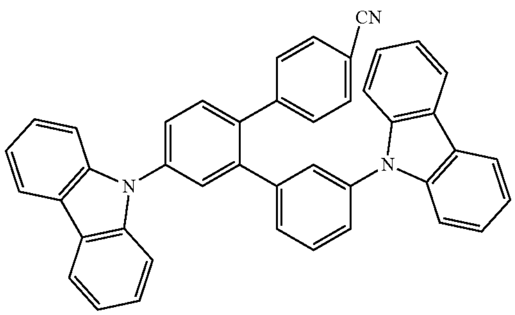
114
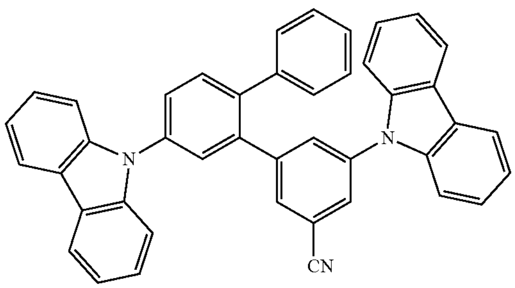
115
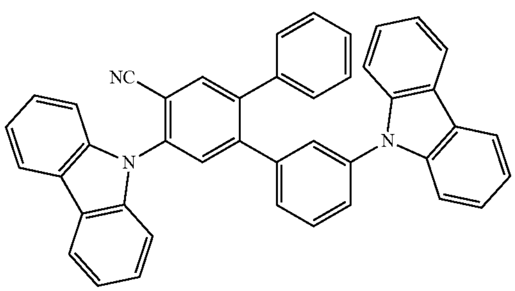
116
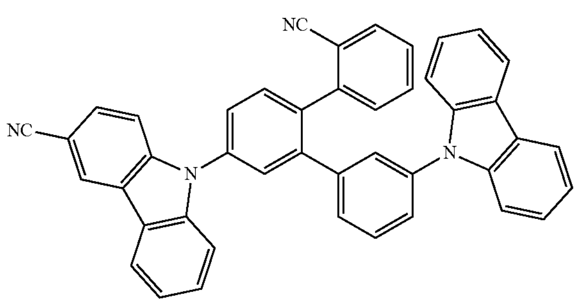
117
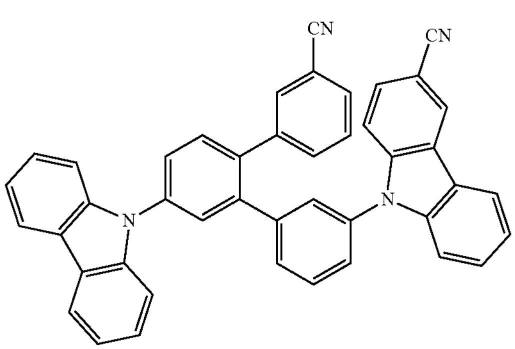
-continued
118
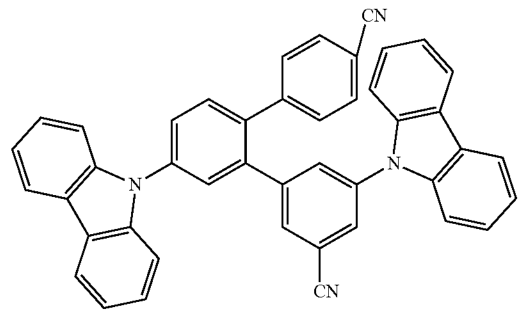
119
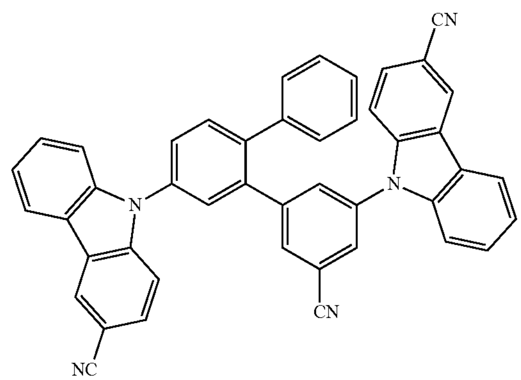
120
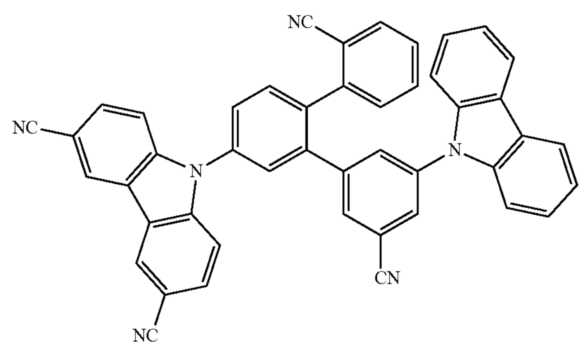
121
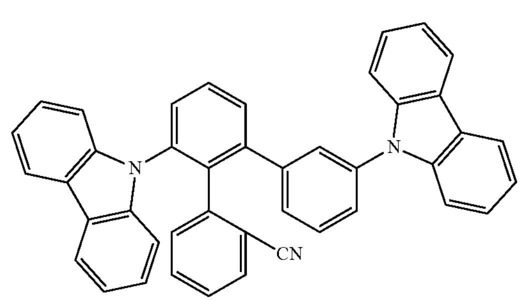

122
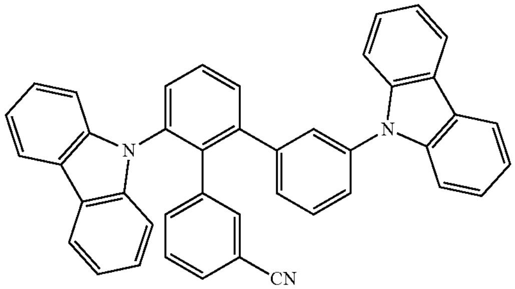
123
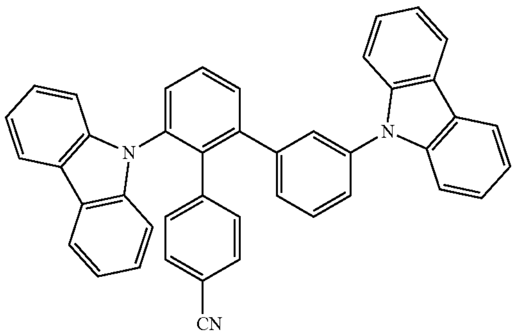
124
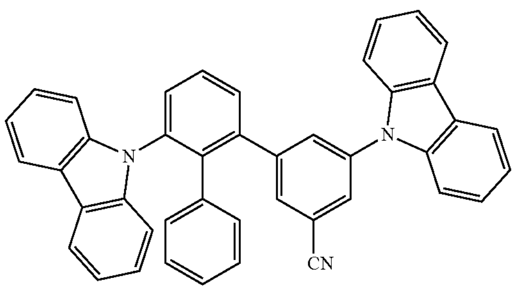
125
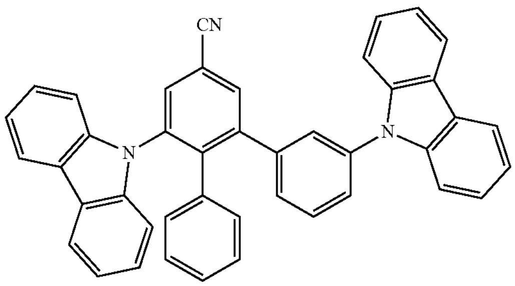
126
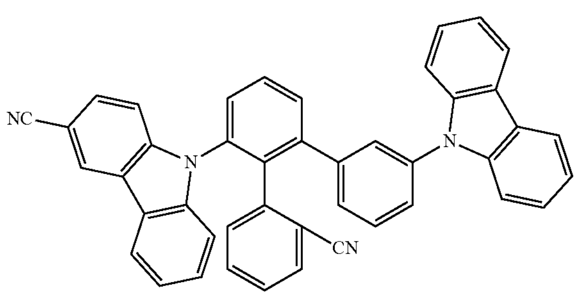
127
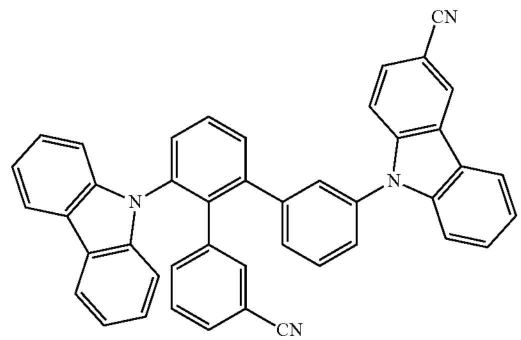
128
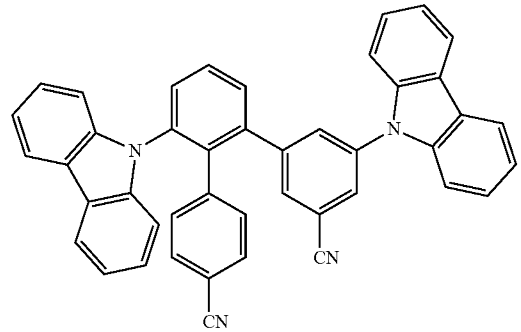
129
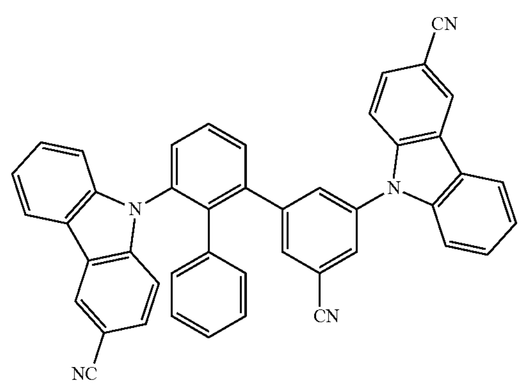
130
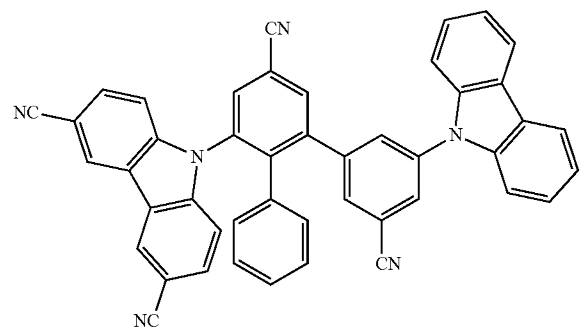

-continued
131
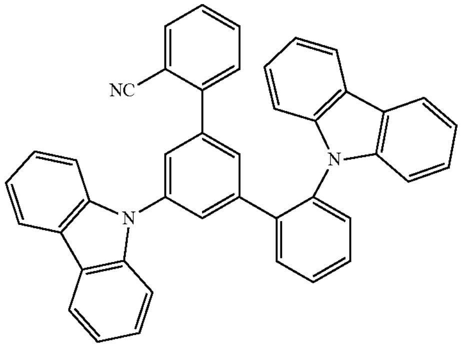
132
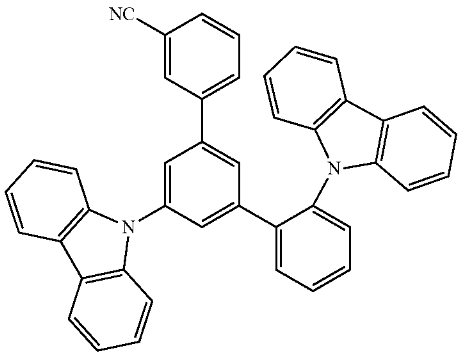
133
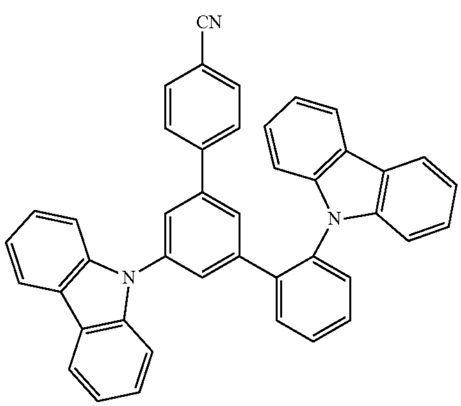
134
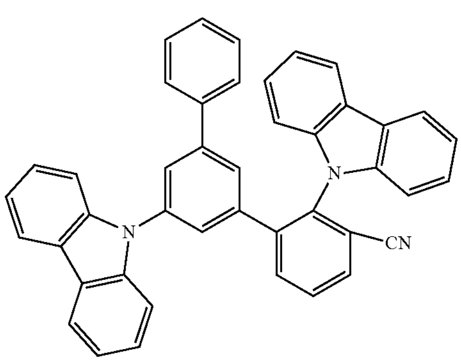
-continued
135
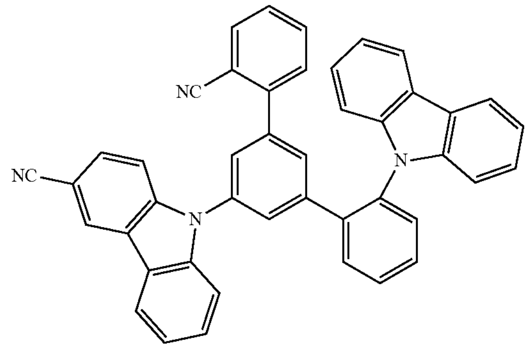
136
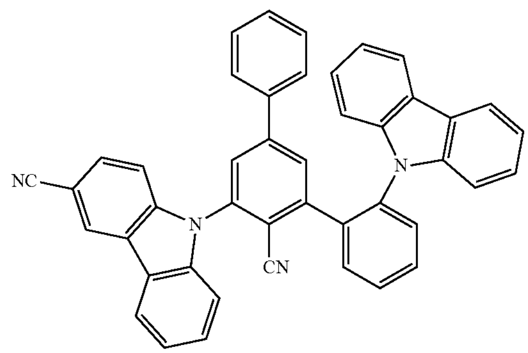
137
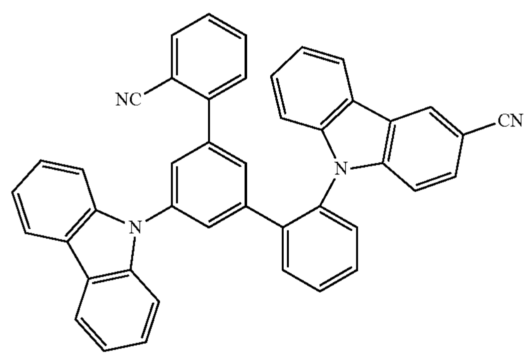
138
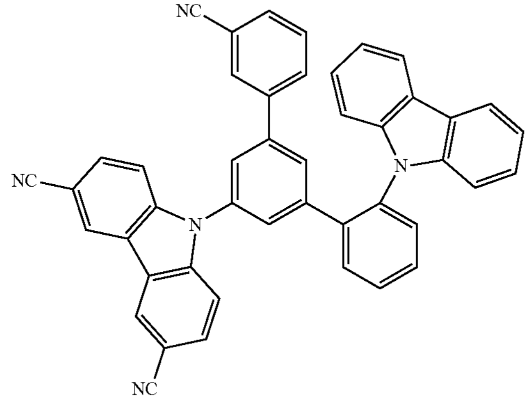

139
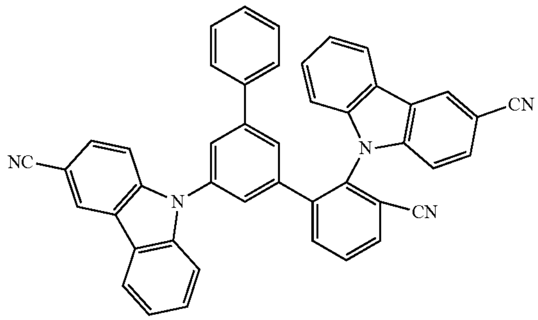
140
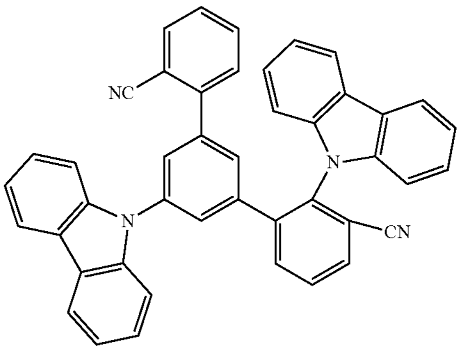
141
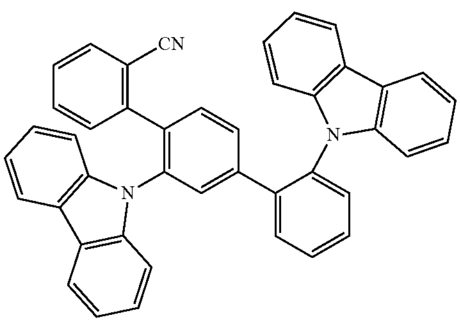
142
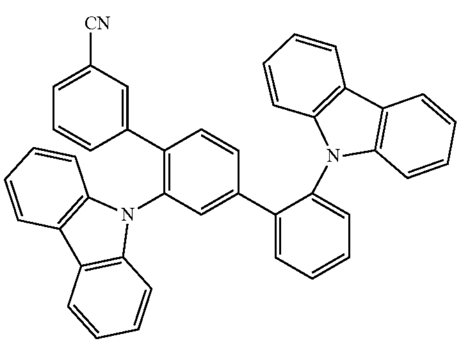
143
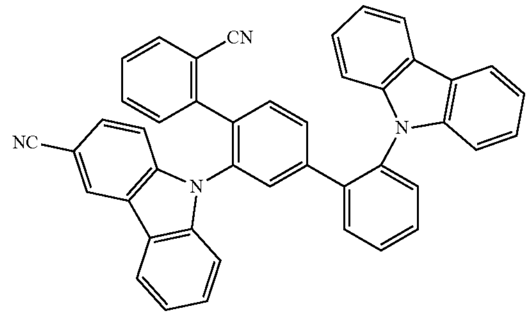
144
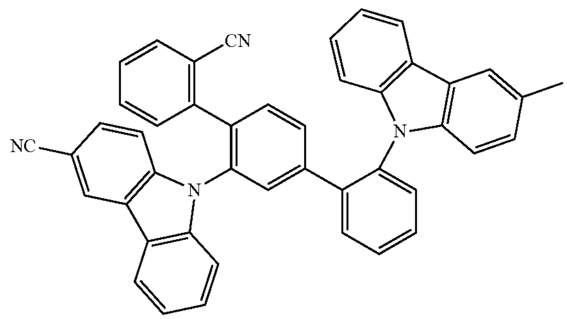
145
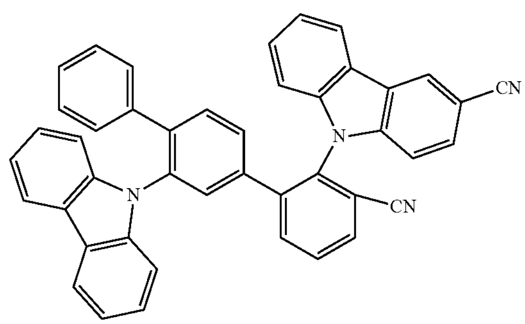
146
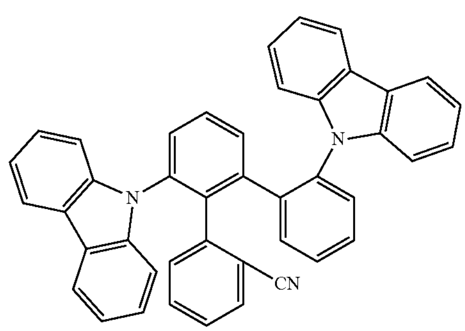

-continued
147
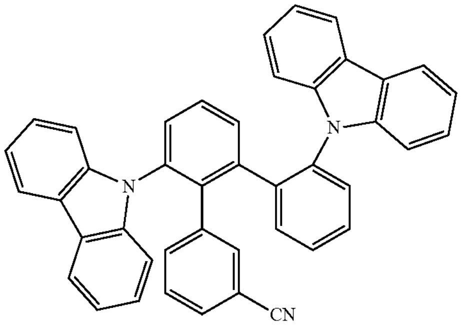
148
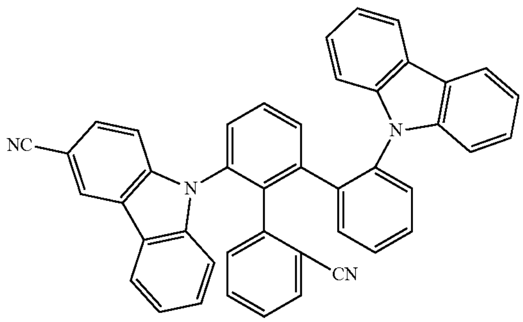
149
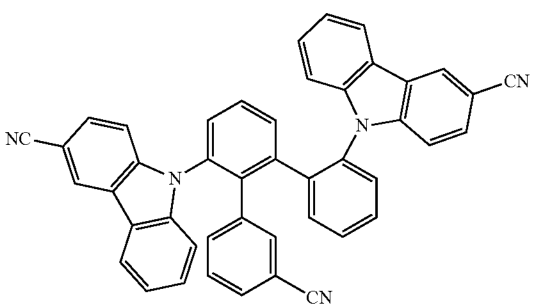
150
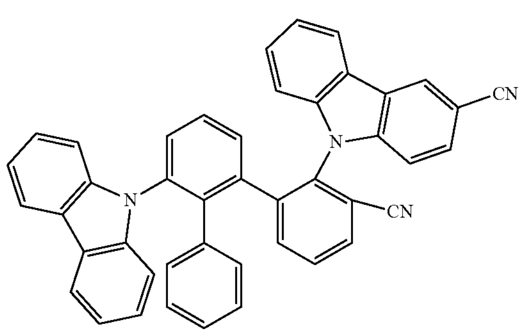
-continued
151
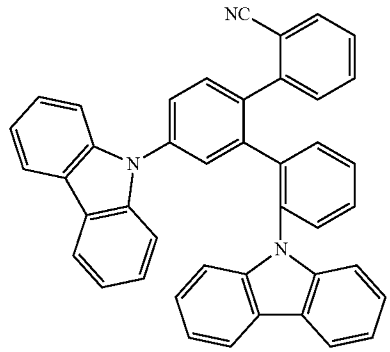
152
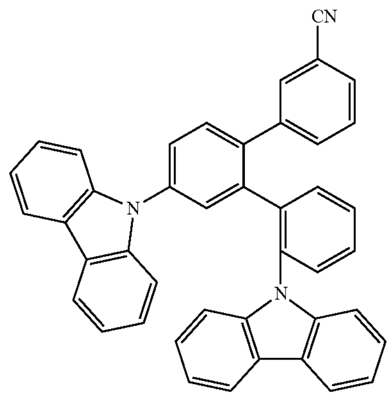
153
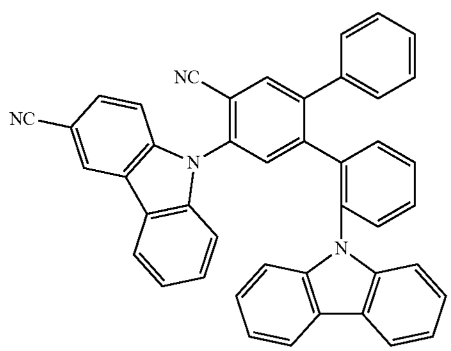
154
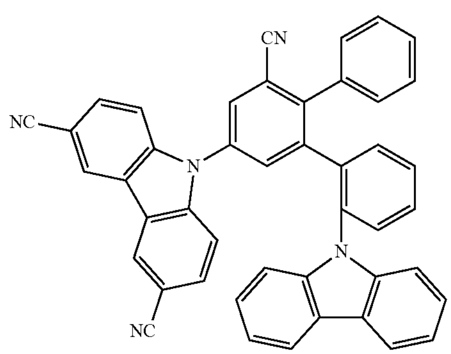

-continued
155
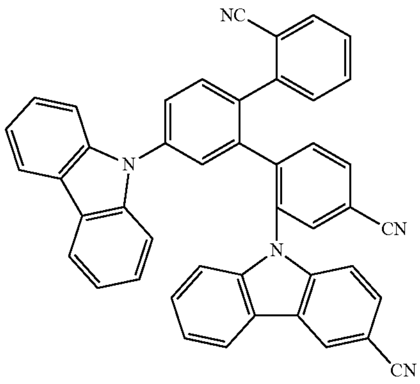
156
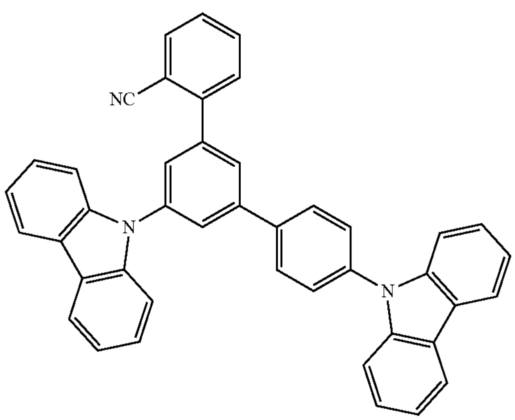
157
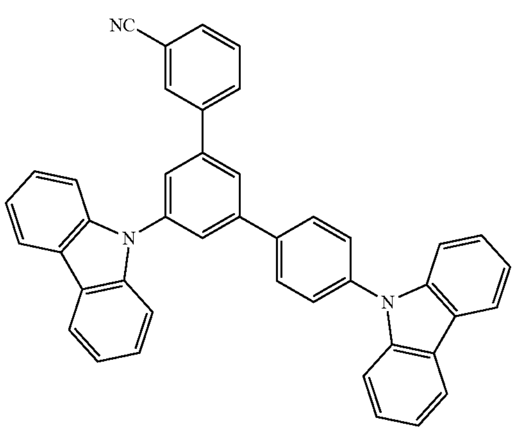
-continued
158
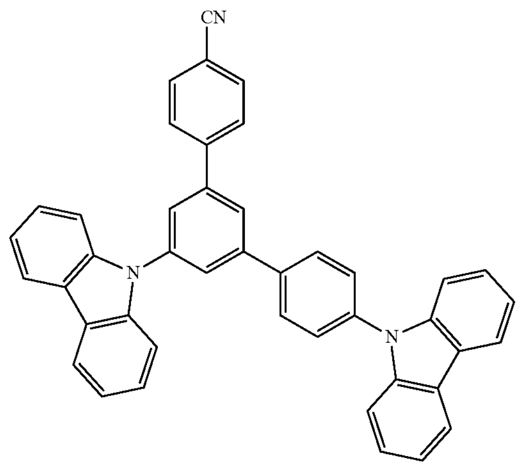
159
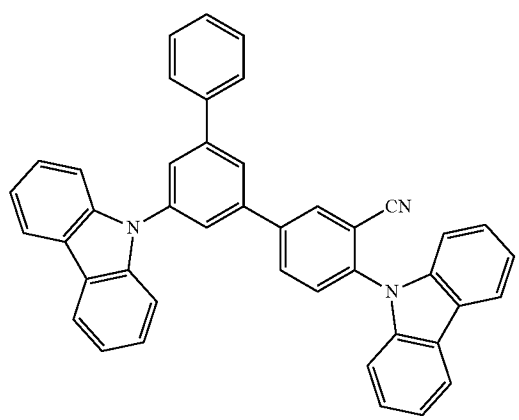
160
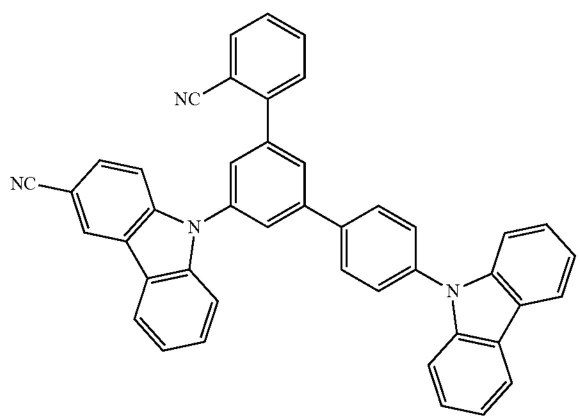

-continued
161
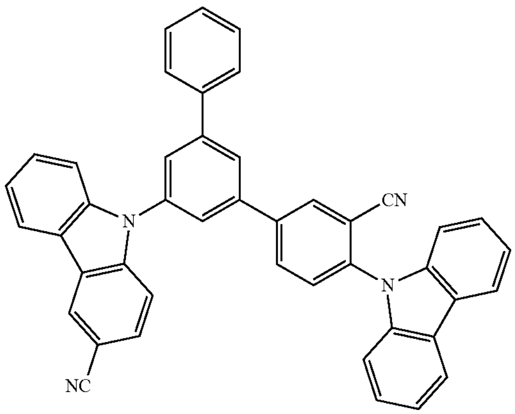
162
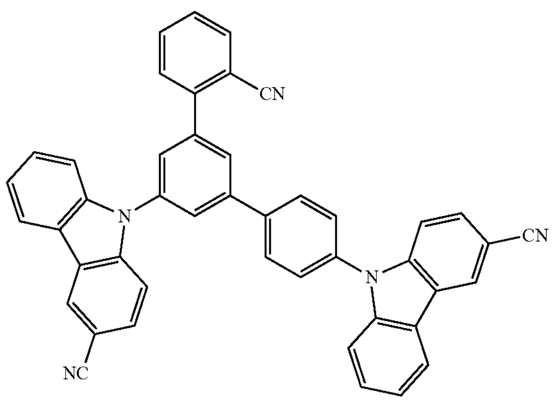
163
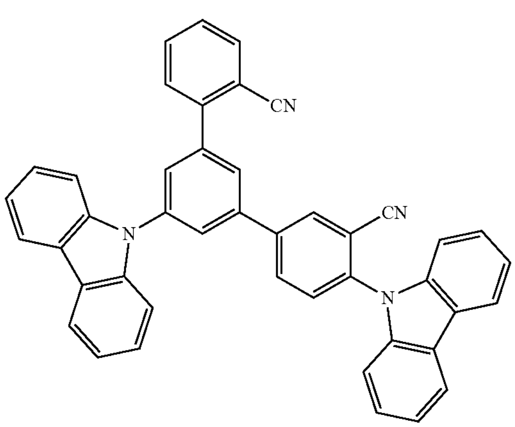
-continued
164
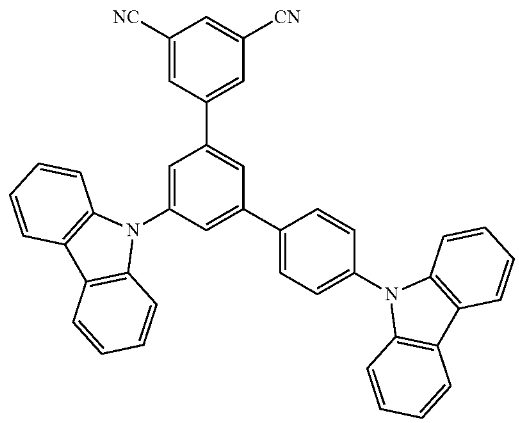
165
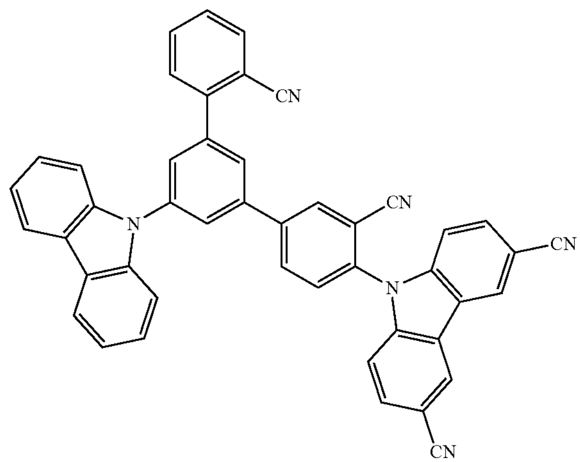
166
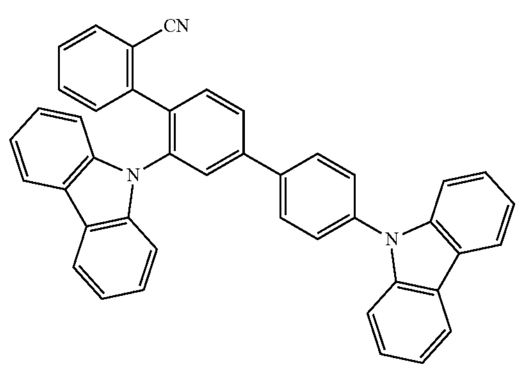

-continued
167
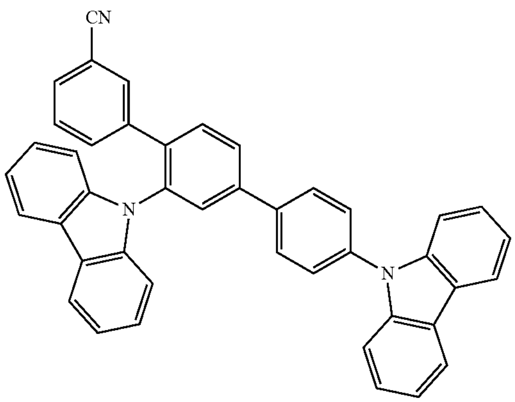
168
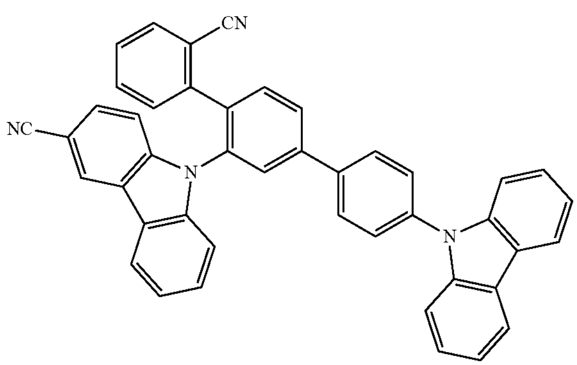
169
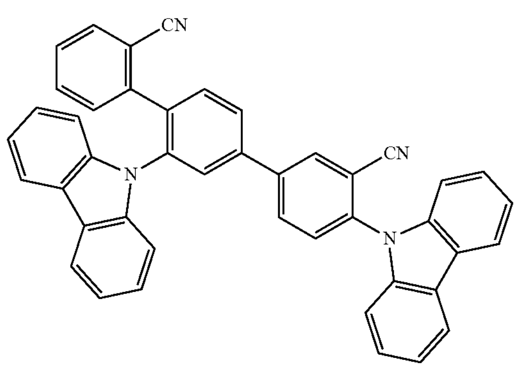
170
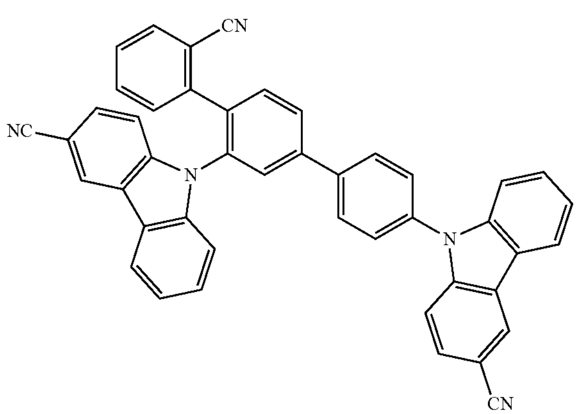
-continued
171
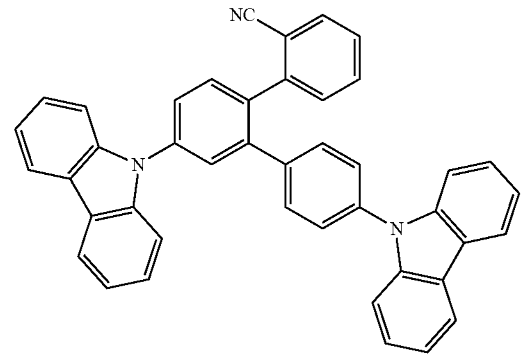
172
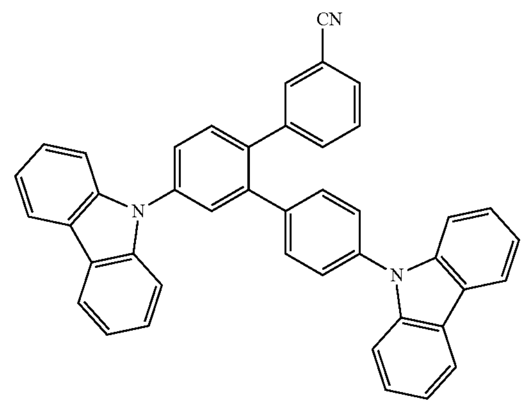
173
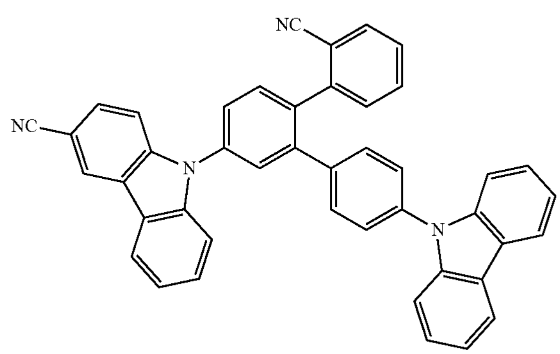
174
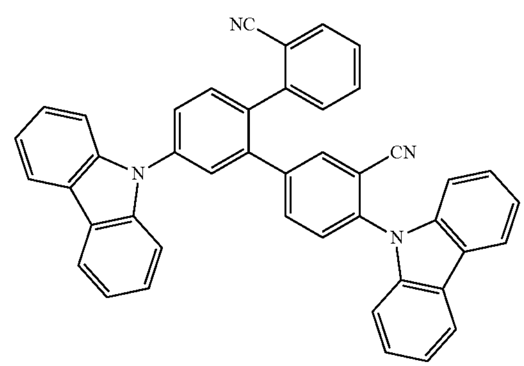

-continued
175
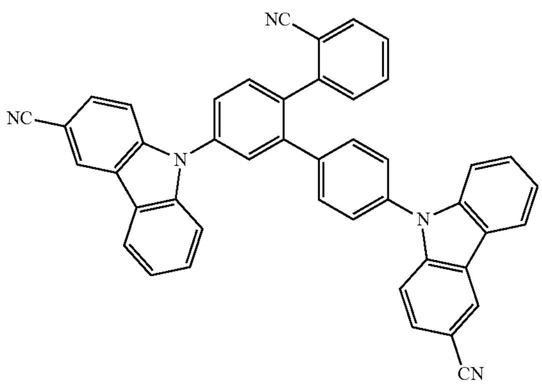
176
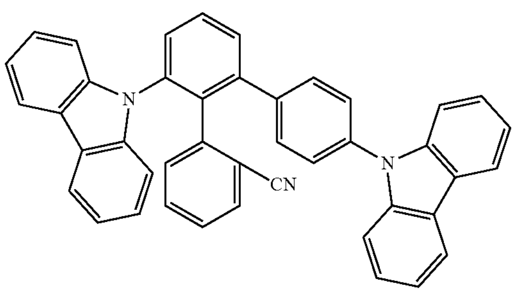
177
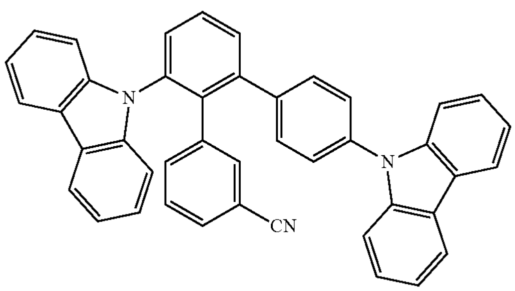
178
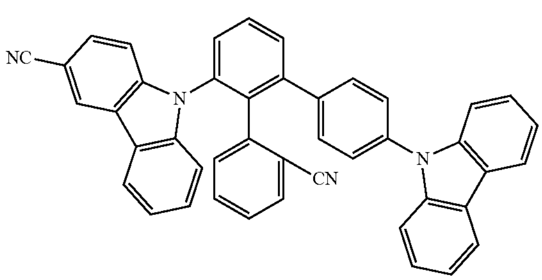
179
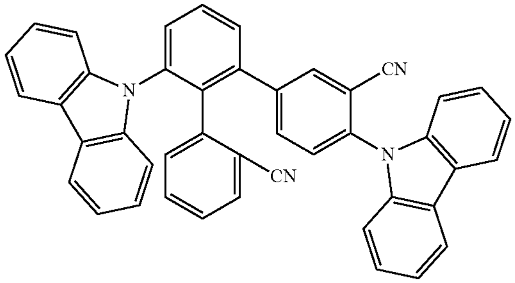
-continued
180
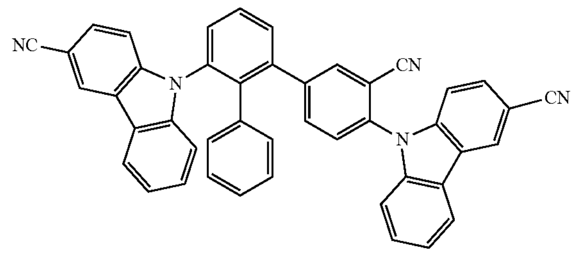
181
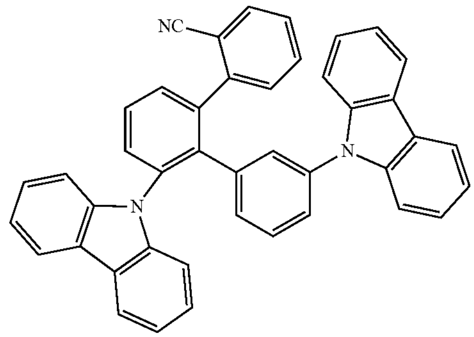
182
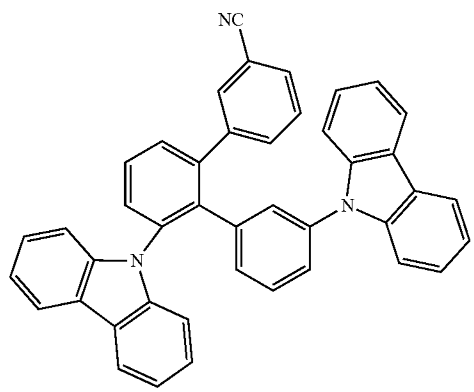
183
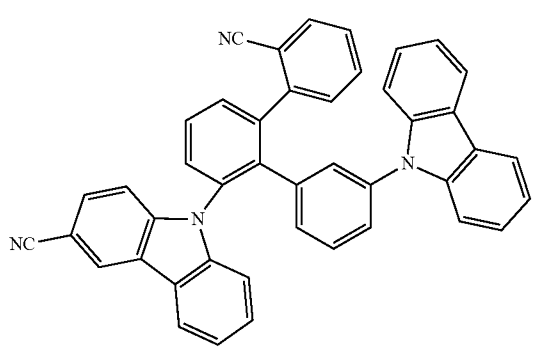

-continued
184
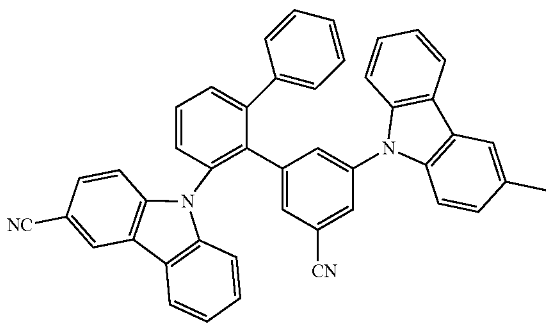
185
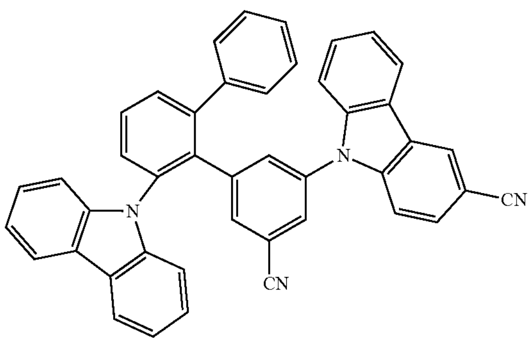
186
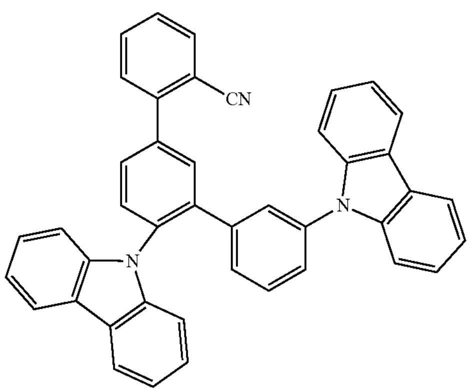
187
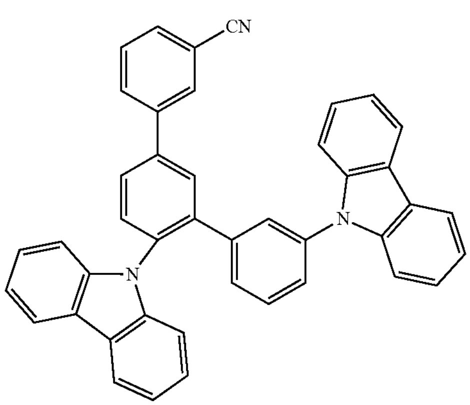
-continued
188
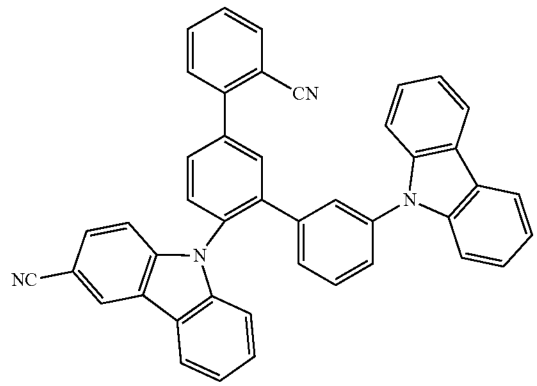
189
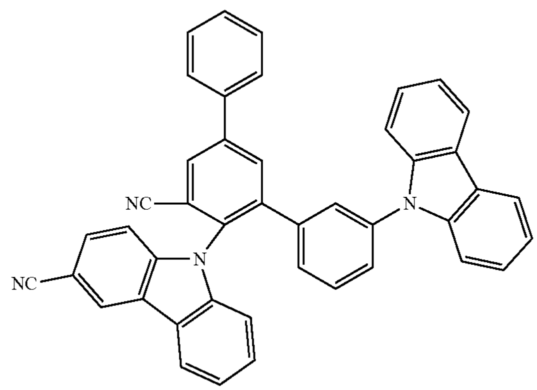
190
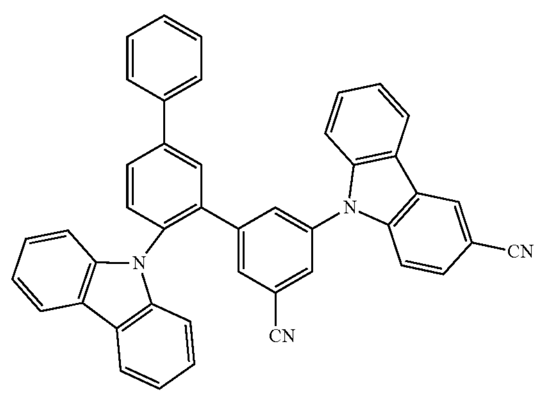
191
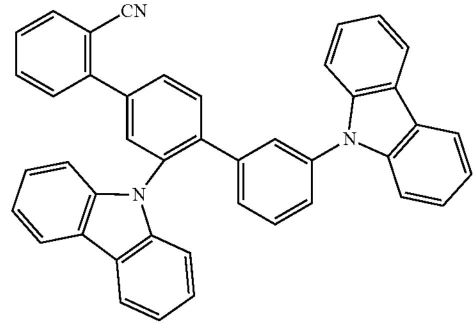

-continued
192
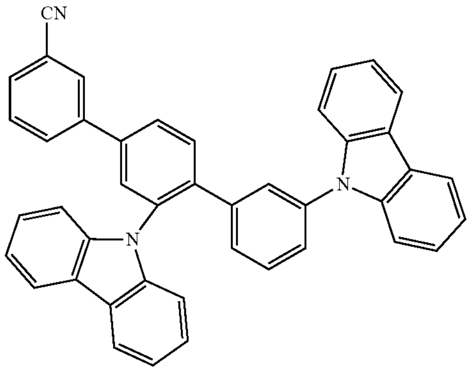
193
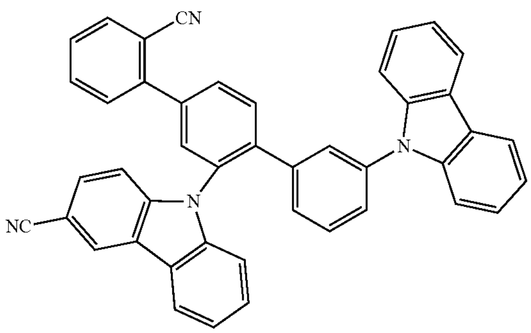
194
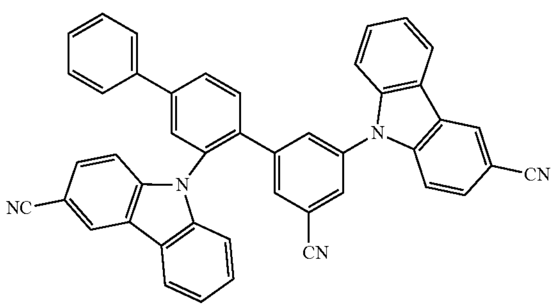
195
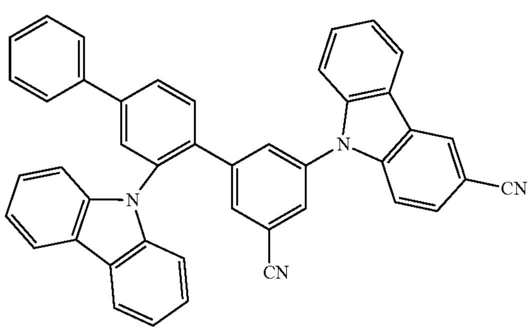
-continued
196
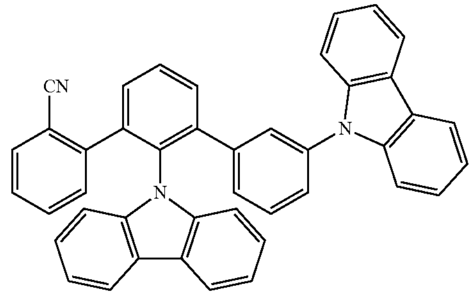
197
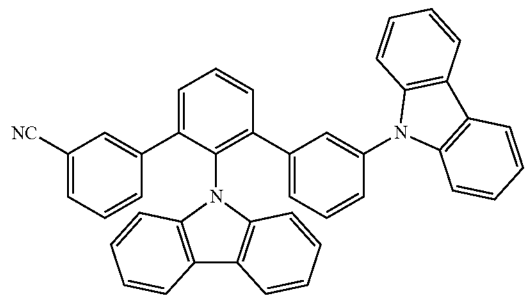
198
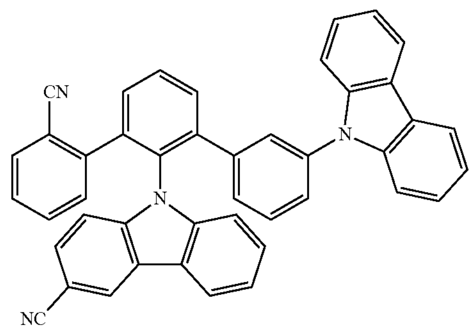
199
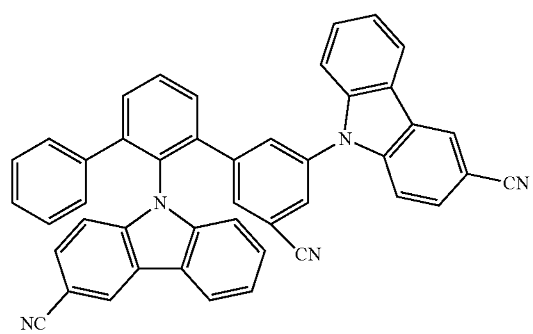
200
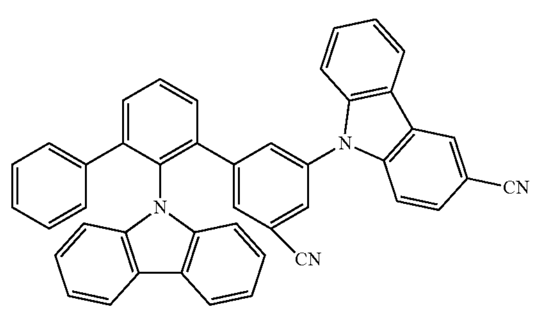

-continued
201
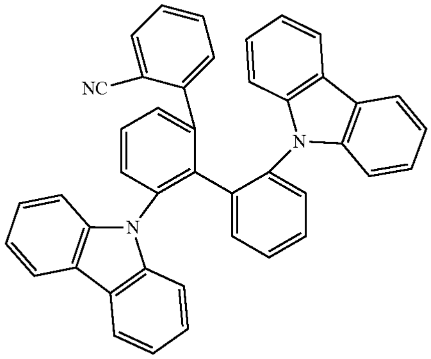
202
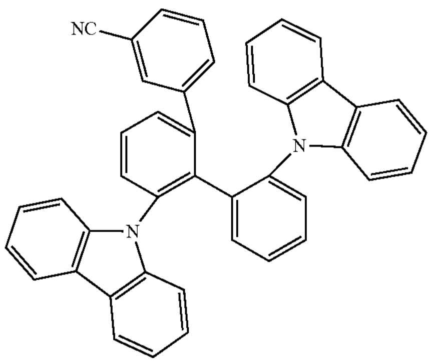
203
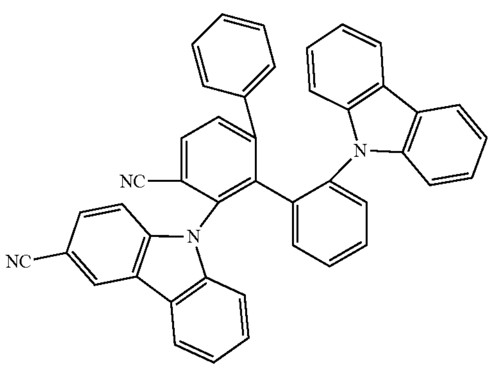
204
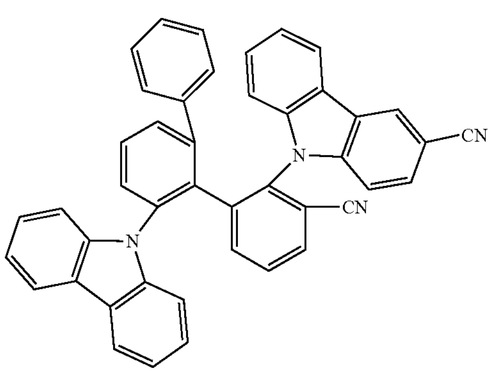
-continued
205
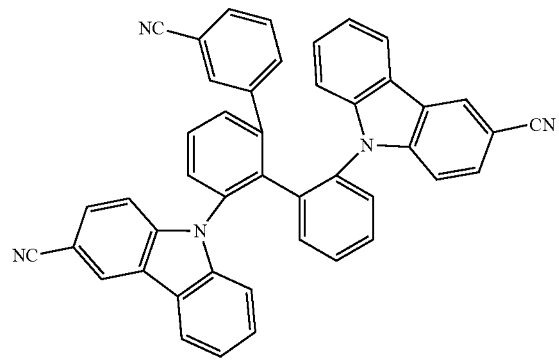
206
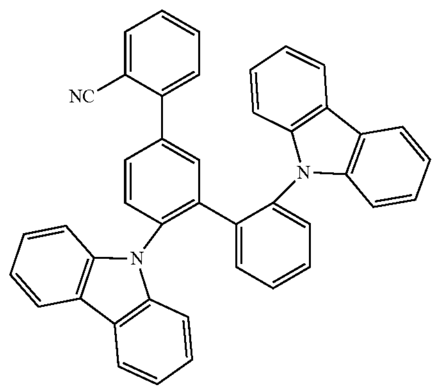
207
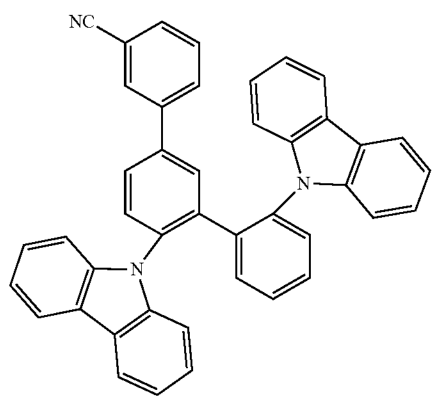
208
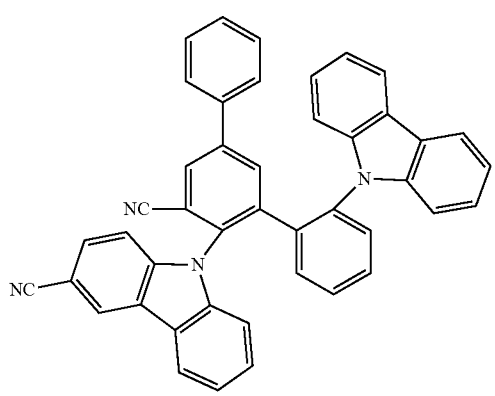

-continued
209
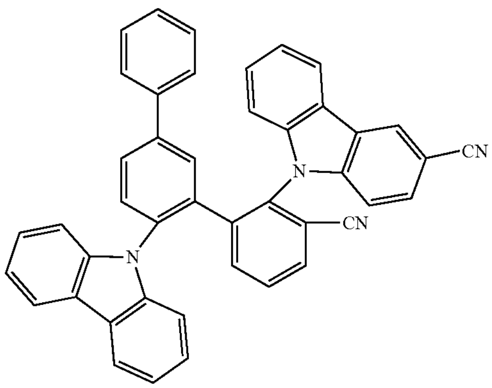
210
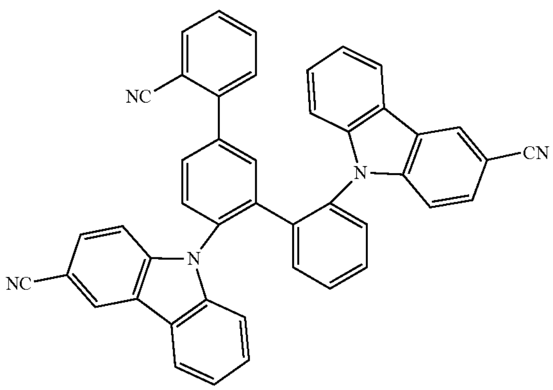
211
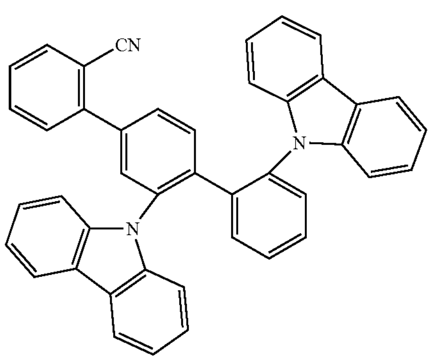
212
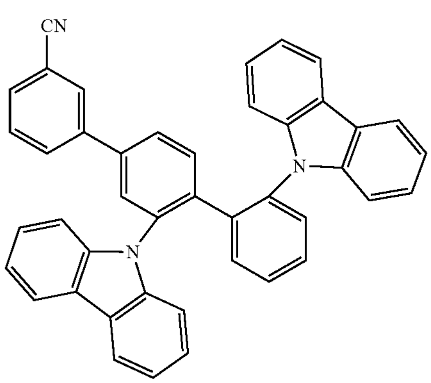
-continued
213
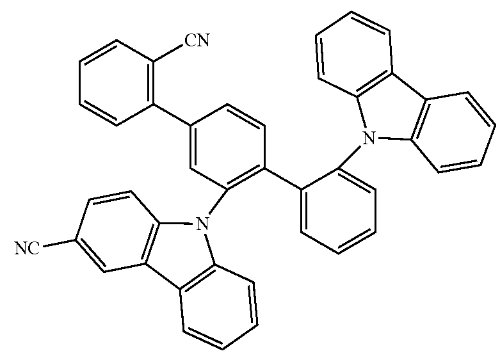
214
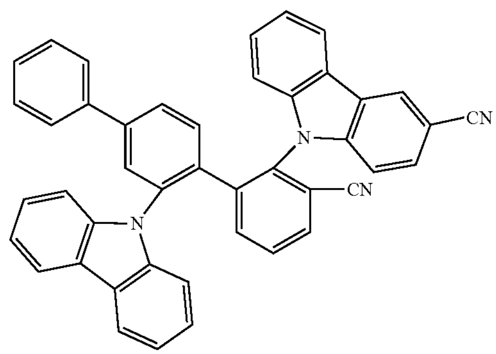
215
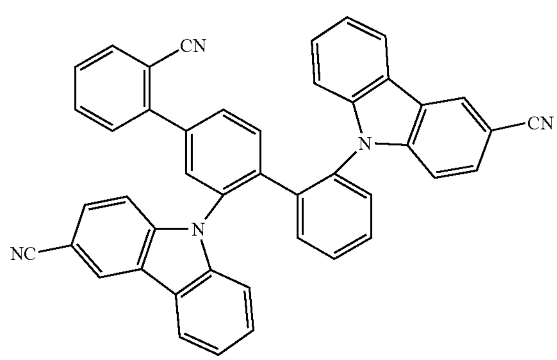
216
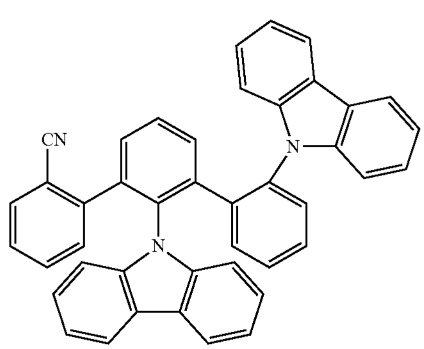

-continued
217
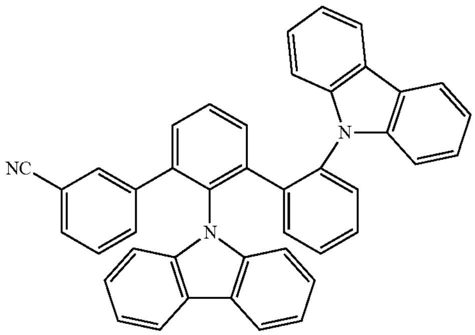
218
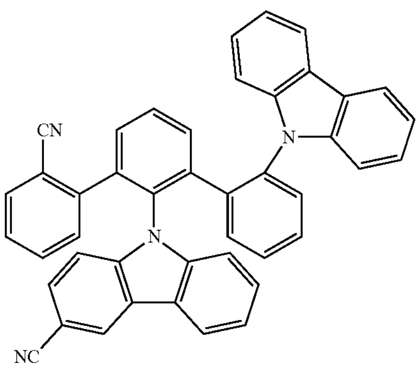
219
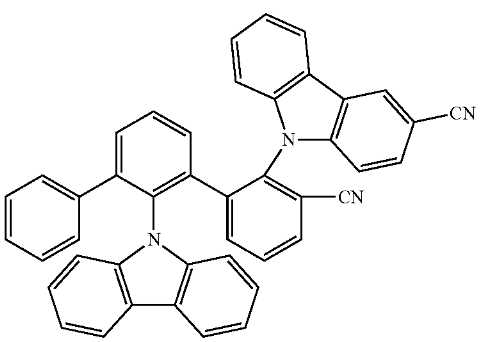
220
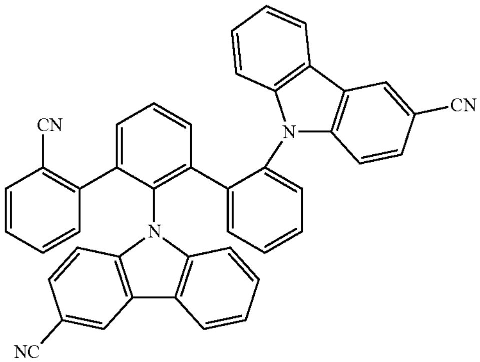
-continued
221
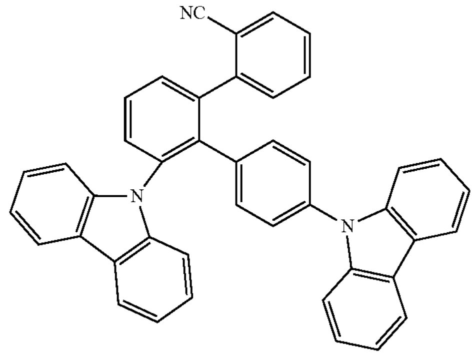
222
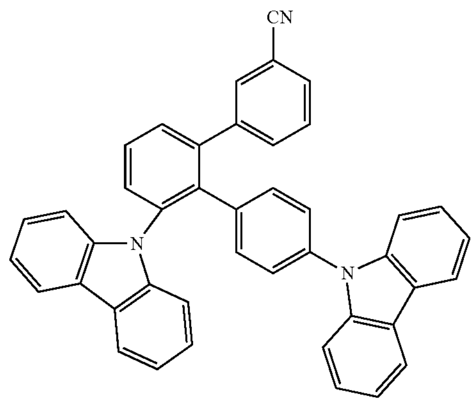
223
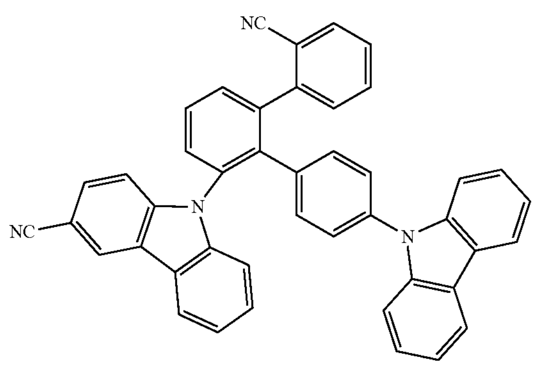
224
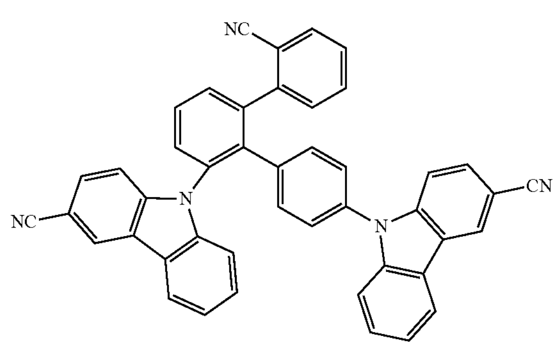

-continued
225
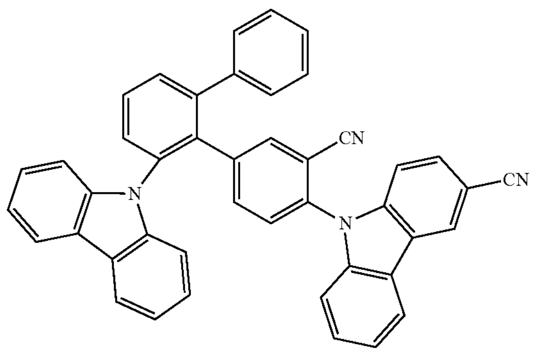
226
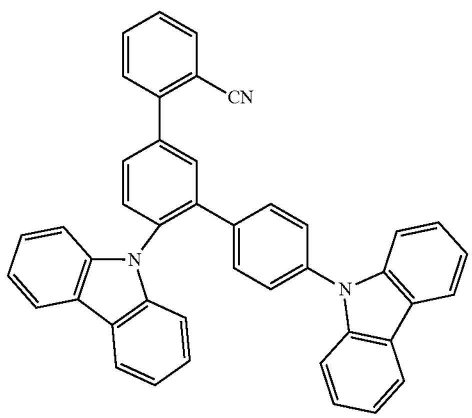
227
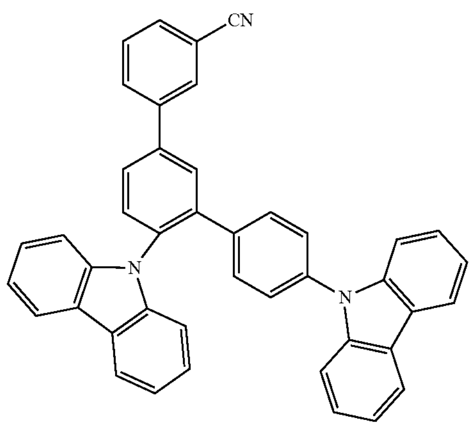
228
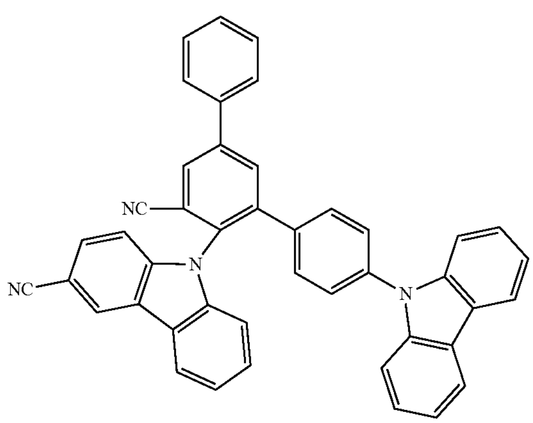
-continued
229
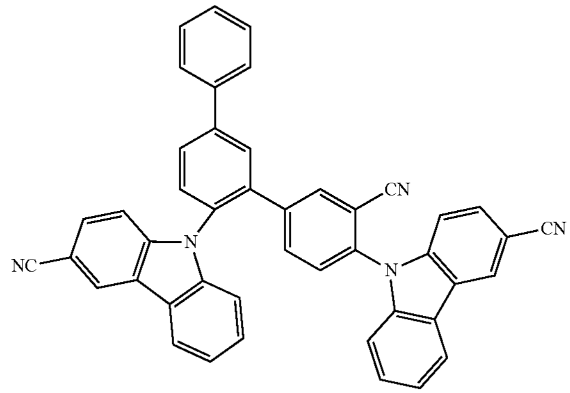
230
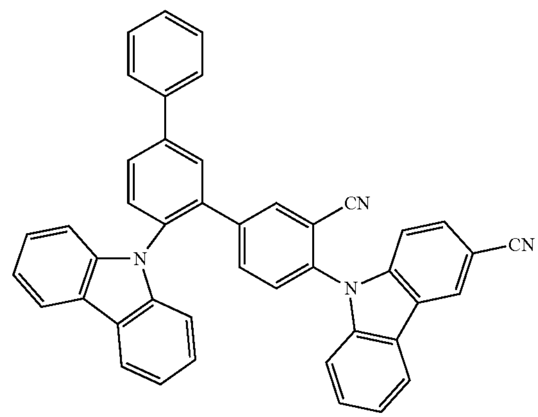
231
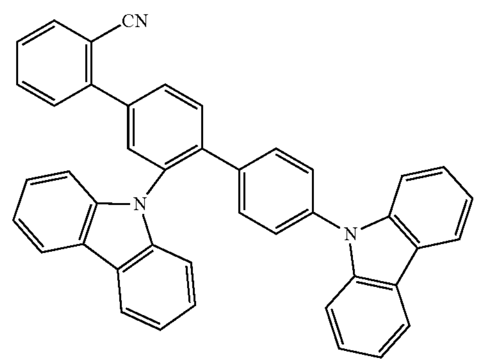
232
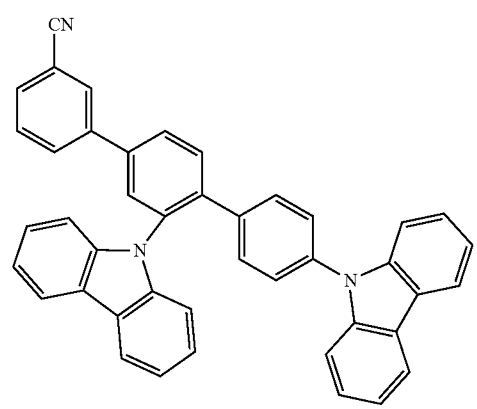

-continued
233
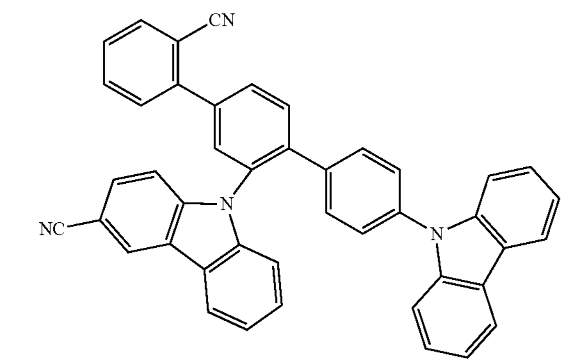
234
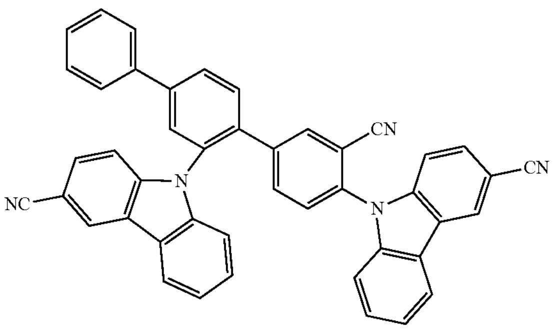
235
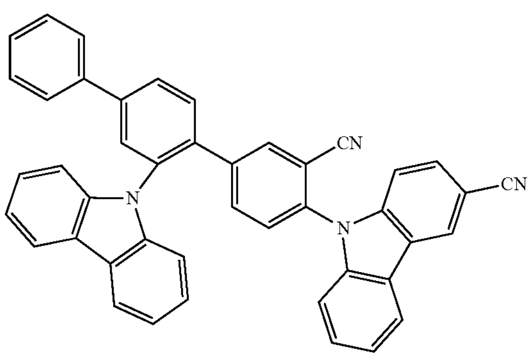
236
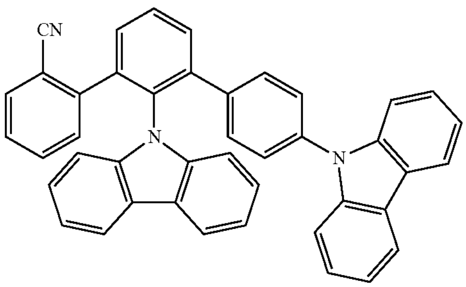
-continued
237
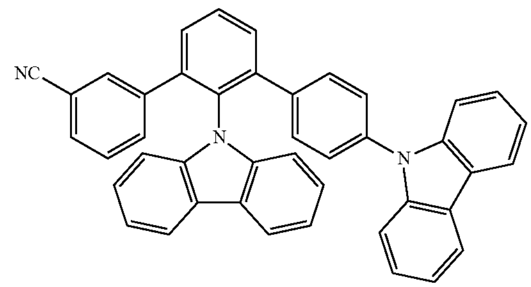
238
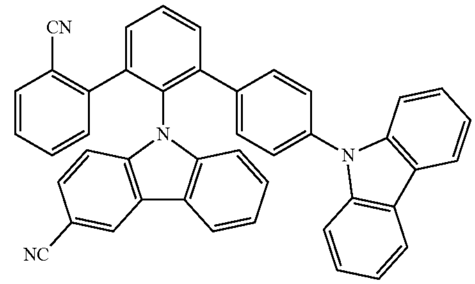
239
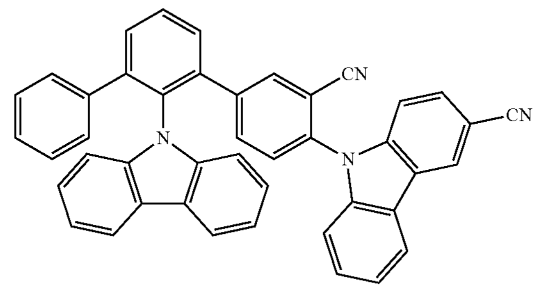
240
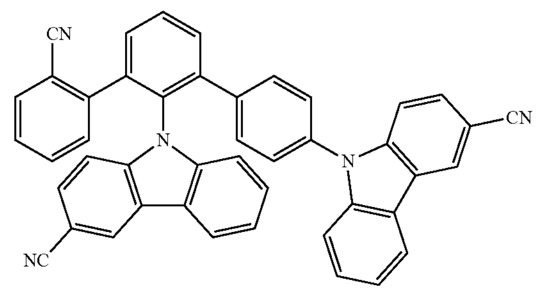
241
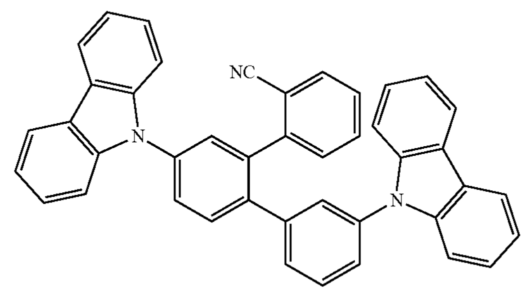

242
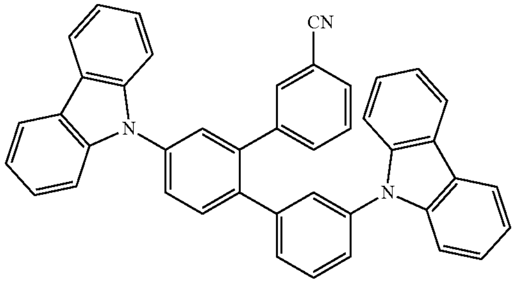
243
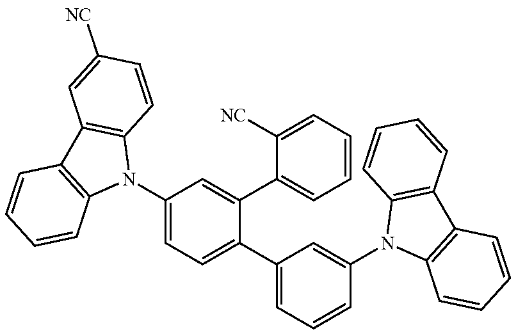
244
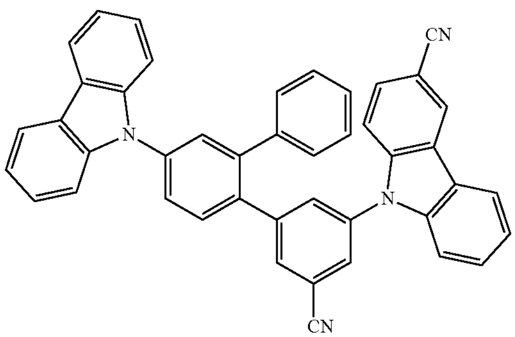
245
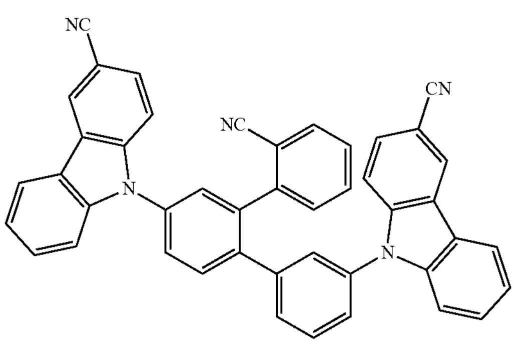
246
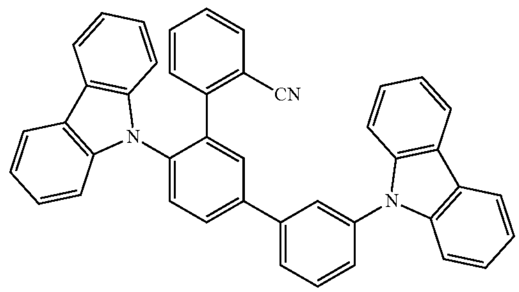
247
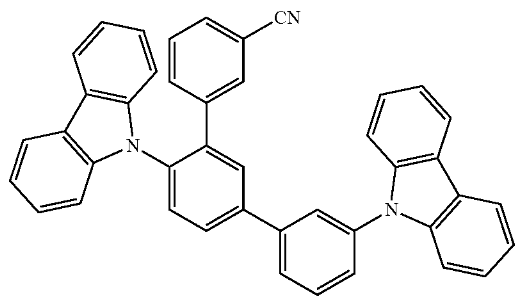
248
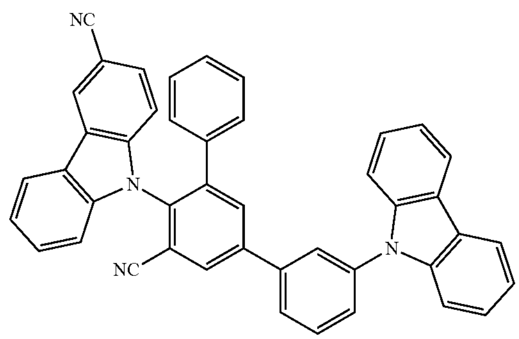
249
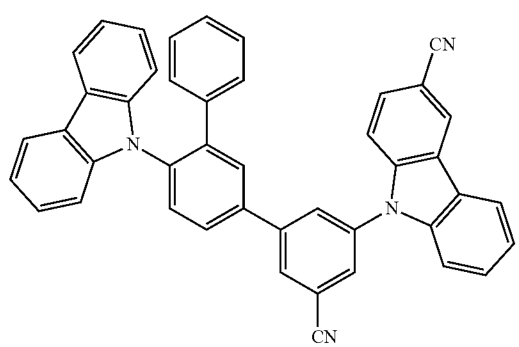

-continued
250
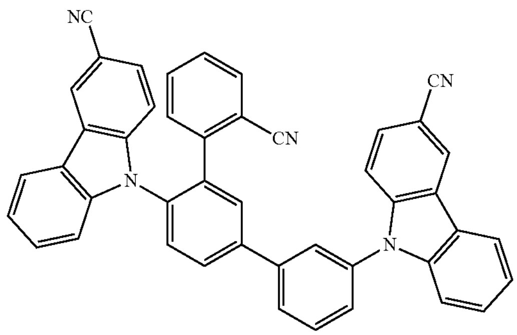
251
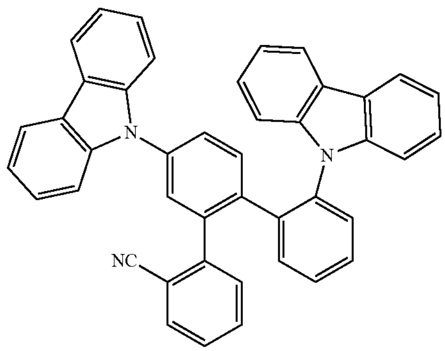
252
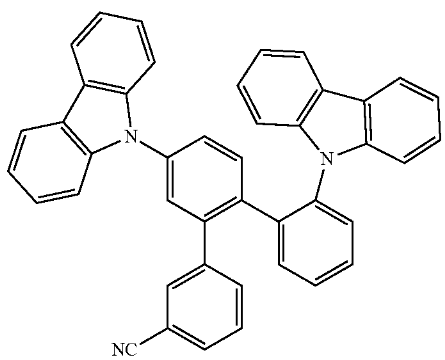
253
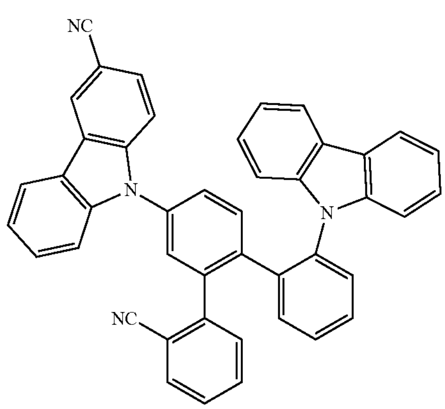
-continued
254
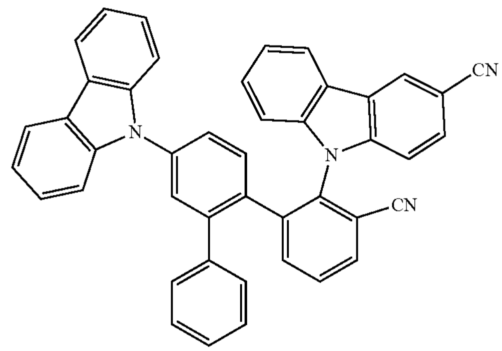
255
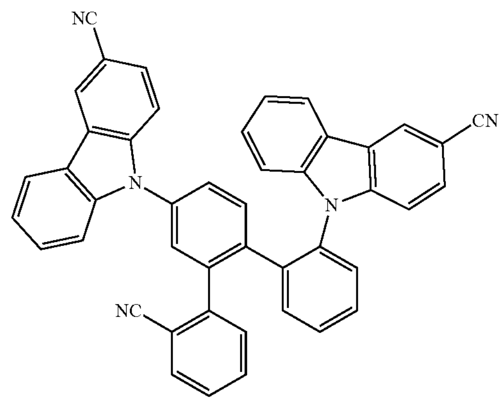
256
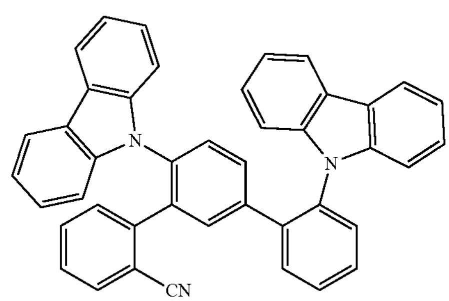
257
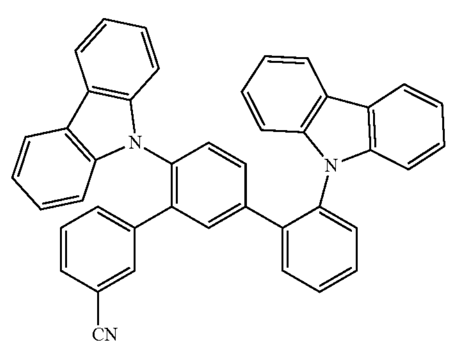

-continued
258
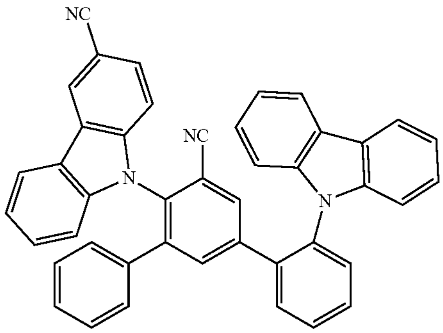
259
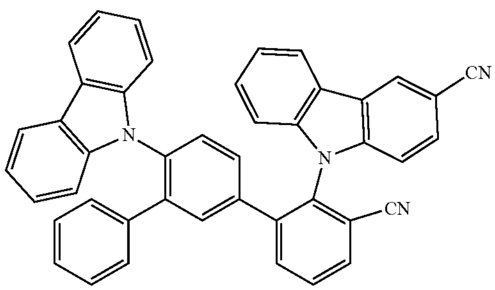
260
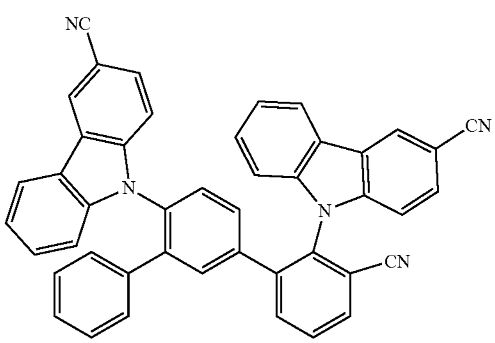
In one or more embodiments, the hole transport host may be one of Compounds H-H1 to H-H106, but embodiments of the present disclosure are not limited thereto:
H-H1
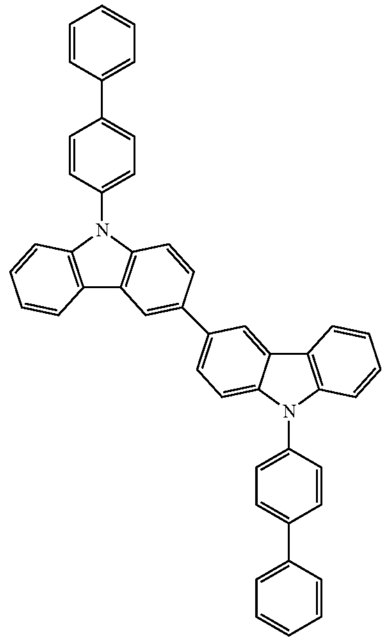
H-H2
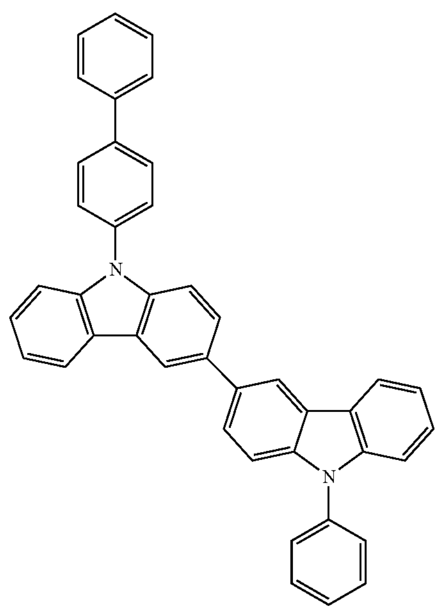

-continued
H-H3
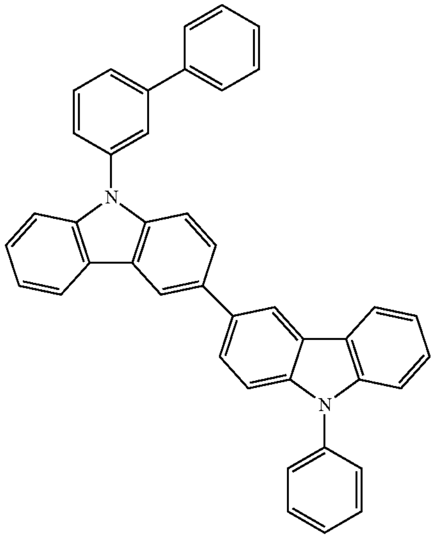
H-H4
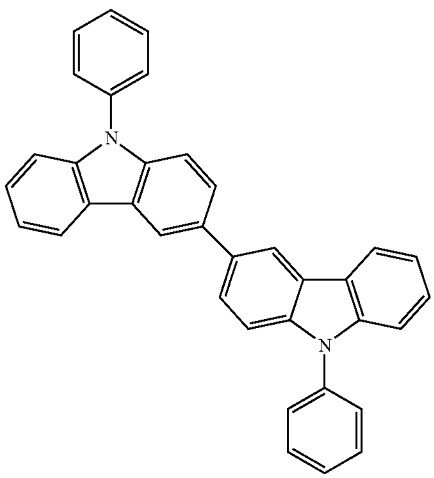
H-H5
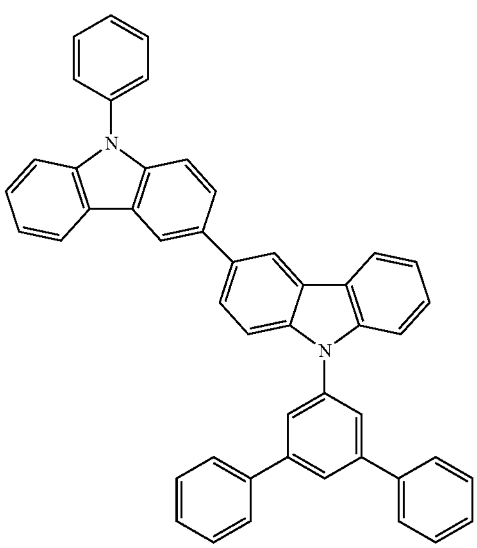
-continued
H-H6
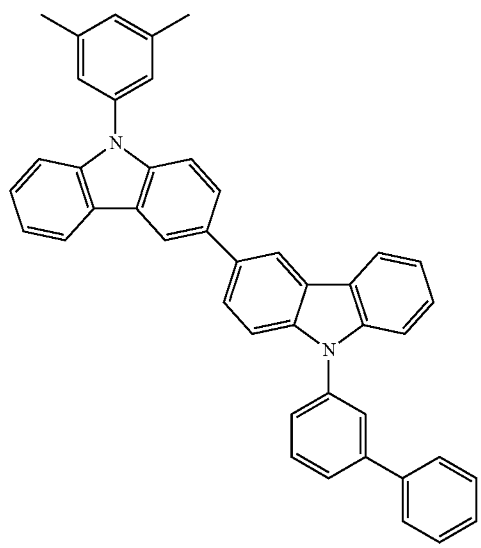
H-H7
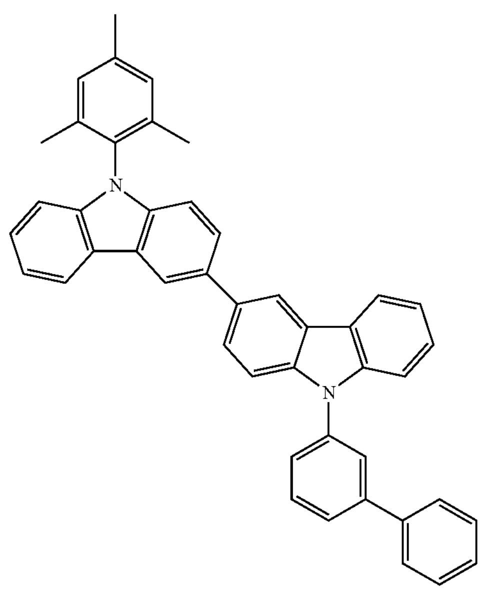

-continued
H-H8
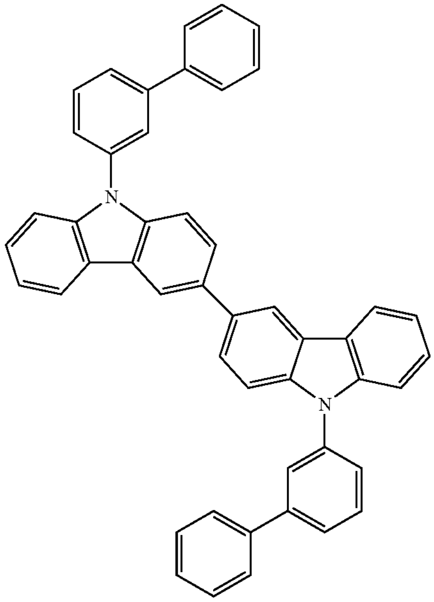
H-H9
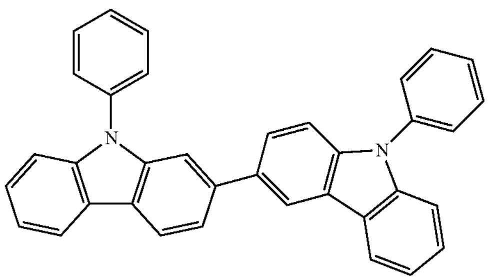
H-H10
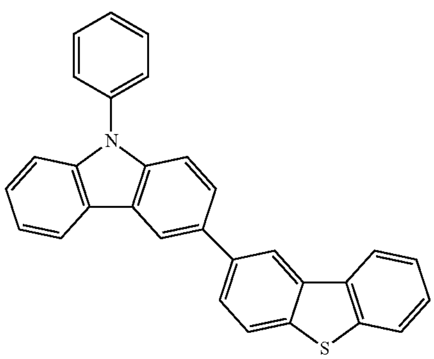
H-H11
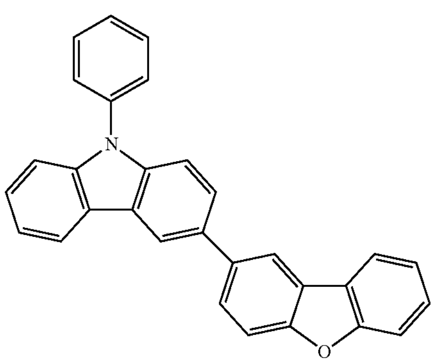
-continued
H-H12
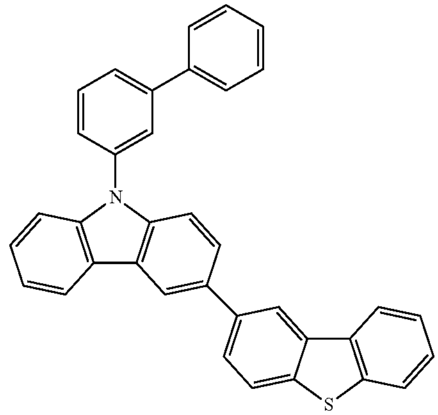
H-H13
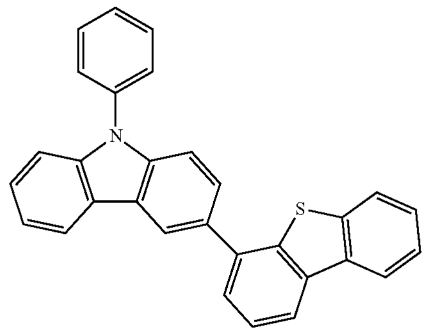
H-H14
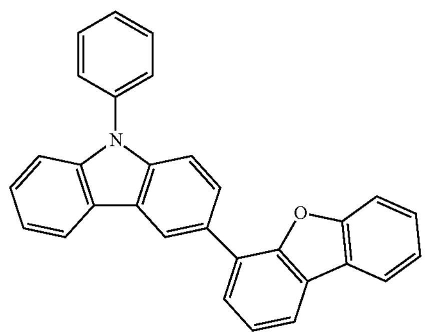
H-H15
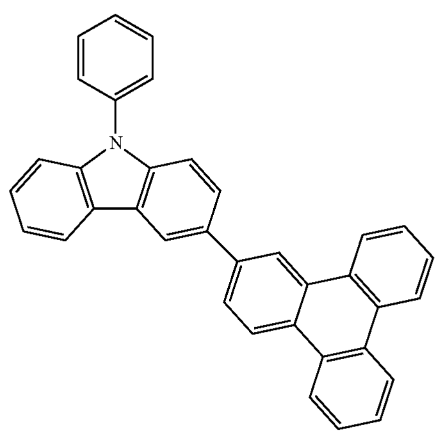

-continued
H-H16
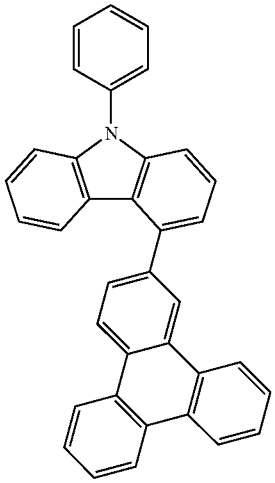
H-H17
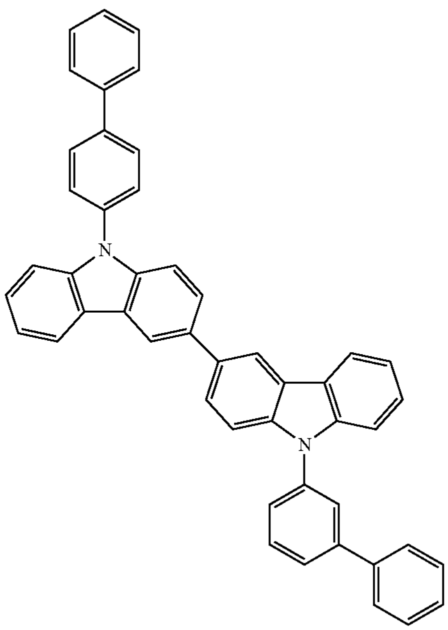
H-H18
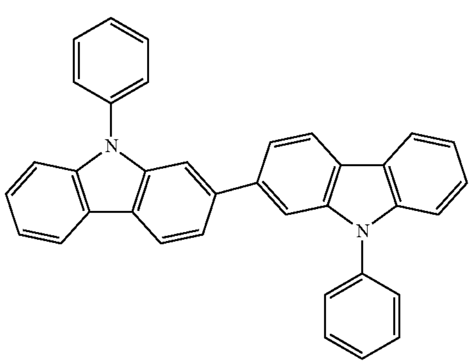
-continued
H-H19
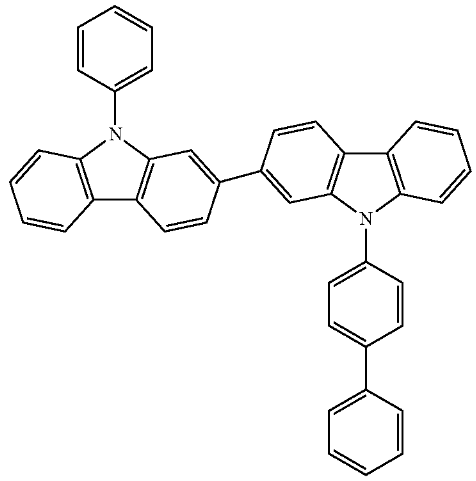
H-H20
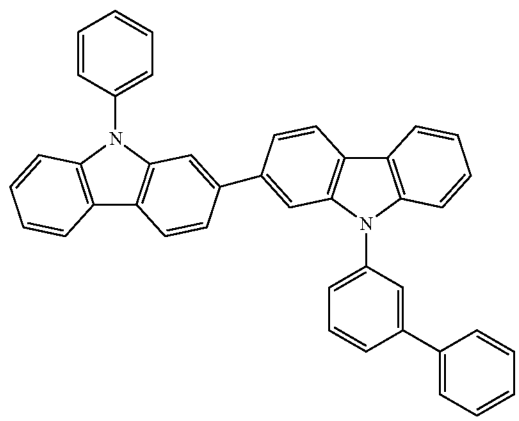
H-H21
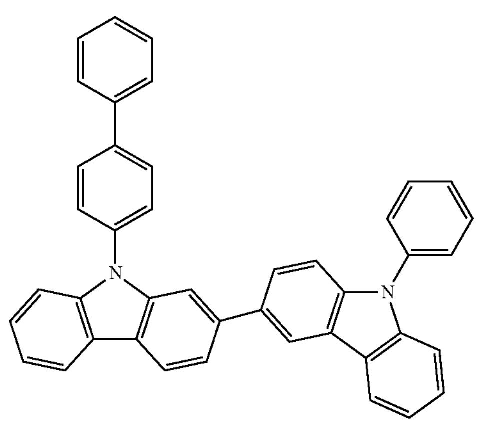

H-H22
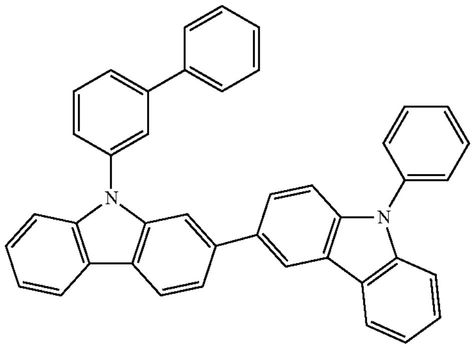
H-H23
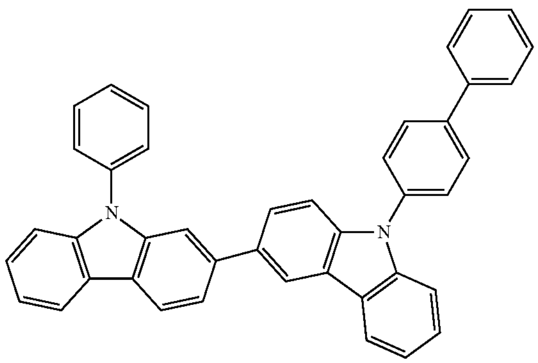
H-H24
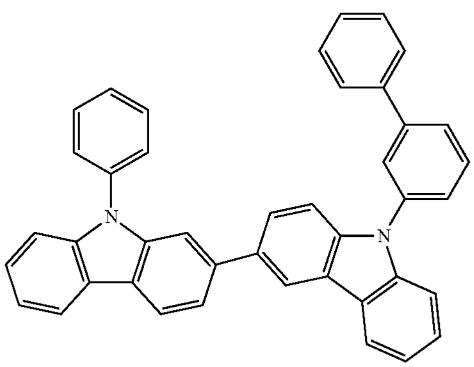
H-H25
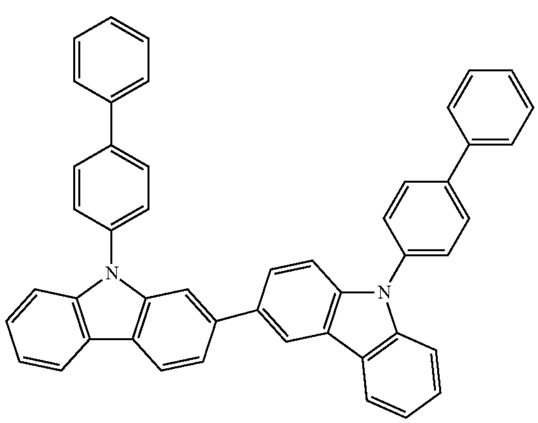
H-H26
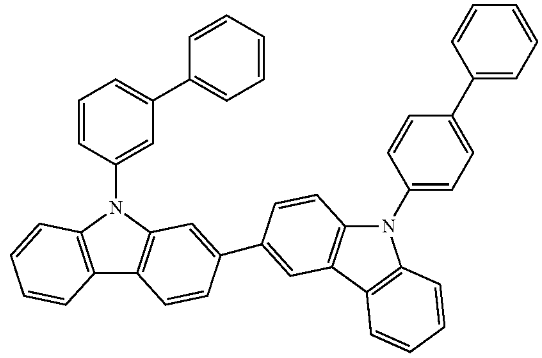
H-H27
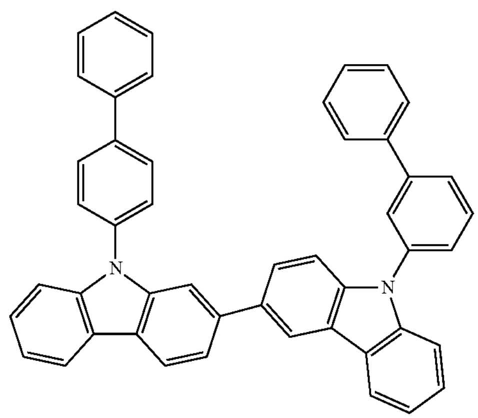
H-H28
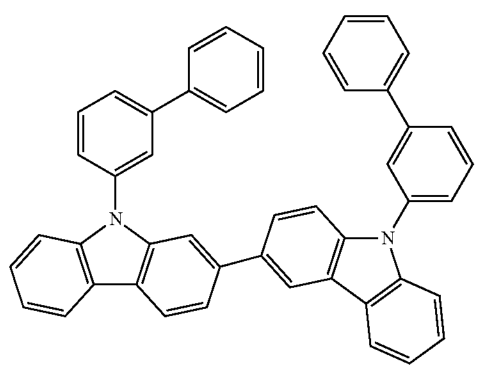

-continued
H-H29
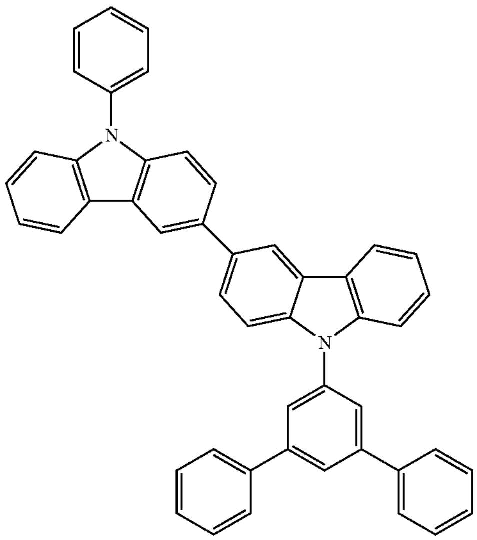
H-H30
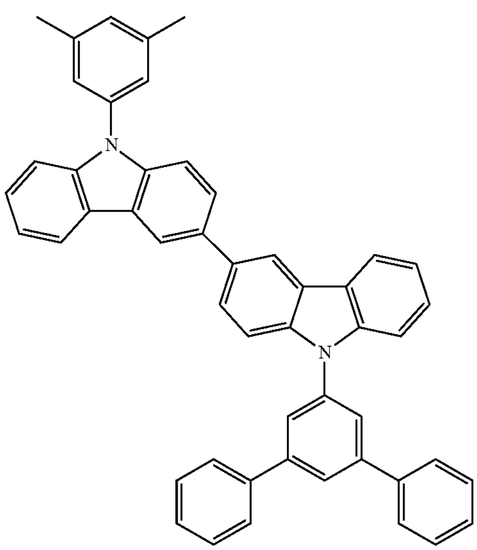
-continued
H-H31
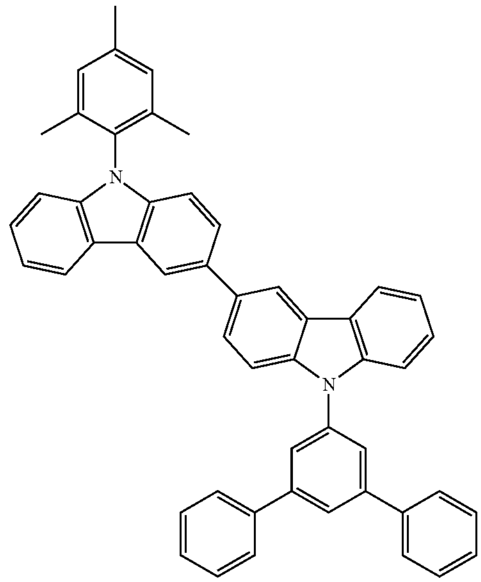
H-H32
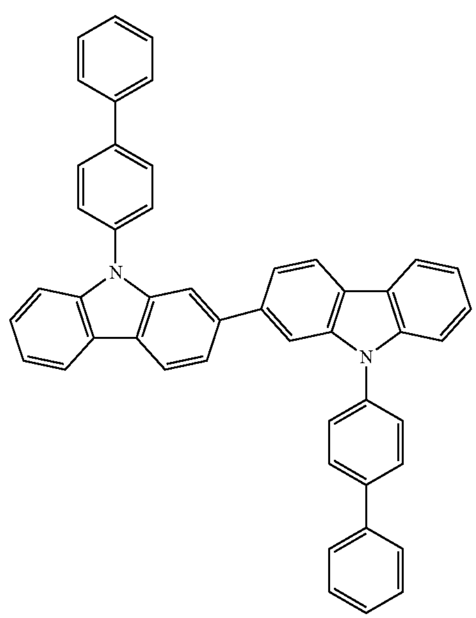

-continued
H-H33
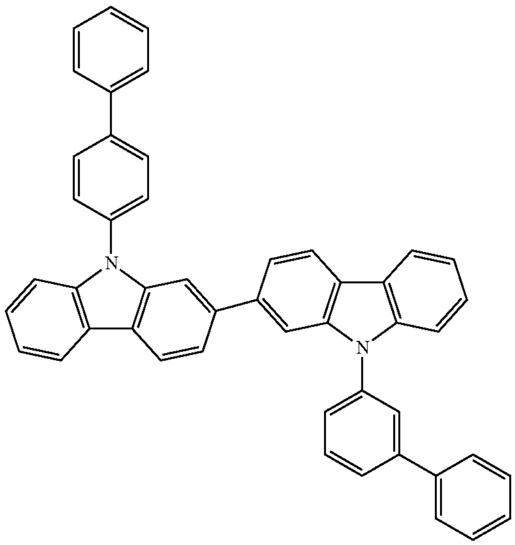
H-H34
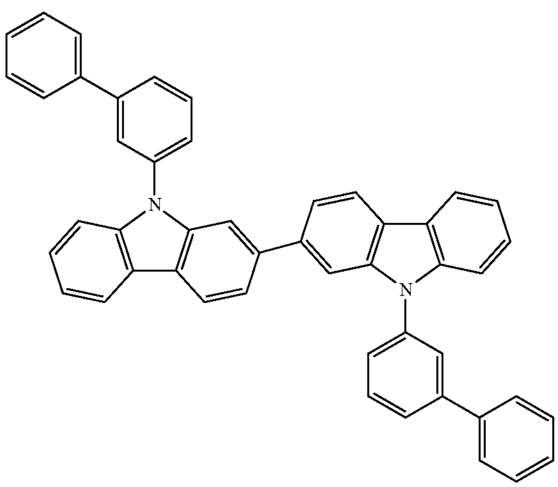
H-H35
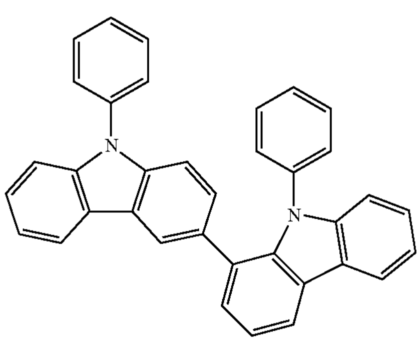
-continued
H-H36
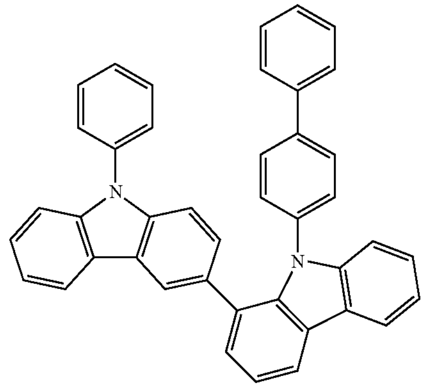
H-H37
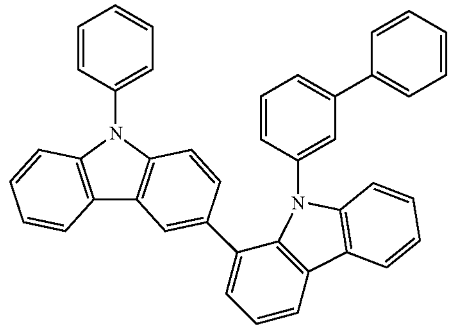
H-H38
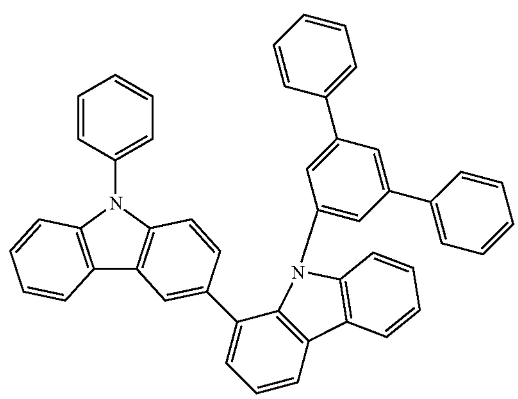
H-H39
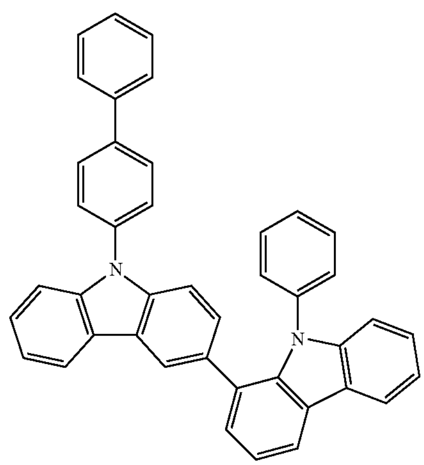

H-H40
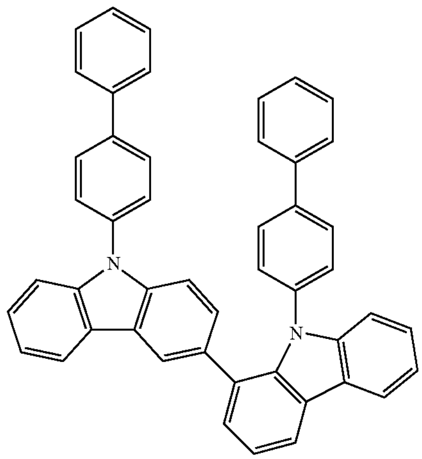
H-H41
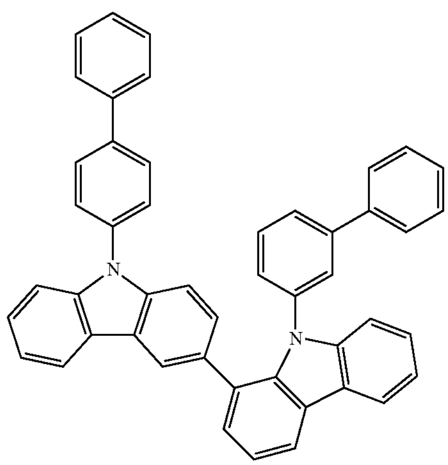
H-H42
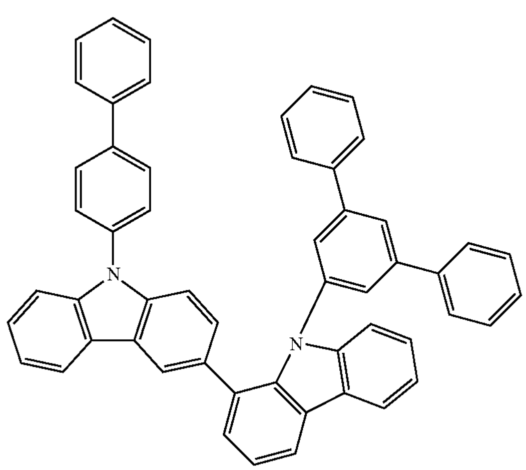
H-H43
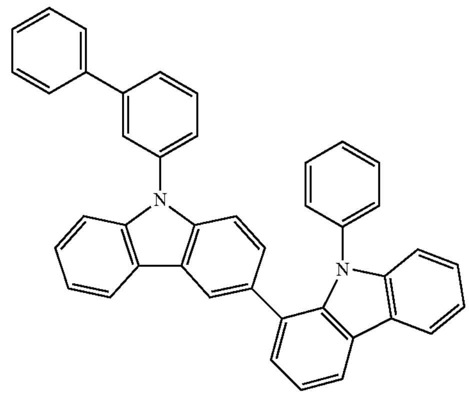
H-H44
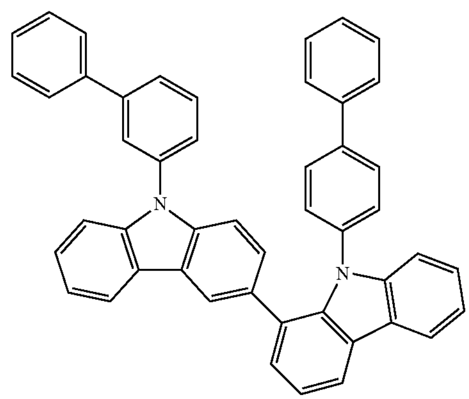
H-H45
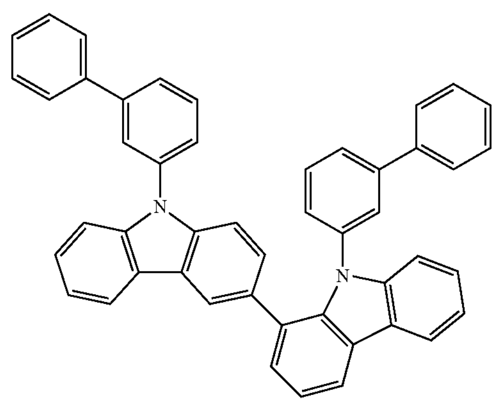
H-H46
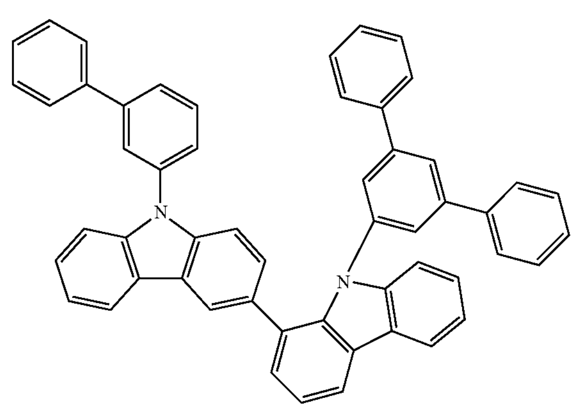

-continued
H-H47
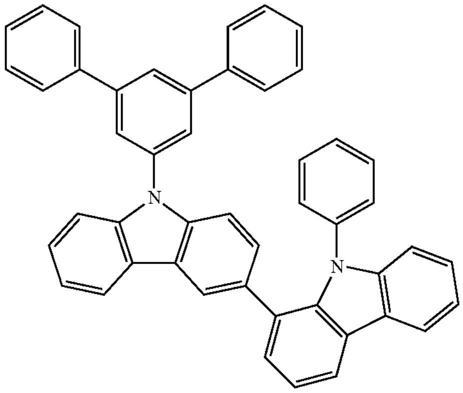
H-H48
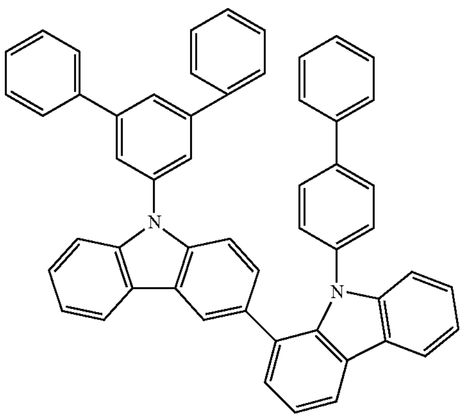
H-H49
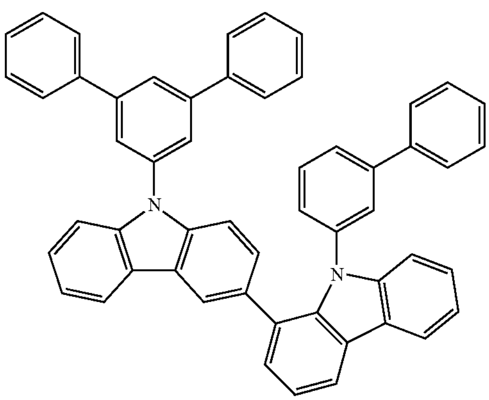
H-H50
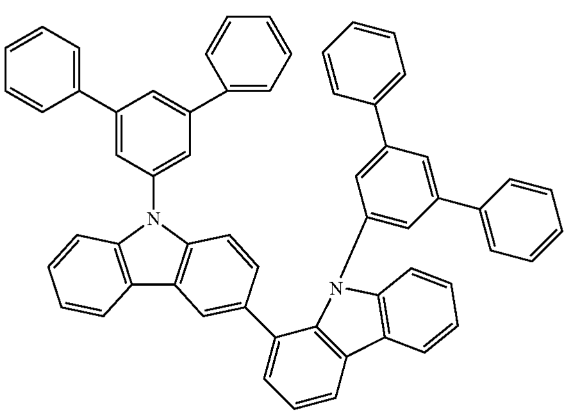
-continued
H-H51
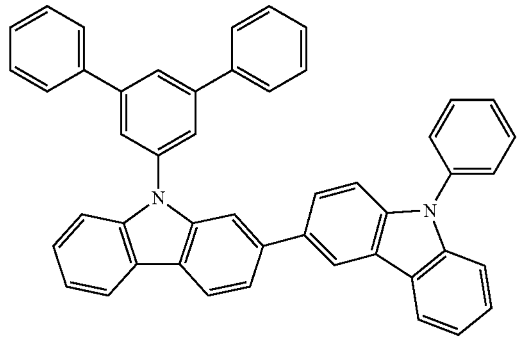
H-H52
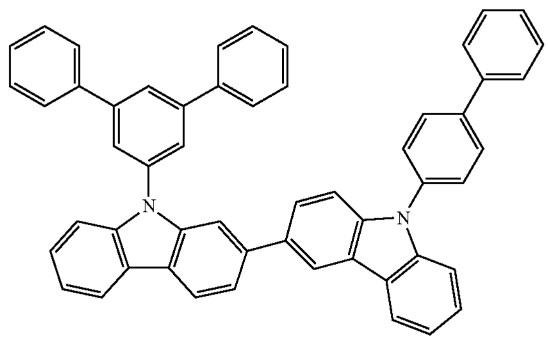
H-H53
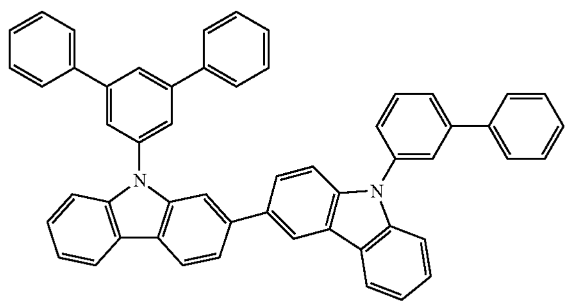
H-H54
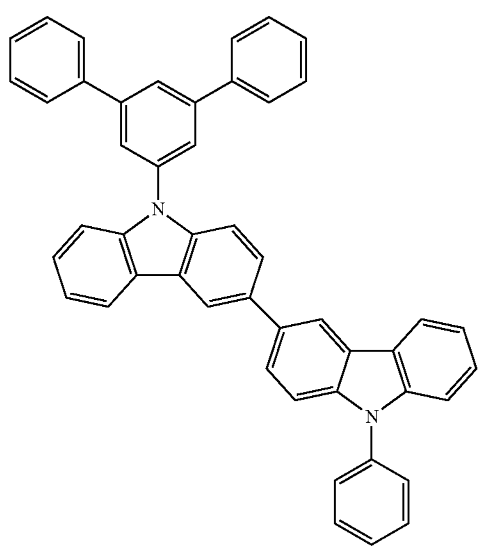

H-H55
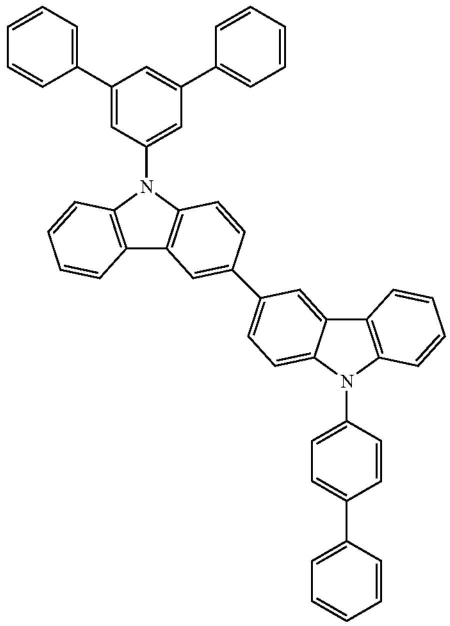
H-H56
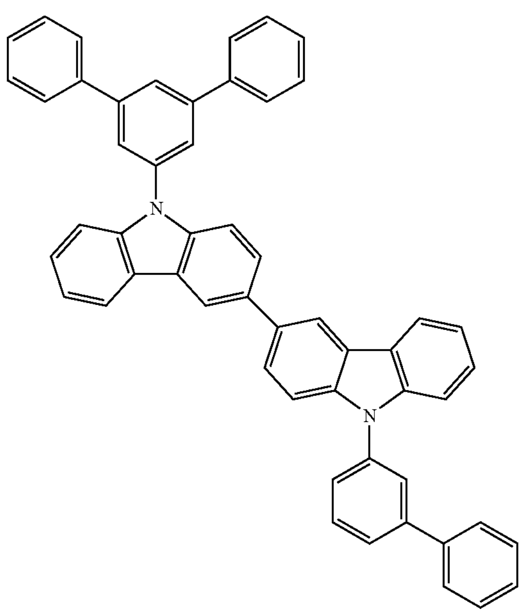
H-H57
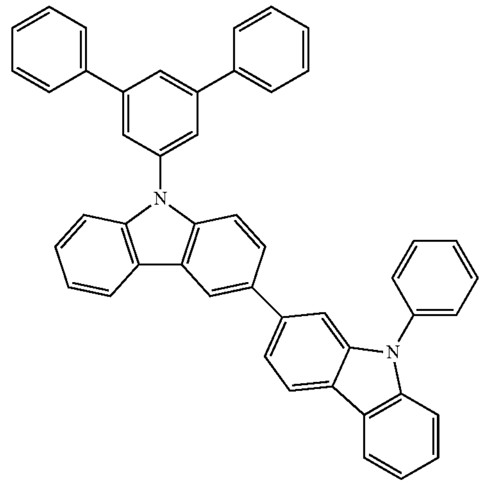
H-H58
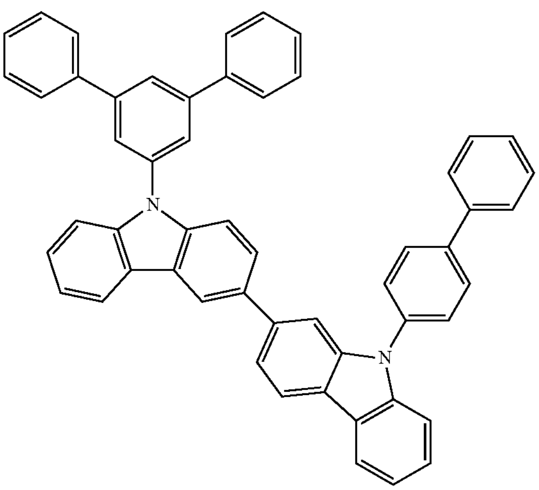
H-H59
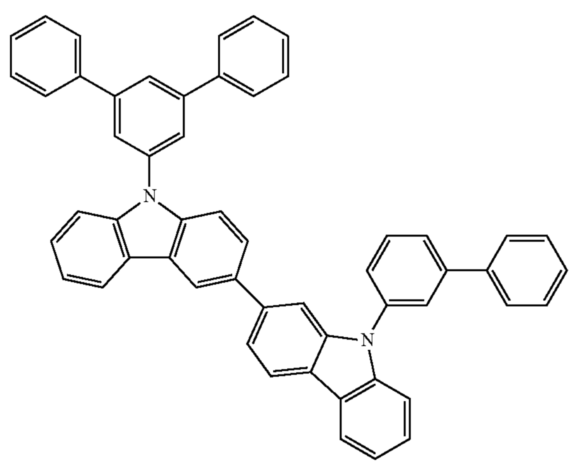

-continued
H-H60
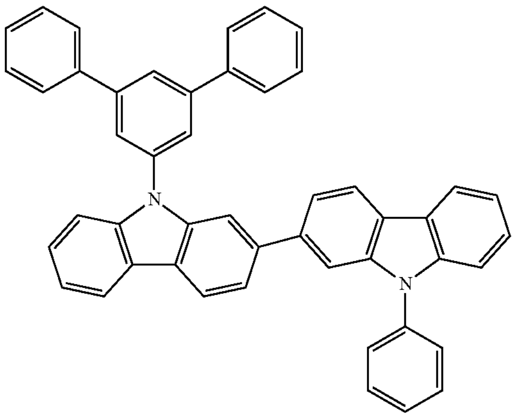
H-H61
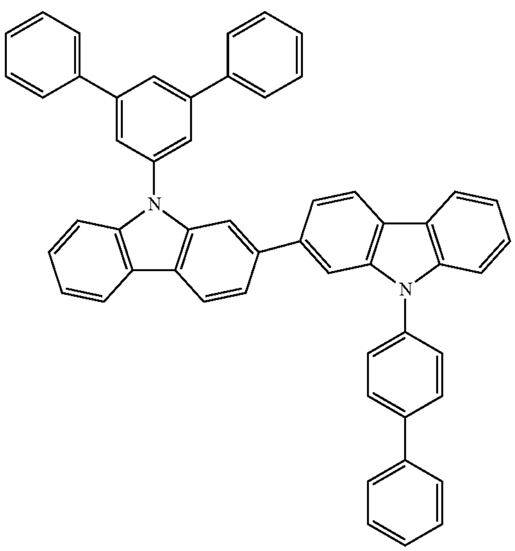
H-H62
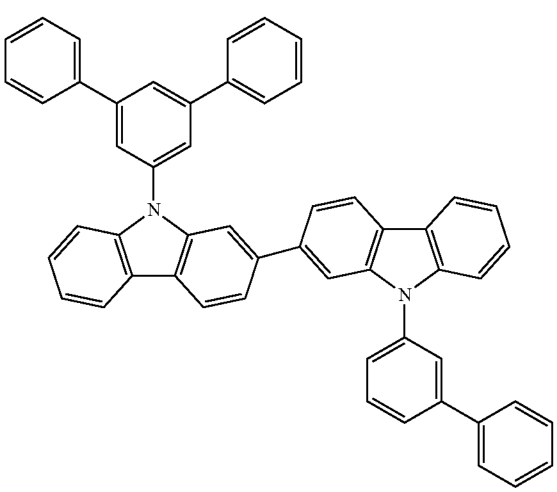
-continued
H-H63
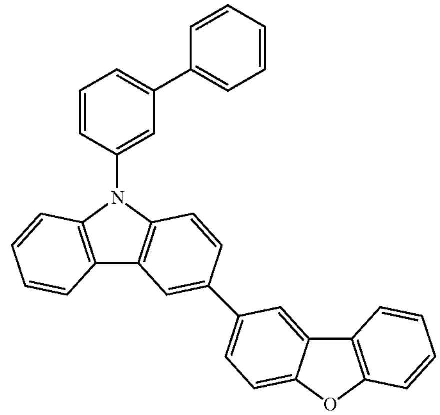
H-H64
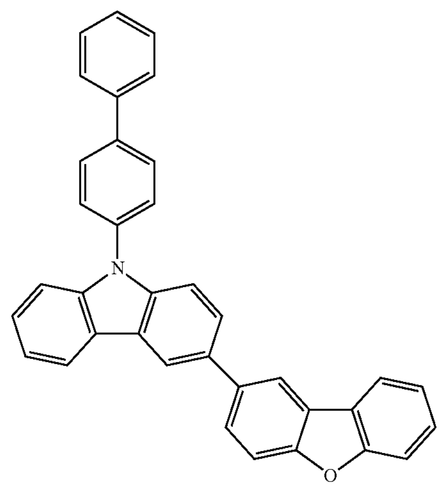
H-H65
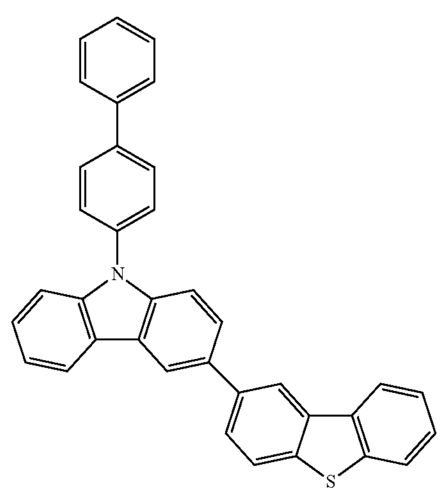

-continued
H-H66
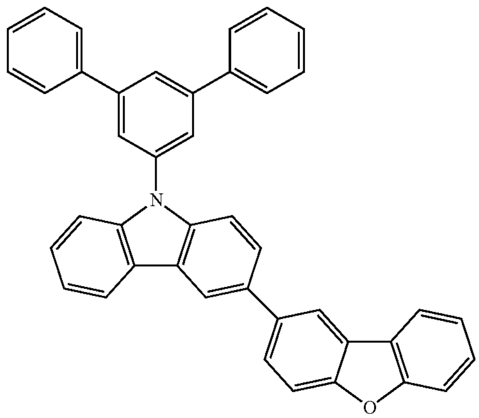
H-H67
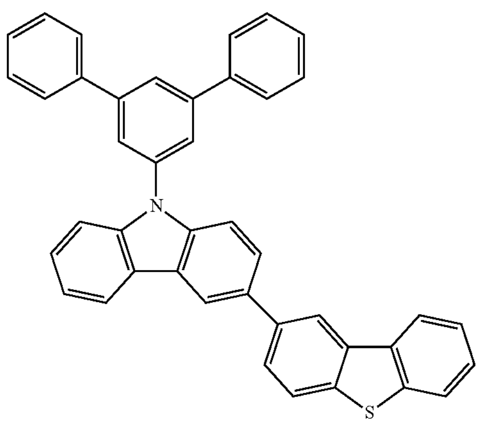
H-H68
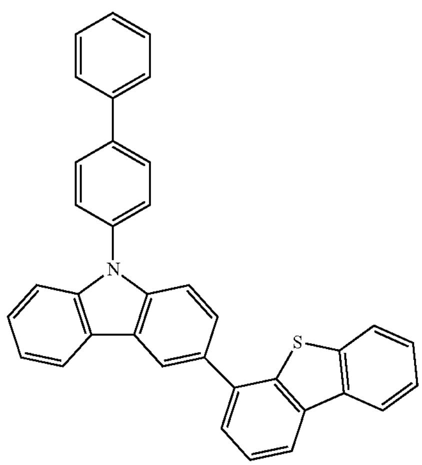
-continued
H-H69
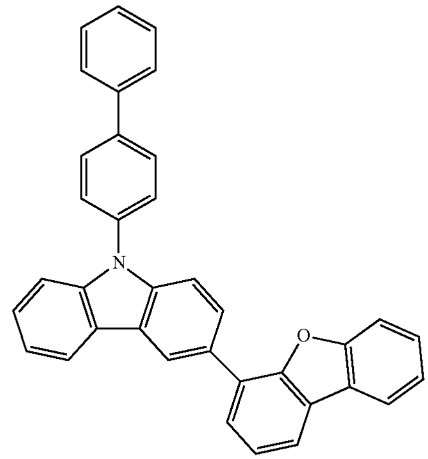
H-H70
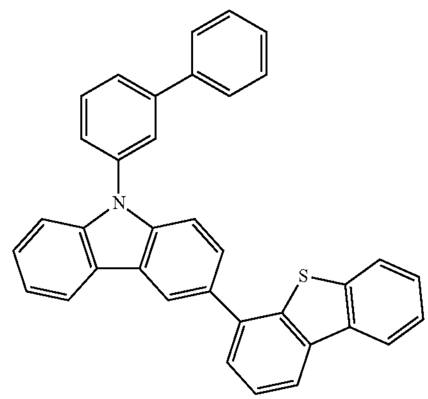
H-H71
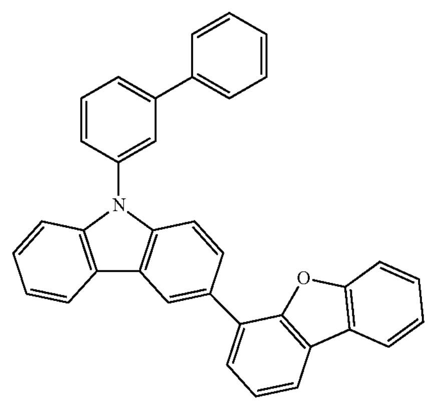
H-H72
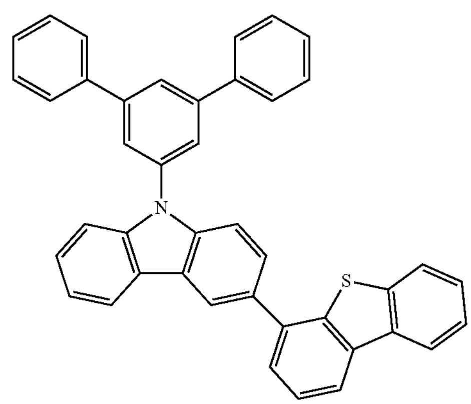

H-H73
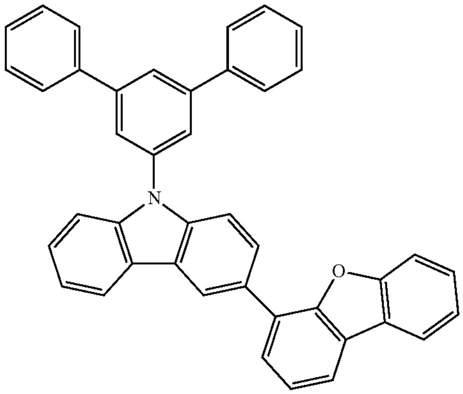
H-H74
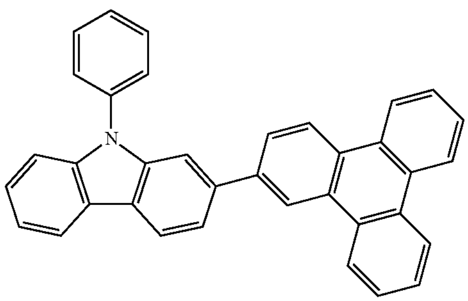
H-H75
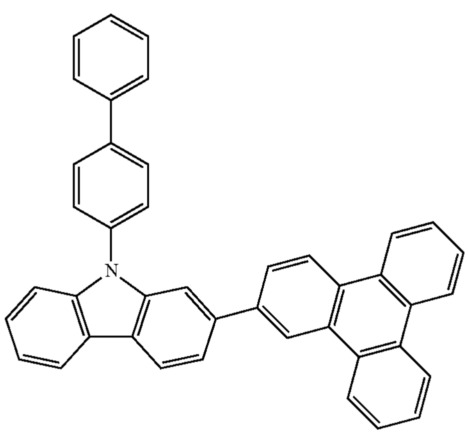
H-H76
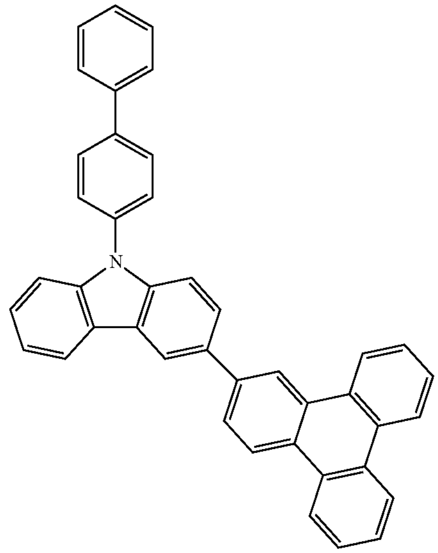
H-H77
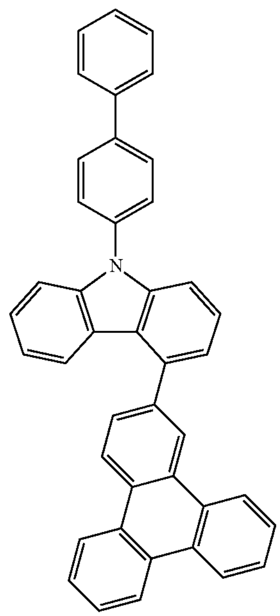
H-H78
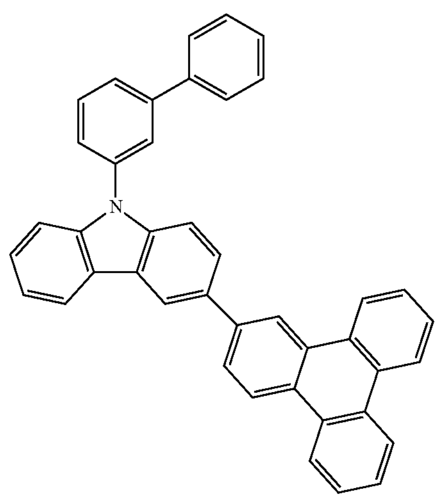

-continued
H-H79
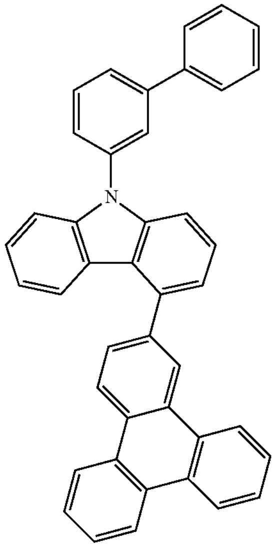
H-H80
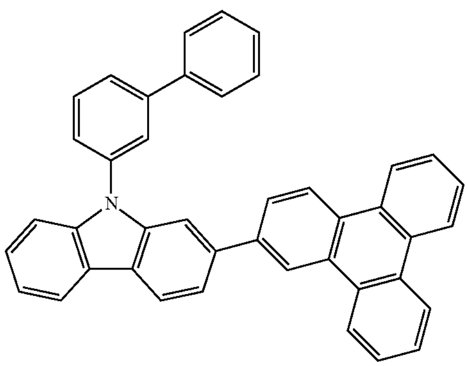
H-H81
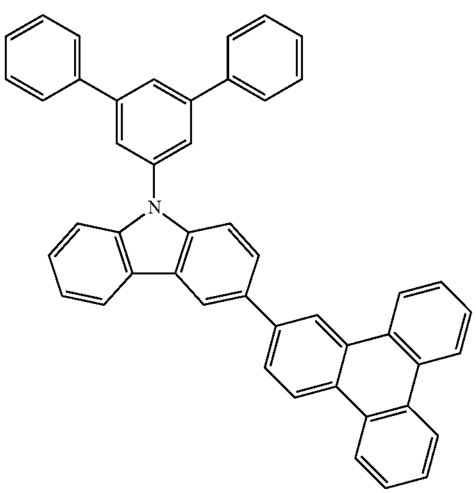
-continued
H-H82
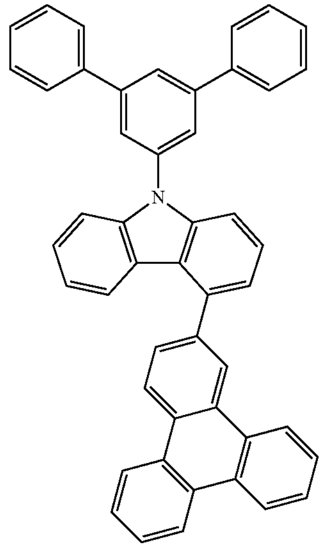
H-H83
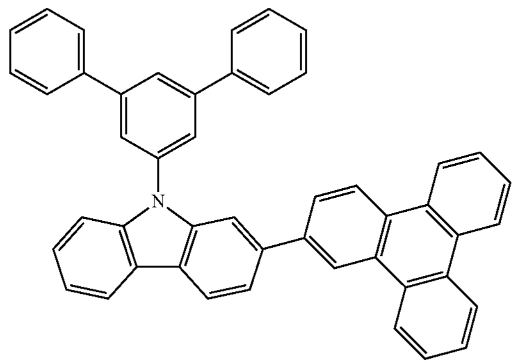
H-H84
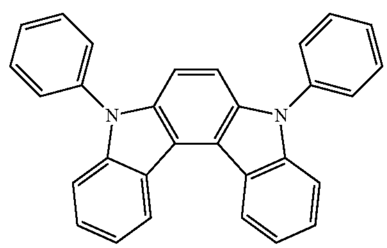
H-H85
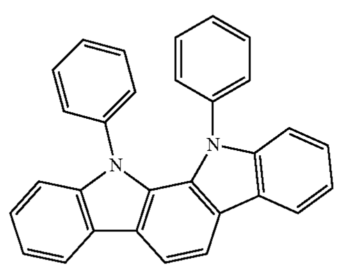

H-H86
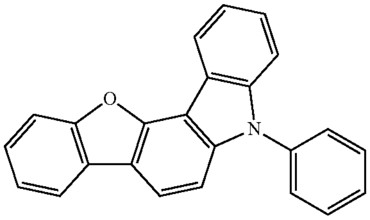
H-H87
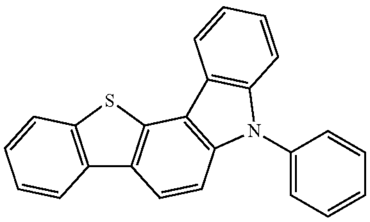
H-H88
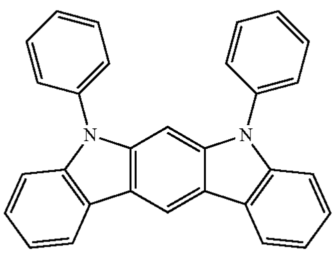
H-H89
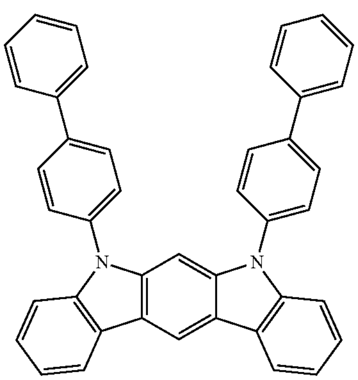
H-H90
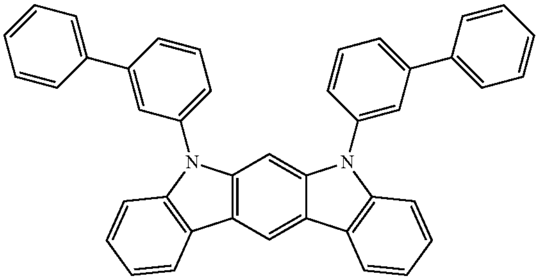
H-H91
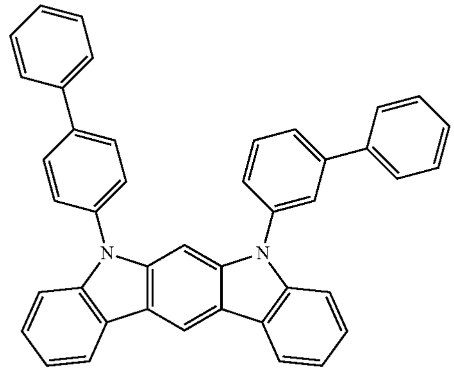
H-H92
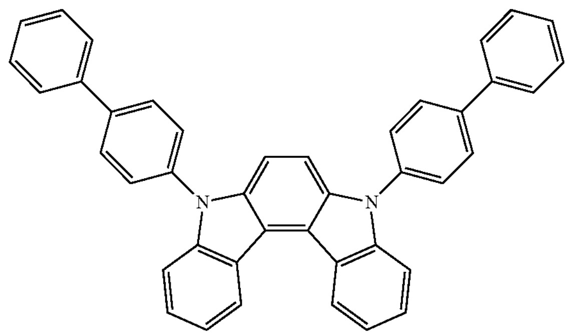
H-H93
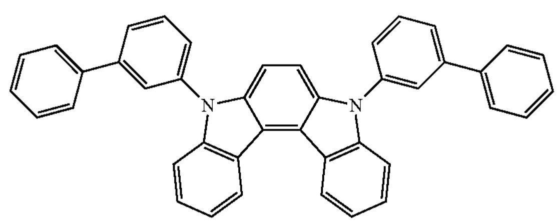
H-H94
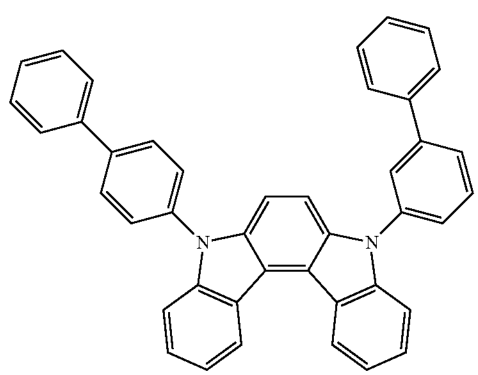

-continued
H-H95
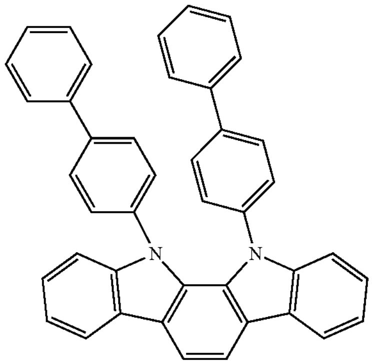
H-H96
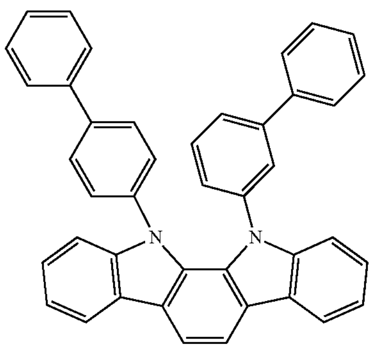
H-H97
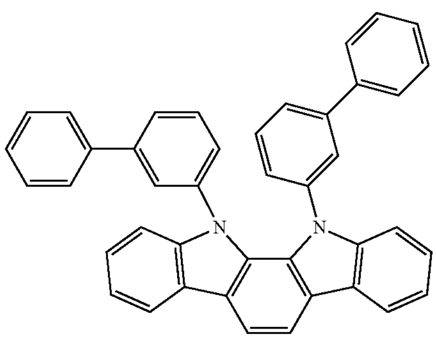
H-H98
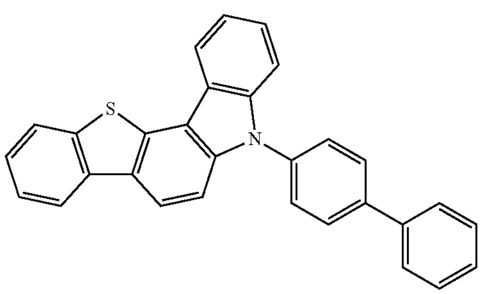
H-H99
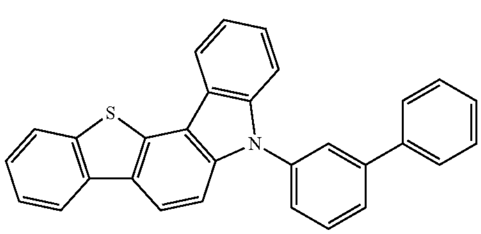
-continued
H-H100
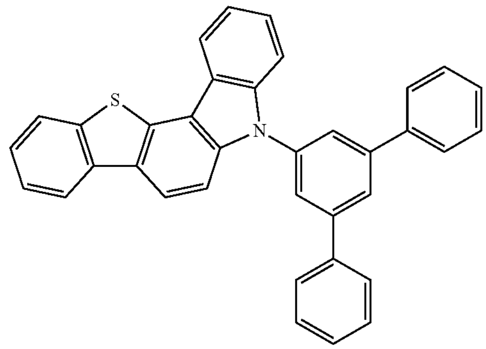
H-H101
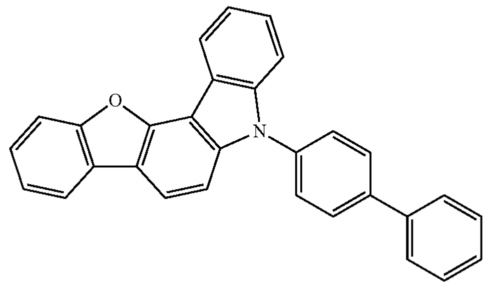
H-H102
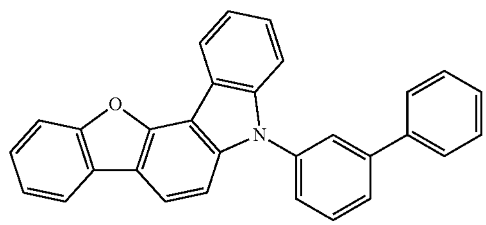
H-H103
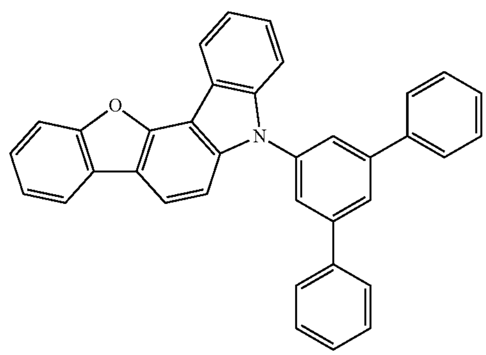
H-H104
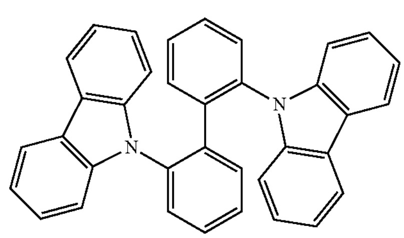

-continued
H-H105
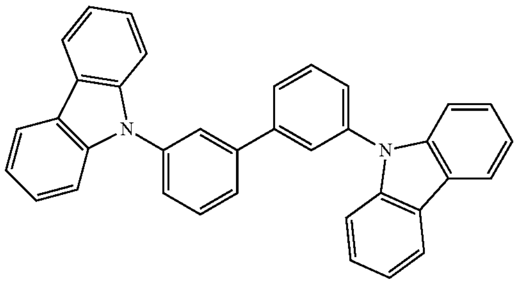
H-H106
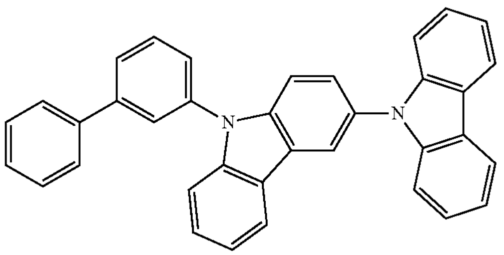
In one or more embodiments, the amphoteric host may be Group HEH1, but embodiments of the present disclosure are not limited thereto:
<Group HEH1>
1
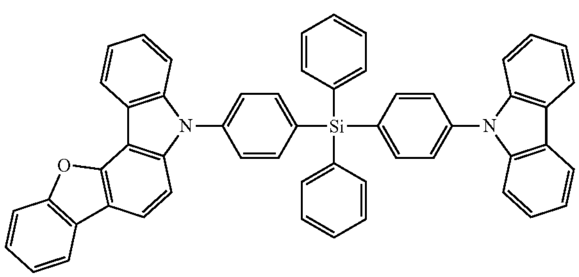
2
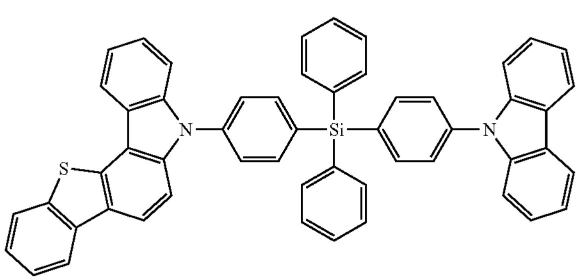
-continued
3
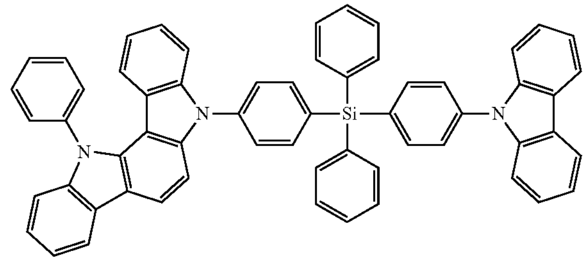
4
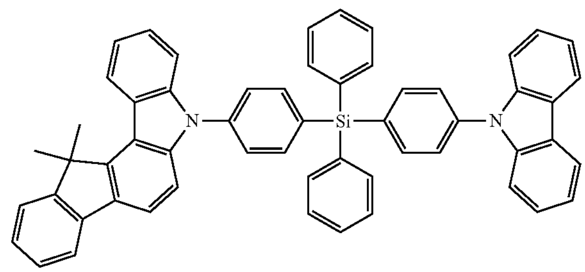
5
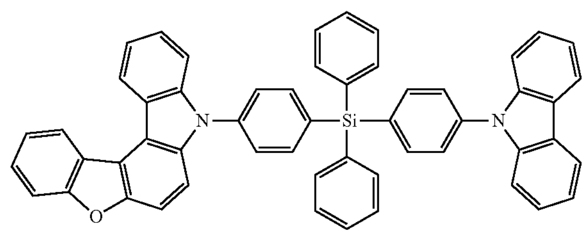
6
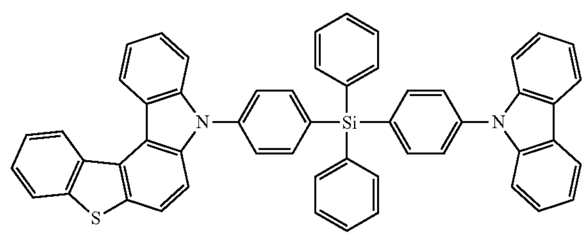
7
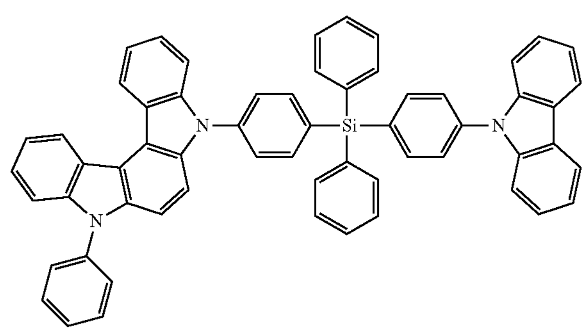

-continued
8
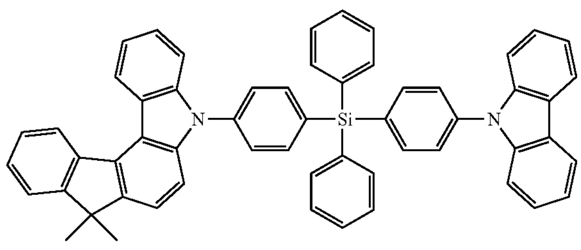
9
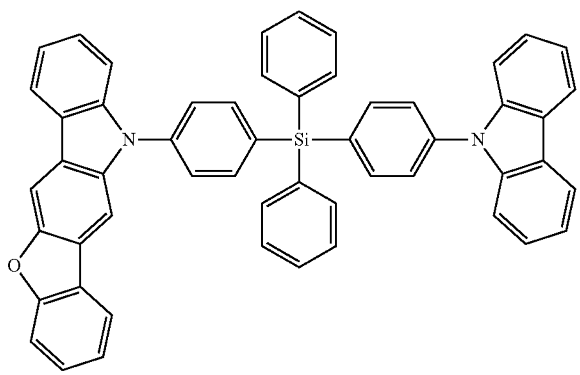
10
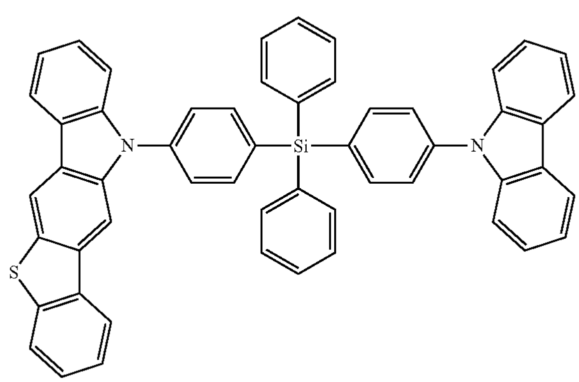
11
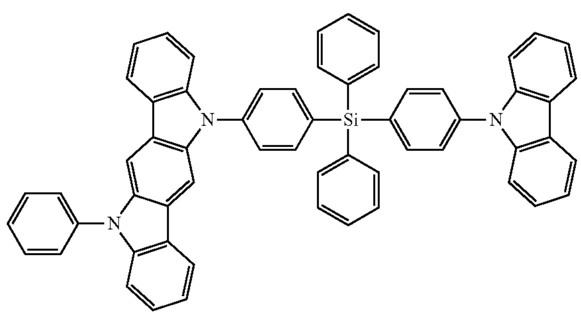
-continued
12
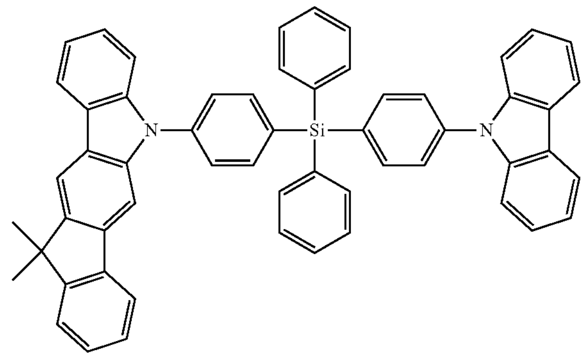
13
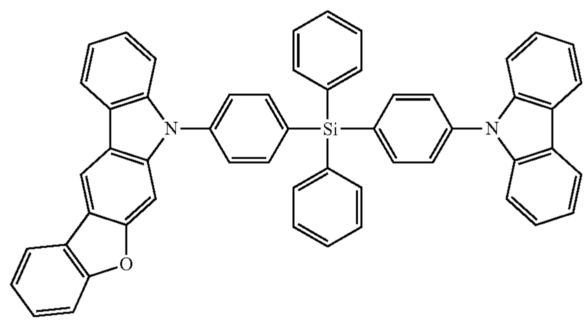
14
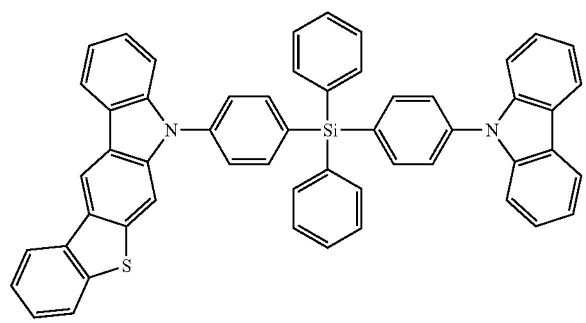
15
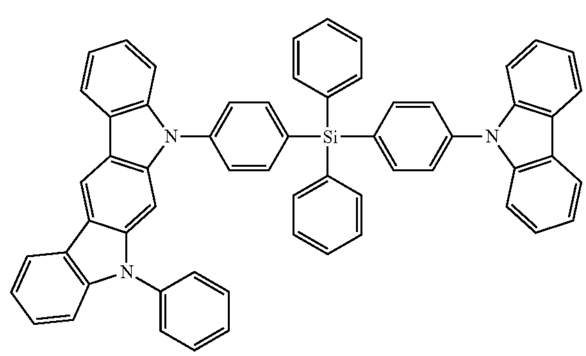

-continued
16
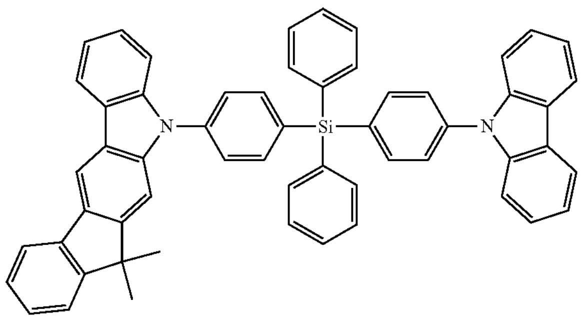
17
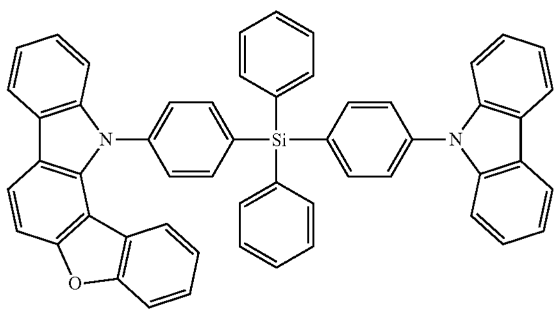
18
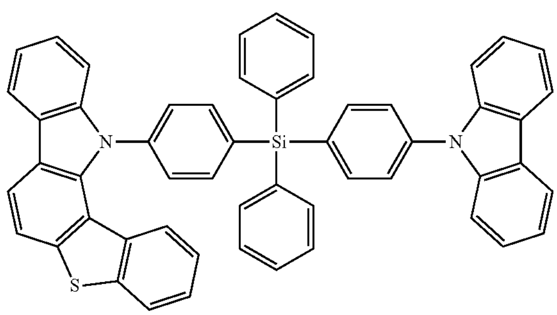
19
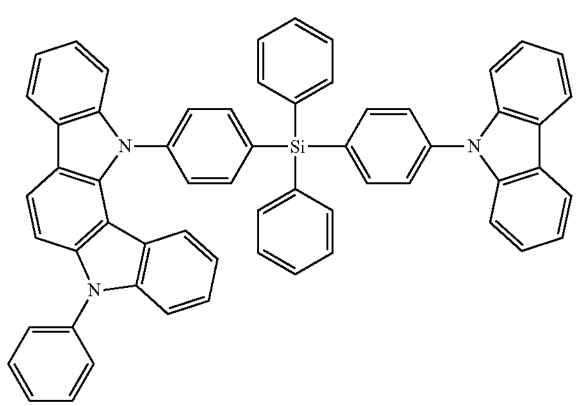
-continued
20
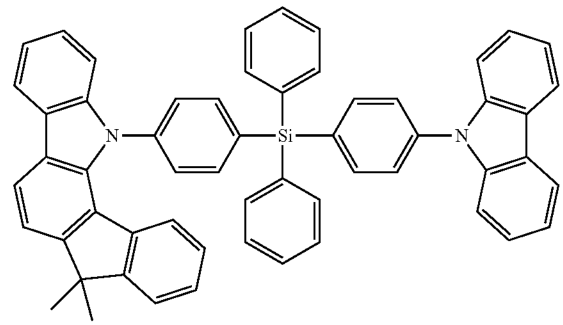
21
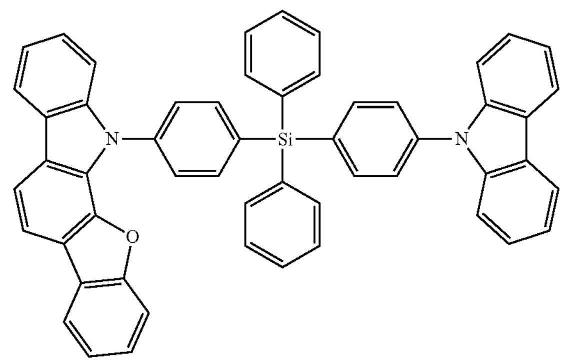
22
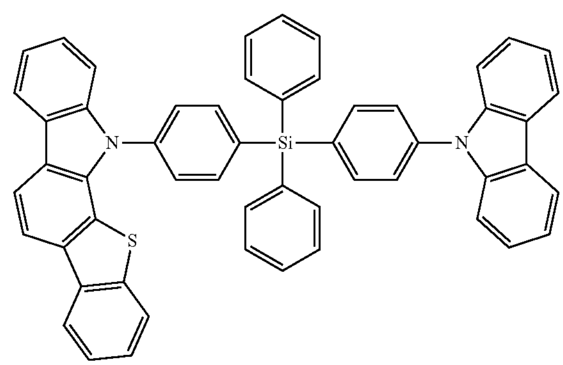
23
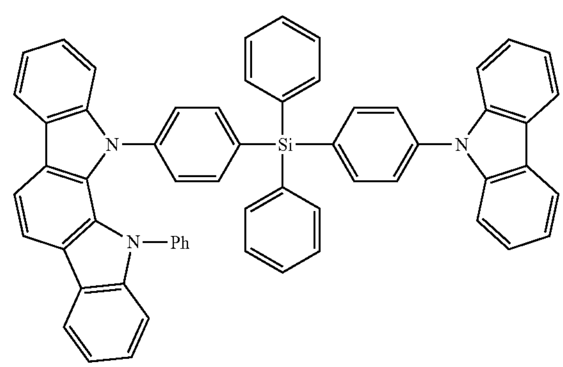

-continued
24
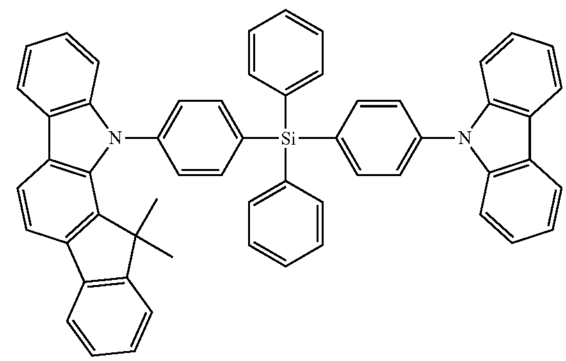
25
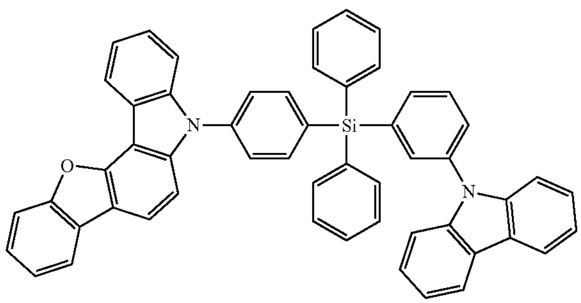
26
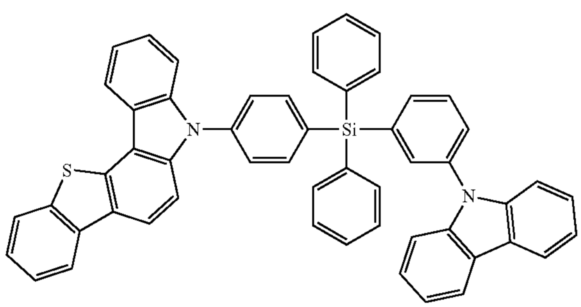
27
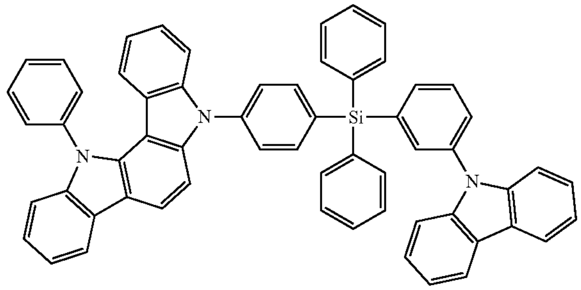
-continued
28
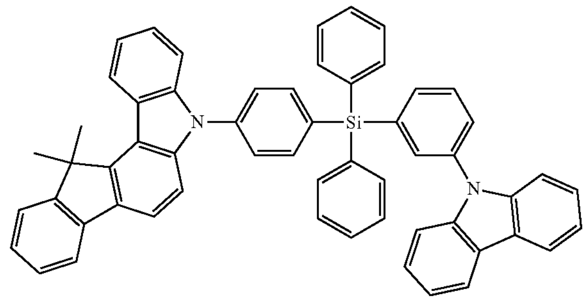
29
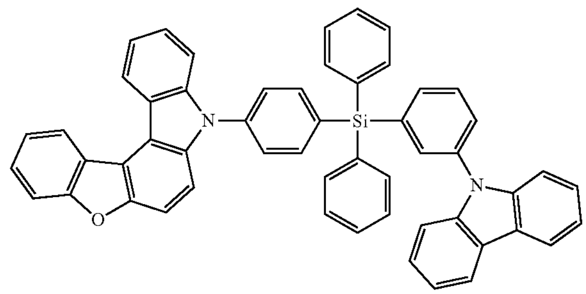
30
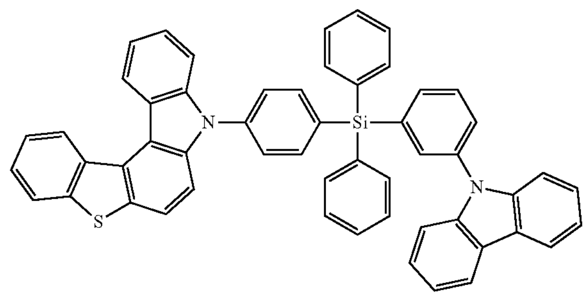
31
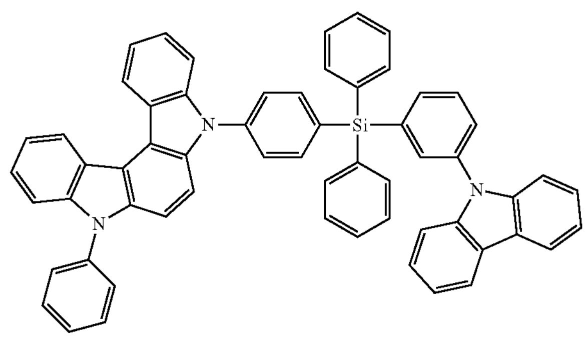
32
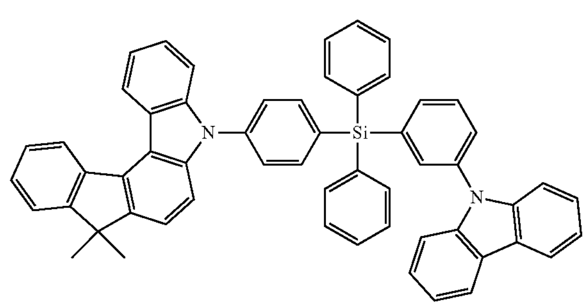

33
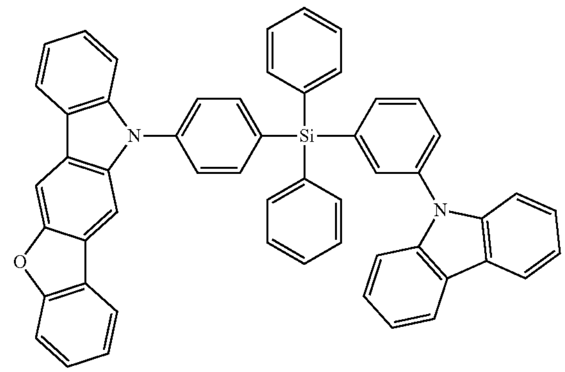
34
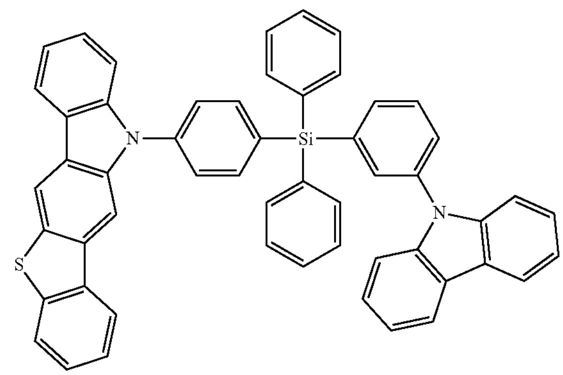
35
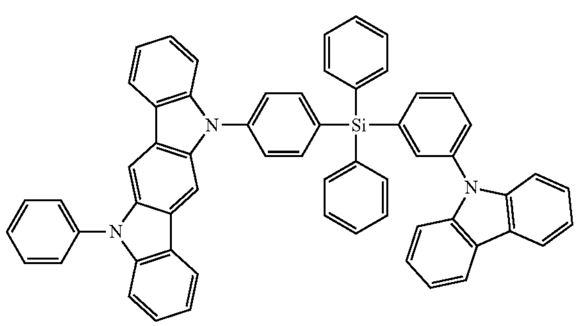
36
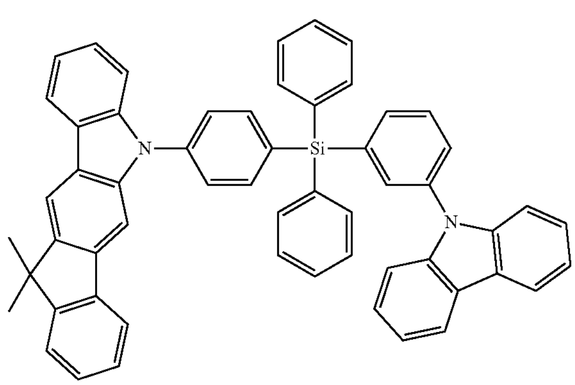
37
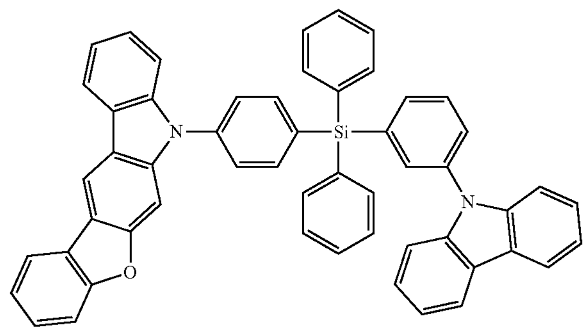
38
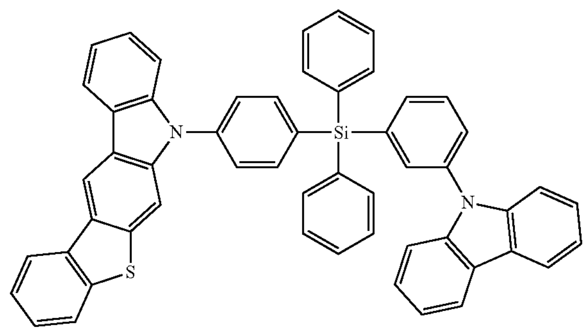
39
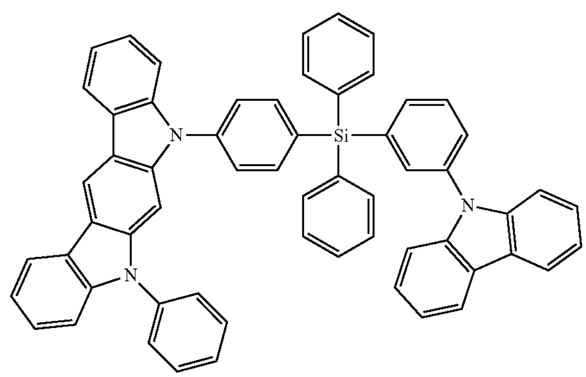
40
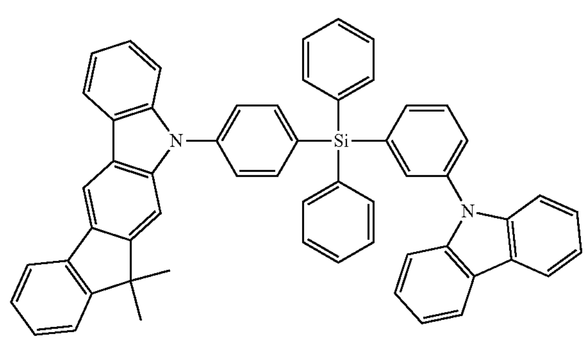

-continued
41
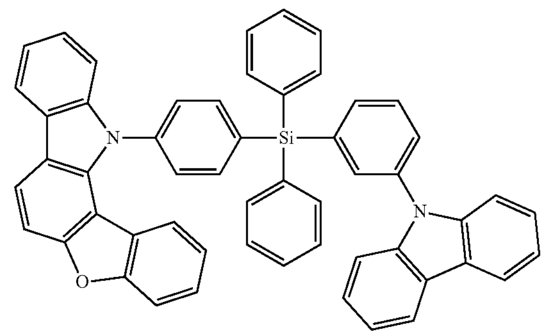
42
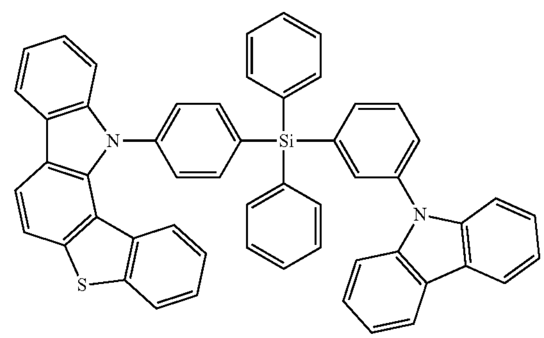
43
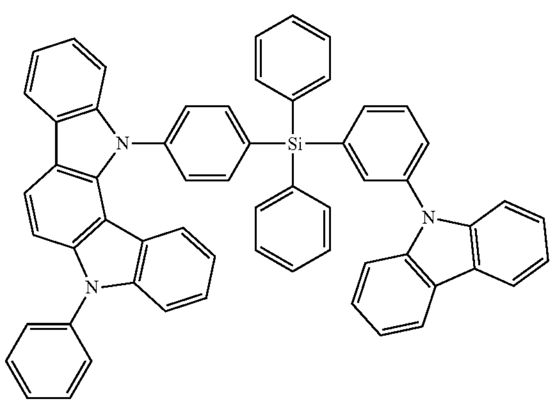
44
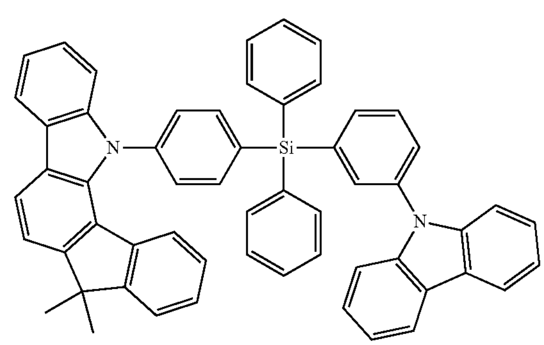
-continued
45
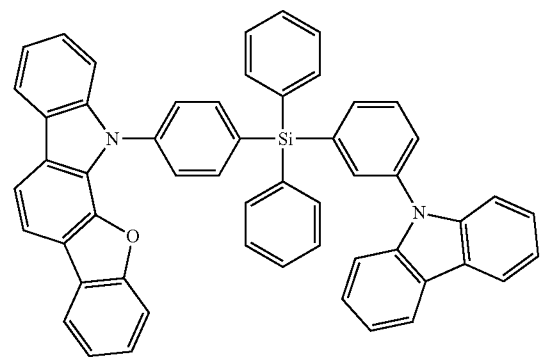
46
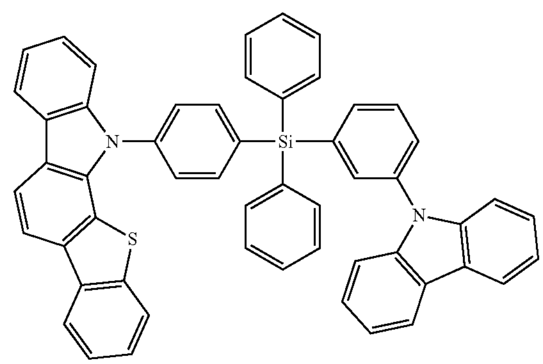
47
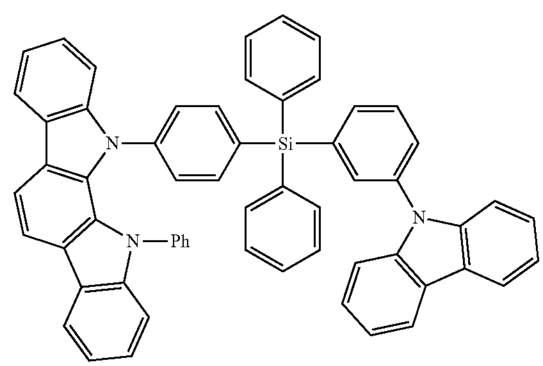
48
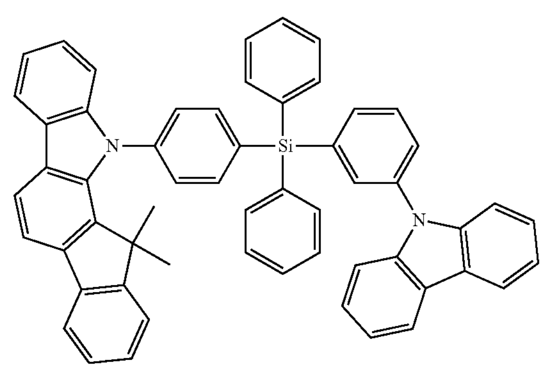

49
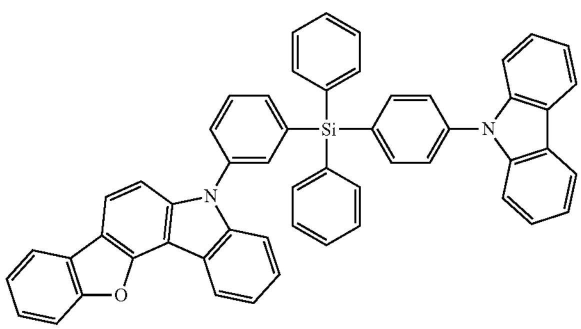
50
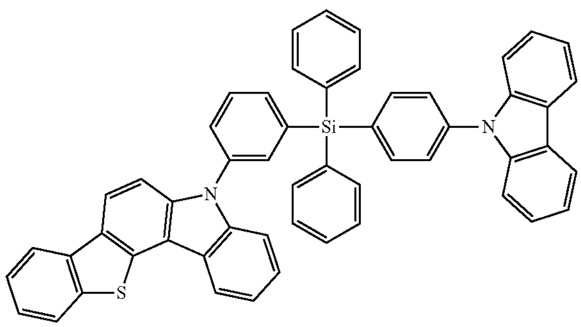
51
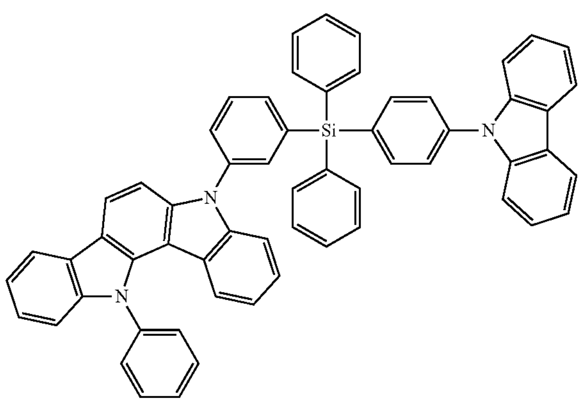
52
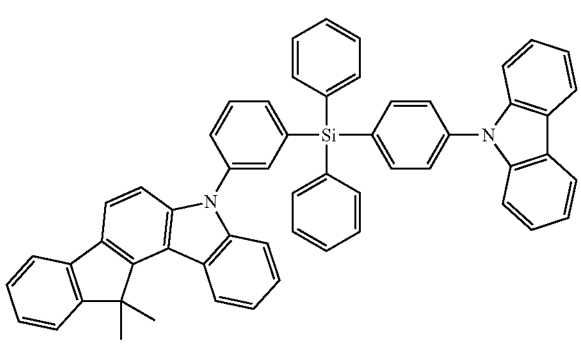
53
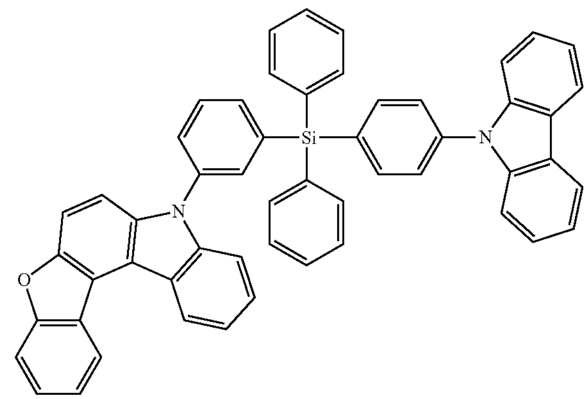
54
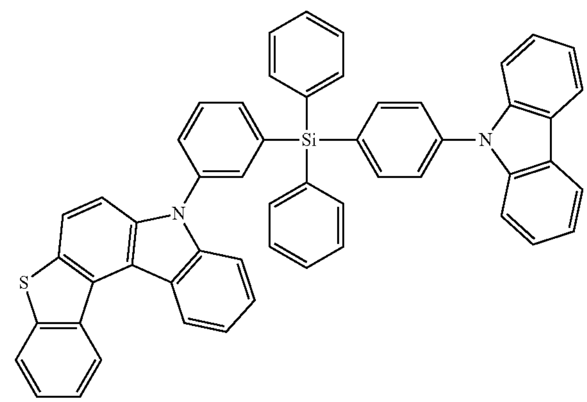
55
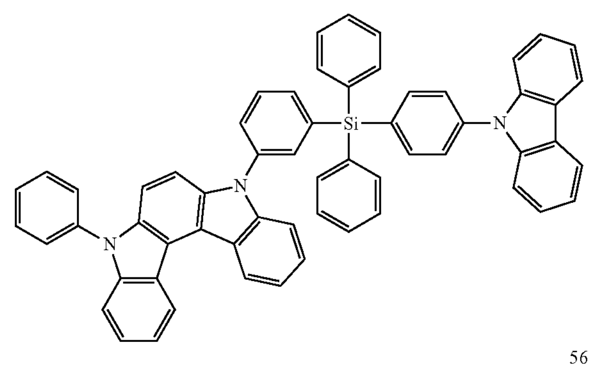
56
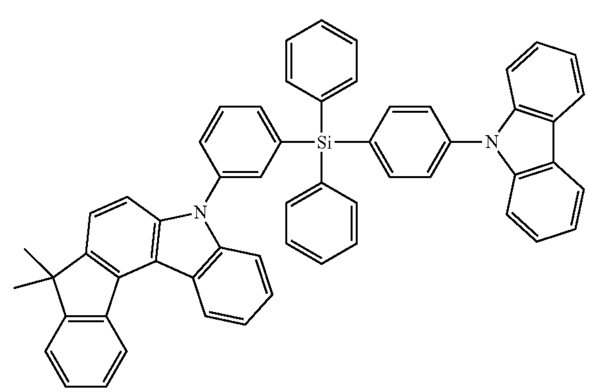

-continued
57
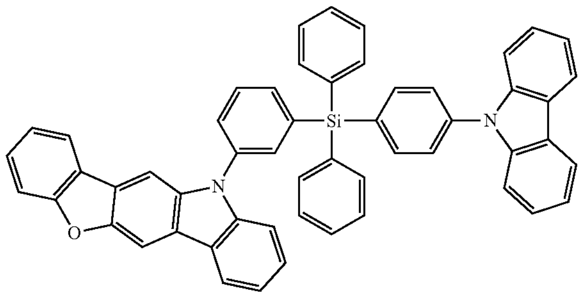
58
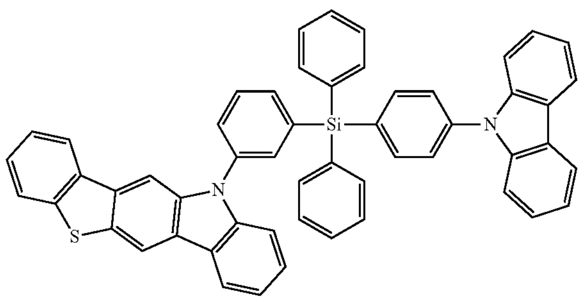
59
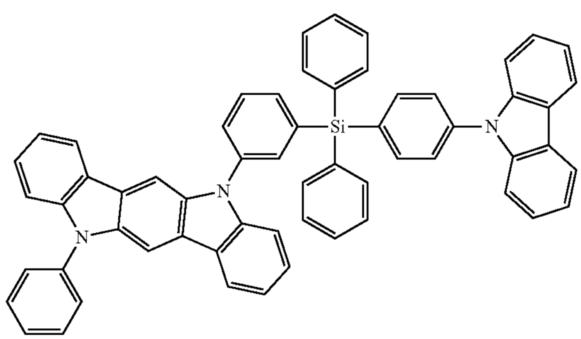
60
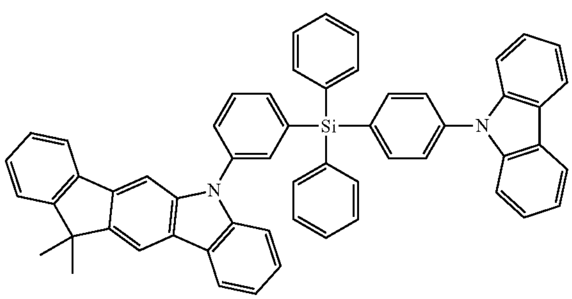
61
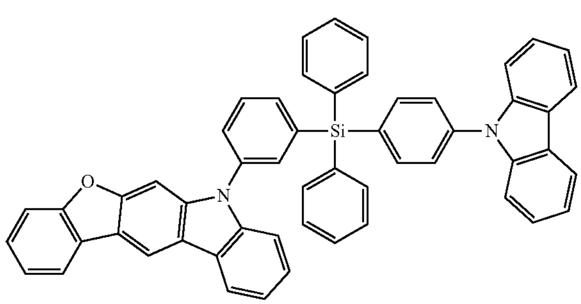
-continued
62
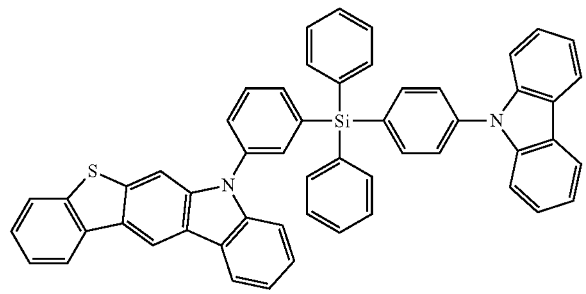
63
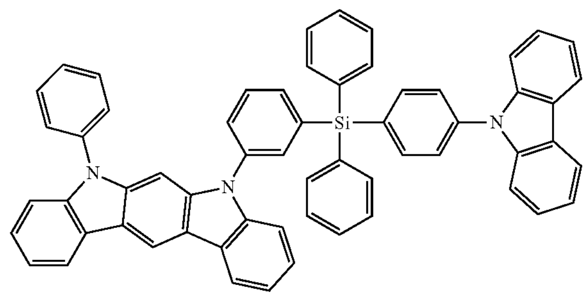
64
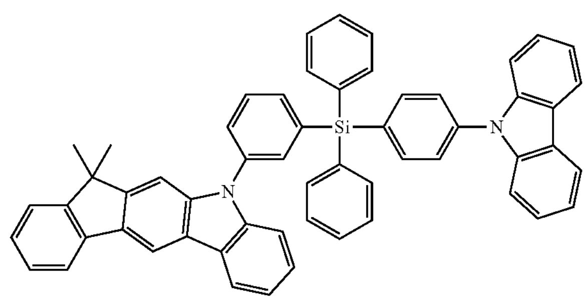
65
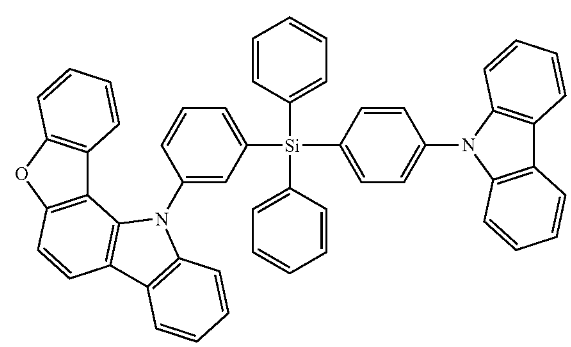

-continued
66
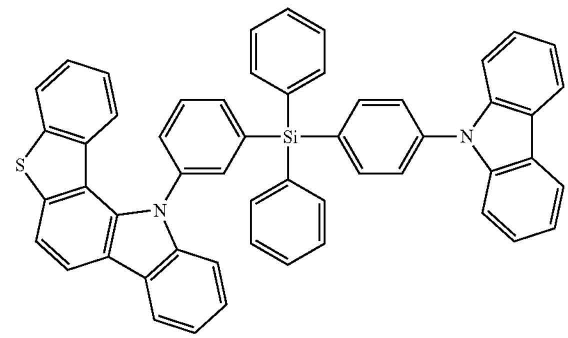
67
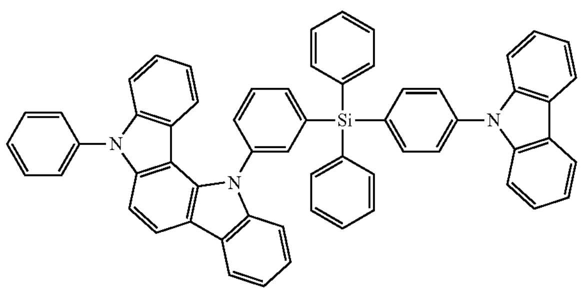
68
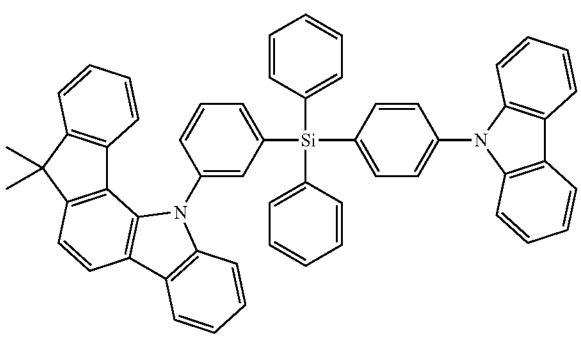
69
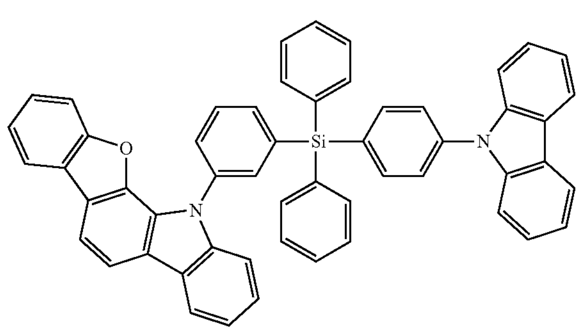
-continued
70
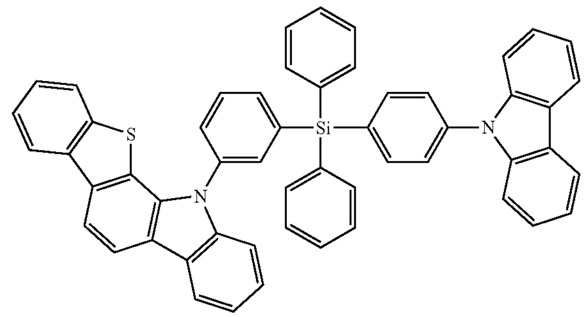
71
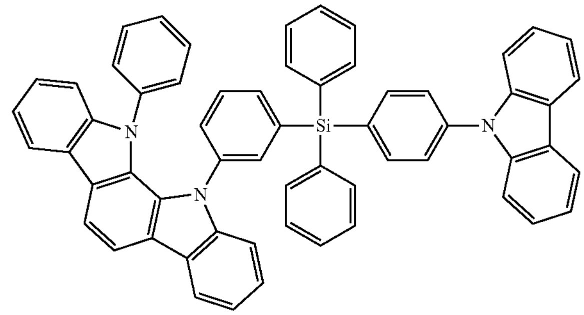
72
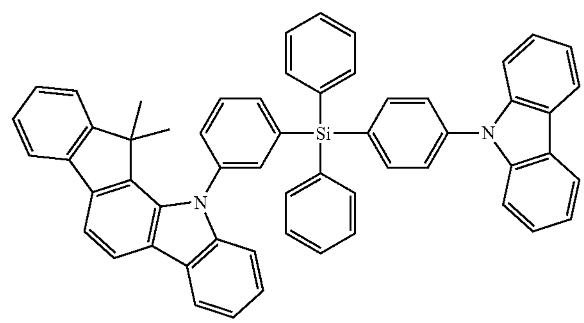
73
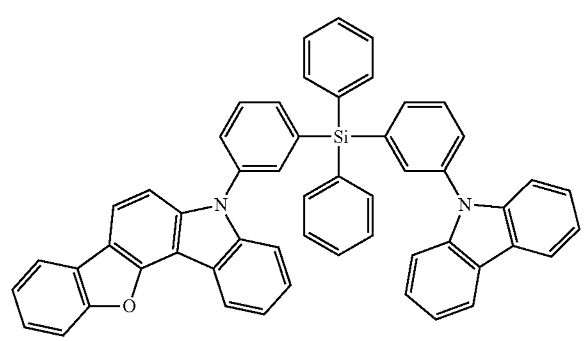

-continued
74
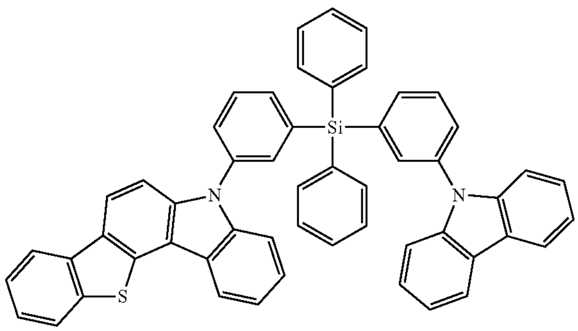
75
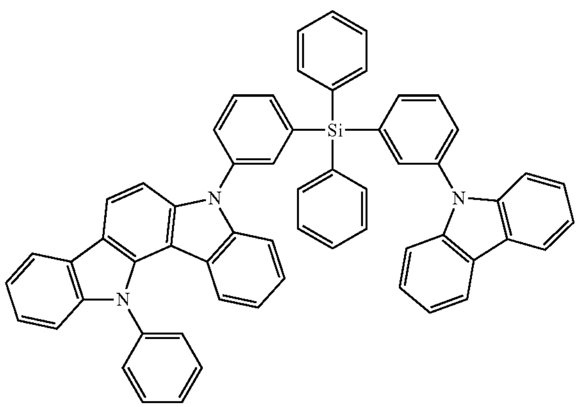
76
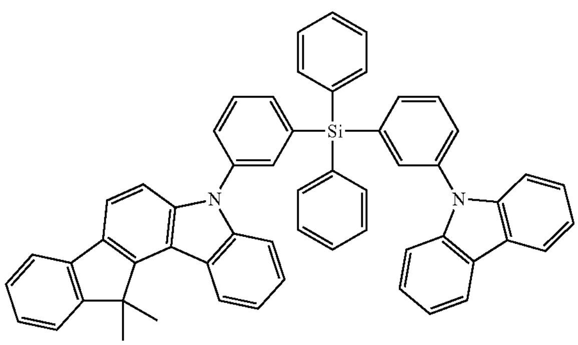
77
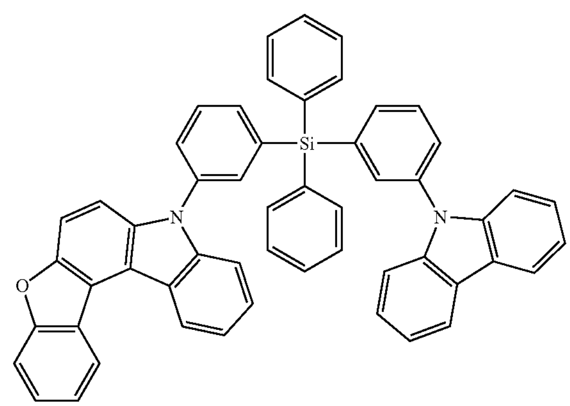
-continued
78
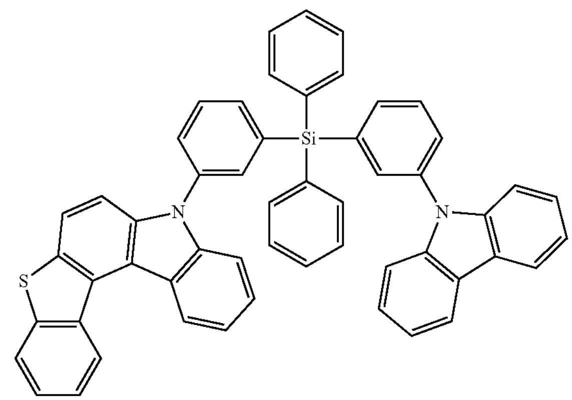
79
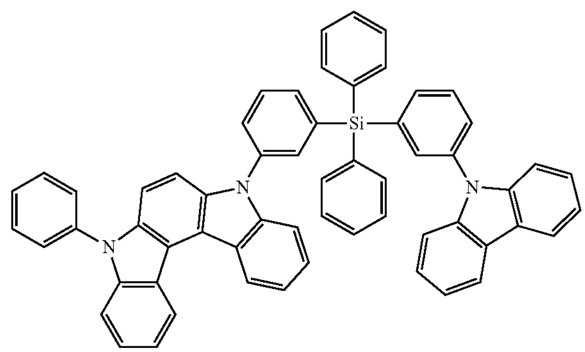
80
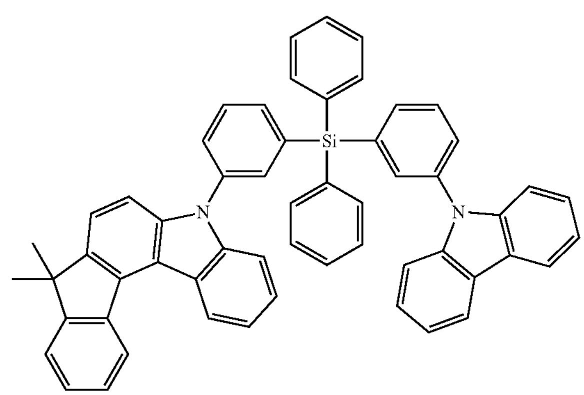
81
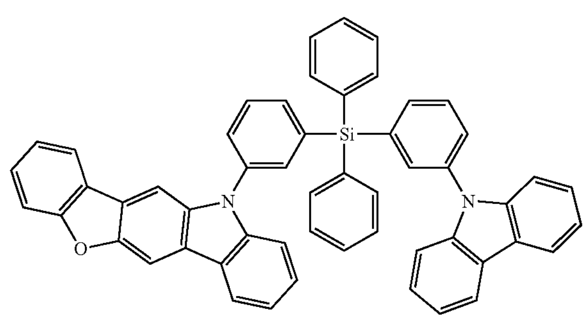

-continued
82
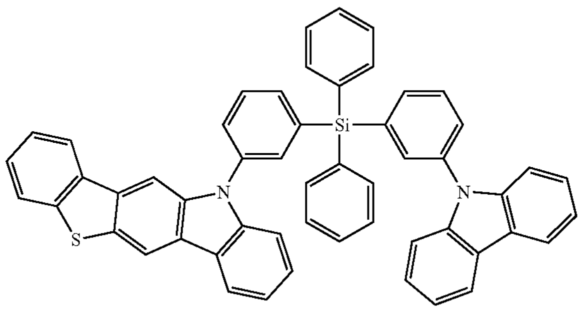
83
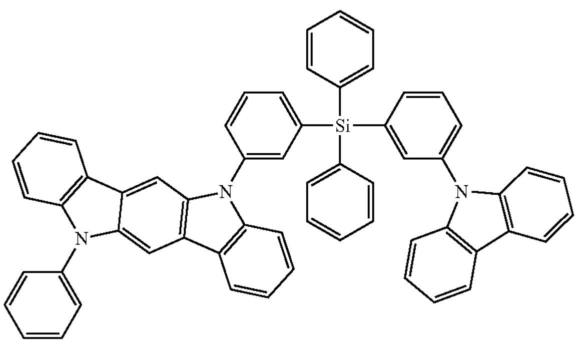
84
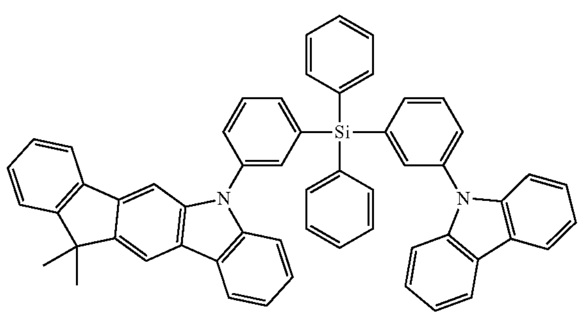
85
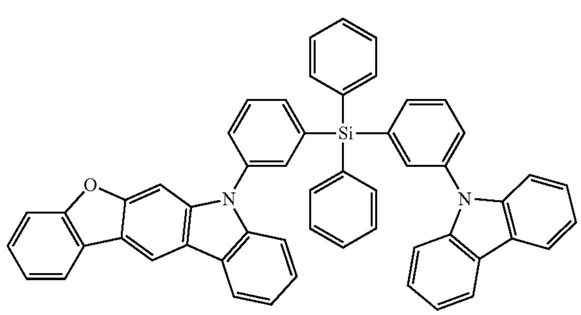
-continued
86
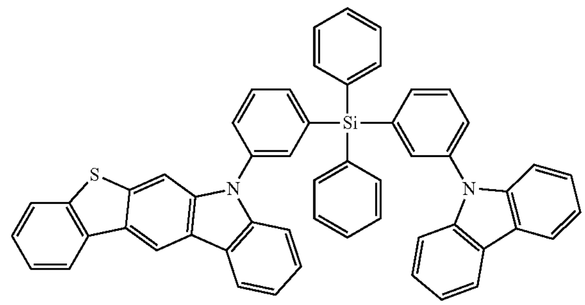
87
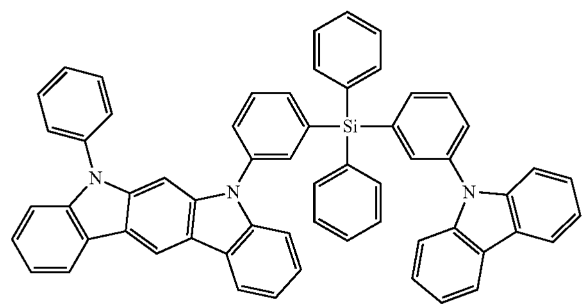
88
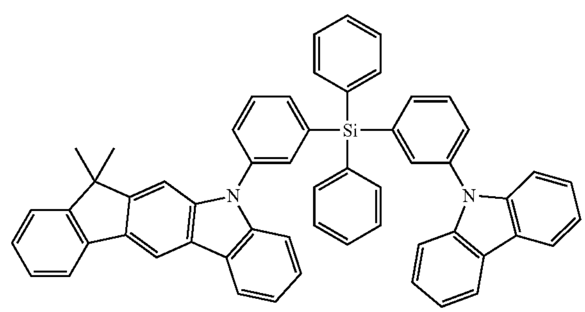
89
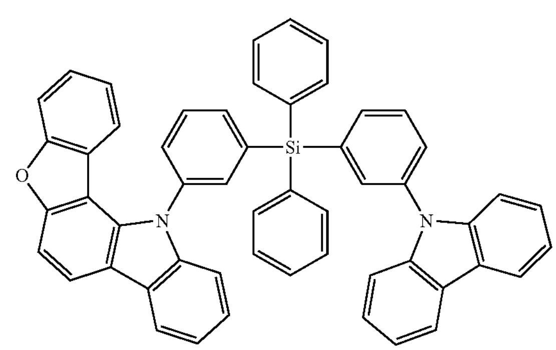

-continued
90
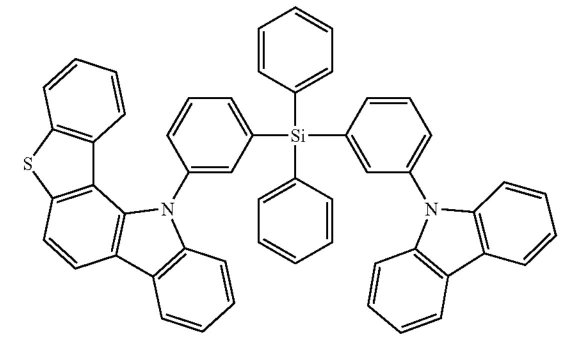
91
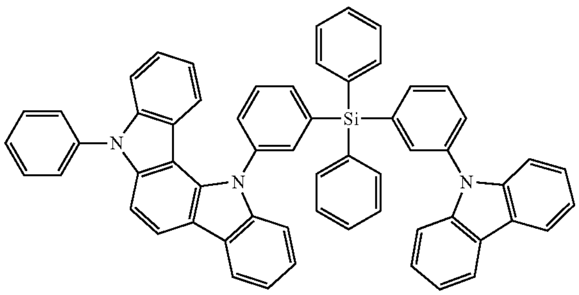
92
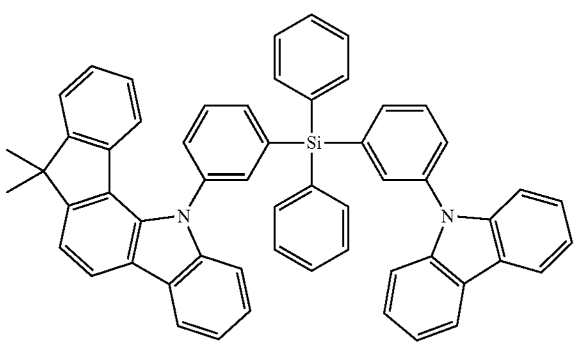
93
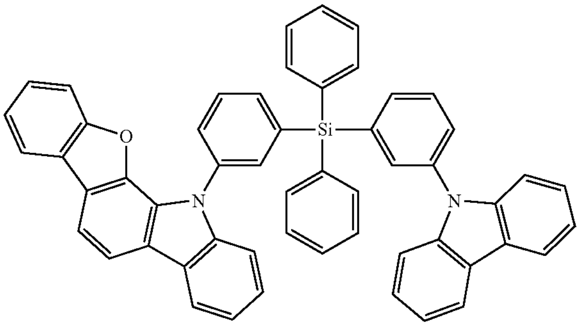
-continued
94
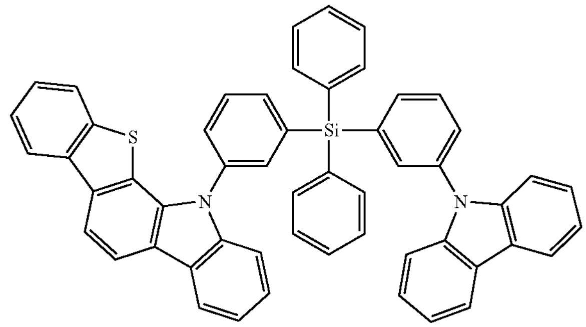
95
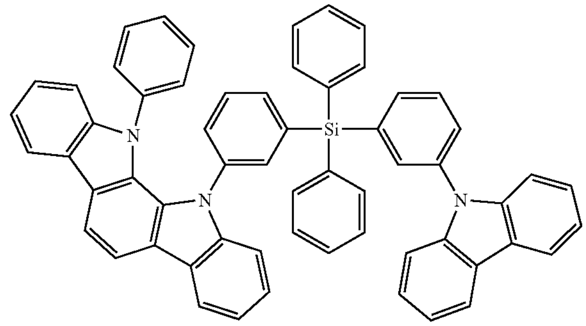
96
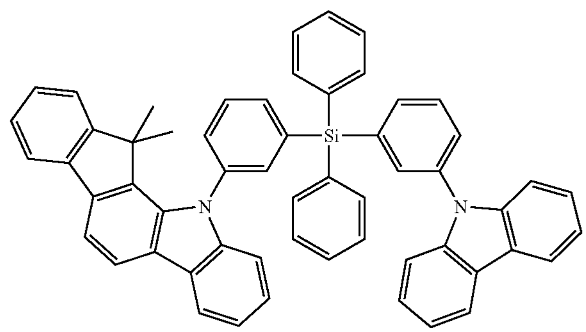
97
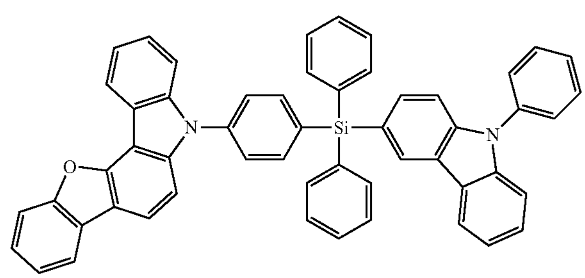
98
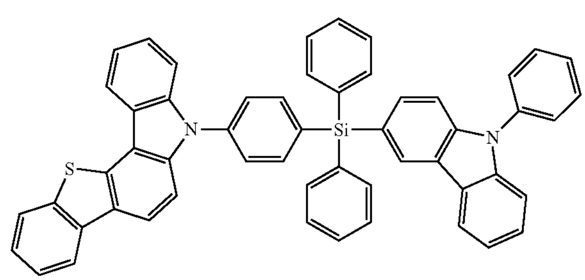

-continued
99
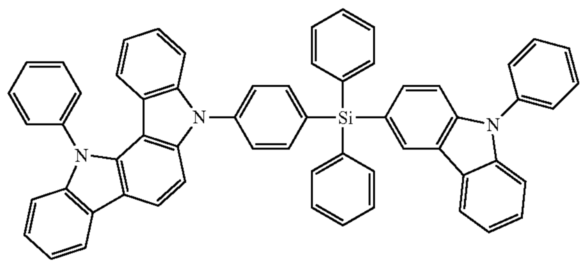
100
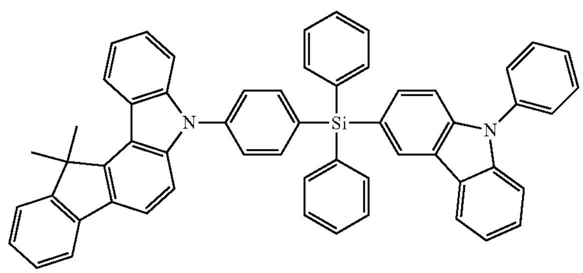
101
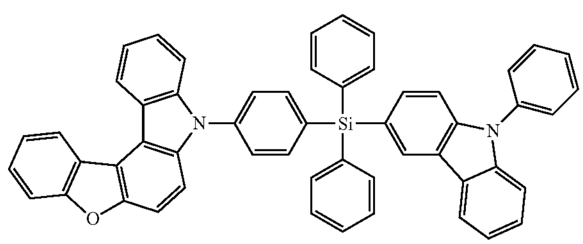
102
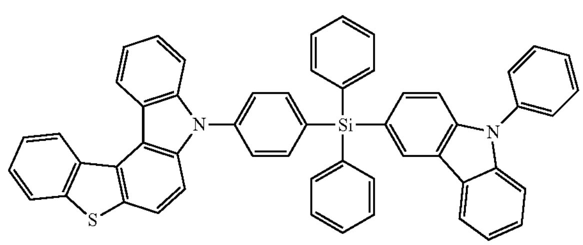
103
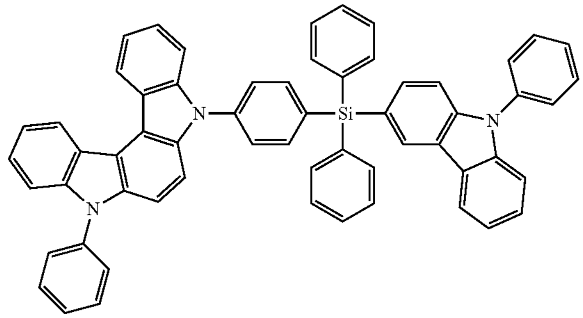
-continued
104
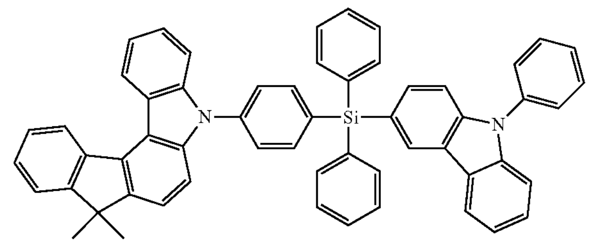
105
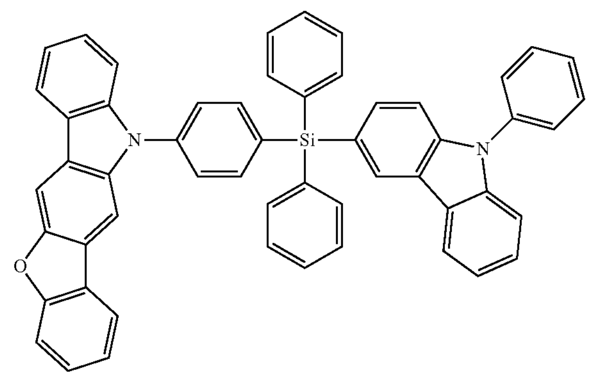
106
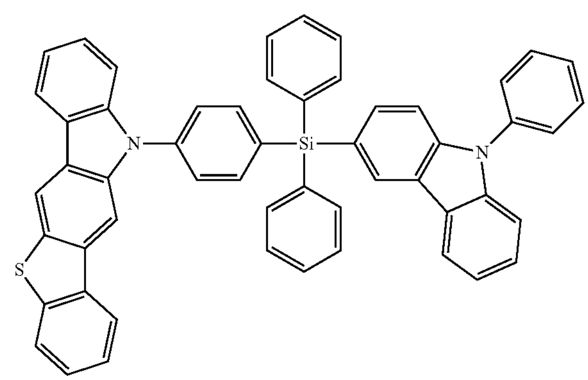
107
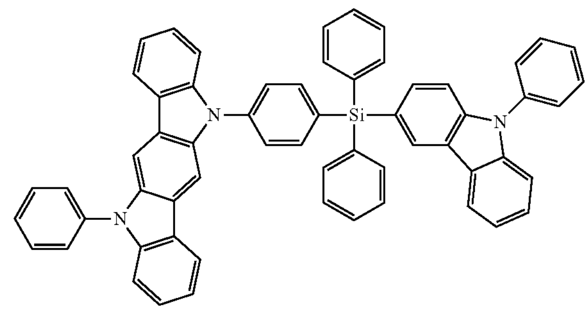

108
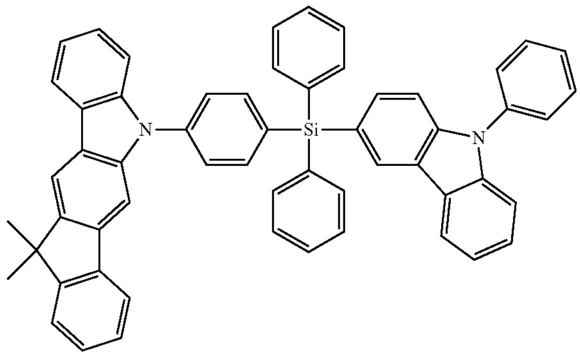
109
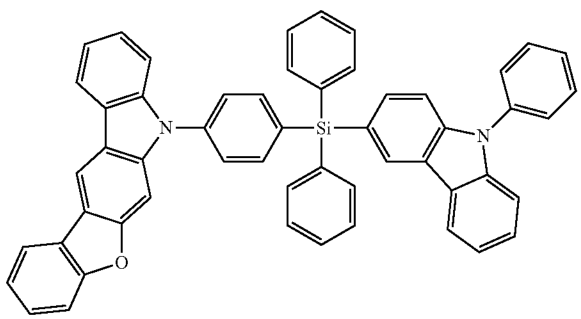
110
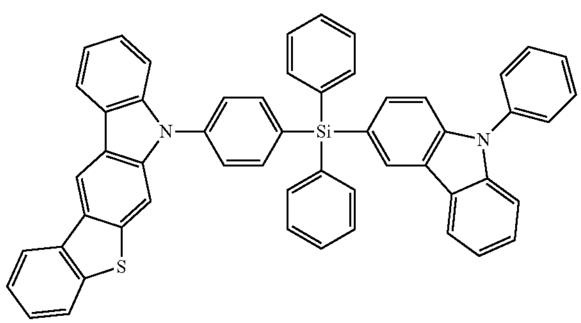
111
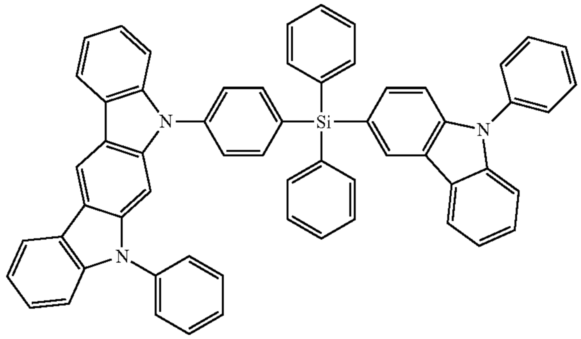
112
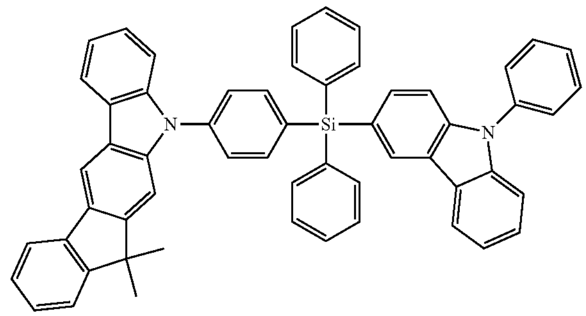
113
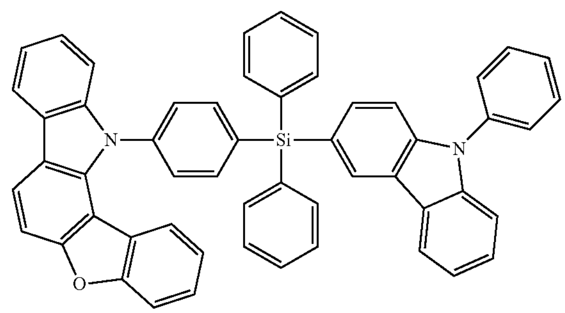
114
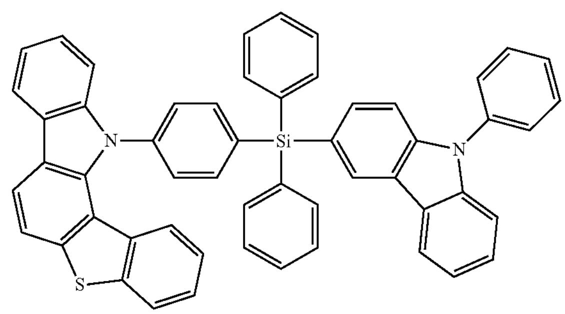
115
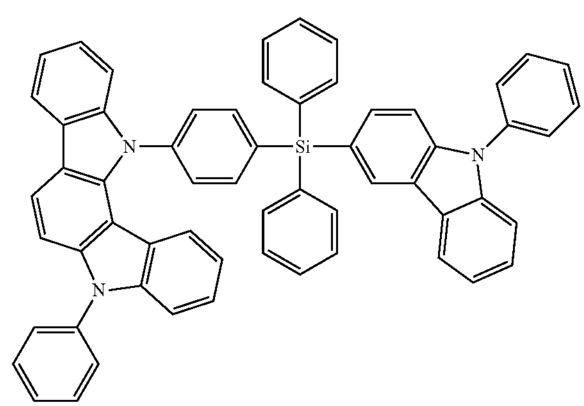

-continued
116
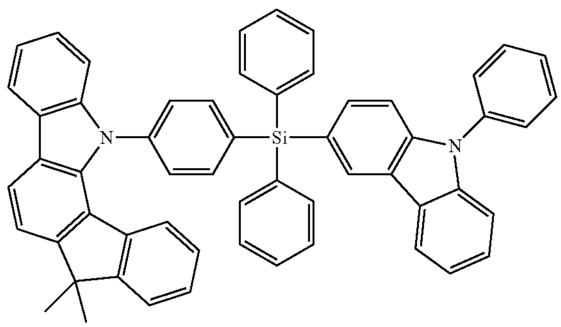
117
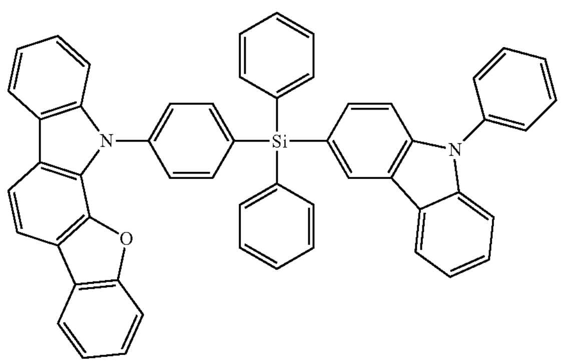
118
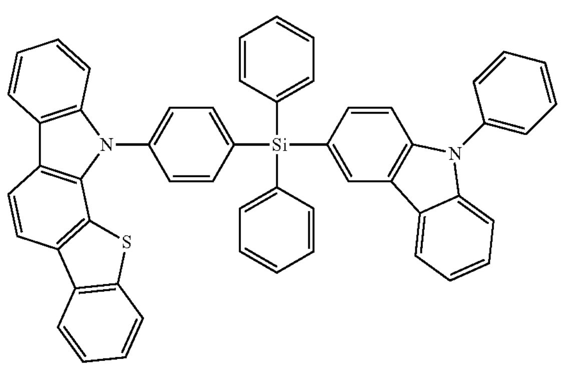
119
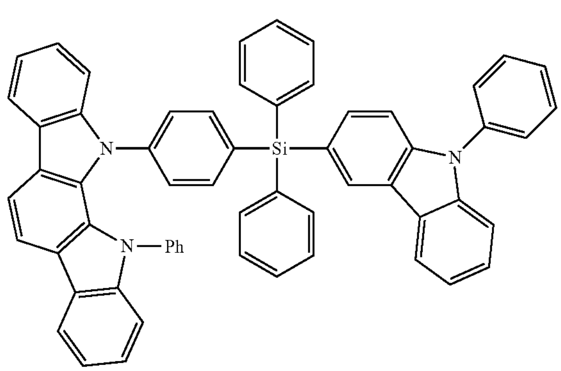
-continued
120
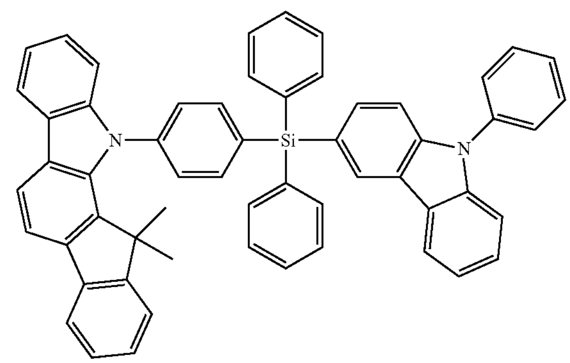
121
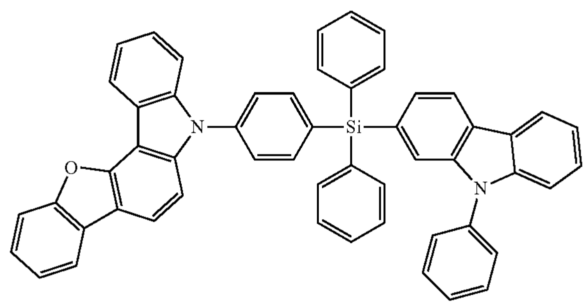
122
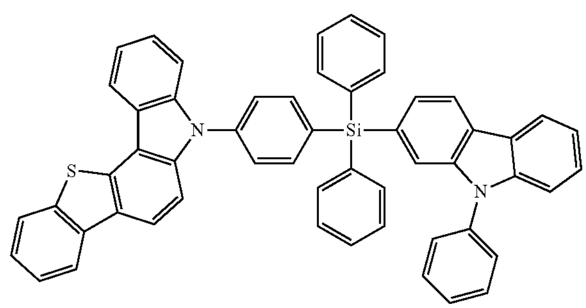
123
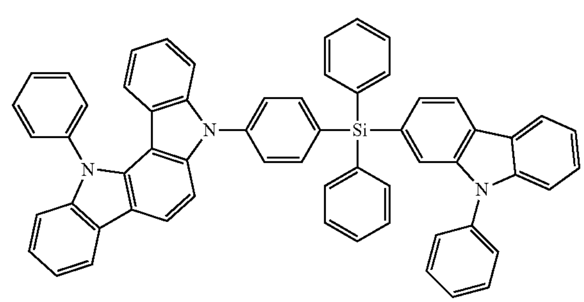

124
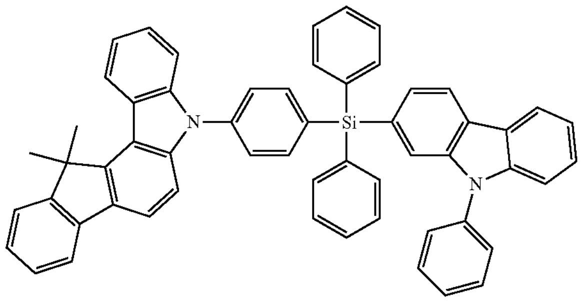
125
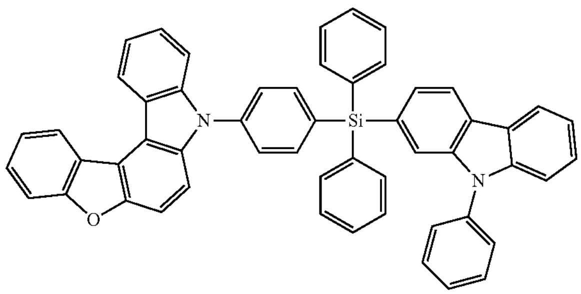
126
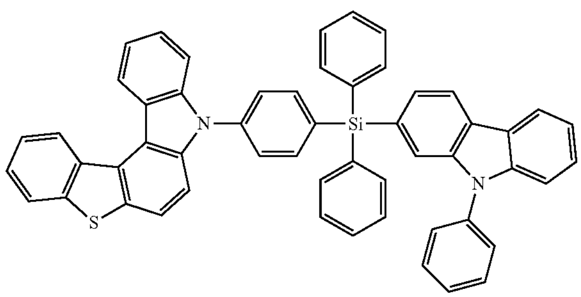
127
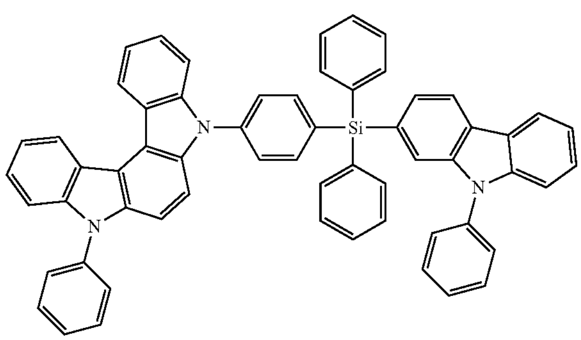
128
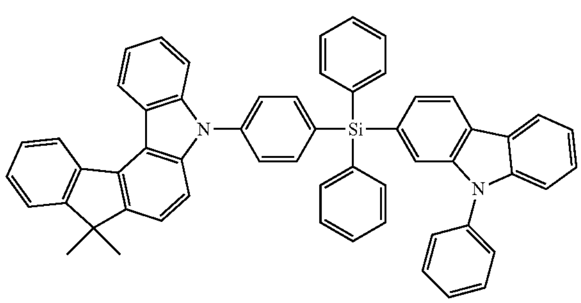
129
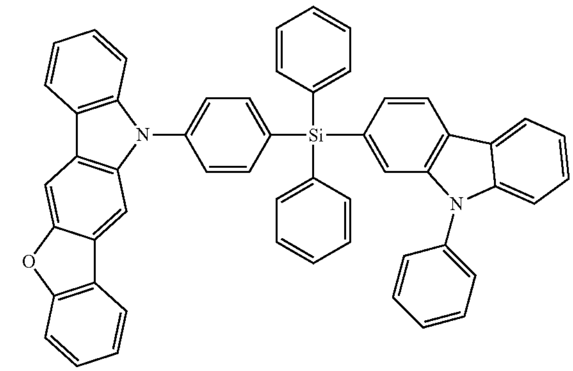
130
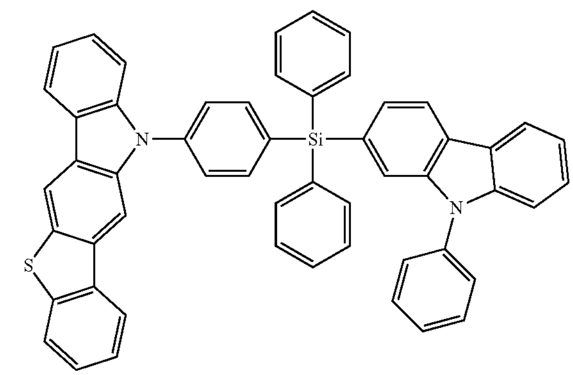
131
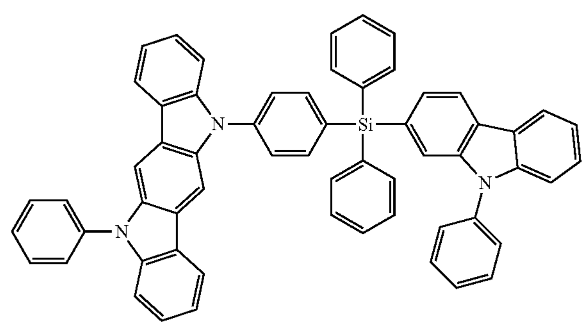
132
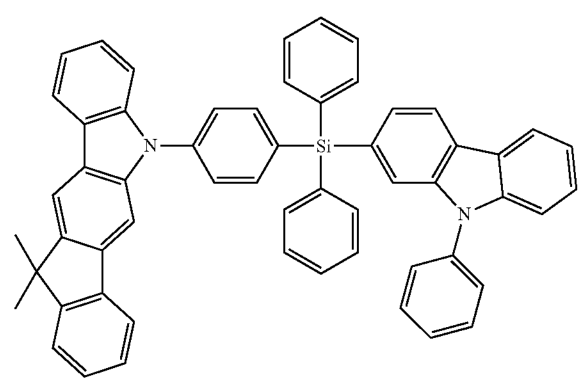

-continued
133
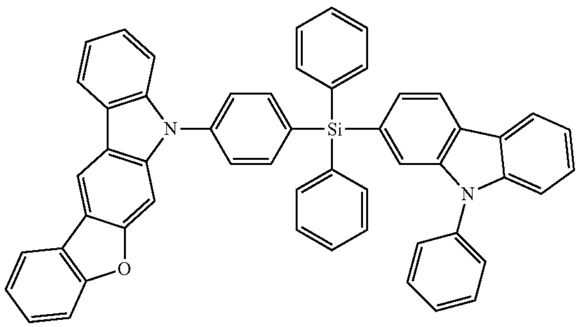
134
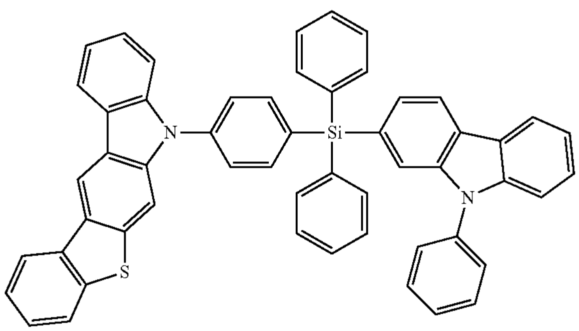
135
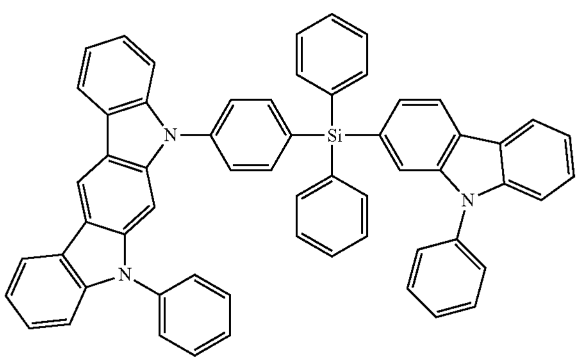
136
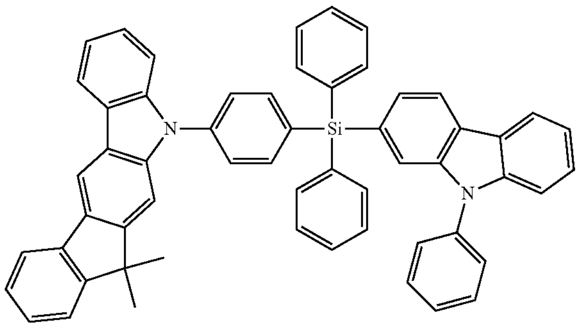
-continued
137
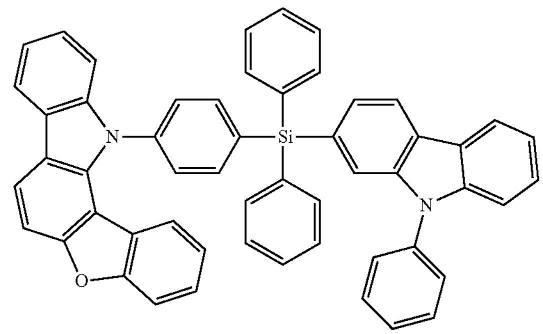
138
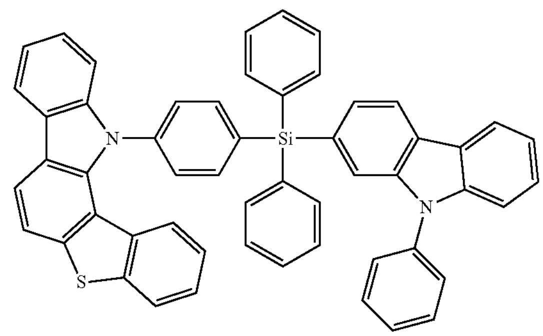
139
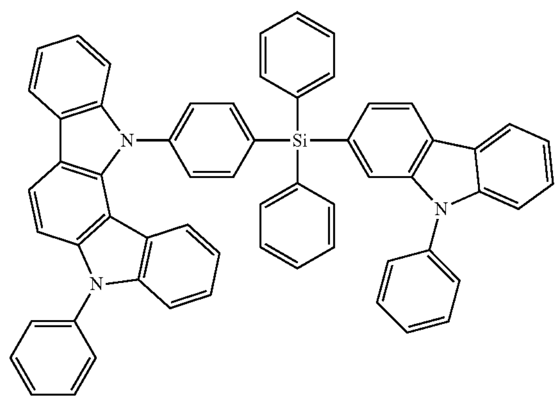
140
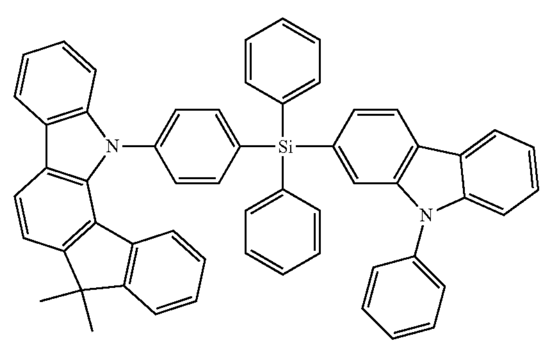

141
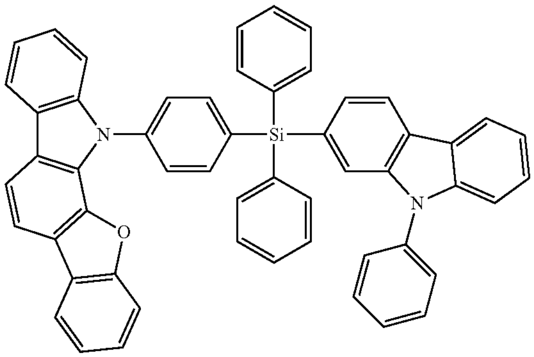
142
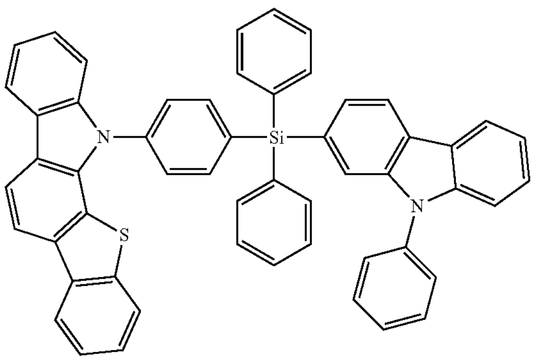
143
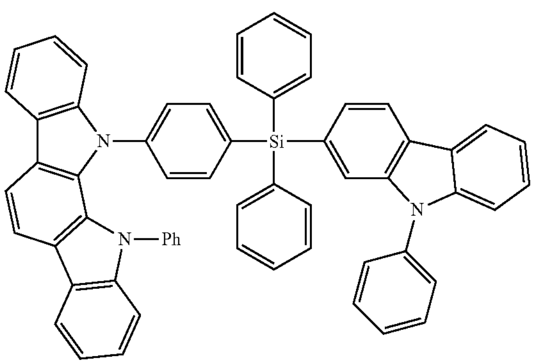
144
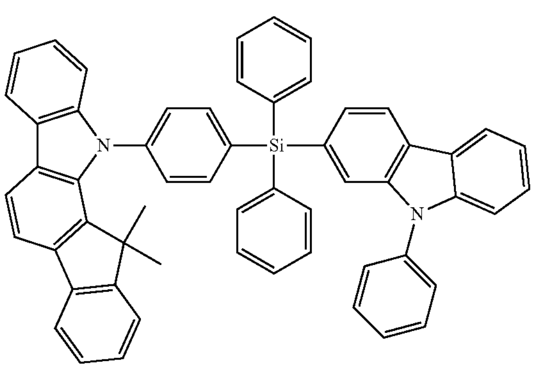
145
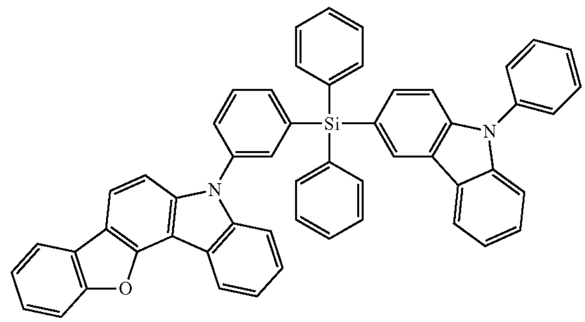
146
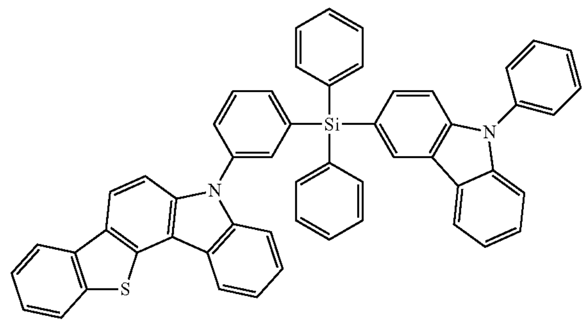
147
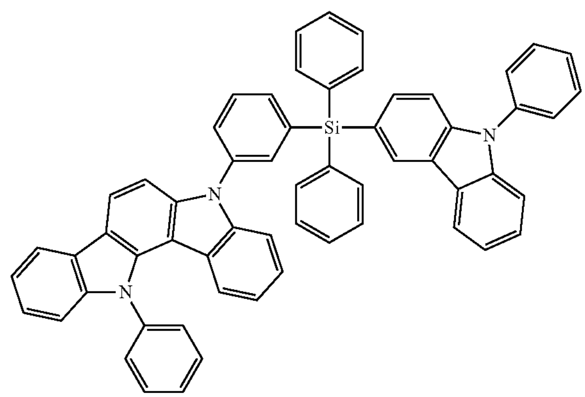
148
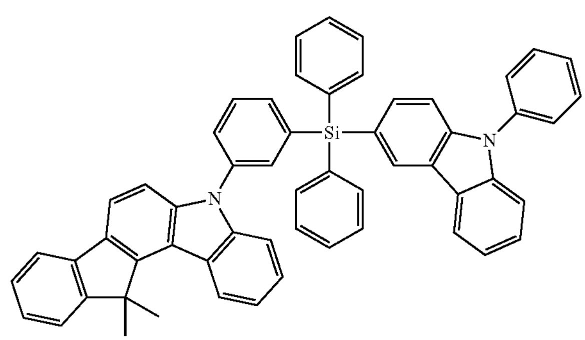

-continued
149
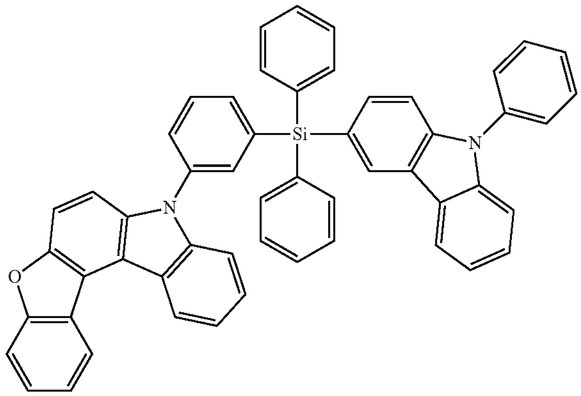
150
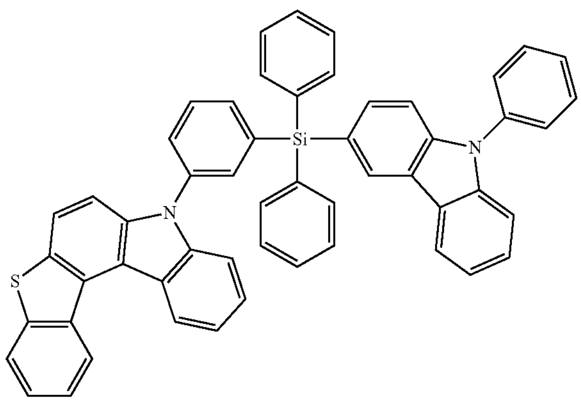
151
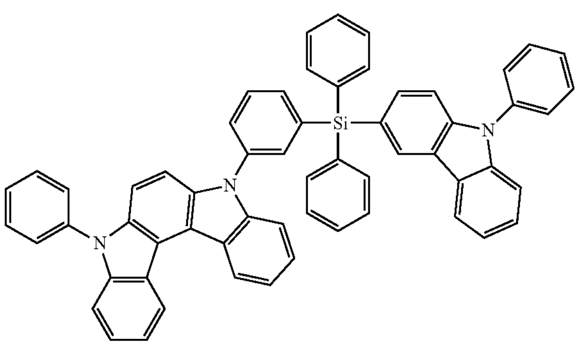
152
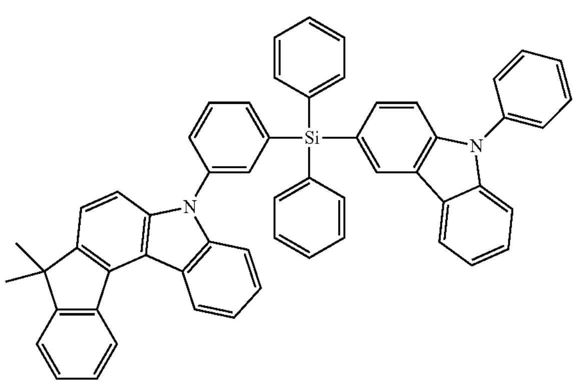
-continued
153
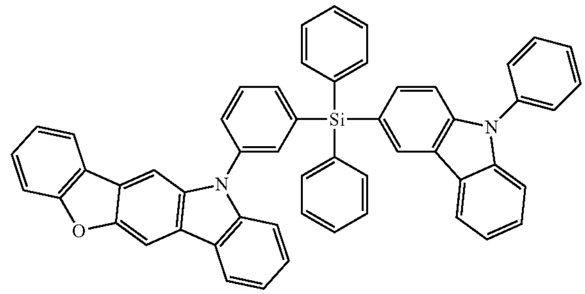
154
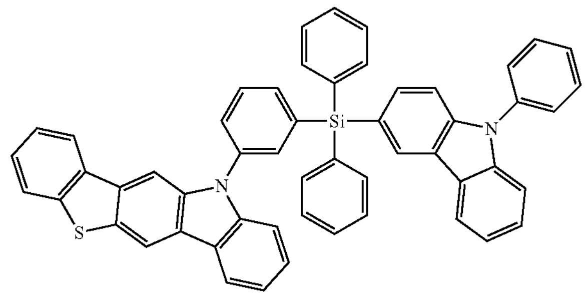
155
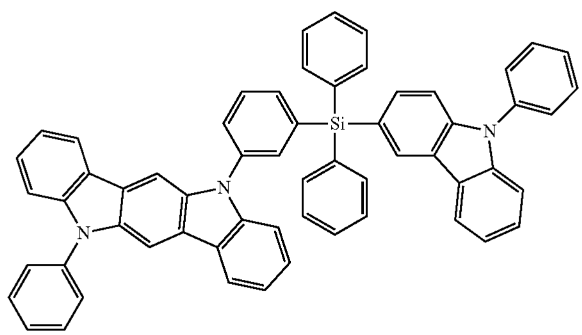
156
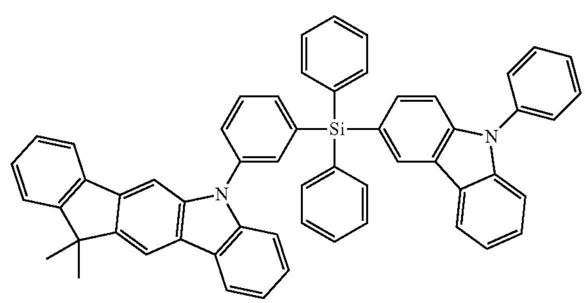
157
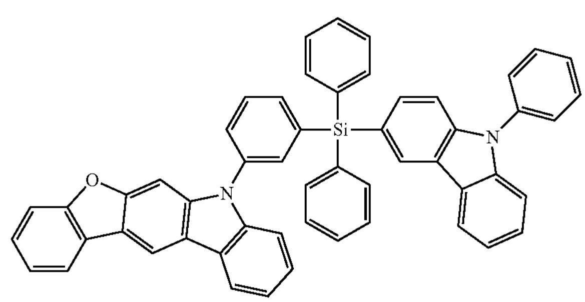

-continued
158
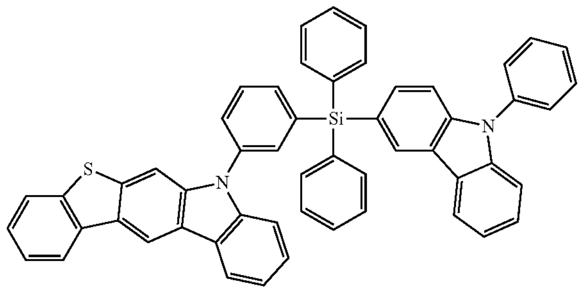
159
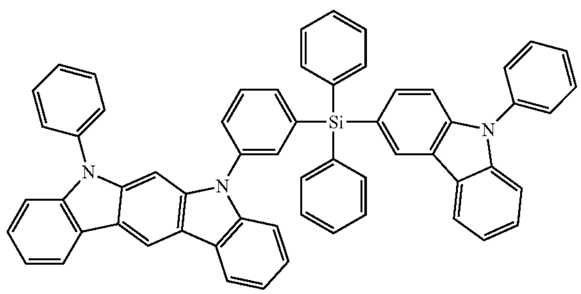
160
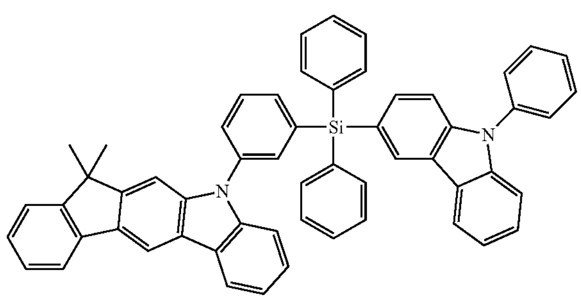
161
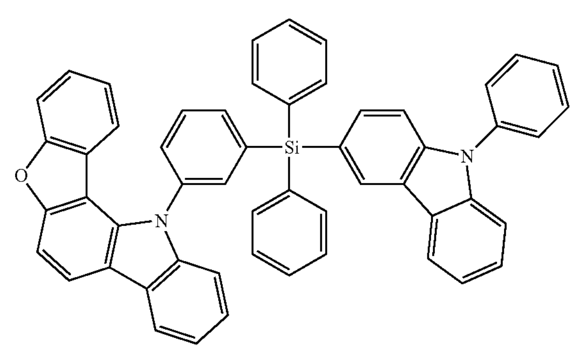
-continued
162
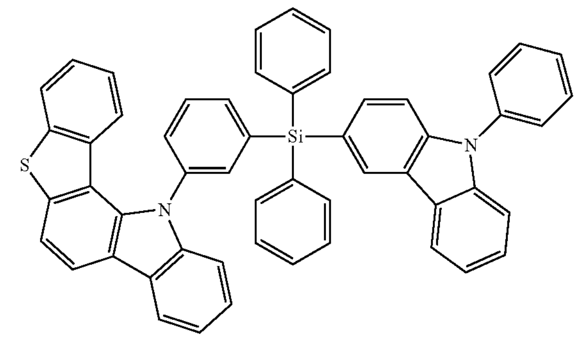
163
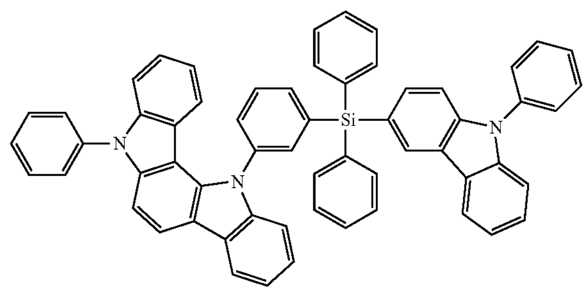
164
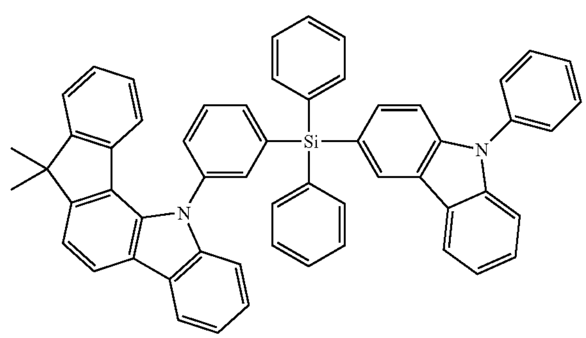
165
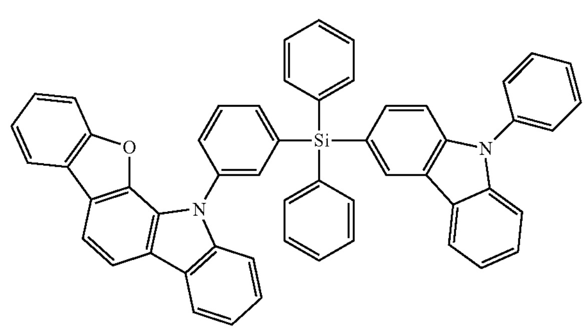

-continued
166
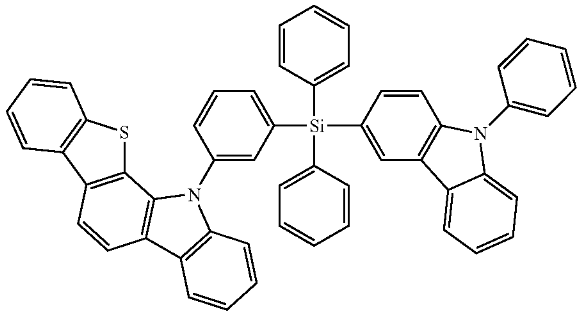
167
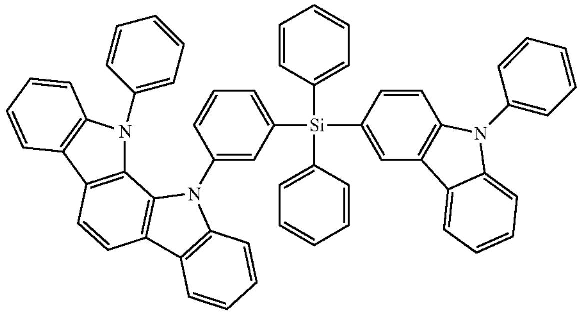
168
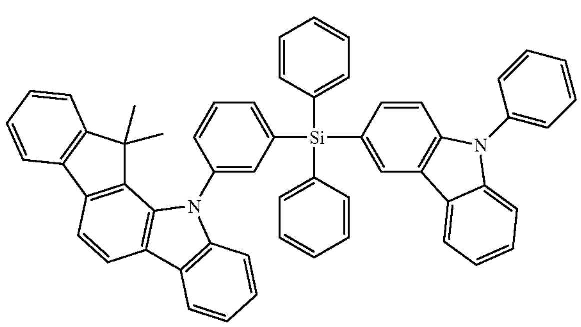
169
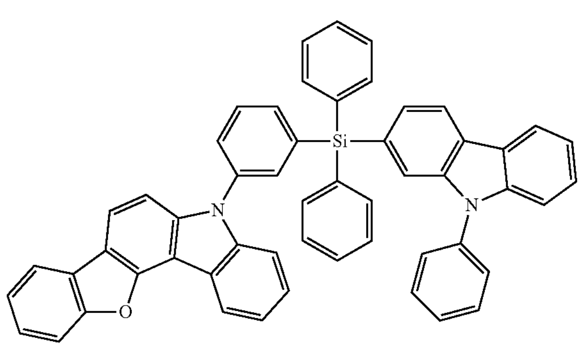
-continued
170
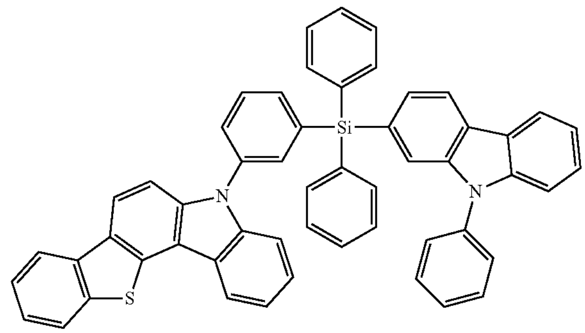
171
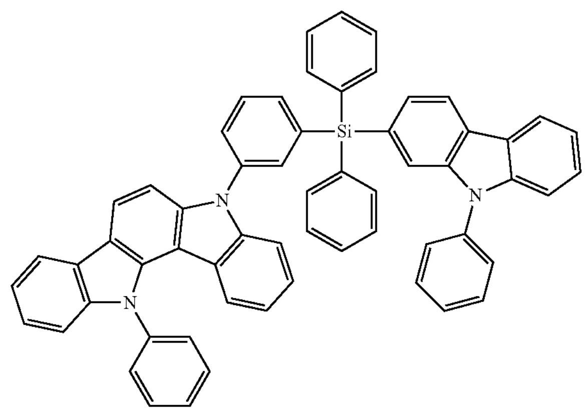
172
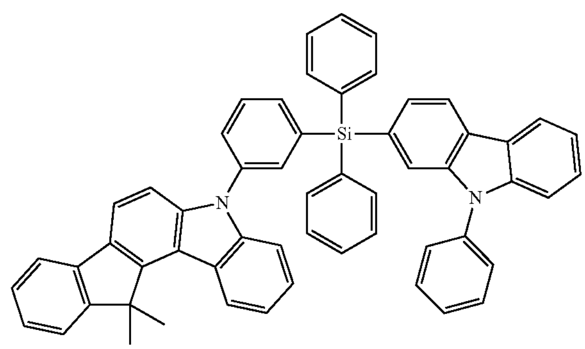
173
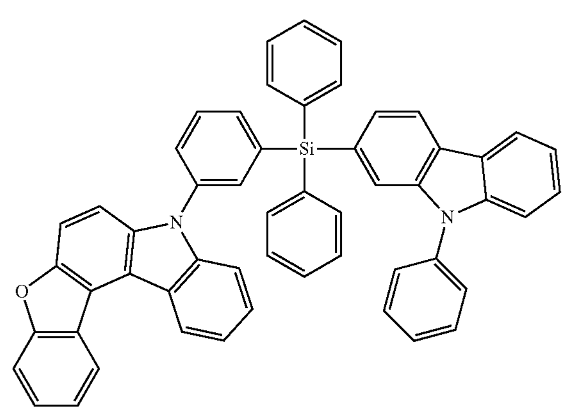

-continued
174
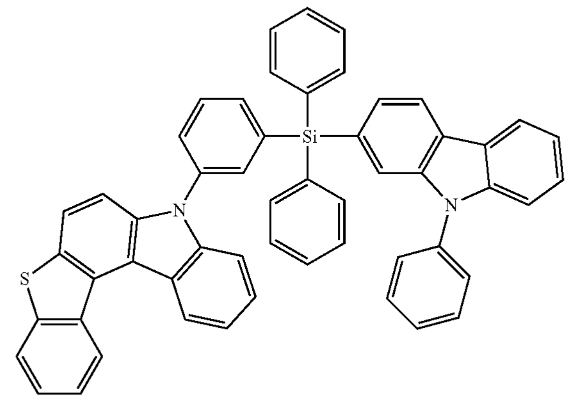
175
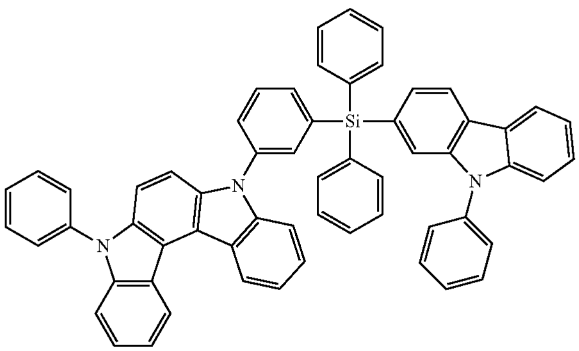
176
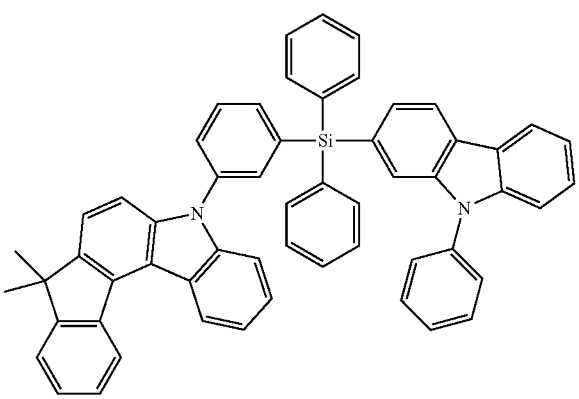
177
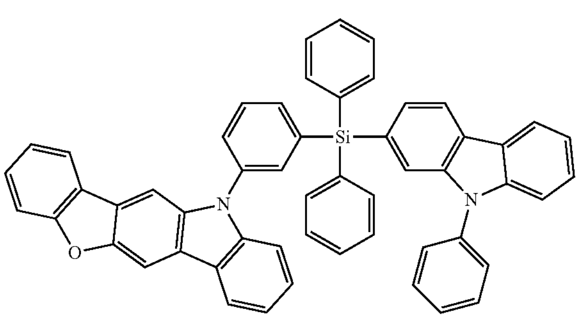
-continued
178
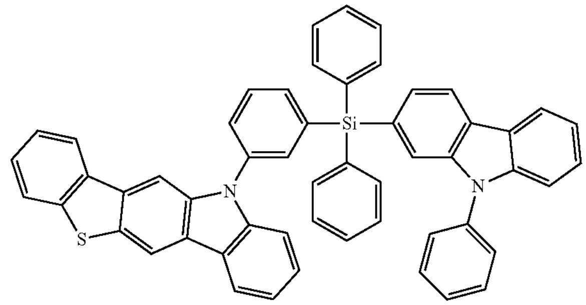
179
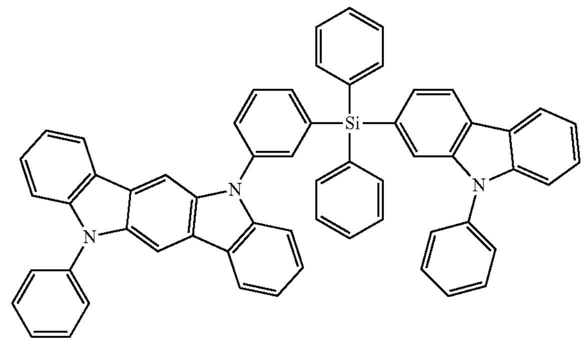
180
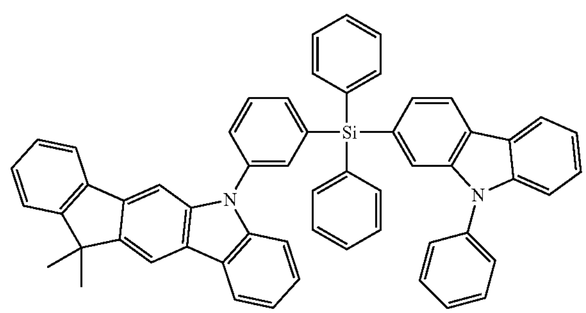
181
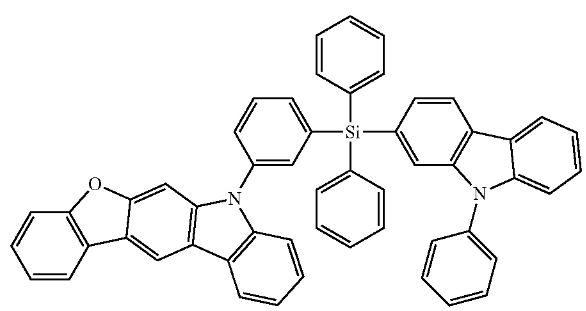

-continued
182
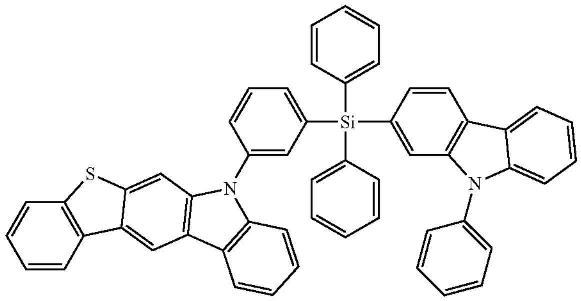
183
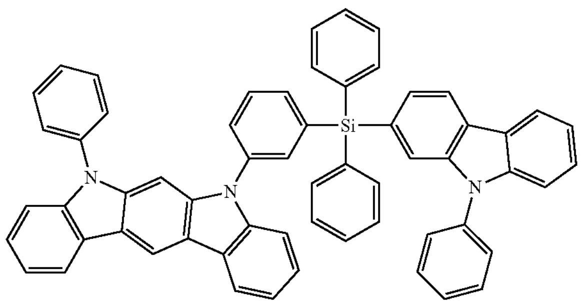
184
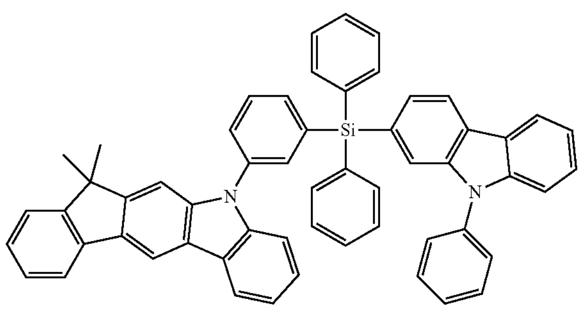
185
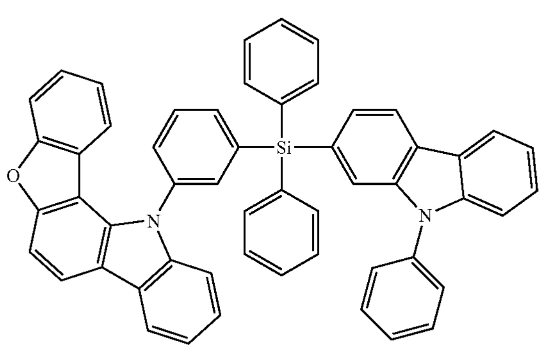
-continued
186
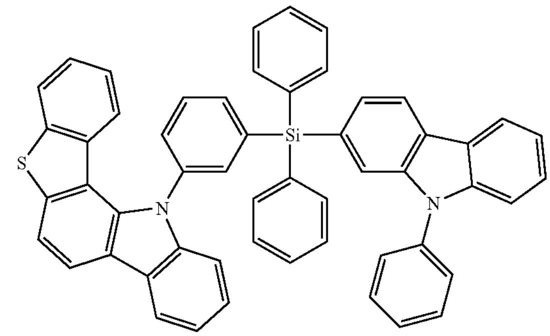
187
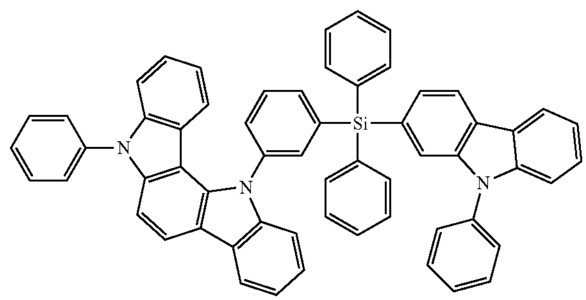
188
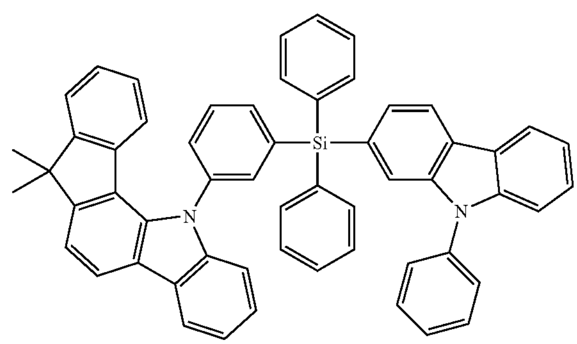
189
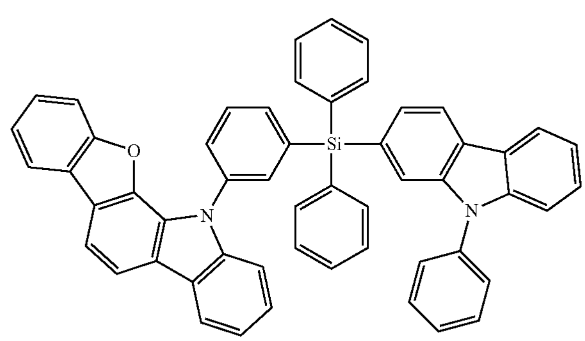

-continued
190
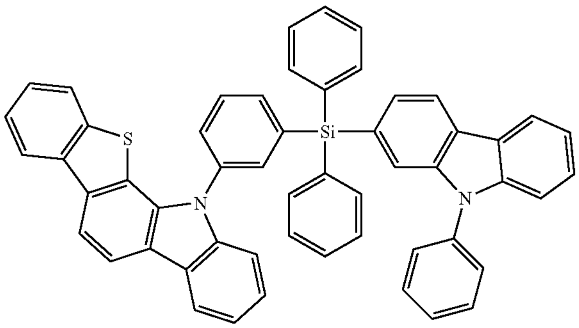
191
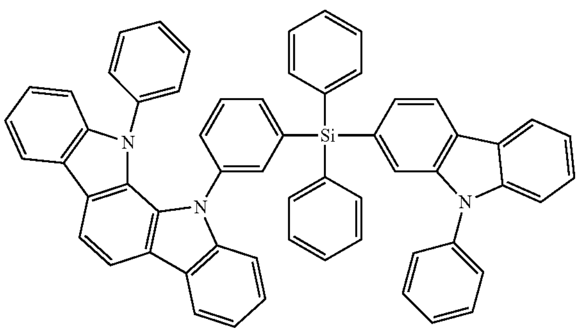
192
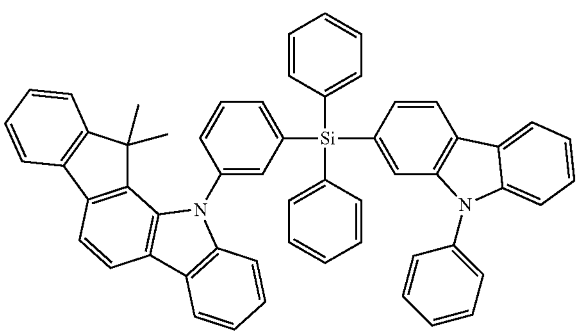
193
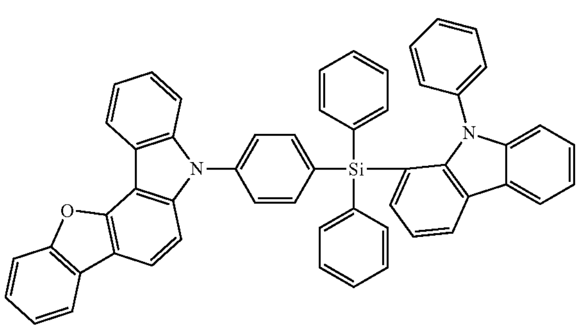
-continued
194
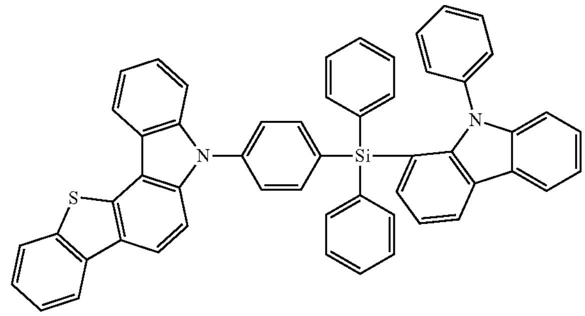
195
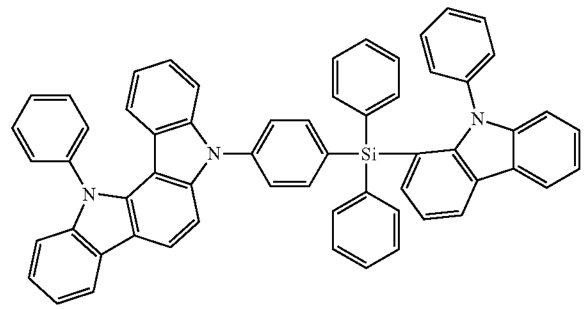
196
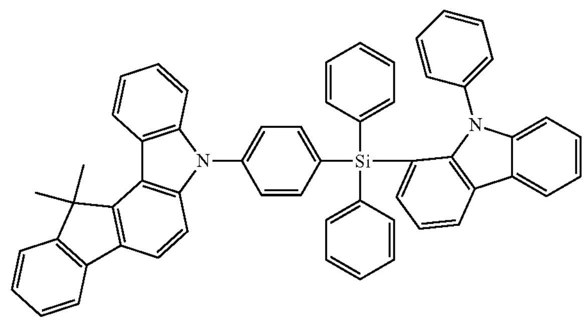
197
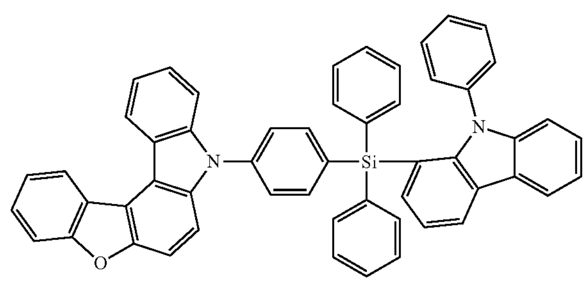
198
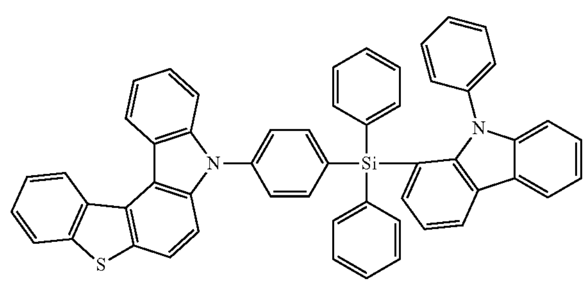

-continued
199
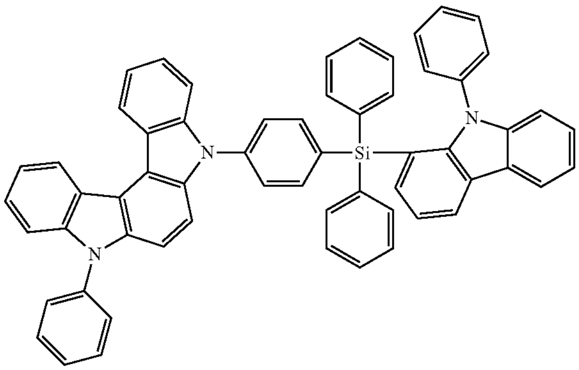
200
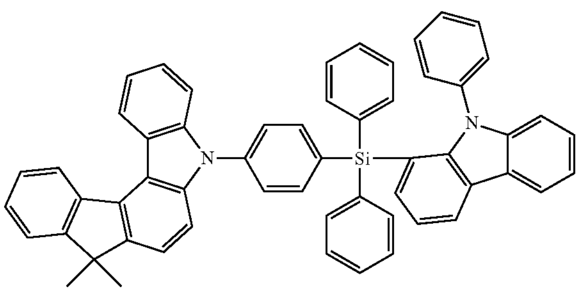
201
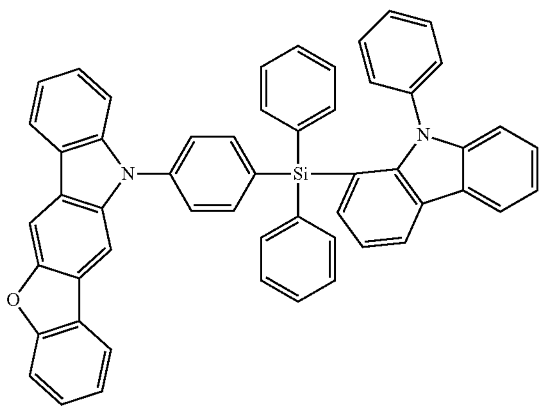
202
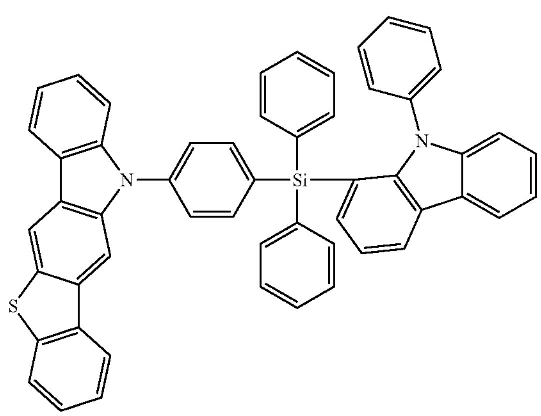
-continued
203
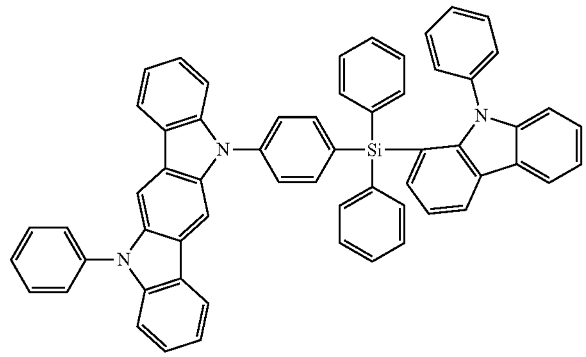
204
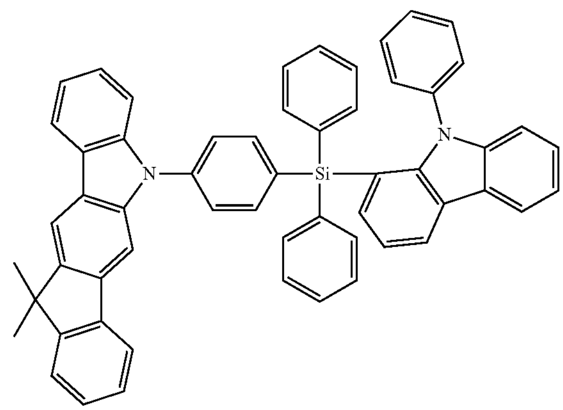
205
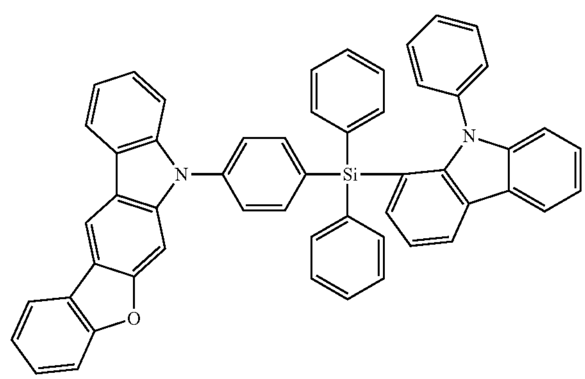
206
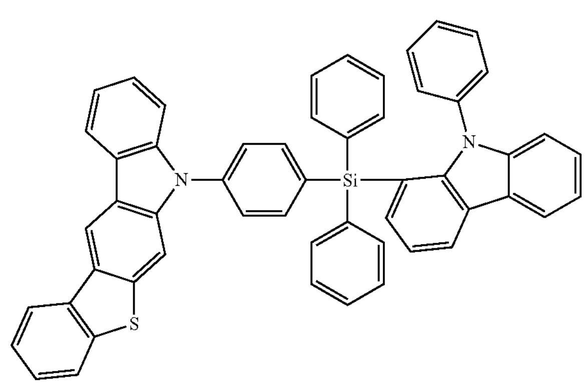

-continued
207
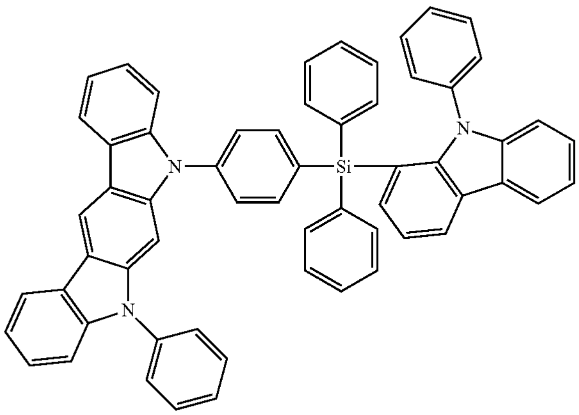
208
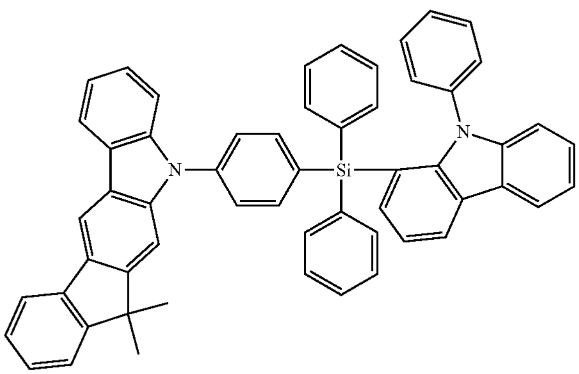
209
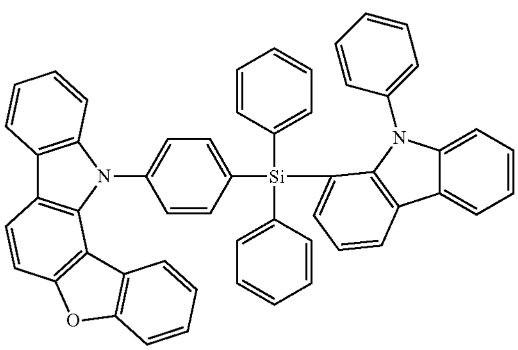
210
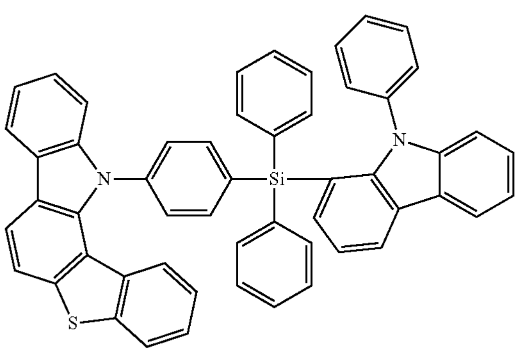
-continued
211
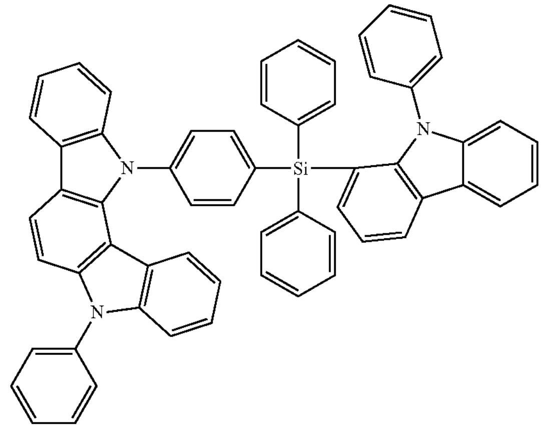
212
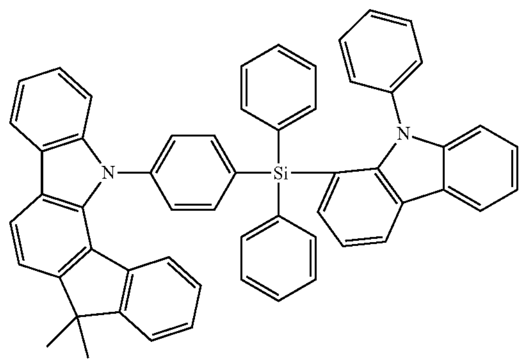
213
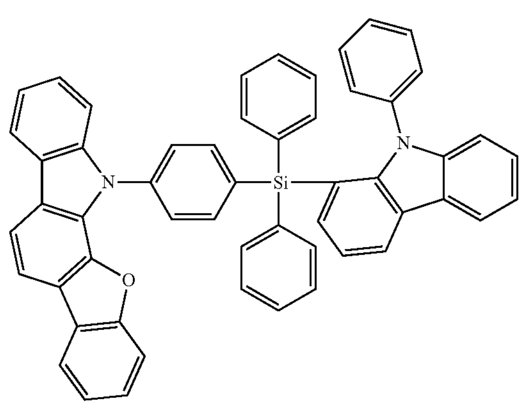

-continued
214
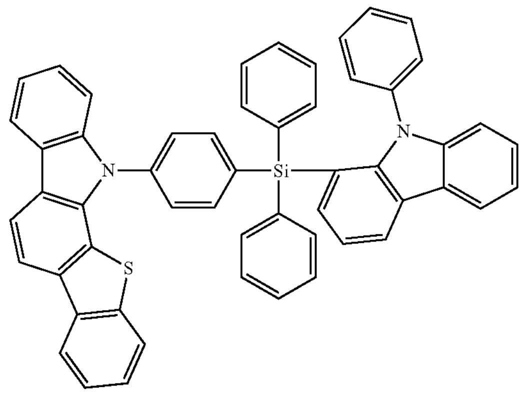
215
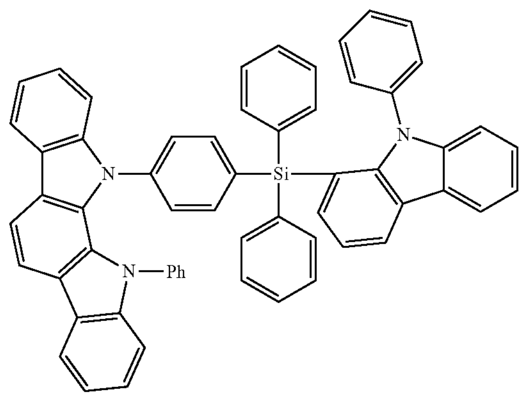
216
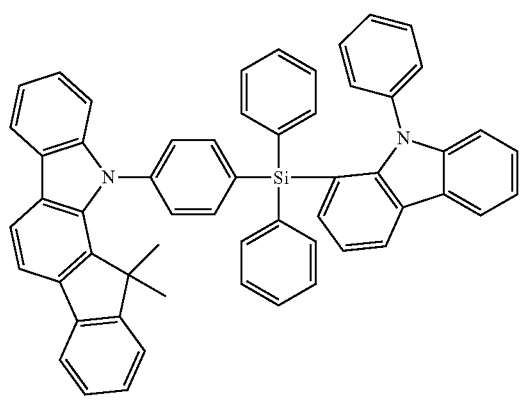
217
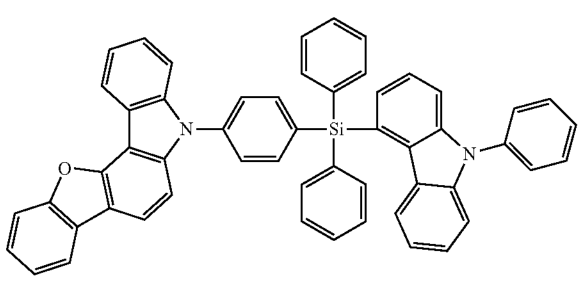
-continued
218
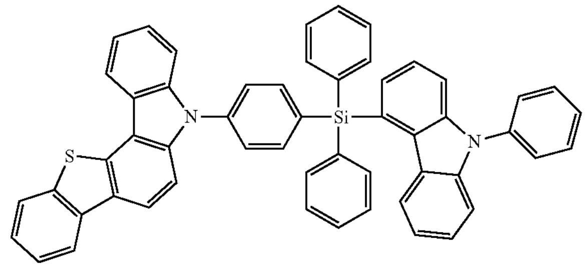
219
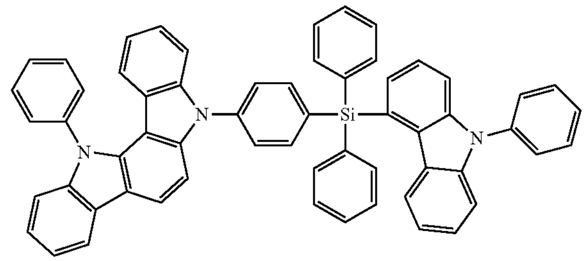
220
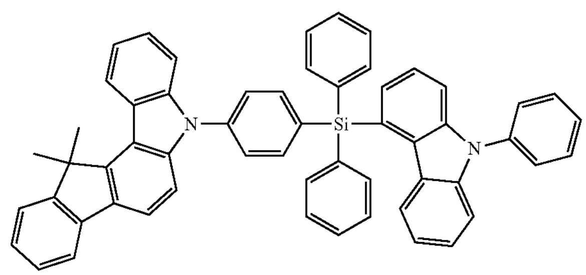
221
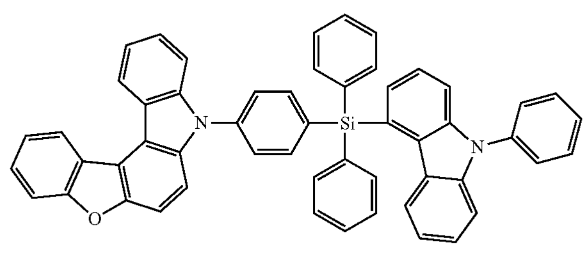
222
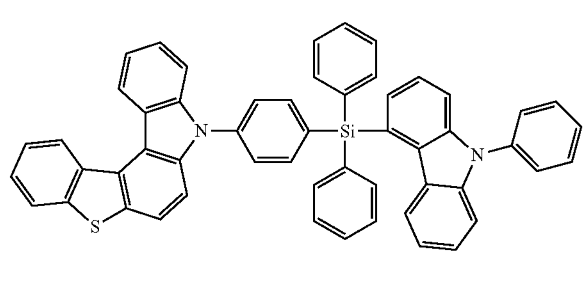

-continued
223
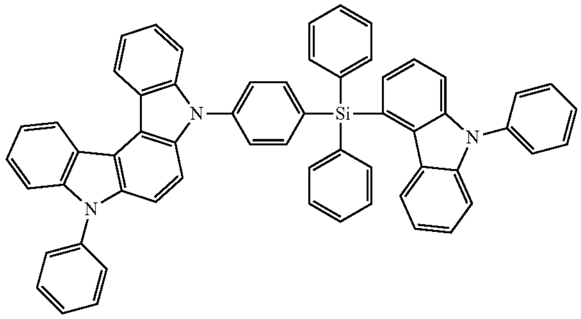
224
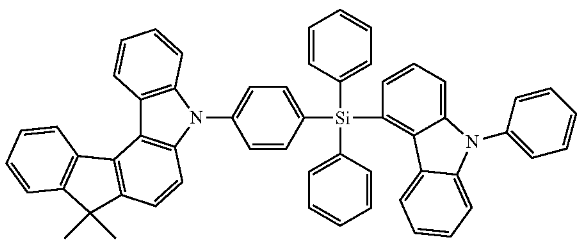
225
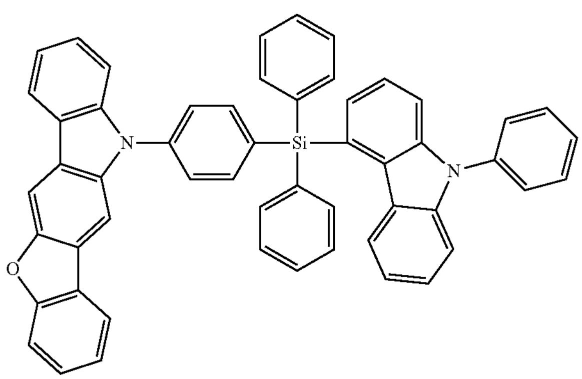
226
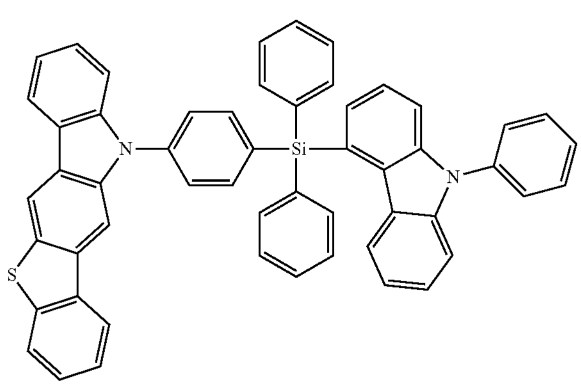
-continued
227
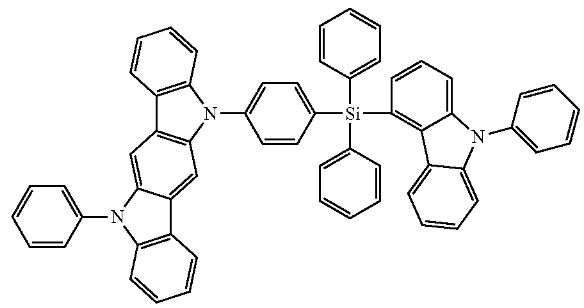
228
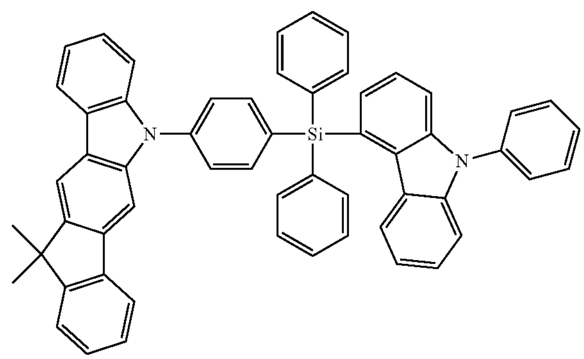
229
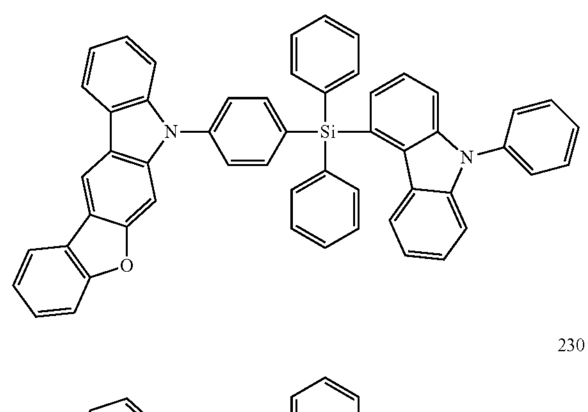
230
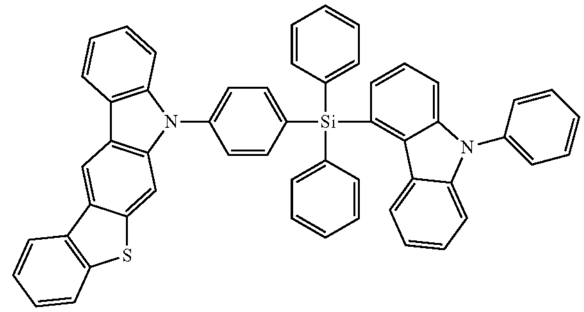

231
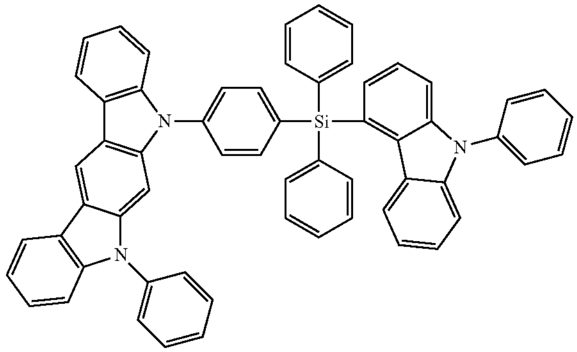
232
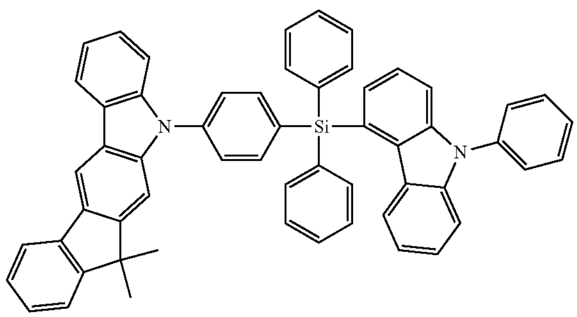
233
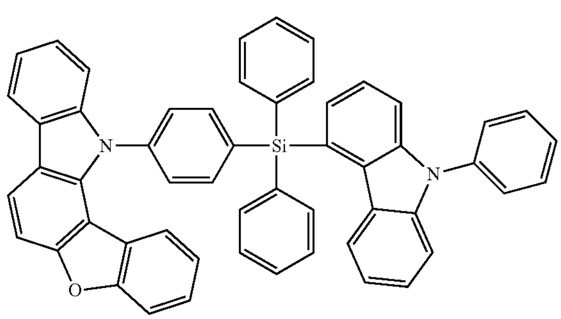
234
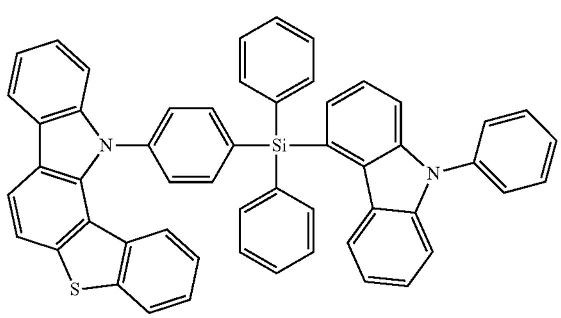
235
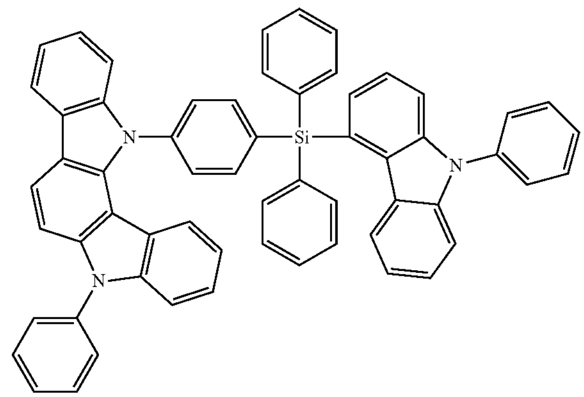
236
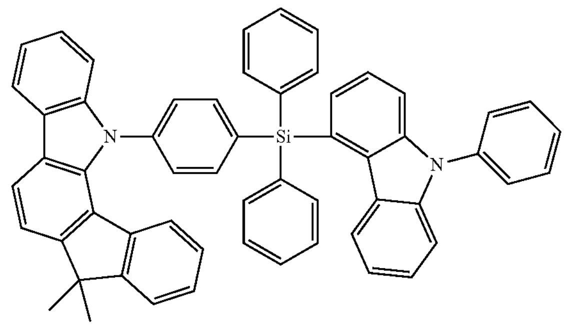
237
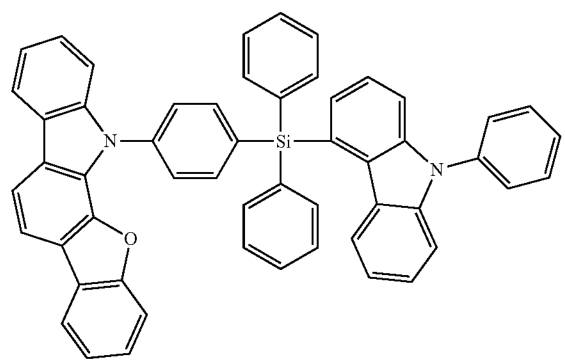
238
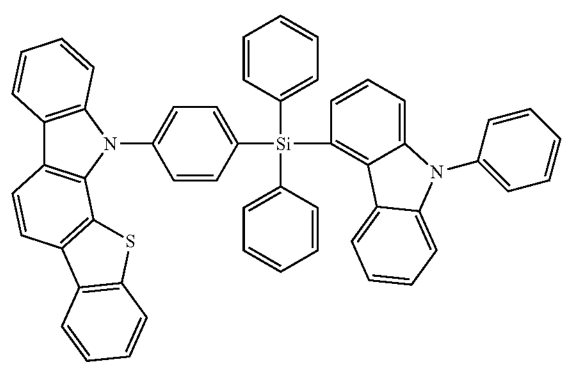

-continued
239
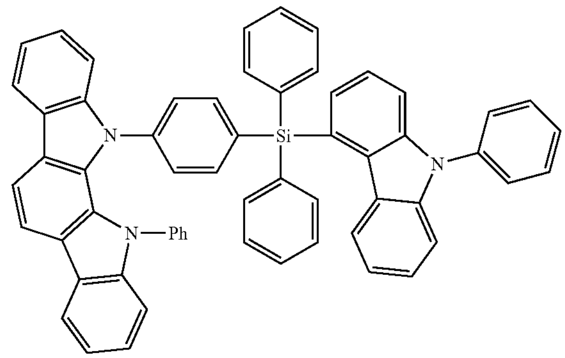
240
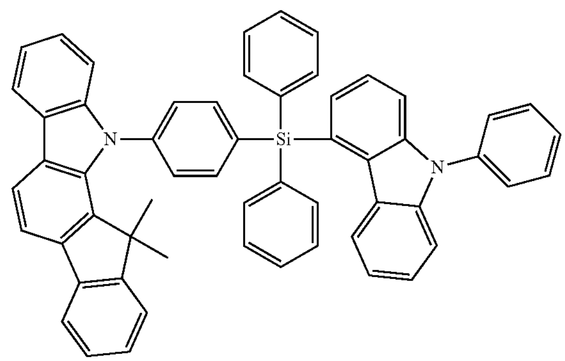
241
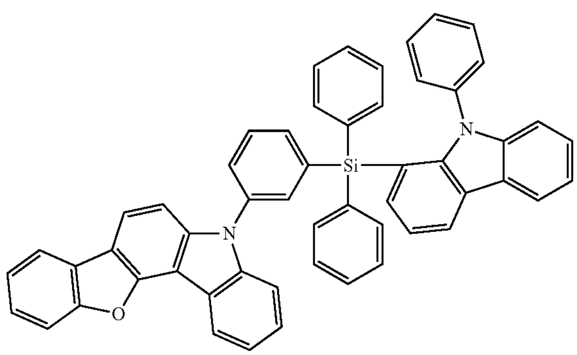
242
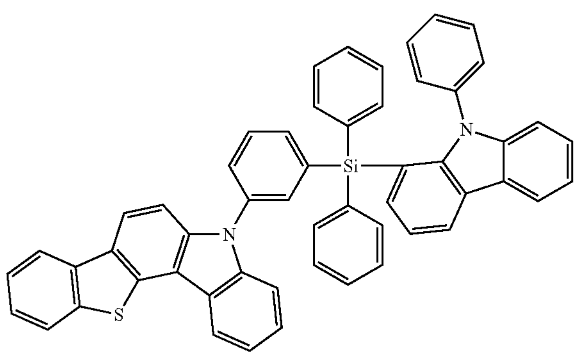
-continued
243
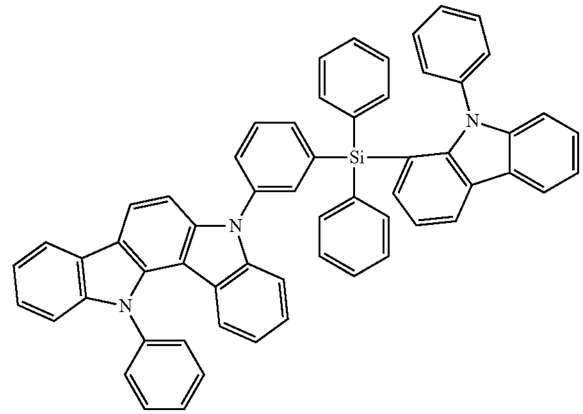
244
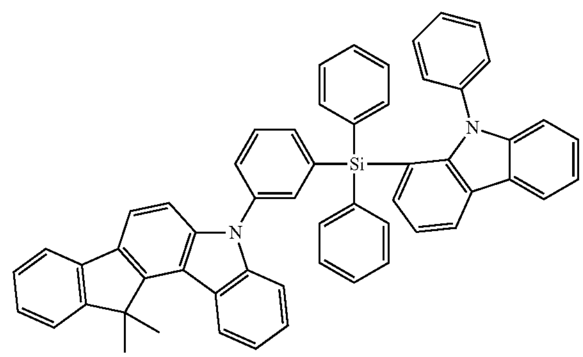
245
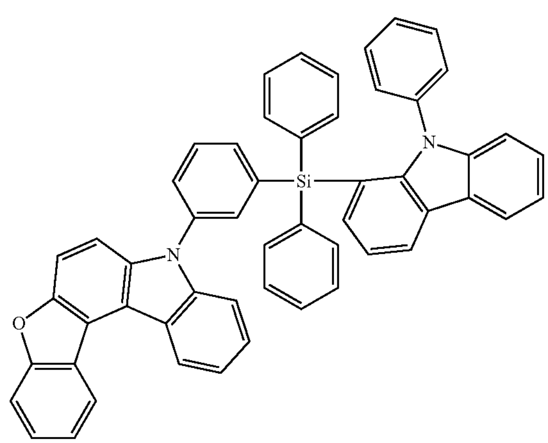

-continued
246
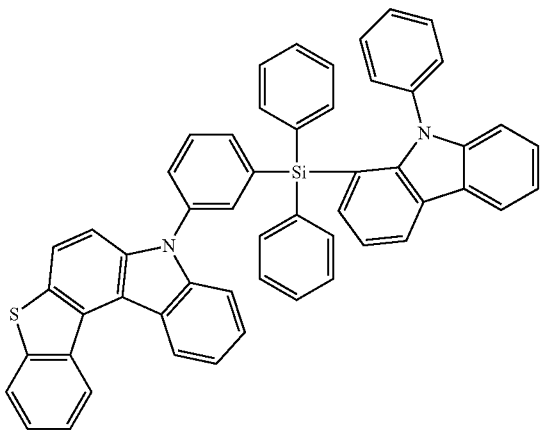
247
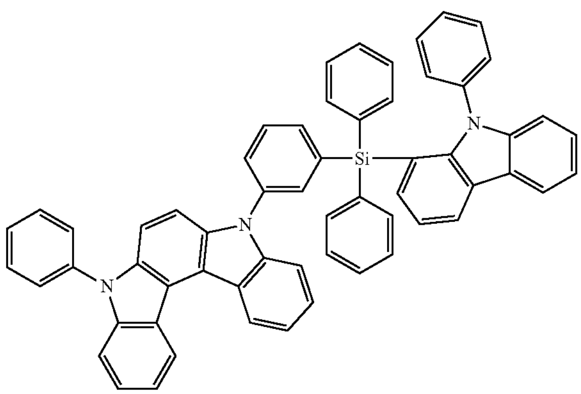
248
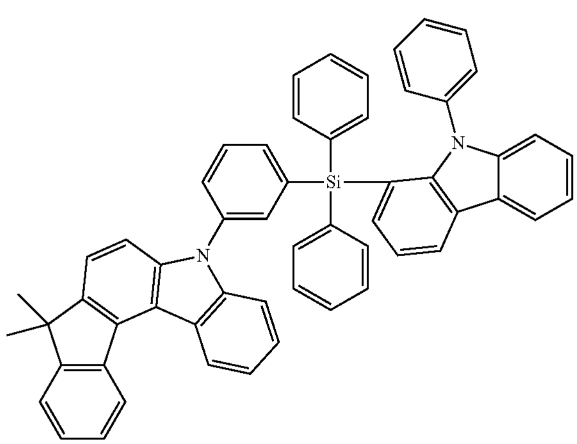
-continued
249
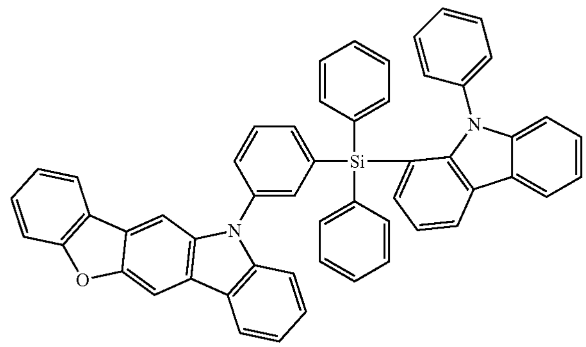
250
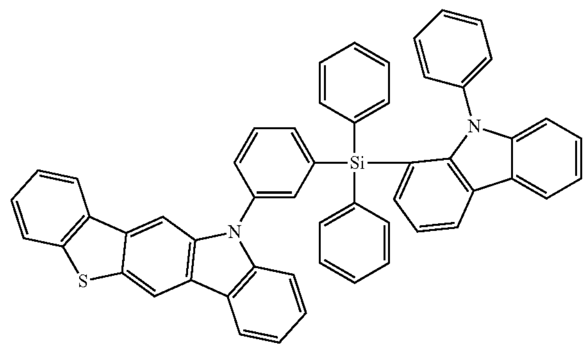
251
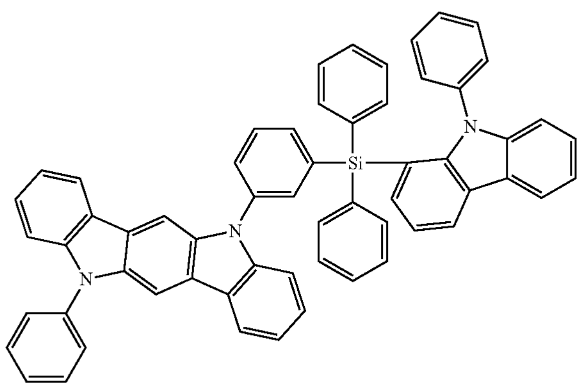
252
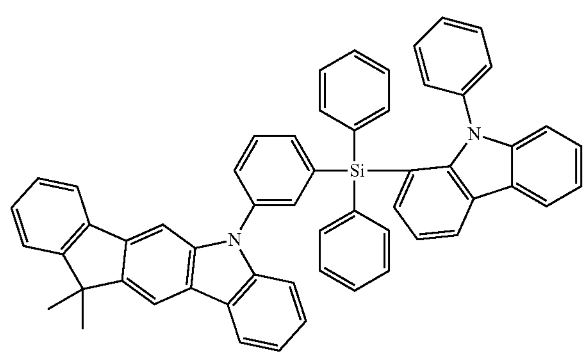

-continued
253
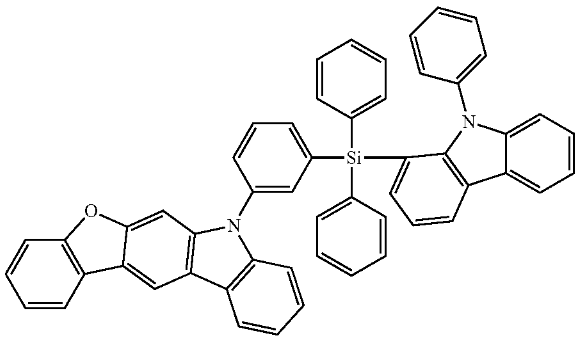
254
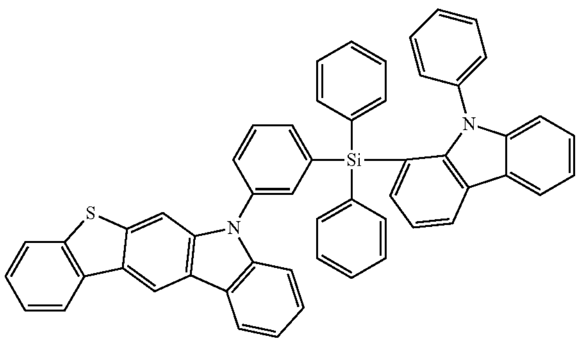
255
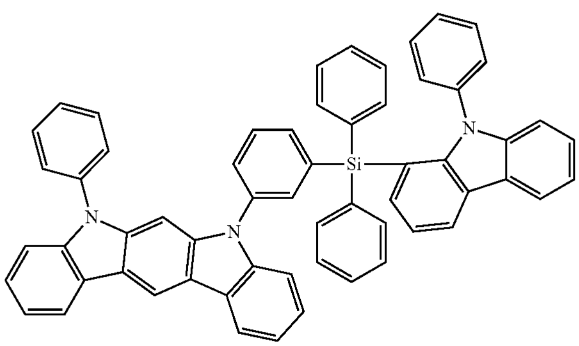
256
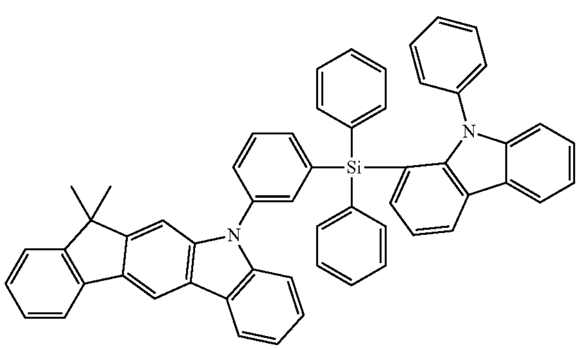
-continued
257
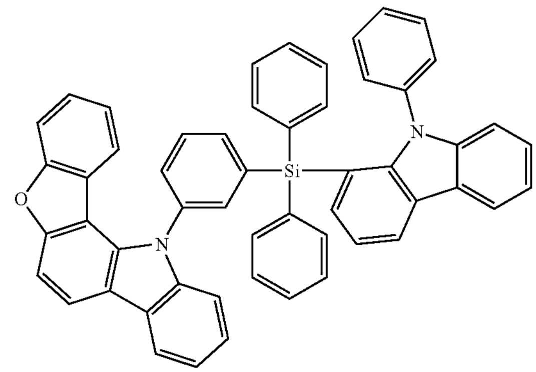
258
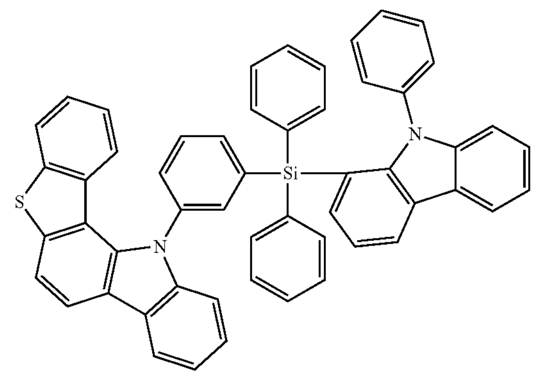
259
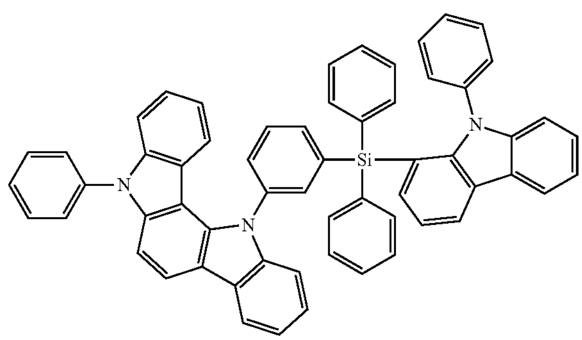
260
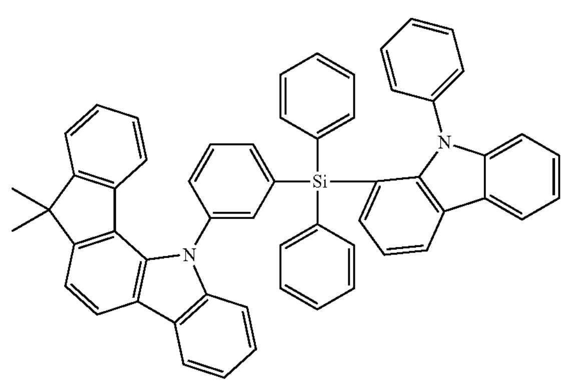

-continued
261
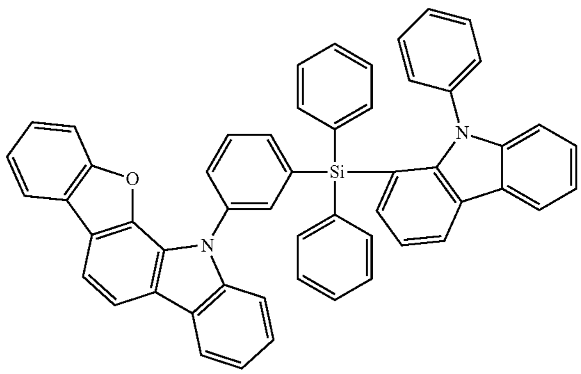
262
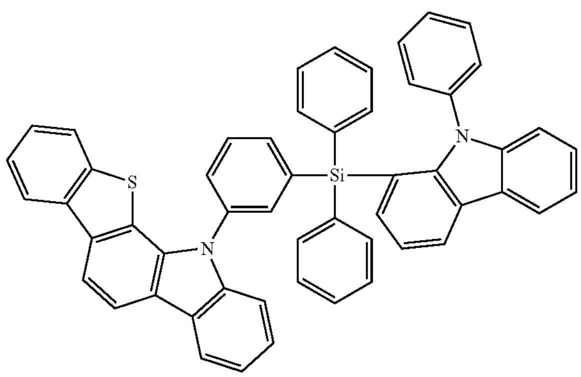
263
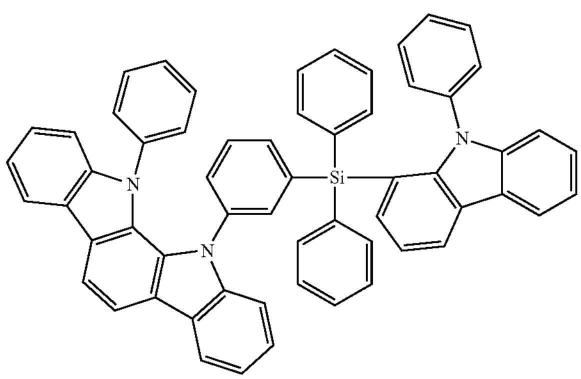
264
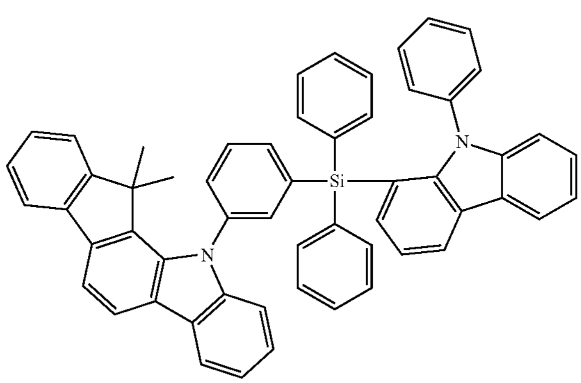
-continued
265
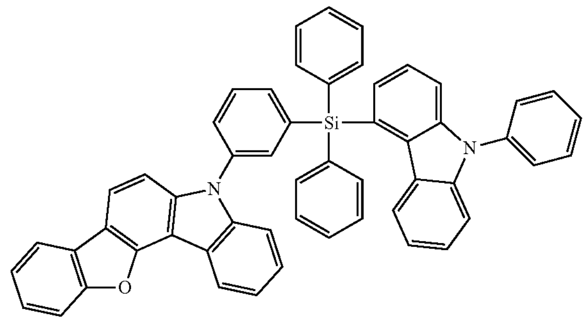
266
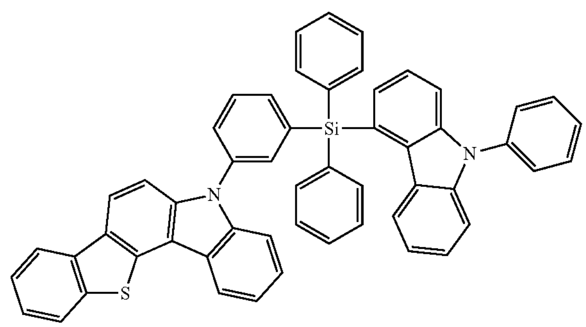
267
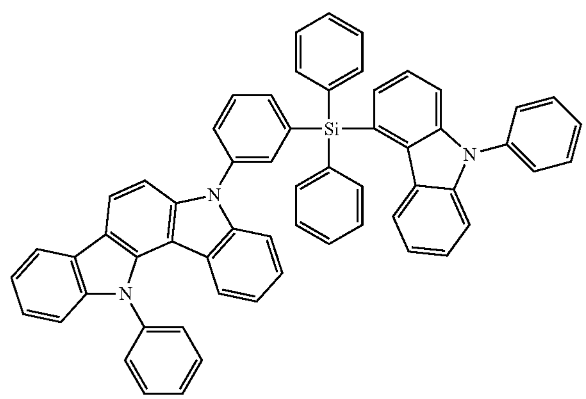
268
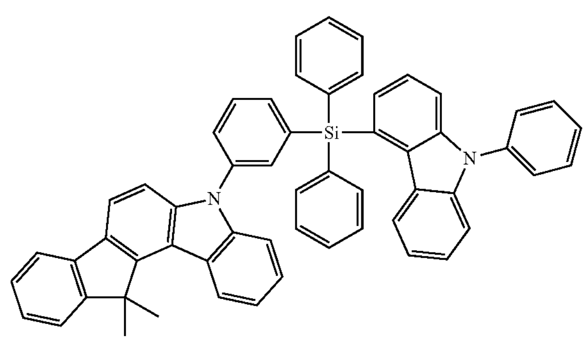

269
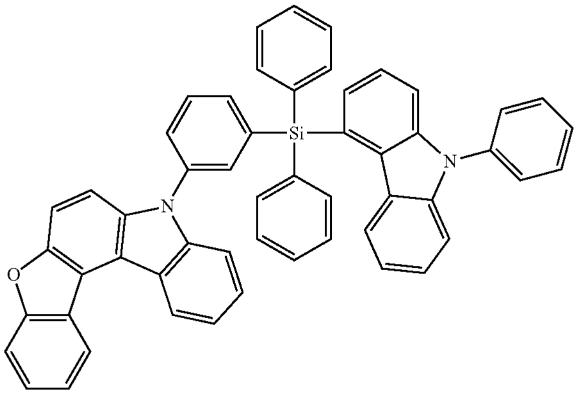
270
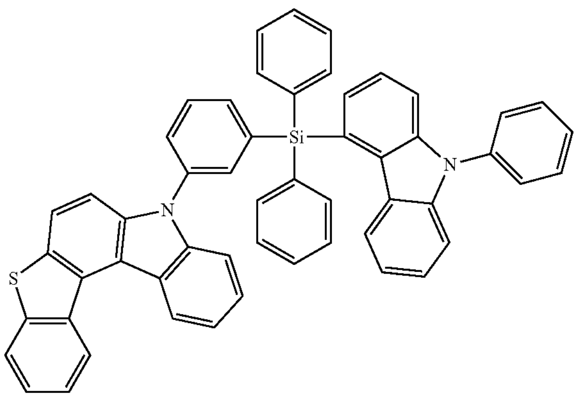
271
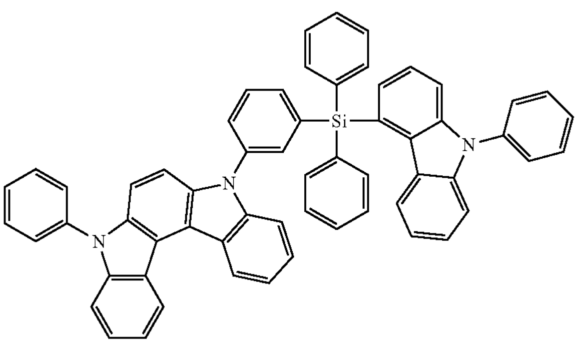
272
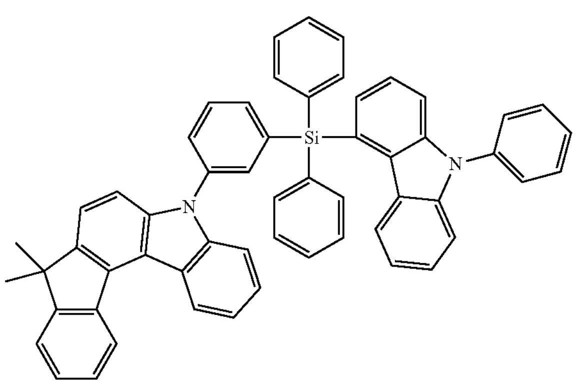
273
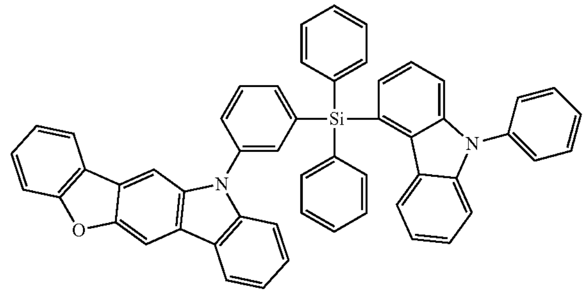
274
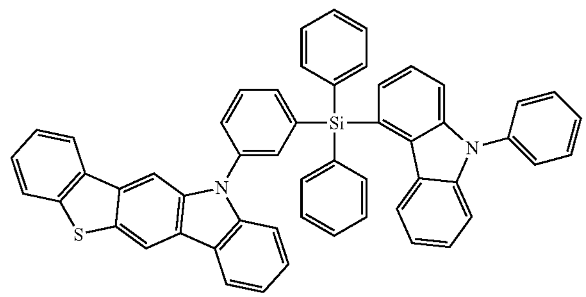
275
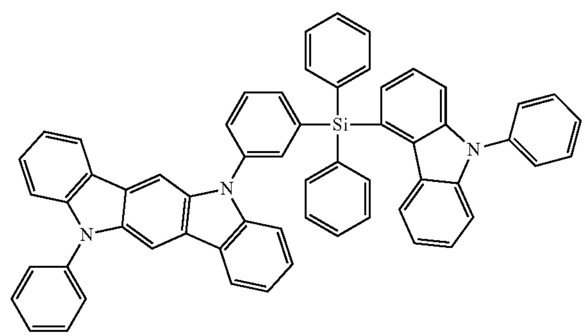
276
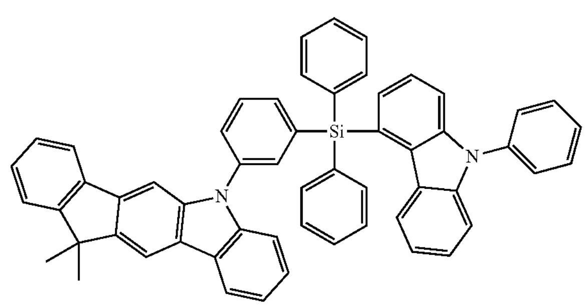

-continued
277
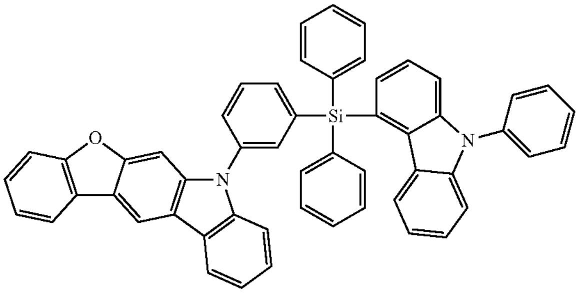
278
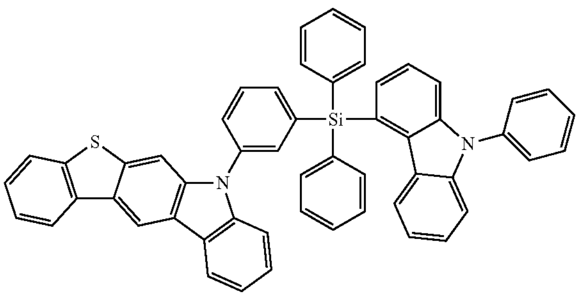
279
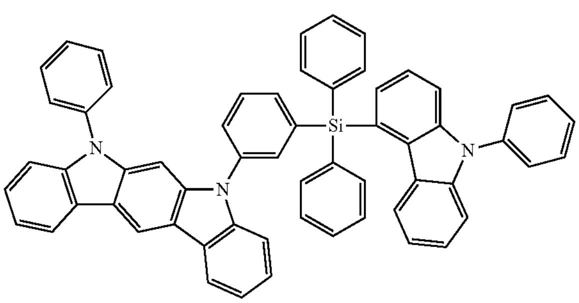
280
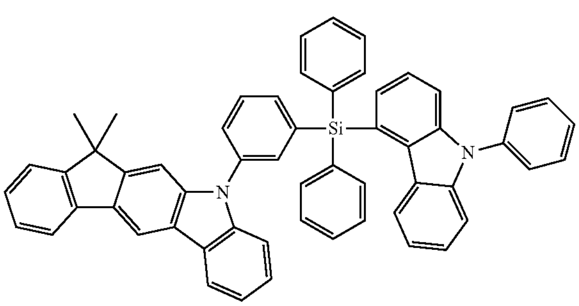
-continued
281
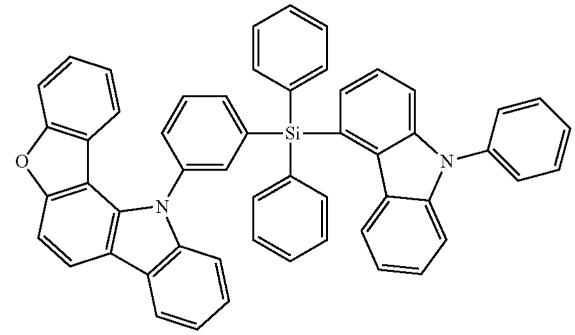
282
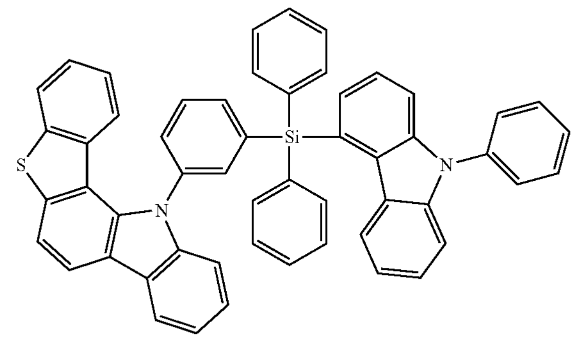
283
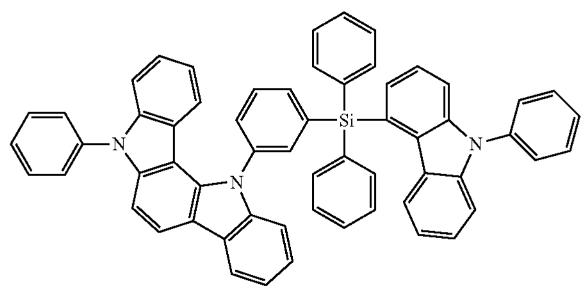
284
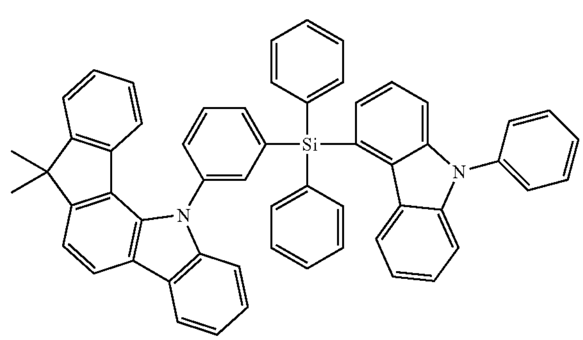

-continued
285
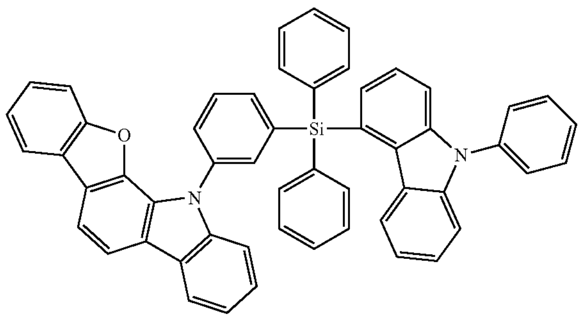
286
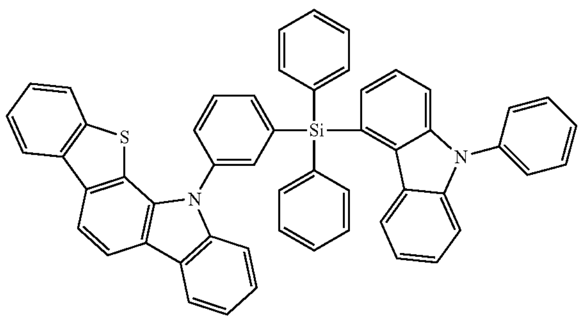
-continued
287
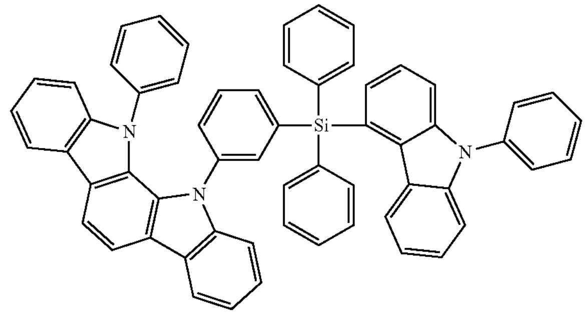
288
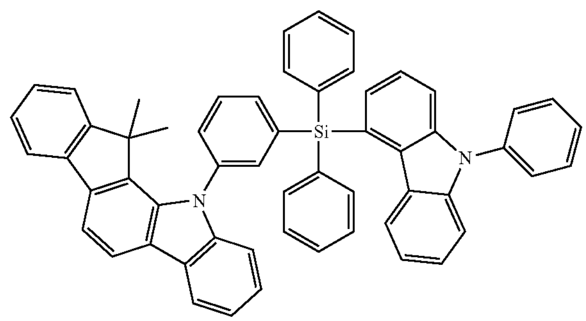
289
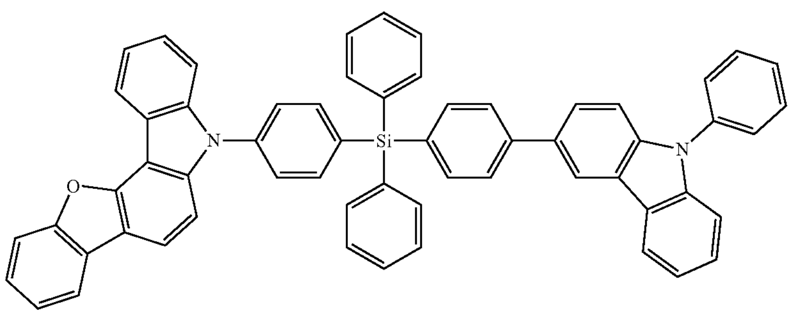
290
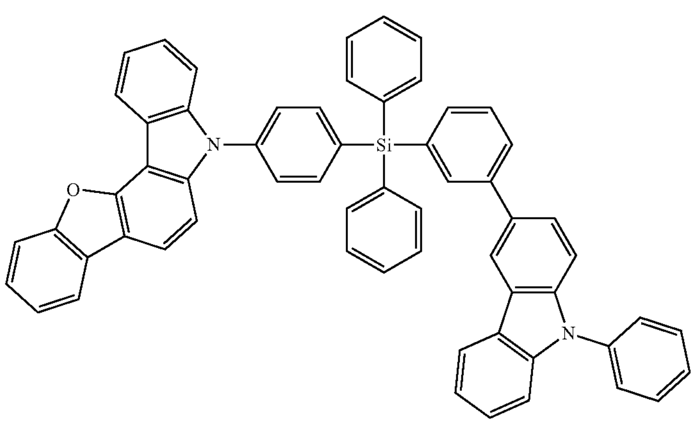

-continued
291
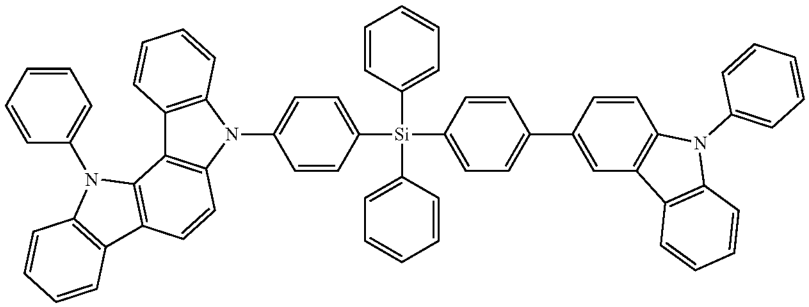
292
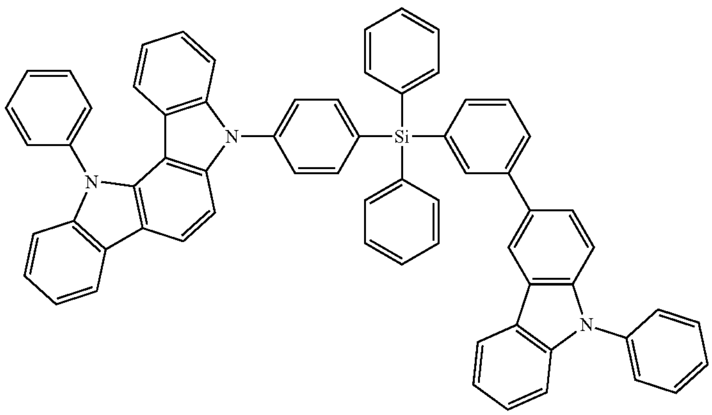
293
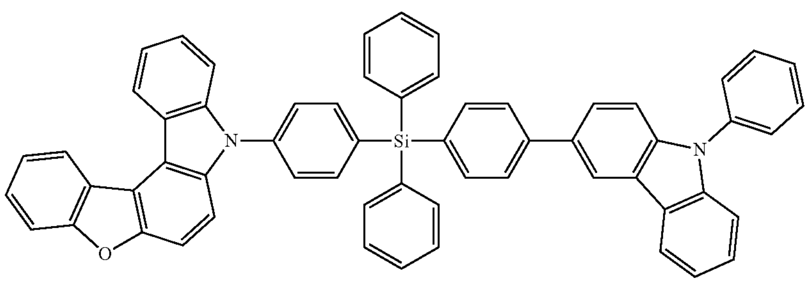
294
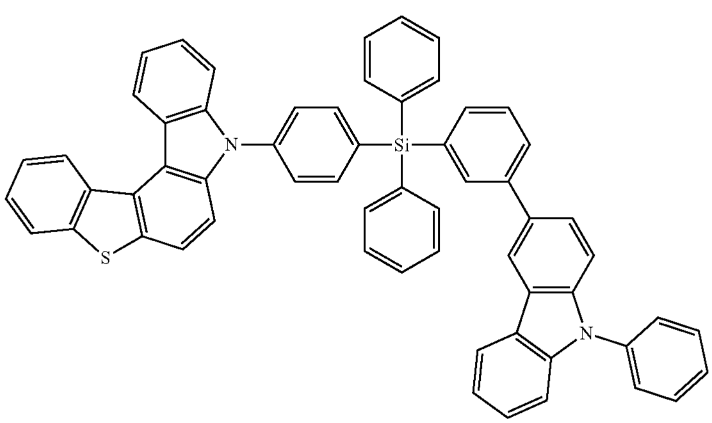

-continued
295
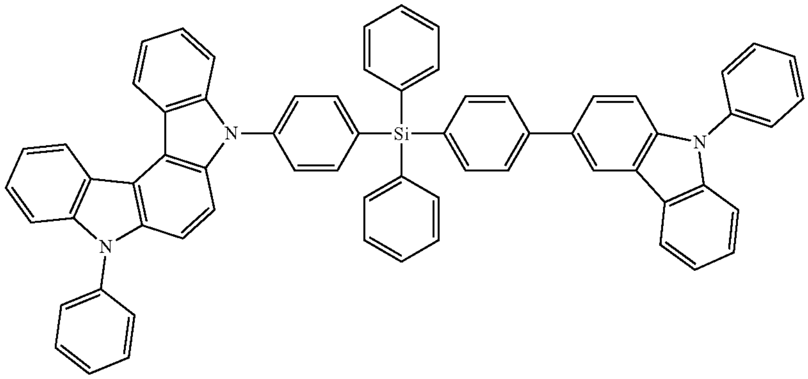
296
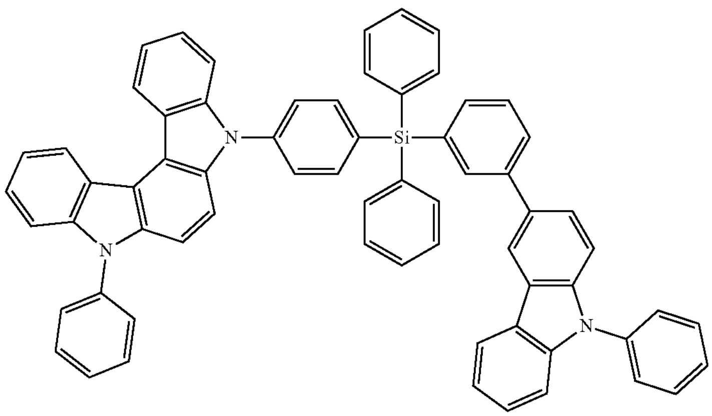
297
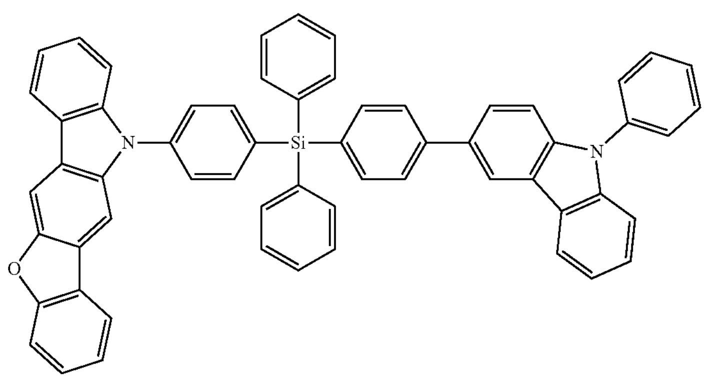
298
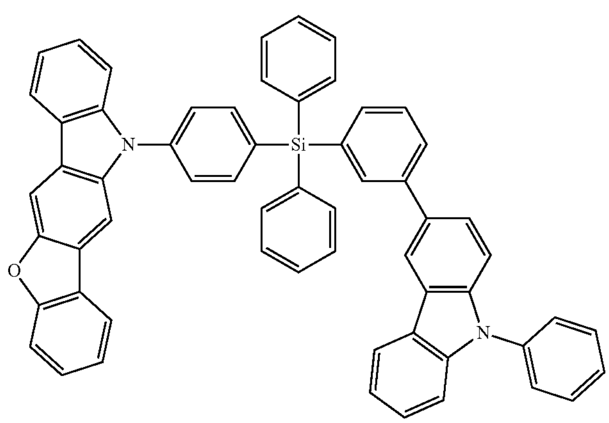

-continued
299
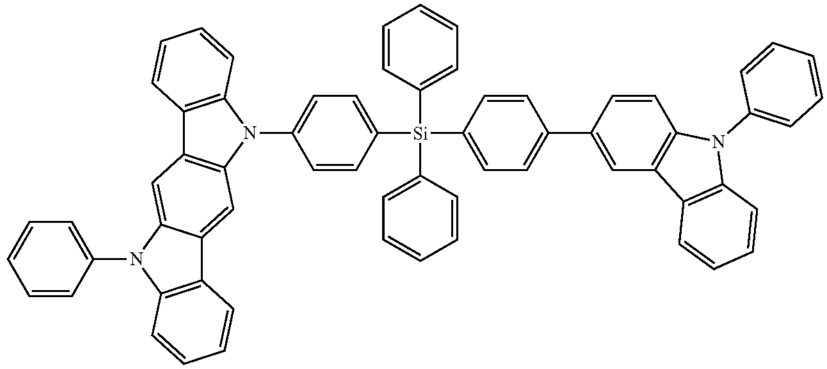
300
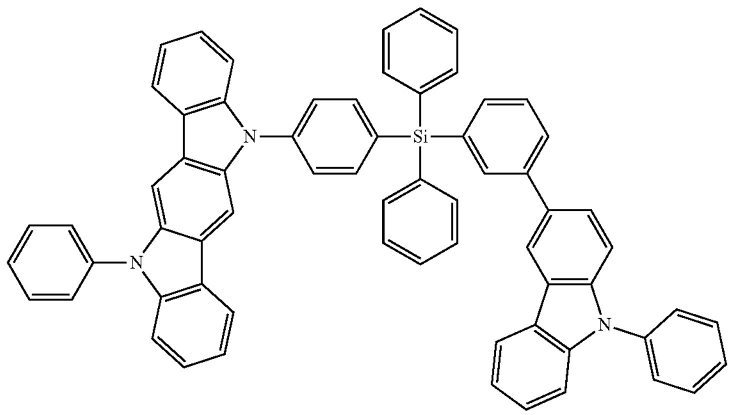
301
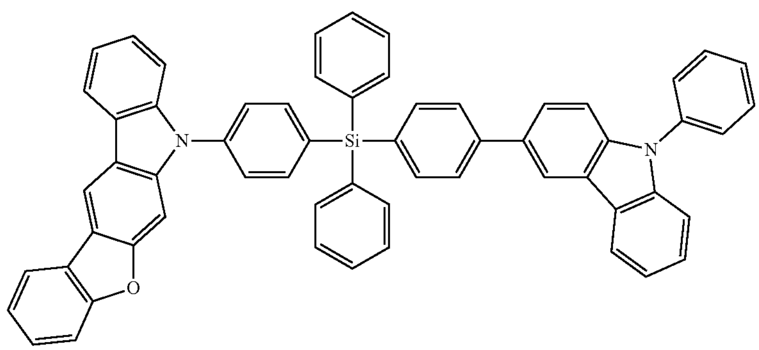
302
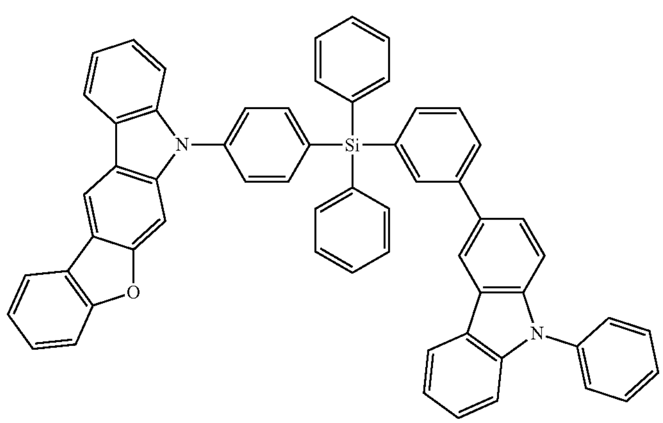

-continued
303
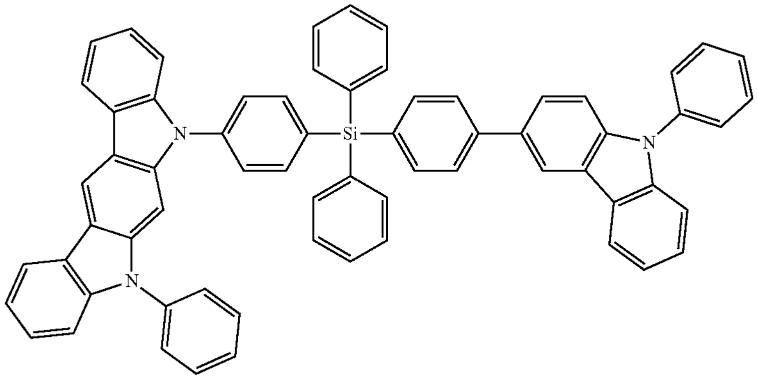
304
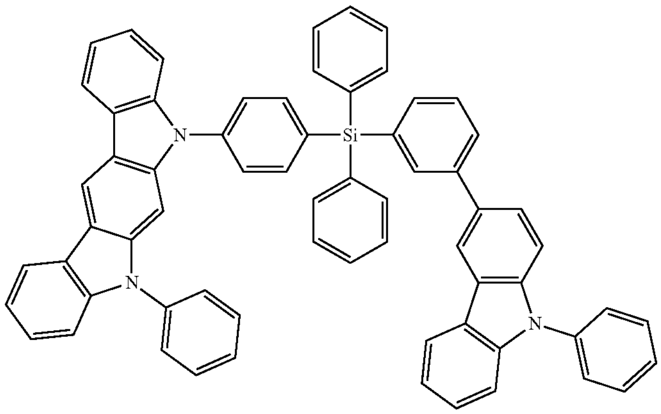
305
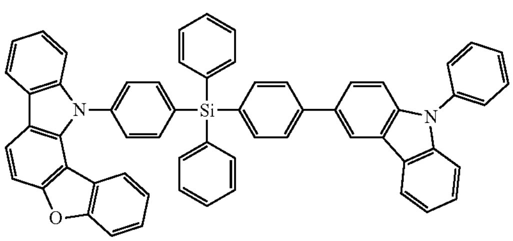
306
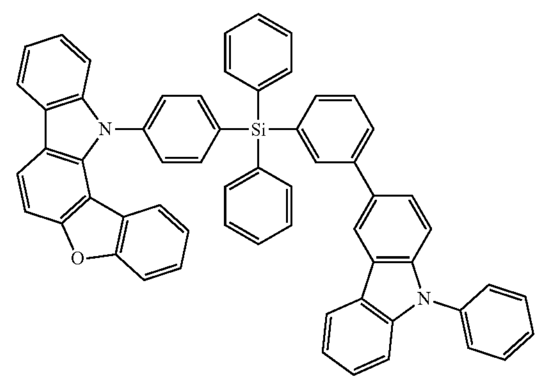
307
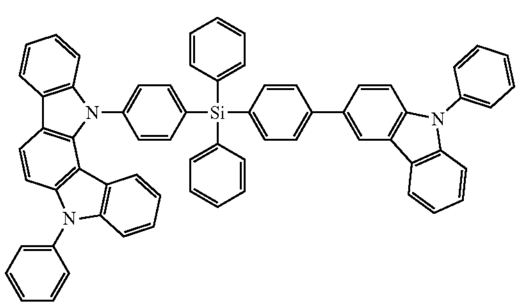
308
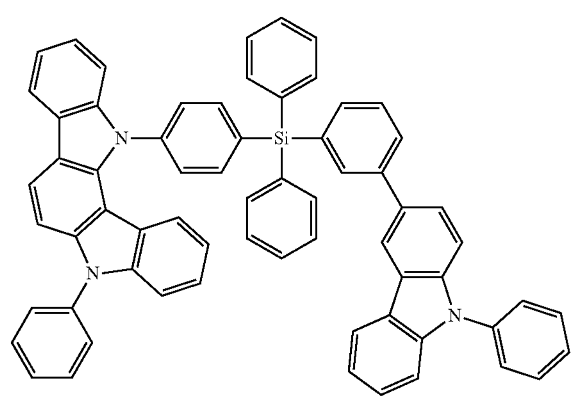

-continued
309
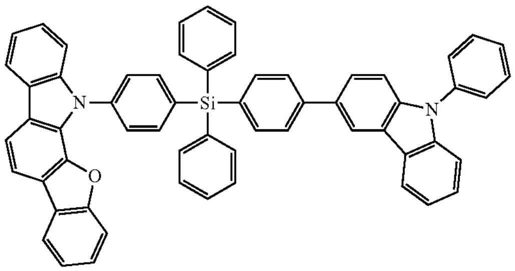
310
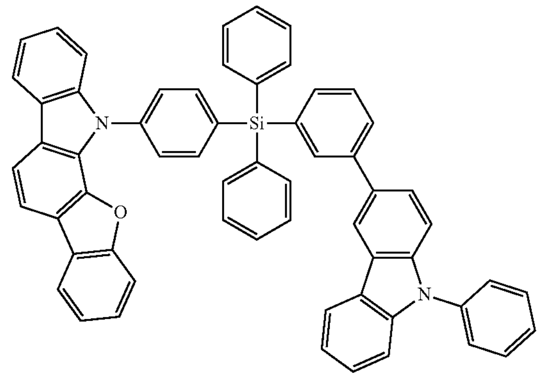
311
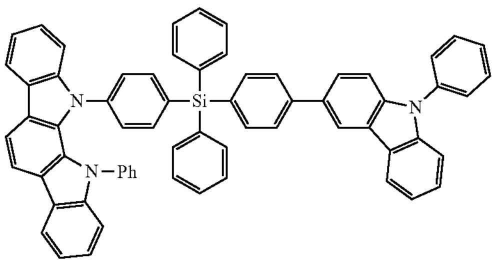
312
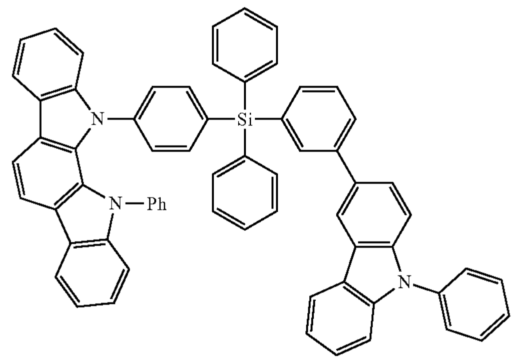
313
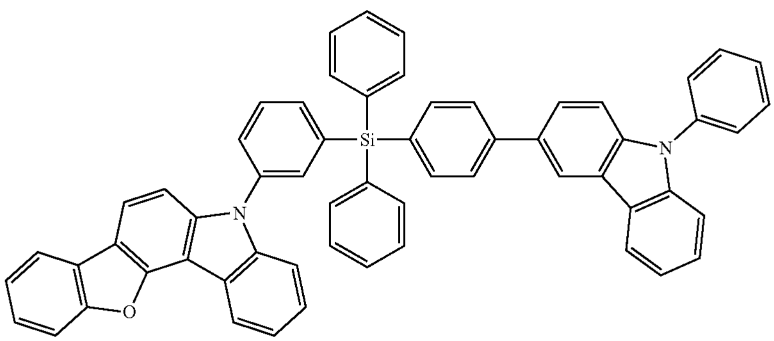
314
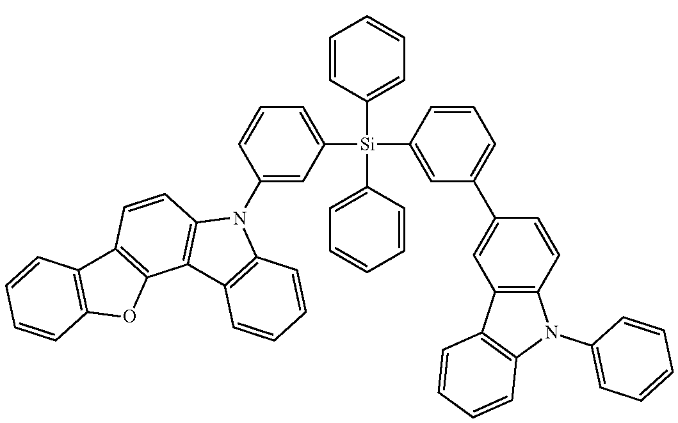

-continued
315
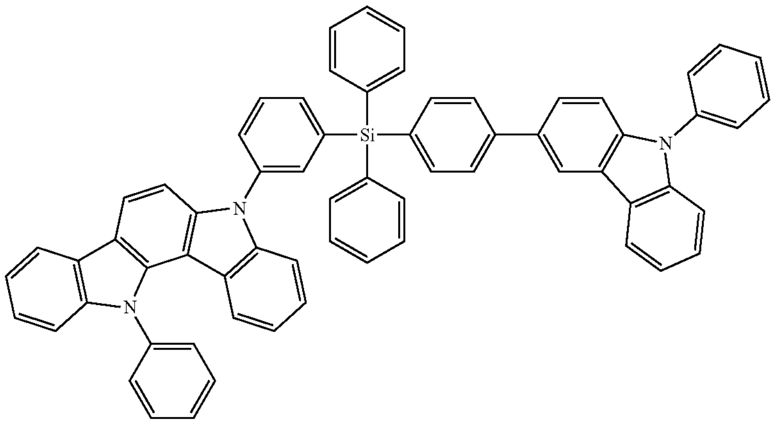
316
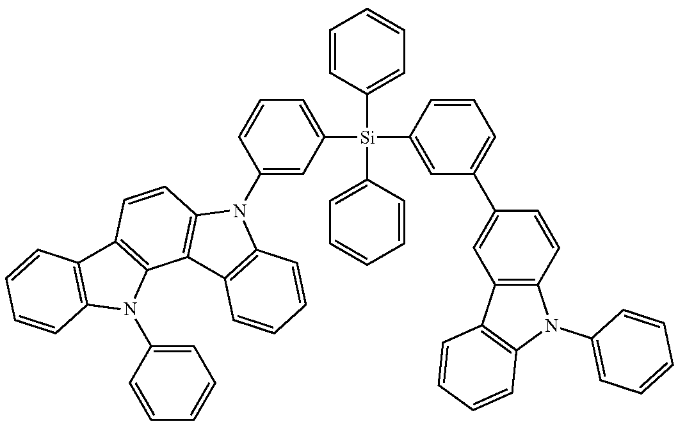
317
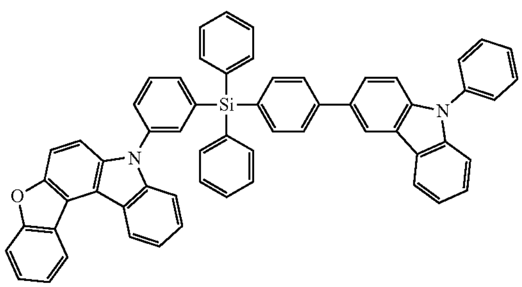
318
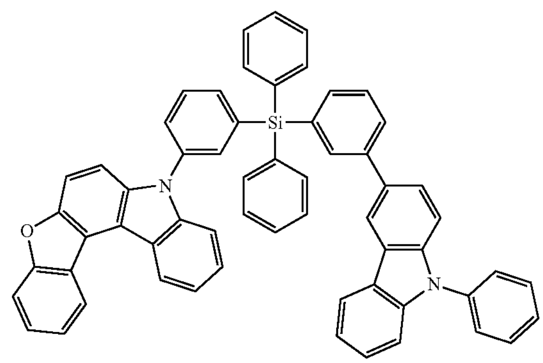
319
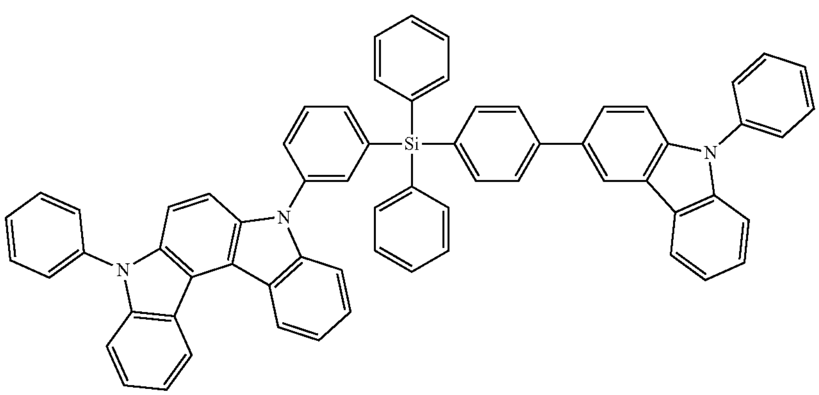

-continued
320
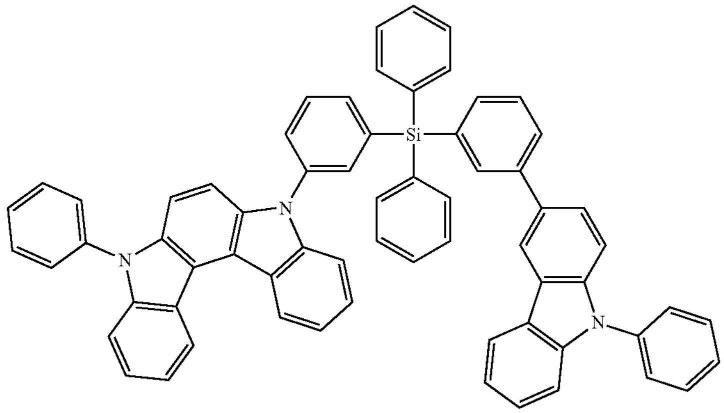
321
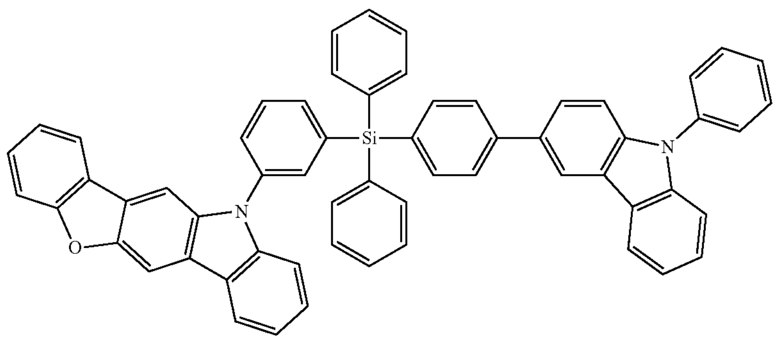
322
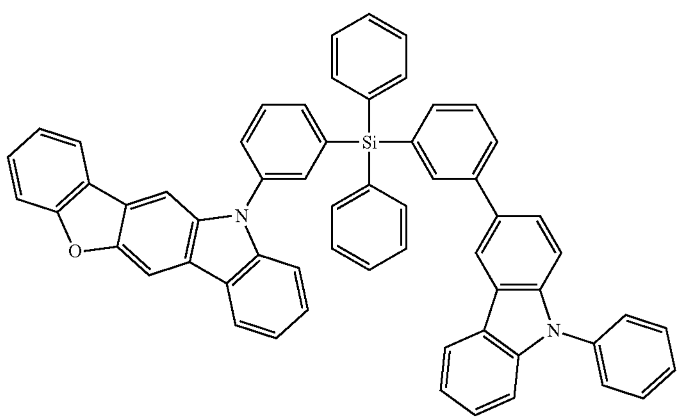
323
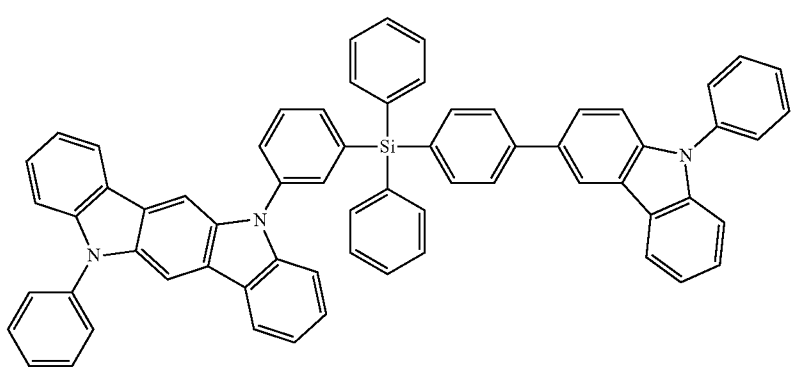

-continued
324
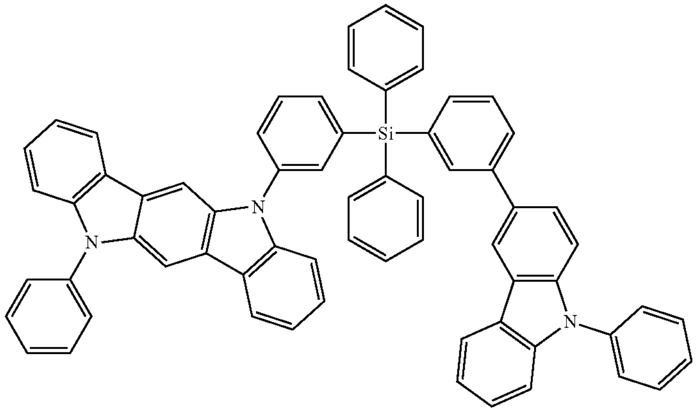
325
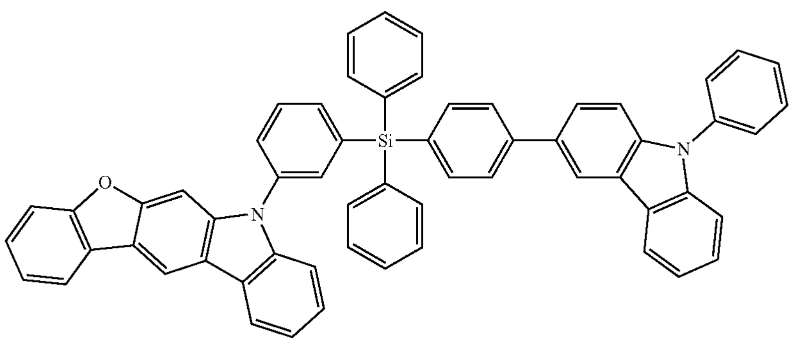
326
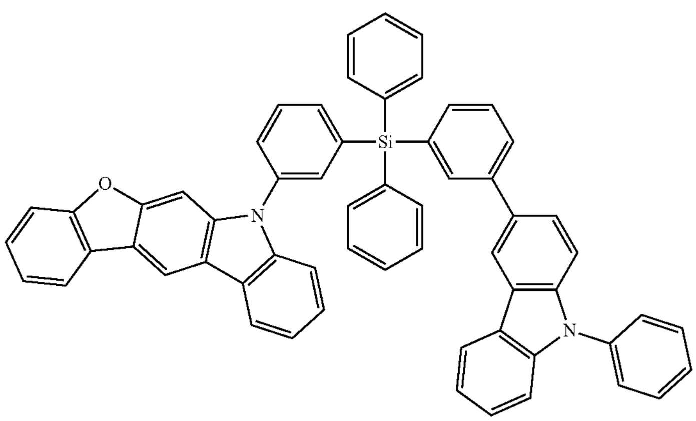
327
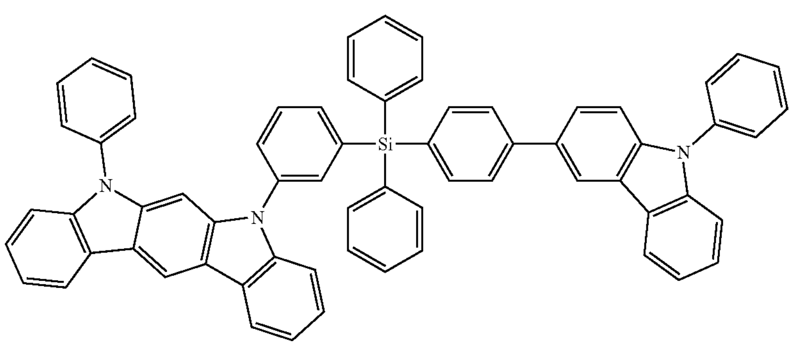

-continued
328
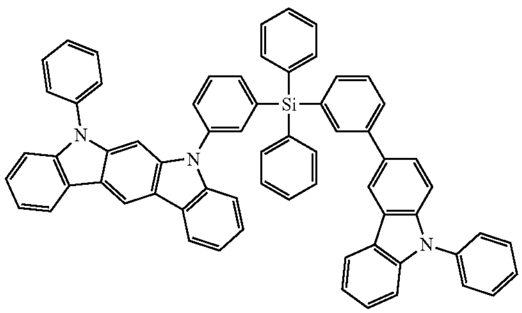
328
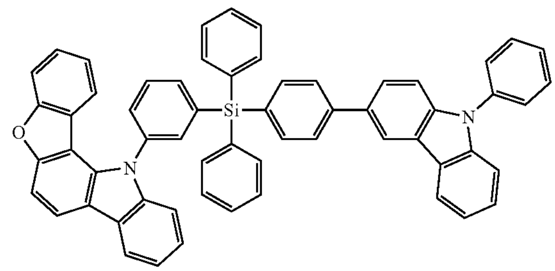
330
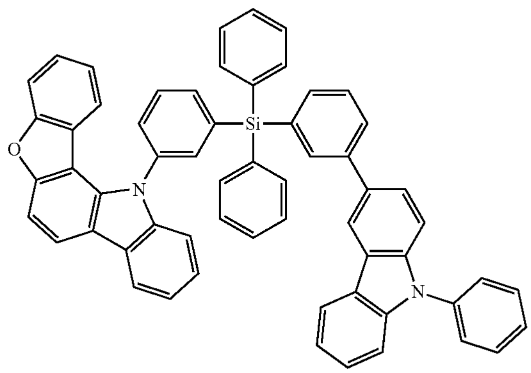
331
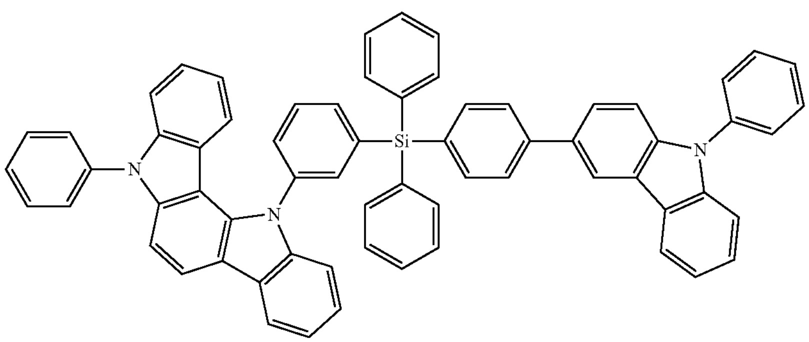
332
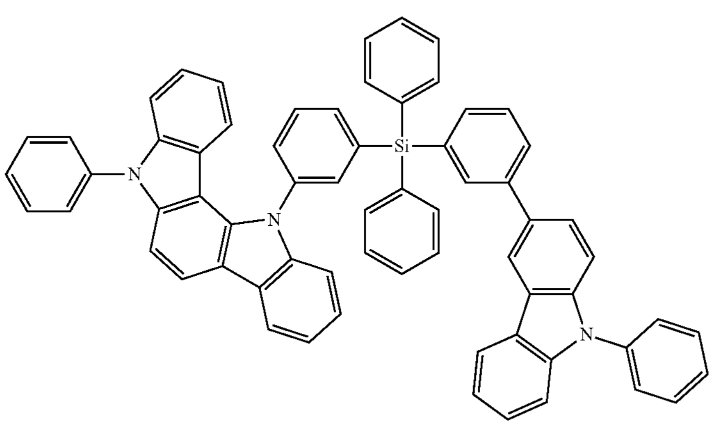

-continued
333
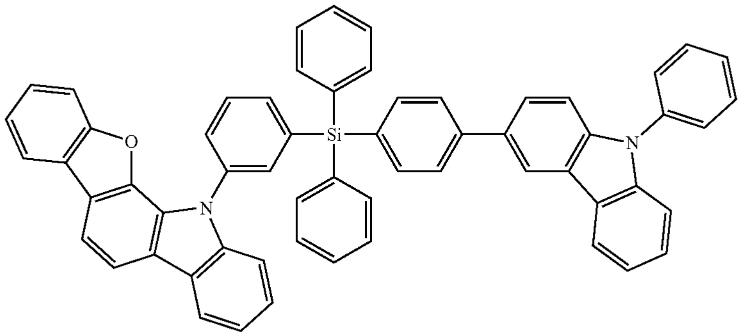
334
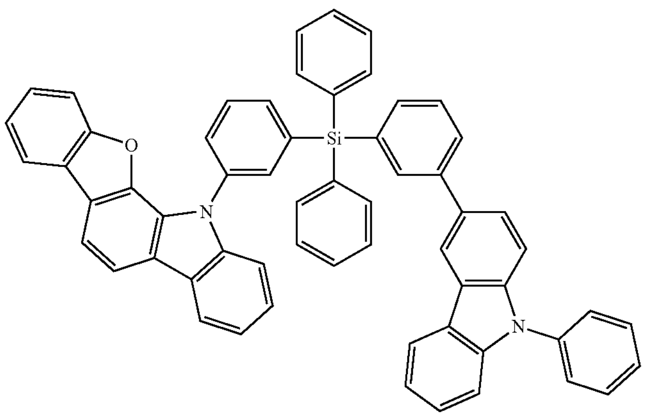
335
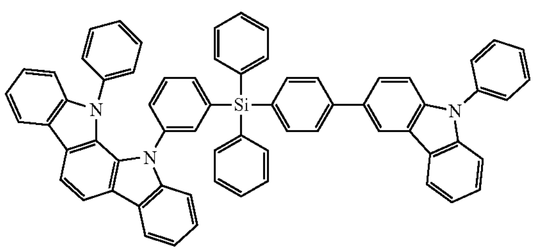
336
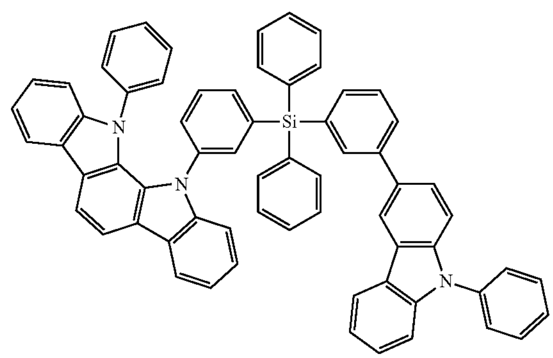
337
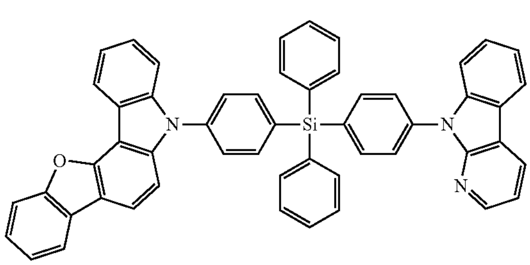
338
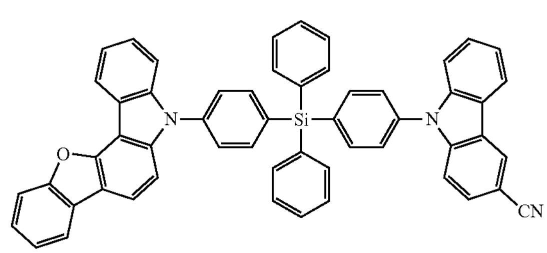

-continued
339
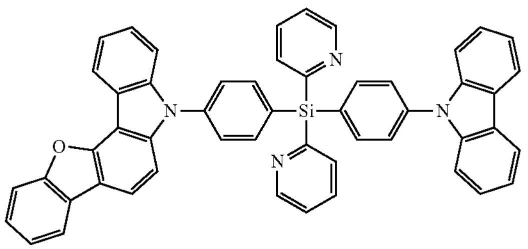
340
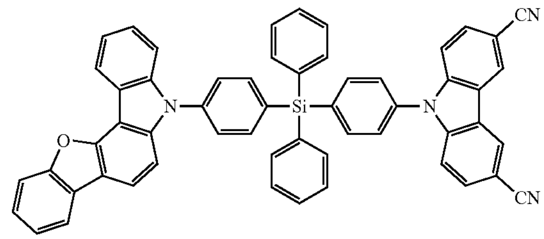
341
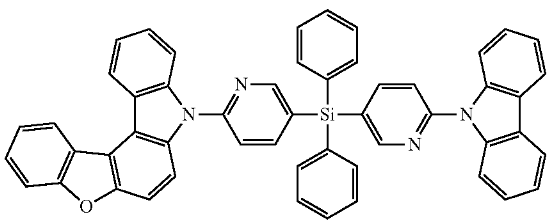
342
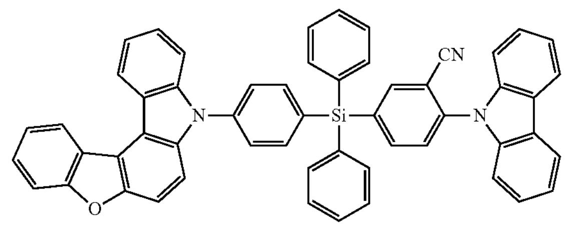
343
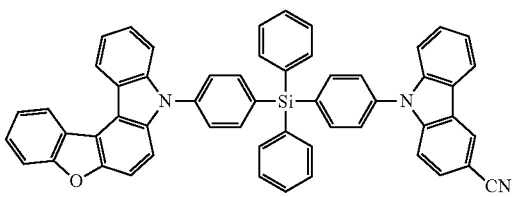
344
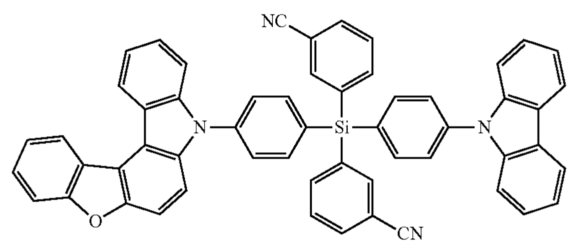
345
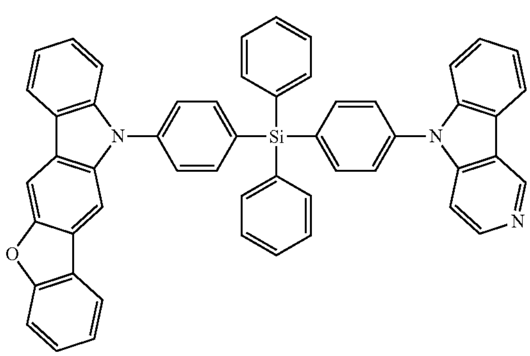
346
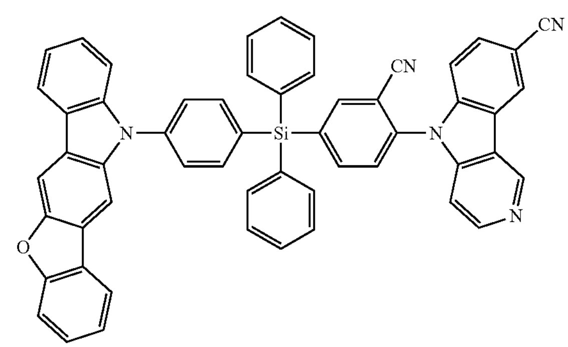
347
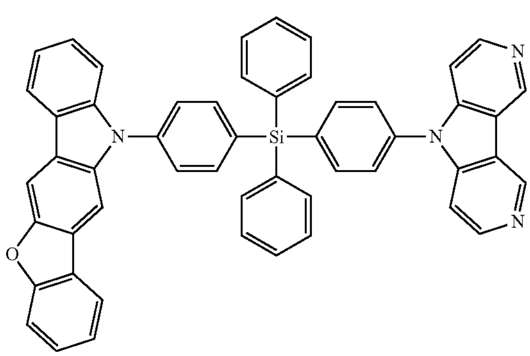
348
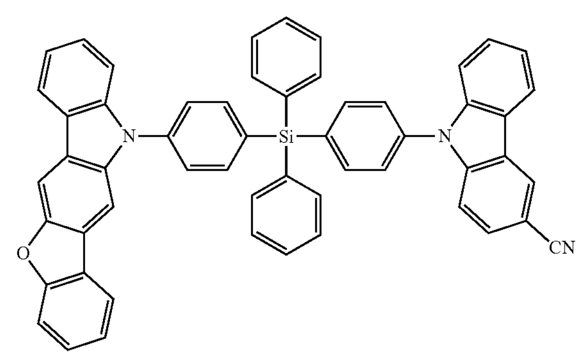

-continued
349
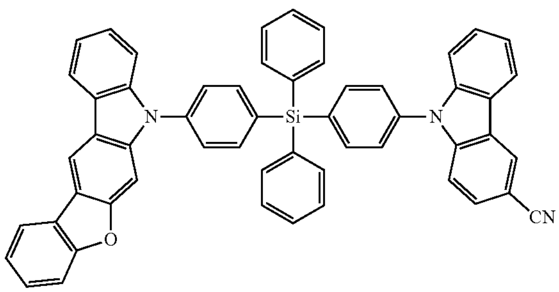
350
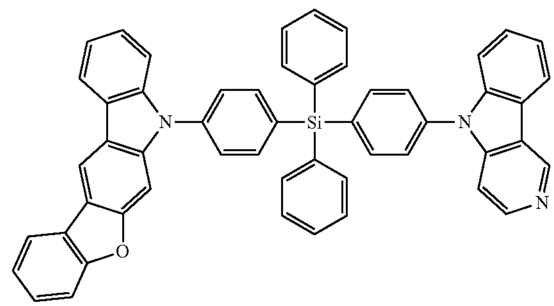
351
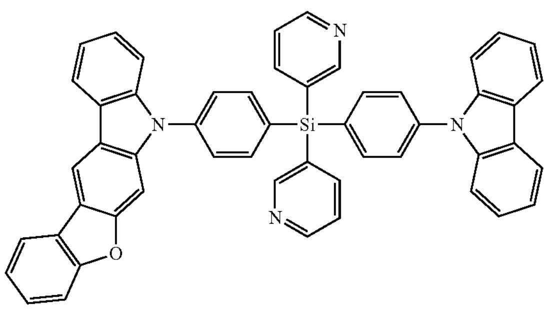
352
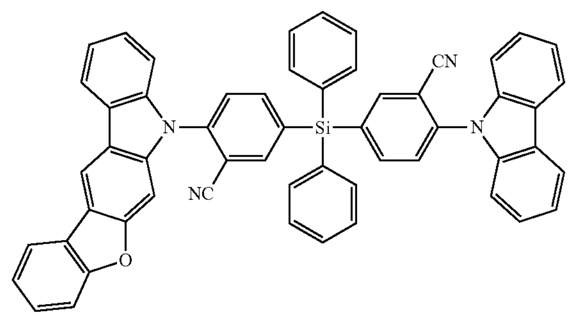
353
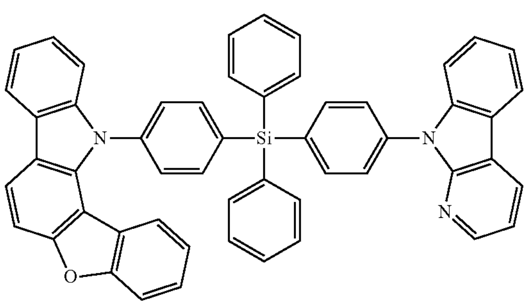
354
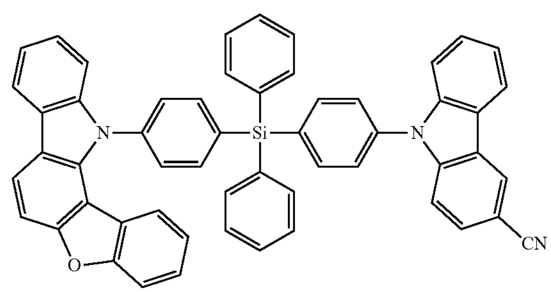
355
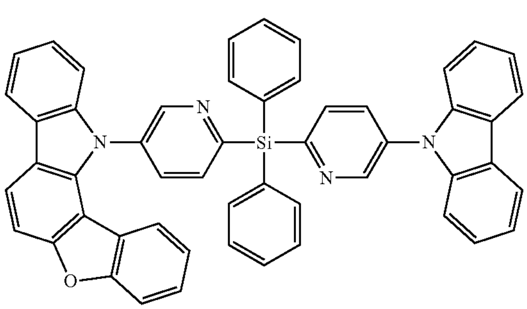
356
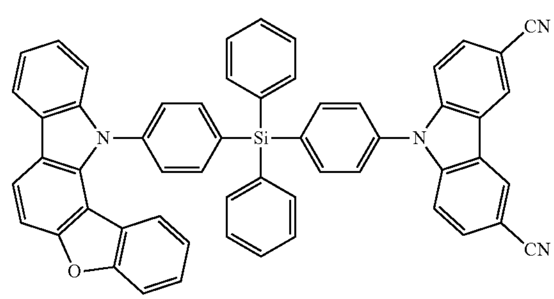

-continued
357
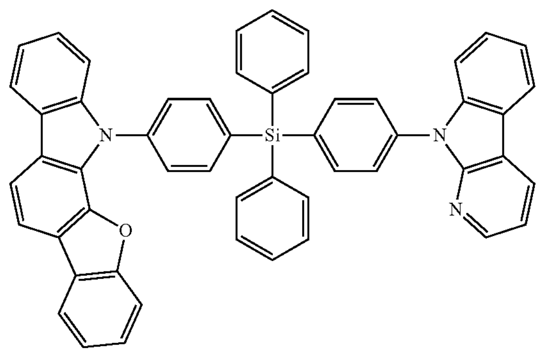
358
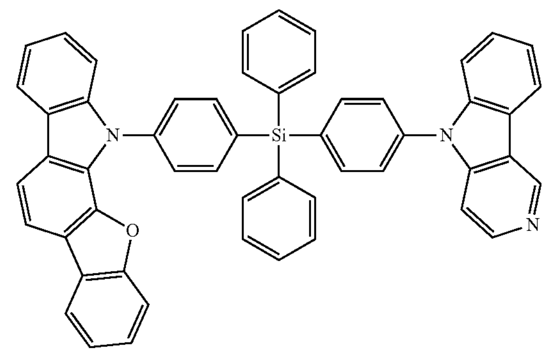
359
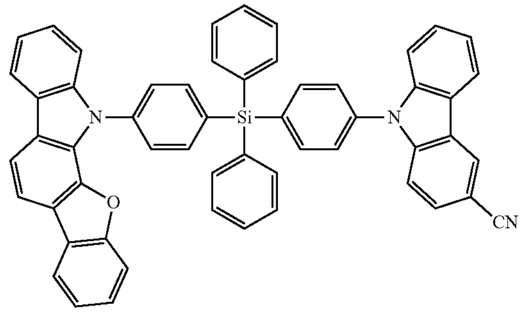
360
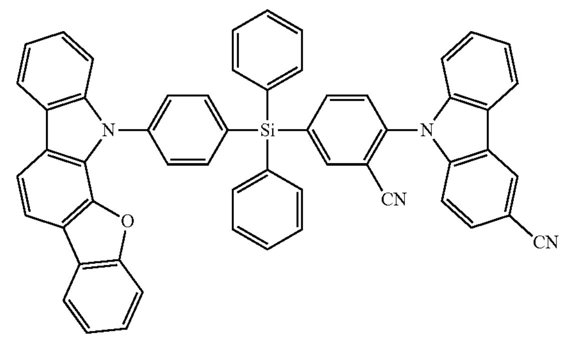
361
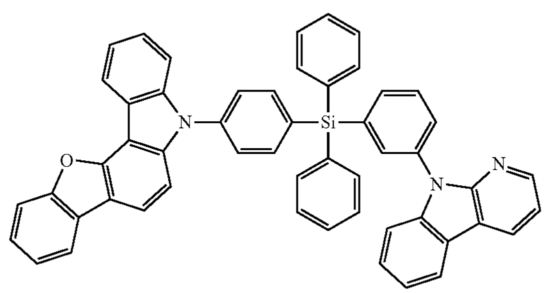
362
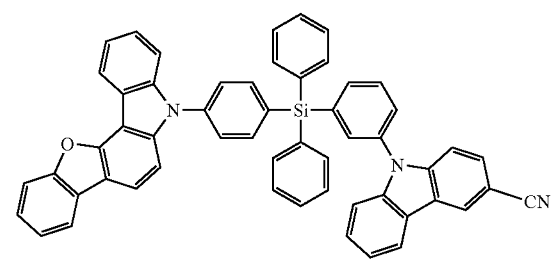
363
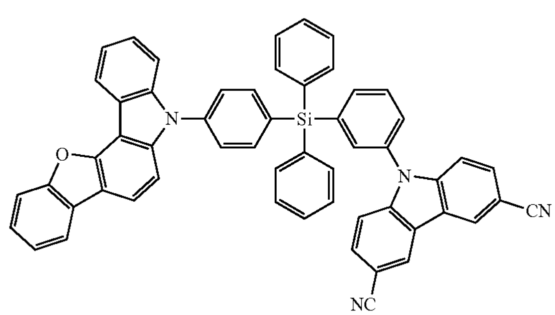
364
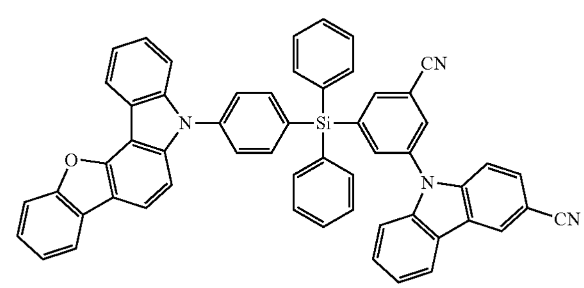

-continued
365
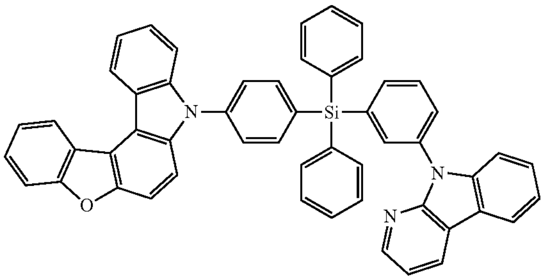
366
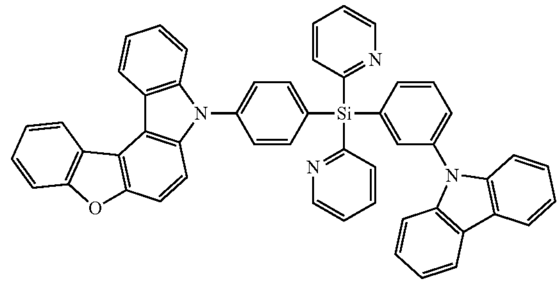
367
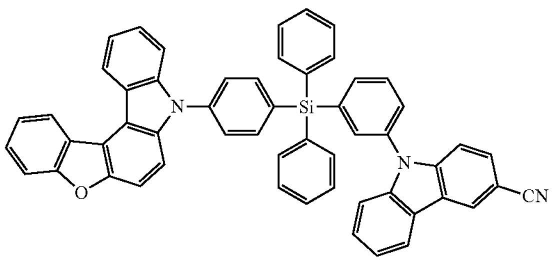
368
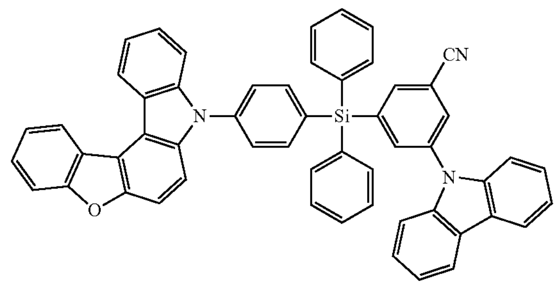
369
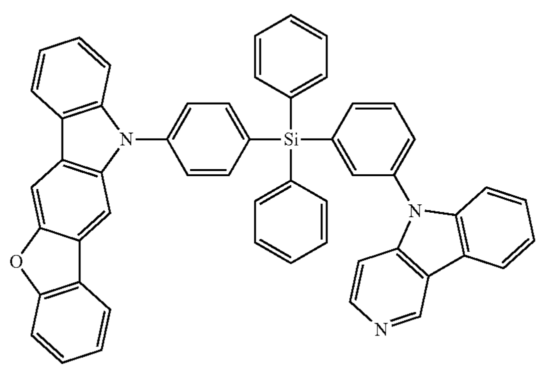
370
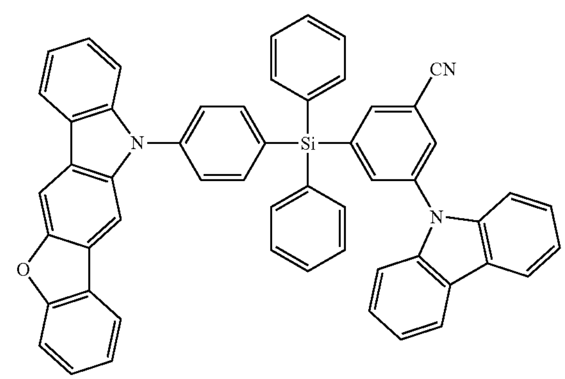
371
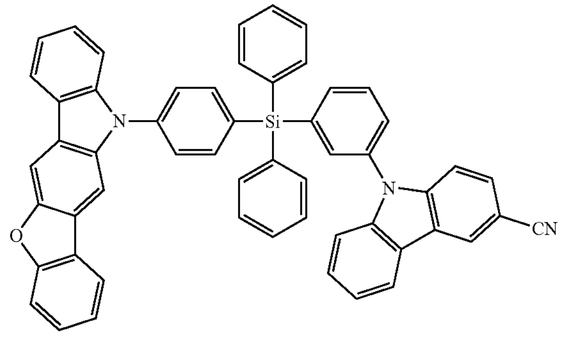
372
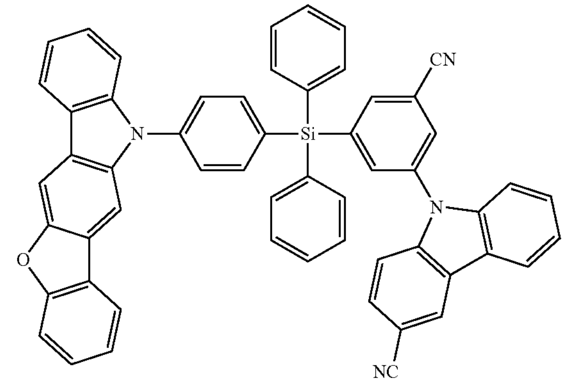

-continued
373
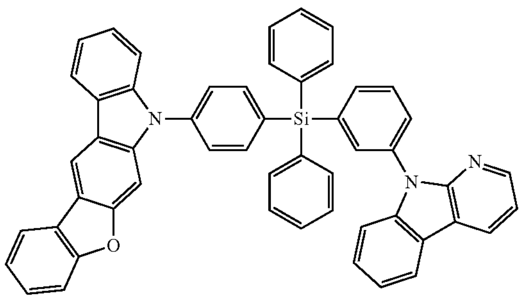
374
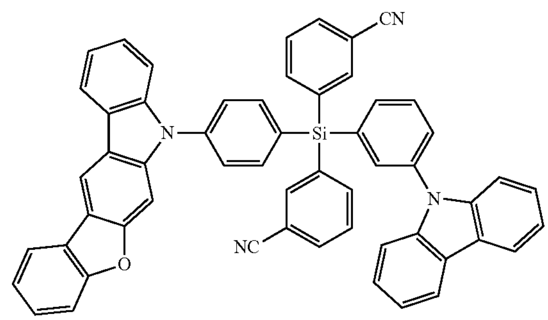
375
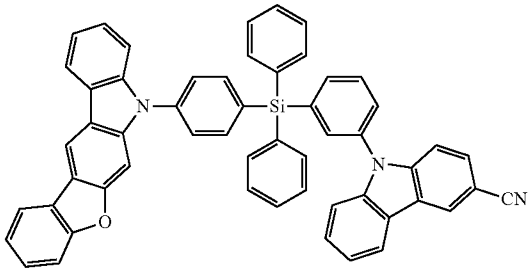
376
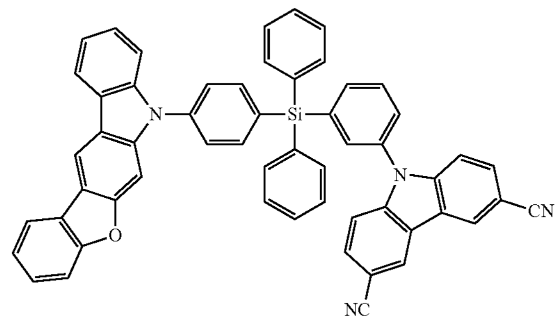
377
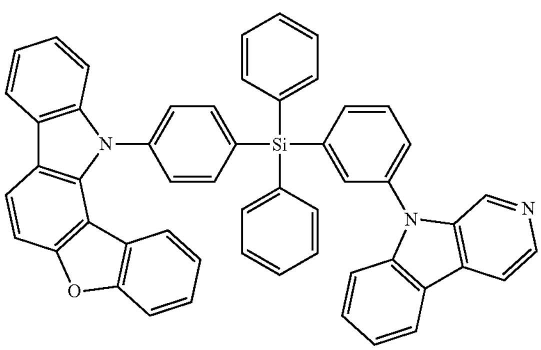
378
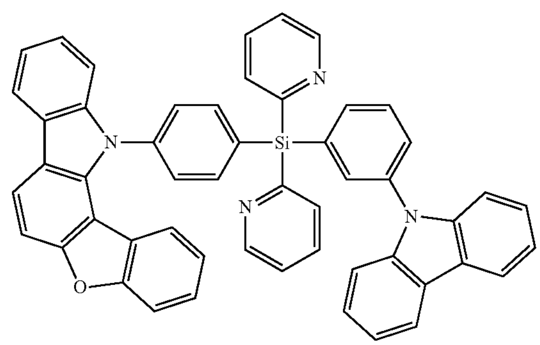
379
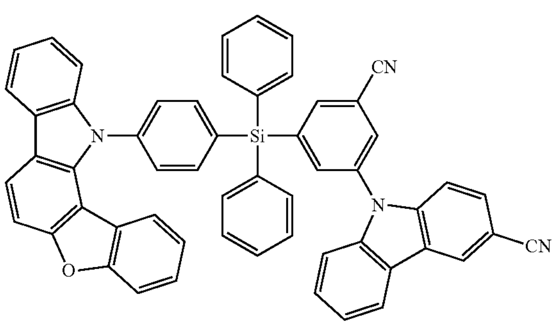
380
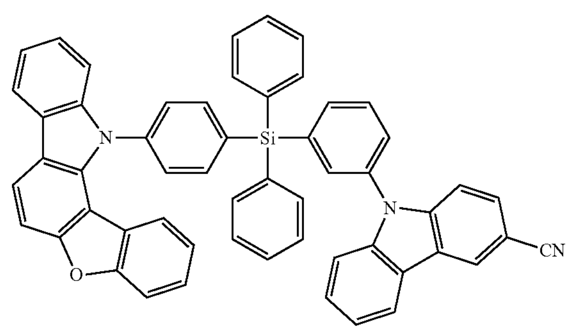

-continued
381
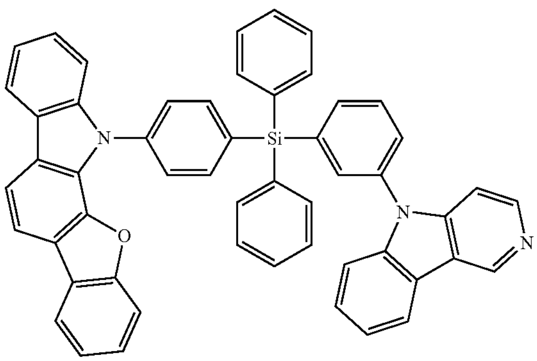
382
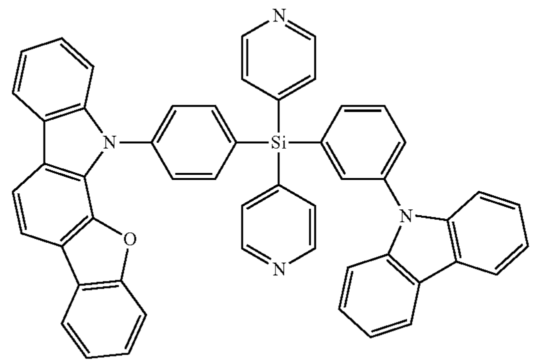
383
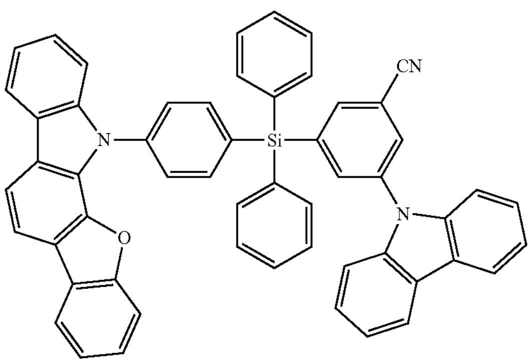
384
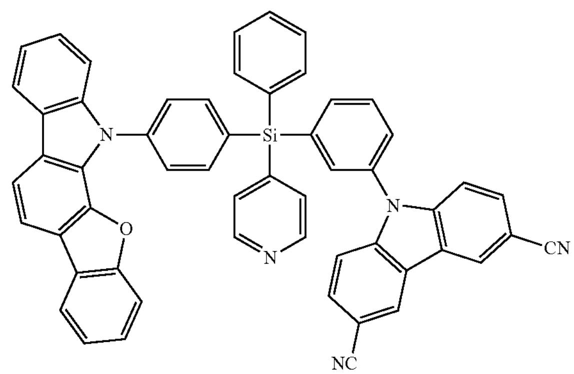
385
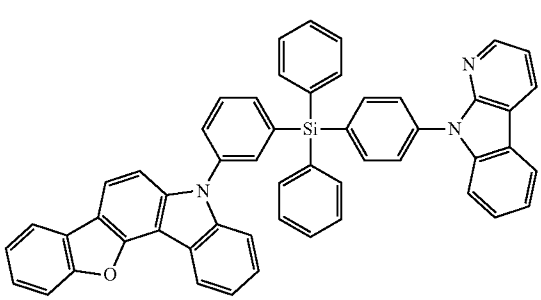
386
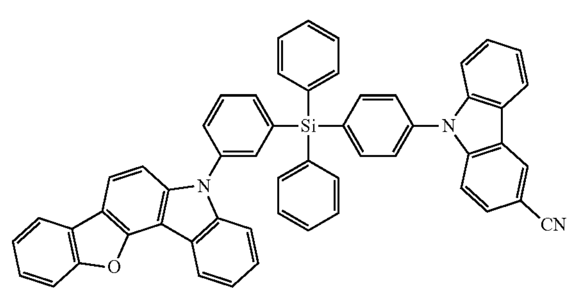
387
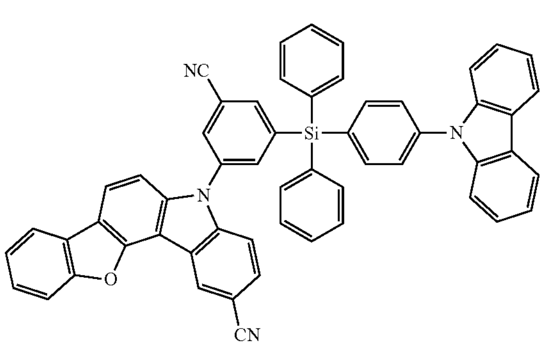
388
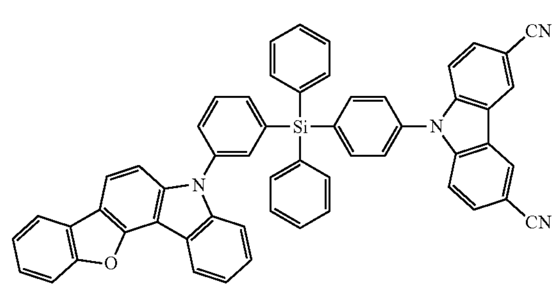

-continued
389
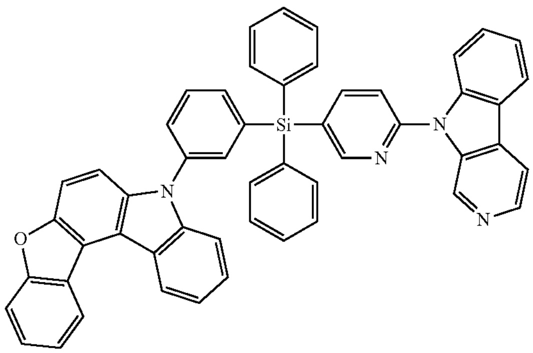
390
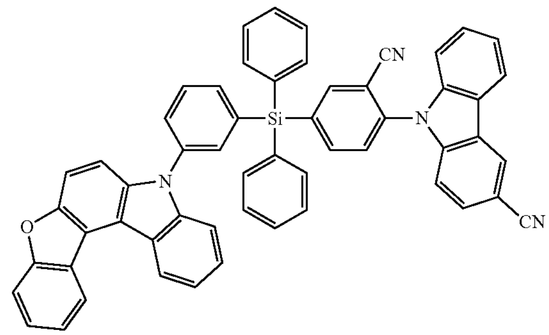
391
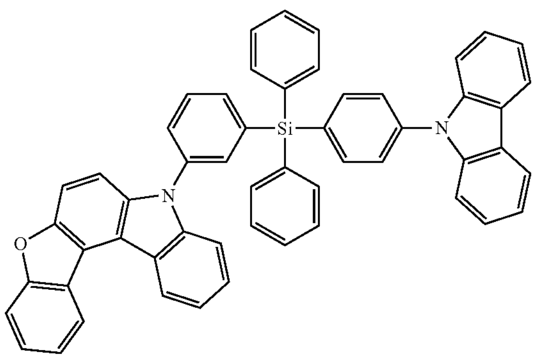
392
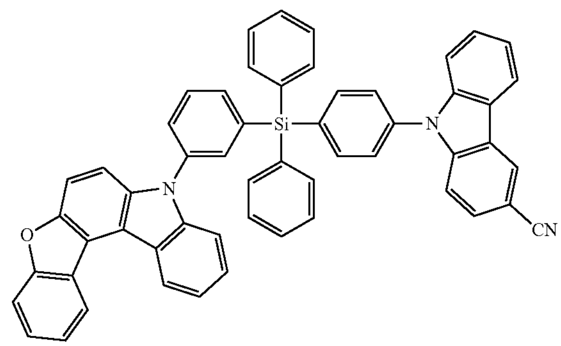
393
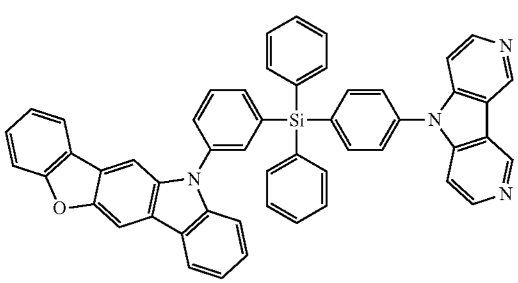
394
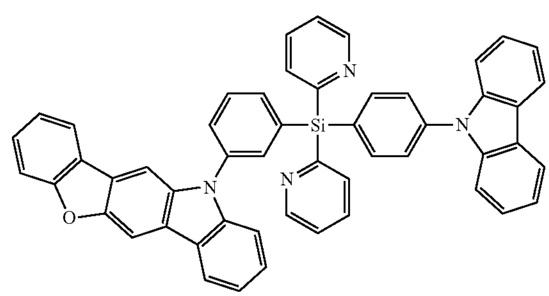
395
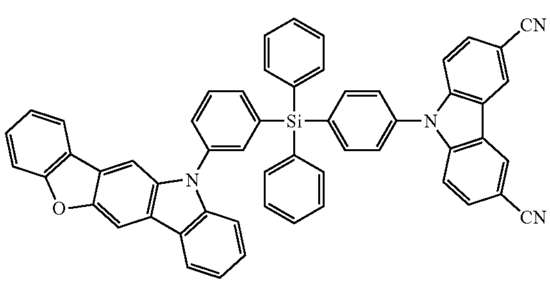
396
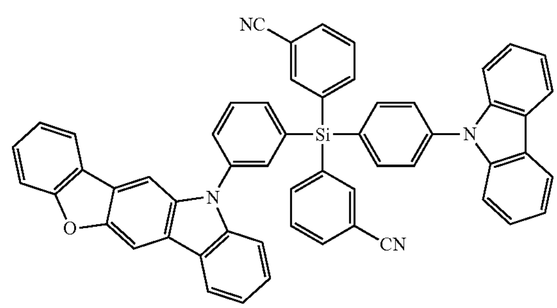

-continued
397
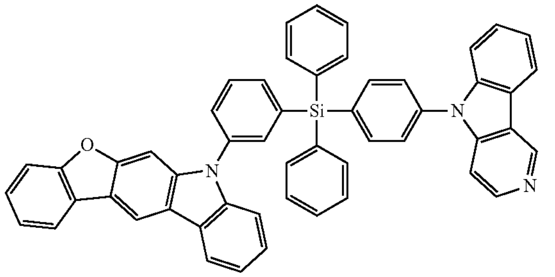
398
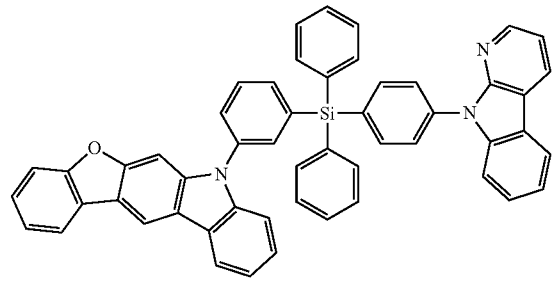
399
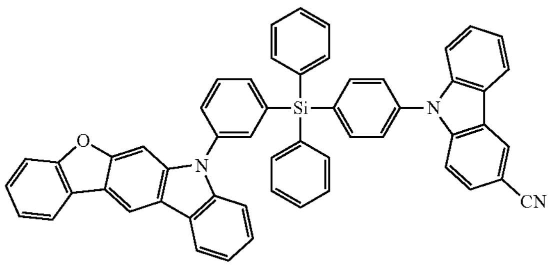
400
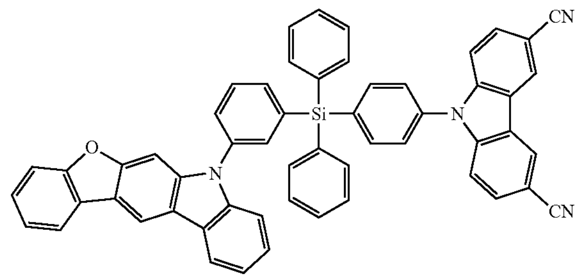
401
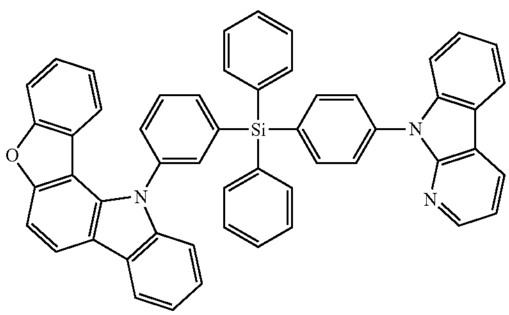
402
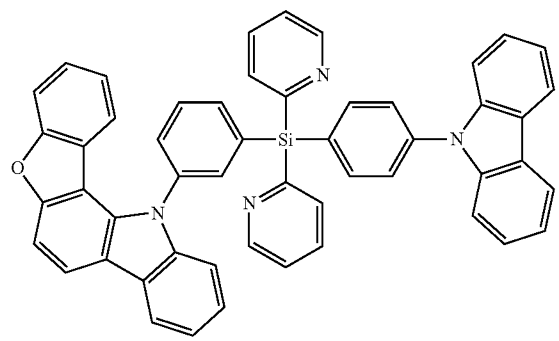
403
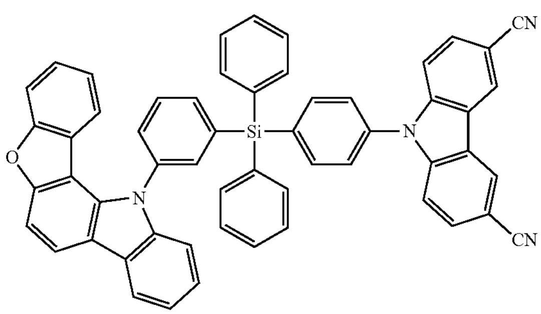
404
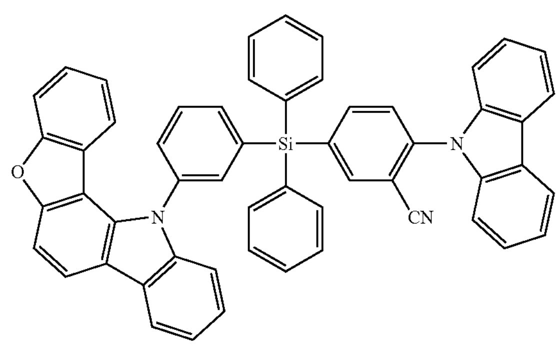
405
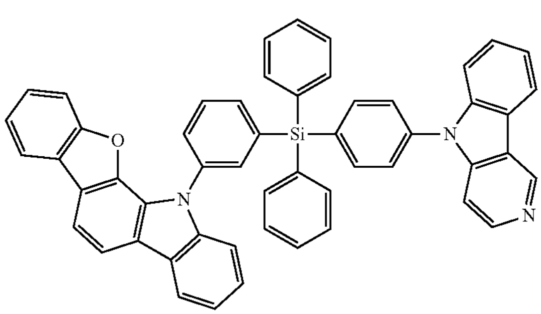
406
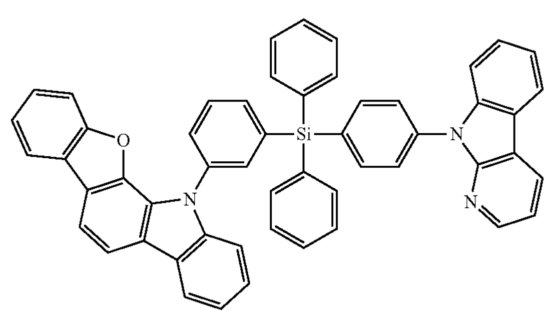

-continued
407
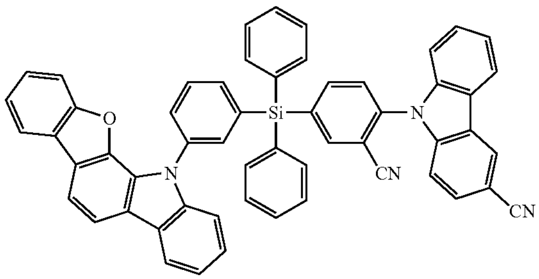
408
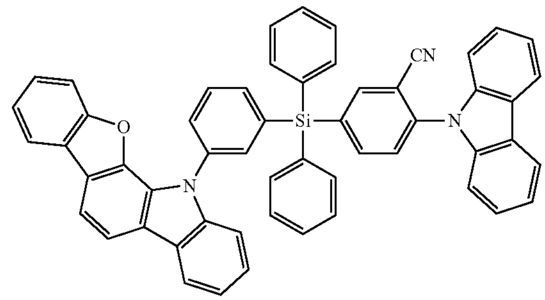
409
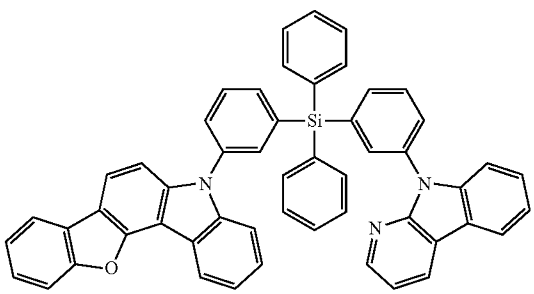
410
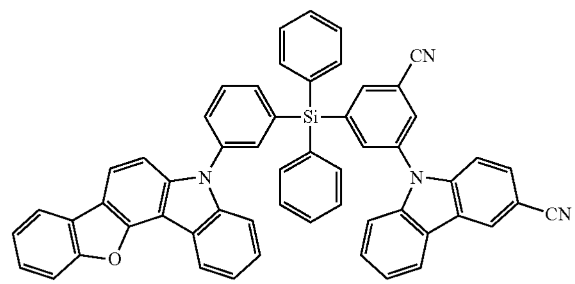
411
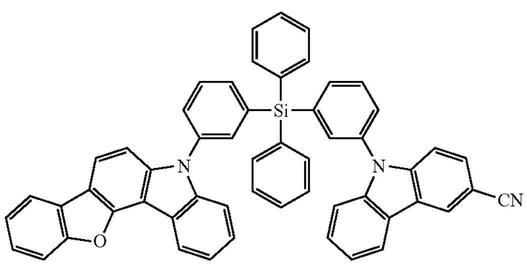
412
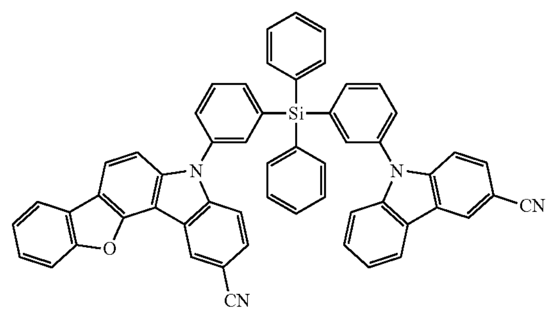
413
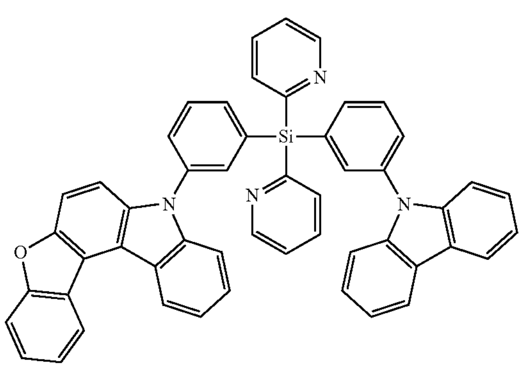
414
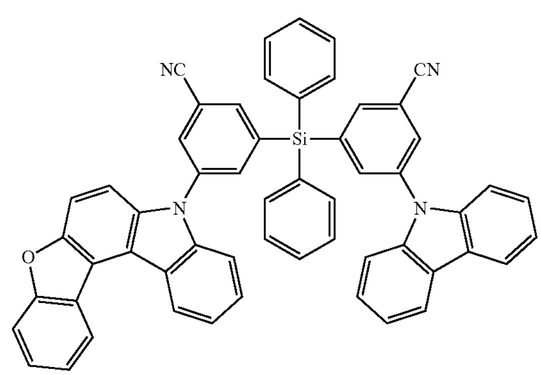

-continued
415
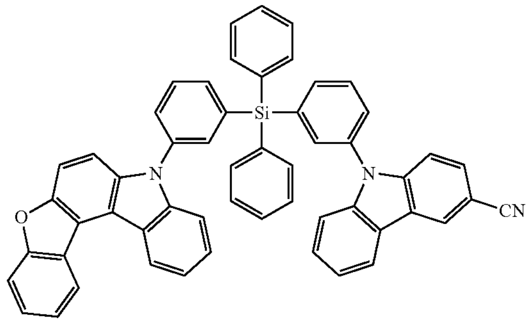
416
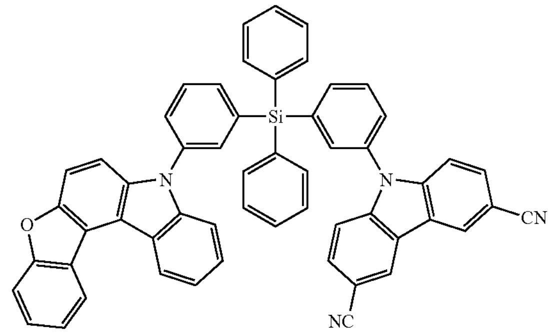
417
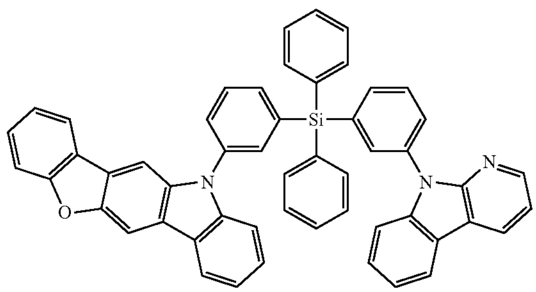
418
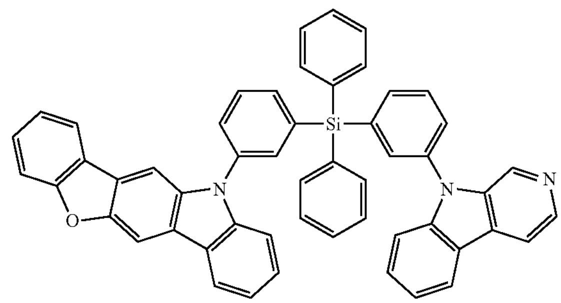
419
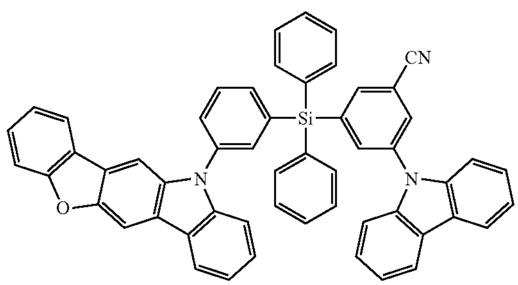
420
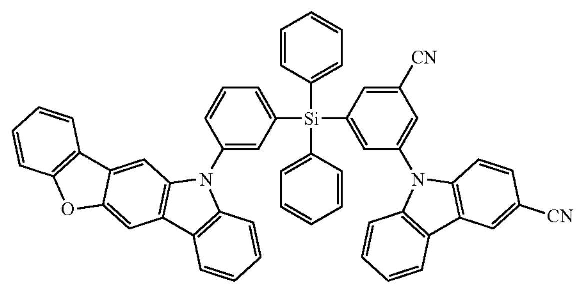
421
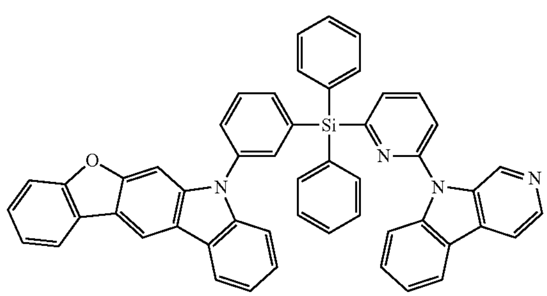
422
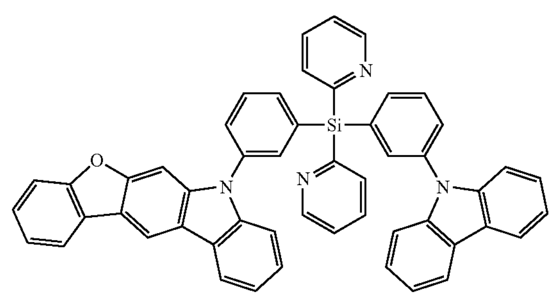
423
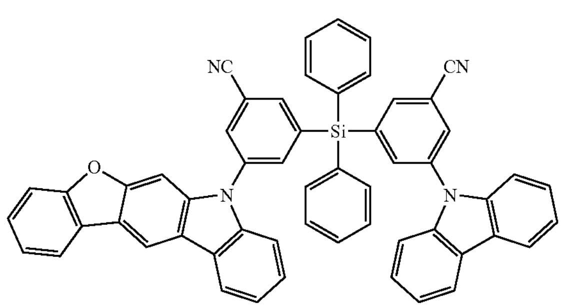
424
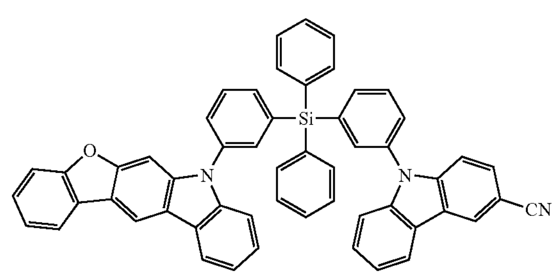

-continued

425

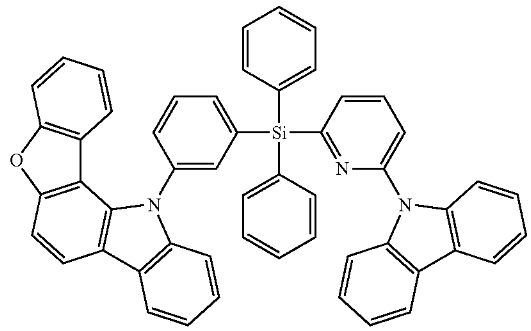

426

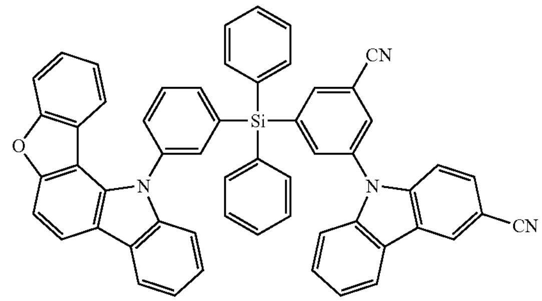

427

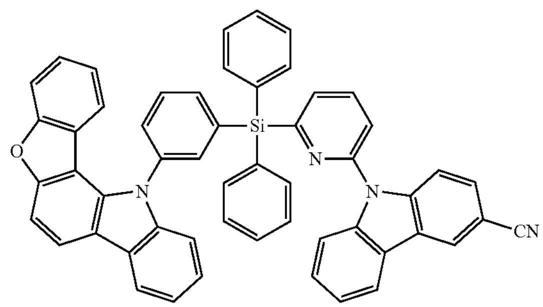

428

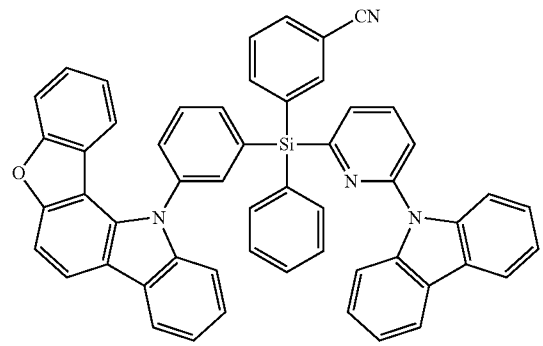

429

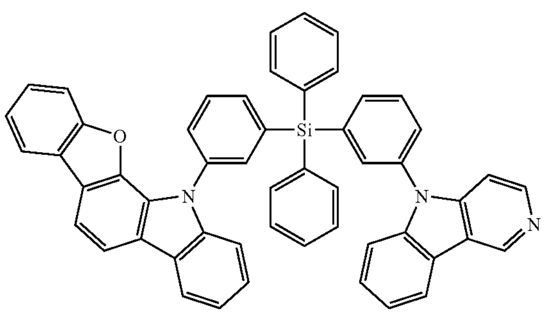

430

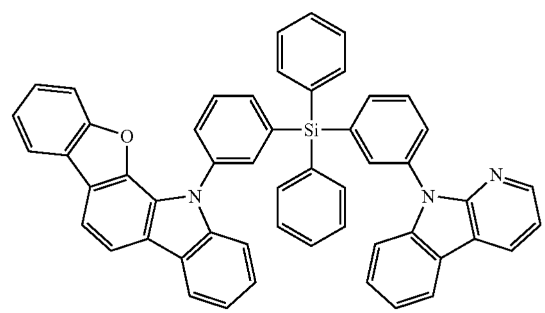

431

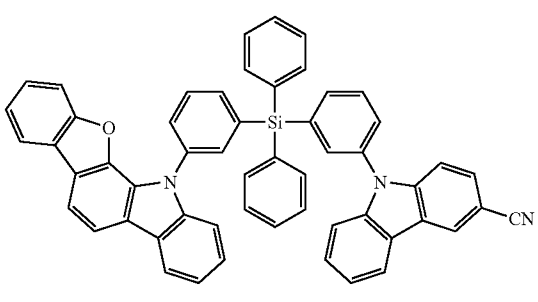

432

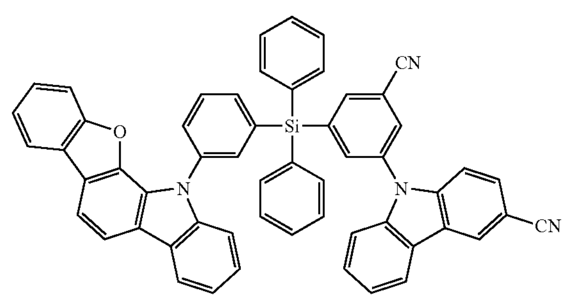

In Compounds 1 to 432, Ph may be a phenyl group.

When the host is a mixture of an electron transport host and a hole transport host, the weight ratio of the electron transport host to the hole transport host may be 1:9 to 9:1, for example, 2:8 to 8:2, for example, 4:6 to 6:4, for example, 5:5. When the weight ratio of the electron transport host and the hole transport host satisfies the above-described ranges, the hole-and-electron transport balance in the emission layer 15 may be made.

[Dopant in Emission Layer 15]

Since the dopant emits fluorescent light, organic light-emitting devices according to an embodiment of the present disclosure are clearly distinguished from organic light-emitting devices containing compounds that emit phosphorescent light.

A maximum emission wavelength of an emission spectrum of the dopant may be 400 nm or more and 550 nm or less. For example, the maximum emission wavelength of the emission spectrum of the dopant may be 400 nm or more and 495 nm or less, or 450 nm or more and 495 nm or less, but embodiments of the present disclosure are not limited thereto. In other words, the dopant may emit blue light.

The "maximum emission wavelength" refers to a wavelength at which the emission intensity is the greatest, and may also be referred to as "a peak emission wavelength".

In some embodiments, the dopant may be free of metal atoms.

In some embodiments, the dopant may be a condensed polycyclic compound or a styryl-based compound.

For example, the dopant may include one of a naphthalene-containing core, a fluorene-containing core, a spiro-bifluorene-containing core, a benzofluorene-containing core, a dibenzofluorene-containing core, a phenanthrene-containing core, an anthracene-containing core, a fluoranthene-containing core, a triphenylene-containing core, a pyrene-containing core, a chrysene-containing core, a naphthacene-containing core, a picene-containing core, a perylene-containing core, a pentaphene-containing core, an indenoanthracene-containing core, a tetracene-containing core, a bisanthracene-containing core, or a core represented by one of Formulae 501-1 to 501-18, but embodiments of the present disclosure are not limited thereto:

501-1

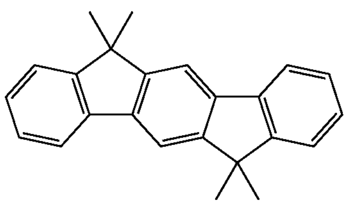

501-2

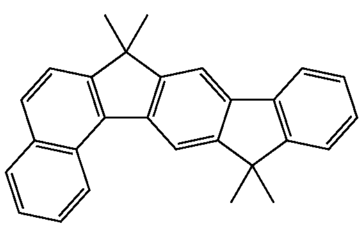

501-3

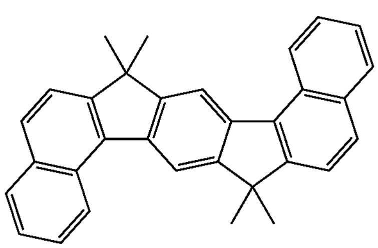

501-4

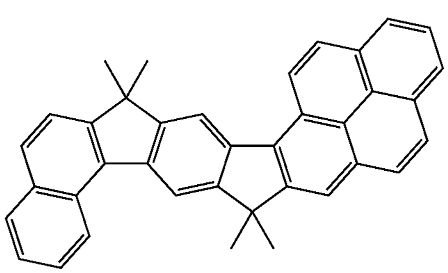

-continued 501-5

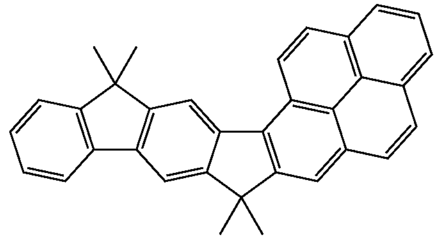

501-6

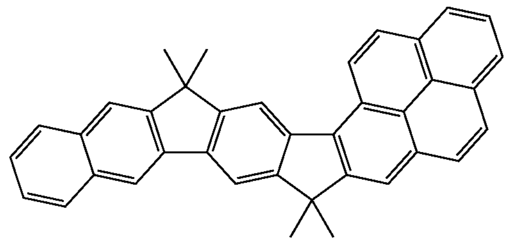

501-7

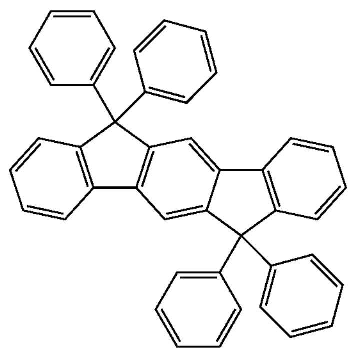

501-8

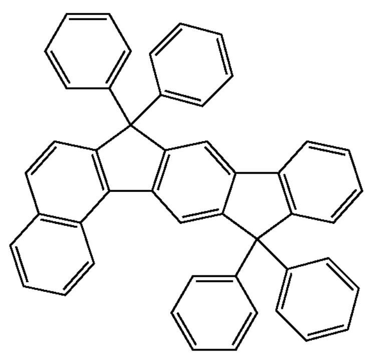

501-9

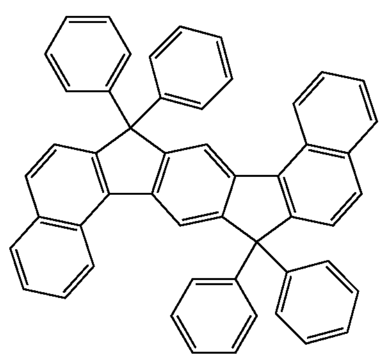

-continued 501-10

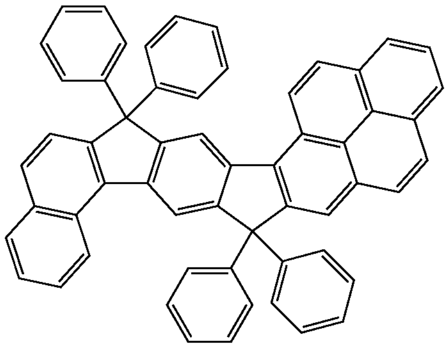

501-11

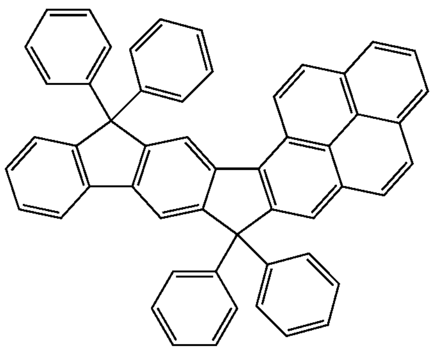

501-12

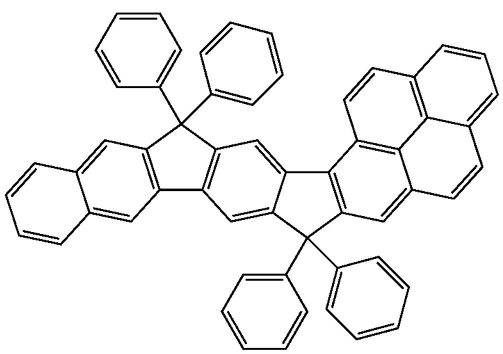

501-13

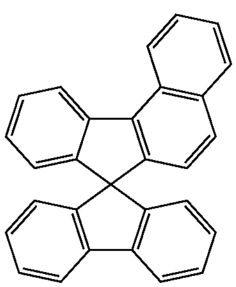

501-14

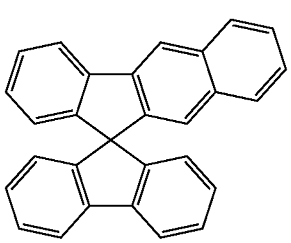

-continued 501-15

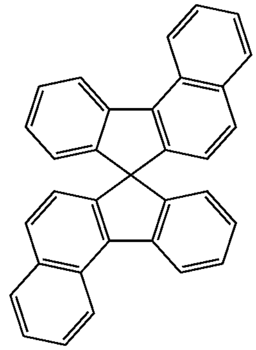

501-16

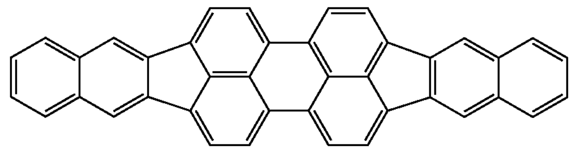

501-17

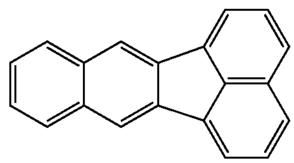

501-18

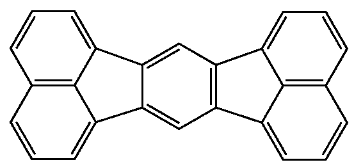

In one or more embodiments, the dopant may be a styryl-amine-based compound or a styryl-carbazole-based compound, but embodiments of the present disclosure are not limited thereto.

In one or more embodiments, the dopant may be a compound represented by one of Formula 501:

<Formula 501>

$$Ar_{501}\left[(L_{503})_{xd3}-N\begin{matrix}(L_{501})_{xd1}-R_{501}\\(L_{502})_{xd2}-R_{502}\end{matrix}\right]_{xd4}.$$

In Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene indenoanthracene group, a tetracene group, a bisanthracene group, or a group represented by Formulae 501-1 to 501-18, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group —Si($Q_{501}$)($Q_{502}$)($Q_{503}$) (wherein $Q_{501}$ to $Q_{503}$ are each independently hydrogen, $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group), or any combination thereof, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ to $R_{508}$ may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, xd1 to xd3 may each independently be 0, 1, 2, or 3, and xd4 may be 0, 1, 2, 3, 4, 5, or 6.

For example, in Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formula 501-1 to 501-18, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, —Si($Q_{501}$)($Q_{502}$)($Q_{503}$) ($Q_{501}$ to $Q_{503}$ may each independently be hydrogen, $C_1$-$C_{20}$ alkyl group, a $C_1$-$C_{20}$ alkoxy group, a phenyl group, a biphenyl group, a terphenyl group, a naphthyl group), or any combination thereof, $L_{501}$ to $L_{503}$ are the same as described in connection with $L_{21}$, xd1 to xd3 may each independently be 0, 1, or 2, and xd4 may be 0, 1, 2, or 3, but embodiments of the present disclosure are not limited thereto.

In one or more embodiments, the dopant may include a compound represented by one of Formulae 502-1 to 502-5:

<Formula 502-1>

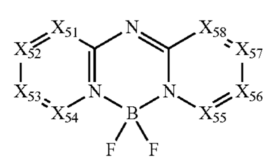

-continued

<Formula 502-2>

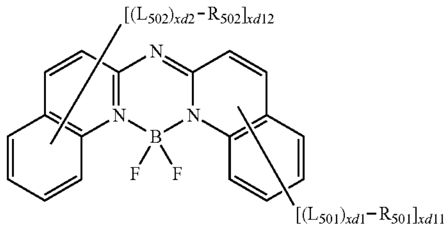

<Formula 502-3>

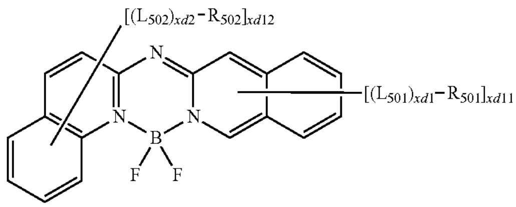

<Formula 502-4>

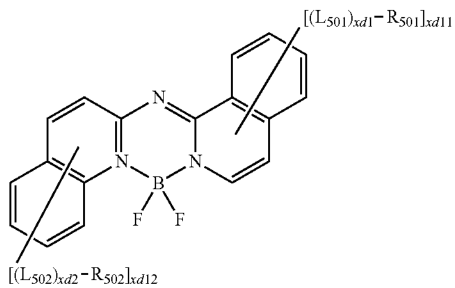

<Formula 502-5>

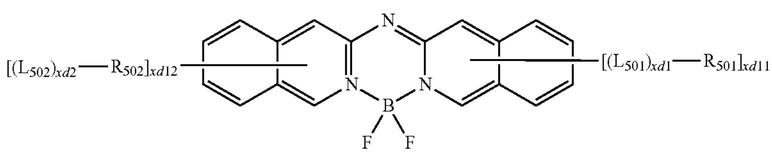

In Formulae 502-1 to 502-5, $X_{51}$ may be N or C-[$(L_{501})_{xd1}$-$R_{501}$], $X_{52}$ may be N or C-[$(L_{502})_{xd2}$-$R_{502}$], $X_{53}$ may be N or C-[$(L_{503})_{xd3}$-$R_{503}$], $X_{54}$ may be N or C-[$(L_{504})_{xd4}$-$R_{504}$], $X_{55}$ may be N or C-[$(L_{505})_{xd5}$-$R_{505}$], $X_{56}$ may be N or C-[$(L_{506})_{xd6}$-$R_{506}$], $X_{57}$ may be N or C-[$(L_{507})_{xd7}$-$R_{507}$], and $X_{58}$ may be N or C-[$(L_{508})_{xd8}$-$R_{508}$], $L_{501}$ to $L_{508}$ are each the same as described in connection with $L_{501}$ in Formula 501, xd1 to xd8 are each the same as described in connection with xd1 in Formula 501, $R_{501}$ to $R_{508}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, xd11 and xd12 may each independently be an integer from 0 to 5, two of $R_{501}$ to $R_{504}$ may optionally be linked together to form a saturated or unsaturated ring, and two of $R_{505}$ to $R_{508}$ may optionally be linked together to form a saturated or unsaturated ring.

In one or more embodiments, the dopant may include a compound represented by Formula 503:

<Formula 503>

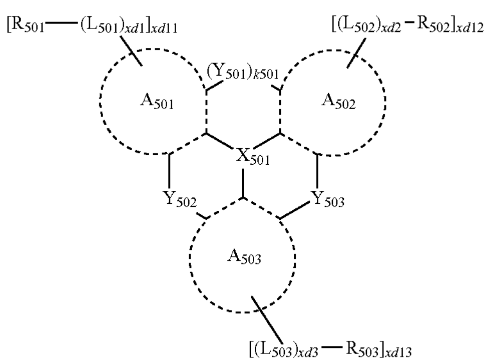

In Formula 503, $X_{501}$ may be N, B, P(═)($R_{504}$), or P(═S)($R_{504}$), $Y_{501}$ to $Y_{502}$ may each independently be O, S, N($R_{505}$), B($R_{505}$), C($R_{505}$)($R_{506}$), or Si($R_{505}$)($R_{506}$), k501 may be 0 or 1, wherein, when k501 is 0, —$(Y_{501})_{k501}$— may not exist, $A_{501}$ to $A_{503}$ may each independently be a $C_5$-$C_{30}$ carbocyclic group or a $C_1$-$C_{30}$ heterocyclic group, $L_{501}$ to $L_{503}$ are the same as described in connection with $L_{501}$ in Formula 501, xd1 to xd are the same as described in connection with xd1 in Formula 501, $R_{501}$ to $R_{506}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), wherein $R_{501}$ to $R_{506}$ may optionally be linked to each other to form a substituted or unsubstituted $C_5$-$C_{30}$ carbocyclic group or a substituted or unsubstituted $C_1$-$C_{30}$ heterocyclic group, xd11 and xd12 may each independently be an integer from 0 to 5, and $Q_1$ to $Q_3$, $Q_{21}$ to $Q_{23}$, and $Q_{31}$ to $Q_{33}$ may each be independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, or a terphenyl group.

The dopant may include at least one compound, for example, of the following Compounds FD(1) to FD(16) and FD1 to FD24:

FD(1)

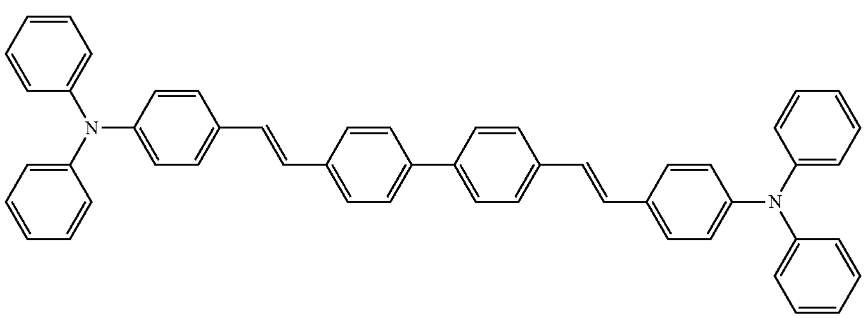

FD(2)

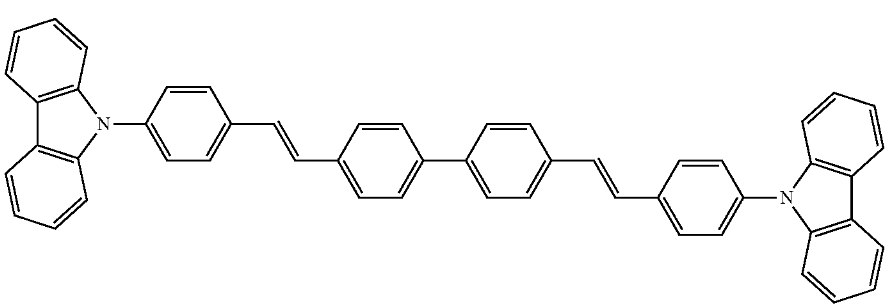

-continued
FD(3)
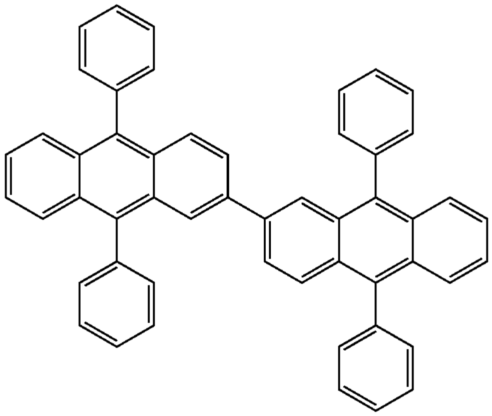
FD(4)
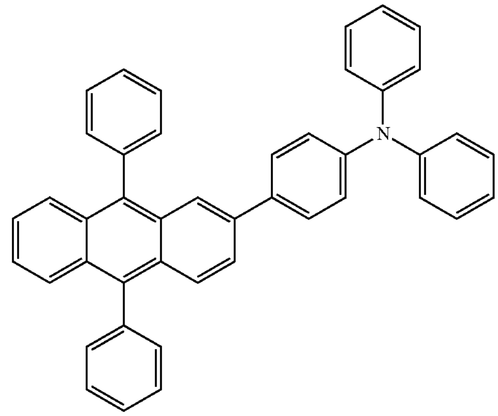
FD(5)
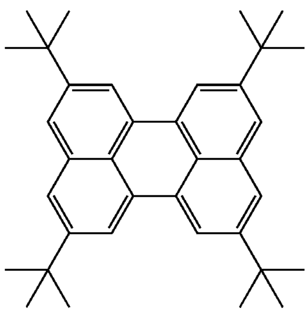
FD(6)
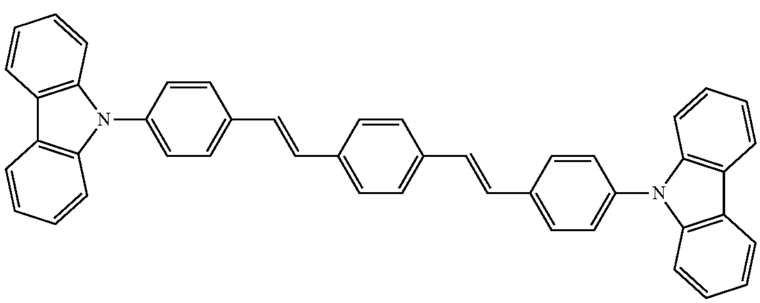
FD(7)
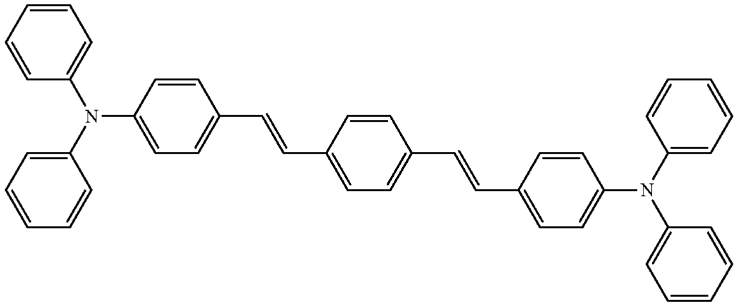

-continued
FD(8)
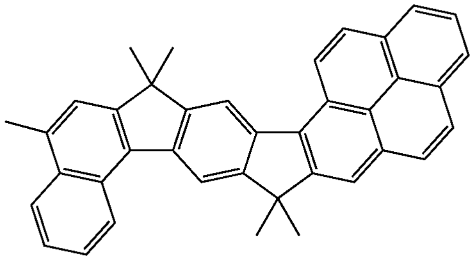
FD(9)
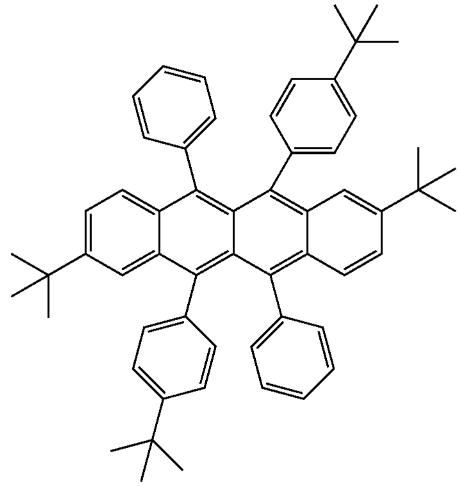
FD(10)
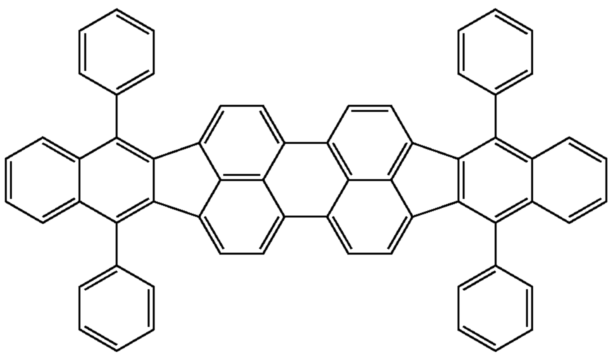
FD(11)
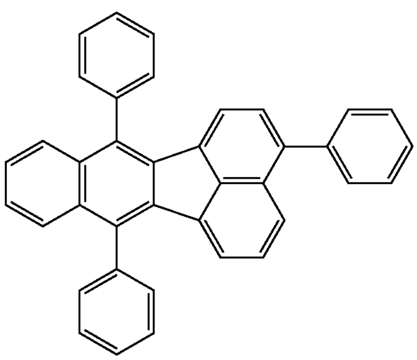
FD(12)
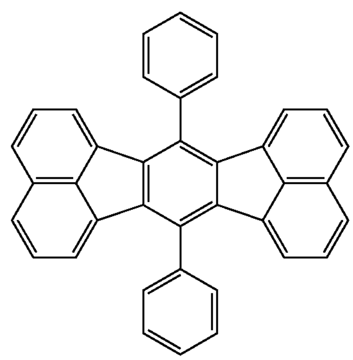
FD(13)
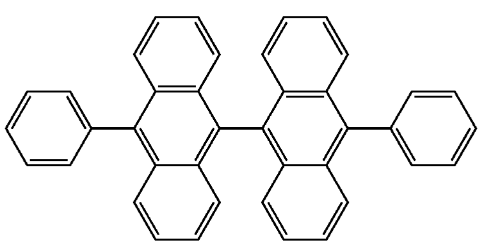

-continued
FD(14)
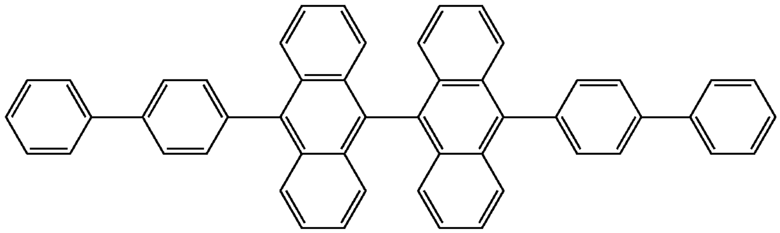
FD(15)
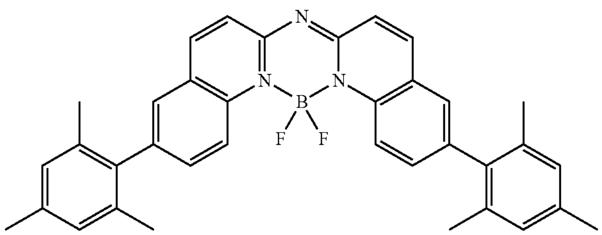
FD(16)
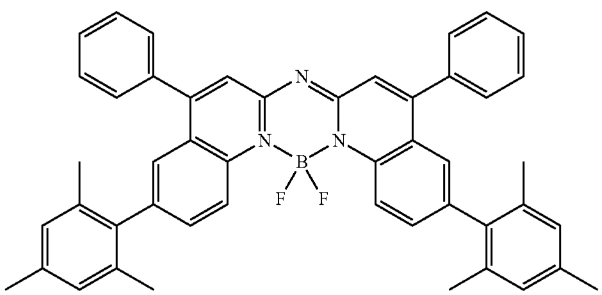
FD1
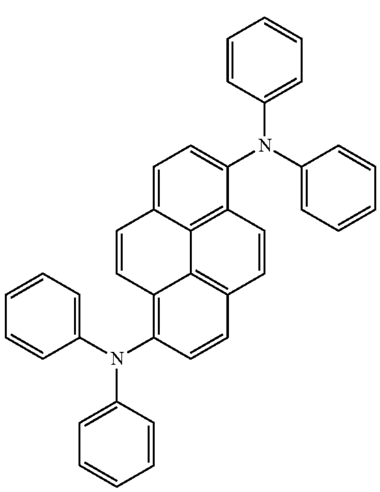
FD2
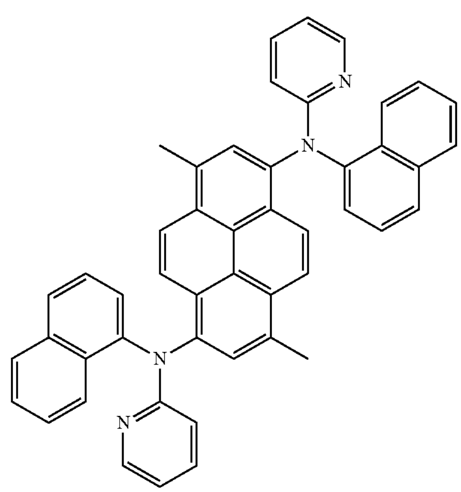

-continued
FD3
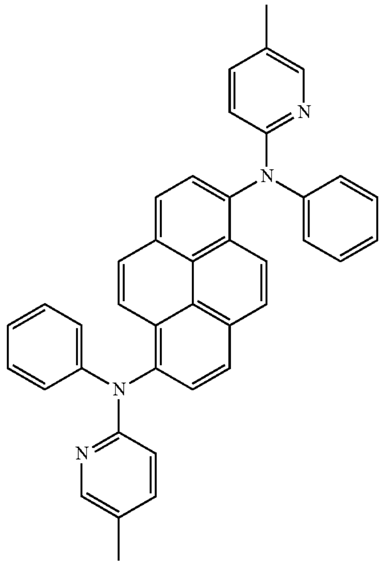
FD4
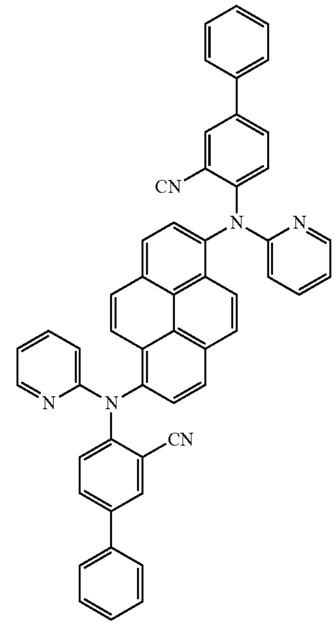
FD5
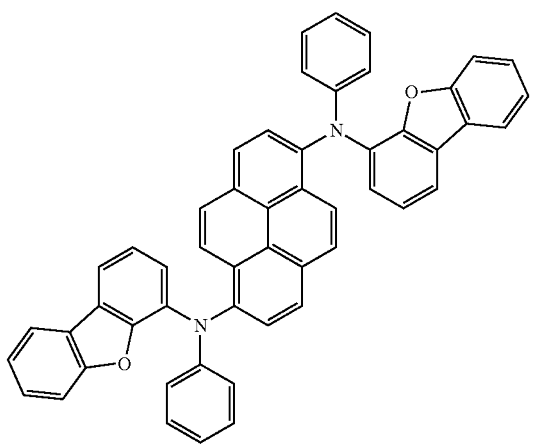
FD6
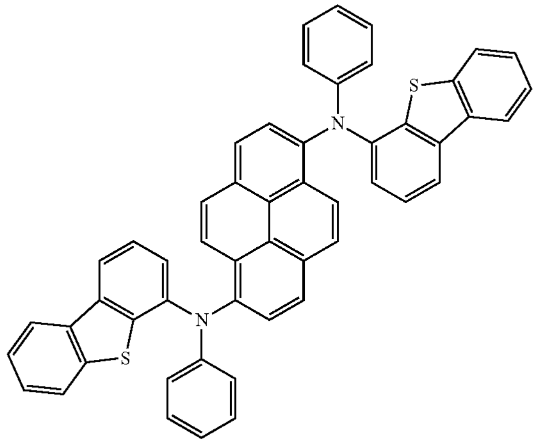

-continued
FD7
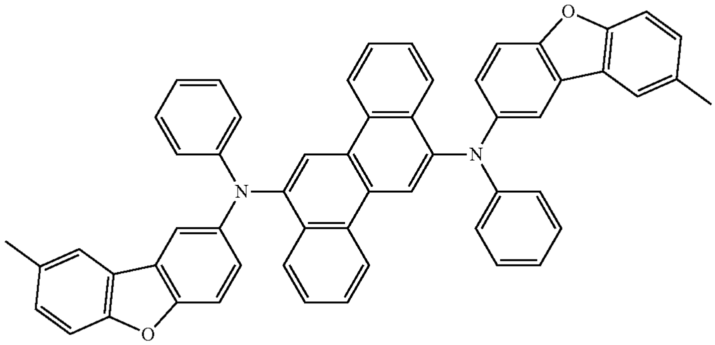
FD8
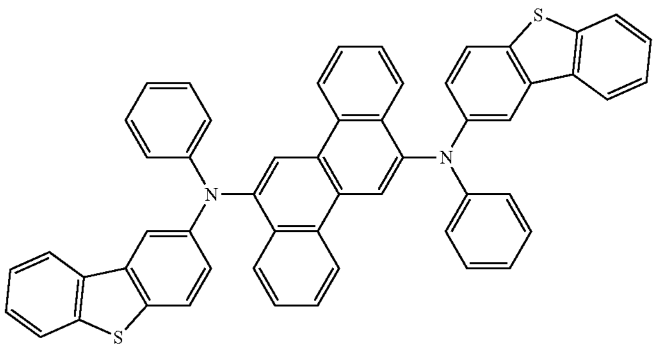
FD9
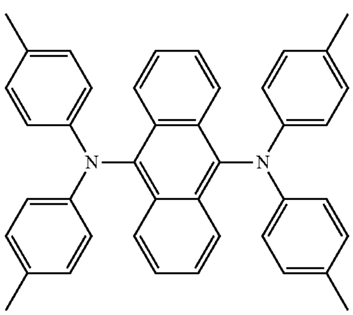
FD10
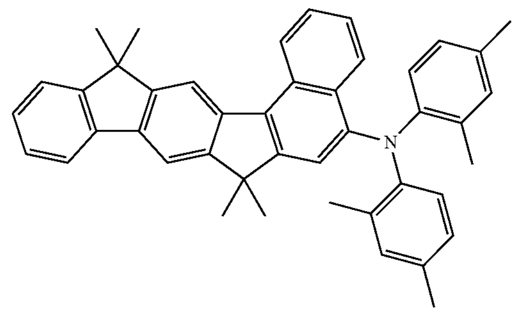
FD11
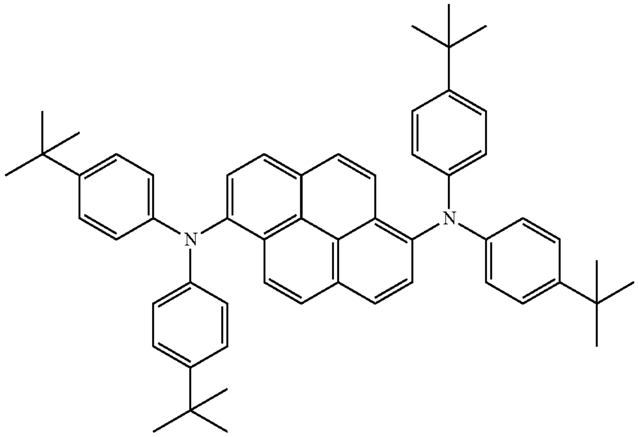

-continued
FD12
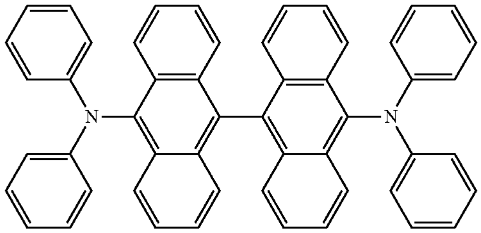
FD13
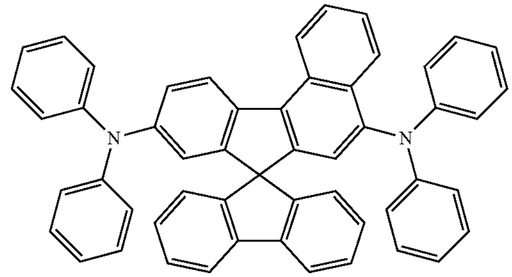
FD14
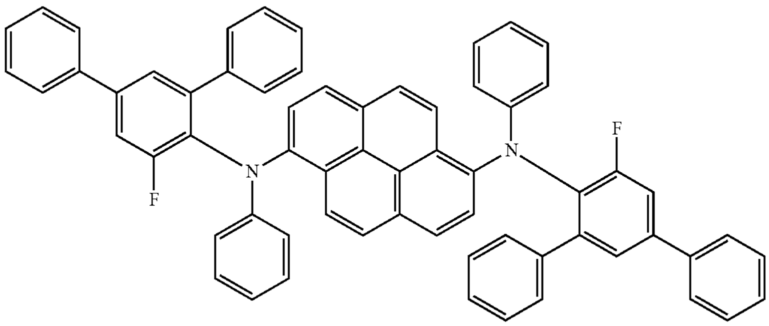
FD15
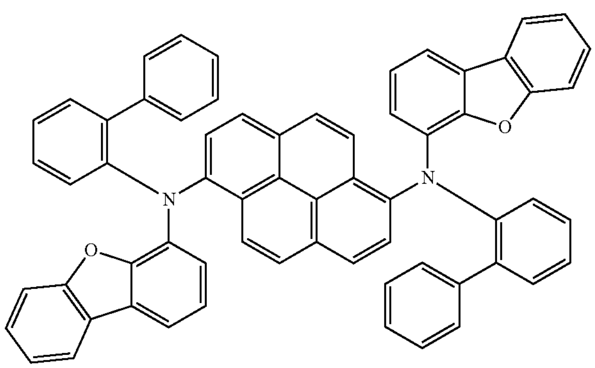
FD16
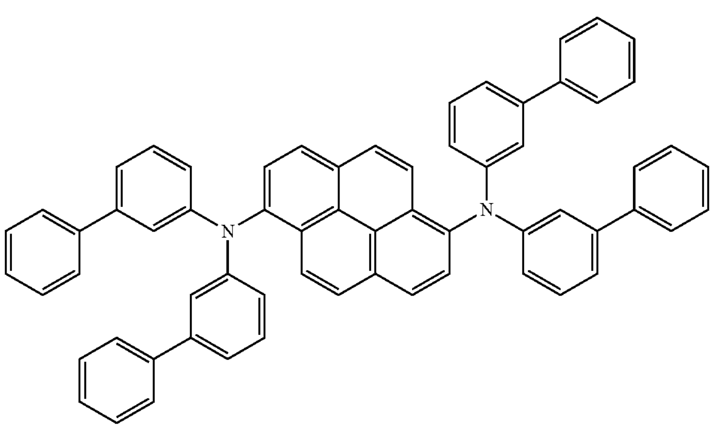

-continued
FD17
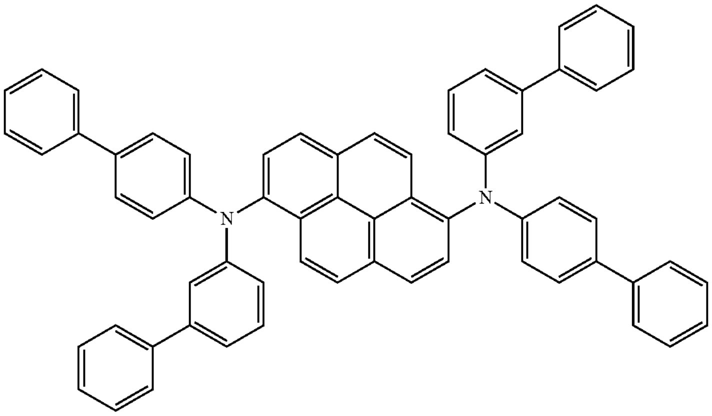
FD18
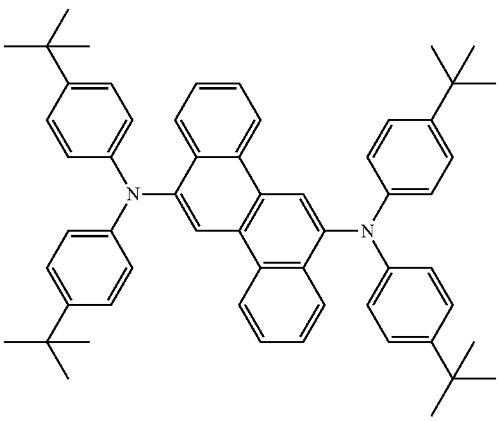
FD19
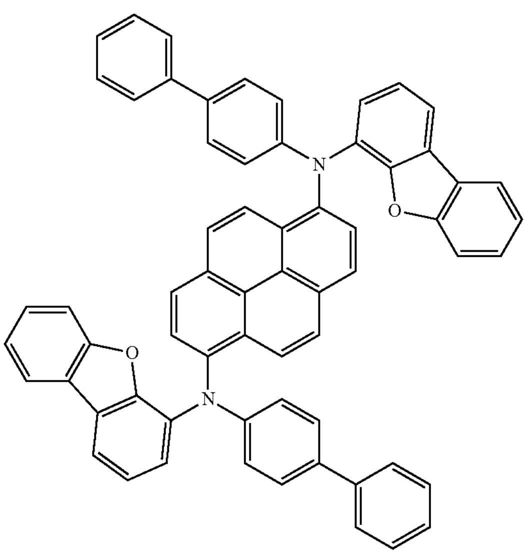
FD20
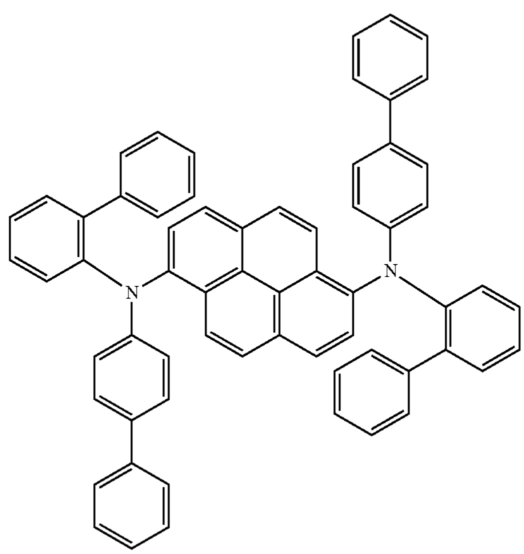

-continued

FD21

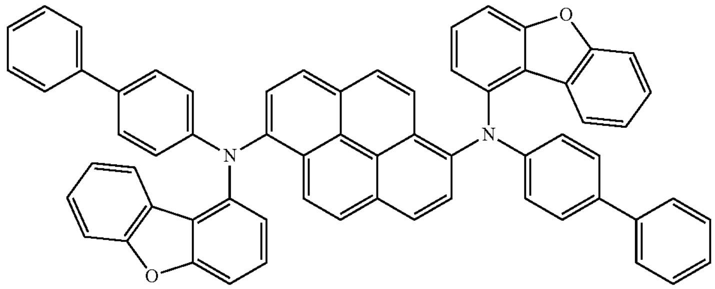

FD22

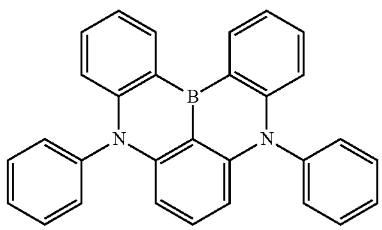

FD23

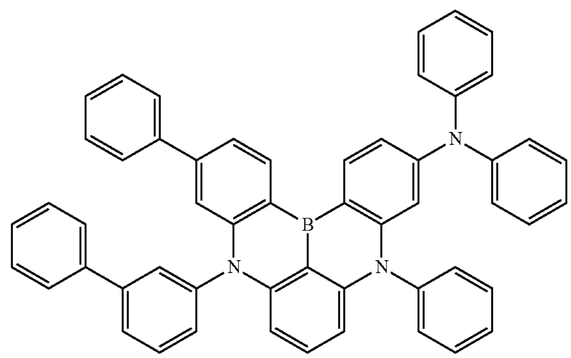

FD24

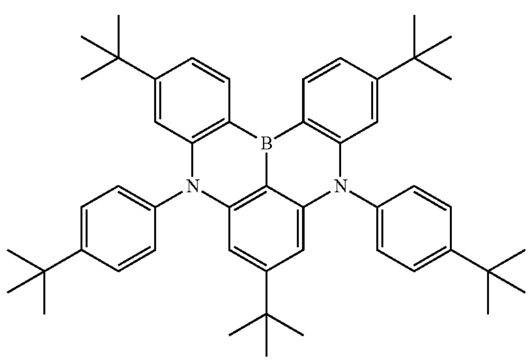

The amount of the dopant in the emission layer may be about 0.01 wt % to about 15 wt %, but embodiments of the present disclosure are not limited thereto. [Sensitizer in emission layer 15]

The sensitizer may include ruthenium (Ru), palladium (Pd), rhenium (Re), osmium (Os), or platinum (Pt). In one or more embodiments, the sensitizer may be a phosphorescent dopant compound.

In some embodiments, the sensitizer may include a metal ($M_{11}$) ruthenium (Ru), palladium (Pd), rhenium (Re), osmium (Os), or platinum (Pt), and an organic ligand ($L_{11}$), and $L_{11}$ and $M_{11}$ may form 1, 2, 3, or 4 cyclometallated ring(s).

In some embodiments, the sensitizer may include an organometallic compound represented by Formula 101:

$$M_{11}(L_{11})_{n11}(L_{12})_{n12}.$$ <Formula 101>

In Formula 101, $M_{11}$ is ruthenium (Ru), palladium (Pd), rhenium (Re), osmium (Os), or platinum (Pt), $L_{11}$ is a ligand represented by one of Formulae 1-1 to 1-4, $L_{12}$ may be a monodentate ligand or a bidentate ligand, n11 may be 1, n12 may be 0, 1, or 2, 1-1

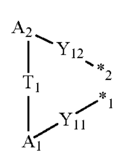

1-2

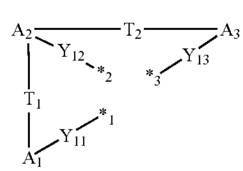

-continued 1-3

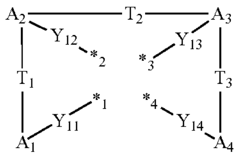

1-4

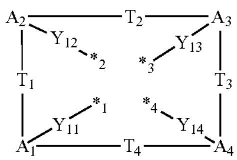

in Formulae 1-1 to 1-4, $A_1$ to $A_4$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(═O)—*, *—S(═O)—*', *—S(═O)$_2$—*', *—C($R_{93}$)═*', *═C($R_{93}$)—*', *—C($R_{93}$)═C($R_{94}$)—*', *—C(═S)—*', or *—C≡C—*', a substituent of the substituted $C_5$-$C_{30}$ carbocyclic group, a substituent of the substituted $C_1$-$C_{30}$ heterocyclic group, and $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —C(═O)($Q_1$), —S(═O)($Q_1$), —S(═O)$_2$($Q_1$), —P(═O)($Q_1$)($Q_2$), —P(═S)($Q_1$)($Q_2$), or any combination thereof, wherein each of the substituent of the substituted $C_5$-$C_{30}$ carbocyclic group and the substituent of the substituted $C_1$-$C_{30}$ heterocyclic group is not hydrogen, $*_1$, $*_2$, $*_3$, and $*_4$ each indicate a binding site to $M_{11}$, and $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a substituted or unsubstituted $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, and a $C_6$-$C_{60}$ aryl group, a $C_6$-$C_{60}$ aryl group that is substituted with deuterium, —F, a cyano group, a $C_1$-$C_{60}$ alkyl group, or a $C_6$-$C_{60}$ aryl group.

In one or more embodiments, the sensitizer may be Groups I to VI, but embodiments of the present disclosure are not limited thereto:

<Group I>

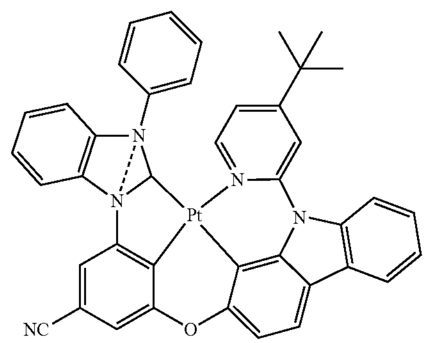

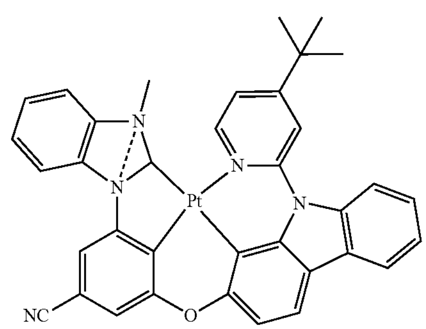

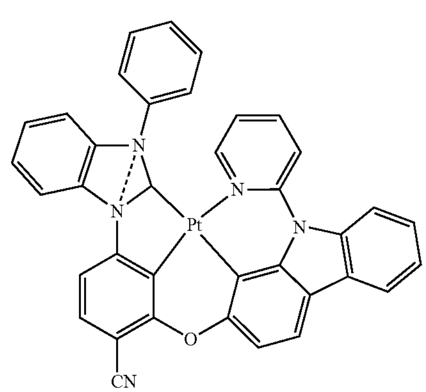

-continued
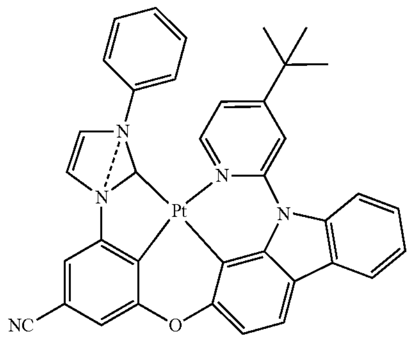
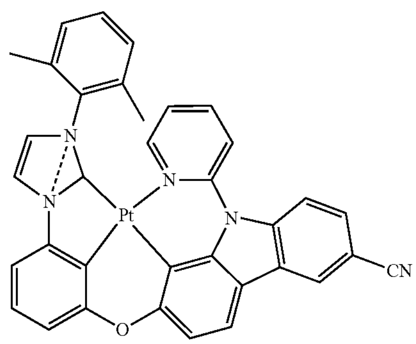
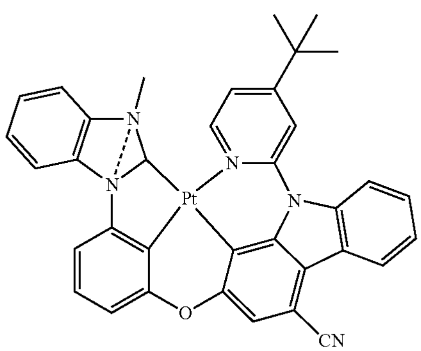
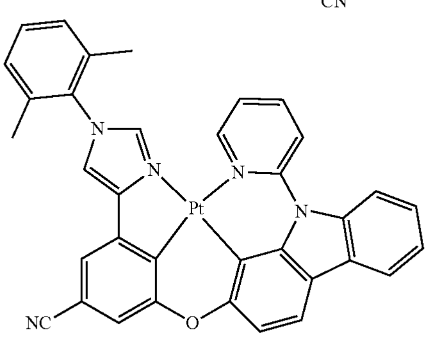
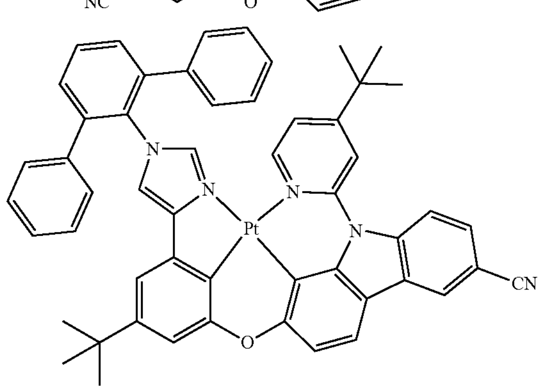
-continued
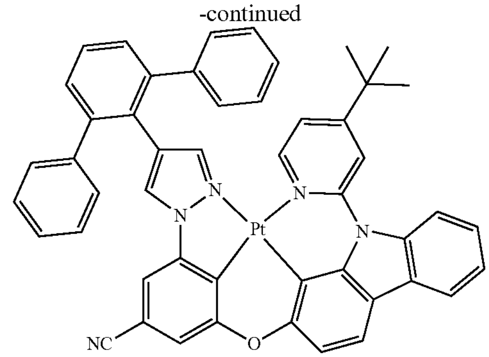
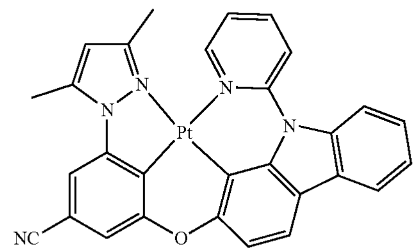
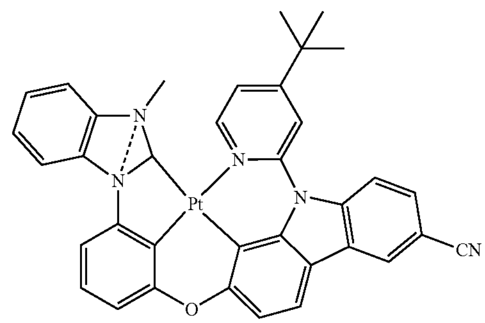
<Group II>
1
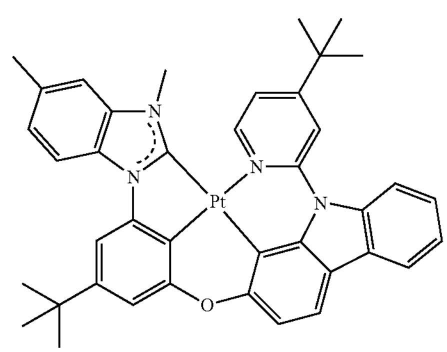
2
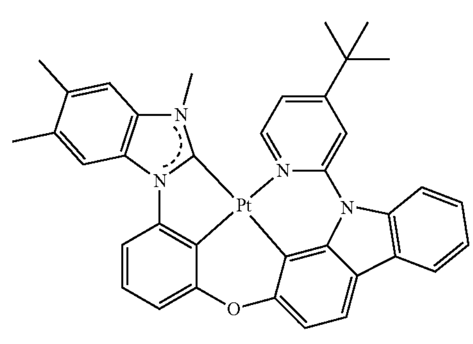

3
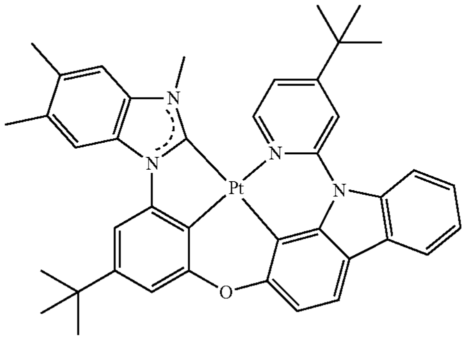
4
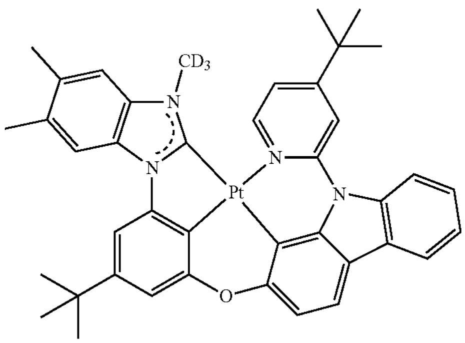
5
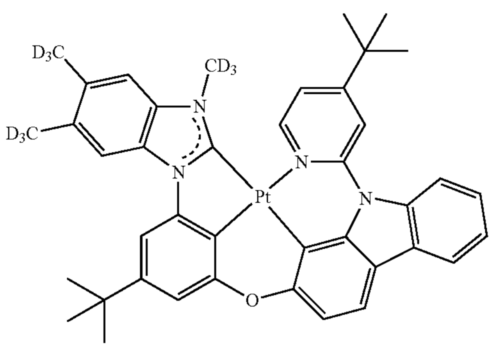
6
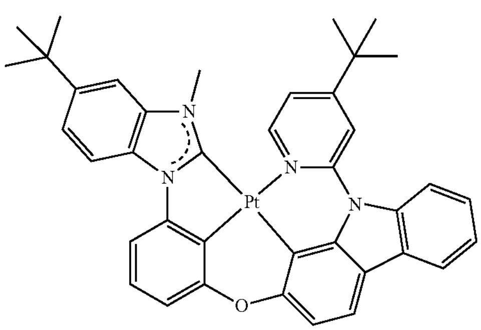
7
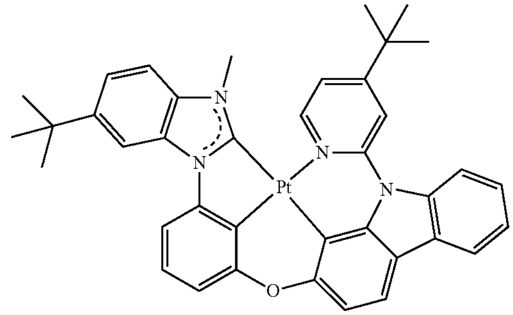
8
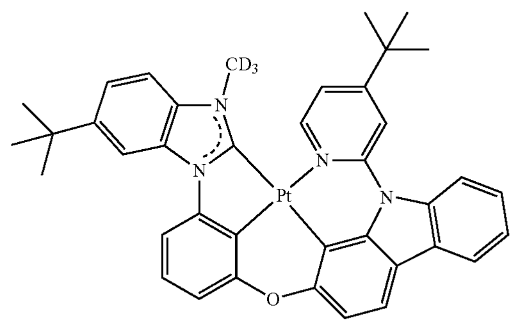
9
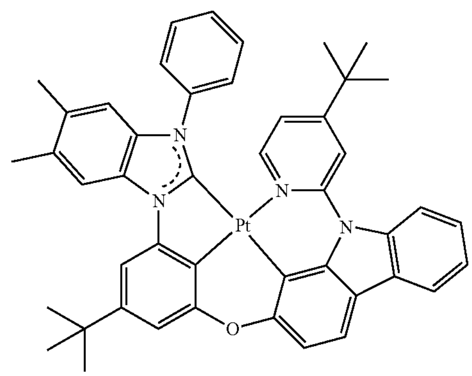
10
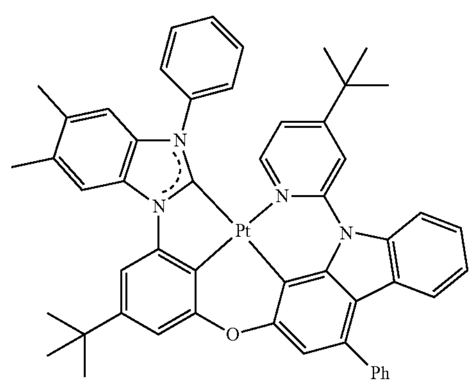

-continued
11
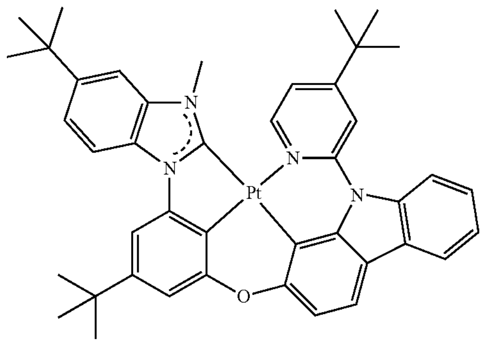
12
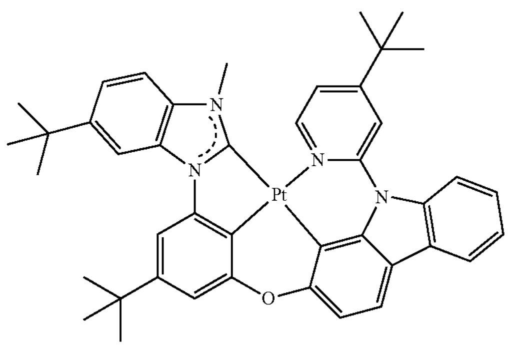
13
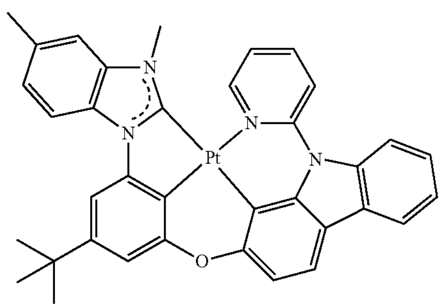
14
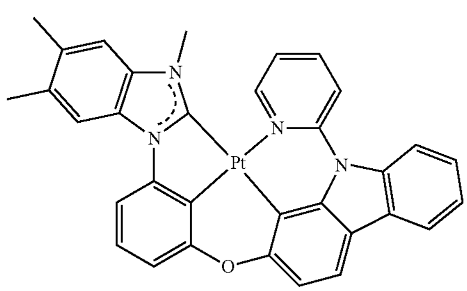
15
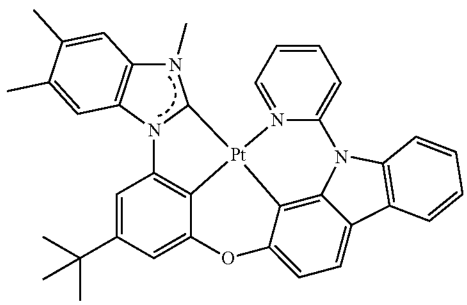
-continued
16
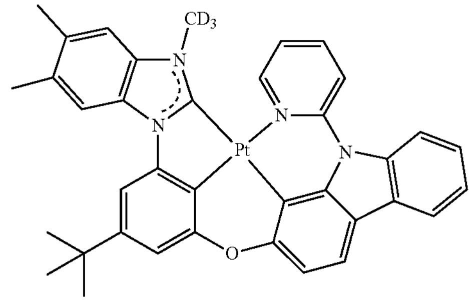
17
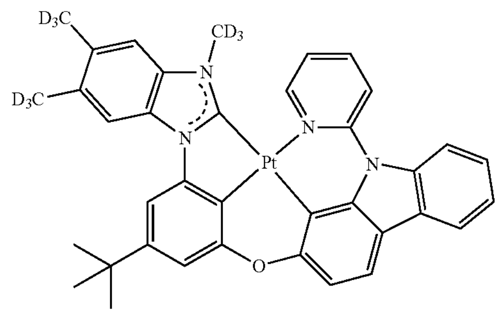
18
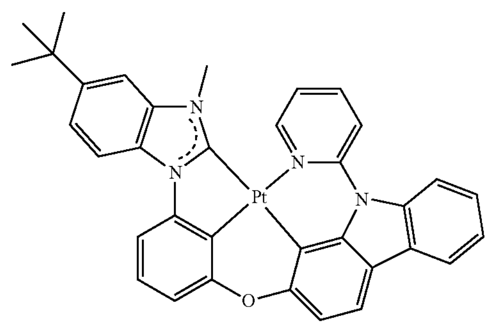
19
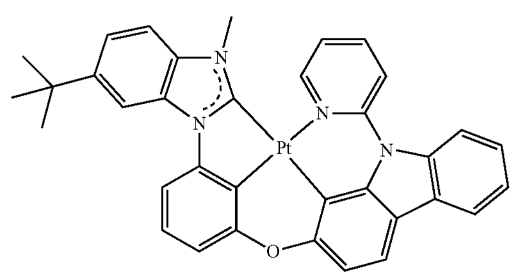
20
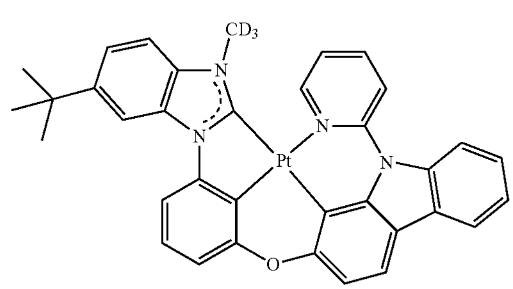

-continued
21
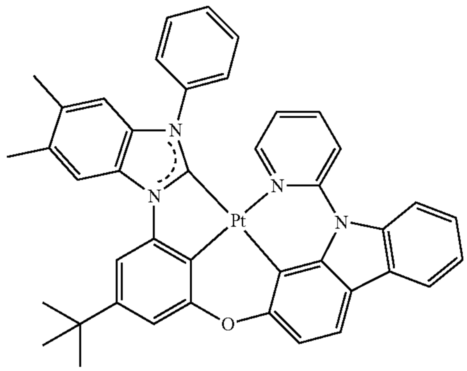
22
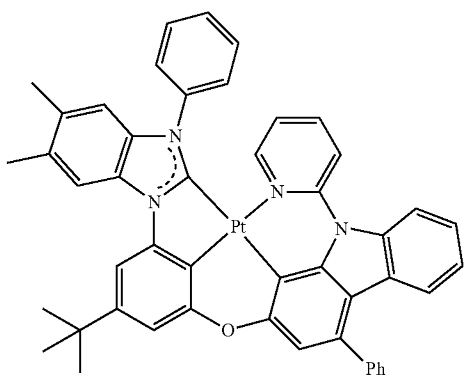
23
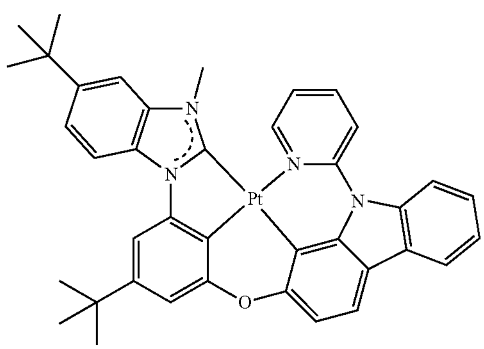
24
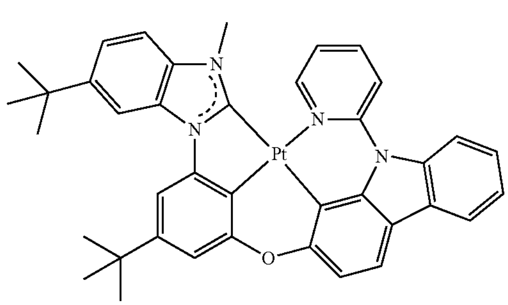
-continued
25
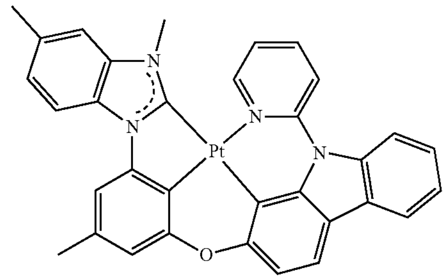
26
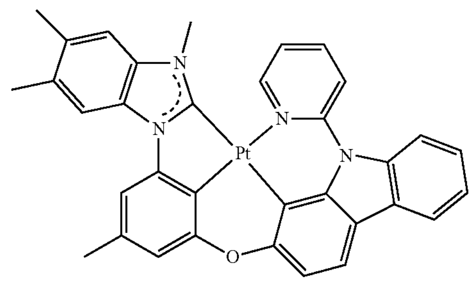
27
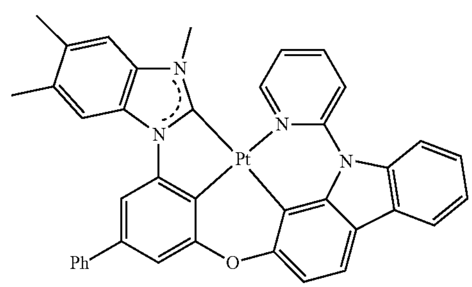
28
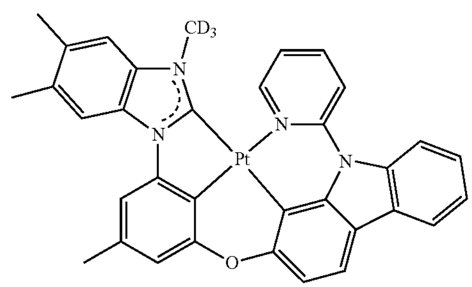
29
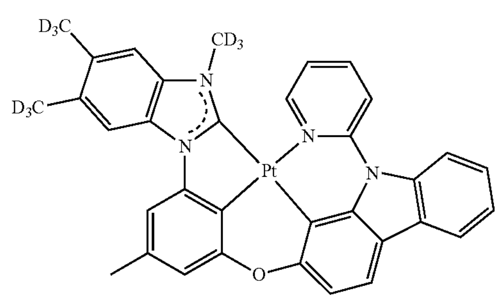

-continued
30
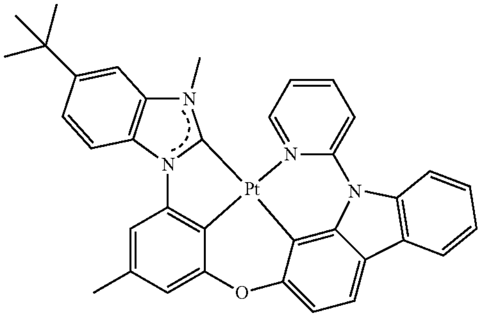
31
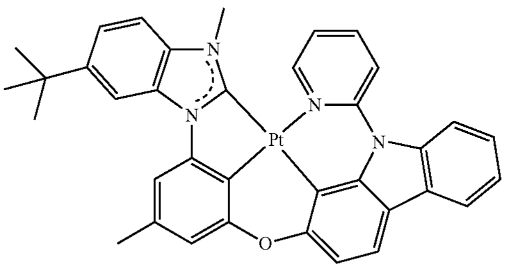
32
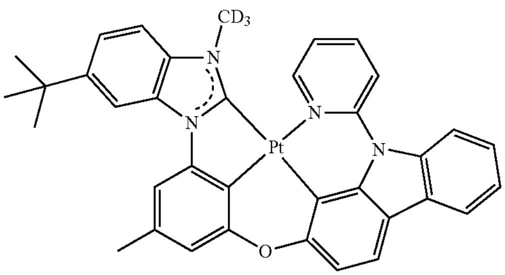
33
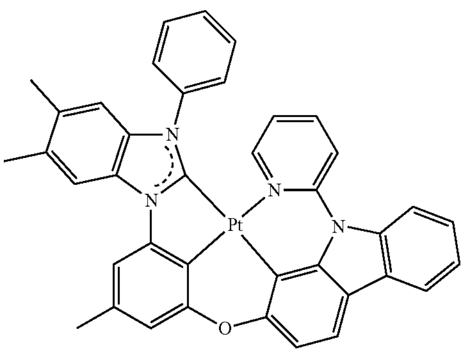
34
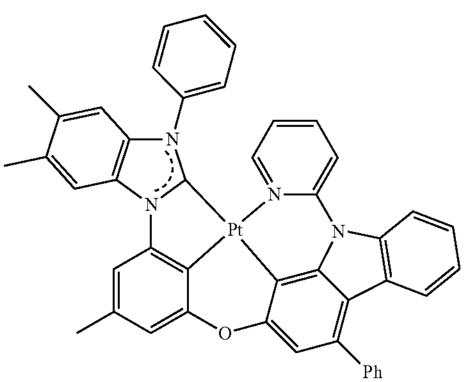
-continued
35
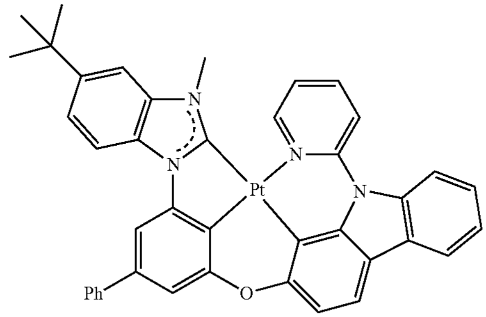
36
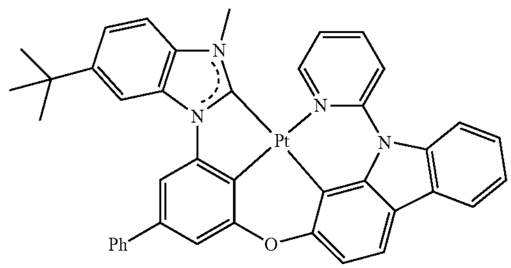
37
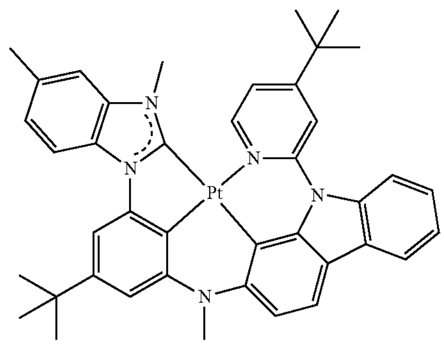
38
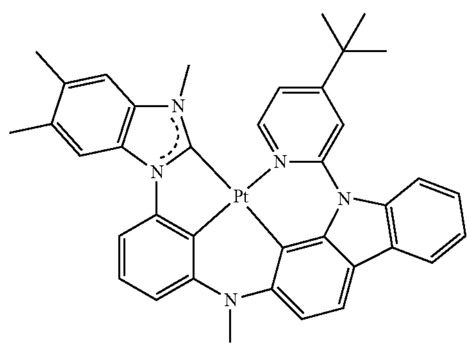
39
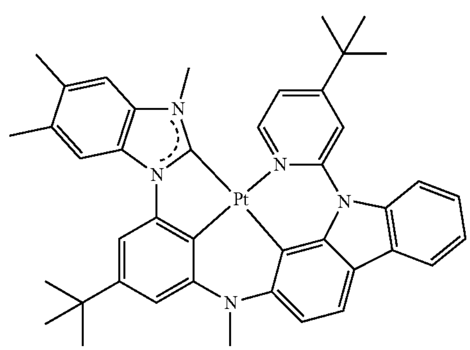

-continued
40
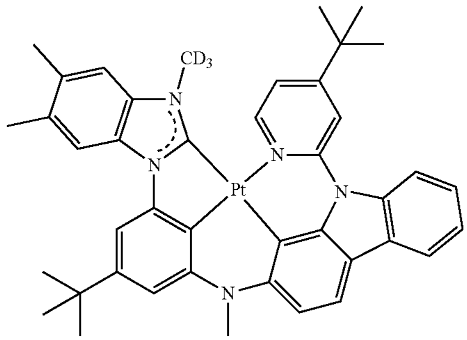
41
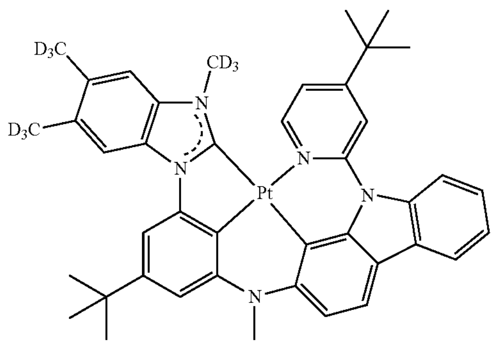
42
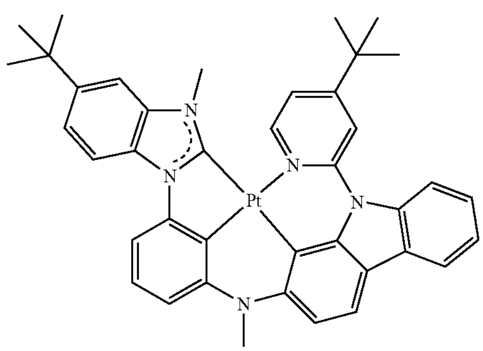
43
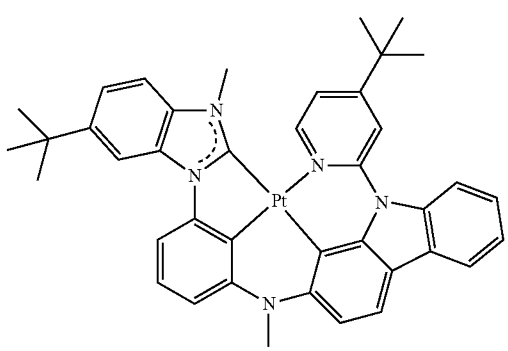
-continued
44
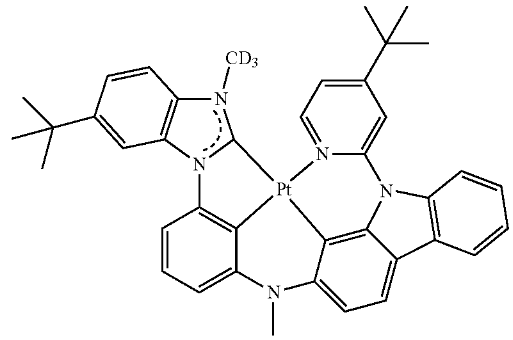
45
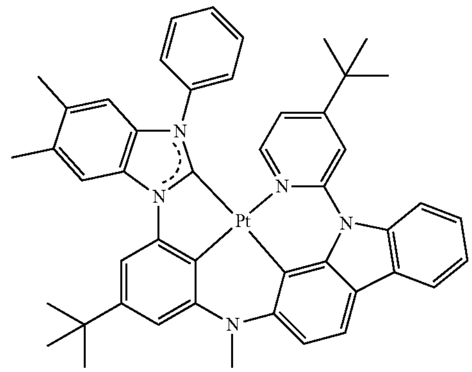
46
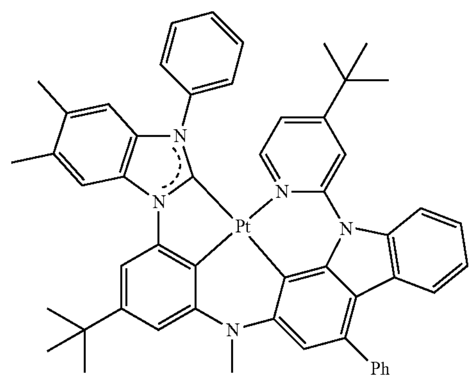
47
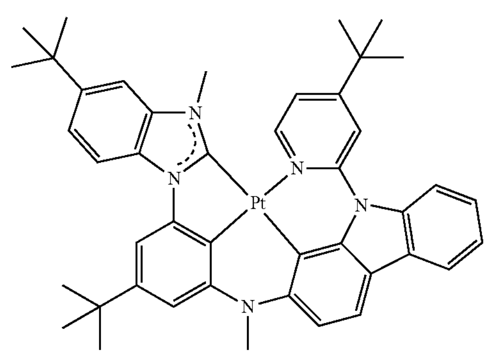

-continued
48
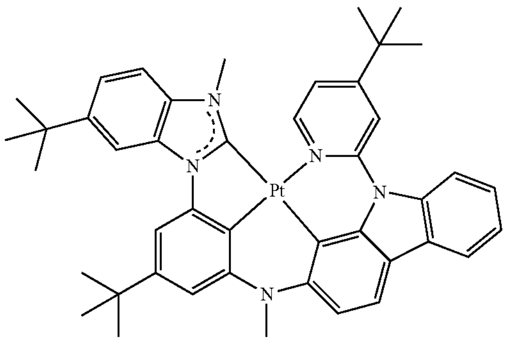
49
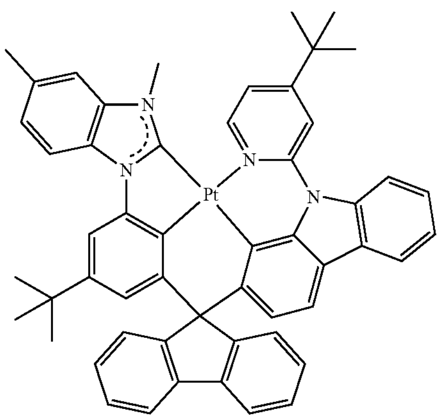
50
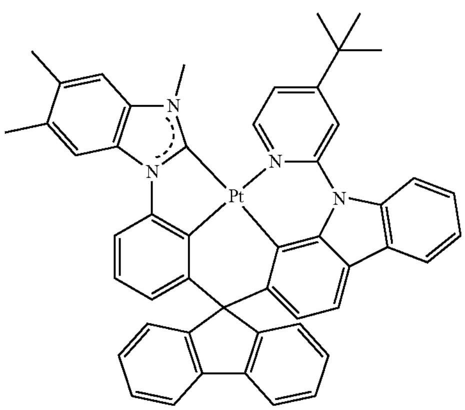
51
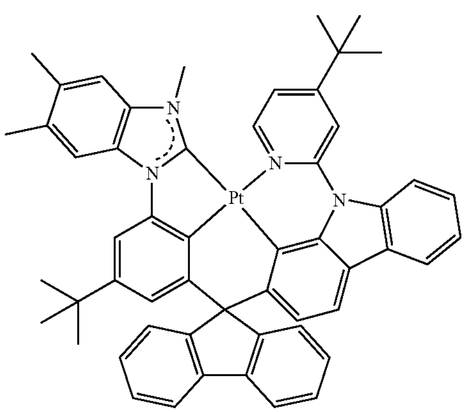
-continued
52
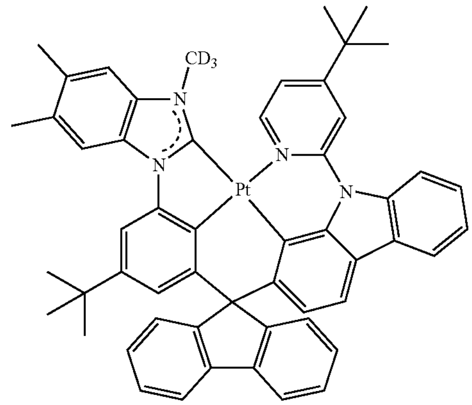
53
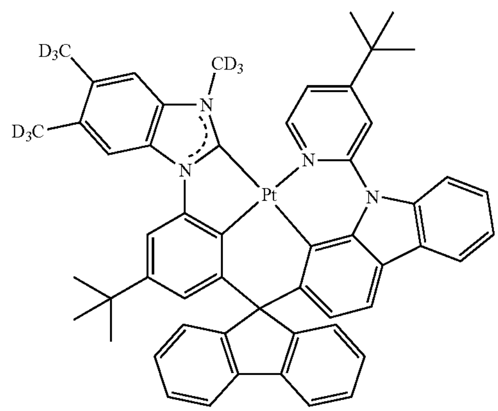
54
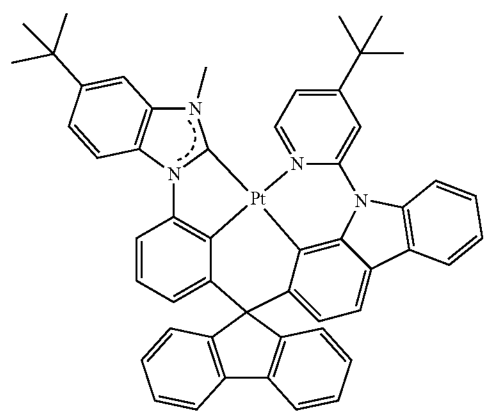
55
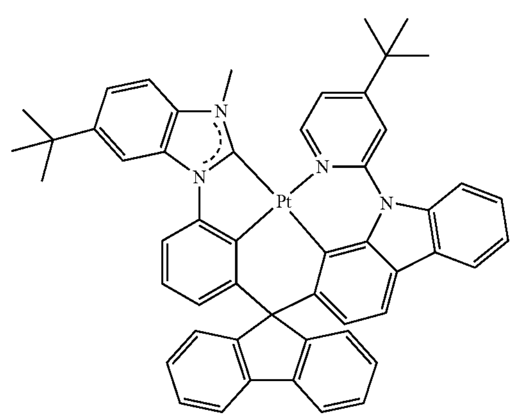

-continued
56
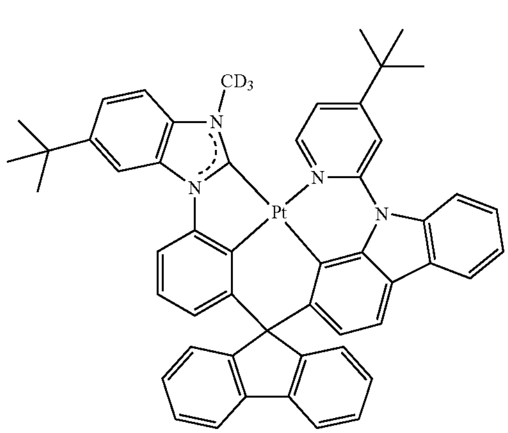
57
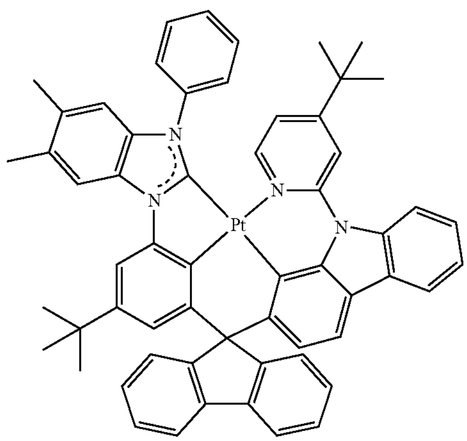
58
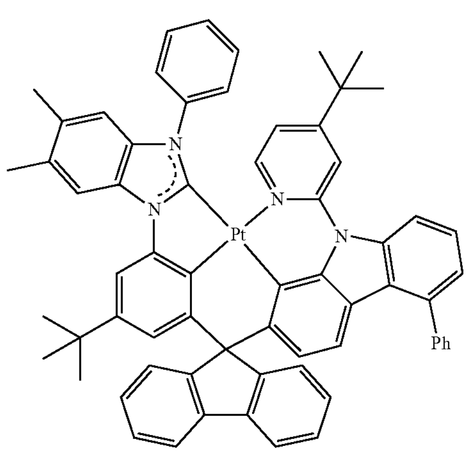
-continued
59
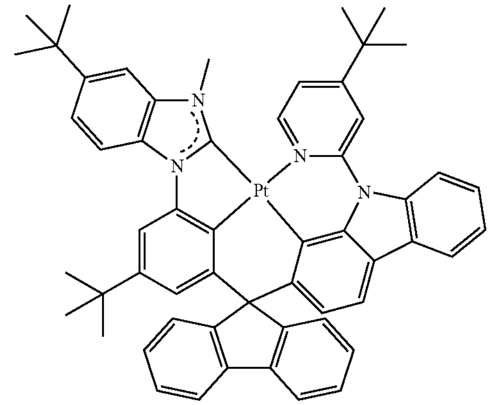
60
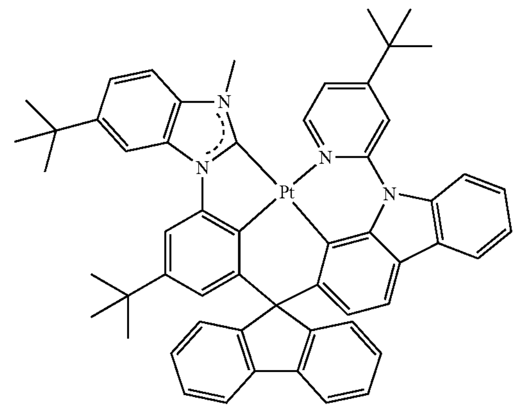
61
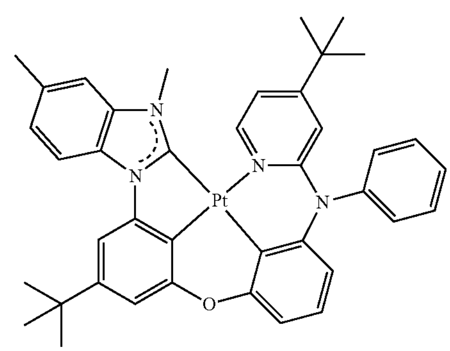
62
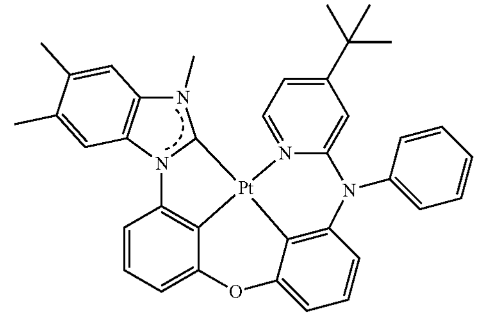

-continued
63
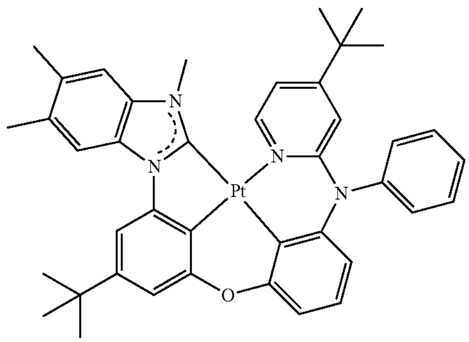
64
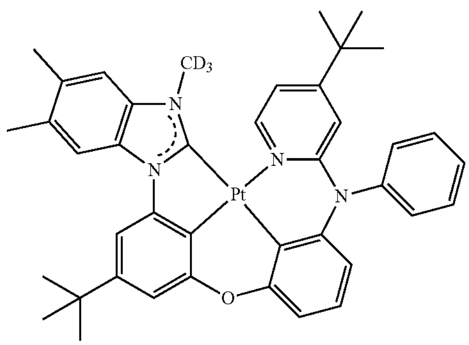
65
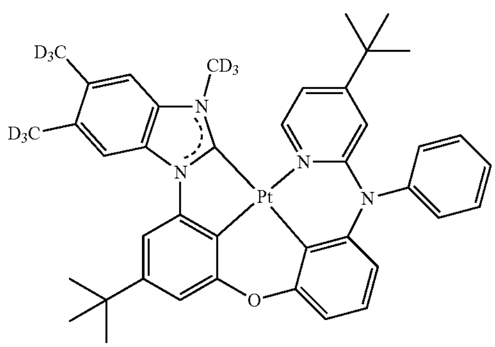
66
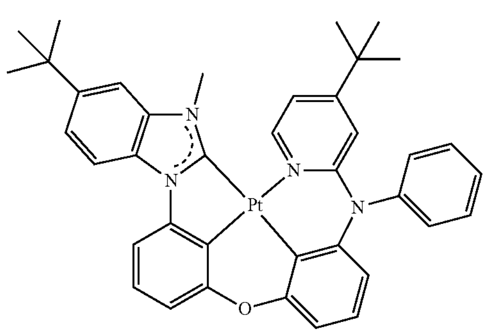
-continued
67
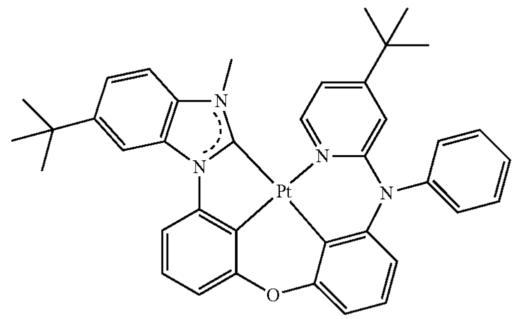
68
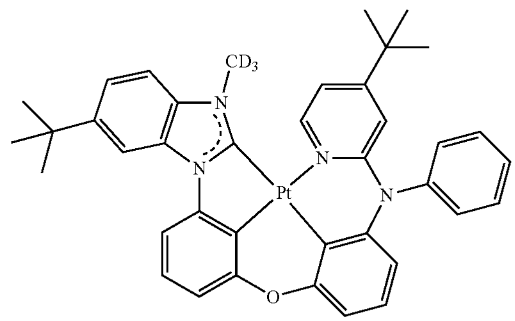
69
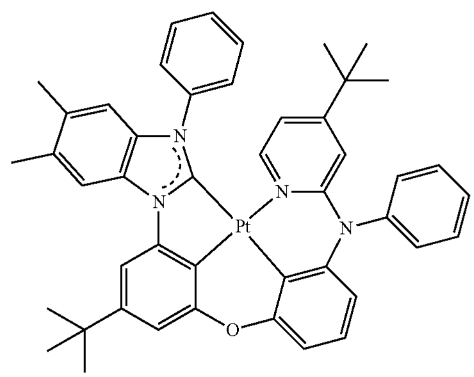
70
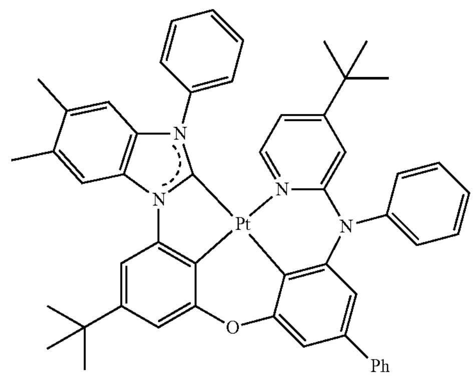

-continued
71
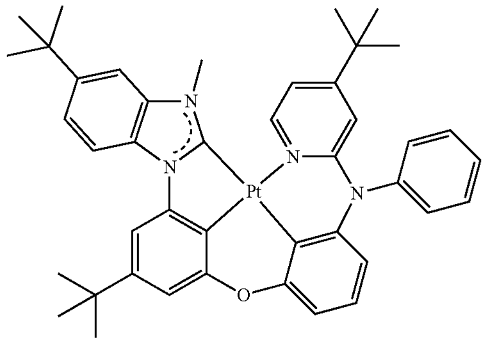
72
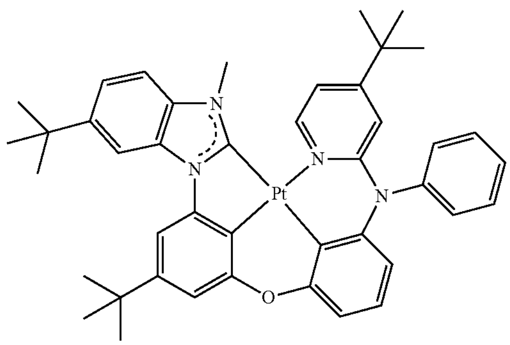
73
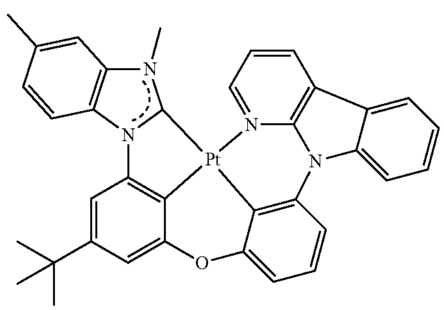
74
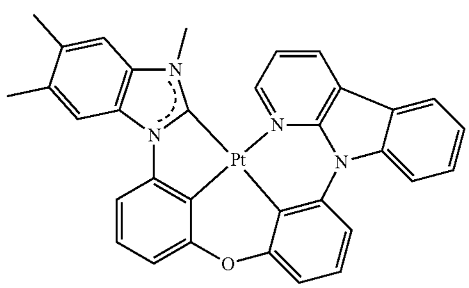
75
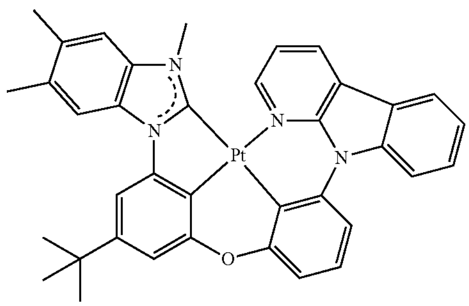
-continued
76
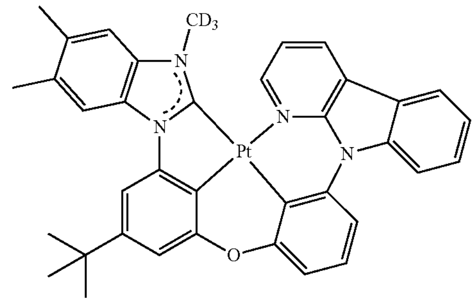
77
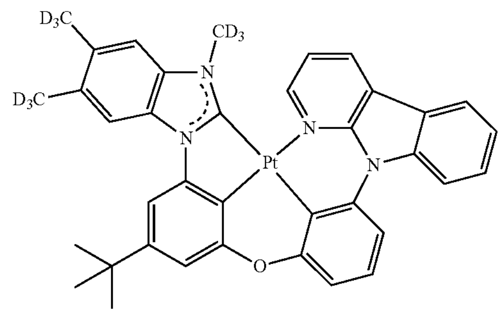
78
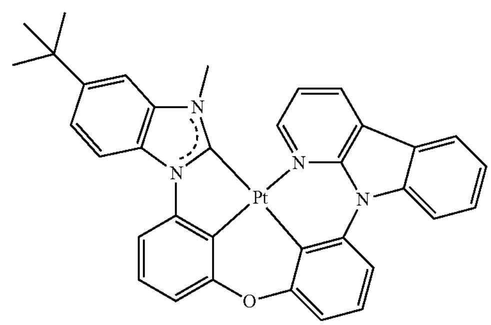
79
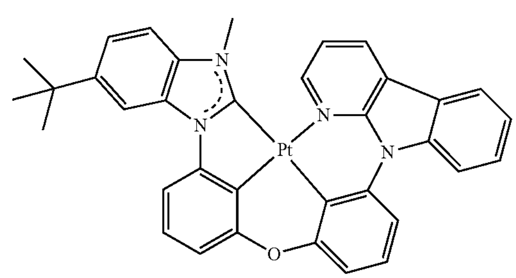
89
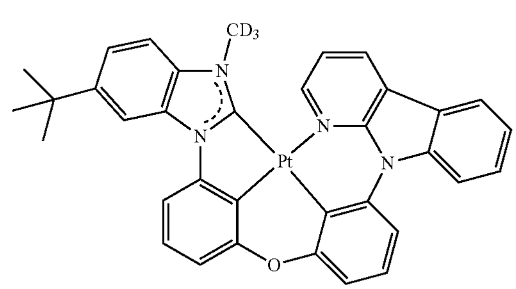

81
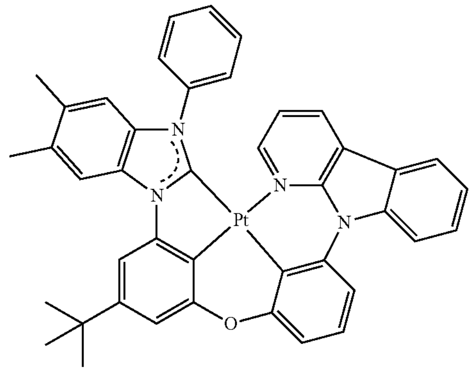
82
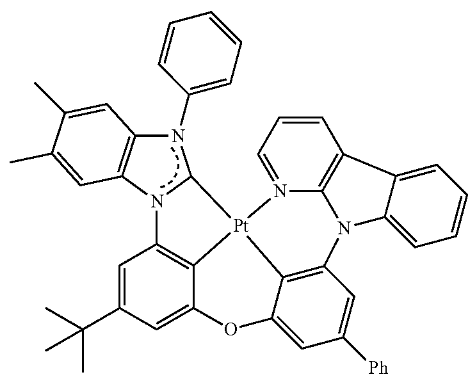
83
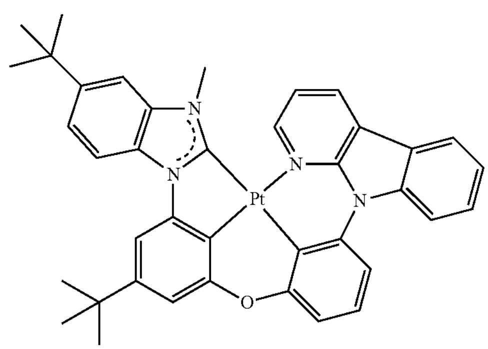
84
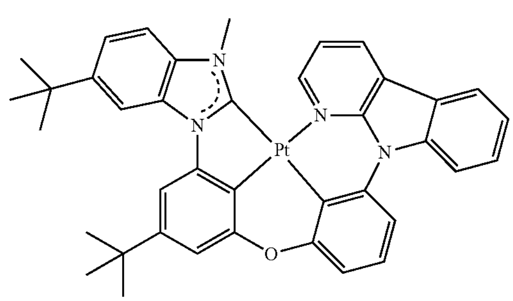
85
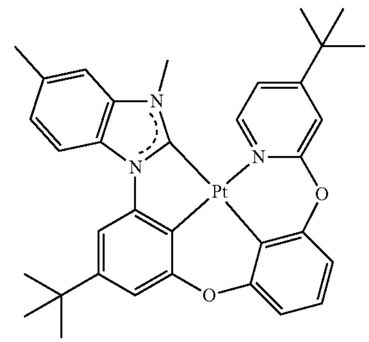
86
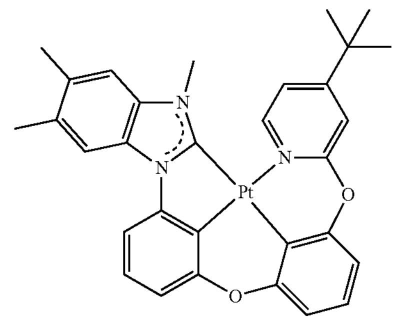
87
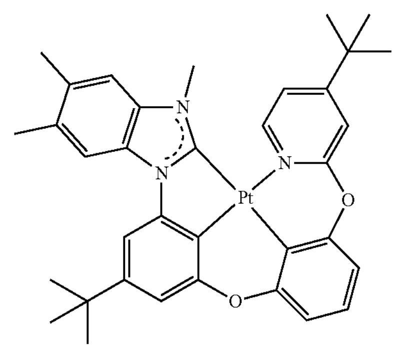
88
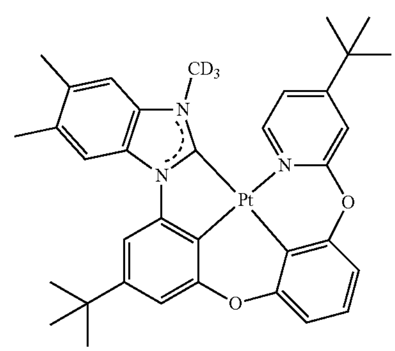

-continued
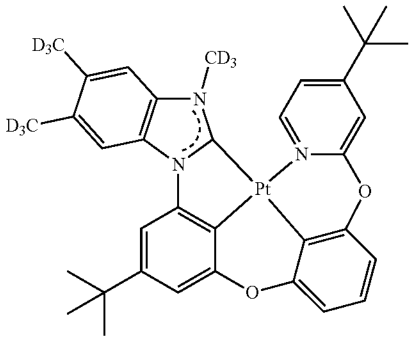
89
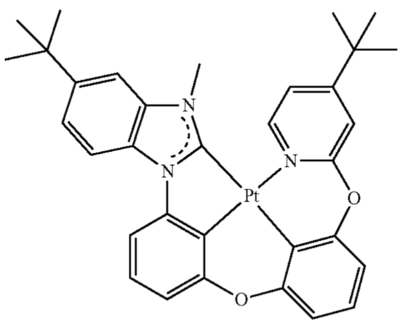
90
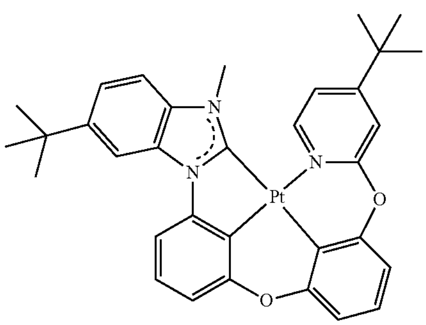
91
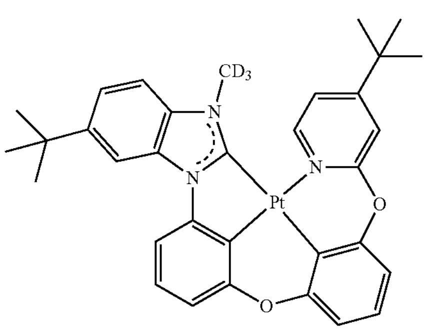
92
-continued
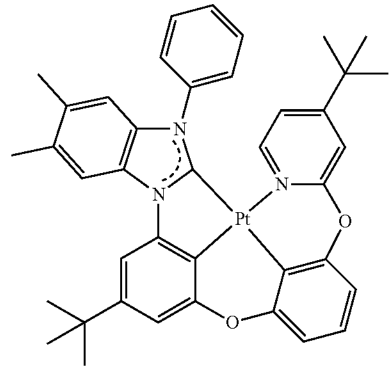
93
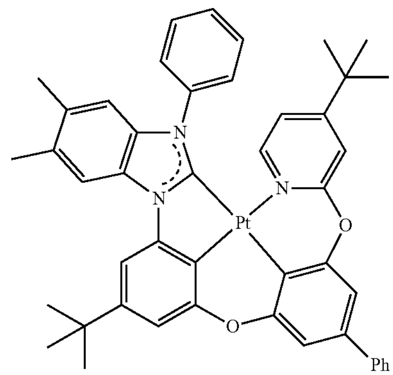
94
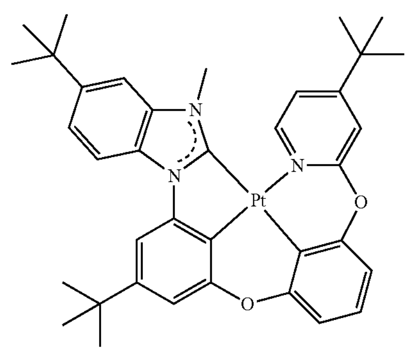
95
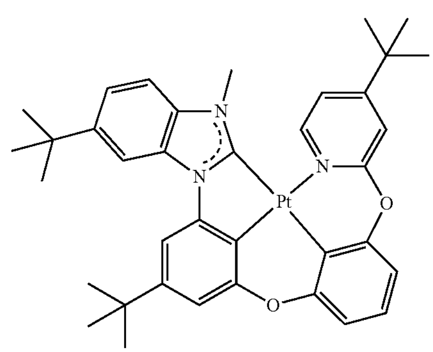
96

-continued
97
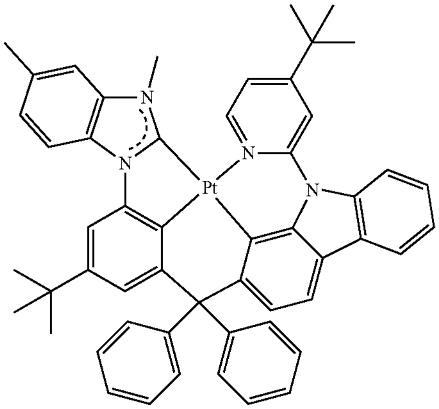
98
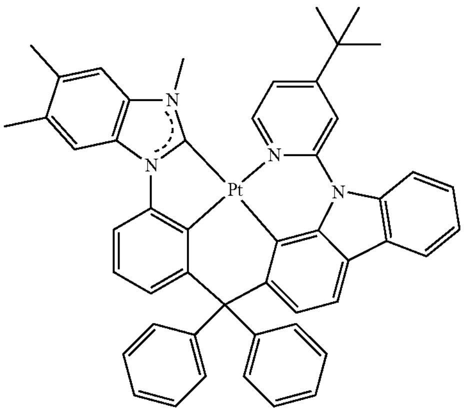
99
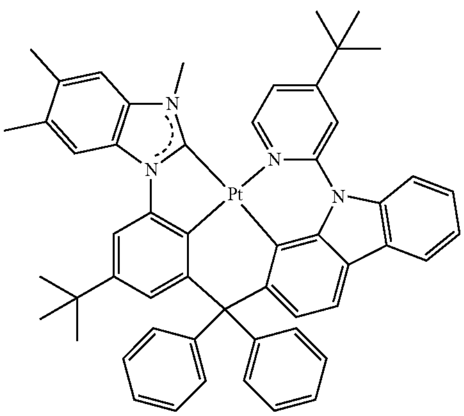
100
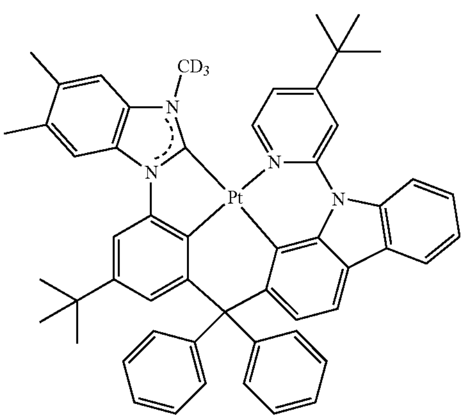
-continued
101
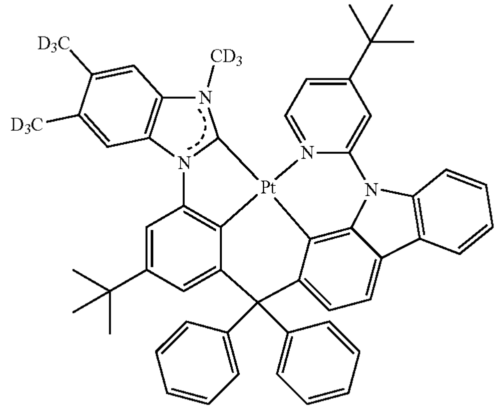
102
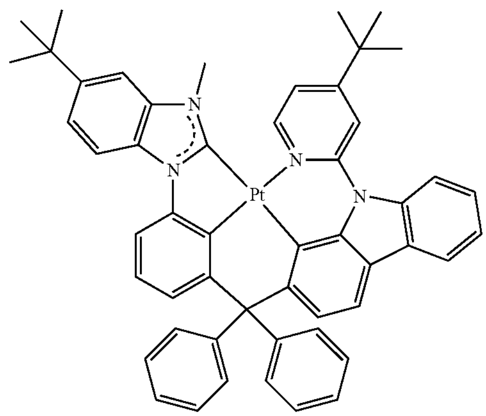
103
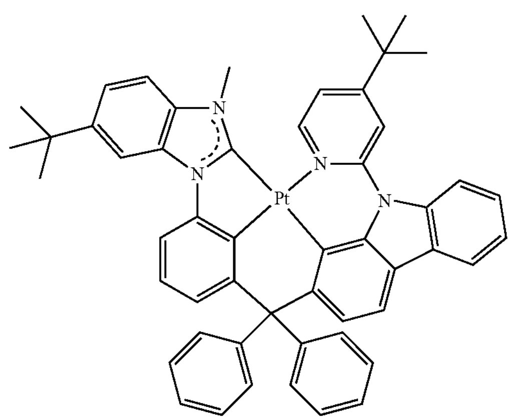

-continued
104
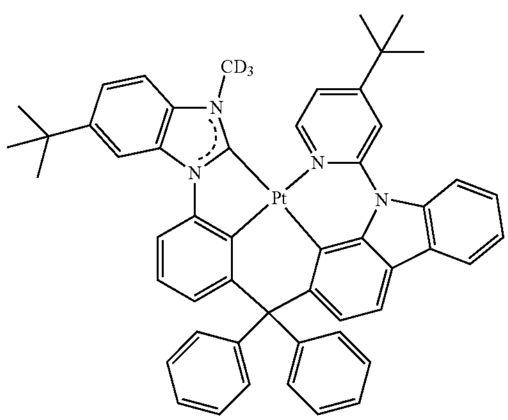
105
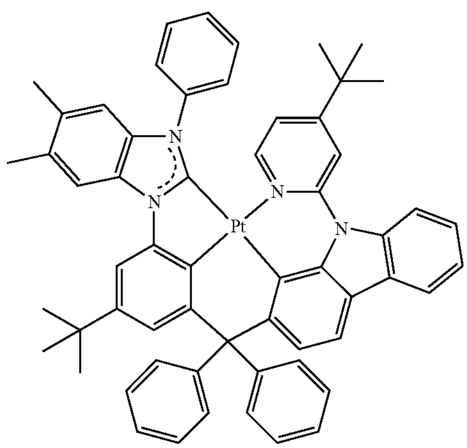
106
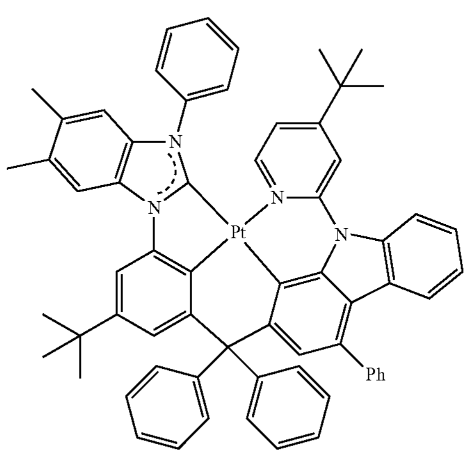
-continued
107
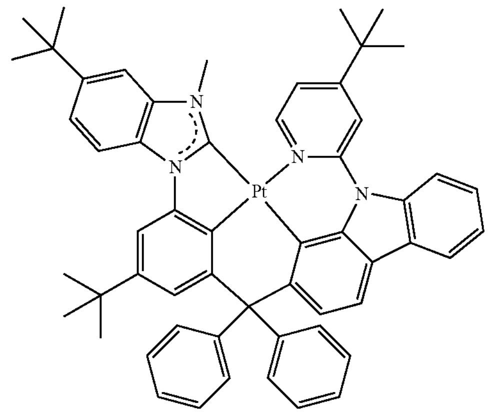
108
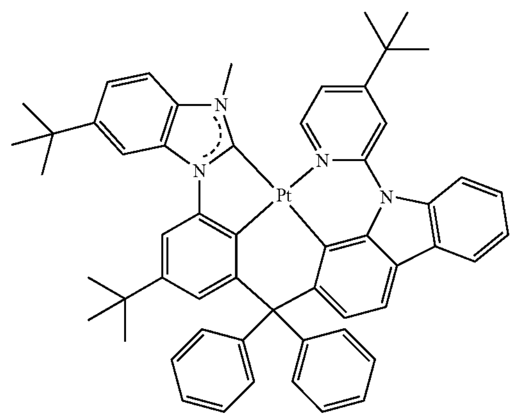
109
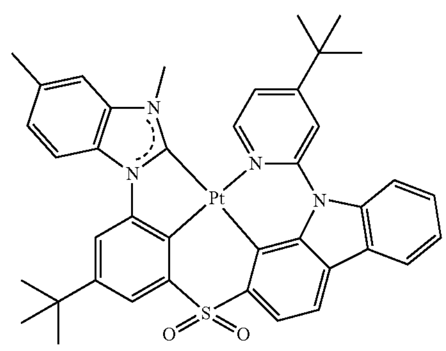
110
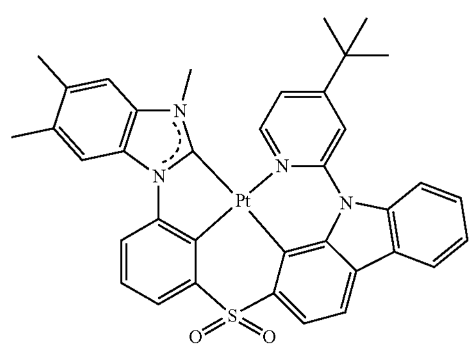

111
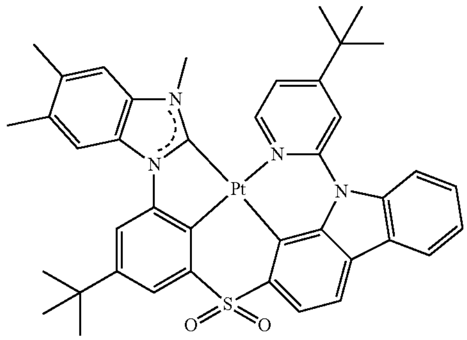
112
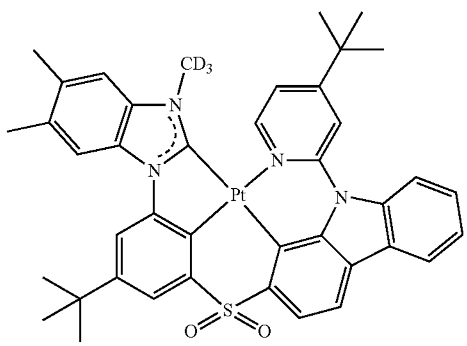
113
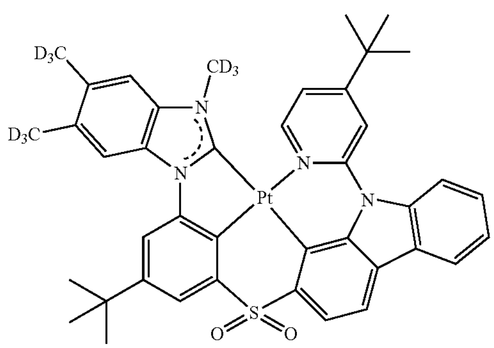
114
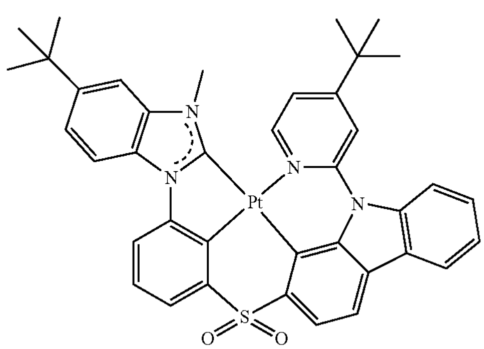
115
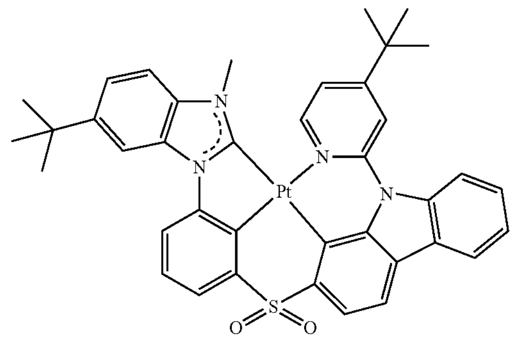
116
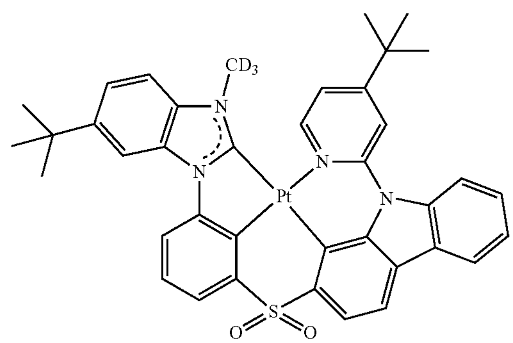
117
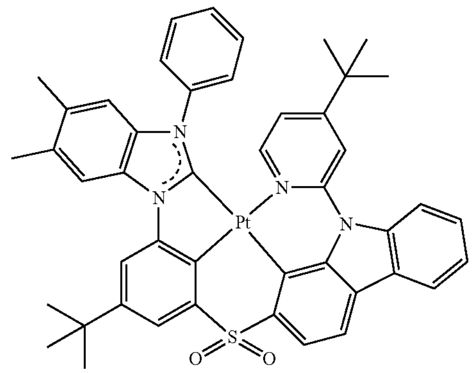
118
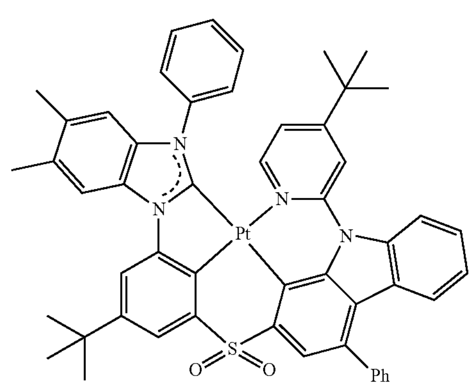

-continued
119
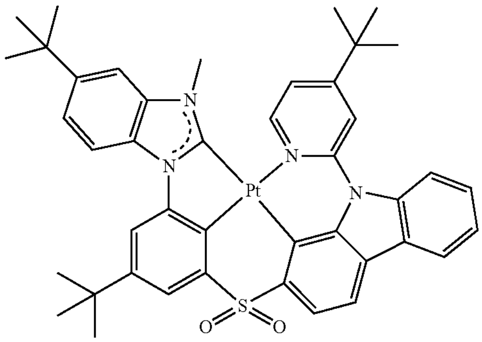
120
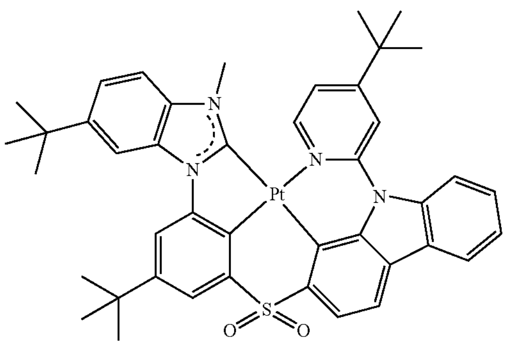
<Group III>
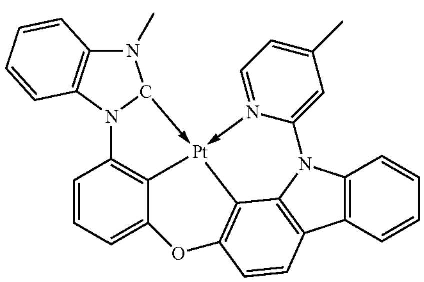
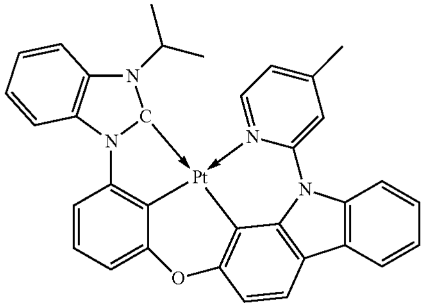
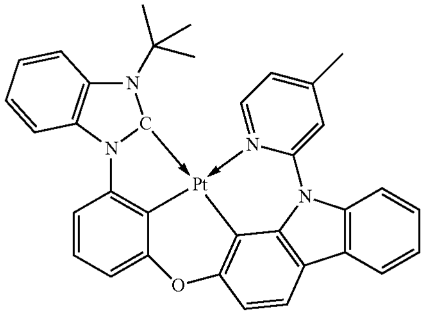
-continued
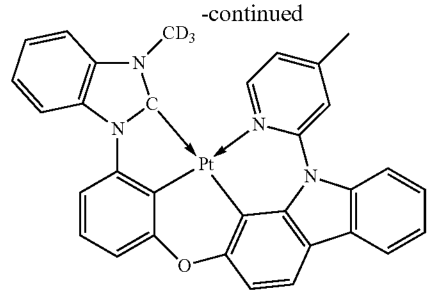
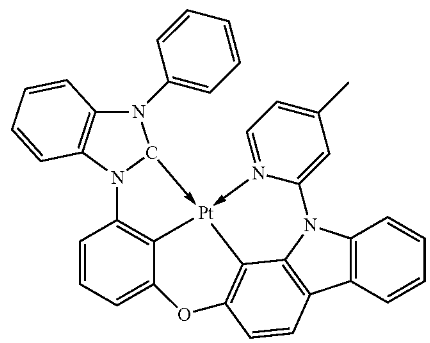
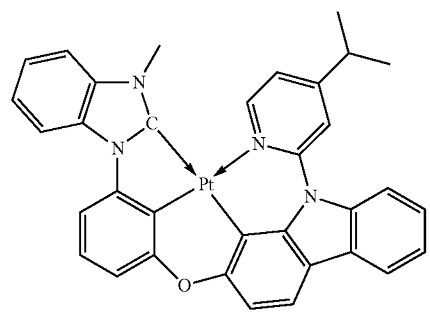
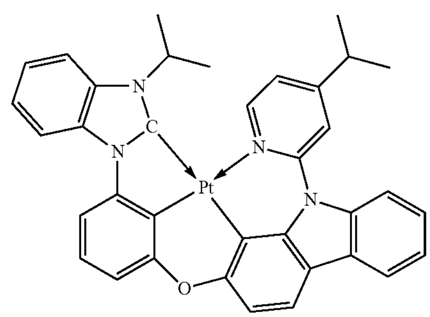
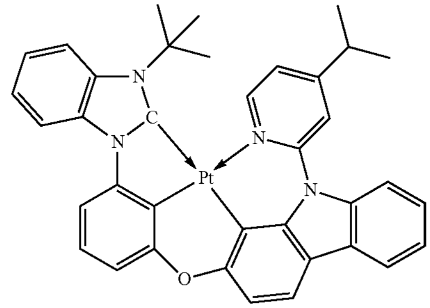

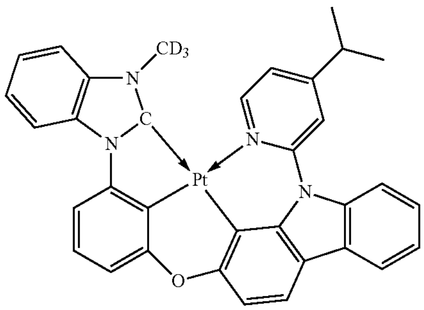
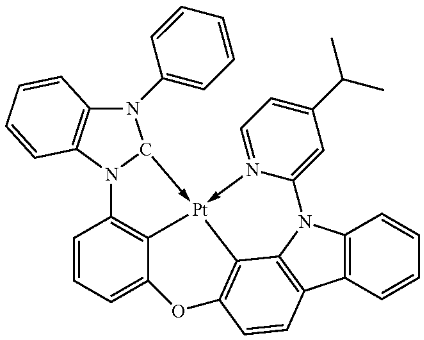
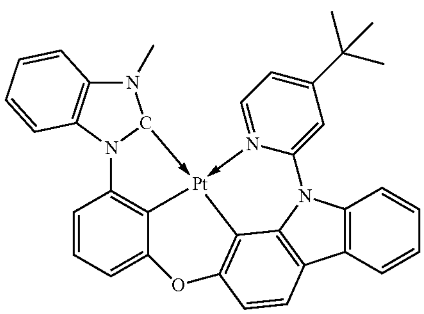
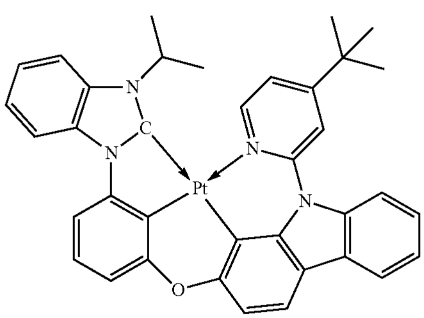
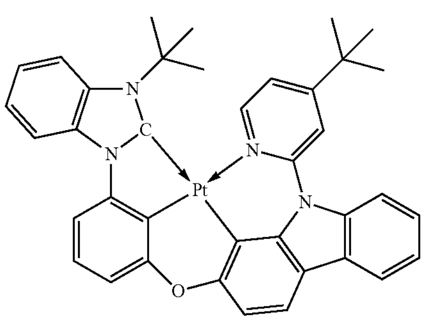
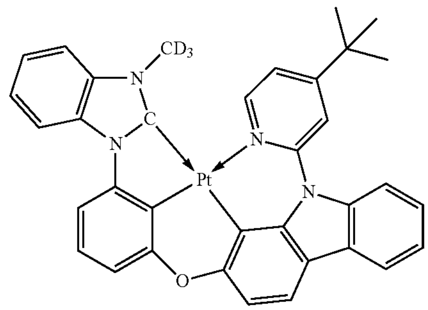
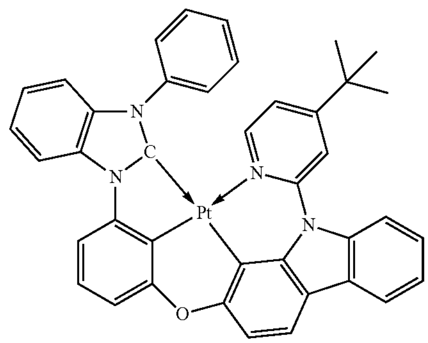
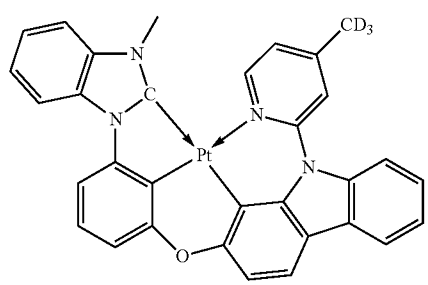
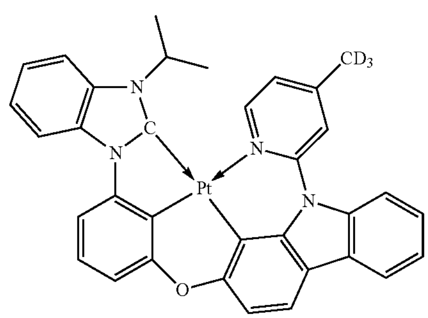
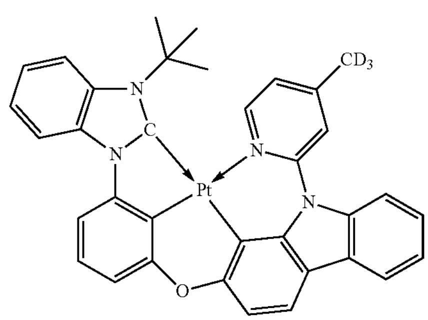

-continued
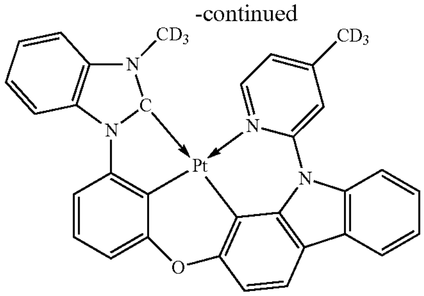
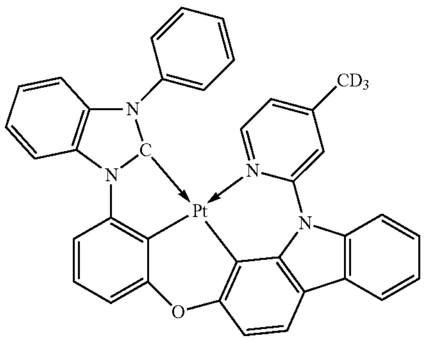
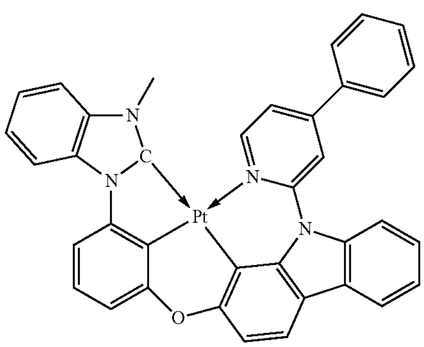
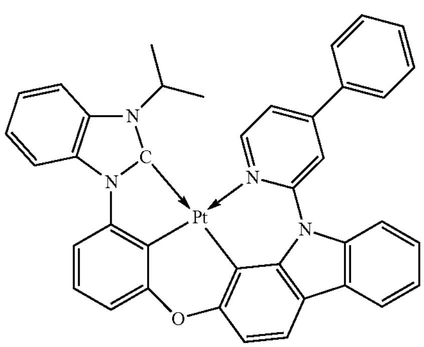
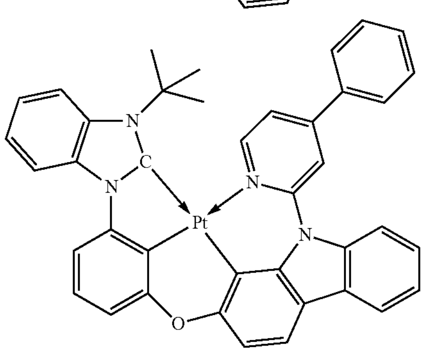
-continued
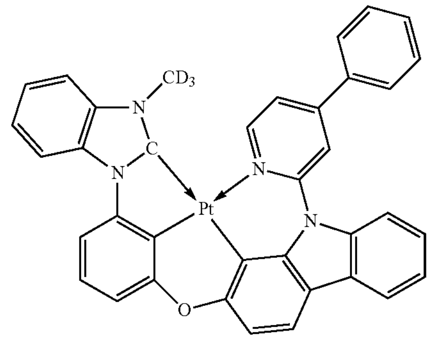
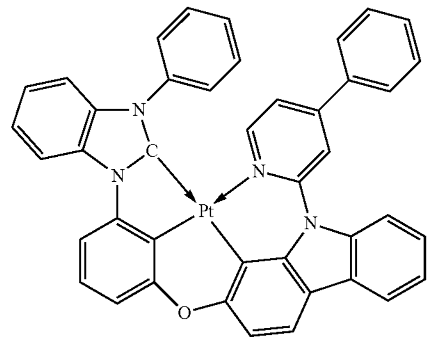
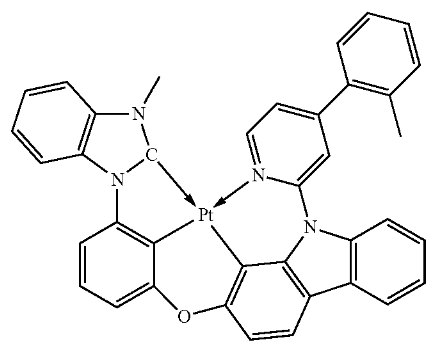
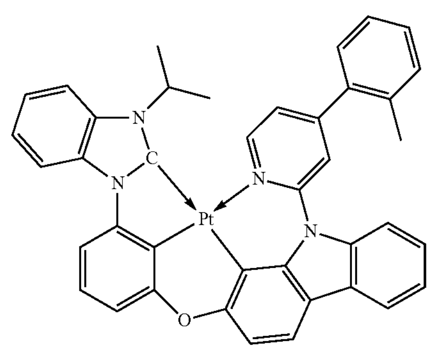
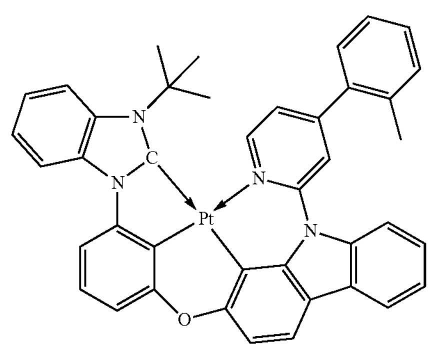

-continued
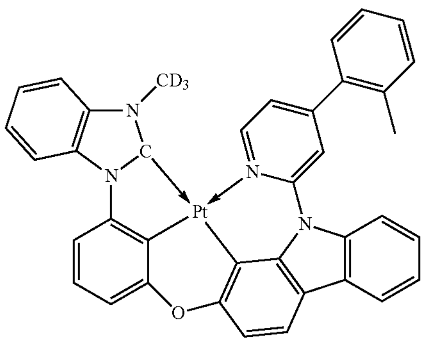
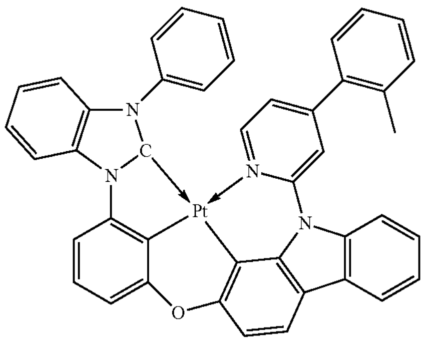
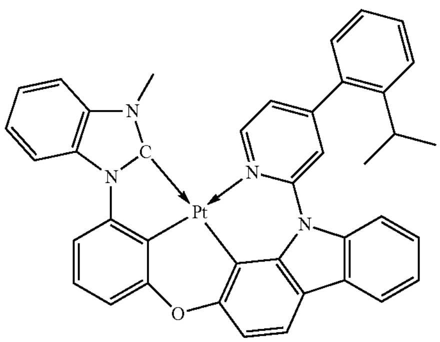
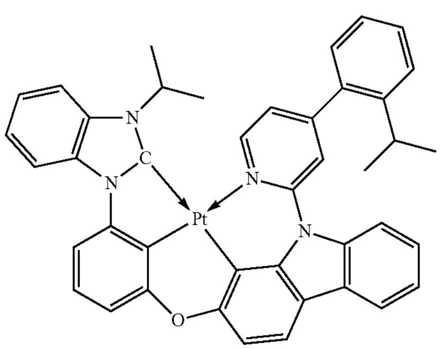
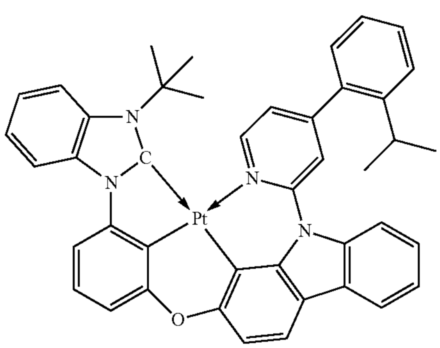
-continued
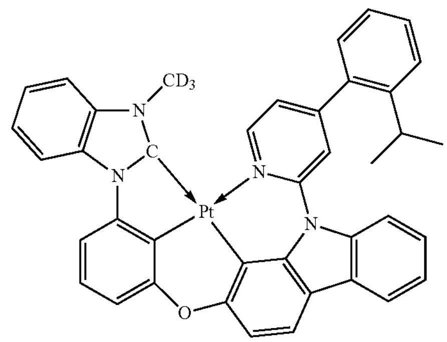
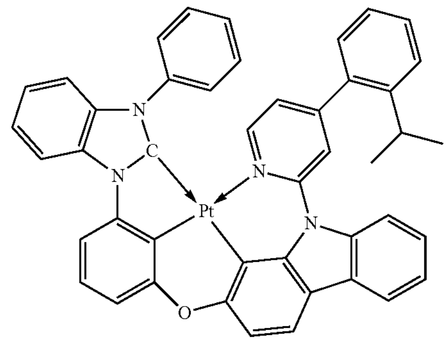
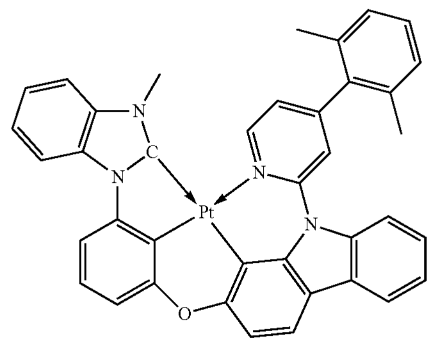
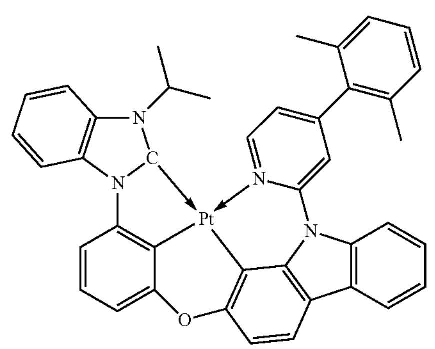
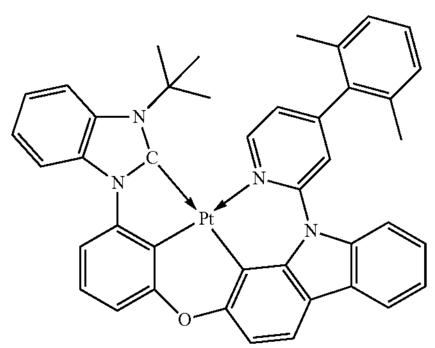

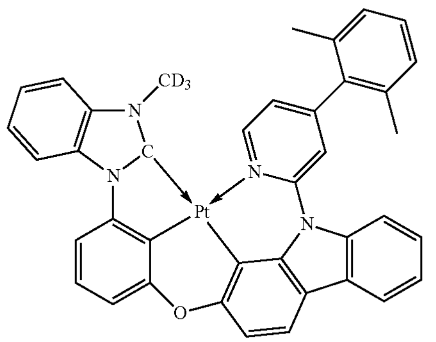
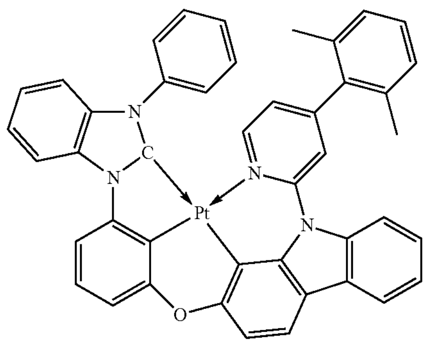
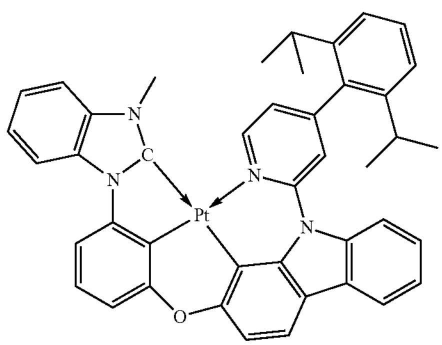
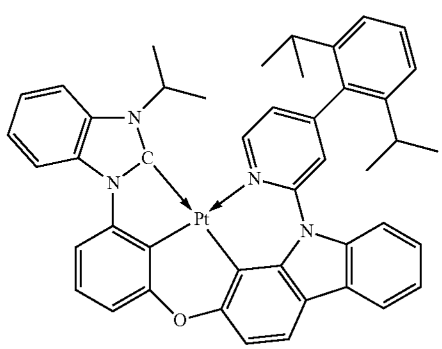
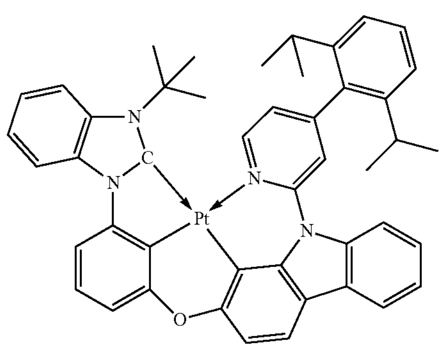
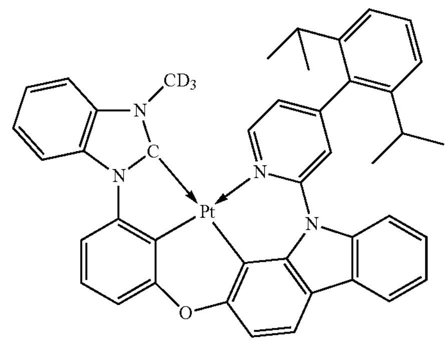
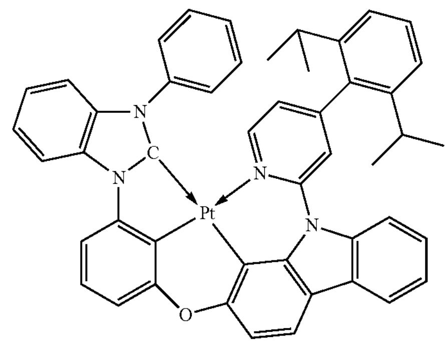
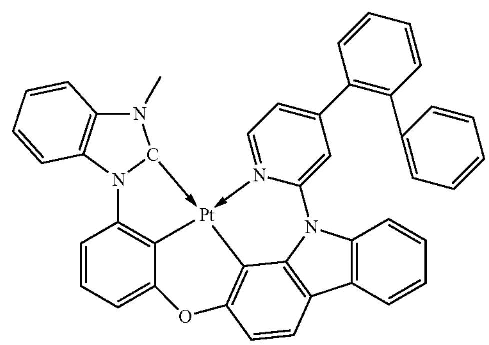
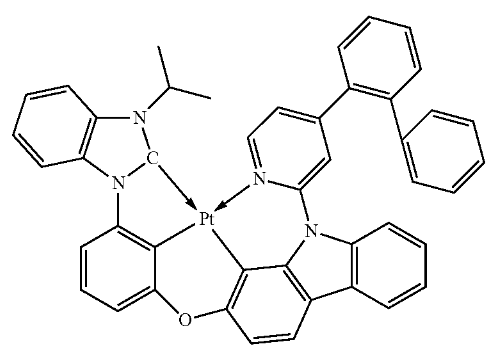
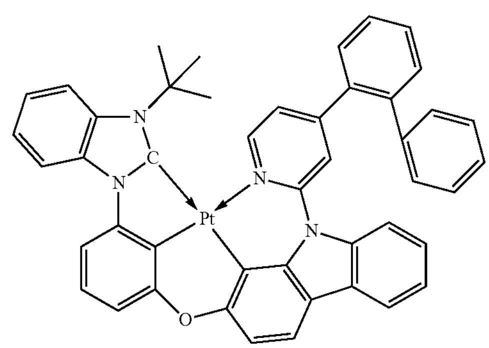

-continued
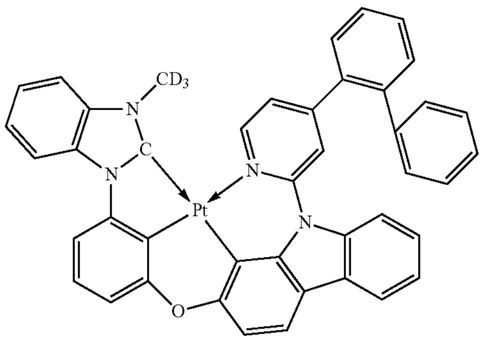
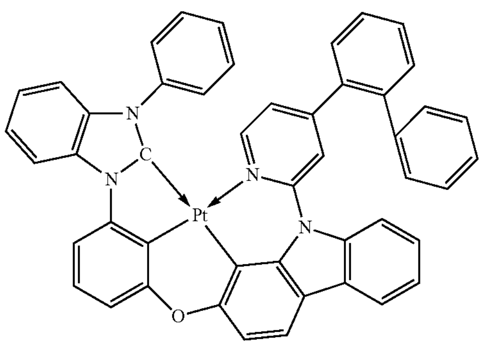
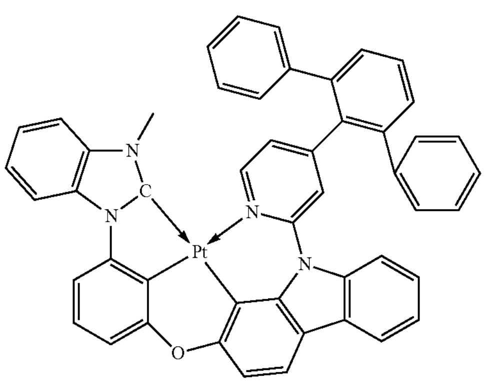
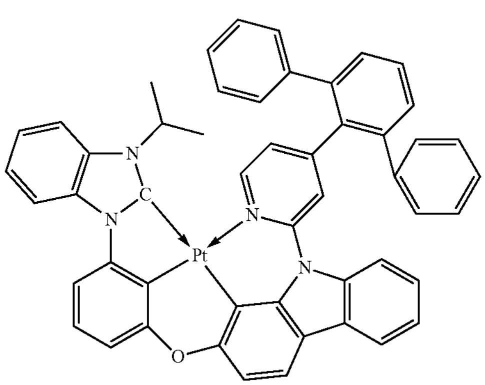
-continued
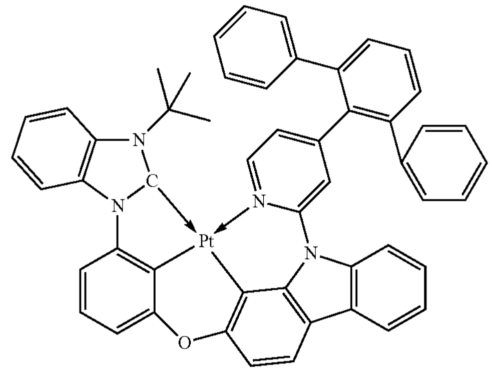
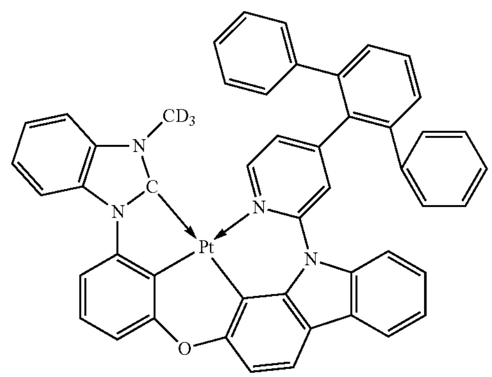
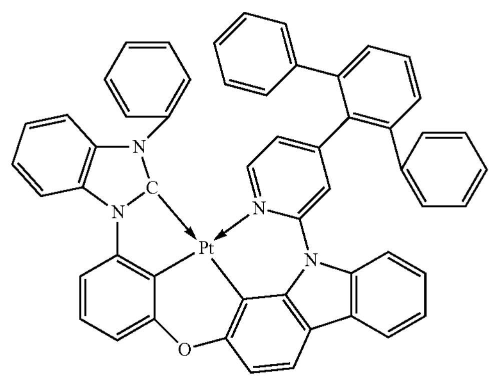
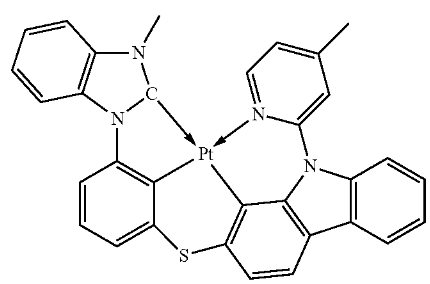
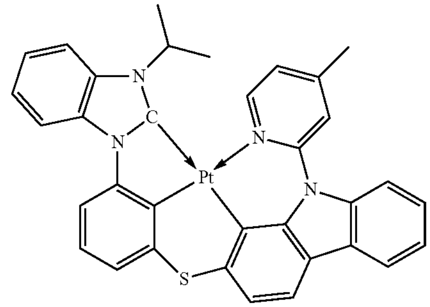

-continued
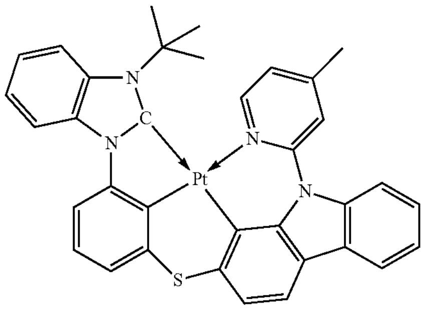
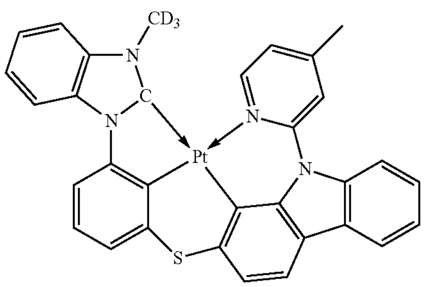
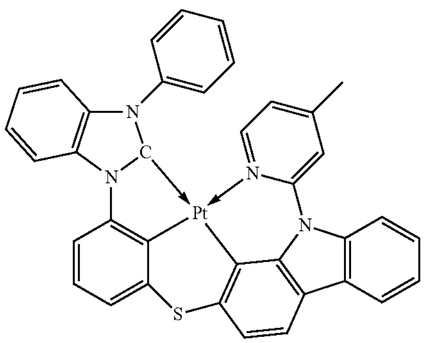
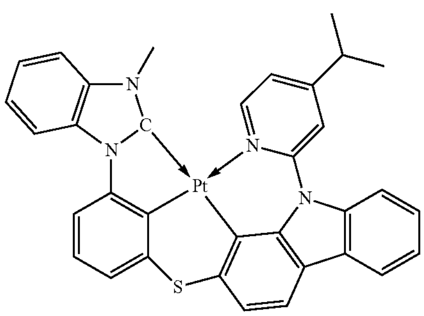
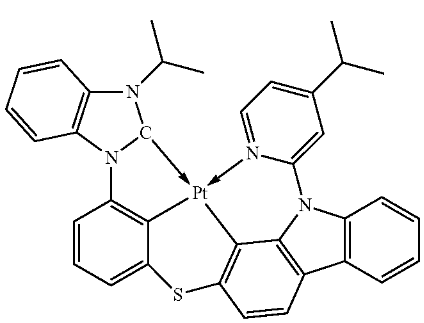
-continued
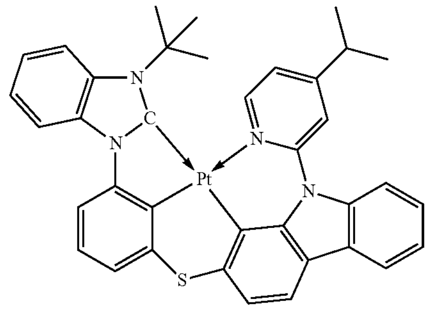
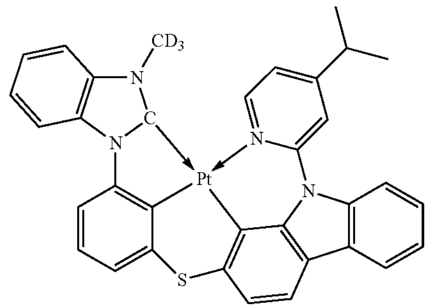
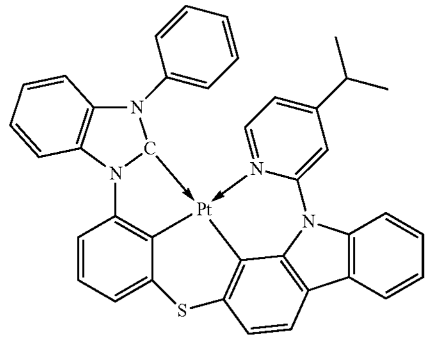
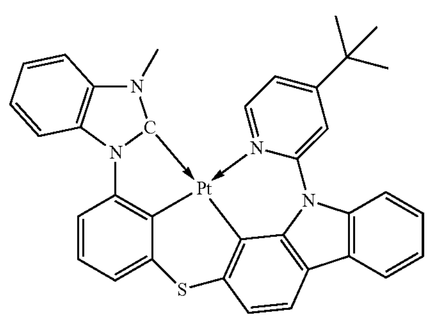
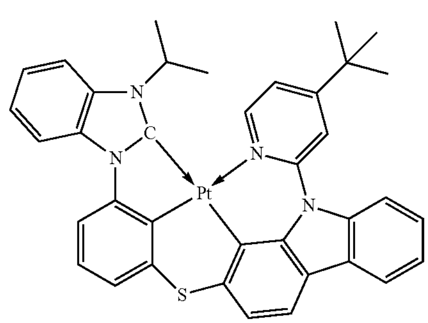

-continued
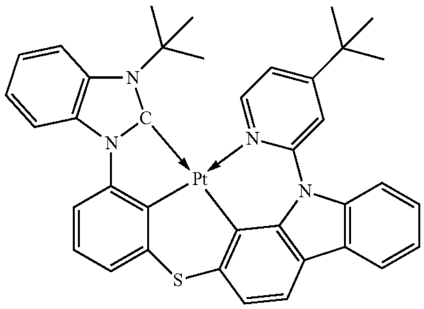
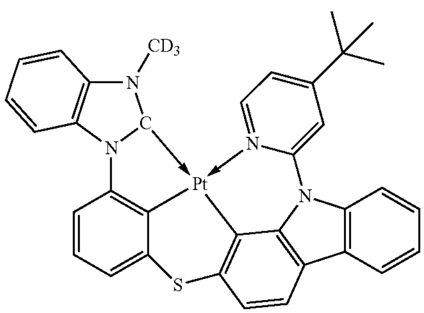
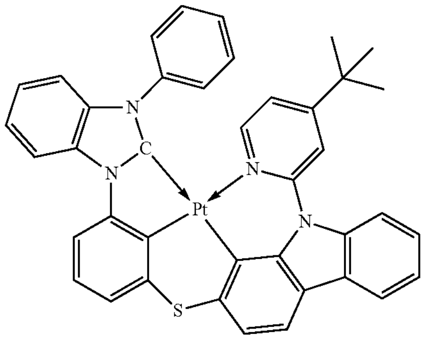
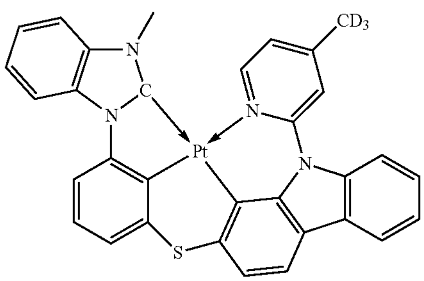
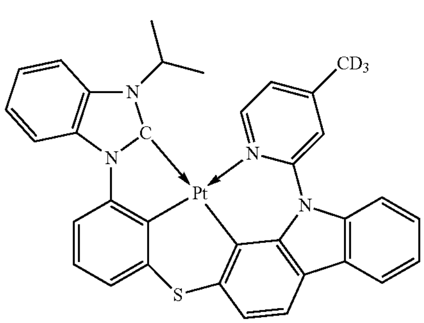
-continued
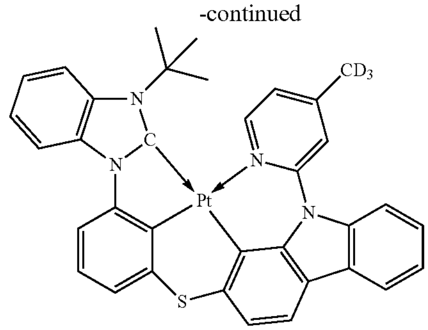
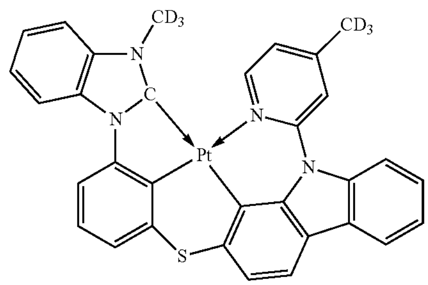
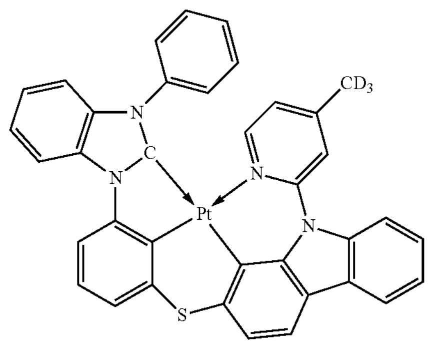
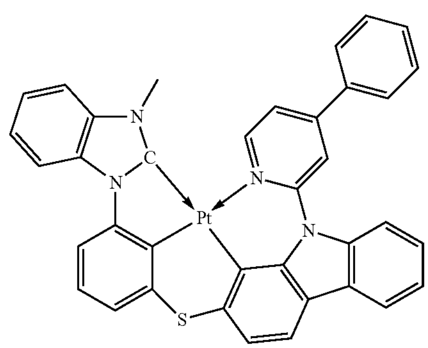
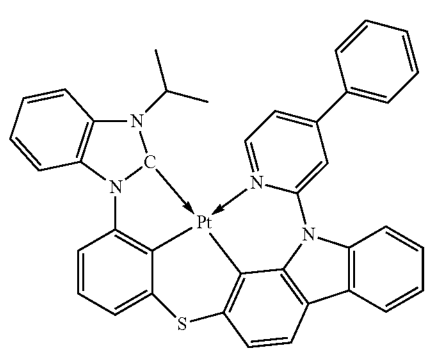

-continued
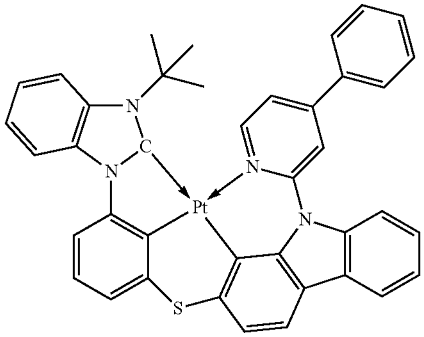
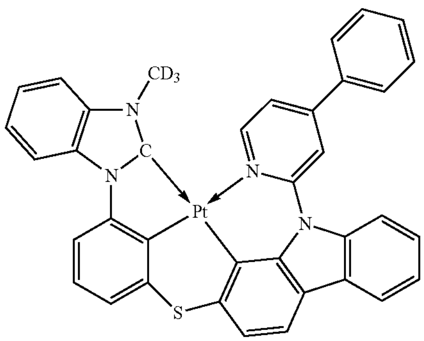
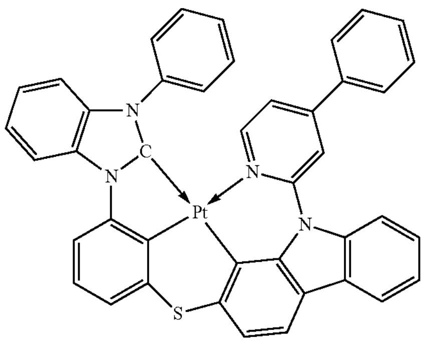
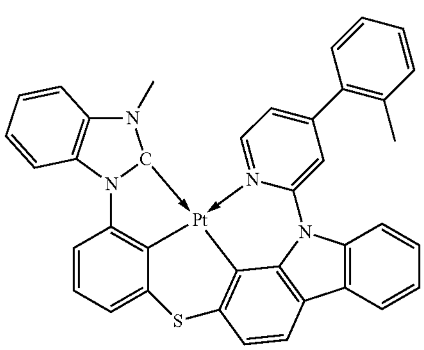
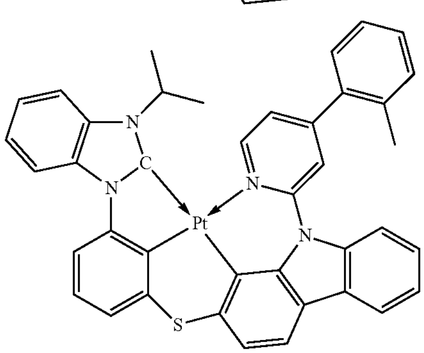
-continued
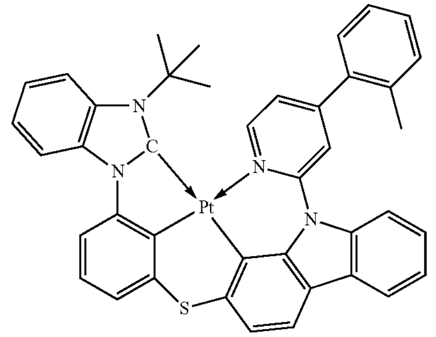
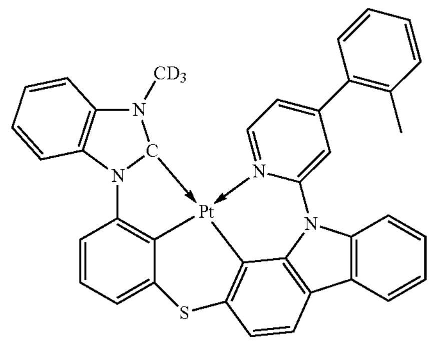
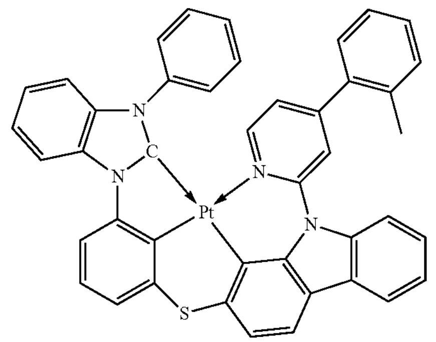
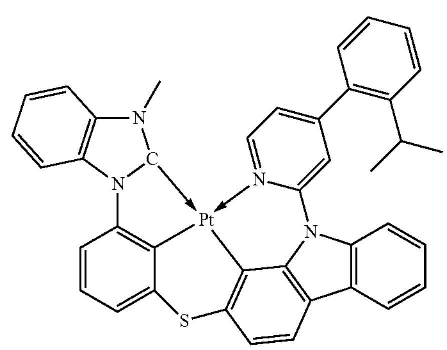
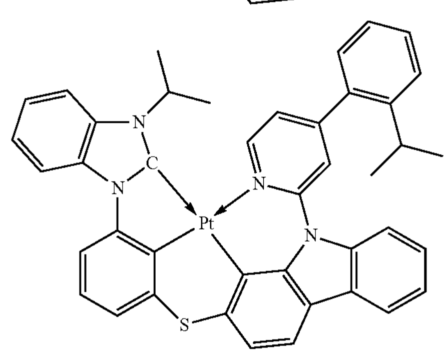

-continued
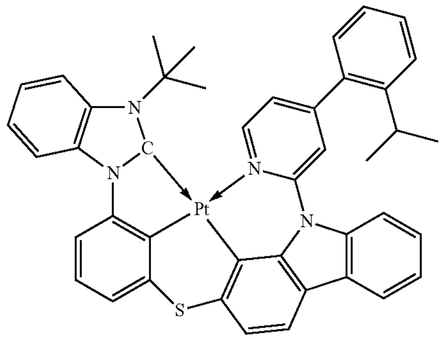
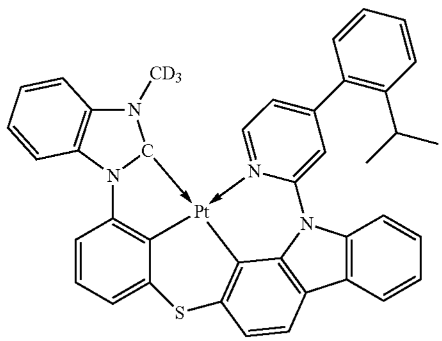
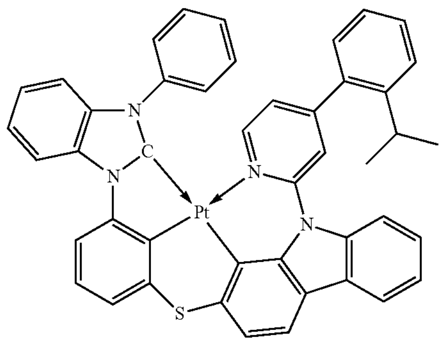
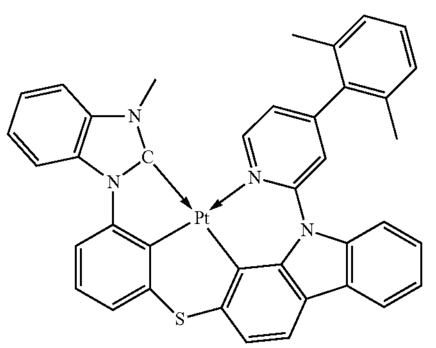
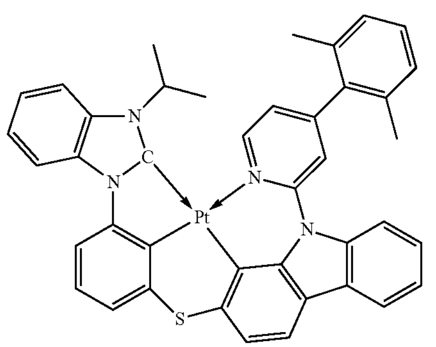
-continued
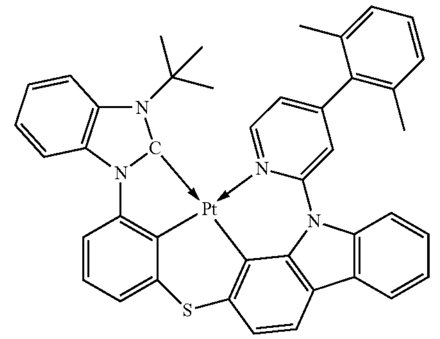
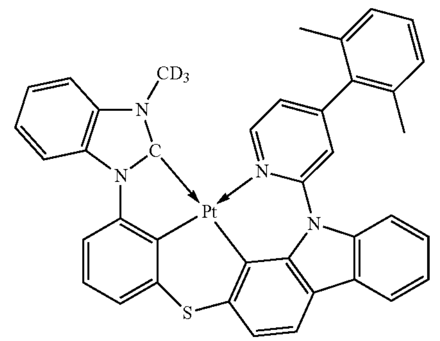
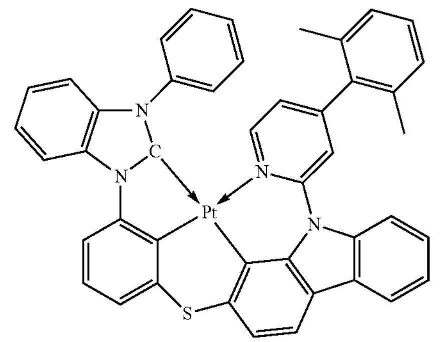
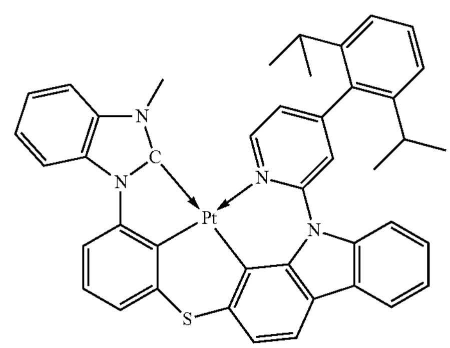
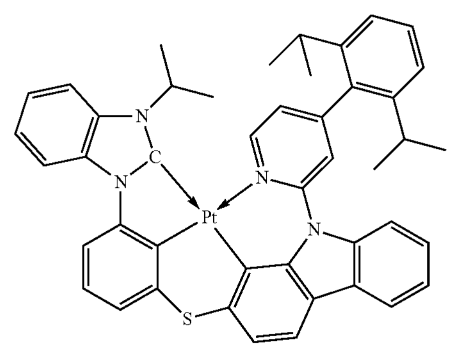

-continued
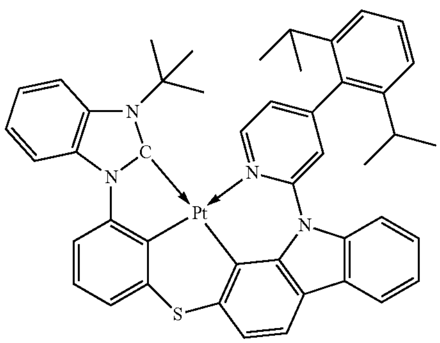
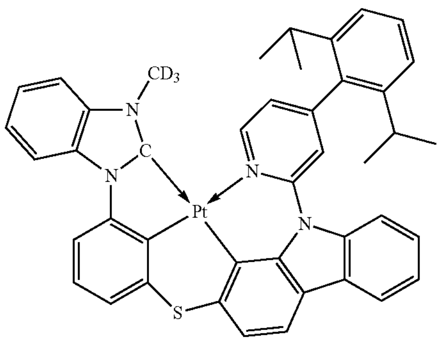
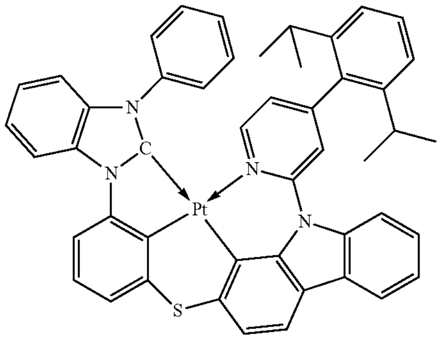
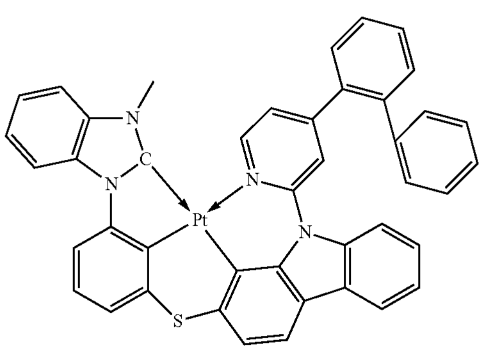
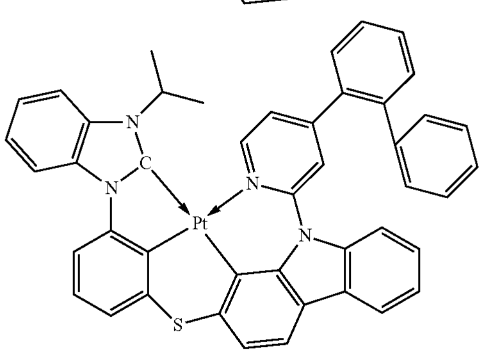
-continued
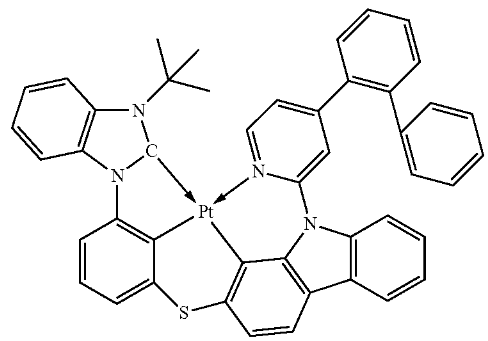
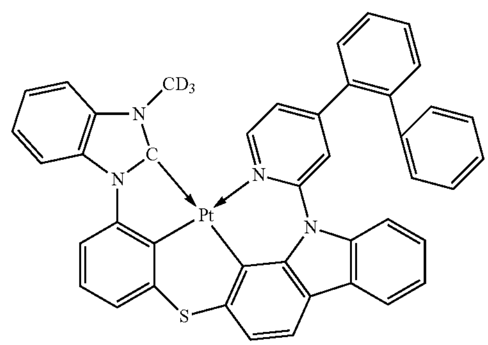
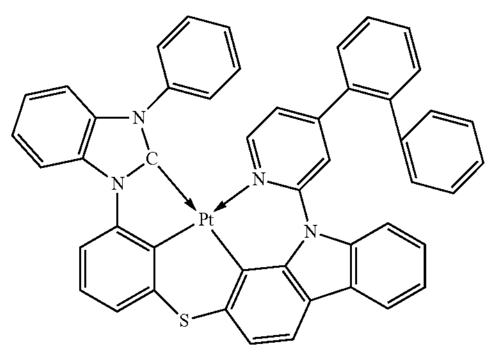
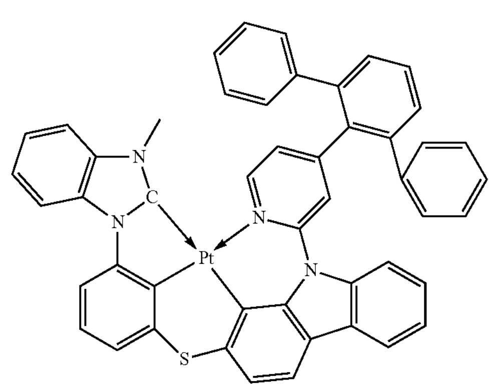

-continued
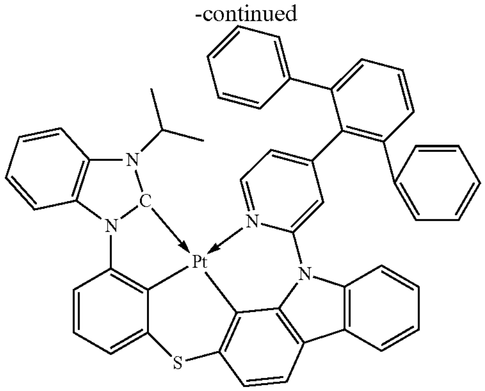
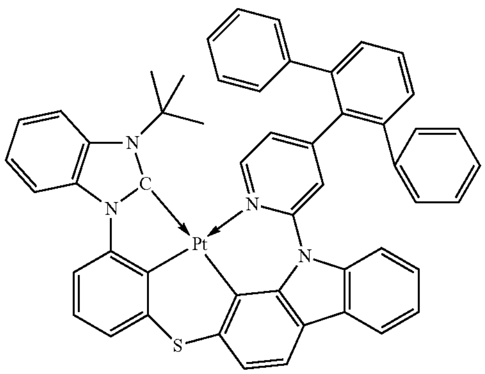
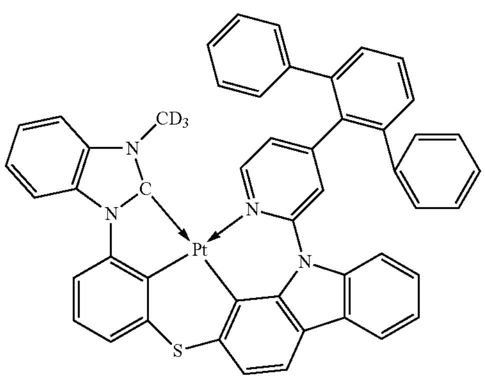
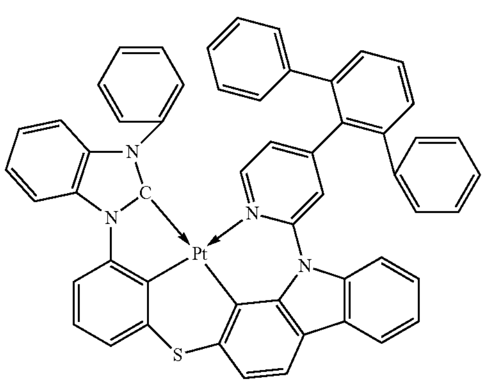
-continued
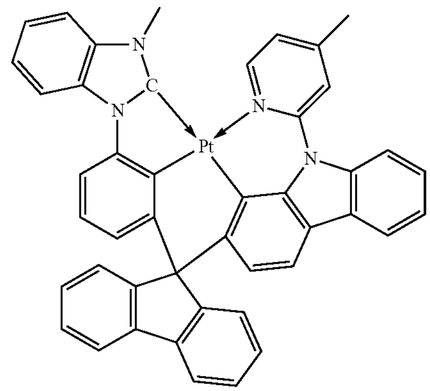
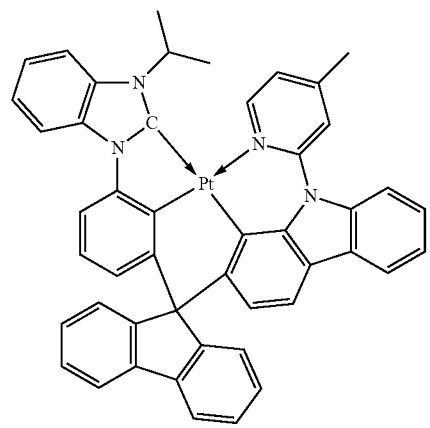
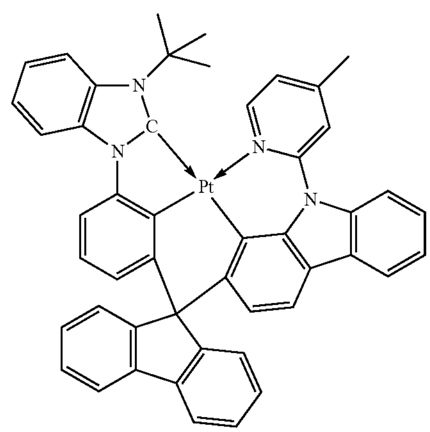
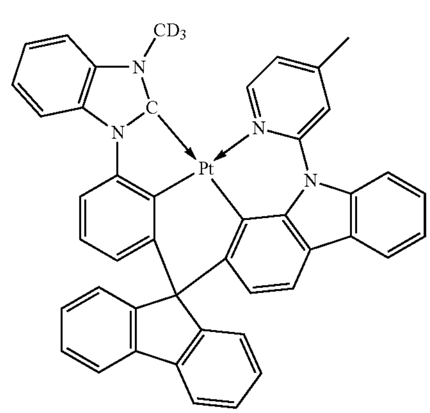

-continued
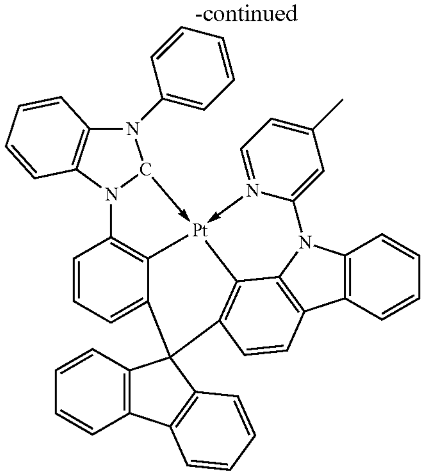
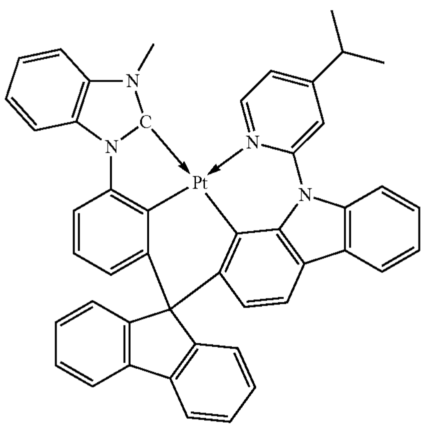
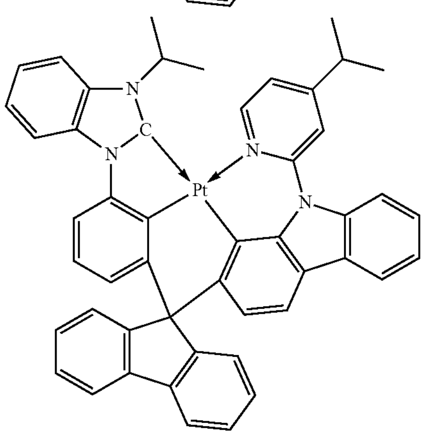
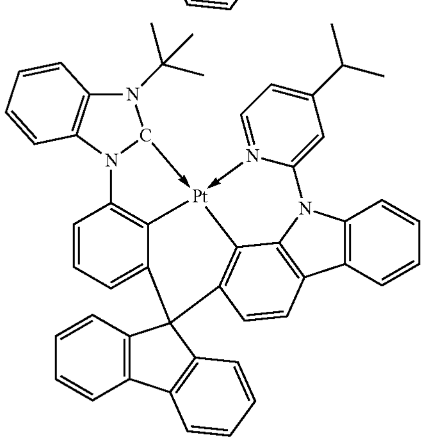
-continued
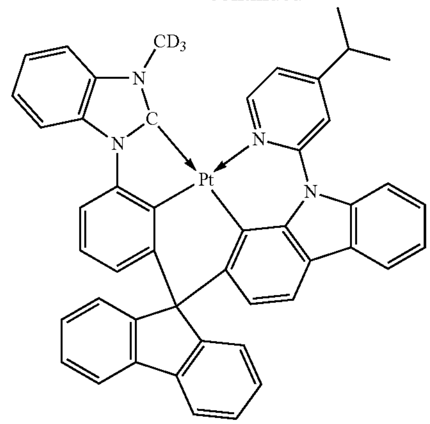
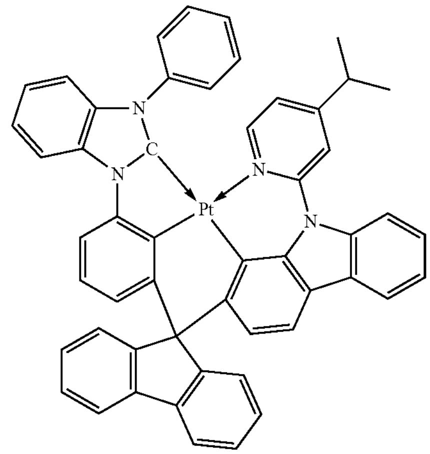
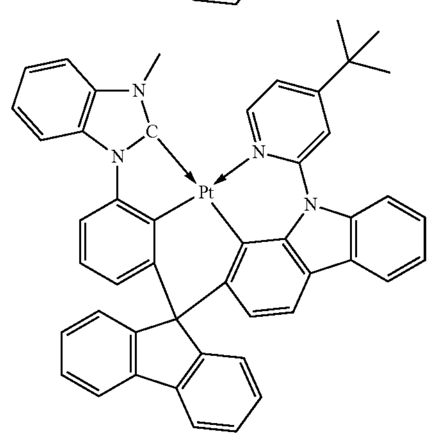
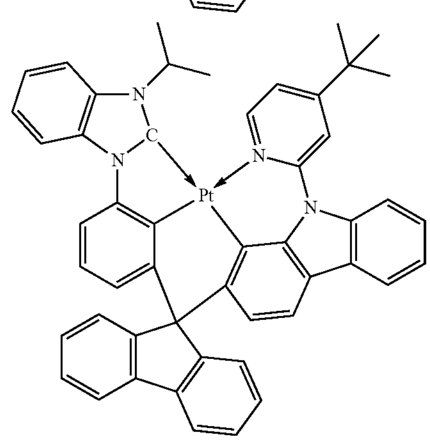

-continued
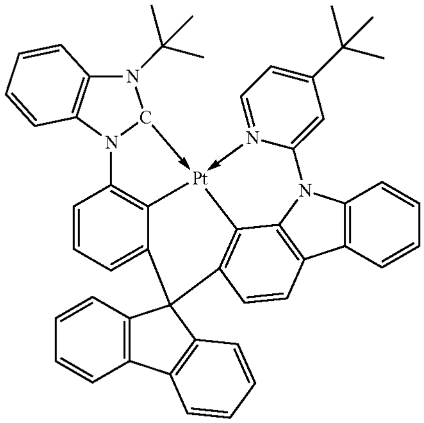
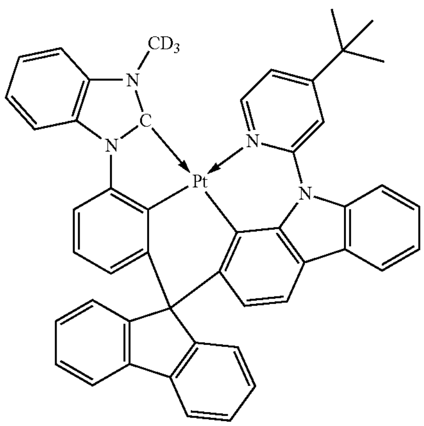
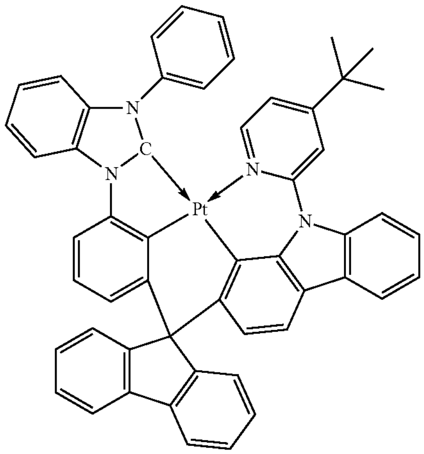
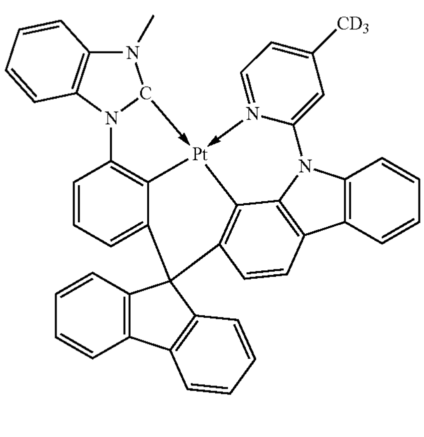
-continued
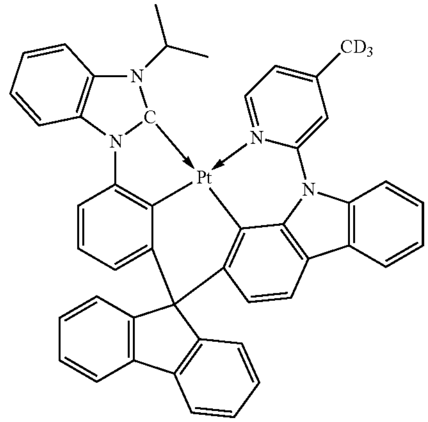
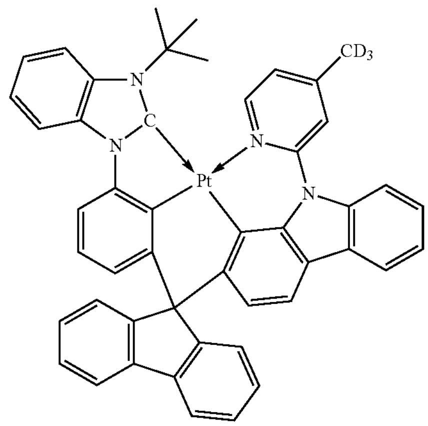
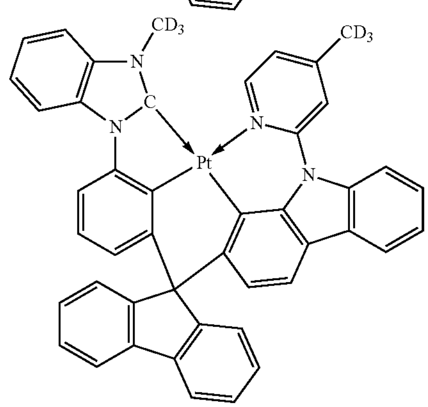
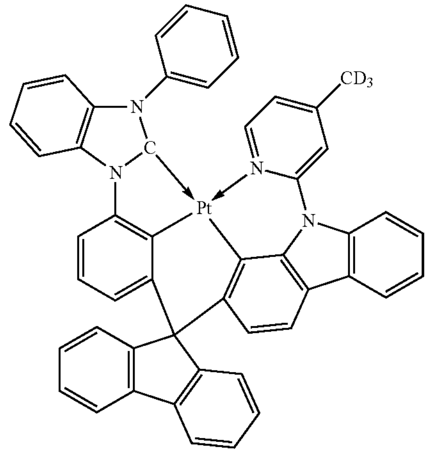

-continued
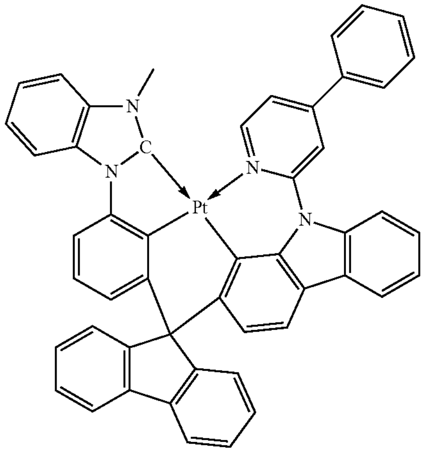
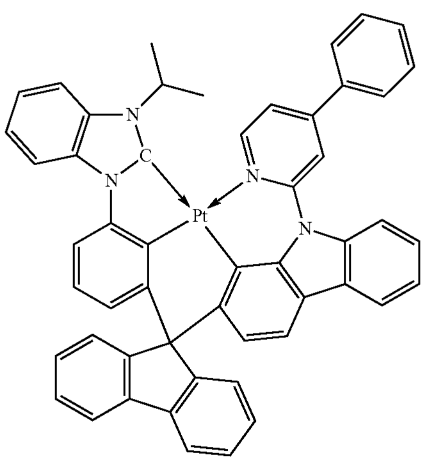
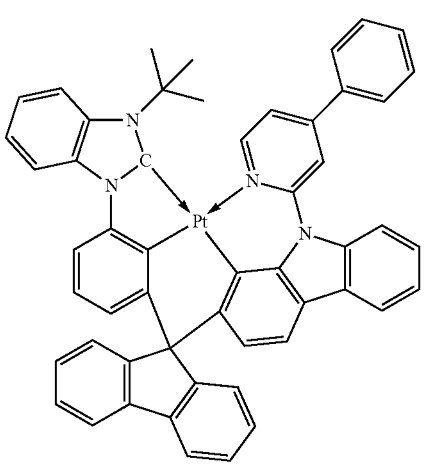
-continued
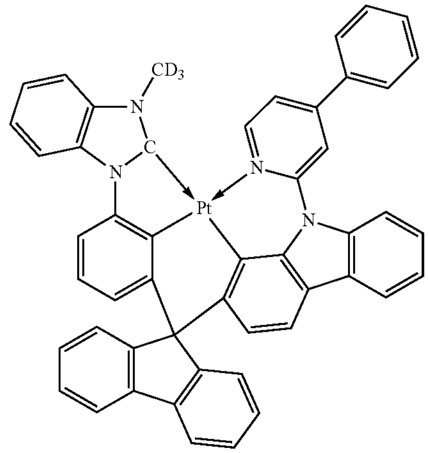
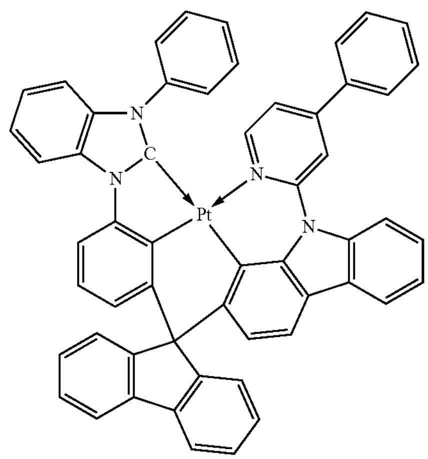
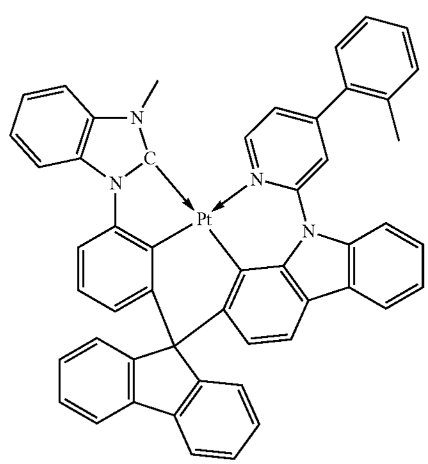

-continued
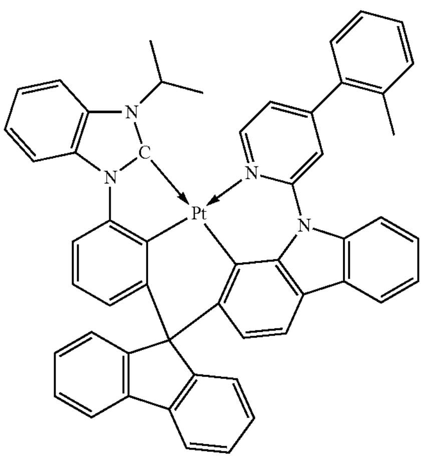
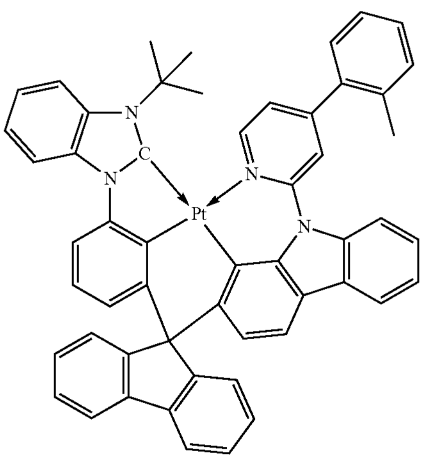
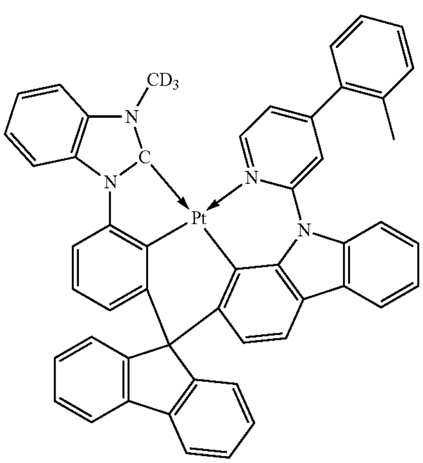
-continued
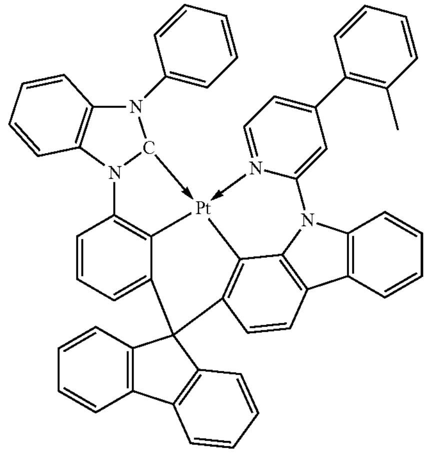
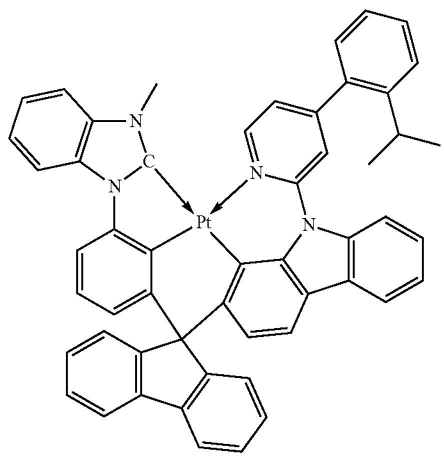
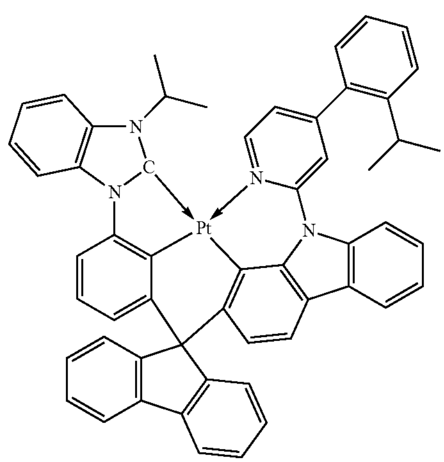

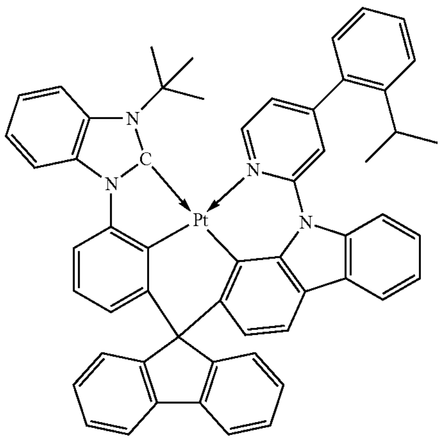
N
C
N
Pt
N
N
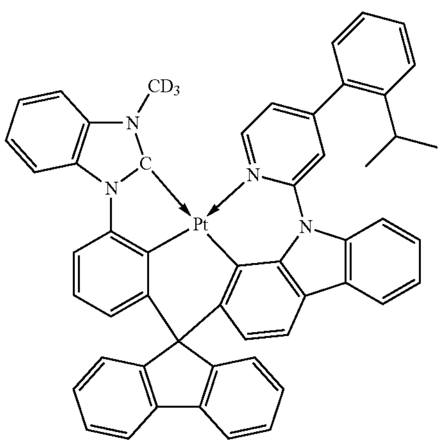
CD3
N
C
N
Pt
N
N
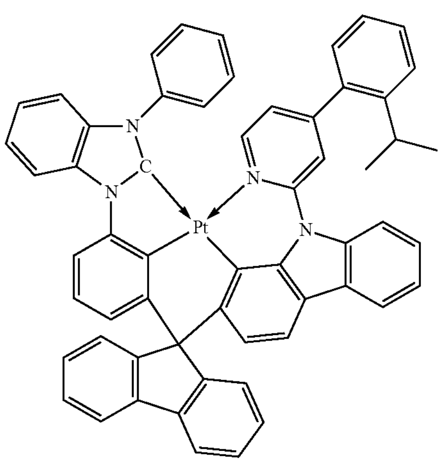
N
C
N
Pt
N
N
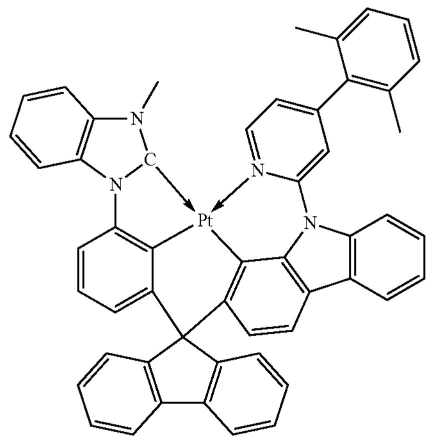
N
C
N
Pt
N
N
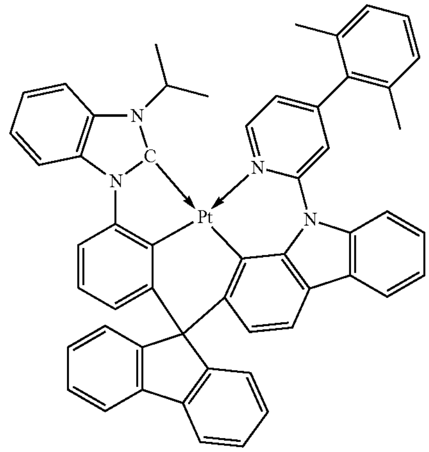
N
C
N
Pt
N
N
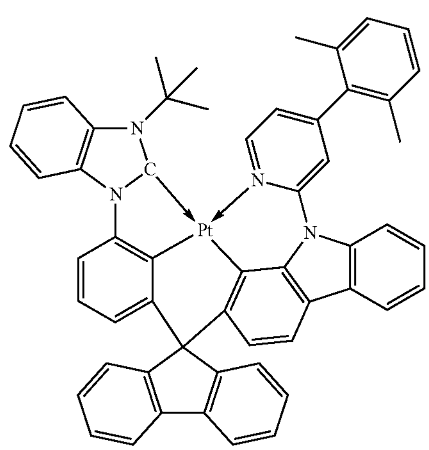
N
C
N
Pt
N
N

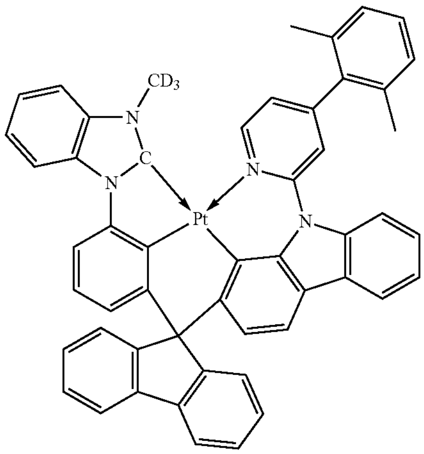
CD3
N
C
N
Pt
N
N
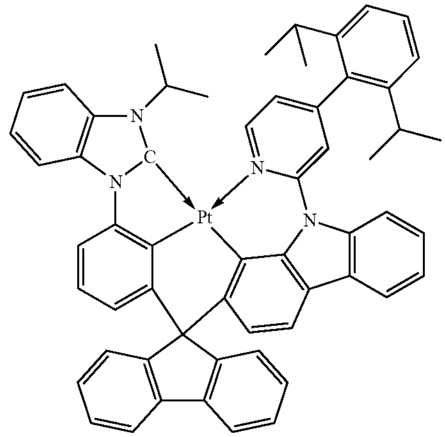
N
C
N
Pt
N
N
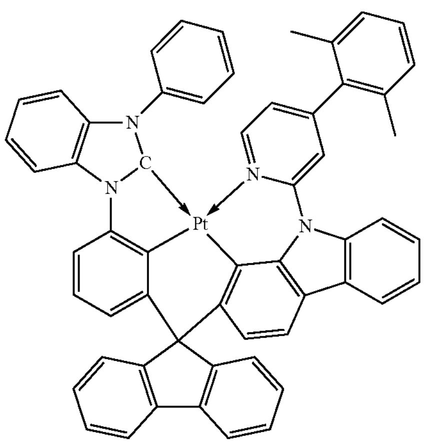
N
C
N
Pt
N
N
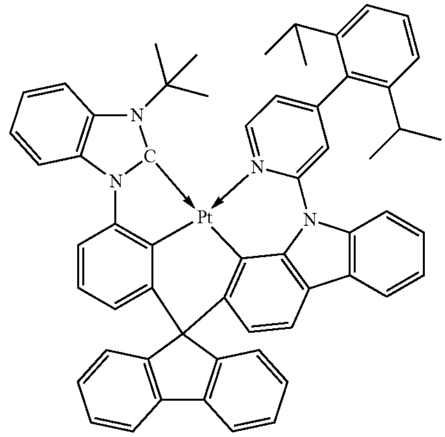
N
C
N
Pt
N
N
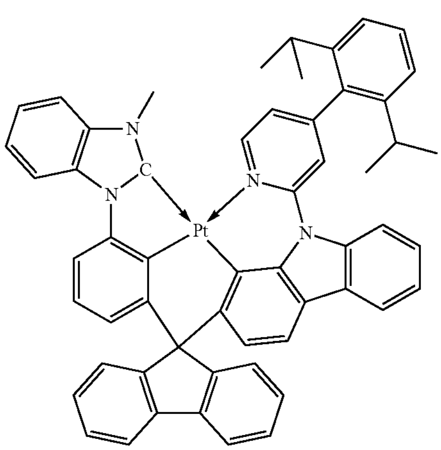
N
C
N
Pt
N
N
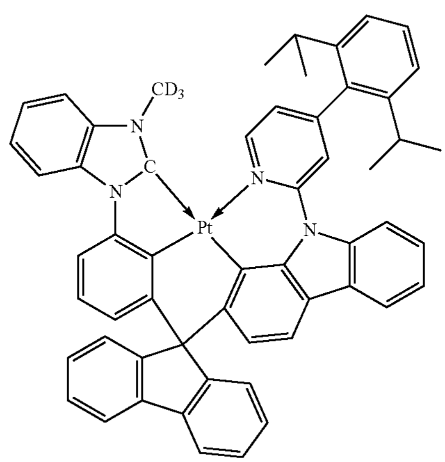
CD3
N
C
N
Pt
N
N -continued
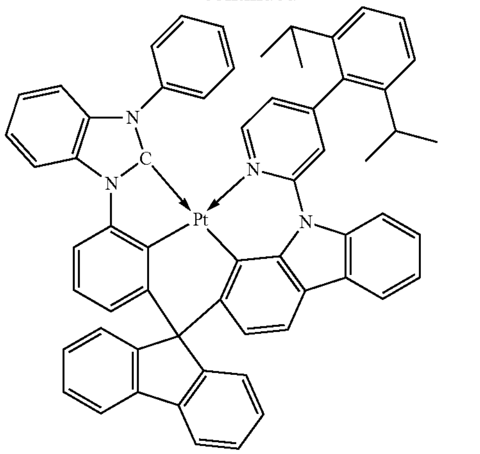
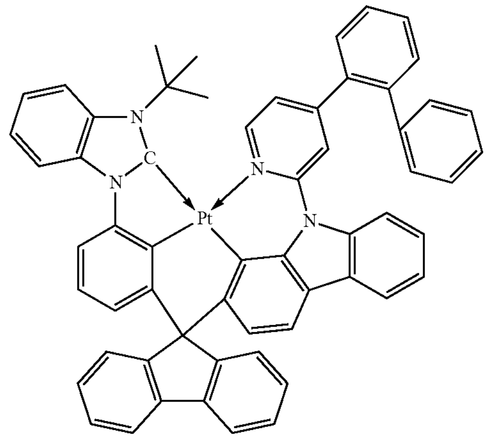
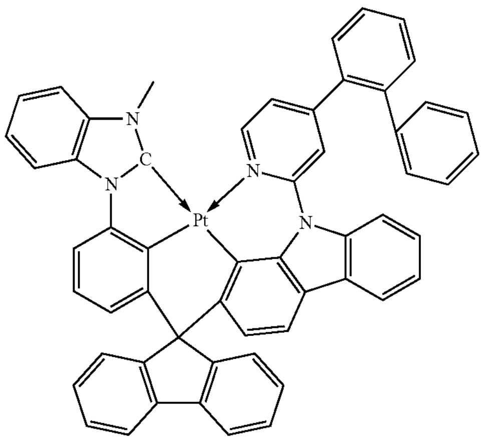
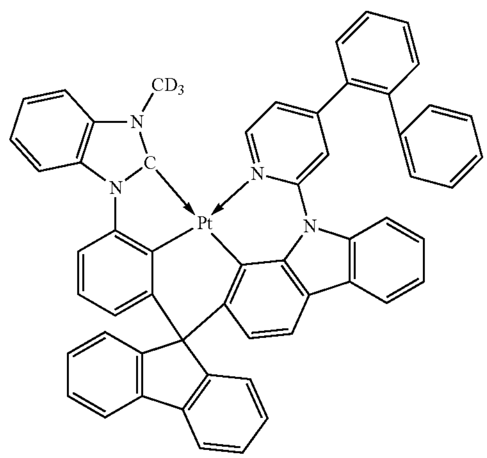
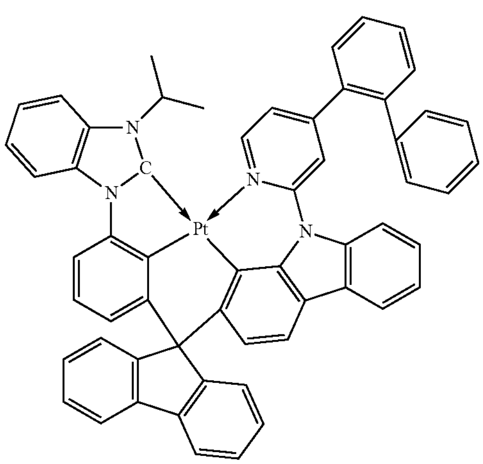
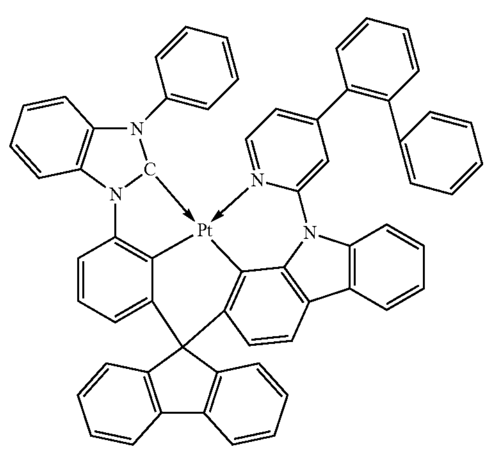

-continued
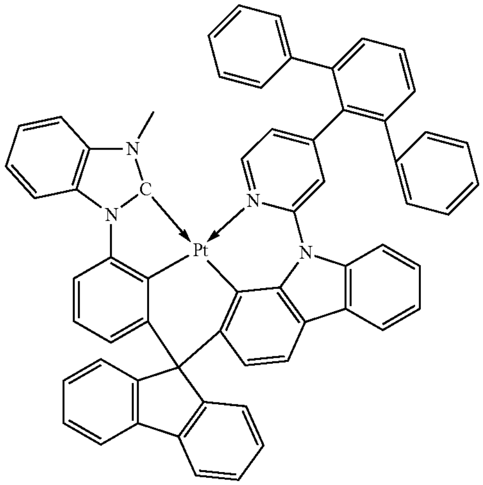
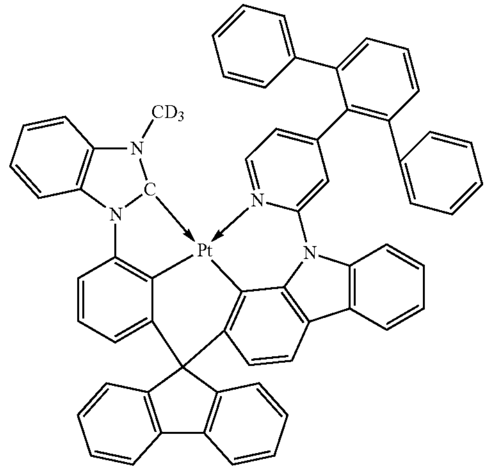
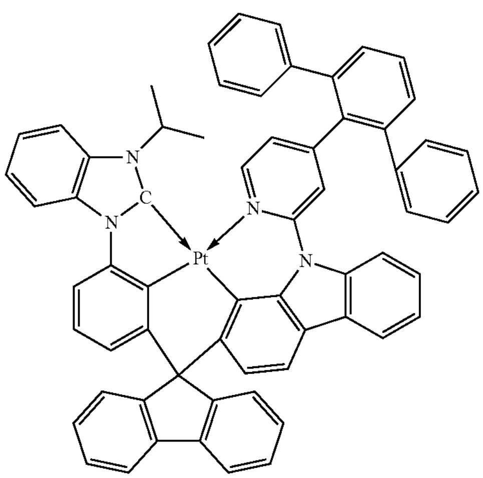
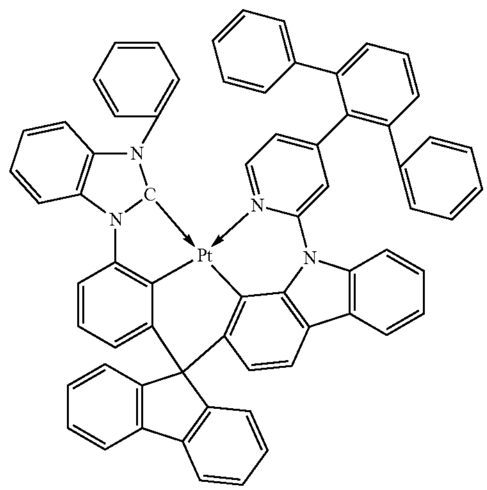
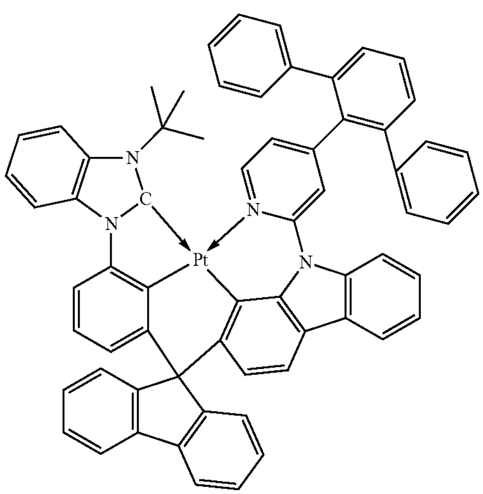
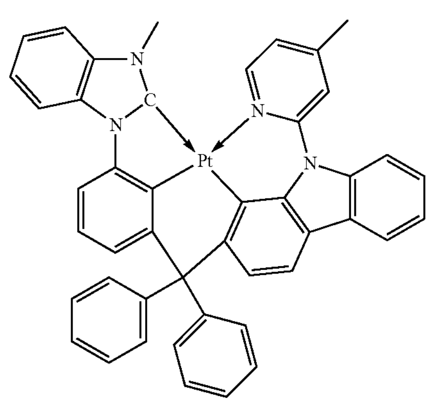

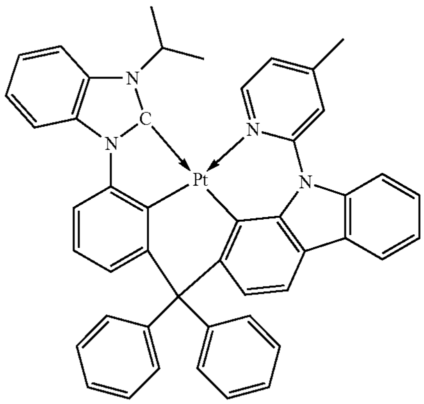
N
C
N
Pt
N
N
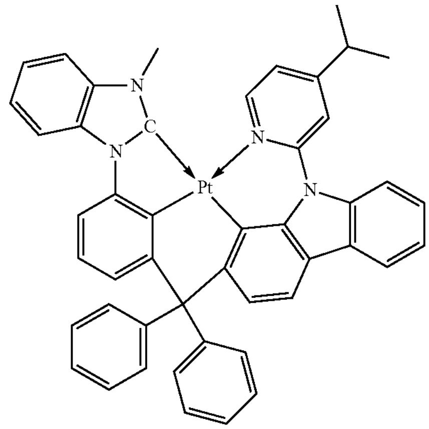
N
C
N
Pt
N
N
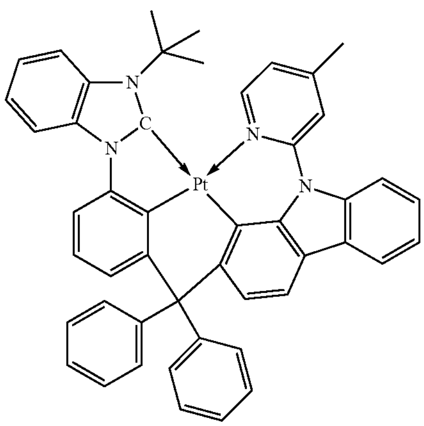
N
C
N
Pt
N
N
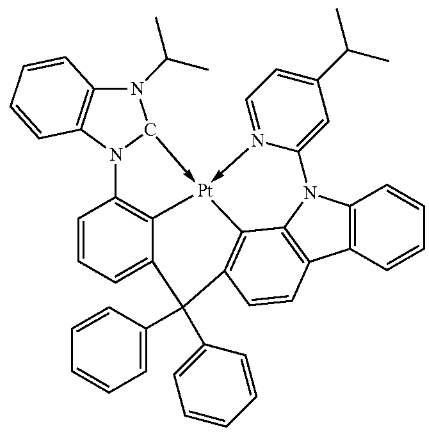
N
C
N
Pt
N
N
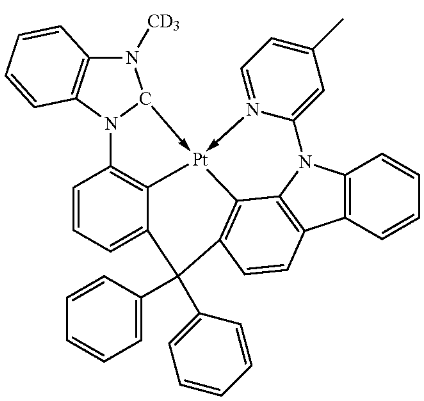
CD3
N
C
N
Pt
N
N
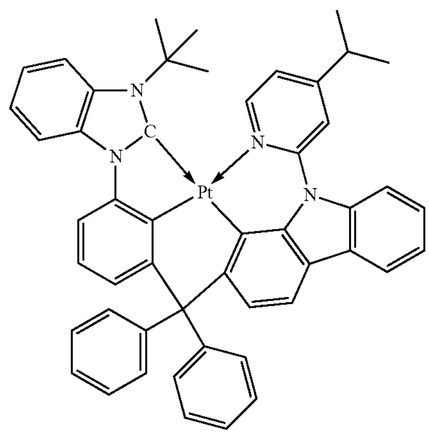
N
C
N
Pt
N
N
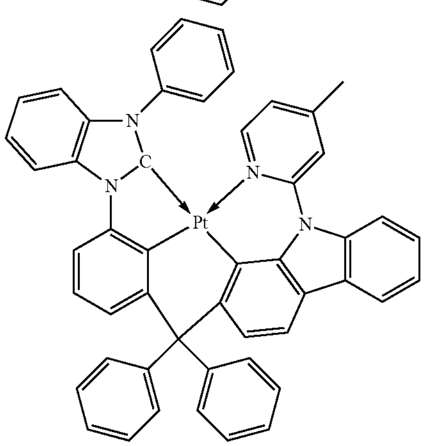
N
C
N
Pt
N
N
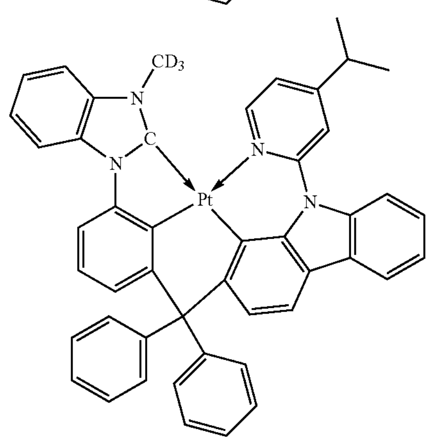
CD3
N
C
N
Pt
N
N -continued
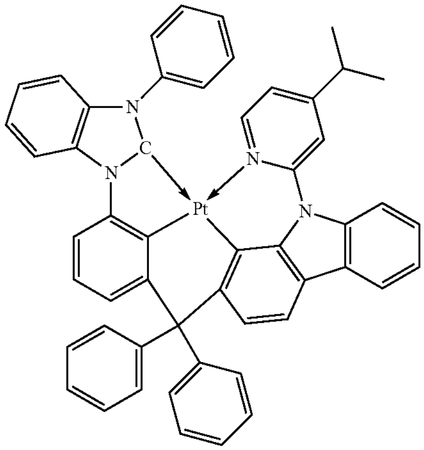
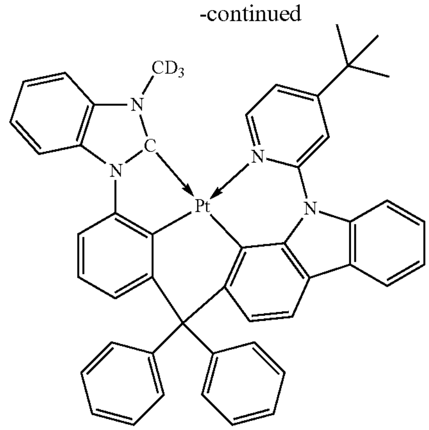
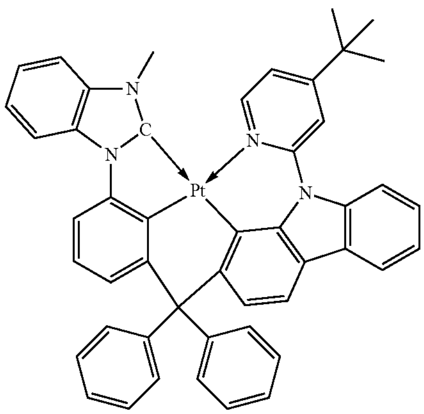
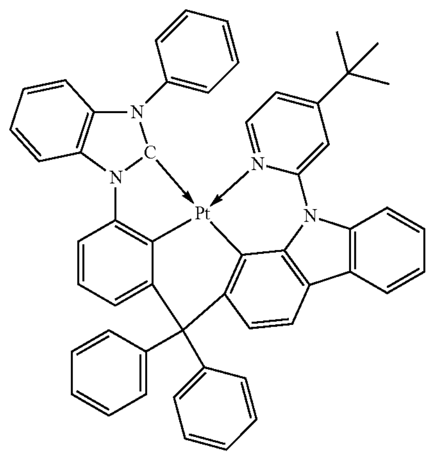
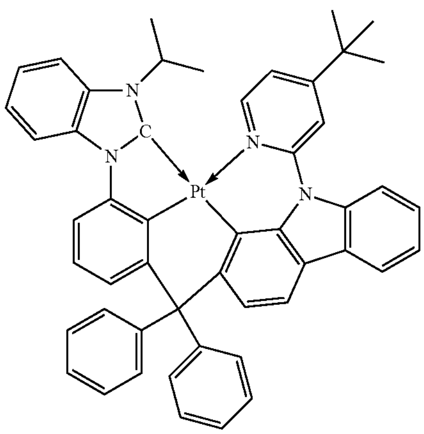
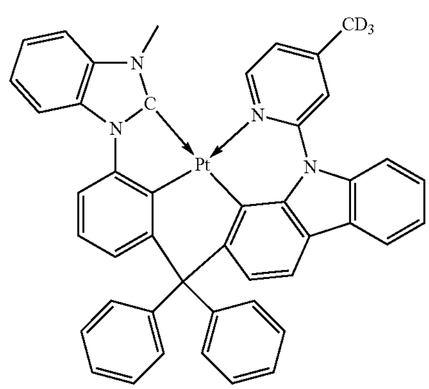
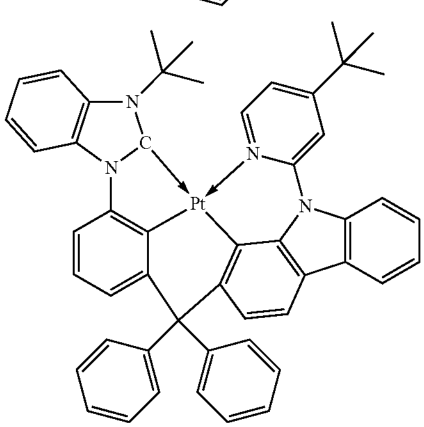
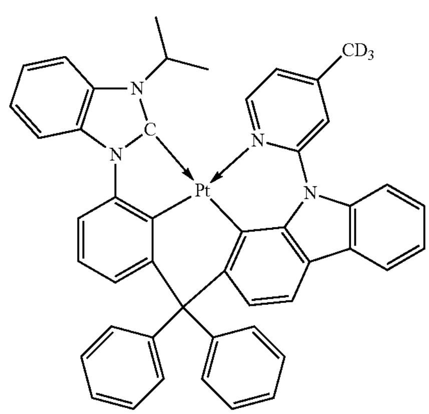

-continued
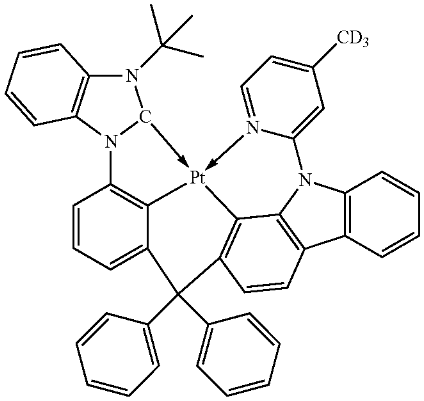
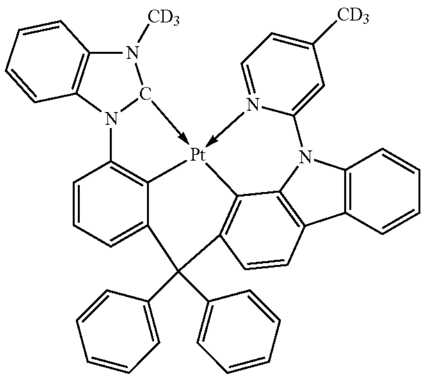
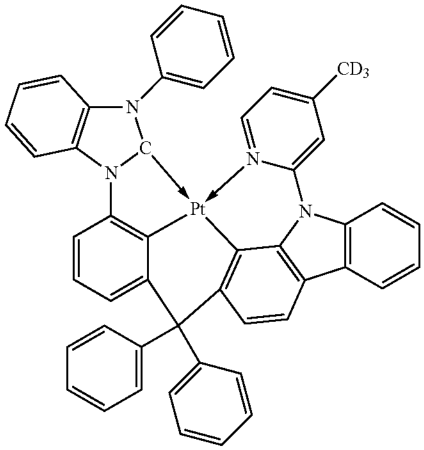
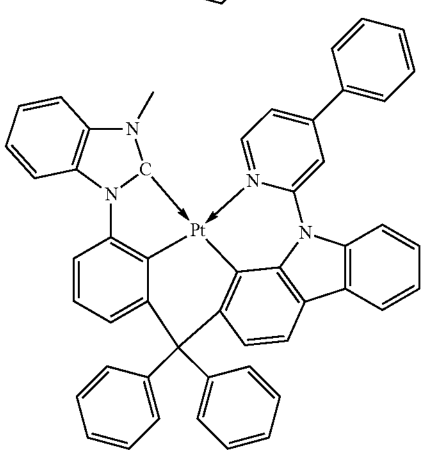
-continued
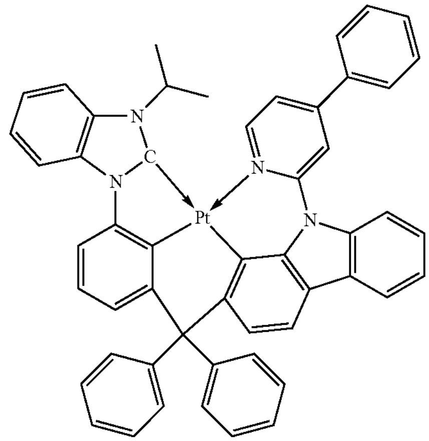
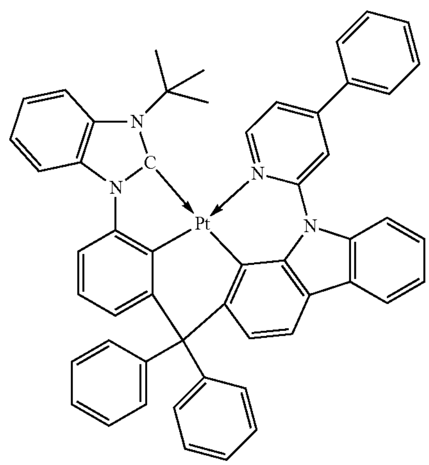
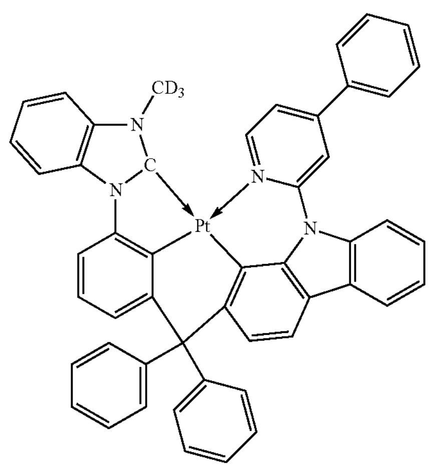

-continued
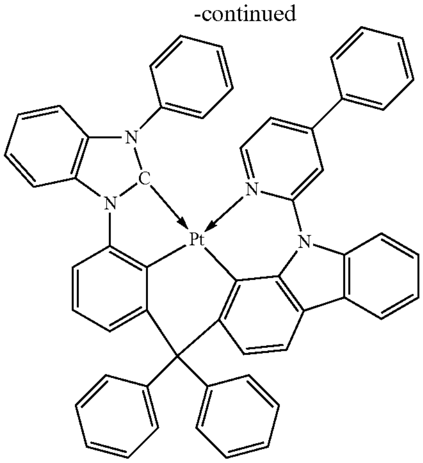
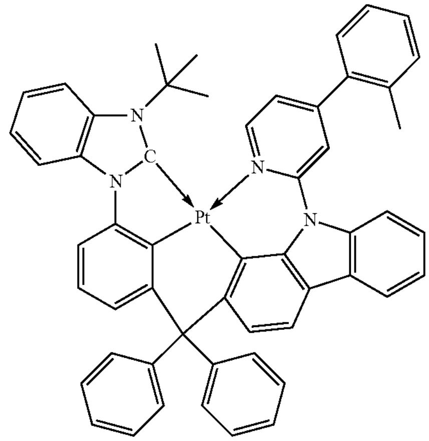
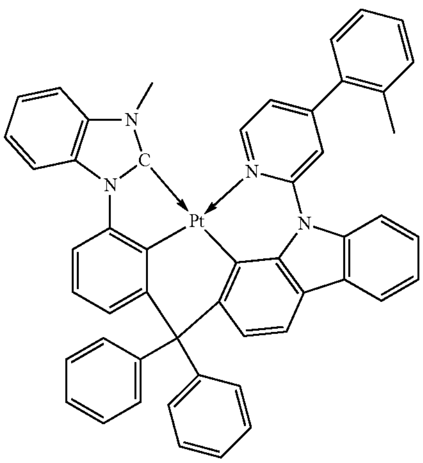
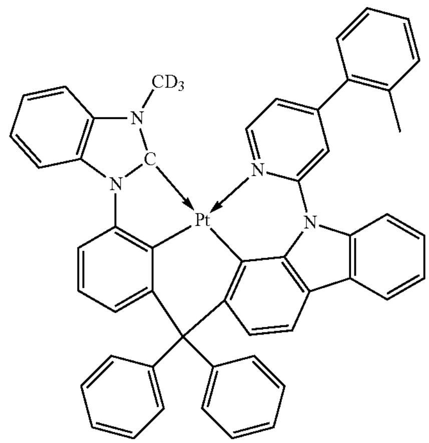
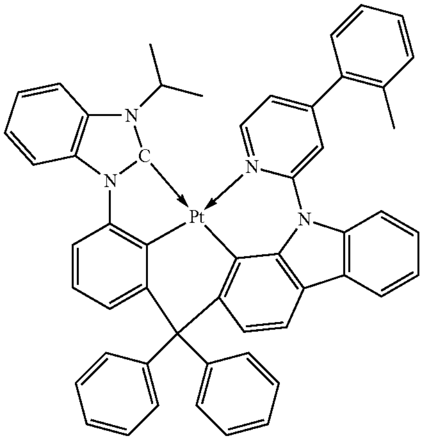
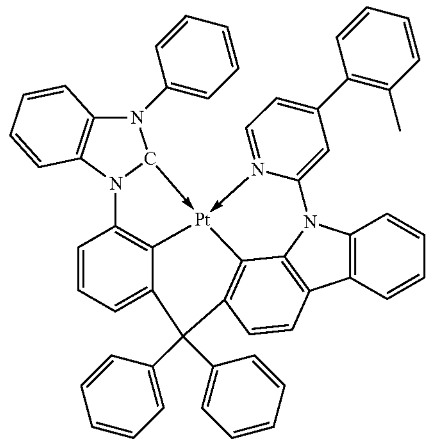
-continued -continued
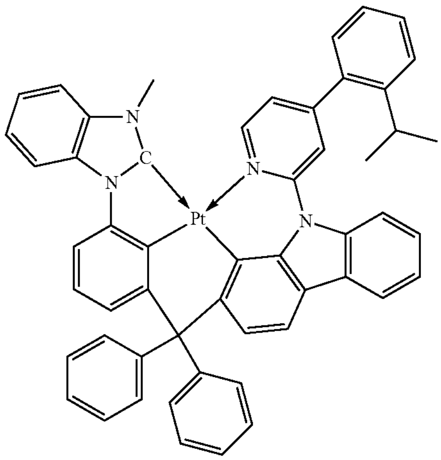
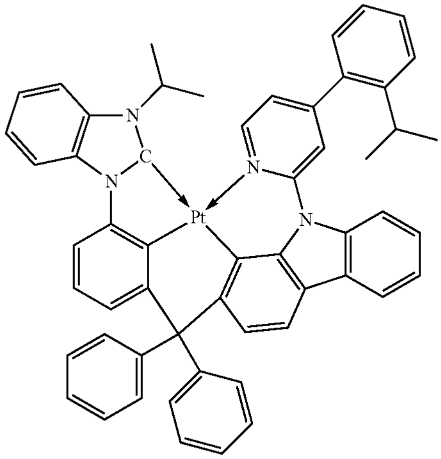
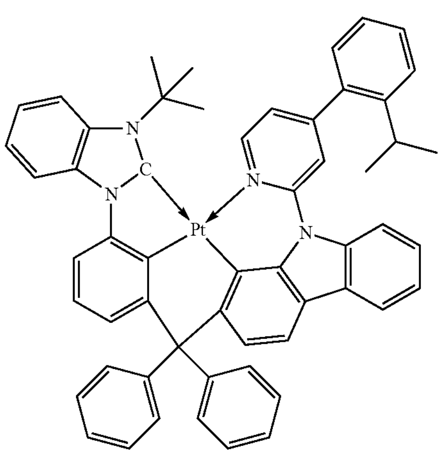
-continued
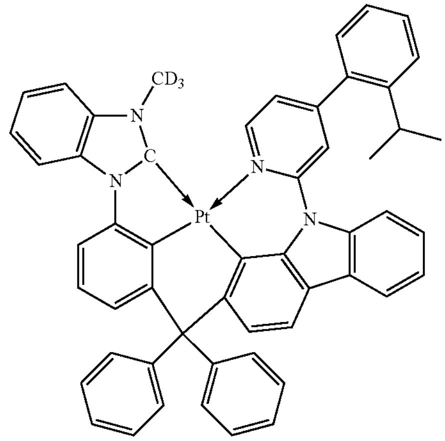
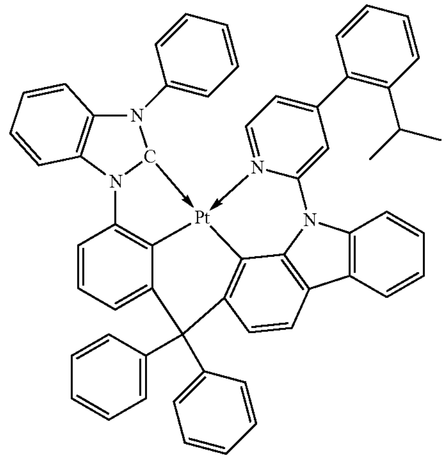
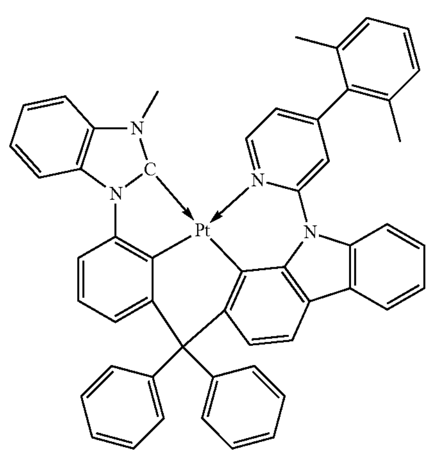

-continued
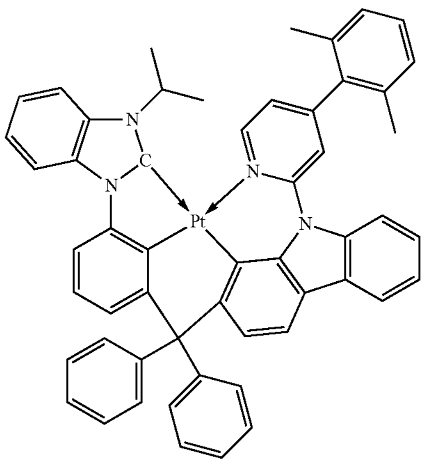
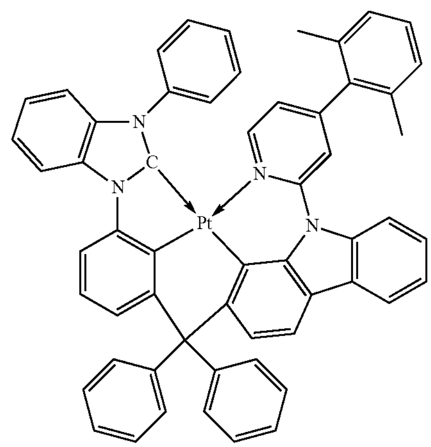
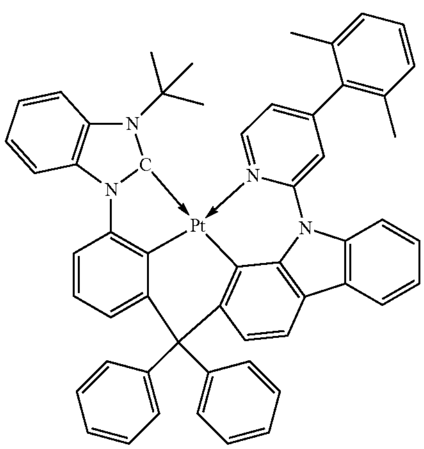
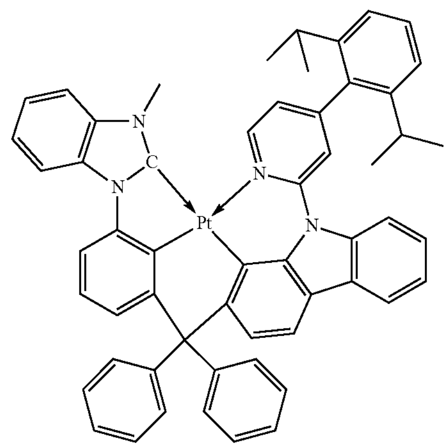
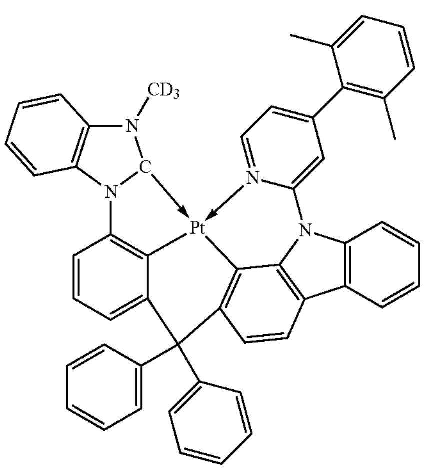
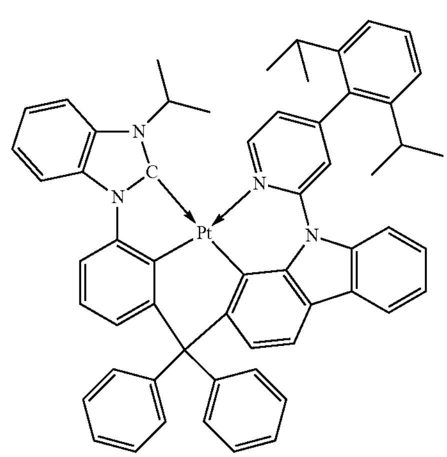

-continued
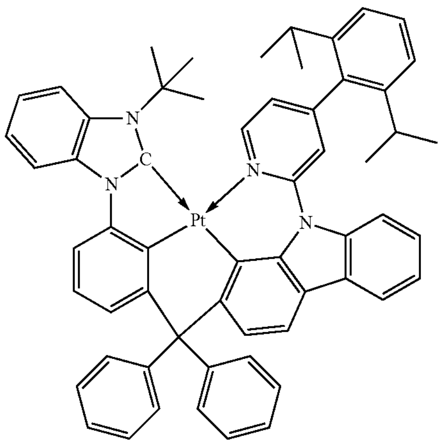
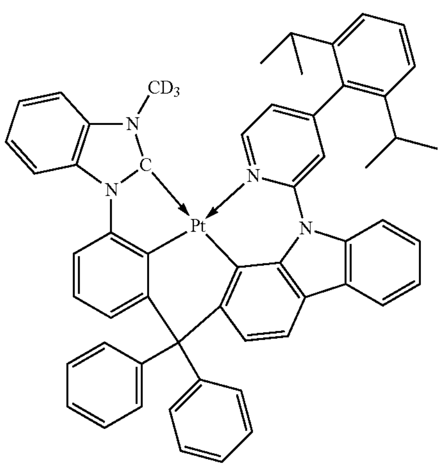
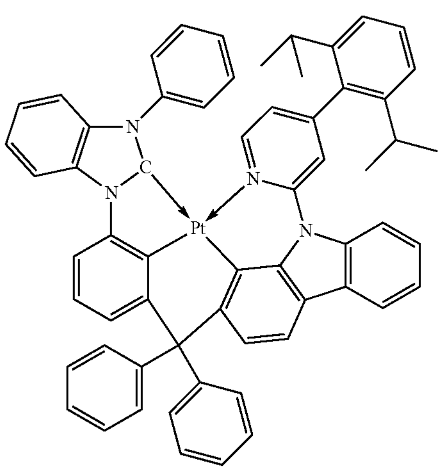
-continued
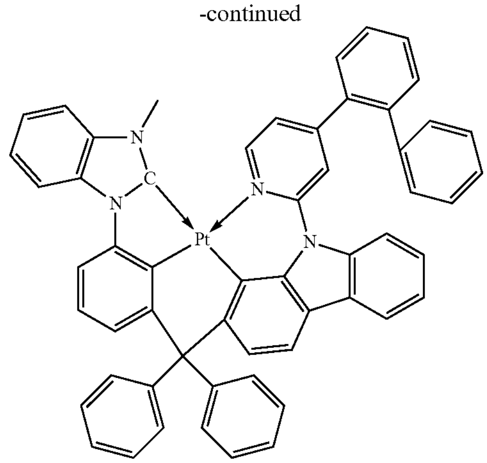
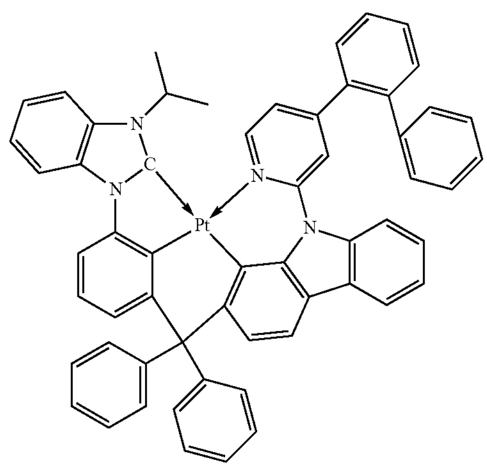
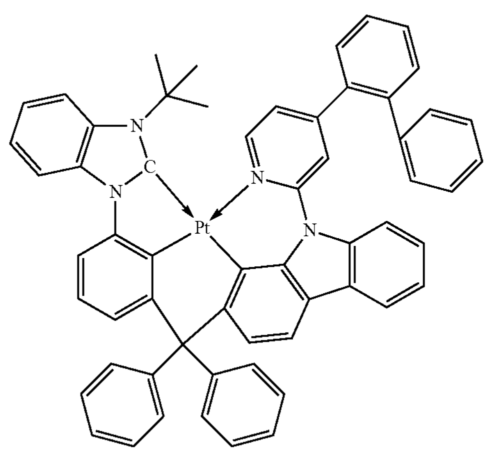

-continued
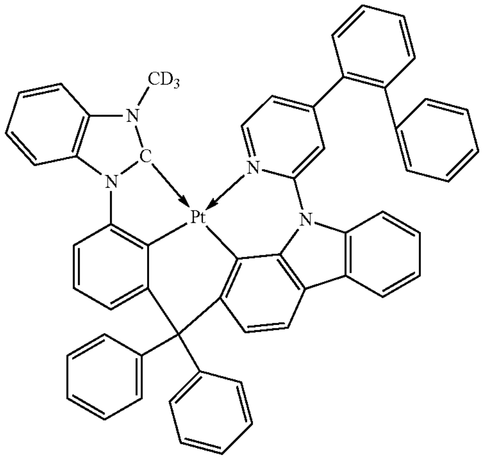
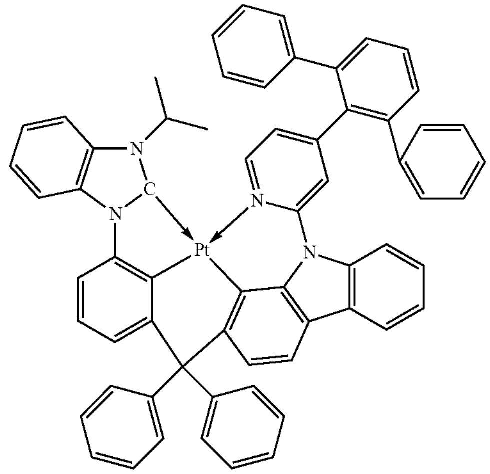
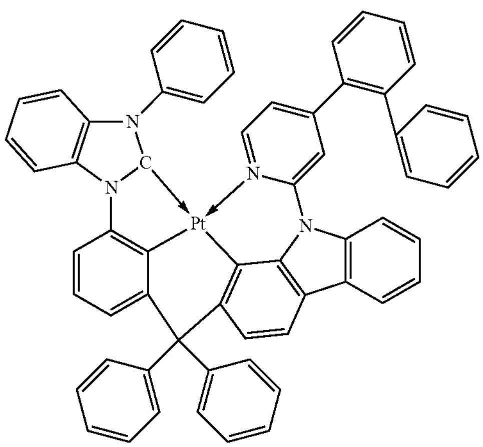
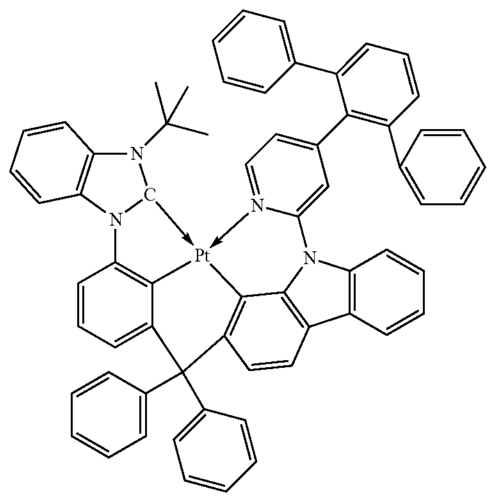
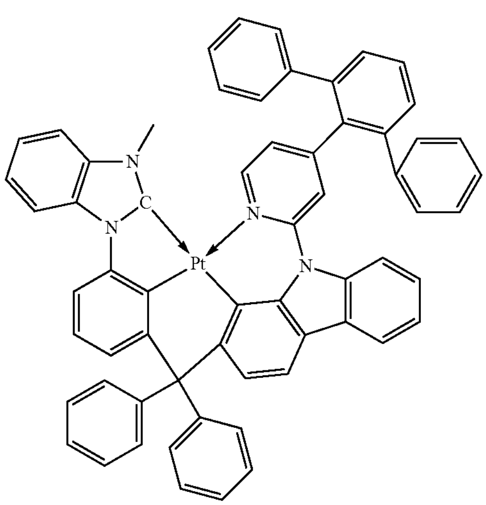
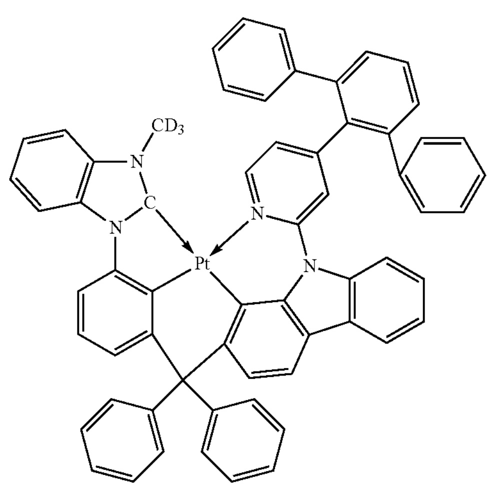

-continued
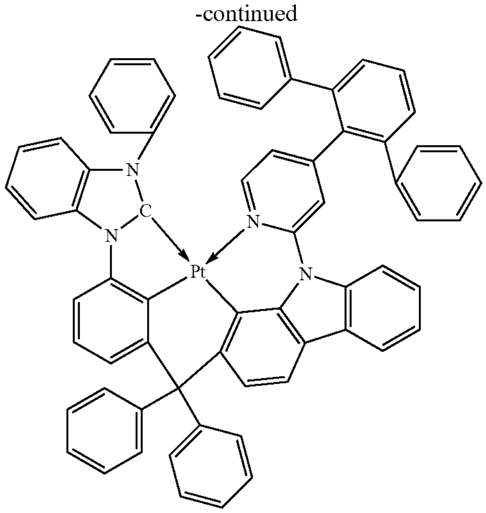
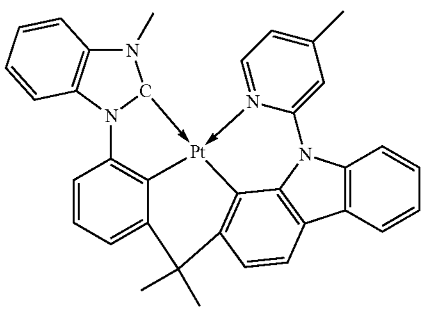
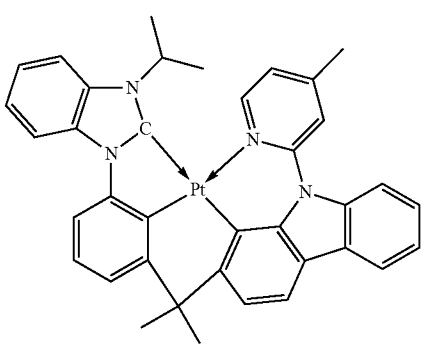
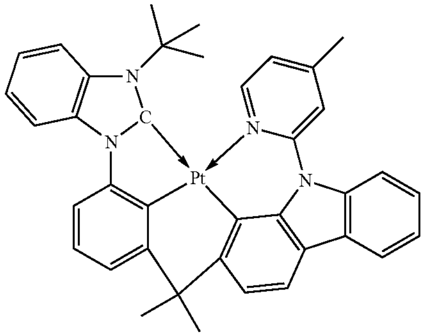
-continued
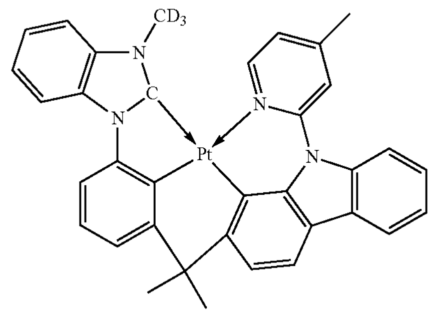
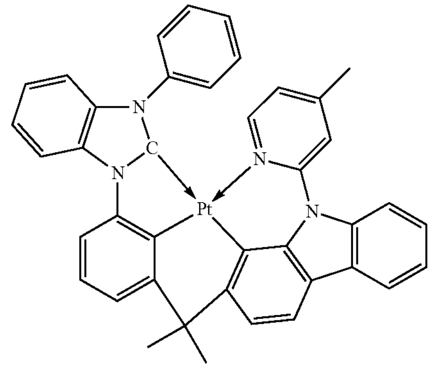
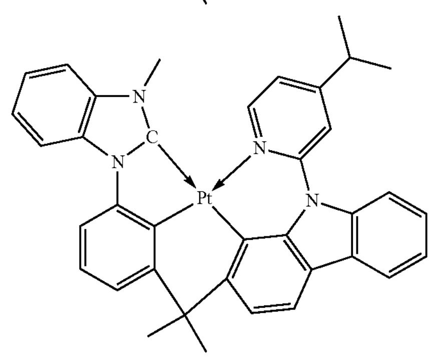
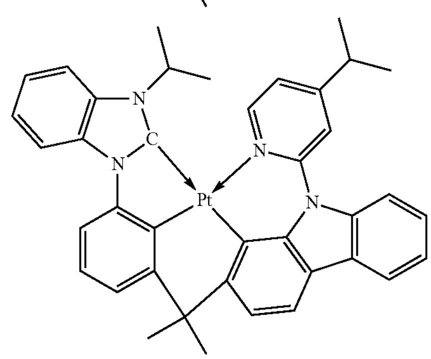
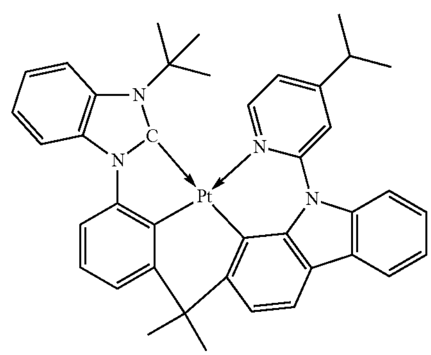

-continued
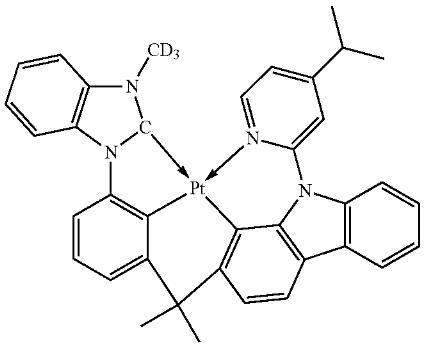
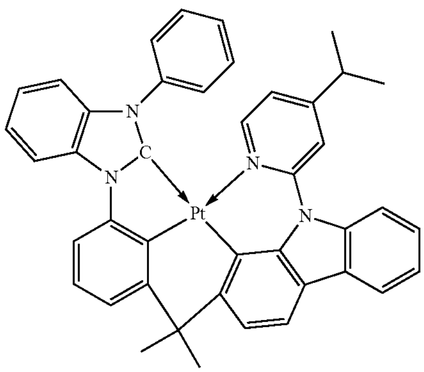
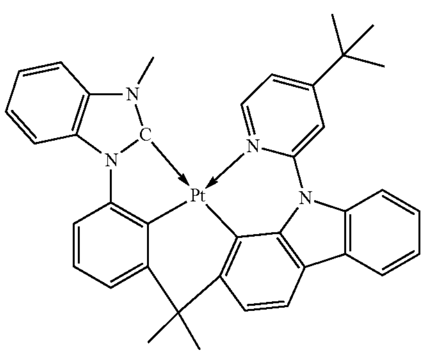
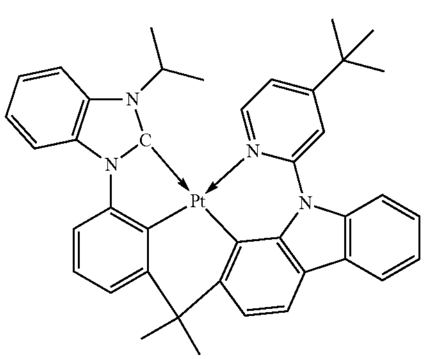
-continued
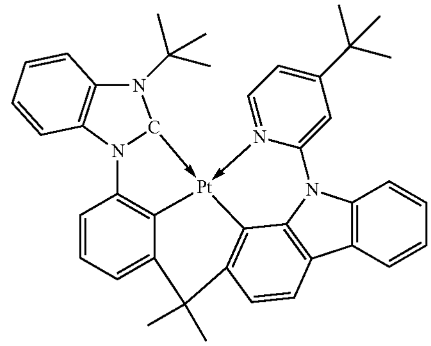
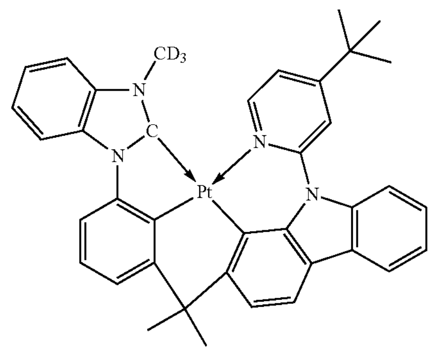
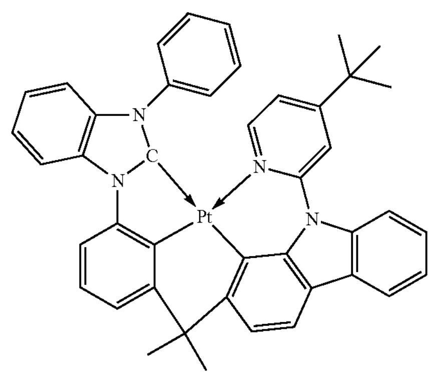
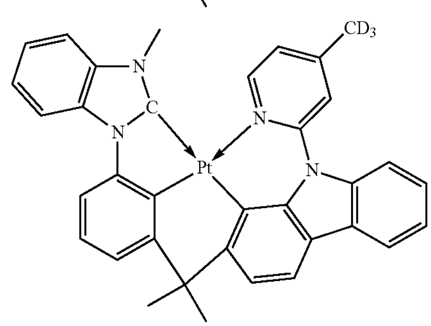
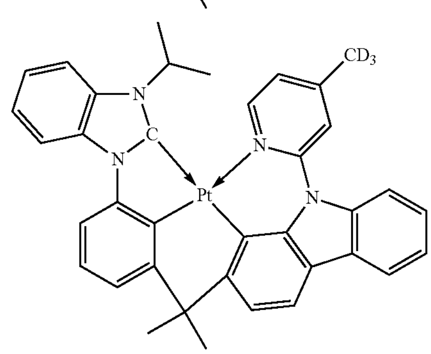

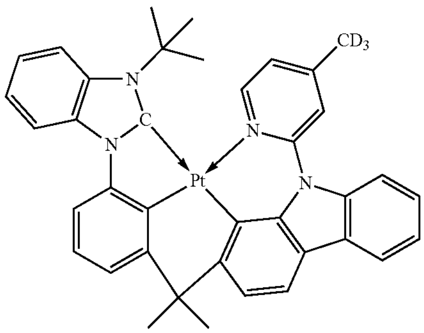
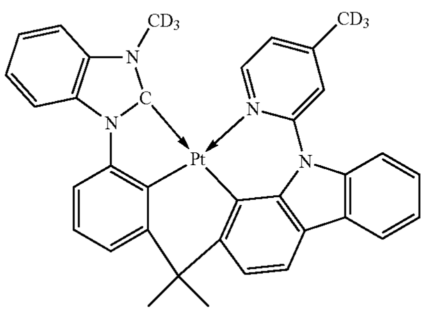
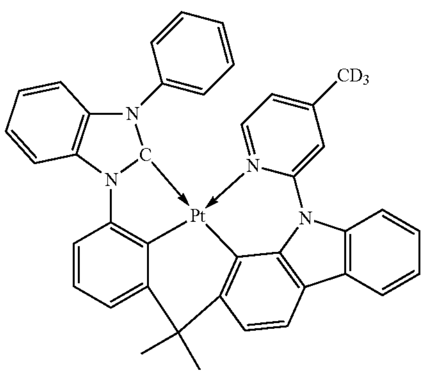
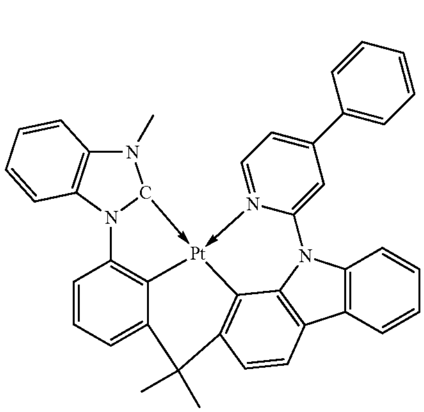
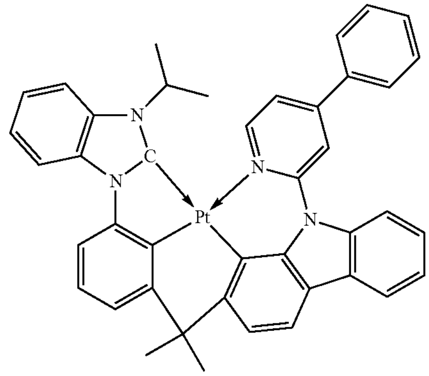
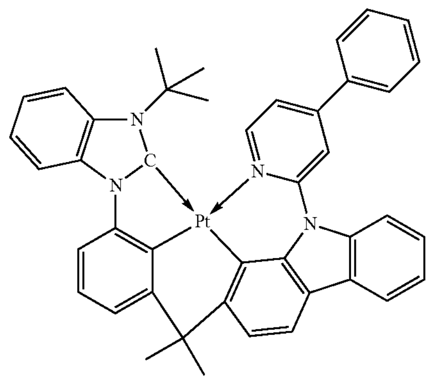
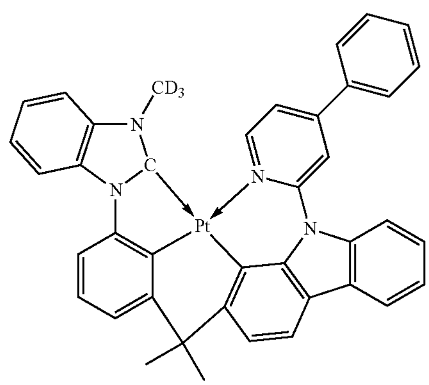
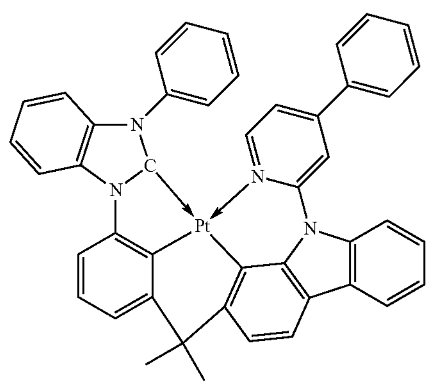

970
-continued
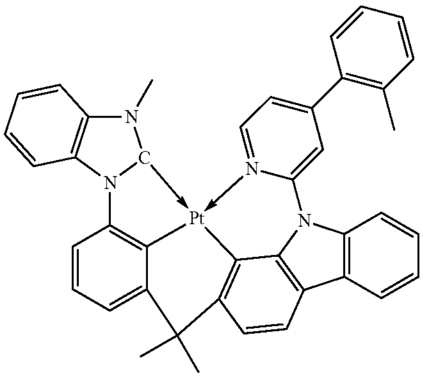
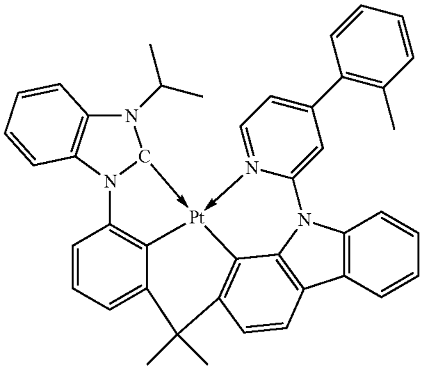
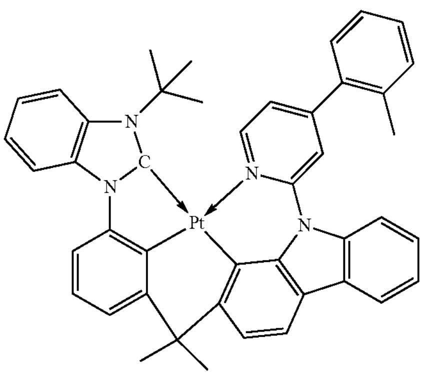
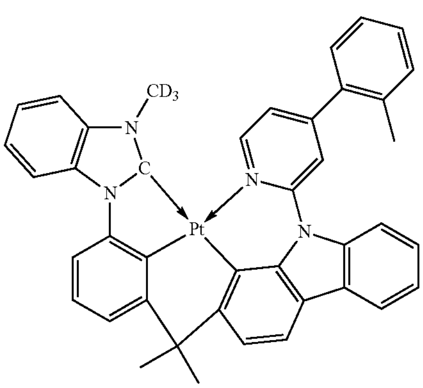
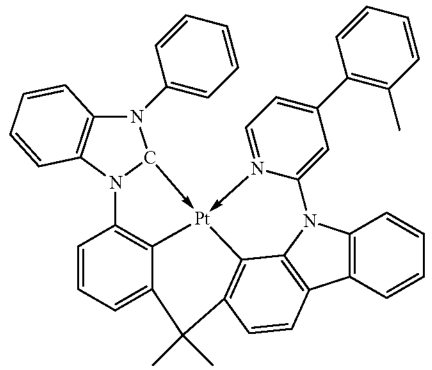
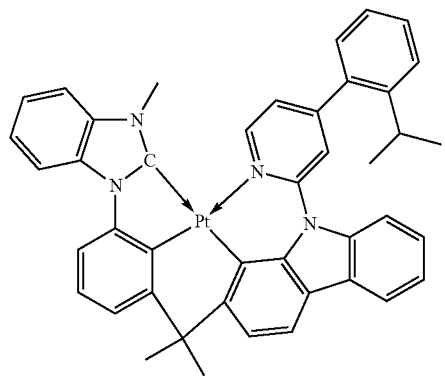
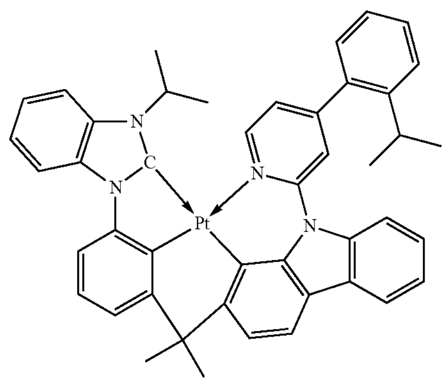
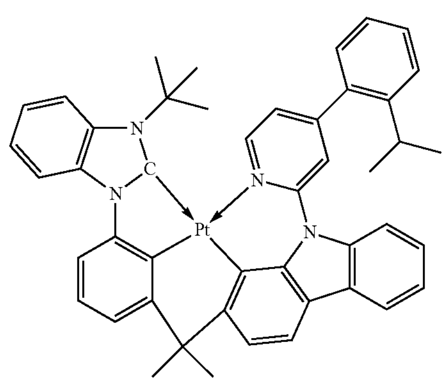

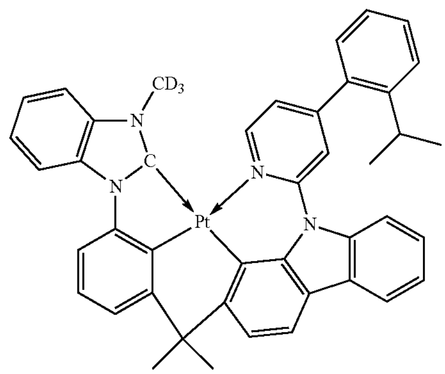
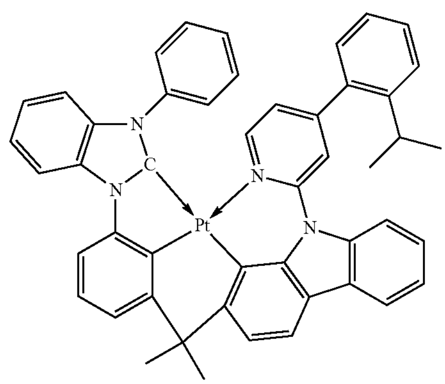
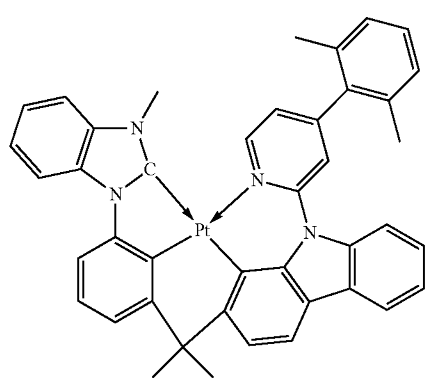
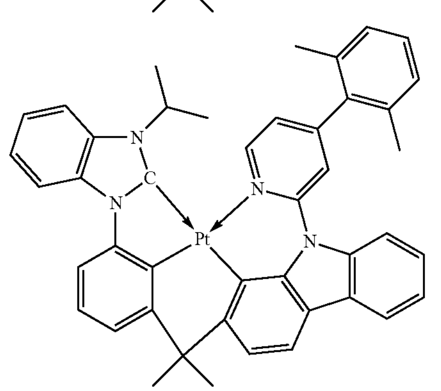
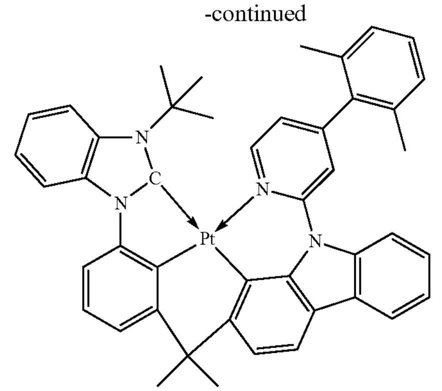
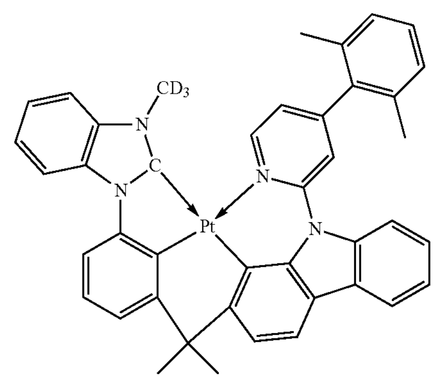
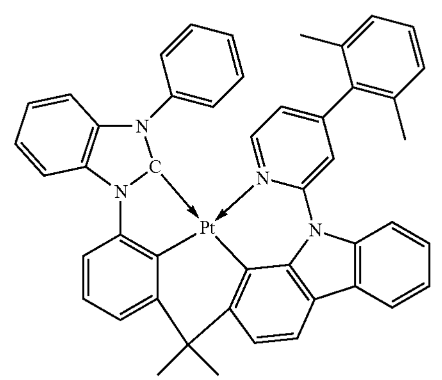
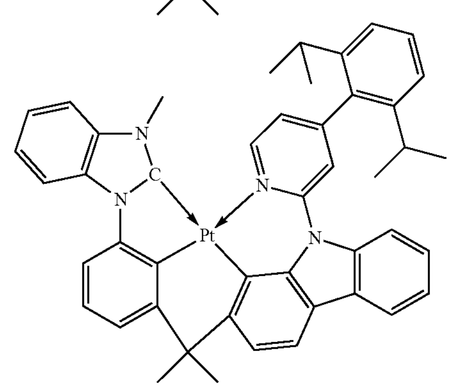

-continued
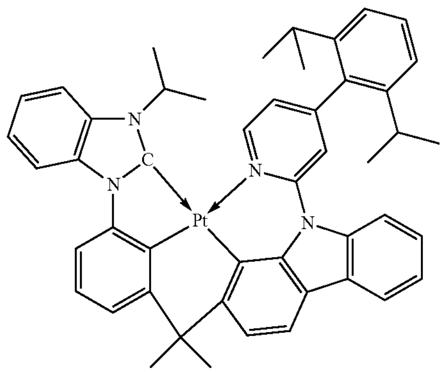
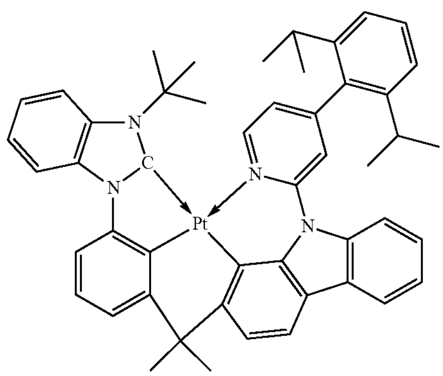
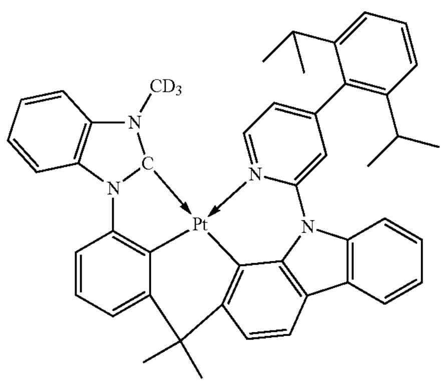
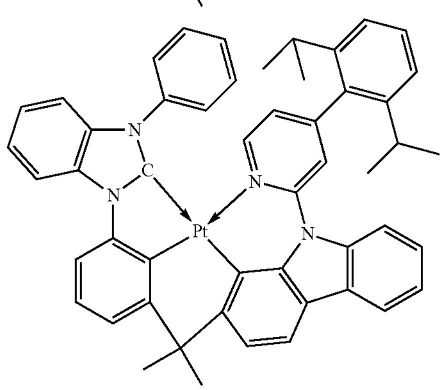
-continued
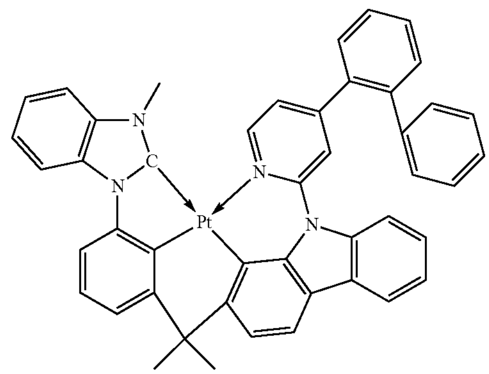
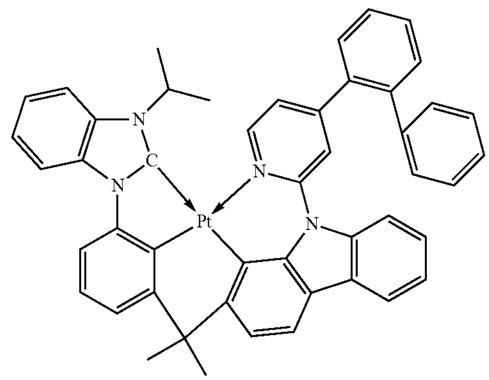
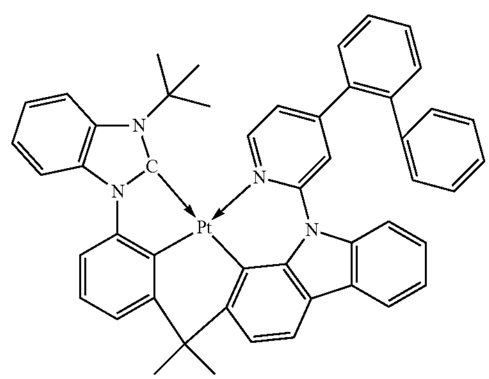
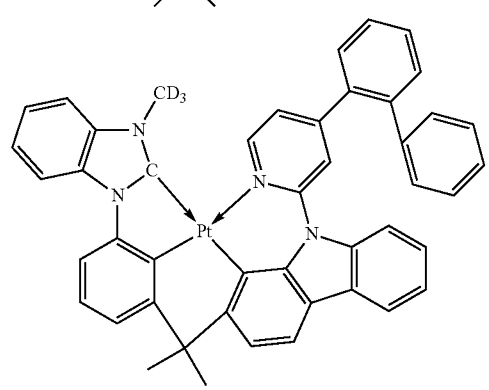

-continued
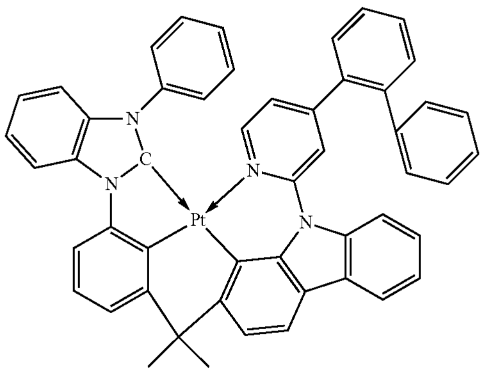
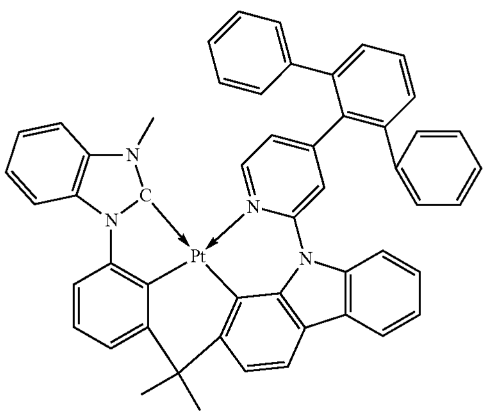
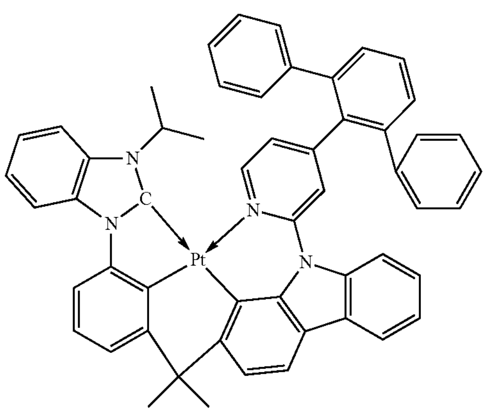
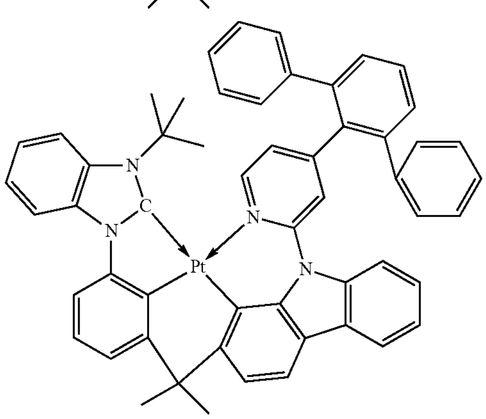
-continued
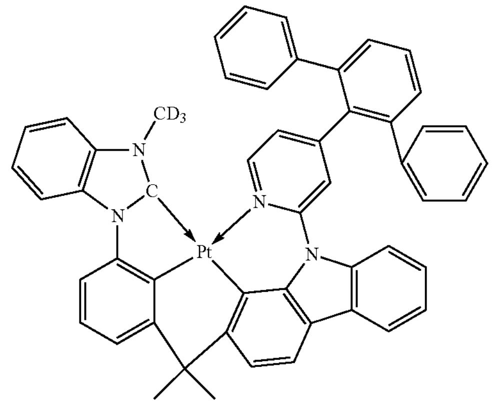
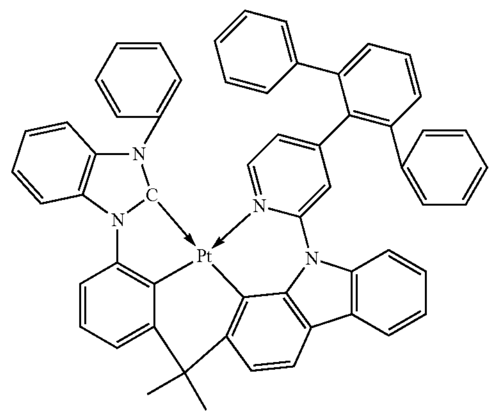
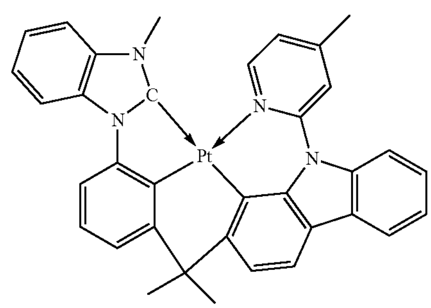
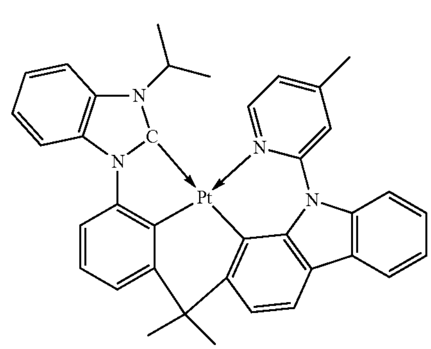

-continued
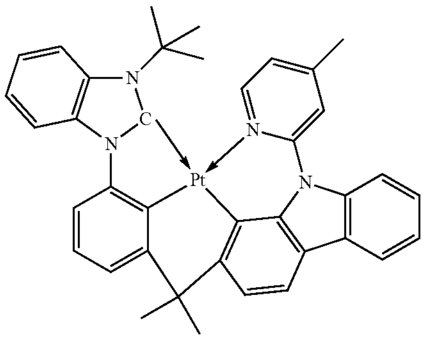
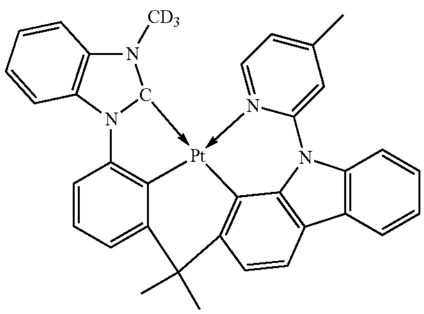
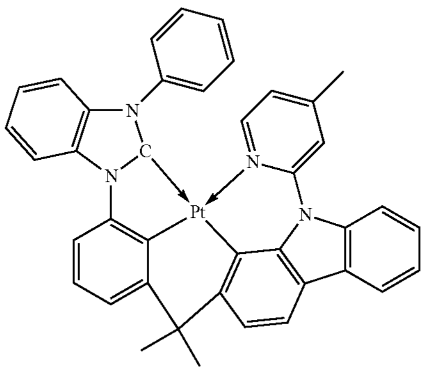
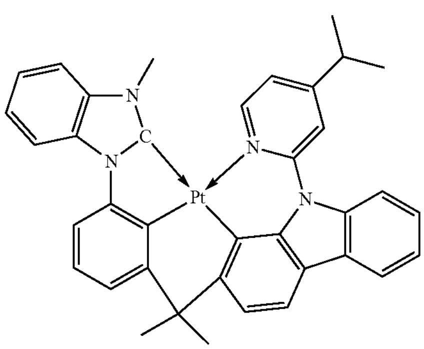
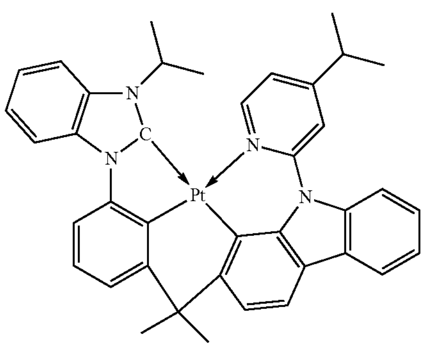
-continued
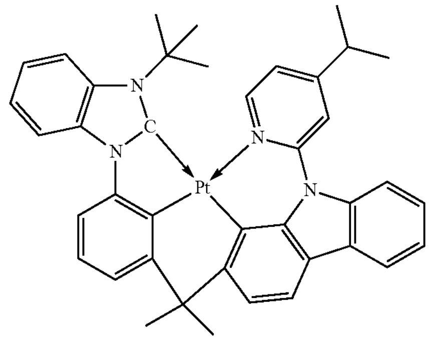
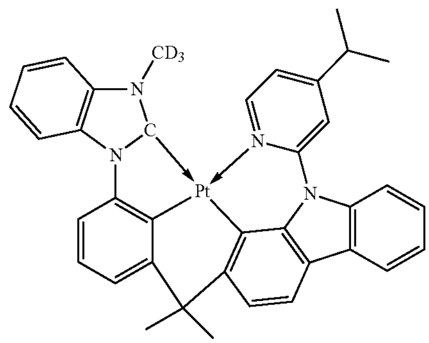
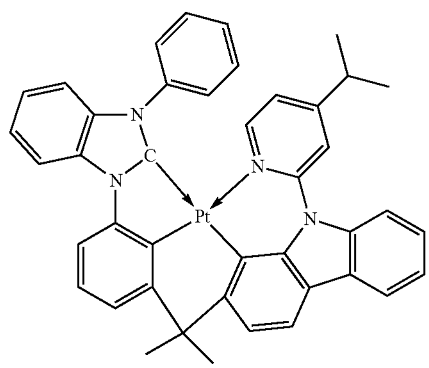
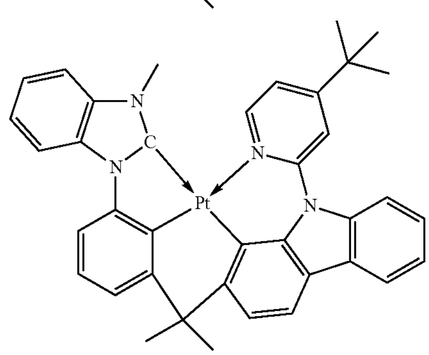
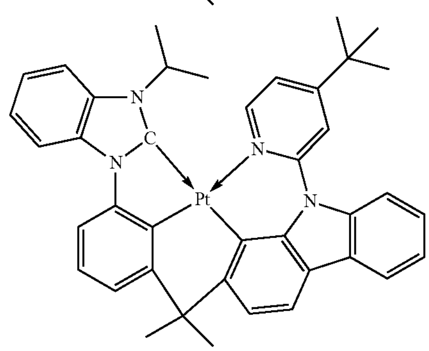

-continued
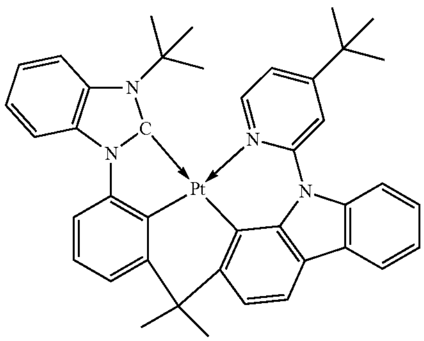
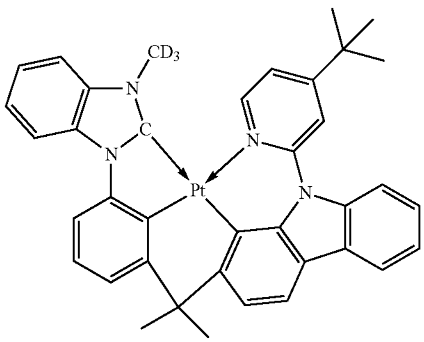
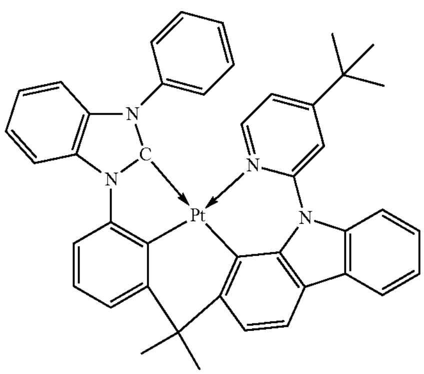
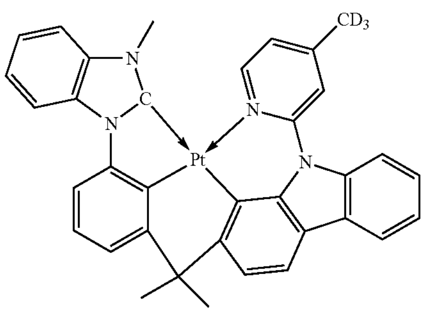
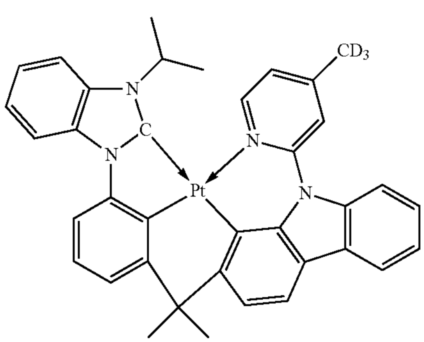
-continued
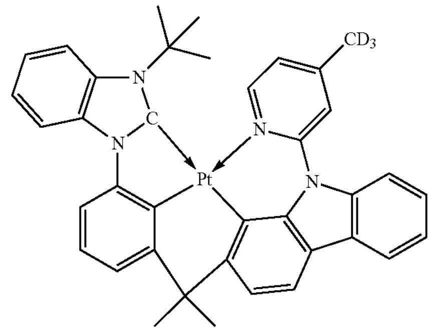
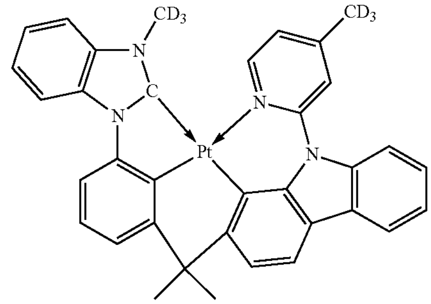
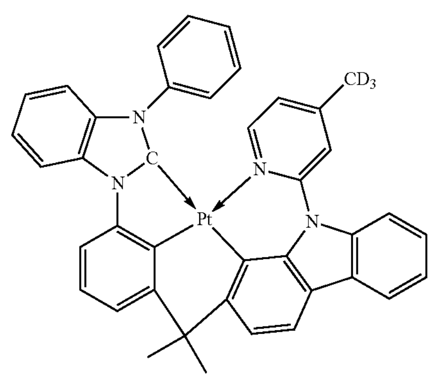
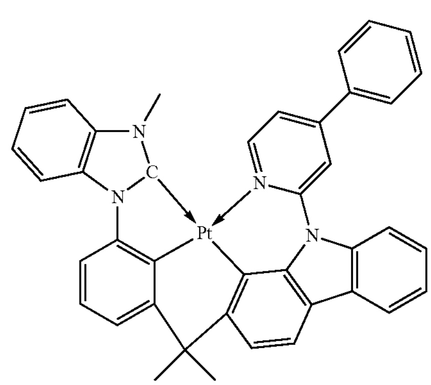

-continued
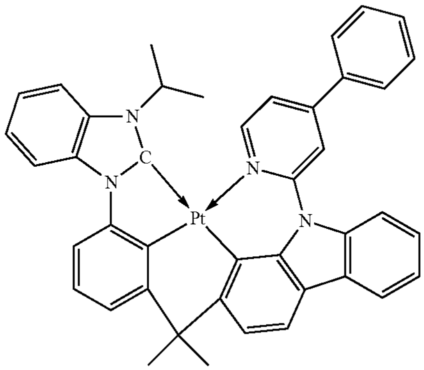
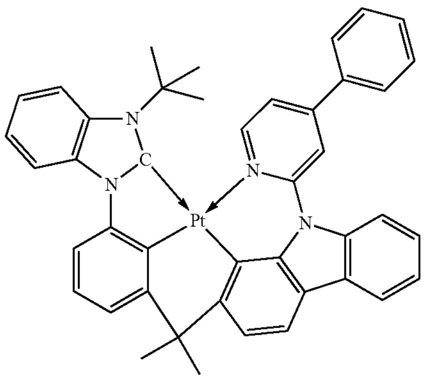
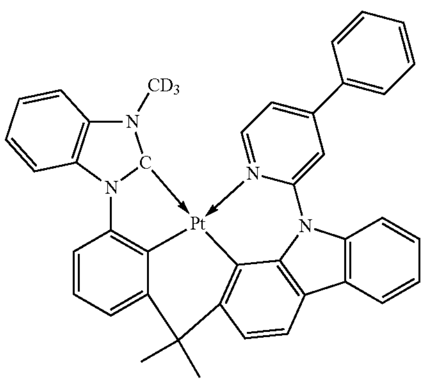
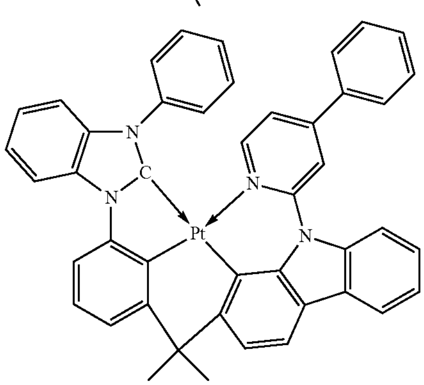
-continued
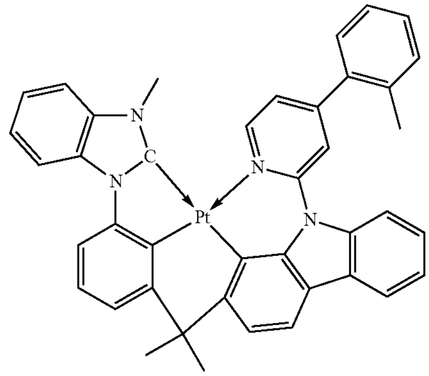
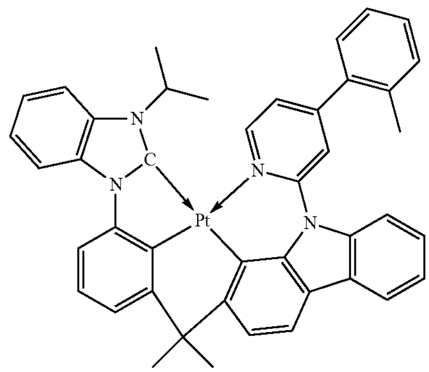
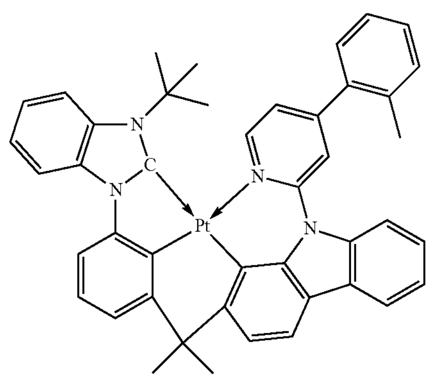
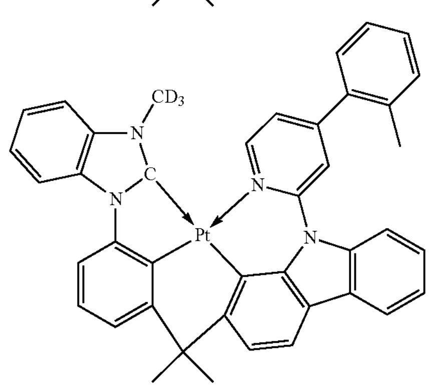

-continued
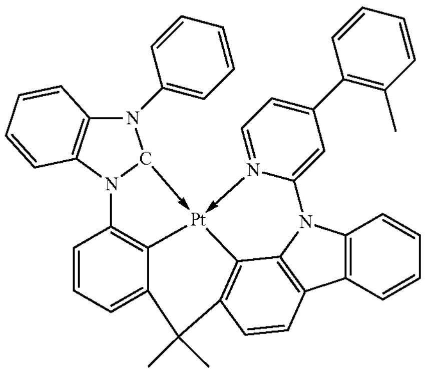
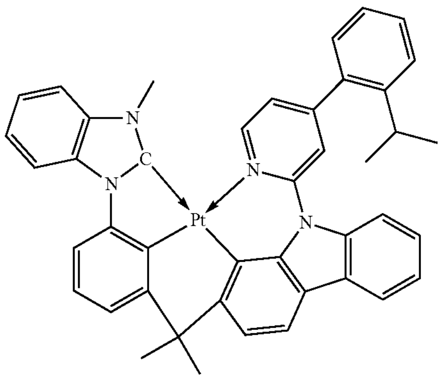
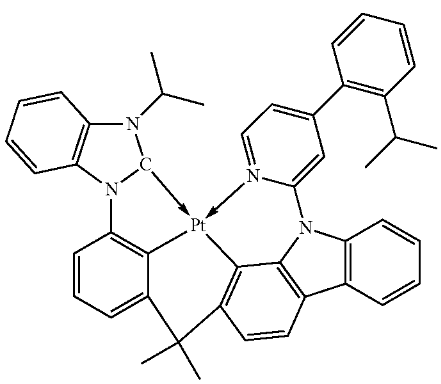
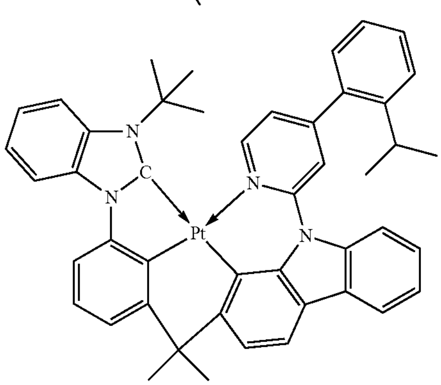
-continued
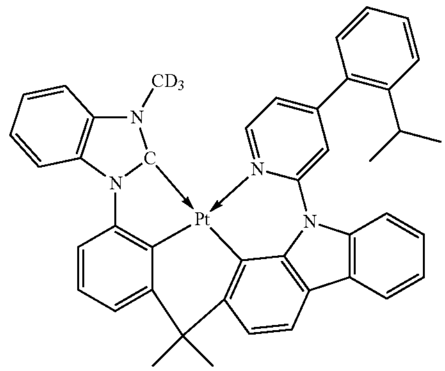
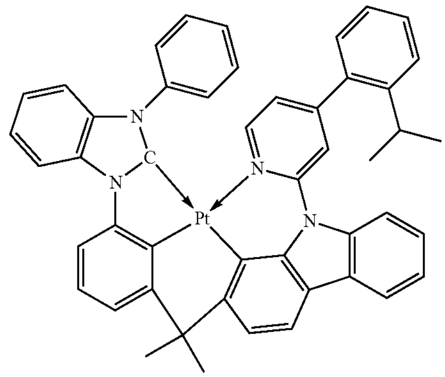
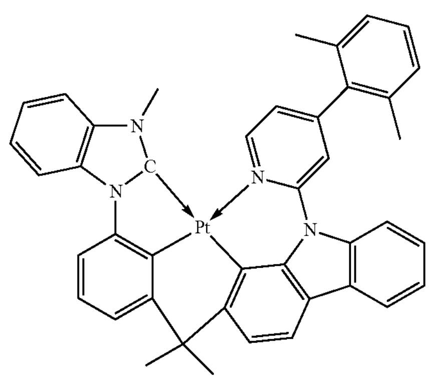
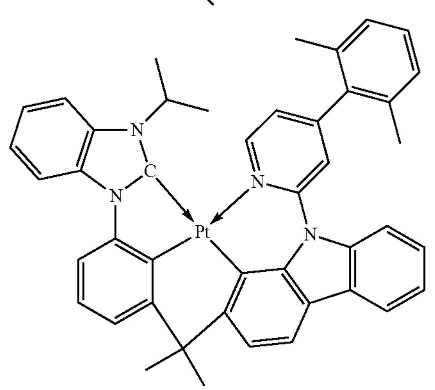

-continued
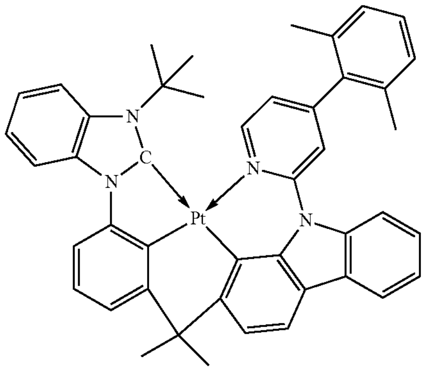
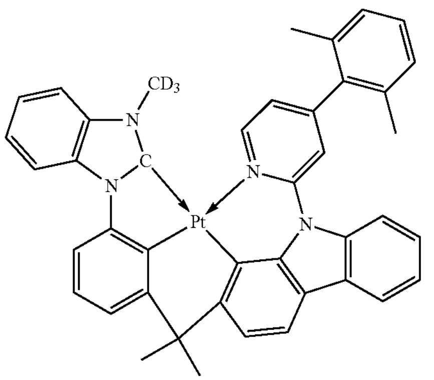
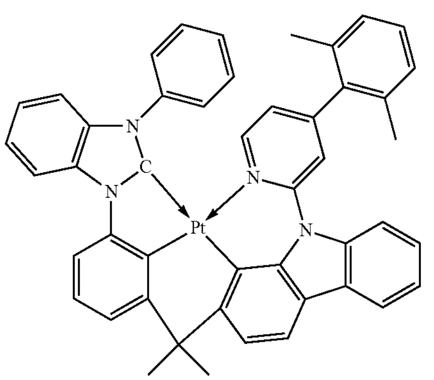
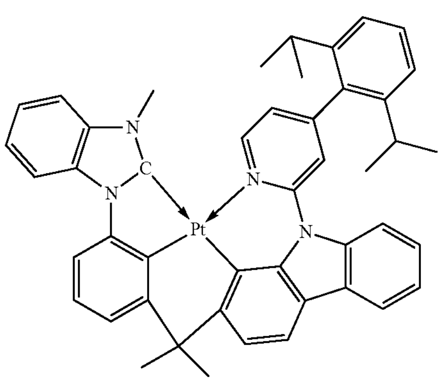
-continued
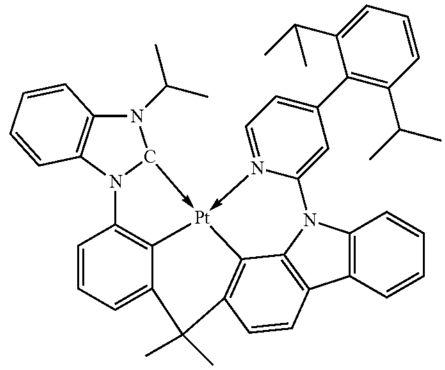
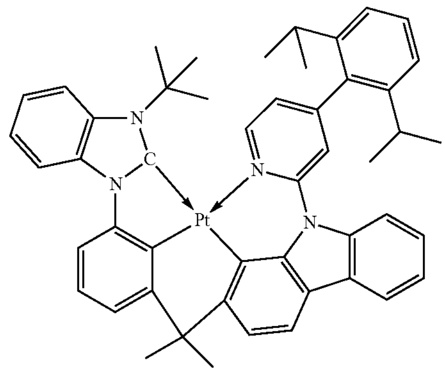
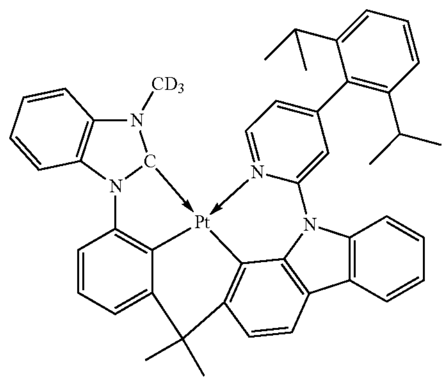
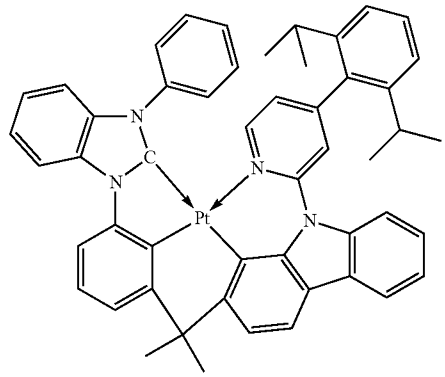

-continued
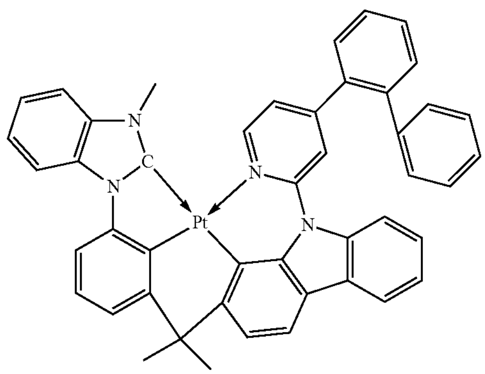
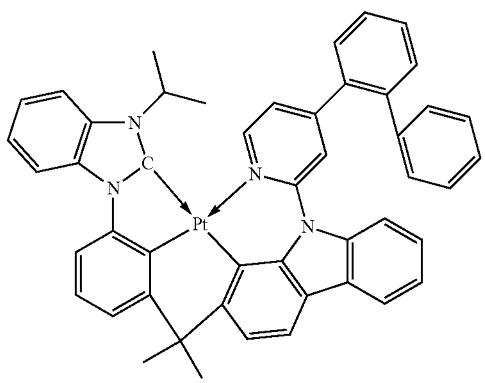
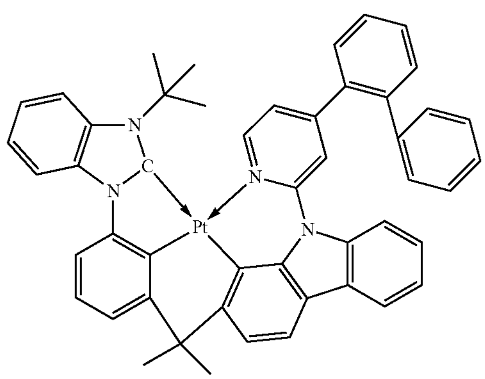
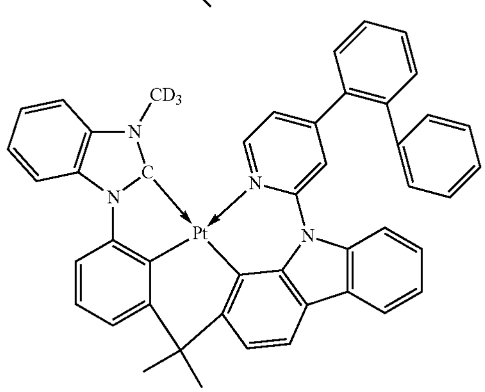
-continued
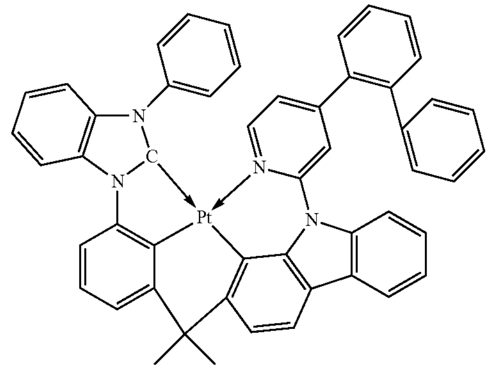
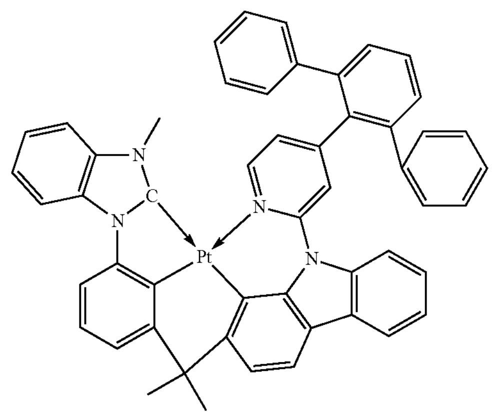
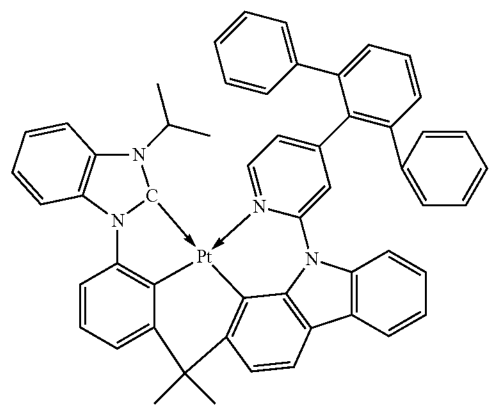
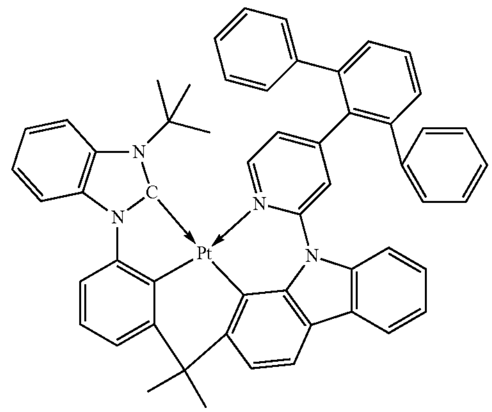

-continued
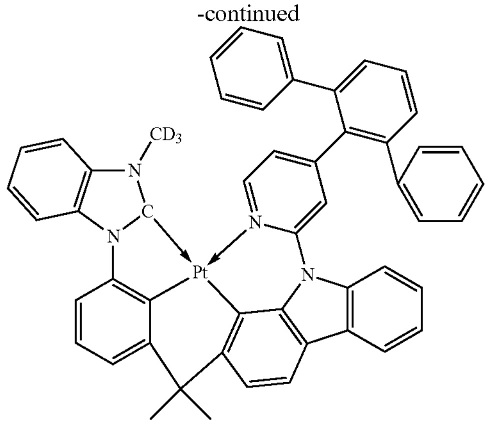
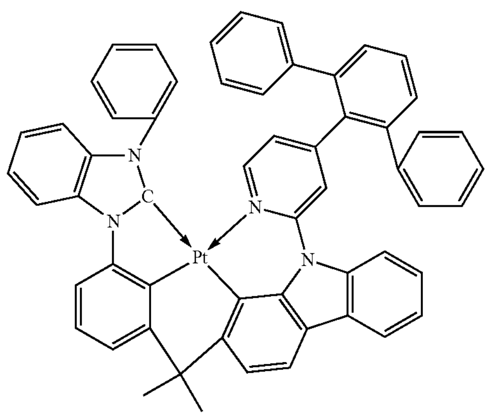
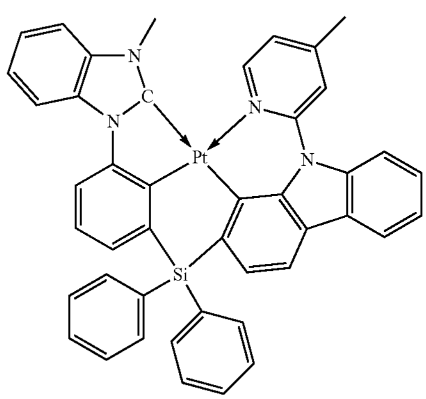
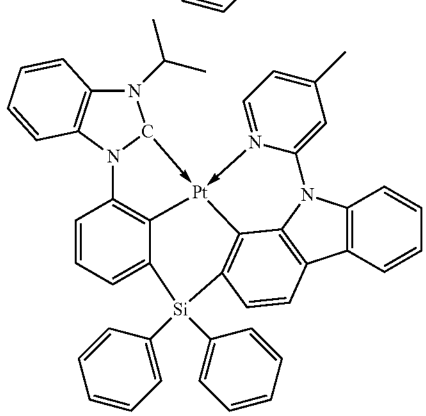
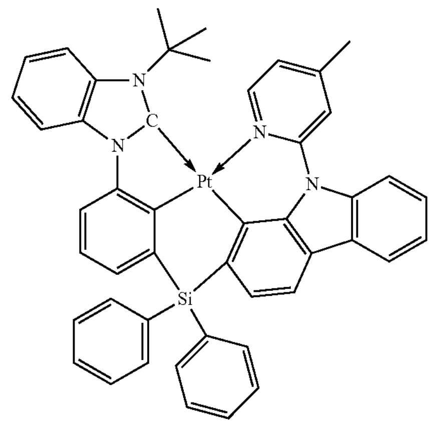
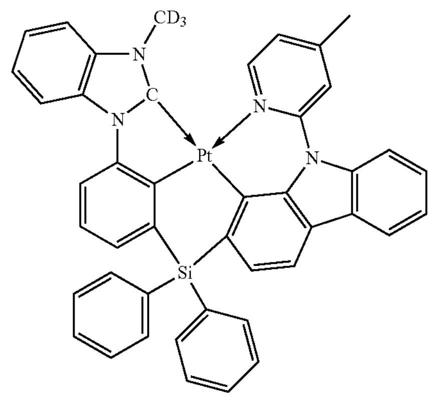
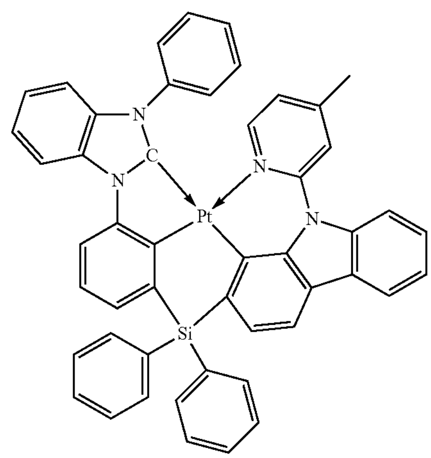
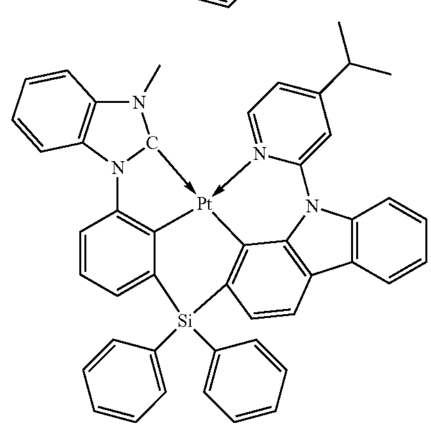

-continued
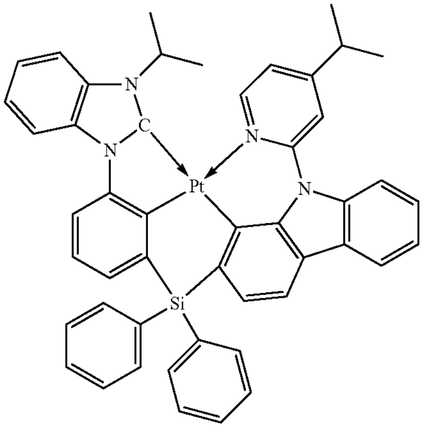
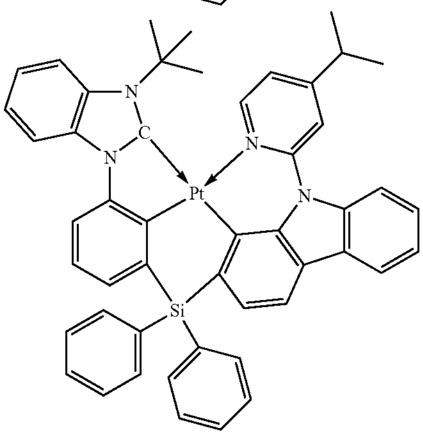
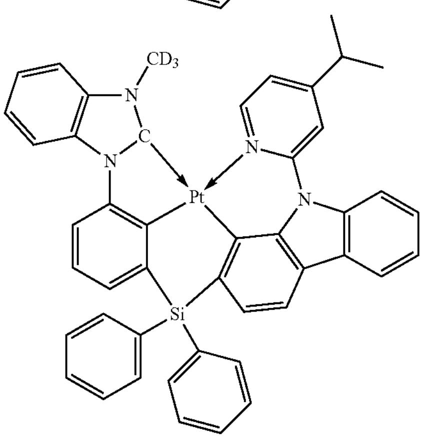
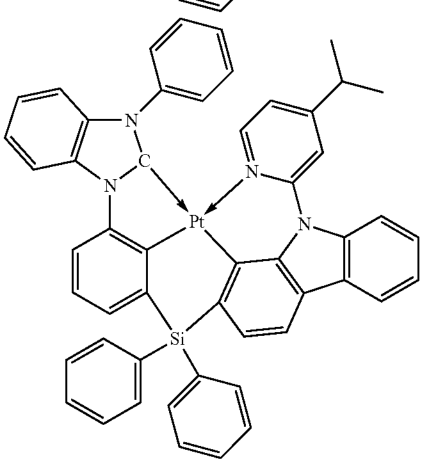
-continued
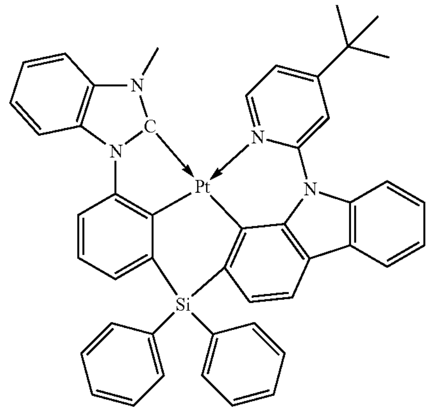
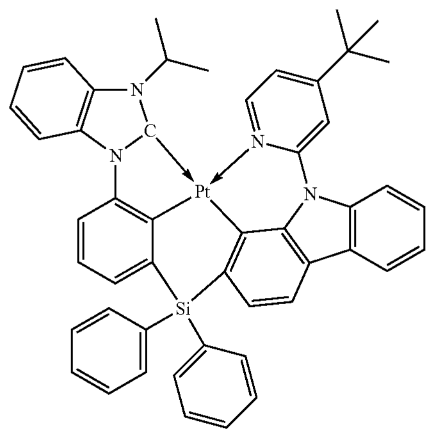
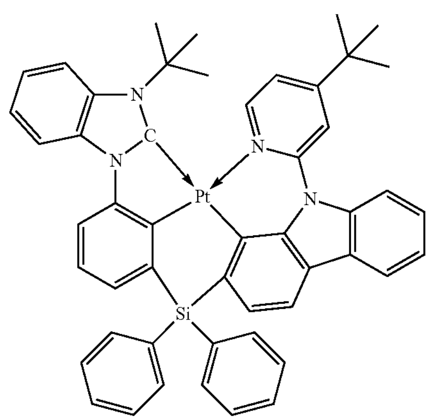
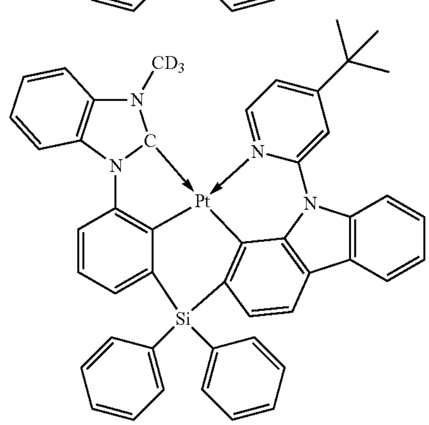

-continued
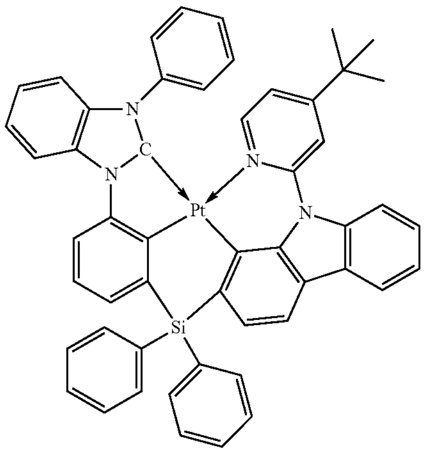
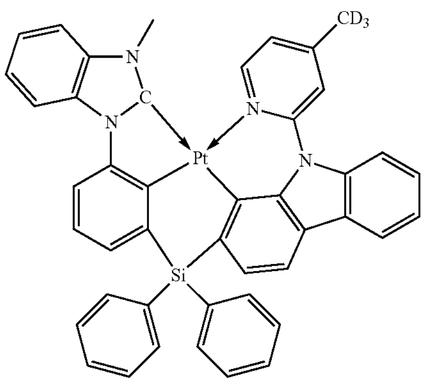
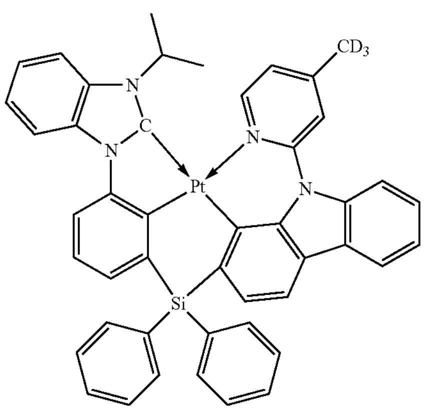
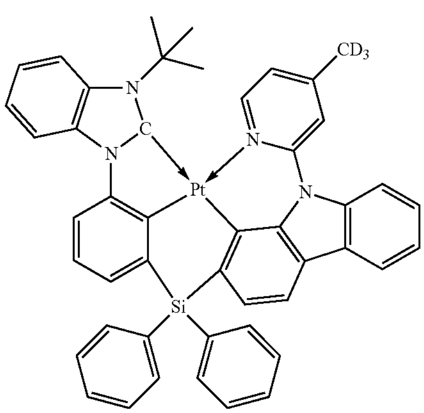
-continued
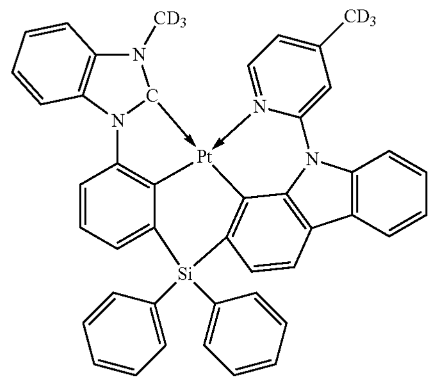
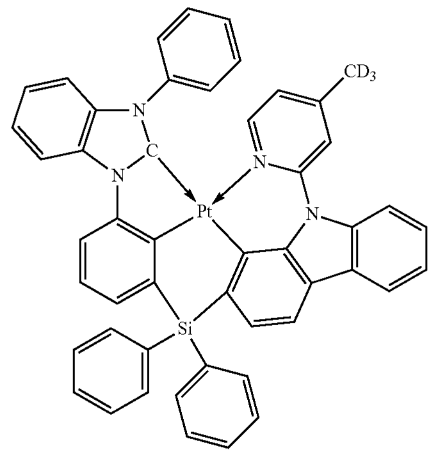
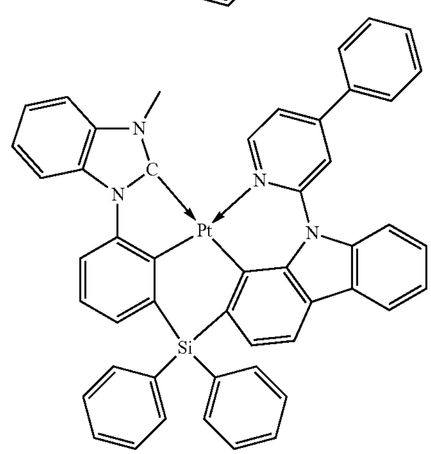
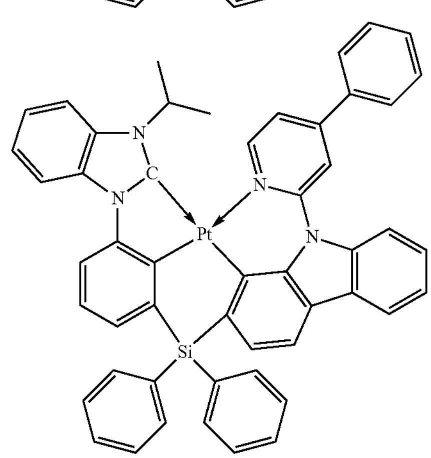

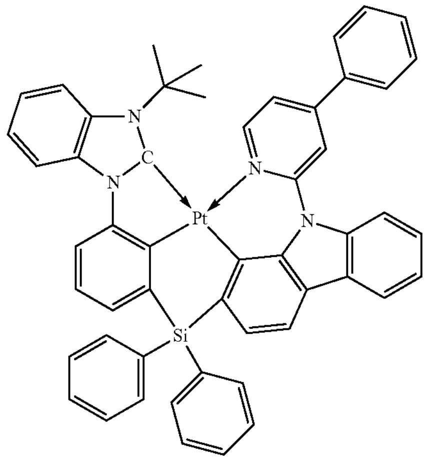
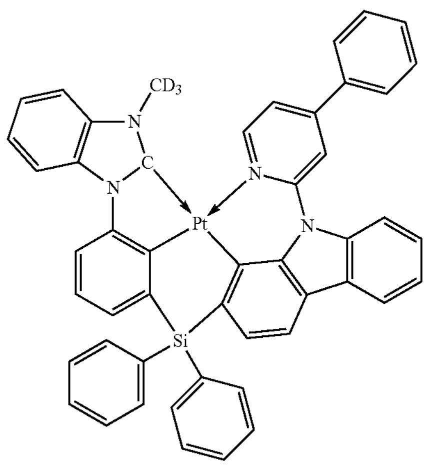
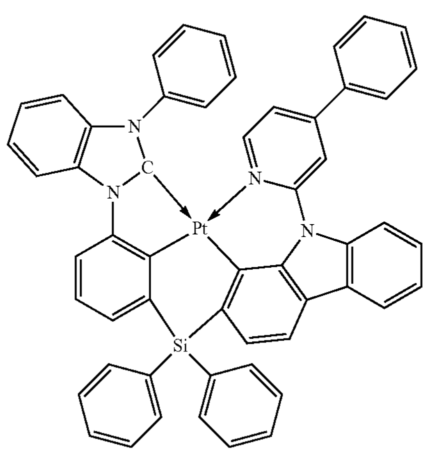
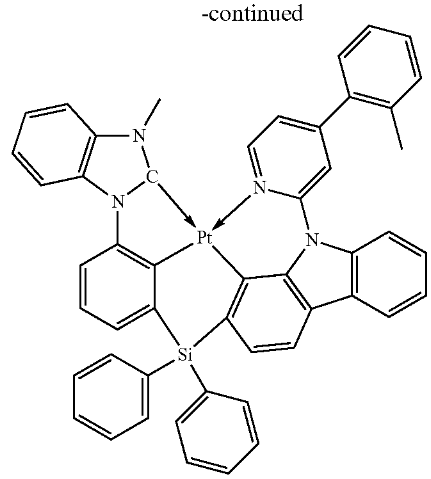
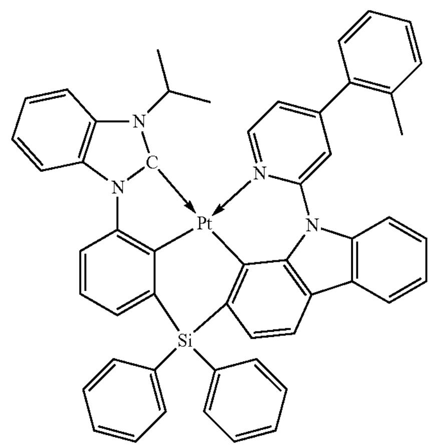
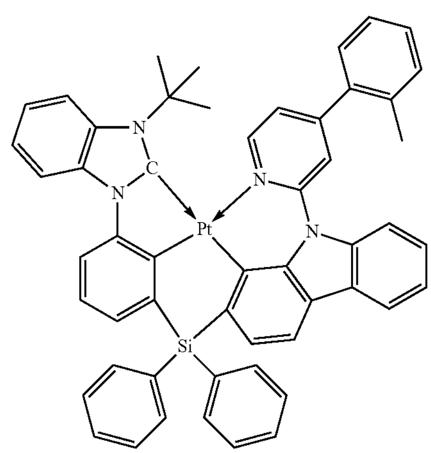

-continued
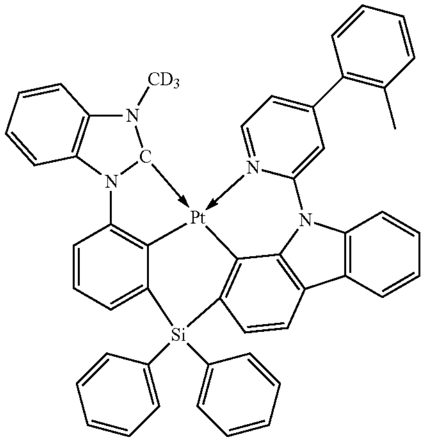
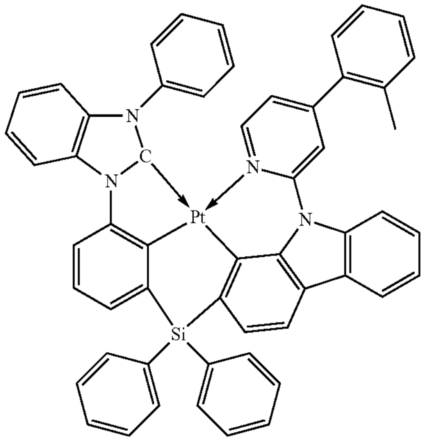
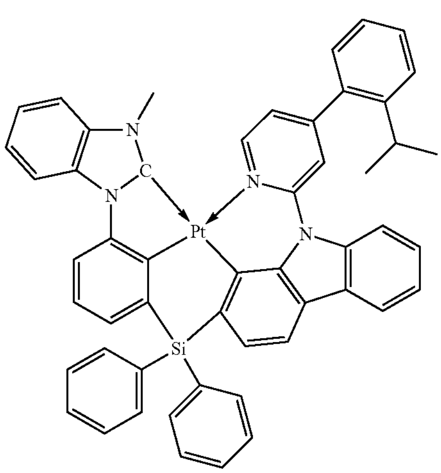
-continued
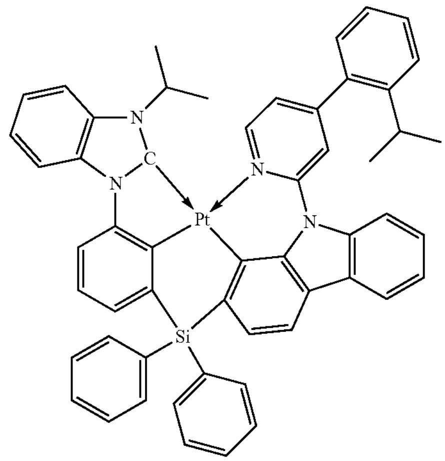
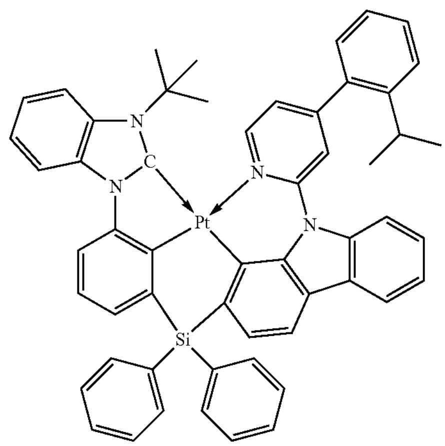
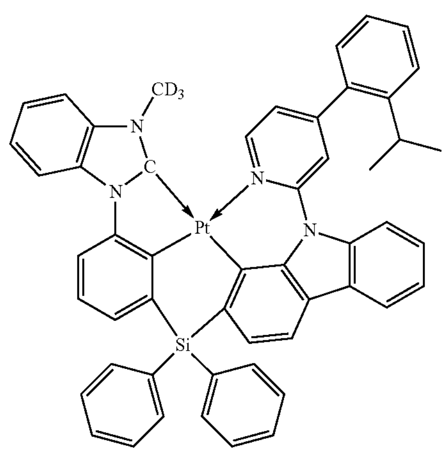

-continued
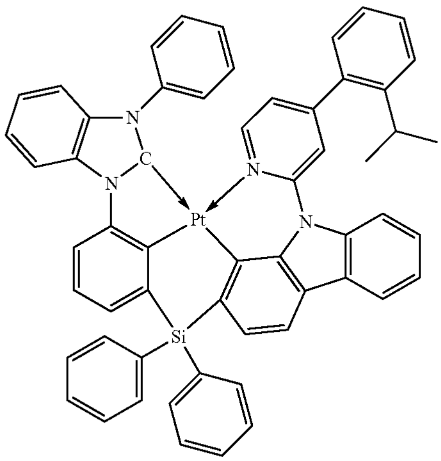
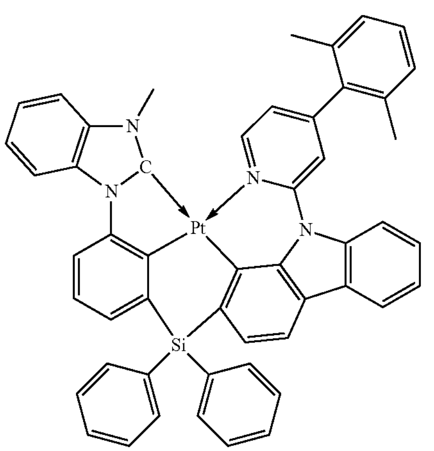
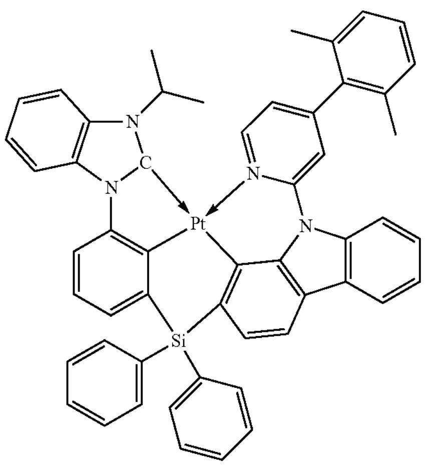
-continued
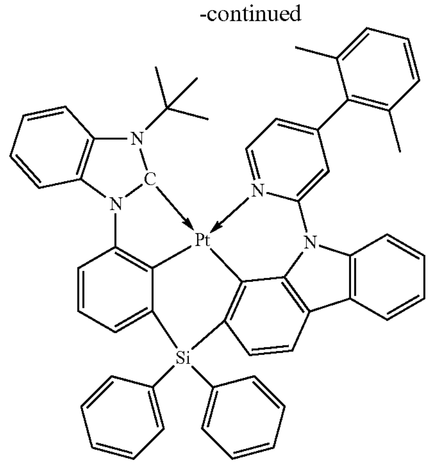
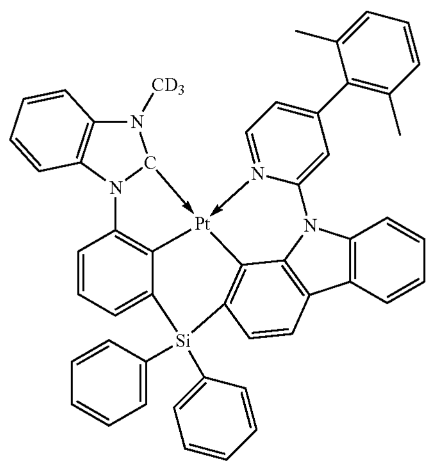
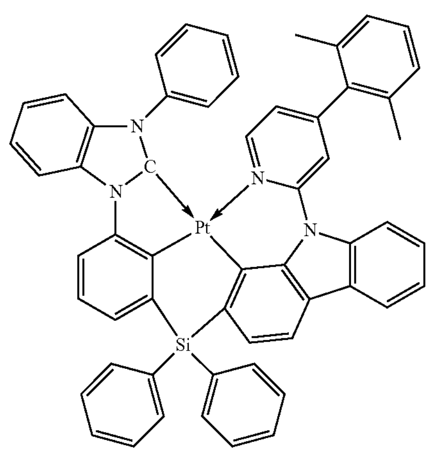

-continued
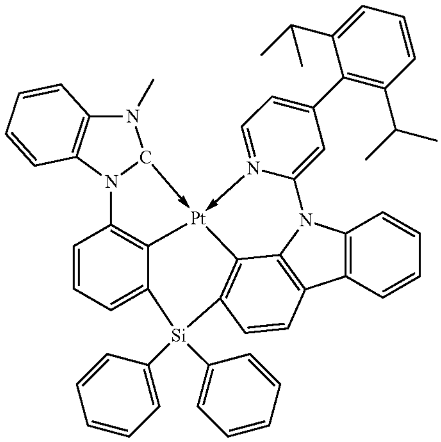
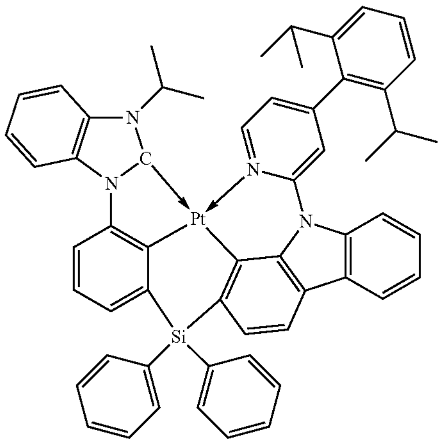
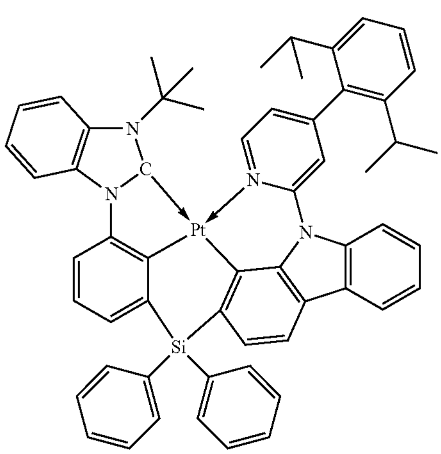
-continued
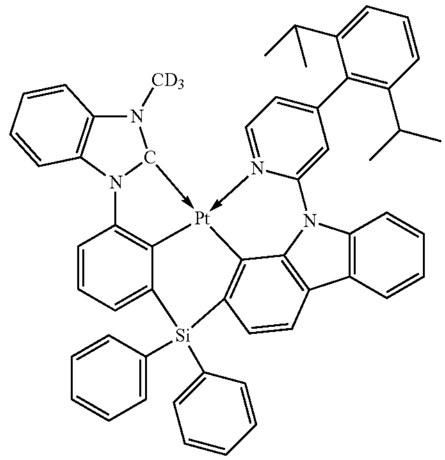
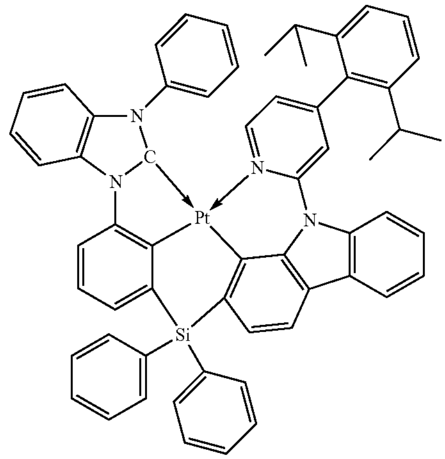
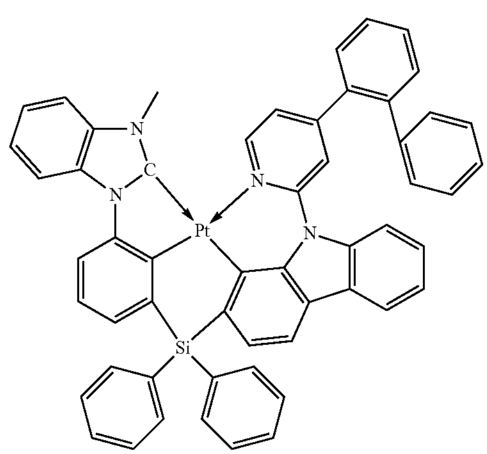

-continued
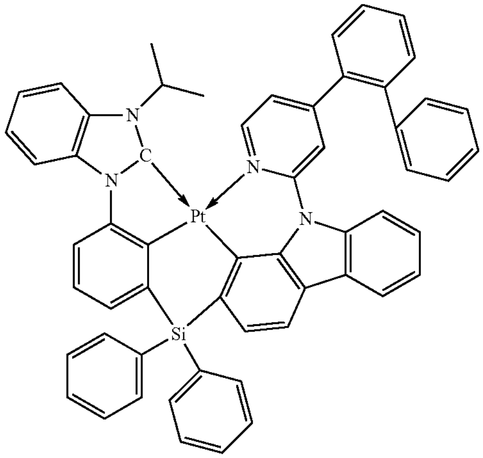
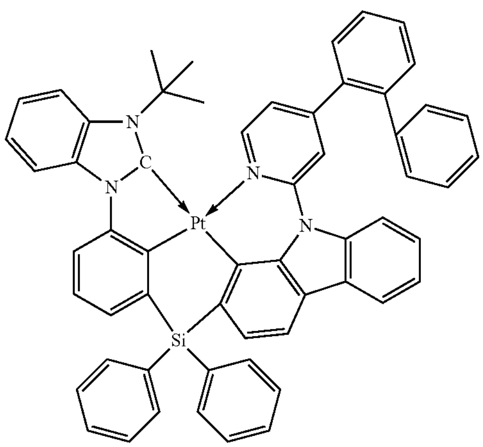
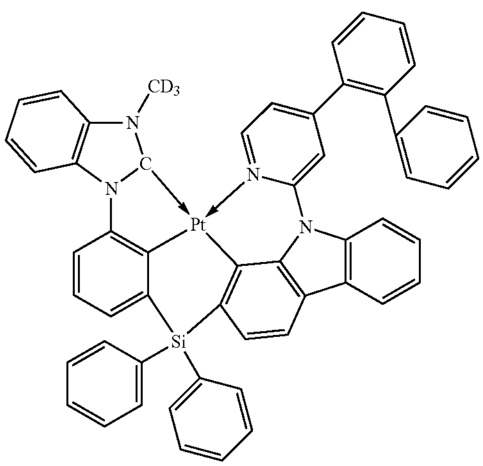
-continued
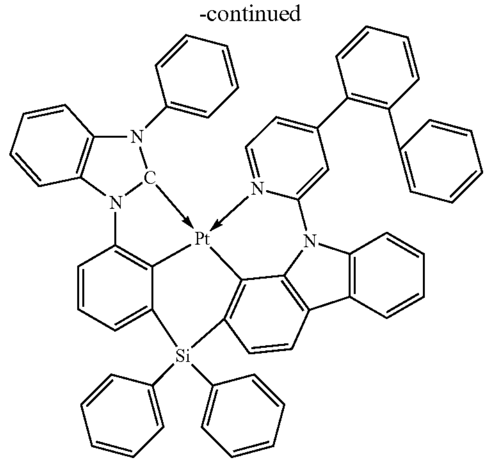
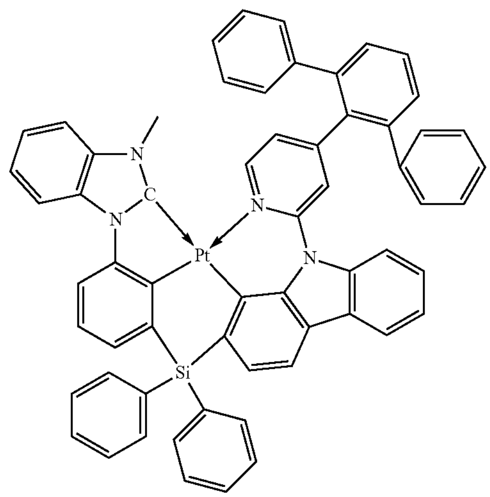
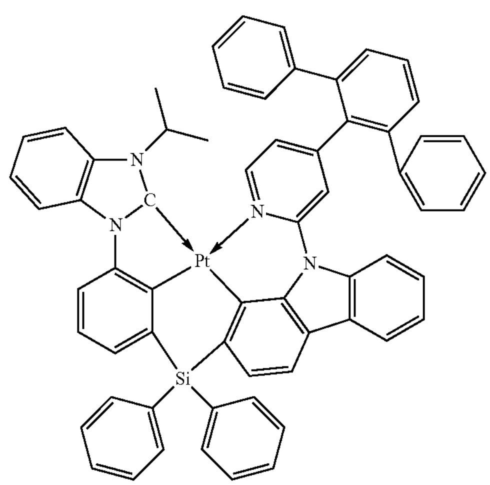

-continued
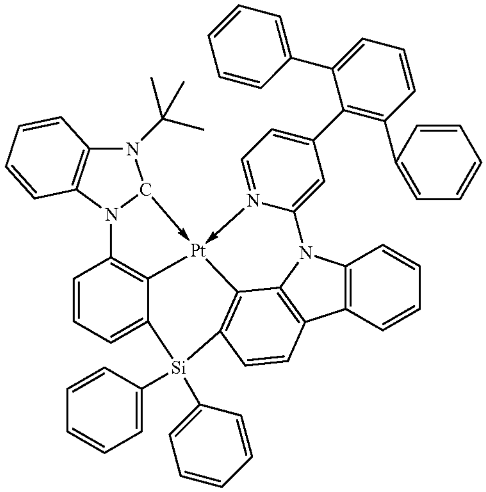
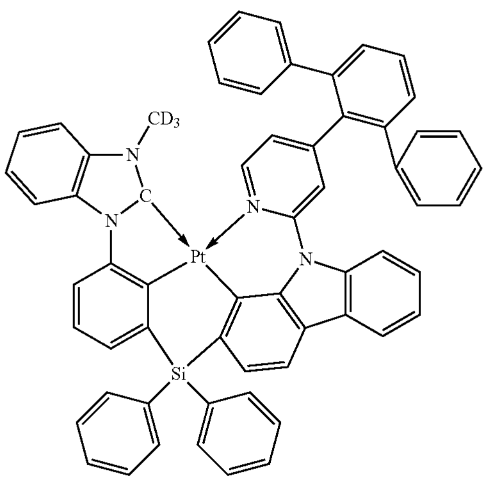
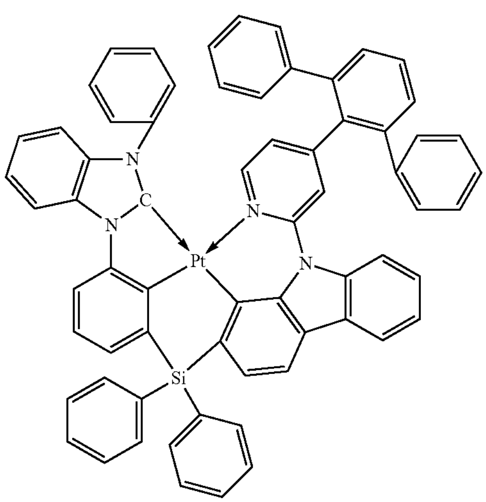
-continued
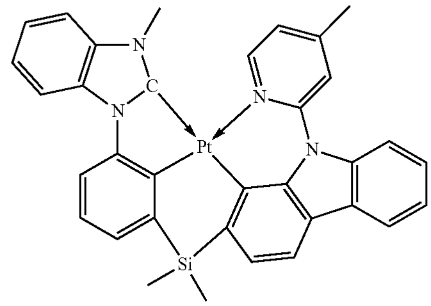
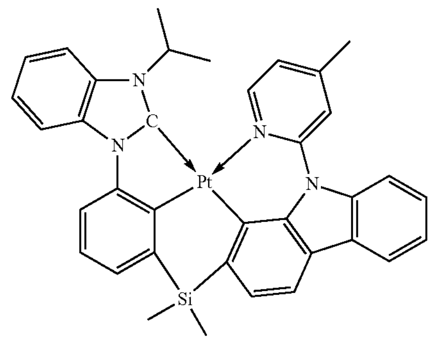
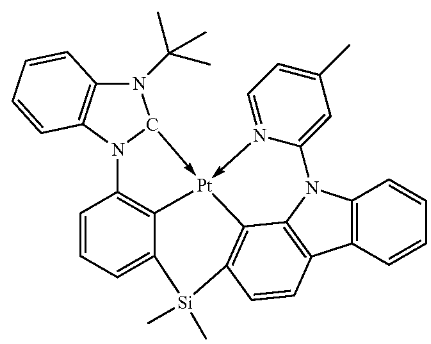
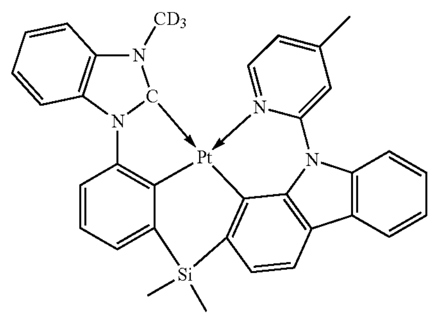
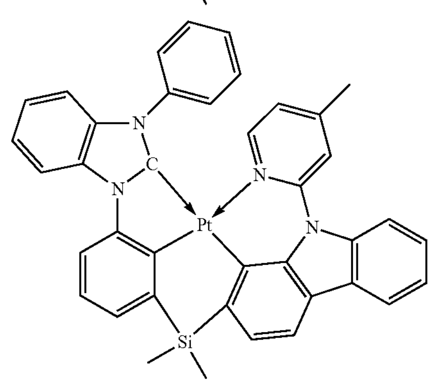

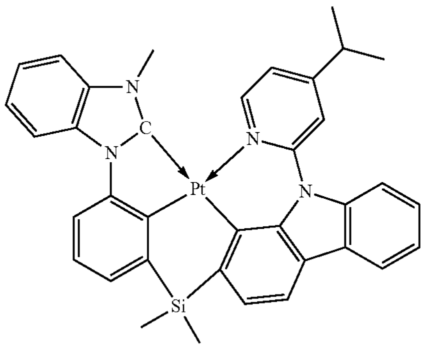
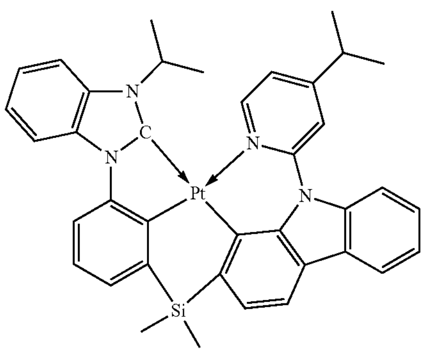
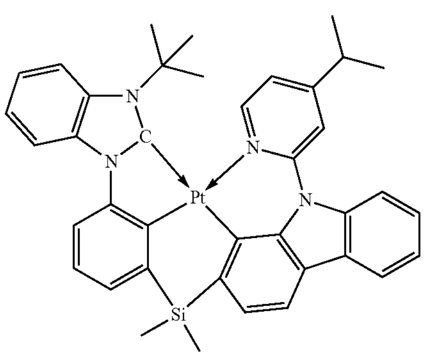
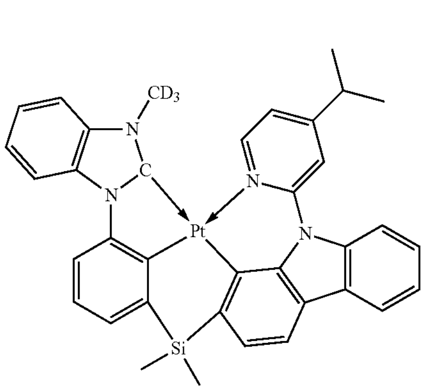
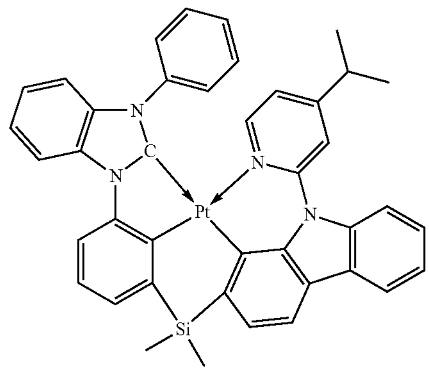
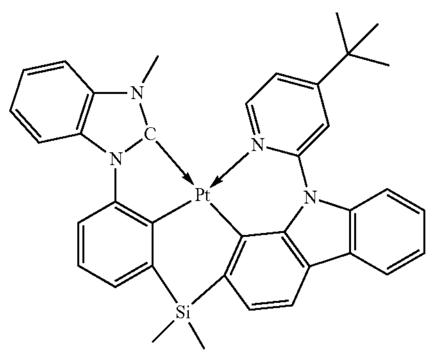
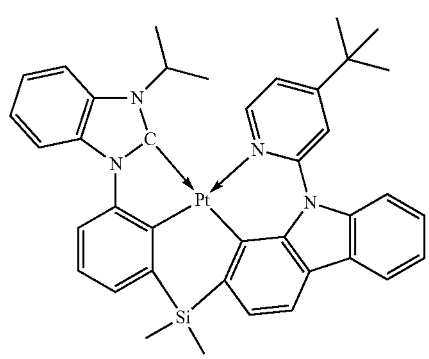
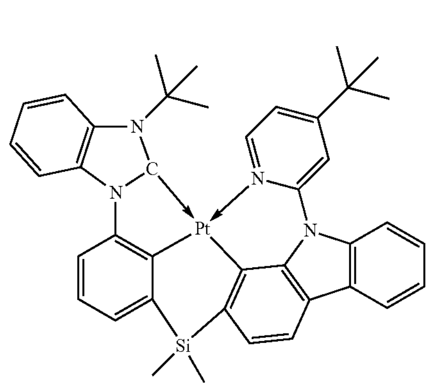

-continued
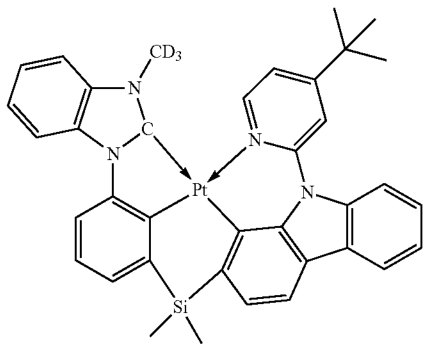
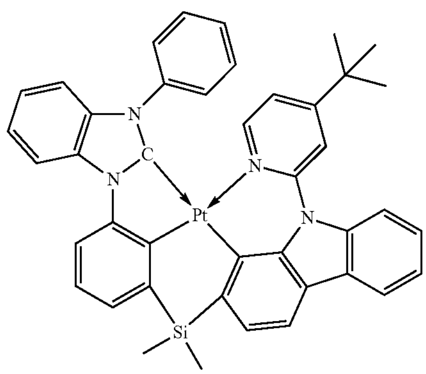
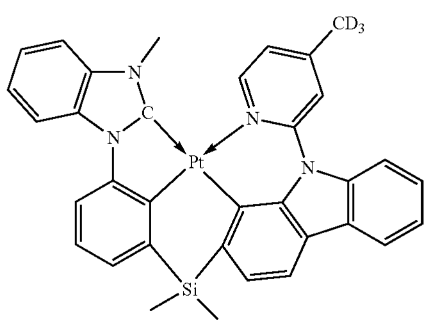
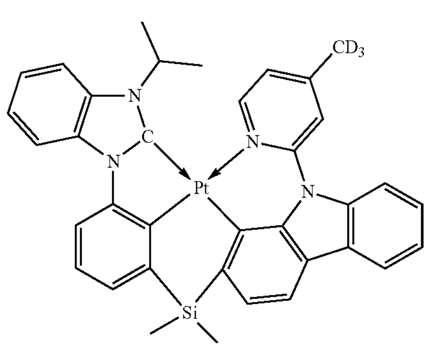
-continued
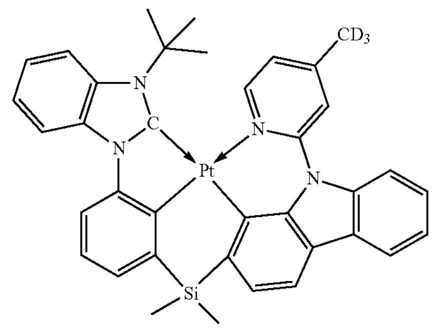
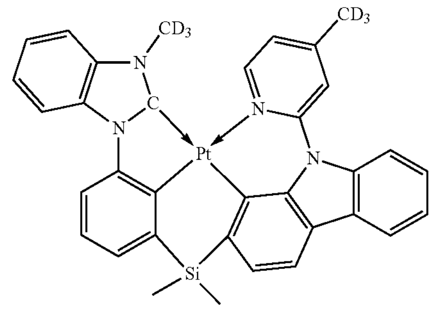
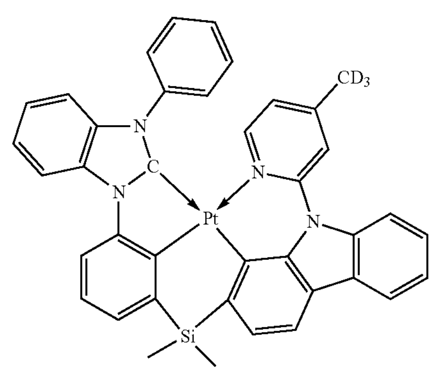
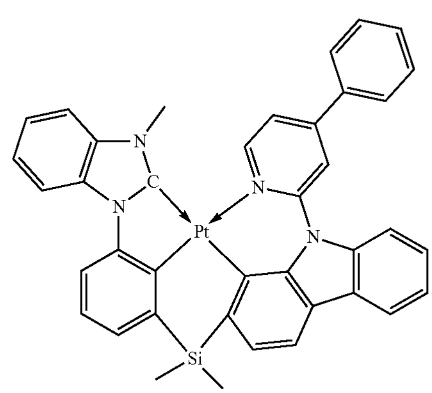

-continued
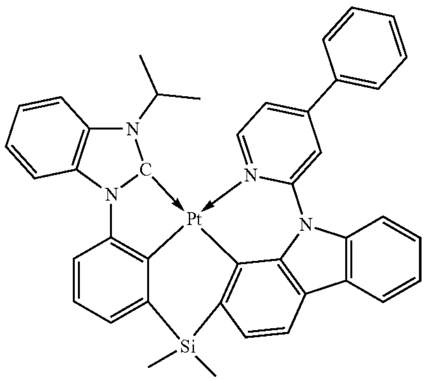
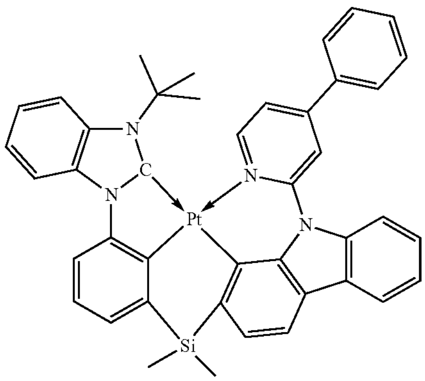
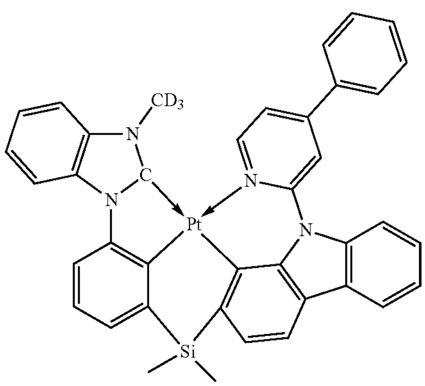
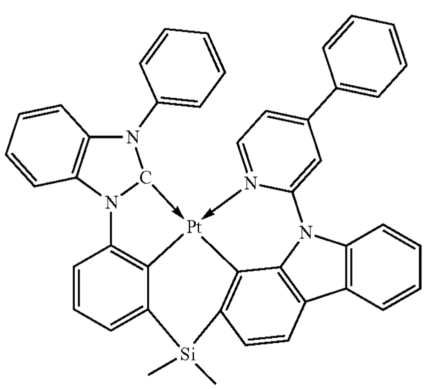
-continued
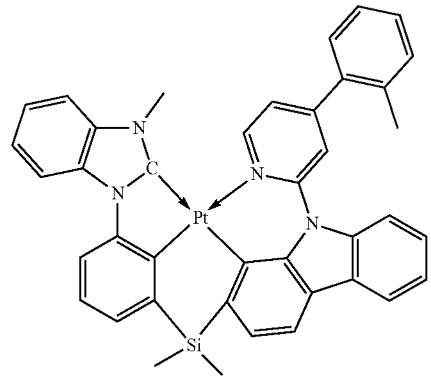
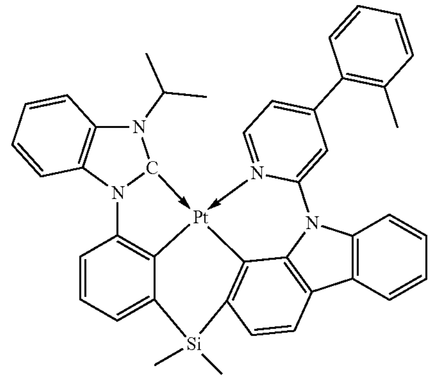
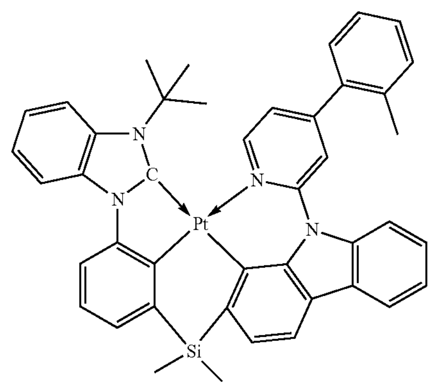
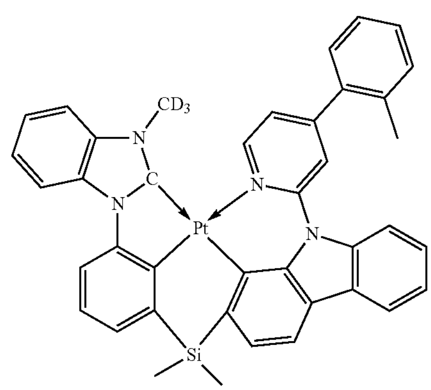

-continued
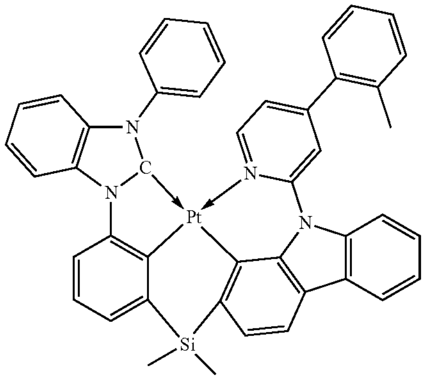
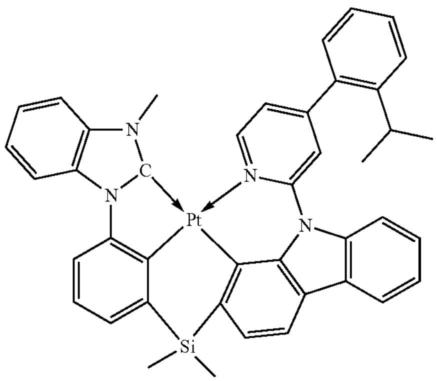
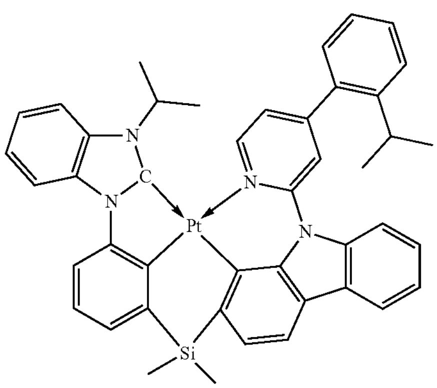
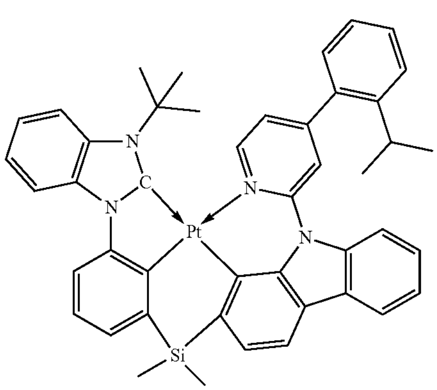
-continued
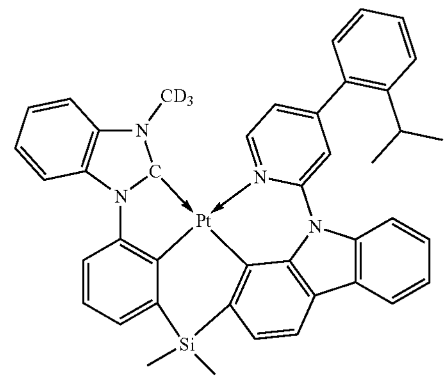
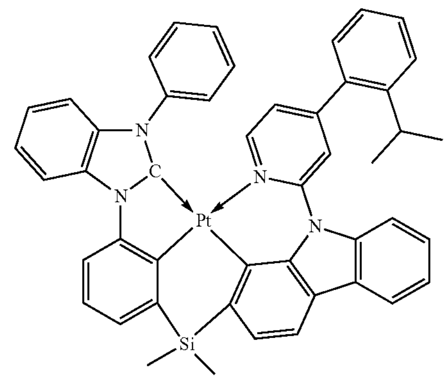
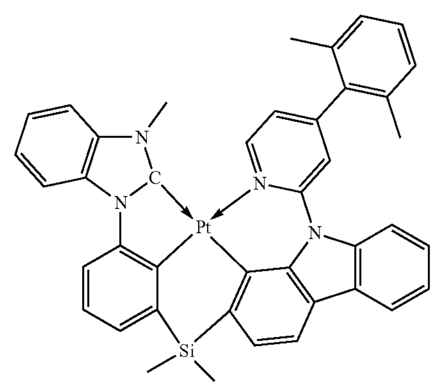
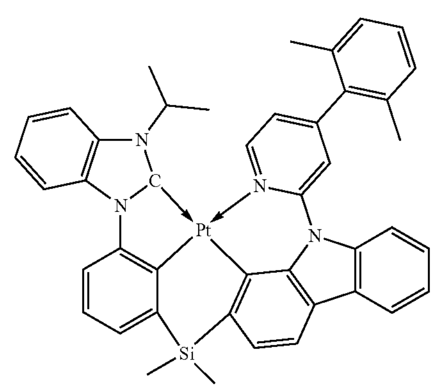

-continued
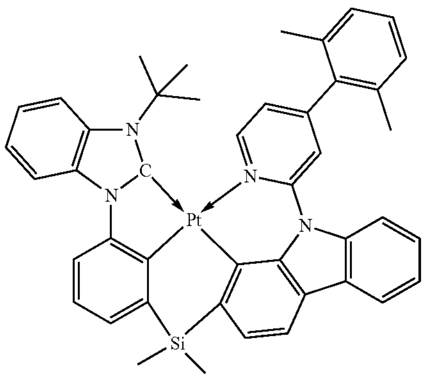
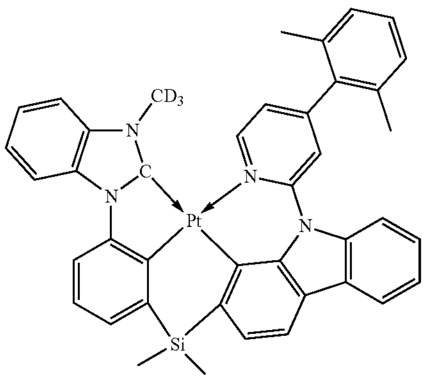
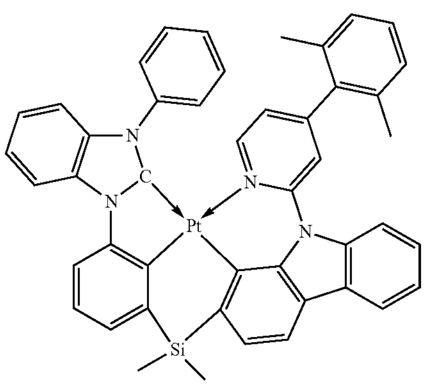
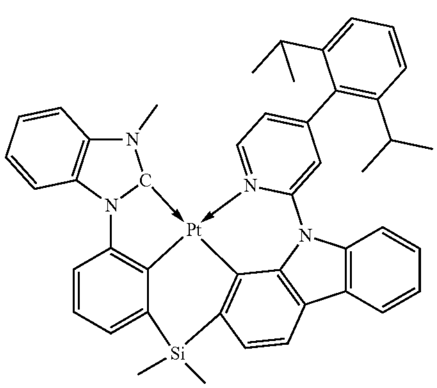
-continued
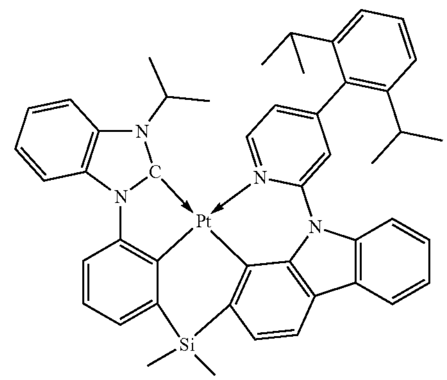
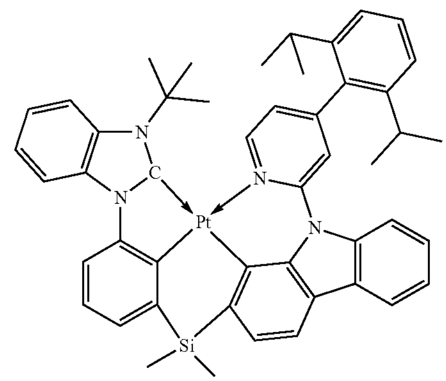
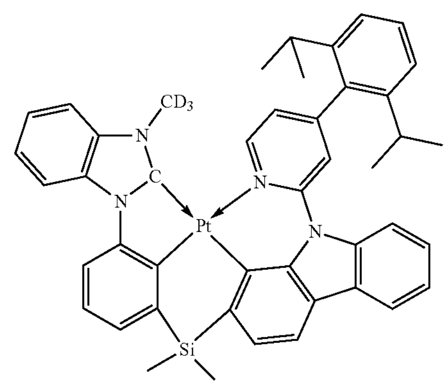
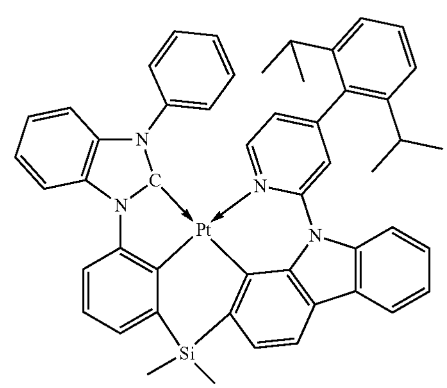

-continued
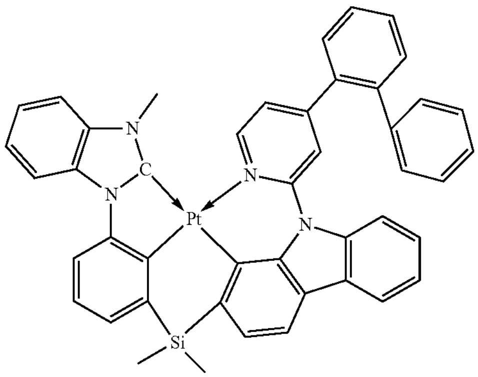
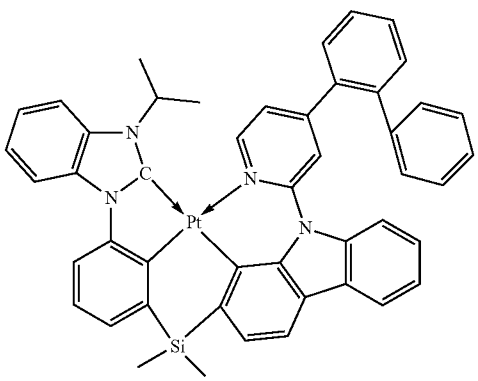
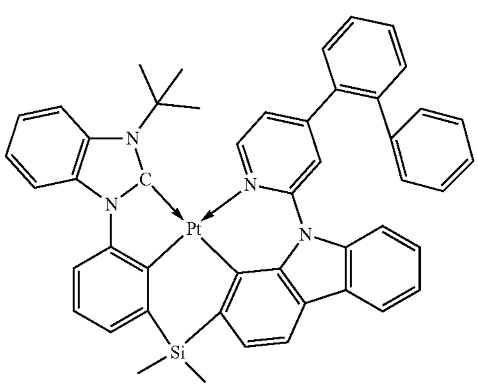
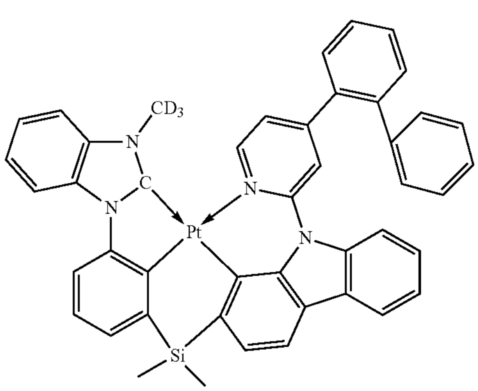
-continued
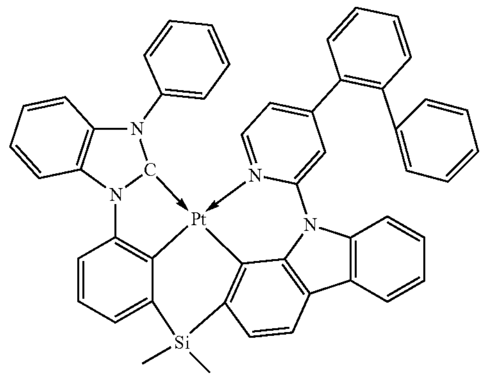
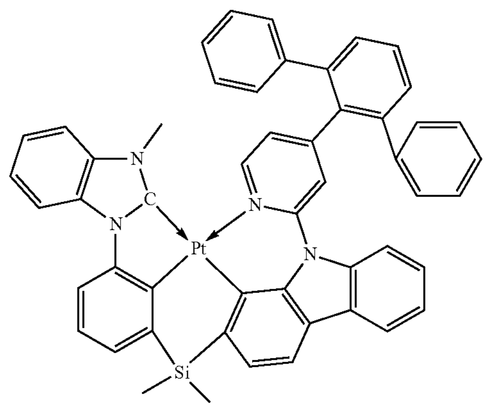
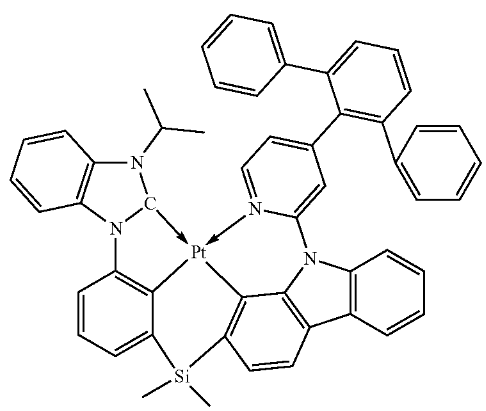
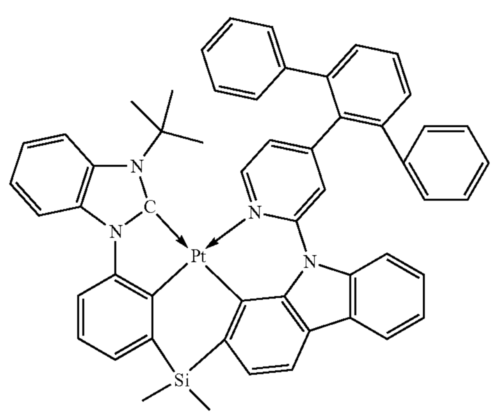

-continued
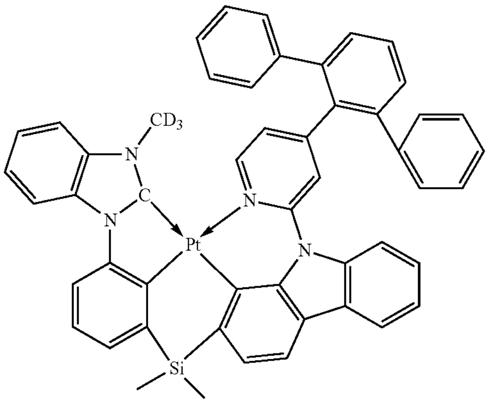
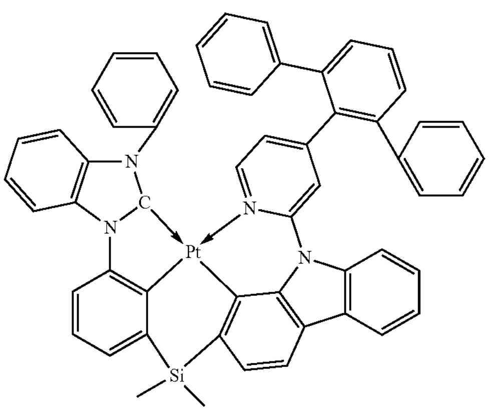
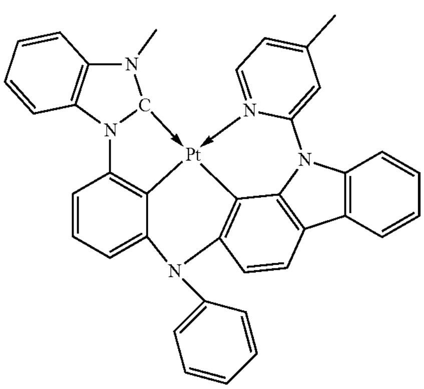
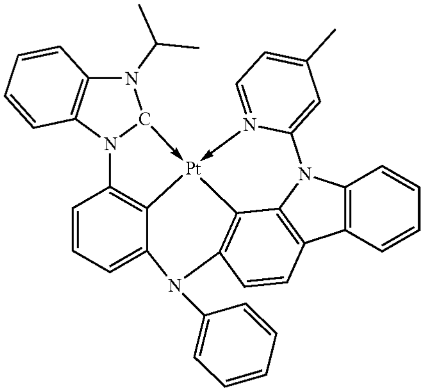
-continued
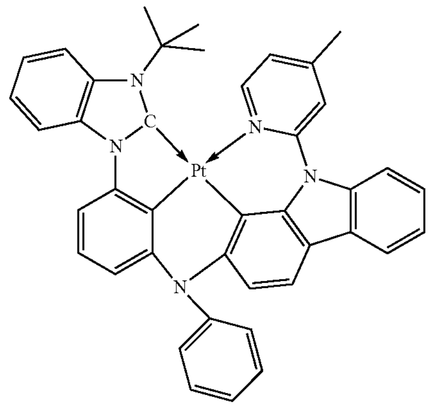
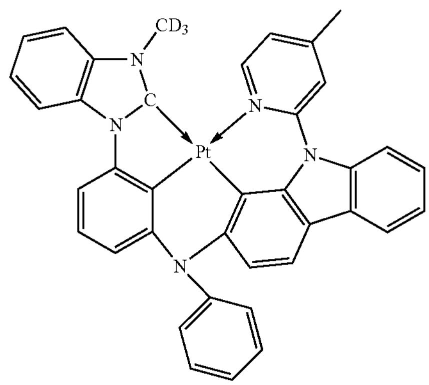
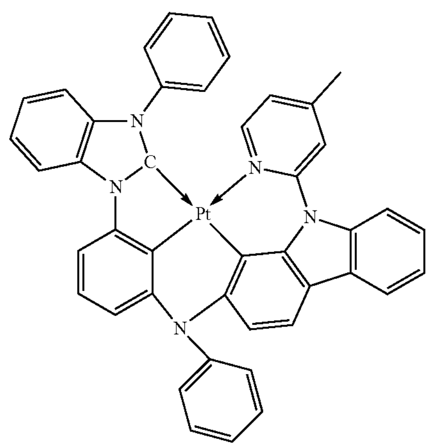
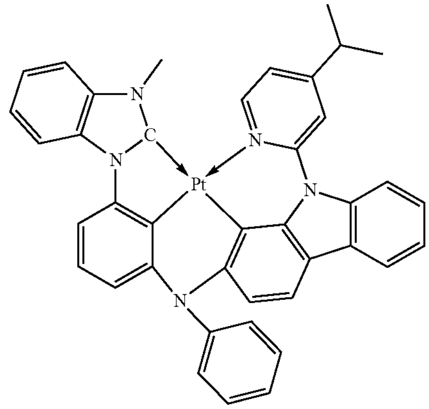

-continued
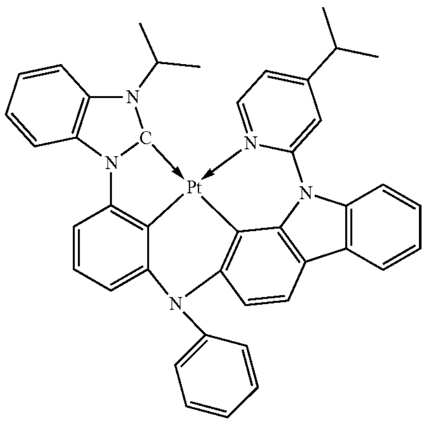
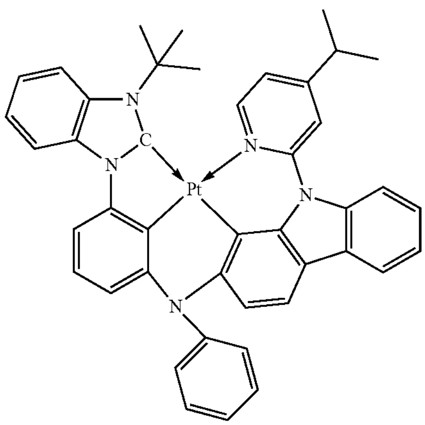
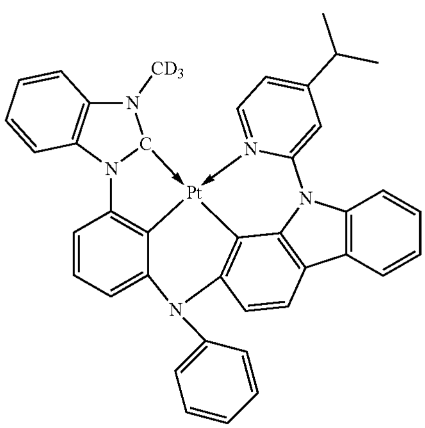
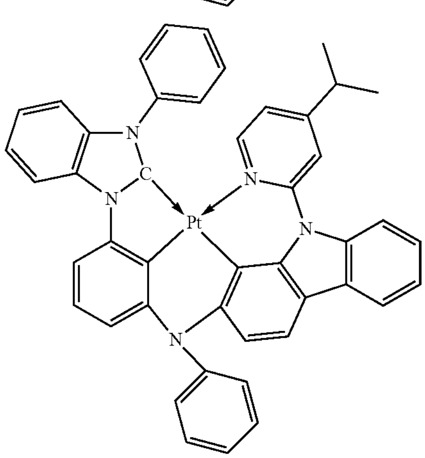
-continued
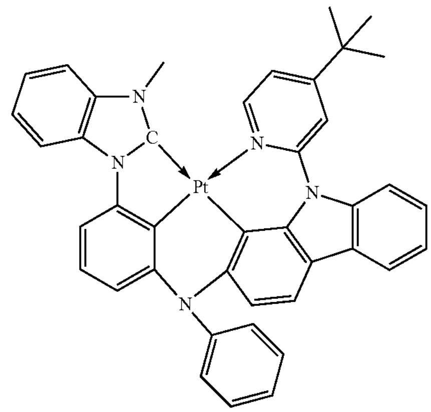
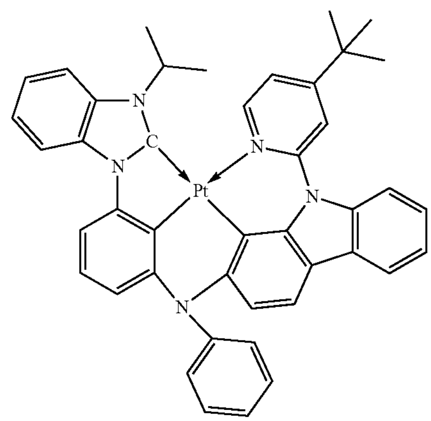
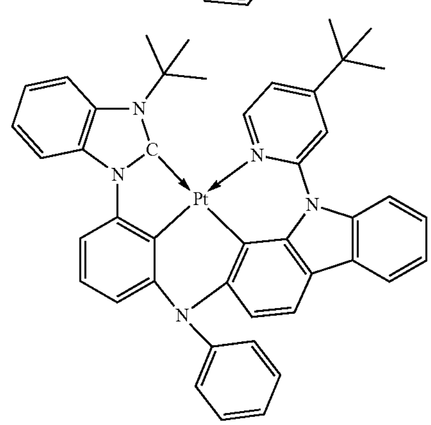
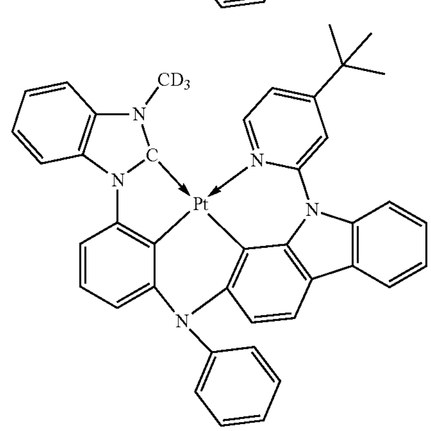

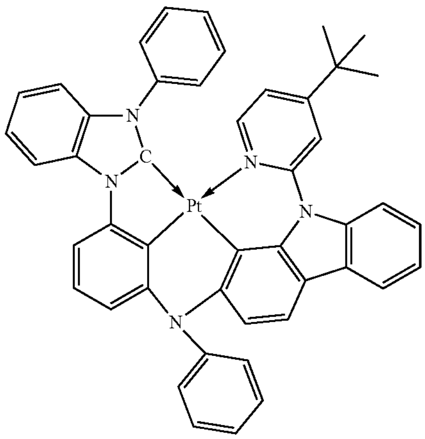
N
C
N
Pt
N
N
N
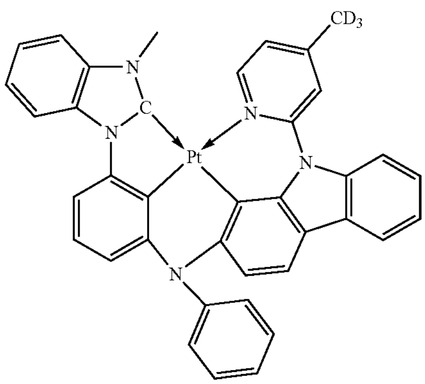
CD3
N
C
N
Pt
N
N
N
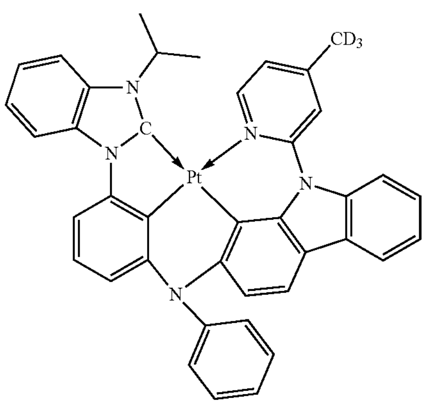
CD3
N
C
N
Pt
N
N
N
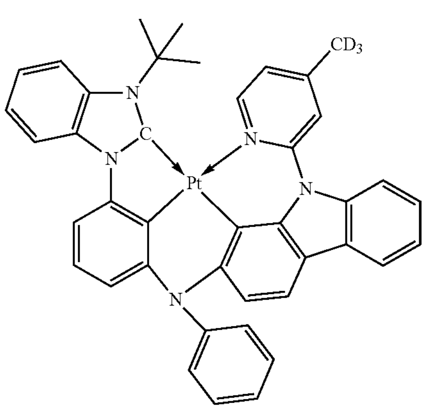
CD3
N
C
N
Pt
N
N
N
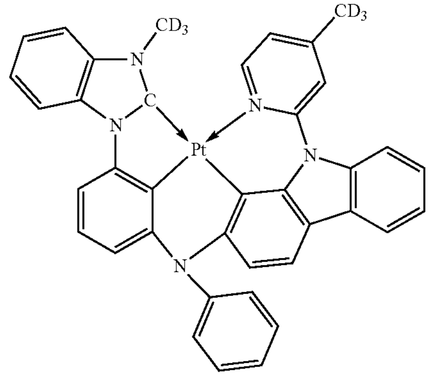
CD3
CD3
N
C
N
Pt
N
N
N
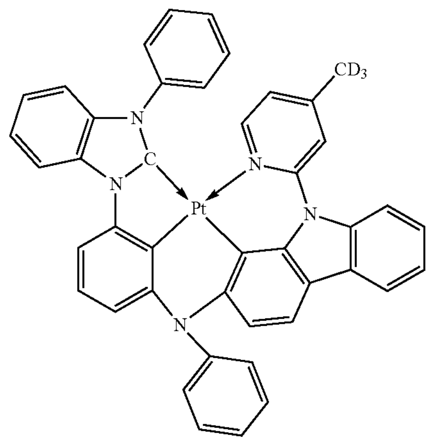
CD3
N
C
N
Pt
N
N
N
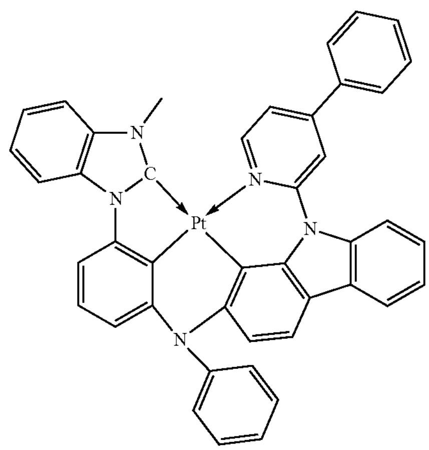
N
C
N
Pt
N
N
N
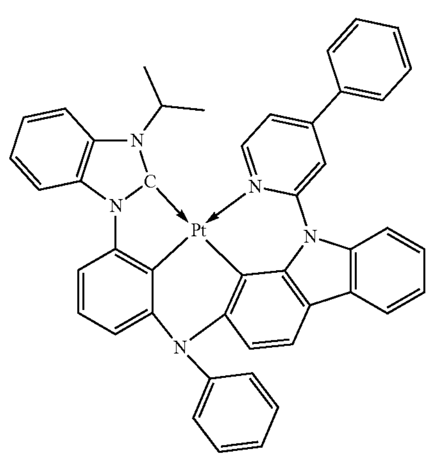
N
C
N
Pt
N
N
N -continued
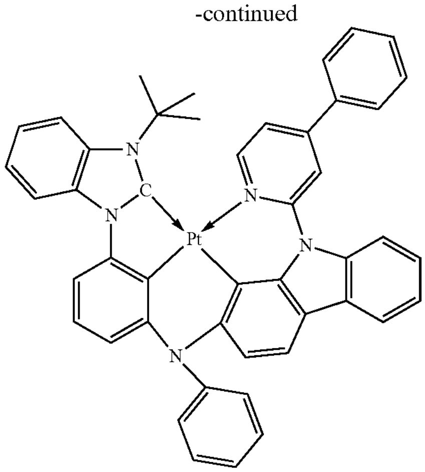
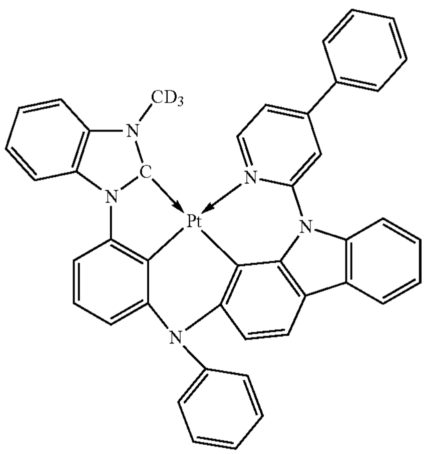
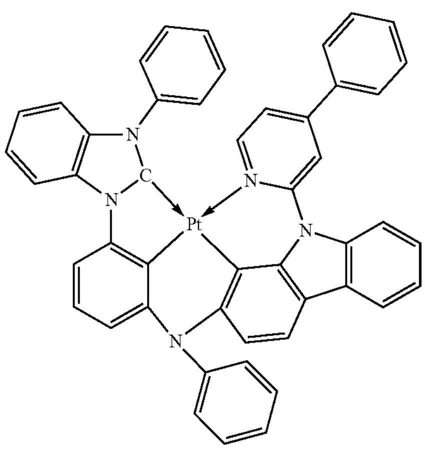
-continued
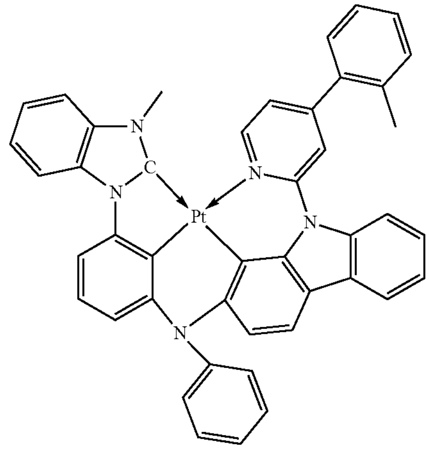
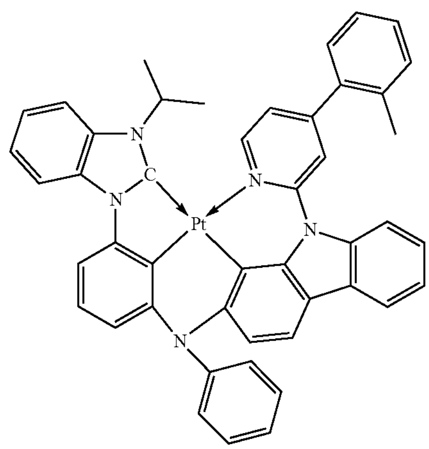
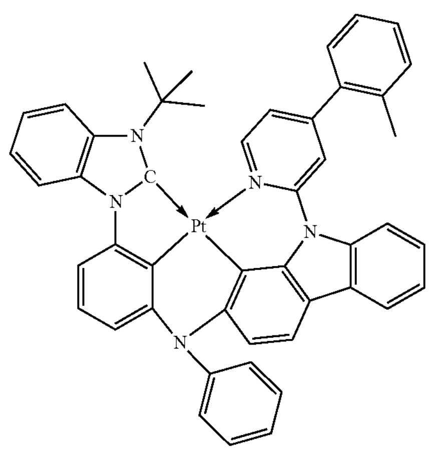

-continued
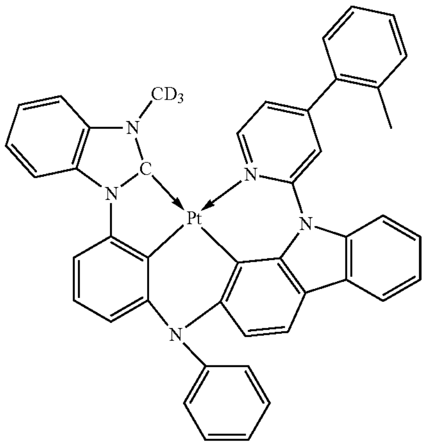
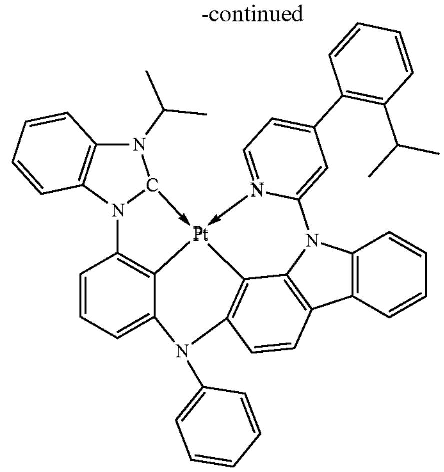
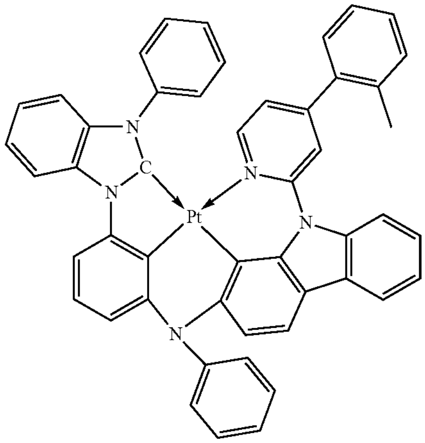
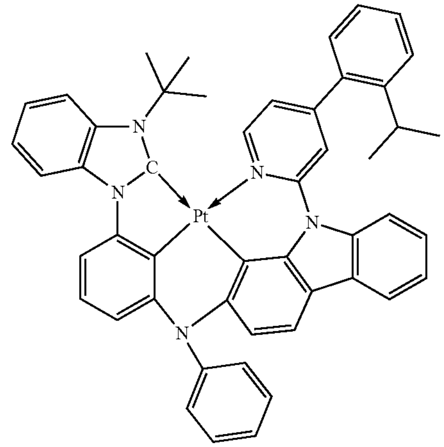
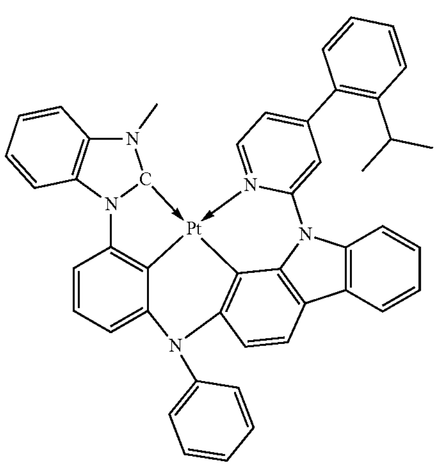
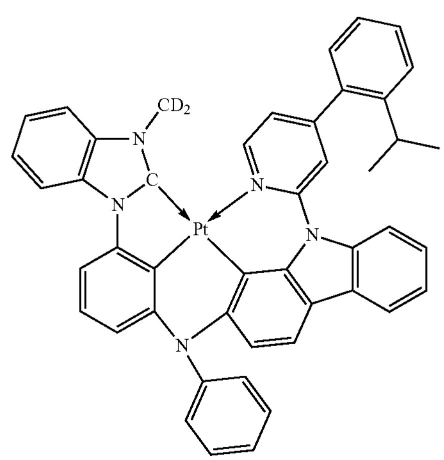
-continued -continued
-continued
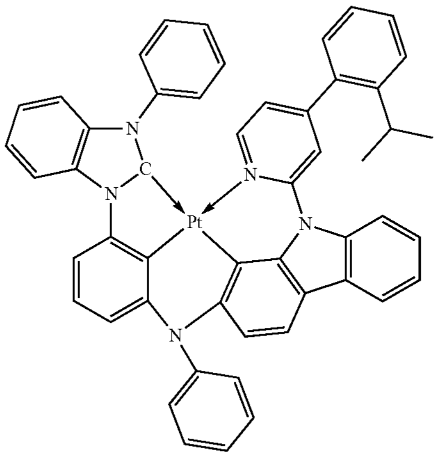
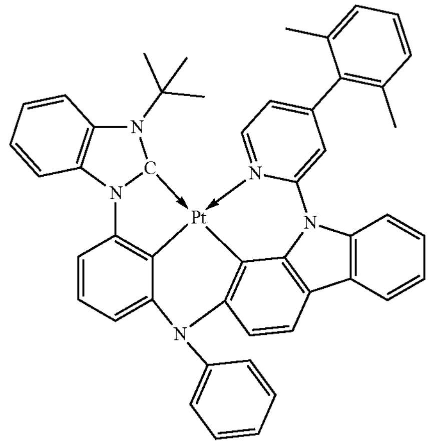
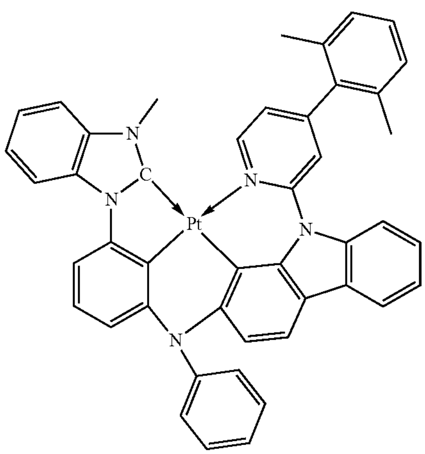
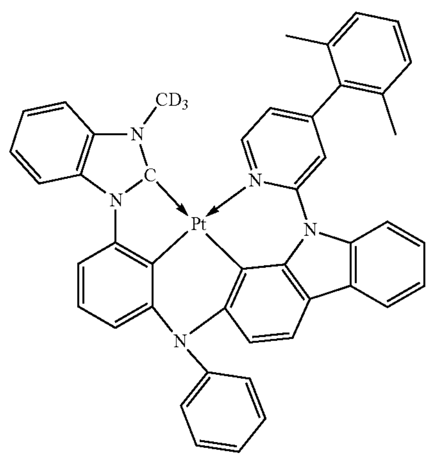
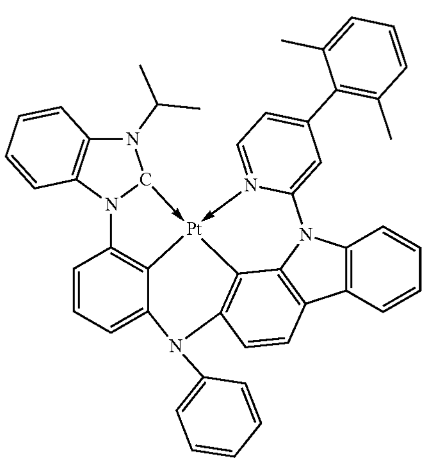
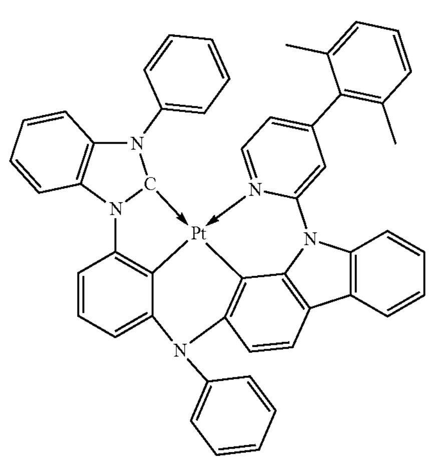

-continued
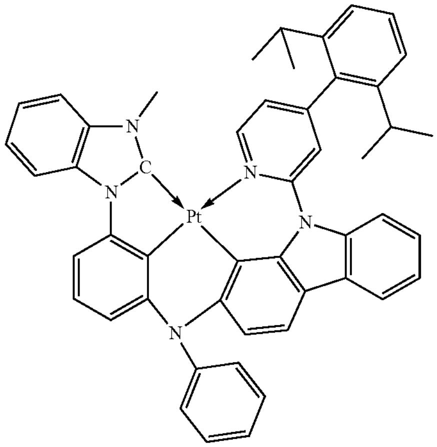
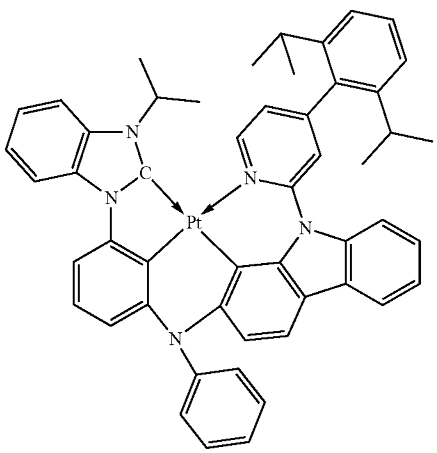
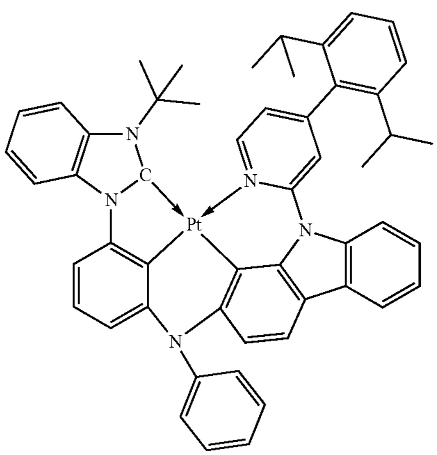
-continued
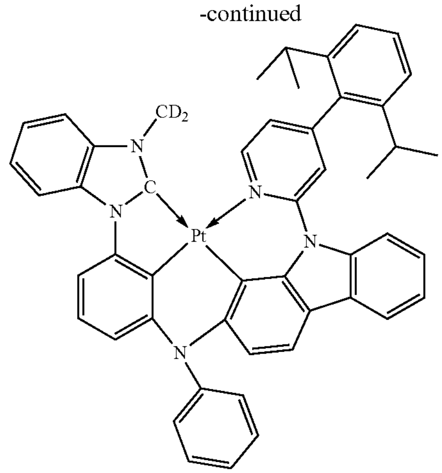
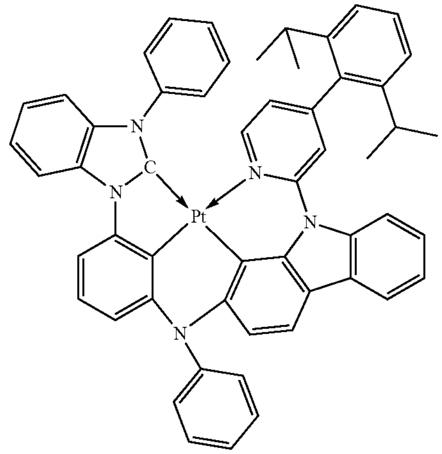
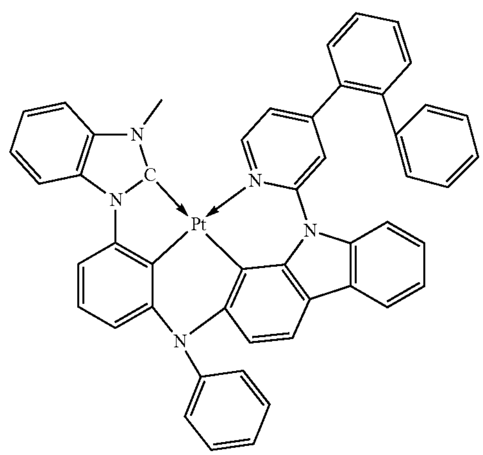

-continued
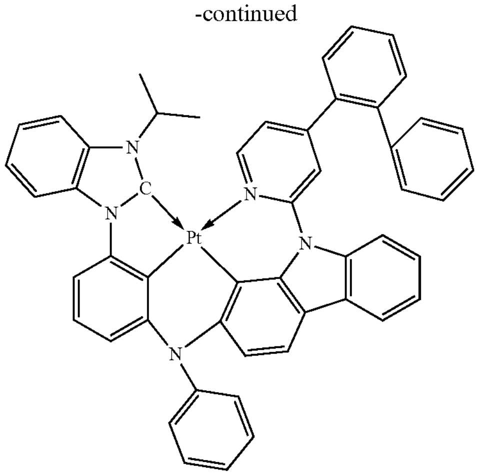
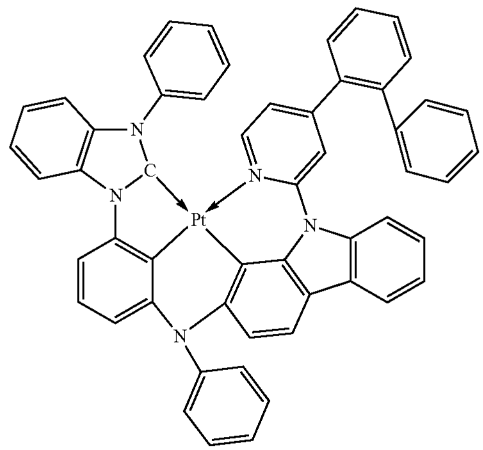
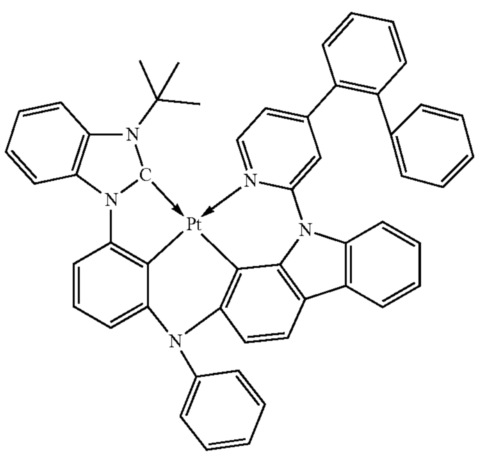
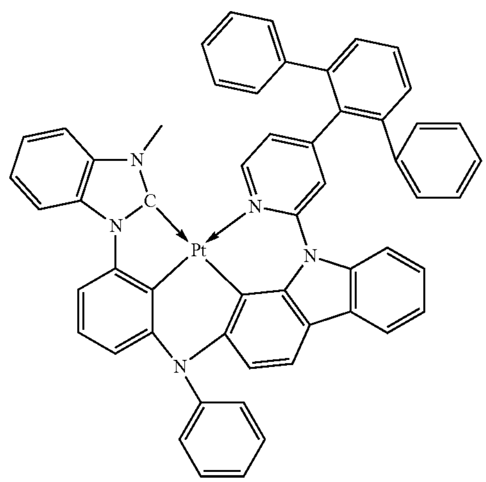
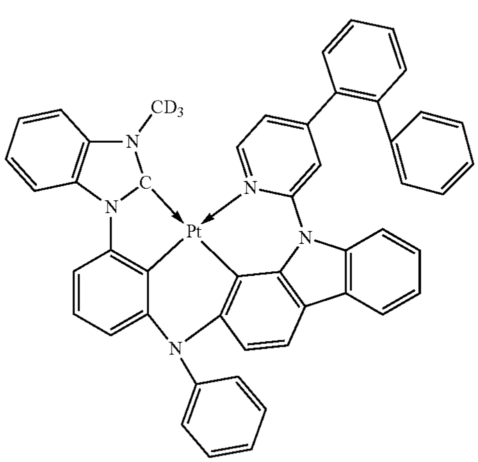
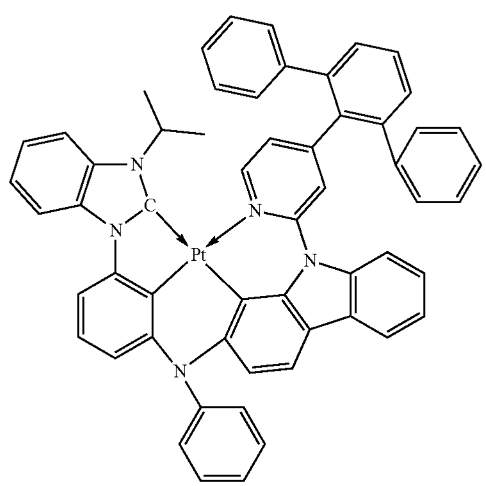

-continued
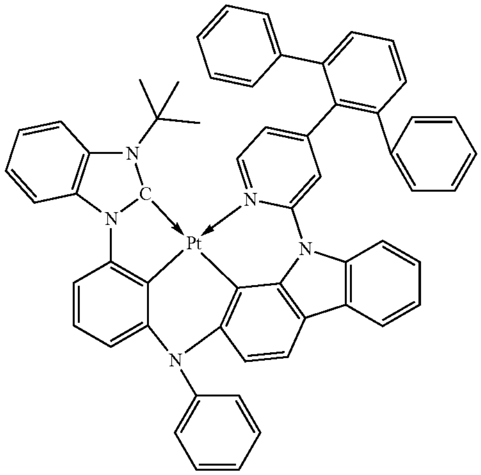
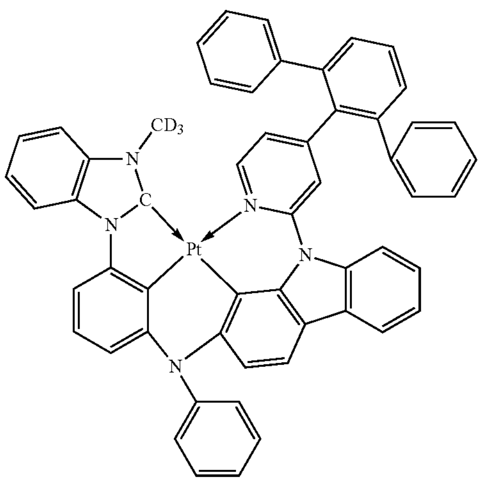
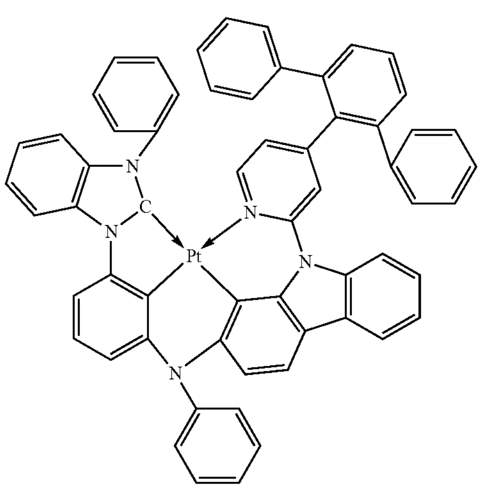
-continued
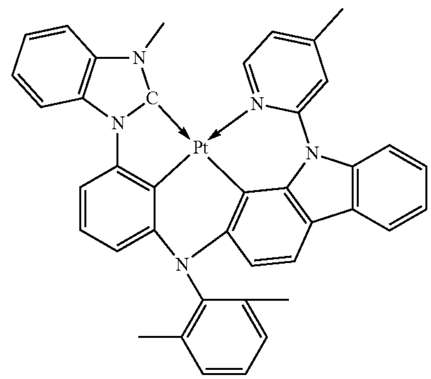
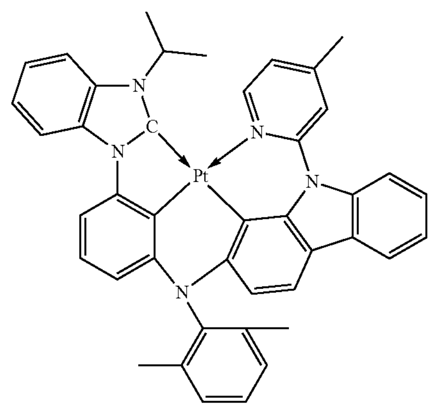
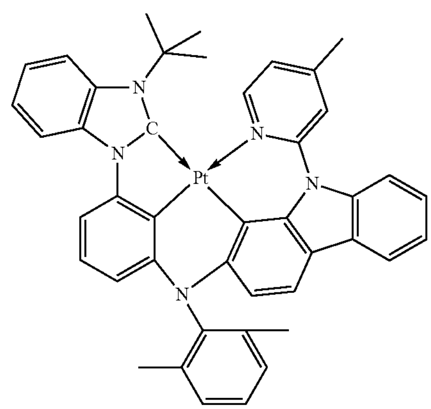
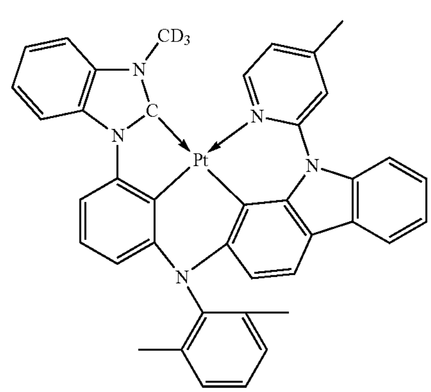

-continued
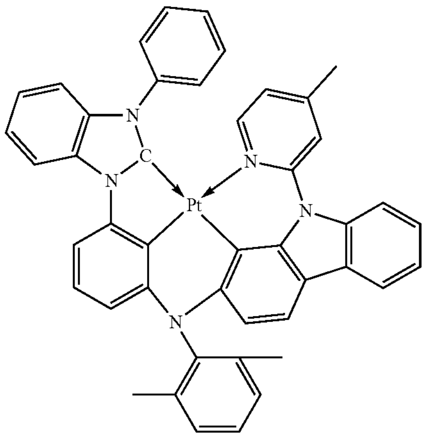
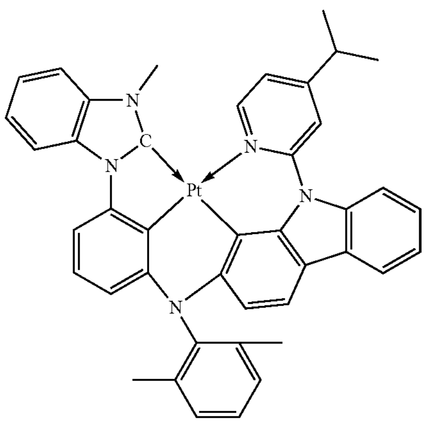
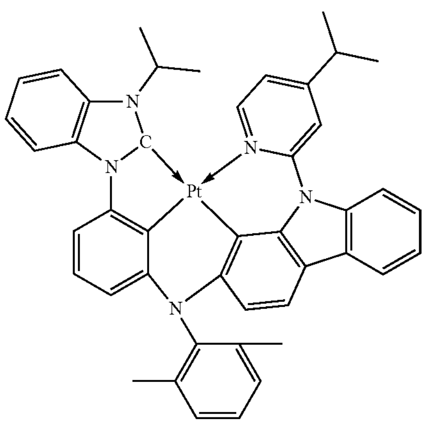
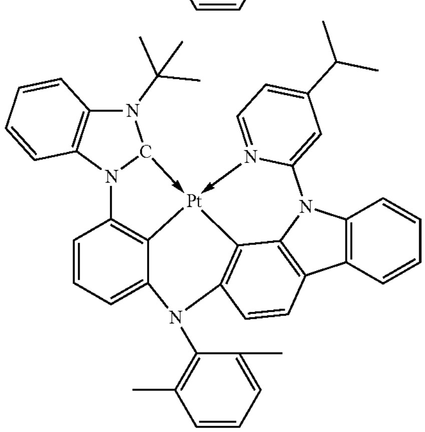
-continued
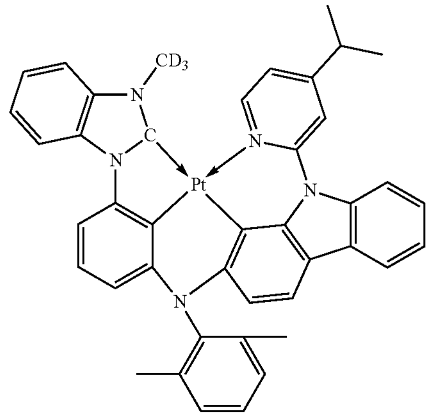
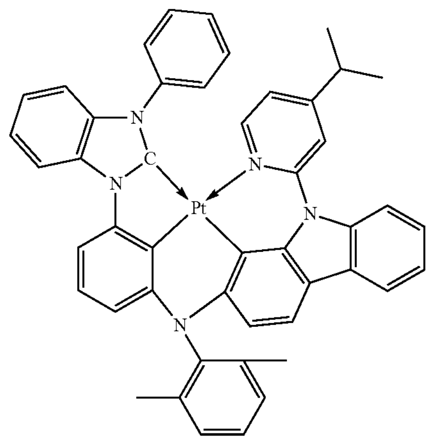
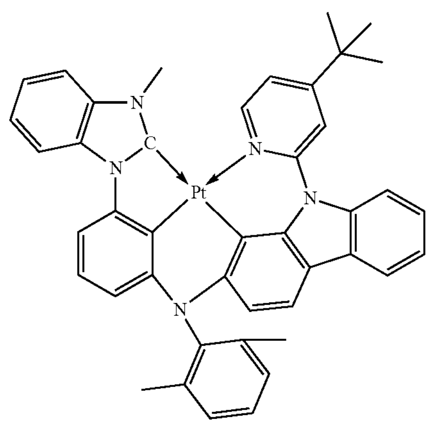
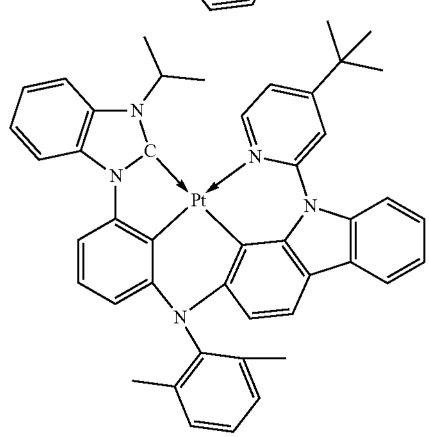

-continued
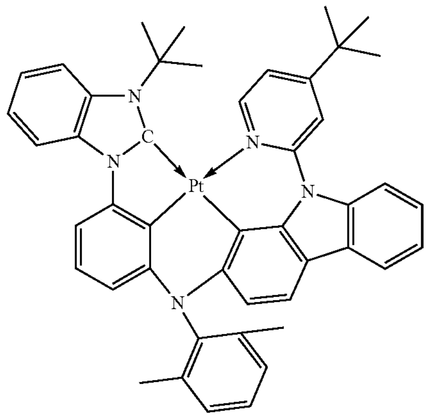
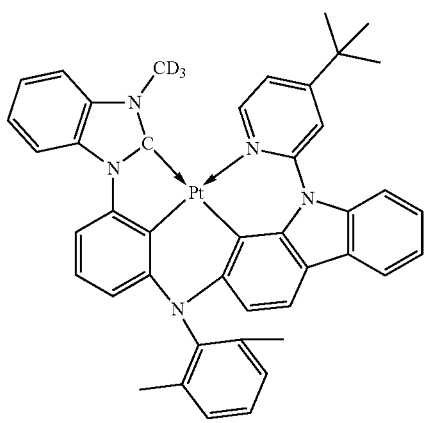
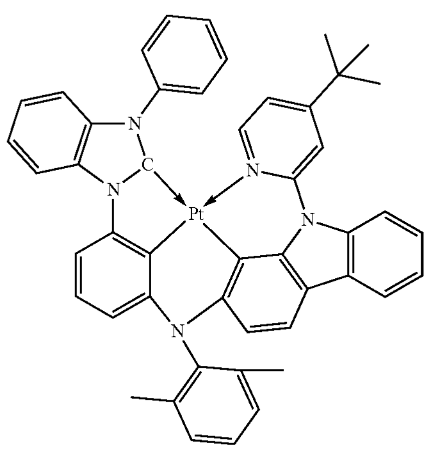
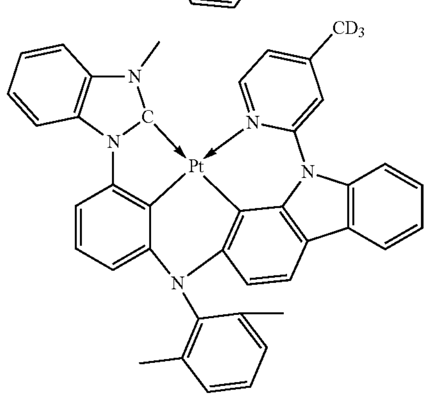
-continued
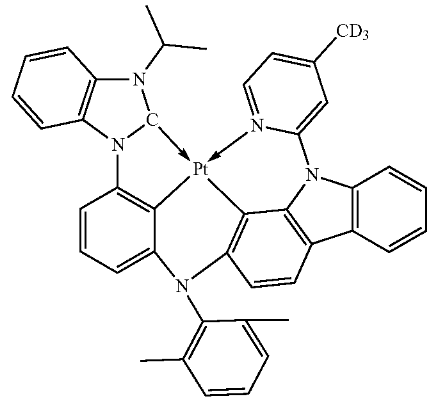
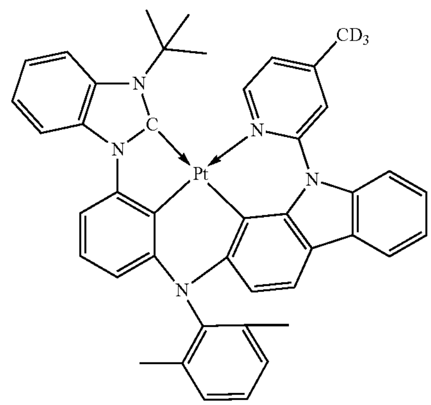
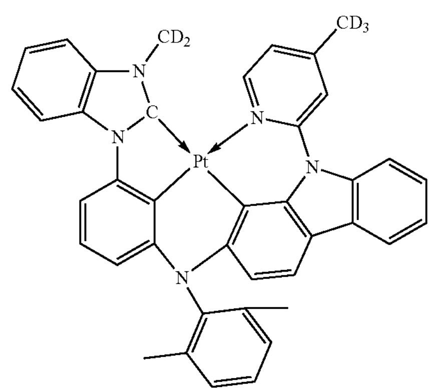
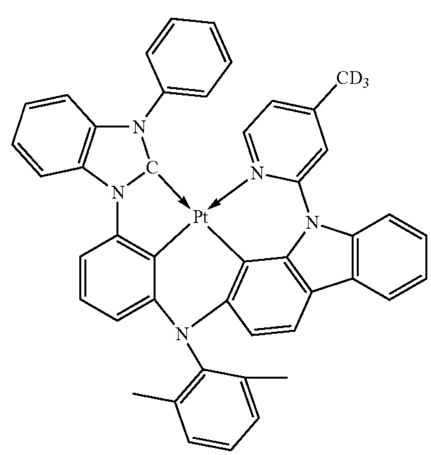

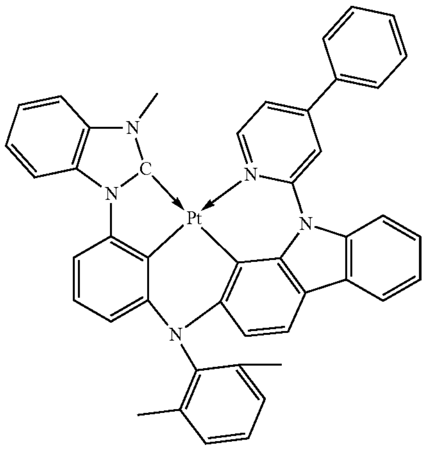
N
C
N
N
Pt
N
N
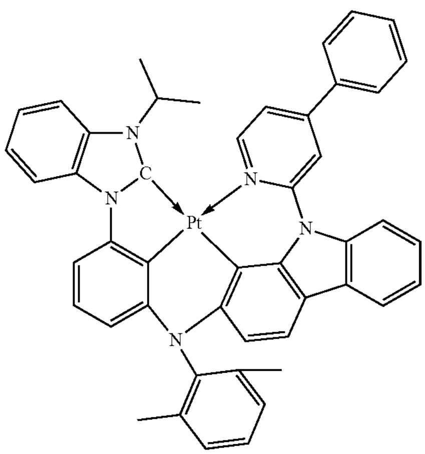
N
C
N
N
Pt
N
N
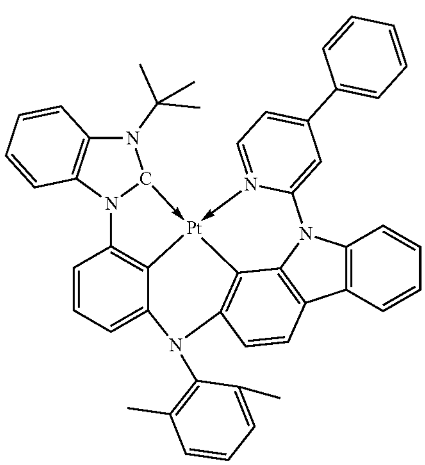
N
C
N
N
Pt
N
N
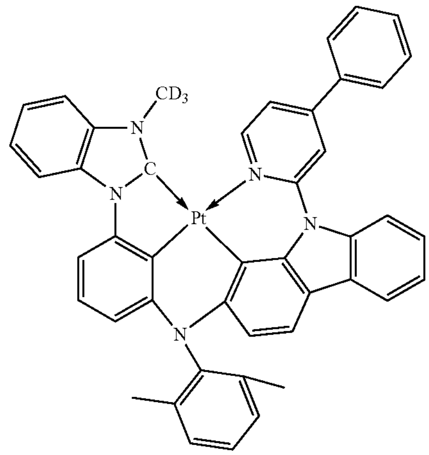
CD3
N
C
N
N
Pt
N
N
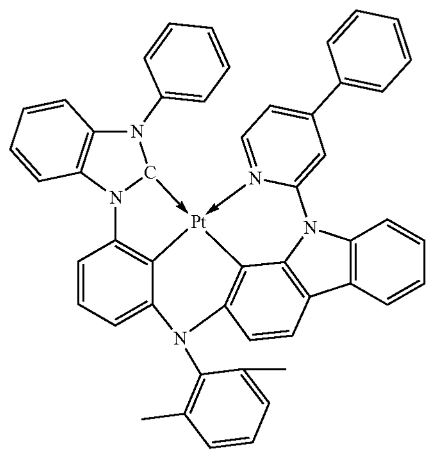
N
C
N
N
Pt
N
N
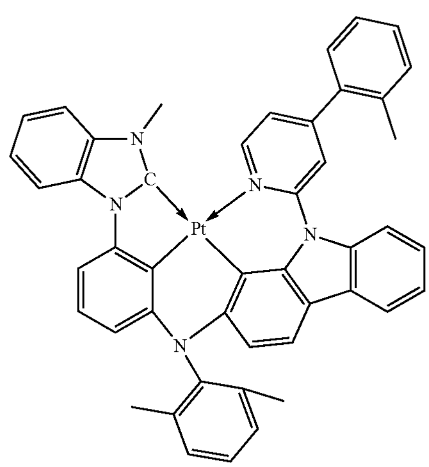
N
C
N
N
Pt
N
N

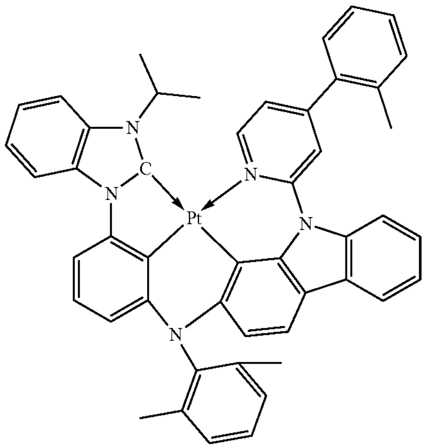
N
C
N
Pt
N
N
N
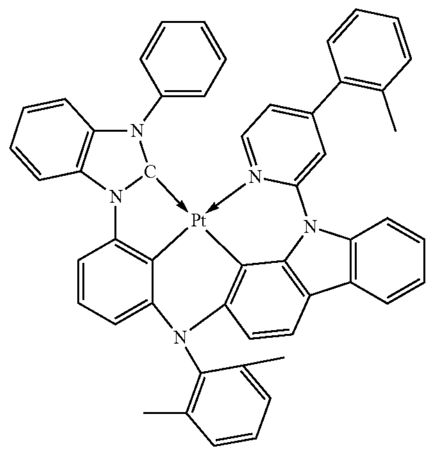
N
C
N
Pt
N
N
N
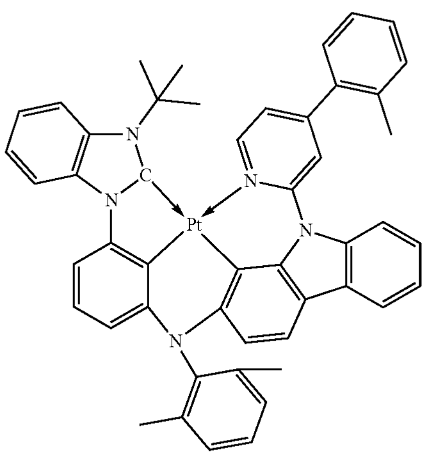
N
C
N
Pt
N
N
N
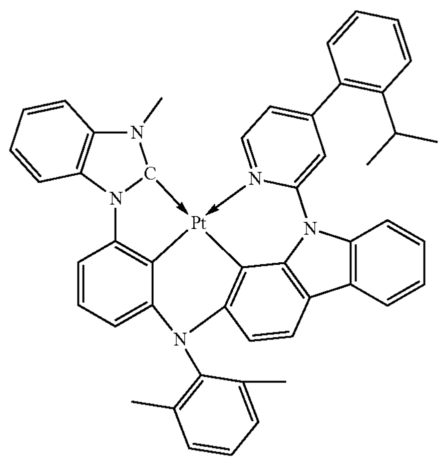
N
C
N
Pt
N
N
N
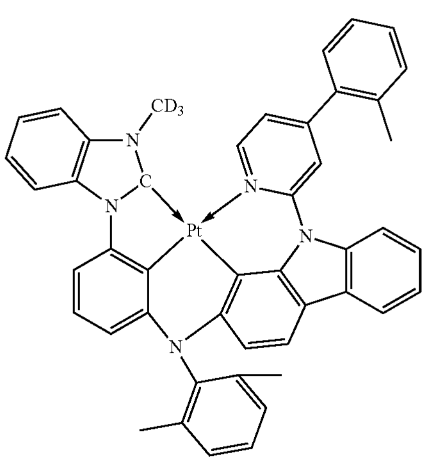
CD3
N
C
N
Pt
N
N
N
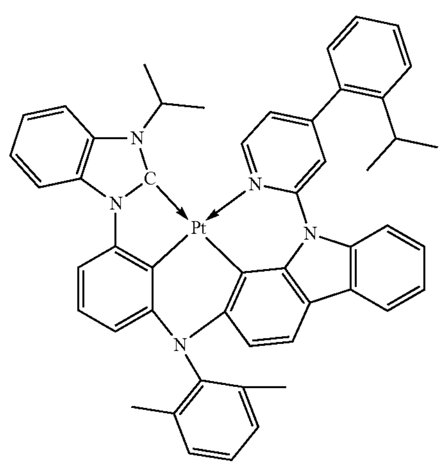
N
C
N
Pt
N
N
N -continued
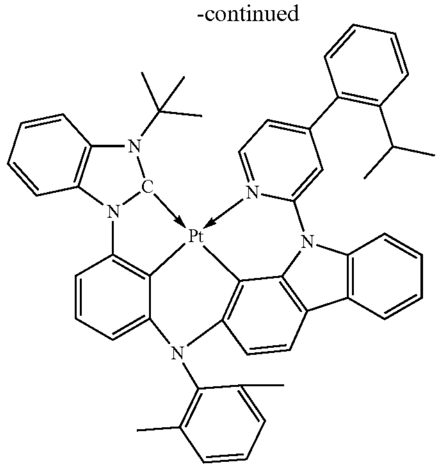
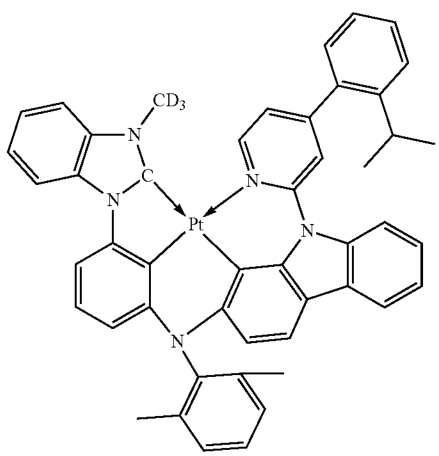
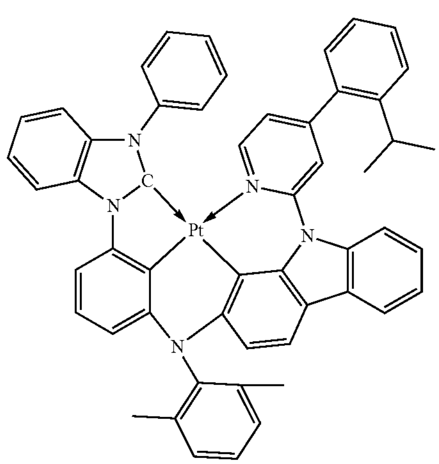
-continued
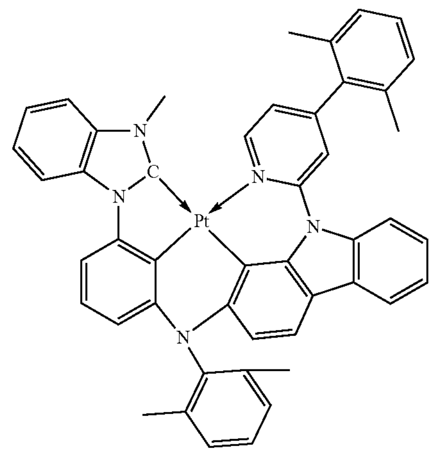
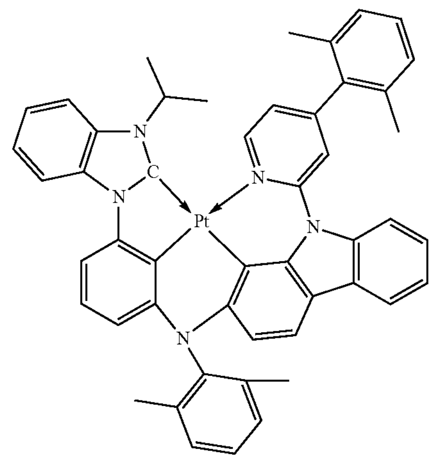
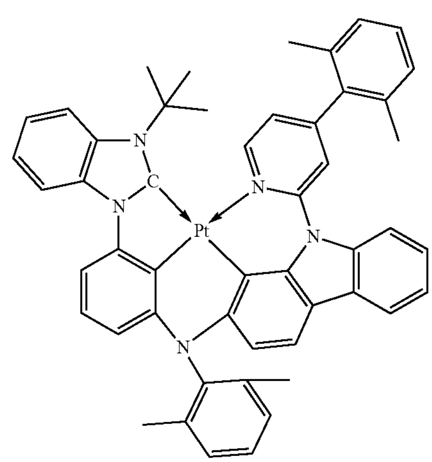

-continued
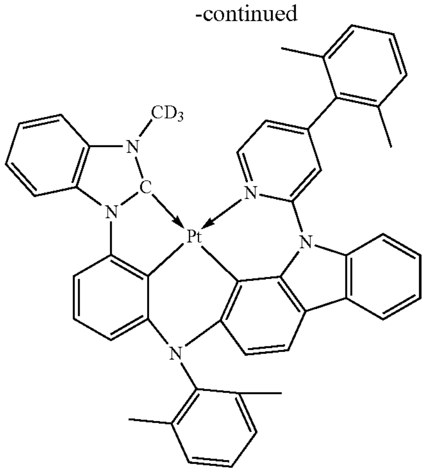
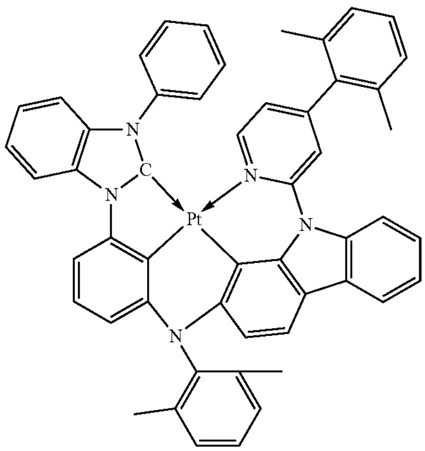
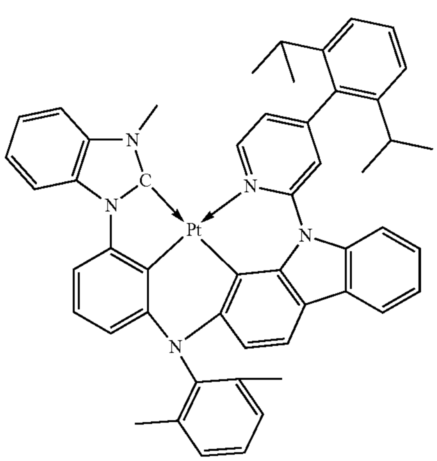
-continued
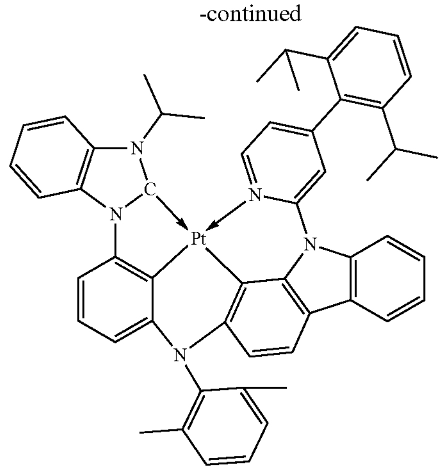
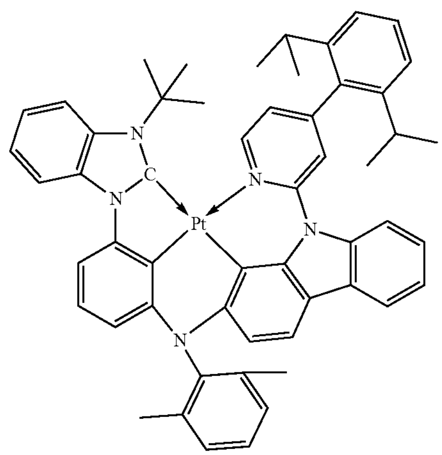
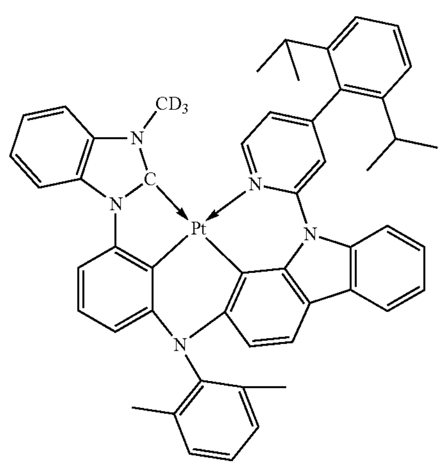

-continued
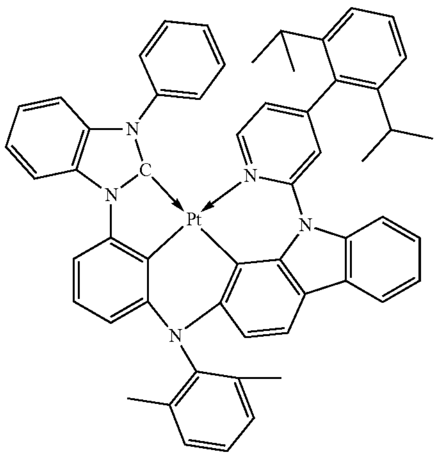
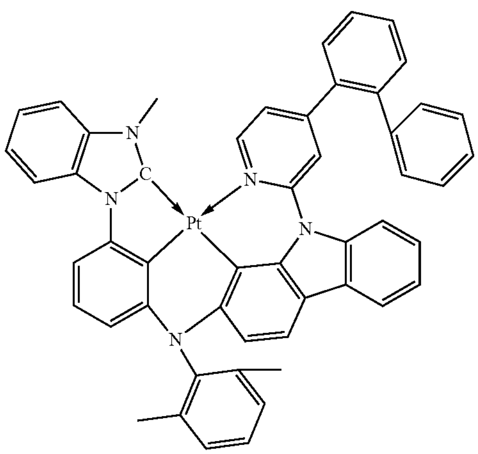
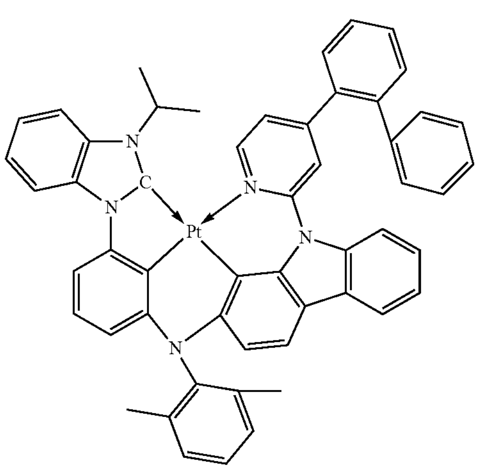
-continued
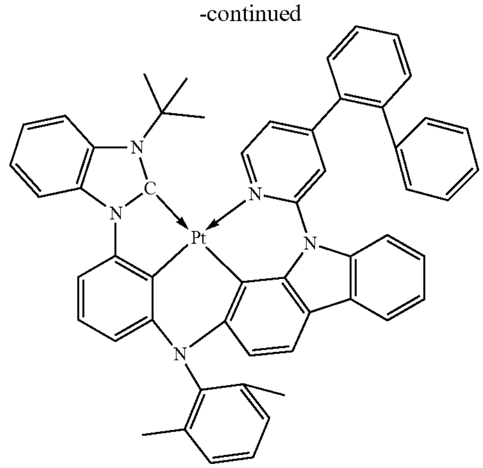
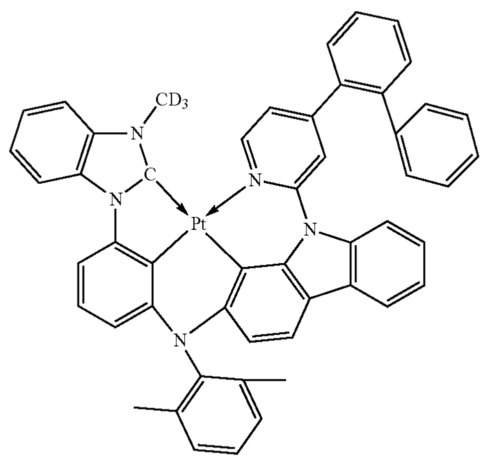
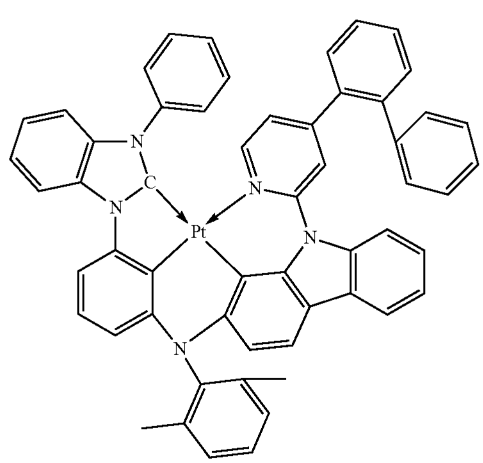

-continued
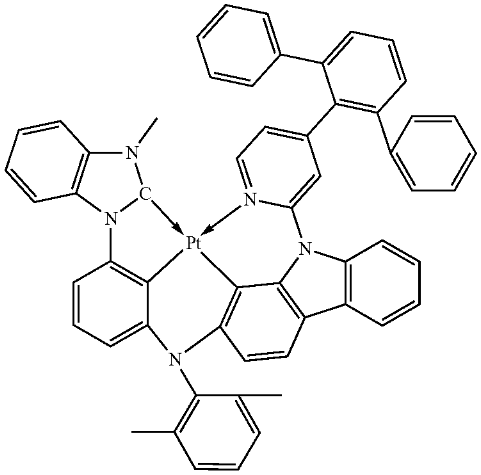
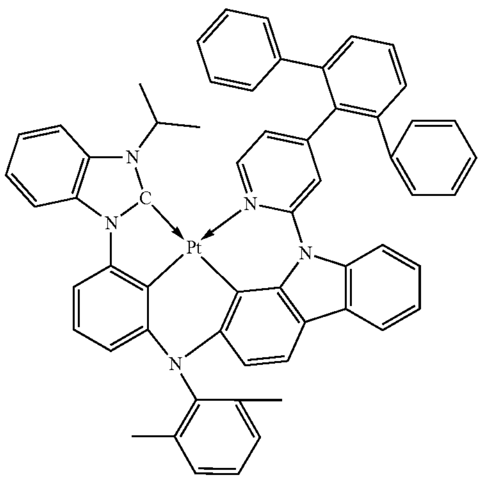
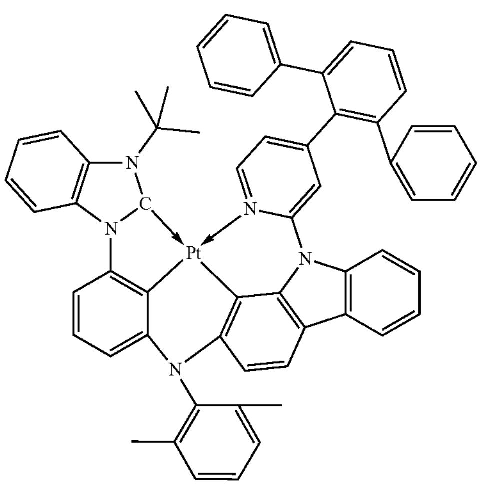
-continued
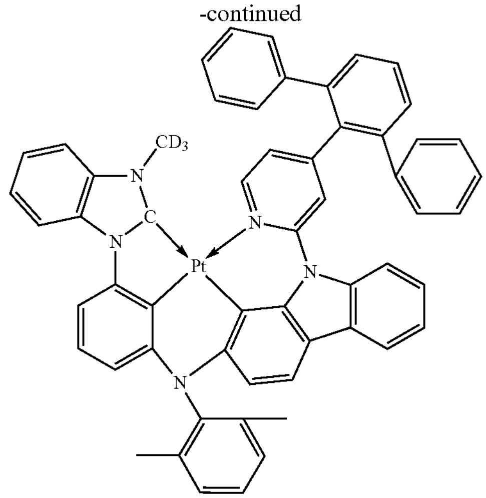
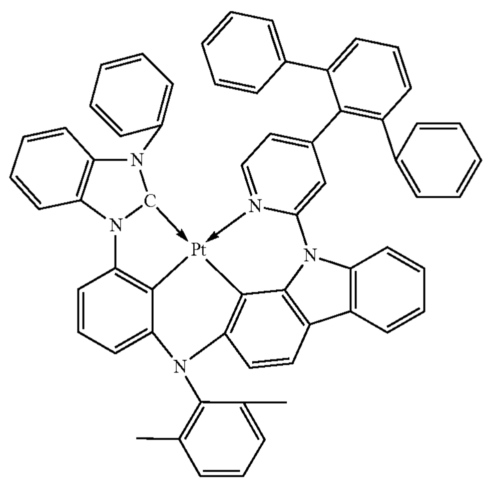
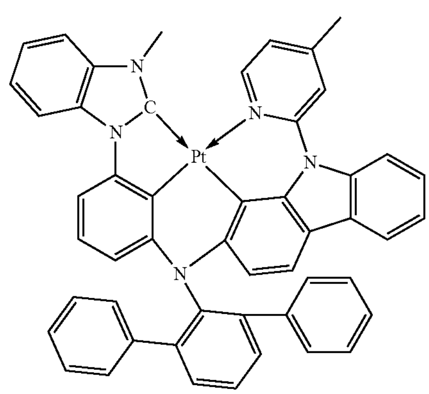

-continued
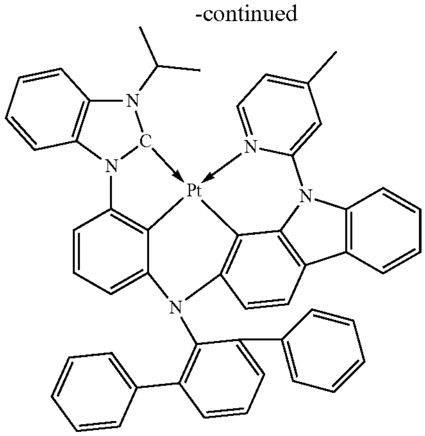
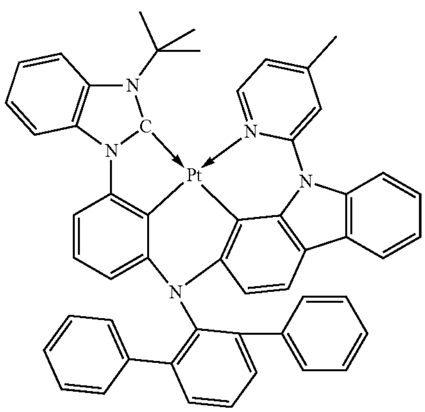
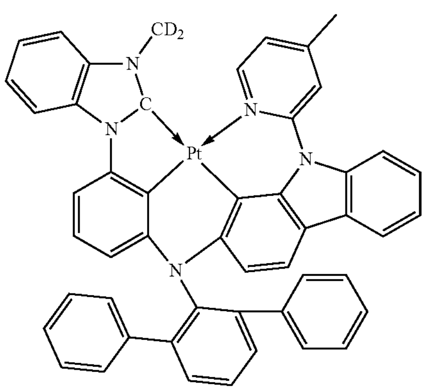
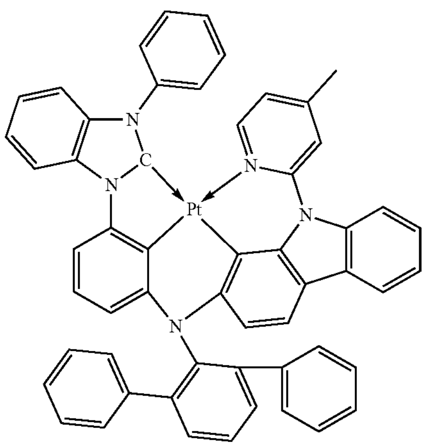
-continued
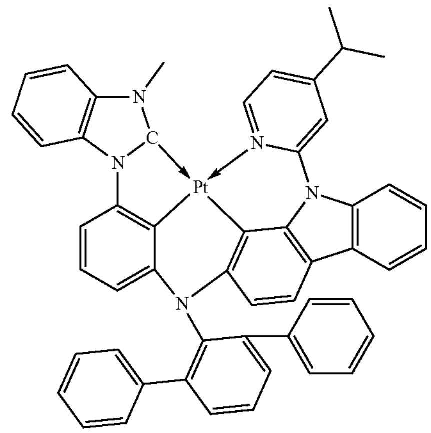
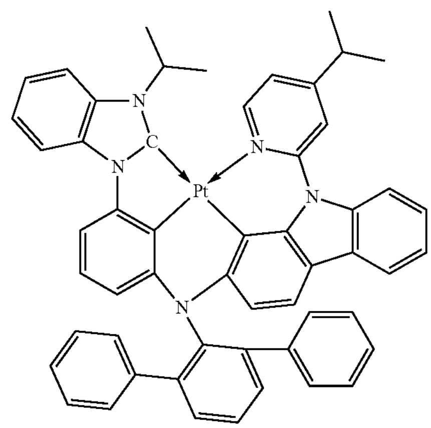
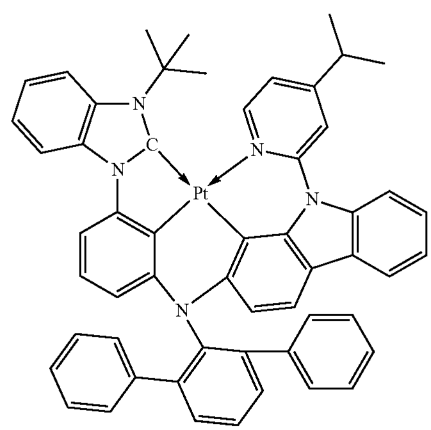
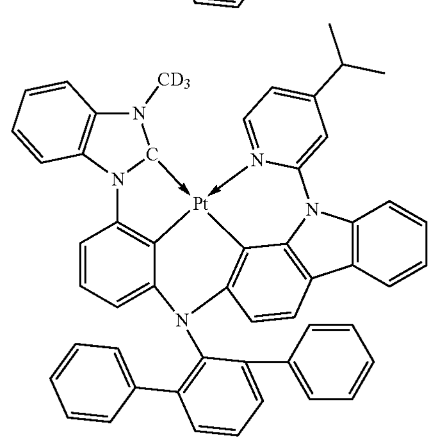

-continued
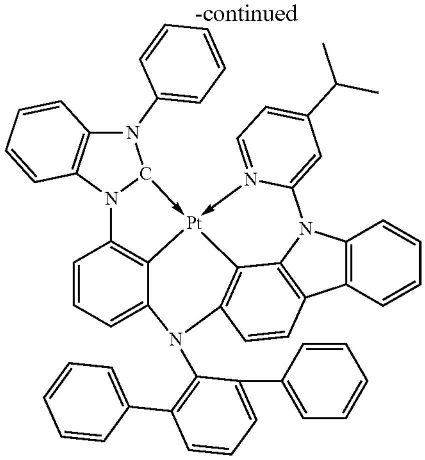
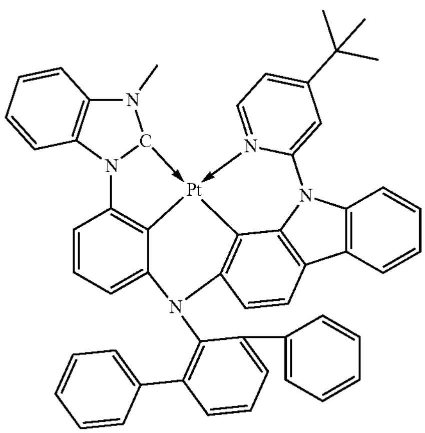
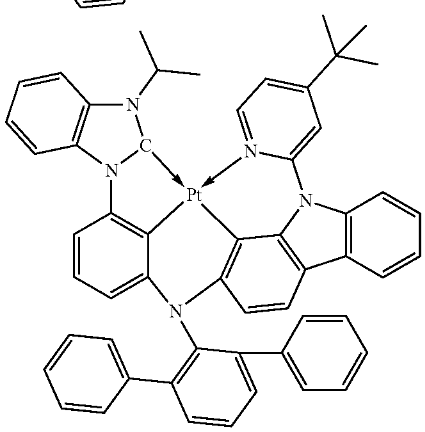
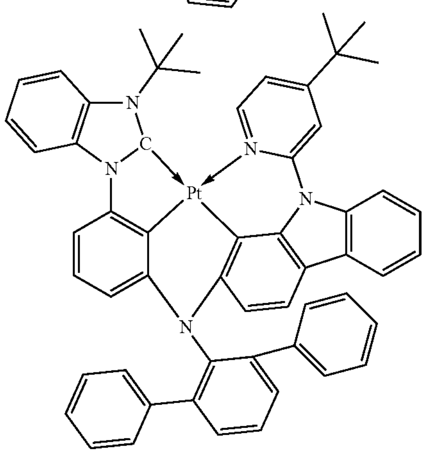
-continued
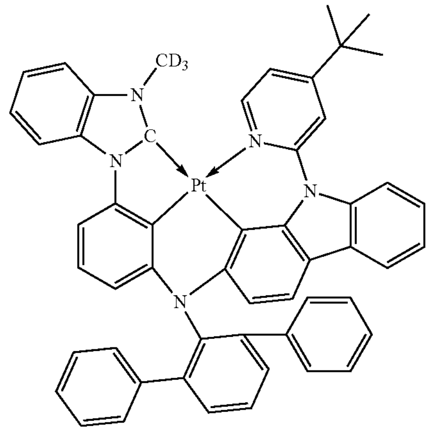
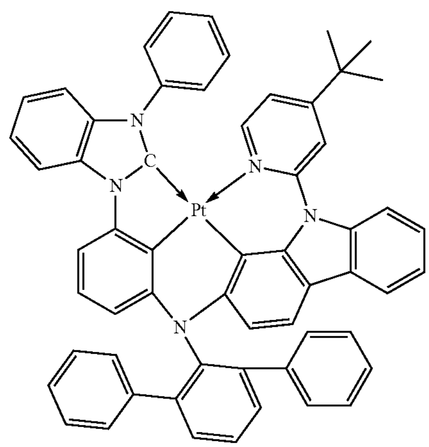
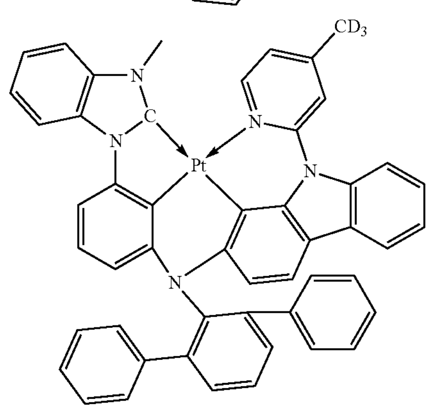
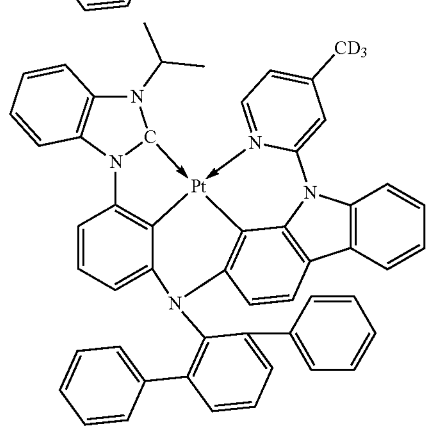

-continued
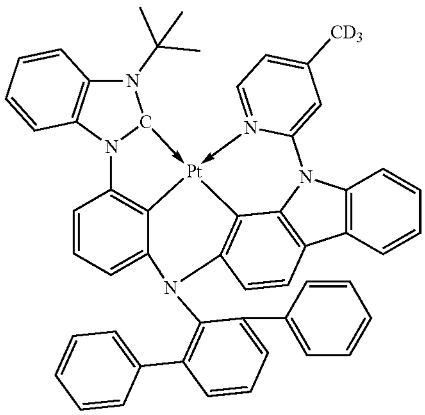
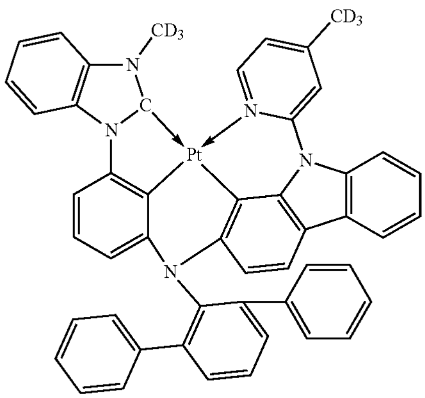
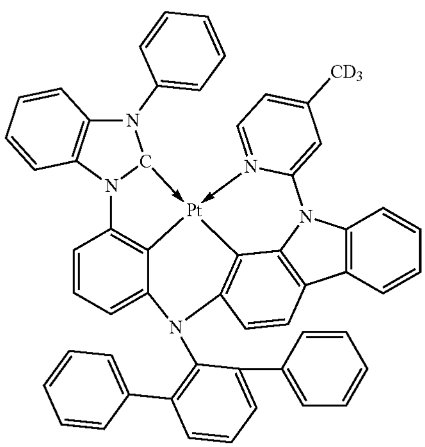
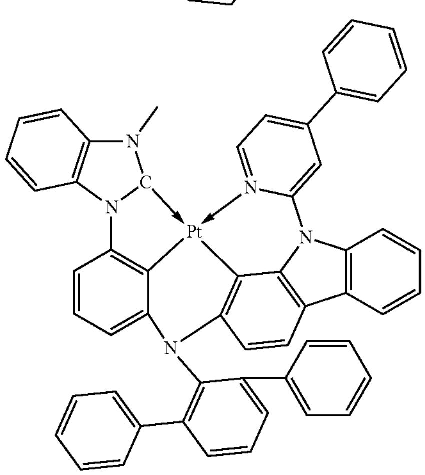
-continued
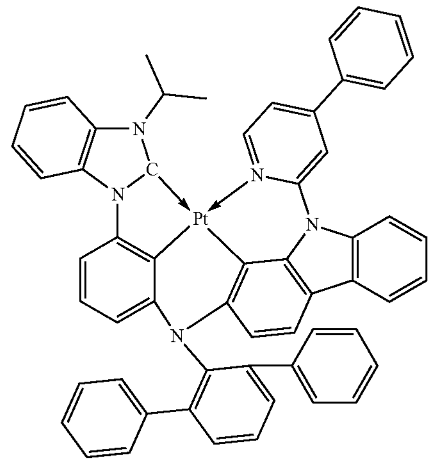
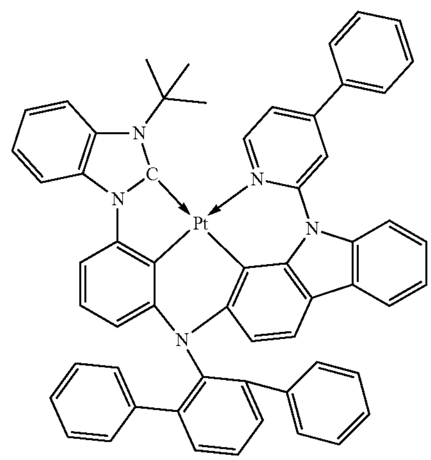
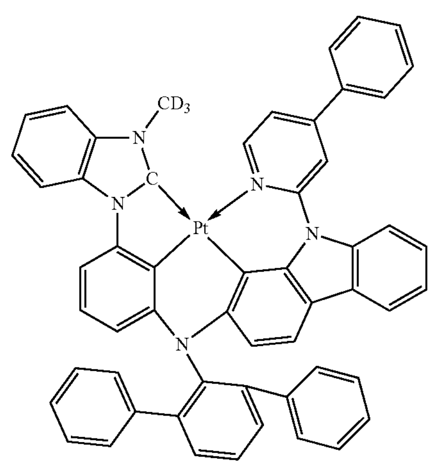

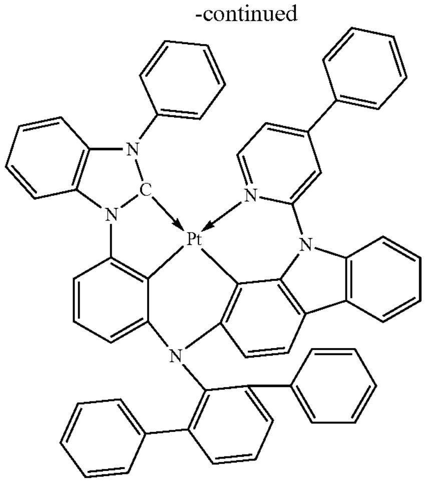
N
C
N
Pt
N
N
N
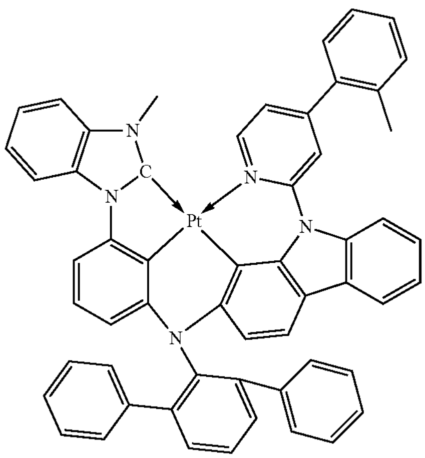
N
C
N
Pt
N
N
N
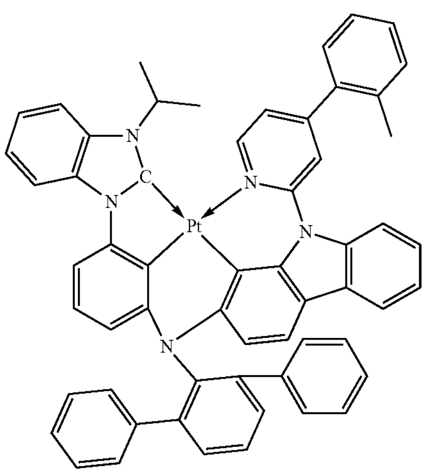
N
C
N
Pt
N
N
N
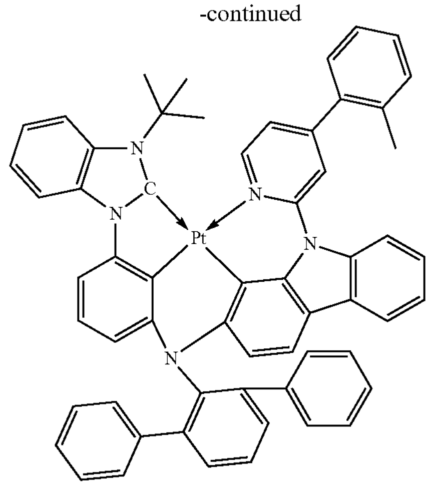
N
C
N
Pt
N
N
N
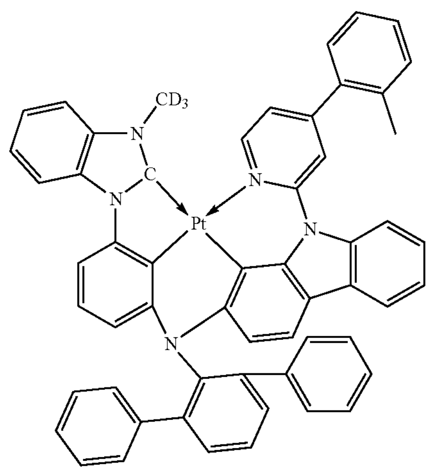
CD3
N
C
N
Pt
N
N
N
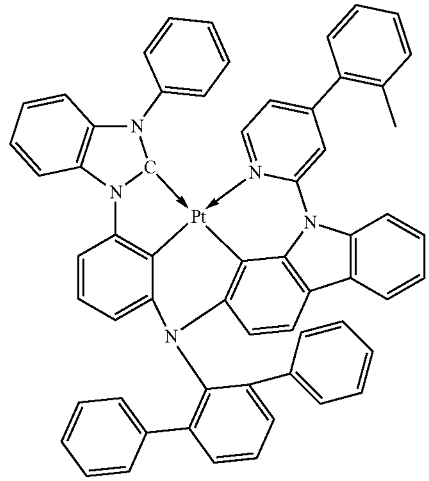
N
C
N
Pt
N
N
N -continued
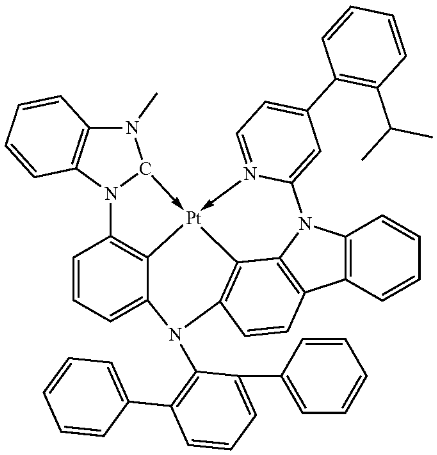
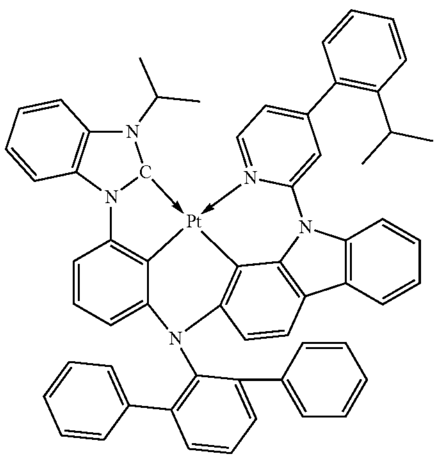
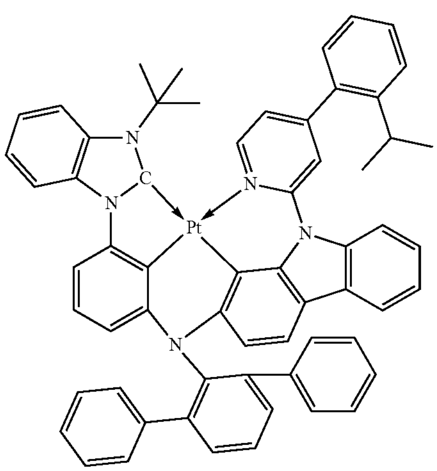
-continued
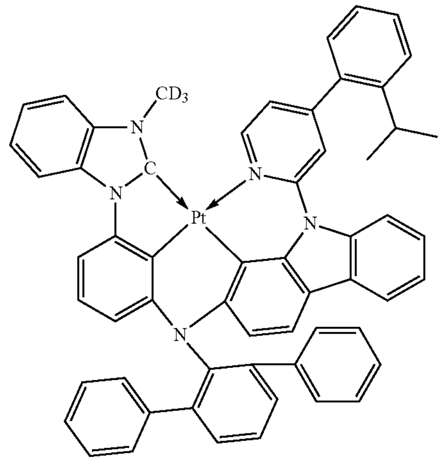
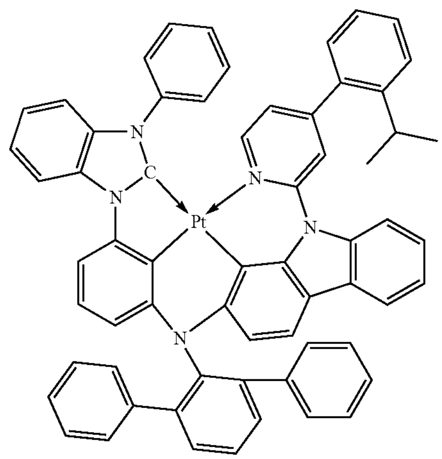
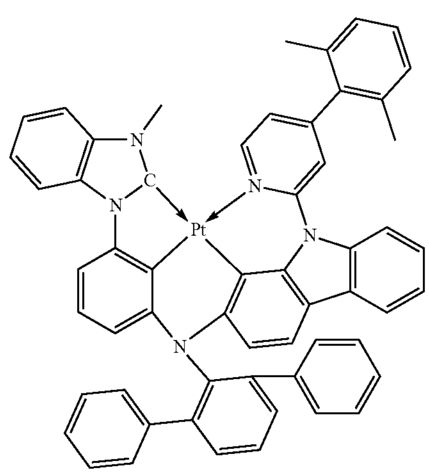

-continued
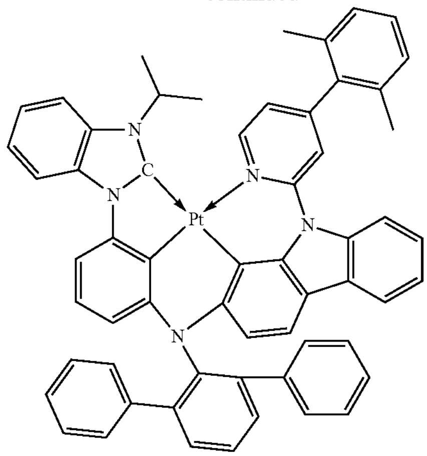
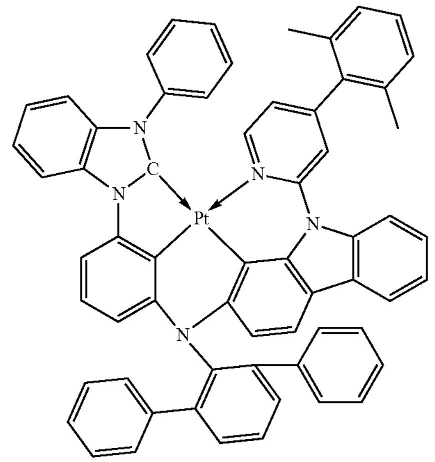
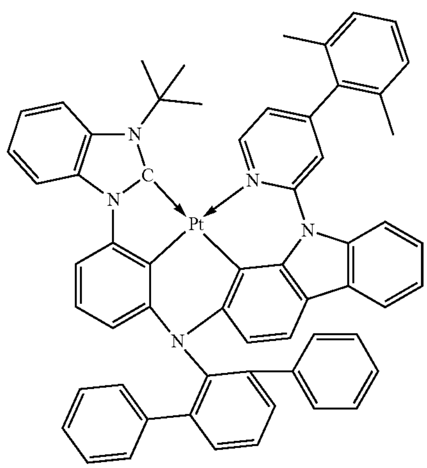
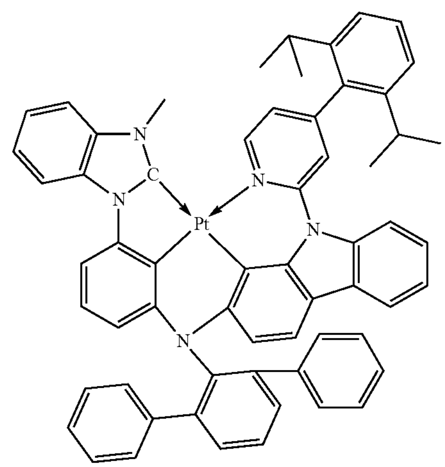
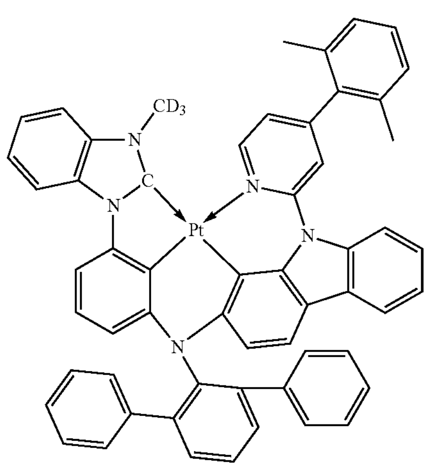
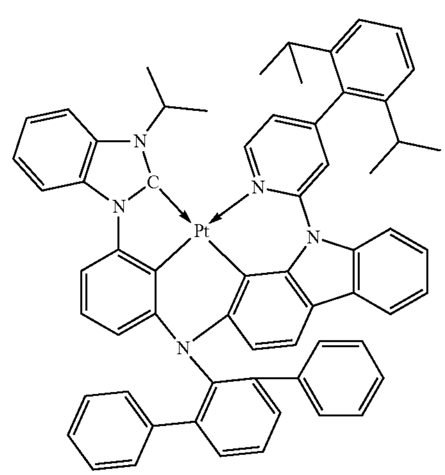

-continued
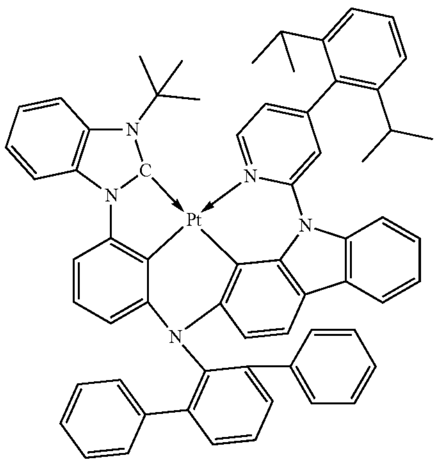
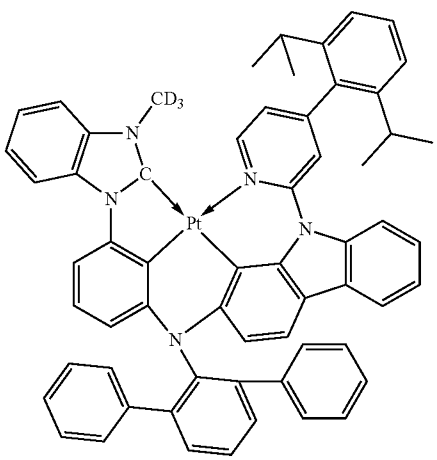
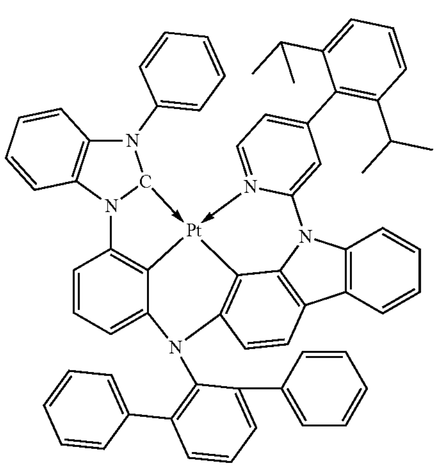
-continued
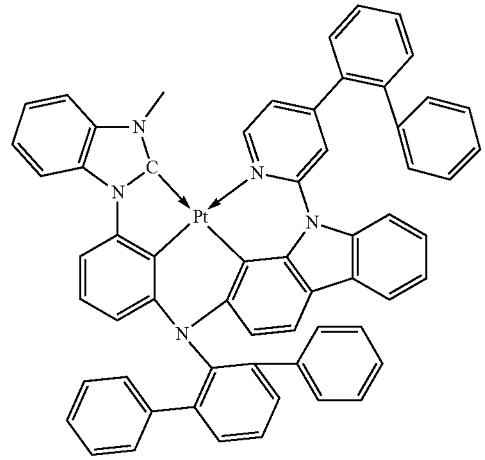
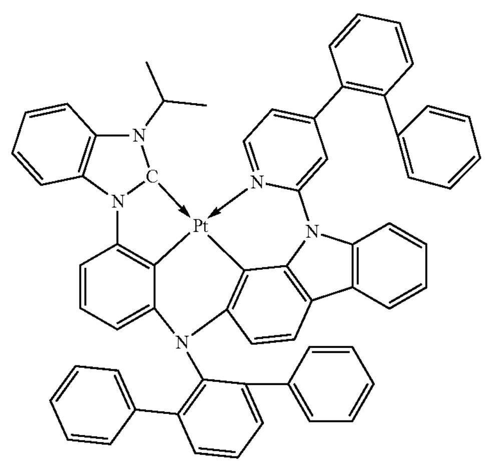
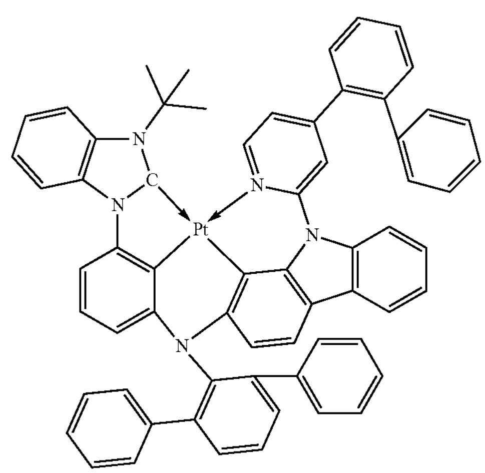

-continued
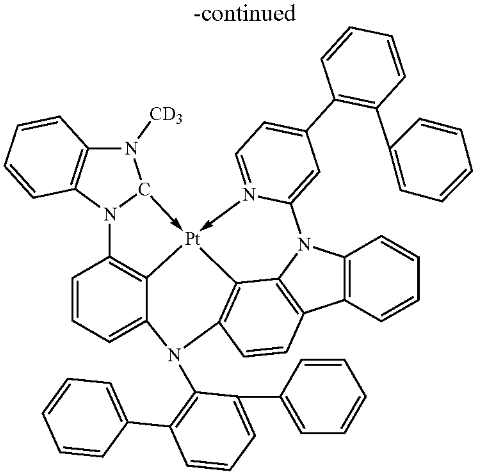
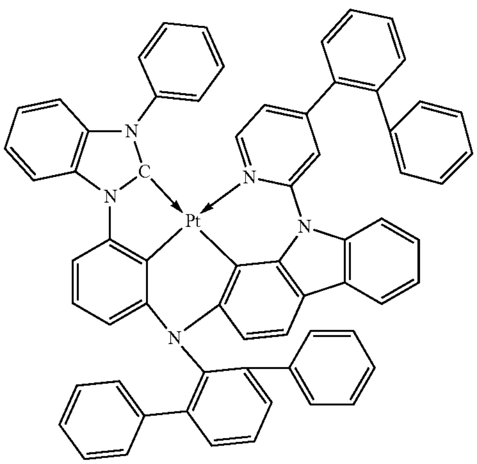
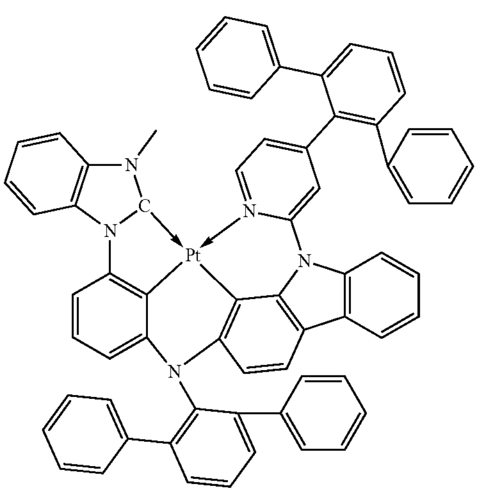
-continued
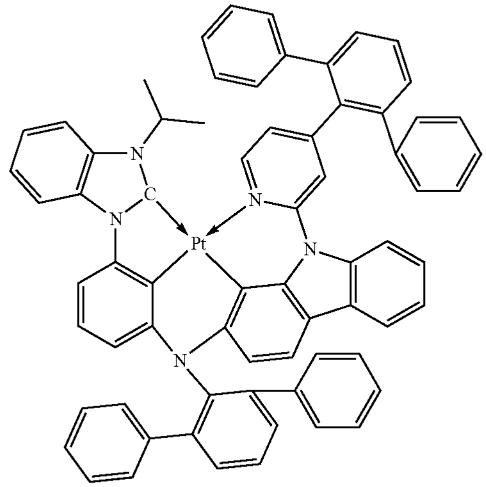
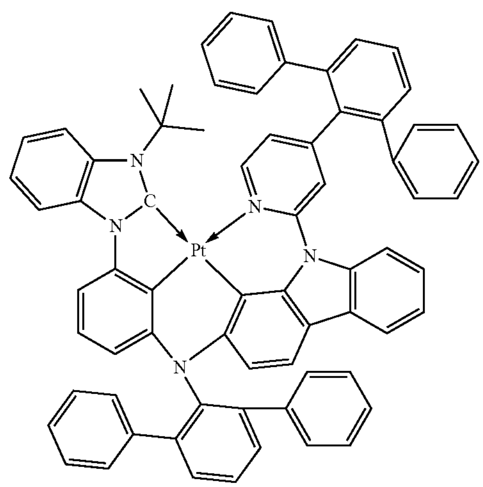
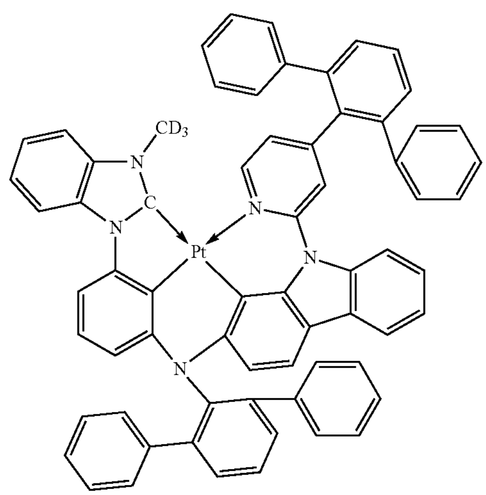

-continued
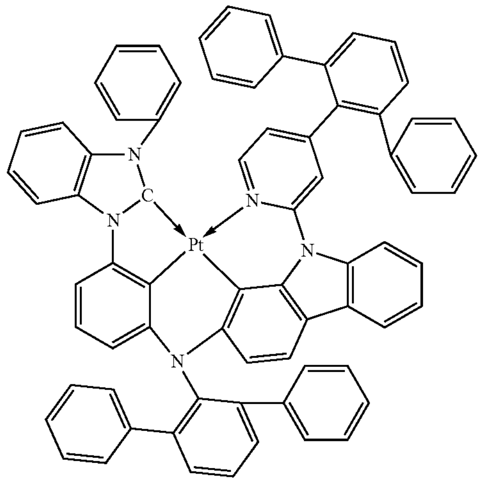
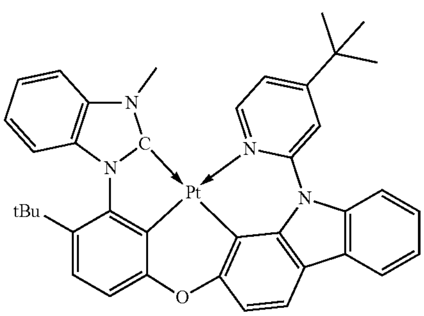
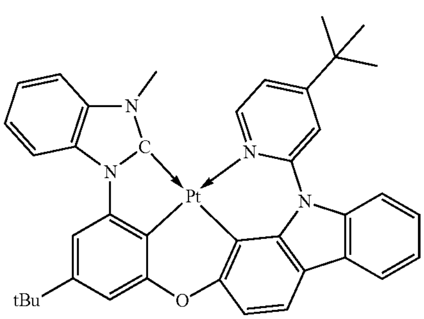
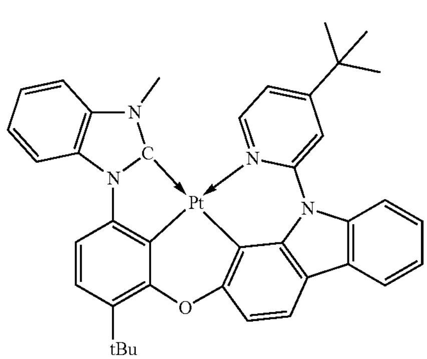
-continued
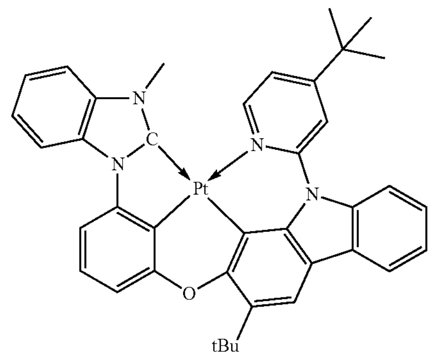
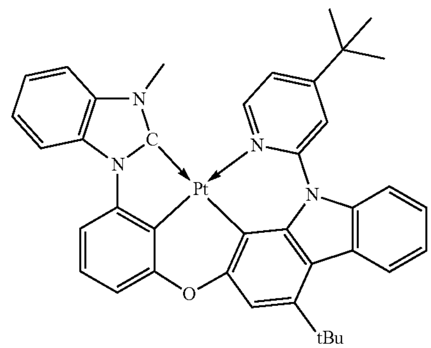
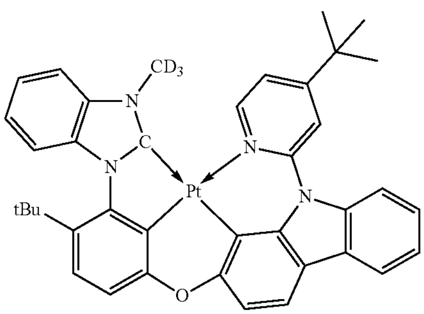
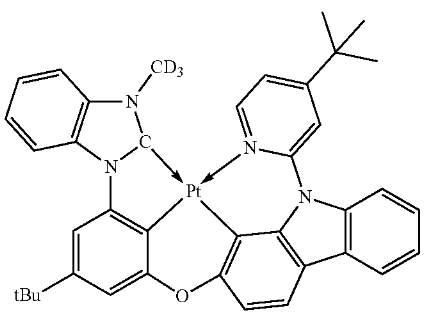
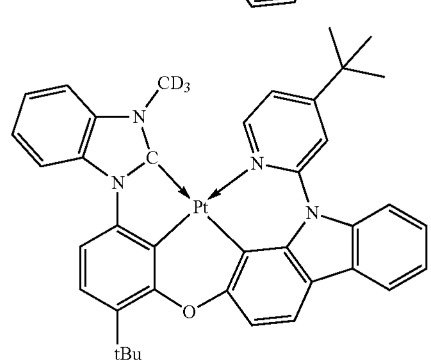

-continued
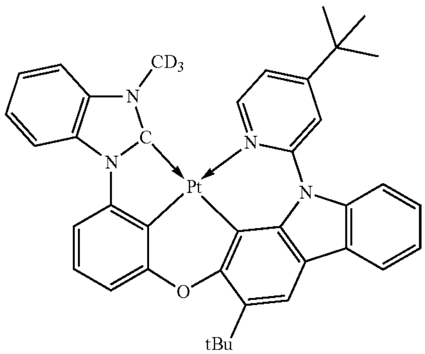
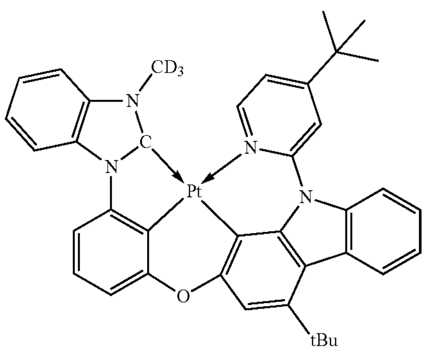
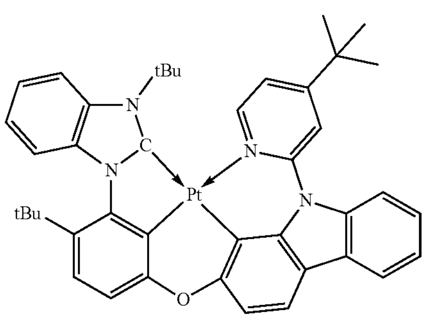
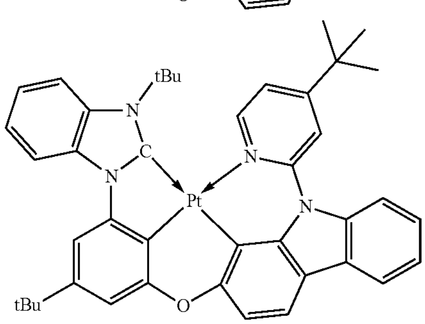
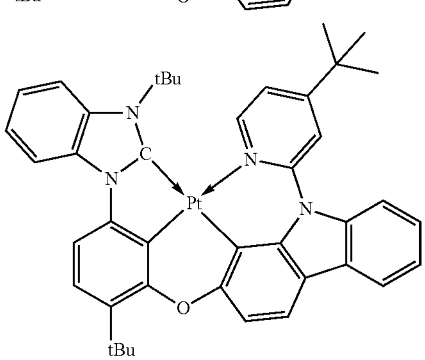
-continued
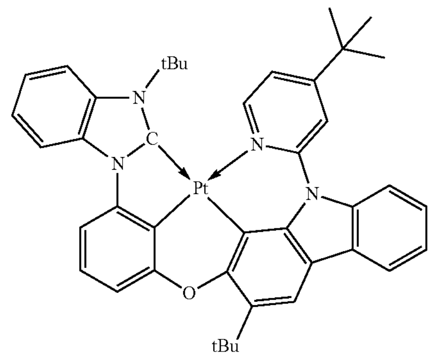
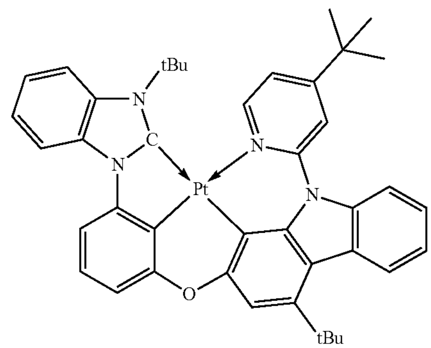
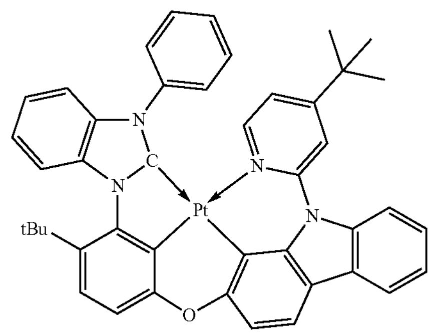
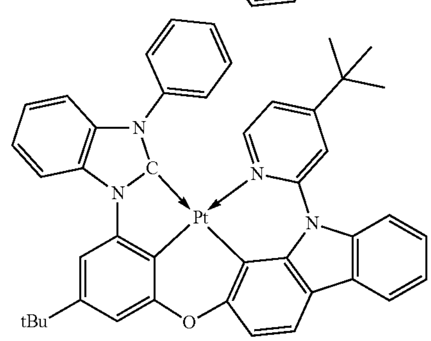
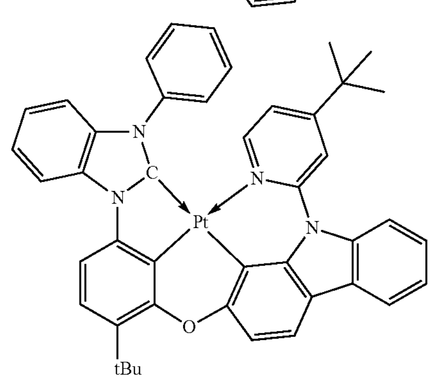

-continued
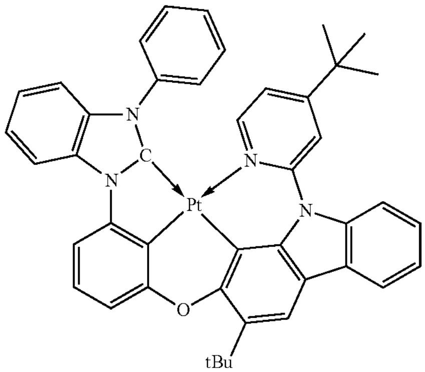
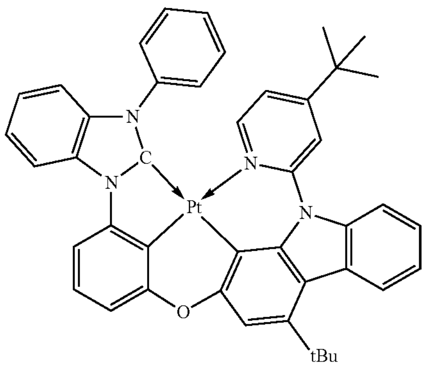
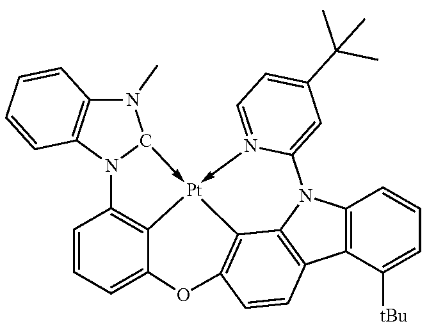
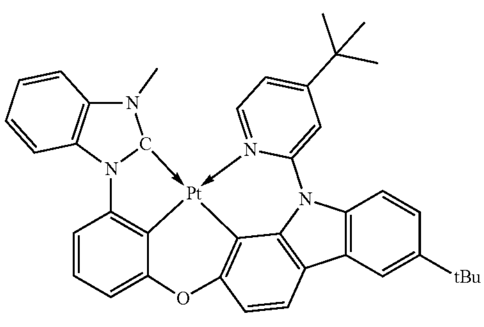
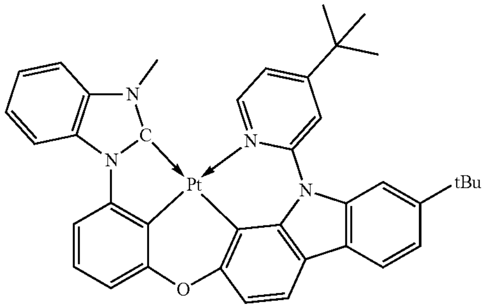
-continued
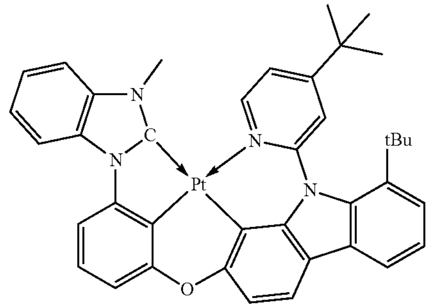
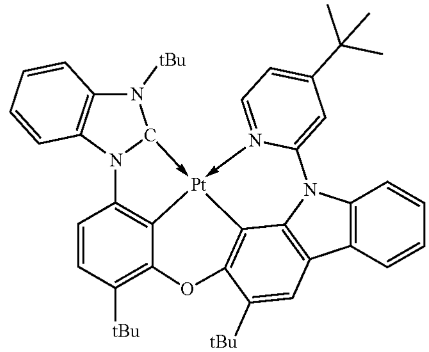
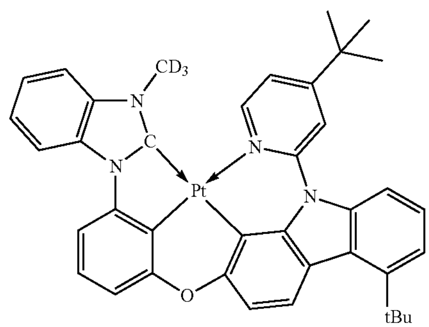
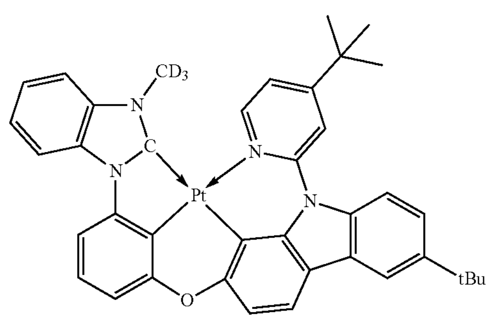
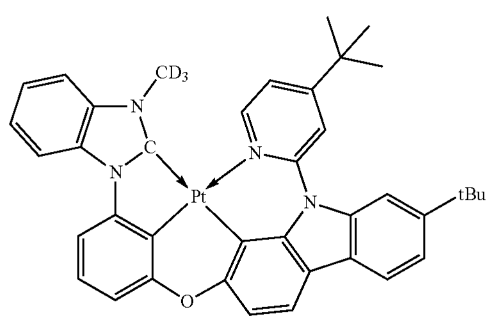

-continued
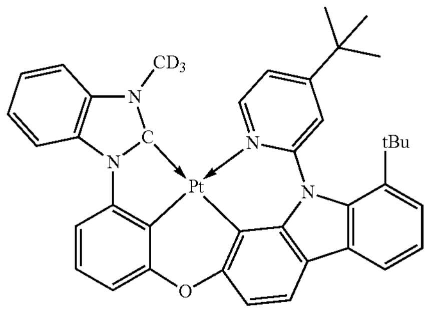
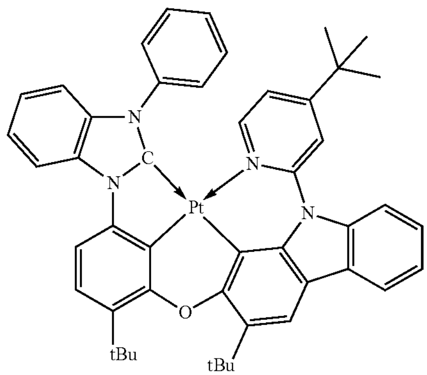
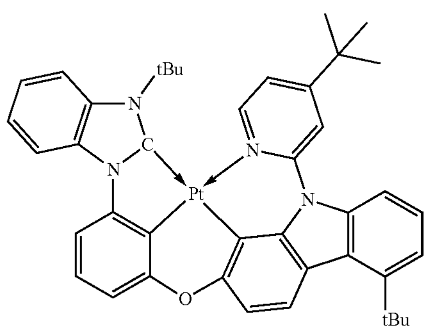
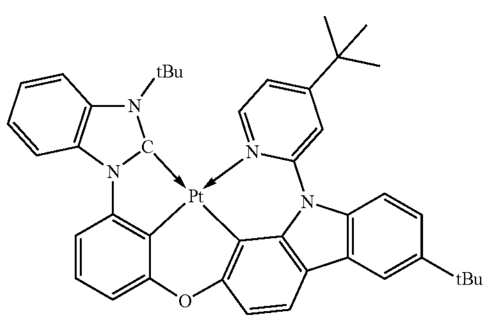
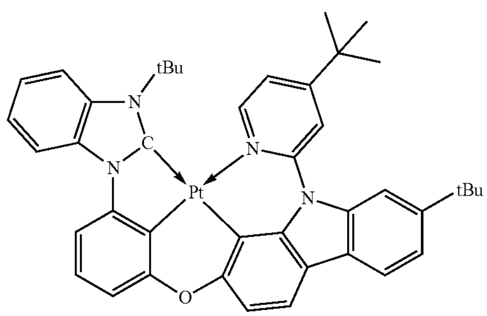
-continued
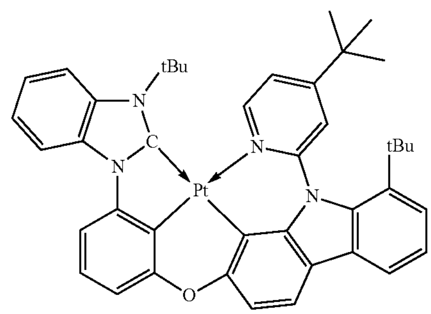
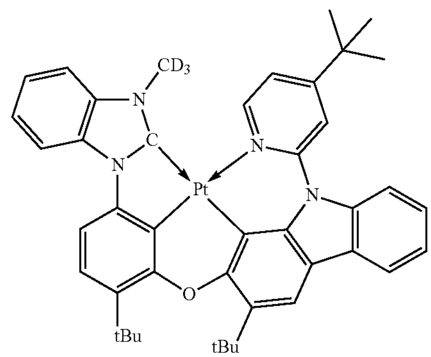
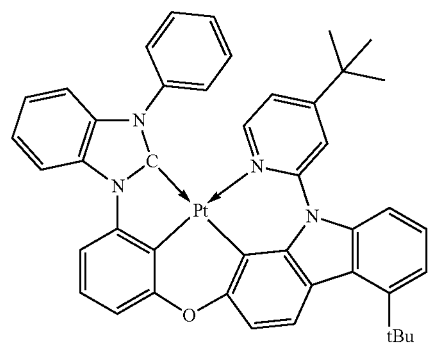
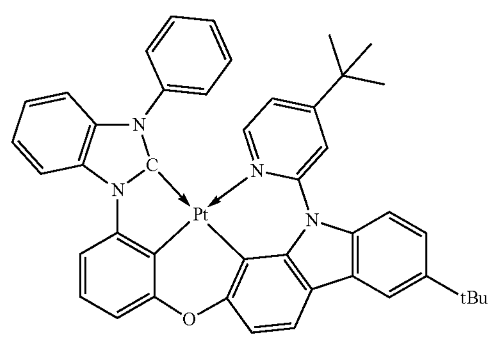
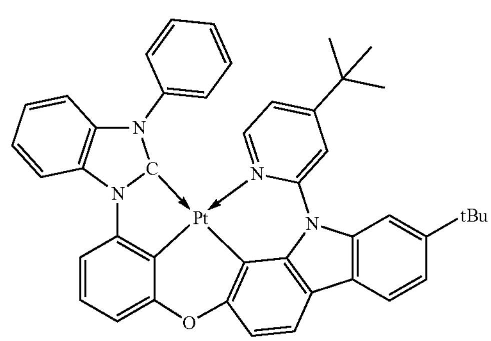

-continued
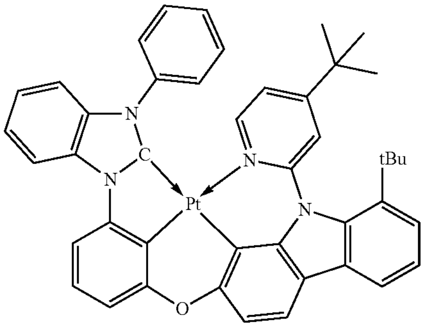
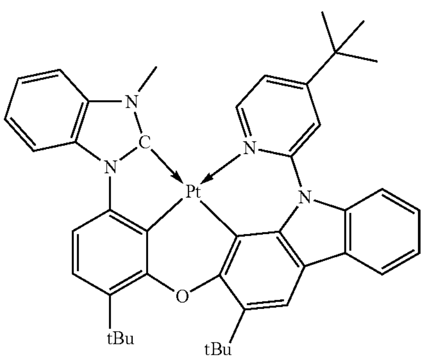
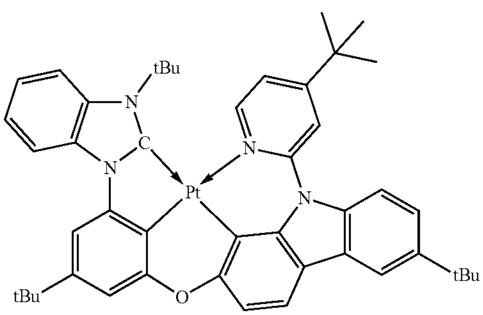
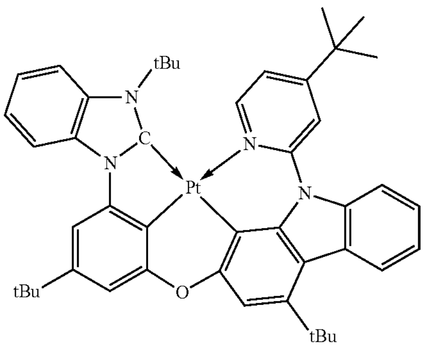
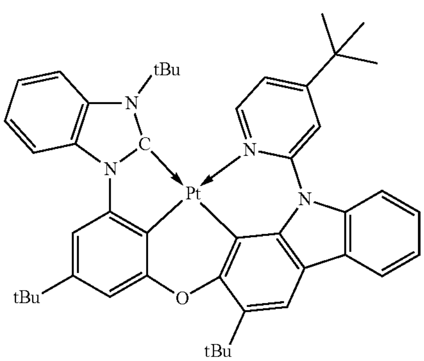
-continued
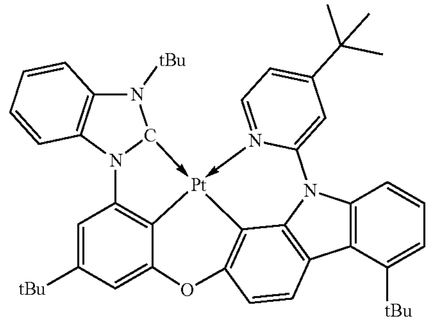
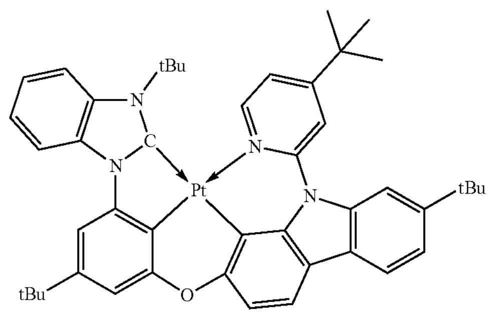
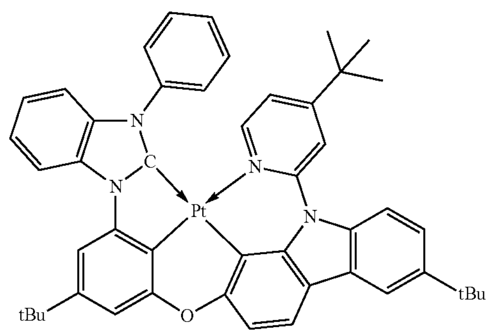
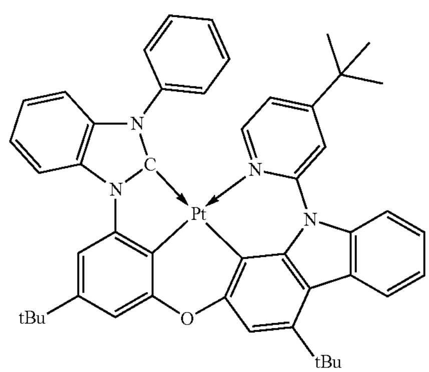
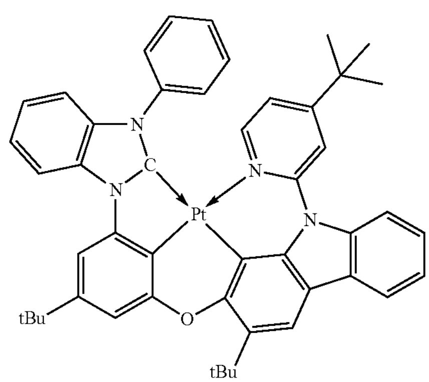

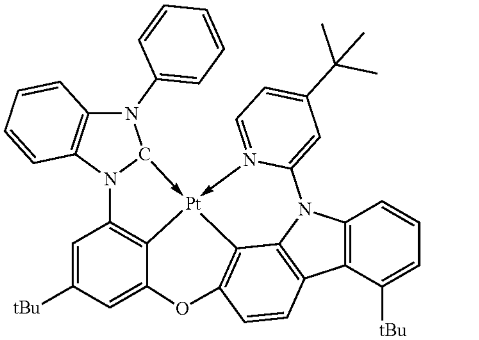
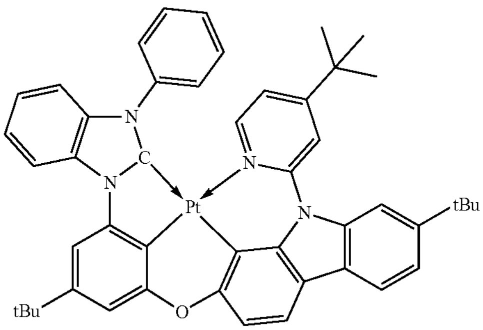
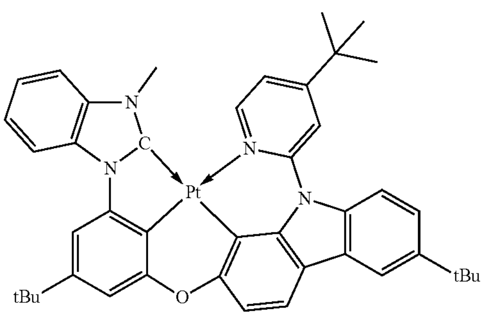
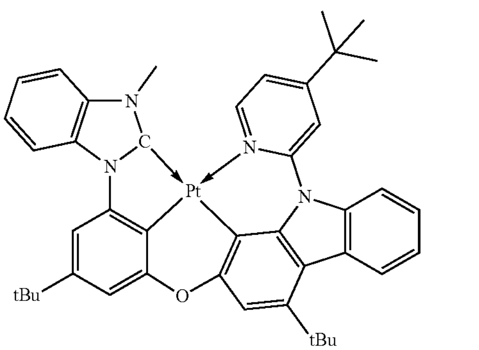
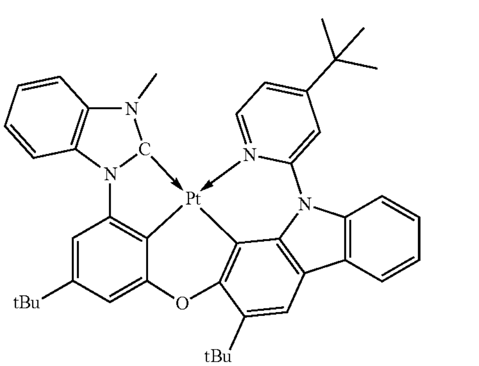
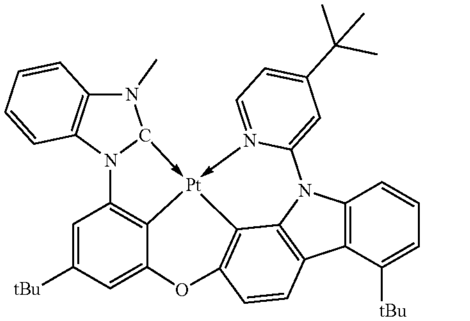
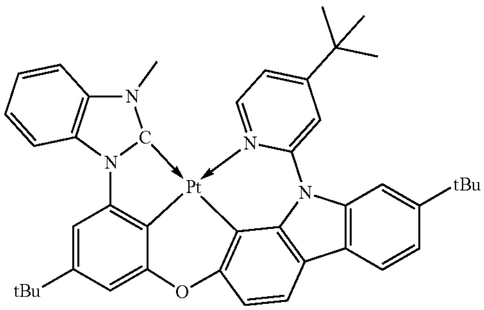
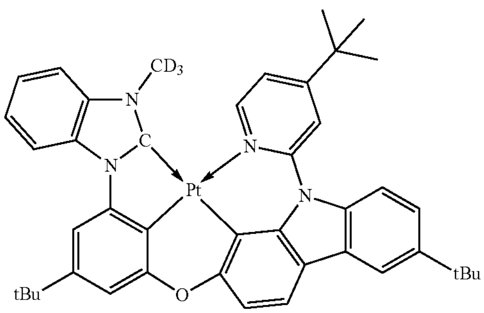
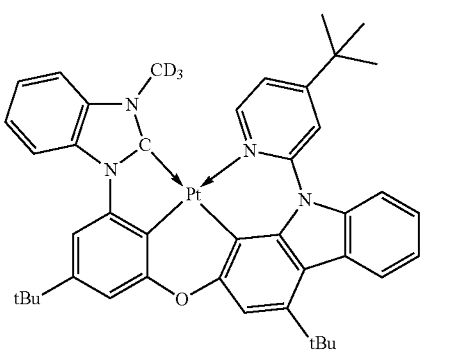
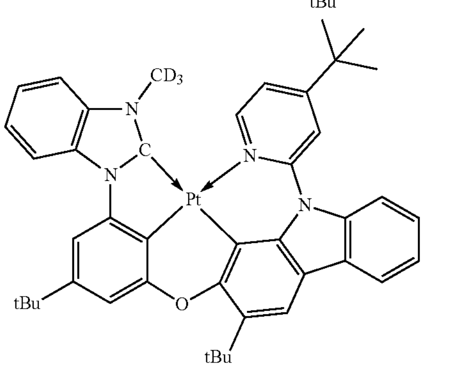

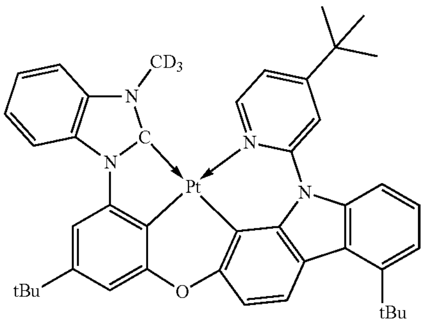
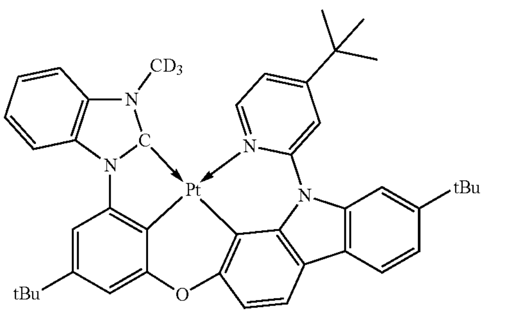
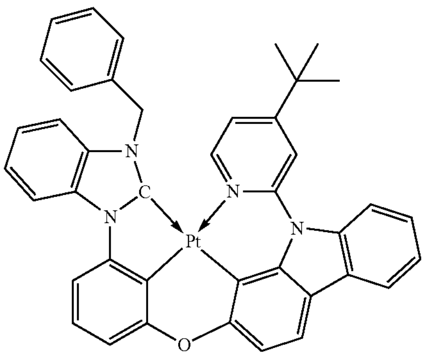
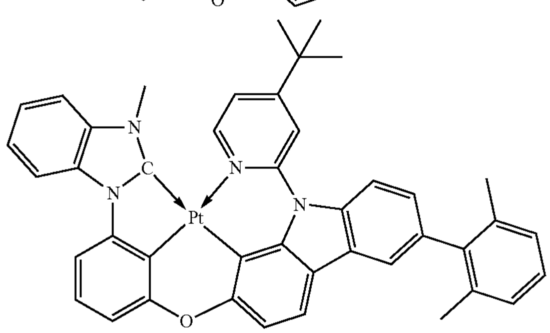
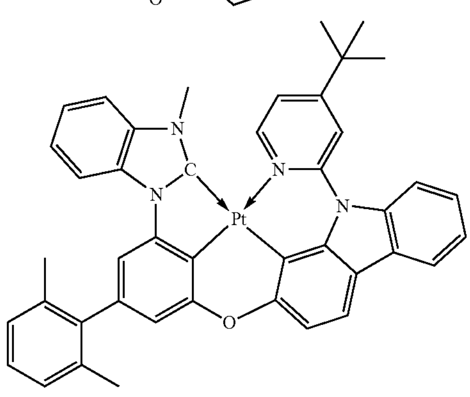
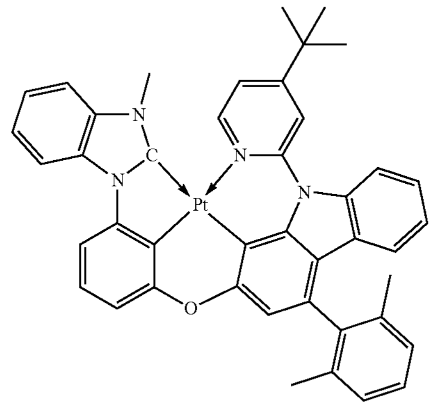
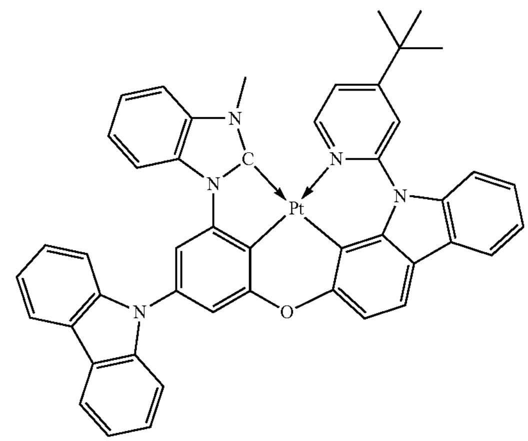
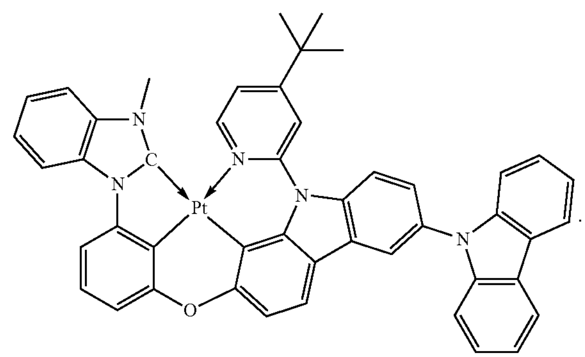
<Group IV>
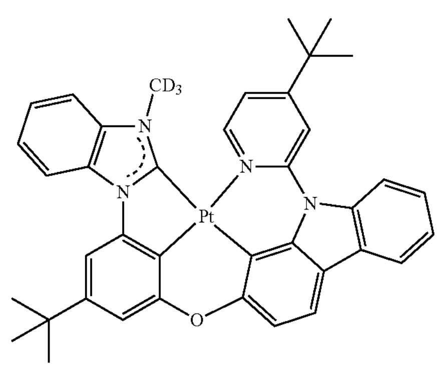

-continued

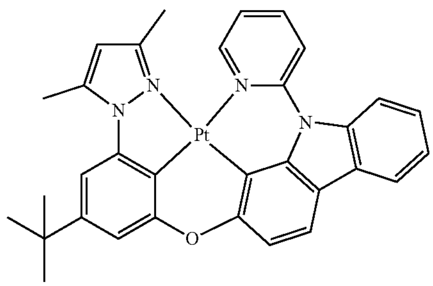

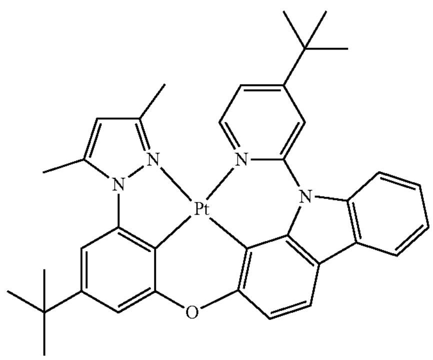

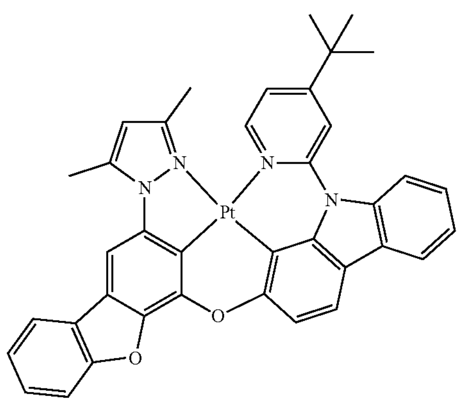

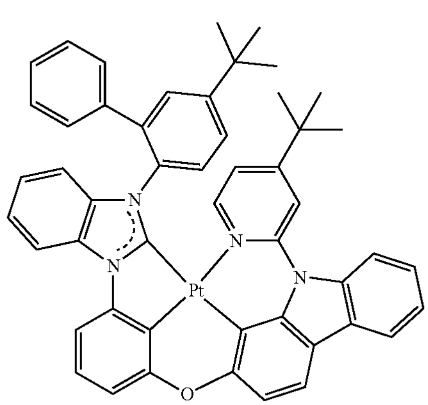

-continued

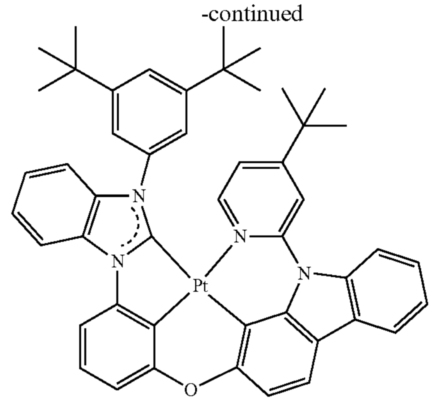

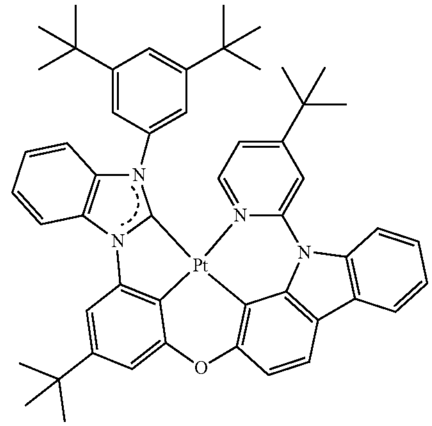

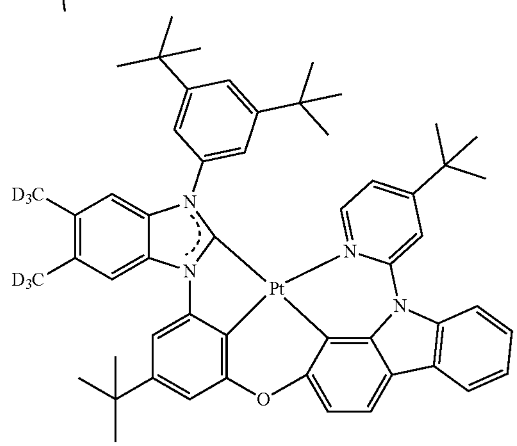

[Hole Transport Region 12]

The hole transport region 12 may be located between the first electrode 11 and the emission layer 15 of the organic light-emitting device 10.

The hole transport region 12 may have a single-layered structure or a multi-layered structure.

For example, the hole transport region 12 may have a hole injection layer, a hole transport layer, a hole injection layer/hole transport layer structure, a hole injection layer/first hole transport layer/second hole transport layer structure, a hole transport layer/middle layer structure, a hole injection layer/hole transport layer/middle layer structure, a hole transport layer/electron blocking layer, or hole injection layer/hole transport layer/electron blocking layer structure, but embodiments of the present disclosure are not limited thereto.

The hole transport region 12 may include any compound having hole transport properties.

For example, the hole transport region 12 may include an amine-based compound.

In one or more embodiments, the hole transport region 12 may include at least one of a compound represented by Formula 201 to a compound represented by Formula 205, but embodiments of the present disclosure are not limited thereto:

<Formula 201>

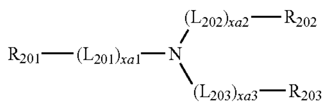

<Formula 202>

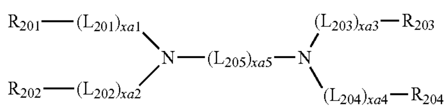

<Formula 203>

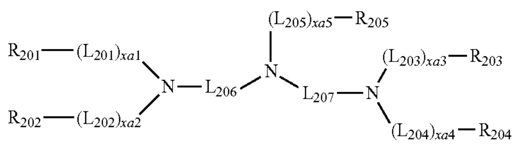

<Formula 204>

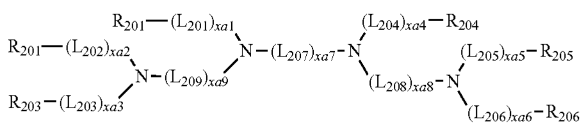

<Formula 205>

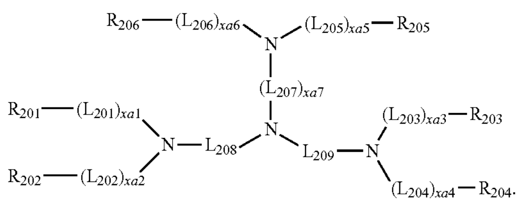

In Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein neighboring two groups of $R_{201}$ to $R_{206}$ may optionally be linked to each other via a single bond, a dimethyl-methylene group, or a diphenyl-methylene group.

For example, $L_{201}$ to $L_{209}$ may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —$Si(Q_{11})(Q_{12})(Q_{13})$, xa1 to xa9 may each independently be 0, 1, or 2, and $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof, wherein $Q_{11}$ to $Q_{13}$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, the hole transport region 12 may include a carbazole-containing amine-based compound.

In one or more embodiments, the hole transport region 12 may include a carbazole-containing amine-based compound or a carbazole-free amine-based compound.

The carbazole-containing amine-based compound may be, for example, of compounds represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

The carbazole-free amine-based compound may be, for example, of compounds represented by Formula 201 which do not include a carbazole group and which include at least one a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

In one or more embodiments, the hole transport region 12 may include at least one compound represented by Formulae 201, 202, or any combination thereof.

In one or more embodiments, the hole transport region 12 may include at least one of the compounds represented by Formulae 201-1, 202-1, 201-2, or any combination thereof, but embodiments of the present disclosure are not limited thereto:

<Formula 201-1>

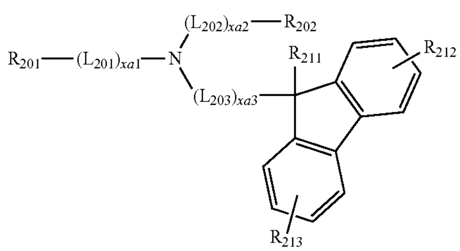

-continued

<Formula 202-1>

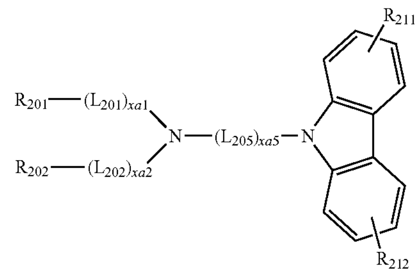

<Formula 201-2>

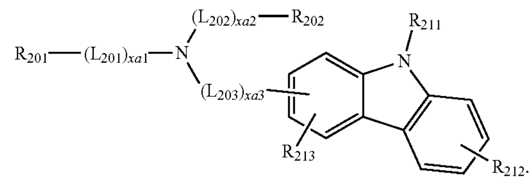

In Formulae 201-1, 202-1, and 201-2, $L_{201}$ to $L_{203}$, $L_{205}$, xa1 to xa3, xa5, $R_{201}$, and $R_{202}$ are the same as described herein, and $R_{211}$ to $R_{213}$ are each independently hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, or a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

For example, the hole transport region 12 may include at least one of Compounds HT1 to HT39, but embodiments of the present disclosure are not limited thereto.

HT1

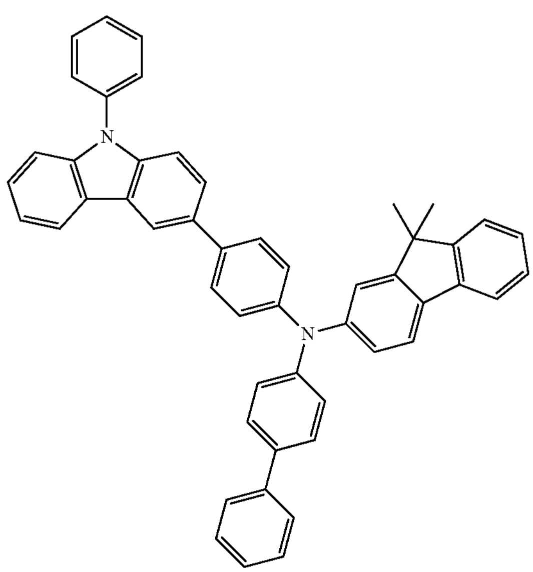

HT2

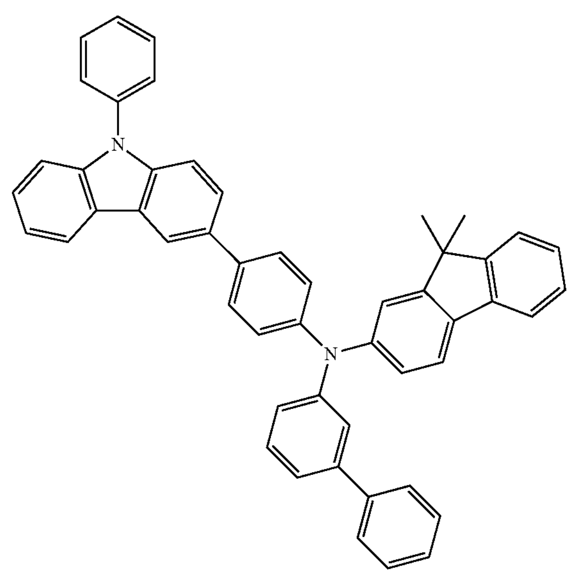

-continued
HT3
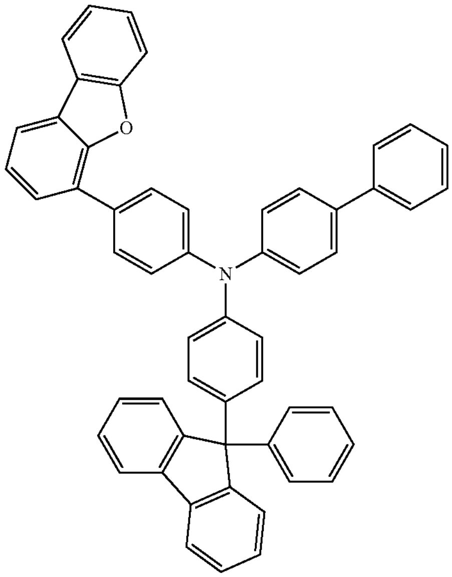
HT4
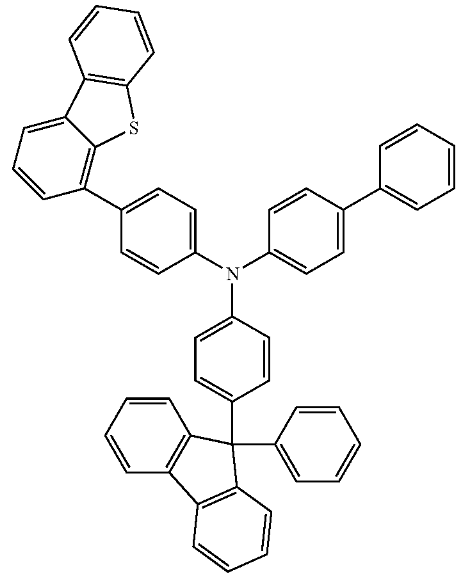
HT5
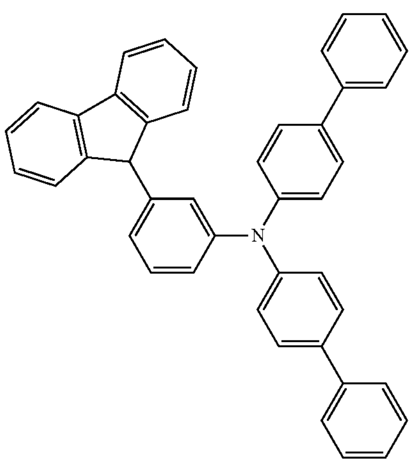
HT6
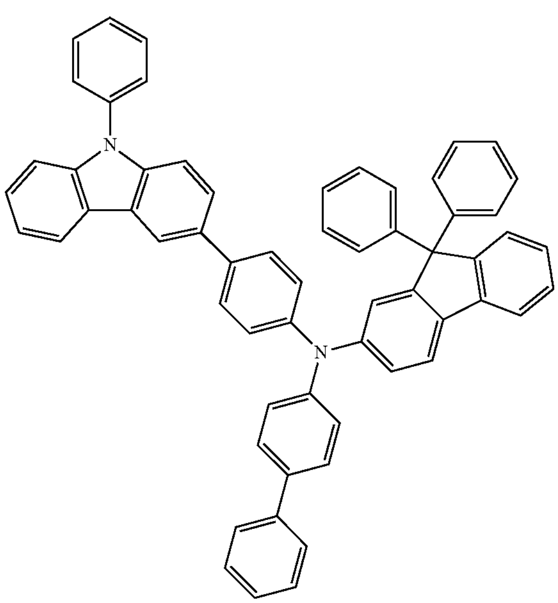
HT7
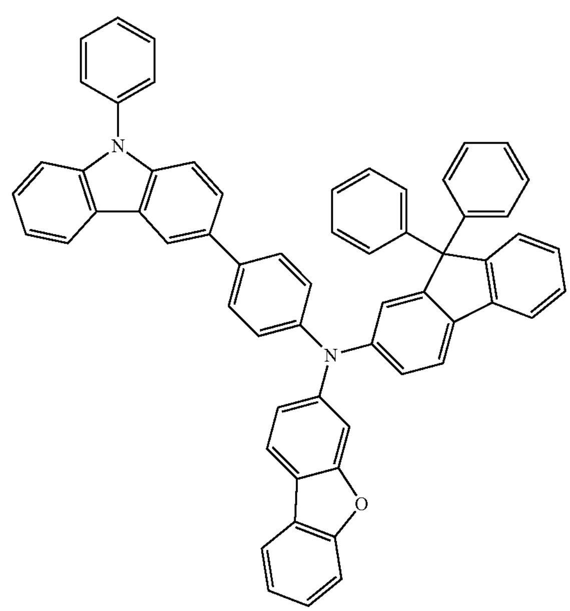

-continued
HT8
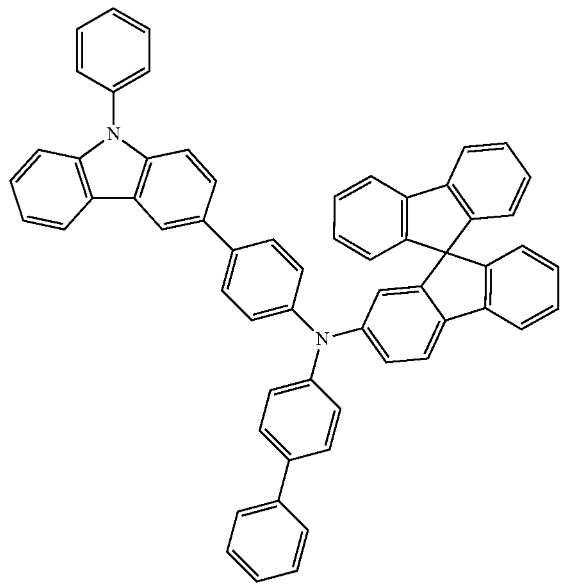
HT9
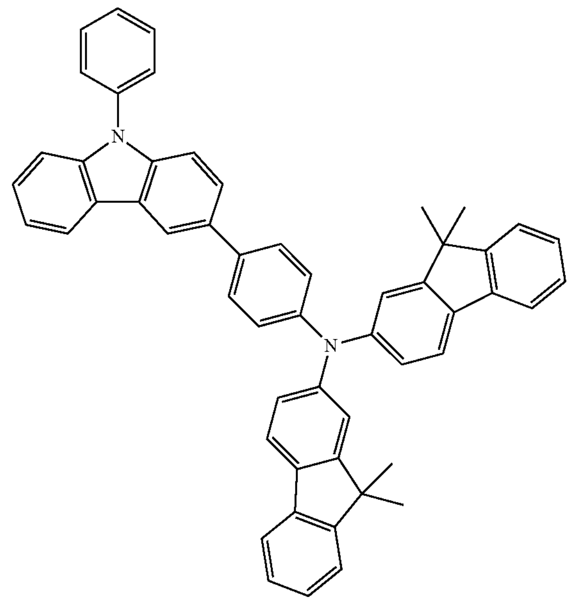
HT10
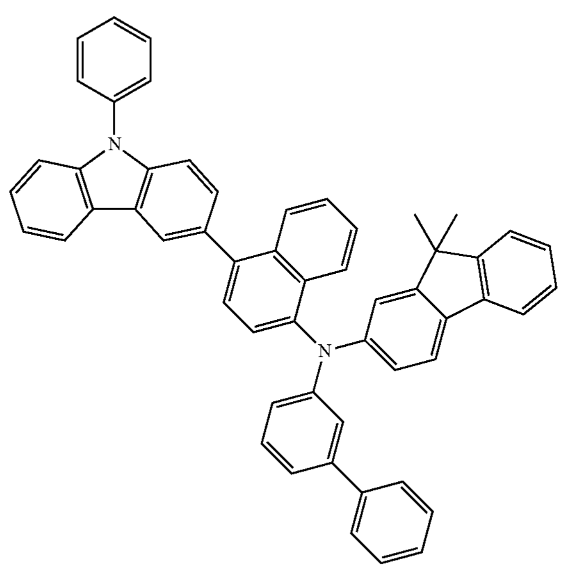
HT11
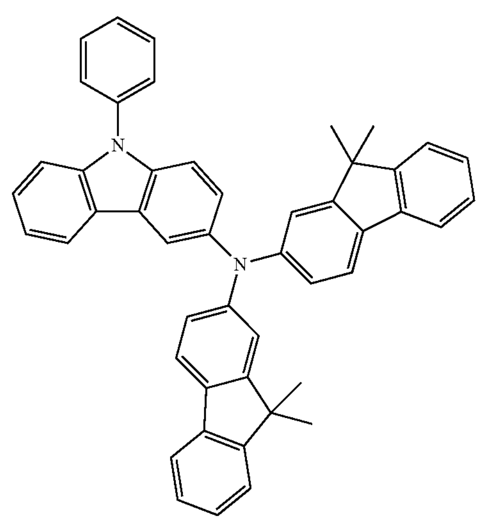

-continued
HT12
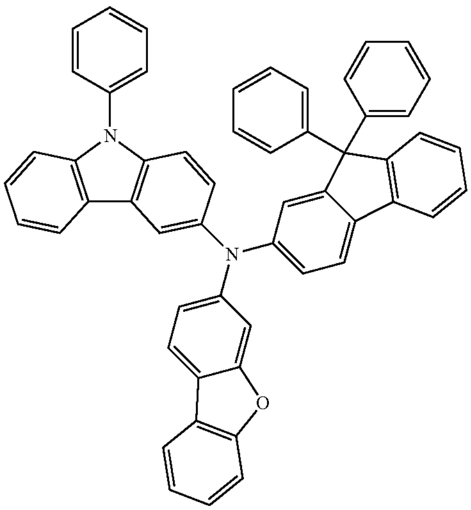
HT13
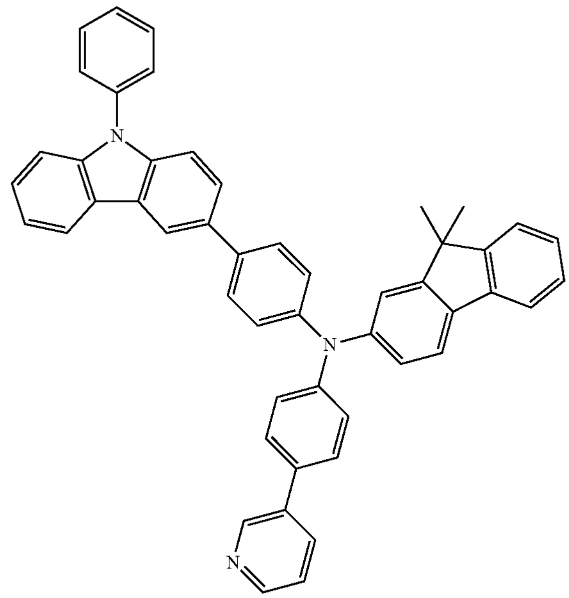
HT14
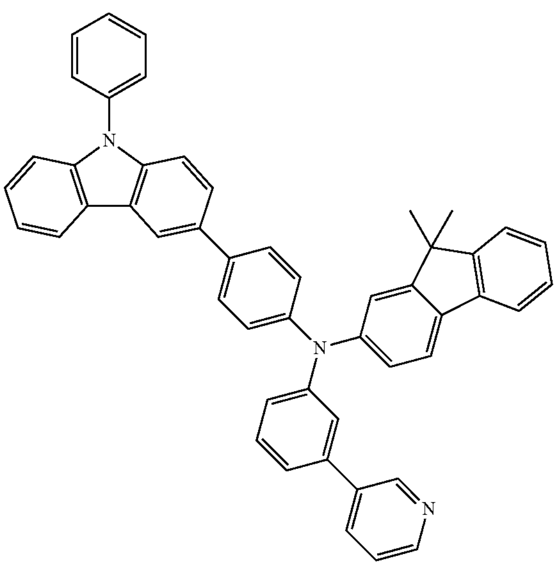
HT15
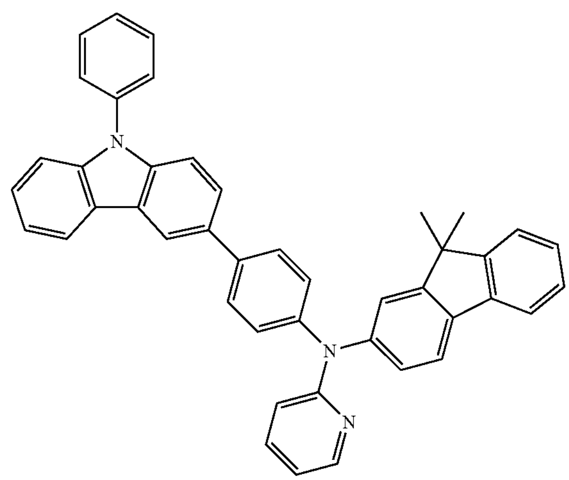
HT16
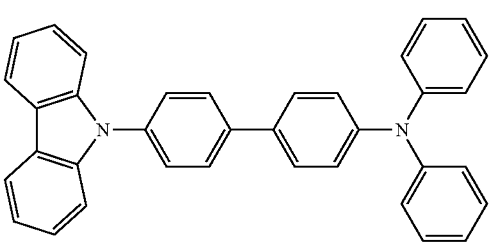
HT17
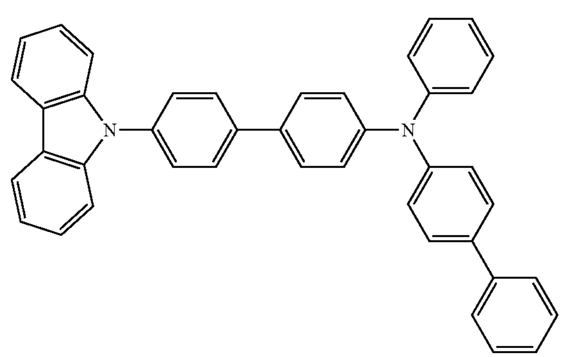

-continued
HT18
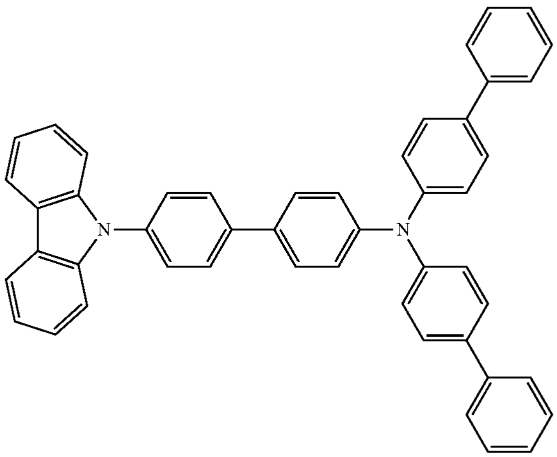
HT19
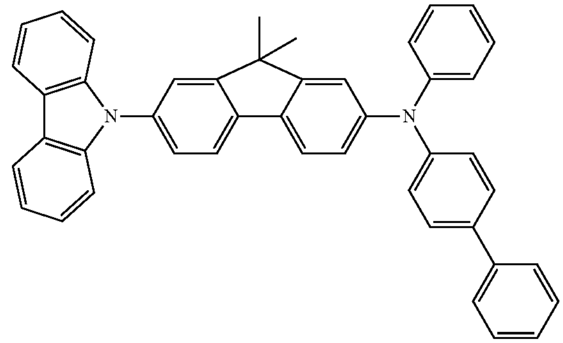
HT20
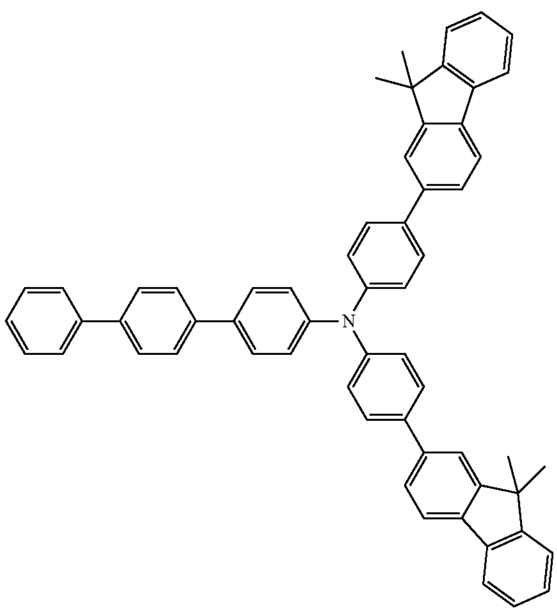
HT21
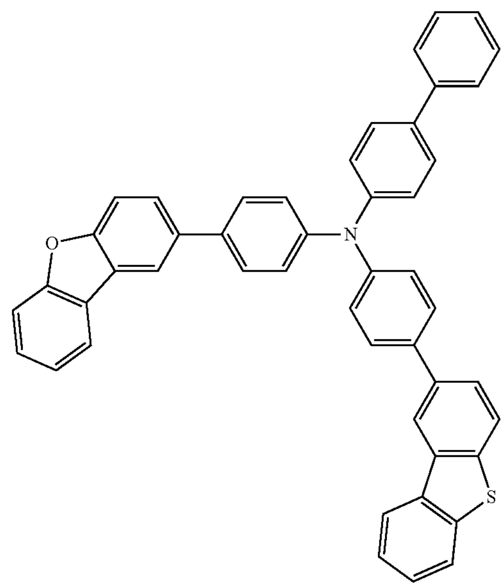
HT22
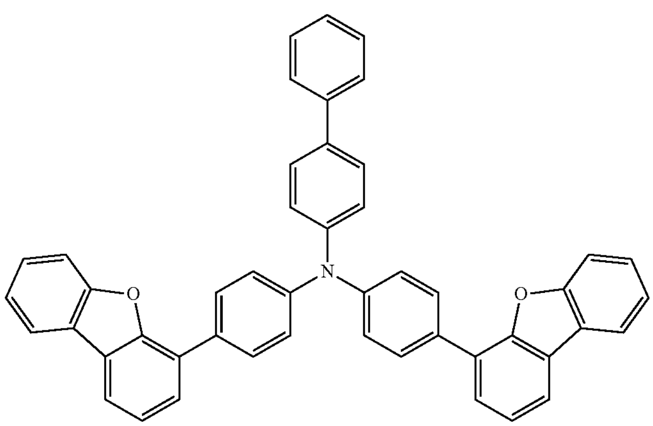

-continued
HT23
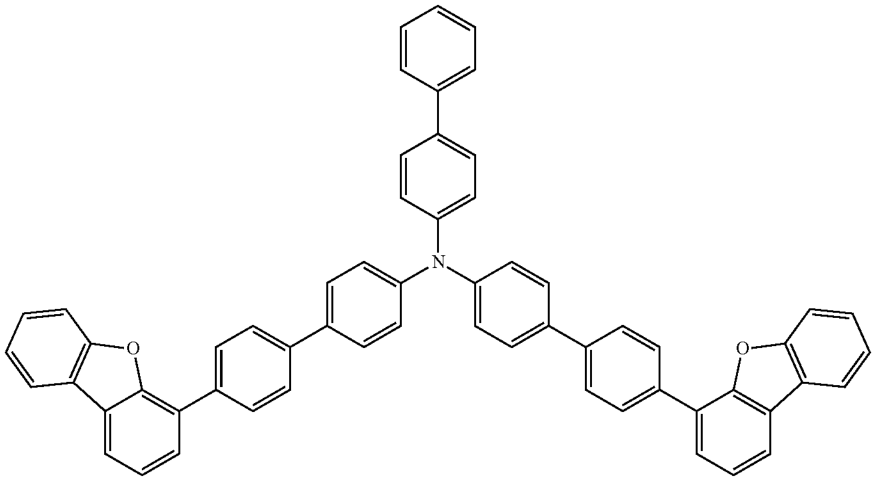
HT24
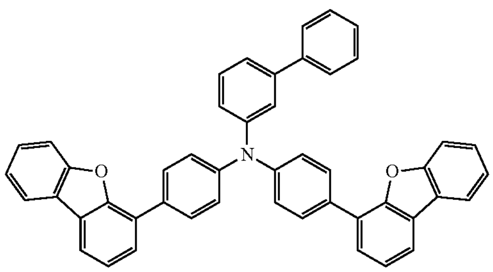
HT25
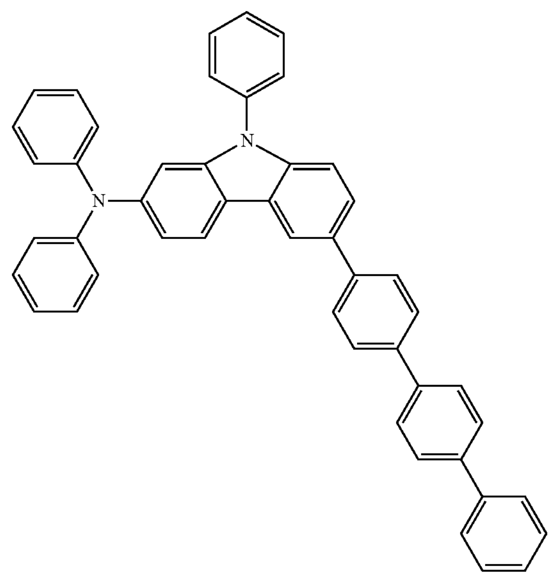
HT26
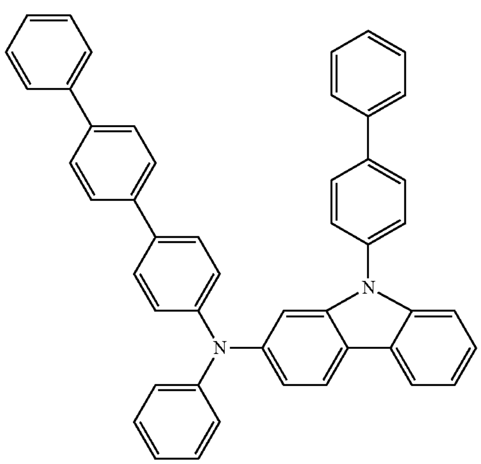
HT27
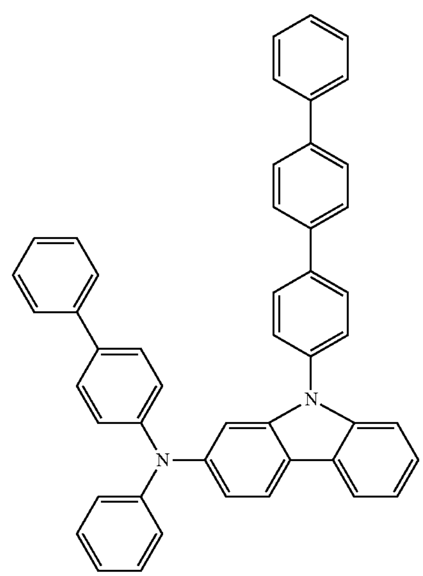

-continued
HT28
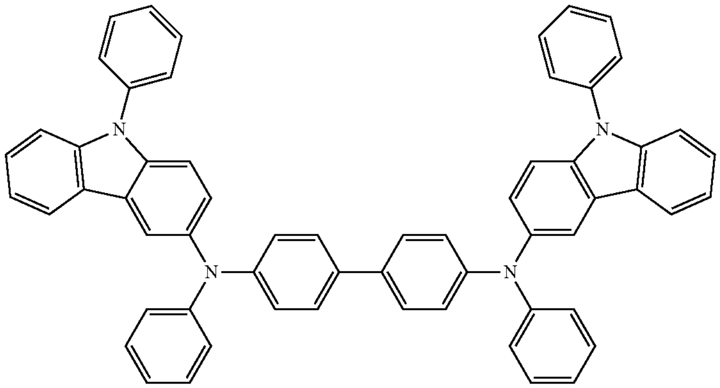
HT29
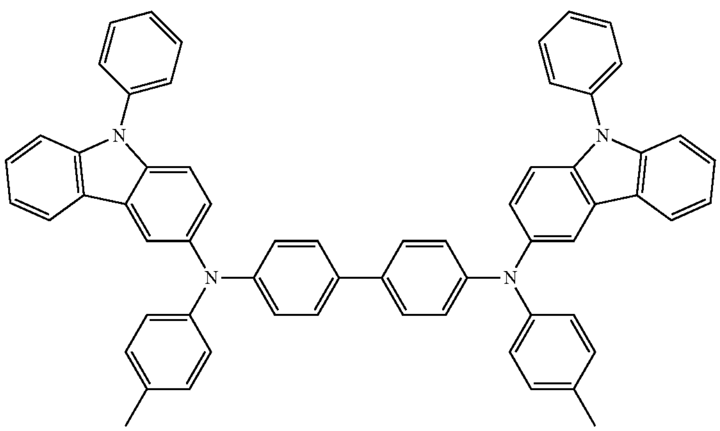
HT30
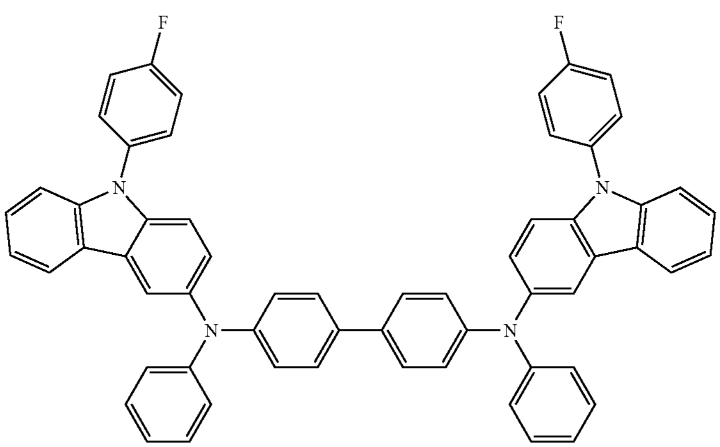

-continued
HT31
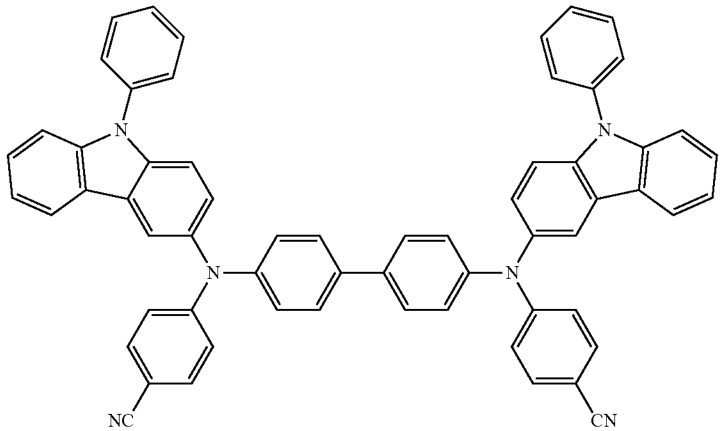
HT32
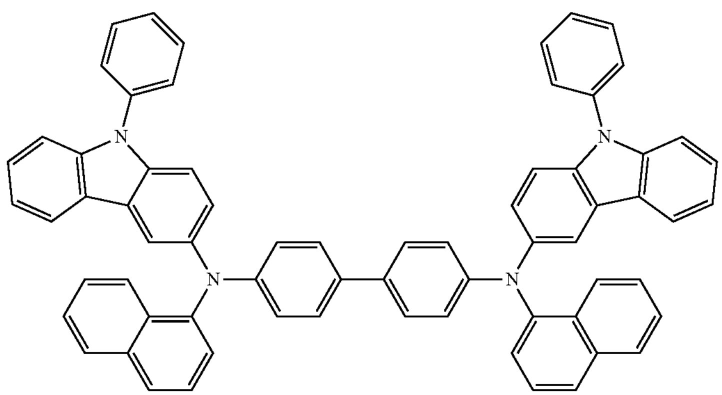
HT33
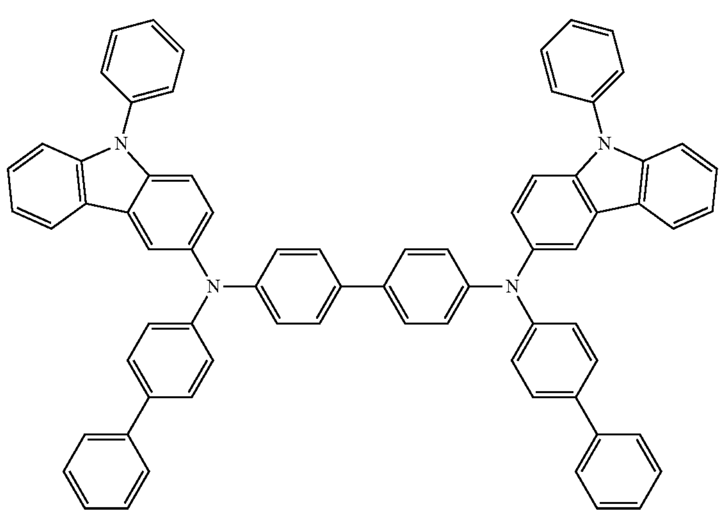

-continued
HT34
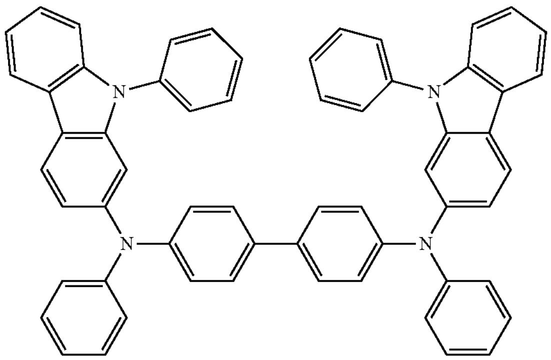
HT35
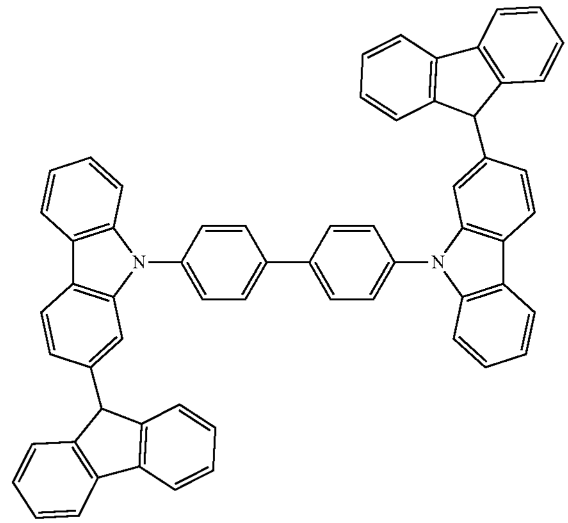
HT36
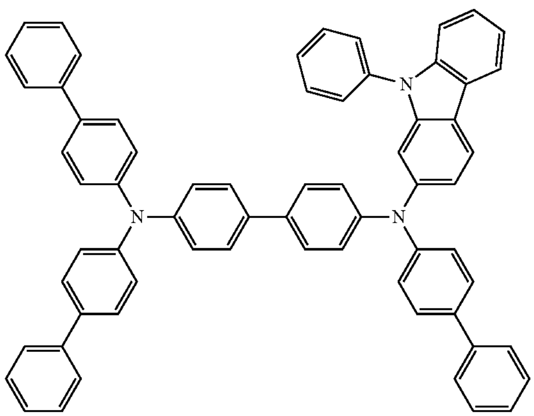
HT37
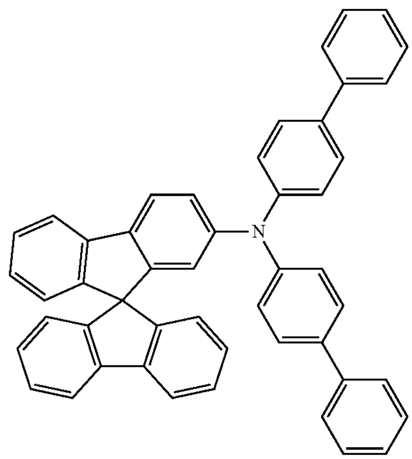
HT38
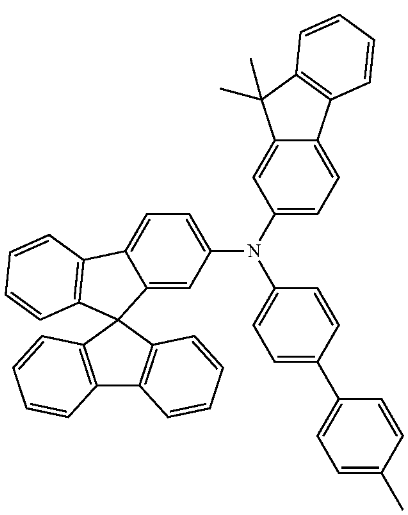
HT39
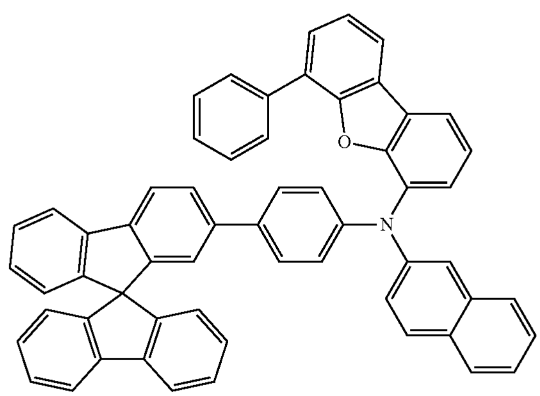
In one or more embodiments, hole transport region 12 of the organic light-emitting device 10 may further include a p-dopant. When the hole transport region 12 further includes a p-dopant, the hole transport region 12 may have a matrix (for example, at least one of the compounds represented by Formulae 201 to 205) and a p-dopant included in the matrix.

The p-dopant may be uniformly or non-uniformly doped in the hole transport region 12.

In one or more embodiments, a lowest unoccupied molecular orbital (LUMO) energy level of the p-dopant may be −3.5 eV or less.

The p-dopant may include at least one of a quinone derivative, a metal oxide, a cyano group-containing compound, or any combination thereof, but embodiments of the present disclosure are not limited thereto.

In one or more embodiments, the p-dopant may include at least one of:

a quinone derivative, such as tetracyanoquinodimethane (TCNQ), 2,3,5,6-tetrafluoro-7,7,8,8-tetracyanoquinodimethane (F4-TCNQ), or F6-TCNNQ;

a metal oxide, such as tungsten oxide or molybdenum oxide;

1,4,5,8,9,12-hexaazatriphenylene-hexacarbonitrile (HAT-CN);

a compound represented by Formula 221, or any combination thereof, but embodiments of the present disclosure are not limited thereto:

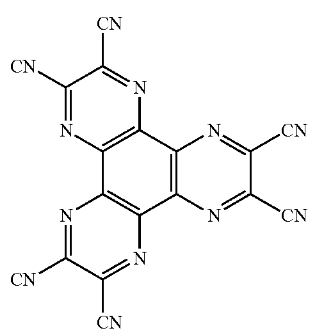

HAT-CN

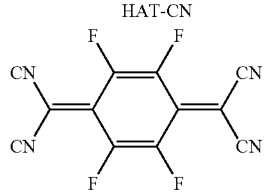

F4-TCNQ

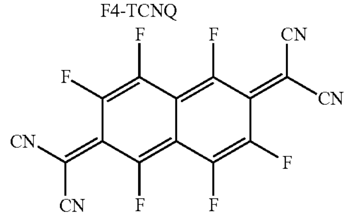

F6-TCNNQ

<Formula 221>

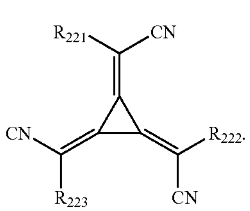

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{221}$ to $R_{223}$ may have at least one of a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, a $C_1$-$C_{20}$ alkyl group substituted with —I, or any combination thereof.

The hole transport region 12 may have a thickness of about 100 Å to about 10,000 Å, for example, about 400 Å to about 2,000 Å, and the emission layer 15 may have a thickness of about 100 Å to about 3,000 Å, for example, about 300 Å to about 1,000 Å. When the thickness of each of the hole transport region 12 and the emission layer 15 is within these ranges described above, satisfactory hole transportation characteristics and/or luminescent characteristics may be obtained without a substantial increase in driving voltage.

[Electron Transport Region 17]

The electron transport region 17 is placed between the emission layer 15 and the second electrode 19 of the organic light-emitting device 10.

The electron transport region 17 may have a single-layered structure or a multi-layered structure.

For example, the electron transport region 17 may have an electron transport layer, an electron transport layer/electron injection layer structure, a buffer layer/electron transport layer structure, a hole blocking layer/electron transport layer structure, a buffer layer/electron transport layer/electron injection layer structure, or a hole blocking layer/electron transport layer/electron injection layer structure, but embodiments of the present disclosure are not limited thereto. The electron transport region 17 may further include an electron control layer.

The electron transport region 17 may include known electron transport materials.

The electron transport region 17 (for example, a buffer layer, a hole blocking layer, an electron control layer, or an electron transport layer in the electron transport region) may include a metal-free compound containing at least one π electron-deficient nitrogen-containing $C_1$-$C_{60}$ cyclic group. The π electron-deficient nitrogen-containing $C_1$-$C_{60}$ cyclic group is the same as described above.

For example, the electron transport region 17 may include a compound represented by Formula 601:

$$[Ar_{601}]_{xe11}\text{-}[(L_{601})_{xe1}\text{-}R_{601}]_{xe21}. \quad \text{<Formula 601>}$$

In Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one or more embodiments, at least one of $Ar_{601}$(s) in the number of xe11 and $R_{601}$(s) in the number of xe21 may include the π electron-deficient nitrogen-containing $C_1$-$C_{60}$ cyclic group.

In one or more embodiments, ring $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), —P(=O)($Q_{31}$)($Q_{32}$), or any combination thereof, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

<Formula 601-1>

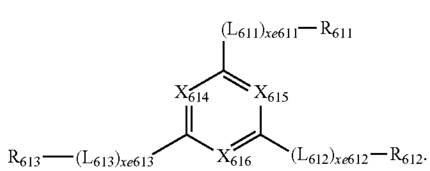

In Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ may each independently be the same as described in connection with the $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group; or $$—S(=O)_2(Q_{601}) \text{ or } —P(=O)(Q_{601})(Q_{602}),$$

wherein $Q_{601}$ and $Q_{602}$ are the same as described above.

The electron transport region 17 may include at least one compound of Compounds ET1 to ET36, but embodiments of the present disclosure are not limited thereto:

ET1

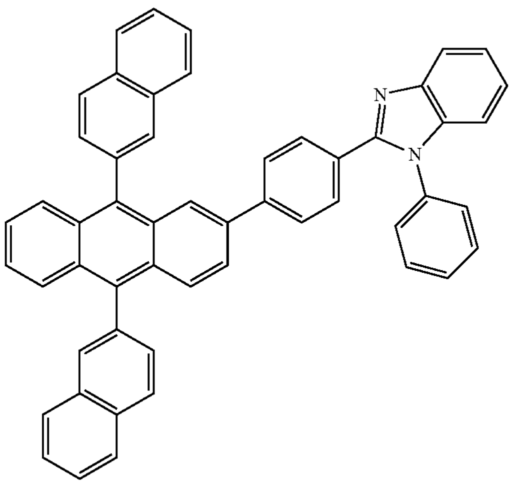

ET2

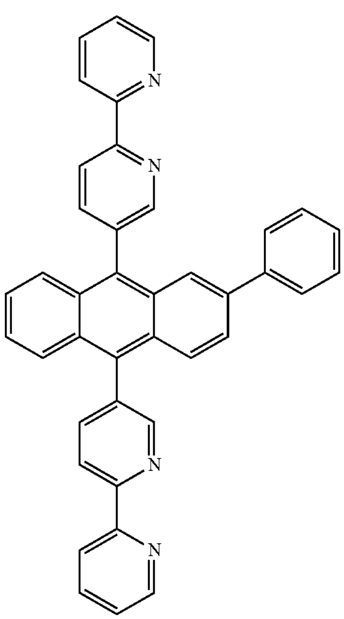

-continued

ET3

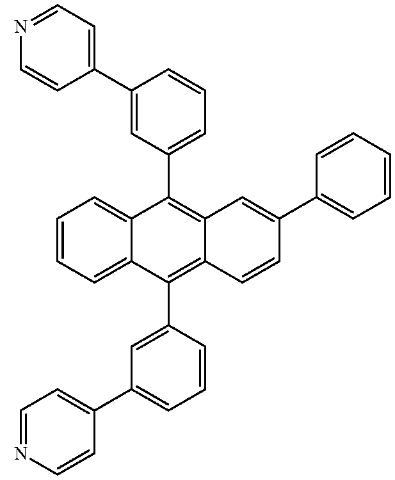

ET4

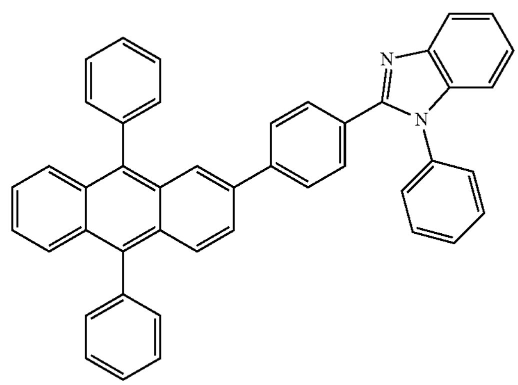

ET5

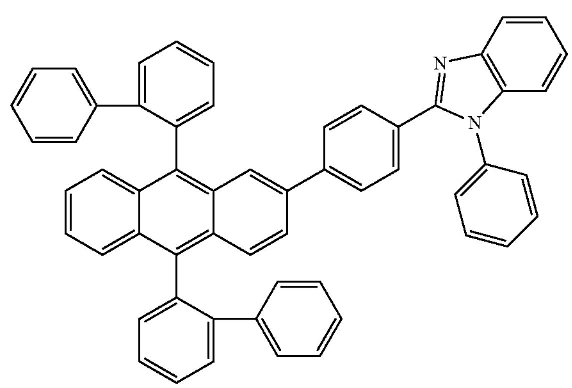

-continued
ET6
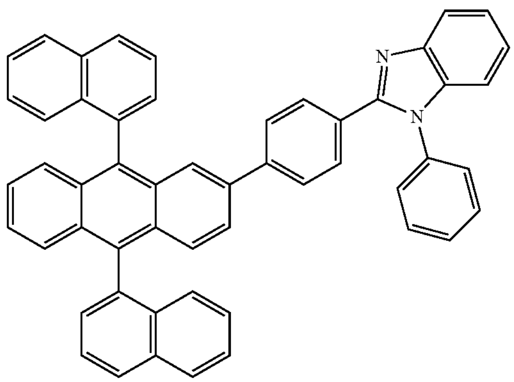
ET7
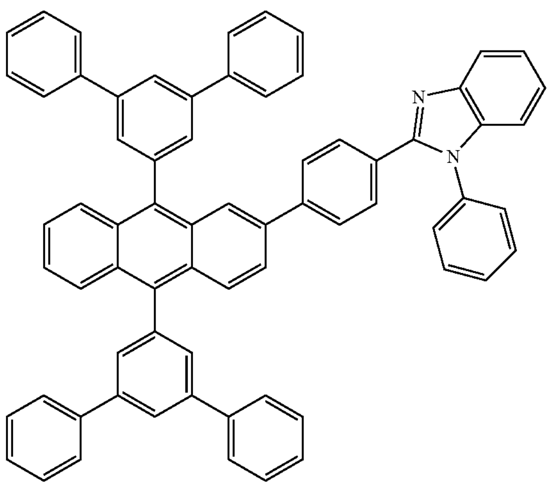
ET8
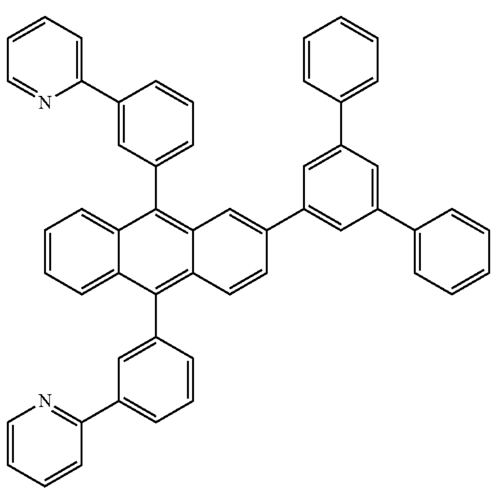
-continued
ET9
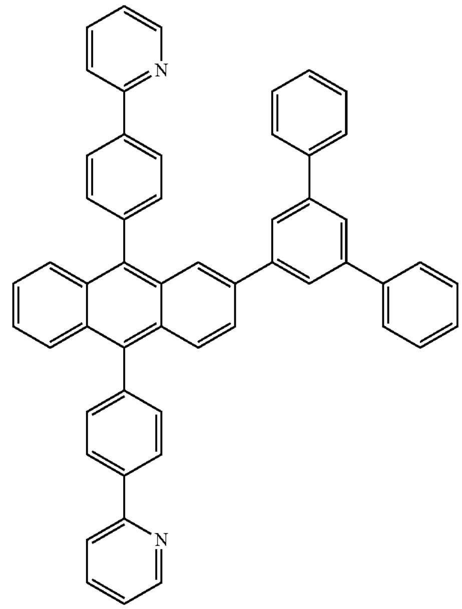
ET10
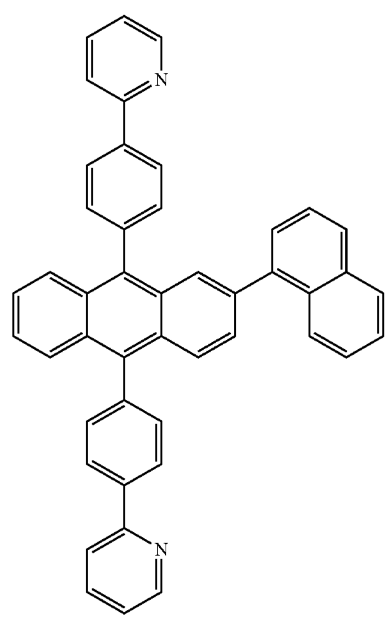

ET11
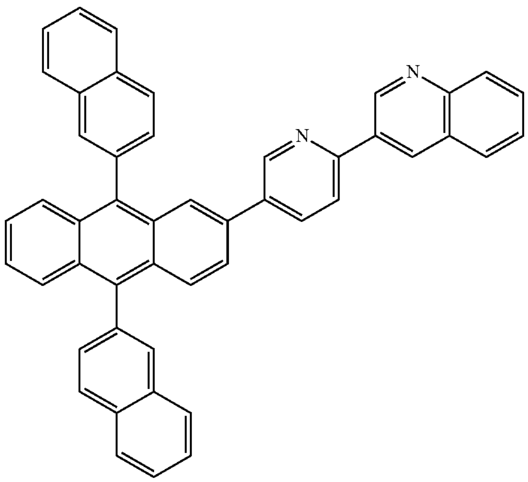
ET12
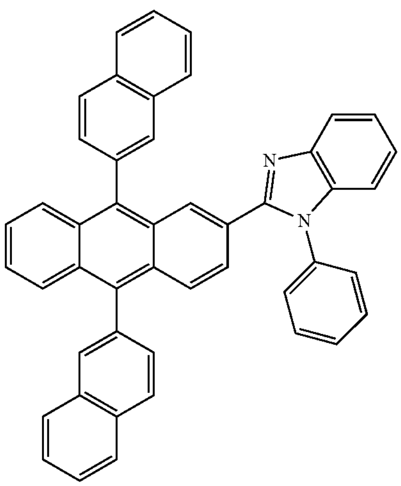
ET13
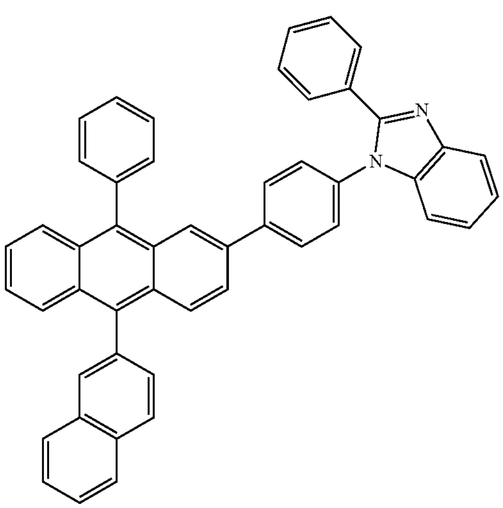
ET14
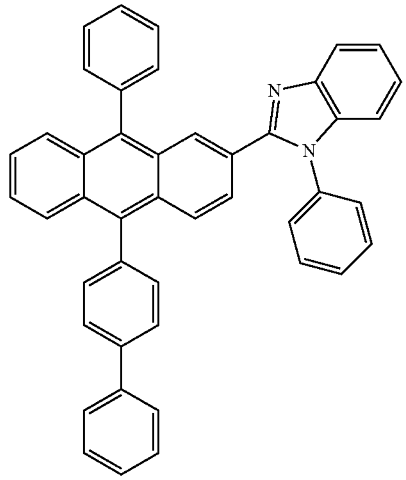
ET15
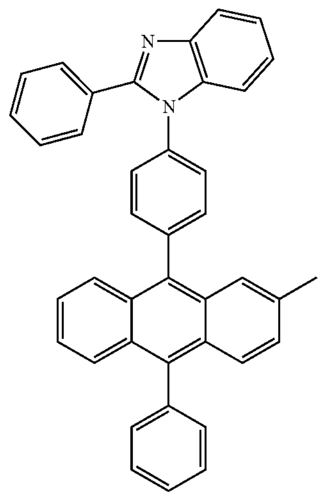
ET16
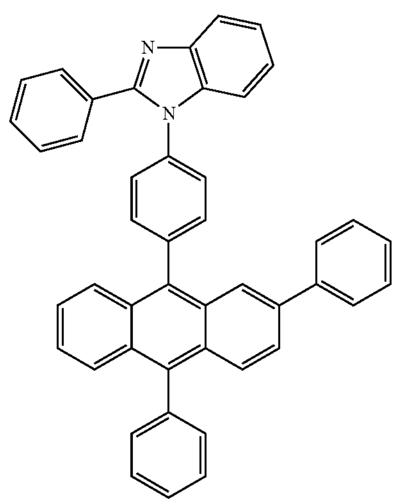

-continued
ET17
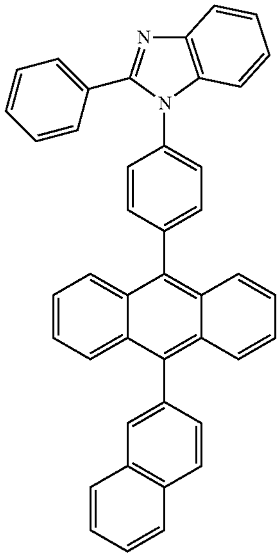
ET18
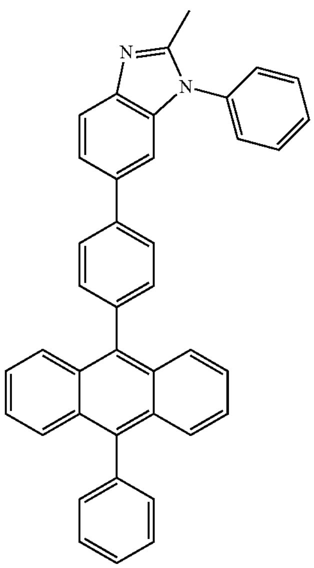
ET19
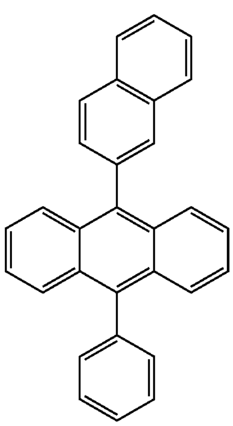
-continued
ET20
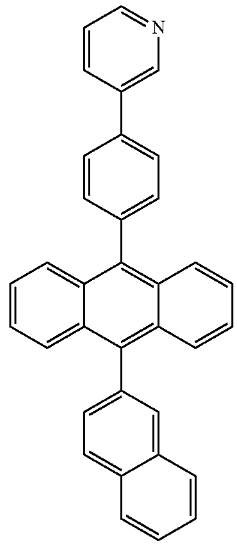
ET21
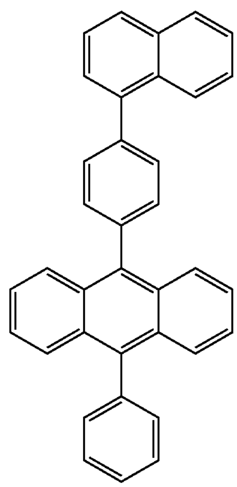
ET22
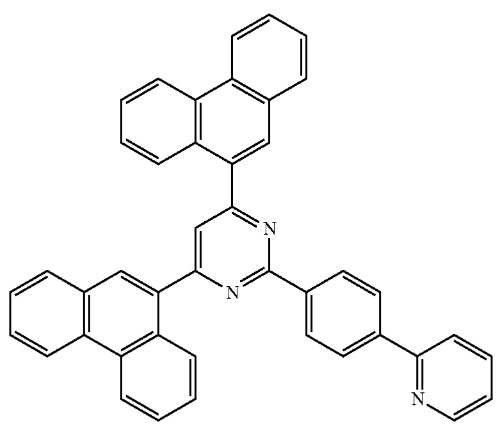

ET23
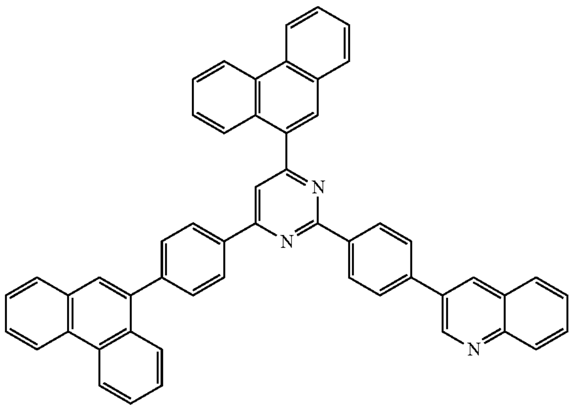
ET24
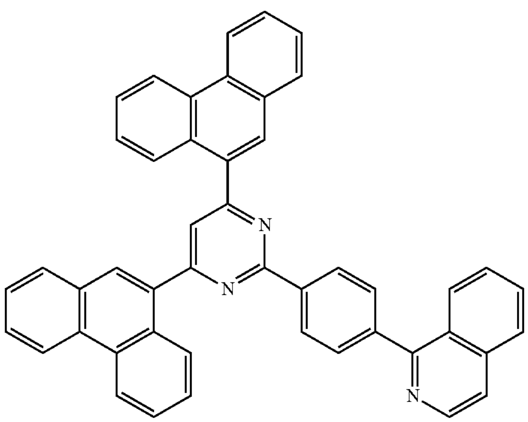
ET25
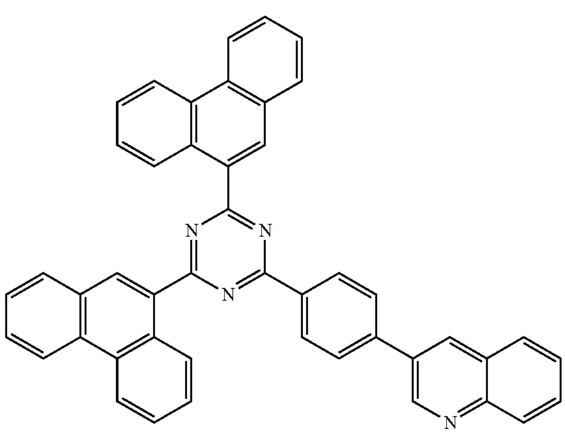
ET26
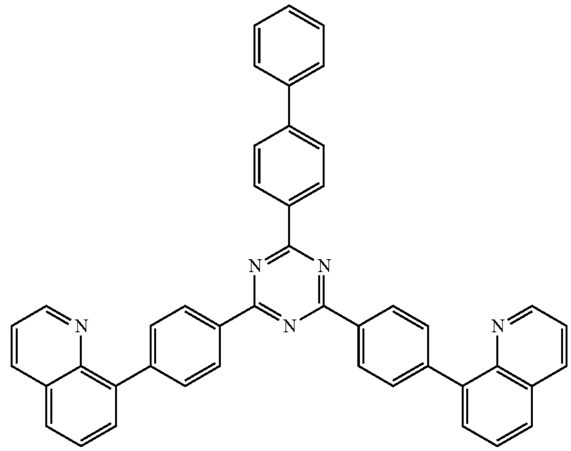
ET27
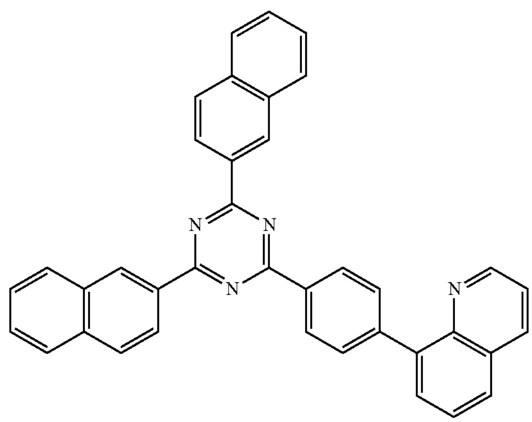
ET28
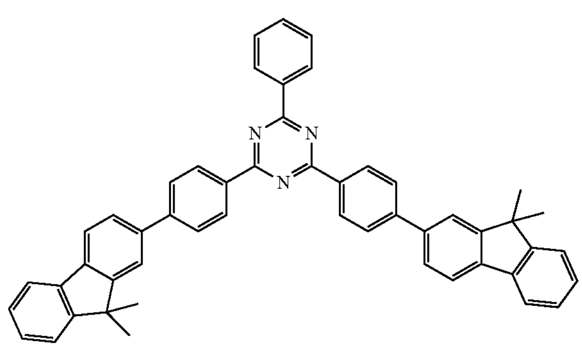

-continued
ET29
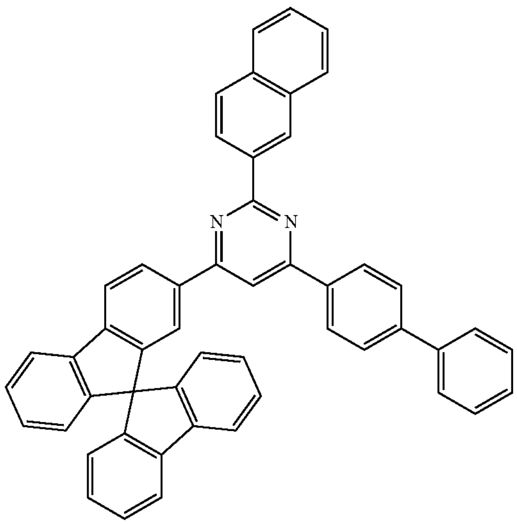
ET30
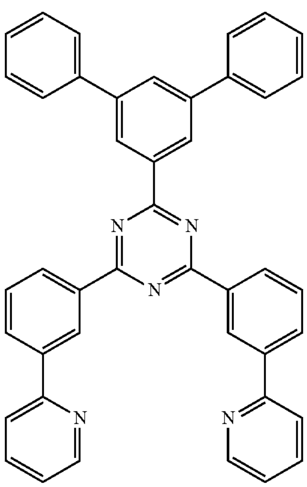
ET31
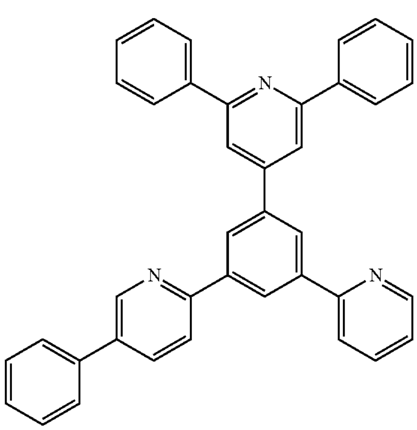
-continued
ET32
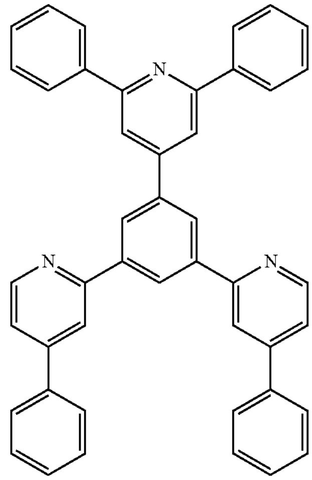
ET33
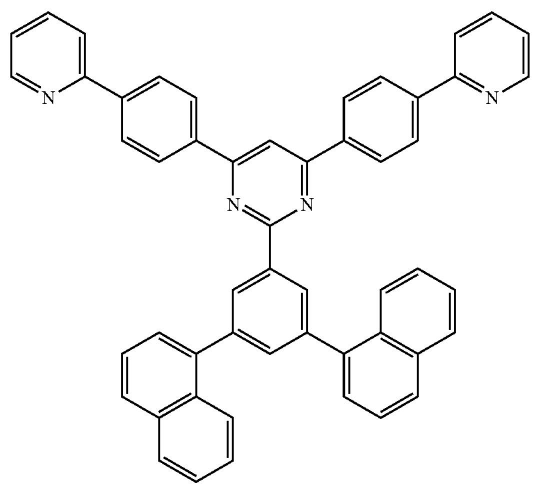
ET34
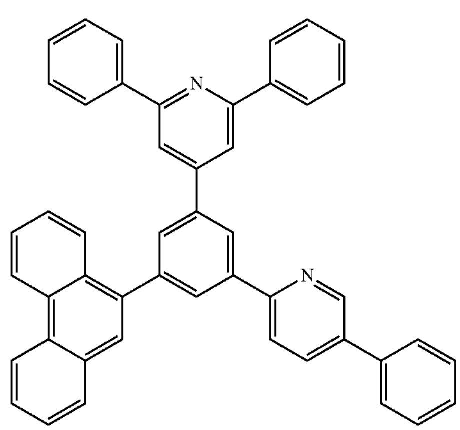

-continued

ET35

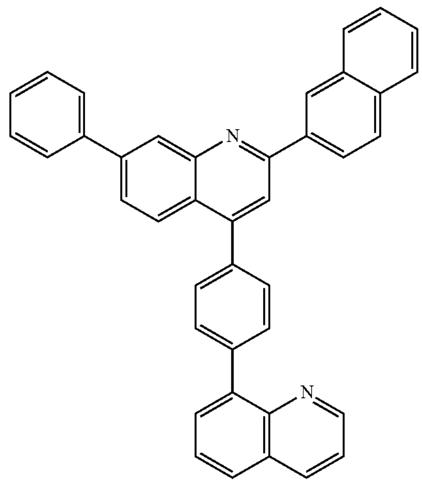

ET36

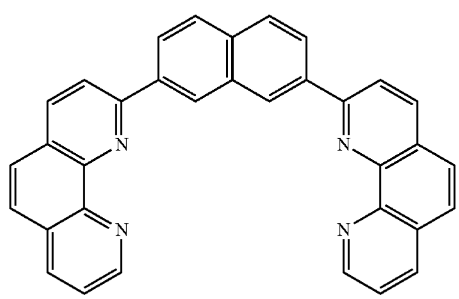

In one or more embodiments, the electron transport region 17 may include at least one of 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, or any combination thereof:

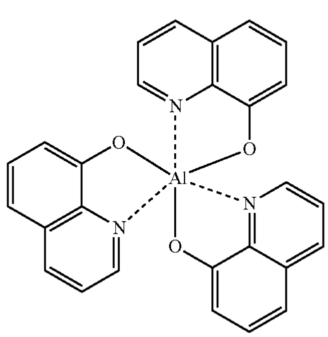

$Alq_3$

-continued

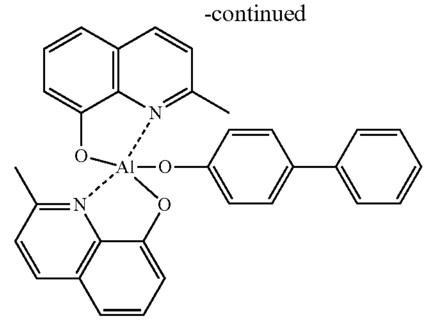

BAlq

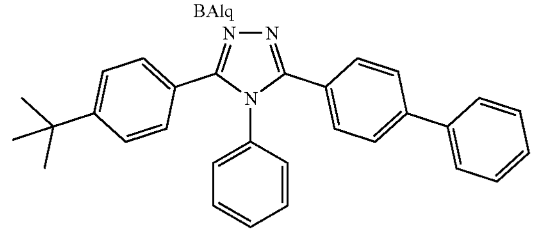

TAZ

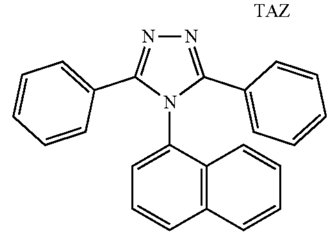

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region 17 (for example, the electron transport layer in the electron transport region 17) may further include, in addition to the materials described above, a metal-containing material.

The metal-containing material may include at least one of an alkali metal complex, an alkaline earth-metal complex, or any combination thereof. The alkali metal complex may include a metal ion such as a Li ion, a Na ion, a K ion, a Rb ion, or a Cs ion, and the alkaline earth-metal complex may include a metal ion such as a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium 8-hydroxyquinolate, LiQ) or ET-D2.

ET-D1

ET-D2

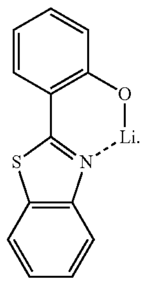

The electron transport region 17 may include an electron injection layer that facilitates injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth-metal complex, a rare earth metal complex, or any combination thereof.

The alkali metal may be Li, Na, K, Rb, or Cs. In one or more embodiments, the alkali metal may be Li, Na, or Cs. In one or more embodiments, the alkali metal may be Li or Cs, but embodiments of the present disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, or the rare earth metal compound may be an oxide or a halide (for example, fluorides, chlorides, bromides, or iodides) of the alkali metal, the alkaline earth-metal, or the rare earth metal.

The alkali metal compound may be an alkali metal oxide, such as $Li_2O$, $Cs_2O$, or $K_2O$, or an alkali metal halide, such as LiF, NaF, CsF, KF, LiI, NaI, CsI, or KI. In one or more embodiments, the alkali metal compound may be LiF, $Li_2O$, NaF, LiI, NaI, CsI, or KI, but embodiments of the present disclosure are not limited thereto.

The alkaline earth metal compound may be BaO, SrO, CaO, $Ba_xSr_{1-x}O$ ($0<x<1$), or $Ba_xCa_{1-x}O$ ($0<x<1$). In one or more embodiments, the alkaline earth metal compound may be BaO, SrO, or CaO, but embodiments of the present disclosure are not limited thereto.

The rare earth metal compound may be $YbF_3$, $ScF_3$, $ScO_3$, $Y_2O_3$, $Ce_2O_3$, $GdF_3$, or $TbF_3$. In one or more embodiments, the rare earth metal compound may be $YbF_3$, $ScF_3$, $TbF_3$, $YbI_3$, $ScI_3$, or $TbI_3$, but embodiments of the present disclosure are not limited thereto.

The alkali metal complex, the alkaline earth-metal complex, and the rare earth metal complex may include an ion of alkali metal, alkaline earth-metal, or rare earth metal as described above, and a ligand coordinated with a metal ion of the alkali metal complex, the alkaline earth-metal complex, or the rare earth metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

[Second Electrode 19]

The second electrode 19 is located on the organic layer 10A having such a structure. The second electrode 19 may be a cathode which is an electron injection electrode, and in this regard, a material for forming the second electrode 19 may be a metal, an alloy, an electrically conductive compound, and a combination thereof, which have a relatively low work function.

The second electrode 19 may include at least one lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments of the present disclosure are not limited thereto. The second electrode 19 may be a transmissive electrode, a semi-transmissive electrode, or a reflective electrode.

The second electrode 19 may have a single-layered structure having a single layer or a multi-layered structure including two or more layers.

Hereinbefore, the organic light-emitting device 10 has been described with reference to FIG. 1, but embodiments of the present disclosure are not limited thereto.

Figure 3:
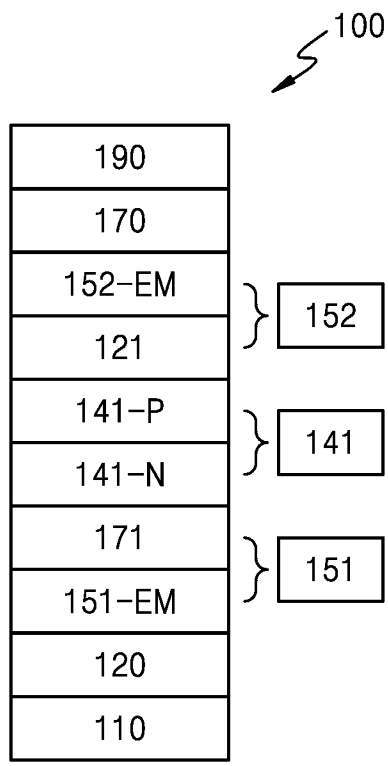
FIG. 3 is a schematic cross-sectional view of an organic light-emitting device according to another exemplary embodiment.

Description of FIG. 3

FIG. 3 is a schematic cross-sectional view of an organic light-emitting device 100 according to another exemplary embodiment.

In FIG. 3, the organic light-emitting device 100 includes a first electrode 110, a second electrode 190 facing the first electrode 110, and a first emission unit 151 and a second emission unit 152 which are located between the first electrode 110 and the second electrode 190. A charge generating layer 141 is located between the first emission unit 151 and the second emission unit 152, and the charge generating layer 141 includes an n-type charge generating layer 141-N and a p-type charge generating layer 141-P. The charge generating layer 141 is a layer that generates charge and supplies the charge to an adjacent emission unit, and may use a known material.

The first emission unit 151 includes a first emission layer 151-EM, and the second emission unit 152 includes a second emission layer 152-EM. A maximum emission wavelength of light emitted from the first emission unit 151 may be different from a maximum emission wavelength of light emitted from the second emission unit 152. For example, a mixture of light emitted from the first emission unit 151 and light emitted from the second emission unit 152 may be white light, but embodiments of the present disclosure are not limited thereto.

A hole transport region 120 is located between the first emission unit 151 and the first electrode 110, and the second emission unit 152 includes a first hole transport region 121 located on the side of the first electrode 110.

An electron transport region 170 is located between the second emission unit 152 and the second electrode 190, and the first emission unit 151 includes a first electron transport region 171 located between the charge generating layer 141 and the first emission layer 151-EM.

The first emission layer 151-EM may include a host, a dopant, and a sensitizer, and the dopant and the sensitizer may satisfy Conditions 1 and 2.

The second emission layer 152-EM may include a host, a dopant, and a sensitizer, and the dopant and the sensitizer may satisfy Conditions 1 and 2.

Descriptions of the first electrode 110 and the second electrode 190 in FIG. 3 are the same as described in connection with the first electrode 11 and the second electrode 19 in FIG. 1.

Descriptions of the first emission layer 151-EM and the second emission layer 152-EM in FIG. 3 are the same as described in connection with the emission layer 15 in FIG. 1.

Descriptions of the hole transport region 120 and the first hole transport region 121 in FIG. 3 are the same as described in connection with the hole transport region 12 in FIG. 1.

Descriptions of the electron transport region 170 and the first electron transport region 171 in FIG. 3 are the same as described in connection with the electron transport region 17 in FIG. 1.

Hereinafter, referring to FIG. 3, the organic light emitting device 100 including the first emission unit 151 and the second emission unit 152, each being an emission layer including a host, a dopant, and a sensitizer, as described in the present specification, has been described. However, one of the first emission unit 151 and the second emission unit 152 of the organic light emitting device 100 of FIG. 3 may be replaced with any known emission unit or may include three or more emission units.

Figure 4:
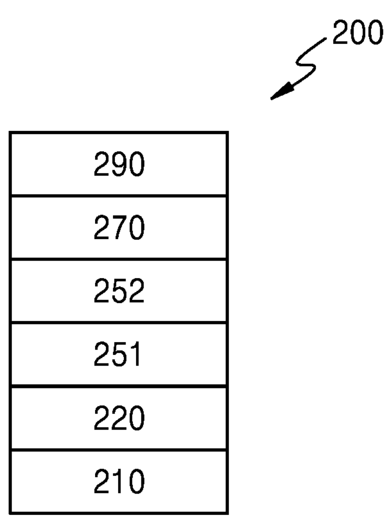
FIG. 4 is a schematic cross-sectional view of an organic light-emitting device according to another exemplary embodiment.

Description of FIG. 4

FIG. 4 is a schematic cross-sectional view of an organic light-emitting device 200 according to another exemplary embodiment.

The organic light-emitting device 200 includes a first electrode 210, a second electrode 290 facing the first electrode 210, and a first emission layer 251 and a second emission layer 252 which are stacked between the first electrode 210 and the second electrode 290.

A maximum emission wavelength of light emitted from the first emission layer 251 may be different from a maximum emission wavelength of light emitted from the second emission layer 252. For example, a mixture of light emitted from the first emission layer 251 and light emitted from the second emission layer 252 may be white light, but embodiments of the present disclosure are not limited thereto.

A hole transport region 220 is located between the first emission layer 251 and the first electrode 210, and an electron transport region 270 is located between the second emission layer 252 and the second electrode 290.

The first emission layer 251 may include a host, a dopant, and a sensitizer, and the dopant and the sensitizer may satisfy Conditions 1 and 2.

The second emission layer 252 may include a host, a dopant, and a sensitizer, and the dopant and the sensitizer may satisfy Conditions 1 and 2.

Descriptions of the first electrode 210, the hole transport region 220, and the second electrode 290 in FIG. 4 are the same as described in connection with the first electrode 11, the hole transport region 12, and the second electrode 19 in FIG. 1, respectively.

Descriptions of the first emission layer 251 and the second emission layer 252 in FIG. 4 are the same as described in connection with the emission layer 15 in FIG. 1.

A description of the electron transport region 270 in FIG. 4 is the same as described in connection with the electron transport region 17 in FIG. 1.

Hereinafter, referring to FIG. 4, the organic light emitting device 200 including the first emission layer 251 and the second emission layer 252, each including a host, a dopant, and a sensitizer, as described in the present specification, has been described. However, one of the first emission layer 251 and the second emission layer 252 of FIG. 4 may be replaced with any known emission layer, may include three or more emission layers, or may further include a middle layer between neighboring emission layers.

Explanation of Terms

The term "transition metal of Period 1 of the Periodic Table of Elements" as used herein refers to an element of Period 4 and the d-block of the Periodic Table of Elements, and non-limiting examples thereof include scandium (Sc), titanium (Ti), vanadium (V), chromium (Cr), manganese (Mn), iron (Fe), cobalt (Co), nickel (Ni), copper (Cu), and zinc (Zn).

The term "transition metal of Period 2 of the Periodic Table of Elements" as used herein refers to an element of Period 5 and the d-block of the Periodic Table of Elements, and non-limiting examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "transition metal of Period 3 of the Periodic Table of Elements" as used herein refers to an element of Period 6 and the d-block and the f-block of the Periodic Table of Elements, and non-limiting examples thereof include lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" used herein refers to a divalent group having the same structure as that of the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group. The term "$C_1$-$C_{60}$ alkylthio group" used herein refers to a monovalent group represented by —$SA_{104}$ (wherein $A_{104}$ is the $C_1$-$C_{60}$ alkyl group), and examples thereof include a methylthio group, an ethylthio group, and an isopropylthio group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethanol group, a propenyl group, and a butenyl group. The term "$C_2$-$C_{60}$ alkenylene group" used herein refers to a divalent group having the same structure as that of the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

The term "$C_1$-$C_{10}$ heterocycloalkyl group" as used herein refers to a monovalent saturated monocyclic group having at least one N, O, P, Si, B, Se, Ge, S, or any combination thereof as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one N, O, P, Si, B, Se, Ge, S, or any combination thereof as a ring-forming atom, 1 to 10 carbon atoms, and at least one double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one N, O, P, Si, B, Se, Ge, S, or any combination thereof as a ring-forming atom, and 1 to 60 carbon atoms. The term "$C_1$-$C_{60}$ heteroarylene group" as used herein refers to a divalent group having a carbocyclic aromatic system that has at least one N, O, P, B, Se, Ge, S, or any combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" used herein refers to a monovalent group in which two or more rings are condensed with each other, only carbon is used as a ring-forming atom (for example, the number of carbon atoms may be 8 to 60) and the whole molecule is a non-aromaticity group. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, N, O, P, Si, B, Se, Ge, S, or any combination thereof other than carbon atoms (for example, having 1 to 60 carbon atoms), as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group and may be a monovalent, divalent, trivalent, tetravalent, pentavalent, or hexavalent group, depending on the formula structure.

The term "$C_1$-$C_{30}$ heterocyclic group" as used herein refers to a saturated or unsaturated cyclic group having, as a ring-forming atom, at least one heteroatom N, O, Si, P, and S other than 1 to 30 carbon atoms. The $C_1$-$C_{30}$ heterocyclic group may be a monocyclic group or a polycyclic group and may be a monovalent, divalent, trivalent, tetravalent, pentavalent, or hexavalent group, depending on the formula structure.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a Ci-Cia heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The term "room temperature" used herein refers to a temperature of about 25° C.

The terms "a biphenyl group, a terphenyl group, and a tetraphenyl group" used herein respectively refer to monovalent groups in which two, three, or four phenyl groups which are linked together via a single bond.

The terms "a cyano group-containing phenyl group, a cyano group-containing biphenyl group, a cyano group-containing terphenyl group, and a cyano group-containing tetraphenyl group" used herein respectively refer to a phenyl group, a biphenyl group, a terphenyl group, and a tetraphenyl group, each of which is substituted with at least one cyano group. In "a cyano group-containing phenyl group, a cyano group-containing biphenyl group, a cyano group-containing terphenyl group, and a cyano group-containing tetraphenyl group", a cyano group may be substituted to any position of the corresponding group, and the "cyano group-containing phenyl group, the cyano group-containing biphenyl group, the cyano group-containing terphenyl group, and the cyano group-containing tetraphenyl group" may further include substituents other than a cyano group. For example, a phenyl group substituted with a cyano group, and a phenyl group substituted with a cyano group and a methyl group may all belong to "a cyano group-containing phenyl group."

Hereinafter, a compound and an organic light-emitting device according to embodiments are described in detail with reference to Synthesis Examples and Examples. However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES

Evaluation Example 1: Measurement of $\Delta E_{ST}$

First, a singlet ground-state ($S_0$) structure of a compound was optimized by using density function theory (DFT). Based on the optimized structure, a singlet excited-state energy ($S_1$) and a triplet excited-state energy ($T_1$) was calculated by using time-dependent density functional theory (TD-DFT). At this time, by using B3LYP (see Becke, A. D., J. Chem. Phys. 98, 5648 (1993), incorporated herein by reference), the singlet excited-state energy and the triplet excited-state energy were calculated. The basis sets used were LanL2DZ (see document [Roy, L. E., J. Chem. Theory Comput. 4, 1029 (2008)]) with respect to a center transition metal and 6-31G(d,p) (see Hehre, W. J., J. Chem. 56, 2257 (1972), incorporated herein by reference) with respect to surrounding atoms. All these calculations were carried out by using a Gaussian 09 package [Gaussian 09, Revision E.01, Frisch, M. J.].

TABLE 1

| Compound | $\Delta E_{ST}$ (eV) |
|---|---|
| S01 | 0.204 |
| S02 | 0.218 |
| S03 | 0.218 |
| PXZ-DPS | 0.028 |

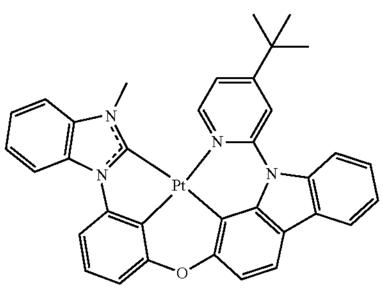

S01

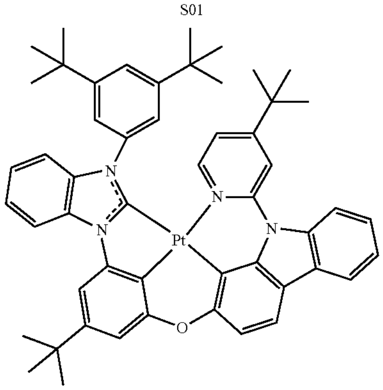

S02

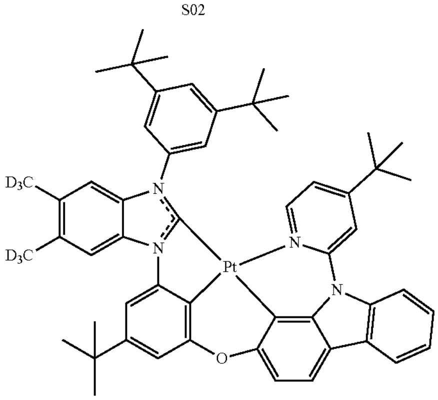

S03

TABLE 1-continued

| Compound | $\Delta E_{ST}$ (eV) |
|---|---|

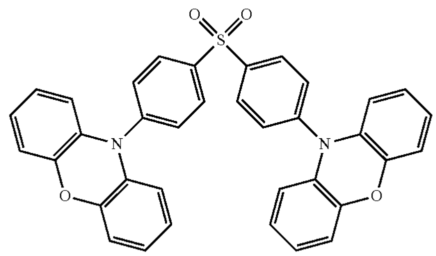

PXZ-DPS

Evaluation Example 2: Measurement of HOMO Energy Level

With respect to compounds in Table 2, CV (electrolyte: 0.1 M $Bu_4NClO_4$/solvent: $CH_2Cl_2$/electrode: three-electrode system (working electrode: GC, reference electrode: Ag/AgCl, auxiliary electrode: Pt)) was used to obtain a potential (V)-current (A) graph of each compound, and then a HOMO energy level of the each compound was calculated from a reduction onset of the graph.

TABLE 2

| Compounds(Sensitizer) | HOMO (eV) |
|---|---|
| S01 | −5.46 |
| S02 | −5.33 |
| S03 | −5.33 |
| PXZ-DPS | −5.67 |
| FD11 | −5.61 |
| FD14 | −5.55 |
| FD15 | −5.68 |
| FD16 | −5.37 |
| FD17 | −5.6 |
| FD18 | −5.63 |
| FD19 | −5.61 |
| FD20 | −5.48 |
| FD21 | −5.66 |

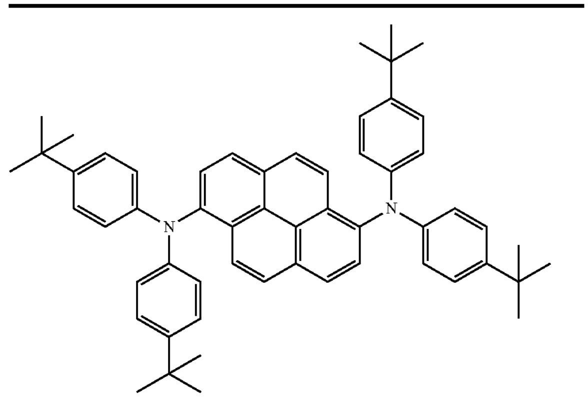

FD11

TABLE 2-continued
| Compounds(Sensitizer) | HOMO (eV) |
|---|---|
| 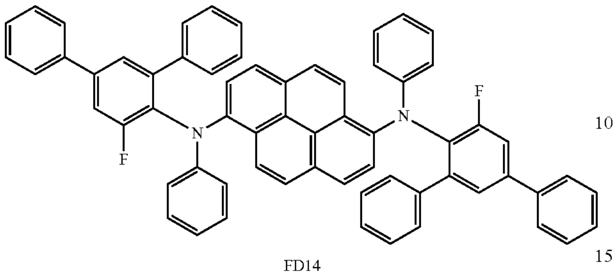 FD14 | |
| 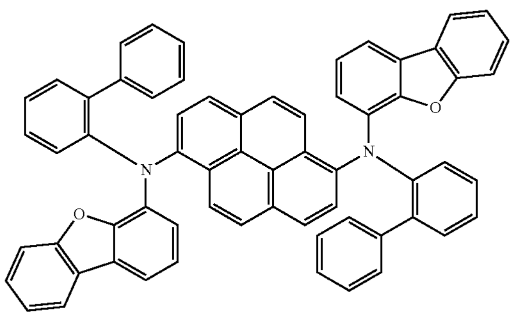 FD15 | |
| 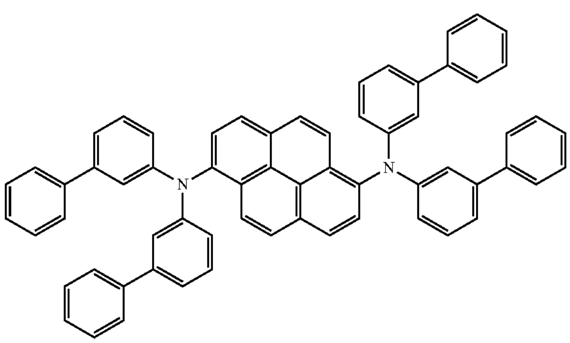 FD16 | |
| 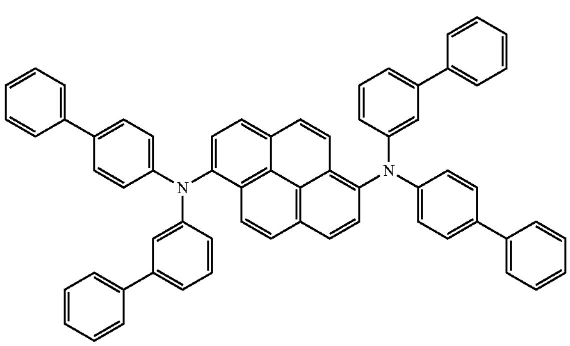 FD17 | |
TABLE 2-continued
| Compounds(Sensitizer) | HOMO (eV) |
|---|---|
| 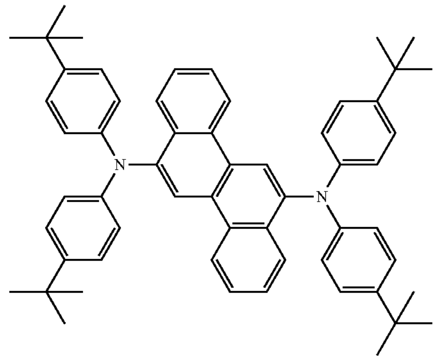 FD18 | |
| 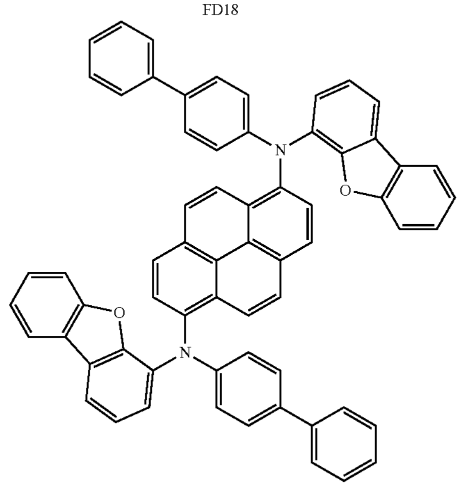 FD19 | |
| 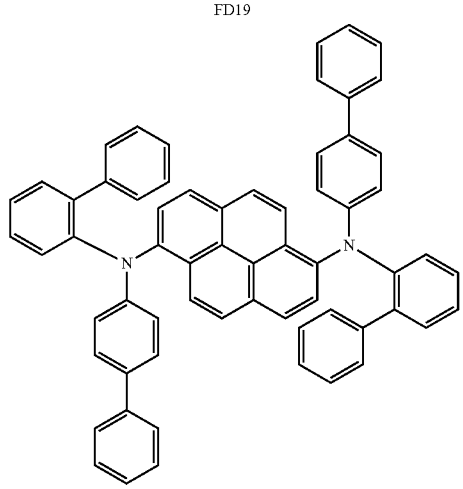 FD20 | |
| 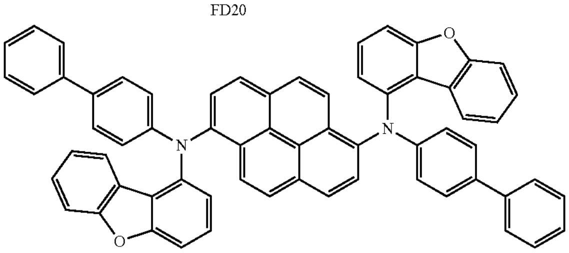 FD21 | |

Example 1

An ITO glass substrate was cut to a size of 50 mm×50 mm×0.5 mm, sonicated by using acetone, isopropyl alcohol, and pure water for 15 minutes each, and then UV-ozone was irradiated for 30 minutes thereto for cleaning.

Subsequently, F6-TCNNQ was deposited on an ITO electrode (anode) on the glass substrate to form a hole injection layer having a thickness of 100 Å, and HT1 was deposited on the hole injection layer to form a hole transport layer having a thickness of 1,260 Å, and thus a hole transport region was formed.

Compound H-H1 (a first host), H-E1 (a second host), Compound SP001 (sensitizer) (wherein, a weight ratio of the first host, the second host, and the sensitizer is 45:45:15), and Compound FD11 (dopant) (wherein, a dopant is 0.5 wt % based on the total weight of the first host, the second host, the sensitizer, and the dopant) were co-deposited on the hole transport region to form an emission layer having a thickness of 400 Å.

Compound ET17 and LiQ were co-deposited at a weight ratio of 5:5 on the emission layer to form an electron transport layer having a thickness of 360 Å, LiQ was deposited on the electron transport layer to form an electron injection layer having a thickness of 5 Å, and Al was formed on the electron injection layer to a thickness of 800 Å, resulting in completing the manufacture of an organic light-emitting device.

Examples 2 to 13 and Comparative Example 1X

Organic light-emitting devices were manufactured in the same manner as in Example 1, except that compounds shown in Table 3 were used as a sensitizer and a dopant.

TABLE 3

| | First host | Second host | Sensitizer | Dopant | Condition 1 satisfied/unsatisfied | Condition 2 satisfied/unsatisfied |
|---|---|---|---|---|---|---|
| Example 1 | H-H104 | HE6-27 | S01 | FD14 | satisfied | satisfied |
| Example 2 | H-H104 | HE6-27 | S01 | FD15 | satisfied | satisfied |
| Example 3 | H-H104 | HE6-27 | S01 | FD21 | satisfied | satisfied |
| Example 4 | H-H104 | HE6-27 | S01 | FD19 | satisfied | satisfied |
| Example 5 | H-H104 | HE6-27 | S03 | FD20 | satisfied | satisfied |
| Example 6 | H-H104 | HE6-27 | S03 | FD17 | satisfied | satisfied |
| Example 7 | H-H104 | HE6-27 | S03 | FD18 | satisfied | satisfied |
| Example 8 | H-H106 | HE6-28 | S02 | FD11 | satisfied | satisfied |
| Example 9 | H-H106 | HE6-28 | S02 | FD16 | satisfied | satisfied |
| Example 10 | H-H106 | HE6-28 | S02 | FD18 | satisfied | satisfied |
| Example 11 | H-H106 | HE6-28 | S02 | FD15 | satisfied | satisfied |
| Comparative Example 1X | H-H104 | HE6-27 | PXZ-DPS | FD11 | unsatisfied | satisfied |

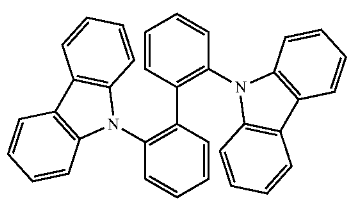

H-H104

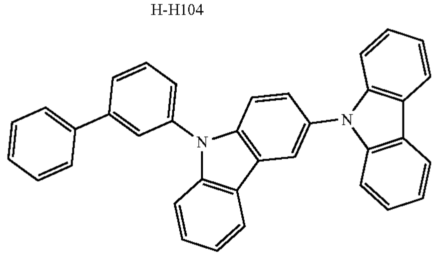

H-H106

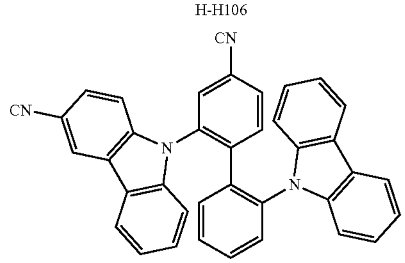

HE6-27

TABLE 3-continued

| | First host | Second host | Sensitizer | Dopant | Condition 1 satisfied/unsatisfied | Condition 2 satisfied/unsatisfied |
|---|---|---|---|---|---|---|

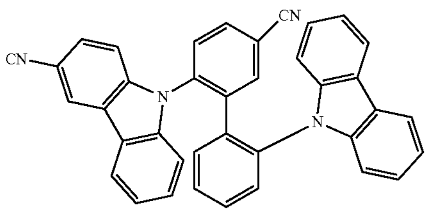

HE6-28

Comparative Examples 1F and 2F

Organic light-emitting devices were manufactured in the same manner as in Example 1, except that a first host, a second host, and a dopant were used as shown in Table 4, without using a sensitizer, in forming an emission layer.

TABLE 4

| | First host | Second host | Dopant | Weight ratio (First host:Second host:Dopant) |
|---|---|---|---|---|
| Comparative Example 1F | H-H104 | HE6-27 | FD14 | 50:50:15 |
| Comparative Example 2F-1 | H-H104 | HE6-27 | FD15 | 50:50:15 |
| Comparative Example 2F-2 | H-H106 | HE6-28 | FD15 | 50:50:15 |
| Comparative Example 3F | H-H106 | HE6-28 | FD16 | 50:50:15 |
| Comparative Example 4F | H-H104 | HE6-27 | FD17 | 50:50:15 |
| Comparative Example 5F-1 | H-H104 | HE6-27 | FD18 | 50:50:15 |
| Comparative Example 5F-2 | H-H106 | HE6-28 | FD18 | 50:50:15 |
| Comparative Example 6F | H-H104 | HE6-27 | FD19 | 50:50:15 |
| Comparative Example 7F | H-H104 | HE6-27 | FD20 | 50:50:15 |
| Comparative Example 8F | H-H104 | HE6-27 | FD21 | 50:50:15 |
| Comparative Example 9F | H-H106 | HE6-28 | FD11 | 50:50:15 |

Evaluation Example 2: Measurement of Lifespan of OLED

With respect to each organic light-emitting device manufactured according to Examples 1 to 13, Comparative Example 1X, and Comparative Examples 1F, 2F-1, 2F-2, 3F, 4F, 5F-1, 5F-2, and 6F to 9F, lifespan ($T_{95}$), external quantum efficiency (EQE), roll-off ratio, and maximum emission wavelength (EL $\lambda_{max}$) were evaluated, and then lifespan ($T_{95}$), external quantum efficiency, and roll-off ratio were calculated as relative values (%). Results thereof are shown in Tables 5 and 6. Minolta Cs-1000A was used as an evaluation apparatus. Lifespan ($T_{95}$) was determined by evaluating time that was taken until the brightness was reduced to 97% of initial brightness 100%, under the same brightness measurement conditions.

TABLE 5

| | Lifespan ($T_{95}$) (%) | EQE (%) | Roll-off ratio (%) | EL $\lambda_{max}$ (nm) |
|---|---|---|---|---|
| Example 1 | 100 | 100 | 0.081 | 457 |
| Example 2 | 305.5 | 140.1 | 0.214 | 458 |
| Example 3 | 360.3 | 133.6 | 0.205 | 459 |
| Example 4 | 238.8 | 122.3 | 0.212 | 458 |
| Example 5 | 432.5 | 141.1 | 8 | 465 |
| Example 6 | 430.9 | 178.3 | 11.3 | 465 |
| Example 7 | 1087.3 | 168.2 | 13.4 | 466 |
| Example 8 | 2586.5 | 179.5 | 9.3 | 467 |
| Example 9 | 1539.6 | 155.8 | 12.1 | 465 |
| Example 10 | 2650.8 | 170.4 | 13.4 | 466 |
| Example 11 | 1716.7 | 160.2 | 14.3 | 465 |
| Comparative Example 1X | 6.35 | 137.6 | 33 | 534 |

TABLE 6

| | Lifespan ($T_{95}$) (%) | EQE (%) | Roll-off ratio (%) | EL $\lambda_{max}$ (nm) |
|---|---|---|---|---|
| Comparative Example 1F | 9.90166 | 55.23702 | 38.9 | 456 |
| Comparative Example 2F-1 | 99.1065 | 59.58239 | 32.7 | 460 |
| Comparative Example 2F-2 | 166.4175 | 61.53499 | 31.3 | 461 |
| Comparative Example 3F | 89.90544 | 60.13544 | 32.4 | 455 |
| Comparative Example 4F | 174.741 | 56.87359 | 36.1 | 456 |
| Comparative Example 5F-1 | 224.0848 | 55.60948 | 34.4 | 469 |
| Comparative Example 5F-2 | 253.8608 | 52.52822 | 29.4 | 469 |
| Comparative Example 6F | 131.4112 | 48.90519 | 29.6 | 461 |
| Comparative Example 7F | 38.64871 | 51.42212 | 40.2 | 469 |
| Comparative Example 8F | 171.655 | 50.59819 | 28.6 | 463 |
| Comparative Example 9F | 206.6682 | 53.99549 | 32.8 | 474 |

Referring to Table 5, it is confirmed that organic light-emitting devices manufactured according to Examples 1 to 13 have long lifespan and improved roll-off characteristics, compared to an organic light-emitting device manufactured according to Comparative Example 1X.

Referring to Table 6, when each of organic light-emitting devices manufactured according to Examples 1 to 13 and organic light-emitting devices manufactured according to Comparative Examples 1F, 2F-1, 2F-2, 3F, 4F, 5F-1, 5F-2, and 6F to 9F includes the same dopant, maximum emission wavelength values thereof are almost the same, whereas the organic light-emitting devices manufactured according to Examples have improved lifespan, external quantum efficiency, and roll-off characteristics, compared to the organic light-emitting devices manufactured according to Comparative Examples. In other words, it is confirmed that the characteristics of the organic light-emitting devices, each including a sensitizer and manufactured according to Examples, are all improved, compared to the organic light-emitting devices manufactured according to Comparative Examples.

The organic light-emitting devices according to embodiments of the present disclosure have high efficiency and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:

a first electrode; a second electrode; and an organic layer between the first electrode and the second electrode, wherein the organic layer comprises an emission layer, the emission layer comprises a host, a dopant, and a sensitizer, the sensitizer comprises ruthenium (Ru), palladium (Pd), rhenium (Re), osmium (Os), platinum (Pt), or any combination thereof, and the dopant and the sensitizer satisfy Conditions 1 and 2 below:

$$0.2\ \text{eV} \leq \Delta E_{ST}(S) \qquad \text{<Condition 1>}$$

$$|\text{HOMO}(D)-\text{HOMO}(S)|<0.5\ \text{eV} \qquad \text{<Condition 2>}$$

wherein, in Conditions 1 and 2, $\Delta E_{ST}(S)$ is a difference between a lowest excitation singlet energy level and a lowest excitation triplet energy level of the sensitizer, HOMO(D) is a highest occupied molecular orbital (HOMO) energy level of the dopant, and HOMO(S) is a HOMO energy level of the sensitizer, wherein the sensitizer comprises an organometallic compound represented by Formula 101 below:

$$M_{11}(L_{11})_{n11}(L_{12})_{n12} \qquad \text{<Formula 101>}$$

wherein, in Formula 101, $M_{11}$ is ruthenium (Ru), palladium (Pd), rhenium (Re), osmium (Os), or platinum (Pt), $L_{11}$ is a ligand represented by one of Formulae 1-1 to 1-4, $L_{12}$ may be a monodentate ligand or a bidentate ligand, n11 is 1, and n12 may be 0, 1, or 2, 1-1

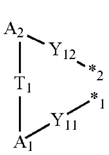

-continued 1-2

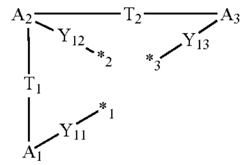

1-3

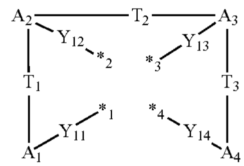

1-4

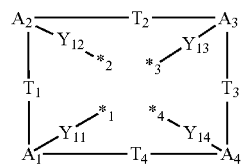

wherein, in Formulae 1-1 to 1-4, $A_1$ to $A_4$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be a single bond, a double bond, *—N($R_{93}$)—*', *—B($R_{93}$)—*', *—P($R_{93}$)—*', *—C($R_{93}$)($R_{94}$)—*', *—Si($R_{93}$)($R_{94}$)—*', *—Ge($R_{93}$)($R_{94}$)—*', *—S—*', *—Se—*', *—O—*', *—C(═O)—*, *—S(═O)—*', *—S(═O)$_2$—*', *—C($R_{93}$)═*', *═C($R_{93}$)—*', *—C($R_{93}$)═C($R_{94}$)—*', *—C(═S)—*', or *—C≡C—*', a substituent of the substituted $C_5$-$C_{30}$ carbocyclic group, a substituent of the substituted $C_1$-$C_{30}$ heterocyclic group, and $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), wherein each of the substituent of the substituted $C_5$-$C_{30}$ carbocyclic group and the substituent of the substituted $C_1$-$C_{30}$ heterocyclic group is not hydrogen, $*_1$, $*_2$, $*_3$, and $*_4$ each indicate a binding site to $M_{11}$, and $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a substituted or unsubstituted $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, and a $C_6$-$C_{60}$ aryl group, or any combination thereof, or a $C_6$-$C_{60}$ aryl group that is substituted with deuterium, —F, a cyano group, a $C_1$-$C_{60}$ alkyl group, or a $C_6$-$C_{60}$ aryl group, or any combination thereof.

2. The organic light-emitting device of claim 1, wherein the organic light-emitting device further satisfies Condition 1-1 below:

$$0.2\ \text{eV} \le \Delta E_{ST}(S) \le 0.4\ \text{eV}$$ <Condition 1-1> wherein, in Condition 1-1, $\Delta E_{ST}(S)$ is a difference between a lowest excitation singlet energy level and a lowest excitation triplet energy level of the sensitizer.

3. The organic light-emitting device of claim 1, wherein the sensitizer comprises Pt.

4. The organic light-emitting device of claim 1, wherein the organic light-emitting device further satisfies Condition 3 below:

$$T_1(S) \ge 2.63\ \text{eV}$$ <Condition 3> wherein, in Condition 3, $T_1(S)$ is the lowest triplet excitation energy level of the sensitizer.

5. The organic light-emitting device of claim 1, wherein the organic light-emitting device further satisfies Condition 4 below:

$$\text{HOMO}(S) \ge -6.0\ \text{eV}$$ <Condition 4> wherein, in Condition 4, HOMO(S) is a HOMO energy level of the sensitizer.

6. The organic light-emitting device of claim 1, wherein the host, the dopant, and the sensitizer further satisfy Condition 6 below:

$$T_1(H) \ge T_1(S) \ge S_1(D)$$ <Condition 6> wherein, in Condition 6, $T_1(H)$ is a lowest excitation triplet energy level of the host, $S_1(D)$ is a lowest excitation singlet energy level of the dopant, and $T_1(S)$ is a lowest excitation triplet energy level of the sensitizer.

7. The organic light-emitting device of claim 1, wherein, among total emission components emitted from the emission layer, a ratio of emission components emitted from the dopant is 90% or more.

8. The organic light-emitting device of claim 1, wherein each of the host and the sensitizer does not emit light.

9. The organic light-emitting device of claim 1, wherein the emission layer consists of the host, the dopant, and the sensitizer.

10. The organic light-emitting device of claim 1, wherein the host, the dopant, and the sensitizer satisfy Condition 5 below:

$$T_1(H) > T_1(S) > S_1(D)$$ <Condition 5> wherein, in Condition 5, $T_1(H)$ is a lowest excitation triplet energy level of the host, $T_1(S)$ is a lowest excitation triplet energy level of the sensitizer, and $S_1(D)$ is a lowest excitation singlet energy level of the dopant.

11. The organic light-emitting device of claim 1, wherein the host comprises an amphoteric host, an electron transport host, and/or a hole transport host, the electron transport host comprises at least one electron transport moiety, the hole transport host does not comprise an electron transport moiety, and the electron transport moiety is a cyano group, a π electron-deficient nitrogen-containing $C_1$-$C_{60}$ cyclic group, or a group represented by one of the following formulae:

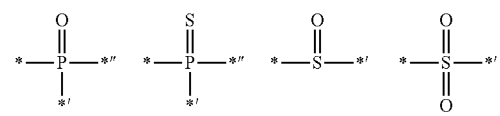

wherein, in the formulae, *, *', and *" are each a binding site to a neighboring atom.

12. The organic light-emitting device of claim 11, wherein the electron transport host comprises at least one π electron-rich $C_3$-$C_{60}$ cyclic group and at least one electron transport moiety, the hole transport host comprises at least one π electron-rich $C_3$-$C_{60}$ cyclic group and does not comprise an electron transport moiety, and the electron transport moiety is a cyano group or a π electron-deficient nitrogen-containing $C_1$-$C_{60}$ cyclic group.

13. The organic light-emitting device of claim 12, wherein the π electron-deficient nitrogen-containing $C_1$-$C_{60}$ cyclic group is: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group; or a condensed cyclic group of two or more π electron-deficient nitrogen-containing $C_1$-$C_{60}$ cyclic groups, and the π electron-rich $C_3$-$C_{60}$ cyclic group is: a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a triindolobenzene group; or a condensed cyclic group of two or more π electron-rich $C_3$-$C_{60}$ cyclic groups.

14. The organic light-emitting device of claim 11, wherein the electron transport host comprises i) at least one of a cyano group, a pyrimidine group, a pyrazine group, a triazine group, or any combination thereof and ii) a triphenylene group, and the hole transport host comprises a carbazole group.

15. The organic light-emitting device of claim 1, wherein a maximum emission wavelength of an emission spectrum of the dopant is 400 nm or more and 550 nm or less.

16. The organic light-emitting device of claim 1, wherein the dopant does not comprise a metal atom.

17. The organic light-emitting device of claim 1, wherein the dopant comprises one of a naphthalene-containing core, a fluorene-containing core, a spiro-bifluorene-containing core, a benzofluorene-containing core, a dibenzofluorene-containing core, a phenanthrene-containing core, an anthracene-containing core, a fluoranthene-containing core, a triphenylene-containing core, a pyrene-containing core, a chrysene-containing core, a naphthacene-containing core, a picene-containing core, a perylene-containing core, a pentaphene-containing core, an indenoanthracene-containing core, a tetracene-containing core, a bisanthracene-containing core, or a core represented by one of Formulae 501-1 to 501-18:

501-1

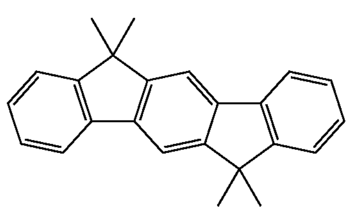

501-2

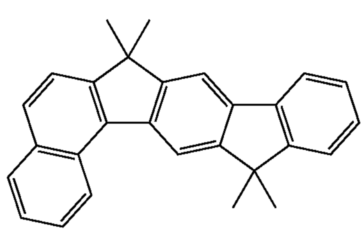

-continued 501-3

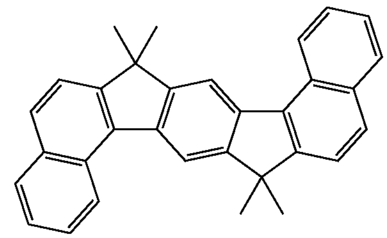

501-4

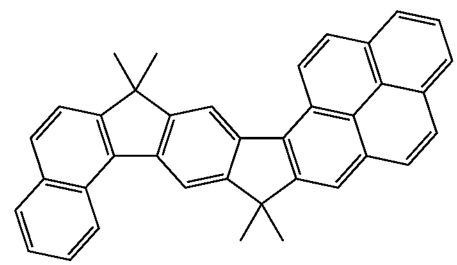

501-5

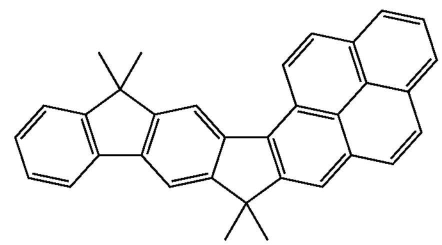

501-6

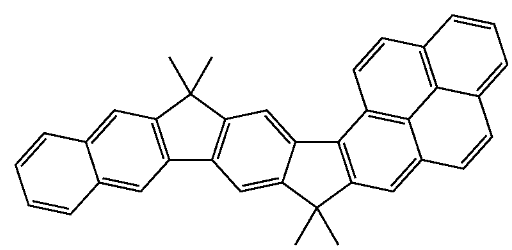

501-7

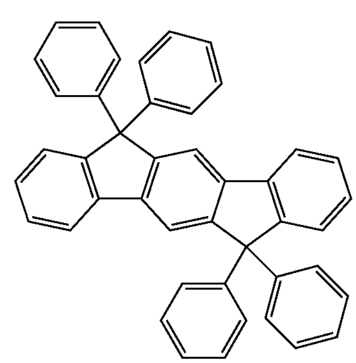

-continued
501-8
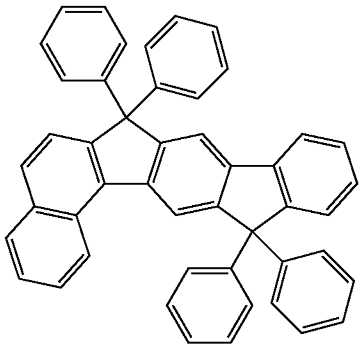
501-9
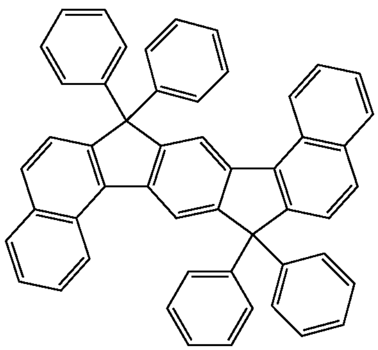
501-10
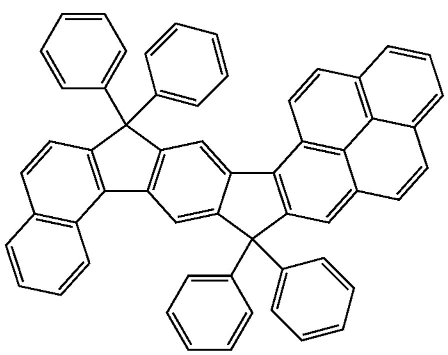
501-11
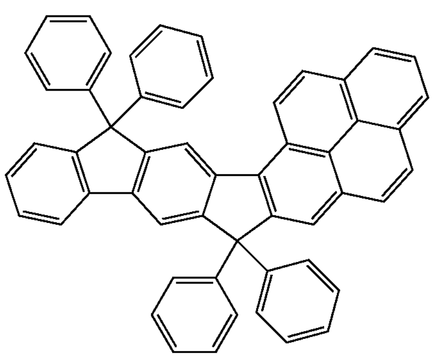
-continued
501-12
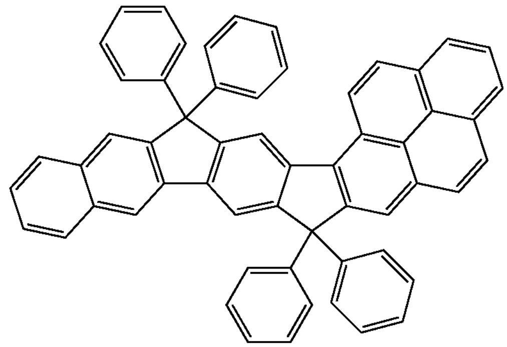
501-13
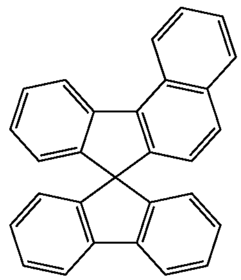
501-14
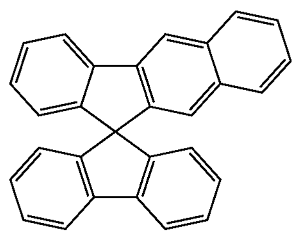
501-15
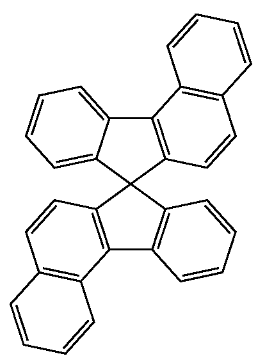
501-16
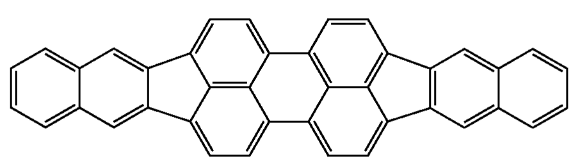

-continued 501-17

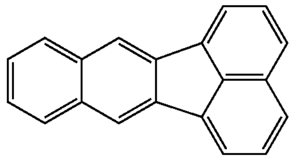

501-18

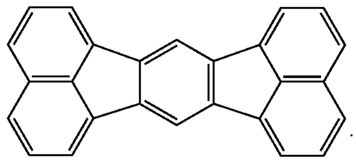

18. An organic light-emitting device comprising:

a first electrode; a second electrode; m emission units located between the first electrode and the second electrode and comprising at least one emission layer; and m−1 charge generating layers located between two adjacent emission units among the m emission units and comprising an n-type charge generating layer and a p-type charge generating layer, wherein m is an integer of 2 or more, a maximum emission wavelength of light emitted from at least one emission unit among the m emission units is different from a maximum emission wavelength of light emitted from at least one emission unit among the remaining emission units, the emission layer comprises a host, a dopant, and a sensitizer, the sensitizer comprises ruthenium (Ru), palladium (Pd), rhenium (Re), or osmium (Os), platinum (Pt), and the dopant and the sensitizer satisfy Conditions 1 and 2 below:

$0.2\ \mathrm{eV} \leq \Delta E_{ST}(S)$ <Condition 1>

$|\mathrm{HOMO}(D) - \mathrm{HOMO}(S)| < 0.5\ \mathrm{eV}$ <Condition 2> wherein, in Conditions 1 and 2, $\Delta E_{ST}(S)$ is a difference between a lowest excitation singlet energy level and a lowest excitation triplet energy level of the sensitizer, HOMO(D) is a HOMO energy level of the dopant, and HOMO(S) is a HOMO energy level of the sensitizer.

19. An organic light-emitting device comprising:

a first electrode; a second electrode; and m emission layers between the first electrode and the second electrode, wherein m is an integer of 2 or more, a maximum emission wavelength of light emitted from at least one emission layer among the m emission layers is different from a maximum emission wavelength of light emitted from at least one emission layer among the remaining emission layers, the emission layer comprises a host, a dopant, and a sensitizer, the sensitizer comprises ruthenium (Ru), palladium (Pd), rhenium (Re), osmium (Os), or platinum (Pt), and the dopant and the sensitizer satisfy Conditions 1 and 2 below:

$0.2\ \mathrm{eV} \leq \Delta E_{ST}(S)$ <Condition 1>

$|\mathrm{HOMO}(D) - \mathrm{HOMO}(S)| < 0.5\ \mathrm{eV}$ <Condition 2> wherein, in Conditions 1 and 2, $\Delta E_{ST}(S)$ is a difference between a lowest excitation singlet energy level and a lowest excitation triplet energy level of the sensitizer, HOMO(D) is a HOMO energy level of the dopant, and HOMO(S) is a HOMO energy level of the sensitizer.

* * * * *